US006274912B1

(12) United States Patent
Mukai et al.

(10) Patent No.: US 6,274,912 B1
(45) Date of Patent: Aug. 14, 2001

(54) SEMICONDUCTOR MEMORY CELL AND METHOD OF MANUFACTURING THE SAME

(75) Inventors: Mikio Mukai, Kanagawa; Yutaka Hayashi, Ibaraki, both of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/177,390

(22) Filed: Oct. 23, 1998

(30) Foreign Application Priority Data

| | | |
|---|---|---|
| Oct. 29, 1997 | (JP) | 9-297559 |
| Oct. 29, 1997 | (JP) | 9-297560 |
| Feb. 5, 1998 | (JP) | 10-024651 |
| Feb. 5, 1998 | (JP) | 10-024652 |
| Feb. 20, 1998 | (JP) | 10-038690 |
| Mar. 3, 1998 | (JP) | 10-050348 |

(51) Int. Cl.[7] ........ H01L 29/76
(52) U.S. Cl. ........ 257/365; 257/399; 257/401
(58) Field of Search ........ 257/365, 366, 257/369, 401, 67; 438/284, 277, 199

(56) References Cited

U.S. PATENT DOCUMENTS 5,428,238 6/1995 Hayashi et al. .......... 257/366

FOREIGN PATENT DOCUMENTS 7-99251 4/1995 (JP) .

*Primary Examiner*—Olik Chaudhuri
*Assistant Examiner*—Nathan W. Ha
(74) *Attorney, Agent, or Firm*—Ronald P. Kananen; Rader, Fishman & Grauer

(57) ABSTRACT

A semiconductor memory cell comprising a first transistor of a first conductivity type for read-out, a second transistor of a second conductivity type for write-in and a junction-field-effect transistor of the first conductivity type for current control; the first transistor having source/drain regions constituted of a first region and a fourth region, and a channel forming region constituted of a surface region of a third region; the second transistor having source/drain regions constituted of a second region and the third region, and a channel forming region constituted of a surface region of the first region; the junction-field-effect transistor having gate regions constituted of the fifth region and a portion of the third region facing the fifth region, a channel region constituted of part of the fourth region sandwiched by the fifth region and said portion of the third region, and source/drain regions constituted of the fourth region.

133 Claims, 248 Drawing Sheets

[STEP−120]

[STEP−130]

[STEP-500]

[STEP-510]

[STEP-510] CONTINUED

[STEP-520]

[STEP—530]

[STEP—530] CONTINUED

[STEP-530] CONTINUED

[STEP-540]

[STEP-550]

[STEP-560]

[STEP-1000]

[STEP-1010]

[STEP−1020]

[STEP−1030]

[STEP-1200]

[STEP-1210]

[STEP-1220]

[STEP-1230]

[STEP−1250]

[STEP−1260]

[STEP−1400]

[STEP−1410]

[STEP-1410] CONTINUED

[STEP-1420]

[STEP–1430]

[STEP–1430] CONTINUED

[STEP—1430] CONTINUED

[STEP—1440]

[STEP-1450]

[STEP–1800]

[STEP–1810]

[STEP-1810] CONTINUED

[STEP-1810] CONTINUED

[STEP-1820]

[STEP-1830]

[STEP-1830] CONTINUED

[STEP-1840]

[STEP-1850]

[STEP-1850] CONTINUED

[STEP–1850] CONTINUED

[STEP-2220]

[STEP-2230]

[STEP—2230] CONTINUED

[STEP-2240]

[STEP-2250]

[STEP–2250] CONTINUED

[STEP-2250] CONTINUED

SEMICONDUCTOR MEMORY CELL AND METHOD OF MANUFACTURING THE SAME

BACKGROUND OF THE INVENTION AND RELATED ART STATEMENT

The present invention relates to a semiconductor memory cell including multiple transistors or a semiconductor memory cell including multiple transistors physically merged into one unit, and a method of manufacturing the above semiconductor memory cell.

As a high-density semiconductor memory cell, there has been made available a dynamic semiconductor memory cell that can be referred to as a single-transistor semiconductor memory cell including one transistor and one capacitor shown in FIG. 248. In the above semiconductor memory cell, an electric charge stored in the capacitor is required to be large enough to generate a sufficiently large voltage change on a bit line. However, as the planar dimensions of the semiconductor memory cell are reduced, the capacitor formed in a parallel planar shape decreases in size, which causes a new problem that, when information which is stored as an electric charge in the capacitor of the semiconductor memory cell is read out, the read-out information is buried in noise, or that only a small voltage change is generated on the bit line since the stray capacitance of the bit line increases for every new generation of the semiconductor memory cell. As means for solving the above problems, there has been proposed a dynamic semiconductor memory cell having a trench capacitor cell structure shown in FIG. 249 or a stacked capacitor cell structure. Since, however, the fabrication-related technology has its own limits on the depth of the trench (or the groove) or the height of the stack, the capacitance of the capacitor is also limited. For this reason, dynamic semiconductor memory cells having the above structures are said to be suffered from the above mentioned limitation for the dimension beyond the low sub-micron rules unless expensive new materials are introduced for the capacitor.

In the planar dimensions smaller than those of the low sub-micron rule, the transistor constituting the semiconductor memory cell also has problems of deterioration of the drain breakdown voltage and drain-to-source punchthrough voltage. There is therefore a large risk that current leakage arises even if the voltage applied to the semiconductor memory cell is still within a predetermined range. When a semiconductor memory cell is made smaller in size, therefore, it is difficult to normally operate the semiconductor memory cell having a conventional transistor structure.

For overcoming the above limit problems of the capacitor, the present applicant has proposed a semiconductor memory cell comprising two transistors or two transistors physically merged into one unit, as is disclosed in Japanese Patent Application No. 246264/1993 (Japanese Patent Laid-open No. 99251/1995), corresponding to U.S. Pat. No. 5,428,238. The semiconductor memory cell shown in FIGS. 15(A) and 15(B) of Japanese Patent Laid-Open No. 99251/1995 comprises a first semi-conductive region $SC_1$ of a first conductivity type formed in a surface region of a semiconductor substrate or formed on an insulating substrate, a first conductive region $SC_2$ formed in a surface region of the first semi-conductive region $SC_1$ so as to form a rectifier junction together with the first semi-conductive region $SC_1$, a second semi-conductive region $SC_3$ of a second conductivity type formed in a surface region of the first semi-conductive region $SC_1$ and spaced from the first conductive region $SC_2$, a second conductive region $SC_4$ formed in a surface region of the second semi-conductive region $SC_3$ so as to form a rectifier junction together with the second semi-conductive region $SC_3$, and a conductive gate G formed on a barrier layer so as to bridge the first semi-conductive region $SC_1$ and the second conductive region $SC_4$ and so as to bridge the first conductive region $SC_2$ and the second semi-conductive region $SC_3$, the conductive gate G being connected to a first memory-cell-selecting line, the first conductive region $SC_2$ being connected to a write-in information setting line, and the second conductive region $SC_4$ being connected to a second memory-cell-selecting line.

The first semi-conductive region $SC_1$ (functioning as a channel forming region $Ch_2$), the first conductive region $SC_2$ (functioning as one source/drain region), the second semi-conductive region $SC_3$ (functioning as the other source/drain region) and the conductive gate G constitute a switching transistor $TR_2$. On the other hand, the second semi-conductive region $SC_3$ (functioning as a channel forming region $Ch_1$), the first semi-conductive region $SC_1$ (functioning as one source/drain region), the second conductive region $SC_4$ (functioning as the other source/drain region) and the conductive gate G constitute an information storing transistor $TR_1$.

The semiconductor memory cell shown in FIGS. 12(A) and 13 of Japanese Patent Laid-Open No. 99251/1995 comprises a first conductive region $SC_1$ of a first conductivity type formed in a p-type well (a fourth conductive region) $SC_4$, a second conductive region $SC_2$ formed in a surface region of the fourth conductive region $SC_4$ so as to form a rectifier junction together with the fourth conductive region $SC_4$, a third conductive region $SC_3$ of a second conductivity type formed in a surface region of the first conductive region $SC_1$ and spaced from the second conductive region $SC_2$, and a conductive gate G formed on a barrier layer so as to bridge the first conductive region $SC_1$ and the second conductive region $SC_2$ and so as to bridge the third conductive region $SC_3$ and the fourth conductive region $SC_4$, the conductive gate G being connected to a first memory-cell-selecting line, the second conductive region $SC_2$ being connected to a write-in information setting line, and the third conductive region $SC_3$ being connected to a second memory-cell-selecting line. The third conductive region $SC_3$ is constituted of a p-type semi-conductive region $SC_{3p}$ and a metal layer $SC_{3s}$ which is adjacent to the p-type semi-conductive region $SC_{3p}$ to form a Schottky junction. The regions $SC_{3p}$ and $SC_{3s}$ are formed in a surface region of the first conductive region $SC_1$.

The first conductive region $SC_1$ (functioning as a channel forming region $Ch_2$), the fourth conductive region $SC_4$ (functioning as one source/drain region), the third conductive region $SC_3$ (functioning as the other source/drain region) and the conductive gate G constitute a switching transistor $TR_2$. On the other hand, the fourth conductive region $SC_4$ (functioning as a channel forming region $Ch_1$), the first conductive region $SC_1$ (functioning as one source/drain region), the second conductive region $SC_2$ (functioning as the other source/drain region) and the conductive gate G constitute an information storing transistor $TR_1$. The metal layer $SC_{3s}$ in itself does not constitute the source/drain region of the switching transistor $TR_2$.

When information is written in the above semiconductor memory cells, the switching transistor $TR_2$ is brought into an on-state. As a result, the information is stored in the channel forming region $Ch_1$ of the information storing transistor $TR_1$ as a potential or as an electric charge. When the information is read out, a threshold voltage of the information storing transistor $TR_1$ seen from the conductive gate G varies, depending upon the potential or the electric charge stored in the channel forming region $Ch_1$ of the information storing transistor $TR_1$. Therefore, when the information is read out, the storage state of the information storing transistor $TR_1$ can be judged from the magnitude of a channel current (including a zero magnitude) by applying a properly selected potential to the conductive gate G. The information is read out by detecting the operation state of the information storing transistor $TR_1$.

That is, in the semiconductor memory cell shown in FIGS. 15(A) and 15(B) of Japanese Patent Laid-Open No. 99251/1995, when the information is read out, the information storing transistor $TR_1$ is brought into an on-state or an off-state, depending upon the information stored therein. Since the second conductive region $SC_4$ is connected to the second memory-cell-selecting line, a large current or a small current may flow in the information storing transistor $TR_1$, depending upon the stored information ("0" or "1"). In this way, the information stored in the semiconductor memory cell can be read out by utilizing the information storing transistor $TR_1$. However, when the information is read out, the semiconductor memory cell has no mechanism for controlling the current which flows through the first semi-conductive region $SC_1$ sandwiched by the first conductive region $SC_2$ and the second semi-conductive region $SC_3$. Therefore, when the information stored in the information storing transistor $TR_1$ is detected with the conductive gate G, only a small margin of the current which flows between the first semi-conductive region $SC_1$ and the second conductive region $SC_4$ is obtained, which causes a problem that the number of the semiconductor memory cells connected to the second memory-cell-selecting line (a bit line) is limited.

Further, since the information storing transistor $TR_1$ and the switching transistor $TR_2$ are formed in the same main surface of the semiconductor substrate, the semiconductor memory cell has problems that it is large in size and that a margin in the manufacturing process of the semiconductor memory cell is small. The semiconductor memory cell may have a configuration in which the information storing transistor $TR_1$ and the switching transistor $TR_2$ are merged into one unit. As a result, the information storing transistor $TR_1$ and the switching transistor $TR_2$ may be formed in an area equivalent to that required for one conventional transistor. However, when the integration density of an integrated circuit is increased, the area of the integrated circuit increases proportional to the number of the semiconductor memory cells. As a result, it is difficult to fully satisfy the demand for manufacturing the semiconductor memory cell with a higher integration density.

OBJECT AND SUMMARY OF THE INVENTION

It is therefore an object of the present invention to provide a semiconductor memory cell which attains the stable performance of transistors, a large window (current difference) for reading out information stored therein to assure consistent read-out/write-in and permits smaller dimensions or to provide a logic compatible memory cell.

Further, it is an object of the present invention to provide a semiconductor memory cell comprising at least 3 transistors, a transistor for read-out, a transistor for write-in and a junction-field-effect transistor for current control, wherein the transistor for read-out and the transistor for write-in are merged into one unit.

Further, it is an object of the present invention to provide a semiconductor memory cell comprising at least 3 transistors, a transistor for read-out, a transistor for write-in and a junction-field-effect transistor for current control, and a diode, wherein the transistor for read-out and the transistor for write-in are merged into one unit.

Further, it is an object of the present invention to provide a semiconductor memory cell comprising at least 4 transistors, a transistor for read-out, a transistor for write-in, a junction-field-effect transistor for current control and an additional transistor for write-in, and a diode, wherein the transistor for read-out, the transistor for write-in and the additional transistor for write-in are merged into one unit.

Further it is an object of the present invention to provide a semiconductor memory cell comprising two transistors merged into one unit, or comprising two transistors and a diode merged into one unit, which can assure stable transistor operation, can be fabricated by fewer steps in a smaller area and requires no large capacitor such that used for a conventional DRAMs to promote higher integration.

It is further another object of the present invention to provide a process for the manufacture thereof.

As shown in a principle drawing of FIG. 1A, for achieving the above object, according to a first aspect of the present invention, there is provided a semiconductor memory cell comprising a first transistor of a first conductivity type for read-out $TR_1$, a second transistor of a second conductivity type for write-in $TR_2$ and a junction-field-effect transistor of the first conductivity type for current control $TR_3$, said semiconductor memory cell having;

(1) a first semi-conductive region $SC_1$ of the first conductivity type, (2) a second semi-conductive or conductive region $SC_2$ formed in a surface region of the first region $SC_1$, said second region $SC_2$ forming a rectifier junction together with the first region $SC_1$, (3) a third semi-conductive region $SC_3$ of the second conductivity type formed in a surface region of the first region $SC_1$ and spaced from the second region $SC_2$, (4) a fourth semi-conductive region $SC_4$ of the first conductivity type formed in a surface region of the third region $SC_3$, (5) a fifth semi-conductive or conductive region $SC_5$ formed in a surface region of the fourth region $SC_4$, said fifth region $SC_5$ forming a rectifier junction together with the fourth region $SC_4$, and (6) a gate portion G shared by the first transistor $TR_1$ and the second transistor $TR_2$, and formed on a barrier layer so as to bridge the first region $SC_1$ and the fourth region $SC_4$ and so as to bridge the second region $SC_2$ and the third region $SC_3$, wherein;

(A-1) one source/drain region of the first transistor $TR_1$ is constituted of the surface region of the fourth region $SC_4$, (A-2) the other source/drain region of the first transistor $TR_1$ is constituted of the surface region of the first region $SC_1$ sandwiched by the second region $SC_2$ and the third region $SC_3$, (A-3) a channel forming region $CH_1$ of the first transistor $TR_1$ is constituted of the surface region of the third region $SC_3$ sandwiched by the surface region of the first region $SC_1$ and the surface region of the fourth region $SC_4$, (B-1) one source/drain region of the second transistor $TR_2$ is constituted of the second region $SC_2$, (B-2) the other source/drain region of the second transistor $TR_2$ is constituted of the surface region of the third region $SC_3$ constituting the channel forming region $CH_1$ of the first transistor $TR_1$, (B-3) a channel forming region $CH_2$ of the second transistor $TR_2$ is constituted of the surface region of the first region $SC_1$ constituting the other source/drain region of the first transistor $TR_1$, (C-1) gate regions of the junction-field-effect transistor $TR_3$ are constituted of the fifth region $SC_5$ and a portion of the third region $SC_3$ facing the fifth region $SC_5$, (C-2) a channel region $CH_3$ of the junction-field-effect transistor $TR_3$ is constituted of part of the fourth region $SC_4$ sandwiched by the fifth region $SC_5$ and said portion of the third region $SC_3$, (C-3) one source/drain region of the junction-field-effect transistor $TR_3$ is constituted of a portion of the fourth region $SC_4$ extending from one end of the channel region $CH_3$ of the junction-field-effect transistor $TR_3$ and constituting one source/drain region of the first transistor $TR_1$, (C-4) the other source/drain region of the junction-field-effect transistor $TR_3$ is constituted of a portion of the fourth region $SC_4$ extending from the other end of the channel region $CH_3$ of the junction-field-effect transistor $TR_3$, (D) the gate portion G is connected to a first memory-cell-selecting line, (E) a diode D is formed between the first region $SC_1$ and the second region $SC_2$, and the first region $SC_1$ is connected to a write-in information setting line through the diode D, (F) the second region $SC_2$ is connected to the write-in information setting line, (G) the portion of the fourth region $SC_4$ constituting the other source/drain region of the junction-field-effect transistor $TR_3$ is connected to a second memory-cell-selecting line, and (H) the fifth region $SC_5$ is connected to a predetermined potential line.

The meaning of the term "sandwiched by" is equivalent to that of the term "interposed between", in the specification and the claims. In the drawings, the first memory-cell-selecting line is referred to as "1ST LINE", the first-A memory-cell-selecting line is referred to as "1ST-A LINE", the first-B memory-cell-selecting line is referred to as "1ST-B LINE", the second memory-cell-selecting line is referred to as "2ND LINE", the second-A memory-cell-selecting line is referred to as "2ND-A LINE" and the second-B memory-cell-selecting line is referred to as "2ND-B LINE".

In the semiconductor memory cell according to the first aspect of the present invention, the configuration in which the second region $SC_2$ is connected to the write-in information setting line includes a configuration in which the second region $SC_2$ and part of the write-in information setting line are fabricated in common. The configuration in which the fifth region $SC_5$ is connected to the predetermined potential line includes a configuration in which the fifth region $SC_5$ and part of the predetermined potential line are fabricated in common.

In the semiconductor memory cell according to the first aspect of the present invention, the diode D is formed between the first region $SC_1$ and the second region $SC_2$. When the second region $SC_2$ comprises a semiconductor opposite to the first region $SC_1$ in the conductivity, the diode D is a pn junction diode and there is possibility that latch-up takes place, because minority carriers are injected from forward biased diode D in operation to read out information and the third region $SC_3$ is floating. When there is possibility that latch-up takes place, the semiconductor memory cell preferably has, as shown in a principle drawing of FIG. 3A, a configuration in which the semiconductor memory cell further has a sixth semi-conductive or conductive region $SC_6$ formed in the surface region of the first region $SC_1$, said sixth region $SC_6$ forming a rectifier junction together with the first region $SC_1$, the diode $D_1$ is constituted of the sixth region $SC_6$ and the first region $SC_1$, and one end of the diode $D_1$ is connected to the write-in information setting line. Alternatively, the semiconductor memory cell preferably has a configuration in which the semiconductor memory cell further has a sixth semi-conductive or conductive region $SC_6$ formed in the surface region of the first region $SC_1$, said sixth region $SC_6$ forming a rectifier junction together with the first region $SC_1$, the diode D is constituted of the sixth region $SC_6$ and the first region $SC_1$, and the sixth region $SC_6$ has a common region with part of the write-in information setting line, that is, the sixth region $SC_6$ and part of the write-in information setting line are fabricated in common. In the above embodiment, the material constituting the sixth region $SC_6$ is selected among the materials which make a Schottky junction or an ISO-type hetero junction, both of which operate with majority carriers of the first semiconductor region $SC_1$ and do not inject many minority carriers even when the junction is forward biased. That is, the rectifier junction between the sixth region $SC_6$ and the first region $SC_1$ is a majority carrier junction such as a Schottky junction or an ISO-type hetero junction. The term of "ISO-type hetero junction" means a hetero junction which is formed between two dissimilar semiconductors having the same conductivity type (see S. M. Sze, "Physics of Semiconductor Devices", 2nd edition, pp. 122, John Wiley & Sons). Further, forward voltage of the junction is smaller than that of the pn junction. Thus, this characteristic of the diode D prevents the latch-up phenomenon. The Schottky barrier is formed when the sixth region $SC_6$ or the second region $SC_2$ comprises a kind of metal such as, for example, Al, Mo and Ti or a silicide such as, for example, $TiSi_2$ and $WSi_2$. The ISO-type hetero junction is formed when the sixth region $SC_6$ or the second region $SC_2$ comprises a semiconductor which is different in the material from the first region $SC_1$ but has the same conductivity as that of the first region $SC_1$.

Alternatively, in the semiconductor memory cell according to the first aspect of the present invention, as shown in a principle drawing of FIG. 4A, the fifth region $SC_5$ may be connected to the third region $SC_3$ in place of being connected to the predetermined potential line, to simplify the wiring configuration of the semiconductor memory cell. In this configuration, the diode D is formed between the first region $SC_1$ and the second region $SC_2$. When there is possibility that latch-up takes place, the semiconductor memory cell preferably has, as shown in a principle drawing of FIG. 4B, a configuration in which the semiconductor memory cell further has a sixth semi-conductive or conductive region $SC_6$ formed in the surface region of the first region $SC_1$, said sixth region $SC_6$ forming a rectifier junction together with the first region $SC_1$, the diode $D_1$ is constituted of the sixth region $SC_6$ and the first region $SC_1$, and one end of the diode $D_1$ is connected to the write-in information setting line. Alternatively, the semiconductor memory cell preferably has a configuration in which the semiconductor memory cell further has a sixth semi-conductive or conductive region $SC_6$ formed in the surface region of the first region $SC_1$, said sixth region $SC_6$ forming a rectifier junction together with the first region $SC_1$, said rectifier junction between the sixth region $SC_6$ and the first region $SC_1$ being a majority carrier junction such as a Schottky junction or an ISO-type hetero junction, the diode D is constituted of the sixth region $SC_6$ and the first region $SC_1$, and the sixth region $SC_6$ has a common region with part of the write-in information setting line, that is, the sixth region $SC_6$ and part of the write-in information setting line are fabricated in common.

As shown in a principle drawing of FIG. 8A, for achieving the above object, according to a second aspect of the present invention, there is provided a semiconductor memory cell comprising a first transistor of a first conductivity type for read-out $TR_1$, a second transistor of a second conductivity type for write-in $TR_2$, a junction-field-effect transistor of the first conductivity type for current control $TR_3$ and a third transistor of the second conductivity type for write-in $TR_4$, said semiconductor memory cell having;

(1) a first semi-conductive region $SC_1$ of the first conductivity type, (2) a second semi-conductive or conductive region $SC_2$ formed in a surface region of the first region $SC_1$, said second region $SC_2$ forming a rectifier junction together with the first region $SC_1$, (3) a third semi-conductive region $SC_3$ of the second conductivity type formed in a surface region of the first region $SC_1$ and spaced from the second region $SC_2$, (4) a fourth semi-conductive region $SC_4$ of the first conductivity type formed in a surface region of the third region $SC_3$, (5) a fifth semi-conductive or conductive region $SC_5$ formed in a surface region of the fourth region $SC_4$, said fifth region $SC_5$ forming a rectifier junction together with the fourth region $SC_4$, and (6) a gate portion G shared by the first transistor $TR_1$, the second transistor $TR_2$ and the third transistor $TR_4$, and formed on a barrier layer so as to bridge the first region $SC_1$ and the fourth region $SC_4$, so as to bridge the second region $SC_2$ and the third region $SC_3$ and so as to bridge the third region $SC_3$ and the fifth region $SC_5$, wherein;

(A-1) one source/drain region of the first transistor $TR_1$ is constituted of the surface region of the fourth region $SC_4$, (A-2) the other source/drain region of the first transistor $TR_1$ is constituted of the surface region of the first region $SC_1$ sandwiched by the second region $SC_2$ and the third region $SC_3$, (A-3) a channel forming region $CH_1$ of the first transistor $TR_1$ is constituted of the surface region of the third region $SC_3$ sandwiched by the surface region of the first region $SC_1$ and the surface region of the fourth region $SC_4$, (B-1) one source/drain region of the second transistor $TR_2$ is constituted of the second region $SC_2$, (B-2) the other source/drain region of the second transistor $TR_2$ is constituted of the surface region of the third region $SC_3$ constituting the channel forming region $CH_1$ of the first transistor $TR_1$, (B-3) a channel forming region $CH_2$ of the second transistor $TR_2$ is constituted of the surface region of the first region $SC_1$ constituting the other source/drain region of the first transistor $TR_1$, (C-1) gate regions of the junction-field-effect transistor $TR_3$ are constituted of the fifth region $SC_5$ and a portion of the third region $SC_3$ facing the fifth region $SC_5$, (C-2) a channel region $CH_3$ of the junction-field-effect transistor $TR_3$ is constituted of part of the fourth region $SC_4$ sandwiched by the fifth region $SC_5$ and said portion of the third region $SC_3$, (C-3) one source/drain region of the junction-field-effect transistor $TR_3$ is constituted of a portion of the fourth region $SC_4$ extending from one end of the channel region $CH_3$ of the junction-field-effect transistor $TR_3$ and constituting one source/drain region of the first transistor $TR_1$, (C-4) the other source/drain region of the junction-field-effect transistor $TR_3$ is constituted of a portion of the fourth region $SC_4$ extending from the other end of the channel region $CH_3$ of the junction-field-effect transistor $TR_3$, (D-1) one source/drain region of the third transistor $TR_4$ is constituted of the surface region of the third region $SC_3$ constituting the channel forming region $CH_1$ of the first transistor $TR_1$, (D-2) the other source/drain region of the third transistor $TR_4$ is constituted of the fifth region $SC_5$, (D-3) a channel forming region $CH_4$ of the third transistor $TR_4$ is constituted of the surface region of the fourth region $SC_4$ functioning as one source/drain region of the first transistor $TR_1$, (E) the gate portion G is connected to a first memory-cell-selecting line, (F) a diode D is formed between the first region $SC_1$ and the second region $SC_2$, and the first region $SC_1$ is connected to a write-in information setting line through the diode D, (G) the second region $SC_2$ is connected to the write-in information setting line, and (H) the portion of the fourth region $SC_4$ constituting the other source/drain region of the junction-field-effect transistor $TR_3$ is connected to a second memory-cell-selecting line.

In the semiconductor memory cell according to the second aspect of the present invention, the configuration in which the second region $SC_2$ is connected to the write-in information setting line includes a configuration in which the second region $SC_2$ and part of the write-in information setting line are fabricated in common.

In the semiconductor memory cell according to the second aspect of the present invention, the diode D is formed between the first region $SC_1$ and the second region $SC_2$. When there is possibility that latch-up takes place, the semiconductor memory cell preferably has, as shown in a principle drawing of FIG. 8B, a configuration in which the semiconductor memory cell further has a sixth semi-conductive or conductive region $SC_6$ formed in the surface region of the first region $SC_1$, said sixth region $SC_6$ forming a rectifier junction together with the first region $SC_1$, the diode $D_1$ is constituted of the sixth region $SC_6$ and the first region $SC_1$, and one end of the diode $D_1$ is connected to the write-in information setting line. Alternatively, the semiconductor memory cell preferably has a configuration in which the semiconductor memory cell further has a sixth semi-conductive or conductive region $SC_6$ formed in the surface region of the first region $SC_1$, said sixth region $SC_6$ forming a rectifier junction together with the first region $SC_1$, said rectifier junction between the sixth region $SC_6$ and the first region $SC_1$ being a majority carrier junction such as a Schottky junction or an ISO-type hetero junction, the diode D is constituted of the sixth region $SC_6$ and the first region $SC_1$, and the sixth region $SC_6$ has a common region with part of the write-in information setting line, that is, the sixth region $SC_6$ and part of the write-in information setting line are fabricated in common.

A semiconductor memory cell according to a third aspect of the present invention for achieving the above object has the same fundamental configuration as that of the semiconductor memory cell according to the first aspect of the present invention.

That is, as shown in a principle drawing of FIG. 12A, according to the third aspect of the present invention, there is provided a semiconductor memory cell comprising a first transistor of a first conductivity type for read-out $TR_1$, a second transistor of a second conductivity type for write-in $TR_2$ and a junction-field-effect transistor of the first conductivity type for current control $TR_3$, said semiconductor memory cell having;

(1) a first semi-conductive region $SC_1$ of the first conductivity type, (2) a second semi-conductive or conductive region $SC_2$ formed in a surface region of the first region $SC_1$, said second region $SC_2$ forming a rectifier junction together with the first region $SC_1$, (3) a third semi-conductive region $SC_3$ of the second conductivity type formed in a surface region of the first region $SC_1$ and spaced from the second region $SC_2$, (4) a fourth semi-conductive region $SC_4$ of the first conductivity type formed in a surface region of the third region $SC_3$, (5) a fifth semi-conductive or conductive region $SC_5$ formed in a surface region of the fourth region $SC_4$, said fifth region $SC_5$ forming a rectifier junction together with the fourth region $SC_4$, and (6) a gate portion G shared by the first transistor $TR_1$ and the second transistor $TR_2$, and formed on a barrier layer so as to bridge the first region $SC_1$ and the fourth region $SC_4$ and so as to bridge the second region $SC_2$ and the third region $SC_3$, wherein;

(A-1) one source/drain region of the first transistor $TR_1$ is constituted of the surface region of the fourth region $SC_4$, (A-2) the other source/drain region of the first transistor $TR_1$ is constituted of the surface region of the first region $SC_1$ sandwiched by the second region $SC_2$ and the third region $SC_3$, (A-3) a channel forming region $CH_1$ of the first transistor $TR_1$ is constituted of the surface region of the third region $SC_3$ sandwiched by the surface region of the first region $SC_1$ and the surface region of the fourth region $SC_4$, (B-1) one source/drain region of the second transistor $TR_2$ is constituted of the second region $SC_2$, (B-2) the other source/drain region of the second transistor $TR_2$ is constituted of the surface region of the third region $SC_3$ constituting the channel forming region $CH_1$ of the first transistor $TR_1$, (B-3) a channel forming region $CH_2$ of the second transistor $TR_2$ is constituted of the surface region of the first region $SC_1$ constituting the other source/drain region of the first transistor $TR_1$, (C-1) gate regions of the junction-field-effect transistor $TR_3$ are constituted of the fifth region $SC_5$ and a portion of the third region $SC_3$ facing the fifth region $SC_5$, (C-2) a channel region $CH_3$ of the junction-field-effect transistor $TR_3$ is constituted of part of the fourth region $SC_4$ sandwiched by the fifth region $SC_5$ and said portion of the third region $SC_3$, (C-3) one source/drain region of the junction-field-effect transistor $TR_3$ is constituted of a portion of the fourth region $SC_4$ extending from one end of the channel region $CH_3$ of the junction-field-effect transistor $TR_3$ and constituting one source/drain region of the first transistor $TR_1$, (C-4) the other source/drain region of the junction-field-effect transistor $TR_3$ is constituted of a portion of the fourth region $SC_4$ extending from the other end of the channel region $CH_3$ of the junction-field-effect transistor $TR_3$, (D) the gate portion G is connected to a first memory-cell-selecting line, (E) a diode D is formed between the first region $SC_1$ and the second region $SC_2$, and the first region $SC_1$ is connected to a write-in information setting line through the diode D, (F) the second region $SC_2$ and the fifth region $SC_5$ are connected to the write-in information setting line, and (G) the portion of the fourth region $SC_4$ constituting the other source/drain region of the junction-field-effect transistor $TR_3$ is connected to a predetermined potential line.

In the semiconductor memory cell according to the third aspect of the present invention, the configuration in which each of the second region $SC_2$ and the fifth region $SC_5$ is connected to the write-in information setting line includes a configuration in which the second region $SC_2$ and part of the write-in information setting line are fabricated in common and the fifth region $SC_5$ and part of the write-in information setting line are fabricated in common.

In the semiconductor memory cell according to the third aspect of the present invention, the diode D is formed between the first region $SC_1$ and the second region $SC_2$. When there is possibility that latch-up takes place, the semiconductor memory cell preferably has, a configuration in which the semiconductor memory cell further has, as shown in a principle drawing of FIG. 15A, a sixth semi-conductive or conductive region $SC_6$ formed in the surface region of the first region $SC_1$, said sixth region $SC_6$ forming a rectifier junction together with the first region $SC_1$, the diode $D_1$ is constituted of the sixth region $SC_6$ and the first region $SC_1$, and one end of the diode $D_1$ is connected to the write-in information setting line. Alternatively, the semiconductor memory cell preferably has a configuration in which the semiconductor memory cell further has a sixth semi-conductive or conductive region $SC_6$ formed in the surface region of the first region $SC_1$, said sixth region $SC_6$ forming a rectifier junction together with the first region $SC_1$, said rectifier junction between the sixth region $SC_6$ and the first region $SC_1$ being a majority carrier junction such as a Schottky junction or an ISO-type hetero junction, the diode D is constituted of the sixth region $SC_6$ and the first region $SC_1$, and the sixth region $SC_6$ has a common region with part of the write-in information setting line, that is, the sixth region $SC_6$ and part of the write-in information setting line are fabricated in common.

In the semiconductor memory cell according to the third aspect of the present invention, as shown in a principle drawing of FIG. 16A, the semiconductor memory cell preferably has a configuration in which the fifth region $SC_5$ is connected to the third region $SC_3$ in place of being connected to the write-in information setting line, to simplify the wiring configuration of the semiconductor memory cell. In this configuration, the diode D is formed between the first region $SC_1$ and the second region $SC_2$. When there is possibility that latch-up takes place, as shown in a principle drawing of FIG. 16B, the semiconductor memory cell preferably has a configuration in which the semiconductor memory cell further has a sixth semi-conductive or conductive region $SC_6$ formed in the surface region of the first region $SC_1$, said sixth region $SC_6$ forming a rectifier junction together with the first region $SC_1$, the diode $D_1$ is constituted of the sixth region $SC_6$ and the first region $SC_1$, and one end of the diode $D_1$ is connected to the write-in information setting line. Alternatively, the semiconductor memory cell preferably has a configuration in which the semiconductor memory cell further has a sixth semi-conductive or conductive region $SC_6$ formed in the surface region of the first region $SC_1$, said sixth region $SC_6$ forming a rectifier junction together with the first region $SC_1$, said rectifier junction between the sixth region $SC_6$ and the first region $SC_1$ being a majority carrier junction such as a Schottky junction or an ISO-type hetero junction, the diode D is constituted of the sixth region $SC_6$ and the first region $SC_1$, and the sixth region $SC_6$ has a common region with part of the write-in information setting line, that is, the sixth region $SC_6$ and part of the write-in information setting line are fabricated in common.

A semiconductor memory cell according to a fourth aspect of the present invention for achieving the above object has the same fundamental configuration as that of the semiconductor memory cell according to the second aspect of the present invention.

That is, as shown in a principle drawing of FIG. 19A, according to the fourth aspect of the present invention, there is provided a semiconductor memory cell comprising a first transistor of a first conductivity type for read-out $TR_1$, a second transistor of a second conductivity type for write-in $TR_2$, a junction-field-effect transistor of the first conductivity type for current control $TR_3$ and a third transistor of the second conductivity type for write-in $TR_4$, said semiconductor memory cell having;

(1) a first semi-conductive region $SC_1$ of the first conductivity type, (2) a second semi-conductive or conductive region $SC_2$ formed in a surface region of the first region $SC_1$, said second region $SC_2$ forming a rectifier junction together with the first region $SC_1$, (3) a third semi-conductive region $SC_3$ of the second conductivity type formed in a surface region of the first region $SC_1$ and spaced from the second region $SC_2$, (4) a fourth semi-conductive region $SC_4$ of the first conductivity type formed in a surface region of the third region $SC_3$, (5) a fifth semi-conductive or conductive region $SC_5$ formed in a surface region of the fourth region $SC_4$, said fifth region $SC_5$ forming a rectifier junction together with the fourth region $SC_4$, and (6) a gate portion G shared by the first transistor $TR_1$, the second transistor $TR_2$ and the third transistor $TR_4$, and formed on a barrier layer so as to bridge the first region $SC_1$ and the fourth region $SC_4$, so as to bridge the second region $SC_2$ and the third region $SC_3$ and so as to bridge the third region $SC_3$ and the fifth region $SC_5$, wherein;

(A-1) one source/drain region of the first transistor $TR_1$ is constituted of the surface region of the fourth region $SC_4$, (A-2) the other source/drain region of the first transistor $TR_1$ is constituted of the surface region of the first region $SC_1$ sandwiched by the second region $SC_2$ and the third region $SC_3$, (A-3) a channel forming region $CH_1$ of the first transistor $TR_1$ is constituted of the surface region of the third region $SC_3$ sandwiched by the surface region of the first region $SC_1$ and the surface region of the fourth region $SC_4$, (B-1) one source/drain region of the second transistor $TR_2$ is constituted of the second region $SC_2$, (B-2) the other source/drain region of the second transistor $TR_2$ is constituted of the surface region of the third region $SC_3$ constituting the channel forming region $CH_1$ of the first transistor $TR_1$, (B-3) a channel forming region $CH_2$ of the second transistor $TR_2$ is constituted of the surface region of the first region $SC_1$ constituting the other source/drain region of the first transistor $TR_1$, (C-1) gate regions of the junction-field-effect transistor $TR_3$ are constituted of the fifth region $SC_5$ and a portion of the third region $SC_3$ facing the fifth region $SC_5$, (C-2) a channel region $CH_3$ of the junction-field-effect transistor $TR_3$ is constituted of part of the fourth region $SC_4$ sandwiched by the fifth region $SC_5$ and the portion of the third region $SC_3$, (C-3) one source/drain region of the junction-field-effect transistor $TR_3$ is constituted of a portion of the fourth region $SC_4$ extending from one end of the channel region $CH_3$ of the junction-field-effect transistor $TR_3$ and constituting one source/drain region of the first transistor $TR_1$, (C-4) the other source/drain region of the junction-field-effect transistor $TR_3$ is constituted of a portion of the fourth region $SC_4$ extending from the other end of the channel region $CH_3$ of the junction-field-effect transistor $TR_3$, (D-1) one source/drain region of the third transistor $TR_4$ is constituted of the surface region of the third region $SC_3$ constituting the channel forming region $CH_1$ of the first transistor $TR_1$, (D-2) the other source/drain region of the third transistor $TR_4$ is constituted of the fifth region $SC_5$, (D-3) a channel forming region $CH_4$ of the third transistor $TR_4$ is constituted of the surface region of the fourth region $SC_4$ functioning as one source/drain region of the first transistor $TR_1$, (E) the gate portion G is connected to a first memory-cell-selecting line, (F) a diode D is formed between the first region $SC_1$ and the second region $SC_2$, and the first region $SC_1$ is connected to a write-in information setting line through the diode D, (G) the second region $SC_2$ is connected to the write-in information setting line, and (H) the portion of the fourth region $SC_4$ constituting the other source/drain region of the junction-field-effect transistor $TR_3$ is connected to a predetermined potential line.

In the semiconductor memory cell according to the fourth aspect of the present invention, the configuration in which the second region $SC_2$ is connected to the write-in information setting line includes a configuration in which the second region $SC_2$ and part of the write-in information setting line are fabricated in common.

In the semiconductor memory cell according to the fourth aspect of the present invention, the diode D is formed between the first region $SC_1$ and the second region $SC_2$. When there is possibility that latch-up takes place, as shown in a principle drawing of FIG. 15A, the semiconductor memory cell preferably has a configuration in which the semiconductor memory cell further has a sixth semi-conductive or conductive region $SC_6$ formed in the surface region of the first region $SC_1$, said sixth region $SC_6$ forming a rectifier junction together with the first region $SC_1$, the diode $D_1$ is constituted of the sixth region $SC_6$ and the first region $SC_1$, and one end of the diode $D_1$ is connected to the write-in information setting line. Alternatively, the semiconductor memory cell preferably has a configuration in which the semiconductor memory cell further has a sixth semi-conductive or conductive region $SC_6$ formed in the surface region of the first region $SC_1$, said sixth region $SC_6$ forming a rectifier junction together with the first region $SC_1$, said rectifier junction between the sixth region $SC_6$ and the first region $SC_1$ being a majority carrier junction such as a Schottky junction or an ISO-type hetero junction, the diode D is constituted of the sixth region $SC_6$ and the first region $SC_1$, and the sixth region $SC_6$ has a common region with part of the write-in information setting line, that is, the sixth region $SC_6$ and part of the write-in information setting line are fabricated in common.

The semiconductor memory cell according to the first to fourth aspects of the present invention can be formed in a surface region of a semiconductor substrate, formed on an insulating layer or an insulator formed on a semiconductor substrate or a supporting substrate, formed in a well of the first conductivity type in a semiconductor substrate, or formed on an electric insulator, and is preferably formed in a well of the first conductivity type or formed on an insulator including an insulating layer and an insulating substrate, for preventing alpha-particle or neutron induced soft error.

In the semiconductor memory cell according to any one of the first to fourth aspects of the present invention, a region $SC_7$ containing a high concentration of an impurity having the first conductivity type is preferably formed under the third region $SC_3$, for increasing a potential or an electric charge stored in the channel forming region $CH_1$ of the first transistor $TR_1$.

A method for manufacturing a semiconductor memory cell according to the first aspect of the present invention is a method in which the semiconductor memory cell according to any one of the first to fourth aspects of the present invention is manufactured.

That is, a method for manufacturing a semiconductor memory cell comprising at least a first transistor of a first conductivity type for read-out $TR_1$, a second transistor of a second conductivity type for write-in $TR_2$ and a junction-field-effect transistor of the first conductivity type for current control $TR_3$, said semiconductor memory cell having;

(1) a first semi-conductive region $SC_1$ of the first conductivity type, (2) a second semi-conductive or conductive region $SC_2$ formed in a surface region of the first region $SC_1$, said second region $SC_2$ forming a rectifier junction together with the first region $SC_1$, (3) a third semi-conductive region $SC_3$ of the second conductivity type formed in a surface region of the first region $SC_1$ and spaced from the second region $SC_2$, (4) a fourth semi-conductive region $SC_4$ of the first conductivity type formed in a surface region of the third region $SC_3$, (5) a fifth semi-conductive or conductive region $SC_5$ formed in a surface region of the fourth region $SC_4$, said fifth region $SC_5$ forming a rectifier junction together with the fourth region $SC_4$, and (6) a gate portion G shared by the first transistor $TR_1$ and the second transistor $TR_2$, and formed on a barrier layer at least so as to bridge the first region $SC_1$ and the fourth region $SC_4$ and so as to bridge the second region $SC_2$ and the third region $SC_3$, the first transistor $TR_1$ having;

(A-1) one source/drain region constituted of the surface region of the fourth region $SC_4$, (A-2) the other source/drain region constituted of the surface region of the first region $SC_1$ sandwiched by the second region $SC_2$ and the third region $SC_3$, and (A-3) a channel forming region $CH_1$ constituted of the surface region of the third region $SC_3$ sandwiched by the surface region of the first region $SC_1$ and the surface region of the fourth region $SC_4$, the second transistor $TR_2$ having;

(B-1) one source/drain region constituted of the second region $SC_2$, (B-2) the other source/drain region constituted of the surface region of the third region $SC_3$ constituting the channel forming region $CH_1$ of the first transistor $TR_1$, and (B-3) a channel forming region $CH_2$ constituted of the surface region of the first region $SC_1$ constituting the other source/drain region of the first transistor $TR_1$, and the junction-field-effect transistor $TR_3$ having;

(C-1) gate regions constituted of the fifth region $SC_5$ and a portion of the third region $SC_3$ facing the fifth region $SC_5$, (C-2) a channel region $CH_3$ constituted of part of the fourth region $SC_4$ sandwiched by the fifth region $SC_5$ and said portion of the third region $SC_3$, (C-3) one source/drain region constituted of a portion of the fourth region $SC_4$ extending from one end of the channel region $CH_3$ of the junction-field-effect transistor $TR_3$ and constituting one source/drain region of the first transistor $TR_1$, (C-4) the other source/drain region constituted of a portion of the fourth region $SC_4$ extending from the other end of the channel region $CH_3$ of the junction-field-effect transistor $TR_3$, said method comprising the steps of;

forming the barrier layer at least on the surfaces of the first region $SC_1$ and the third region $SC_3$, and then, forming the gate portion G on the barrier layer, and forming the third region $SC_3$, the fourth region $SC_4$ and the fifth region $SC_5$ by ion implantation in an arbitrary order so as to optimize a distance between the facing gate regions of the junction-field-effect transistor $TR_3$ and so as to optimize impurity concentrations of the facing gate regions and the channel region $CH_3$ of the junction-field-effect transistor $TR_3$.

Each of the second region $SC_2$ and the fifth region $SC_5$ in the semiconductor memory cell according to any one of the first to fourth aspects of the present invention may be constituted of a silicide, a metal or a metal compound, and is preferably constituted of semiconductor. When the sixth region $SC_6$ is formed in the semiconductor memory cell according to any one of the first to fourth aspects of the present invention, the sixth region $SC_6$ may be constituted of semiconductor, and is preferably constituted of a silicide, a metal or a metal compound, and, in this case, the second region $SC_2$ is preferably constituted of semiconductor.

In the semiconductor memory cell according to any one of the first to fourth aspects of the present invention, each gate portion of the first transistor $TR_1$ and the second transistor $TR_2$ is connected to the first memory-cell-selecting line. It is therefore sufficient to provide one first memory-cell-selecting line, so that the chip area can be decreased.

In the semiconductor memory cell according to any one of the first aspect to fourth aspects of the present invention, the third region $SC_3$ functioning as (or corresponding to) the other source/drain region of the second transistor $TR_2$ functions as (or corresponds to) the channel forming region $CH_1$ of the first transistor $TR_1$. The first region $SC_1$ functioning as (or corresponding to) the channel forming region $CH_2$ of the second transistor $TR_2$ and functioning as (or corresponding to) the other source/drain region of the first transistor $TR_1$ is connected to the write-in information setting line. And, when the on- and off-states of the first transistor $TR_1$ and the second transistor $TR_2$ can be controlled by properly selecting a potential in the first memory-cell-selecting line. That is, when the potential of the first memory-cell-selecting line is set at a potential as high enough to bring the second transistor $TR_2$ into an on-state at a write-in time, the second transistor $TR_2$ is brought into an on-state, and whereby an electric charge is charged or accumulated in a capacitor formed between the first region $SC_1$ and the third region $SC_3$ in the second transistor $TR_2$ depending upon the potential of the write-in information setting line. As a result, the information is stored in the channel forming region $CH_1$ (the third region $SC_3$) of the first transistor $TR_1$ as a potential difference between the first region $SC_1$ and the third region $SC_3$ or as an electric charge. When the information is read out, the potential of the first region $SC_1$ is set at a read-out potential, and in the first transistor $TR_1$, the potential or the electric charge (the information) stored or accumulated in the channel forming region $CH_1$ of the first transistor $TR_1$ is converted to a potential difference between the third region $SC_3$ (functioning as or corresponding to the channel forming region $CH_1$) and the fourth region $SC_4$ (functioning as or corresponding to the source/drain region), or to an electric charge. As a result, the threshold voltage of the first transistor $TR_1$ seen from the gate region G varies depending upon the above potential difference or electric charge (the information). When the information is read out, therefore, the on/off operation of the first transistor $TR_1$ can be controlled by applying a properly selected potential to the gate portion G. That is, the information can be read out by detecting the operation state of the first transistor $TR_1$.

Moreover, the semiconductor memory cell according to any one of the first to fourth aspects of the present invention is provided with the junction-field-effect transistor $TR_3$ in addition to the first transistor $TR_1$ and the second transistor $TR_2$. Since the on/off operation of the junction-field-effect transistor $TR_3$ is controlled when the information is read out, a large margin can be assured for the current which flows between the first region $SC_1$ and the fourth region $SC_4$. As a result, the number of semiconductor memory cells that can be connected to the second memory-cell-selecting line is hardly limited, and further, the information holding time (retention time) of the semiconductor memory cell can be increased.

Further, since the diode D or $D_1$ is provided, it is not required to form a line to be connected to the first region $SC_1$. If a potential to be applied to the write-in information setting line is not a low degree of voltage (0.4 volt or lower in a case of a pn junction) at which no large forward current flows in the junction portion of the second region $SC_2$ and the first region $SC_1$ at a write-in time, there is possibility that latch-up takes place. The above problem can be overcome, for example, by a method in which the sixth region $SC_6$ in the semiconductor memory cell is formed in the surface region of the first region $SC_1$, a material such as a silicide, a metal or a metal compound is used to constitute the sixth region $SC_6$, and the junction between the sixth region $SC_6$ and the first region $SC_1$ is formed as a junction in which majority carrier mainly constitutes a forward current like in a Schottky junction. That is, the sixth region $SC_6$ is constituted of a silicide layer, a metal layer formed of Mo, Al or the like, or a metal compound layer, and thus, a diode $D_1$ of a Schottky junction type is formed. The sixth region $SC_6$ may be constituted of a material in common with that constituting the write-in information setting line, such as titanium silicide or TiN used as a barrier layer or a glue layer. That is, the semiconductor memory cell preferably has a configuration in which the sixth region $SC_6$ is formed in the surface region of the first region $SC_1$ and the sixth region $SC_6$ has a common region with part of the write-in information setting line, that is, the sixth region $SC_6$ and part of the write-in information setting line are fabricated in common. The configuration in which the sixth region $SC_6$ has a common region with part of the write-in information setting line includes a configuration in which the sixth region $SC_6$ is constituted of a compound formed by reacting a material for a wiring with silicon (Si) in a silicon semiconductor substrate.

The semiconductor memory cell according to the second or fourth aspect of the present invention is provided with the third transistor for write-in $TR_4$ in addition to the junction-field-effect transistor $TR_3$. Since the on/off operations of these transistors $TR_3$ and $TR_4$ are controlled when the information is read out, a large margin can be assured for the current which flows between the first region $SC_1$ and the fourth region $SC_4$. As a result, the number of semiconductor memory cells connectable to the second memory cell-selecting line becomes less liable to be limited.

As shown in a principle drawing of FIG. 24A, for achieving the above object, according to a fifth aspect of the present invention, there is provided a semiconductor memory cell provided with a semi-conductive layer having a first main surface and a second main surface opposed to the first main surface, said semiconductor memory cell comprising a first transistor of a first conductivity type for read-out $TR_1$, a second transistor of a second conductivity type for write-in $TR_2$ and a junction-field-effect transistor of the first conductivity type for current control $TR_3$, and having;

(1) a first semi-conductive region $SC_1$ of the first conductivity type, formed through the semi-conductive layer from the first main surface to the second main surface, (2) a second semi-conductive region $SC_2$ of the second conductivity type, formed through the semi-conductive layer from the first main surface to the second main surface and being in contact with the first region $SC_1$, (3) a third semi-conductive or conductive region $SC_3$ formed in a surface region, including the second main surface, of the first region $SC_1$ and spaced from the second region $SC_2$, said third region $SC_3$ forming a rectifier junction together with the first region $SC_1$, (4) a fourth semi-conductive or conductive region $SC_4$ formed in a surface region, including the first main surface, of the second region $SC_2$ and spaced from the first region $SC_1$, said fourth region $SC_4$ forming a rectifier junction together with the second region $SC_2$, (5) a fifth semi-conductive or conductive region $SC_5$ formed in a surface region, including the first main surface, of the first region $SC_1$ and spaced from the second region $SC_2$, said fifth region $SC_5$ forming a rectifier junction together with the first region $SC_1$, (6) a gate portion $G_1$ of the first transistor $TR_1$ formed on a barrier layer formed on the first main surface so as to bridge the first region $SC_1$ and the fourth region $SC_4$, and (7) a gate portion $G_2$ of the second transistor $TR_2$ formed on a barrier layer formed on the second main surface so as to bridge the second region $SC_2$ and the third region $SC_3$, wherein;

(A-1) one source/drain region of the first transistor $TR_1$ is constituted of a surface region, including the first main surface, of the first region $SC_1$, (A-2) the other source/drain region of the first transistor $TR_1$ is constituted of the fourth region $SC_4$, (A-3) a channel forming region $CH_1$ of the first transistor $TR_1$ is constituted of a surface region, including the first main surface, of the second region $SC_2$ which surface region is sandwiched by the surface region, including the first main surface, of the first region $SC_1$ and the fourth region $SC_4$, (B-1) one source/drain region of the second transistor $TR_2$ is constituted of the third region $SC_3$, (B-2) the other source/drain region of the second transistor $TR_2$ is constituted of a surface region, including the second main surface, of the second region $SC_2$, (B-3) a channel forming region $CH_2$ of the second transistor $TR_2$ is constituted of a surface region, including the second main surface, of the first region $SC_1$ which surface region is sandwiched by the third region $SC_3$ and the surface region, including the second main surface, of the second region $SC_2$, (C-1) gate regions of the junction-field-effect transistor $TR_3$ are constituted of the fifth region $SC_5$ and the third region $SC_3$ facing the fifth region $SC_5$, (C-2) a channel region $CH_3$ of the junction-field-effect transistor $TR_3$ is constituted of a portion of the first region $SC_1$ sandwiched by the fifth region $SC_5$ and the third region $SC_3$, (C-3) one source/drain region of the junction-field-effect transistor $TR_3$ is constituted of a portion of the first region $SC_1$ extending from one end of the channel region $CH_3$ of the junction-field-effect transistor $TR_3$ and constituting one source/drain region of the first transistor $TR_1$ and the channel forming region $CH_2$ of the second transistor $TR_2$, (C-4) the other source/drain region of the junction-field-effect transistor $TR_3$ is constituted of a portion of the first region $SC_1$ extending from the other end of the channel region $CH_3$ of the junction-field-effect transistor $TR_3$, (D) the gate portion $G_1$ of the first transistor $TR_1$ and the gate portion $G_2$ of the second transistor $TR_2$ are connected to a first memory-cell-selecting line, (E) the third region $SC_3$ is connected to a write-in information setting line, (F) the fourth region $SC_4$ is connected to a second memory-cell-selecting line, (G) the other source/drain region of the junction-field-effect transistor $TR_3$ is connected to a predetermined potential line, and (H) the fifth region $SC_5$ is connected to a second predetermined potential line.

In the semiconductor memory cell according to the fifth aspect of the present invention, as shown in a principle drawing of FIG. 24B, the semiconductor memory cell preferably has a configuration in which the fifth region $SC_5$ is connected to the write-in information setting line in place of being connected to the second predetermined potential line, to simplify the wiring configuration of the semiconductor memory cell.

Alternatively, in the semiconductor memory cell according to the fifth aspect of the present invention, as shown in a principle drawing of FIG. 31A, the semiconductor memory cell preferably has a configuration in which the fourth region $SC_4$ is connected to the predetermined potential line in place of being connected to the second memory-cell-selecting line, and the other source/drain region of the junction-field-effect transistor $TR_3$ is connected to the second memory-cell-selecting line in place of being connected to the predetermined potential line. In this configuration, as shown in a principle drawing of FIG. 31B, the semiconductor memory cell preferably has a configuration in which the fifth region $SC_5$ is connected to the write-in information setting line in place of being connected to the second predetermined potential line.

In the semiconductor memory cell according to the fifth aspect of the present invention, the configuration in which the third region $SC_3$ is connected to the write-in information setting line includes a configuration in which the third region $SC_3$ and part of the write-in information setting line are fabricated in common. The configuration in which the fourth region $SC_4$ is connected to the second memory-cell-selecting line includes a configuration in which the fourth region $SC_4$ and part of the second memory-cell-selecting line are fabricated in common. The configuration in which the fifth region $SC_5$ is connected to the second predetermined potential line includes a configuration in which the fifth region $SC_5$ and part of the second predetermined potential line are fabricated in common. When the fifth region $SC_5$ is connected to the write-in information setting line, the configuration in which the fifth region $SC_5$ is connected to the write-in information setting line includes a configuration in which the fifth region $SC_5$ and part of the write-in information setting line are fabricated in common. Further, the configuration in which the fourth region $SC_4$ is connected to the predetermined potential line includes a configuration in which the fourth region $SC_4$ and part of the predetermined potential line are fabricated in common.

As shown in a principle drawing of FIG. 33A, for achieving the above object, according to a sixth aspect of the present invention, there is provided a semiconductor memory cell provided with a semi-conductive layer having a first main surface and a second main surface opposed to the first main surface, said semiconductor memory cell comprising a first transistor of a first conductivity type for read-out $TR_1$, a second transistor of a second conductivity type for write-in $TR_2$ and a junction-field-effect transistor of the first conductivity type for current control $TR_3$, and having;

(1) a first semi-conductive region $SC_1$ of the first conductivity type, formed through the semi-conductive layer from the first main surface to the second main surface, (2) a second semi-conductive region $SC_2$ of the second conductivity type, formed through the semi-conductive layer from the first main surface to the second main surface and being in contact with the first region $SC_1$, (3) a third semi-conductive or conductive region $SC_3$ formed in a surface region, including the second main surface, of the first region $SC_1$ and spaced from the second region $SC_2$, said third region $SC_3$ forming a rectifier junction together with the first region $SC_1$, (4) a fourth semi-conductive or conductive region $SC_4$ formed in a surface region, including the first main surface, of the second region $SC_2$ and spaced from the first region $SC_1$, said fourth region $SC_4$ forming a rectifier junction together with the second region $SC_2$, (5) a fifth semi-conductive or conductive region $SC_5$ formed in a surface region of the fourth region $SC_4$, said fifth region $SC_5$ forming a rectifier junction together with the fourth region $SC_4$, (6) a gate portion $G_1$ of the first transistor $TR_1$ formed on a barrier layer formed on the first main surface so as to bridge the first region $SC_1$ and the fourth region $SC_4$, and (7) a gate portion $G_2$ of the second transistor $TR_2$ formed on a barrier layer formed on the second main surface so as to bridge the second region $SC_2$ and the third region $SC_3$, wherein;

(A-1) one source/drain region of the first transistor $TR_1$ is constituted of a surface region, including the first main surface, of the first region $SC_1$, (A-2) the other source/drain region of the first transistor $TR_1$ is constituted of the fourth region $SC_4$, (A-3) a channel forming region $CH_1$ of the first transistor $TR_1$ is constituted of a surface region, including the first main surface, of the second region $SC_2$ which surface region is sandwiched by the surface region, including the first main surface, of the first region $SC_1$ and the fourth region $SC_4$, (B-1) one source/drain region of the second transistor $TR_2$ is constituted of the third region $SC_3$, (B-2) the other source/drain region of the second transistor $TR_2$ is constituted of a surface region, including the second main surface, of the second region $SC_2$, (B-3) a channel forming region $CH_2$ of the second transistor $TR_2$ is constituted of a surface region, including the second main surface, of the first region $SC_1$ which surface region is sandwiched by the third region $SC_3$ and the surface region, including the second main surface, of the second region $SC_2$, (C-1) gate regions of the junction-field-effect transistor $TR_3$ are constituted of the fifth region $SC_5$ and a portion of the second region $SC_2$ facing the fifth region $SC_5$, (C-2) a channel region $CH_3$ of the junction-field-effect transistor $TR_3$ is constituted of a portion of the fourth region $SC_4$ sandwiched by the fifth region $SC_5$ and said portion of the second region $SC_2$, (C-3) one source/drain region of the junction-field-effect transistor $TR_3$ is constituted of a portion of the fourth region $SC_4$ extending from one end of the channel region $CH_3$ of the junction-field-effect transistor $TR_3$ and constituting the other source/drain region of the first transistor $TR_1$, (C-4) the other source/drain region of the junction-field-effect transistor $TR_3$ is constituted of a portion of the fourth region $SC_4$ extending from the other end of the channel region $CH_3$ of the junction-field-effect transistor $TR_3$, (D) the gate portion $G_1$ of the first transistor $TR_1$ and the gate portion $G_2$ of the second transistor $TR_2$ are connected to a first memory-cell-selecting line, (E) the third region $SC_3$ is connected to a write-in information setting line, (F) the first region $SC_1$ is connected to a predetermined potential line, (G) the other source/drain region of the junction-field-effect transistor $TR_3$ is connected to a second memory-cell-selecting line, and (H) the fifth region $SC_5$ is connected to a second predetermined potential line.

As shown in a principle drawing of FIG. 33B, the semiconductor memory cell according to the sixth aspect of the present invention preferably has a configuration in which the fifth region $SC_5$ is connected to the second region $SC_2$ in place of being connected to the second predetermined potential line, to simplify the wiring configuration of the semiconductor memory cell.

Alternatively, as shown in a principle drawing of FIG. 39A, the semiconductor memory cell according to the sixth aspect of the present invention preferably has a configuration in which the other source/drain region of the junction-field-effect transistor $TR_3$ is connected to the predetermined potential line in place of being connected to the second memory-cell-selecting line, and the first region $SC_1$ is connected to the second memory-cell-selecting line in place of being connected to the predetermined potential line. In this configuration, as shown in a principle drawing of FIG. 39B, the semiconductor memory cell preferably has a configuration in which the fifth region $SC_5$ is connected to the second region $SC_2$ in place of being connected to the second predetermined potential line.

In the semiconductor memory cell according to the sixth aspect of the present invention, the configuration in which the third region $SC_3$ is connected to the write-in information setting line includes a configuration in which the third region $SC_3$ and part of the write-in information setting line are fabricated in common. The configuration in which the fifth region $SC_5$ is connected to the second predetermined potential line includes a configuration in which the fifth region $SC_5$ and part of the second predetermined potential line are fabricated in common.

As shown in a principle drawing of FIG. 41, for achieving the above object, a semiconductor memory cell according to a seventh aspect of the present invention has a configuration in which a sixth region $SC_6$ is further formed in the semiconductor memory cell according to the sixth aspect of the present invention and, thus, a second junction-field-effect transistor $TR_5$ is added.

That is, according to the seventh aspect of the present invention, there is provided a semiconductor memory cell provided with a semi-conductive layer having a first main surface and a second main surface opposed to the first main surface, said semiconductor memory cell comprising a first transistor of a first conductivity type for read-out $TR_1$, a second transistor of a second conductivity type for write-in $TR_2$, a first junction-field-effect transistor of the first conductivity type for current control $TR_3$ and a second junction-field-effect transistor of the first conductivity type for current control $TR_5$, and having;

(1) a first semi-conductive region $SC_1$ of the first conductivity type, formed through the semi-conductive layer from the first main surface to the second main surface, (2) a second semi-conductive region $SC_2$ of the second conductivity type, formed through the semi-conductive layer from the first main surface to the second main surface and being in contact with the first region $SC_1$, (3) a third semi-conductive or conductive region $SC_3$ formed in a surface region, including the second main surface, of the first region $SC_1$ and spaced from the second region $SC_2$, said third region $SC_3$ forming a rectifier junction together with the first region $SC_1$, (4) a fourth semi-conductive or conductive region $SC_4$ formed in a surface region, including the first main surface, of the second region $SC_2$ and spaced from the first region $SC_1$, said fourth region $SC_4$ forming a rectifier junction together with the second region $SC_2$, (5) a fifth semi-conductive or conductive region $SC_5$ formed in a surface region of the fourth region $SC_4$, said fifth region $SC_5$ forming a rectifier junction together with the fourth region $SC_4$, (6) a sixth semi-conductive or conductive region $SC_6$ formed in a surface region, including the first main surface, of the first region $SC_1$ and spaced from the second region $SC_2$, said sixth region $SC_6$ forming a rectifier junction together with the first region $SC_1$, (7) a gate portion $G_1$ of the first transistor $TR_1$ formed on a barrier layer formed on the first main surface so as to bridge the first region $SC_1$ and the fourth region $SC_4$, and (8) a gate portion $G_2$ of the second transistor $TR_2$ formed on a barrier layer formed on the second main surface so as to bridge the second region $SC_2$ and the third region $SC_3$, wherein;

(A-1) one source/drain region of the first transistor $TR_1$ is constituted of a surface region, including the first main surface, of the first region $SC_1$, (A-2) the other source/drain region of the first transistor $TR_1$ is constituted of the fourth region $SC_4$, (A-3) a channel forming region $CH_1$ of the first transistor $TR_1$ is constituted of a surface region, including the first main surface, of the second region $SC_2$ which surface region is sandwiched by the surface region, including the first main surface, of the first region $SC_1$ and the fourth region $SC_4$, (B-1) one source/drain region of the second transistor $TR_2$ is constituted of the third region $SC_3$, (B-2) the other source/drain region of the second transistor $TR_2$ is constituted of a surface region, including the second main surface, of the second region $SC_2$, (B-3) a channel forming region $CH_2$ of the second transistor $TR_2$ is constituted of a surface region, including the second main surface, of the first region $SC_1$ which surface region is sandwiched by the third region $SC_3$ and the surface region, including the second main surface, of the second region $SC_2$, (C-1) gate regions of the first junction-field-effect transistor $TR_3$ are constituted of the fifth region $SC_5$ and a portion of the second region $SC_2$ facing the fifth region $SC_5$, (C-2) a channel region $CH_3$ of the first junction-field-effect transistor $TR_3$ is constituted of a portion of the fourth region $SC_4$ sandwiched by the fifth region $SC_5$ and said portion of the second region $SC_2$, (C-3) one source/drain region of the first junction-field-effect transistor $TR_3$ is constituted of a portion of the fourth region $SC_4$ extending from one end of the channel region $CH_3$ of the first junction-field-effect transistor $TR_3$ and constituting the other source/drain region of the first transistor $TR_1$, (C-4) the other source/drain region of the first junction-field-effect transistor $TR_3$ is constituted of a portion of the fourth region $SC_4$ extending from the other end of the channel region $CH_3$ of the first junction-field-effect transistor $TR_3$, (D-1) gate regions of the second junction-field-effect transistor $TR_5$ are constituted of the sixth region $SC_6$ and the third region $SC_3$, (D-2) a channel region $CH_5$ of the second junction-field-effect transistor $TR_5$ is constituted of a portion of the first region $SC_1$ sandwiched by the sixth region $SC_6$ and the third region $SC_3$, (D-3) one source/drain region of the second junction-field-effect transistor $TR_5$ is constituted of a portion of the first region $SC_1$ extending from one end of the channel region $CH_5$ of the second junction-field-effect transistor $TR_1$ and constituting one source/drain region of the first transistor $TR_1$ and the channel forming region $CH_2$ of the second transistor $TR_2$, (D-4) the other source/drain region of the second junction-field-effect transistor $TR_5$ is constituted of a portion of the first region $SC_1$ extending from the other end of the channel region $CH_5$ of the second junction-field-effect transistor $TR_5$, (E) the gate portion $G_1$ of the first transistor $TR_1$ and the gate portion $G_2$ of the second transistor $TR_2$ are connected to a first memory-cell-selecting line, (F) the third region $SC_3$ is connected to a write-in information setting line, (G) the other source/drain region of the second junction-field-effect transistor $TR_5$ is connected to a predetermined potential line, (H) the other source/drain region of the first junction-field-effect transistor $TR_3$ is connected to a second memory-cell-selecting line, and (I) the fifth region $SC_5$ and the sixth region $SC_6$ are connected to a second predetermined potential line.

As shown in a principle drawing of FIG. 44, the semiconductor memory cell according to the seventh aspect of the present invention preferably has a configuration in which the other source/drain region of the first junction-field-effect transistor $TR_3$ is connected to the predetermined potential line in place of being connected to the second memory-cell-selecting line, and the other source/drain region of the second junction-field-effect transistor $TR_5$ is connected to the second memory-cell-selecting line in place of being connected to the predetermined potential line.

Alternatively, the semiconductor memory cell according to the seventh aspect of the present invention preferably has a configuration in which the fifth region $SC_5$ is connected to the second region $SC_2$ in place of being connected to the second predetermined potential line. The sixth region $SC_6$ may be connected to the write-in information setting line in place of being connected to the second predetermined potential line. Alternatively, as shown in a principle drawing of FIG. 46, the semiconductor memory cell according to the seventh aspect of the present invention preferably has a configuration in which the fifth region $SC_5$ is connected to the second region $SC_2$ in place of being connected to the second predetermined potential line, and the sixth region $SC_6$ is connected to the write-in information setting line in place of being connected to the second predetermined potential line. In these configurations, as shown in a principle drawing of FIG. 51, the semiconductor memory cell preferably has a configuration in which the other source/drain region of the first junction-field-effect transistor $TR_3$ is connected to the predetermined potential line in place of being connected to the second memory-cell-selecting line, and the other source/drain region of the second junctionfield-effect transistor $TR_5$ is connected to the second memory-cell-selecting line in place of being connected to the predetermined potential line.

In the semiconductor memory cell according to the seventh aspect of the present invention, the configuration in which the third region $SC_3$ is connected to the write-in information setting line includes a configuration in which the third region $SC_3$ and part of the write-in information setting line are fabricated in common. The configuration in which each of the fifth region $SC_5$ and the sixth region $SC_6$ is connected to the second predetermined potential line includes a configuration in which each of the fifth region $SC_5$ and the sixth region $SC_6$ has a common region with part of the second predetermined potential line, that is, the fifth region $SC_5$ and part of the second predetermined potential line are fabricated in common and the sixth region $SC_6$ and part of the second predetermined potential line are fabricated in common. Further, the configuration in which the sixth region $SC_6$ is connected to the write-in information setting line includes a configuration in which the sixth region $SC_6$ and part of the write-in information setting line are fabricated in common.

As shown in a principle drawing of FIG. 53, for achieving the above object, a semiconductor memory cell according to a eighth aspect of the present invention has a similar configuration to that of the semiconductor memory cell according to the sixth aspect of the present invention, and has a configuration in which a third transistor of the second conductivity type for write-in $TR_4$ is added.

That is, according to the eighth aspect of the present invention, there is provided a semiconductor memory cell provided with a semi-conductive layer having a first main surface and a second main surface opposed to the first main surface, said semiconductor memory cell comprising a first transistor of a first conductivity type for read-out $TR_1$, a second transistor of a second conductivity type for write-in $TR_2$, a junction-field-effect transistor of the first conductivity type for current control $TR_3$ and a third transistor of the second conductivity type for write-in $TR_4$, and having;

(1) a first semi-conductive region $SC_1$ of the first conductivity type, formed through the semi-conductive layer from the first main surface to the second main surface, (2) a second semi-conductive region $SC_2$ of the second conductivity type, formed through the semi-conductive layer from the first main surface to the second main surface and being in contact with the first region $SC_1$, (3) a third semi-conductive or conductive region $SC_3$ formed in a surface region, including the second main surface, of the first region $SC_1$ and spaced from the second region $SC_2$, said third region $SC_3$ forming a rectifier junction together with the first region $SC_1$, (4) a fourth semi-conductive or conductive region $SC_4$ formed in a surface region, including the first main surface, of the second region $SC_2$ and spaced from the first region $SC_1$, said fourth region $SC_4$ forming a rectifier junction together with the second region $SC_2$, (5) a fifth semi-conductive or conductive region $SC_5$ formed in a surface region of the fourth region $SC_4$, said fifth region $SC_5$ forming a rectifier junction together with the fourth region $SC_4$, (6) a gate portion $(G_1+G_5)$ shared by the first transistor $TR_1$ and the third transistor $TR_4$, and formed on a barrier layer formed on the first main surface so as to bridge the first region $SC_1$ and the fourth region $SC_4$ and so as to bridge the second region $SC_2$ and the fifth region $SC_5$, and (7) a gate portion $G_2$ of the second transistor $TR_2$ formed on a barrier layer formed on the second main surface so as to bridge the second region $SC_2$ and the third region $SC_3$, wherein;

(A-1) one source/drain region of the first transistor $TR_1$ is constituted of a surface region, including the first main surface, of the first region $SC_1$, (A-2) the other source/drain region of the first transistor $TR_1$ is constituted of the fourth region $SC_4$, (A-3) a channel forming region $CH_1$ of the first transistor $TR_1$ is constituted of a surface region, including the first main surface, of the second region $SC_2$ which surface region is sandwiched by the surface region, including the first main surface, of the first region $SC_1$ and the fourth region $SC_4$, (B-1) one source/drain region of the second transistor $TR_2$ is constituted of the third region $SC_3$, (B-2) the other source/drain region of the second transistor $TR_2$ is constituted of a surface region, including the second main surface, of the second region $SC_2$, (B-3) a channel forming region $CH_2$ of the second transistor $TR_2$ is constituted of a surface region, including the second main surface, of the first region $SC_1$ which surface region is sandwiched by the third region $SC_3$ and the surface region, including the second main surface, of the second region $SC_2$, (C-1) gate regions of the junction-field-effect transistor $TR_3$ are constituted of the fifth region $SC_5$ and a portion of the second region $SC_2$ facing the fifth region $SC_5$, (C-2) a channel region $CH_3$ of the junction-field-effect transistor $TR_3$ is constituted of a portion of the fourth region $SC_4$ sandwiched by the fifth region $SC_5$ and said portion of the second region $SC_2$, (C-3) one source/drain region of the junction-field-effect transistor $TR_3$ is constituted of a portion of the fourth region $SC_4$ extending from one end of the channel region $CH_3$ of the junction-field-effect transistor $TR_3$ and constituting the other source/drain region of the first transistor $TR_1$, (C-4) the other source/drain region of the junction-field-effect transistor $TR_3$ is constituted of a portion of the fourth region $SC_4$ extending from the other end of the channel region $CH_3$ of the junction-field-effect transistor $TR_3$, (D-1) one source/drain region of the third transistor $TR_4$ is constituted of the channel forming region $CH_1$ of the first transistor $TR_1$, (D-2) the other source/drain region of the third transistor $TR_4$ is constituted of the fifth region $SC_5$, (D-3) a channel forming region $CH_4$ of the third transistor $TR_4$ is constituted of the other source/drain region of the first transistor $TR_1$, (E) the gate portion $(G_1+G_5)$ shared by the first transistor $TR_1$ and the third transistor $TR_4$ and the gate portion $G_2$ of the second transistor $TR_2$ are connected to a first memory-cell-selecting line, (F) the third region $SC_3$ is connected to a write-in information setting line, (G) the first region $SC_1$ is connected to a predetermined potential line, and (H) the other source/drain region of the junction-field-effect transistor $TR_3$ is connected to a second memory-cell-selecting line.

As shown in a principle drawing of FIG. 57, the semiconductor memory cell according to the eighth aspect of the present invention preferably has a configuration in which the other source/drain region of the junction-field-effect transistor $TR_3$ is connected to the predetermined potential line in place of being connected to the second memory-cell-selecting line, and the first region $SC_1$ is connected to the second memory-cell-selecting line in place of being connected to the predetermined potential line.

In the semiconductor memory cell according to the eighth aspect of the present invention, the configuration in which the third region $SC_3$ is connected to the write-in information setting line includes a configuration in which the third region $SC_3$ and part of the write-in information setting line are fabricated in common.

As shown in a principle drawing of FIG. 59, for achieving the above object, a semiconductor memory cell according to a ninth aspect of the present invention has a configuration in which the configuration of the semiconductor memory cell according to the seventh aspect of the present invention is combined with that of the semiconductor memory cell according to the eighth aspect of the present invention. That is, the semiconductor memory cell according to the ninth aspect of the present invention has a configuration in which a sixth region $SC_6$ is formed in the semiconductor memory cell according to the sixth aspect of the present invention, a second junction-field-effect transistor of the first conductivity type for current control $TR_5$ is added and a third transistor of the second conductivity type for write-in $TR_4$ is further added.

That is, according to the ninth aspect of the present invention, there is provided a semiconductor memory cell provided with a semi-conductive layer having a first main surface and a second main surface opposed to the first main surface, said semiconductor memory cell comprising a first transistor of a first conductivity type for read-out $TR_1$, a second transistor of a second conductivity type for write-in $TR_2$, a first junction-field-effect transistor of the first conductivity type for current control $TR_3$, a second junction-field-effect transistor of the first conductivity type for current control $TR_5$ and a third transistor of the second conductivity type for write-in $TR_4$, and having;

(1) a first semi-conductive region $SC_1$ of the first conductivity type, formed through the semi-conductive layer from the first main surface to the second main surface, (2) a second semi-conductive region $SC_2$ of the second conductivity type, formed through the semi-conductive layer from the first main surface to the second main surface and being in contact with the first region $SC_1$, (3) a third semi-conductive or conductive region $SC_3$ formed in a surface region, including the second main surface, of the first region $SC_1$ and spaced from the second region $SC_2$, said third region $SC_3$ forming a rectifier junction together with the first region $SC_1$, (4) a fourth semi-conductive or conductive region $SC_4$ formed in a surface region, including the first main surface, of the second region $SC_2$ and spaced from the first region $SC_1$, said fourth region $SC_4$ forming a rectifier junction together with the second region $SC_2$, (5) a fifth semi-conductive or conductive region $SC_5$ formed in a surface region of the fourth region $SC_4$, said fifth region $SC_5$ forming a rectifier junction together with the fourth region $SC_4$, (6) a sixth semi-conductive or conductive region $SC_6$ formed in a surface region, including the first main surface, of the first region $SC_1$ and spaced from the second region $SC_2$, said sixth region $SC_6$ forming a rectifier junction together with the first region $SC_1$, (7) a gate portion $(G_1+G_5)$ shared by the first transistor $TR_1$ and the third transistor $TR_4$, and formed on a barrier layer formed on the first main surface so as to bridge the first region $SC_1$ and the fourth region $SC_4$ and so as to bridge the second region $SC_2$ and the fifth region $SC_5$, and (8) a gate portion $G_2$ of the second transistor $TR_2$ formed on a barrier layer formed on the second main surface so as to bridge the second region $SC_2$ and the third region $SC_3$, wherein;

(A-1) one source/drain region of the first transistor $TR_1$ is constituted of a surface region, including the first main surface, of the first region $SC_1$, (A-2) the other source/drain region of the first transistor $TR_1$ is constituted of the fourth region $SC_4$, (A-3) a channel forming region $CH_1$ of the first transistor $TR_1$ is constituted of a surface region, including the first main surface, of the second region $SC_2$ which surface region is sandwiched by the surface region, including the first main surface, of the first region $SC_1$ and the fourth region $SC_4$, (B-1) one source/drain region of the second transistor $TR_2$ is constituted of the third region $SC_3$, (B-2) the other source/drain region of the second transistor $TR_2$ is constituted of a surface region, including the second main surface, of the second region $SC_2$, (B-3) a channel forming region $CH_2$ of the second transistor $TR_2$ is constituted of a surface region, including the second main surface, of the first region $SC_1$ which surface region is sandwiched by the third region $SC_3$ and the surface region, including the second main surface, of the second region $SC_2$, (C-1) gate regions of the first junction-field-effect transistor $TR_3$ are constituted of the fifth region $SC_5$ and a portion of the second region $SC_2$ facing the fifth region $SC_5$, (C-2) a channel region $CH_3$ of the first junction-field-effect transistor $TR_3$ is constituted of a portion of the fourth region $SC_4$ sandwiched by the fifth region $SC_5$ and said portion of the second region $SC_2$, (C-3) one source/drain region of the first junction-field-effect transistor $TR_3$ is constituted of a portion of the fourth region $SC_4$ extending from one end of the channel region $CH_3$ of the first junction-field-effect transistor $TR_3$ and constituting the other source/drain region of the first transistor $TR_1$, (C-4) the other source/drain region of the first junction-field-effect transistor $TR_3$ is constituted of a portion of the fourth region $SC_4$ extending from the other end of the channel region $CH_3$ of the first junction-field-effect transistor $TR_3$, (D-1) gate regions of the second junction-field-effect transistor $TR_5$ are constituted of the sixth region $SC_6$ and the third region $SC_3$, (D-2) a channel region $CH_5$ of the second junction-field-effect transistor $TR_5$ is constituted of a portion of the first region $SC_1$ sandwiched by the sixth region $SC_6$ and the third region $SC_3$, (D-3) one source/drain region of the second junction-field-effect transistor $TR_5$ is constituted of a portion of the first region $SC_1$ extending from one end of the channel region $CH_5$ of the second junction-field-effect transistor $TR_5$ and constituting one source/drain region of the first transistor $TR_1$ and the channel forming region $CH_2$ of the second transistor $TR_2$, (D-4) the other source/drain region of the second junction-field-effect transistor $TR_5$ is constituted of a portion of the first region $SC_1$ extending from the other end of the channel region $CH_5$ of the second junction-field-effect transistor $TR_5$, (E-1) one source/drain region of the third transistor $TR_4$ is constituted of the channel forming region $CH_1$ of the first transistor $TR_1$, (E-2) the other source/drain region of the third transistor $TR_4$ is constituted of the fifth region $SC_5$, (E-3) a channel forming region $CH_4$ of the third transistor $TR_4$ is constituted of the other source/drain region of the first transistor $TR_1$, (F) the gate portion $(G_1+G_5)$ shared by the first transistor $TR_1$ and the third transistor $TR_4$ and the gate portion $G_2$ of the second transistor $TR_2$ are connected to a first memory-cell-selecting line, (G) the third region $SC_3$ is connected to a write-in information setting line, (H) the other source/drain region of the second junction-field-effect transistor $TR_5$ is connected to a predetermined potential line, (I) the other source/drain region of the first junction-field-effect transistor $TR_3$ is connected to a second memory-cell-selecting line, and (J) the sixth region $SC_6$ is connected to a second predetermined potential line.

As shown in a principle drawing of FIG. 62, the semiconductor memory cell according to the ninth aspect of the present invention preferably has a configuration in which the other source/drain region of the first junction-field-effect transistor $TR_3$ is connected to the predetermined potential line in place of being connected to the second memory-cell-selecting line, and the other source/drain region of the second junction-field-effect transistor $TR_5$ is connected to the second memory-cell-selecting line in place of being connected to the predetermined potential line.

Alternatively, as shown in a principle drawing of FIG. 64, the semiconductor memory cell according to the ninth aspect of the present invention preferably has a configuration in which the sixth region $SC_6$ is connected to the write-in information setting line in place of being connected to the second predetermined potential line. In this configuration, as shown in a principle drawing of FIG. 69, the semiconductor memory cell preferably has a configuration in which the other source/drain region of the first junction-field-effect transistor $TR_3$ is connected to the predetermined potential line in place of being connected to the second memory-cell-selecting line, and the other source/drain region of the second junction-field-effect transistor $TR_5$ is connected to the second memory-cell-selecting line in place of being connected to the predetermined potential line.

In the semiconductor memory cell according to the ninth aspect of the present invention, the configuration in which the third region $SC_3$ is connected to the write-in information setting line includes a configuration in which the third region $SC_3$ and part of the write-in information setting line are fabricated in common. The configuration in which the sixth region $SC_6$ is connected to the second predetermined potential line includes a configuration in which the sixth region $SC_6$ and part of the second predetermined potential line are fabricated in common. Further, the configuration in which the sixth region $SC_6$ is connected to the write-in information setting line includes a configuration in which the sixth region $SC_6$ and part of the write-in information setting line are fabricated in common.

A method for manufacturing a semiconductor memory cell according to a second aspect of the present invention is a method in which the semiconductor memory cell according to the fifth aspect of the present invention is manufactured.

That is, according to the second aspect of the present invention, there is provided a method for manufacturing a semiconductor memory cell provided with a semi-conductive layer having a first main surface and a second main surface opposed to the first main surface, said semiconductor memory cell comprising a first transistor of a first conductivity type for read-out $TR_1$, a second transistor of a second conductivity type for write-in $TR_2$ and a junction-field-effect transistor of the first conductivity type for current control $TR_3$, and having;

(1) a first semi-conductive region $SC_1$ of the first conductivity type, formed through the semi-conductive layer from the first main surface to the second main surface, (2) a second semi-conductive region $SC_2$ of the second conductivity type, formed through the semi-conductive layer from the first main surface to the second main surface and being in contact with the first region $SC_1$, (3) a third semi-conductive or conductive region $SC_3$ formed in a surface region, including the second main surface, of the first region $SC_1$ and spaced from the second region $SC_2$, said third region $SC_3$ forming a rectifier junction together with the first region $SC_1$, (4) a fourth semi-conductive or conductive region $SC_4$ formed in a surface region, including the first main surface, of the second region $SC_2$ and spaced from the first region $SC_1$, said fourth region $SC_4$ forming a rectifier junction together with the second region $SC_2$, (5) a fifth semi-conductive or conductive region $SC_5$ formed in a surface region, including the first main surface, of the first region $SC_1$ and spaced from the second region $SC_2$, said fifth region $SC_5$ forming a rectifier junction together with the first region $SC_1$, (6) a gate portion $G_1$ of the first transistor $TR_1$ formed on a barrier layer formed on the first main surface so as to bridge the first region $SC_1$ and the fourth region $SC_4$, and (7) a gate portion $G_2$ of the second transistor $TR_2$ formed on a barrier layer formed on the second main surface so as to bridge the second region $SC_2$ and the third region $SC_3$, the first transistor $TR_1$ having;

(A-1) one source/drain region constituted of a surface region, including the first main surface, of the first region $SC_1$, (A-2) the other source/drain region constituted of the fourth region $SC_4$, and (A-3) a channel forming region $CH_1$ constituted of a surface region, including the first main surface, of the second region $SC_2$ which surface region is sandwiched by the surface region, including the first main surface, of the first region $SC_1$ and the fourth region $SC_4$, the second transistor $TR_2$ having;

(B-1) one source/drain region constituted of the third region $SC_3$, (B-2) the other source/drain region constituted of a surface region, including the second main surface, of the second region $SC_2$, and (B-3) a channel forming region $CH_2$ constituted of a surface region, including the second main surface, of the first region $SC_1$ which surface region is sandwiched by the third region $SC_3$ and the surface region, including the second main surface, of the second region $SC_2$, and the junction-field-effect transistor $TR_3$ having;

(C-1) gate regions constituted of the fifth region $SC_5$ and the third region $SC_3$ facing the fifth region $SC_5$, (C-2) a channel region $CH_3$ constituted of a portion of the first region $SC_1$ sandwiched by the fifth region $SC_5$ and the third region $SC_3$, (C-3) one source/drain region constituted of a portion of the first region $SC_1$ extending from one end of the channel region $CH_3$ of the junction-field-effect transistor $TR_3$ and constituting one source/drain region of the first transistor $TR_1$ and the channel forming region $CH_2$ of the second transistor $TR_2$, and (C-4) the other source/drain region constituted of portion of the first region $SC_1$ extending from the other end of the channel region $CH_3$ of the junction-field-effect transistor $TR_3$, said method comprising the steps of;

forming the barrier layer on the first main surface and then, forming the gate portion $G_1$ of the first transistor $TR_1$ on the barrier layer, and forming the barrier layer on the second main surface and then, forming the gate portion $G_2$ of the second transistor $TR_2$ on the barrier layer, and forming the first region $SC_1$, the third region $SC_3$ and the fifth region $SC_5$ by ion implantation in an arbitrary order so as to optimize a distance between the facing gate regions of the junction-field-effect transistor $TR_3$ and so as to optimize impurity concentrations of the facing gate regions and the channel region $CH_3$ of the junction-field-effect transistor $TR_3$.

A method for manufacturing a semiconductor memory cell according to a third aspect of the present invention is a method in which the semiconductor memory cell according to any one of the sixth to the ninth aspects of the present invention is manufactured.

That is, according to the third aspect of the present invention, there is provided a method for manufacturing a semiconductor memory cell provided with a semi-conductive layer having a first main surface and a second main surface opposed to the first main surface, said semiconductor memory cell comprising at least a first transistor of a first conductivity type for read-out $TR_1$, a second transistor of a second conductivity type for write-in $TR_2$ and a junction-field-effect transistor of the first conductivity type for current control $TR_3$, and having at least;

(1) a first semi-conductive region $SC_1$ of the first conductivity type, formed through the semi-conductive layer from the first main surface to the second main surface, (2) a second semi-conductive region $SC_2$ of the second conductivity type, formed through the semi-conductive layer from the first main surface to the second main surface and being in contact with the first region $SC_1$, (3) a third semi-conductive or conductive region $SC_3$ formed in a surface region, including the second main surface, of the first region $SC_1$ and spaced from the second region $SC_2$, said third region $SC_3$ forming a rectifier junction together with the first region $SC_1$, (4) a fourth semi-conductive or conductive region $SC_4$ formed in a surface region, including the first main surface, of the second region $SC_2$ and spaced from the first region $SC_1$, said fourth $SC_4$ region forming a rectifier junction together with the second region $SC_2$, (5) a fifth semi-conductive or conductive region $SC_5$ formed in a surface region of the fourth region $SC_4$, said fifth region $SC_5$ forming a rectifier junction. together with the fourth region $SC_4$, (6) a gate portion $G_1$ of the first transistor $TR_1$ formed on a barrier layer formed on the first main surface so as to bridge the first region $SC_1$ and the fourth region $SC_4$, and (7) a gate portion $G_2$ of the second transistor $TR_2$ formed on a barrier layer formed on the second main surface so as to bridge the second region $SC_2$ and the third region $SC_3$, the first transistor $TR_1$ having;

(A-1) one source/drain region constituted of a surface region, including the first main surface, of the first region $SC_1$, (A-2) the other source/drain region constituted of the fourth region $SC_4$, and (A-3) a channel forming region $CH_1$ constituted of a surface region, including the first main surface, of the second region $SC_2$ which surface region is sandwiched by the surface region, including the first main surface, of the first region $SC_1$ and the fourth region $SC_4$, the second transistor $TR_2$ having;

(B-1) one source/drain region constituted of the third region $SC_3$, (B-2) the other source/drain region constituted of a surface region, including the second main surface, of the second region $SC_2$, and (B-3) a channel forming region $CH_2$ constituted of a surface region, including the second main surface, of the first region $SC_1$ which surface region is sandwiched by the third region $SC_3$ and the surface region, including the second main surface, of the second region $SC_2$, and the junction-field-effect transistor $TR_3$ having;

(C-1) gate regions constituted of the fifth region $SC_5$ and a portion of the second region $SC_2$ facing the fifth region $SC_5$, (C-2) a channel region $CH_3$ constituted of a portion of the fourth region $SC_4$ sandwiched by the fifth region $SC_5$ and said portion of the second region $SC_2$, (C-3) one source/drain region constituted of a portion of the fourth region $SC_4$ extending from one end of the channel region $CH_3$ of the junction-field-effect transistor $TR_3$ and constituting the other source/drain region of the first transistor $TR_1$, and (C-4) the other source/drain region constituted of a portion of the fourth region $SC_4$ extending from the other end of the channel region $CH_3$ of the junction-field-effect transistor $TR_3$, said method comprising the steps of;

forming the barrier layer on the first main surface and then, forming the gate portion $G_1$ of the first transistor $TR_1$ on the barrier layer, and forming the barrier layer on the second main surface and then, forming the gate portion $G_2$ of the second transistor $TR_2$ on the barrier layer, and forming the second region $SC_2$, the fourth region $SC_4$ and the fifth region $SC_5$ by ion implantation in an arbitrary order so as to optimize a distance between the facing gate regions of the junction-field-effect transistor $TR_3$ and so as to optimize impurity concentrations of the facing gate regions and the channel region $CH_3$ of the junction-field-effect transistor $TR_3$.

In the method for manufacturing a semiconductor memory cell according to the second or third aspect of the present invention, the order of fabrication processes of the gate portion $G_1$ of the first transistor $TR_1$ and the gate portion $G_2$ of the second transistor $TR_2$ is optional in consideration of a structure of the semiconductor memory cell to be produced. The order of fabrication processes of the gate portion $G_1$ of the first transistor $TR_1$, the gate portion $G_2$ of the second transistor $TR_2$ and the individual facing gate regions of the junction-field-effect transistor $TR_3$ is also optional in consideration of a structure of the semiconductor memory cell to be produced.

Each of the third region $SC_3$, the fourth region $SC_4$ and the fifth region $SC_5$ in the semiconductor memory cell according to the fifth aspect of the present invention may be constituted of a silicide, a metal or a metal compound, and is preferably constituted of semiconductor. The fourth region $SC_4$ in the semiconductor memory cell according to the sixth or eighth aspect of the present invention is preferably constituted of semiconductor, and each of the third region $SC_3$ and the fifth region $SC_5$ in the semiconductor memory cell according to the sixth or eighth aspect of the present invention may be constituted of a silicide, a metal or a metal compound, and is preferably constituted of semiconductor. The fourth region $SC_4$ in the semiconductor memory cell according to the seventh or ninth aspect of the present invention is preferably constituted of semiconductor, and each of the third region $SC_3$, the fifth region $SC_5$ and the sixth region $SC_6$ in the semiconductor memory cell according to the seventh or ninth aspect of the present invention may be constituted of a silicide, a metal or a metal compound, and is preferably constituted of semiconductor. When the conductive region is constituted of a silicide, a metal or a metal compound and the conductive region is connected to a wiring, the conductive region may be constituted of a material in common with that constituting the wiring, such as titanium silicide or TiN used as a barrier layer or a glue layer. That is, the semiconductor memory cell preferably has a configuration in which the conductive region has a common region with part of a wiring.

In the semiconductor memory cell according to any one of the fifth to ninth aspects of the present invention, the chip area can be reduced since the individual gate portions of the first transistor $TR_1$ and the second transistor $TR_2$ are faced on the both sides of the semi-conductive layer. Only one first memory-cell-selecting line can suffice since both of the gate portion $G_1$ of the first transistor $TR_1$ and the gate portion $G_2$ of the second transistor $TR_2$ are connected thereto, which promotes shrinkage of the cell area.

In the semiconductor memory cell according to any one of the fifth to ninth aspects of the present invention, the channel forming region $CH_1$ of the first transistor $TR_1$ is constituted of the second region $SC_2$ functioning as the other source/drain region of the second transistor $TR_2$. The third region $SC_3$ corresponding to one source/drain region of the second transistor $TR_2$ is connected to the write-in information setting line. And an appropriate potential set on the first memory-cell-selecting line enables control of the on/off states of the first transistor $TR_1$ and the second transistor $TR_2$. In more details, when the potential of the first memory-cell-selecting line is set, upon write-in, at a potential as high enough to bring the second transistor $TR_2$ into an on-state, the second transistor $TR_2$ is brought into an on-state, and whereby an electric charge is charged or accumulated in a capacitor formed between the first region $SC_1$ and the second region $SC_2$ in the second transistor $TR_2$ depending upon the potential of the write-in information setting line. As a result, the information is stored in the channel forming region $CH_1$ (the second region $SC_2$) of the first transistor $TR_1$ as a potential difference between the first region $SC_1$ and the second region $SC_2$ or as an electric charge. When the information is read out, the potential or electric charge (the information) stored or accumulated in the channel forming region $CH_1$ of the first transistor $TR_1$ is converted to a potential difference between the second region $SC_2$ corresponding to the channel forming region $CH_1$ and the fourth region $SC_4$ corresponding to the other source/drain region, or to an electric charge. As a result, the threshold voltage of the first transistor $TR_1$ seen from the gate region $G_1$ varies depending upon the above potential difference or electric charge (information). When the information is read out, applying a properly selected potential to the gate portion $G_1$ thus allows the on/off operation control of the first transistor $TR_1$, and detecting such operation state of the first transistor $TR_1$ enables the read-out of the information.

In addition, the semiconductor memory cell according to any one of the fifth to ninth aspects of the present invention is provided with at least the junction-field-effect transistor $TR_3$ in addition to the first transistor $TR_1$ and the second transistor $TR_2$. Since the on/off operation of the junction-field-effect transistor $TR_3$ is controlled when the information is read out, a large margin can be assured for the current which flows between the first region $SC_1$ and the fourth region $SC_4$. As a result, the number of semiconductor memory cells connectable to the second memory cell-selecting line becomes less liable to be limited, and the information holding time (retention time) of the semiconductor memory cell can be increased.

The semiconductor memory cell according to the ninth aspect of the present invention further contains the third transistor $TR_4$ in addition to the junction-field-effect transistor $TR_3$. Since the on/off operations of the third transistor $TR_4$ the junction-field-effect transistor $TR_3$ are controlled when the information is read out, a remarkably large margin can be consistently assured for the current which flows between the first region $SC_1$ and the fourth region $SC_4$. As a result,the number of semiconductor memory cells connectable, for example, to the second memory cell-selecting line becomes further less liable to be limited.

As shown in a principle drawing of FIG. 76A or FIG. 77A, for achieving the above object, according to a tenth aspect of the present invention, there is provided a semiconductor memory cell comprising a first transistor of a first conductivity type for read-out $TR_1$, a second transistor of a second conductivity type for write-in $TR_2$ and a diode D, wherein;

- (A-1) one source/drain region of the first transistor $TR_1$ is connected to a second memory-cell-selecting line,
- (A-2) the other source/drain region of the first transistor $TR_1$ constitutes one end of the diode D,
- (B-1) one source/drain region of the second transistor $TR_2$ is connected to a write-in information setting line and constitutes other end of the diode D,
- (B-2) the other source/drain region of the second transistor $TR_2$ functions (or serves) as a channel forming region $CH_1$ of the first transistor $TR_1$, and
- (C) a gate portion $G_1$ and $G_2$ shared by the first transistor $TR_1$ and the second transistor $TR_2$ is connected to a first memory-cell-selecting line.

As shown in a principle drawing of FIG. 76B or FIG. 77B, for achieving the above object, according to a eleventh aspect of the present invention, there is provided a semiconductor memory cell comprising a first transistor of a first conductivity type for read-out $TR_1$, a second transistor of a second conductivity type for write-in $TR_2$ and a diode D, wherein;

(A-1) one source/drain region of the first transistor $TR_1$ is connected to a predetermined potential line, (A-2) the other source/drain region of the first transistor $TR_1$ constitutes one end of the diode D, (B-1) one source/drain region of the second transistor $TR_2$ is connected to a second memory-cell-selecting line and constitutes other end of the diode D, (B-2) the other source/drain region of the second transistor $TR_2$ functions (or serves) as a channel forming region $CH_1$ of the first transistor $TR_1$, and (C) a gate portion $G_1$ and $G_2$ shared by the first transistor $TR_1$ and the second transistor $TR_2$ is connected to a first memory-cell-selecting line.

For achieving the above object, according to a twelfth aspect of the present invention, there is provided a semiconductor memory cell comprising a first transistor of a first conductivity type for read-out $TR_1$, a second transistor of a second conductivity type for write-in $TR_2$ and a diode D, said semiconductor memory cell having;

(1) a first semi-conductive region $SC_1$ of the second conductivity type, (2) a second semi-conductive or conductive region $SC_2$ forming a rectifier junction together with the first region $SC_1$, (3) a third semi-conductive region $SC_3$ of the first conductivity type, in contact with the first region $SC_1$ and spaced from the second region $SC_2$, (4) a fourth semi-conductive or conductive region $SC_4$ formed in a surface region of the third region $SC_3$, said fourth region $SC_4$ forming a rectifier junction together with the third region $SC_3$, and (5) a gate portion $G_1$ and $G_2$ shared by the first transistor $TR_1$ and the second transistor $TR_2$, and formed on a barrier layer so as to bridge the second region $SC_2$ and the third region $SC_3$ and so as to bridge the first region $SC_1$ and the fourth region $SC_4$, wherein;

(A-1) one source/drain region of the first transistor $TR_1$ is constituted of the second region $SC_2$, (A-2) the other source/drain region of the first transistor $TR_1$ is constituted of the third region $SC_3$, (A-3) a channel forming region $CH_1$ of the first transistor $TR_1$ is constituted of a surface region of the first region $SC_1$ sandwiched by the second region $SC_2$ and the third region $SC_3$, (B-1) one source/drain region of the second transistor $TR_2$ is constituted of the fourth region $SC_4$, (B-2) the other source/drain region of the second transistor $TR_2$ is constituted of the first region $SC_1$, (B-3) a channel forming region $CH_2$ of the second transistor $TR_2$ is constituted of a surface region of the third region $SC_3$ sandwiched by the first region $SC_1$ and the fourth region $SC_4$, (C) the diode D is constituted of the third region $SC_3$ and the fourth region $SC_4$, (D) the gate portion $G_1$ and $G_2$ is connected to a first memory-cell-selecting line, (E) the second region $SC_2$ is connected to a second memory-cell-selecting line, and (F) the fourth region $SC_4$ is connected to a write-in information setting line.

The semiconductor memory cell according to the twelfth aspect of the present invention preferably has a configuration in which the second region $SC_2$ is connected to a predetermined potential line in place of being connected to the second memory-cell-selecting line, and the fourth region $SC_4$ is connected to the second memory-cell-selecting line in place of being connected to the write-in information setting line. A region $SC_7$ containing a high concentration of an impurity having the first conductivity type is preferably formed under the first region $SC_1$, for increasing a potential or an electric charge stored in the channel forming region $CH_1$ of the first transistor $TR_1$.

For achieving the above object, according to a thirteenth aspect of the present invention, there is provided a semiconductor memory cell comprising a first transistor of a first conductivity type for read-out $TR_1$, a second transistor of a second conductivity type for write-in $TR_2$ and a diode D, said semiconductor memory cell having;

(1) a first semi-conductive region $SC_1$ of the first conductivity type, (2) a second semi-conductive or conductive region $SC_2$ forming a rectifier junction together with the first region $SC_1$, (3) a third semi-conductive region $SC_3$ of the second conductivity type, in contact with the first region $SC_1$ and spaced from the second region $SC_2$, (4) a fourth semi-conductive or conductive region $SC_4$ formed in a surface region of the third region $SC_3$, said fourth region $SC_4$ forming a rectifier junction together with the third region $SC_3$, and (5) a gate portion $G_1$ and $G_2$ shared by the first transistor $TR_1$ and the second transistor $TR_2$, and formed on a barrier layer so as to bridge the second region $SC_2$ and the third region $SC_3$ and so as to bridge the first region $SC_1$ and the fourth region $SC_4$, wherein;

(A-1) one source/drain region of the first transistor $TR_1$ is constituted of the fourth region $SC_4$, (A-2) the other source/drain region of the first transistor $TR_1$ is constituted of the first region $SC_1$, (A-3) a channel forming region $CH_1$ of the first transistor $TR_1$ is constituted of a surface region of the third region $SC_3$ sandwiched by the first region $SC_1$ and the fourth region $SC_4$, (B-1) one source/drain region of the second transistor $TR_2$ is constituted of the second region $SC_2$, (B-2) the other source/drain region of the second transistor $TR_2$ is constituted of the third region $SC_3$, (B-3) a channel forming region $CH_2$ of the second transistor $TR_2$ is constituted of a surface region of the first region $SC_1$ sandwiched by the second region $SC_2$ and the third region $SC_3$, (C) the diode D is constituted of the first region $SC_1$ and the second region $SC_2$, (D) the gate portion $G_1$ and $G_2$ is connected to a first memory-cell-selecting line, (E) the fourth region $SC_4$ is connected to a second memory-cell-selecting line, and (F) the second region $SC_2$ is connected to a write-in information setting line.

The semiconductor memory cell according to the thirteenth aspect of the present invention preferably has a configuration in which the fourth region $SC_4$ is connected to a predetermined potential line in place of being connected to the second memory-cell-selecting line, and the second region $SC_2$ is connected to the second memory-cell-selecting line in place of being connected to the write-in information setting line. In the semiconductor memory cell according to the twelfth and thirteenth aspects, a region $SC_7$ containing a high concentration of an impurity having the first conductivity type is preferably formed under the third region $SC_3$, for increasing a potential or an electric charge stored in the channel forming region $CH_1$ of the first transistor $TR_1$.

The semiconductor memory cell according to the tenth to thirteenth aspects of the present invention can be formed in a surface region of a semiconductor substrate, on an insulating layer or an insulator formed on a semiconductor substrate or a supporting substrate, in a well of the second conductivity type in a semiconductor substrate (in the semiconductor memory cell according to the twelfth aspect of the present invention), in a well of the first conductivity type formed in a semiconductor substrate (in the semiconductor memory cell according to the thirteenth aspect of the present invention), or on an electric insulator, and is preferably formed in a well or formed on an insulator including an insulating layer and an insulating substrate for preventing alpha-particle or neutron induced soft error.

When each of the second region $SC_2$ and the fourth region $SC_4$ in the semiconductor memory cell according to the twelfth or thirteenth aspect of the present invention is constituted of a conductive region, such a region may be constituted of a silicide, a metal or a metal compound. When such a region is constituted of a silicide, a metal or a metal compound and each of these regions is connected to a wiring, each of these region may be constituted of a material in common with that constituting the wiring, such as titanium silicide or TiN used as a barrier layer or a glue layer. That is, the semiconductor memory cell preferably has a configuration in which each of these region has a common region with part of a wiring.

In the semiconductor memory cell according to any one of the tenth to thirteenth aspects of the present invention, the individual gate portions of the first transistor $TR_1$ and second transistor $TR_2$ are commonly connected to the first memory-cell-selecting line. Therefore, only a single first memory-cell-selecting can suffice, which leads to a smaller chip area.

In the semiconductor memory cell according to the tenth or eleventh aspect of the present invention, the other source/drain region of the second transistor $TR_2$ is in common with the channel forming region $CH_3$ of the first transistor $TR_1$. In the semiconductor memory cell according to the twelfth aspect of the present invention, the first region $SC_1$ functioning as the other source/drain region of the second transistor $TR_2$ corresponds to the channel forming region $CH_1$ of the first transistor $TR_1$. And the semiconductor memory cell according to the thirteenth aspect of the present invention, the third region $SC_3$ functioning as the other source/drain region of the second transistor $TR_2$ corresponds to the channel forming region $CH_1$ of the first transistor $TR_1$. When information is written in, the second transistor $TR_2$ is brought into an on-state to allow information to be stored, in a form of potential or an electric charge, in the channel forming region $CH_1$ of the first transistor $TR_1$. When the information is read out, the threshold voltage of the first transistor $TR_1$ seen from the gate region varies depending upon the potential or electric charge (information) stored or accumulated in the channel forming region $CH_1$. Thus, when the information is read out, a status of the information accumulation in the first transistor $TR_1$ can be detected as level (including 0) of the channel current, by applying a properly selected potential to the gate portion. That is, the read-out of the information is effected by detecting the operation status of the first transistor $TR_1$.

Further, the third region $SC_3$ or the first region $SC_1$ corresponding to the channel forming region $CH_2$ of the second transistor $TR_2$ and to the other source/drain region of the first transistor $TR_1$ is connected to the write-in information setting line or to the second memory-cell-selecting line through the diode D. This allows omission of so-called read-out line to simplify the wiring configuration.

In the semiconductor memory cell according to the tenth or eleventh aspect of the present invention, the diode D is constituted of the other source/drain region of the first transistor $TR_1$ and one source/drain region of the second transistor $TR_2$; and in the semiconductor memory cell according to the twelfth or thirteenth aspect of the present invention, the diode D is constituted of the third region $SC_3$ and fourth region $SC_4$, or of the first region $SC_1$ and the second region $SC_2$. These result in a simplified structure and a smaller area of the semiconductor memory cell.

For achieving the above object, according to a fourteenth aspect of the present invention, there is provided a semiconductor memory cell provided with a semi-conductive layer having a first main surface and a second main surface opposed to the first main surface, said semiconductor memory cell comprising a first transistor of a first conductivity type for read-out $TR_1$, and a second transistor of a second conductivity type for write-in $TR_2$, and having;

(1) a first semi-conductive region $SC_1$ of the first conductivity type, formed through the semi-conductive layer from the first main surface to the second main surface, (2) a second semi-conductive region $SC_2$ of the second conductivity type, formed through the semi-conductive layer from the first main surface to the second main surface and being in contact with the first region $SC_1$, (3) a third semi-conductive or conductive region $SC_3$ formed in a surface region, including the second main surface, of the first region $SC_1$ and spaced from the second region $SC_2$, said third region $SC_3$ forming a rectifier junction together with the first region $SC_1$, (4) a fourth semi-conductive or conductive region $SC_4$ formed in a surface region, including the first main surface, of the second region $SC_2$ and spaced from the first region $SC_1$, said fourth region $SC_4$ forming a rectifier junction together with the second region $SC_2$, (5) a gate portion $G_1$ of the first transistor $TR_1$ formed on a barrier layer formed on the first main surface so as to bridge the first region $SC_1$ and the fourth region $SC_4$, and (6) a gate portion $G_2$ of the second transistor $TR_2$ formed on a barrier layer formed on the second main surface so as to bridge the second region $SC_2$ and the third region $SC_3$, wherein;

(A-1) one source/drain region of the first transistor $TR_1$ is constituted of the fourth region $SC_4$, (A-2) the other source/drain region of the first transistor $TR_1$ is constituted of a surface region, including the first main surface, of the first region $SC_1$, (A-3) a channel forming region $CH_1$ of the first transistor $TR_1$ is constituted of a surface region, including the first main surface, of the second region $SC_2$ which surface region is sandwiched by the surface region, including the first main surface, of the first region $SC_1$ and the fourth region $SC_4$, (B-1) one source/drain region of the second transistor $TR_2$ is constituted of the third region $SC_3$, (B-2) the other source/drain region of the second transistor $TR_2$ is constituted of a surface region, including the second main surface, of the second region $SC_2$, (B-3) a channel forming region $CH_2$ of the second transistor $TR_2$ is constituted of a surface region, including the second main surface, of the first region $SC_1$ which surface region is sandwiched by the third region $SC_3$ and the surface region, including the second main surface, of the second region $SC_2$, (C) the gate portion $G_1$ of the first transistor $TR_1$ and the gate portion $G_2$ of the second transistor $TR_2$ are connected to a first memory-cell-selecting line, (D) the third region $SC_3$ is connected to a write-in information setting line, (E) the fourth region $SC_4$ is connected to a second memory-cell-selecting line, and (F) the other source/drain region of the first transistor $TR_1$ is connected to a predetermined potential line.

The semiconductor memory cell according to the fourteenth aspect of the present invention preferably has a configuration in which the fourth region $SC_4$ is connected to the predetermined potential line in place of being connected to the second memory-cell-selecting line, and the other source/drain region of the first transistor $TR_1$ is connected to the second memory-cell-selecting line in place of being connected to the predetermined potential line. The semiconductor memory cell having such a configuration is referred to as a semiconductor memory cell according to the fifteenth aspect of the present invention.

For achieving the above object, according to a sixteenth aspect of the present invention, there is provided a semiconductor memory cell provided with a semi-conductive layer having a first main surface and a second main surface opposed to the first main surface, said semiconductor memory cell comprising a first transistor of a first conductivity type for read-out $TR_1$, a second transistor of a second conductivity type for write-in $TR_2$ and a diode D, and having;

(1) a first semi-conductive region $SC_1$ of the first conductivity type, formed through the semi-conductive layer from the first main surface to the second main surface, (2) a second semi-conductive region $SC_2$ of the second conductivity type, formed through the semi-conductive layer from the first main surface to the second main surface and being in contact with the first region $SC_1$, (3) a third semi-conductive or conductive region $SC_3$ formed in a surface region, including the second main surface, of the first region $SC_1$ and spaced from the second region $SC_2$, said third region $SC_3$ forming a rectifier junction together with the first region $SC_1$, (4) a fourth semi-conductive or conductive region $SC_4$ formed in a surface region, including the first main surface, of the second region $SC_2$ and spaced from the first region $SC_1$, said fourth region $SC_4$ forming a rectifier junction together with the second region $SC_2$, (5) a gate portion $G_1$ of the first transistor $TR_1$ formed on a barrier layer formed on the first main surface so as to bridge the first region $SC_1$ and the fourth region $SC_4$, and (6) a gate portion $G_2$ of the second transistor $TR_2$ formed on a barrier layer formed on the second main surface so as to bridge the second region $SC_2$ and the third region $SC_3$, wherein;

(A-1) one source/drain region of the first transistor $TR_1$ is constituted of the fourth region $SC_4$, (A-2) the other source/drain region of the first transistor $TR_1$ is constituted of a surface region, including the first main surface, of the first region $SC_1$, (A-3) a channel forming region $CH_1$ of the first transistor $TR_1$ is constituted of a surface region, including the first main surface, of the second region $SC_2$ which surface region is sandwiched by the surface region, including the first main surface, of the first region $SC_1$ and the fourth region $SC_4$, (B-1) one source/drain region of the second transistor $TR_2$ is constituted of the third region $SC_3$, (B-2) the other source/drain region of the second transistor $TR_2$ is constituted of a surface region, including the second main surface, of the second region $SC_2$, (B-3) a channel forming region $CH_2$ of the second transistor $TR_2$ is constituted of a surface region, including the second main surface, of the first region $SC_1$ which surface region is sandwiched by the third region $SC_3$ and the surface region, including the second main surface, of the second region $SC_2$, (C) the diode D is constituted of the first region $SC_1$ and the third region $SC_3$, (D) the gate portion $G_1$ of the first transistor $TR_1$ and the gate portion $G_2$ of the second transistor $TR_2$ are connected to a first memory-cell-selecting line, (E) the third region $SC_3$ is connected to a write-in information setting line, and (F) the fourth region $SC_4$ is connected to a second memory-cell-selecting line.

The semiconductor memory cell according to the sixteenth aspect of the present invention preferably has a configuration in which the third region $SC_3$ is connected to the second memory-cell-selecting line in place of being connected to the write-in information setting line, and the fourth region $SC_4$ is connected to a predetermined potential line in place of being connected to second memory-cell-selecting line. The semiconductor memory cell having such a configuration is referred to as a semiconductor memory cell according to the seventeenth aspect of the present invention.

When each of the third region $SC_3$ and the fourth region $SC_4$ in the semiconductor memory cell according to the fourteenth to seventeenth aspects of the present invention is constituted of a conductive region, each of these regions may be constituted, of a silicide, a metal or a metal compound. When each of these regions is constituted of a silicide, a metal or a metal compound and each of these regions is connected to a wiring, these region may be constituted of a material in common with that constituting the wiring, such as titanium silicide or TiN used as a barrier layer or a glue layer. That is, the semiconductor memory cell preferably has a configuration in which each of these region has a common region with part of a wiring.

In the semiconductor memory cell according to any one of the fourteenth to seventeenth aspects of the present invention, the individual gate portions of the first transistor $TR_1$ and the second transistor $TR_2$ are opposed on the both sides of the semi-conductive layer, which advantageously reduces the cell area. Since both of the gate portion $G_1$ of the first transistor $TR_1$ and the gate portion $G_2$ of the second transistor $TR_2$ are connected to the first memory-cell-selecting line in common, only a single memory-cell-selecting line can suffice, which contributes to shrinkage of the chip area.

In the semiconductor memory cell according to any one of the fourteenth to seventeenth aspects of the present invention, the channel forming region $CH_1$ of the first transistor $TR_1$ is constituted of the other source/drain region of the second transistor $TR_2$. The third region $SC_3$ corresponding to one source/drain region of the second transistor $TR_2$ is connected to the write-in information setting line or the second memory-cell-selecting line. Selecting a proper potential of the first memory-cell-selecting line allows control of the on/off states of the first transistor $TR_1$ and second transistor $TR_2$. In more details, when the potential of the first memory-cell-selecting line is set, upon write-in, at a potential as high enough to bring the second transistor $TR_2$ into an on-state, the second transistor for write-in $TR_2$ is brought into an on-state, and whereby an electric charge is charged or accumulated in a capacitor formed between the first region $SC_1$ and the second region $SC_2$ in the second transistor $TR_2$ depending upon the potential of the write-in information setting line. As a result, the information is stored in the channel forming region $CH_1$ (the second region $SC_2$) of the first transistor $TR_1$ as a potential difference between the first region $SC_1$ and the second region $SC_2$, or as an electric charge. When the information is read out, the threshold voltage of the first transistor $TR_1$ seen from the gate region $G_1$ varies depending upon the above potential difference or electric charge (the information) stored or accumulated in the second region $SC_2$. Therefore, when the information is read out, applying a properly selected potential to the gate portion $G_1$ thus allows the on/off operation control of the first transistor $TR_1$, and detecting such operation state of the first transistor $TR_1$ enables the read-out of the information.

In the semiconductor memory cell according to the sixteenth or seventeenth aspect of the present invention, fabrication of the diode D can simplify the wiring configuration as compared to that in the semiconductor memory cell according to the fourteenth or fifteenth aspect of the present invention. In the semiconductor memory cell according to any one of the above fourteenth to seventeenth aspects of the present invention, there is no need to interconnect the gate portion of the first transistor on the first main surface and the gate portion of the second transistor on the second main surface in every semiconductor memory cell. Instead, it is allowable to make mutual connection among the gate portions of the first transistors and among the gate portions of the second transistors, individually, these first and second transistors being contained in a predetermined number of, or orderly located, adjacent semiconductor memory cells, which is followed by connecting them to the first memory-cell-selecting line.

As shown in a principle drawing of FIG. 122, for achieving the above object, according to a eighteenth aspect of the present invention, there is provided a semiconductor memory cell provided with a semi-conductive layer having a first main surface and a second main surface opposed to the first main surface, said semiconductor memory cell comprising a first semiconductor memory device and a second semiconductor memory device, said first semiconductor memory device comprising a first transistor of a first conductivity type for read-out $TR_{1A}$ and a first transistor of a second conductivity type for write-in $TR_{2A}$, and said second semiconductor memory device comprising a second transistor of the first conductivity type for read-out $TR_{1B}$ and a second transistor of the second conductivity type for write-in $TR_{2B}$, said semiconductor memory cell having;

(1) a first semi-conductive region $SC_1$ of the first conductivity type, formed through the semi-conductive layer from the first main surface to the second main surface, (2-1) a second-A semi-conductive or conductive region $SC_{2A}$ formed in a surface region, including the first main surface, of the first region $SC_1$, said second-A region $SC_{2A}$ forming a rectifier junction together with the first region $SC_1$, (2-2) a second-B semi-conductive or conductive region $SC_{2B}$ formed in a surface region, including the second main surface, of the first region $SC_1$, said second-B region $SC_{2B}$ forming a rectifier junction together with the first region $SC_1$, (3-1) a third-A semi-conductive region $SC_{3A}$ of the second conductivity type opposite to the first conductivity type, formed in a surface region, including the first main surface, of the first region $SC_1$ and spaced from the second-A region $SC_{2A}$, (3-2) a third-B semi-conductive region $SC_{3B}$ of the second conductivity type opposite to the first conductivity type, formed in a surface region, including the second main surface, of the first region $SC_1$ and spaced from the second-B region $SC_{3B}$, (4-1) a fourth-A semi-conductive or conductive region $SC_{4A}$ formed in a surface region, including the first main surface, of the third-A region $SC_{3A}$, said fourth-A region $SC_{4A}$ forming a rectifier junction together with the third-A region $SC_{3A}$, (4-2) a fourth-B semi-conductive or conductive region $SC_{4B}$ formed in a surface region, including the second main surface, of the third-B region $SC_{3B}$, said fourth-B region $SC_{4B}$ forming a rectifier junction together with the third-B region $SC_{3B}$, (5-1) a gate portion $G_{1A}$ and $G_{2A}$ of the first semiconductor memory device formed on a first barrier layer formed on the first main surface so as to bridge the first region $SC_1$ and the fourth-A region $SC_{4A}$ and so as to bridge the second-A region $SC_{2A}$ and the third-A region $SC_{3A}$, and (5-2) a gate portion $G_{1B}$ and $G_{2B}$ of the second semiconductor memory device formed on a second barrier layer formed on the second main surface so as to bridge the first region $SC_1$ and the fourth-B region $SC_{4B}$ and so as to bridge the second-B region $SC_{2B}$ and the third-B region $SC_{3B}$, wherein;

(A-1) one source/drain region of the first transistor for read-out $TR_{1A}$ is constituted of the fourth-A region $SC_{4A}$, (A-2) the other source/drain region of the first transistor for read-out $TR_{1A}$ is constituted of a surface region, including the first main surface, of the first region $SC_1$, (A-3) a channel forming region $CH_{1A}$ of the first transistor for read-out $TR_{1A}$ is constituted of a surface region, including the first main surface, of the third-A region $SC_{3A}$ which surface region is sandwiched by the surface region, including the first main surface, of the first region $SC_1$ and the fourth-A region $SC_{4A}$, (a-1) one source/drain region of the second transistor for read-out TRLB is constituted of the fourth-B region $SC_{4B}$, (a-2) the other source/drain region of the second transistor for read-out $TR_{1B}$ is constituted of a surface region, including the second main surface, of the first region $SC_1$, (a-3) a channel forming region $CH_{1B}$, of the second transistor for read-out $TR_{1B}$ is constituted of a surface region, including the second main surface, of the third-B region $SC_{3B}$ which surface region is sandwiched by the surface region, including the second main surface, of the first region $SC_1$ and the fourth-B region $SC_{4B}$, (B-1) one source/drain region of the first transistor for write-in $TR_{2A}$ is constituted of the second-A region $SC_{2A}$, (B-2) the other source/drain region of the first transistor for write-in $TR_{2A}$, is constituted of a surface region, including the first main surface, of the third-A region $SC_{3A}$, (B-3) a channel forming region $CH_{2A}$ of the first transistor for write-in $TR_{2A}$ is constituted of a surface region, including the first main surface, of the first region $SC_1$ which surface region is sandwiched by the surface region, including the first main surface, of the third-A region $SC_{3A}$ and the second-A region $SC_{2A}$, (b-1) one source/drain region of the second transistor for write-in $TR_{2B}$ is constituted of the second-B region $SC_{2B}$, (b-2) the other source/drain region of the second transistor for write-in $TR_{2B}$, is constituted of a surface region, including the second main surface, of the third-B region $SC_{3B}$, (b-3) a channel forming region $CH_{2B}$ of the second transistor for write-in $TR_{2B}$ is constituted of a surface region, including the second main surface, of the first region $SC_1$ which surface region is sandwiched by the surface region, including the second main surface, of the third-B region $SC_{3B}$ and the second-B region $SC_{2B}$, (C) the gate portion $G_{1A}$ and $G_{2A}$ of the first semiconductor memory device is connected to a first-A memory-cell-selecting line, (c) the gate portion $G_{1B}$ and $G_{2B}$ of the second semiconductor memory device is connected to a first-B memory-cell-selecting line, (D) the second-A region $SC_{2A}$ is connected to a write-in information setting line-A, (d) the second-B region $SC_{2B}$ is connected to a write-in information setting line-B, (E) the fourth-A region $SC_{4A}$ is connected to a second-A memory-cell-selecting line, (e) the fourth-B region $SC_{4B}$ is connected to a second-B memory-cell-selecting line, and (F) the first region $SC_1$ is connected to a predetermined potential line.

As shown in a principle drawing of FIG. 124, the semiconductor memory cell according to the eighteenth aspect of the present invention preferably has a configuration in which the fourth-A region $SC_{4A}$ is connected to a predetermined potential line-A in place of being connected to the second-A memory-cell-selecting line, the fourth-B region $SC_{4B}$ is connected to a predetermined potential line-B in place of being connected to the second-B memory-cell-selecting line, and the first region $SC_1$ is connected to a second memory-cell-selecting line in place of being connected to the predetermined potential line.

As shown in a principle drawing of FIG. 135, for achieving the above object, according to a nineteenth aspect of the present invention, there is provided a semiconductor memory cell provided with a semi-conductive layer having a first main surface and a second main surface opposed to the first main surface, said semiconductor memory cell comprising a first semiconductor memory device and a second semiconductor memory device, said first semiconductor memory device comprising a first transistor of a first conductivity type for read-out $TR_{1A}$, a first transistor of a second conductivity type for write-in $TR_{2A}$ and a first diode $D_A$, and said second semiconductor memory device comprising a second transistor of the first conductivity type for read-out $TR_{1B}$, a second transistor of the second conductivity type for write-in $TR_{2B}$ and a second diode $D_B$, said semiconductor memory cell having;

(1) a first semi-conductive region $SC_1$ of the first conductivity type, formed through the semi-conductive layer from the first main surface to the second main surface, (2-1) a second-A semi-conductive or conductive region $SC_{2A}$ formed in a surface region, including the first main surface, of the first region $SC_1$, said second-A region $SC_{2A}$ forming a rectifier junction together with the first region $SC_1$, (2-2) a second-B semi-conductive or conductive region $SC_{2B}$ formed in a surface region, including the second main surface, of the first region $SC_1$, said second-B region $SC_{2B}$ forming a rectifier junction together with the first region $SC_1$, (3-1) a third-A semi-conductive region $SC_{3A}$ of the second conductivity type opposite to the first conductivity type, formed in a surface region, including the first main surface, of the first region $SC_1$ and spaced from the second-A region $SC_{2A}$, (3-2) a third-B semi-conductive region $SC_{3B}$ of the second conductivity type opposite to the first conductivity type, formed in a surface region, including the second main surface, of the first region $SC_1$ and spaced from the second-B region $SC_{2B}$, (4-1) a fourth-A semi-conductive or conductive region $SC_{4A}$ formed in a surface region, including the first main surface, of the third-A region $SC_{3A}$, said fourth-A region $SC_{4A}$ forming a rectifier junction together with the third-A region $SC_{3A}$, (4-2) a fourth-B semi-conductive or conductive region $SC_{4B}$ formed in a surface region, including the second main surface, of the third-B region $SC_{3B}$, said fourth-B region $SC_{4B}$ forming a rectifier junction together with the third-B region $SC_{3B}$, (5-1) a gate portion $G_{1A}$ and $G_{2A}$ of the first semiconductor memory device formed on a first barrier layer formed on the first main surface so as to bridge the first region $SC_1$ and the fourth-A region $SC_{4A}$ and so as to bridge the second-A region $SC_{2A}$ and the third-A region $SC_{3A}$, and (5-2) a gate portion $G_{1B}$ and $G_{2B}$ of the second semiconductor memory device formed on a second barrier layer formed on the second main surface so as to bridge the first region $SC_1$ and the fourth-B region $SC_{4B}$ and so as to bridge the second-B region $SC_{2B}$ and the third-B region $SC_{3B}$, wherein;

(A-1) one source/drain region of the first transistor for read-out $TR_{1A}$ is constituted of the fourth-A region $SC_{4A}$, (A-2) the other source/drain region of the first transistor for read-out $TR_{1A}$ is constituted of a surface region, including the first main surface, of the first region $SC_1$, (A-3) a channel forming region $CH_{1A}$ of the first transistor for read-out $TR_{1A}$ is constituted of a surface region, including the first main surface, of the third-A region $SC_{3A}$ which surface region is sandwiched by the surface region, including the first main surface, of the first region $SC_1$ and the fourth-A region $SC_{4A}$, (a-1) one source/drain region of the second transistor for read-out $TR_{1B}$ is constituted of the fourth-B region $SC_{4B}$, (a-2) the other source/drain region of the second transistor for read-out $TR_{1B}$, is constituted of a surface region, including the second main surface, of the first region $SC_1$, (a-3) a channel forming region $CH_{1B}$ of the second transistor for read-out $TR_{1B}$ is constituted of a surface region, including the second main surface, of the third-B region $SC_{3B}$ which surface region is sandwiched by the surface region, including the second main surface, of the first region $SC_1$ and the fourth-B region $SC_{4B}$, (B-1) one source/drain region of the first transistor for write-in $TR_{2A}$ is constituted of the second-A region $SC_{2A}$, (B-2) the other source/drain region of the first transistor for write-in $TR_{2A}$ is constituted of a surface region, including the first main surface, of the third-A region $SC_{3A}$, (B-3) a channel forming region $CH_{2A}$ of the first transistor for write-in $TR_{2A}$ is constituted of a surface 25 region, including the first main surface, of the first region $SC_1$ which surface region is sandwiched by the surface region, including the first main surface, of the third-A region $SC_{3A}$ and the second-A region $SC_{2A}$, (b-1) one source/drain region of the second transistor for write-in $TR_{2B}$ is constituted of the second-B region $SC_{2B}$, (b-2) the other source/drain region of the second transistor for write-in $TR_{2B}$ is constituted of a surface region, including the second main surface, of the third-B region $SC_{3B}$, (b-3) a channel forming region $CH_{2B}$ of the second transistor for write-in $TR_{2B}$ is constituted of a surface region, including the second main surface, of the first region $SC_1$ which surface region is sandwiched by the surface region, including the second main surface, of the third-B region $SC_{3B}$ and the second-B region $SC_{2B}$, (C) the first diode DA is constituted of the first region $SC_1$ and the second-A region $SC_{2A}$, (c) the second diode $D_B$ is constituted of the first region $SC_1$ and the second-B region $SC_{2B}$, (D) the gate portion $G_{1A}$ and $G_{2A}$ of the first semiconductor memory device is connected to a first-A memory-cell-selecting line, (d) the gate portion $G_{1B}$ and $G_{2B}$ of the second semiconductor memory device is connected to a first-B memory-cell-selecting line, (E) the second-A region $SC_{2A}$ is connected to a write-in information setting line-A, (e) the second-B region $SC_{2B}$ is connected to a write-in information setting line-B, (F) the fourth-A region $SC_{4A}$ is connected to a second-A memory-cell-selecting line, and (f) the fourth-B region $SC_{4B}$ is connected to a second-B memory-cell-selecting line. As shown in a principle drawing of FIG. 137, the semiconductor memory cell according to the nineteenth aspect of the present invention preferably has a configuration in which the write-in information setting line-A is in common with the write-in information setting line-B.

As shown in a principle drawing of FIG. 139, the semiconductor memory cell according to the nineteenth aspect of the present invention preferably has a configuration in which the second-A region $SC_{2A}$ is connected to the second-A memory-cell-selecting line in place of being connected to the write-in information setting line-A, the second-B region $SC_{2B}$ is connected to the second-B memory-cell-selecting line in place of being connected to the write-in information setting line-B, the fourth-A region $SC_{4A}$ is connected to a predetermined potential line-A in place of being connected to the second-A memory-cell-selecting line, and the fourth-B region $SC_{4B}$ is connected to a predetermined potential line-B in place of being connected to the second-B memory-cell-selecting line. In this configuration, as shown in a principle drawing of FIG. 141, the semiconductor memory cell preferably has a configuration in which the second-A memory-cell-selecting line is in common with the second-B memory-cell-selecting line.

Further, as shown in a principle drawing of FIG. 143, the semiconductor memory cell according to the nineteenth aspect of the present invention preferably has a configuration in which the semiconductor memory cell further has a fifth-A conductive region $SC_{5A}$ formed in a surface region, including the first main surface, of the first region $SC_1$ and a fifth-B conductive region $SC_{5B}$ formed in a surface region, including the second main surface, of the first region $SC_1$, the first diode comprises a Schottky diode $D_{SA}$ constituted of the first region $SC_1$ and the fifth-A region $SC_{5A}$ in place of being constituted of the first region $SC_1$ and the second-A region $SC_{2A}$, and the second diode comprises a Schottky diode $D_{SB}$ constituted of the first region $SC_1$ and the fifth-B region $SC_{5B}$ in place of being constituted of the first region $SC_1$ and the second-B region $SC_{2B}$. The semiconductor memory cell having such a configuration is referred to as a semiconductor memory cell according to the twentieth aspect of the present invention. In this configuration, as shown in a principle drawing of FIG. 145, the semiconductor memory cell preferably has a configuration in which the write-in information setting line-A is in common with the write-in information setting line-B.

As shown in a principle drawing of FIG. 147, the semiconductor memory cell according to the twentieth aspect of the present invention preferably has a configuration in which the second-A region $SC_{2A}$ is connected to the second-A memory-cell-selecting line in place of being connected to the write-in information setting line-A, the second-B region $SC_{2B}$ is connected to the second-B memory-cell-selecting line in place of being connected to the write-in information setting line-B, the fourth-A region $SC_{4A}$ is connected to a predetermined potential line-A in place of being connected to the second-A memory-cell-selecting line, and the fourth-B region $SC_{4B}$ is connected to a predetermined potential line-B in place of being connected to the second-B memory-cell-selecting line. In this configuration, as shown in a principle drawing of FIG. 149 the semiconductor memory cell preferably has a configuration in which the second-A memory-cell-selecting line is in common with the second-B memory-cell-selecting line.

As shown in a principle drawing of FIG. 151, the semiconductor memory cell according to the nineteenth aspect of the present invention preferably has a configuration in which the write-in information setting line-A is in common with the write-in information setting line-B, the semiconductor memory cell further has a fifth conductive region $SC_5$ formed through the semi-conductive layer from the first main surface to the second main surface and being in contact with the first region $SC_1$, the first diode comprises a Schottky diode $D_S$ constituted of the first region $SC_1$ and the fifth region $SC_5$ in place of being constituted of the first region $SC_1$ and the second-A region $SC_{2A}$, and the second diode comprises a Schottky diode $D_S$ constituted of the first region $SC_1$ and the fifth region $SC_5$ in place of being constituted of the first region $SC_1$ and the second-B region $SC_{2B}$.

In this configuration, as shown in a principle drawing of FIG. 153, the semiconductor memory cell preferably has a configuration in which the second-A region $SC_{2A}$ and the second-B region $SC_{2B}$ are connected to a second memory-cell-selecting line in place of being connected to the common write-in information setting line, the fourth-A region $SC_{4A}$ is connected to a predetermined potential line-A in place of being connected to the second-A memory-cell-selecting line, and the fourth-B region $SC_{4B}$ is connected to a predetermined potential line-B in place of being connected to the second-B memory-cell-selecting line.

As shown in a principle drawing of FIG. 155, for achieving the above object, according to a twenty-first aspect of the present invention, there is provided a semiconductor memory cell provided with a semi-conductive layer having a first main surface and a second main surface opposed to the first main surface, said semiconductor memory cell comprising a first semiconductor memory device and a second semiconductor memory device, said first semiconductor memory device comprising a first transistor of a first conductivity type for read-out $TR_{1A}$, a first transistor of a second conductivity type for write-in $TR_{2A}$ and a first diode D, and said second semiconductor memory device comprising a second transistor of the first conductivity type for read-out $TR_{1B}$, a second transistor of the second conductivity type for write-in $TR_{2B}$ and a second diode D, said semiconductor memory cell having;

(1) a first semi-conductive region $SC_1$ of the first conductivity type, formed through the semi-conductive layer from the first main surface to the second main surface, (2) a second semi-conductive region $SC_2$ of the second conductivity type opposite to the first conductivity type, formed through the semi-conductive layer from the first main surface to the second main surface and being in contact with the first region $SC_1$, (3-1) a third-A semi-conductive region $SC_{3A}$ of the second conductivity type, formed in a surface region, including the first main surface, of the first region $SC_1$ and spaced from the second region $SC_2$, (3-2) a third-B semi-conductive region $SC_{3B}$ of the second conductivity type, formed in a surface region, including the second main surface, of the first region $SC_1$ and spaced from the second region $SC_2$, (4-1) a fourth-A semi-conductive or conductive region $SC_{4A}$ formed in a surface region, including the first main surface, of the third-A region $SC_{3A}$, said fourth-A region $SC_{4A}$ forming a rectifier junction together with the third-A region $SC_{3A}$, (4-2) a fourth-B semi-conductive or conductive region $SC_{4B}$ formed in a surface region, including the second main surface, of the third-B region $SC_{3B}$, said fourth-B region $SC_{4B}$ forming a rectifier junction together with the third-B region $SC_{3B}$, (5-1) agate portion $G_{1A}$ and $G_{2A}$ of the first semiconductor memory device formed on a first barrier layer formed on the first main surface so as to bridge the first region $SC_1$ and the fourth-A region $SC_{4A}$ and so as to bridge the second region $SC_2$ and the third-A region $SC_{3A}$, and (5-2) a gate portion $G_{1B}$ and $G_{2B}$ of the second semiconductor memory device formed on a second barrier layer formed on the second main surface so as to bridge the first region $SC_1$ and the fourth-B region $SC_{4B}$ and so as to bridge the second region $SC_2$ and the third-B region $SC_{3B}$, wherein;

(A-1) one source/drain region of the first transistor for read-out $TR_{1A}$ is constituted of the fourth-A region $SC_{4A}$, (A-2) the other source/drain region of the first transistor for read-out $TR_{1A}$ is constituted of a surface region, including the first main surface, of the first region $SC_1$, (A-3) a channel forming region $CH_{1A}$ of the first transistor for read-out $TR_{1A}$ is constituted of a surface region, including the first main surface, of the third-A region $SC_{3A}$ which surface region is sandwiched by the surface region, including the first main surface, of the first region $SC_1$ and the fourth-A region $SC_{4A}$, (a-1) one source/drain region of the second transistor for read-out $TR_{1B}$ is constituted of the fourth-B region $SC_{4B}$, (a-2) the other source/drain region of the second transistor for read-out $TR_1$, is constituted of a surface region, including the second main surface, of the first region $SC_1$, (a-3) a channel forming region $CH_{1B}$ of the second transistor for read-out $TR_{1B}$ is constituted of a surface region, including the second main surface, of the third-B region $SC_{3B}$ which surface region is sandwiched by the surface region, including the second main surface, of the first region $SC_1$ and the fourth-B region $SC_{4B}$, (B-1) one source/drain region of the first transistor for write-in $TR_{2A}$ is constituted of a surface region, including the first main surface, of the second region $SC_2$, (B-2) the other source/drain region of the first transistor for write-in $TR_{2A}$ is constituted of a surface region, including the first main surface, of the third-A region $SC_{3A}$, (B-3) a channel forming region $CH_{2A}$ of the first transistor for write-in $TR_{2A}$ is constituted of a surface region, including the first main surface, of the first region $SC_1$ which surface region is sandwiched by the surface region, including the first main surface, of the second region $SC_2$ and the surface region, including the first main surface, of the third-A region $SC_{3A}$, (b-1) one source/drain region of the second transistor for write-in $TR_{2B}$ is constituted of a surface region, including the second main surface, of the second region $SC_2$, (b-2) the other source/drain region of the second transistor for write-in $TR_{2B}$ is constituted of a surface region, including the second main surface, of the third-B region $SC_{3B}$, (b-3) a channel forming region $CH_{2B}$ of the second transistor for write-in $TR_{2B}$ is constituted of a surface region, including the second main surface, of the first region $SC_1$ which surface region is sandwiched by the surface region, including the second main surface, of the second region $SC_2$ and the surface region, including the second main surface, of the third-B region $SC_{3B}$, (C) the first diode D is in common with the second diode D, and each of the first diode D and the second diode D is constituted of the first region $SC_1$ and the second region $SC_2$, (D) the gate portion $G_{1A}$ and $G_{2A}$ of the first semiconductor memory device is connected to a first-A memory-cell-selecting line, (d) the gate portion $G_{1B}$ and $G_{2B}$ of the second semiconductor memory device is connected to a first-B memory-cell-selecting line, (E) the second region $SC_2$ is connected to a write-in information setting line, (F) the fourth-A region $SC_{4A}$ is connected to a second-A memory-cell-selecting line, and (f) the fourth-B region $SC_{4B}$ is connected to a second-B memory-cell-selecting line.

As shown in a principle drawing of FIG. 157, the semiconductor memory cell according to the twenty-first aspect of the present invention preferably has a configuration in which the second region $SC_2$ is connected to a second memory-cell-selecting line in place of being connected to the write-in information setting line, the fourth-A region $SC_{4A}$ is connected to a predetermined potential line-A in place of being connected to the second-A memory-cell-selecting line, and the fourth-B region $SC_{4B}$ is connected to a predetermined potential line-B in place of being connected to the second-B memory-cell-selecting line.

When the write-in information setting line A and write-in information setting line B are fabricated in common, or the second-A memory-cell-selecting line and the second-B memory-cell-selecting line are fabricated in common, there is no need to mutually interconnect these write-in information setting lines or these memory-cell-selecting lines. Instead, it is allowable to make mutual connection among the write-in information setting lines or among the second memory-cell-selecting lines contained in a predetermined number of, or orderly located, adjacent semiconductor memory cells. It is also allowable to interconnect the first-A and first-B memory-cell-selecting lines for every semiconductor memory cell, or to interconnect the first-A and first-B memory-cell-selecting lines in a predetermined number of, or orderly located, adjacent memory cells.

When each of the second-A region $SC_{2A}$, the second-B region $SC_{2B}$, the fourth-A region $SC_{4A}$ and the fourth-B region $SC_{4B}$ is constituted of a conductive region in the semiconductor memory cell according to the eighteenth to twentieth aspects of the present invention, or when each of the fourth-A region $SC_{4A}$ and the fourth-B region $SC_{4B}$ is constituted of a conductive region in the semiconductor memory cell according to the twenty-first aspect of the present invention, each of these regions may be constituted of a silicide, a metal or a metal compound. When the conductive region is constituted of a silicide, a metal such as Mo or Al or a metal compound and the conductive region is connected to a wiring, the conductive region may be constituted of a material in common with that constituting the wiring, such as titanium silicide or TiN used as a barrier layer or a glue layer. That is, the semiconductor memory cell preferably has a configuration in which the conductive region has a common region with part of a wiring. Further, the semiconductor memory cell preferably has a configuration in which the region $SC_{5A}$, the region $SC_{5B}$ or the region $SC_5$ may be constituted of a silicide, a metal or a metal compound.

In the semiconductor memory cell according to any one of the eighteenth to twenty-first aspects of the present invention, a region $SC_{6A}$ containing a high concentration of an impurity having the first conductivity type is preferably formed between the first region $SC_1$ and the third-A region $SC_{3A}$, or a region $SC_{6B}$ containing a high concentration of an impurity having the first conductivity type is preferably formed between the first region $SC_1$ and the third-B region $SC_{3B}$, for increasing a potential or an electric charge stored in the channel forming region $CH_{1A}$ or $CH_{1B}$ of the first or second transistor for read-out $TR_{1A}$ or $TR_{1B}$.

In the semiconductor memory cell according to any one of the eighteenth to twenty-first aspects of the present invention, the first semiconductor memory device and the second semiconductor memory device, opposite to each other, are fabricated on the portions in the semi-conductive layer containing the first main surface and the second main surface, respectively. Thus a region essentially accepting only one semiconductor memory cell can contain two semiconductor memory cells, which contributes to a larger integration density of the semiconductor memory cells.

In the individual memory devices of the semiconductor memory cell according to any one of the eighteenth to twenty-first aspects of the present invention, the individual gate portions of the read-out transistor and write-in transistor are fabricated in common, both of which being connected to the first-A and first-B memory-cell-selecting lines. Therefore, only one first-A memory-cell-selecting line and only one first-B memory cell selecting line can suffice for every semiconductor memory cell, which contributes to a smaller chip area.

In the semiconductor memory cell according to the eighteenth to twenty-first aspects of the present invention, now exemplifying the first semiconductor memory device, the channel forming region $CH_{1A}$ of the first transistor for read-out $TR_{1A}$ is constituted of the third-A region $SC_{3A}$ functioning as the other source/drain region of the first transistor for write-in $TR_{2A}$. The second region $SC_{2A}$ corresponding to one source/drain region of the first transistor for write-in $TR_{2A}$ is connected to the write-in information setting line A or the second-A memory-cell selecting line. Selecting a proper potential of the first-A memory-cell selecting line allows control of the on/off states of the first transistor for read-out $TR_{1A}$ and the first transistor for write-in $TR_{2A}$. In more details, when the potential of the first-A memory-cell-selecting line is set, upon write-in, at a potential as high enough to bring the first transistor for write-in $TR_{2A}$ into an on-state, the first transistor for write-in $TR_{2A}$ is brought into an on-state, and whereby an electric charge is charged or accumulated in a capacitor formed between the first region $SC_1$ and the third-A region $SC_{3A}$ in the first transistor for write-in $TR_{2A}$ depending upon the potential of the write-in information setting line A or the second-A memory-cell-selecting line. As a result, the information is stored or accumulated in the channel forming region $CH_{1A}$ (the third-A region $SC_{3A}$) of the first transistor for read-out $TR_{1A}$ as a potential difference between the first region $SC_1$ and the third-A region $SC_{3A}$, or as an electric charge. When the information is read out, the threshold voltage of the first transistor for read-out $TR_{1A}$ seen from the gate region $G_{1A}$ varies depending upon the above potential difference or electric charge (the information) stored or accumulated in the third-A region $SC_{3A}$. When the information is read-out, applying a properly selected potential to the gate portion $G_{1A}$ thus allows the on/off operation control of the first transistor for read-out $TR_{1A}$, and detecting such operation state of the first transistor for read-out $TR_{1A}$ enables the read-out of the information.

The semiconductor memory cell according to any one of the nineteenth to twenty-first aspects of the present invention is provided with the diode, which can simplify the wiring configuration as compared with that in the semiconductor memory cell according to the eighteenth aspect of the present invention.

As shown in a principle drawing of FIG. 160, for achieving the above object, according to a twenty-second aspect of the present invention, there is provided a semiconductor memory cell comprising two semiconductor memory devices opposite to each other, and each semiconductor memory device comprising three transistors, a transistor for read-out, a transistor for write-in and a junction-field-effect transistor for current control.

That is, according to the twenty-second aspect of the present invention, there is provided a semiconductor memory cell provided with a semi-conductive layer having a first main surface and a second main surface opposed to the first main surface, said semiconductor memory cell comprising a first semiconductor memory device and a second semiconductor memory device, said first semiconductor memory device comprising a first transistor of a first conductivity type for read-out $TR_{1A}$, a first transistor of a second conductivity type for write-in $TR_{2A}$ and a first junction-field-effect transistor of the first conductivity type for current control $TR_{3A}$, and said second semiconductor memory device comprising a second transistor of the first conductivity type for read-out $TR_{1B}$, a second transistor of the second conductivity type for write-in $TR_{2B}$ and a second junction-field-effect transistor of the first conductivity type for current control $TR_{3B}$, said semiconductor memory cell having;

(1) a first semi-conductive region $SC_1$ of the first conductivity type, formed through the semi-conductive layer from the first main surface to the second main surface, (2-1) a second-A semi-conductive or conductive region $SC_{2A}$ formed in a surface region, including the first main surface, of the first region $SC_1$, said second-A region $SC_{2A}$ forming a rectifier junction together with the first region $SC_1$, (2-2) a second-B semi-conductive or conductive region $SC_{2B}$ formed in a surface region, including the second main surface, of the first region $SC_1$, said second-B region $SC_{2B}$ forming a rectifier junction together with the first region $SC_1$, (3-1) a third-A semi-conductive region $SC_{3A}$ of the second conductivity type opposite to the first conductivity type, formed in a surface region, including the first main surface, of the first region $SC_1$ and spaced from the second-A region $SC_{2A}$, (3-2) a third-B semi-conductive region $SC_{3B}$ of the second conductivity type, formed in a surface region, including the second main surface, of the first region $SC_1$ and spaced from the second-B region $SC_{2B}$, (4-1) a fourth-A semi-conductive or conductive region $SC_{4A}$ formed in a surface region, including the first main surface, of the third-A region $SC_{3A}$, said fourth-A region $SC_{4A}$ forming a rectifier junction together with the third-A region $SC_{3A}$, (4-2) a fourth-B semi-conductive or conductive region $SC_{4B}$ formed in a surface region, including the second main surface, of the third-B region $SC_{3B}$, said fourth-B region $SC_{4B}$ forming a rectifier junction together with the third-B region $SC_{3B}$, (5-1) a gate portion $G_A$ ($G_{1A}$ and $G_{2A}$) of the first semiconductor memory device formed on a first barrier layer formed on the first main surface so as to bridge the first region $SC_1$ and the fourth-A region $SC_{4A}$ and so as to bridge the second-A region $SC_{2A}$ and the third-A region $SC_{3A}$, and (5-2) a gate portion GB ($G_{1B}$ and $G_{2B}$) of the second semiconductor memory device formed on a second barrier layer formed on the second main surface so as to bridge the first region $SC_1$ and the fourth-B region $SC_{4B}$ and so as to bridge the second-B region $SC_{2B}$ and the third-B region $SC_{3B}$, wherein;

(A-1) one source/drain region of the first transistor for read-out $TR_{1A}$ is constituted of the fourth-A region $SC_{4A}$, (A-2) the other source/drain region of the first transistor for read-out $TR_{1A}$ is constituted of a surface region, including the first main surface, of the first region $SC_1$, (A-3) a channel forming region $CH_{1A}$ of the first transistor for read-out $TR_{1A}$ is constituted of a surface region, including the first main surface, of the third-A region $SC_{3A}$ which surface region is sandwiched by the surface region, including the first main surface, of the first region $SC_1$ and the fourth-A region $SC_{4A}$, (a-1) one source/drain region of the second transistor for read-out $TR_{1B}$ is constituted of the fourth-B region $SC_{4B}$, (a-2) the other source/drain region of the second transistor for read-out $TR_{1B}$ is constituted of a surface region, including the second main surface, of the first region $SC_1$, (a-3) a channel forming region $CH_{1B}$ of the second transistor for read-out $TR_{1B}$ is constituted of a surface region, including the second main surface, of the third-B region $SC_{3B}$ which surface region is sandwiched by the surface region, including the second main surface, of the first region $SC_1$ and the fourth-B region $SC_{4B}$, (B-1) one source/drain region of the first transistor for write-in $TR_{2A}$ is constituted of the second-A region $SC_{2A}$, (B-2) the other source/drain region of the first transistor for write-in $TR_{2A}$ is constituted of a surface region, including the first main surface, of the third-A region $SC_{3A}$, (B-3) a channel forming region $CH_{2A}$ of the first transistor for write-in $TR_{2A}$ is constituted of a surface region, including the first main surface, of the first region $SC_1$ which surface region is sandwiched by the surface region, including the first main surface, of the third-A region $SC_{3A}$ and the second-A region $SC_{2A}$, (b-1) one source/drain region of the second transistor for write-in $TR_{2B}$ is constituted of the second-B region $SC_{2B}$, (b-2) the other source/drain region of the second transistor for write-in $TR_{2B}$, is constituted of a surface region, including the second main surface, of the third-B region $SC_{3B}$, (b-3) a channel forming region $CH_{2B}$ of the second transistor for write-in $TR_{2B}$ is constituted of a surface region, including the second main surface, of the first region $SC_1$ which surface region is sandwiched by the surface region, including the second main surface, of the third-B region $SC_{3B}$ and the second-B region $SC_{2B}$, (C-1) gate regions of the first junction-field-effect transistor $TR_{3A}$ are constituted of the second-A region $SC_{2A}$ and the third-A region $SC_{3A}$, (C-2) a channel region $CH_{3A}$ of the first junction-field-effect transistor $TR_{3A}$ is constituted of a portion of the first region $SC_1$ sandwiched by the second-A region $SC_{2A}$ and the third-A region $SC_{3A}$, (c-1) gate regions of the second junction-field-effect transistor $TR_{3B}$ are constituted of the second-B region $SC_{2B}$ and the third-B region $SC_{3B}$, (c-2) a channel region $CH_{3B}$ of the second junction-field-effect transistor $TR_{3B}$ is constituted of a portion of the first region $SC_1$ sandwiched by the second-B region $SC_{2B}$ and the third-B region $SC_{3B}$, (D) the gate portion $G_A$ ($G_{1A}$ and $G_{2A}$) of the first semiconductor memory device is connected to a first-A memory-cell-selecting line, (d) the gate portion GB ($G_{1B}$ and $G_{2B}$) of the second semiconductor memory device is connected to a first-B memory-cell-selecting line, (E) the second-A region $SC_{2A}$ is connected to a write-in information setting line-A, (e) the second-B region $SC_{2B}$ is connected to a write-in information setting line-B, (F) the fourth-A region $SC_{4A}$ is connected to a second-A memory-cell-selecting line, (f) the fourth-B region $SC_{4B}$ is connected to a second-B memory-cell-selecting line, and (G) the first region $SC_1$ is connected to a predetermined potential line.

For achieving the above object, according to a twenty-third aspect of the present invention, there is provided a semiconductor memory cell comprising two semiconductor memory devices opposite to each other, and each semiconductor memory device comprising three transistors, a transistor for read-out, a transistor for write-in and a junction-field-effect transistor for current control. The semiconductor memory cell according to the twenty-third aspect of the present invention differs from the semiconductor memory cell according to the twenty-second aspect of the present invention in that regions constituting the junction-field-effect transistor for current control are different, in that each of the fourth-A region $SC_{4A}$ and the fourth-B region $SC_{4B}$ is constituted of a semi-conductive region, and in that the fifth-A region $SC_{5A}$ and the fifth-B region $SC_{5B}$ are formed.

That is, as shown in a principle drawing of FIG. 164, according to the twenty-third aspect of the present invention, there is provided a semiconductor memory cell provided with a semi-conductive layer having a first main surface and a second main surface opposed to the first main surface, said semiconductor memory cell comprising a first semiconductor memory device and a second semiconductor memory device, said first semiconductor memory device comprising a first transistor of a first conductivity type for read-out $TR_{1A}$, a first transistor of a second conductivity type for write-in $TR_{2A}$ and a first junction-field-effect transistor of the first conductivity type for current control $TR_{4A}$, and said second semiconductor memory device comprising a second transistor of the first conductivity type for read-out $TR_{1B}$, a second transistor of the second conductivity type for write-in $TR_{2B}$ and a second junction-field-effect transistor of the first conductivity type for current control $TR_{4B}$, said semiconductor memory cell having;

(1) a first semi-conductive region $SC_1$ of the first conductivity type, formed through the semi-conductive layer from the first main surface to the second main surface, (2-1) a second-A semi-conductive or conductive region $SC_{2A}$ formed in a surface region, including the first main surface, of the first region $SC_1$, said second-A region $SC_{2A}$ forming a rectifier junction together with the first region $SC_1$, (2-2) a second-B semi-conductive or conductive region $SC_{2B}$ formed in a surface region, including the second main surface, of the first region $SC_1$, said second-B region $SC_{2B}$ forming a rectifier junction together with the first region $SC_1$, (3-1) a third-A semi-conductive region $SC_{3A}$ of the second conductivity type opposite to the first conductivity type, formed in a surface region, including the first main surface, of the first region $SC_1$ and spaced from the second-A region $SC_{2A}$, (3-2) a third-B semi-conductive region $SC_{3B}$ of the second conductivity type, formed in a surface region, including the second main surface, of the first region $SC_1$ and spaced from the second-B region $SC_{2B}$, (4-1) a fourth-A semi-conductive region $SC_{4A}$ of the first conductivity type, formed in a surface region, including the first main surface, of the third-A region $SC_{3A}$, (4-2) a fourth-B semi-conductive region $SC_{4B}$ of the first conductivity type, formed in a surface region, including the second main surface, of the third-B region $SC_{3B}$, (5-1) a fifth-A semi-conductive or conductive region $SC_{5A}$ formed in a surface region, including the first main surface, of the fourth-A region $SC_{4A}$, said fifth-A region $SC_{5A}$ forming a rectifier junction together with the fourth-A region $SC_{4A}$, (5-2) a fifth-B semi-conductive or conductive region $SC_{5B}$ formed in a surface region, including the second main surface, of the fourth-B region $SC_{4B}$, said fifth-B region $SC_{5B}$ forming a rectifier junction together with the fourth-B region $SC_{4B}$, (6-1) a gate portion $G_A$ ($G_{1A}$ and $G_{2A}$) of the first semiconductor memory device formed on a first barrier layer formed on the first main surface so as to bridge the first region $SC_1$ and the fourth-A region $SC_{4A}$ and so as to bridge the second-A region $SC_{2A}$ and the third-A region $SC_{3A}$, and (6-2) a gate portion $G_B$ ($G_{1B}$ and $G_{2B}$) of the second semiconductor memory device formed on a second barrier layer formed on the second main surface so as to bridge the first region $SC_1$ and the fourth-B region $SC_{4B}$ and so as to bridge the second-B region $SC_{2B}$ and the third-B region $SC_{3B}$, wherein;

(A-1) one source/drain region of the first transistor for read-out $TR_{1A}$ is constituted of the fourth-A region $SC_{4A}$, (A-2) the other source/drain region of the first transistor for read-out $TR_{1A}$ is constituted of a surface region, including the first main surface, of the first region $SC_1$, (A-3) a channel forming region $CH_{1A}$ of the first transistor for read-out $TR_{1A}$ is constituted of a surface region, including the first main surface, of the third-A region $SC_{3A}$ which surface region is sandwiched by the surface region, including the first main surface, of the first region $SC_1$ and the fourth-A region $SC_{4A}$, (a-1) one source/drain region of the second transistor for read-out $TR_{1B}$ is constituted of the fourth-B region $SC_{4B}$, (a-2) the other source/drain region of the second transistor for read-out $TR_{1B}$ is constituted of a surface region, including the second main surface, of the first region $SC_1$, (a-3) a channel forming region $CH_{1B}$ of the second transistor for read-out $TR_{1B}$ is constituted of a surface region, including the second main surface, of the third-B region $SC_{3B}$ which surface region is sandwiched by the surface region, including the second main surface, of the first region $SC_1$ and the fourth-B region $SC_{4B}$, (B-1) one source/drain region of the first transistor for write-in $TR_{2A}$ is constituted of the second-A region $SC_{2A}$, (B-2) the other source/drain region of the first transistor for write-in $TR_{2A}$ is constituted of a surface region, including the first main surface, of the third-A region $SC_{3A}$, (B-3) a channel forming region $CH_{2A}$ of the first transistor for write-in $TR_{2A}$ is constituted of a surface region, including the first main surface, of the first region $SC_1$ which surface region is sandwiched by the surface region, including the first main surface, of the third-A region $SC_{3A}$ and the second-A region $SC_{2A}$, (b-1) one source/drain region of the second transistor for write-in $TR_{2B}$ is constituted of the second-B region $SC_{2B}$, (b-2) the other source/drain region of the second transistor for write-in $TR_{2B}$ is constituted of a surface region, including the second main surface, of the third-B region $SC_{3B}$, (b-3) a channel forming region $CH_{2B}$ of the second transistor for write-in $TR_{2B}$ is constituted of a surface region, including the second main surface, of the first region $SC_1$ which surface region is sandwiched by the surface region, including the second main surface, of the third-B region $SC_{3B}$ and the second-B region $SC_{2B}$, (C-1) gate regions of the first junction-field-effect transistor $TR_{4A}$ are constituted of the fifth-A region $SC_{5A}$ and a portion of third-A region $SC_{3A}$ facing the fifth-A region $SC_{5A}$, (C-2) a channel region $CH_{4A}$ of the first junction-field-effect transistor $TR_{4A}$ is constituted of a portion of the fourth-A region $SC_{4A}$ sandwiched by the fifth-A region $SC_{5A}$ and said portion of the third-A region $SC_{3A}$, (C-3) source/drain regions of the first junction-field-effect transistor $TR_{4A}$ are constituted of portions of the fourth-A region $SC_{4A}$, one of the portions of the fourth-A region $SC_{4A}$ extending from one end of the channel region $CH_{4A}$ of the first junction-field-effect transistor $TR_{4A}$ and the other of the portions of the fourth-A region $SC_{4A}$ extending from the other end of the channel region $CH_{4A}$ of the first junction-field-effect transistor $TR_{4A}$, (c-1) gate regions of the second junction-field-effect transistor $TR_{4B}$ are constituted of the fifth-B region $SC_{5B}$ and a portion of third-B region $SC_{3B}$ facing the fifth-B region $SC_{5B}$, (c-2) a channel region $CH_{4B}$ of the second junction-field-effect transistor $TR_{4B}$ is constituted of a portion of the fourth-B region $SC_{4B}$ sandwiched by the fifth-B region $SC_{5B}$ and said portion of the third-B region $SC_{3B}$, (c-3) source/drain regions of the second junction-field-effect transistor $TR_{4B}$ are constituted of portions of the fourth-B region $SC_{4B}$, one of the portions of the fourth-B region $SC_{4B}$ extending from one end of the channel region $CH_{4B}$ of the second junction-field-effect transistor $TR_{4B}$ and the other of the portions of the fourth-B region $SC_{4B}$ extending from the other end of the channel region $CH_{4B}$ of the second junction-field-effect transistor $TR_{4B}$, (D) the gate portion $G_A$ ($G_{1A}$ and $G_{2A}$) of the first semiconductor memory device is connected to a first-A memory-cell-selecting line, (d) the gate portion $G_B$ ($G_{1B}$ and $G_{2B}$) of the second semiconductor memory device is connected to a first-B memory-cell-selecting line, (E) the second-A region $SC_{2A}$ is connected to a write-in information setting line-A, (e) the second-B region $SC_{2B}$ is connected to a write-in information setting line-B, (F) the fourth-A region $SC_{4A}$ is connected to a second-A memory-cell-selecting line, (f) the fourth-B region $SC_{4B}$ is connected to a second-B memory-cell-selecting line, (G) the first region $SC_1$ is connected to a predetermined potential line, (H) the fifth-A region $SC_{5A}$ is connected to the write-in information setting line-A, and (h) the fifth-B region $SC_{5B}$ is connected to the write-in information setting line-B.

As shown in a principle drawing of FIG. 168, the semiconductor memory cell according to the twenty-third aspect of the present invention preferably has a configuration in which the first semiconductor memory device further has a third junction-field-effect transistor of the first conductivity type for current control $TR_{5A}$, and the second semiconductor memory device further has a fourth junction-field-effect transistor of the first conductivity type for current control $TR_{5B}$, wherein;

(I-1) gate regions of the third junction-field-effect transistor $TR_{5A}$ are constituted of the second-A region $SC_{2A}$ and the third-A region $SC_{3A}$, (I-2) a channel region $CH_{5A}$ of the third junction-field-effect transistor $TR_{5A}$ is constituted of a portion of the first region $SC_1$ sandwiched by the second-A region $SC_{2A}$ and the third-A region $SC_{3A}$, (i-1) gate regions of the fourth junction-field-effect transistor $TR_{5B}$ are constituted of the second-B region $SC_{2B}$ and the third-B region $SC_{3B}$, and (i-2) a channel region $CH_{5B}$ of the fourth junction-field-effect transistor $TR_{5B}$ is constituted of a portion of the first region $SC_1$ sandwiched by the second-B region $SC_{2B}$ and the third-B region $SC_{3B}$.

Alternatively, as shown in a principle drawing of FIG. 172, the semiconductor memory cell according to the twenty-third aspect of the present invention preferably has a configuration in which the fifth-A region $SC_{5A}$ is connected to the third-A region $SC_{3A}$ in place of being connected to the write-in information setting line-A, and the fifth-B region $SC_{5B}$ is connected to the third-B region $SC_{3B}$ in place of being connected to the write-in information setting line-B. The semiconductor memory cell having such a configuration is referred to as a semiconductor memory cell according to the twenty-fourth aspect of the present invention.

As shown in a principle drawing of FIG. 177, the semiconductor memory cell according to the twenty-fourth aspect of the present invention preferably has a configuration in which the first semiconductor memory device further has a third junction-field-effect transistor of the first conductivity type for current control $TR_{5A}$, and the second semiconductor memory device further has a fourth junction-field-effect transistor of the first conductivity type for current control $TR_{5B}$, wherein;

(I-1) gate regions of the third junction-field-effect transistor $TR_{5A}$ are constituted of the second-A region $SC_{2A}$ and the third-A region $SC_{3A}$, (I-2) a channel region $CH_{5A}$ of the third junction-field-effect transistor $TR_{5A}$ is constituted of a portion of the first region $SC_1$ sandwiched by the second-A region $SC_{2A}$ and the third-A region $SC_{3A}$, (i-1) gate regions of the fourth junction-field-effect transistor $TR_{5B}$ are constituted of the second-B region $SC_{2B}$ and the third-B region $SC_{3B}$, and (i-2) a channel region $CH_{5B}$ of the fourth junction-field-effect-transistor $TR_{5B}$ is constituted of a portion of the first region $SC_1$ sandwiched by the second-B region $SC_{2B}$ and the third-B region $SC_{3B}$.

As shown in a principle drawing of FIG. 181, for achieving the above object, according to a twenty-fifth aspect of the present invention, there is provided a semiconductor memory cell comprising two semiconductor memory devices opposite to each other, each semiconductor memory device comprising four transistors, a transistor for read-out, a transistor for write-in, a junction-field-effect transistor for current control and an additional transistor for write-in.

That is, according to the twenty-fifth aspect of the present invention, there is provided a semiconductor memory cell provided with a semi-conductive layer having a first main surface and a second main surface opposed to the first main surface, said semiconductor memory cell comprising a first semiconductor memory device and a second semiconductor memory device, said first semiconductor memory device comprising a first transistor of a first conductivity type for read-out $TR_{1A}$, a first transistor of a second conductivity type for write-in $TR_{2A}$, a first junction-field-effect transistor of the first conductivity type for current control $TR_{4A}$ and a third transistor of the second conductivity type for write-in $TR_{6A}$, and said second semiconductor memory device comprising a second transistor of the first conductivity type for read-out $TR_{1B}$, a second transistor of the second conductivity type for write-in $TR_{2B}$, a second junction-field-effect transistor of the first conductivity type for current control $TR_{4B}$ and a fourth transistor of the second conductivity type for write-in $TR_{6B}$, said semiconductor memory cell having;

(1) a first semi-conductive region $SC_1$ of the first conductivity type, formed through the semi-conductive layer from the first main surface to the second main surface, (2-1) a second-A semi-conductive or conductive region $SC_{2A}$ formed in a surface region, including the first main surface, of the first region $SC_1$, said second-A region $SC_{2A}$ forming a rectifier junction together with the first region $SC_1$, (2-2) a second-B semi-conductive or conductive region $SC_{2B}$ formed in a surface region, including the second main surface, of the first region $SC_1$, said second-B region $SC_{2B}$ forming a rectifier junction together with the first region $SC_1$, (3-1) a third-A semi-conductive region $SC_{3A}$ of the second conductivity type opposite to the first conductivity type, formed in a surface region, including the first main surface, of the first region $SC_1$ and spaced from the second-A region $SC_{2A}$, (3-2) a third-B semi-conductive region $SC_{3B}$ of the second conductivity type, formed in a surface region, including the second main surface, of the first region $SC_1$ and spaced from the second-B region $SC_{2B}$, (4-1) a fourth-A semi-conductive region $SC_{4A}$ of the first conductivity type, formed in a surface region, including the first main surface, of the third-A region $SC_{3A}$, (4-2) a fourth-B semi-conductive region $SC_{4B}$ of the first conductivity type, formed in a surface region, including the second main surface, of the third-B region $SC_{3B}$, (5-1) a fifth-A semi-conductive or conductive region $SC_{5A}$ formed in a surface region, including the first main surface, of the fourth-A region $SC_{4A}$, said fifth-A region $SC_{5A}$ forming a rectifier junction together with the fourth-A region $SC_{4A}$, (5-2) a fifth-B semi-conductive or conductive region $SC_{5B}$ formed in a surface region, including the second main surface, of the fourth-B region $SC_{4B}$, said fifth-B region $SC_{5B}$ forming a rectifier junction together with the fourth-B region $SC_{4B}$, (6-1) a gate portion $G_A$ ($G_{1A}$, $G_{2A}$ and $G_{6A}$) of the first semiconductor memory device formed on a first barrier layer formed on the first main surface so as to bridge the first region $SC_1$ and the fourth-A region $SC_{4A}$, so as to bridge the second-A region $SC_{2A}$ and the third-A region $SC_{3A}$ and so as to bridge the third-A region $SC_{3A}$ and the fifth-A region $SC_{5A}$, and (6-2) a gate portion $G_1$ ($G_{1B}$, $G_{2B}$ and $G_{6B}$) of the second semiconductor memory device formed on a second barrier layer formed on the second main surface so as to bridge the first region $SC_1$ and the fourth-B region $SC_{4B}$, so as to bridge the second-B region $SC_{2B}$ and the third-B region $SC_{3B}$ and so as to bridge the third-B region $SC_{3B}$ and the fifth-b region $SC_{5B}$, wherein;

(A-1) one source/drain region of the first transistor for read-out $TR_{1A}$ is constituted of the fourth-A region $SC_{4A}$, (A-2) the other source/drain region of the first transistor for read-out $TR_{1A}$ is constituted of a surface region, including the first main surface, of the first region $SC_1$, (A-3) a channel forming region $CH_{1A}$ of the first transistor for read-out $TR_{1A}$ is constituted of a surface region, including the first main surface, of the third-A region $SC_{3A}$ which surface region is sandwiched by the surface region, including the first main surface, of the first region $SC_1$ and the fourth-A region $SC_{4A}$, (a-1) one source/drain region of the second transistor for read-out $TR_{1B}$ is constituted of the fourth-B region $SC_{4B}$, (a-2) the other source/drain region of the second transistor for read-out $TR_{1B}$ is constituted of a surface region, including the second main surface, of the first region $SC_1$, (a-3) a channel forming region $CH_{1B}$ of the second transistor for read-out $TR_{1B}$ is constituted of a surface region, including the second main surface, of the third-B region $SC_{3B}$ which surface region is sandwiched by the surface region, including the second main surface, of the first region $SC_1$ and the fourth-B region $SC_{4B}$, (B-1) one source/drain region of the first transistor for write-in $TR_{2A}$ is constituted of the second-A region $SC_{2A}$, (B-2) the other source/drain region of the first transistor for write-in $TR_{2A}$ is constituted of a surface region, including the first main surface, of the third-A region $SC_{3A}$, (B-3) a channel forming region $CH_{2A}$ of the first transistor for write-in $TR_{2A}$ is constituted of a surface region, including the first main surface, of the first region $SC_1$ which surface region is sandwiched by the surface region, including the first main surface, of the third-A region $SC_{3A}$ and the second-A region $SC_{2A}$, (b-1) one source/drain region of the second transistor for write-in $TR_{2B}$ is constituted of the second-B region $SC_{2B}$, (b-2) the other source/drain region of the second transistor for write-in $TR_{2B}$ is constituted of a surface region, including the second main surface, of the third-B region $SC_{3B}$, (b-3) a channel forming region $CH_{2B}$ of the second transistor for write-in $TR_{2B}$ is constituted of a surface region, including the second main surface, of the first region $SC_1$ which surface region is sandwiched by the surface region, including the second main surface, of the third-B region $SC_{3B}$ and the second-B region $SC_{2B}$, (C-1) gate regions of the first junction-field-effect transistor $TR_{4A}$ are constituted of the fifth-A region $SC_{5A}$ and a portion of third-A region $SC_{3A}$ facing the fifth-A region $SC_{5A}$, (C-2) a channel region $CH_{4A}$ of the first junction-field-effect transistor $TR_{4A}$ is constituted of a portion of the fourth-A region $SC_{4A}$ sandwiched by the fifth-A region $SC_{5A}$ and said portion of the third-A region $SC_{3A}$, (C-3) source/drain regions of the first junction-field-effect transistor $TR_{4A}$ are constituted of portions of the fourth-A region $SC_{4A}$, one of the portions of the fourth-A region $SC_{4A}$ extending from one end of the channel region $CH_{4A}$ of the first junction-field-effect transistor $TR_{4A}$ and the other of the portions of the fourth-A region $SC_{4A}$ extending from the other end of the channel region $CH_{4A}$ of the first junction-field-effect transistor $TR_{4A}$, (c-1) gate regions of the second junction-field-effect transistor $TR_{4B}$ are constituted of the fifth-B region $SC_{5B}$ and a portion of third-B region $SC_{3B}$ facing the fifth-B region $SC_{5B}$, (c-2) a channel region $CH_{4B}$ of the second junction-field-effect transistor $TR_{4B}$ is constituted of a portion of the fourth-B region $SC_{4B}$ sandwiched by the fifth-B region $SC_{5B}$ and said portion of the third-B region $SC_{3B}$, (c-3) source/drain regions of the second junction-field-effect transistor $TR_{4B}$ are constituted of portions of the fourth-B region $SC_{4B}$, one of the portions of the fourth-B region $SC_{4B}$ extending from one end of the channel region $CH_{4B}$ of the second junction-field-effect transistor $TR_{4B}$ and the other of the portions of the fourth-B region $SC_{4B}$ extending from the other end of the channel region $CH_{4B}$ of the second junction-field-effect transistor $TR_{4B}$, (D-1) one source/drain region of the third transistor for write-in $TR_{6A}$ is constituted of the surface region of the third-A region $SC_{3A}$ functioning as the channel forming region $CH_{1A}$ of the first transistor for read-out $TR_{1A}$, (D-2) the other source/drain region of the third transistor for write-in $TR_{1A}$ A is constituted of the fifth-A region $SC_{5A}$, (D-3) a channel forming region $CH_{6A}$ of the third transistor for write-in $TR_{6A}$ is constituted of the surface region of the fourth-A region $SC_{4A}$ functioning as one source/drain region of the first transistor for read-out $TR_{1A}$, (d-1) one source/drain region of the fourth transistor for write-in $TR_{6B}$ is constituted of the surface region of the third-B region $SC_{3B}$ functioning as the channel forming region $CH_{1B}$ of the second transistor for read-out $TR_{1B}$, (d-2) the other source/drain region of the fourth transistor for write-in $TR_{6B}$ is constituted of the fifth-B region $SC_{5B}$, (d-3) a channel forming region $CH_{6B}$ of the fourth transistor for write-in $TR_{6B}$ is constituted of the surface region of the fourth-B region $SC_{4B}$ functioning as one source/drain region of the second transistor for read-out $TR_{1B}$, (E) the gate portion $G_A$ ($G_{1A}$, $G_{2A}$ and $G_{6A}$) of the first semiconductor memory device is connected to a first-A memory-cell-selecting line, (e) the gate portion $G_B$ ($G_{1B}$, $G_{2B}$ and $G_{6B}$) of the second semiconductor memory device is connected to a first-B memory-cell-selecting line, (F) the second-A region $SC_{2A}$ is connected to a write-in information setting line-A, (f) the second-B region $SC_{2B}$ is connected to a write-in information setting line-B, (G) the fourth-A region $SC_{4A}$ is connected to a second-A memory-cell-selecting line, (g) the fourth-B region $SC_{4B}$ is connected to a second-B memory-cell-selecting line, and (H) the first region $SC_1$ is connected to a predetermined potential line.

As shown in a principle drawing of FIG. 186, the semiconductor memory cell according to the twenty-fifth aspect of the present invention preferably has a configuration in which the first semiconductor memory device further has a third junction-field-effect transistor of the first conductivity type for current control $TR_{5A}$, and the second semiconductor memory device further has a fourth junction-field-effect transistor of the first conductivity type for current control $TR_{5B}$, wherein;

(I-1) gate regions of the third junction-field-effect transistor $TR_{5A}$ are constituted of the second-A region $SC_{2A}$ and the third-A region $SC_{3A}$, (I-2) a channel region $CH_{5A}$ of the third junction-field-effect transistor $TR_{5A}$ is constituted of a portion of the first region $SC_1$ sandwiched by the second-A region $SC_{2A}$ and the third-A region $SC_{3A}$, (i-1) gate regions of the fourth junction-field-effect transistor $TR_{4B}$ are constituted of the second-B region $SC_{2B}$ and the third-B region $SC_{3B}$, and (i-2) a channel region $CH_{5B}$ of the fourth junction-field-effect transistor $TR_{5B}$ is constituted of a portion of the first region $SC_1$ sandwiched by the second-B region $SC_{2B}$ and the third-B region $SC_{3B}$.

The semiconductor memory cell according to the twenty-second to twenty-fifth aspects of the present invention including modifications preferably has a configuration in which the fourth-A region $SC_{4A}$ is connected to a predetermined potential line-A in place of being connected to the second-A memory-cell-selecting line, the fourth-B region $SC_{4B}$ is connected to a predetermined potential line-B in place of being connected to the second-B memory-cell-selecting line, and the first region $SC_1$ is connected to a second memory-cell-selecting line in place of being connected to the predetermined potential line.

As shown in a principle drawing of FIG. 190, for achieving the above object, according to a twenty-sixth aspect of the present invention, there is provided a semiconductor memory cell comprising two semiconductor memory devices opposite to each other, each semiconductor memory device comprising three transistors, a transistor for read-out, a transistor for write-in, a junction-field-effect transistor for current control, and a diode. The configuration of each semiconductor memory device is similar to that of the semiconductor memory device in the semiconductor memory cell according to the twenty-third aspect of the present invention.

That is, according to the twenty-sixth aspect of the present invention, there is provided a semiconductor memory cell provided with a semi-conductive layer having a first main surface and a second main surface opposed to the first main surface, said semiconductor memory cell comprising a first semiconductor memory device and a second semiconductor memory device, said first semiconductor memory device comprising a first transistor of a first conductivity type for read-out $TR_{1A}$, a first transistor of a second conductivity type for write-in $TR_{2A}$, a first junction-field-effect transistor of the first conductivity type for current control $TR_{4A}$ and a first diode $D_A$, and said second semiconductor memory device comprising a second transistor of the first conductivity type for read-out $TR_{1B}$, a second transistor of the second conductivity type for write-in $TR_{2B}$ a second junction-field-effect transistor of the first conductivity type for current control $TR_{4B}$ and a second diode $D_B$, said semiconductor memory cell having;

(1) a first semi-conductive region $SC_1$ of the first conductivity type, formed through the semi-conductive layer from the first main surface to the second main surface, (2-1) a second-A semi-conductive or conductive region $SC_{2A}$ formed in a surface region, including the first main surface, of the first region $SC_1$, said second-A region $SC_{2A}$ forming a rectifier junction together with the first region $SC_1$, (2-2) a second-B semi-conductive or conductive region $SC_{2B}$ formed in a surface region, including the second main surface, of the first region $SC_1$, said second-B region $SC_{2B}$ forming a rectifier junction together with the first region $SC_1$, (3-1) a third-A semi-conductive region $SC_{3A}$ of the second conductivity type opposite to the first conductivity type, formed in a surface region, including the first main surface, of the first region $SC_1$ and spaced from the second-A region $SC_{2A}$, (3-2) a third-B semi-conductive region $SC_{3B}$ of the second conductivity type, formed in a surface region, including the second main surface, of the first region $SC_1$ and spaced from the second-B region $SC_{2B}$, (4-1) a fourth-A semi-conductive region $SC_{4A}$ of the first conductivity type, formed in a surface region, including the first main surface, of the third-A region $SC_{3A}$, (4-2) a fourth-B semi-conductive region $SC_{4B}$ of the first conductivity type, formed in a surface region, including the second main surface, of the third-B region $SC_{3B}$, (5-1) a fifth-A semi-conductive or conductive region $SC_{5A}$ formed in a surface region, including the first main surface, of the fourth-A region $SC_{4A}$, said fifth-A region $SC_{5A}$ forming a rectifier junction together with the fourth-A region $SC_{4A}$, (5-2) a fifth-B semi-conductive or conductive region $SC_{5B}$ formed in a surface region, including the second main surface, of the fourth-B region $SC_{4B}$, said fifth-B region $SC_{5B}$ forming a rectifier junction together with the fourth-B region $SC_{4B}$, (6-1) a gate portion $G_A$ ($G_{1A}$ and $G_{2A}$) of the first semiconductor memory device formed on a first barrier layer formed on the first main surface so as to bridge the first region $SC_1$ and the fourth-A region $SC_{4A}$ and so as to bridge the second-A region $SC_{2A}$ and the third-A region $SC_{3A}$, and (6-2) a gate portion $G_B$ ($G_{1B}$ and $G_{2B}$) of the second semiconductor memory device formed on a second barrier layer formed on the second main surface so as to bridge the first region $SC_1$ and the fourth-B region $SC_{4B}$ and so as to bridge the second-B region $SC_{2B}$ and the third-B region $SC_{3B}$, wherein;

(A-1) one source/drain region of the first transistor for read-out $TR_{1A}$ is constituted of the fourth-A region $SC_{4A}$, (A-2) the other source/drain region of the first transistor for read-out $TR_{1A}$ is constituted of a surface region, including the first main surface, of the first region $SC_1$, (A-3) a channel forming region $CH_{1A}$ of the first transistor for read-out $TR_{1A}$ is constituted of a surface region, including the first main surface, of the third-A region $SC_{3A}$ which surface region is sandwiched by the surface region, including the first main surface, of the first region $SC_1$ and the fourth-A region $SC_{4A}$, (a-1) one source/drain region of the second transistor for read-out $TR_{1B}$ is constituted of the fourth-B region $SC_{4B}$, (a-2) the other source/drain region of the second transistor for read-out $TR_{1B}$ is constituted of a surface region, including the second main surface, of the first region $SC_1$, (a-3) a channel forming region $CH_{1B}$ of the second transistor for read-out $TR_{1B}$ is constituted of a surface region, including the second main surface, of the third-B region $SC_{3B}$ which surface region is sandwiched by the surface region, including the second main surface, of the first region $SC_1$ and the fourth-B region $SC_{4B}$, (B-1) one source/drain region of the first transistor for write-in $TR_{2A}$ is constituted of the second-A region $SC_{2A}$, (B-2) the other source/drain region of the first transistor for write-in $TR_{2A}$ is constituted of a surface region, including the first main surface, of the third-A region $SC_{3A}$, (B-3) a channel forming region $CH_{2A}$ of the first transistor for write-in $TR_{2A}$ is constituted of a surface region, including the first main surface, of the first region $SC_1$ which surface region is sandwiched by the surface region, including the first main surface, of the third-A region $SC_{3A}$ and the second-A region $SC_{2A}$, (b-1) one source/drain region of the second transistor for write-in $TR_{2B}$ is constituted of the second-B region $SC_{2B}$, (b-2) the other source/drain region of the second transistor for write-in $TR_{2B}$ is constituted of a surface region, including the second main surface, of the third-B region $SC_{3B}$, (b-3) a channel forming region $CH_{2B}$ of the second transistor for write-in $TR_{2B}$ is constituted of a surface region, including the second main surface, of the first region $SC_1$ which surface region is sandwiched by the surface region, including the second main surface, of the third-B region $SC_{3B}$ and the second-B region $SC_{2B}$, (C-1) gate regions of the first junction-field-effect transistor $TR_{4A}$ are constituted of the fifth-A region $SC_{5A}$ and a portion of third-A region $SC_{3A}$ facing the fifth-A region $SC_{5A}$, (C-2) a channel region $CH_{4A}$ of the first junction-field-effect transistor $TR_{4A}$ is constituted of a portion of the fourth-A region $SC_{4A}$ sandwiched by the fifth-A region $SC_{5A}$ and said portion of the third-A region $SC_{3A}$, (C-3) source/drain regions of the first junction-field-effect transistor $TR_{4A}$ are constituted of portions of the fourth-A region $SC_{4A}$, one of the portions of the fourth-A region $SC_{4A}$ extending from one end of the channel region $CH_{4A}$ of the first junction-field-effect transistor $TR_{4A}$ and the other of the portions of the fourth-A region $SC_{4A}$ extending from the other end of the channel region $CH_{4A}$ of the first junction-field-effect transistor $TR_{4A}$, (c-1) gate regions of the second junction-field-effect transistor $TR_{4B}$ are constituted of the fifth-B region $SC_{5B}$ and a portion of third-B region $SC_{3B}$ facing the fifth-B region $SC_{5B}$, (c-2) a channel region $CH_{4B}$ of the second junction-field-effect transistor $TR_{3B}$ is constituted of a portion of the fourth-B region $SC_{4B}$ sandwiched by the fifth-B region $SC_{5B}$ and said portion of the third-B region $SC_{3B}$, (c-3) source/drain regions of the second junction-field-effect transistor $TR_{4B}$ are constituted of portions of the fourth-B region $SC_{4B}$, one of the portions of the fourth-B region $SC_{4B}$ extending from one end of the channel region $CH_{4B}$ of the second junction-field-effect transistor $TR_{4B}$ and the other of the portions of the fourth-B region $SC_{4B}$ extending from the other end of the channel region $CH_{4B}$ of the second junction-field-effect transistor $TR_{4B}$, (D) the first diode $D_A$ is constituted of the second-A region $SC_{2A}$ and the first region $SC_1$, (d) the second diode $D_B$ is constituted of the second-B region $SC_{2B}$ and the first region $SC_1$, (E) the gate portion $G_A$ ($G_{1A}$ and $G_{2A}$) of the first semiconductor memory device is connected to a first-A memory-cell-selecting line, (e) the gate portion $G_B$ ($G_{1B}$ and $G_{2B}$) of the second semiconductor memory device is connected to a first-B memory-cell-selecting line, (F) the second-A region $SC_{2A}$ is connected to a write-in information setting line-A, (f) the second-B region $SC_{2B}$ is connected to a write-in information setting line-B, (G) the fourth-A region $SC_{4A}$ is connected to a second-A memory-cell-selecting line, (g) the fourth-B region $SC_{4B}$ is connected to a second-B memory-cell-selecting line, (H) the fifth-A region $SC_{5A}$ is connected to the write-in information setting line-A, and (h) the fifth-B region $SC_{5B}$ is connected to the write-in information setting line-B.

As shown in a principle drawing of FIG. 194, the semiconductor memory cell according to the twenty-sixth aspect of the present invention preferably has a configuration in which the semiconductor memory cell further has a sixth-A conductive region $SC_{6A}$ formed in a surface region, including the first main surface, of the first region $SC_1$ and a sixth-B conductive region $SC_{6B}$ formed in a surface region, including the second main surface, of the first region $SC_1$, the first diode comprises a Schottky diode $D_{SA}$ constituted of the first region $SC_1$ and the sixth-A region $SC_{6A}$ in place of being constituted of the first region $SC_1$ and the second-A region $SC_{2A}$ and the second diode comprises a Schottky diode $D_{SB}$ constituted of the first region $SC_1$ and the sixth-B region $SC_{6B}$ in place of being constituted of the first region $SC_1$ and the second-B region $SC_{2B}$.

As shown in a principle drawing of FIG. 198, the semiconductor memory cell according to the twenty-sixth aspect of the present invention preferably has a configuration in which the write-in information setting line-A is in common with the write-in information setting line-B, the semiconductor memory cell has a sixth conductive region $SC_6$ formed through the semi-conductive layer from the first main surface to the second main surface and being in contact with the first region $SC_1$, the first diode comprises a Schottky diode $D_S$ constituted of the first region $SC_1$ and the sixth region $SC_6$ in place of being constituted of the first region $SC_1$ and the second-A region $SC_{2A}$, and the second diode comprises a Schottky diodes $D_S$ constituted of the first region $SC_1$ and the sixth region $SC_6$ in place of being constituted of the first region $SC_1$ and the second-B region $SC_{2B}$.

Further, as shown in a principle drawing of FIG. 202, the semiconductor memory cell according to the twenty-sixth aspect of the present invention preferably has a configuration in which the fifth-A region $SC_{5A}$ is connected to the third-A region $SC_{3A}$ in place of being connected to the write-in information setting line-A, and the fifth-B region $SC_{5B}$ is connected to the third-B region $SC_{3B}$ in place of being connected to the write-in information setting line-B. The semiconductor memory cell having such a configuration is referred to as a semiconductor memory cell according to the twenty-seventh aspect of the present invention.

As shown in a principle drawing of FIG. 206, the semiconductor memory cell according to the twenty-seventh aspect of the present invention preferably has a configuration in which the semiconductor memory cell further has a sixth-A conductive region $SC_{6A}$ formed in a surface region, including the first main surface, of the first region $SC_1$ and a sixth-B conductive region $SC_{6B}$ formed in a surface region, including the second main surface, of the first region $SC_1$, the first diode comprises a Schottky diode $D_{SA}$ constituted of the first region $SC_1$ and the sixth-A region $SC_{6A}$ in place of being constituted of the first region $SC_1$ and the second-A region $SC_{2A}$, and the second diode comprises a Schottky diode $D_{SB}$ constituted of the first region $SC_1$ and the sixth-B region $SC_{6B}$ in place of being constituted of the first region $SC_1$ and the second-B region $SC_{2B}$.

Alternatively, as shown in a principle drawing of FIG. 210, the semiconductor memory cell according to the twenty-seventh aspect of the present invention preferably has a configuration in which the write-in information setting line-A is in common with the write-in information setting line-B, the semiconductor memory cell has a sixth conductive region $SC_6$ formed through the semi-conductive layer from the first main surface to the second main surface and being in contact with the first region $SC_1$, the first diode comprises a Schottky diode $D_S$ constituted of the first region $SC_1$ and the sixth region $SC_6$ in place of being constituted of the first region $SC_1$ and the second-A region $SC_{2A}$, and the second diode comprises a Schottky diode $D_S$ constituted of the first region $SC_1$ and the sixth region $SC_6$ in place of being constituted of the first region $SC_1$ and the second-B region $SC_{2B}$.

As shown in a principle drawing of FIG. 214, for achieving the above object, according to a twenty-eighth aspect of the present invention, there is provided a semiconductor memory cell comprising two semiconductor memory devices opposite to each other, each semiconductor memory device comprising four transistors, a transistor for read-out, a transistor for write-in, a junction-field-effect transistor for current control and an additional transistor for write-in, and a diode. The configuration of each semiconductor memory device is similar to that of the semiconductor memory device in the semiconductor memory cell according to the twenty-fifth aspect of the present invention.

That is, according to the twenty-eighth aspect of the present invention, there is provided a semiconductor memory cell provided with a semi-conductive layer having a first main surface and a second main surface opposed to the first main surface, said semiconductor memory cell comprising a first semiconductor memory device and a second semiconductor memory device, said first semiconductor memory device comprising a first transistor of a first conductivity type for read-out $TR_{1A}$, a first transistor of a second conductivity type for write-in $TR_{2A}$, a first junction-field-effect transistor of the first conductivity type for current control $TR_{4A}$, a third transistor of the second conductivity type for write-in $TR_{6A}$ and a first diode $D_A$, and said second semiconductor memory device comprising a second transistor of the first conductivity type for read-out $TR_{1B}$, a second transistor of the second conductivity type for write-in $TR_{2B}$, a second junction-field-effect transistor of the first conductivity type for current control $TR_{4B}$, a fourth transistor of the second conductivity type for write-in $TR_{6B}$ and a second diode $D_B$, said semiconductor memory cell having;

(1) a first semi-conductive region $SC_1$ of the first conductivity type, formed through the semi-conductive layer from the first main surface to the second main surface, (2-1) a second-A semi-conductive or conductive region $SC_{2A}$ formed in a surface region, including the first main surface, of the first region $SC_1$, said second-A region $SC_{2A}$ forming a rectifier junction together with the first region $SC_1$, (2-2) a second-B semi-conductive or conductive region $SC_{2B}$ formed in a surface region, including the second main surface, of the first region $SC_1$, said second-B region $SC_{2B}$ forming a rectifier junction together with the first region $SC_1$, (3-1) a third-A semi-conductive region $SC_{3A}$ of the second conductivity type opposite to the first conductivity type, formed in a surface region, including the first main surface, of the first region $SC_1$ and spaced from the second-A region $SC_{2A}$, (3-2) a third-B semi-conductive region $SC_{3B}$ of the second conductivity type, formed in a surface region, including the second main surface, of the first region $SC_1$ and spaced from the second-B region $SC_{2B}$, (4-1) a fourth-A semi-conductive region $SC_{4A}$ of the first conductivity type, formed in a surface region, including the first main surface, of the third-A region $SC_{3A}$, (4-2) a fourth-B semi-conductive region $SC_{4B}$ of the first conductivity type, formed in a surface region, including the second main surface, of the third-B region $SC_{3B}$, (5-1) a fifth-A semi-conductive or conductive region $SC_{5A}$ formed in a surface region, including the first main surface, of the fourth-A region $SC_{4A}$, said fifth-A region $SC_{5A}$ forming a rectifier junction together with the fourth-A region $SC_{4A}$, (5-2) a fifth-B semi-conductive or conductive region $SC_{5B}$ formed in a surface region, including the second main surface, of the fourth-B region $SC_{4B}$, said fifth-B region $SC_{5B}$ forming a rectifier junction together with the fourth-B region $SC_{4B}$, (6-1) a gate portion $G_A$ ($G_{1A}$, $G_{2A}$ and $G_{6A}$) of the first semiconductor memory device formed on a first barrier layer formed on the first main surface so as to bridge the first region $SC_1$ and the fourth-A region $SC_{4A}$, so as to bridge the second-A region $SC_{2A}$ and the third-A region $SC_{3A}$ and so as to bridge the third-A region $SC_{3A}$ and the fifth-A region $SC_{5A}$, and (6-2) a gate portion $G_B$ ($G_{1B}$, $G_{2B}$ and $G_{6B}$) of the second semiconductor memory device formed on a second barrier layer formed on the second main surface so as to bridge the first region $SC_1$ and the fourth-B region $SC_{4B}$, so as to bridge the second-B region $SC_{2B}$ and the third-B region $SC_{3B}$ and so as to bridge the third-B region $SC_{3B}$ and the fifth-B region $SC_{5B}$, wherein;

(A-1) one source/drain region of the first transistor for read-out $TR_{1A}$ is constituted of the fourth-A region $SC_{4A}$, (A-2) the other source/drain region of the first transistor for read-out $TR_{1A}$ is constituted of a surface region, including the first main surface, of the first region $SC_1$, (A-3) a channel forming region $CH_{1A}$ of the first transistor for read-out $TR_{1A}$ is constituted of a surface region, including the first main surface, of the third-A region $SC_{3A}$ which surface region is sandwiched by the surface region, including the first main surface, of the first region $SC_1$ and the fourth-A region $SC_{4A}$, (a-1) one source/drain region of the second transistor for read-out $TR_{1B}$ is constituted of the fourth-B region $SC_{4B}$, (a-2) the other source/drain region of the second transistor for read-out $TR_{1B}$ is constituted of a surface region, including the second main surface, of the first region $SC_1$, (a-3) a channel forming region $CH_{1B}$ of the second transistor for read-out $TR_{1B}$ is constituted of a surface region, including the second main surface, of the third-B region $SC_{3B}$ which surface region is sandwiched by the surface region, including the second main surface, of the first region $SC_1$ and the fourth-B region $SC_{4B}$, (B-1) one source/drain region of the first transistor for write-in $TR_{2A}$ is constituted of the second-A region $SC_{2A}$, (B-2) the other source/drain region of the first transistor for write-in $TR_{2A}$ is constituted of a surface region, including the first main surface, of the third-A region $SC_{3A}$, (B-3) a channel forming region $CH_{2A}$ of the first transistor for write-in $TR_{2A}$ is constituted of a surface region, including the first main surface, of the first region $SC_1$ which surface region is sandwiched by the surface region, including the first main surface, of the third-A region $SC_{3A}$ and the second-A region $SC_{2A}$, (b-1) one source/drain region of the second transistor for write-in $TR_{2B}$ is constituted of the second-B region $SC_{2B}$, (b-2) the other source/drain region of the second transistor for write-in $TR_{2B}$ is constituted of a surface region, including the second main surface, of the third-B region $SC_{3B}$, (b-3) a channel forming region $CH_{2B}$ of the second transistor for write-in $TR_{2B}$ is constituted of a surface region, including the second main surface, of the first region $SC_1$ which surface region is sandwiched by the surface region, including the second main surface, of the third-B region $SC_{3B}$ and the second-B region $SC_{2B}$, (C-1) gate regions of the first junction-field-effect transistor $TR_{4A}$ are constituted of the fifth-A region $SC_{5A}$ and a portion of third-A region $SC_{3A}$ facing the fifth-A region $SC_{5A}$, (C-2) a channel region $CH_{4A}$ of the first junction-field-effect transistor $TR_{4A}$ is constituted of a portion of the fourth-A region $SC_{4A}$ sandwiched by the fifth-A region $SC_{5A}$ and said portion of the third-A region $SC_{3A}$, (C-3) source/drain regions of the first junction-field-effect transistor $TR_{4A}$ are constituted of portions of the fourth-A region $SC_{4A}$, one of the portions of the fourth-A region $SC_{4A}$ extending from one end of the channel region $CH_{4A}$ of the first junction-field-effect transistor $TR_{4A}$ and the other of the portions of the fourth-A region $SC_{4A}$ extending from the other end of the channel region $CH_{4A}$ of the first junction-field-effect transistor $TR_{4A}$, (c-1) gate regions of the second junction-field-effect transistor $TR_{4B}$ are constituted of the fifth-B region $SC_{5B}$ and a portion of third-B region $SC_{3B}$ facing the fifth-B region $SC_{5B}$, (c-2) a channel region $CH_{4B}$ of the second junction-field-effect transistor $TR_{4B}$ is constituted of a portion of the fourth-B region $SC_{4B}$ sandwiched by the fifth-B region $SC_{5B}$ and said portion of the third-B region $SC_{3B}$, (c-3) source/drain regions of the second junction-field-effect transistor $TR_{4B}$ are constituted of portions of the fourth-B region $SC_{4B}$, one of the portions of the fourth-B region $SC_{4B}$ extending from one end of the channel region $CH_{4B}$ of the second junction-field-effect transistor $TR_{4B}$ and the other of the portions of the fourth-B region $SC_{4B}$ extending from the other end of the channel region $CH_{4B}$ of the second junction-field-effect transistor $TR_{4B}$, (D-1) one source/drain region of the third transistor for write-in $TR_{6A}$ is constituted of the surface region of the third-A region $SC_{3A}$ functioning as the channel forming region $CH_{1A}$ of the first transistor for read-out $TR_{1A}$, (D-2) the other source/drain region of the third transistor for write-in $TR_{6A}$ is constituted of the fifth-A region $SC_{5A}$, (D-3) a channel forming region $CH_{6A}$ of the third transistor for write-in $TR_{6A}$ is constituted of the surface region of the fourth-A region $SC_{4A}$ functioning as one source/drain region of the first transistor for read-out $TR_{1A}$, (d-1) one source/drain region of the fourth transistor for write-in $TR_{6B}$ is constituted of the surface region of the third-B region $SC_{3B}$ functioning as the channel forming region $CH_{1B}$ of the second transistor for read-out $TR_{1B}$, (d-2) the other source,drain region of the fourth transistor for write-in $TR_{6B}$ is constituted of the fifth-B region $SC_{5B}$, (d-3) a channel forming region $CH_{6B}$ of the fourth transistor for write-in $TR_{6B}$ is constituted of the surface region of the fourth-B region $SC_{4B}$ functioning as one source/drain region of the second transistor for read-out $TR_{1B}$, (E) the first diode $D_A$ is constituted of the second-A region $SC_{2A}$ and the first region $SC_1$, (e) the second diode $D_B$ is constituted of the second-B region $SC_{2B}$ and the first region $SC_1$, (F) the gate portion $G_A$ ($G_{1A}$, $G_{2A}$ and $G_{6A}$) of the first semiconductor memory device is connected to a first-A memory-cell-selecting line, (f) the gate portion $G_B$ ($G_{1B}$, $G_{2B}$ and $G_{6B}$) of the second semiconductor memory device is connected to a first-B memory-cell-selecting line, (G) the second-A region $SC_{2A}$ is connected to a write-in information setting line-A, (g) the second-B region $SC_{2B}$ is connected to a write-in information setting line-B, (H) the fourth-A region $SC_{4A}$ is connected to a second-A memory-cell-selecting line, and (h) the fourth-B region $SC_{4B}$ is connected to a second-B memory-cell-selecting line.

As shown in a principle drawing of FIG. 218, the semiconductor memory cell according to the twenty-eighth aspect of the present invention preferably has a configuration in which the semiconductor memory cell further has a sixth-A conductive region $SC_{6A}$ formed in a surface region, including the first main surface, of the first region $SC_1$ and a sixth-B conductive region $SC_{6B}$ formed in a surface region, including the second main surface, of the first region $SC_1$, the first diode comprises a Schottky diode $D_{SA}$ constituted of the first region $SC_1$ and the sixth-A region $SC_{6A}$ in place of being constituted of the first region $SC_1$ and the second-A region $SC_{2A}$, and the second diode comprises a Schottky diode $D_{SB}$ constituted of the first region $SC_1$ and the sixth-B region $SC_{6B}$ in place of being constituted of the first region $SC_1$ and the second-B region $SC_{2B}$.

As shown in a principle drawing of FIG. 222, the semiconductor memory cell according to the twenty-eighth aspect of the present invention preferably has a configuration in which the write-in information setting line-A is in common with the write-in information setting line-B, the semiconductor memory cell has a sixth conductive region $SC_6$ formed through the semi-conductive layer from the first main surface to the second main surface and being in contact with the first region $SC_1$, the first diode comprises a Schottky diode $D_S$ constituted of the first region $SC_1$ and the sixth region $SC_6$ in place of being constituted of the first region $SC_1$ and the second-A region $SC_{2A}$, and the second diodes comprises a Schottky diode $D_S$ constituted of the first region $SC_1$ and the sixth region $SC_6$ in place of being constituted of the first region $SC_1$ and the second-B region $SC_{2B}$.

The semiconductor memory cell according to the twenty-sixth or twenty-eighth aspect of the present invention including modifications preferably has a configuration in which the write-in information setting line-A is in common with the write-in information setting line-B.

Alternatively, the semiconductor memory cell according to the twenty-sixth or twenty-eighth aspect of the present invention including modifications preferably has a configuration in which the fourth-A region $SC_{4A}$ is connected to a predetermined potential line-A in place of being connected to the second-A memory-cell-selecting line, the fourth-B region $SC_{4B}$ is connected to a predetermined potential line-B in place of being connected to the second-B memory-cell-selecting line, the second-A region $SC_{2A}$ is connected to the second-A memory-cell-selecting line in place of being connected to the write-in information setting line-A, and the second-B region $SC_{2B}$ is connected to the second-B memory-cell-selecting line in place of being connected to the write-in information setting line-B. When the semiconductor memory cell has such a configuration, the semiconductor memory cell preferably has a configuration in which the second-A memory-cell-selecting line is in common with the second-B memory-cell-selecting line. Alternatively, when the semiconductor memory cell has such a configuration, the semiconductor memory cell preferably has a configuration in which the fourth-A region $SC_{4A}$ is connected to a predetermined potential line-A in place of being connected to the second-A memory-cell-selecting line, the fourth-B region $SC_{4B}$ is connected to a predetermined potential line-B in place of being connected to the second-B memory-cell-selecting line, and the second-A and second-B regions $SC_{2A}$ and $SC_{2B}$ are connected to a second memory-cell-selecting line in place of being connected to the write-in information setting line-A and the write-in information setting line-B.

As shown in a principle drawing of FIG. 226, for achieving the above object, according to a twenty-ninth aspect of the present invention, there is provided a semiconductor memory cell comprising two semiconductor memory devices opposite to each other, each semiconductor memory device comprising three transistors, a transistor for read-out, a transistor for write-in and a junction-field-effect transistor for current control, and a diode. The configuration of each semiconductor memory device is similar to that of the semiconductor memory device in the semiconductor memory cell according to the twenty-sixth aspect of the present invention, except the structure of the second region.

That is, according to a twenty-ninth aspect of the present invention, there is provided a semiconductor memory cell provided with a semi-conductive layer having a first main surface and a second main surface opposed to the first main surface, said semiconductor memory cell comprising a first semiconductor memory device and a second semiconductor memory device, said first semiconductor memory device comprising a first transistor of a first conductivity type for read-out $TR_{1A}$, a first transistor of a second conductivity type for write-in $TR_{2A}$, a first junction-field-effect transistor of the first conductivity type for current control $TR_{4A}$ and a first diode D, and said second semiconductor memory device comprising a second transistor of the first conductivity type for read-out $TR_{1B}$, a second transistor of the second conductivity type for write-in $TR_{2B}$, a second junction-field-effect transistor of the first conductivity type for current control $TR_{4B}$ and a second diode D, said semiconductor memory cell having;

(1) a first semi-conductive region $SC_1$ of the first conductivity type, formed through the semi-conductive layer from the first main surface to the second main surface, (2) a second semi-conductive region $SC_2$ of the second conductivity type opposite to the first conductivity type, formed through the semi-conductive layer from the first main surface to the second main surface and being in contact with the first region $SC_1$, (3-1) a third-A semi-conductive region $SC_{3A}$ of the second conductivity type, formed in a surface region, including the first main surface, of the first region $SC_1$ and spaced from the second region $SC_2$, (3-2) a third-B semi-conductive region $SC_{3B}$ of the second conductivity type, formed in a surface region, including the second main surface, of the first region $SC_1$ and spaced from the second region $SC_2$, (4-1) a fourth-A semi-conductive region $SC_{4A}$ of the first conductivity type, formed in a surface region, including the first main surface, of the third-A region $SC_{3A}$, (4-2) a fourth-B semi-conductive region $SC_{4B}$ of the first conductivity type, formed in a surface region, including the second main surface, of the third-B region $SC_{3B}$, (5-1) a fifth-A semi-conductive or conductive region $SC_{5A}$ formed in a surface region, including the first main surface, of the fourth-A region $SC_{4A}$, said fifth-A region $SC_{5A}$ forming a rectifier junction together with the fourth-A region $SC_{4A}$, (5-2) a fifth-B semi-conductive or conductive region $SC_{5B}$ formed in a surface region, including the second main surface, of the fourth-B region $SC_{4B}$, said fifth-B region $SC_{5B}$ forming a rectifier junction together with the fourth-B region $SC_{4B}$, (6-1) a gate portion $G_A$ ($G_{1A}$ and $G_{2A}$) of the first semiconductor memory device formed on a first barrier layer formed on the first main surface so as to bridge the first region $SC_1$ and the fourth-A region $SC_{4A}$ and so as to bridge the second region $SC_2$ and the third-A region $SC_{3A}$, and (6-2) a gate portion $G_B$ ($G_{1B}$ and $G_{2B}$) of the second semiconductor memory device formed on a second barrier layer formed on the second main surface so as to bridge the first region $SC_1$ and the fourth-B region $SC_{4B}$ and so as to bridge the second region $SC_2$ and the third-B region $SC_{3B}$, wherein;

(A-1) one source/drain region of the first transistor for read-out $TR_{1A}$ is constituted of the fourth-A region $SC_{4A}$, (A-2) the other source/drain region of the first transistor for read-out $TR_{1A}$ is constituted of a surface region, including the first main surface, of the first region $SC_1$, (A-3) a channel forming region $CH_{1A}$ of the first transistor for read-out $TR_{1A}$ is constituted of a surface region, including the first main surface, of the third-A region $SC_{3A}$ which surface region is sandwiched by the surface region, including the first main surface, of the first region $SC_1$ and the fourth-A region $SC_{4A}$, (a-1) one source/drain region of the second transistor for read-out $TR_{1B}$ is constituted of the fourth-B region $SC_{4B}$, (a-2) the other source/drain region of the second transistor for read-out $TR_{1B}$ is constituted of a surface region, including the second main surface, of the first region $SC_1$, (a-3) a channel forming region $CH_{1B}$ of the second transistor for read-out $TR_{1B}$ is constituted of a surface region, including the second main surface, of the third-B region $SC_{3B}$ which surface region is sandwiched by the surface region, including the second main surface, of the first region $SC_1$ and the fourth-B region $SC_{4B}$, (B-1) one source/drain region of the first transistor for write-in $TR_{2A}$ is constituted of a surface region, including the first main surface, of the second region $SC_2$, (B-2) the other source/drain region of the first transistor for write-in $TR_{2A}$ is constituted of a surface region, including the first main surface, of the third-A region $SC_{3A}$, (B-3) a channel forming region $CH_{2A}$ of the first transistor for write-in $TR_{2A}$ is constituted of a surface region, including the first main surface, of the first region $SC_1$ which surface region is sandwiched by the surface region, including the first main surface, of the third-A region $SC_{3A}$ and the surface region, including the first main surface, of the second region $SC_2$, (b-1) one source/drain region of the second transistor for write-in $TR_{2B}$ is constituted of a surface region, including the second main surface, of the second region $SC_2$, (b-2) the other source/drain region of the second transistor for write-in $TR_{2B}$ is constituted of a surface region, including the second main surface, of the third-B region $SC_{3B}$, (b-3) a channel forming region $CH_{2B}$ of the second transistor for write-in $TR_{2B}$ is constituted of a surface region, including the second main surface, of the first region $SC_1$ which surface region is sandwiched by the surface region, including the second main surface, of the third-B region $SC_{3B}$ and the surface region, including the second main surface, of the second region $SC_2$, (C-1) gate regions of the first junction-field-effect transistor $TR_{4A}$ are constituted of the fifth-A region $SC_{5A}$ and a portion of third-A region $SC_{3A}$ facing the fifth-A region $SC_{5A}$, (C-2) a channel region $CH_{4A}$ of the first junction-field-effect transistor $TR_{4A}$ is constituted of a portion of the fourth-A region $SC_{4A}$ sandwiched by the fifth-A region $SC_{5A}$ and said portion of the third-A region $SC_{3A}$, (C-3) source/drain regions of the first junction-field-effect transistor $TR_{1B}$ are constituted of portions of the fourth-A region $SC_{4A}$, one of the portions of the fourth-A region $SC_{4A}$ extending from one end of the channel region $CH_{4A}$ of the first junction-field-effect transistor $TR_{4A}$ and the other of the portions of the fourth-A region $SC_{4A}$ extending from the other end of the channel region $CH_{4A}$ of the first junction-field-effect transistor $TR_{4A}$, (c-1) gate regions of the second junction-field-effect transistor $TR_{4B}$ are constituted of the fifth-B region $SC_{5B}$ and a portion of third-B region $SC_{3B}$ facing the fifth-B region $SC_{4B}$, (c-2) a channel region $CH_{4B}$ of the second junction-field-effect transistor $TR_{4B}$ is constituted of a portion of the fourth-B region $SC_{4B}$ sandwiched by the fifth-B region $SC_{5B}$ and said portion of the third-B region $SC_{3B}$, (c-3) source/drain regions of the second junction-field-effect transistor $TR_{4B}$ are constituted of portions of the fourth-B region $SC_{4B}$, one of the portions of the fourth-B region $SC_{4B}$ extending from one end of the channel region $CH_{4B}$ of the second junction-field-effect transistor $TR_{4B}$ and the other of the portions of the fourth-B region $SC_{4B}$ extending from the other end of the channel region $CH_{4B}$ of the second junction-field-effect transistor $TR_{4B}$, (D) each of the first diode D and the second diode D is constituted of the second region $SC_2$ and the first region $SC_1$, (E) the gate portion $G_A$ ($G_{1A}$ and $G_{2A}$) of the first semiconductor memory device is connected to a first-A memory-cell-selecting line, (e) the gate portion $G_B$ ($G_{1B}$ and $G_{2B}$) of the second semiconductor memory device is connected to a first-B memory-cell-selecting line, (F) the second region $SC_2$ is connected to a write-in information setting line, (G) the fourth-A region $SC_{4A}$ is connected to a second-A memory-cell-selecting line, (g) the fourth-B region $SC_{4B}$ is connected to a second-B memory-cell-selecting line, and (H) the fifth-A region $SC_{5A}$ and the fifth-B region $SC_{5B}$ are connected to the write-in information setting line.

As shown in a principle drawing of FIG. 230, the semiconductor memory cell according to the twenty-ninth aspect of the present invention preferably has a configuration in which the fifth-A region $SC_{5A}$ is connected to the third-A region $SC_{3A}$ in place of being connected to the write-in information setting line, and the fifth-B region $SC_{5B}$ is connected to the third-B region $SC_{3B}$ in place of being connected to the write-in information setting line.

The semiconductor memory cell according to the twenty-ninth aspect of the present invention preferably has a configuration in which the fourth-A region $SC_{4A}$ is connected to a predetermined potential line-A in place of being connected to the second-A memory-cell-selecting line, the fourth-B region $SC_{4B}$ is connected to a predetermined potential line-B in place of being connected to the second-B memory-cell-selecting line, and the second region is connected to a second memory-cell-selecting line in place of being connected to the write-in information setting line.

As shown in a principle drawing of FIG. 234, for achieving the above object, according to a thirtieth aspect of the present invention, there is provided a semiconductor memory cell comprising two semiconductor memory devices opposite to each other, each semiconductor memory device comprising four transistors, a transistor for read-out, a transistor for write-in, a junction-field-effect transistor for current control and an additional transistor for write-in, and a diode. The configuration of each semiconductor memory device is similar to that of the semiconductor memory device in the semiconductor memory cell according to the twenty-eighth aspect of the present invention, except the structure of the second region.

That is, according to the thirtieth aspect of the present invention, there is provided a semiconductor memory cell provided with a semi-conductive layer having a first main surface and a second main surface opposed to the first main surface, said semiconductor memory cell comprising a first semiconductor memory device and a second semiconductor memory device, said first semiconductor memory device comprising a first transistor of a first conductivity type for read-out $TR_{1A}$, a first transistor of a second conductivity type for write-in $TR_{2A}$, a first junction-field-effect transistor of the first conductivity type for current control $TR_{4A}$, a third transistor of the second conductivity type for write-in $TR_{6A}$ and a first diode D, and said second semiconductor memory device comprising a second transistor of the first conductivity type for read-out $TR_{1B}$, a second transistor of the second conductivity type for write-in $TR_{2B}$, a second junction-field-effect transistor of the first conductivity type for current control $TR_{4B}$, a fourth transistor of the second conductivity type for write-in $TR_{6B}$ and a second diode D, said semiconductor memory cell having;

(1) a first semi-conductive region $SC_1$ of the first conductivity type, formed through the semi-conductive layer from the first main surface to the second main surface, (2) a second semi-conductive region $SC_2$ of the second conductivity type opposite to the first conductivity type, formed through the semi-conductive layer from the first main surface to the second main surface and being in contact with the first region $SC_1$, (3-1) a third-A semi-conductive region $SC_{3A}$ of the second conductivity type, formed in a surface region, including the first main surface, of the first region $SC_1$ and spaced from the second region $SC_2$, (3-2) a third-B semi-conductive region $SC_{3B}$ of the second conductivity type, formed in a surface region, including the second main surface, of the first region $SC_1$ and spaced from the second region $SC_2$, (4-1) a fourth-A semi-conductive region $SC_{4A}$ of the first conductivity type, formed in a surface region, including the first main surface, of the third-A region $SC_{3A}$, (4-2) a fourth-B semi-conductive region $SC_{4B}$ of the first conductivity type, formed in a surface region, including the second main surface, of the third-B region $SC_{3B}$, (5-1) a fifth-A semi-conductive or conductive region $SC_{5A}$ formed in a surface region, including the first main surface, of the fourth-A region $SC_{4A}$, said fifth-A region $SC_{5A}$ forming a rectifier junction together with the fourth-A region $SC_{4A}$, (5-2) a fifth-B semi-conductive or conductive region $SC_{5B}$ formed in a surface region, including the second main surface, of the fourth-B region $SC_{4B}$, said fifth-B region $SC_{5B}$ forming a rectifier junction together with the fourth-B region $SC_{4B}$, (6-1) a gate portion $G_A$ ($G_{1A}$, $G_{2A}$ and $G_{6A}$) of the first semiconductor memory device formed on a first barrier layer formed on the first main surface so as to bridge the first region $SC_1$ and the fourth-A region $SC_{4A}$, so as to bridge the second region $SC_2$ and the third-A region $SC_{3A}$ and so as to bridge the third-A region $SC_{3A}$ and the fifth-A region $SC_{5A}$, and (6-2) a gate portion $G_B$ ($G_{1B}$, $G_{2B}$ and $G_{6B}$) of the second semiconductor memory device formed on a second barrier layer formed on the second main surface so as to bridge the first region $SC_1$ and the fourth-B region $SC_{4B}$, so as to bridge the second region $SC_2$ and the third-B region $SC_{3B}$ and so as to bridge the third-B region $SC_{3B}$ and the fifth-B region $SC_{5B}$, wherein;

(A-1) one source/drain region of the first transistor for read-out $TR_{1A}$ is constituted of the fourth-A region $SC_{4A}$, (A-2) the other source/drain region of the first transistor for read-out $TR_{1A}$ is constituted of a surface region, including the first main surface, of the first region $SC_1$, (A-3) a channel forming region $CH_{1A}$ of the first transistor for read-out $TR_{1A}$ is constituted of a surface region, including the first main surface, of the third-A region $SC_{3A}$ which surface region is sandwiched by the surface region, including the first main surface, of the first region $SC_1$ and the fourth-A region $SC_{4A}$, (a-1) one source/drain region of the second transistor for read-out $TR_{1B}$ is constituted of the fourth-B region $SC_{4B}$, (a-2) the other source/drain region of the second transistor for read-out $TR_{1B}$ is constituted of a surface region, including the second main surface, of the first region $SC_1$, (a-3) a channel forming region $CH_{1B}$ of the second transistor for read-out $TR_{1B}$ is constituted of a surface region, including the second main surface, of the third-B region $SC_{3B}$ which surface region is sandwiched by the surface region, including the second main surface, of the first region $SC_1$ and the fourth-B region $SC_{4B}$, (B-1) one source/drain region of the first transistor for write-in $TR_{2A}$ is constituted of a surface region, including the first main surface, of the second region $SC_2$, (B-2) the other source/drain region of the first transistor for write-in $TR_{2A}$ is constituted of a surface region, including the first main surface, of the third-A region $SC_{3A}$, (B-3) a channel forming region $CH_{2A}$ of the first transistor for write-in $TR_{2A}$ is constituted of a surface region, including the first main surface, of the first region $SC_1$ which surface region is sandwiched by the surface region, including the first main surface, of the third-A region $SC_{3A}$ and the surface region, including the first main surface, of the second region $SC_2$, (b-1) one source/drain region of the second transistor for write-in $TR_{2B}$ is constituted of a surface region, including the second main surface, of the second region $SC_2$, (b-2) the other source/drain region of the second transistor for write-in $TR_{2B}$ is constituted of a surface region, including the second main surface, of the third-B region $SC_{3B}$, (b-3) a channel forming region $CH_{2B}$ of the second transistor for write-in $TR_{2B}$ is constituted of a surface region, including the second main surface, of the first region $SC_1$ which surface region is sandwiched by the surface region, including the second main surface, of the third-B region $SC_{3B}$ and the surface region, including the second main surface, of the second region $SC_2$, (C-1) gate regions of the first junction-field-effect transistor $TR_{4A}$ are constituted of the fifth-A region $SC_{5A}$ and a portion of third-A region $SC_{3A}$ facing the fifth-A region $SC_{5A}$, (C-2) a channel region $CH_{4A}$ of the first junction-field-effect transistor $TR_{4A}$ is constituted of a portion of the fourth-A region $SC_{4A}$ sandwiched by the fifth-A region $SC_{5A}$ and said portion of the third-A region $SC_{3A}$, (C-3) source/drain regions of the first junction-field-effect transistor $TR_{4A}$ are constituted of portions of the fourth-A region $SC_{4A}$, one of the portions of the fourth-A region $SC_{4A}$ extending from one end of the channel region $CH_{4A}$ of the first junction-field-effect transistor $TR_{4A}$ and the other of the portions of the fourth-A region $SC_{4A}$ extending from the other end of the channel region $CH_{4A}$ of the first junction-field-effect transistor $TR_{4A}$, (c-1) gate regions of the second junction-field-effect transistor $TR_{4B}$ are constituted of the fifth-B region $SC_{5B}$ and a portion of third-B region $SC_{3B}$ facing the fifth-B region $SC_{5B}$, (c-2) a channel region $CH_{4B}$ of the second junction-field-effect transistor $TR_{4B}$ is constituted of a portion of the fourth-B region $SC_{4B}$ sandwiched by the fifth-B region $SC_{5B}$ and said portion of the third-B region $SC_{3B}$, (c-3) source/drain regions of the second junction-field-effect transistor $TR_{4B}$ are constituted of portions of the fourth-B region $SC_{4B}$, one of the portions of the fourth-B region $SC_{4B}$ extending from one end of the channel region $CH_{4B}$ of the second junction-field-effect transistor $TR_{4B}$ and the other of the portions of the fourth-B region $SC_{4B}$ extending from the other end of the channel region $CH_{4B}$ of the second junction-field-effect transistor $TR_{4B}$, (D-1) one source/drain region of the third transistor for write-in $TR_{6A}$ is constituted of the surface region of the third-A region $SC_{3A}$ functioning as the channel forming region $CH_{1A}$ of the first transistor for read-out $TR_{1A}$, (D-2) the other source/drain region of the third transistor for write-in $TR_{6A}$ is constituted of the fifth-A region $SC_{5A}$, (D-3) a channel forming region $CH_{6A}$ of the third transistor for write-in $TR_{6A}$ is constituted of the surface region of the fourth-A region $SC_{4A}$ functioning as one source/drain region of the first transistor for read-out $TR_{1A}$, (d-1) one source/drain region of the fourth transistor for write-in $TR_{6B}$ is constituted of the surface region of the third-B region $SC_{3B}$ functioning as the channel forming region $CH_{1B}$ of the second transistor for read-out $TR_{1B}$, (d-2) the other source/drain region of the fourth transistor for write-in $TR_{6B}$ is constituted of the fifth-B region $SC_{5B}$, (d-3) a channel forming region $CH_{6B}$ of the fourth transistor for write-in $TR_{6B}$ is constituted of the surface region of the fourth-B region $SC_{4B}$ functioning as one source/drain region of the second transistor for read-out $TR_{1B}$, (E) each of the first diode D and the second diode D is constituted of the second region $SC_2$ and the first region $SC_1$, (F) the gate portion $G_A$ ($G_{1A}$, $G_{2A}$ and $G_{6A}$) of the first semiconductor memory device is connected to a first-A memory-cell-selecting line, (f) the gate portion $G_B$ ($G_{1B}$, $G_{2B}$ and $G_{6B}$) of the second semiconductor memory device is connected to a first-B memory-cell-selecting line, (G) the second region $SC_2$ is connected to a write-in information setting line, (H) the fourth-A region $SC_{4A}$ is connected to a second-A memory-cell-selecting line, and (h) the fourth-B region $SC_4$, is connected to a second-B memory-cell-selecting line.

As shown in a principle drawing of FIG. 236, the semiconductor memory cell according to the thirtieth aspect of the present invention preferably has a configuration in which the fourth-A region $SC_{4A}$ is connected to a predetermined potential line-A in place of being connected to the second-A memory-cell-selecting line, the fourth-B region $SC_{4B}$ is connected to a predetermined potential line-B in place of being connected to the second-B memory-cell-selecting line, and the second region $SC_2$ is connected to a second memory-cell-selecting line in place of being connected to the write-in information setting line.

The semiconductor memory cell according to any one of the twenty-second to thirtieth aspects of the present invention preferably has a configuration in which regions $SC_{7A}$ and $SC_{7B}$ containing a high concentration of an impurity having the first conductivity type are formed between the third-A region $SC_{3A}$ and the first region $SC_1$ and between the third-B region $SC_{3B}$ and the first region $SC_1$, for increasing a potential or an electric charge stored in the channel forming regions $CH_{1A}$ and $CH_{1B}$ of the first transistor for read-out $TR_{1A}$ and the second transistor for read-out $TR_{1B}$.

When, in the semiconductor memory cell according to any one of the twenty-fifth to twenty-eighth aspects of the present invention, the write-in information setting line-A and the write-in information setting line-B are fabricated in common, or the second-A memory-cell-selecting line and the second-B memory-cell-selecting line are fabricated in common, there is no need to mutually interconnect these write-in information setting line-A and line-B or these second-A and second-B memory-cell-selecting lines. Instead, it is allowable to make mutual connection among the write-in information setting line-A and line-B or among the second-A and second-B memory-cell-selecting lines contained in a predetermined number of, or orderly located, adjacent semiconductor memory cells. It is also allowable to interconnect the first-A and first-B memory-cell-selecting lines for every semiconductor memory cell, or to interconnect the first-A and first-B memory-cell-selecting lines in a predetermined number of, or orderly located, adjacent memory cells.

In the semiconductor memory cell according to the twenty-second to thirtieth aspects of the present invention, when the region is constituted of a conductive region, the region may be constituted of a silicide, a metal such as Mo and Al, or a metal compound. When the sixth region $SC_6$, the sixth-A region $SC_{6A}$ or the sixth-B region $SC_{6B}$ is constituted of a conductive region in the semiconductor memory cell according to the twenty-sixth or twenty-eighth aspect of the present invention, the second-A region $SC_{2A}$ or the second-B region $SC_{2B}$ is preferably constituted of a semiconductive region.

In the semiconductor memory cell according to any one of the twenty-second to thirtieth aspects of the present invention, the first semiconductor memory device and the second semiconductor memory device, opposite to each other, are fabricated on the portions in the semi-conductive layer containing the first main surface and the second main surface, respectively. Thus a region essentially accepting only one semiconductor memory cell can contain two semiconductor memory cells, which contributes to a larger integration density of the semiconductor memory cells.

In the individual memory devices of the semiconductor memory cell according to any one of the twenty-second to thirtieth aspects of the present invention, the individual gate portions of the read-out transistors $TR_{1A}$, $TR_{1B}$ and the write-in transistors $TR_{2A}$, $TR_{2B}$ are connected to the first-A and first-B memory-cell-selecting lines, respectively. Thus only one first-A memory-cell-selecting line and only one first-B memory cell selecting line can suffice, which contributes to a smaller chip area.

In the semiconductor memory cell according to the twenty-second to thirtieth aspects of the present invention, now exemplifying the first semiconductor memory device, the third-A region $SC_{3A}$ functioning as the other source/drain region of the first transistor for write-in $TR_{2A}$ corresponds to the channel forming region $CH_{1A}$ of the first transistor for read-out $TR_{1A}$. When information is written in, the first transistor for write-in $TR_{2A}$ is brought into an on-state, and thus the information is stored or accumulated in the channel forming region $CH_{1A}$ of the first transistor for read-out $TR_{1A}$ as a potential or an electric charge. When the information is read out, the threshold voltage of the first transistor for read-out $TR_{1A}$ seen from the gate region $G_A$ varies depending upon the above potential or electric charge (information) stored or accumulated in the channel forming region $CH_{1A}$. Therefore, when the information is read out, a status of the information accumulation in the first transistor for read-out $TR_{1A}$ can be detected as level (including 0) of the channel current, by applying a properly selected potential to the gate portion $G_A$. That is, the read-out of the information is effected by detecting the operation status of the first transistor for read-out $TR_{1A}$. The same will apply to the second semiconductor memory device.

In more details, in the first semiconductor device of the semiconductor memory cell according to the twenty-second to thirtieth aspects of the present invention, when the potential of the first-A memory-cell-selecting line is set, upon information write-in, at a potential as high enough to bring the first transistor for write-in $TR_{2A}$ into an on-state, an electric charge is charged or accumulated in a capacitor formed between the first region $SC_1$ and the third-A region $SC_{3A}$ in the first transistor for write-in $TR_{2A}$ depending upon the potential of the second-A memory-cell-selecting line. As a result, the information is stored or accumulated in the channel forming region $CH_{1A}$ (the third-A region $SC_{3A}$) of the first transistor for read-out $TR_{1A}$ as a potential difference between the first region $SC_1$ and the third-A region $SC_{3A}$, or as an electric charge. When the information is read out, with the potential of the fourth-A region $SC_{4A}$ set at the read-out potential, the potential or electric charge (information) stored or accumulated in the channel forming region $CH_{1A}$ of the fist transistor for read-out $TR_{1A}$ is converted to a potential difference between the third-A region $SC_{3A}$ (corresponds to the channel forming region $CH_{1A}$) and the first region $SC_1$ (corresponds to the source/drain region), and the threshold voltage of the first transistor for read-out $TR_{1A}$ seen from the gate region $G_{1A}$ varies depending upon such an electric charge (information). Therefore, when the information is read out, applying a properly selected potential to the gate portion $G_A$ allows the on/off operation control of the first transistor for read-out $TR_{1A}$. That is, the information is read out by detecting the operation state of the first transistor for read-out $TR_{1A}$. The same will apply to the second semiconductor memory device.

It is also noted that the semiconductor memory cell according to any one of the twenty-second to thirtieth aspects of the present invention is provided with the junction-field-effect transistor in addition to the transistor for read-out and the transistor for write-in. Since the on/off operation of the junction-field-effect transistor is controlled when the information is read out, a large margin can be assured for the current which flows between the first region $SC_1$ and the fourth-A region $SC_{4A}$, or between the first region $SC_1$ and the fourth-B region $SC_{4B}$. As a result, the number of semiconductor memory cells connectable to the second memory cell-selecting line becomes less liable to be limited, and the information holding time (retention time) of the semiconductor memory cell can be increased.

Since the semiconductor memory cell according to any one of the twenty-fifth to thirtieth aspects of the present invention is provided with the diode, the first region $SC_1$ does not need to be connected to the predetermined potential line as exemplified in the twenty-second aspect of the present invention, which results in a more simple wiring configuration. Meanwhile, when the diode is constituted of a p-n junction in such semiconductor memory cell according to any one of the twenty-fifth to thirtieth aspects of the present invention, latch-up may take place when the information is read out, if the potential setting for individual regions constituting the diode or designing of impurity concentration relationships between these regions is improper. For avoiding the above problem, the voltage which is applied to the write-in information setting line or the second memory-cell-selecting line is required to be a low degree of voltage (0.4 volt or lower) at which no large forward current flows in the junction portion of the second-A or second-B region $SC_{2A}$ or $SC_{2B}$ and the first region $SC_1$, when the information is written in or read out. One possible method for avoiding the latch-up problem is such that the sixth-A and sixth-B regions $SC_{6A}$, $SC_{6B}$ are, or simply the sixth region $SC_6$ is formed in the surface region of the first region $SC_1$; the sixth-A and sixth-B regions $SC_{6A}$, $SC_{6B}$ are, or simply the sixth region $SC_6$ is constituted of a silicide, a metal or a metal compound; and a junction between the first region $SC_1$ and the sixth-A and sixth-B regions $SC_{6A}$, $SC_{6B}$ or between the first region $SC_1$ and the sixth region $SC_6$ is constituted of a Schottky junction or the like in which the majority carrier mainly constitutes a forward current. In other words, the sixth-A and sixth-B regions $SC_{6A}$, $SC_{6B}$ are, or simply the sixth region $SC_6$ is constituted of a silicide layer, a metal layer of Mo or Al, or a metal compound layer, and the diode is of Schottky junction type, whereby the risk of latch-up can be avoided, and the limitation on the voltage applied to the write-in information setting line or the second memory-cell-selecting line is substantially removed.

In the semiconductor memory cell according to any one of the twenty-second to thirtieth aspects of the present invention, connecting the fifth-A region $SC_{5A}$ to third-A region $SC_{3A}$ or connecting the fifth-B region $SC_{5B}$ to third-B region $SC_{3B}$ will simplify the wiring configuration of the semiconductor memory cell. The semiconductor memory cell according to any one of the twenty-second to thirtieth of the present invention is also beneficial in terms of reduction in the cell area and leakage current, since the read-out and write-in transistors are merged into one unit.

The semiconductor memory cell according to any one of the twenty-fifth, twenty-eighth and thirtieth aspects of the present invention is provided with the additional transistor for write-in in addition to the junction-field-effect transistor. Since the on/off operations of the junction-field-effect transistor and the additional transistor for write-in are controlled when the information is read out, a large margin can be assured for the current which flows between the first region $SC_1$ and the fourth-A region $SC_{4A}$, or between the first region $SC_1$ and the fourth-B region $SC_{4B}$. As a result, the number of semiconductor memory cells connectable to the second memory cell-selecting line becomes further less liable to be limited.

The semiconductor memory cell of the present invention can be formed in a surface region of a semiconductor substrate, formed on an insulating layer or an insulator formed on a semiconductor substrate or a supporting substrate, formed in a well formed in a semiconductor substrate, or formed on an electric insulator, and is preferably formed in a well or formed on an insulator including an insulating layer and an insulating substrate, or has an SOI structure or a TFT structure, for preventing alpha-particle or neutron induced soft error.

The channel forming region or the channel region can be formed from a material such as silicon or GaAs by using a known process. Each gate region can be formed of a material such as a metal; GaAs doped with an impurity at a high concentration; silicon, amorphous silicon, polysilicon a silicide doped with an impurity; or a polyside, by using a known process. The barrier layer can be formed of a material such as $SiO_2$, $Si_3N_4$, $Al_2O_3$ or GaAlAs by using a known process. Each region can be formed of silicon, amorphous silicon or polysilicon doped with an impurity, a silicide, a two-layer structure having a silicide layer and a semi-conductive layer, or GaAs doped with an impurity at a high concentration by using a known process, depending upon characteristics required. The semi-conductive layer can be formed of a material such as silicon or GaAs.

The junction-field-effect transistor (JFET) in the semiconductor memory cell of the present invention can be formed by (X) optimizing the distance between the facing gate regions of the junction-field-effect transistor, that is, the thickness of the channel region, and (Y) optimizing impurity concentrations of the facing gate regions and the channel region of the junction-field-effect transistor. It should be noted that if neither the distance between the facing gate regions (the thickness of the channel region $CH_3$) of the junction-field-effect transistor, nor the impurity concentrations of the facing gate regions and the channel region of the junction-field-effect transistor are optimized, the depletion layer will not be widened, making it impossible to bring the junction-field-effect transistor into an on-state or an off-state. These optimizations need to be carried out by computer simulation or experiments.

The semiconductor memory cell of the present invention retains the information as a potential, a potential difference or an electric charge, while leak current caused by junction leak, etc., attenuates them sooner or later. It is therefore necessary to refresh it, and the semiconductor memory cell is operated like DRAM.

BRIEF DESCRIPTION OF THE DRAWINGS

The present invention will be explained in detail with reference to drawings hereinafter.

FIGS. 119A and 119B are schematic partial cross-sectional views of modifications of the semiconductor memory cell in Example 16.

FIGS. 120A and 120B are schematic partial cross-sectional views of modifications of the semiconductor memory cell in Example 17.

FIGS. 121A and 121B are schematic perspective views of side-gate-type semiconductor memory cells to which the semiconductor memory cell explained in Example 14 is applied.

FIG. 122 is a principle drawing of the semiconductor memory cell in Example 18.

FIG. 123 is a schematic partial cross-sectional view of a semiconductor memory cell in Example 18.

FIG. 124 is a principle drawing of a modification of the semiconductor memory cell in Example 18.

FIG. 125 is a schematic partial cross-sectional view of a modification of the semiconductor memory cell in Example 18.

FIGS. 126A and 126B are schematic partial cross-sectional views of a semiconductor substrate, etc., for the explanation of a manufacturing method of the semiconductor memory cell in Example 18.

Figure 126A:
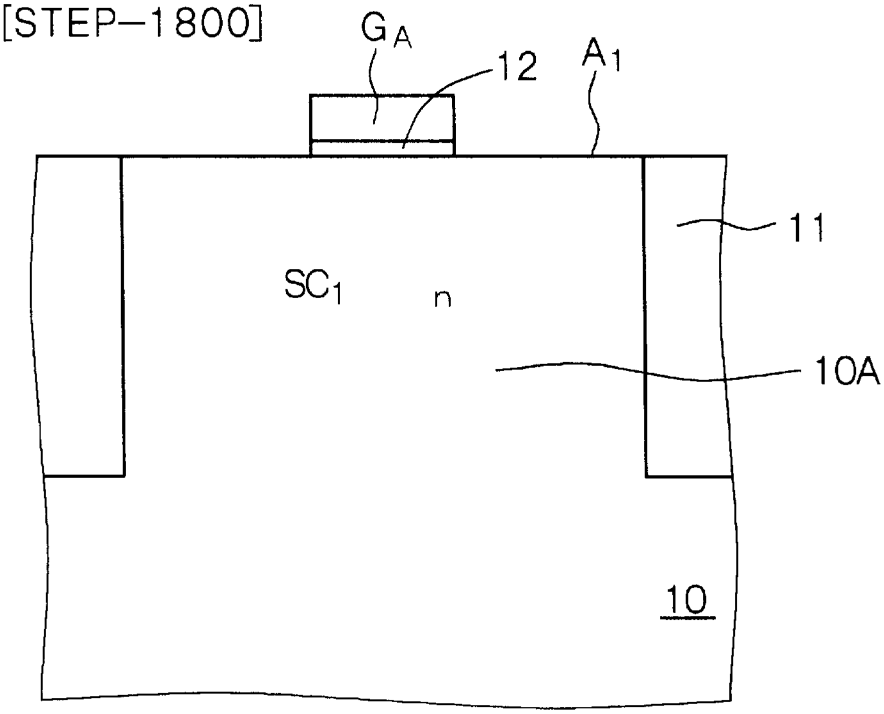
Figure 126B:
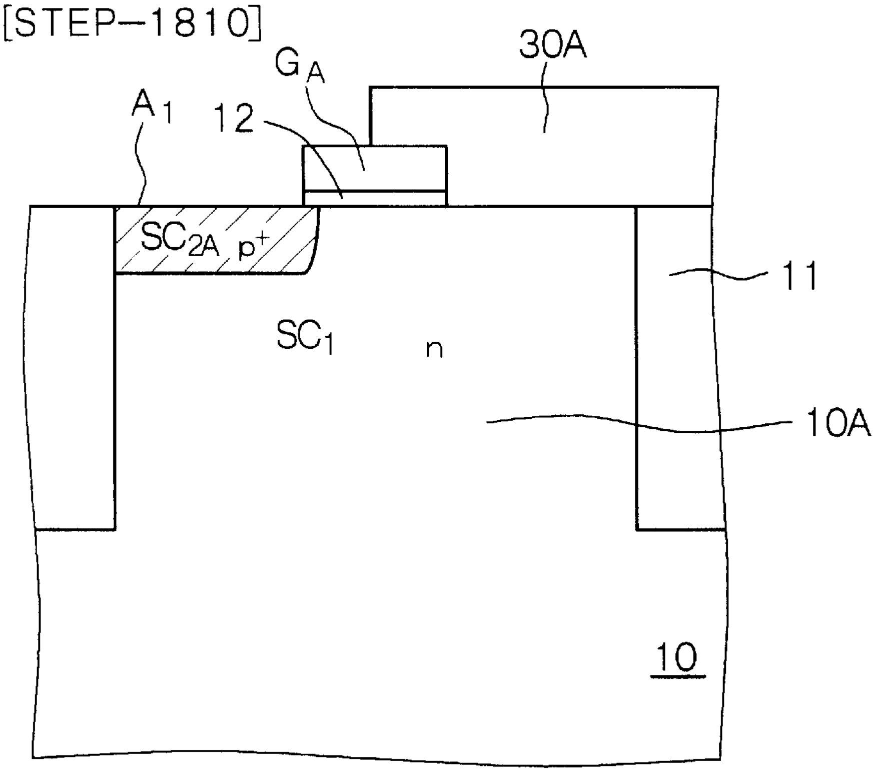
Figure 127A:
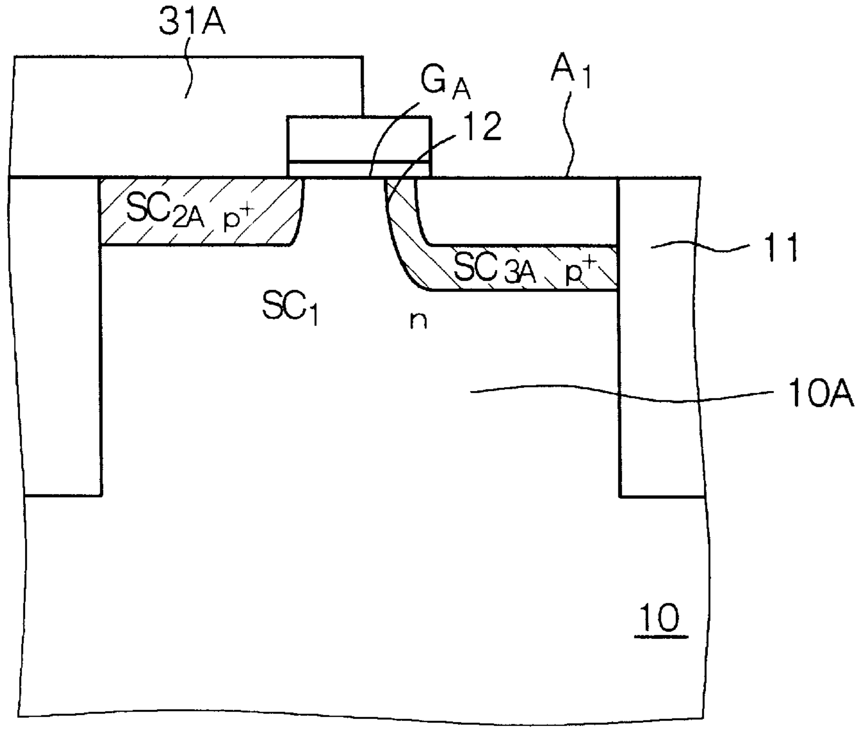
Figure 127B:
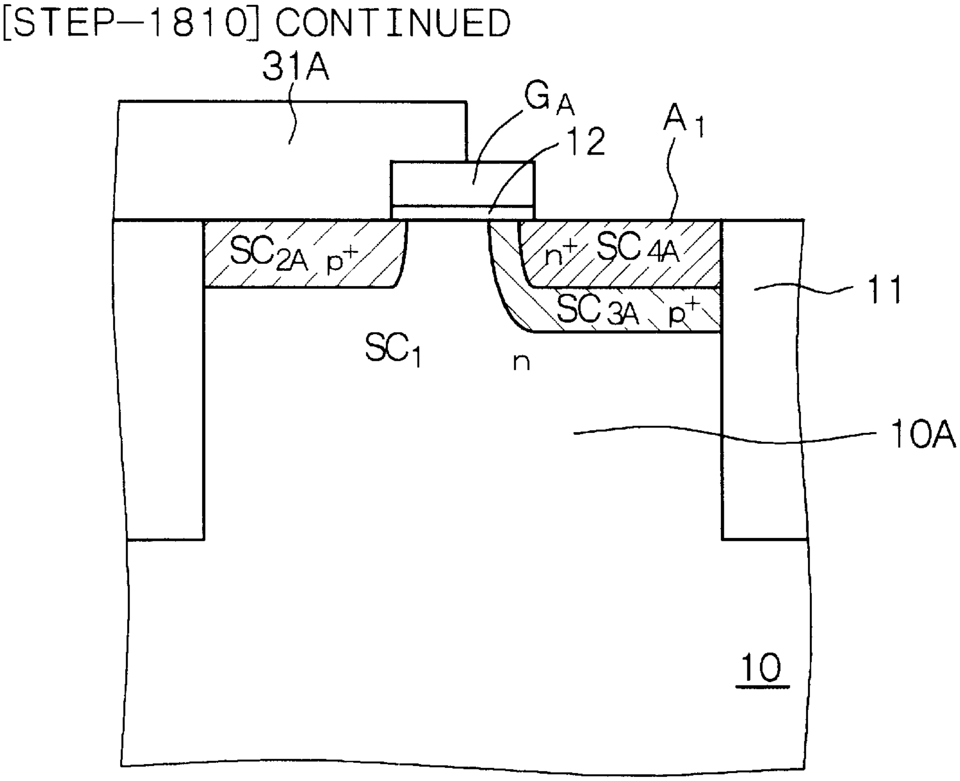

FIGS. 127A and 127B, subsequent to FIG. 126B, are schematic partial cross-sectional views of a semiconductor substrate, etc., for the explanation of a manufacturing method of the semiconductor memory cell in Example 18.

Figure 128:
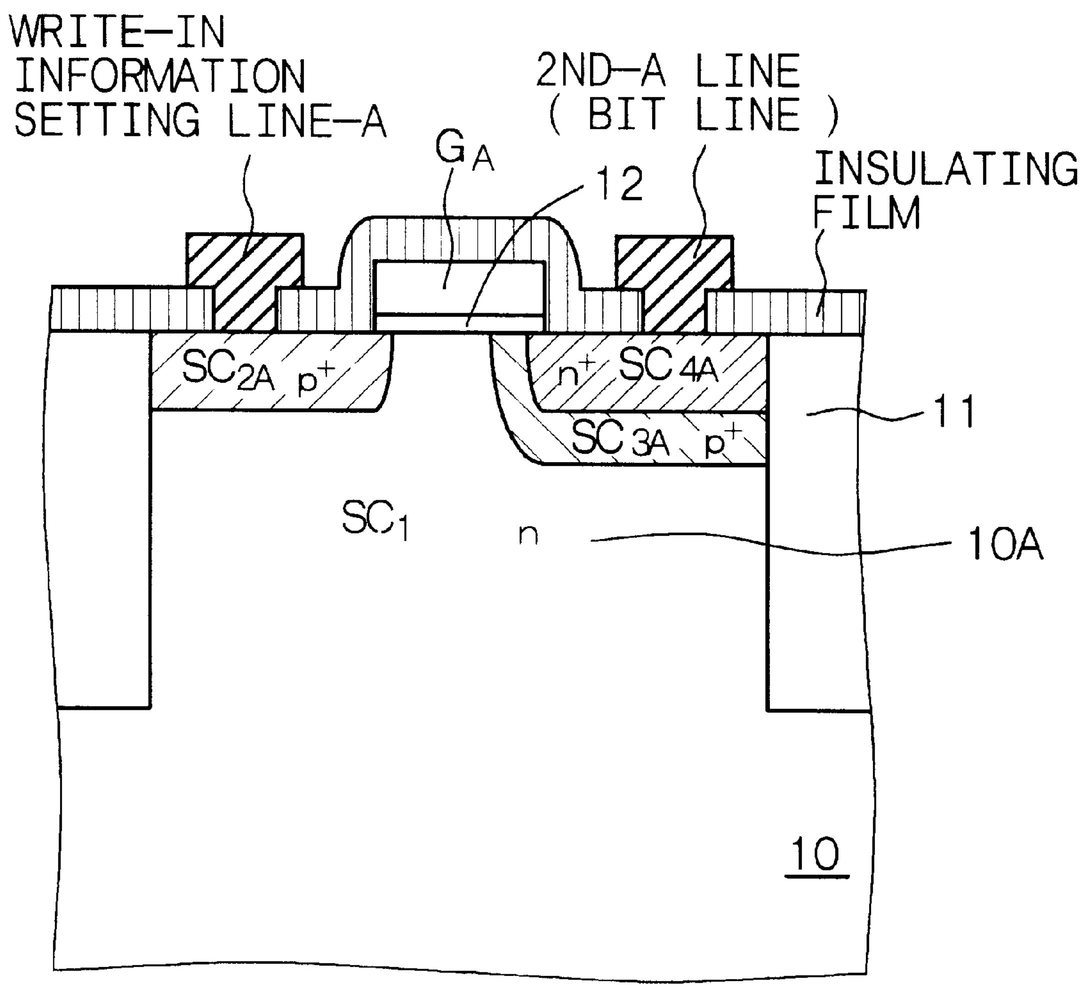

FIG. 128, subsequent to FIG. 127B, is a schematic partial cross-sectional view of a semiconductor substrate, etc., for the explanation of a manufacturing method of the semiconductor memory cell in Example 18.

Figure 129:
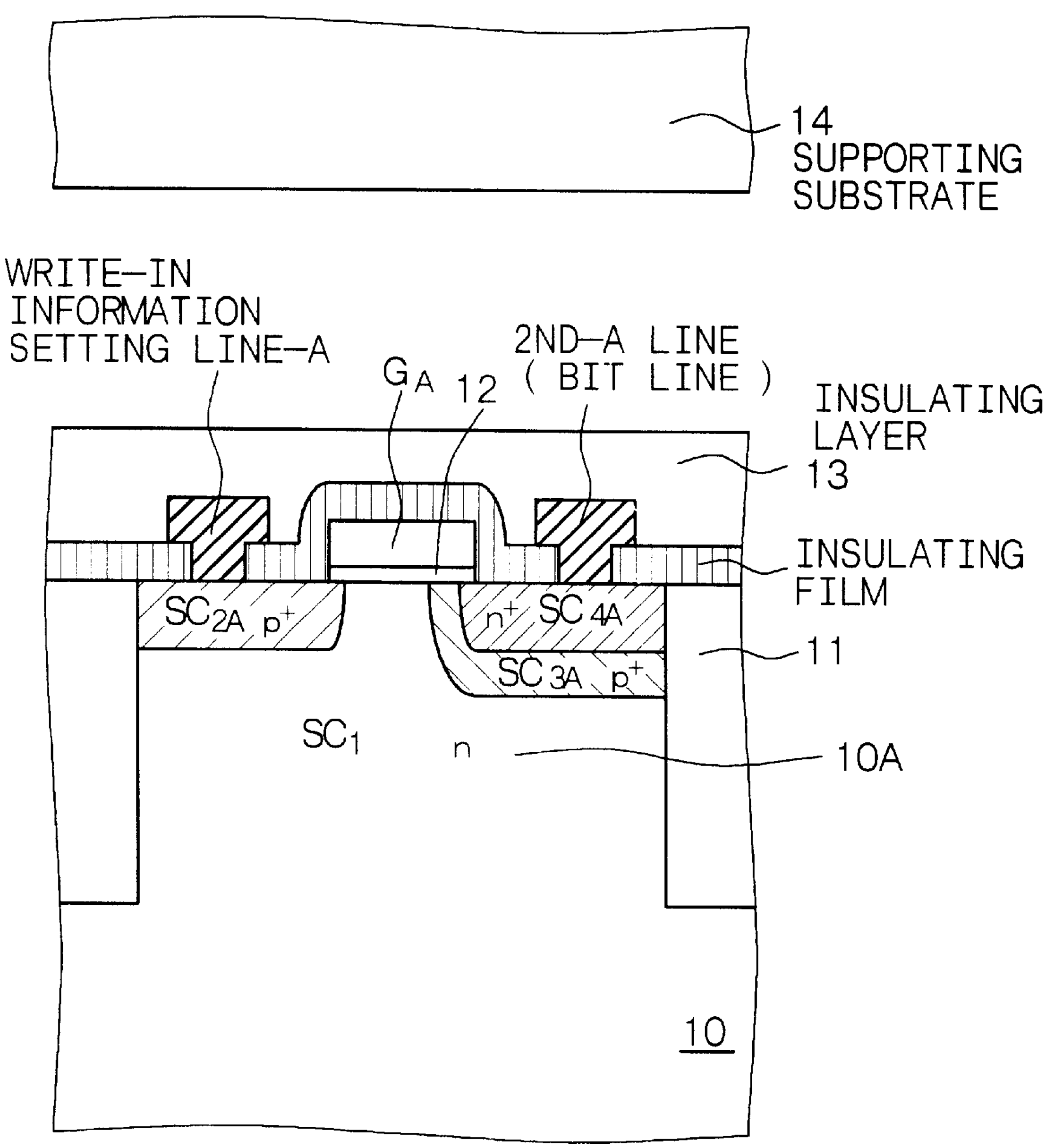

FIG. 129, subsequent to FIG. 128, is a schematic partial cross-sectional view of a semiconductor substrate, etc., for the explanation of a manufacturing method of the semiconductor memory cell in Example 18.

Figure 130:
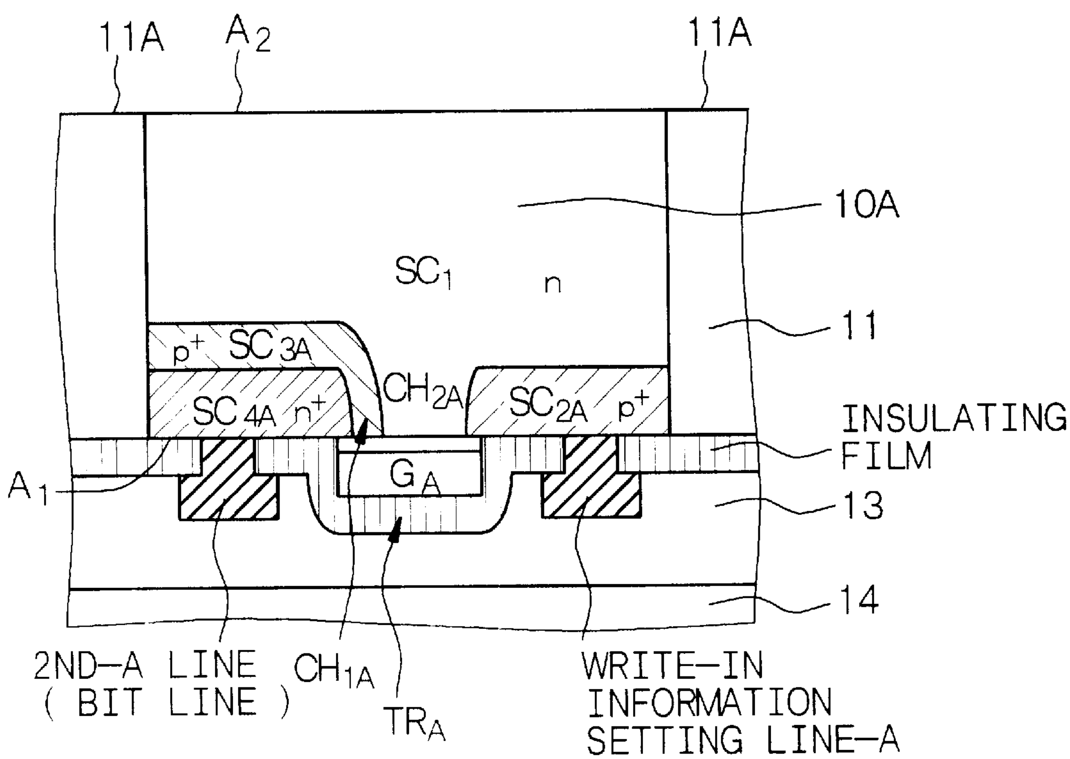

FIG. 130, subsequent to FIG. 129, is a partial cross-sectional view of a semiconductor substrate, etc., for the explanation of a manufacturing method of the semiconductor memory cell in Example 18.

Figure 131:
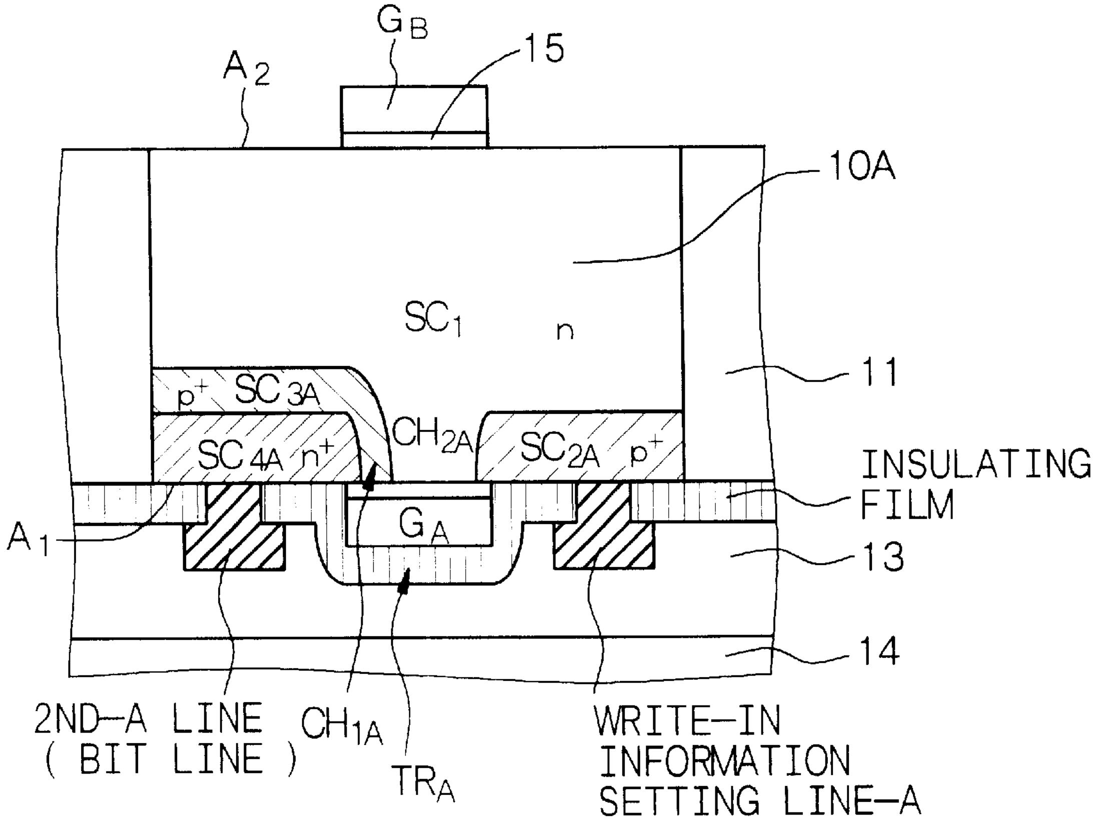

FIG. 131, subsequent to FIG. 130, is a schematic partial cross-sectional view of a semiconductor substrate, etc., for the explanation of a manufacturing method of the semiconductor memory cell in Example 18.

Figure 132:
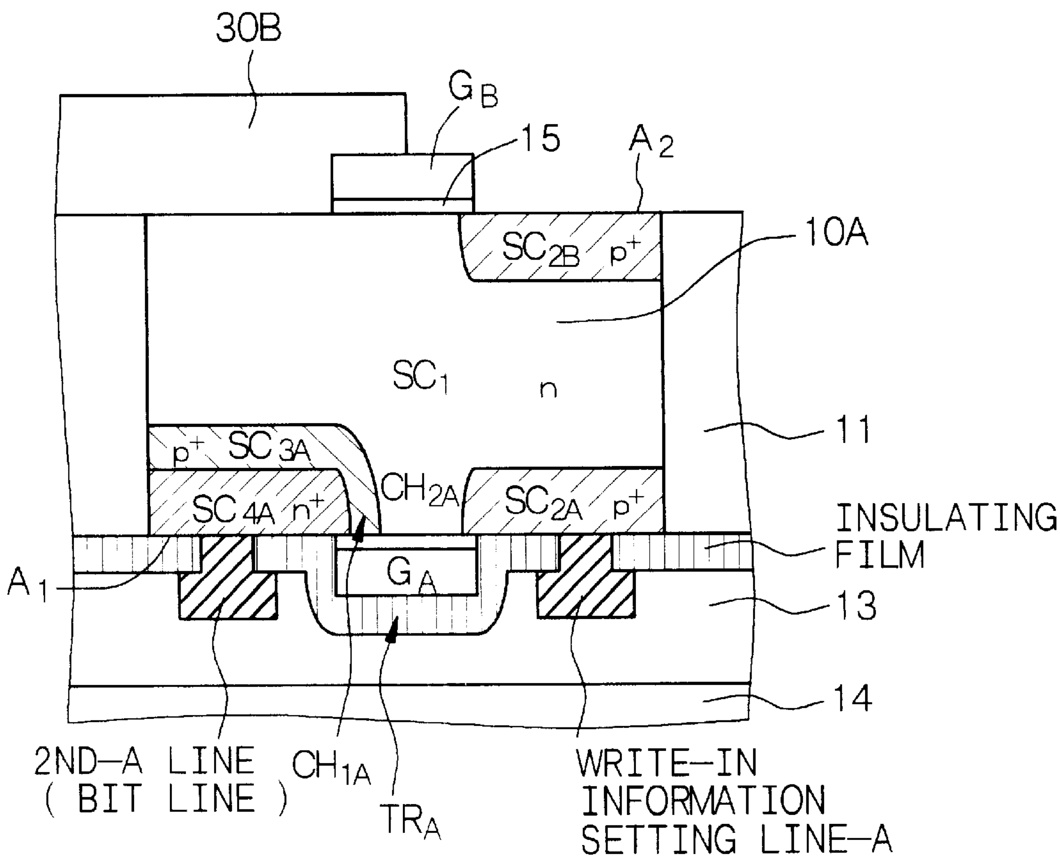

FIG. 132, subsequent to FIG. 131, is a schematic partial cross-sectional view of a semiconductor substrate, etc., for the explanation of a manufacturing method of the semiconductor memory cell in Example 18.

Figure 133:
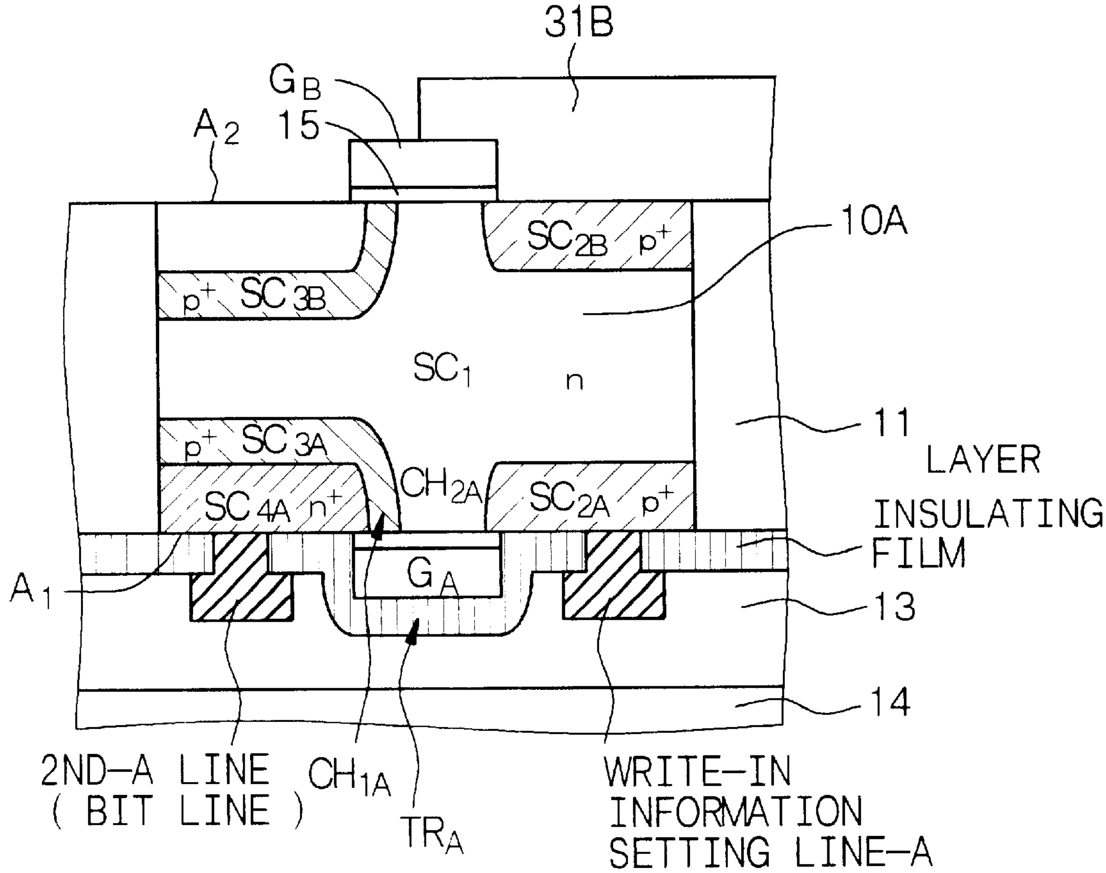

FIG. 133, subsequent to FIG. 132, is a schematic partial cross-sectional view of a semiconductor substrate, etc., for the explanation of a manufacturing method of the semiconductor memory cell in Example 18.

Figure 134:
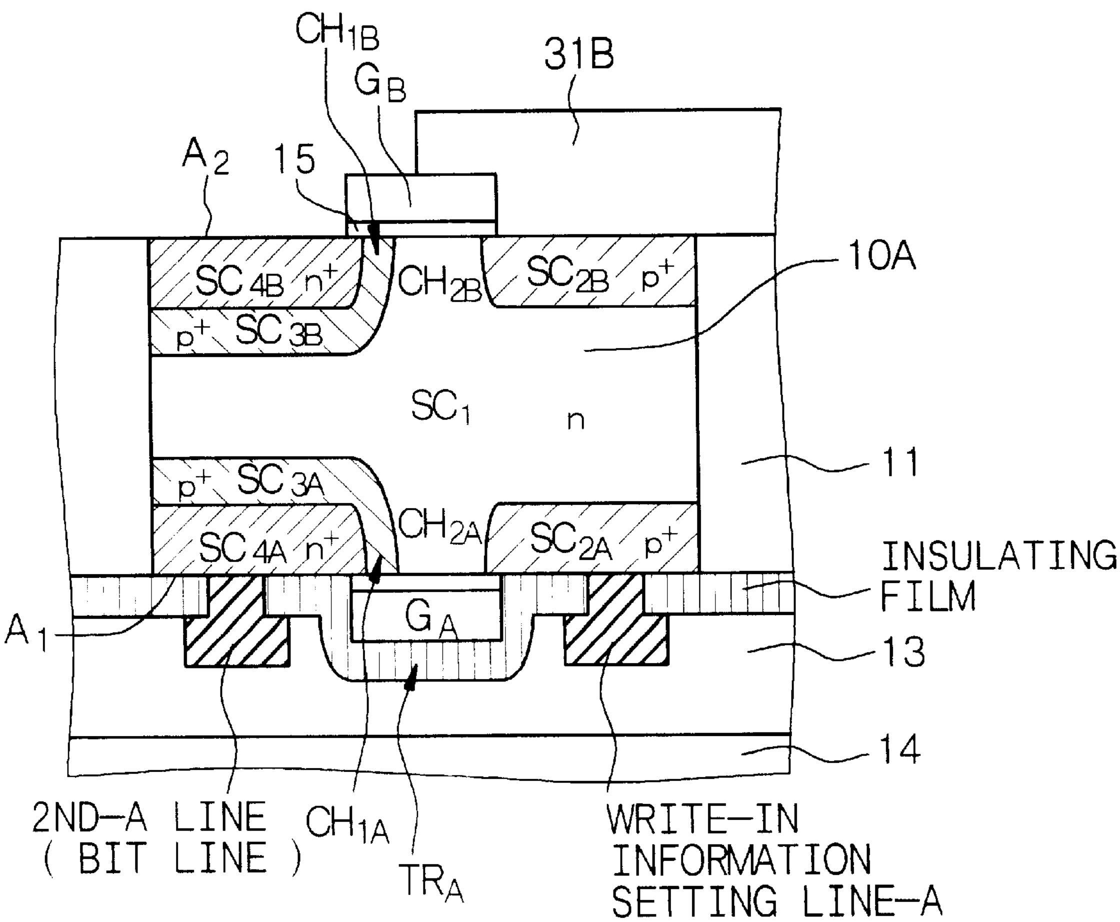

FIG. 134, subsequent to FIG. 133, is a schematic partial cross-sectional view of a semiconductor substrate, etc., for the explanation of a manufacturing method of the semiconductor memory cell in Example 18.

Figure 135:
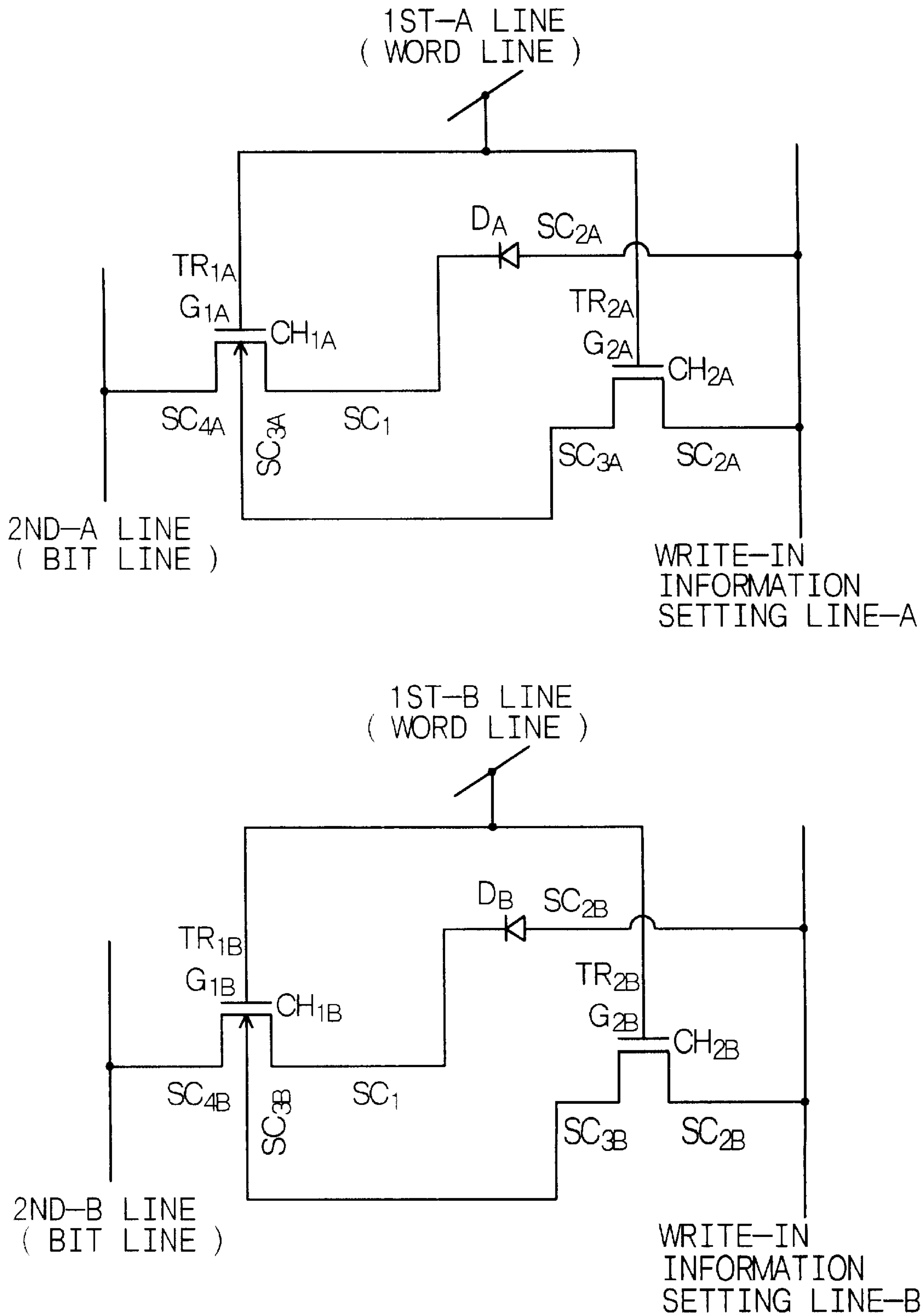

FIG. 135 is a principle drawing of the semiconductor memory cell in Example 19.

Figure 136:
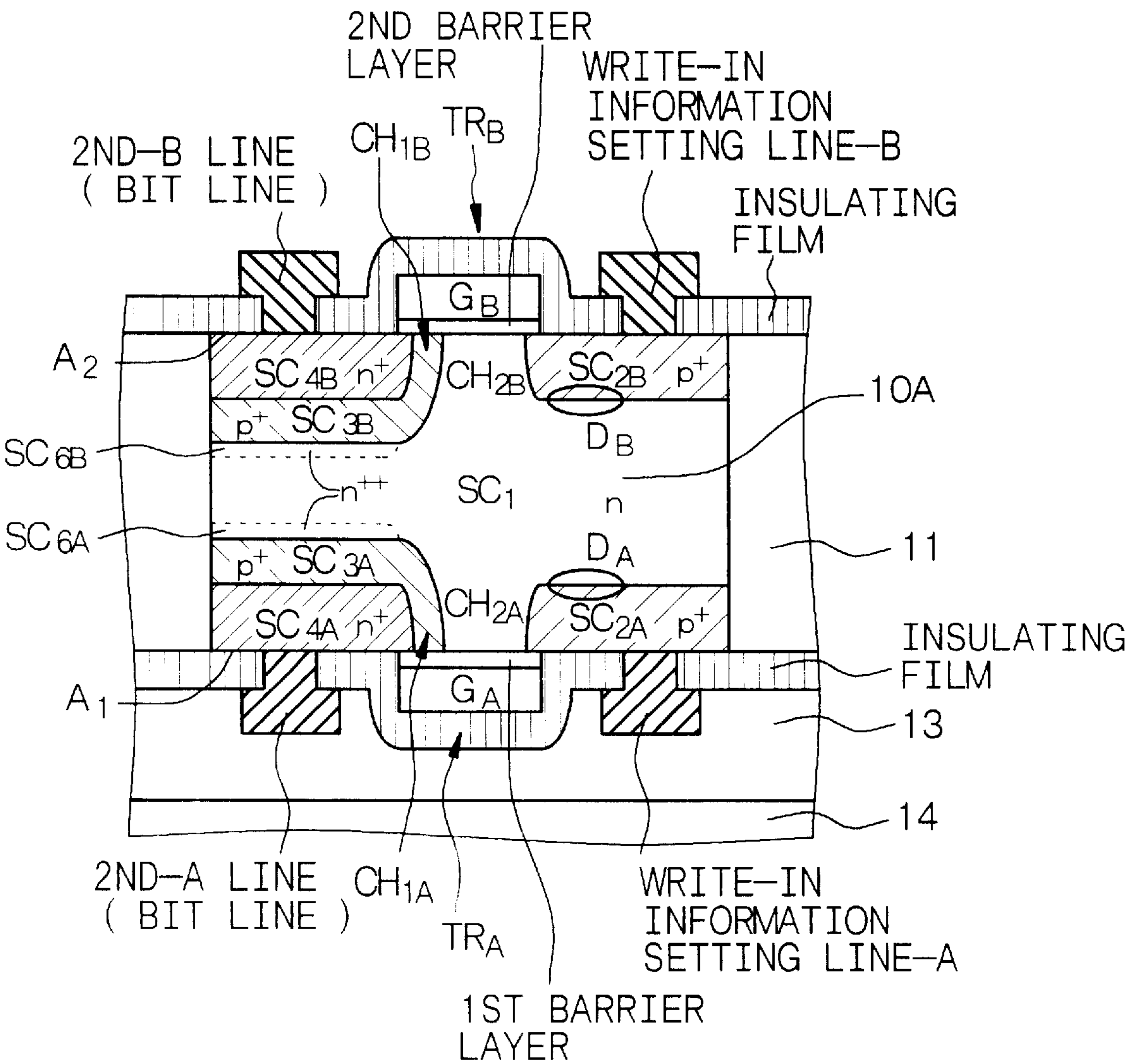

FIG. 136 is a schematic partial cross-sectional view of a semiconductor memory cell in Example 19.

Figure 137:
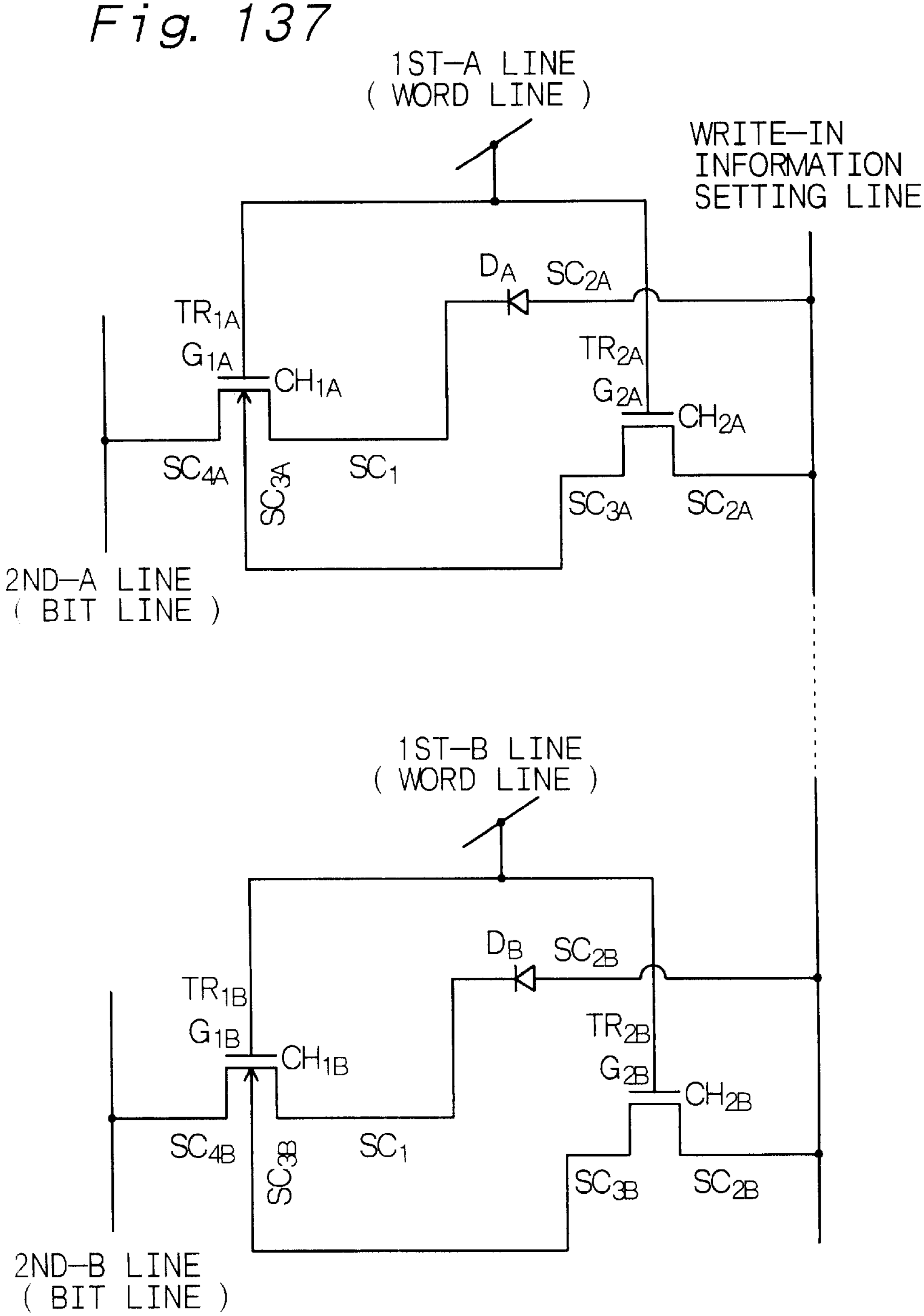

FIG. 137 is a principle drawing of a modification of the semiconductor memory cell in Example 19.

Figure 138:
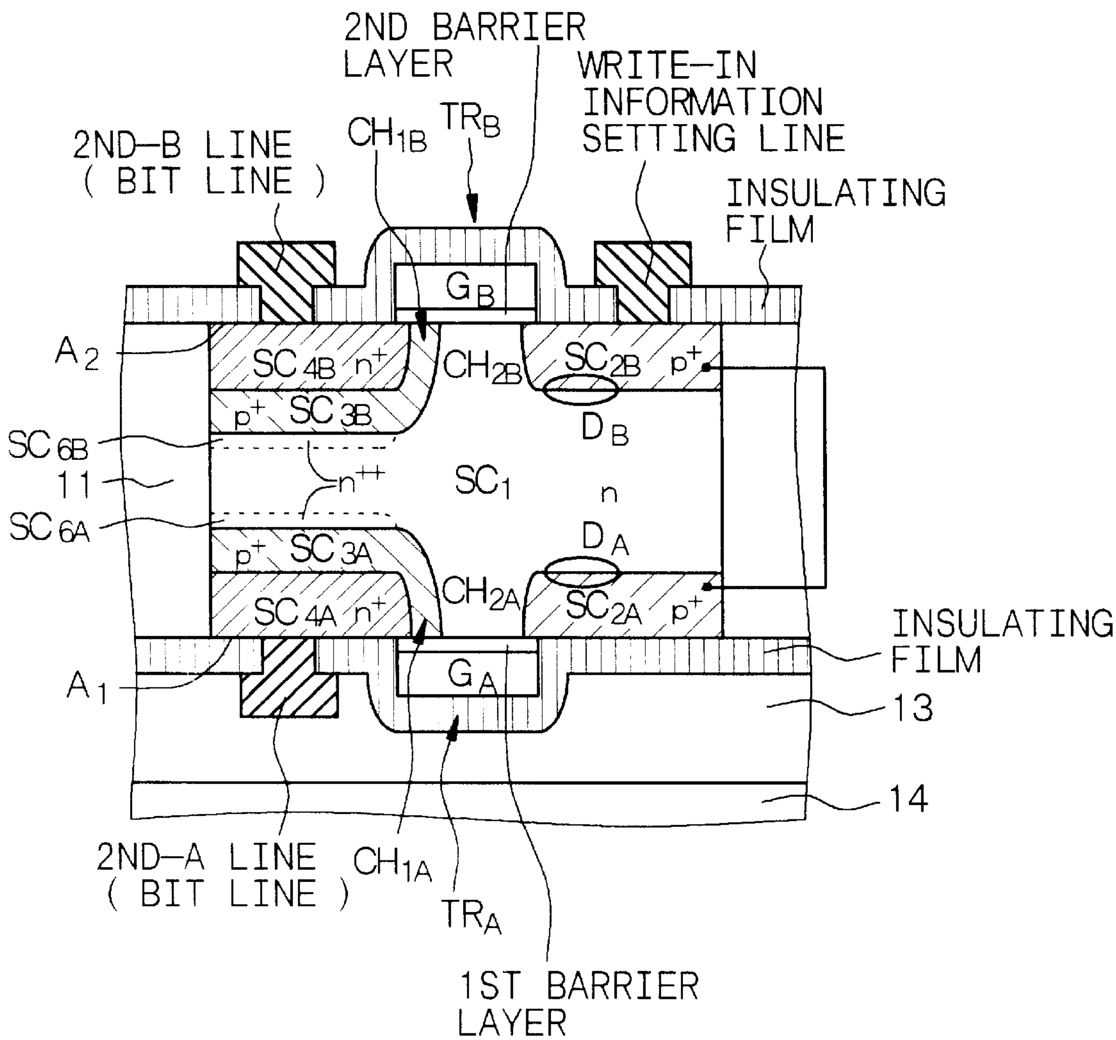

FIG. 138 is a schematic partial cross-sectional view of a modification of the semiconductor memory cell in Example 19.

Figure 139:
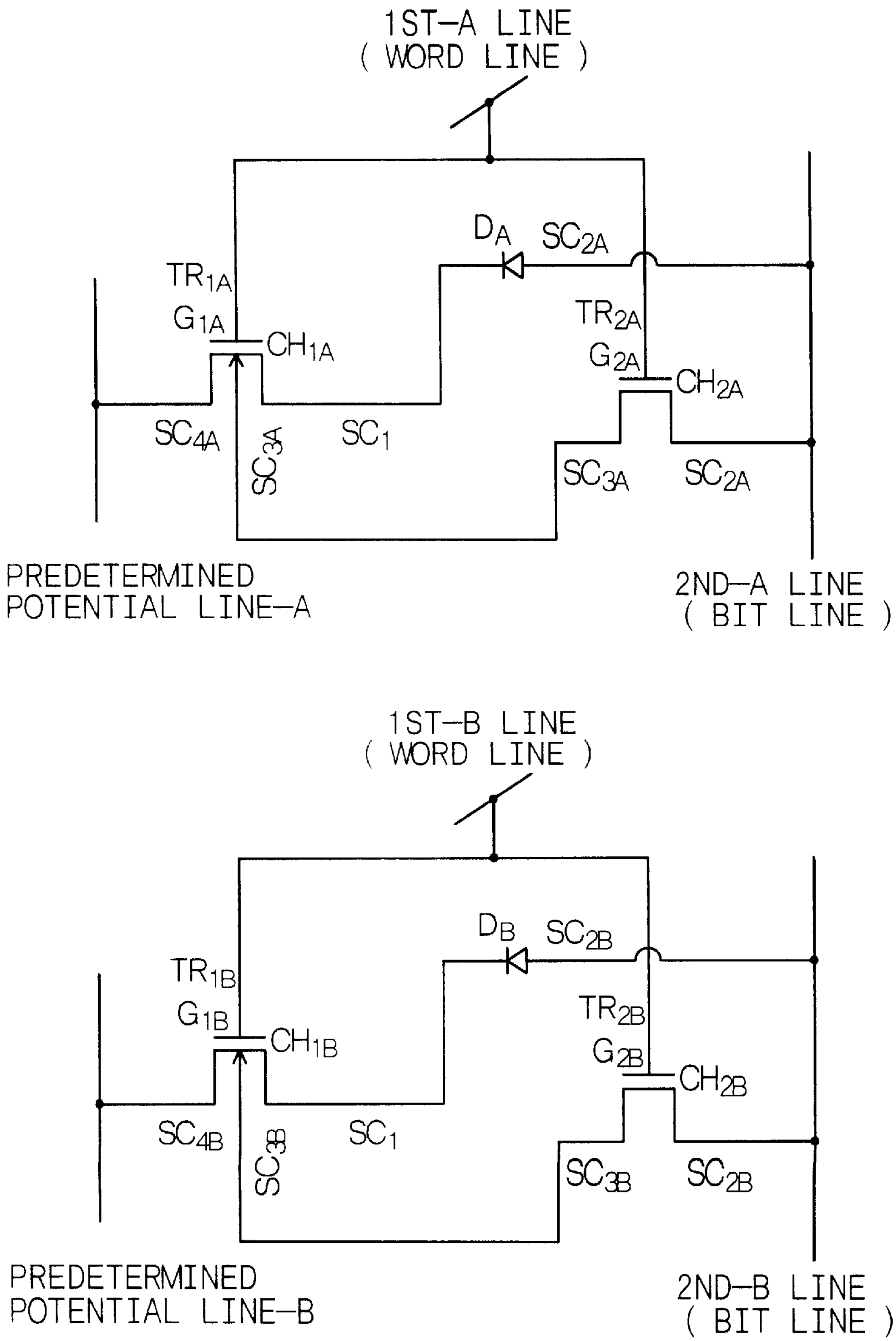

FIG. 139 is a principle drawing of another modification of the semiconductor memory cell in Example 19.

Figure 140:
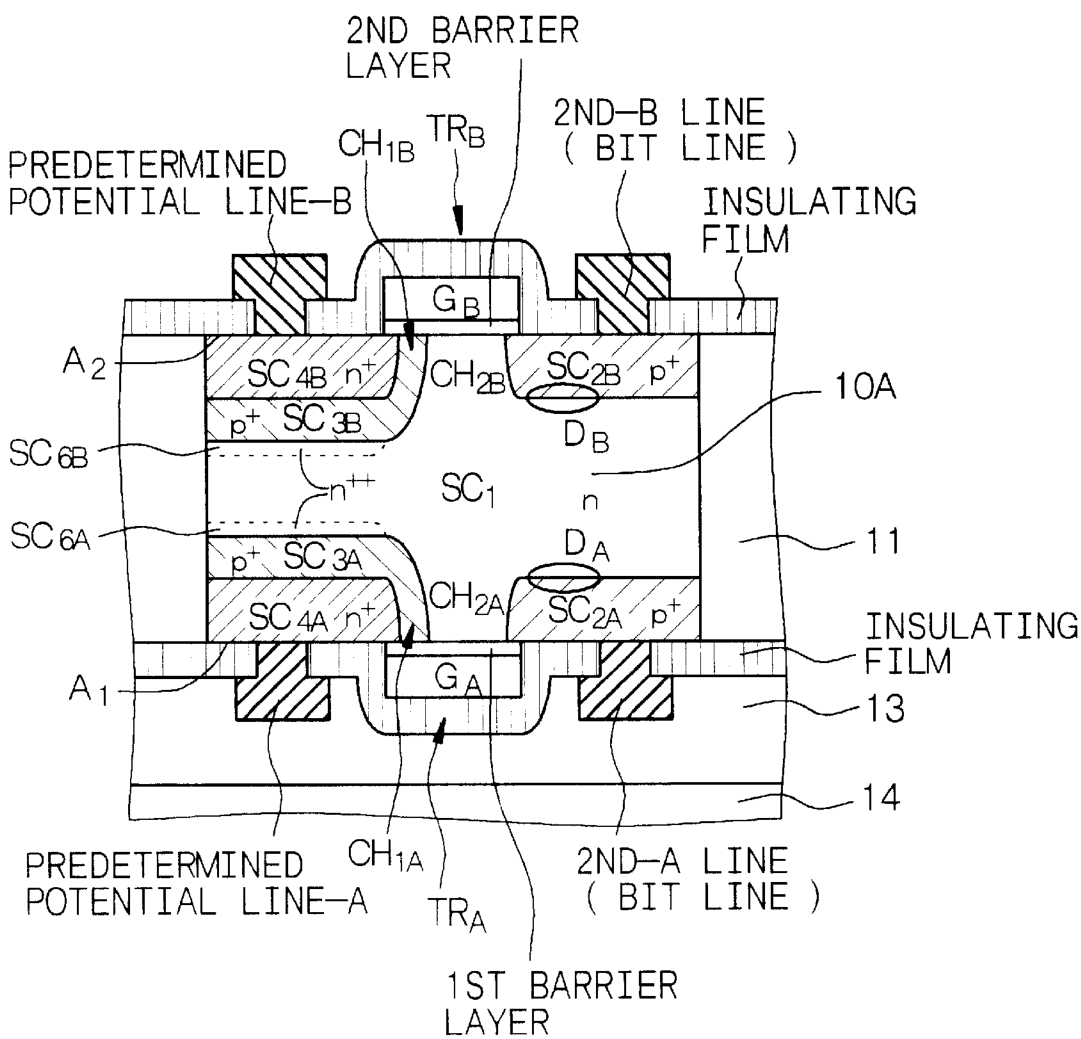

FIG. 140 is a schematic partial cross-sectional view of a modification of the semiconductor memory cell in Example 19.

Figure 141:
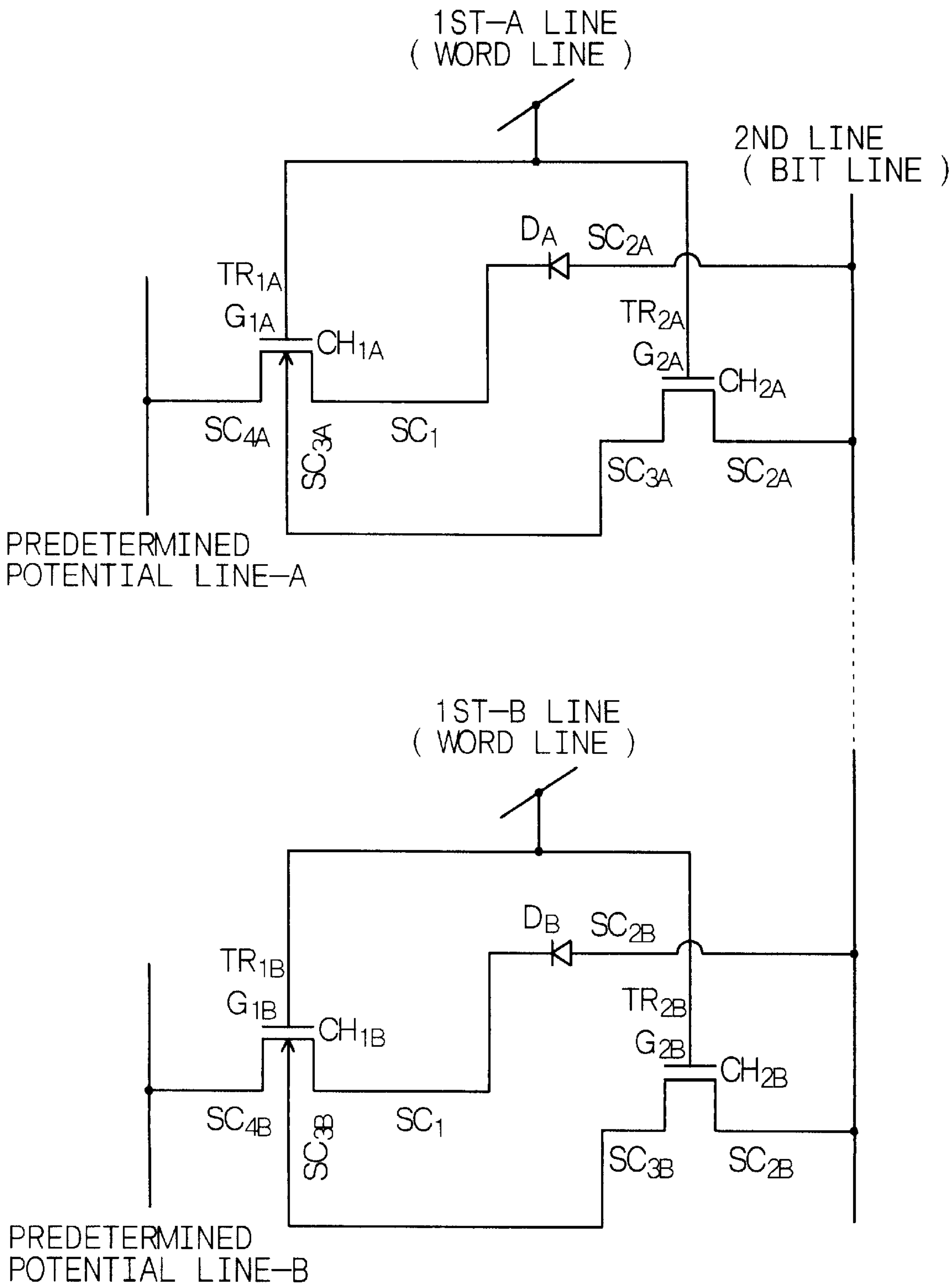

FIG. 141 is a principle drawing of another modification of the semiconductor memory cell in Example 19.

Figure 142:
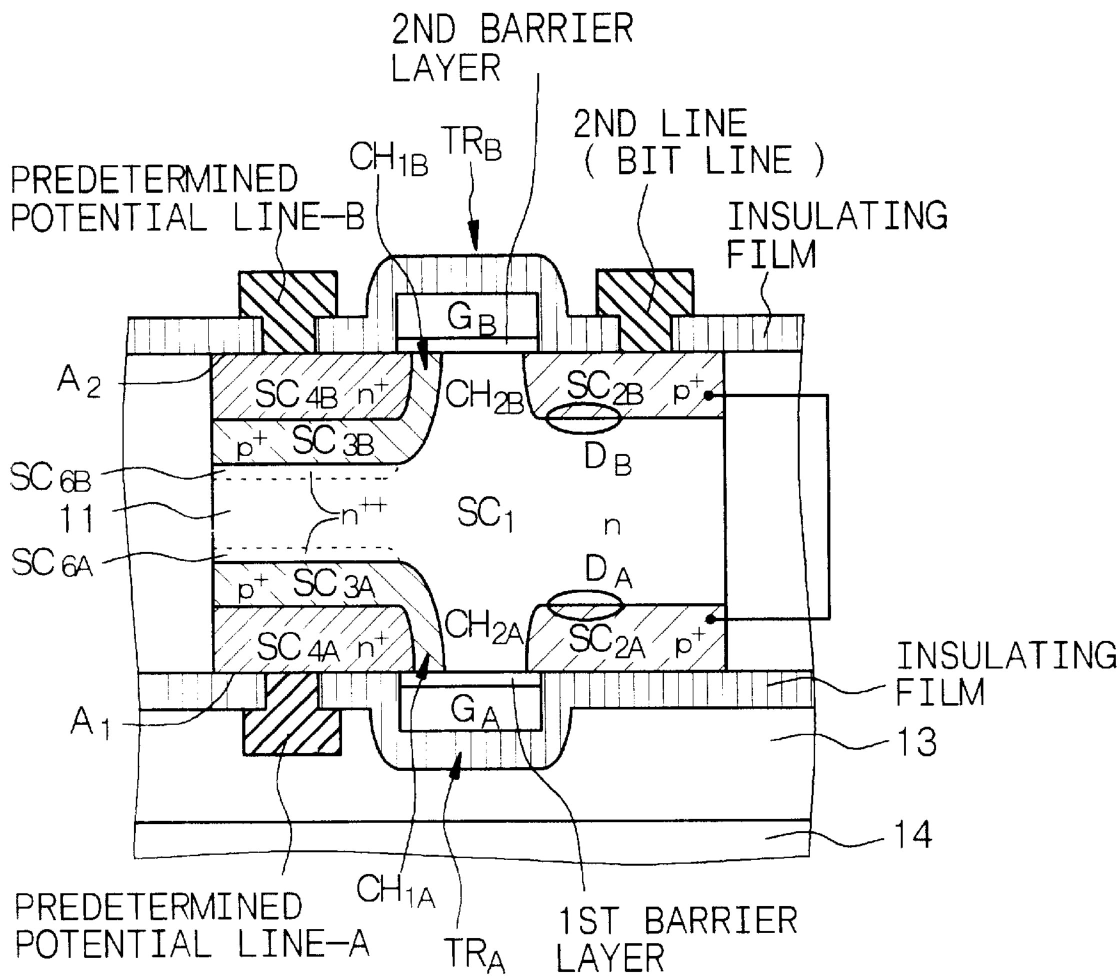

FIG. 142 is a schematic partial cross-sectional view of a modification of the semiconductor memory cell in Example 19.

Figure 143:
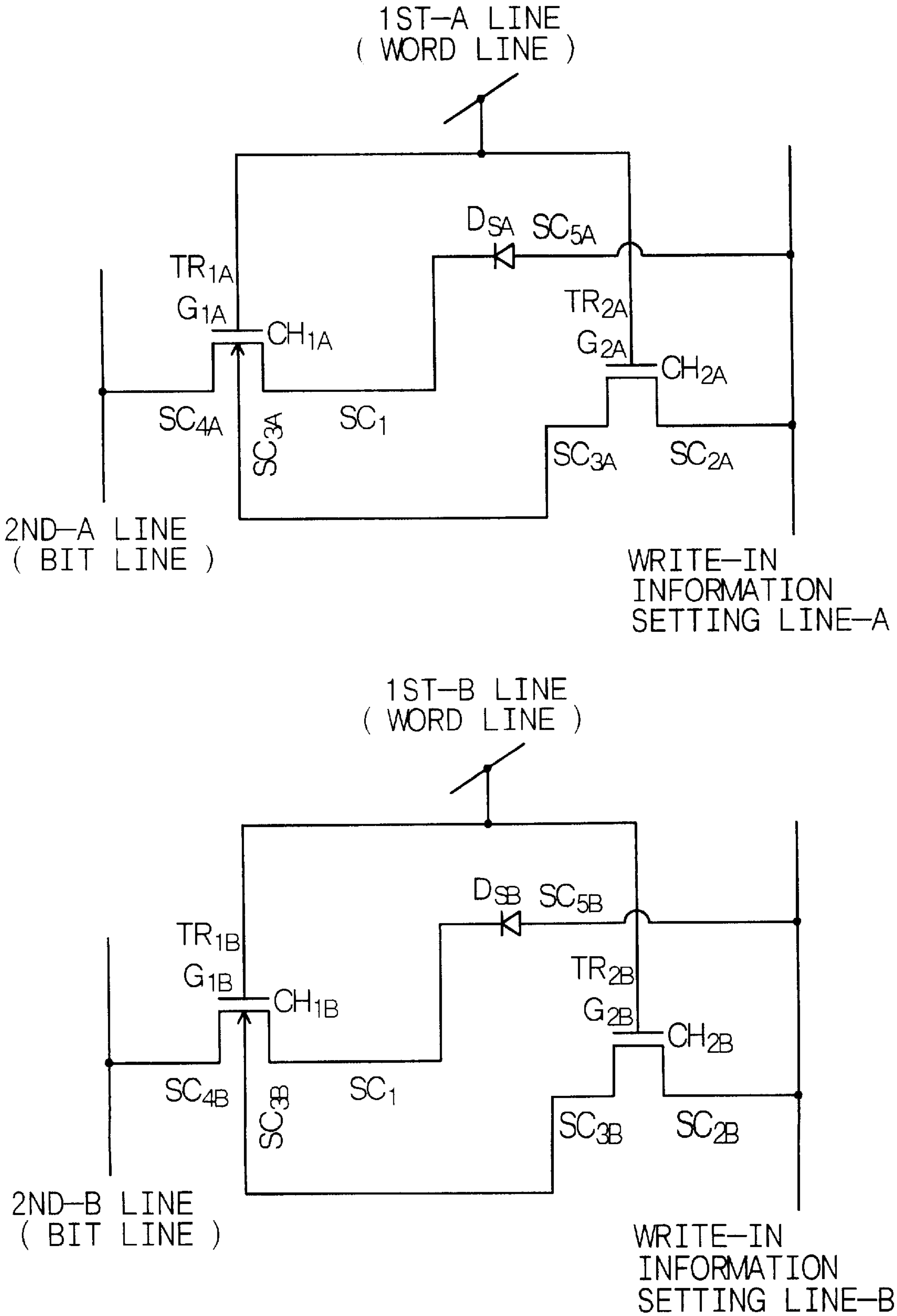

FIG. 143 is a principle drawing of the semiconductor memory cell in Example 20.

Figure 144:
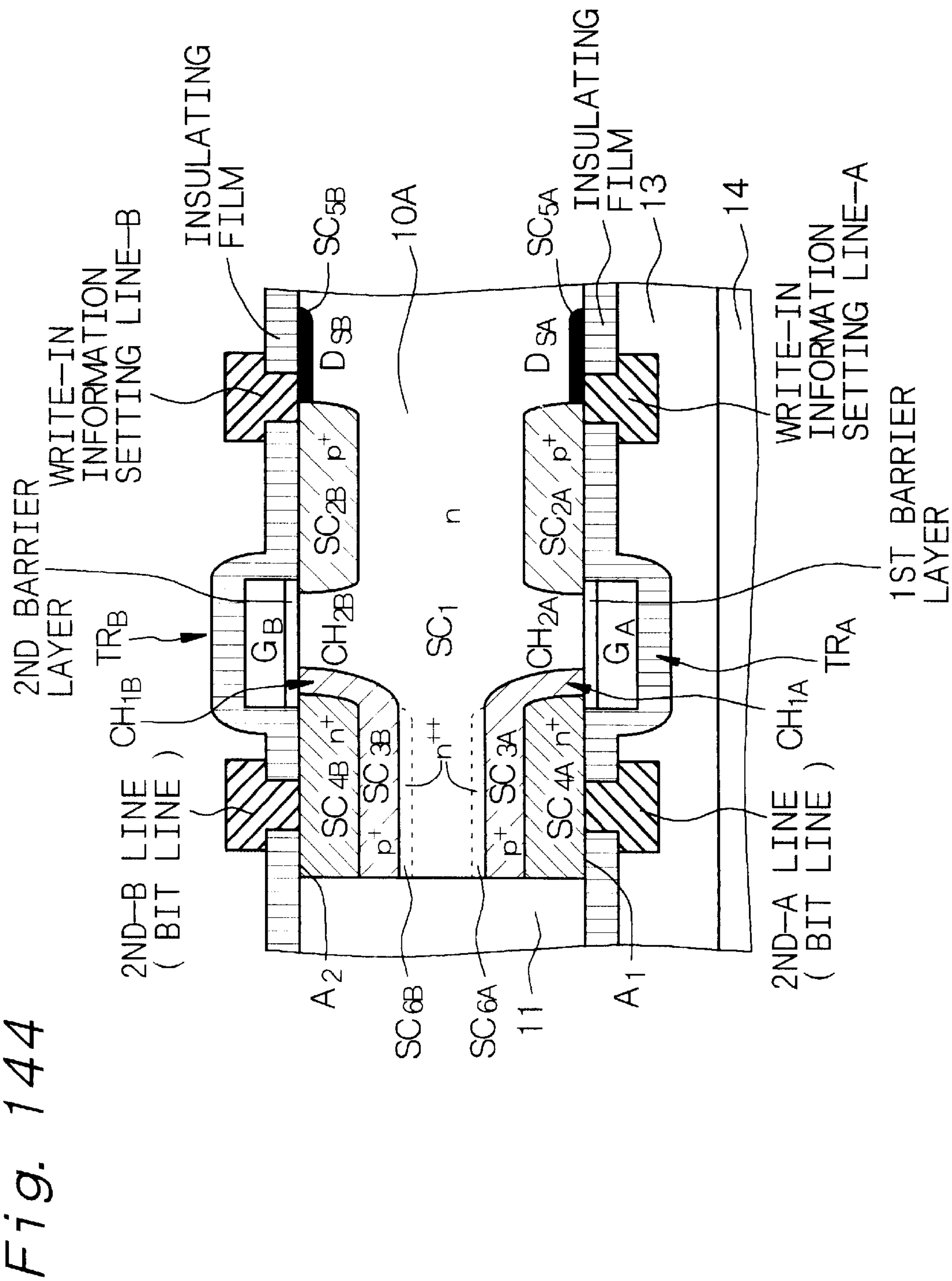

FIG. 144 is a schematic partial cross-sectional view of a semiconductor memory cell in Example 20.

Figure 145:
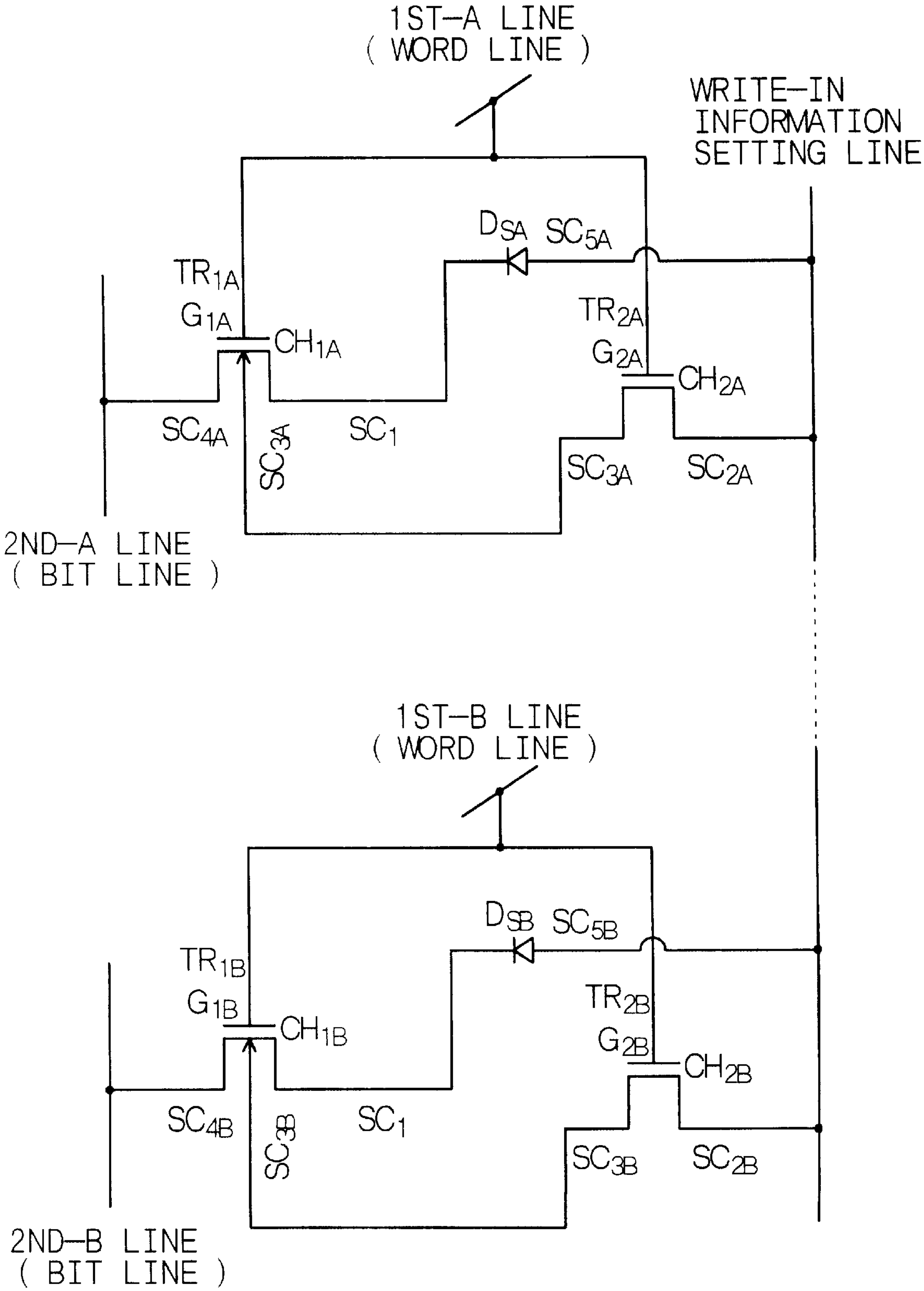

FIG. 145 is a principle drawing of a modification of the semiconductor memory cell in Example 20.

Figure 146:
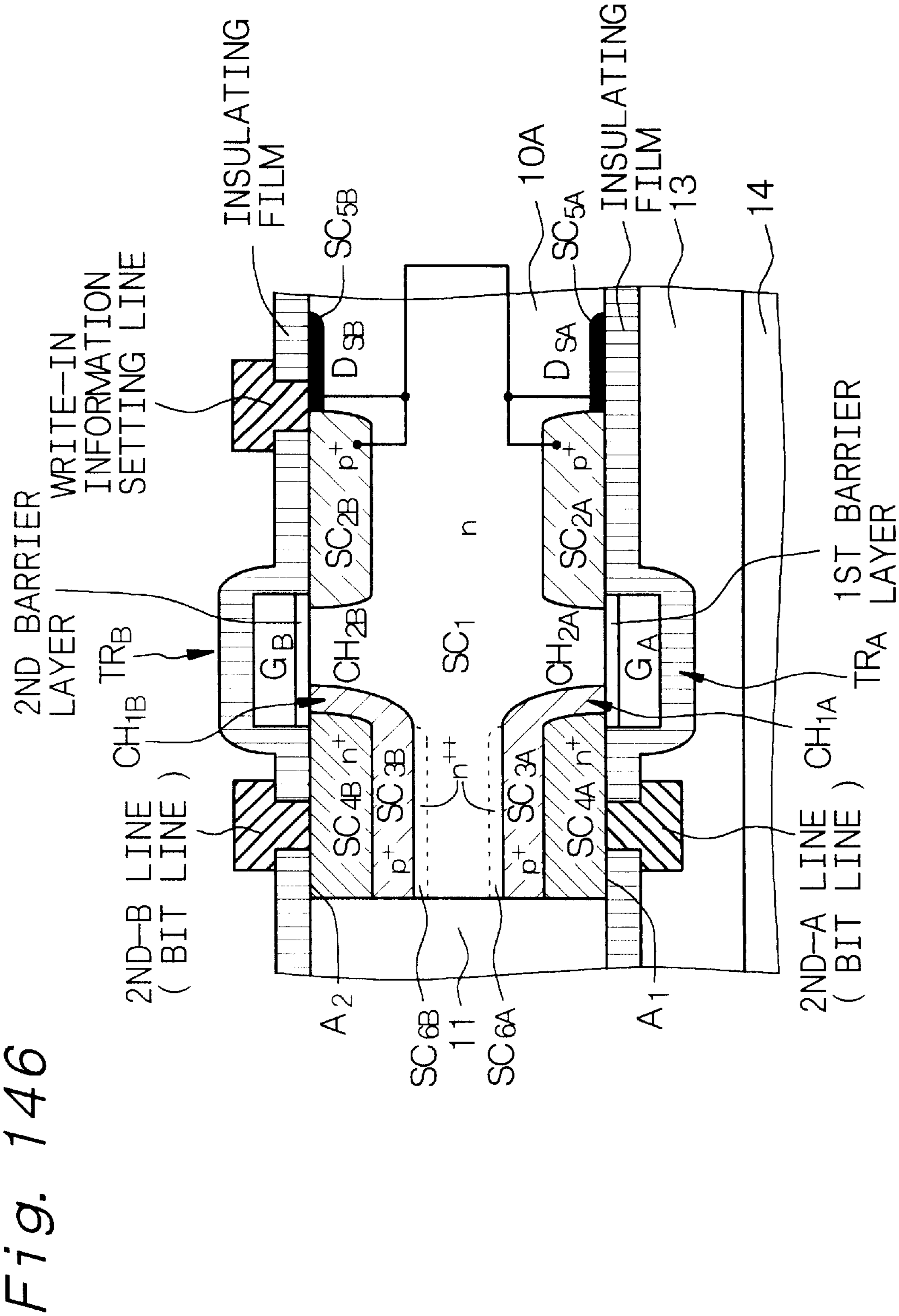

FIG. 146 is a schematic partial cross-sectional view of a modification of the semiconductor memory cell in Example 20.

Figure 147:
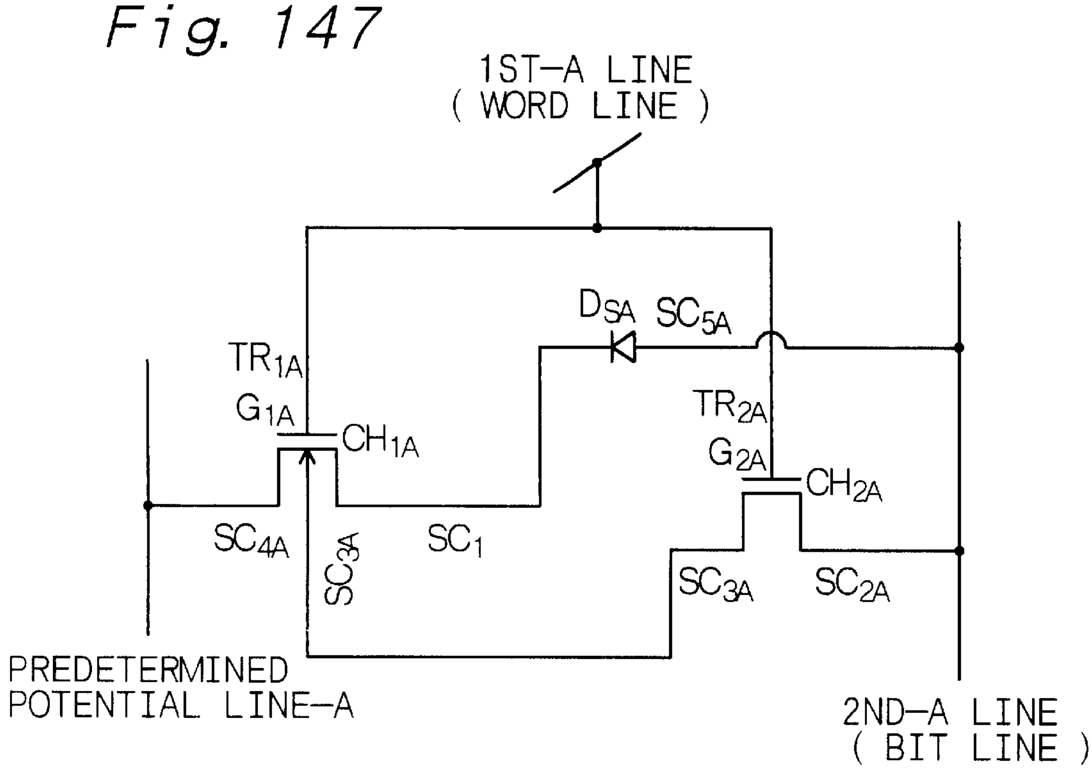
Figure 147:
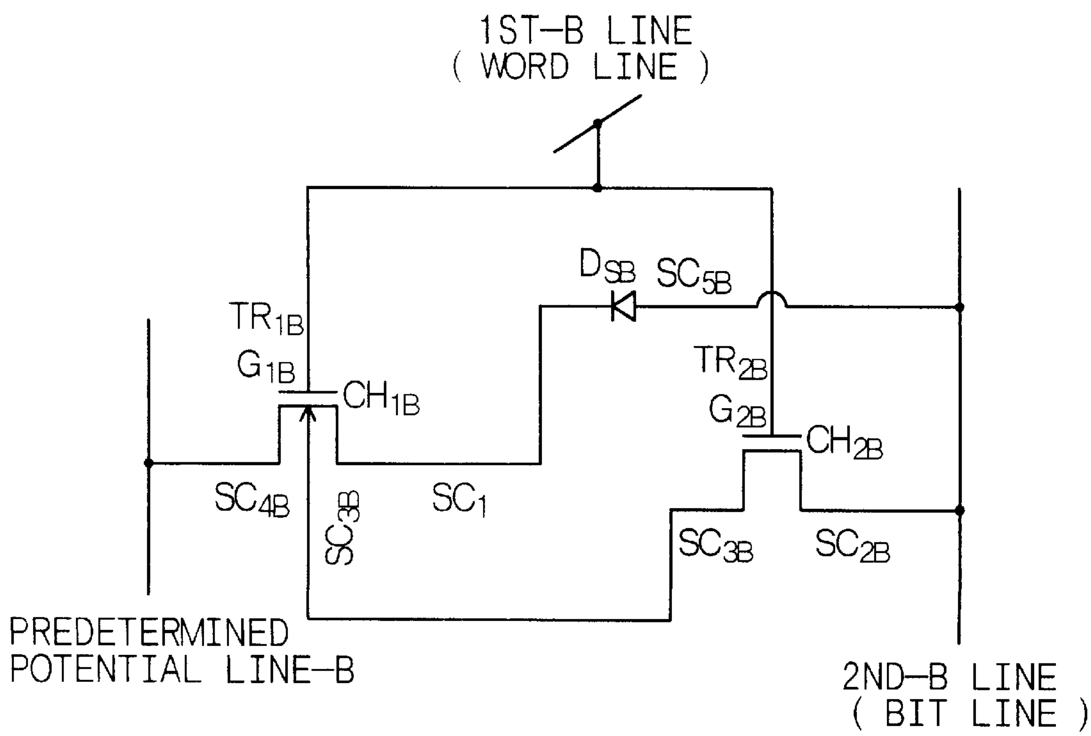

FIG. 147 is a principle drawing of another modification of the semiconductor memory cell in Example 20.

Figure 148:
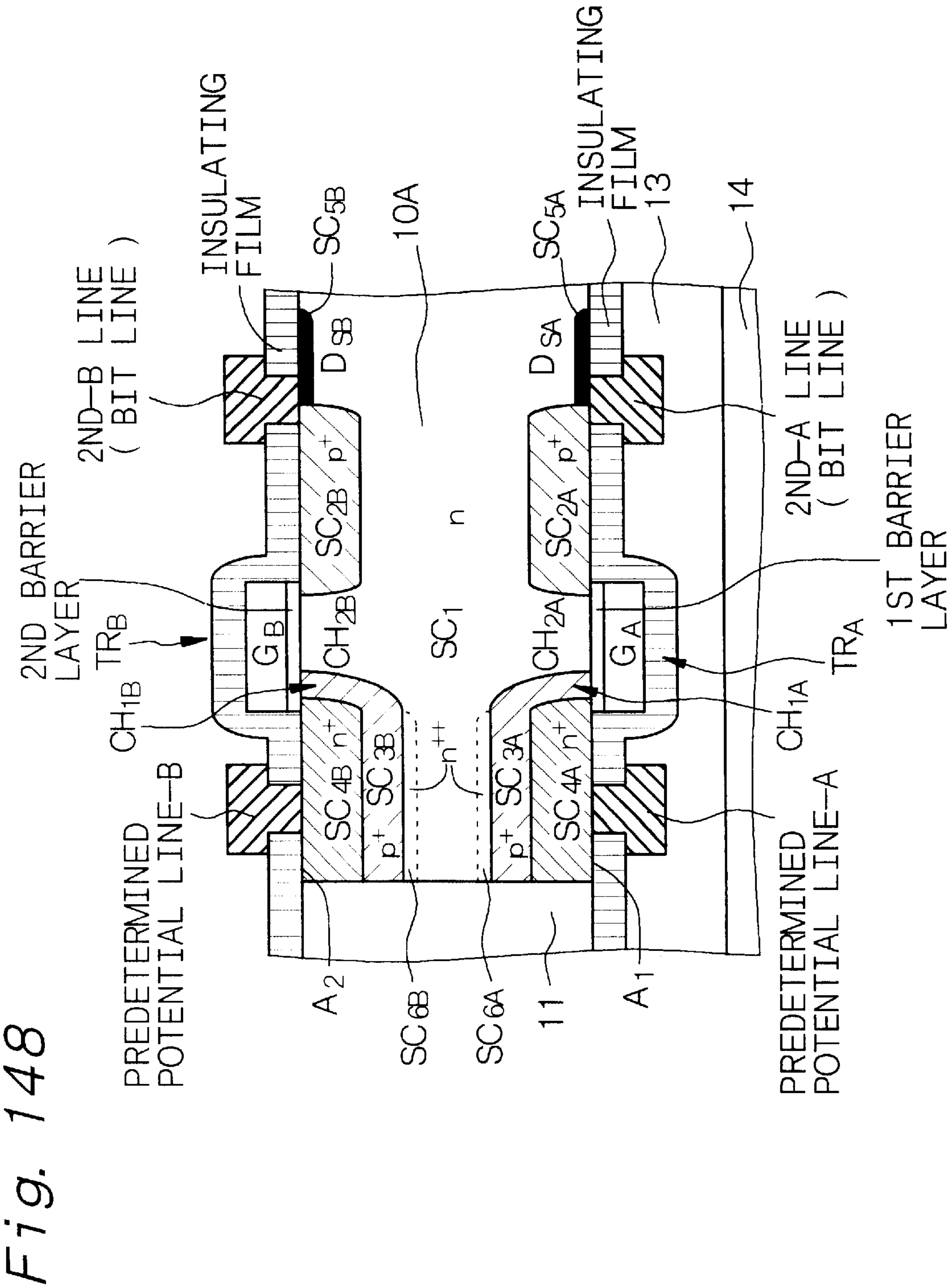

FIG. 148 is a schematic partial cross-sectional view of a modification of the semiconductor memory cell in Example 20.

Figure 149:
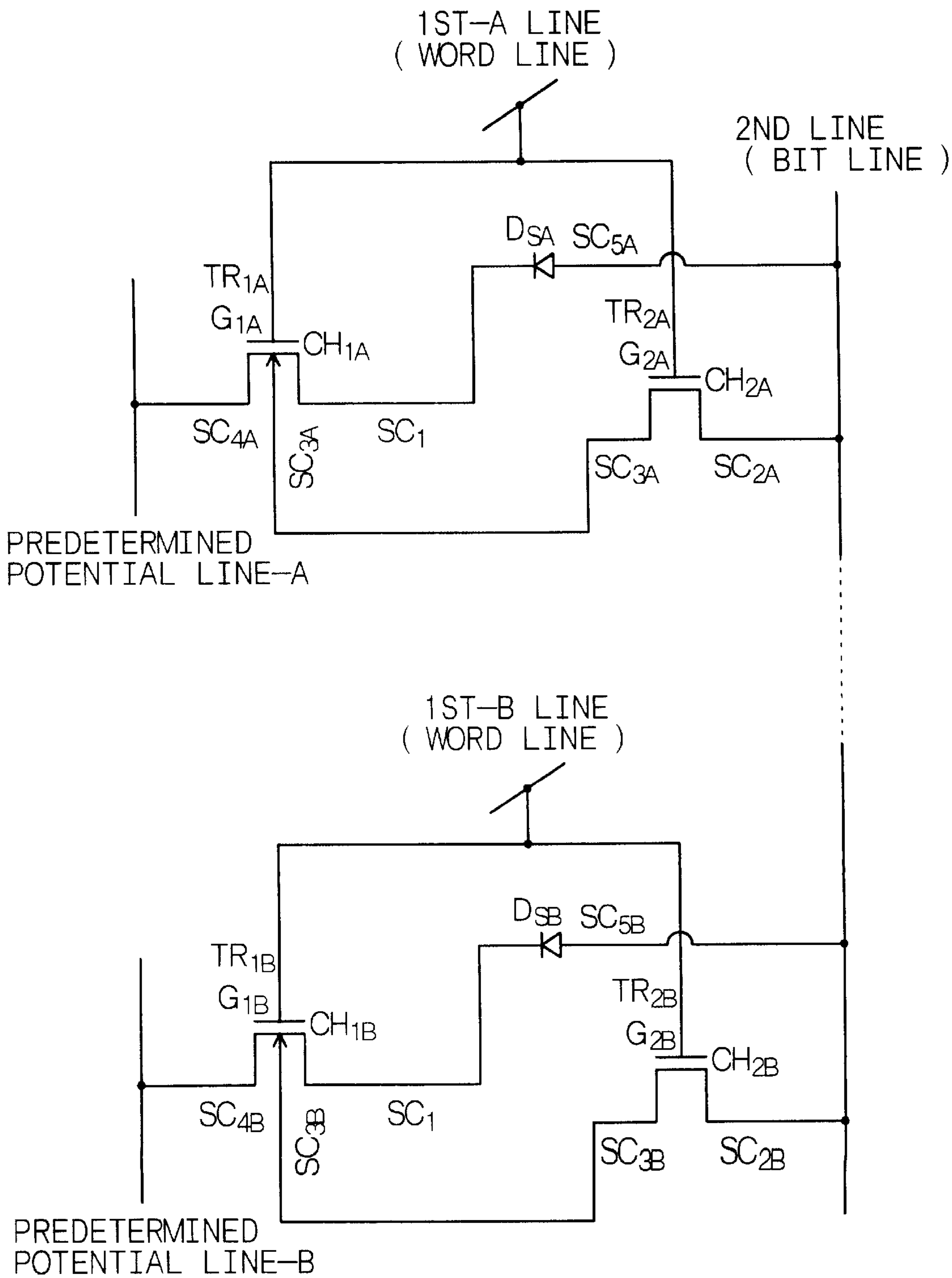

FIG. 149 is a principle drawing of another modification of the semiconductor memory cell in Example 20.

Figure 150:
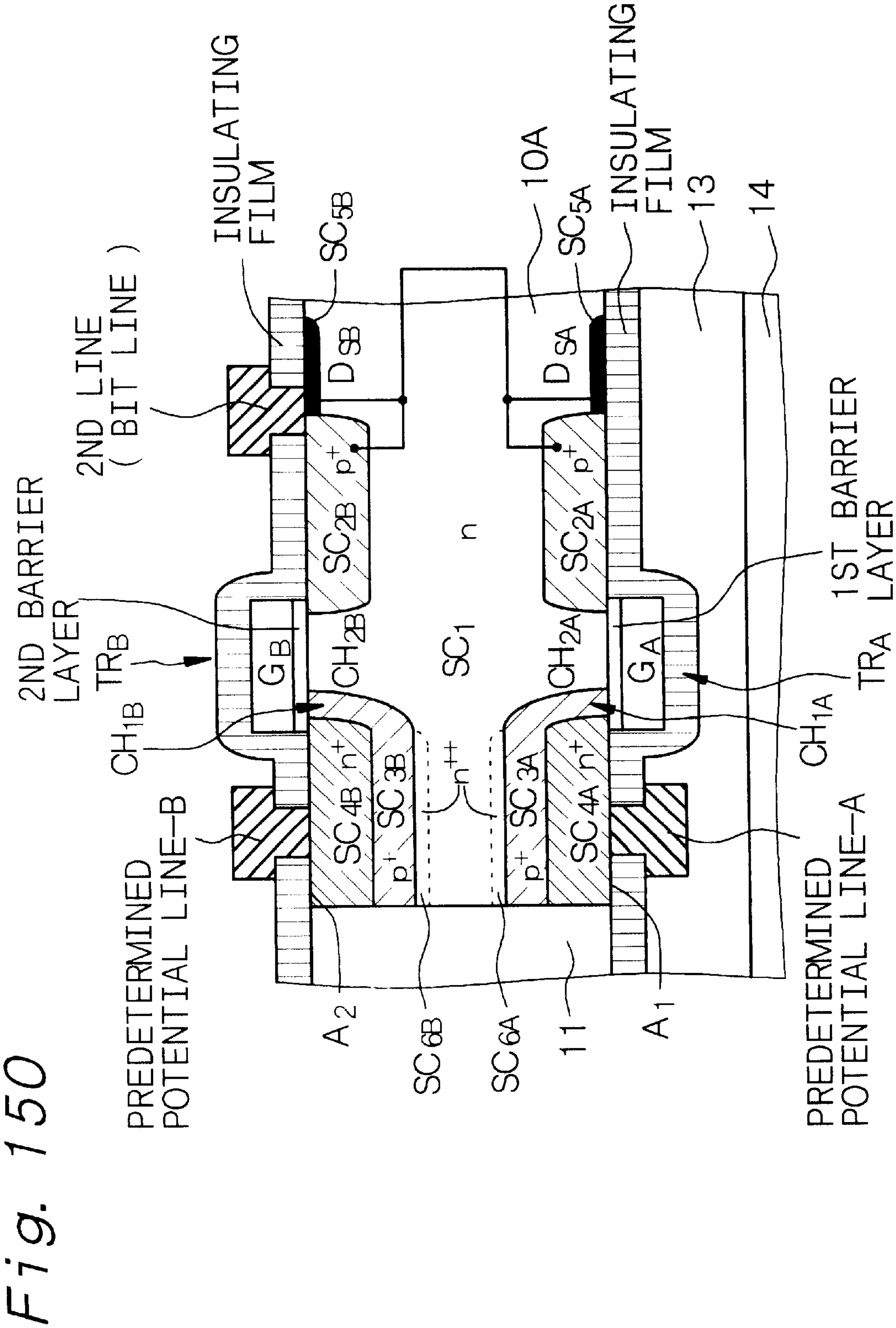

FIG. 150 is a schematic partial cross-sectional view of a modification of the semiconductor memory cell in Example 20.

Figure 151:
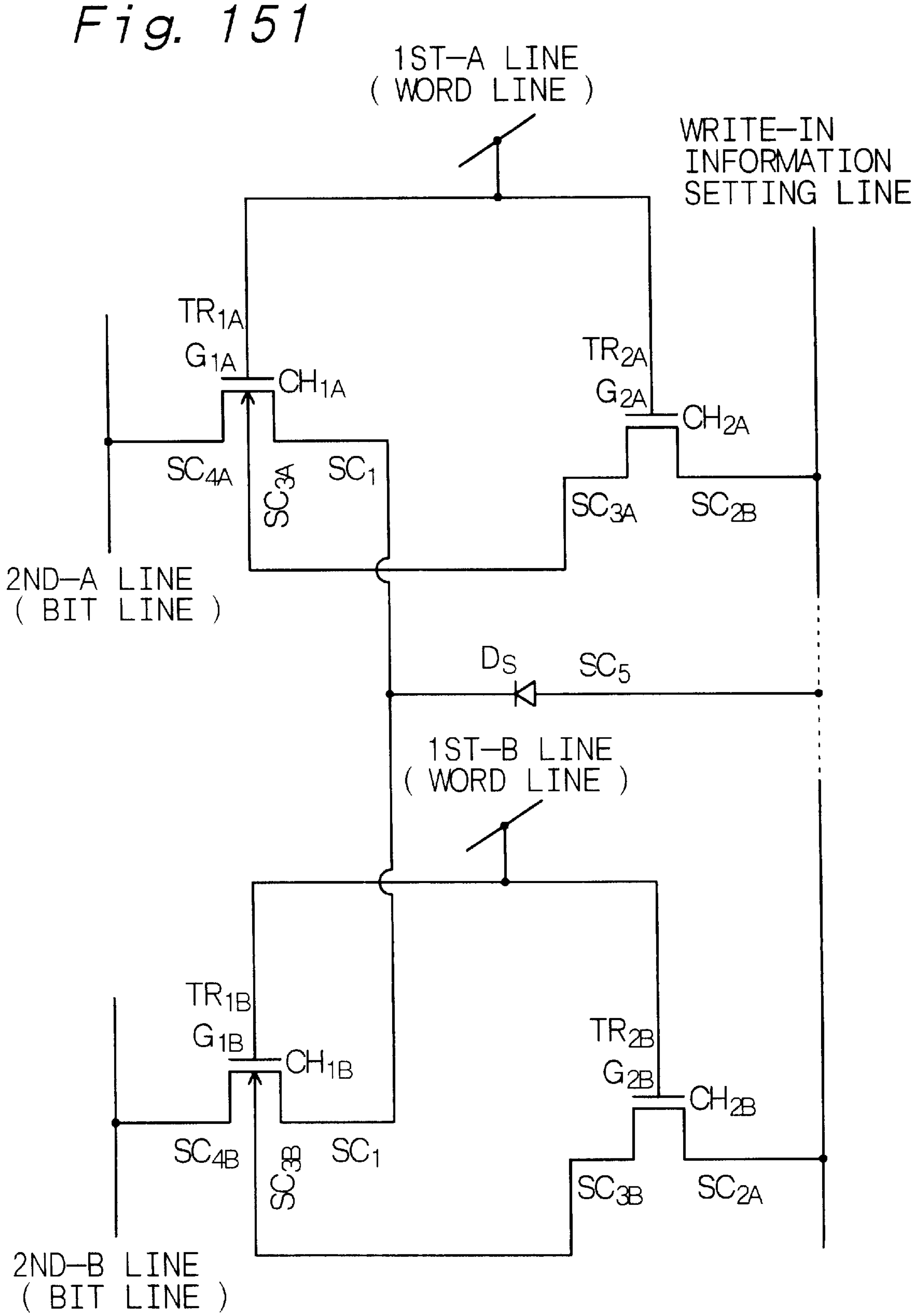

FIG. 151 is a principle drawing of another modification of the semiconductor memory cell in Example 20.

Figure 152:
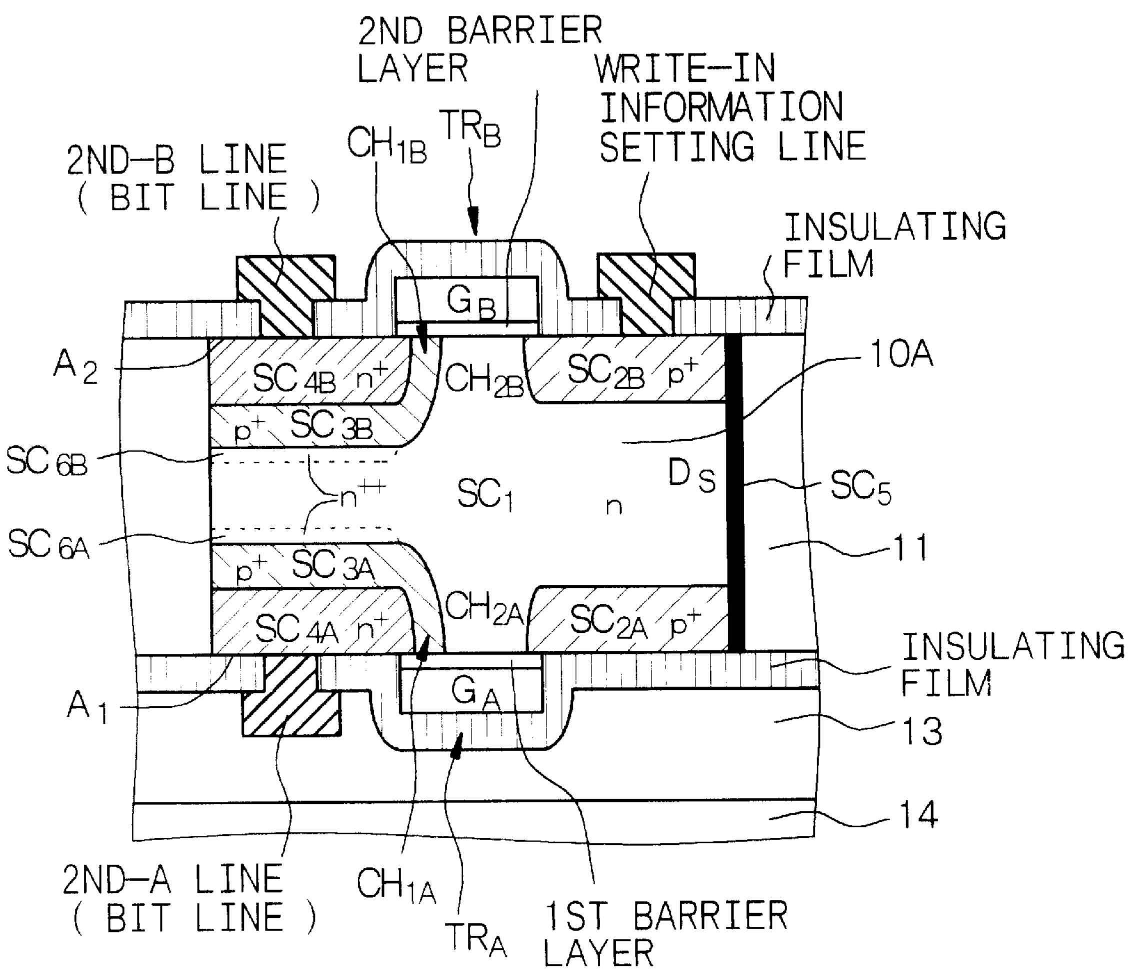

FIG. 152 is a schematic partial cross-sectional view of a modification of the semiconductor memory cell in Example 20.

Figure 153:
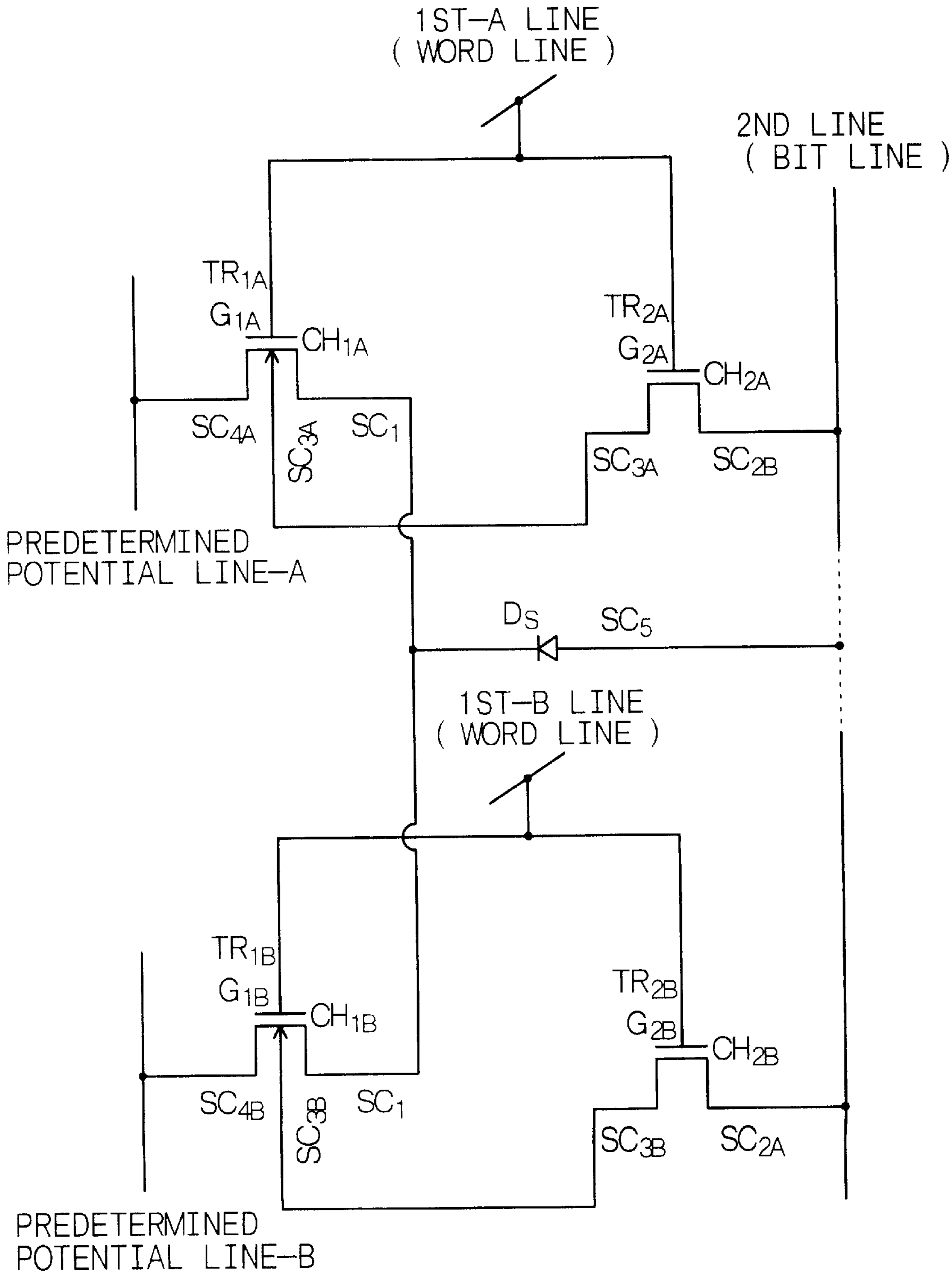

FIG. 153 is a principle drawing of another modification of the semiconductor memory cell in Example 20.

Figure 154:
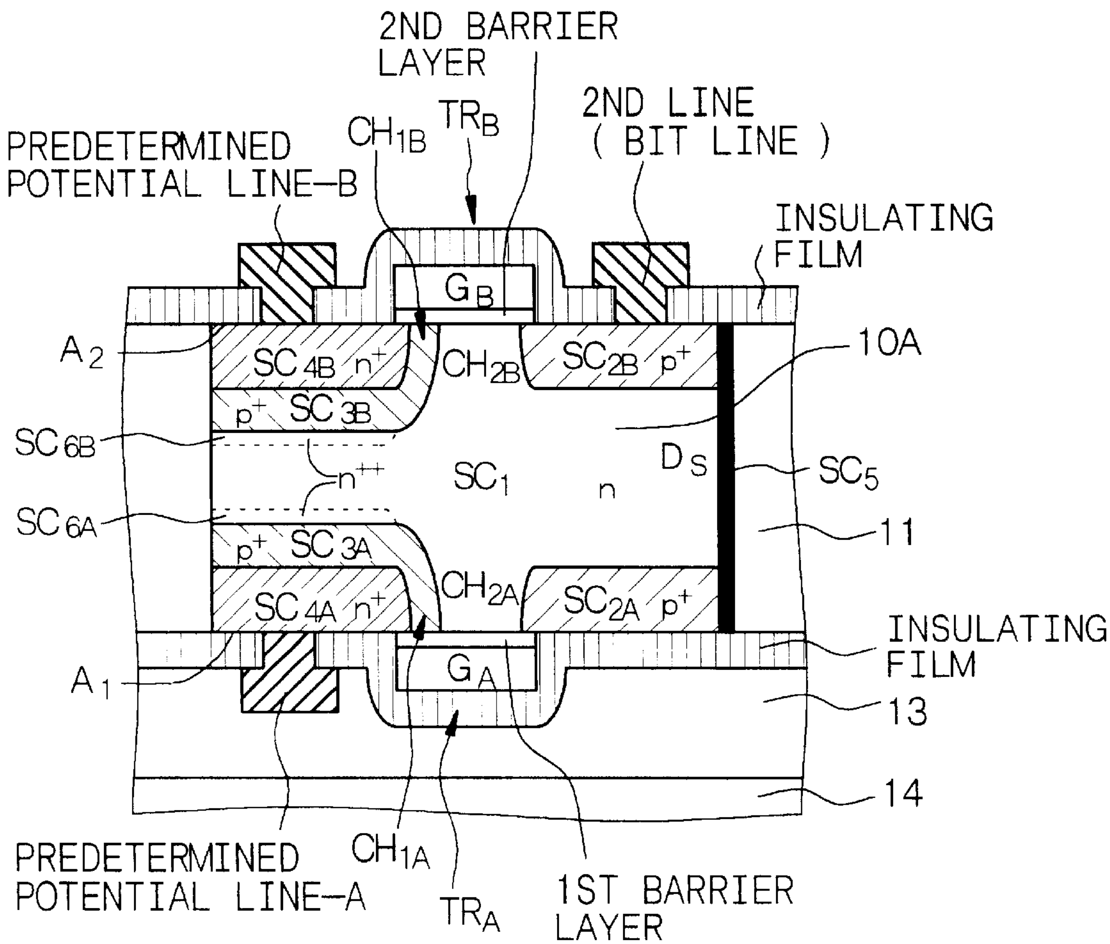

FIG. 154 is a schematic partial cross-sectional view of a modification of the semiconductor memory cell in Example 20.

Figure 155:
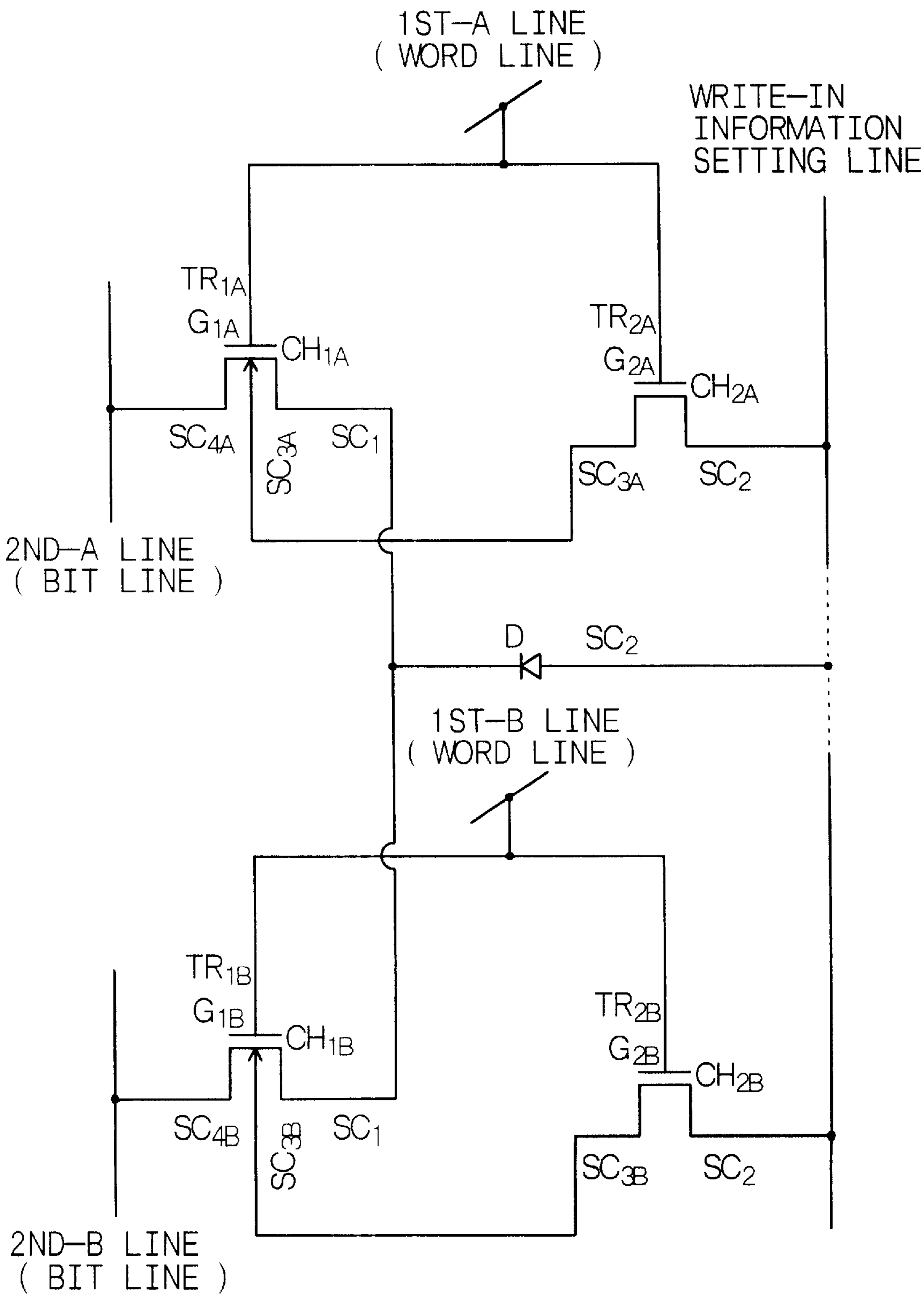

FIG. 155 is a principle drawing of the semiconductor memory cell in Example 21.

Figure 156:
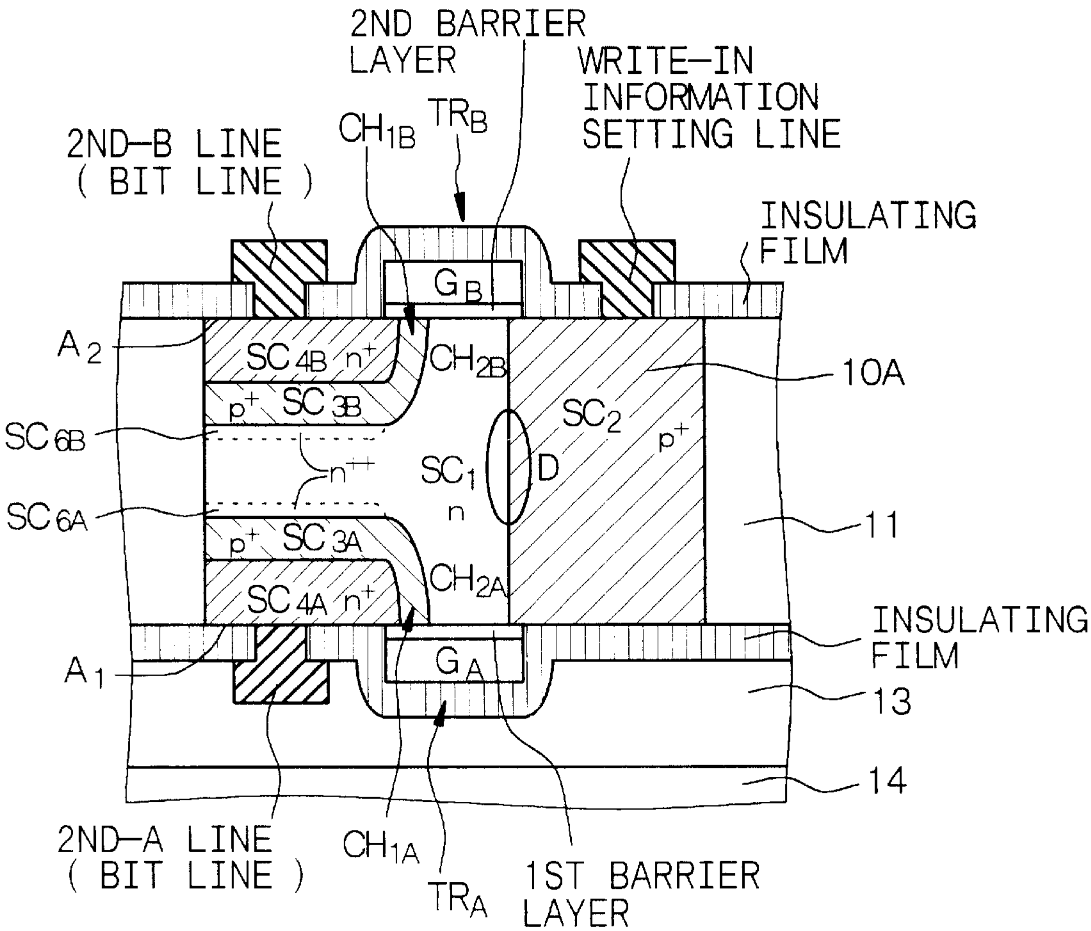

FIG. 156 is a schematic partial cross-sectional view of a semiconductor memory cell in Example 21.

Figure 157:
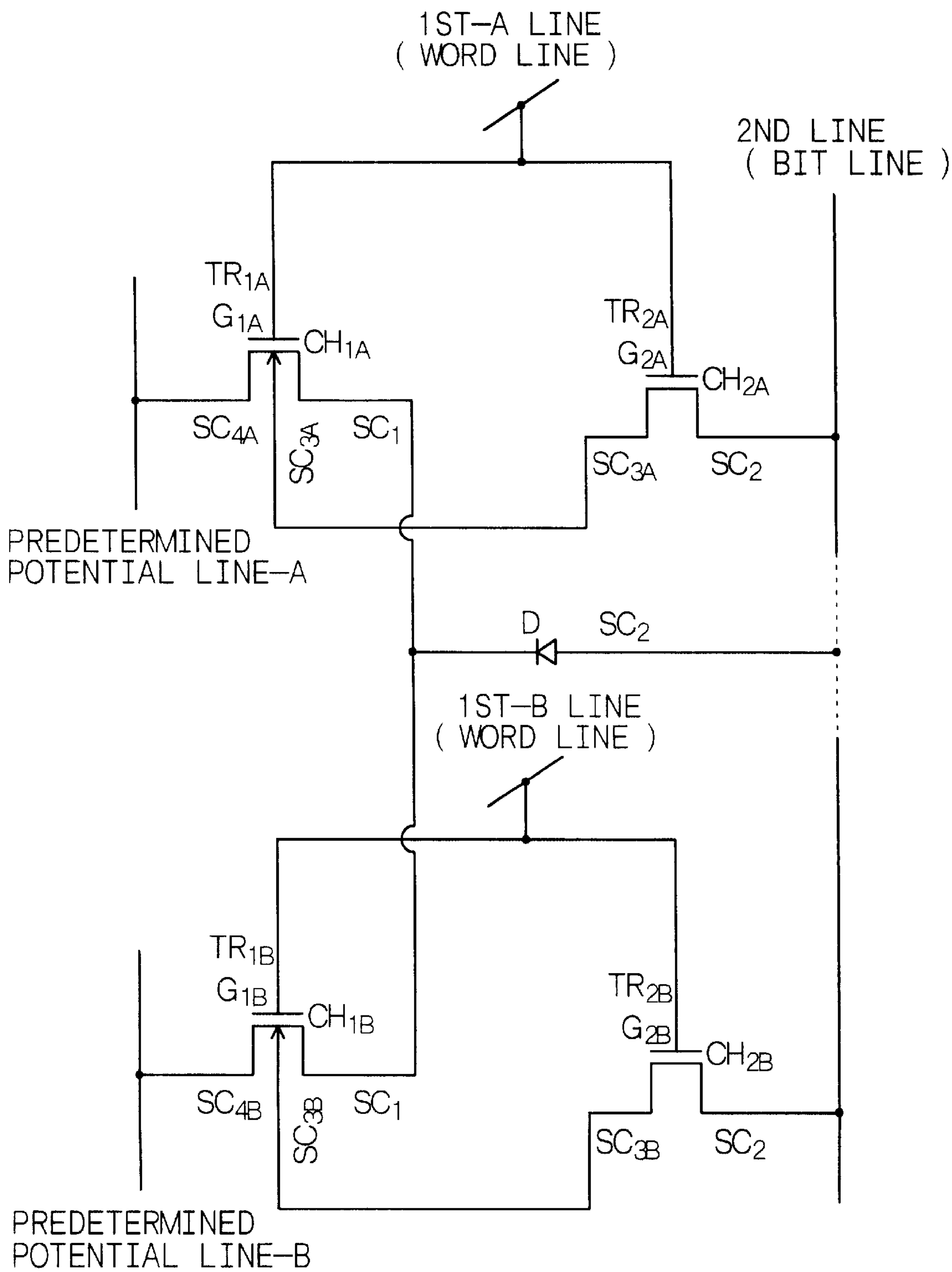

FIG. 157 is a principle drawing of a modification of the semiconductor memory cell in Example 21.

Figure 158:
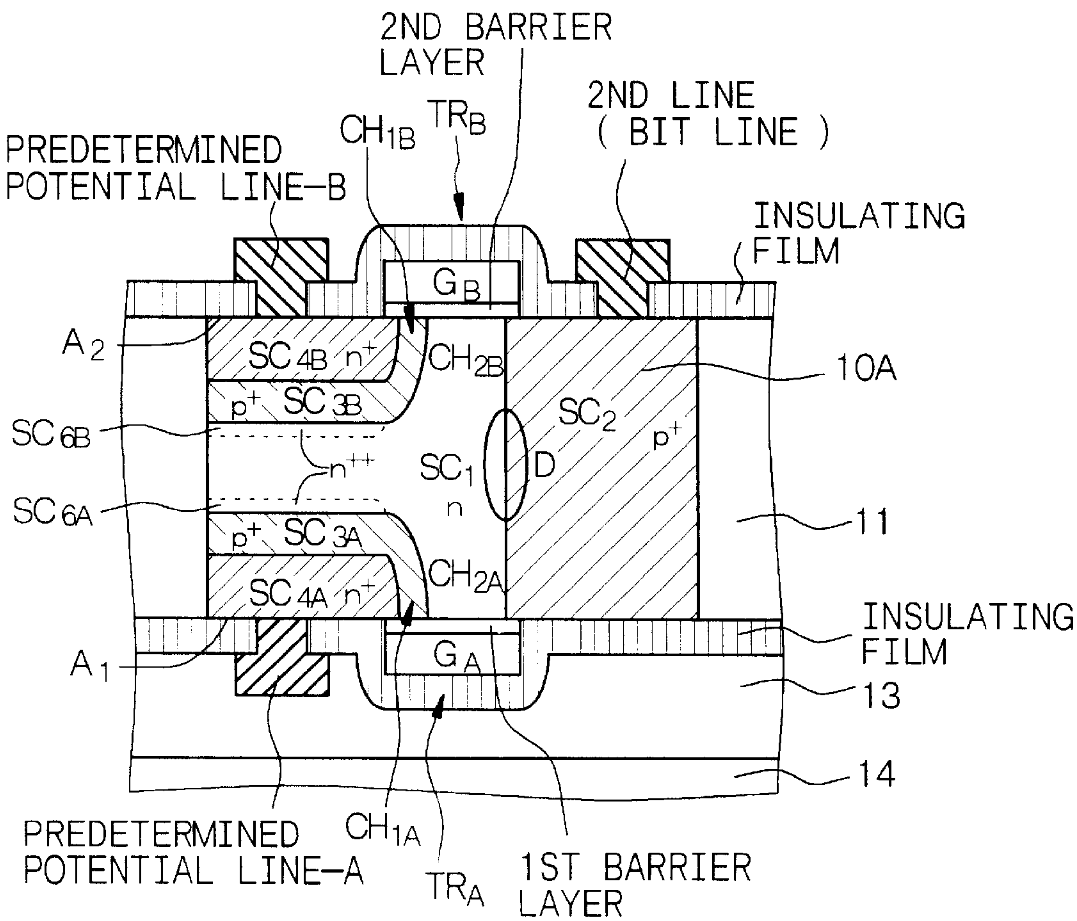

FIG. 158 is a schematic partial cross-sectional view of a modification of the semiconductor memory cell in Example 21.

Figure 159A:
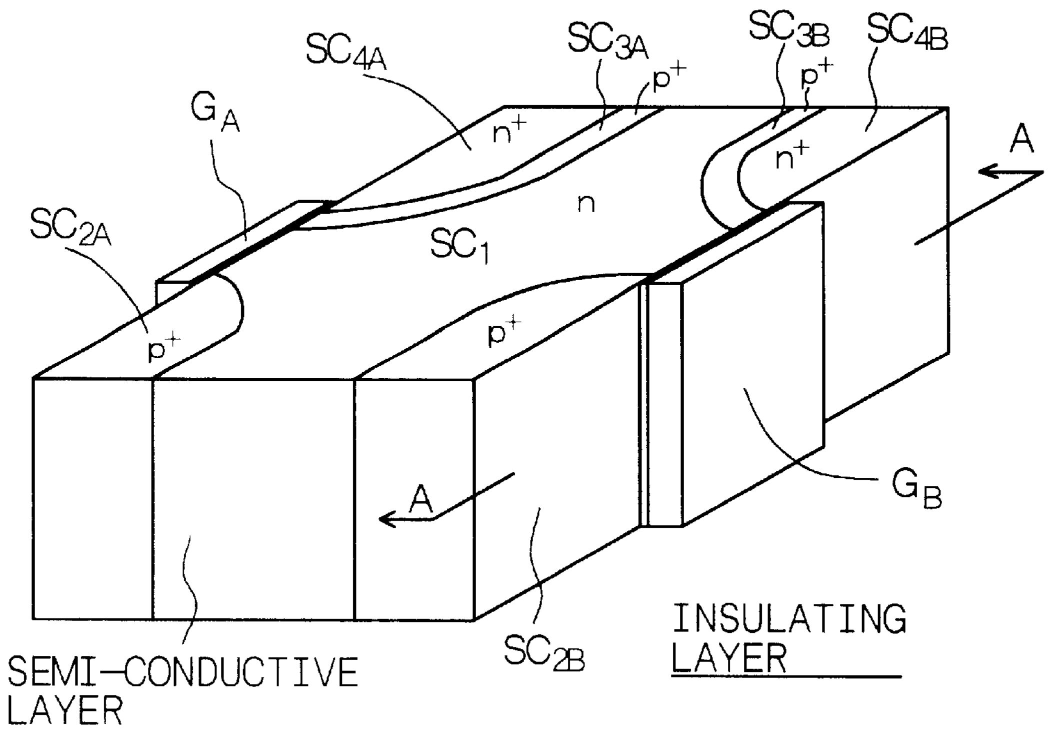
Figure 159B:
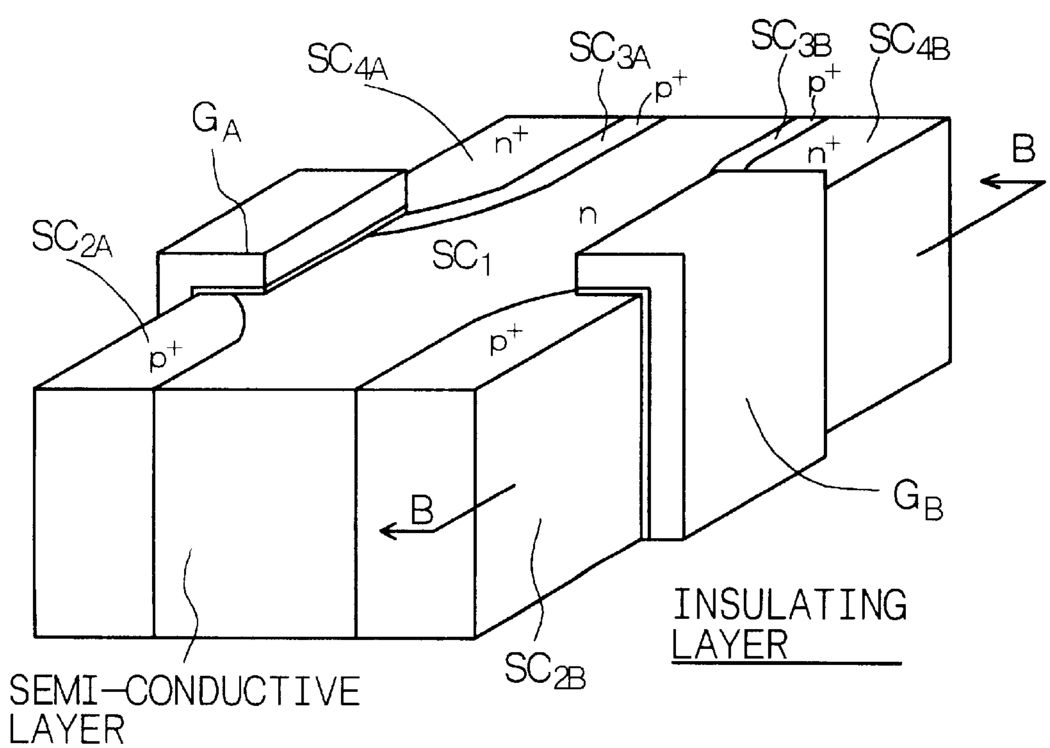

FIGS. 159A and 159B are schematic perspective views of side-gate-type semiconductor memory cells to which the semiconductor memory cell explained in Example 18 is applied.

Figure 160:
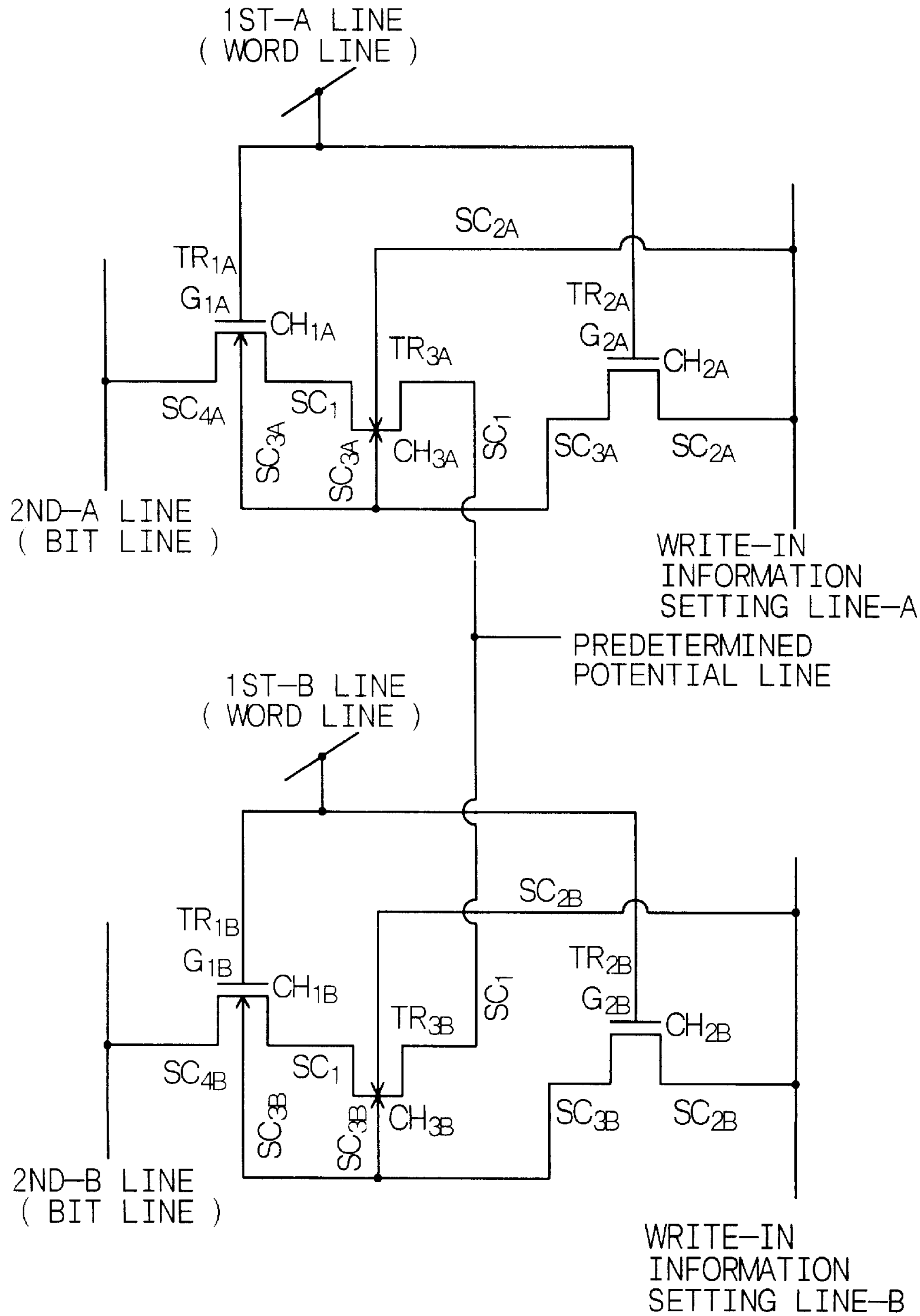

FIG. 160 is a principle drawing of the semiconductor memory cell in Example 22.

Figure 161:
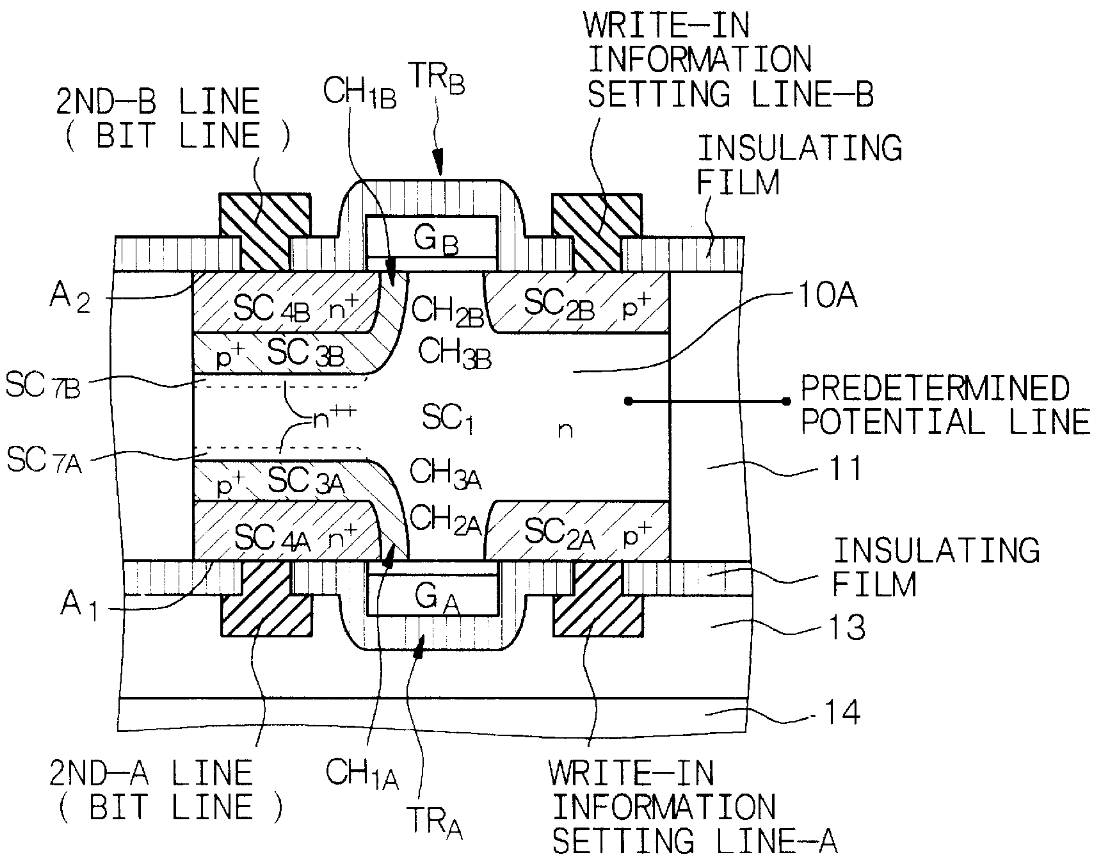

FIG. 161 is a schematic partial cross-sectional view of a semiconductor memory cell in Example 22 shown in FIG. 160.

Figure 162:
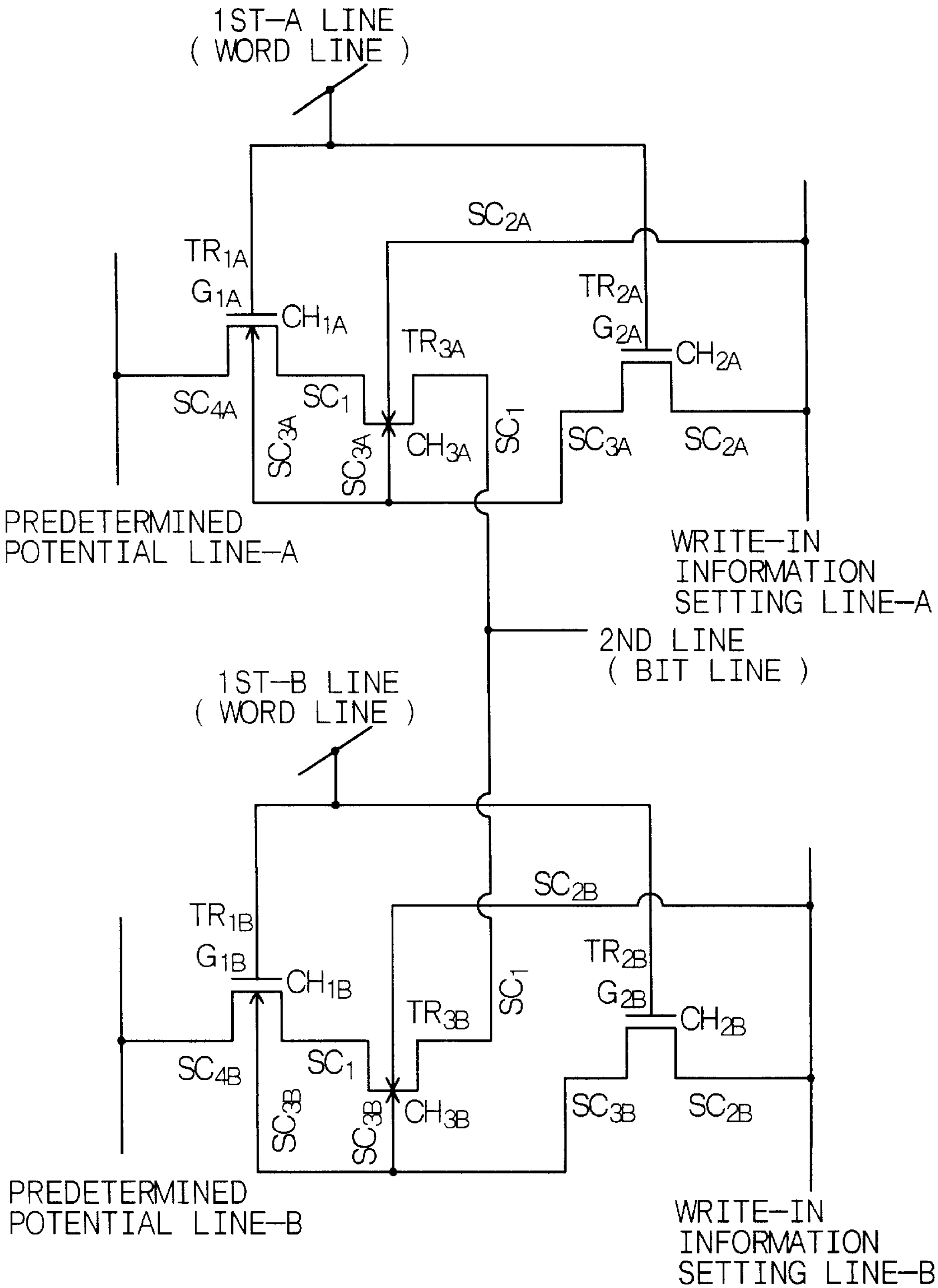

FIG. 162 is a principle drawing of a modification of the semiconductor memory cell in Example 22.

Figure 163:
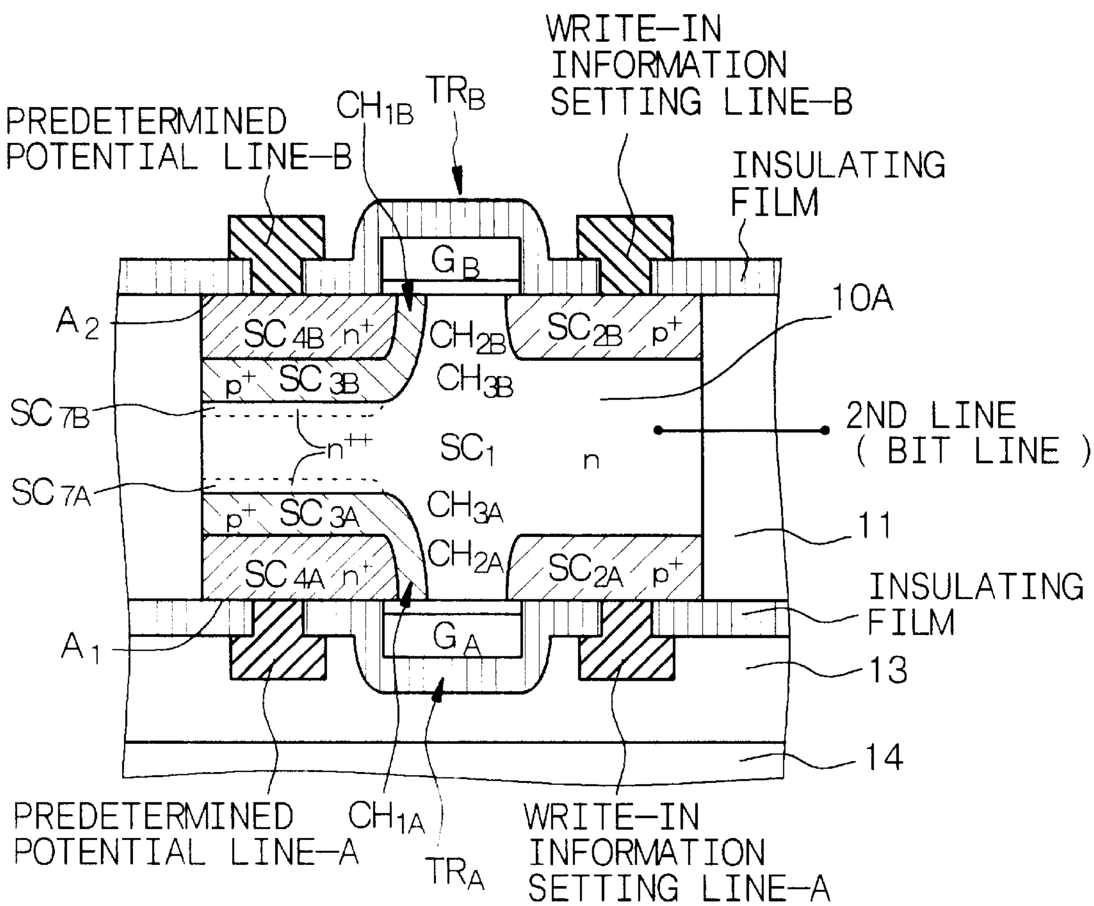

FIG. 163 is a schematic partial cross-sectional view of a modification of the semiconductor memory cell in Example 22 shown in FIG. 162.

Figure 164:
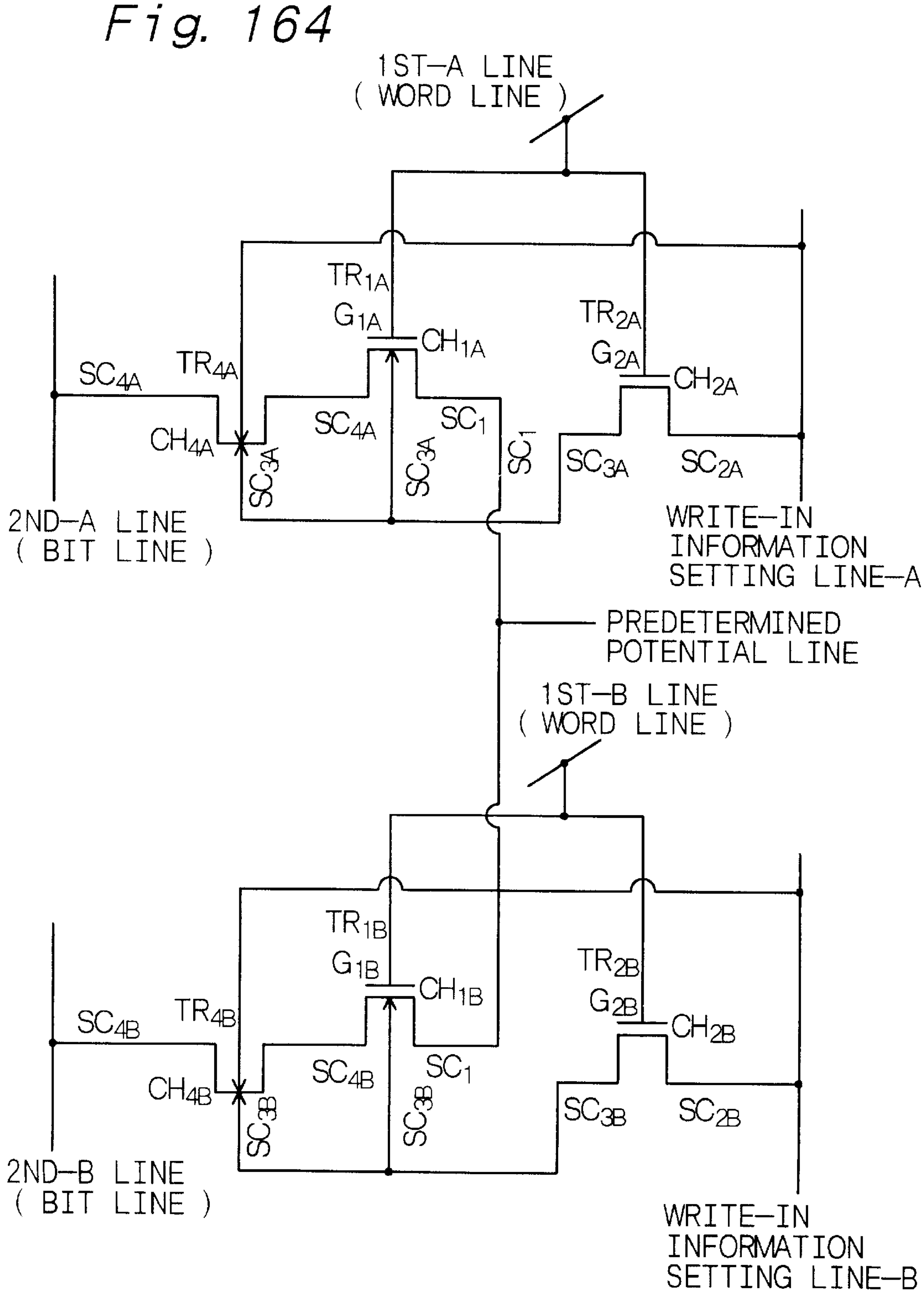

FIG. 164 is a principle drawing of the semiconductor memory cell in Example 23.

Figure 165:
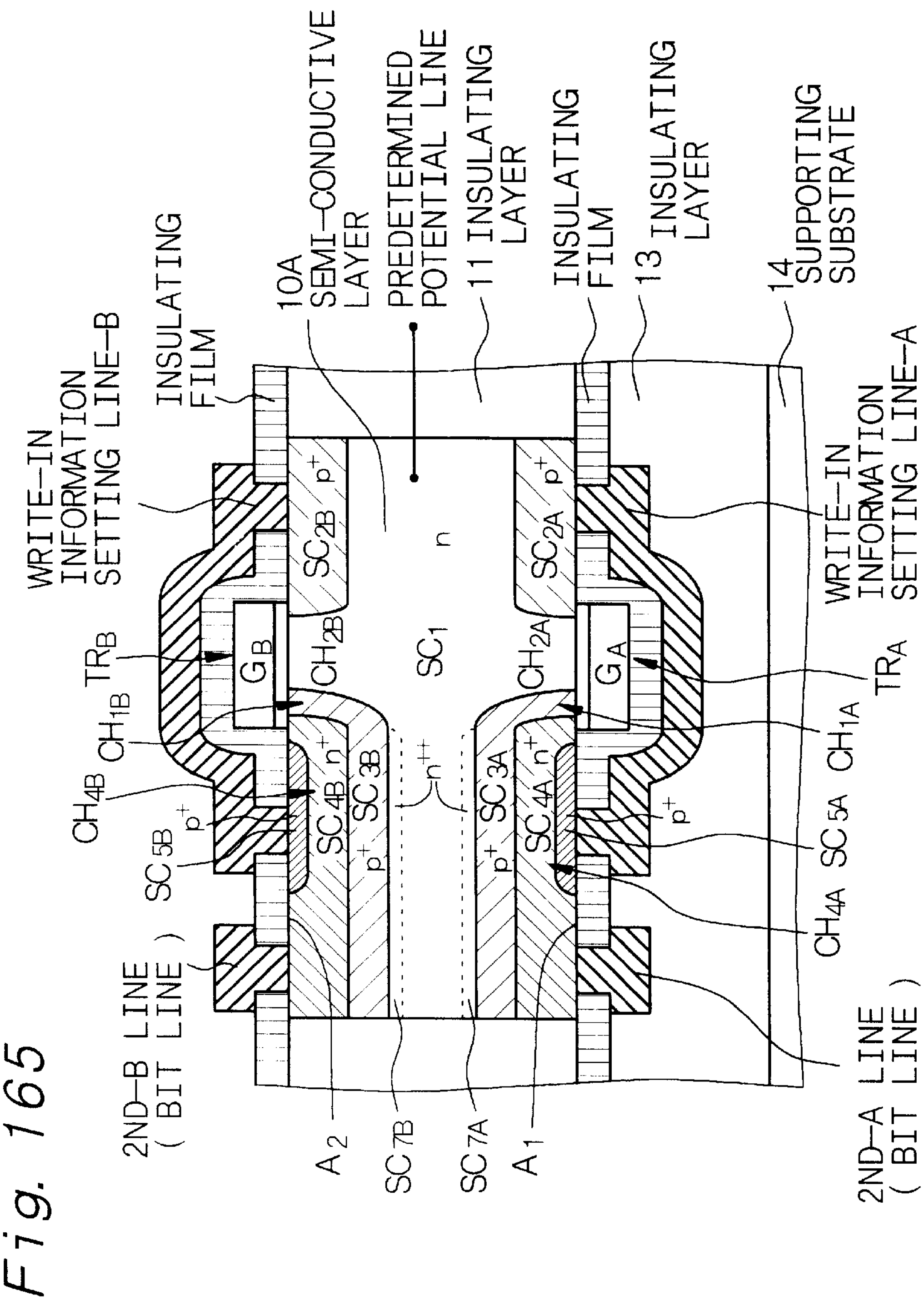

FIG. 165 is a schematic partial cross-sectional view of a semiconductor memory cell in Example 23 shown in FIG. 164.

Figure 166:
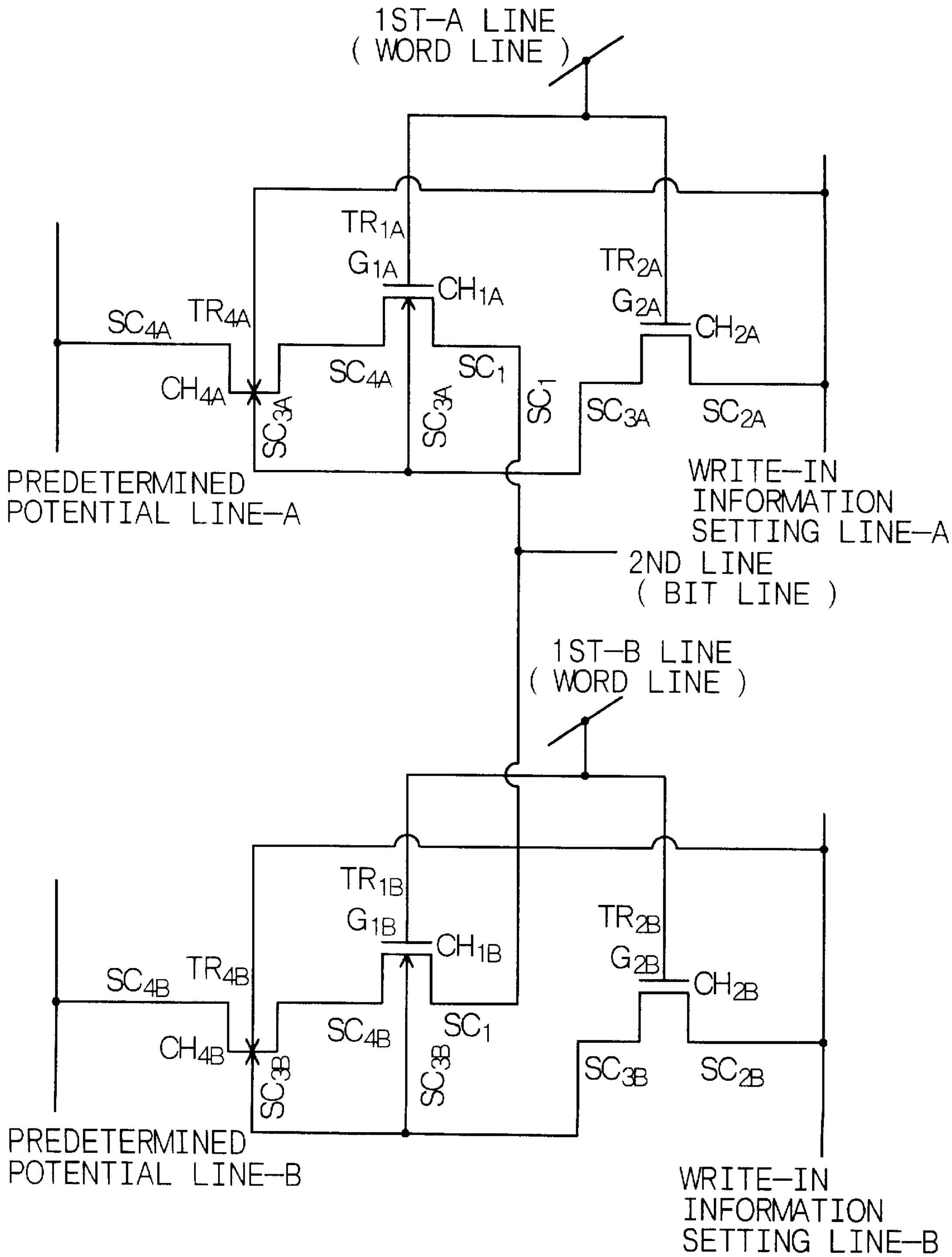

FIG. 166 is a principle drawing of a modification of the semiconductor memory cell in Example 23.

Figure 167:
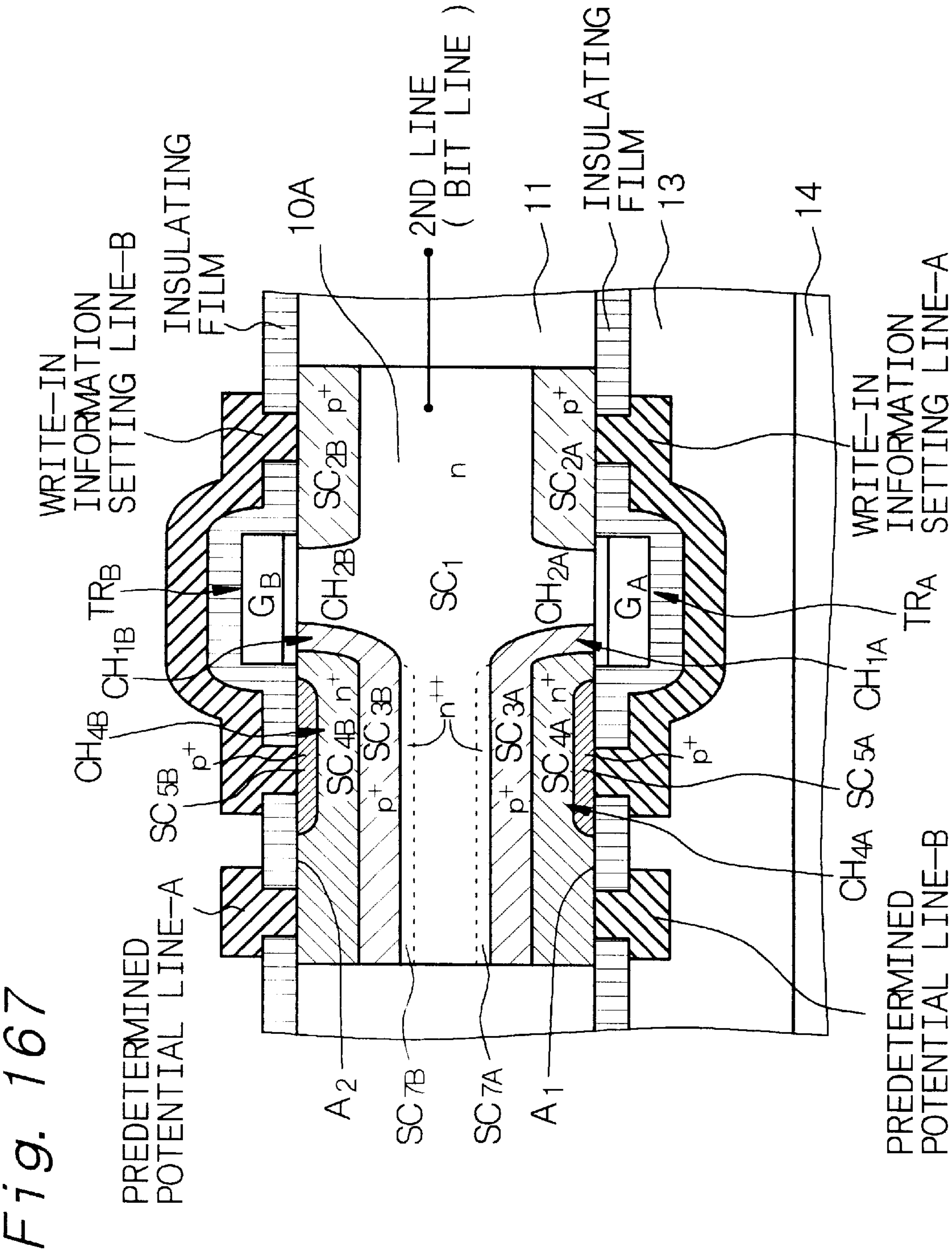

FIG. 167 is a schematic partial cross-sectional view of a modification of the semiconductor memory cell in Example 23 shown in FIG. 166.

Figure 168:
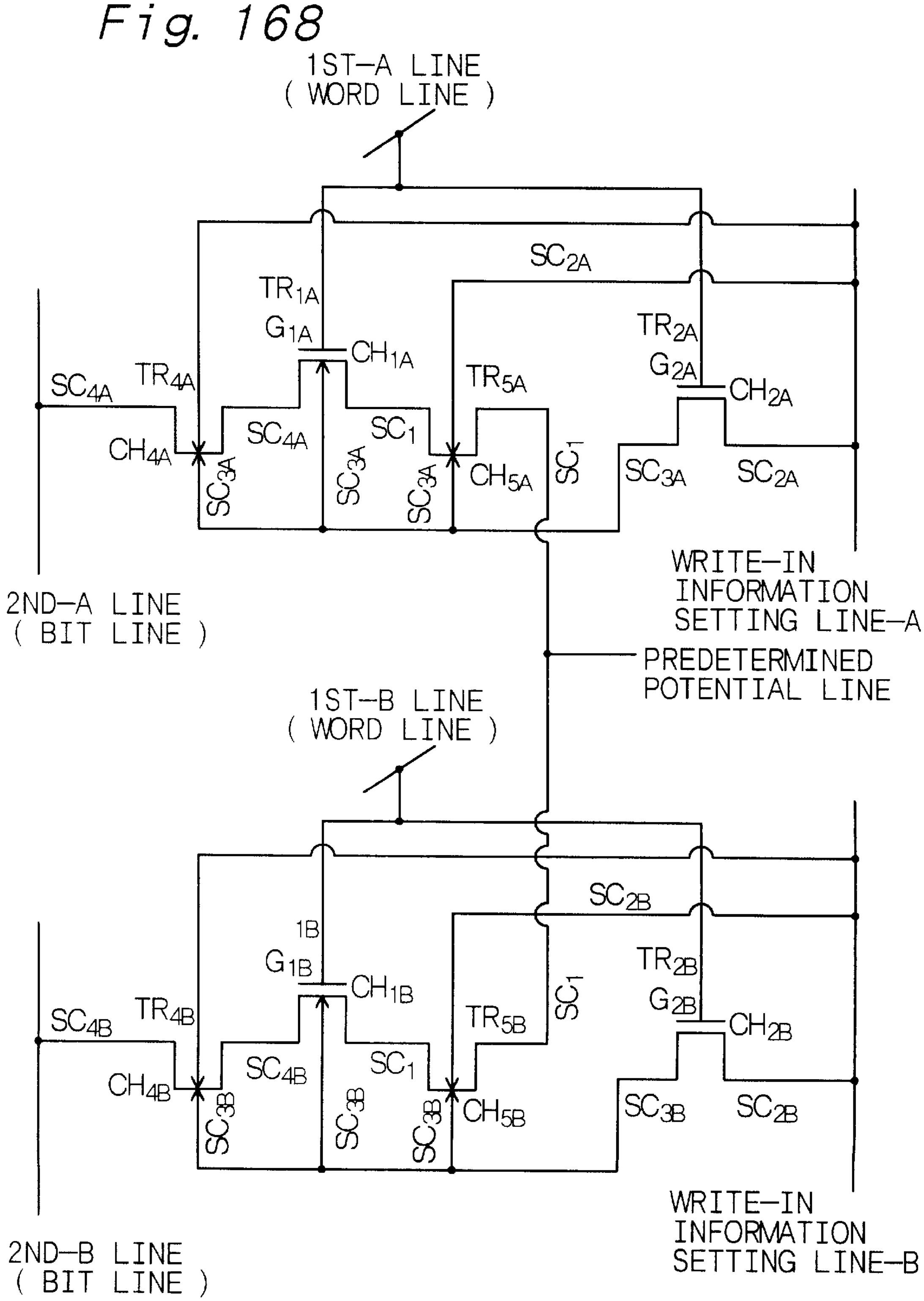

FIG. 168 is a principle drawing of a modification of the semiconductor memory cell in Example 23.

Figure 169:
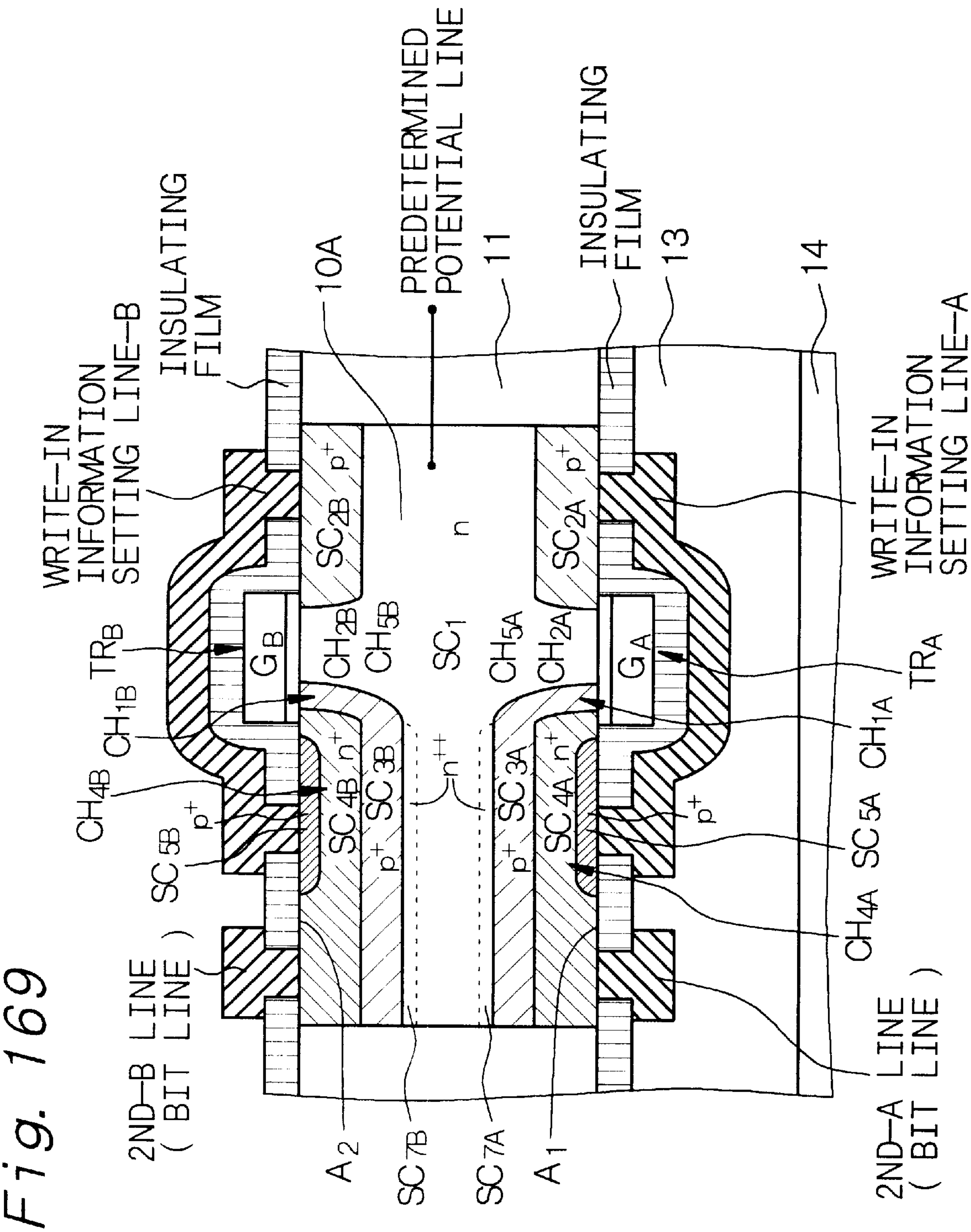

FIG. 169 is a schematic partial cross-sectional view of a modification of the semiconductor memory cell in Example 23 shown in FIG. 168.

Figure 170:
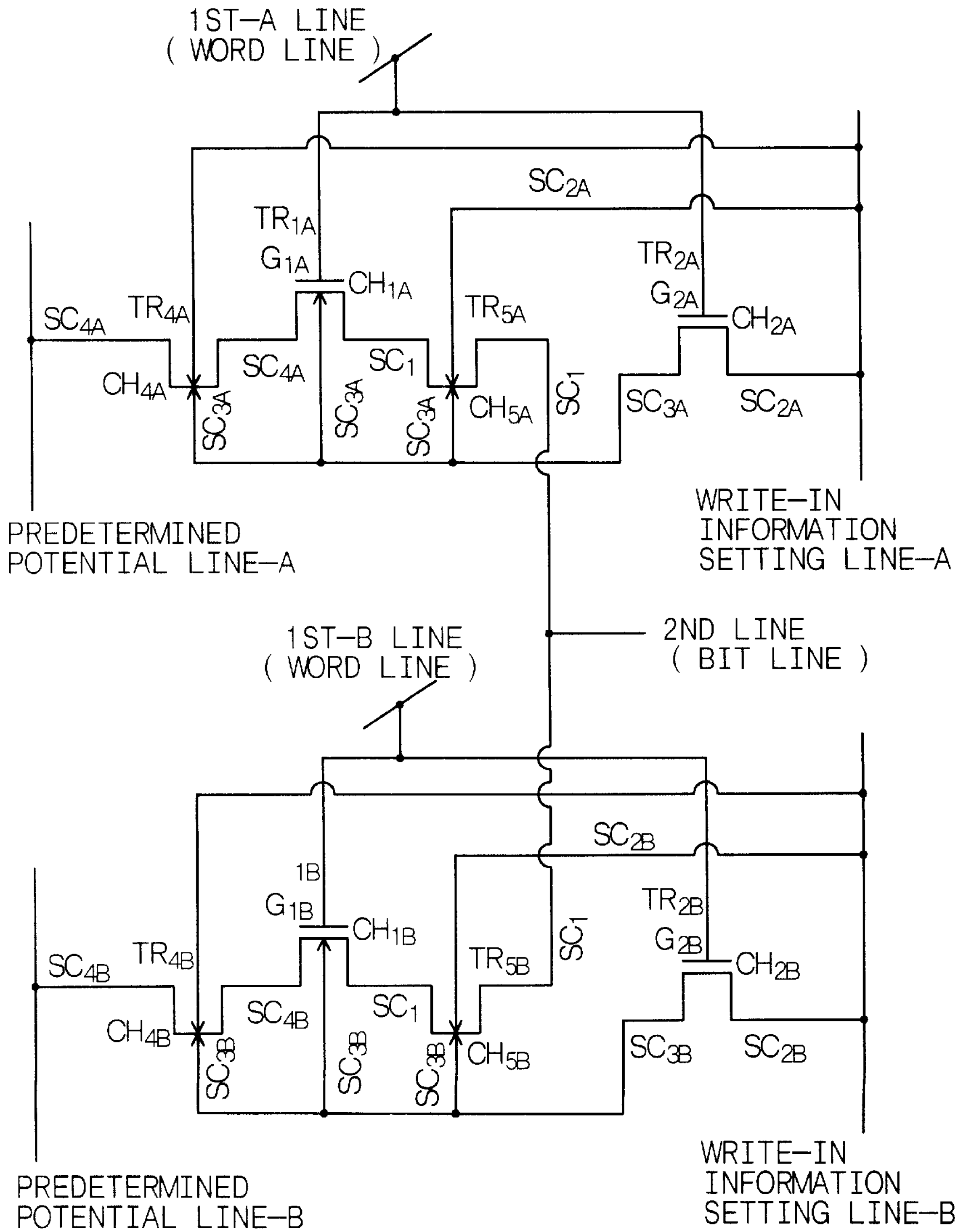

FIG. 170 is a principle drawing of a modification of the semiconductor memory cell in Example 23.

Figure 171:
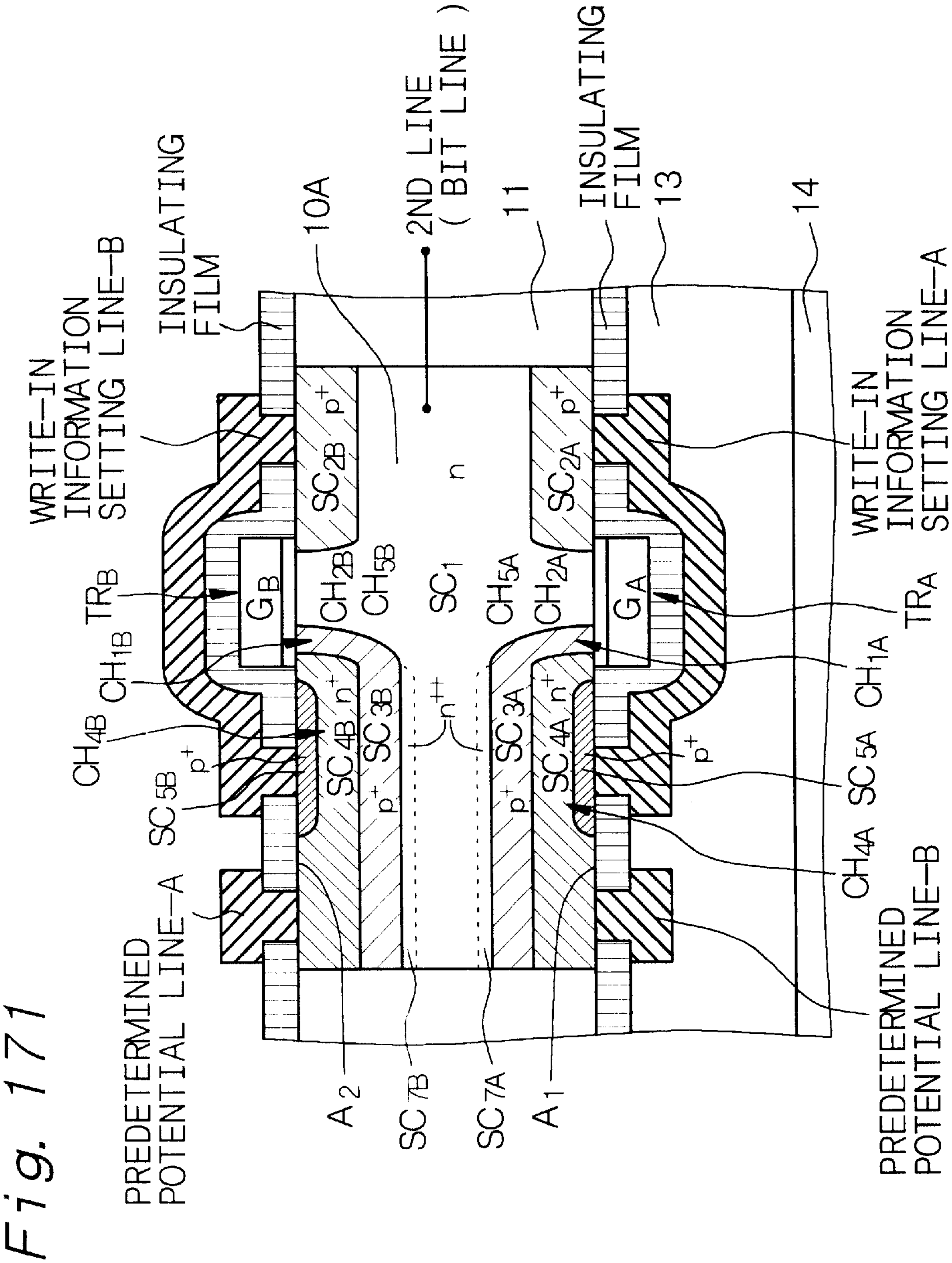

FIG. 171 is a schematic partial cross-sectional view of a modification of the semiconductor memory cell in Example 23 shown in FIG. 170.

Figure 172:
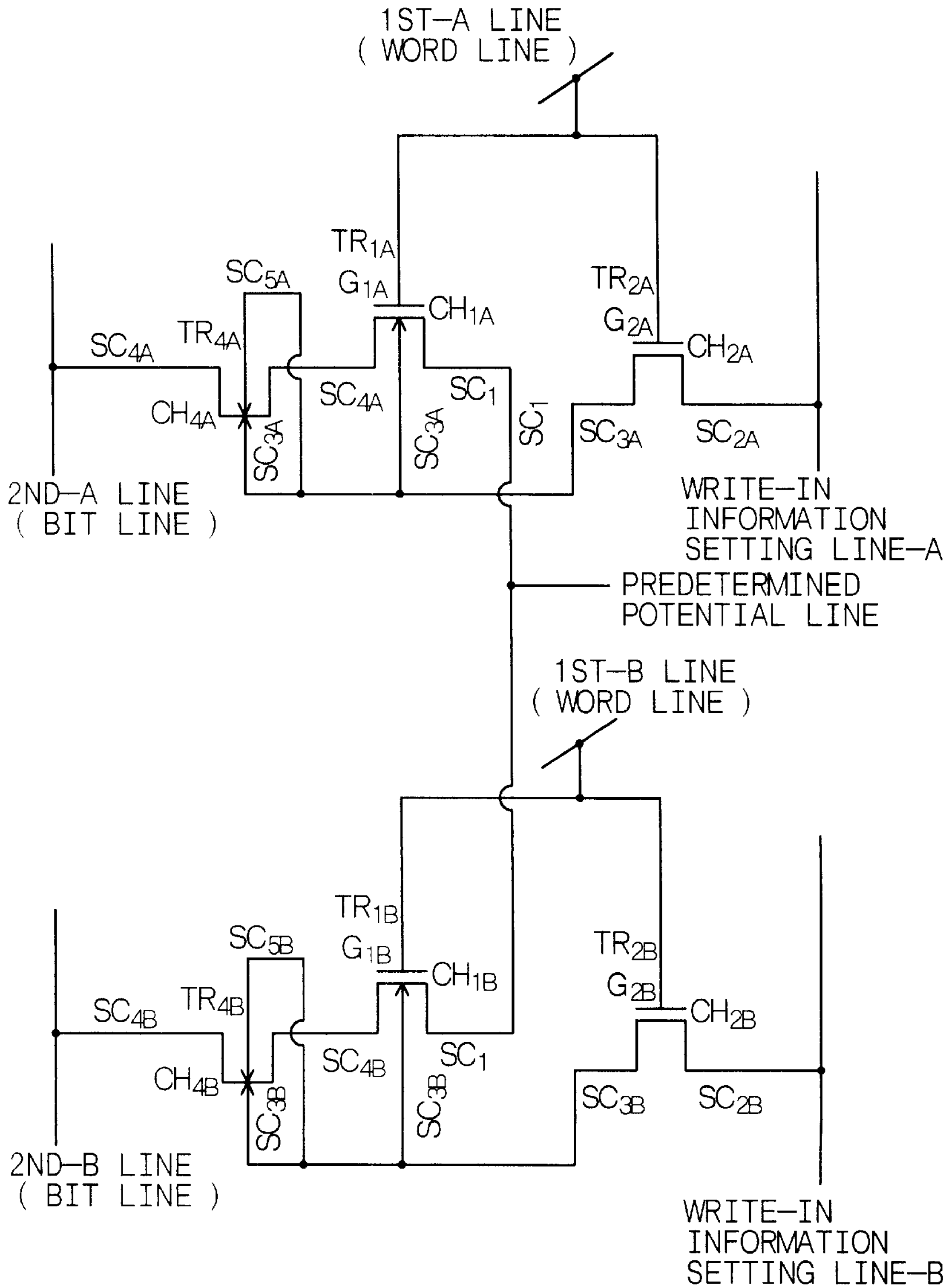

FIG. 172 is a principle drawing of a modification of the semiconductor memory cell in Example 23.

Figure 173:
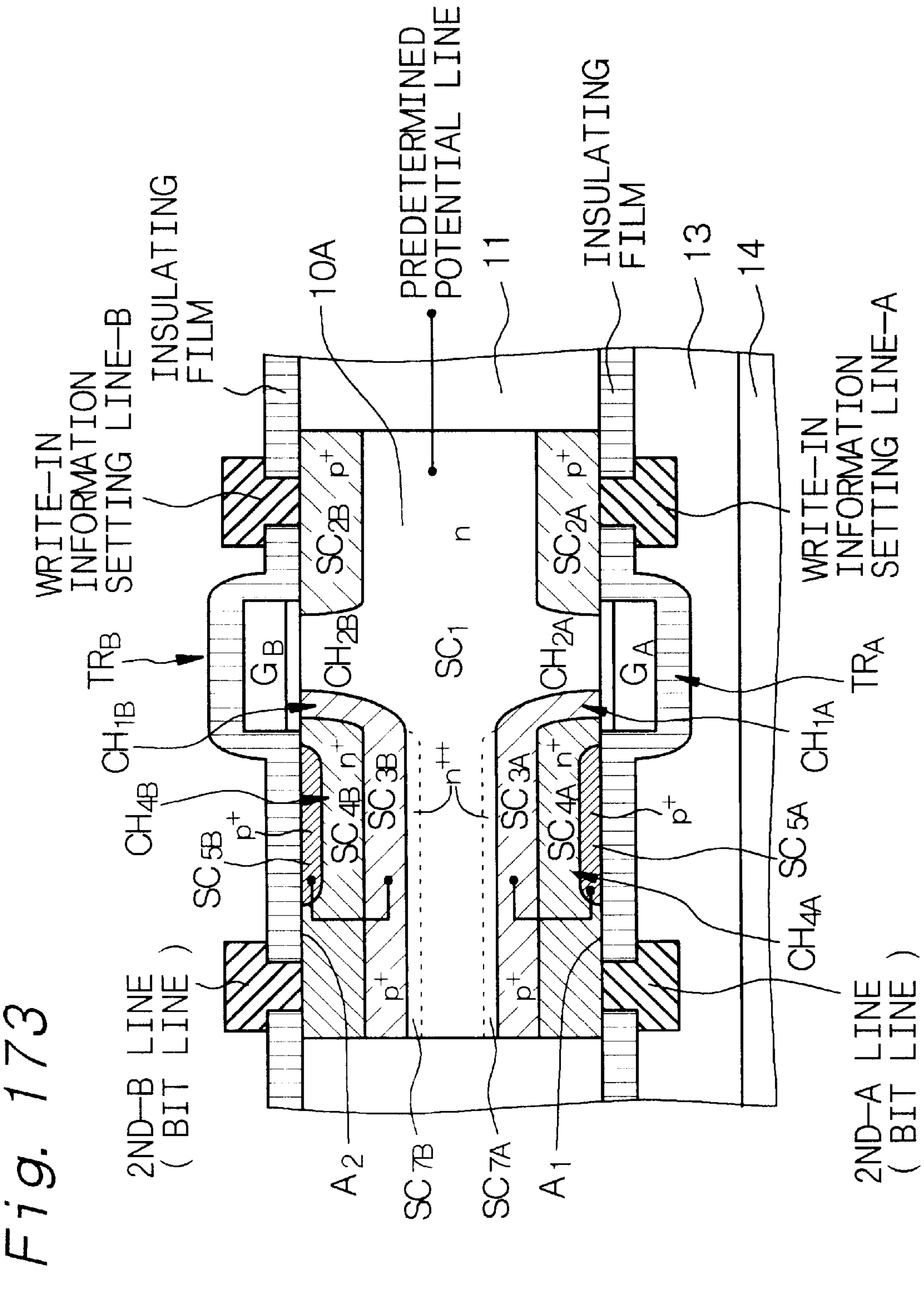

FIG. 173 is a schematic partial cross-sectional view of a modification of the semiconductor memory cell in Example 23 shown in FIG. 172.

Figures 174A, 174B:
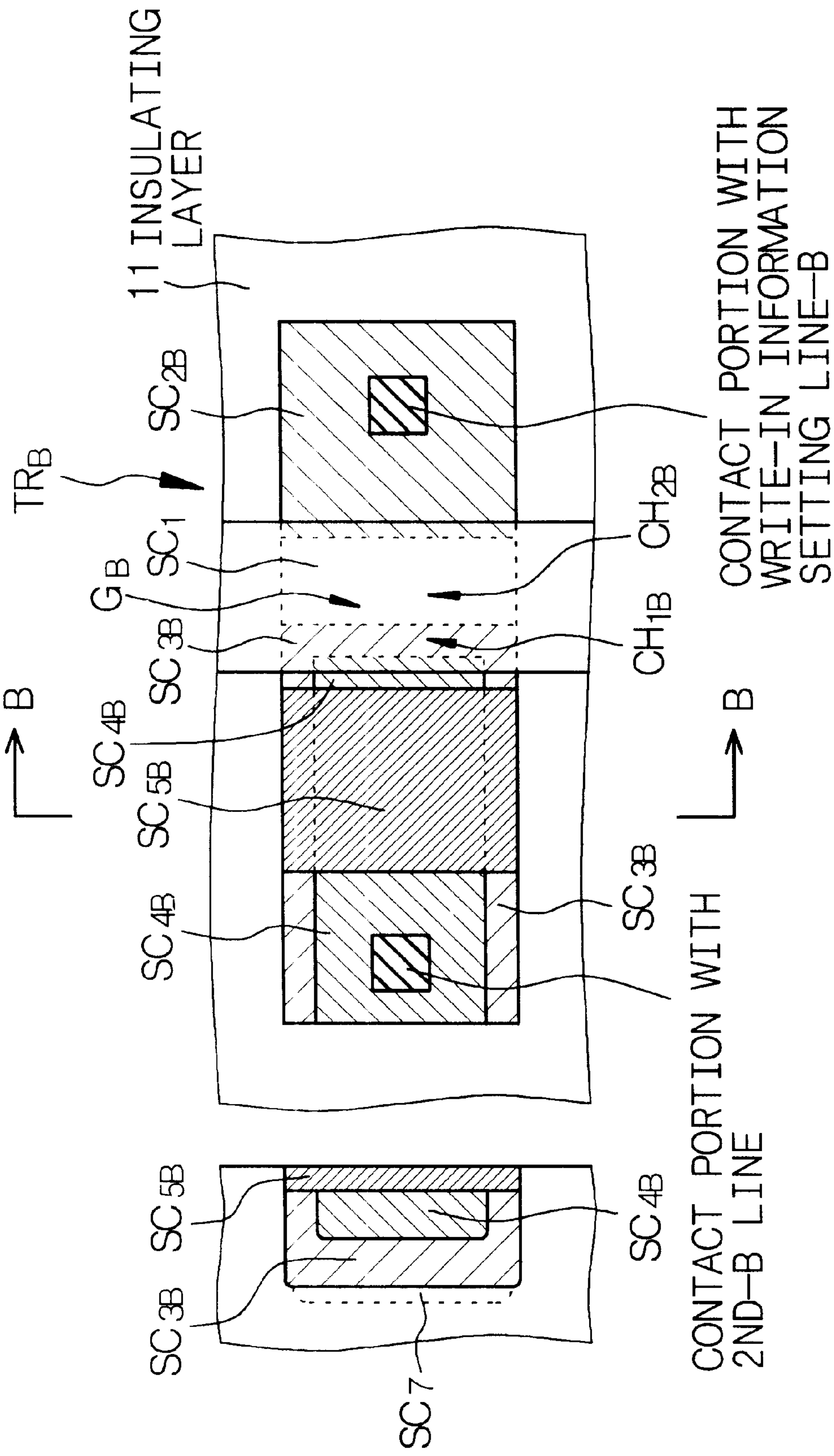

FIGS. 174A and 174B are schematic arrangements of a gate portion, etc., of a modification of the semiconductor memory cell in Example 23 shown in FIG. 172.

Figure 175:
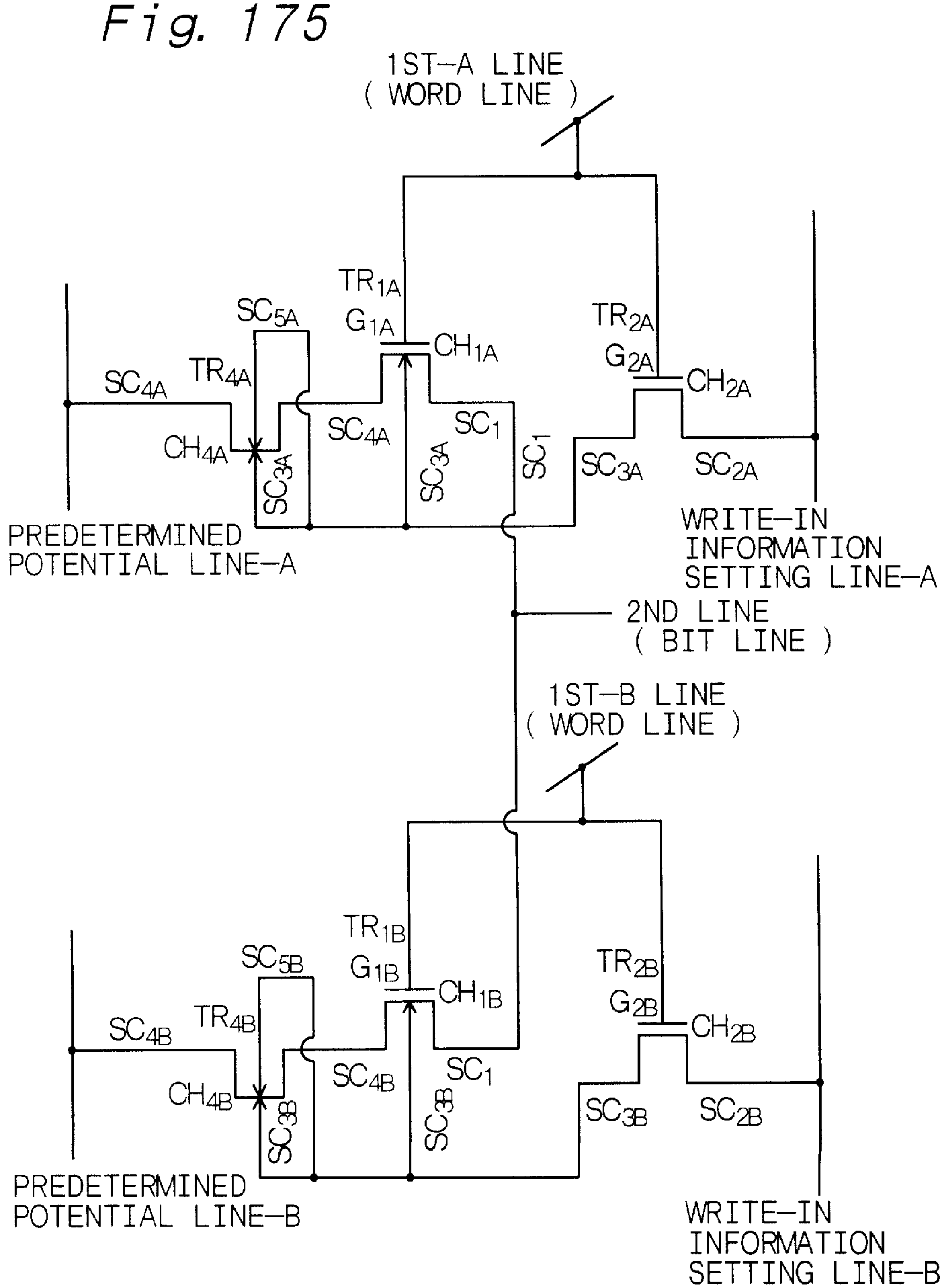

FIG. 175 is a principle drawing of a modification of the semiconductor memory cell in Example 23.

Figure 176:
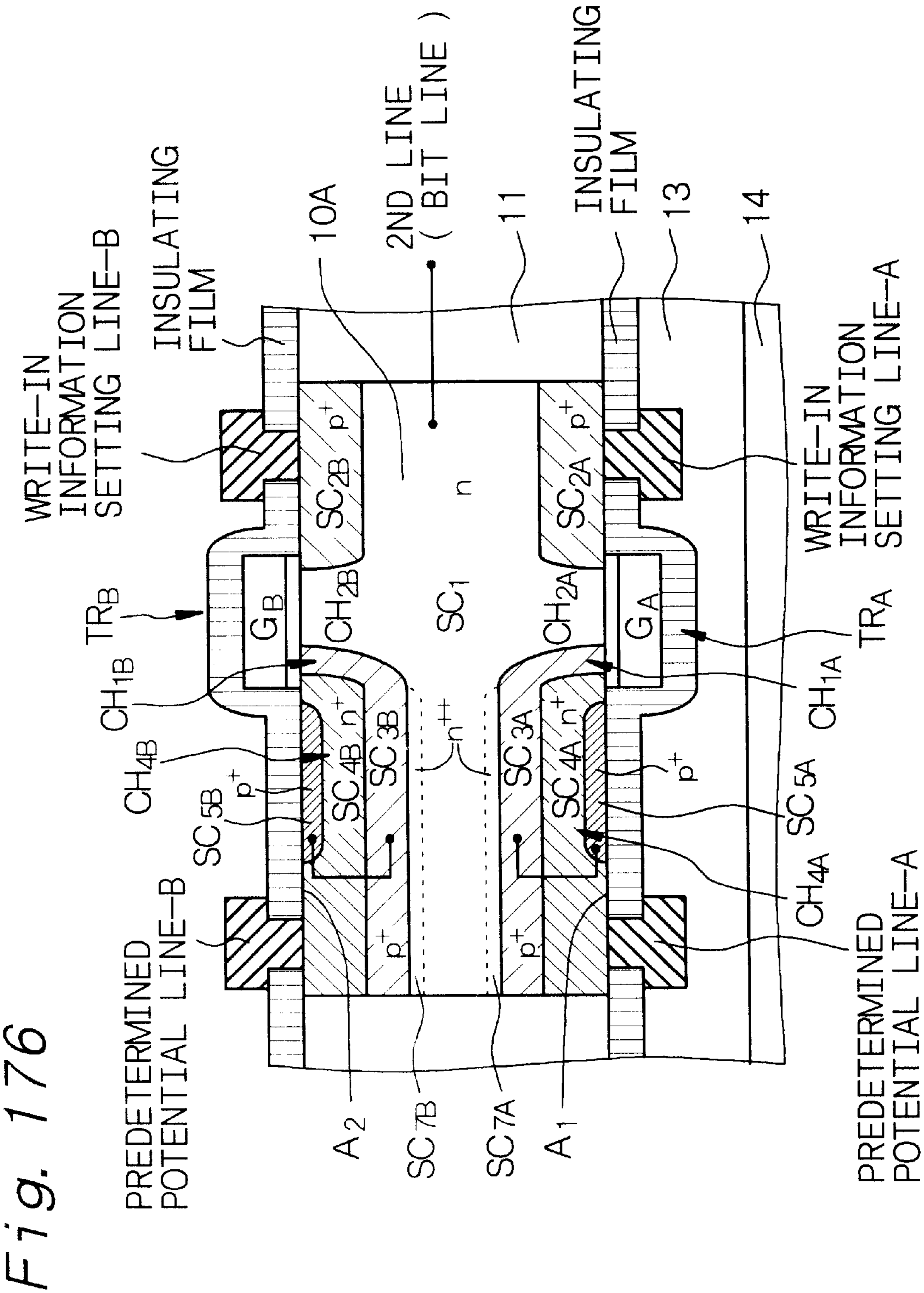

FIG. 176 is a schematic partial cross-sectional view of a modification of the semiconductor memory cell in Example 23 shown in FIG. 175.

Figure 177:
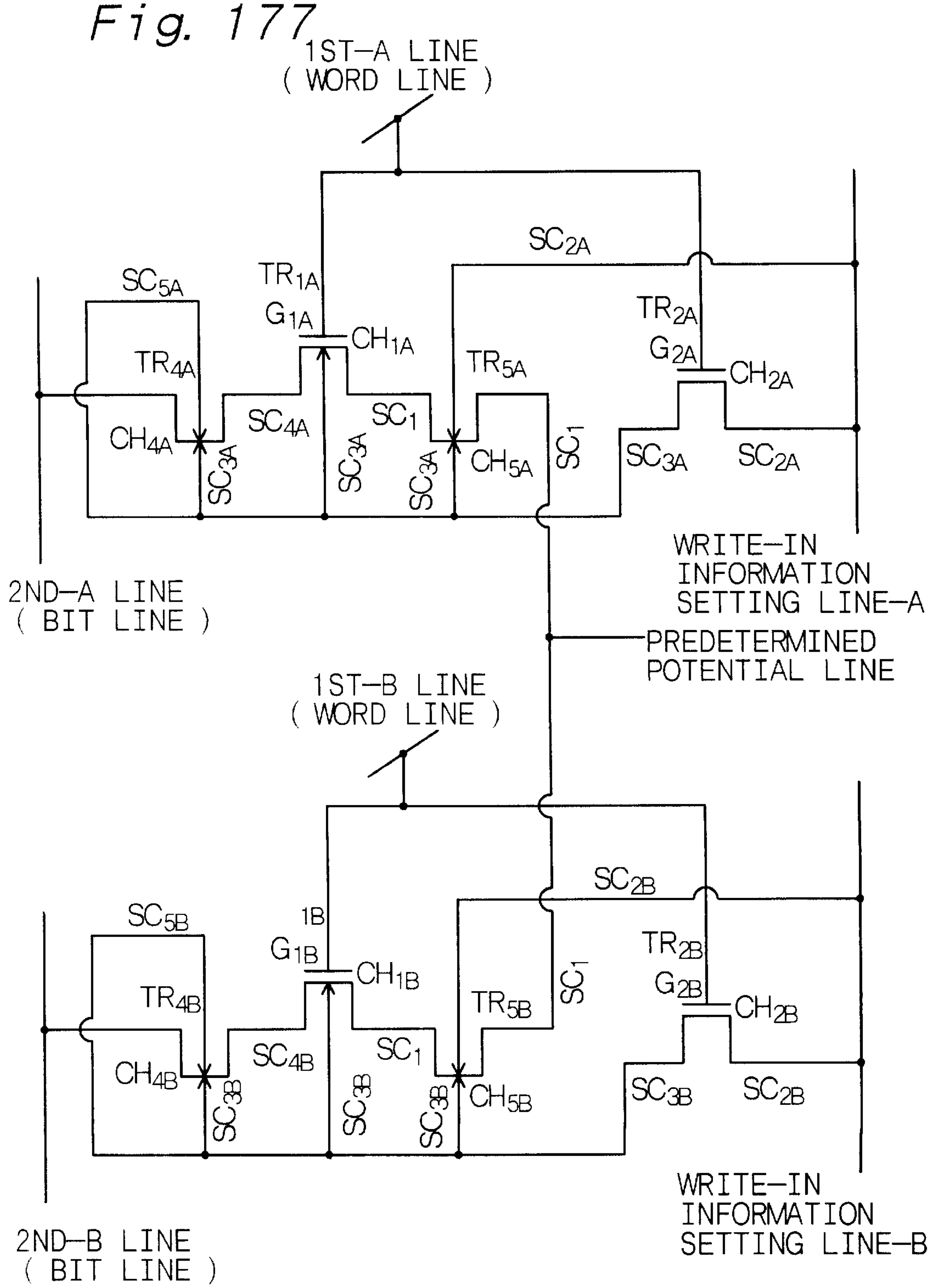

FIG. 177 is a principle of a modification of the semiconductor memory cell in Example 23.

Figure 178:
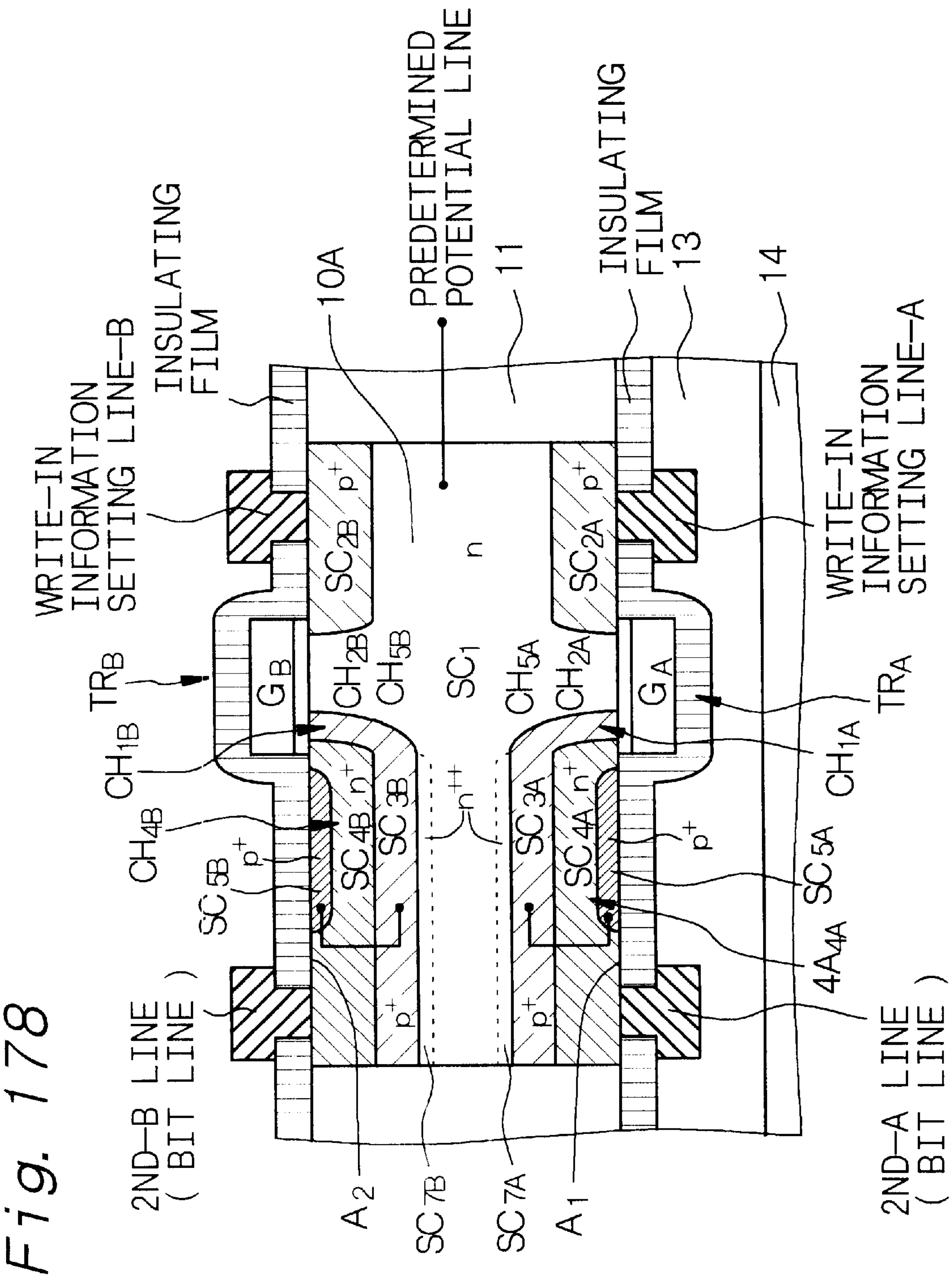

FIG. 178 is a schematic partial cross-sectional view of a modification of the semiconductor memory cell in Example 23 shown in FIG. 177.

Figure 179:
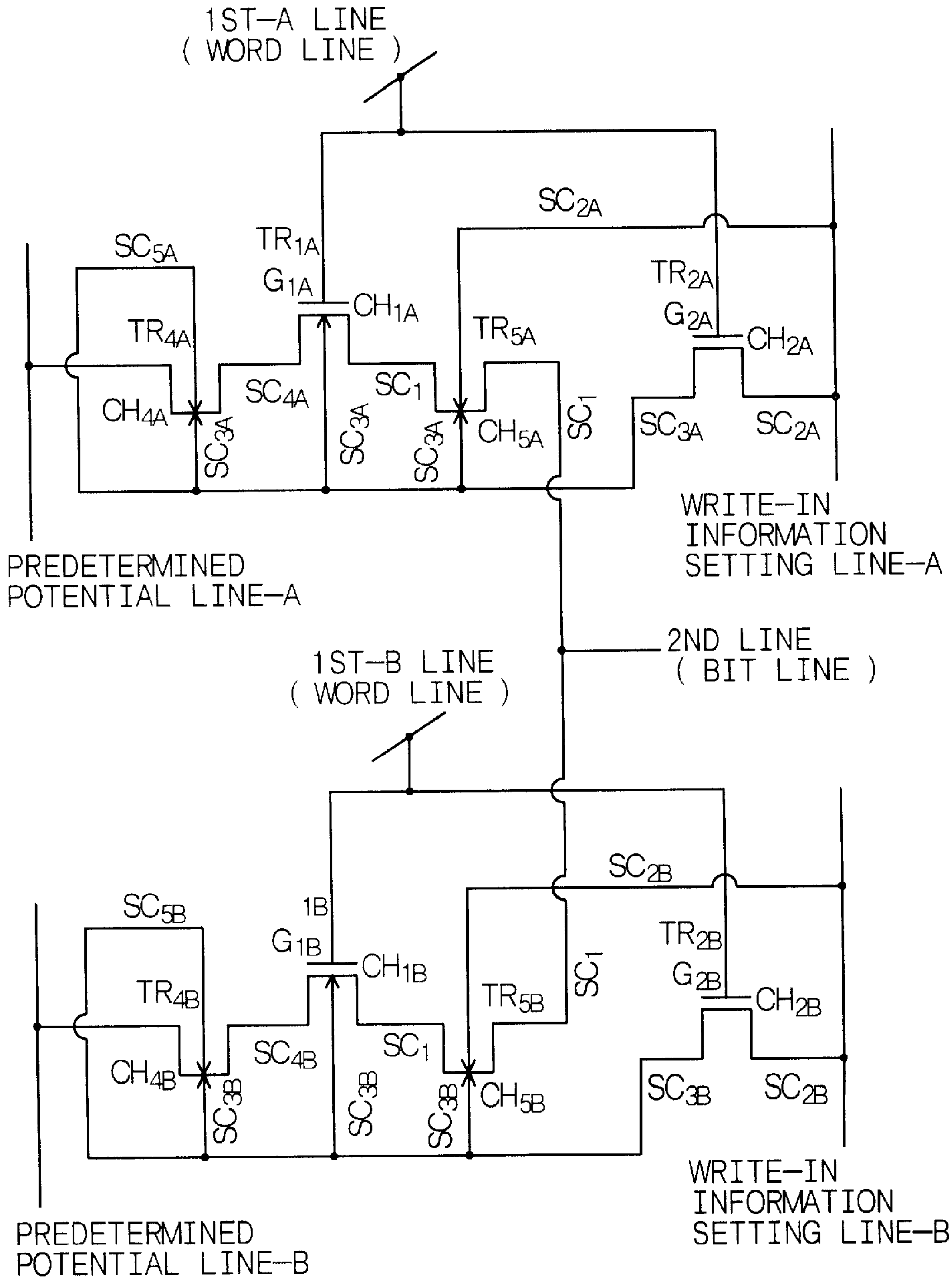

FIG. 179 is a principle drawing of a modification of the semiconductor memory cell in Example 23.

Figure 180:
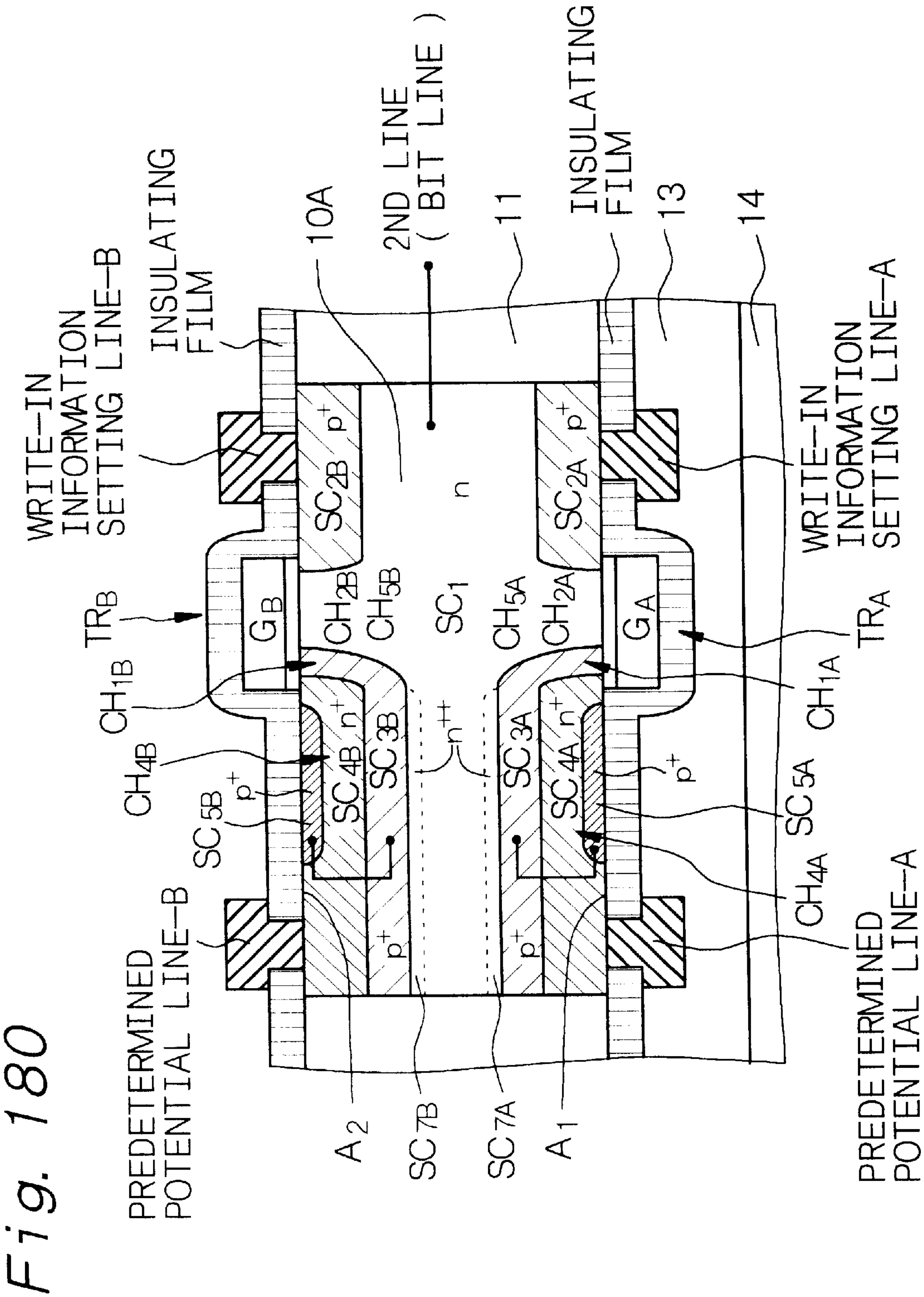

FIG. 180 is a schematic partial cross-sectional view of a modification of the semiconductor memory cell in Example 23 shown in FIG. 179.

Figure 181:
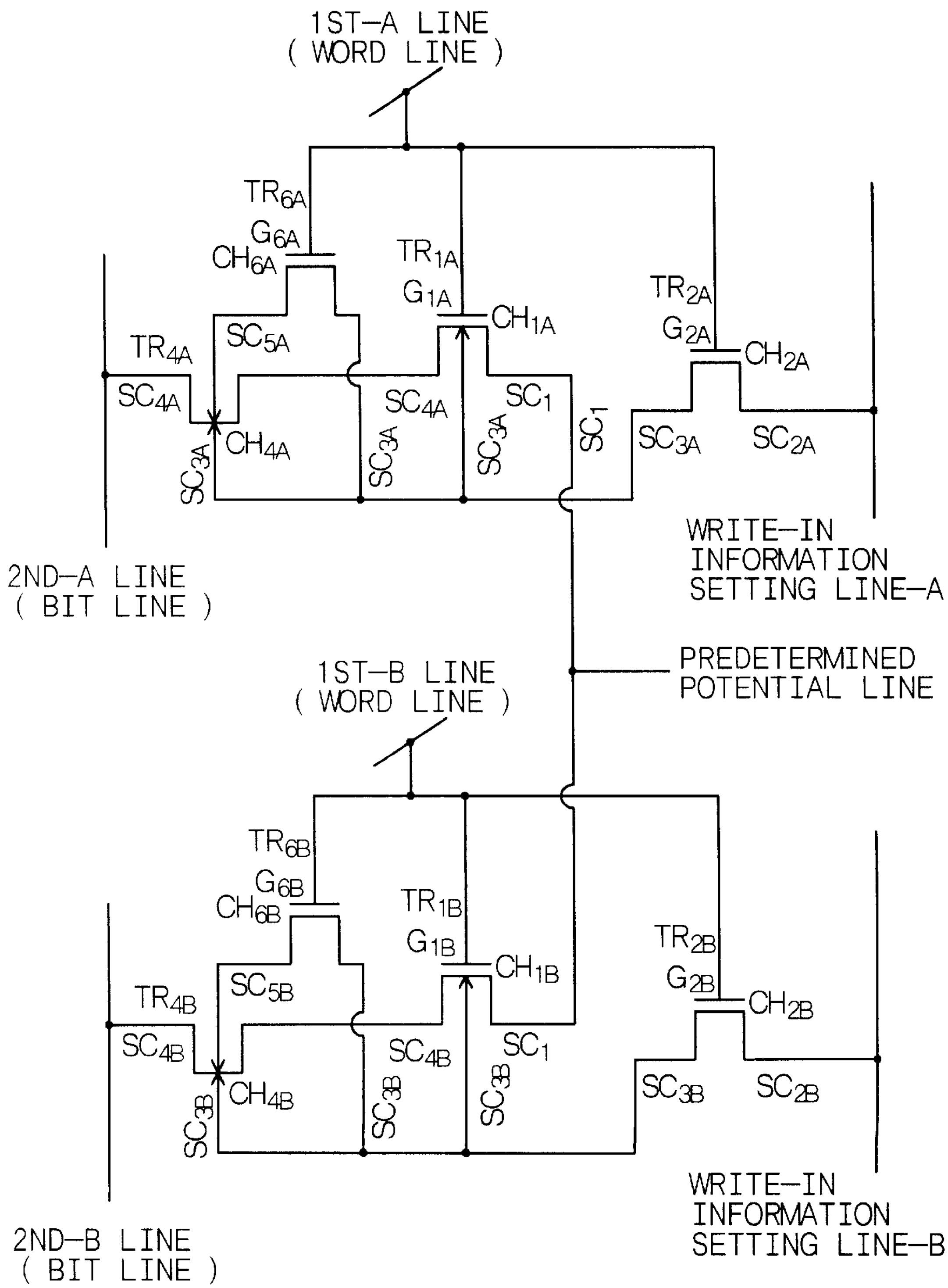

FIG. 181 is a principle drawing of the semiconductor memory cell in Example 24.

Figure 182:
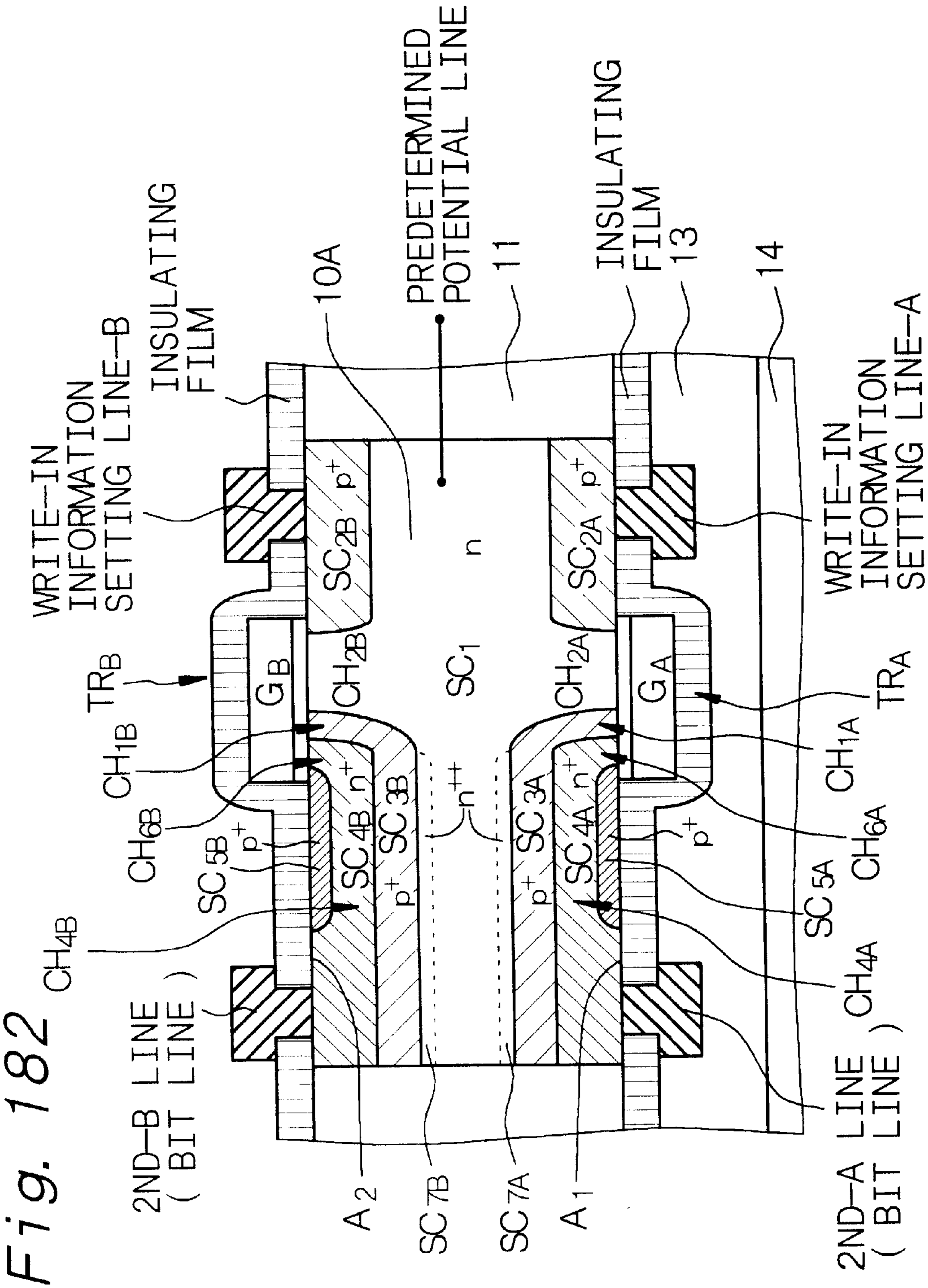

FIG. 182 is a schematic partial cross-sectional view of a semiconductor memory cell in Example 24 shown in FIG. 181.

Figure 183:
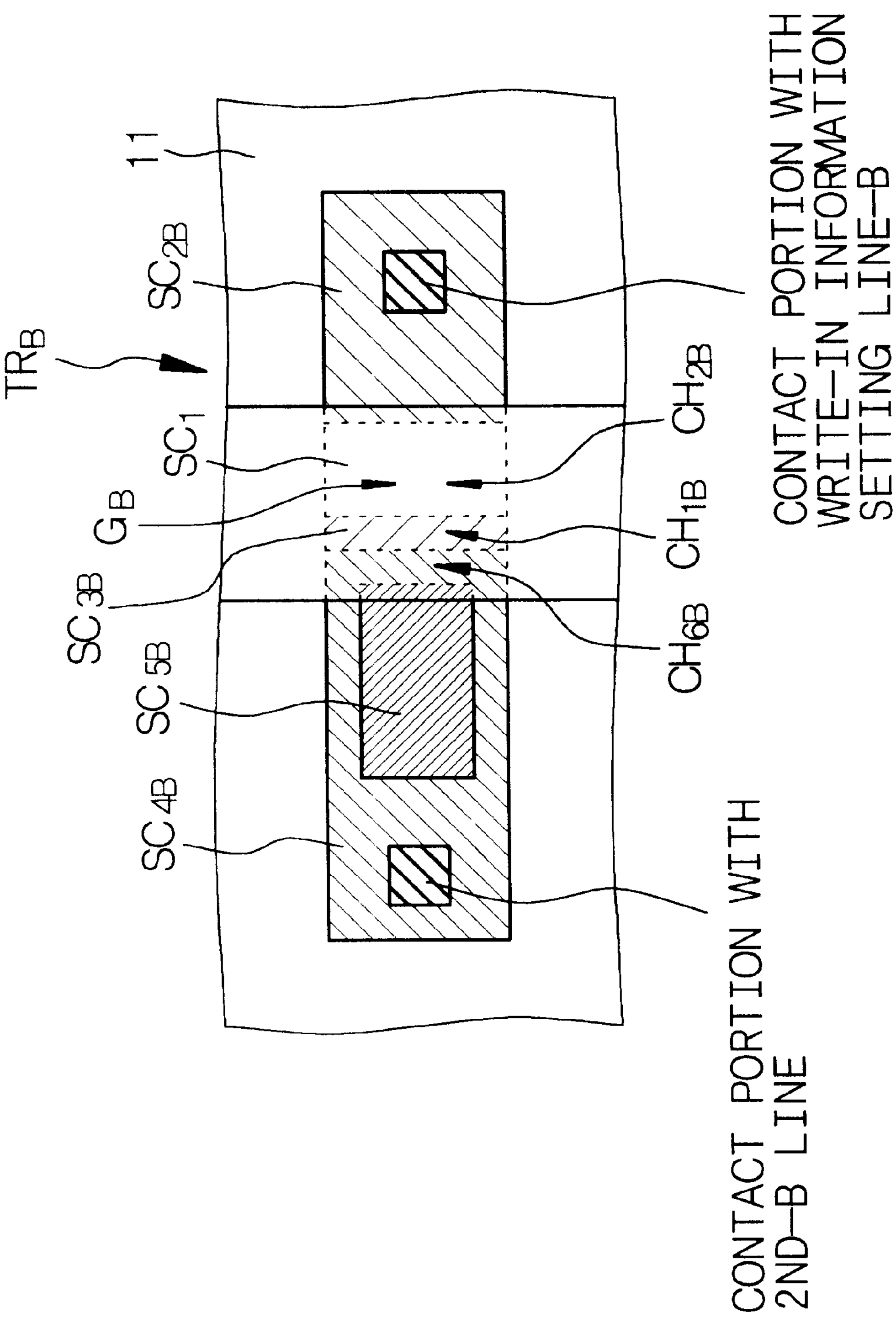

FIG. 183 is a schematic arrangement of a gate portion, etc., of a modification of the semiconductor memory cell in Example 24 shown in FIG. 181.

Figure 184:
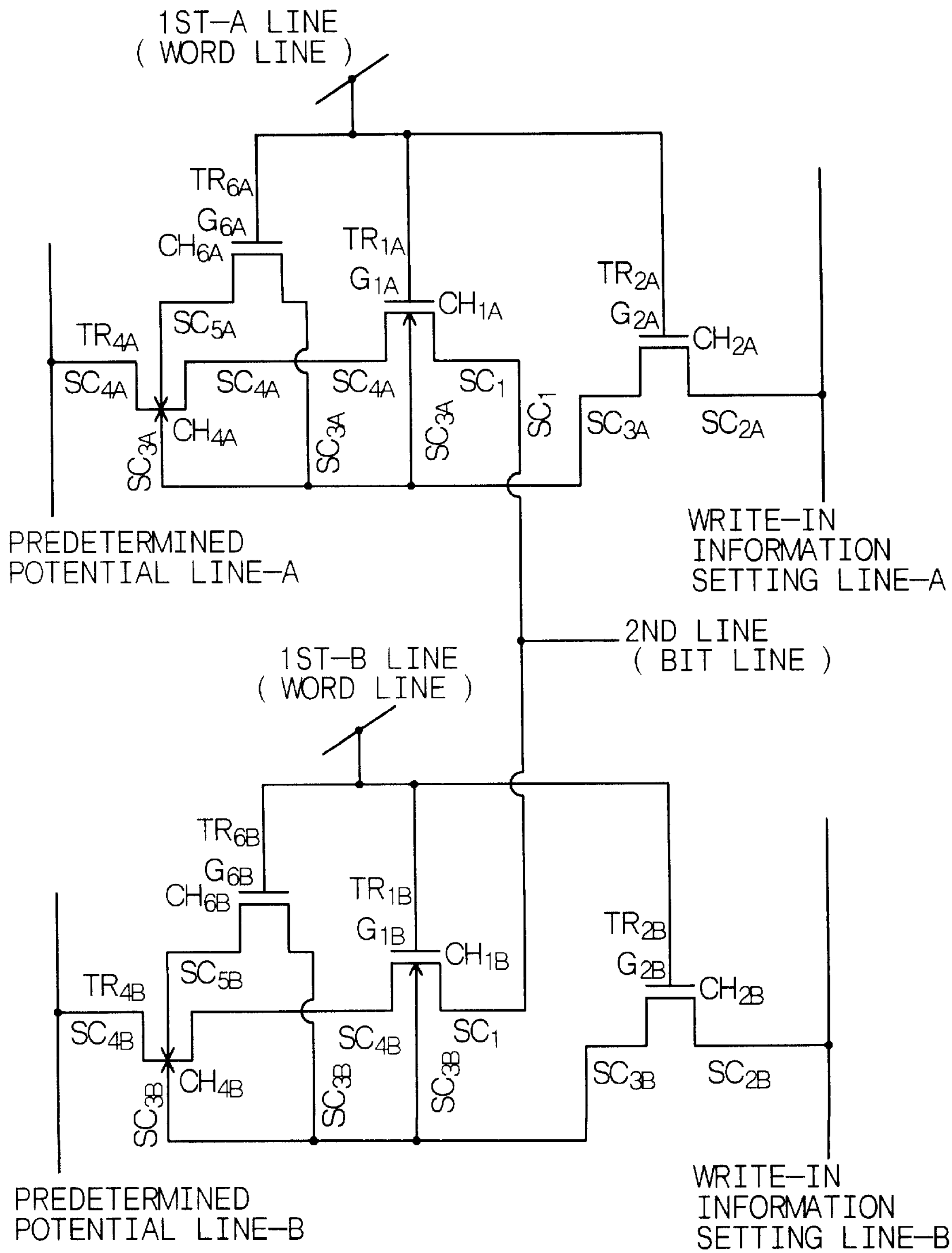

FIG. 184 is a principle drawing of a modification of the semiconductor memory cell in Example 24.

Figure 185:
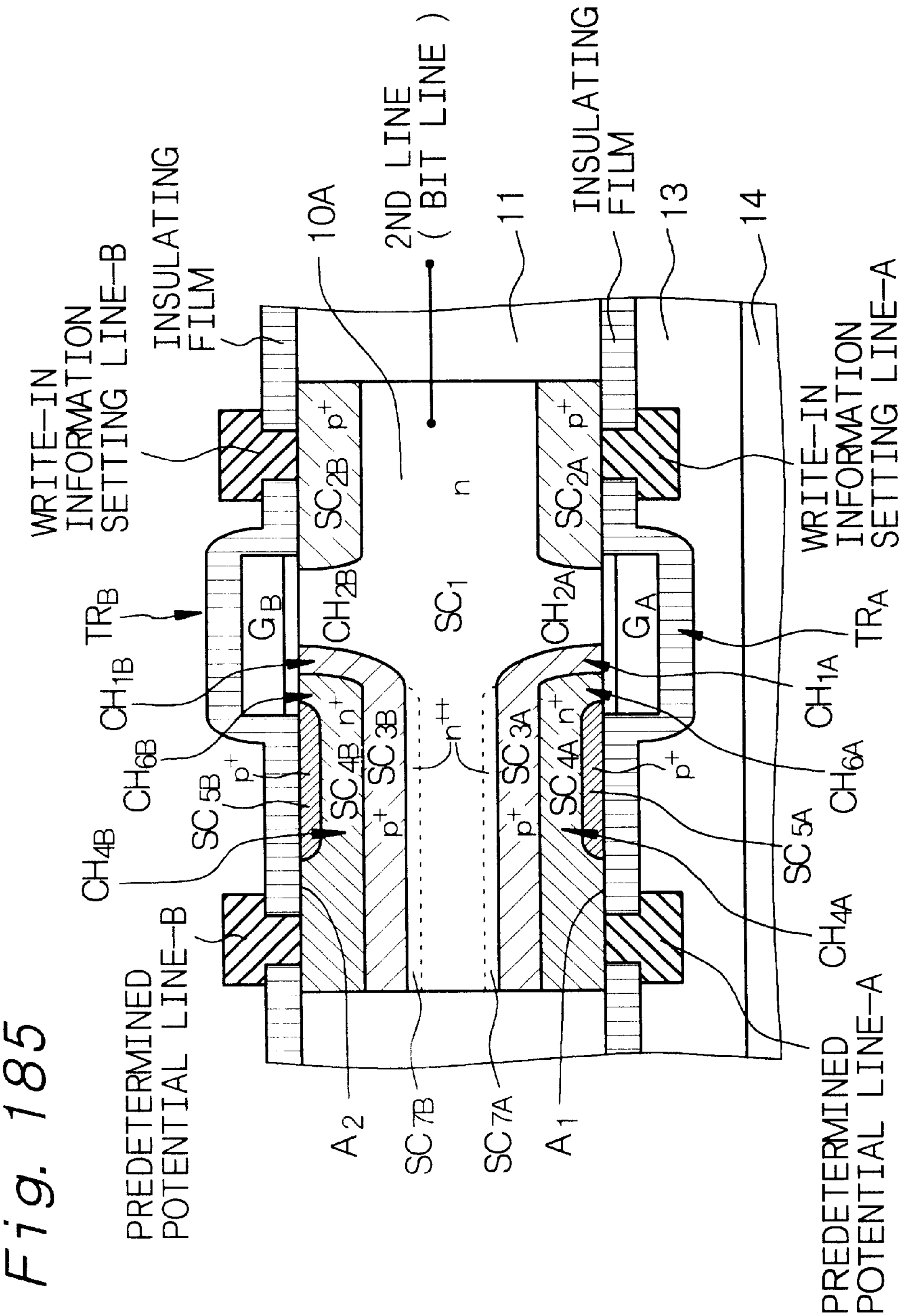

FIG. 185 is a schematic partial cross-sectional view of a modification of the semiconductor memory cell in Example 24 shown in FIG. 184.

Figure 186:
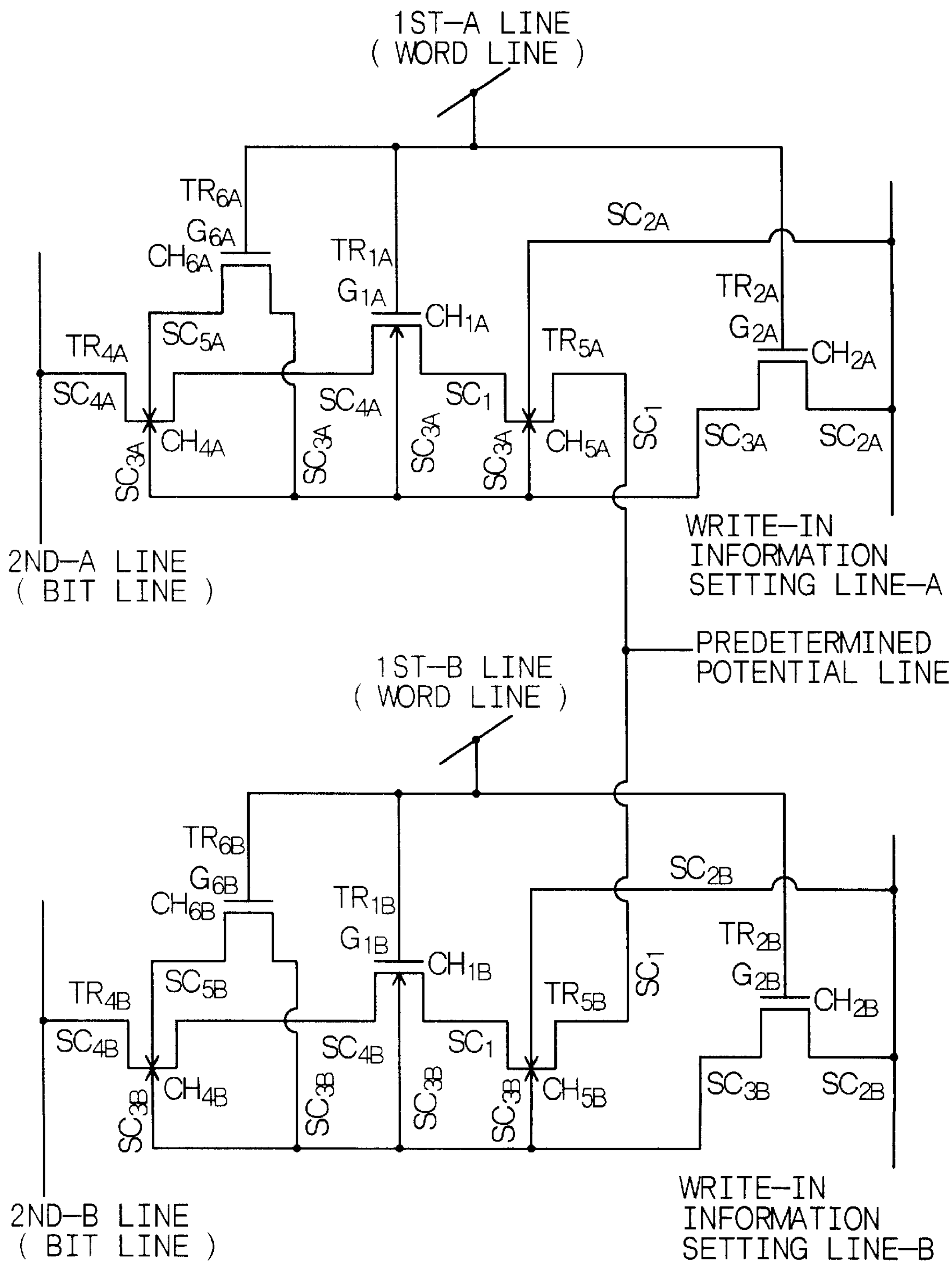

FIG. 186 is a principle drawing of a modification of the semiconductor memory cell in Example 24.

Figure 187:
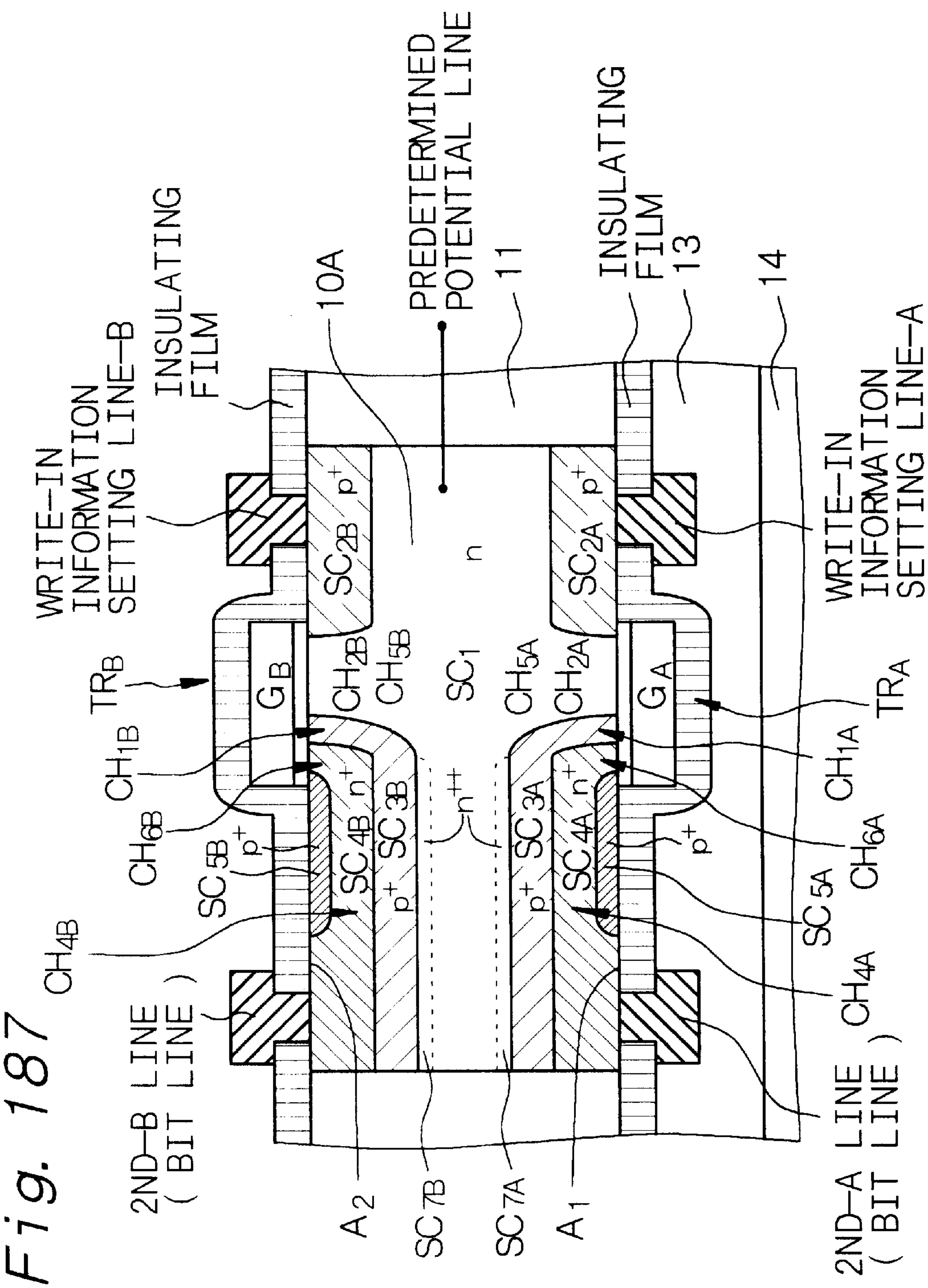

FIG. 187 is a schematic partial cross-sectional view of a modification of the semiconductor memory cell in Example 24 shown in FIG. 186.

Figure 188:
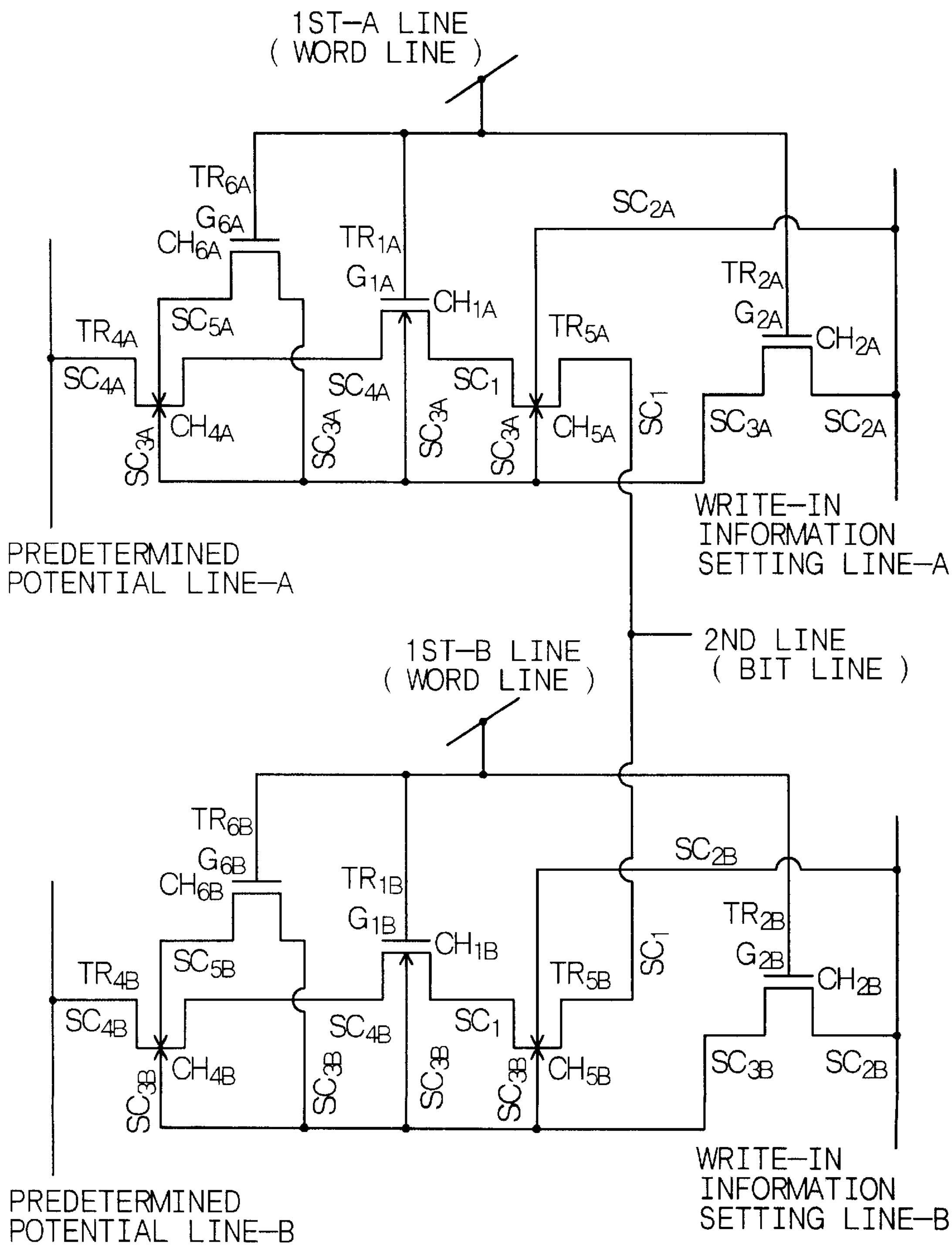

FIG. 188 is a principle drawing of a modification of the semiconductor memory cell in Example 24.

Figure 189:
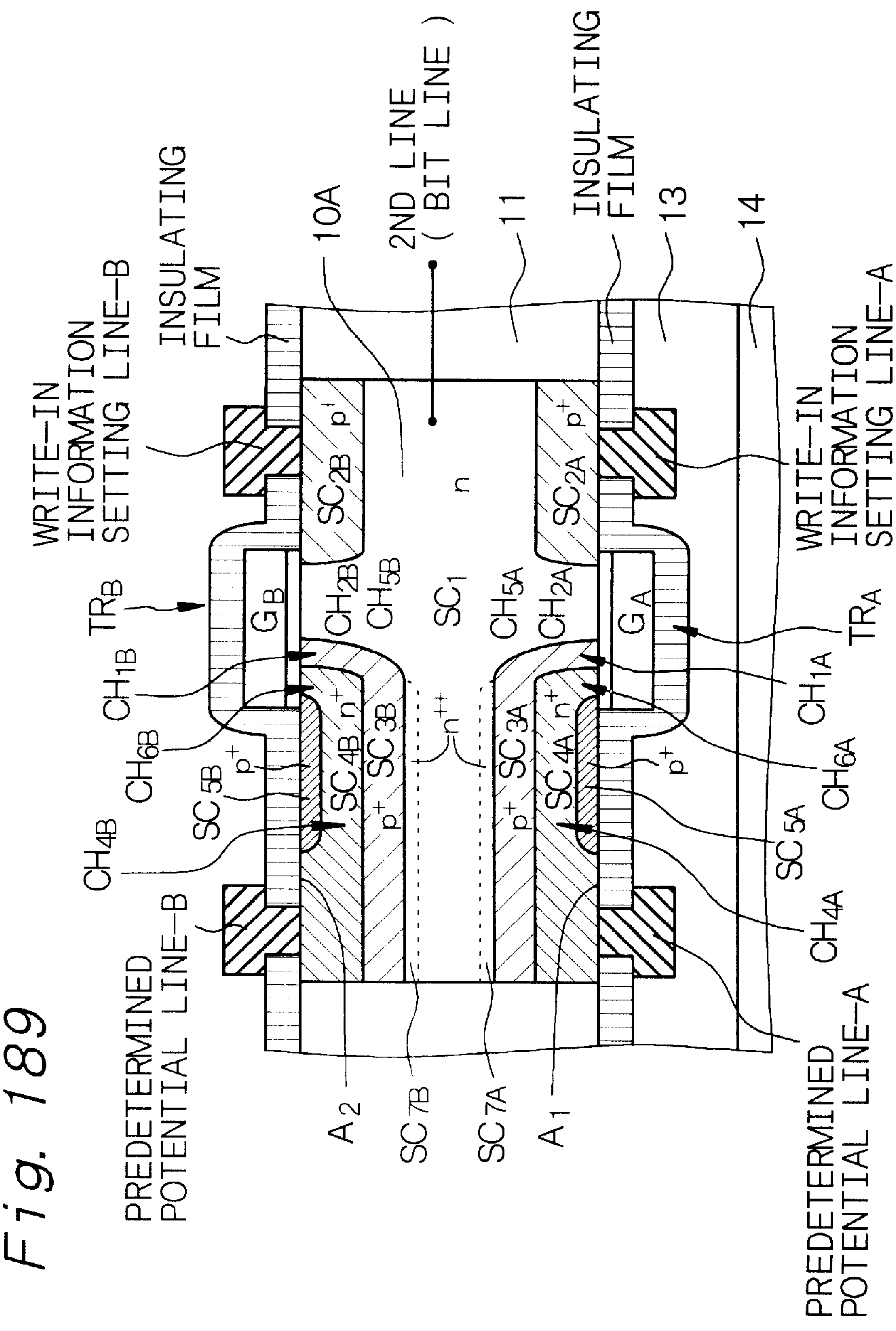

FIG. 189 is a schematic partial cross-sectional view of a modification of the semiconductor memory cell in Example 24 shown in FIG. 188.

Figure 190:
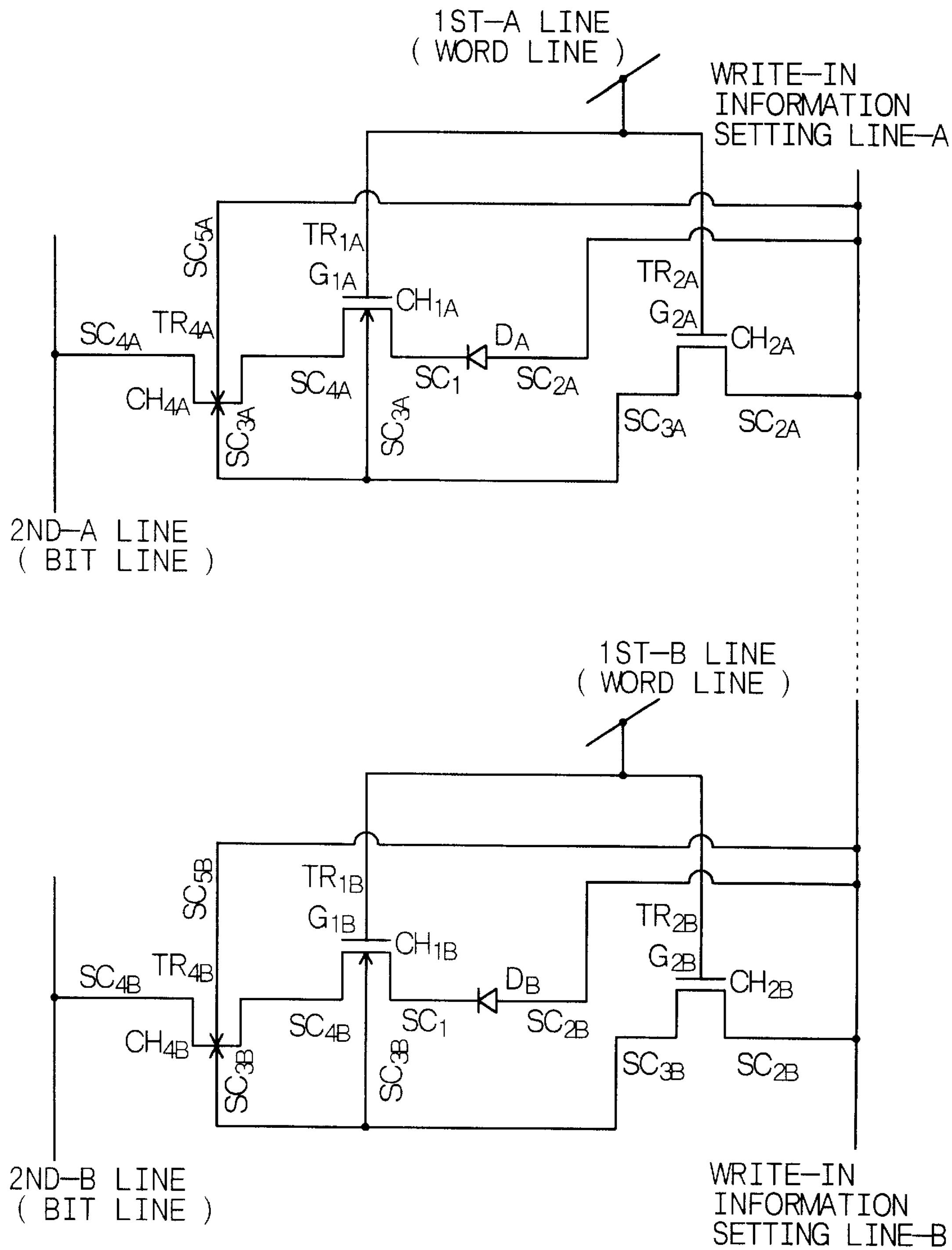

FIG. 190 is a principle drawing of the semiconductor memory cell in Example 25.

Figure 191:
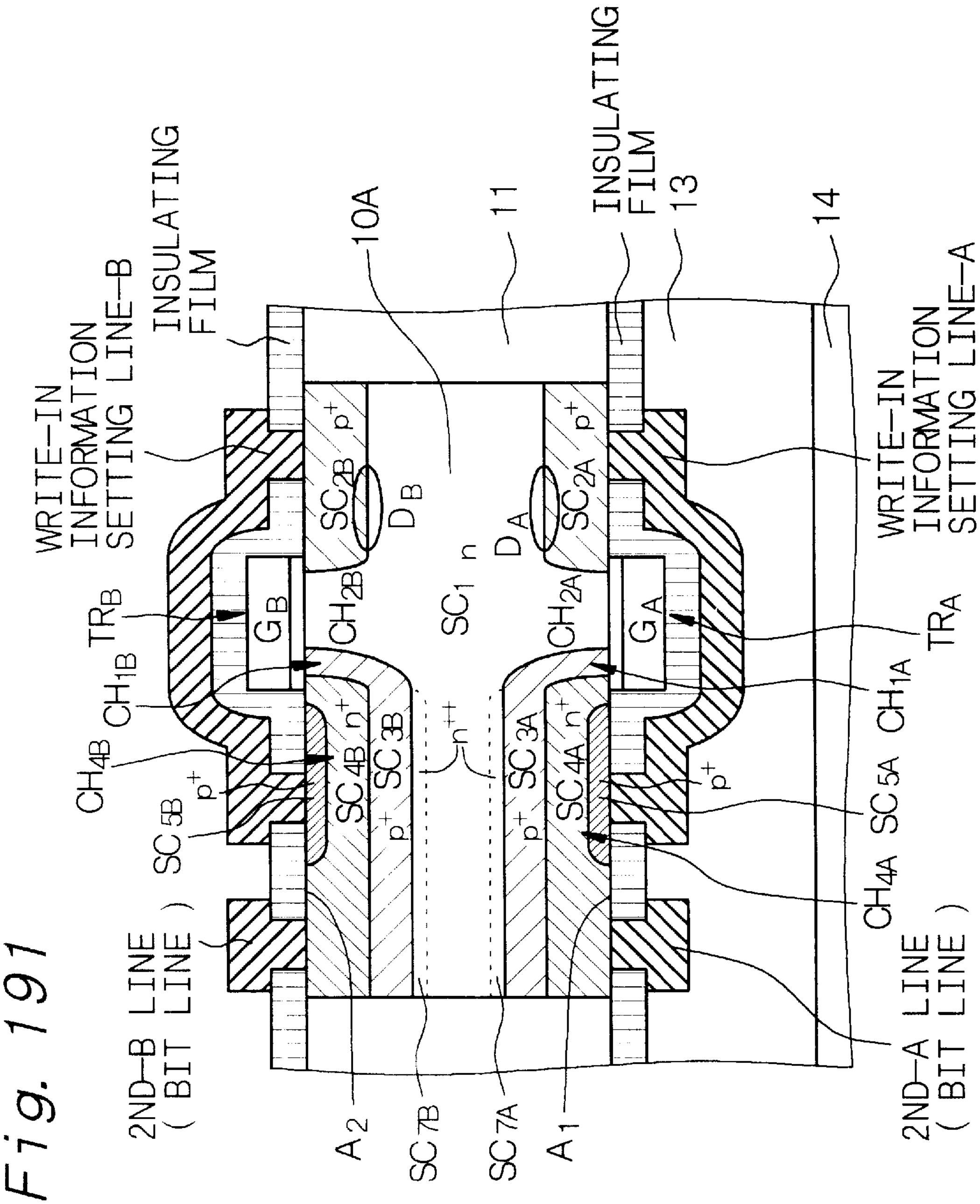

FIG. 191 is a schematic partial cross-sectional view of a semiconductor memory cell in Example 25 shown in FIG. 190.

Figure 192:
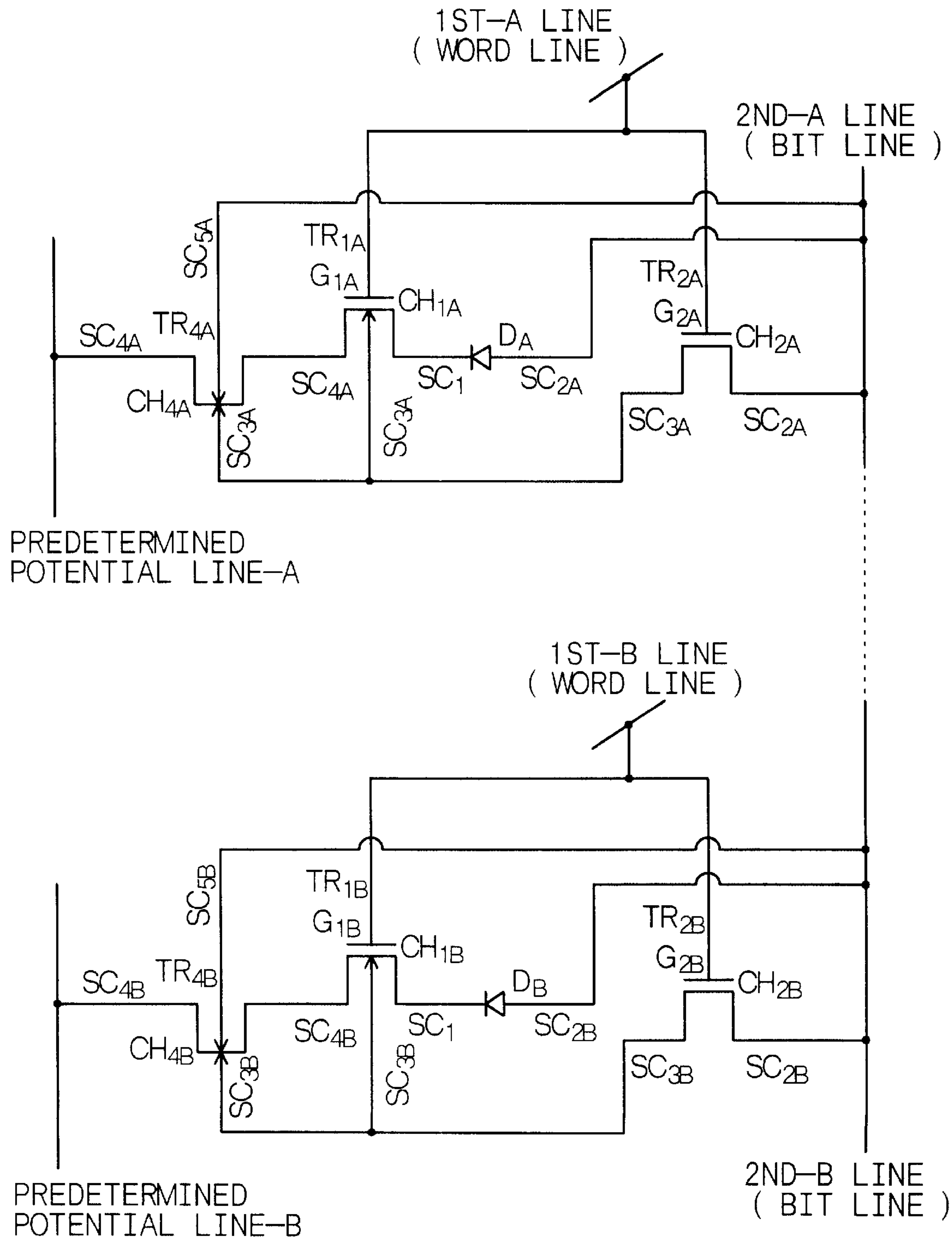

FIG. 192 is a principle drawing of a modification of the semiconductor memory cell in Example 25.

Figure 193:
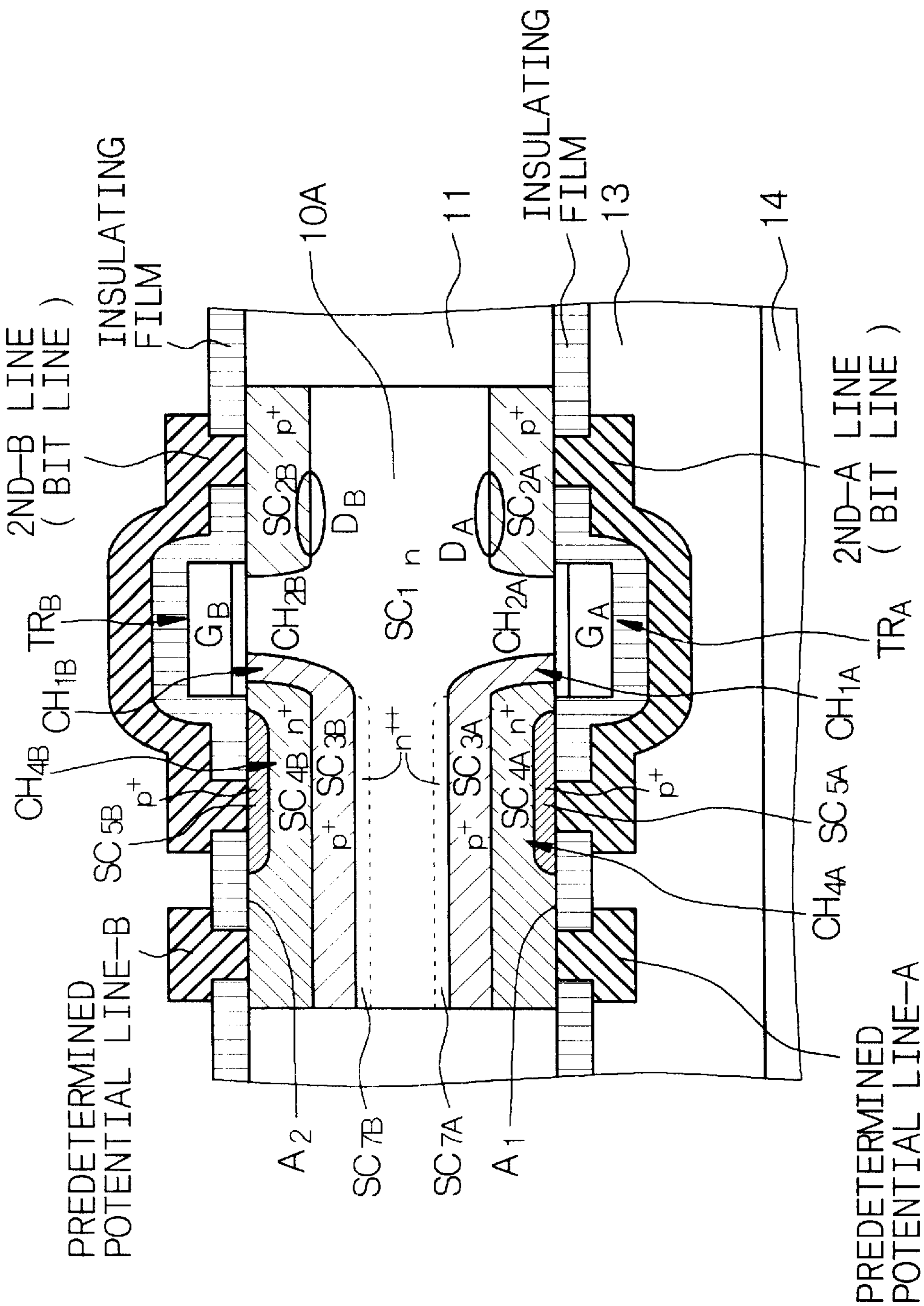

FIG. 193 is a schematic partial cross-sectional view of a modification of the semiconductor memory cell in Example 25 shown in FIG. 192.

Figure 194:
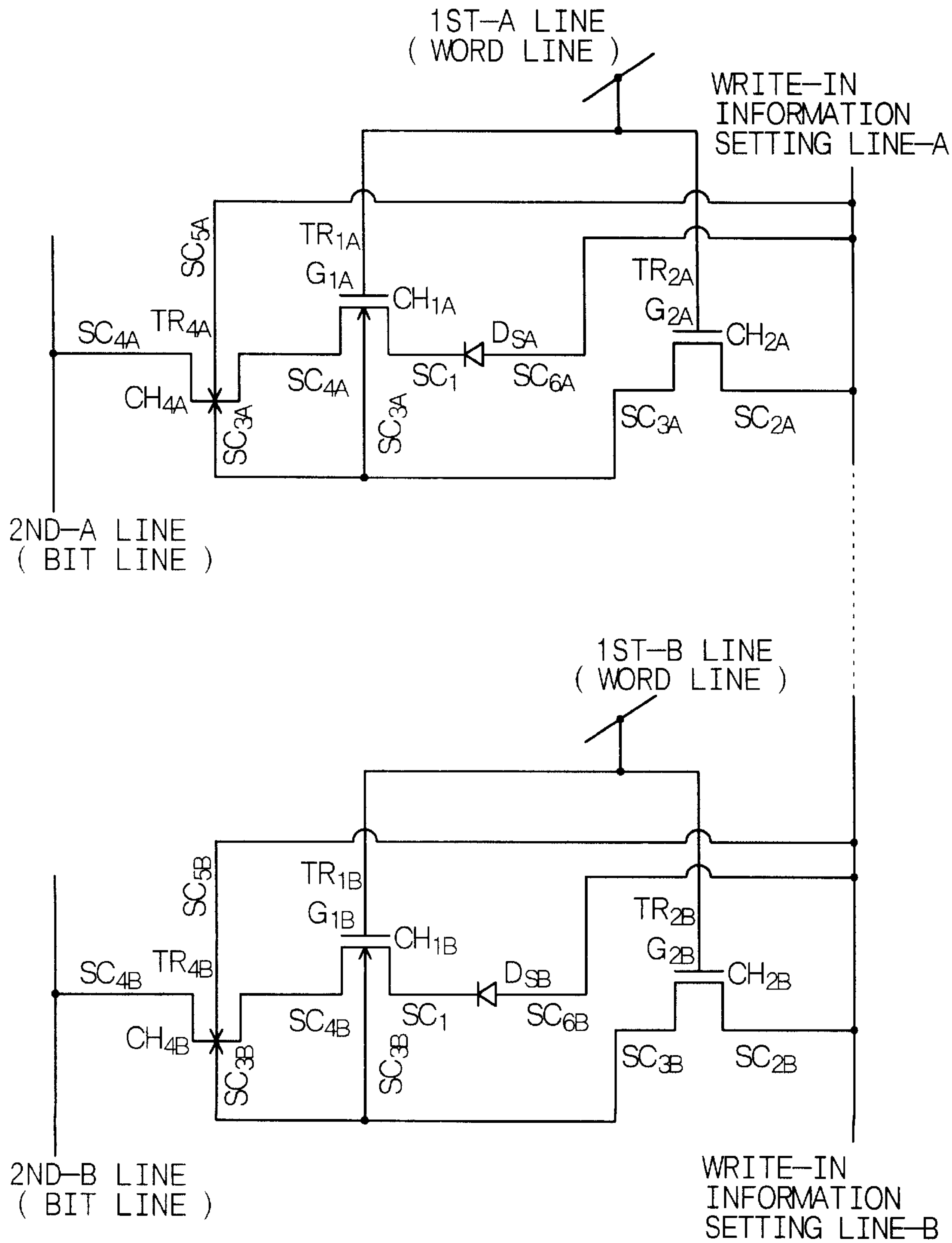

FIG. 194 is a principle drawing of a modification of the semiconductor memory cell in Example 25.

Figure 195:
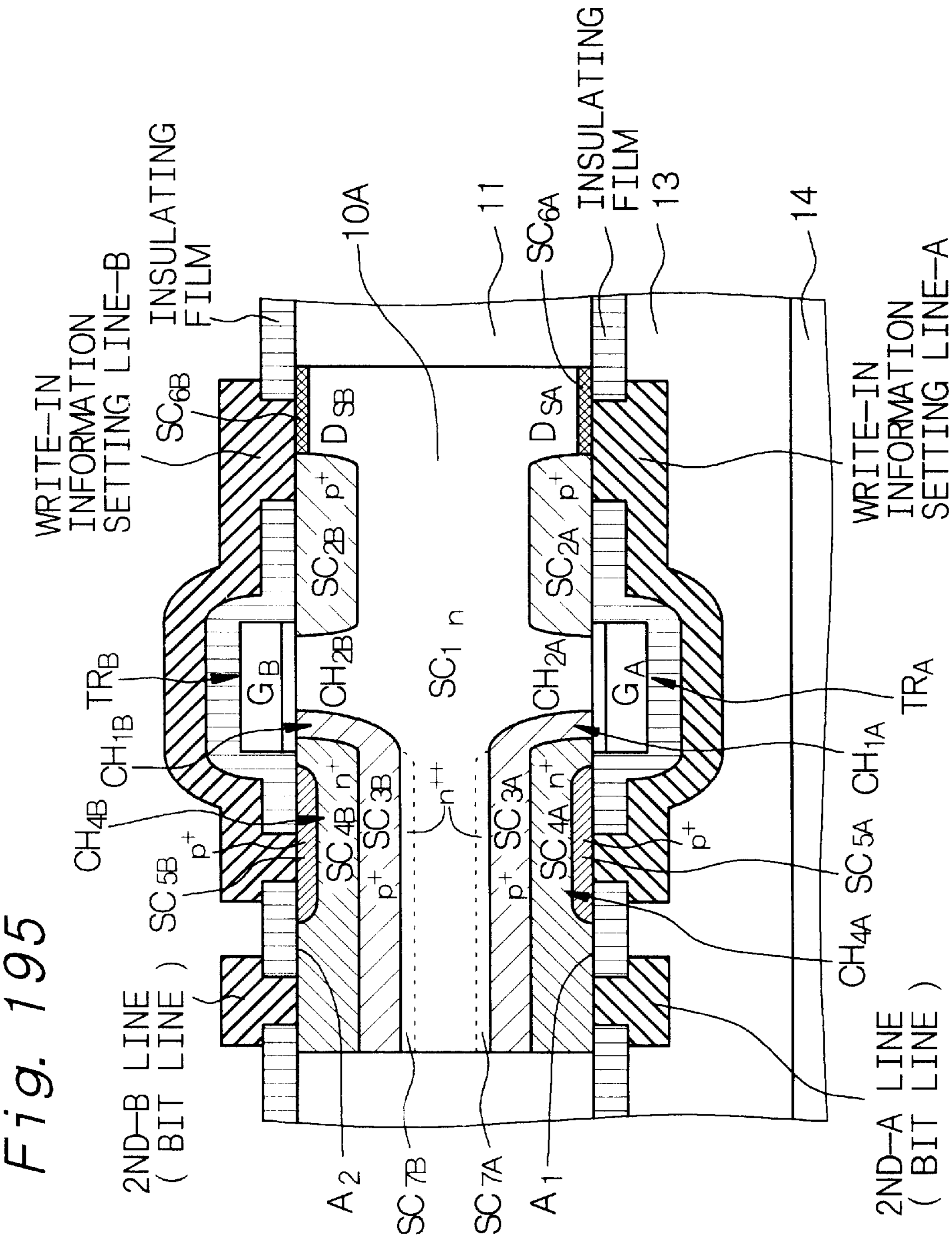

FIG. 195 is a schematic partial cross-sectional view of a modification of the semiconductor memory cell in Example 25 shown in FIG. 194.

Figure 196:
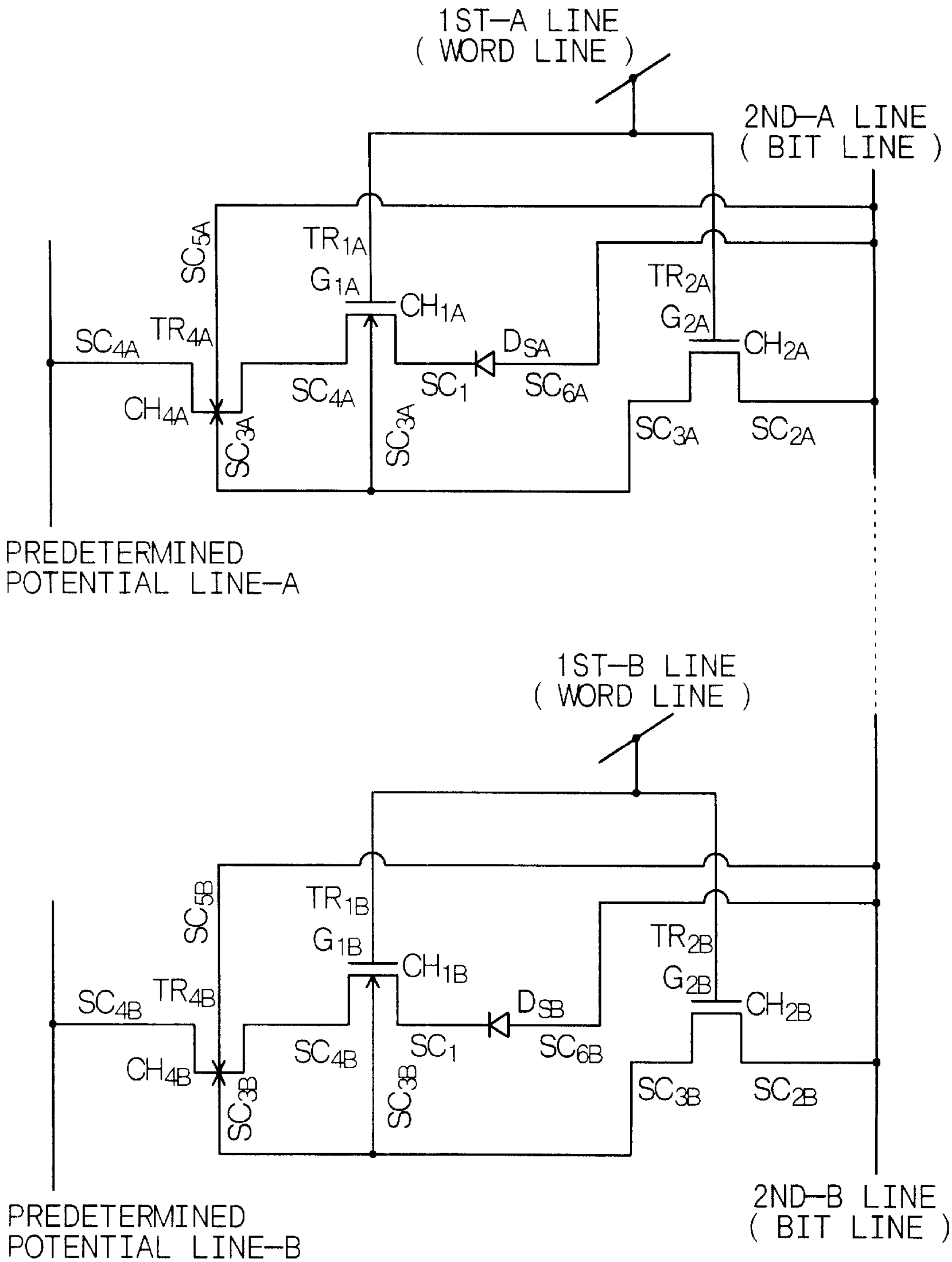

FIG. 196 is a principle drawing of a modification of the semiconductor memory cell in Example 25.

Figure 197:
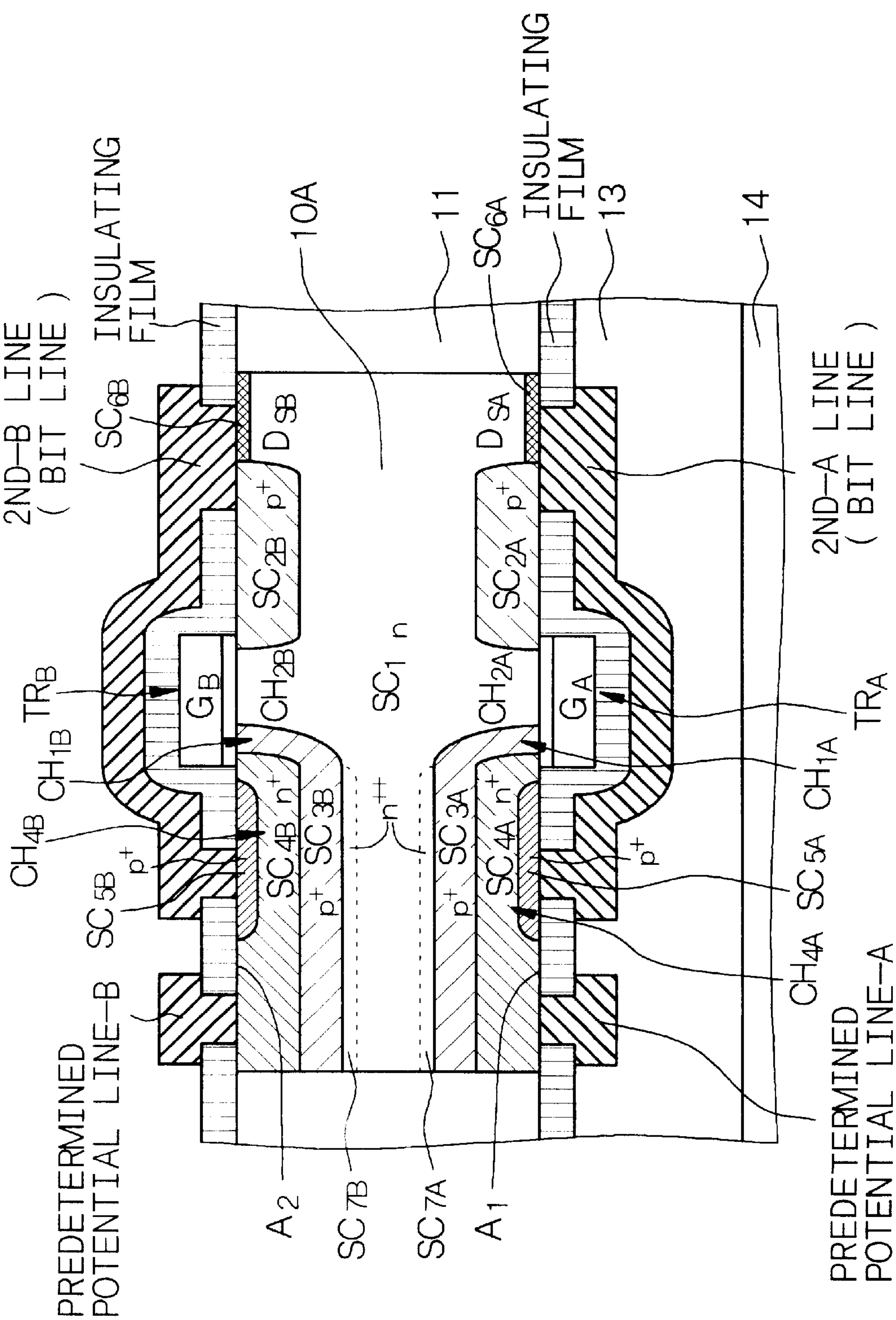

FIG. 197 is a schematic partial cross-sectional view of a modification of the semiconductor memory cell in Example 25 shown in FIG. 196.

Figure 198:
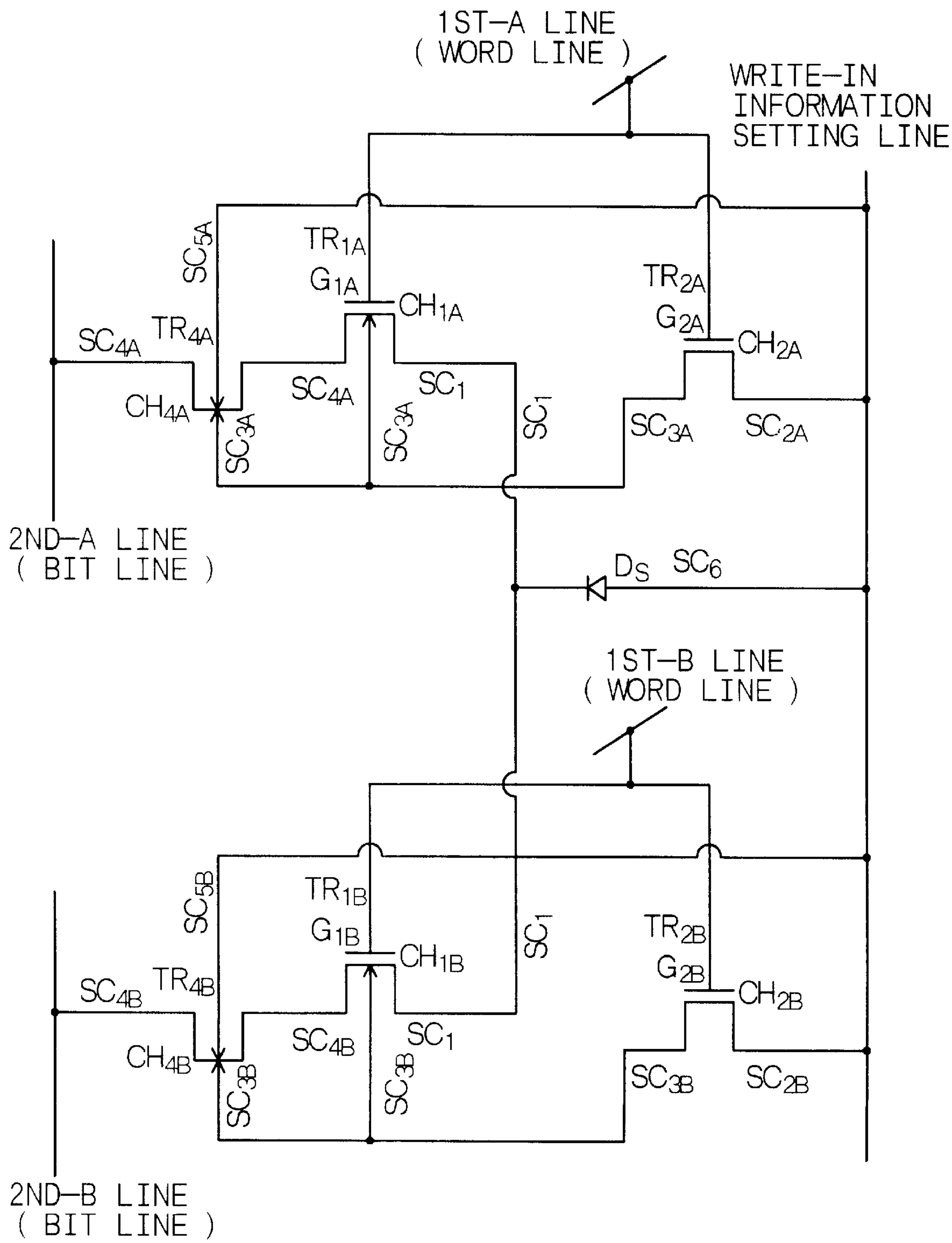

FIG. 198 is a principle drawing of a modification of the semiconductor memory cell in Example 25.

Figure 199:
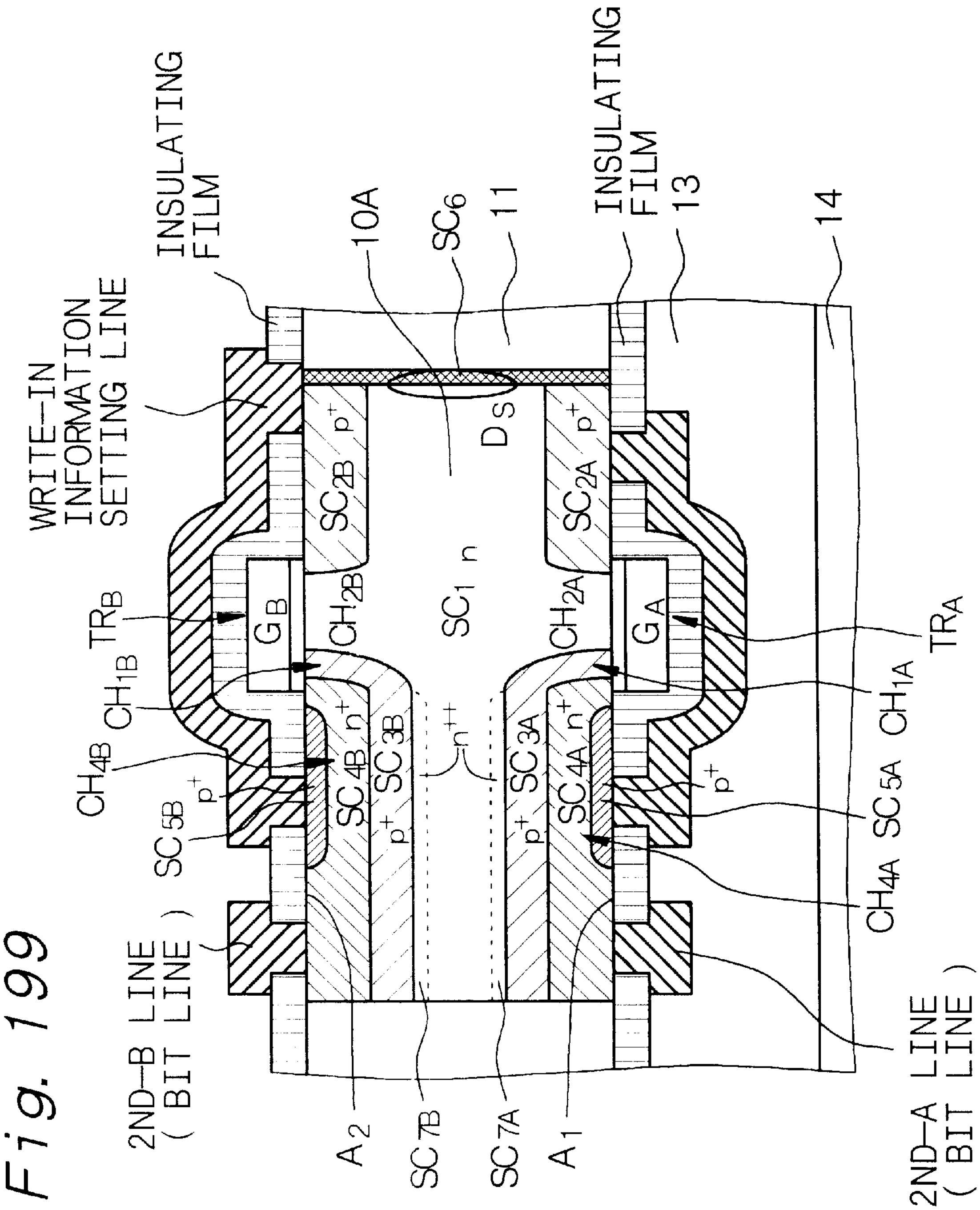

FIG. 199 is a schematic partial cross-sectional view of a modification of the semiconductor memory cell in Example 25 shown in FIG. 198.

Figure 200:
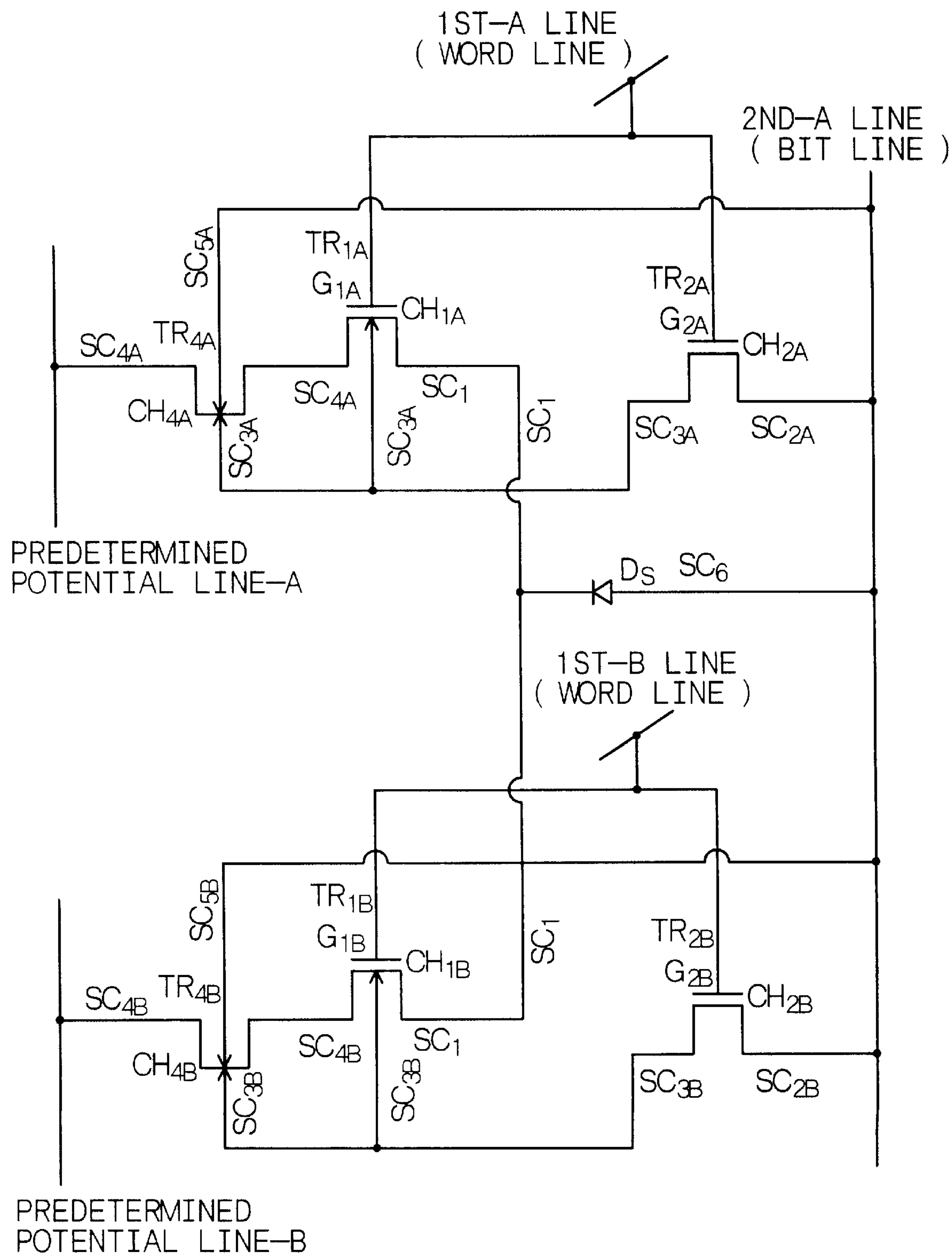

FIG. 200 is a principle drawing of a modification of the semiconductor memory cell in Example 25.

Figure 201:
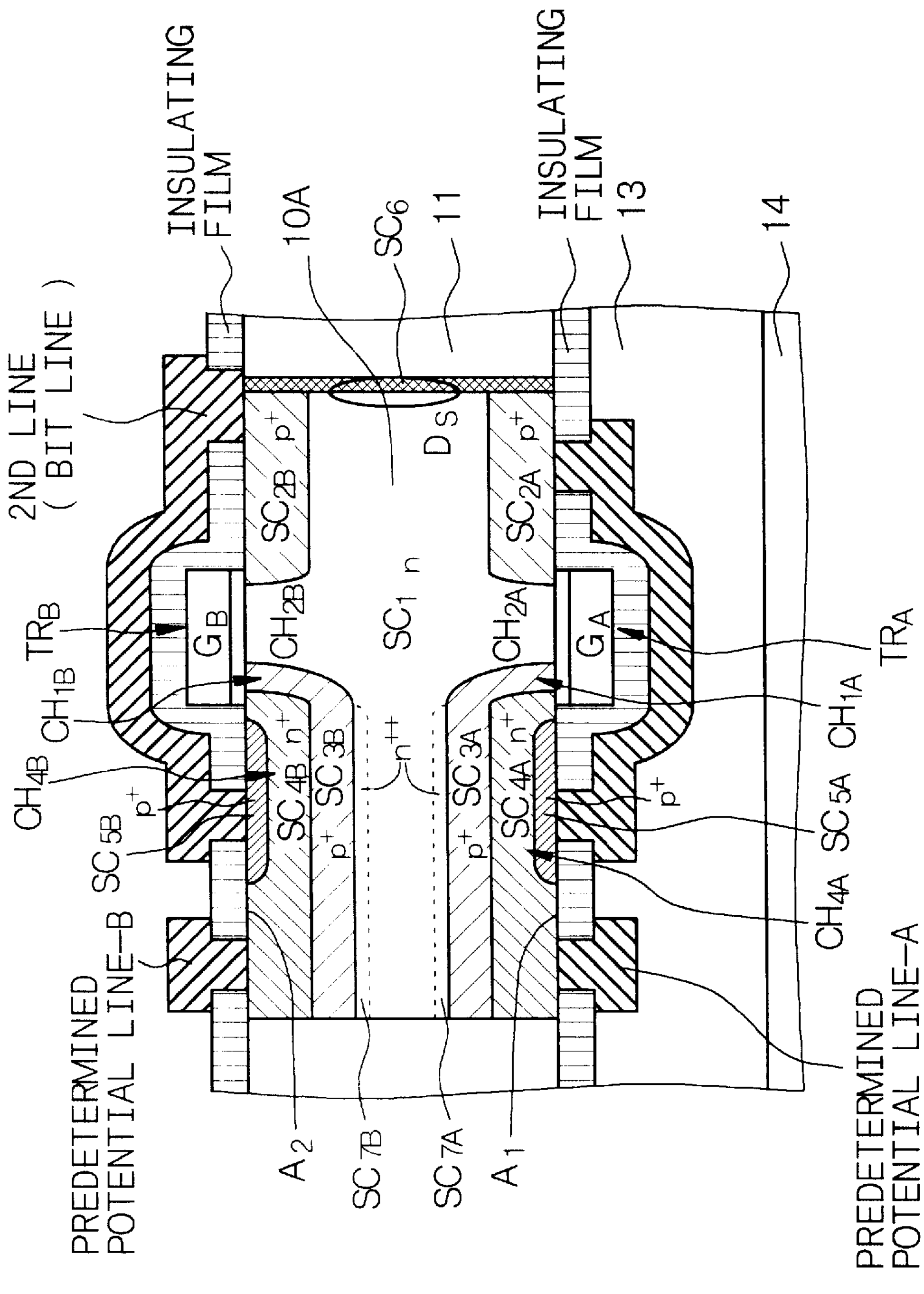

FIG. 201 is a schematic partial cross-sectional view of a modification of the semiconductor memory cell in Example 25 shown in FIG. 200.

Figure 202:
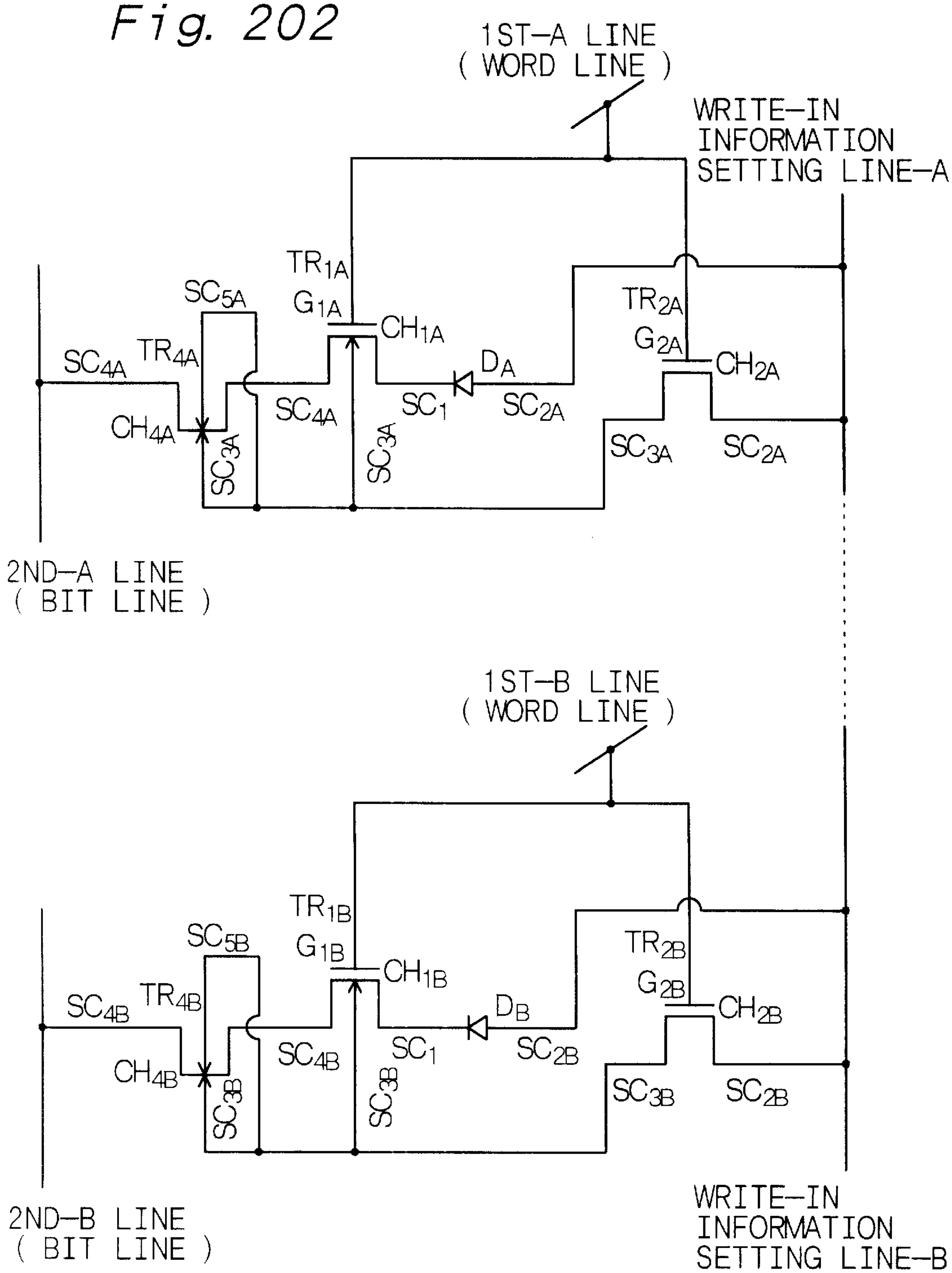

FIG. 202 is a principle drawing of a modification of the semiconductor memory cell in Example 25.

Figure 203:
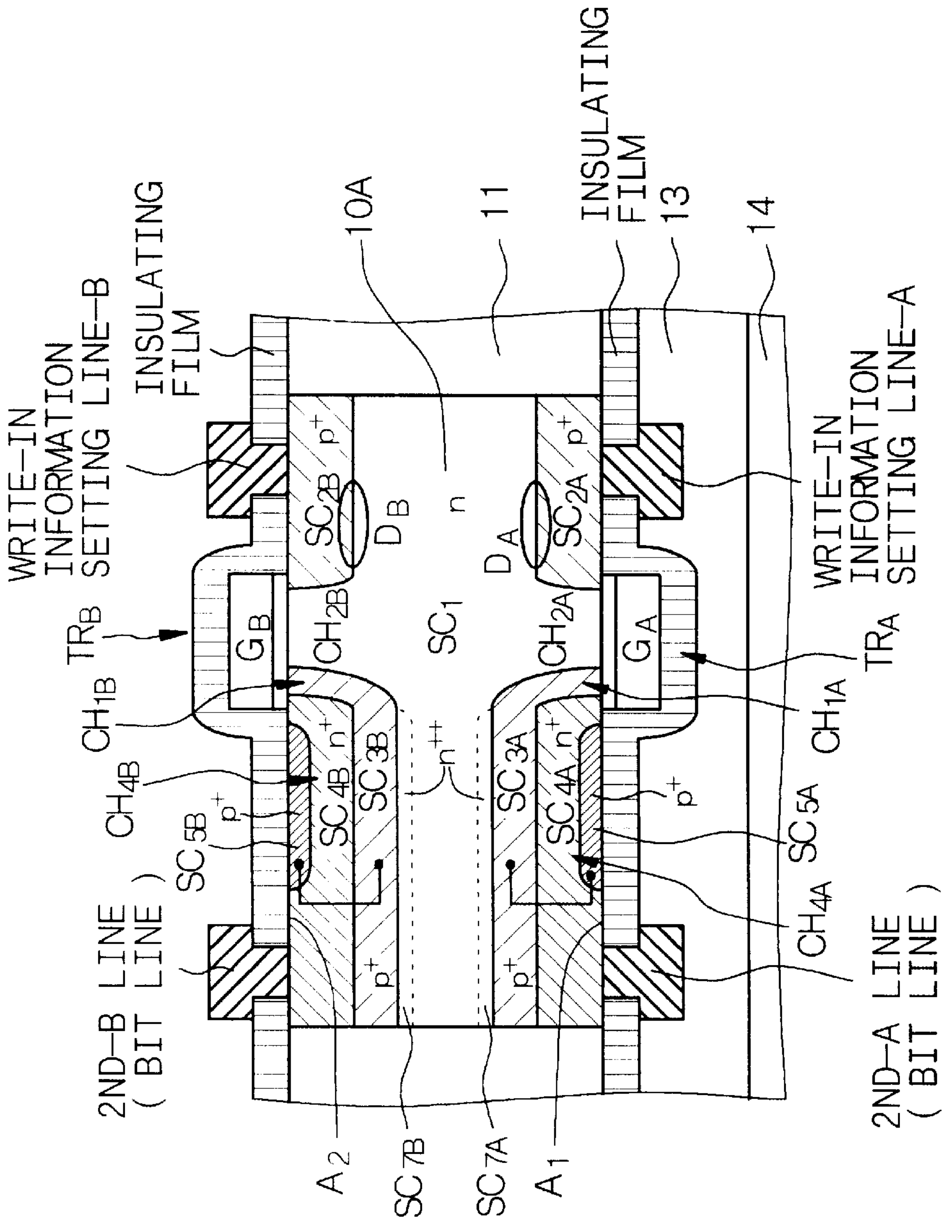

FIG. 203 is a schematic partial cross-sectional view of a modification of the semiconductor memory cell in Example 25 shown in FIG. 202.

Figure 204:
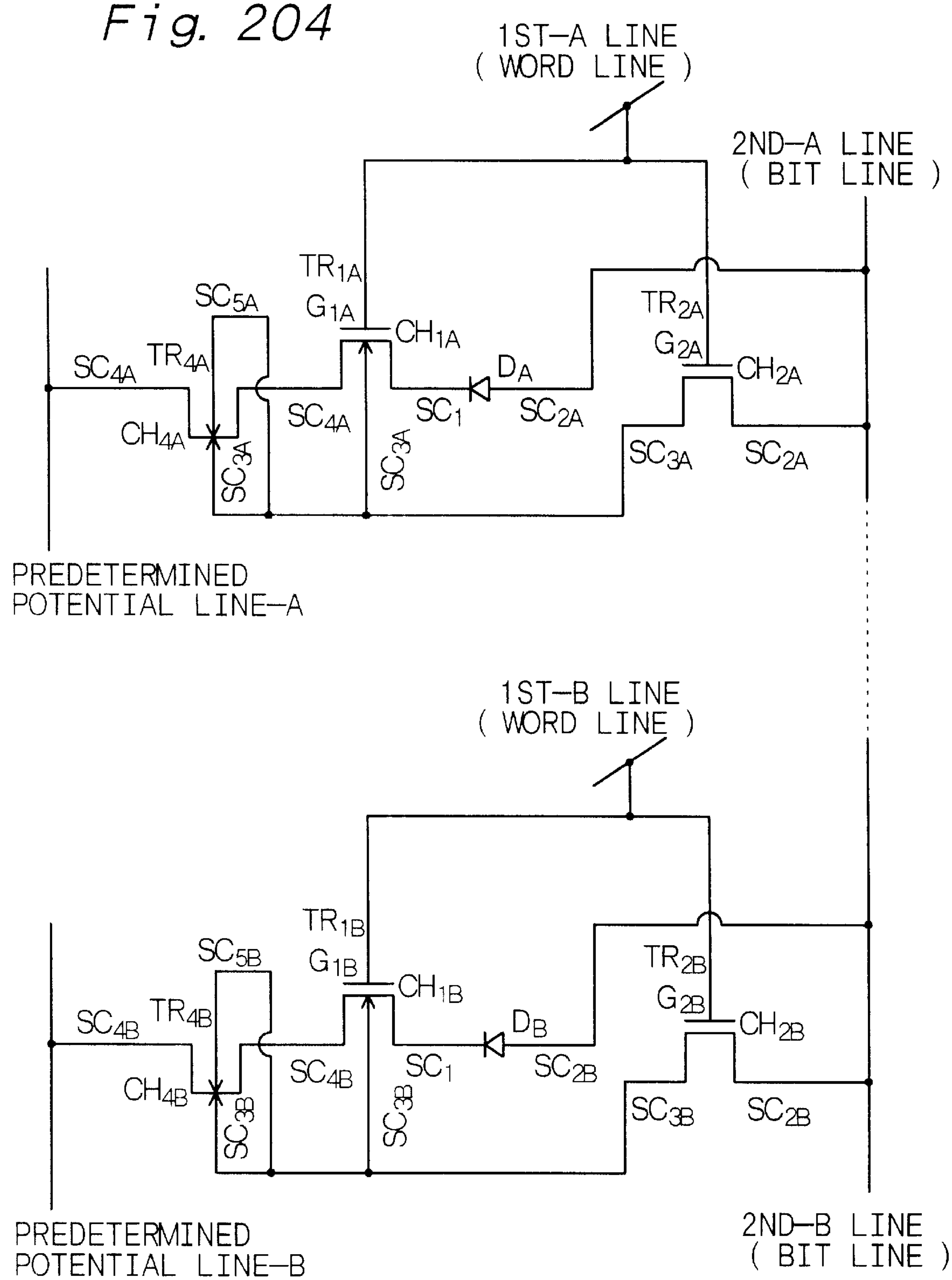

FIG. 204 is a principle drawing of a modification of the semiconductor memory cell in Example 25.

Figure 205:
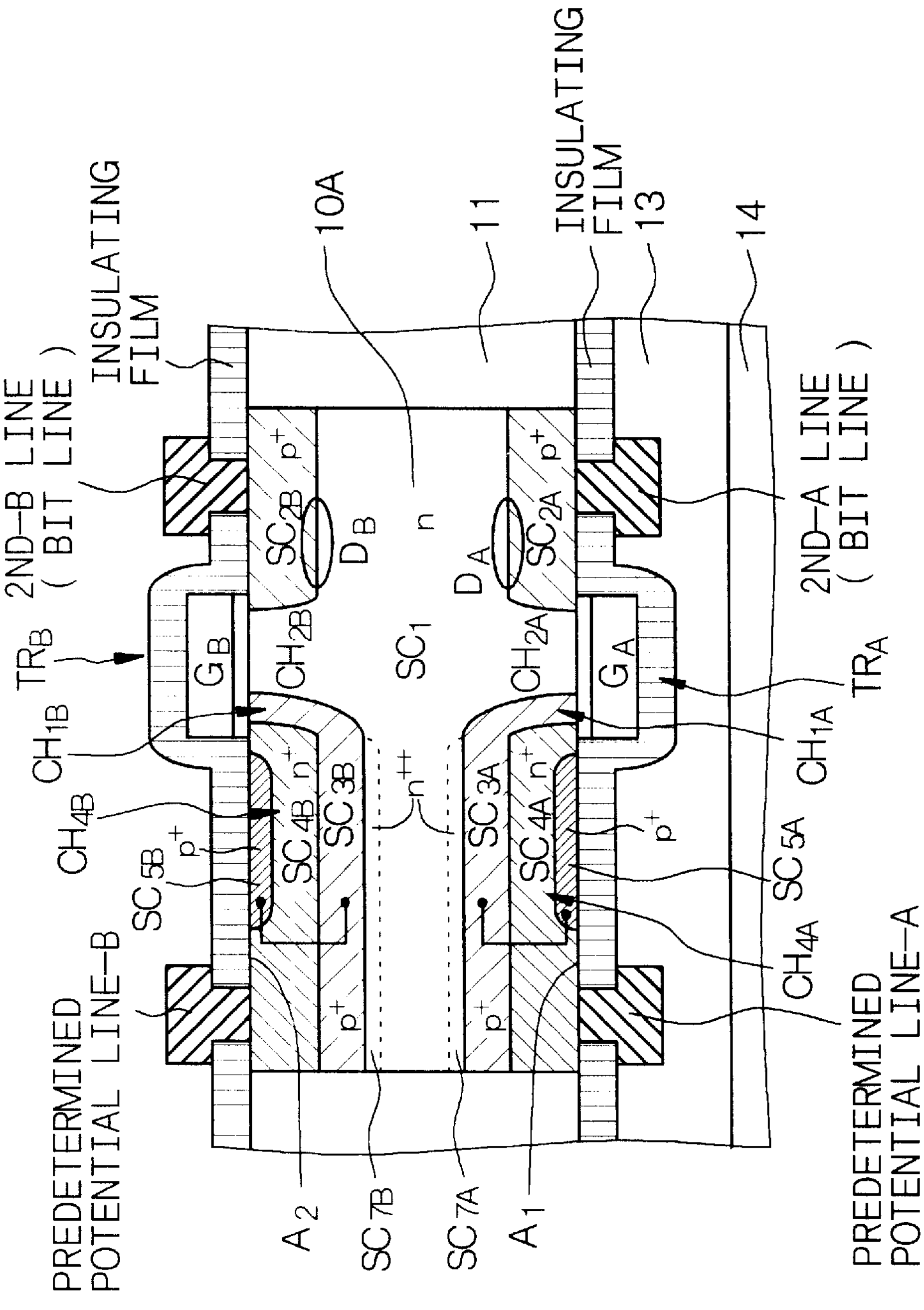

FIG. 205 is a schematic partial cross-sectional view of a modification of the semiconductor memory cell in Example 25 shown in FIG. 204.

Figure 206:
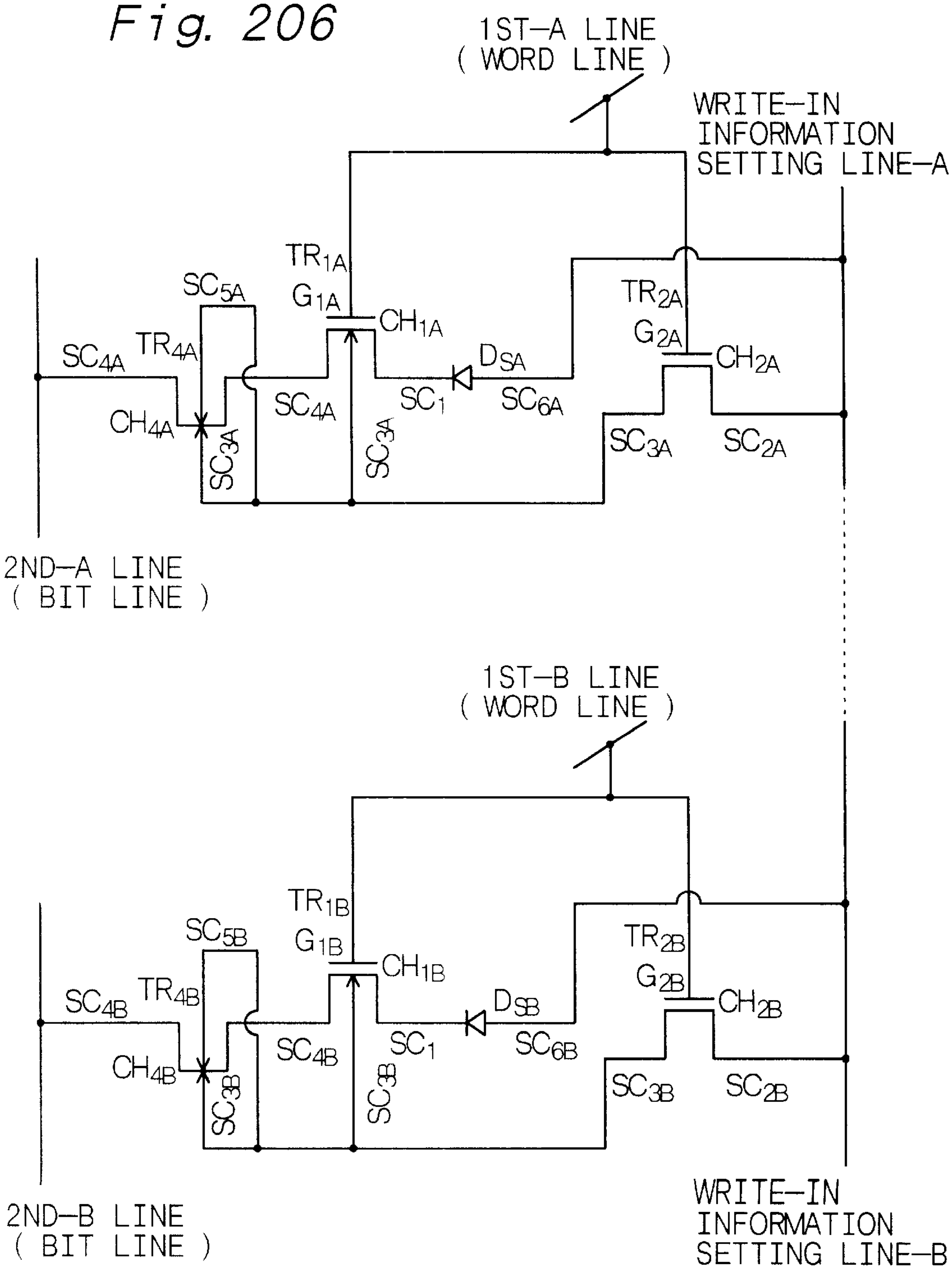

FIG. 206 is a principle drawing of a modification of the semiconductor memory cell in Example 25.

Figure 207:
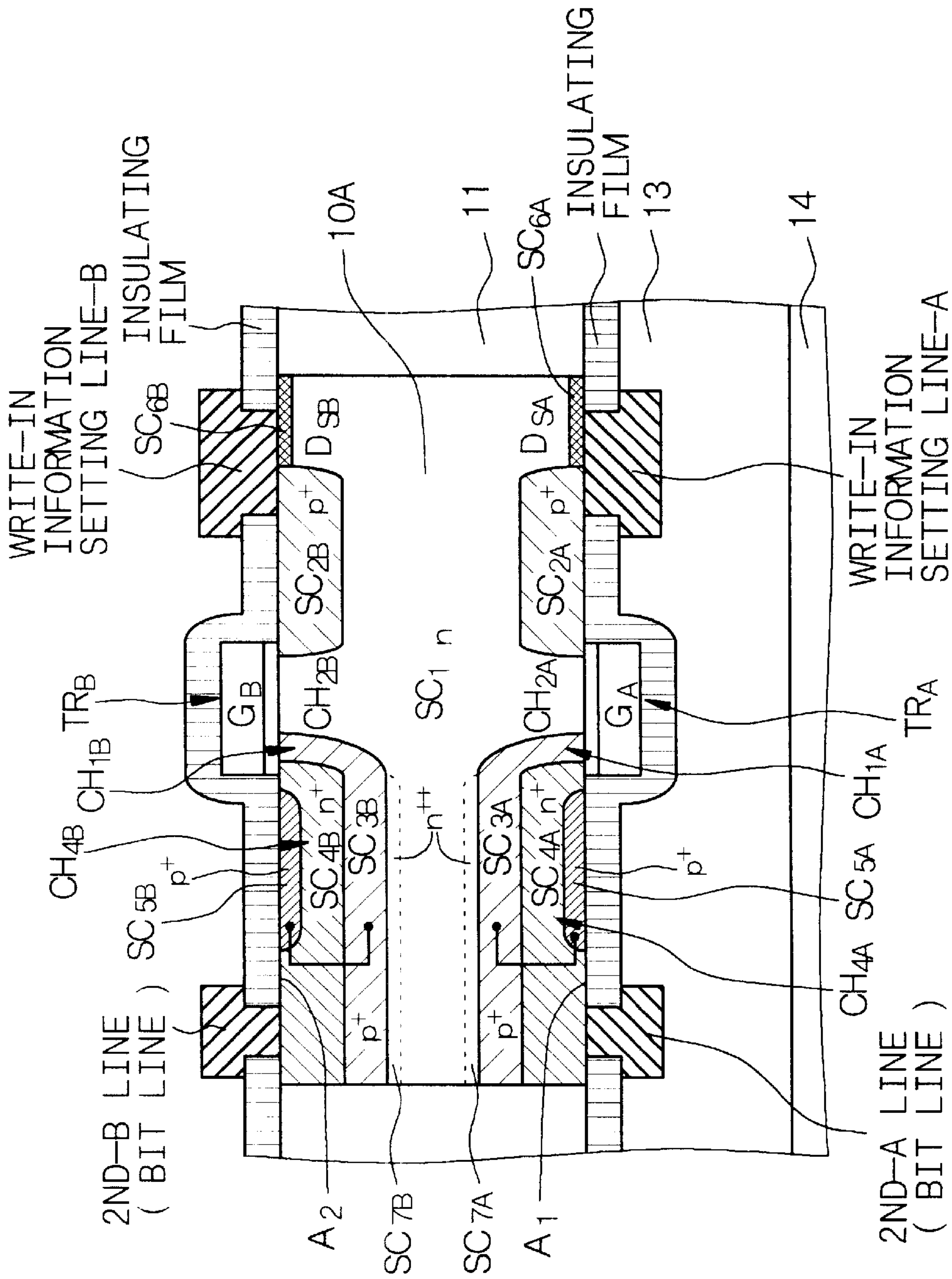

FIG. 207 is a schematic partial cross-sectional view of a modification of the semiconductor memory cell in Example 25 shown in FIG. 206.

Figure 208:
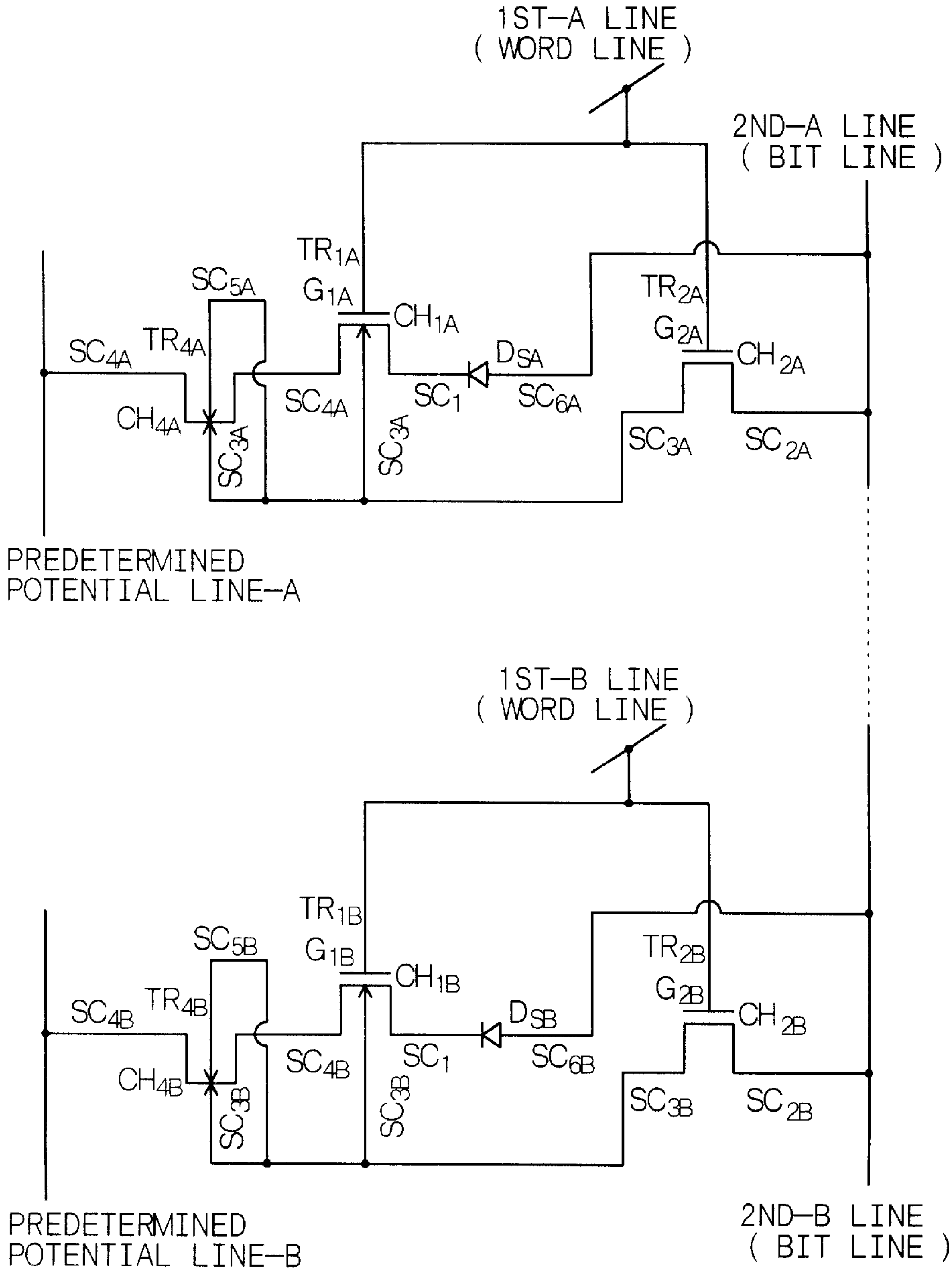

FIG. 208 is a principle drawing of a modification of the semiconductor memory cell in Example 25.

Figure 209:
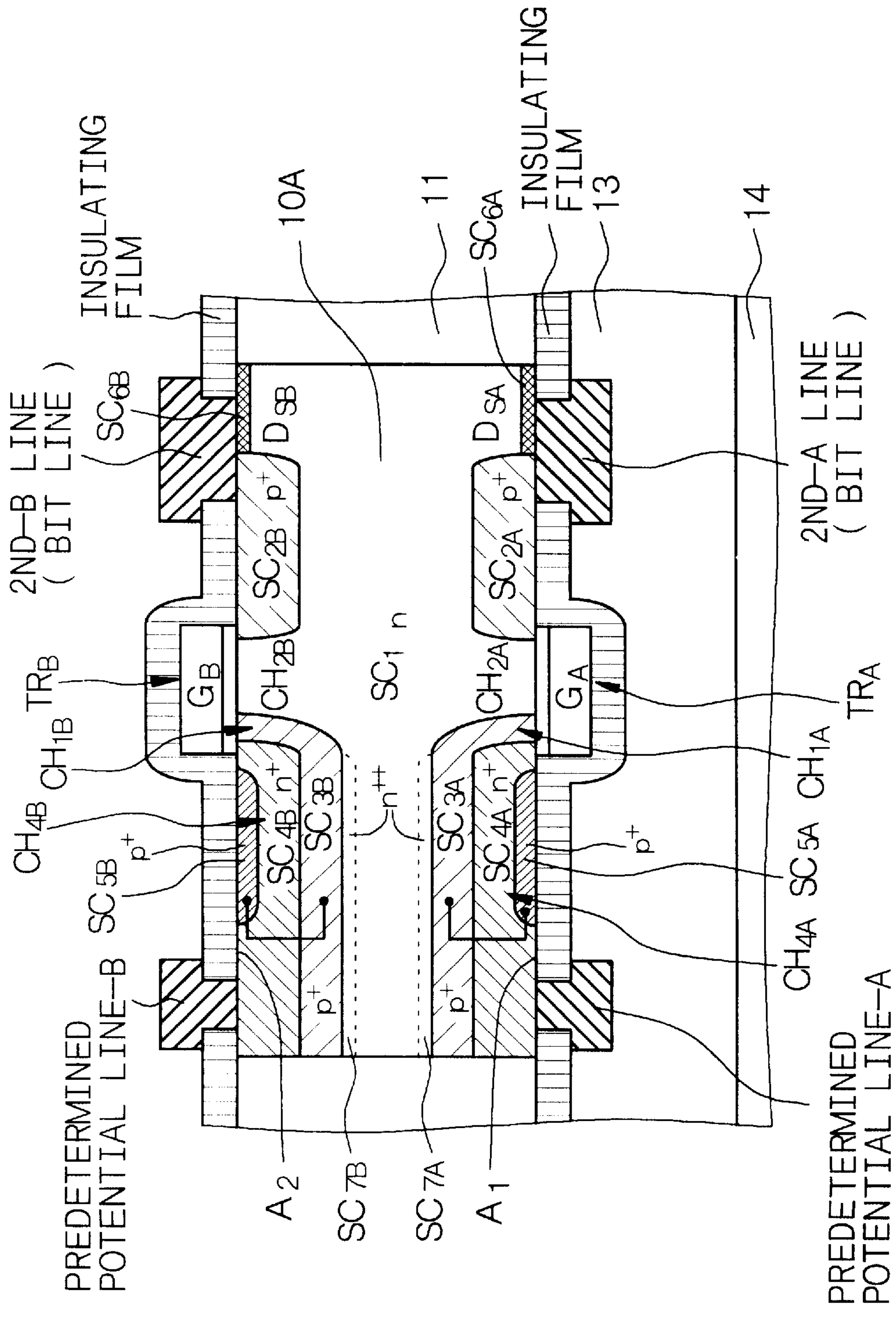

FIG. 209 is a schematic partial cross-sectional view of a modification of the semiconductor memory cell in Example 25 shown in FIG. 208.

Figure 210:
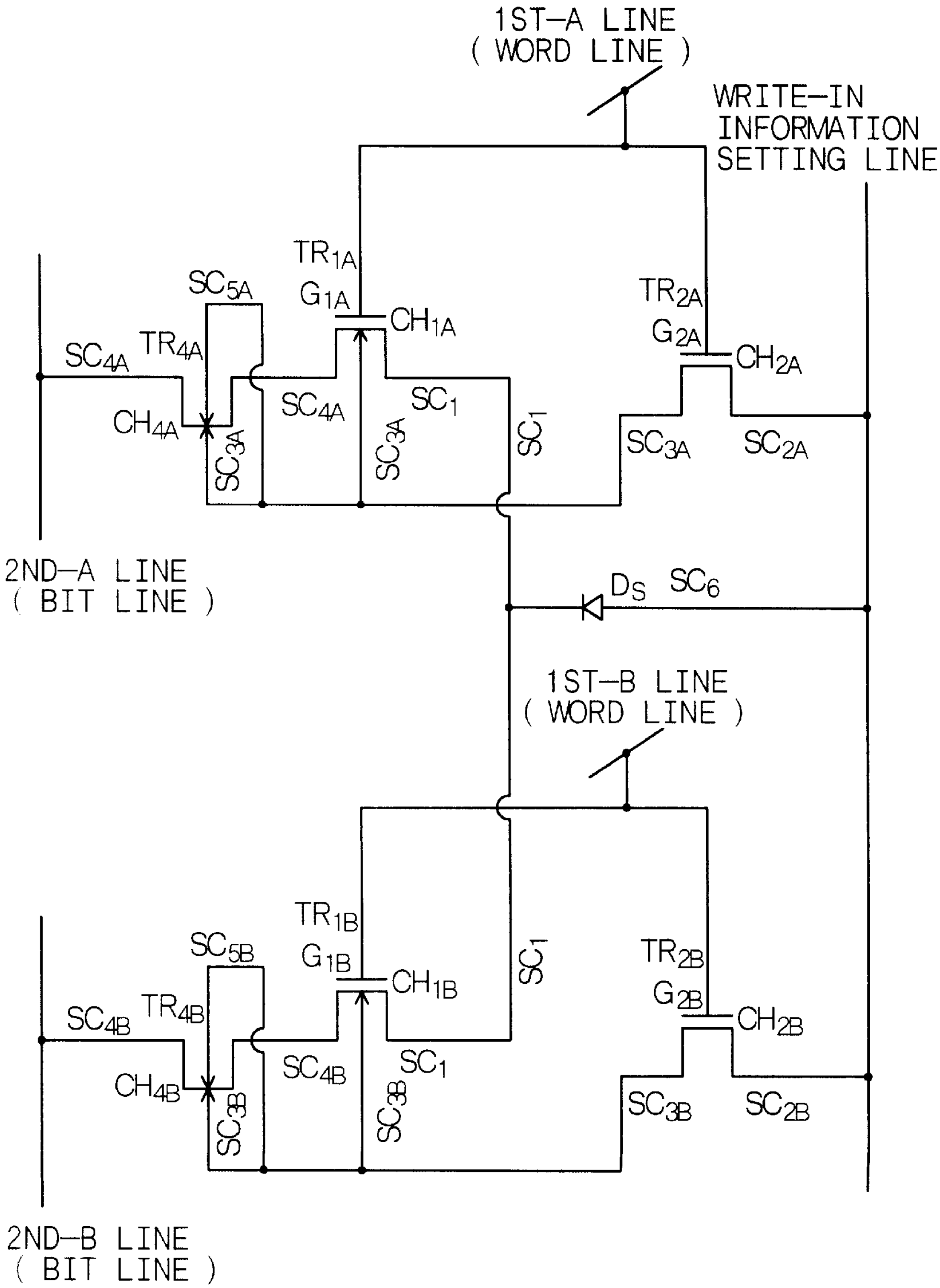

FIG. 210 is a principle drawing of a modification of the semiconductor memory cell in Example 25.

Figure 211:
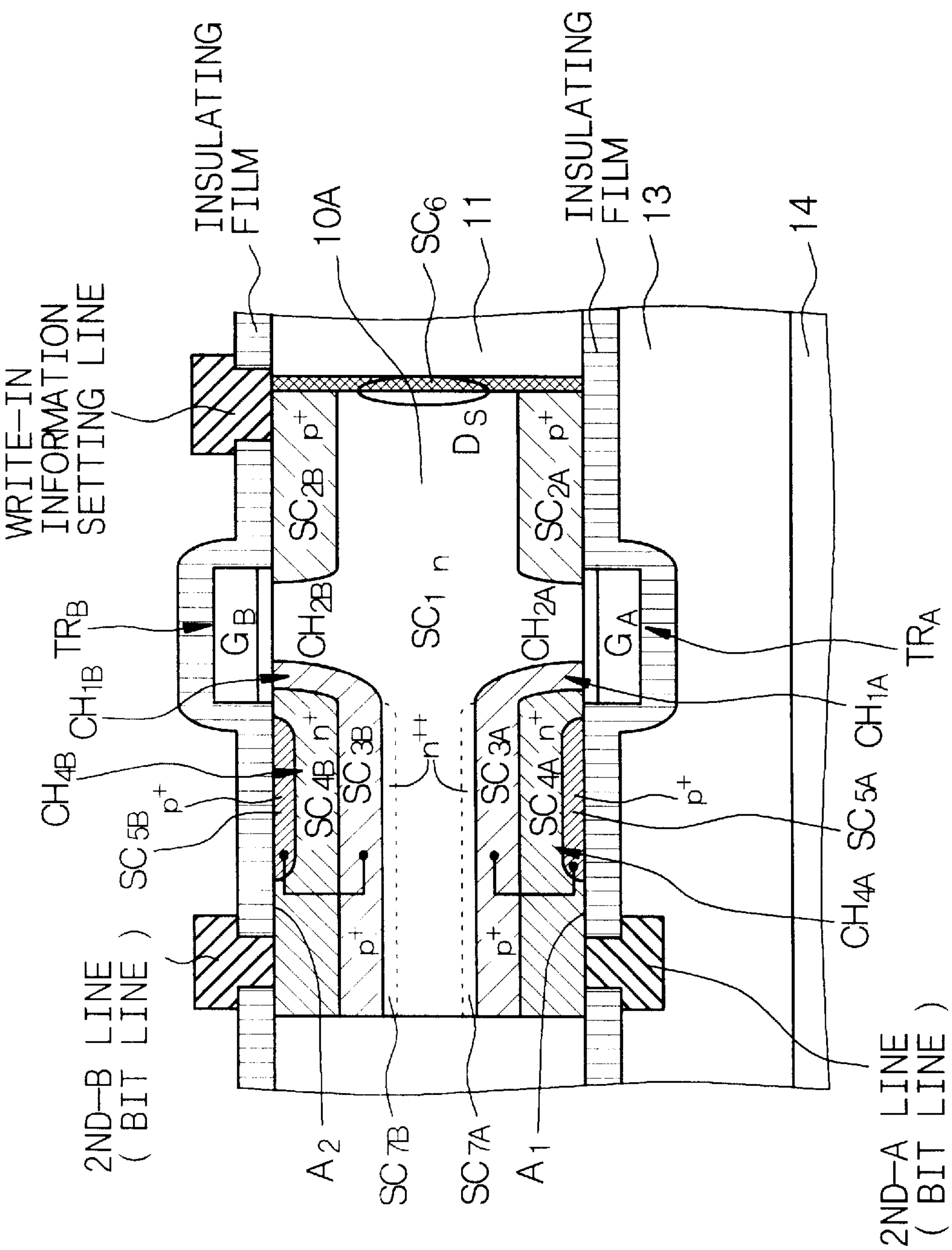

FIG. 211 is a schematic partial cross-sectional view of a modification of the semiconductor memory cell in Example 25 shown in FIG. 210.

Figure 212:
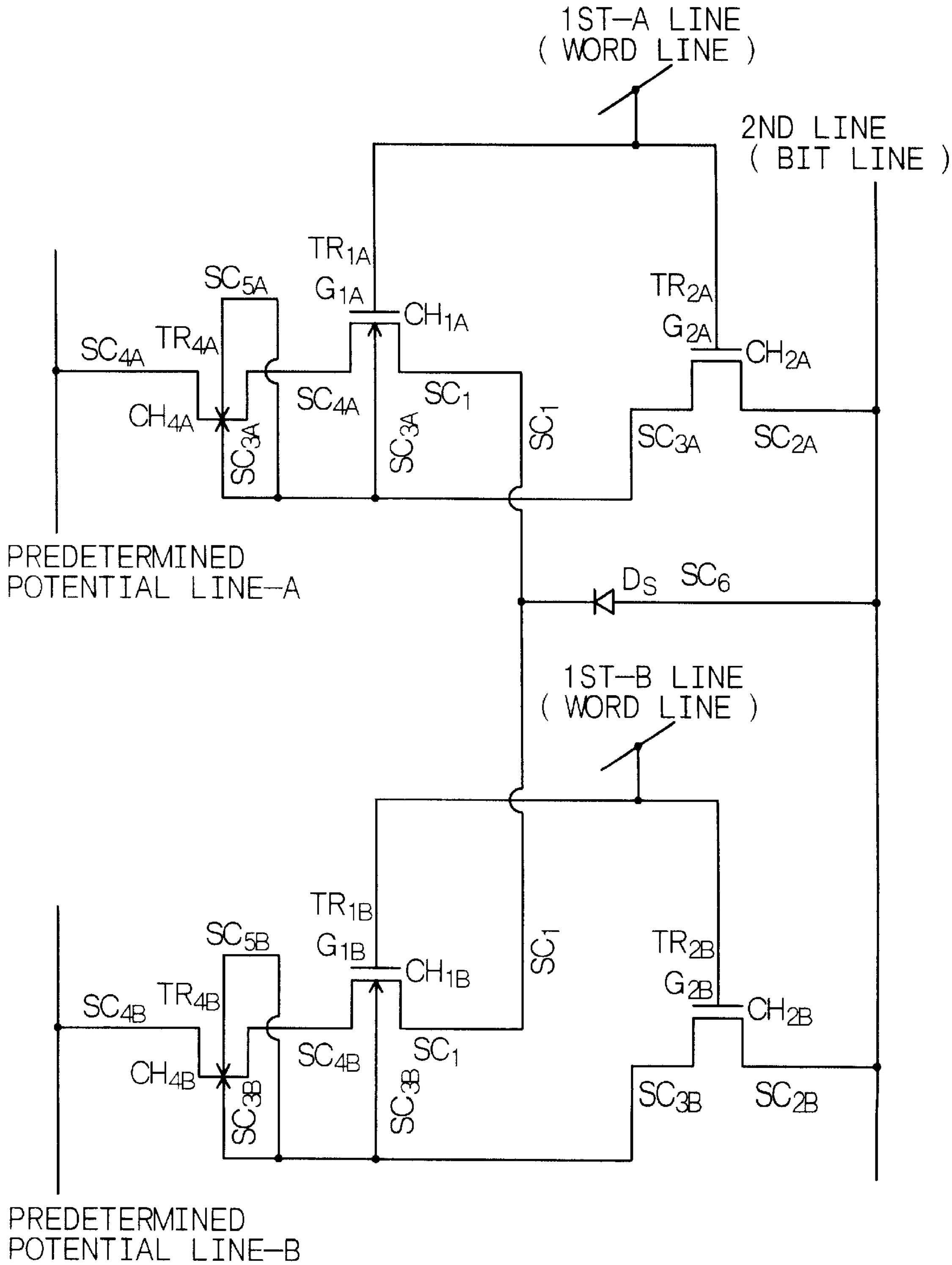

FIG. 212 is a principle drawing of a modification of the semiconductor memory cell in Example 25.

Figure 213:
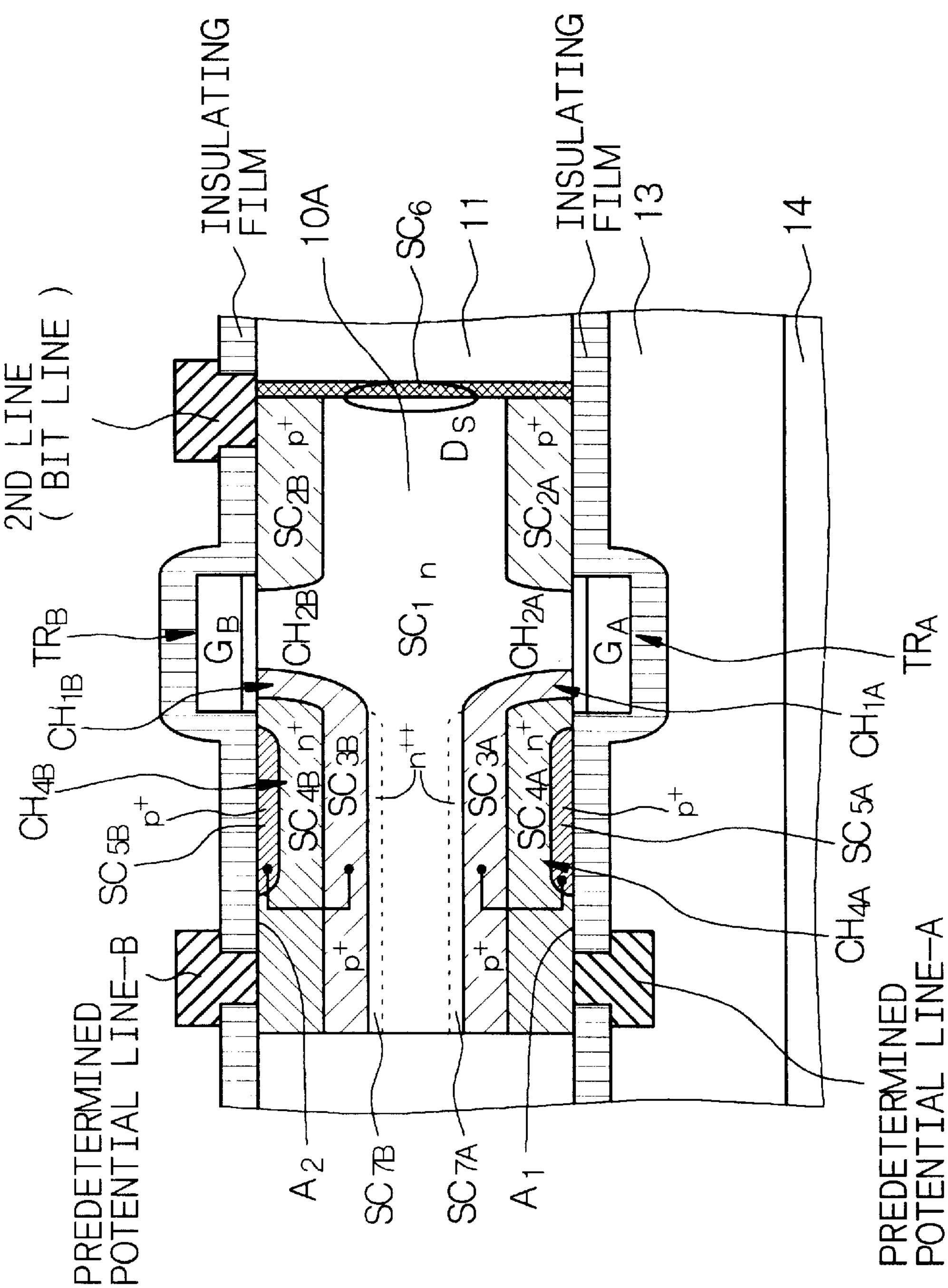

FIG. 213 is a schematic partial cross-sectional view of a modification of the semiconductor memory cell in Example 25 shown in FIG. 212.

Figure 214:
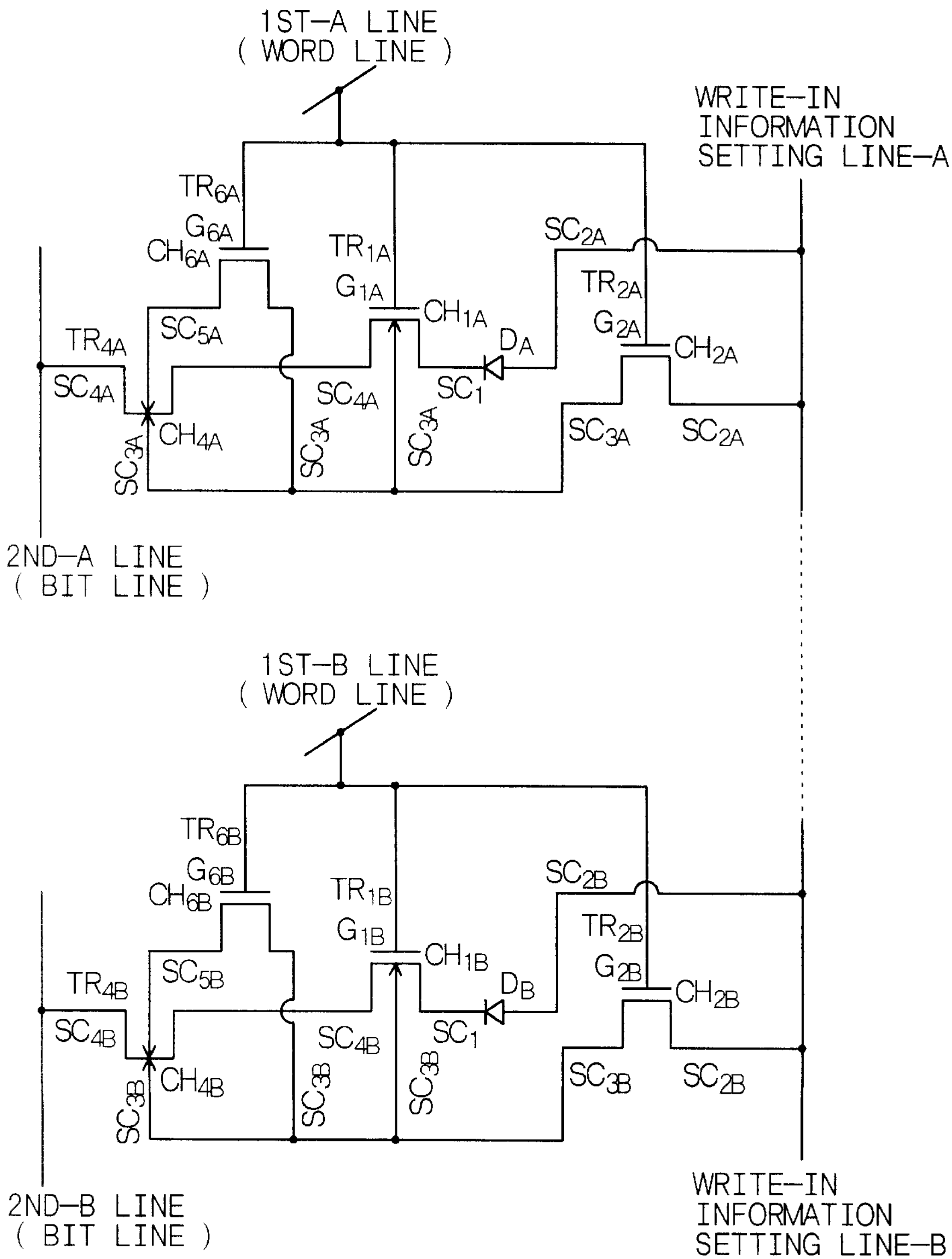

FIG. 214 is a principle drawing of the semiconductor memory cell in Example 26.

Figure 215:
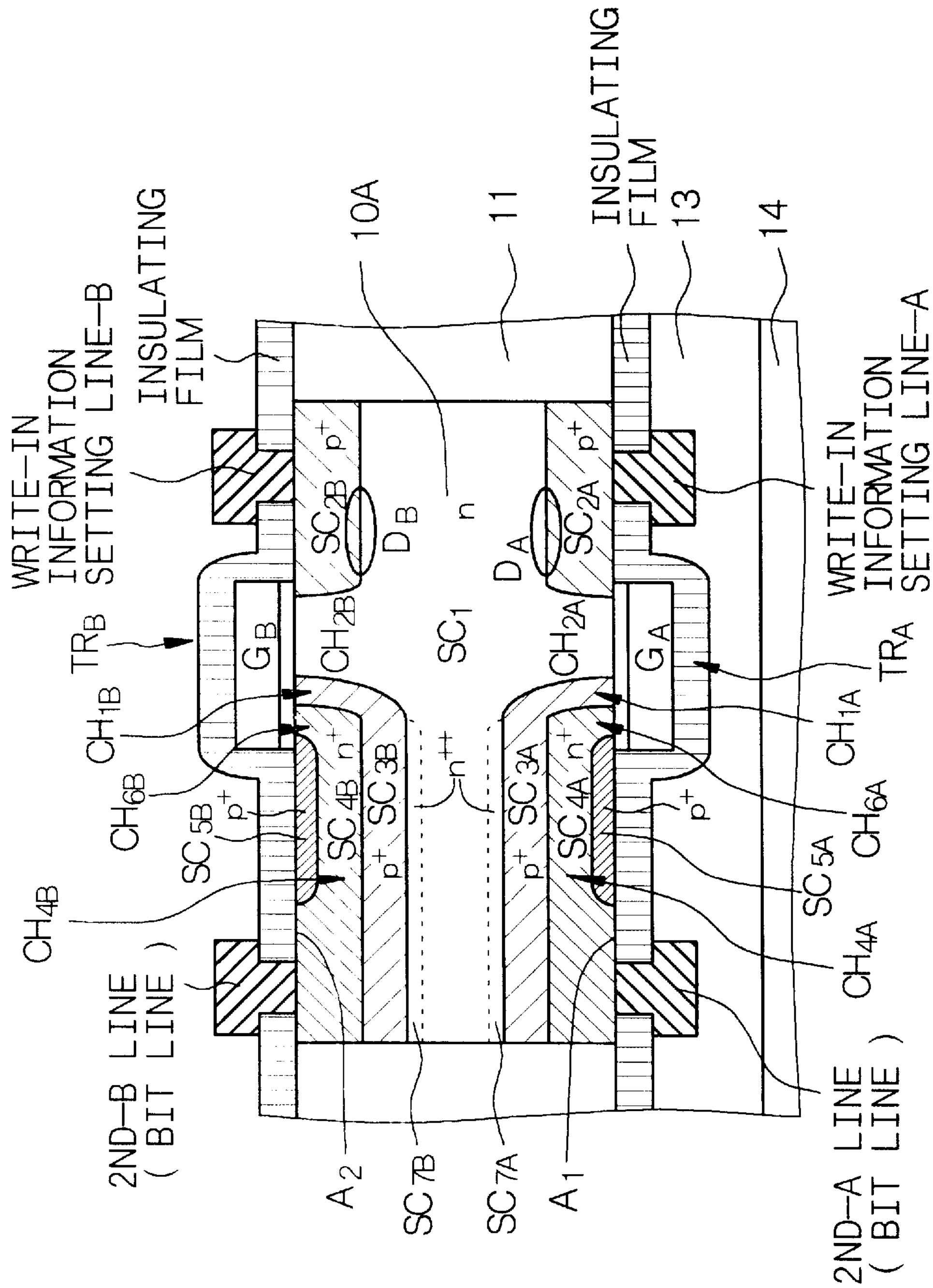

FIG. 215 is a schematic partial cross-sectional view of a semiconductor memory cell in Example 26 shown in FIG. 214.

Figure 216:
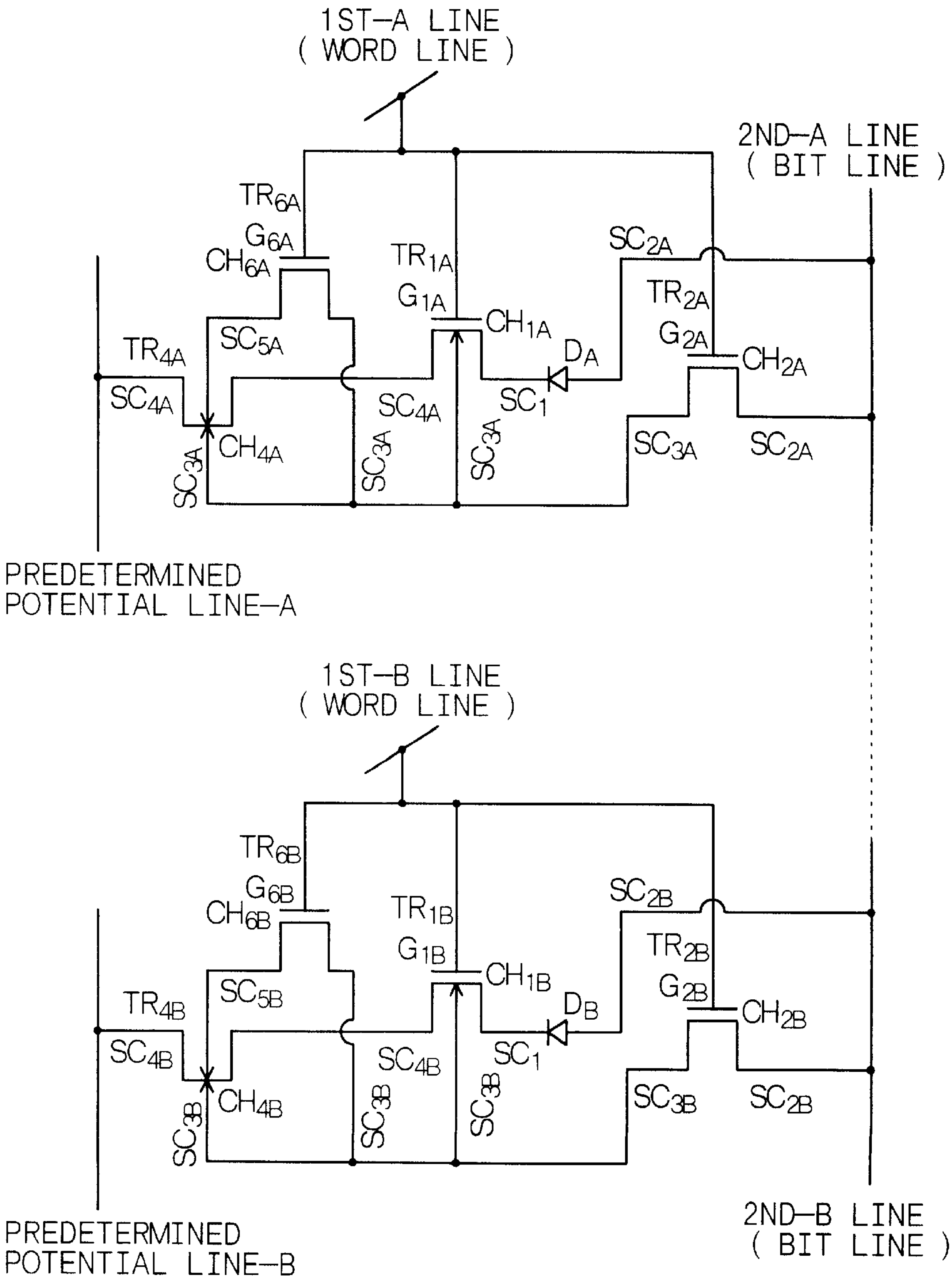

FIG. 216 is a principle drawing of a modification of the semiconductor memory cell in Example 26.

Figure 217:
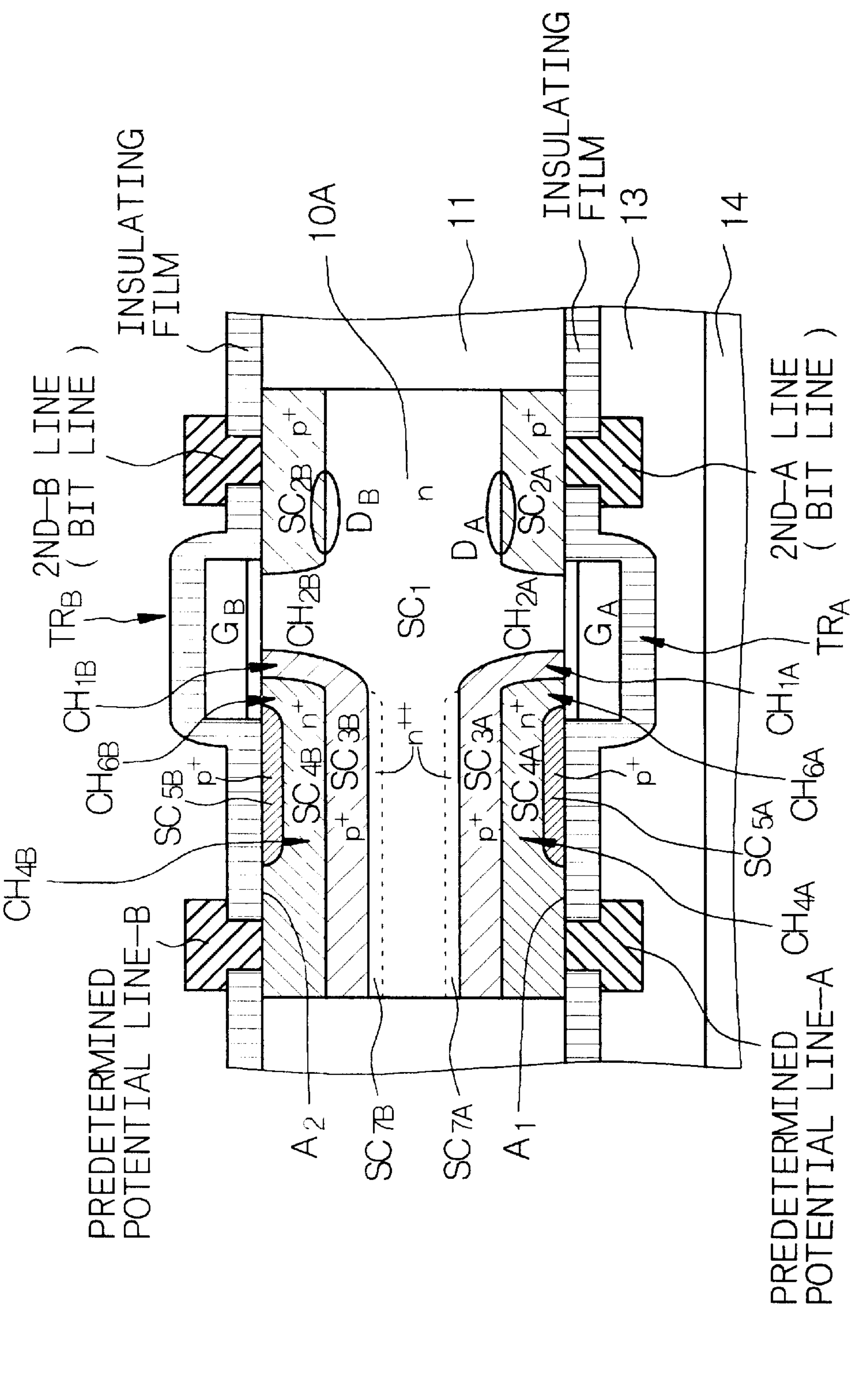

FIG. 217 is a schematic partial cross-sectional view of a modification of the semiconductor memory cell in Example 26 shown in FIG. 216.

Figure 218:
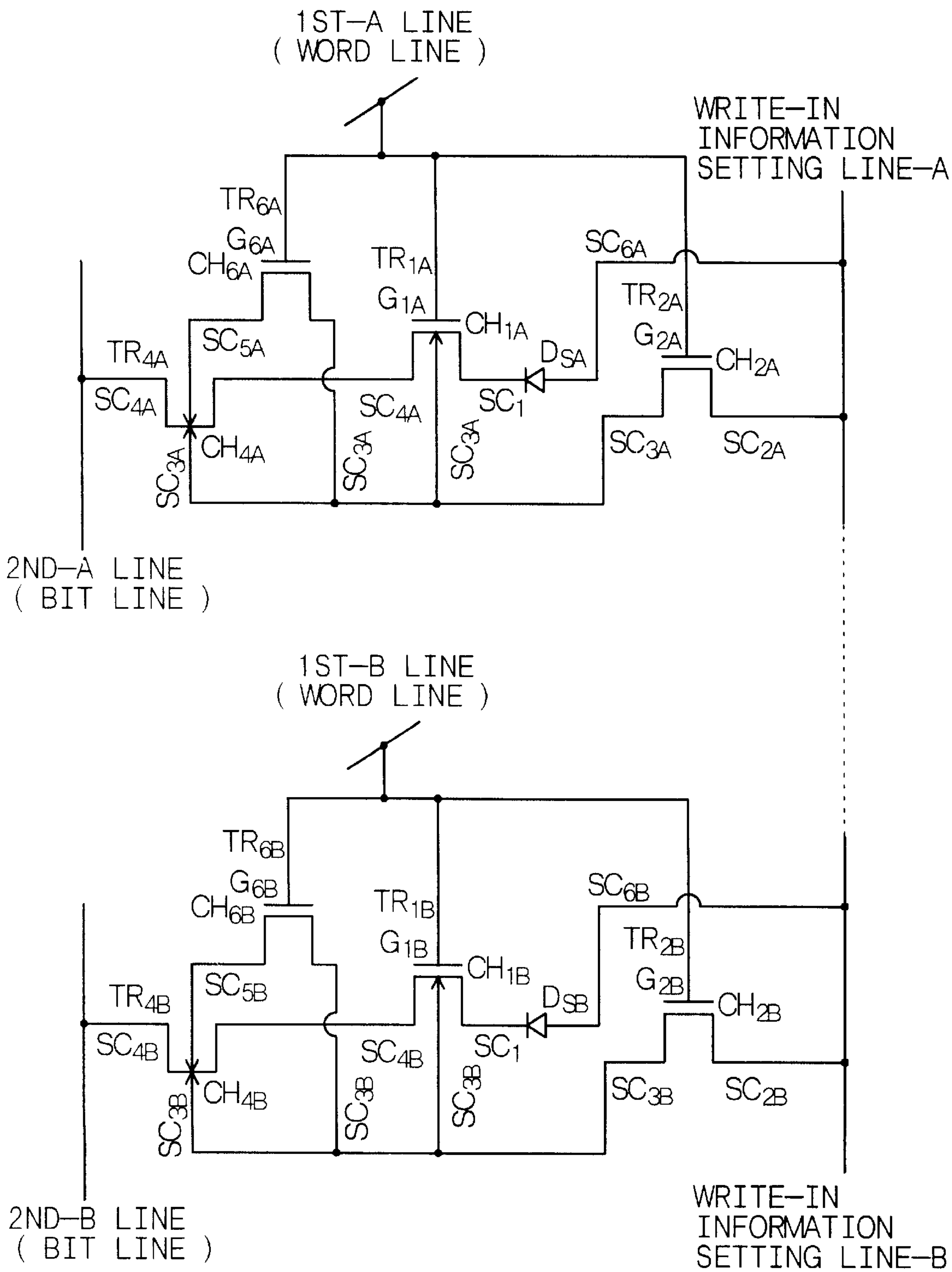

FIG. 218 is a principle drawing of a modification of the semiconductor memory cell in Example 26.

Figure 219:
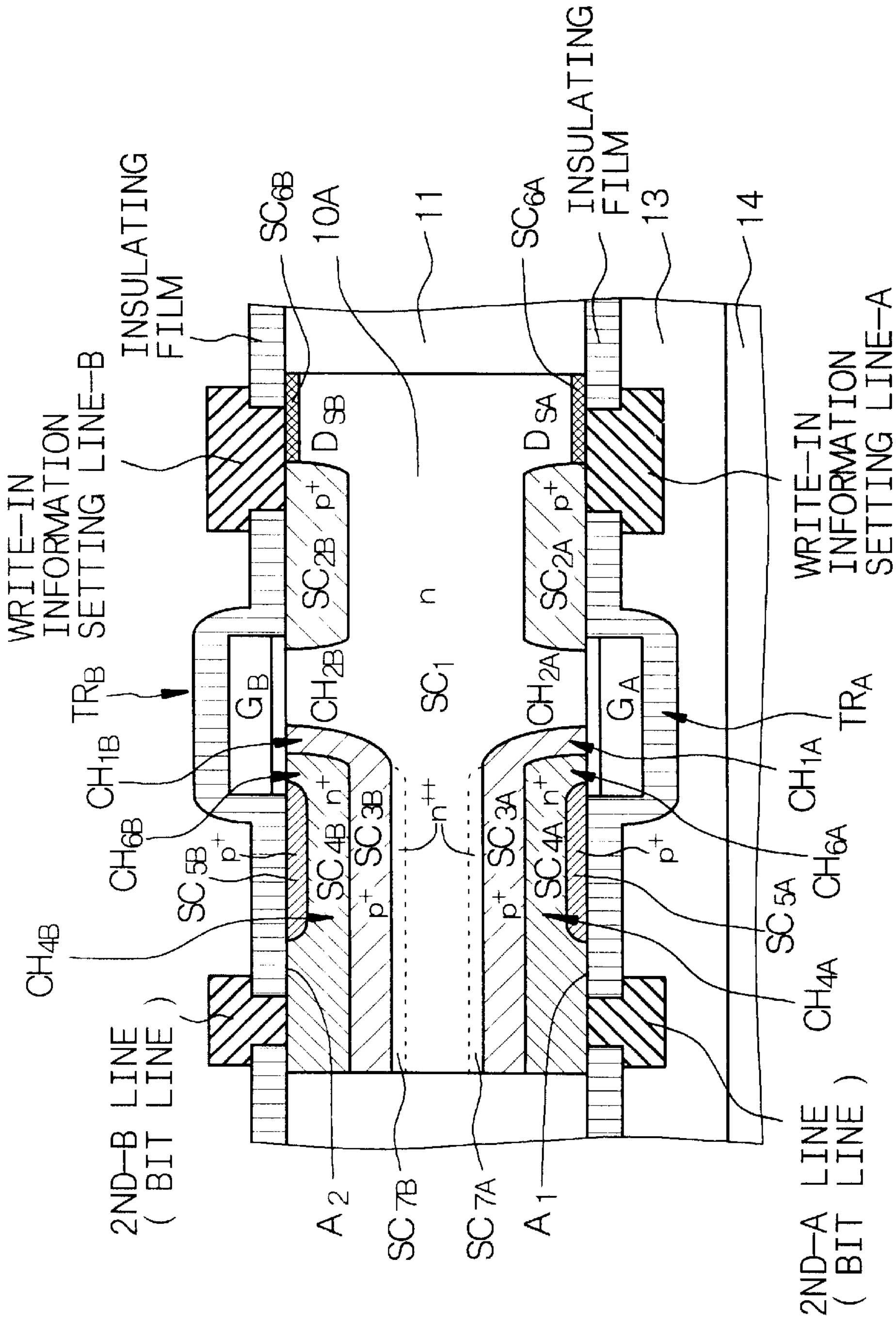

FIG. 219 is a schematic partial cross-sectional view of a modification of the semiconductor memory cell in Example 26 shown in FIG. 218.

Figure 220:
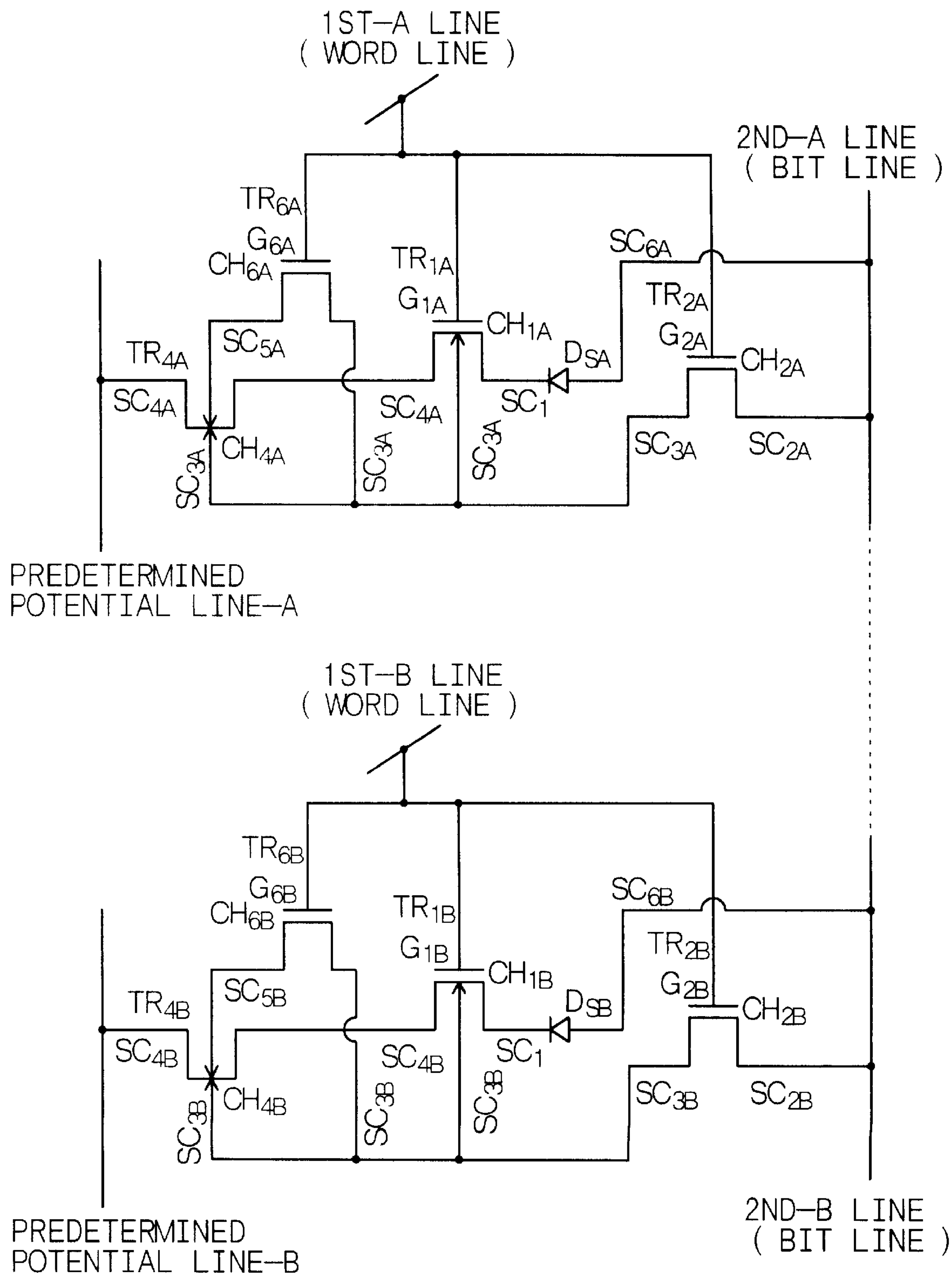

FIG. 220 is a principle drawing of a modification of the semiconductor memory cell in Example 26.

Figure 221:
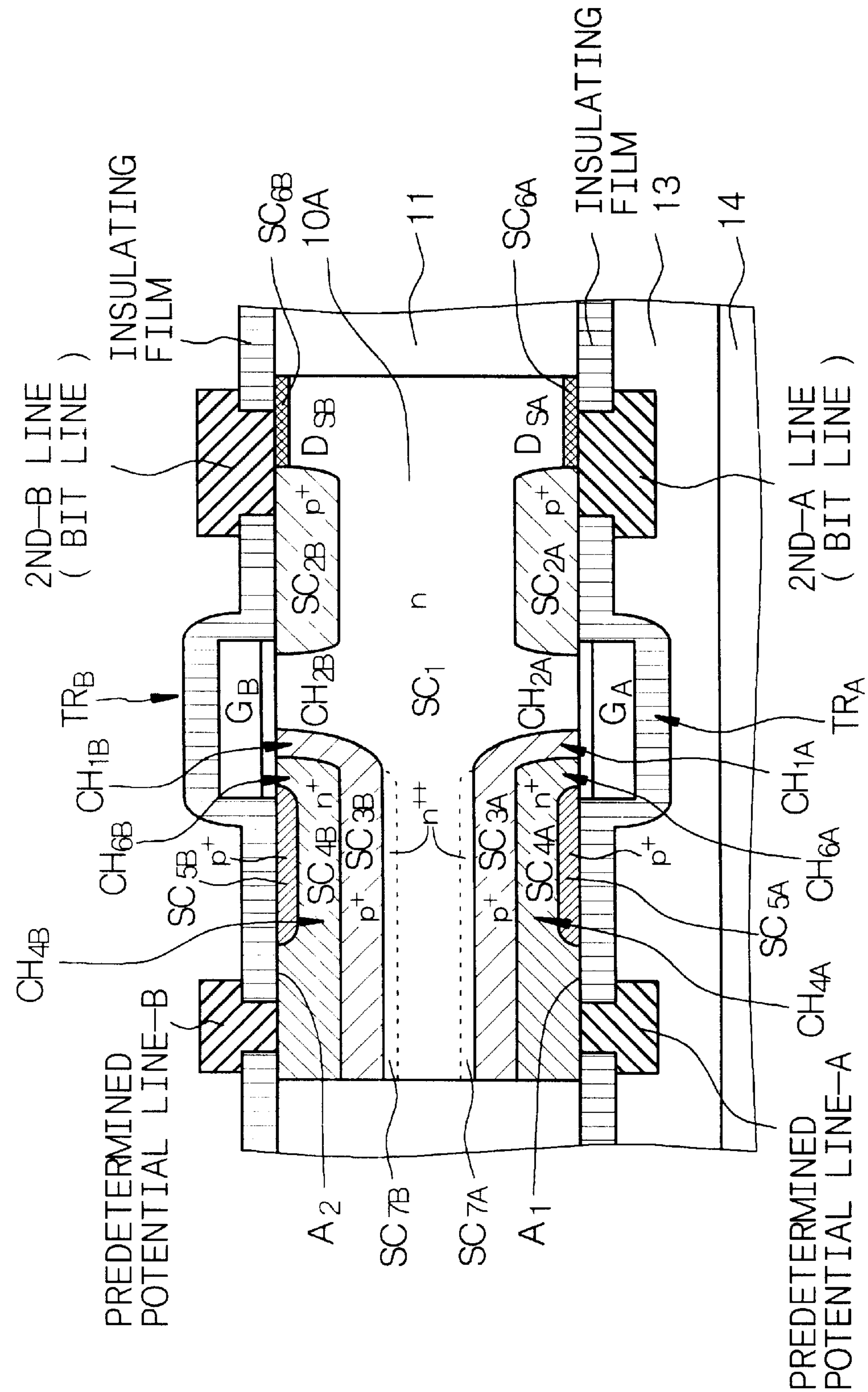

FIG. 221 is a schematic partial cross-sectional view of a modification of the semiconductor memory cell in Example 26 shown in FIG. 220.

Figure 222:
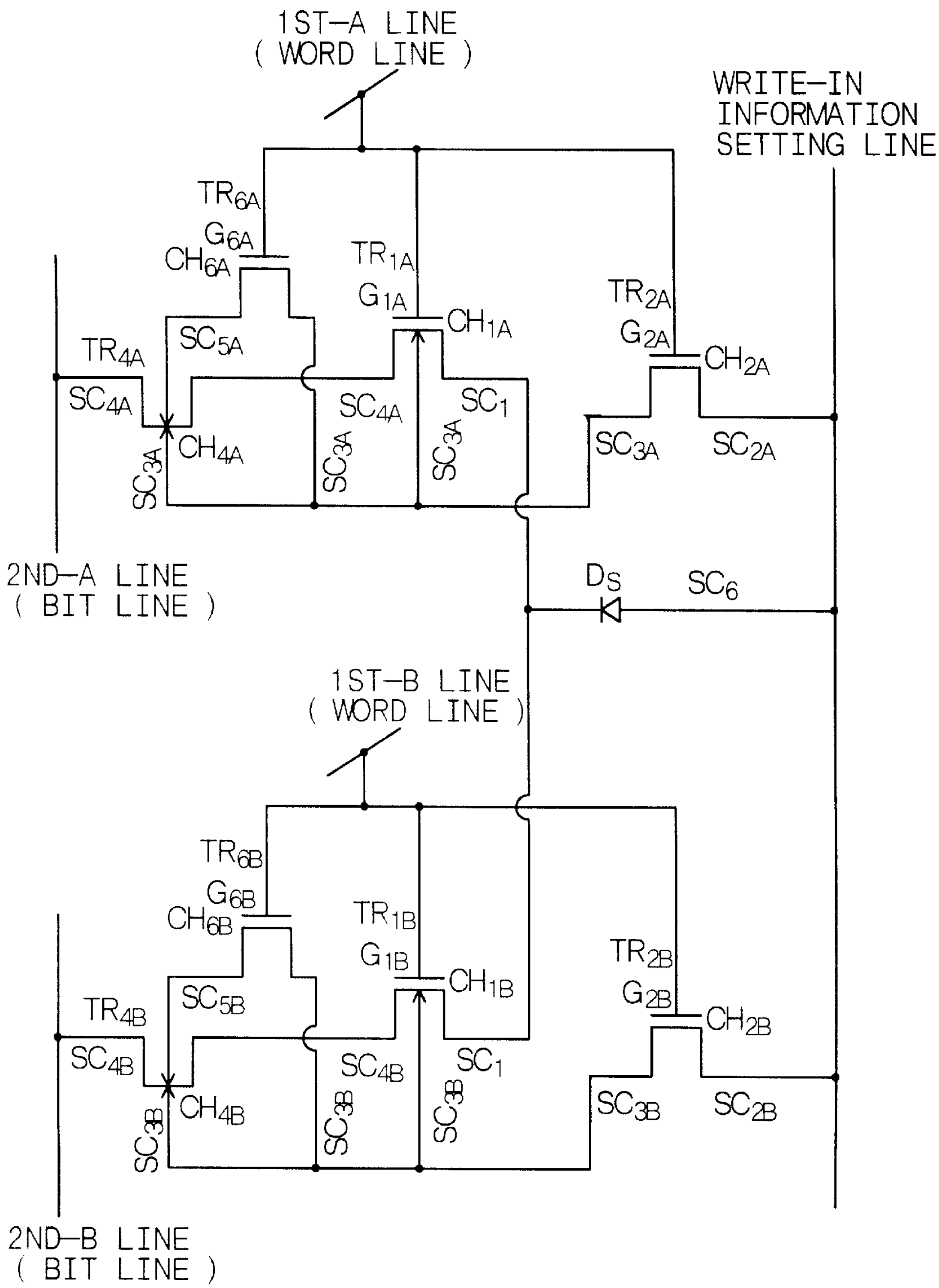

FIG. 222 is a principle drawing of a modification of the semiconductor memory cell in Example 26.

Figure 223:
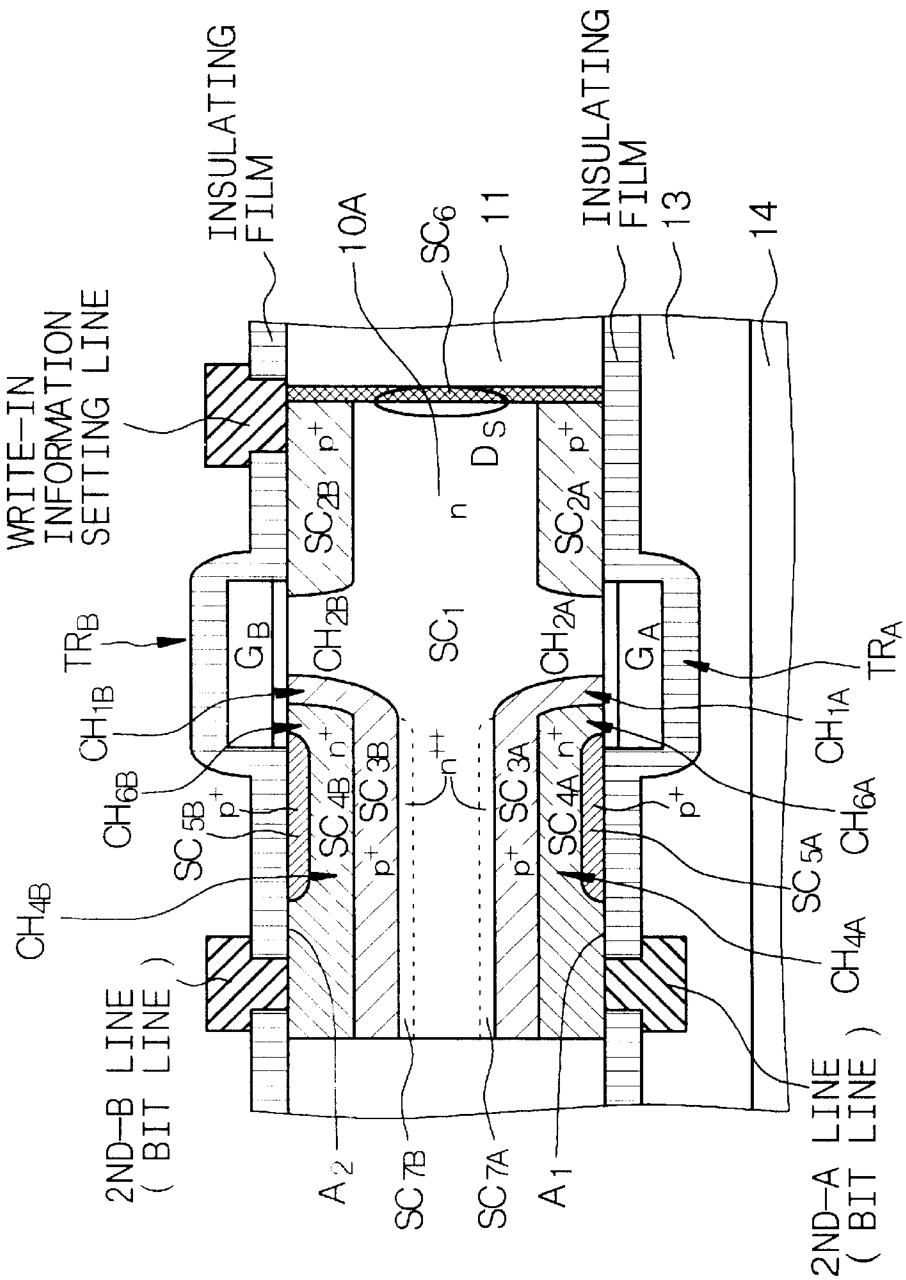

FIG. 223 is a schematic partial cross-sectional view of a modification of the semiconductor memory cell in Example 26 shown in FIG. 222.

Figure 224:
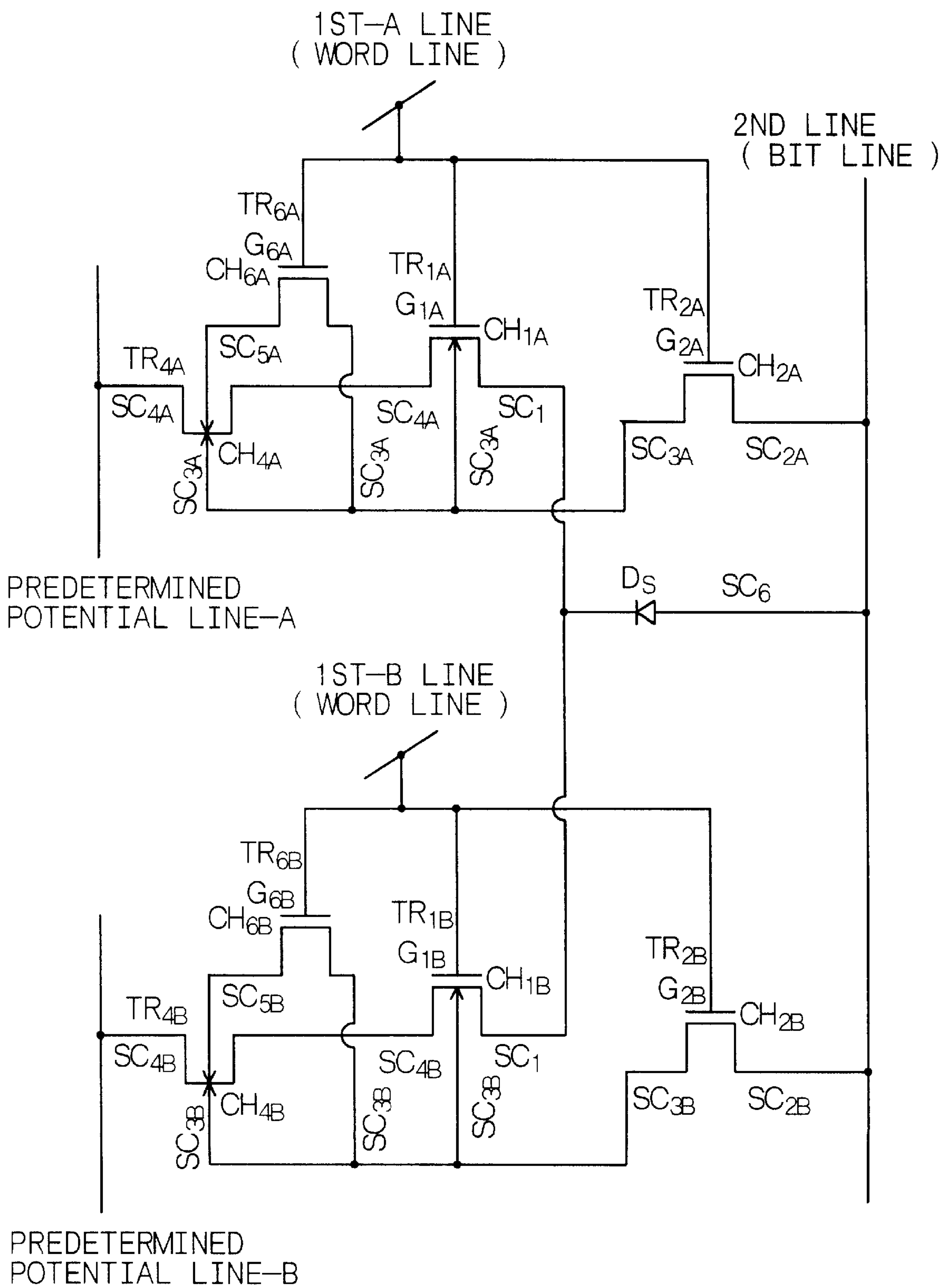

FIG. 224 is a principle drawing of a modification of the semiconductor memory cell in Example 26.

Figure 225:
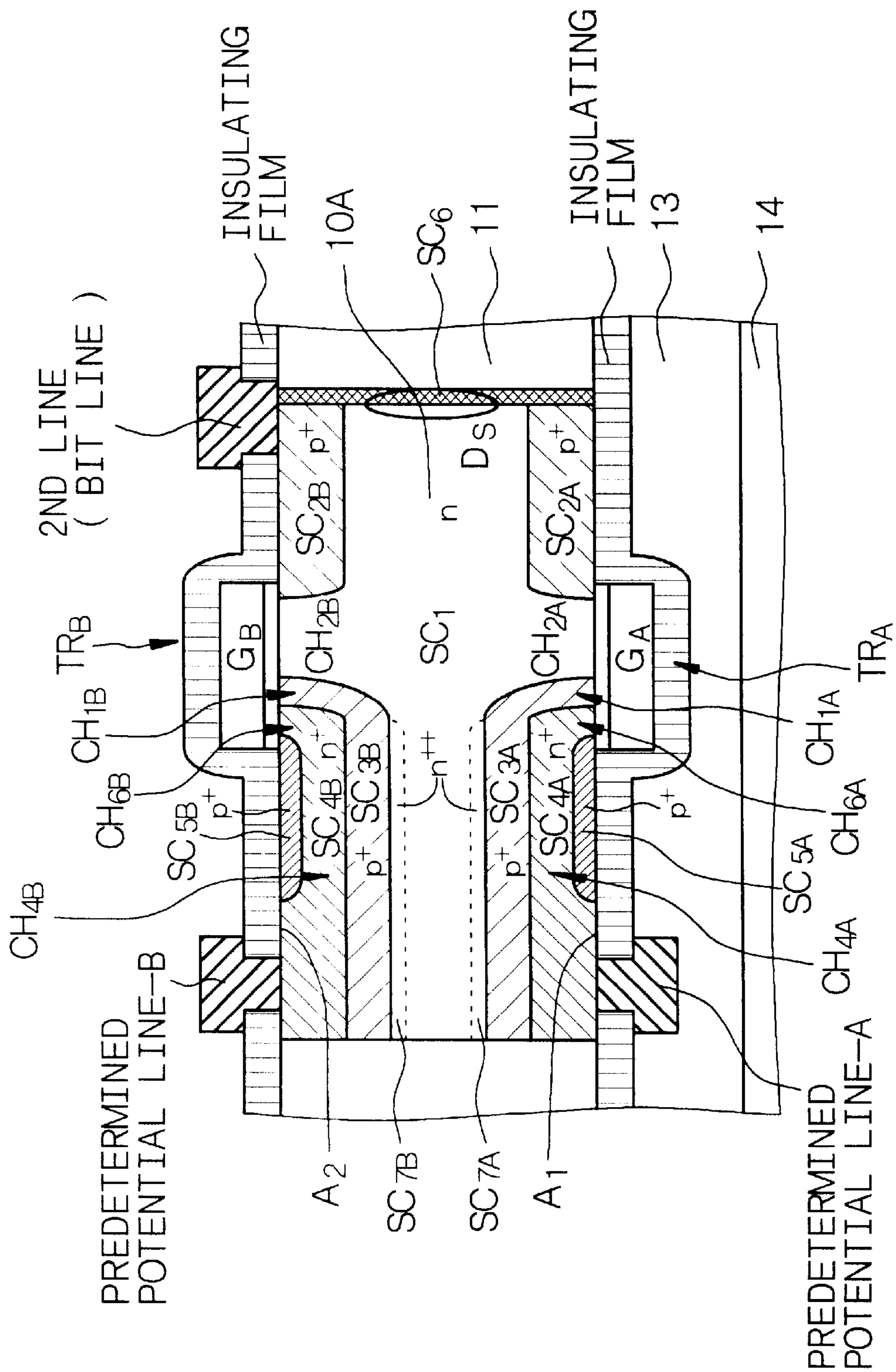

FIG. 225 is a schematic partial cross-sectional view of a modification of the semiconductor memory cell in Example 26 shown in FIG. 224.

Figure 226:
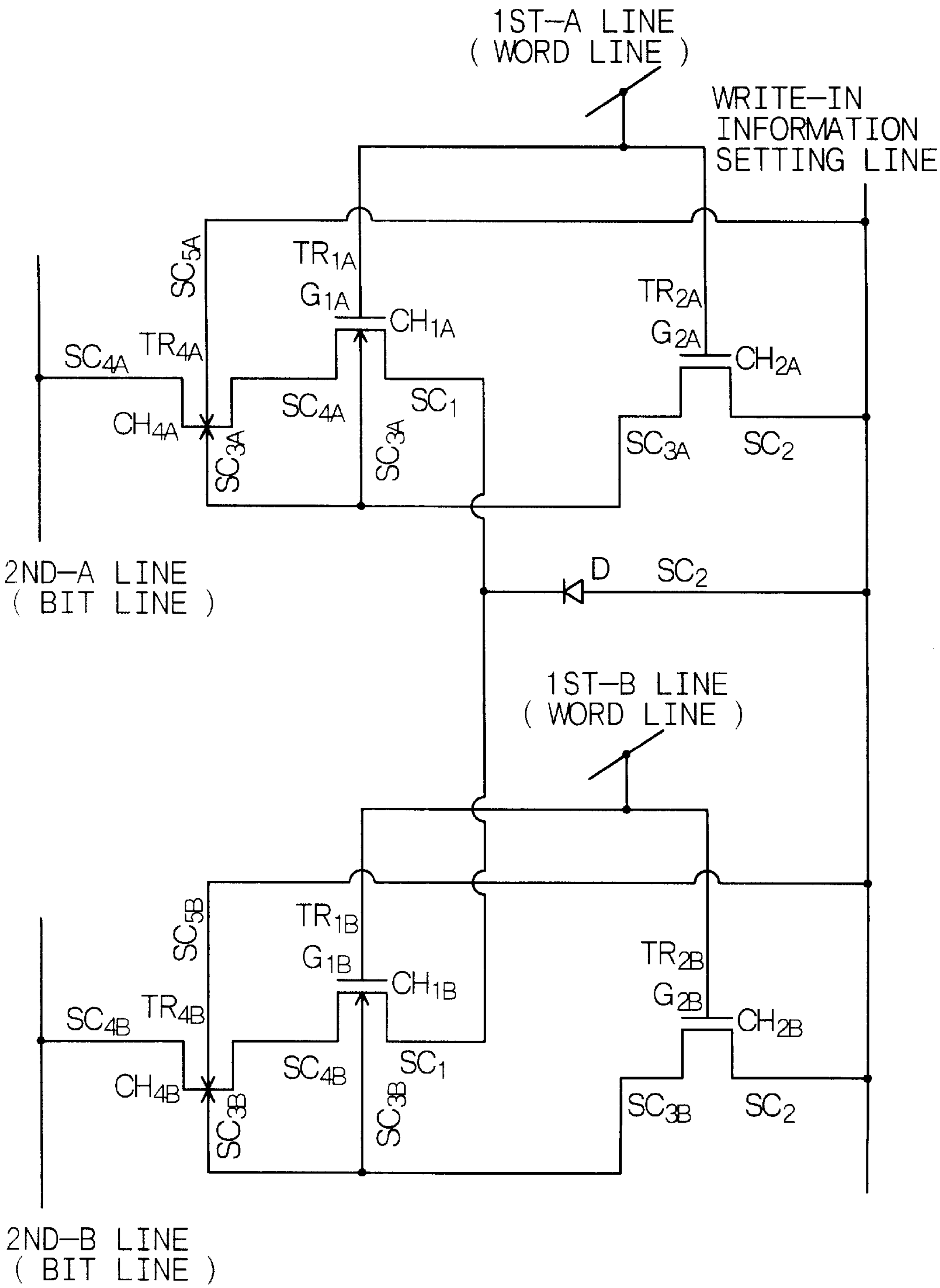

FIG. 226 is a principle drawing of the semiconductor memory cell in Example 27.

Figure 227:
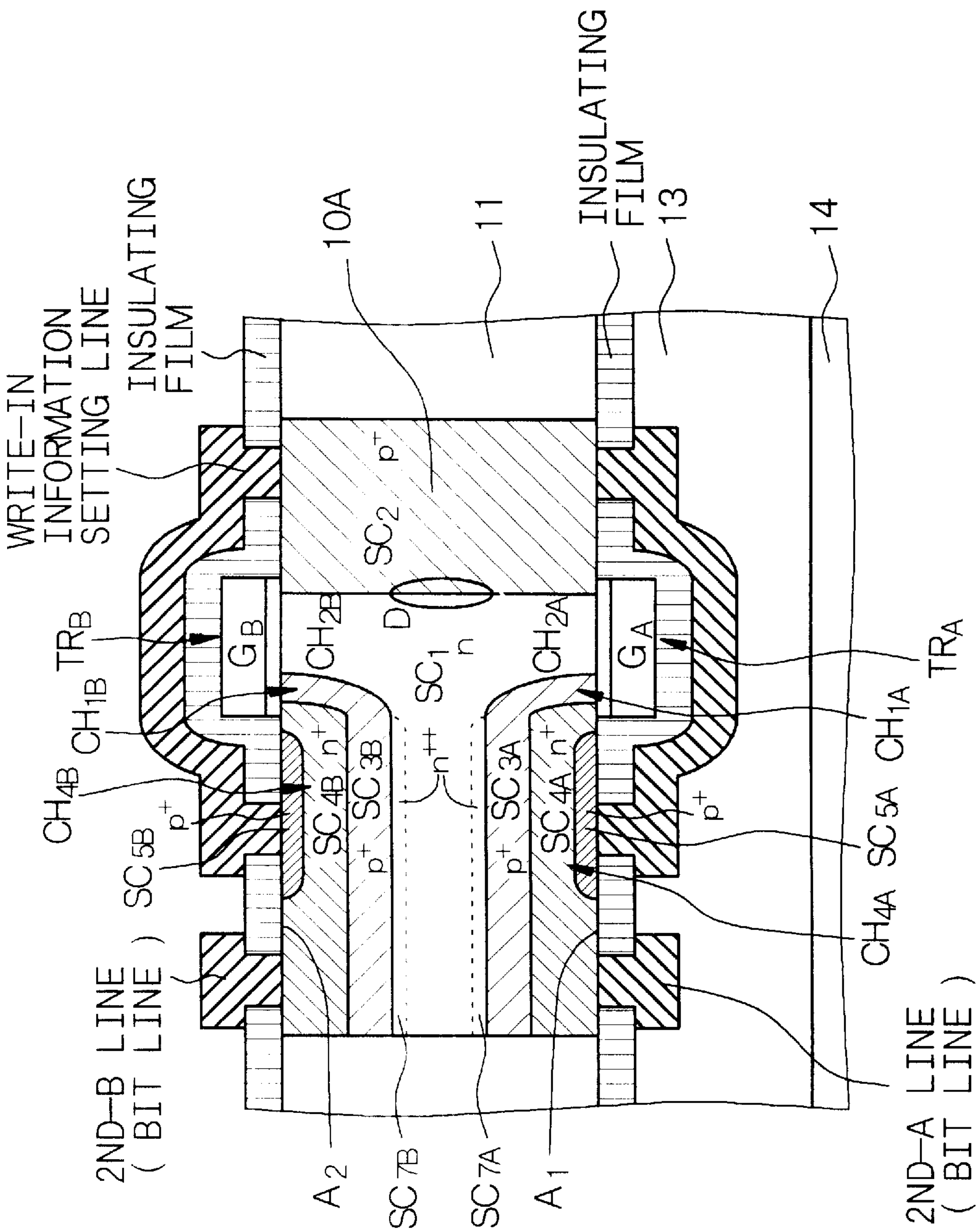

FIG. 227 is a schematic partial cross-sectional view of a semiconductor memory cell in Example 27 shown in FIG. 226.

Figure 228:
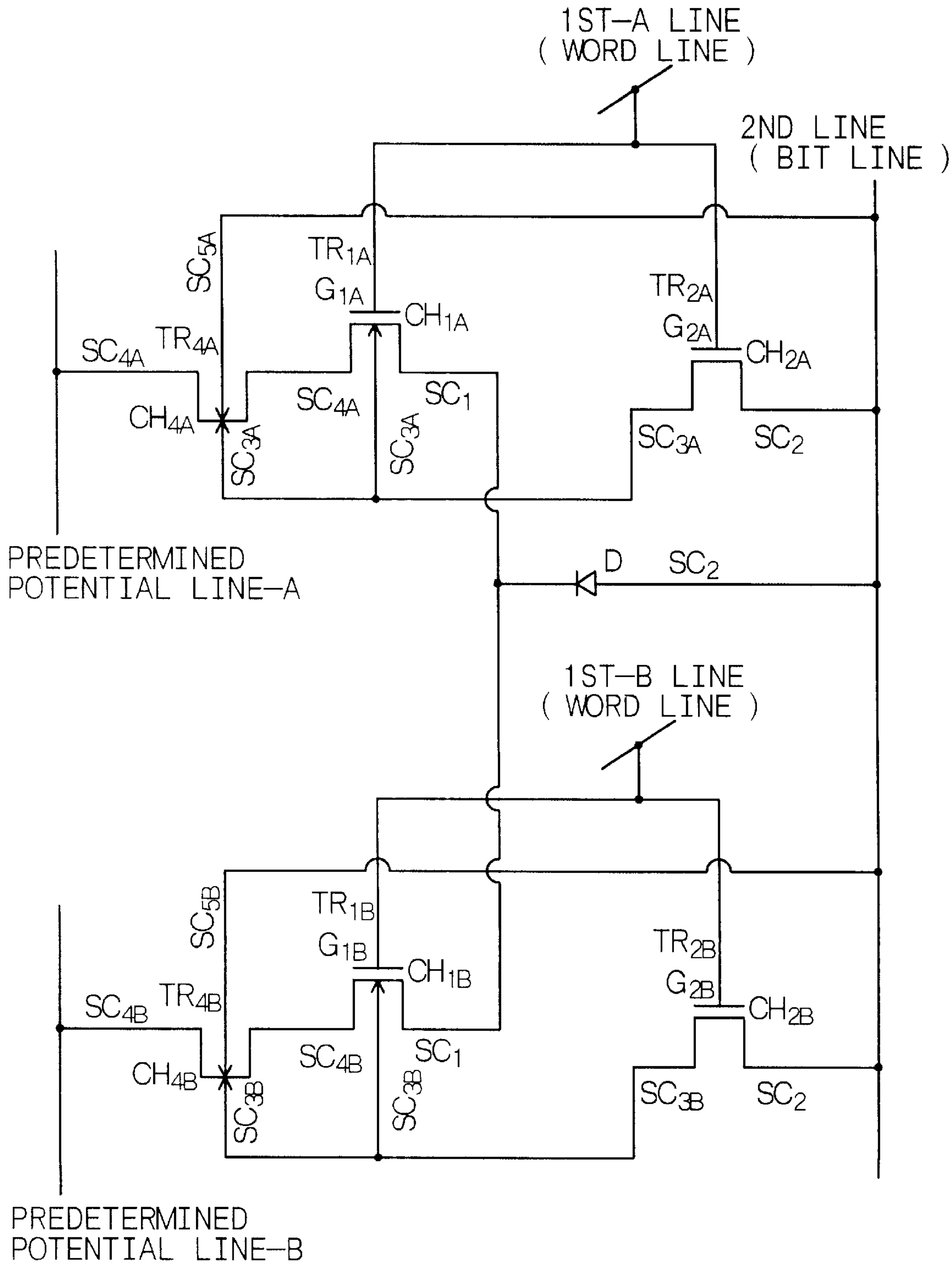

FIG. 228 is a principle drawing of a modification of the semiconductor memory cell in Example 27.

Figure 229:
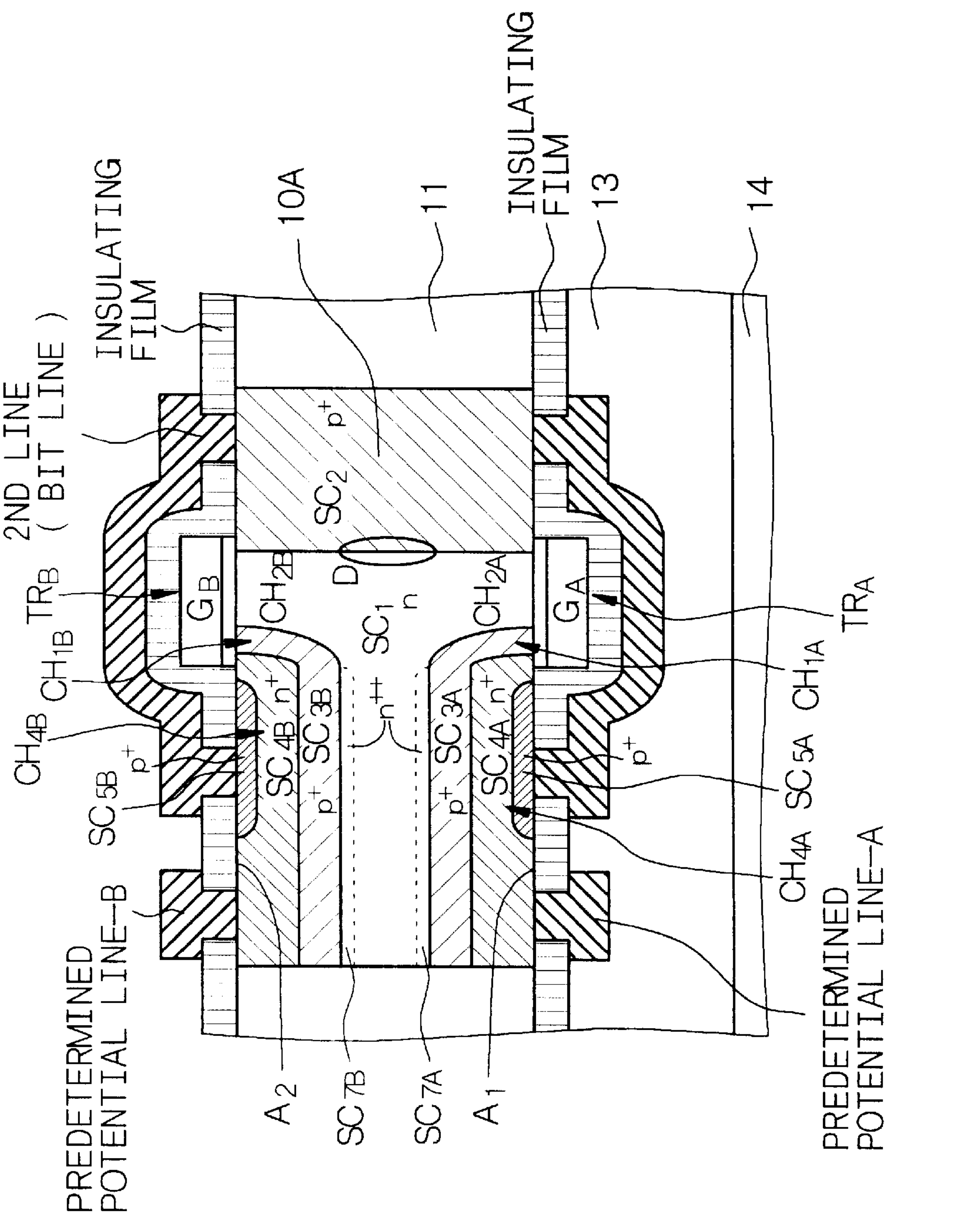

FIG. 229 is a schematic partial cross-sectional view of a modification of the semiconductor memory cell in Example 27 shown in FIG. 228.

Figure 230:
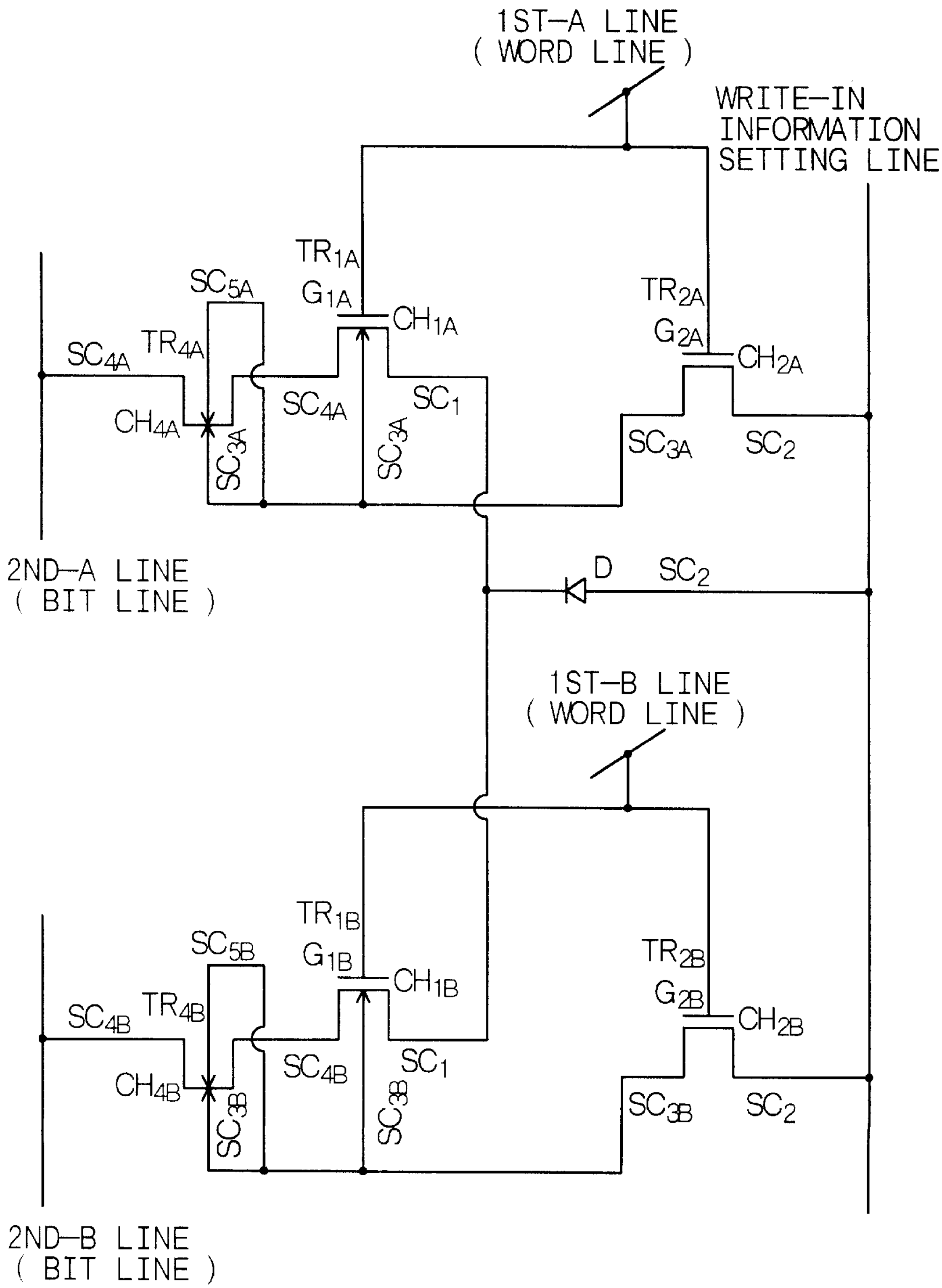

FIG. 230 is a principle drawing of a modification of the semiconductor memory cell in Example 27.

Figure 231:
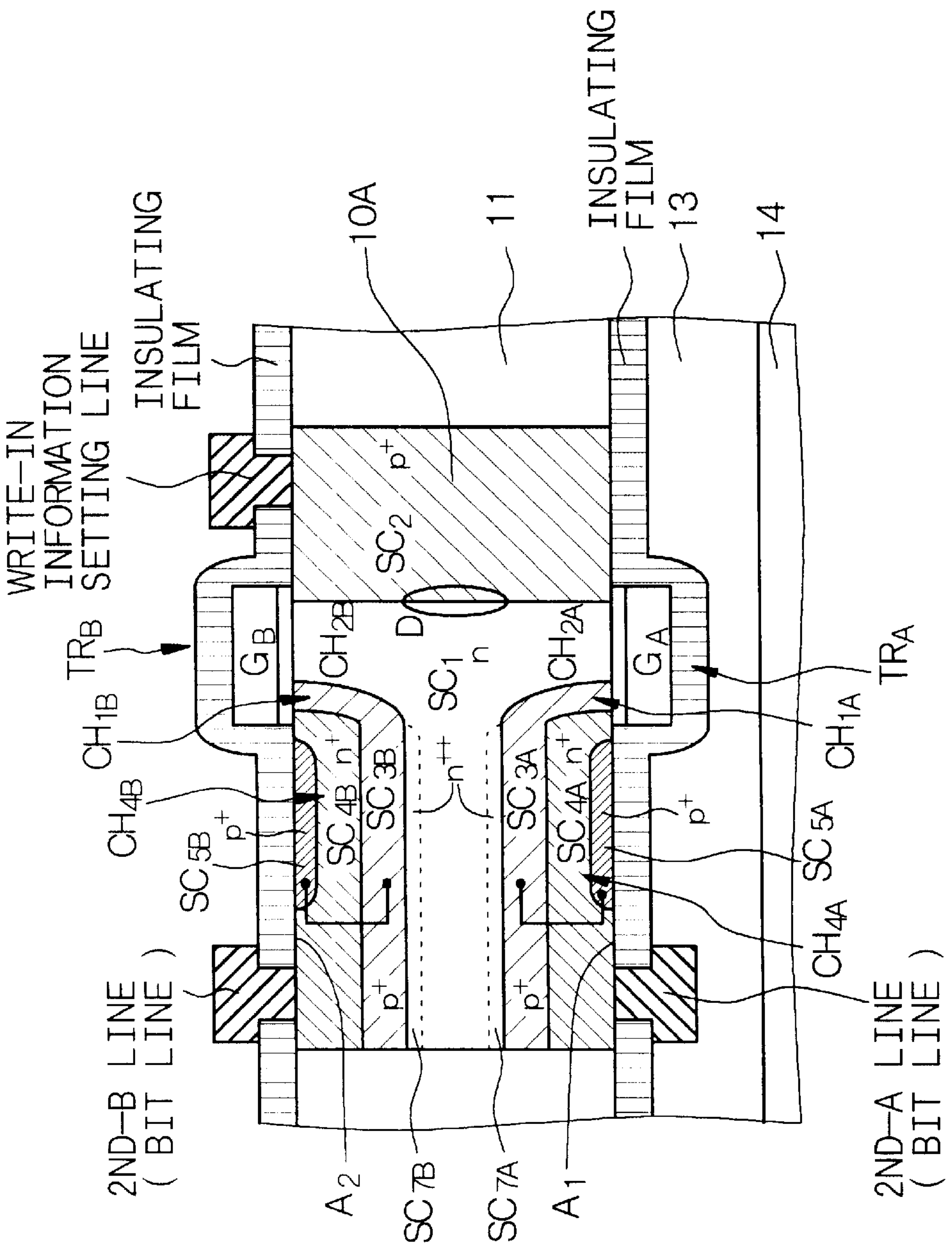

FIG. 231 is a schematic partial cross-sectional view of a modification of the semiconductor memory cell in Example 27 shown in FIG. 230.

Figure 232:
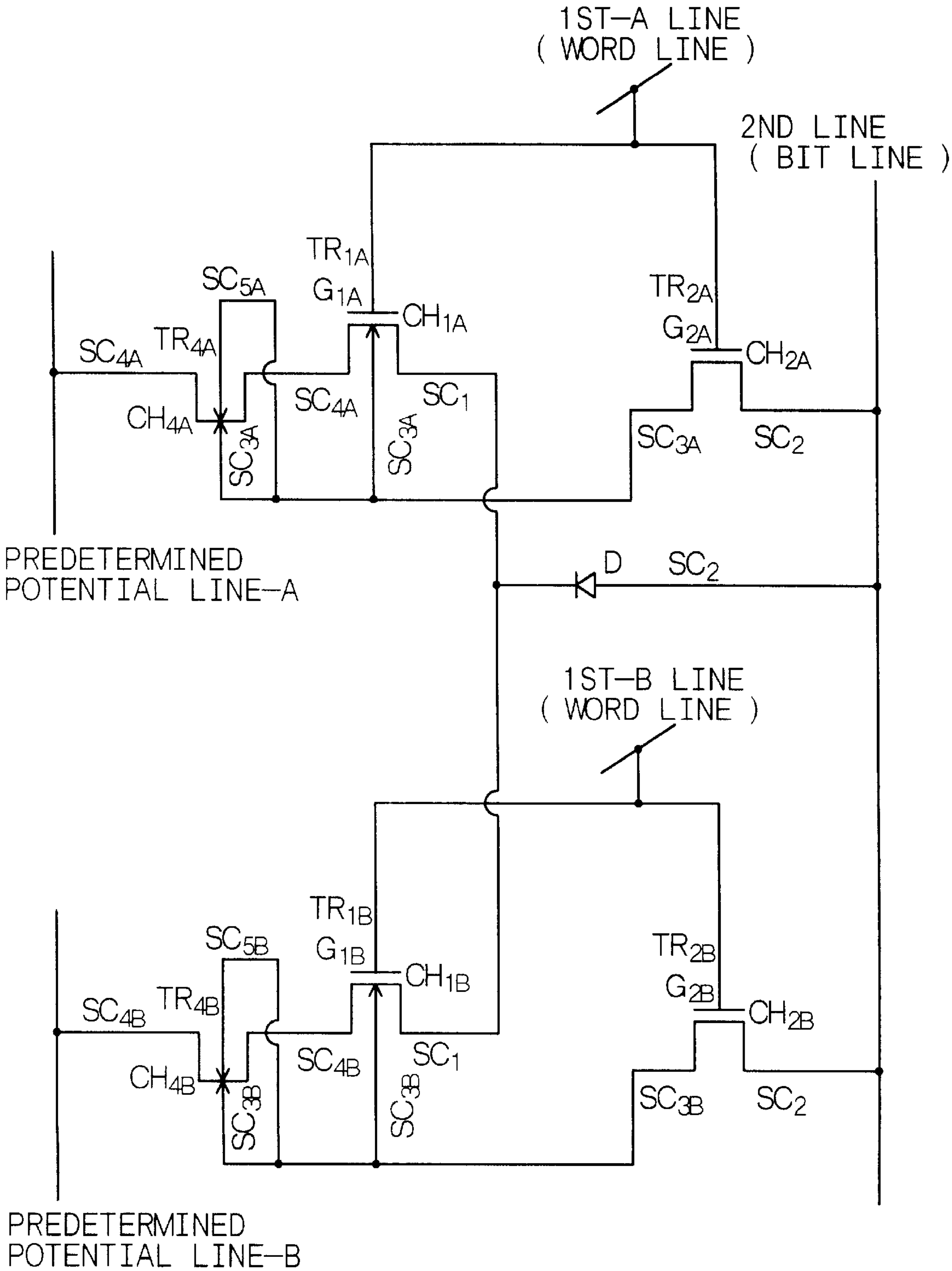

FIG. 232 is a principle drawing of a modification of the semiconductor memory cell in Example 27.

Figure 233:
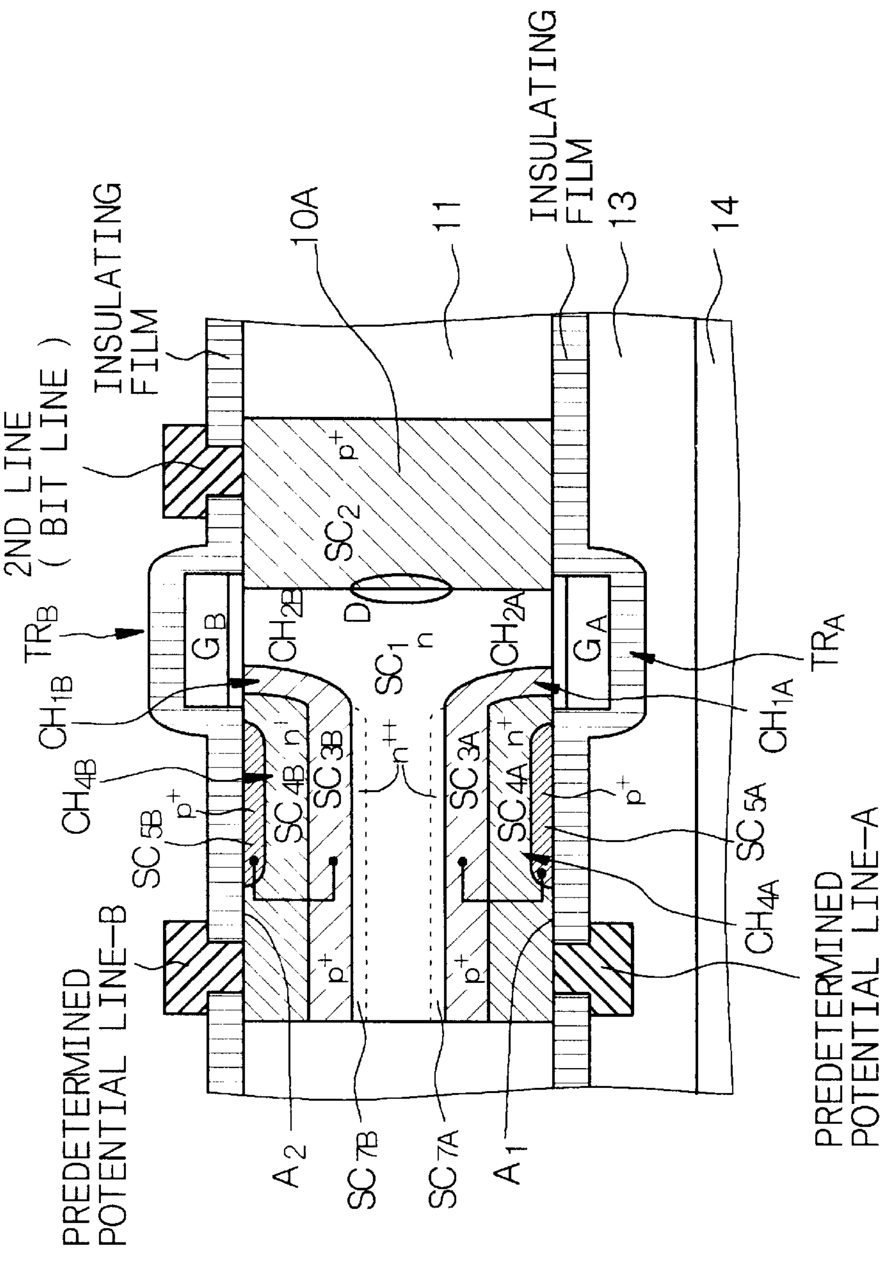

FIG. 233 is a schematic partial cross-sectional view of a modification of the semiconductor memory cell in Example 27 shown in FIG. 232.

Figure 234:
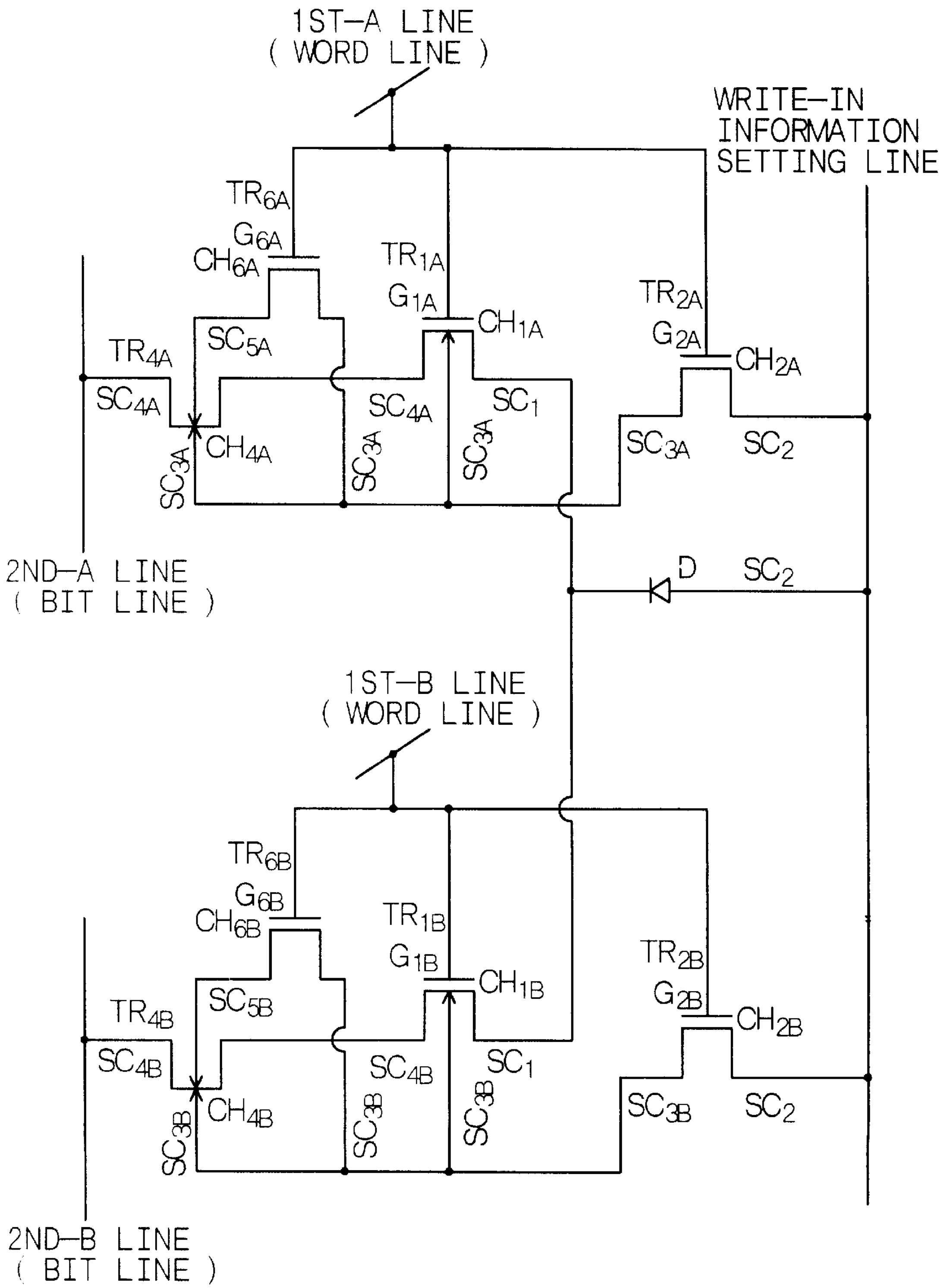

FIG. 234 is a principle drawing of the semiconductor memory cell in Example 28.

Figure 235:
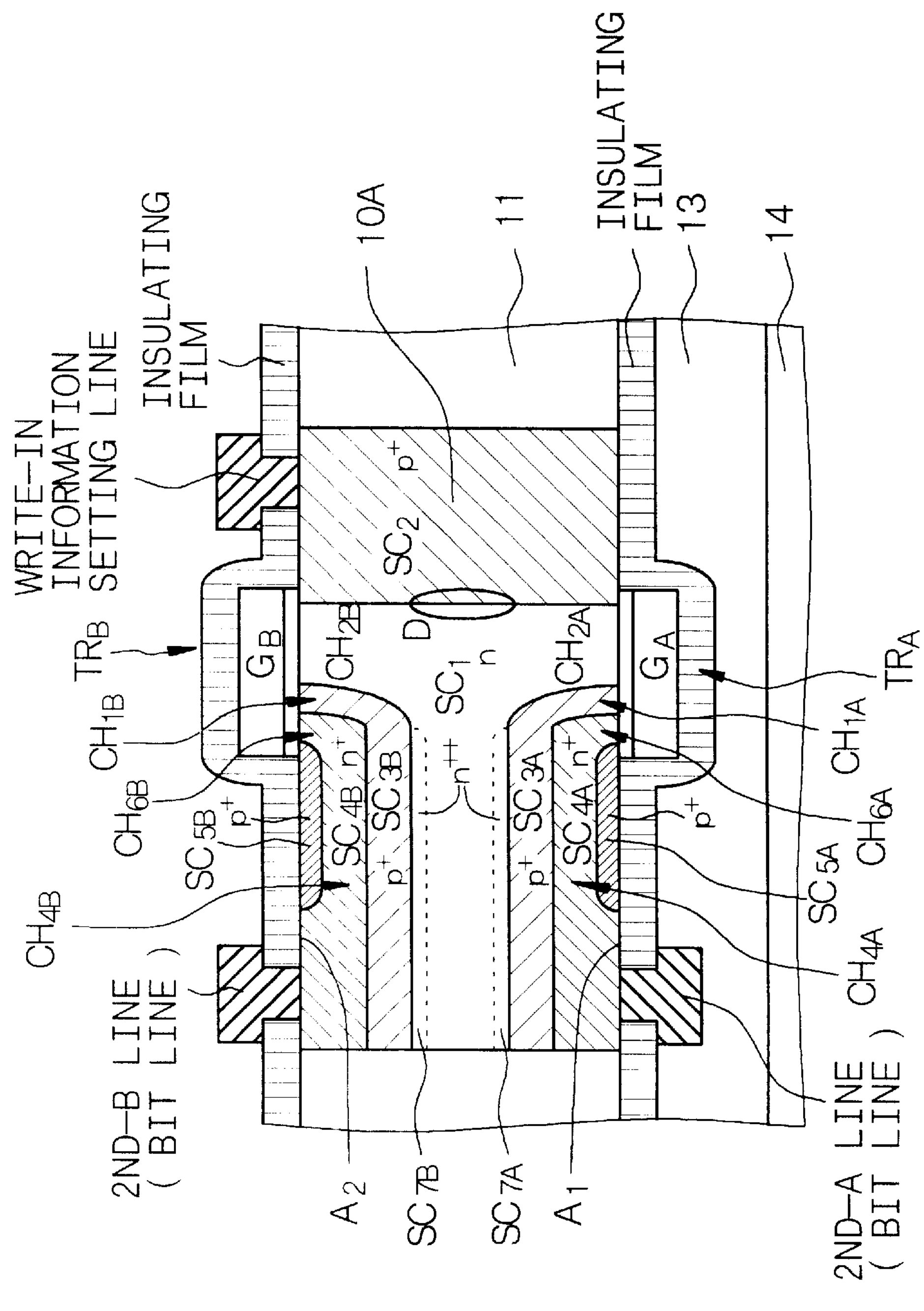

FIG. 235 is a schematic partial cross-sectional view of a semiconductor memory cell in Example 28 shown in FIG. 234.

Figure 236:
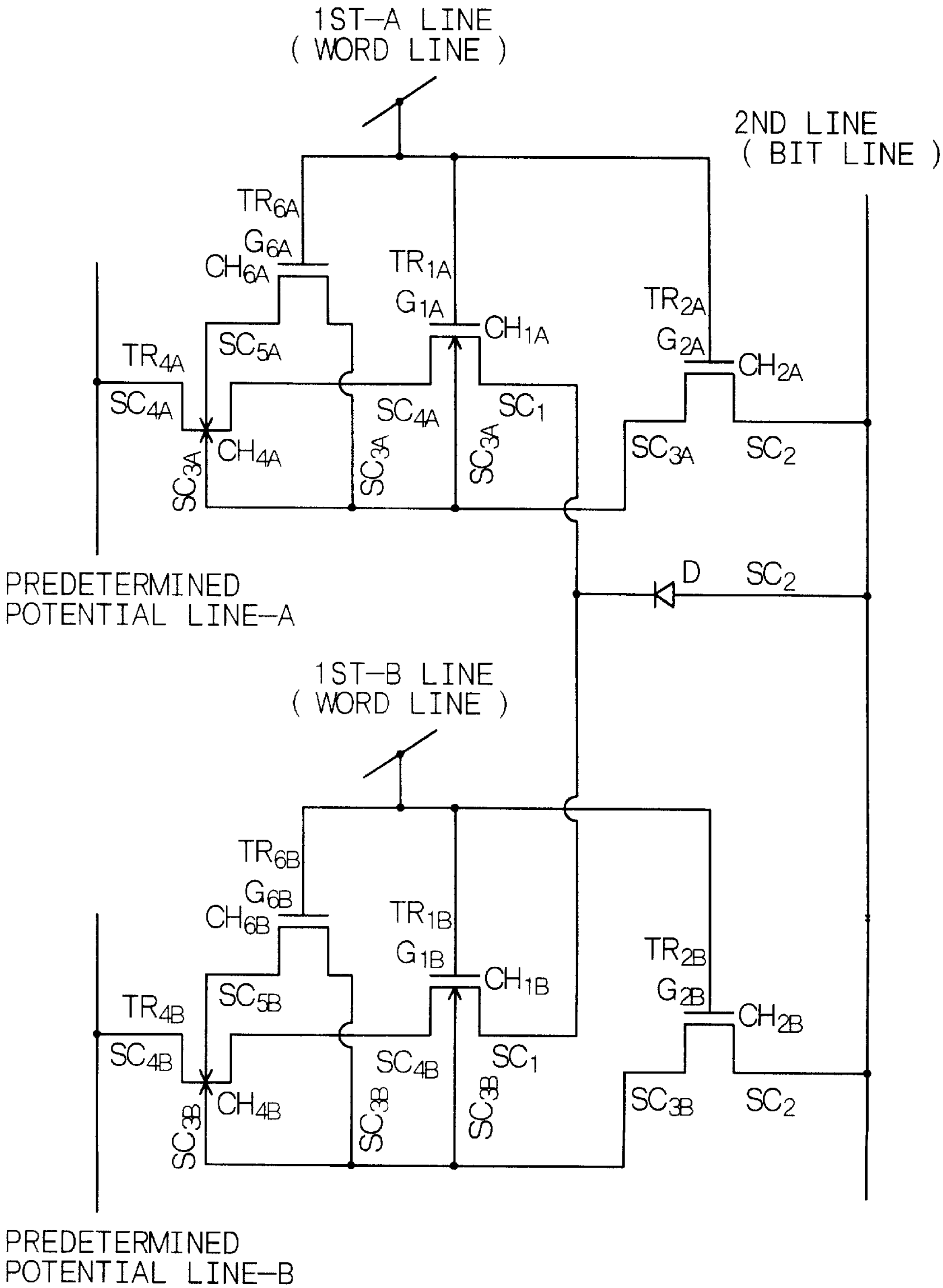

FIG. 236 is a principle drawing of a modification of the semiconductor memory cell in Example 28.

Figure 237:
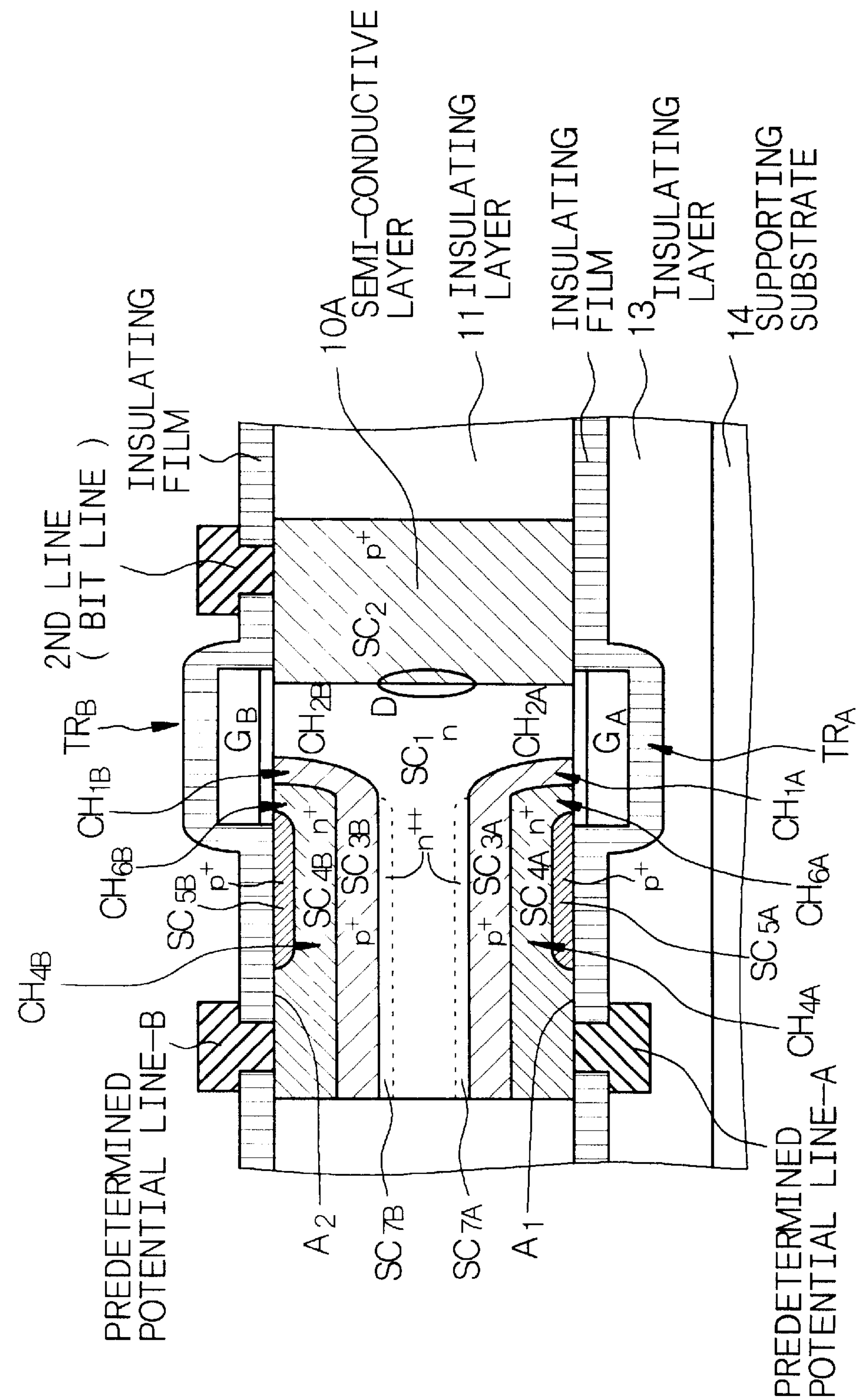

FIG. 237 is a schematic partial cross-sectional view of a modification of the semiconductor memory cell in Example 28 shown in FIG. 236.

Figure 238A:
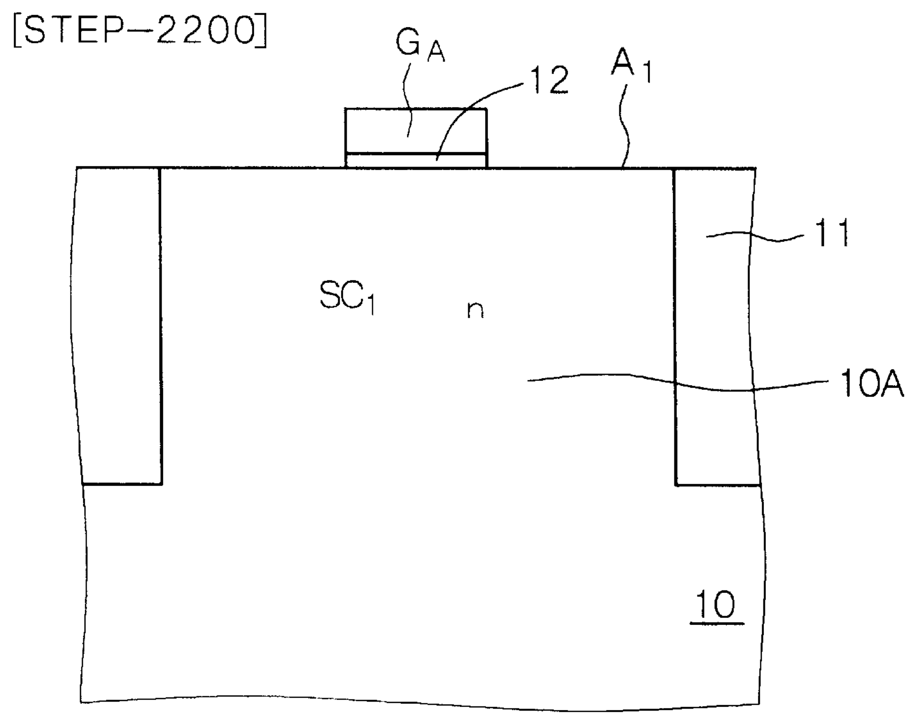
Figure 238B:
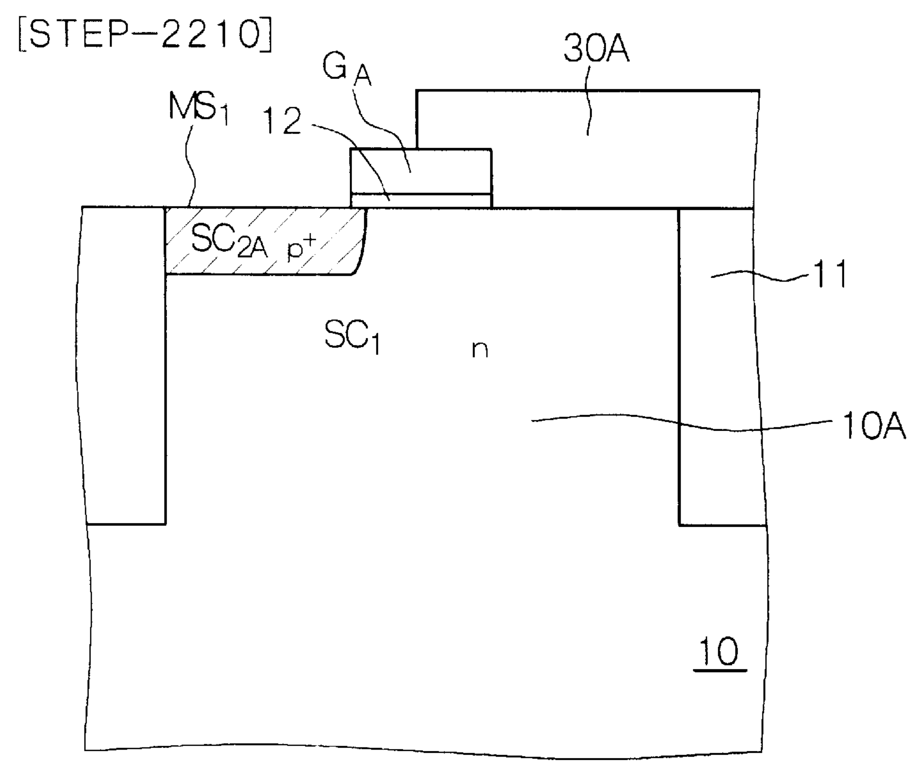

FIGS. 238A and 238B are schematic partial cross-sectional views of a semiconductor substrate, etc., for the explanation of a manufacturing method of the semiconductor memory cell in Example 22.

Figure 239A:
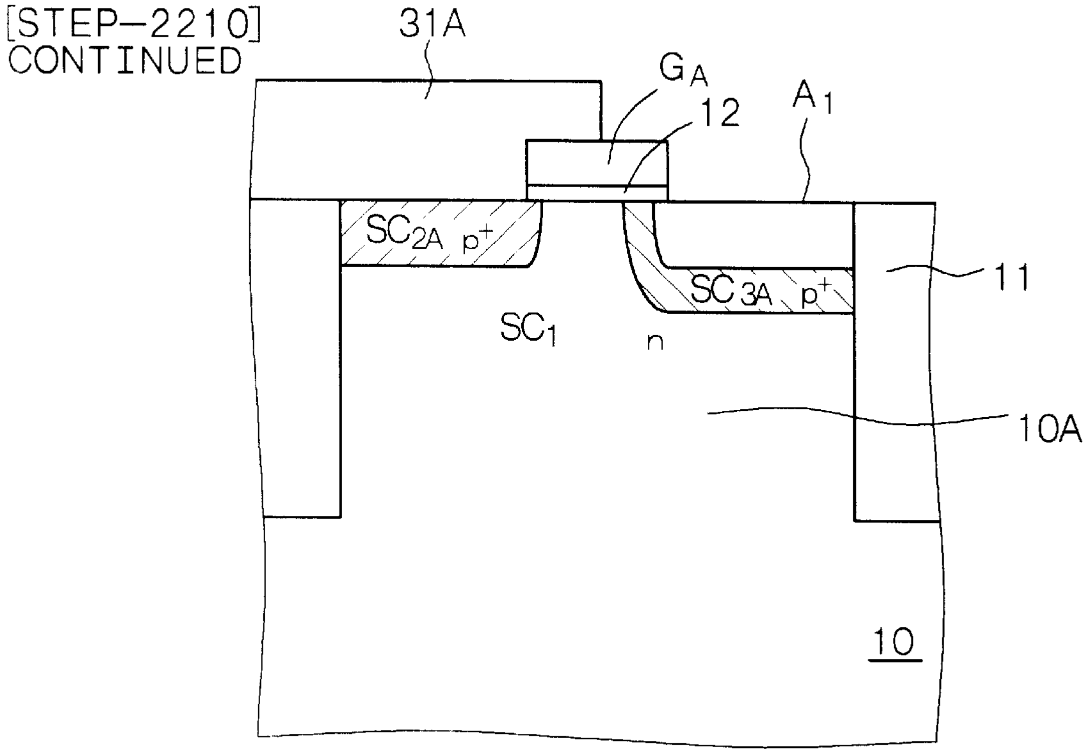
Figure 239B:
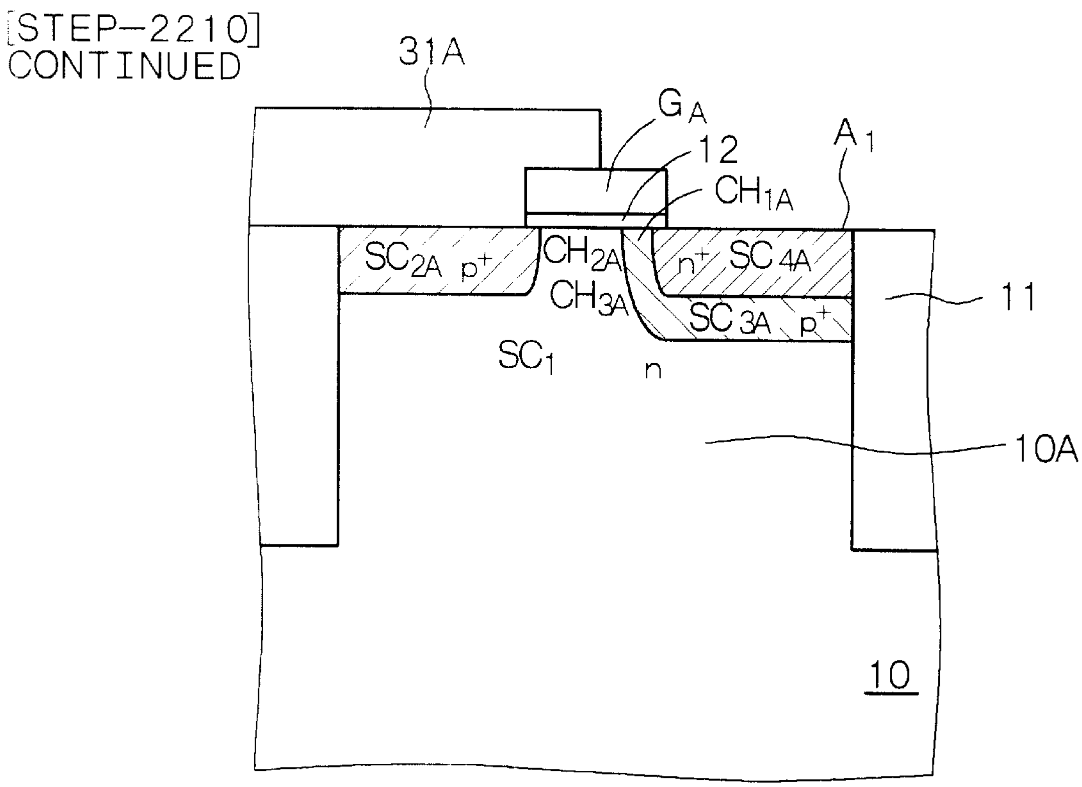

FIGS. 239A and 239B, subsequent to FIG. 238B, are schematic partial cross-sectional views of a semiconductor substrate, etc., for the explanation of a manufacturing method of the semiconductor memory cell in Example 22.

Figure 240:
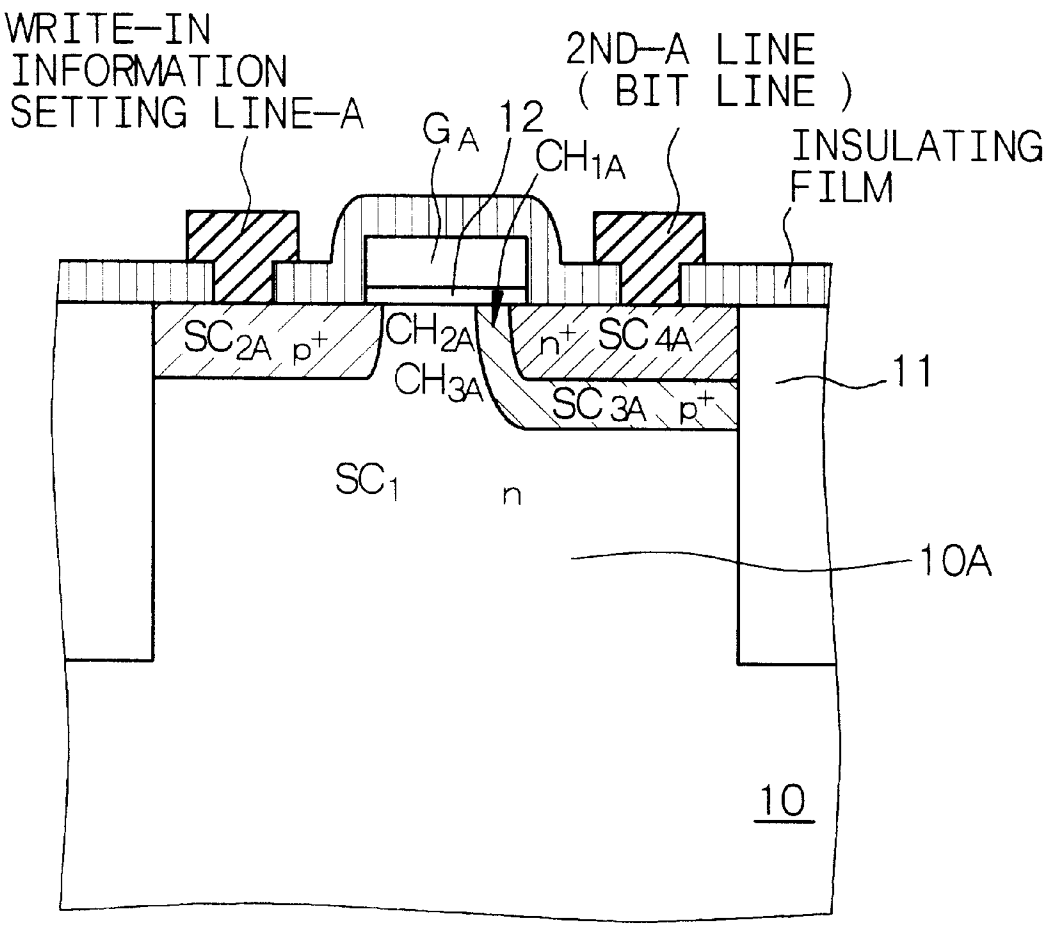

FIG. 240, subsequent to FIG. 239B, is a schematic partial cross-sectional view of a semiconductor substrate, etc., for the explanation of a manufacturing method of the semiconductor memory cell in Example 22.

Figure 241:
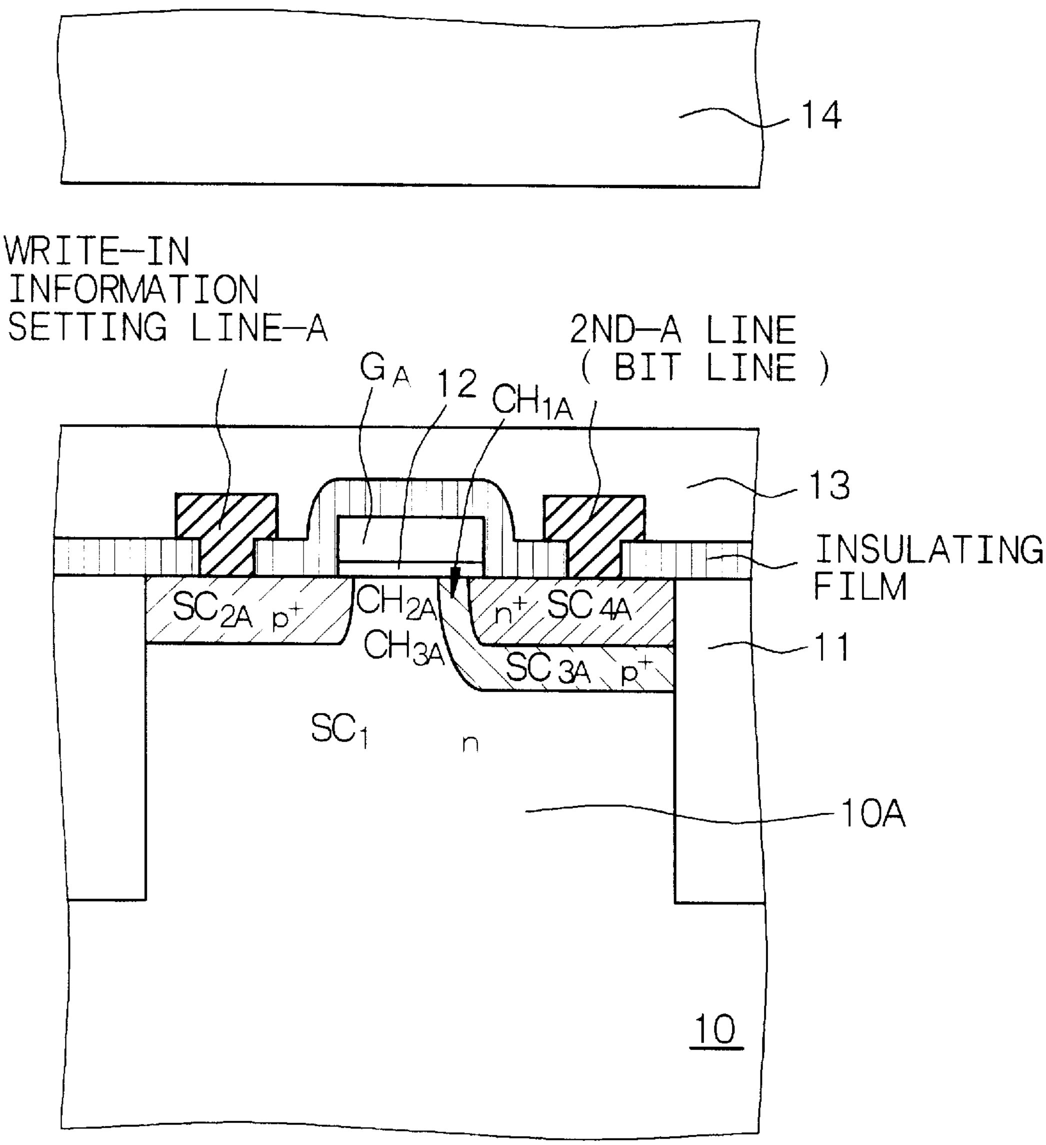

FIG. 241, subsequent to FIG. 240, is a partial cross-sectional view of a semiconductor substrate, etc., for the explanation of a manufacturing method of the semiconductor memory cell in Example 22.

Figure 242:
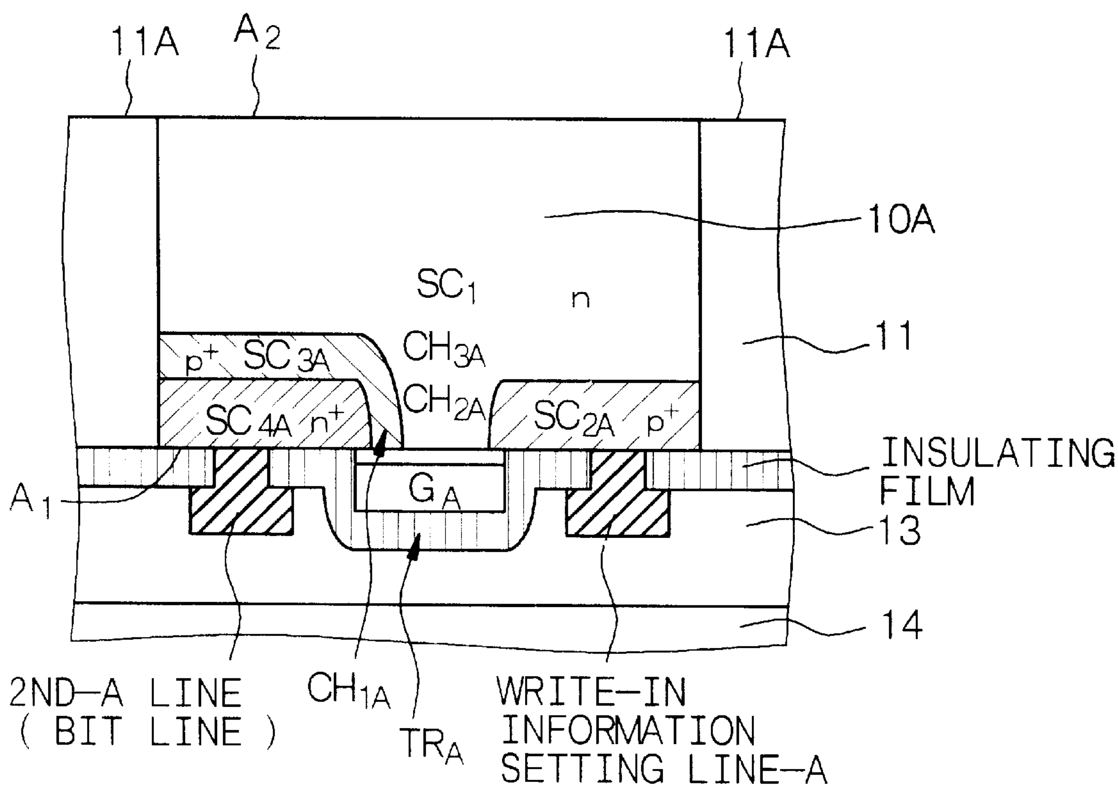

FIG. 242, subsequent to FIG. 241, is a schematic partial cross-sectional view of a semiconductor substrate, etc., for the explanation of a manufacturing method of the semiconductor memory cell in Example 22.

Figure 243:
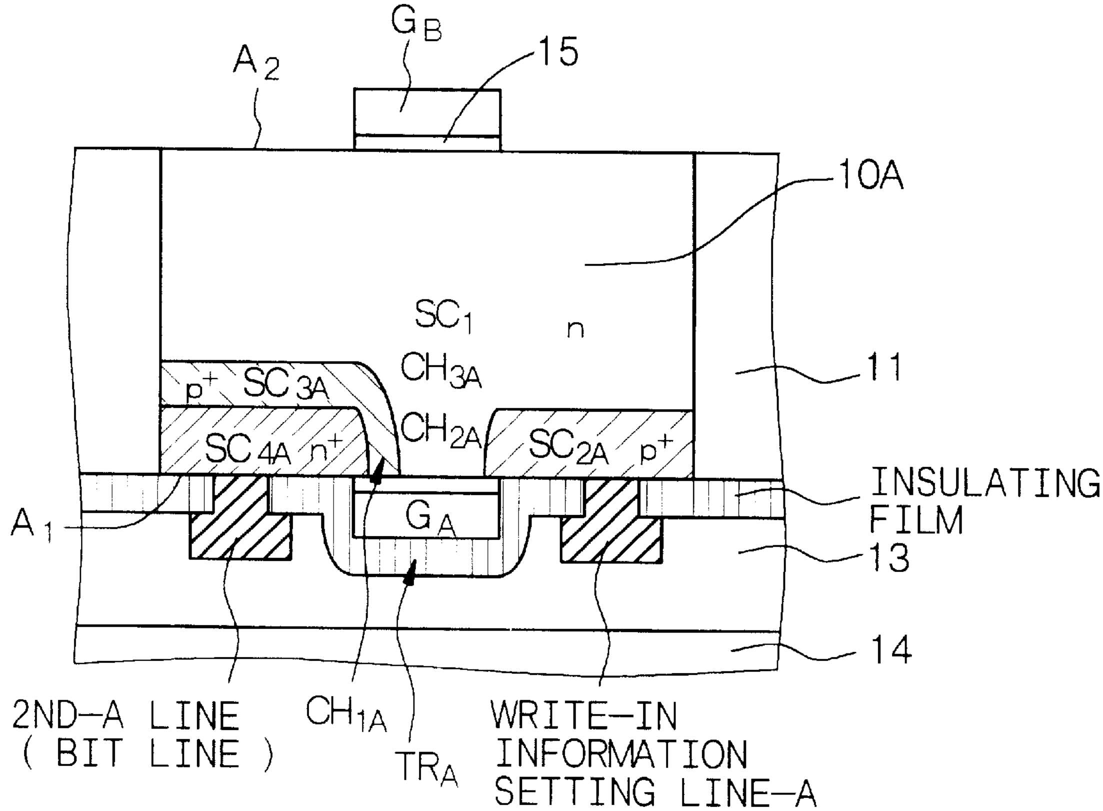

FIG. 243, subsequent to FIG. 242, is a schematic partial cross-sectional view of a semiconductor substrate, etc., for the explanation of a manufacturing method of the semiconductor memory cell in Example 22.

Figure 244:
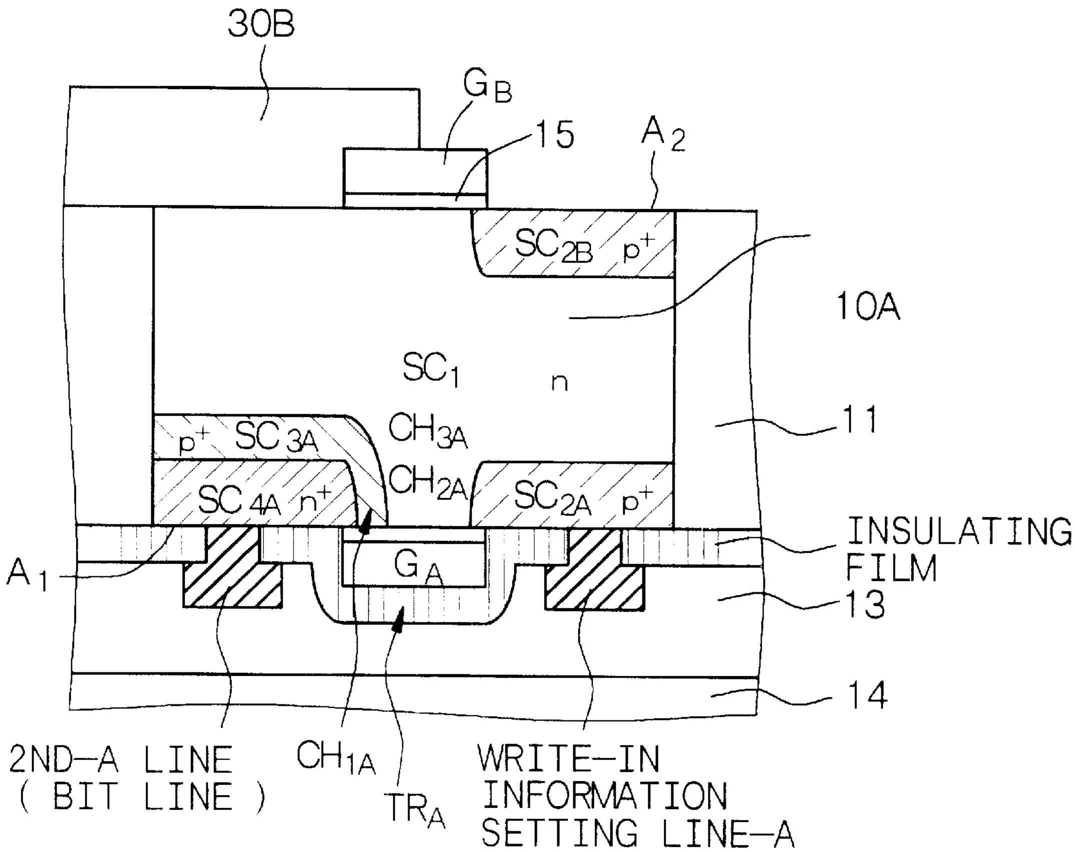

FIG. 244, subsequent to FIG. 243, is a schematic partial cross-sectional view of a semiconductor substrate, etc., for the explanation of a manufacturing method of the semiconductor memory cell in Example 22.

Figure 245:
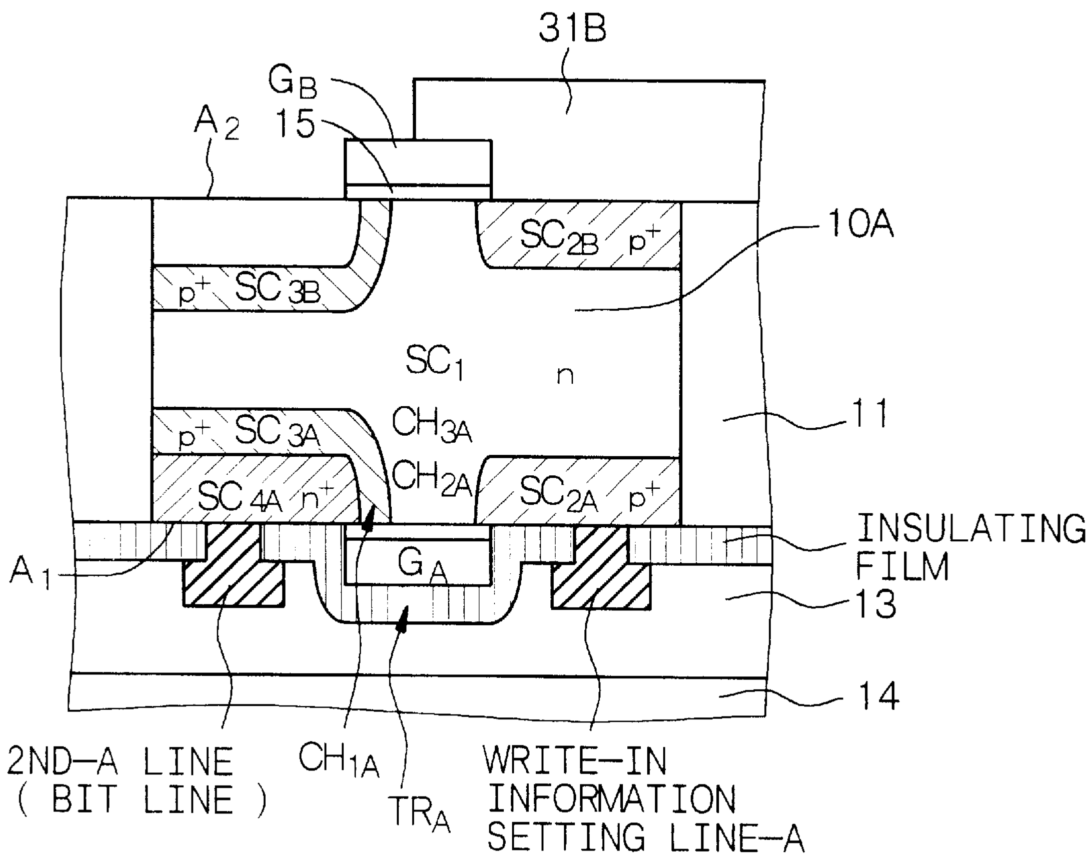

FIG. 245, subsequent to FIG. 244, is a schematic partial cross-sectional view of a semiconductor substrate, etc., for the explanation of a manufacturing method of the semiconductor memory cell in Example 22.

Figure 246:
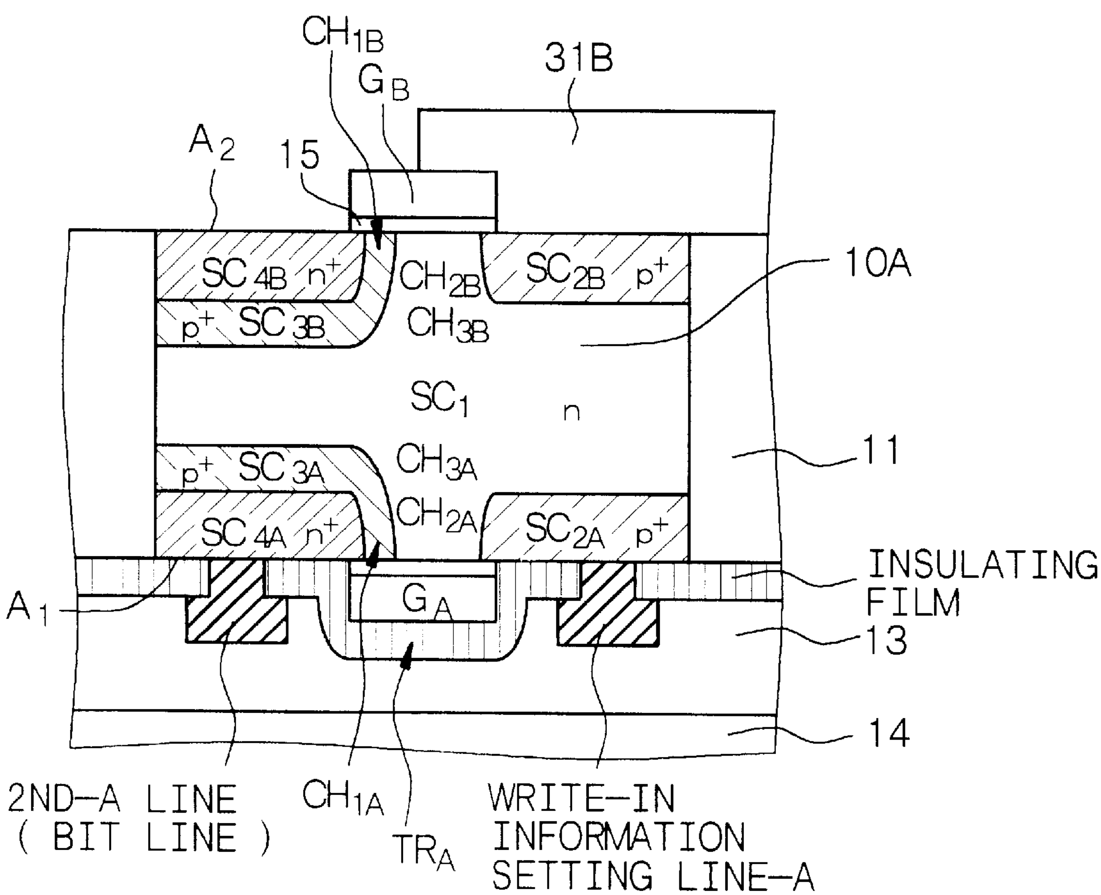

FIG. 246, subsequent to FIG. 245, is a schematic partial cross-sectional view of a semiconductor substrate, etc., for the explanation of a manufacturing method of the semiconductor memory cell in Example 22.

Figure 247A:
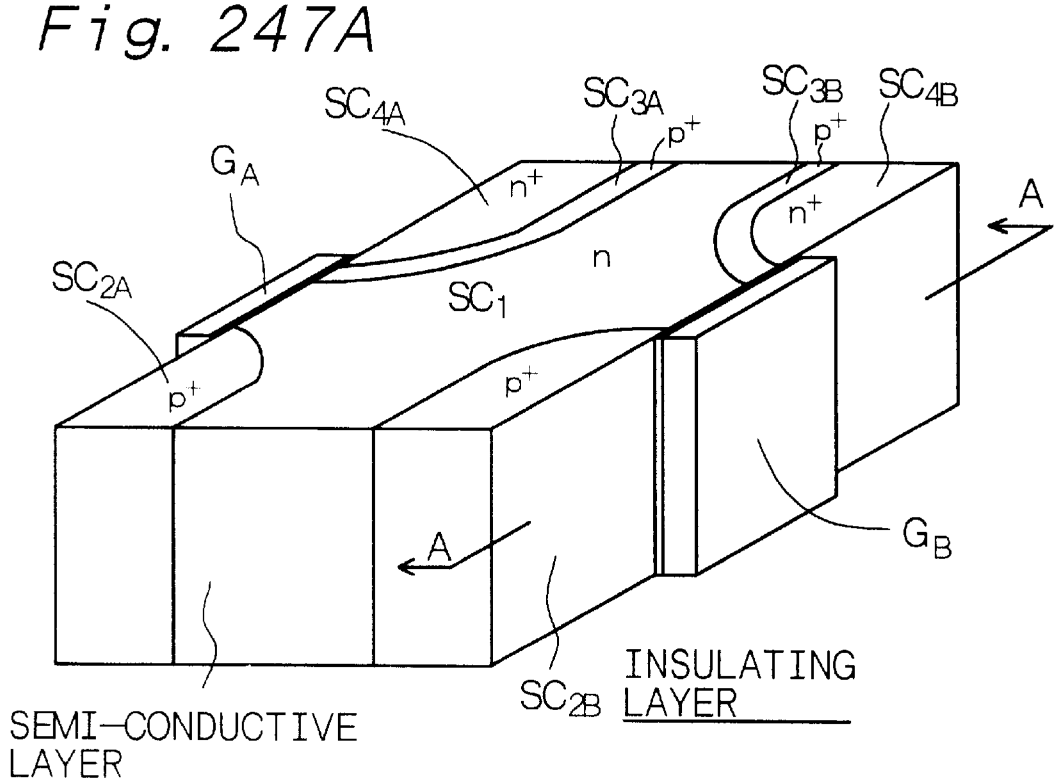
Figure 247B:
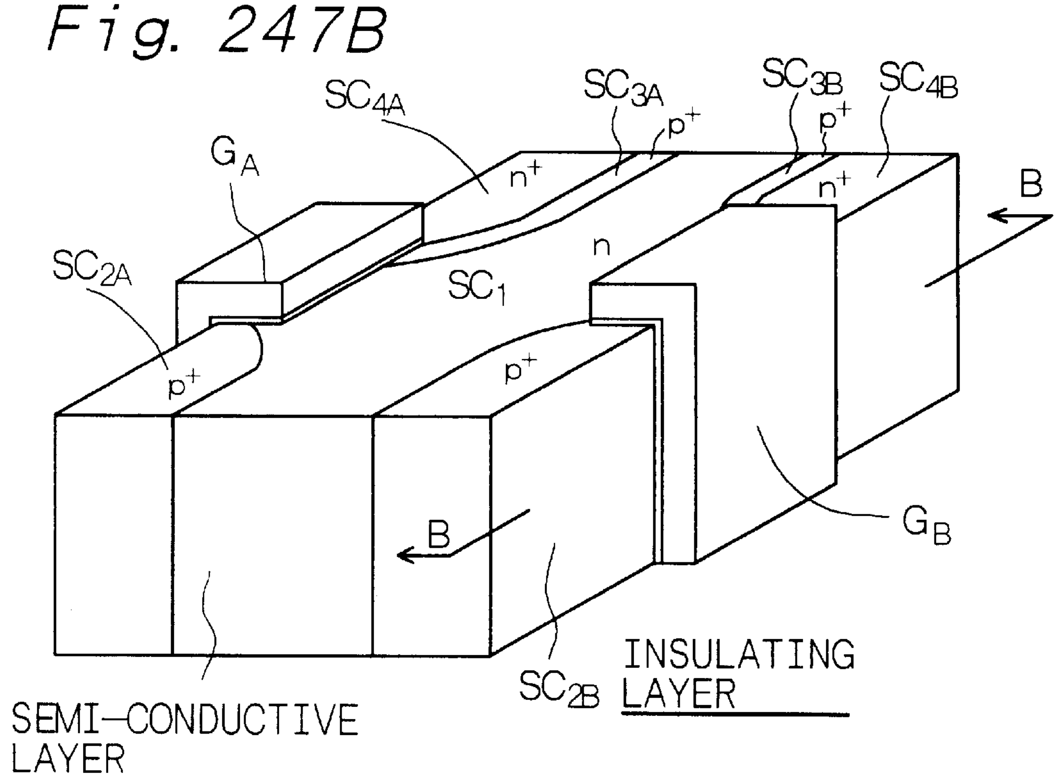

FIGS. 247A and 247B are schematic perspective views of side-gate-type semiconductor memory cells to which the semiconductor memory cell explained in Example 22 is applied.

Figure 248:
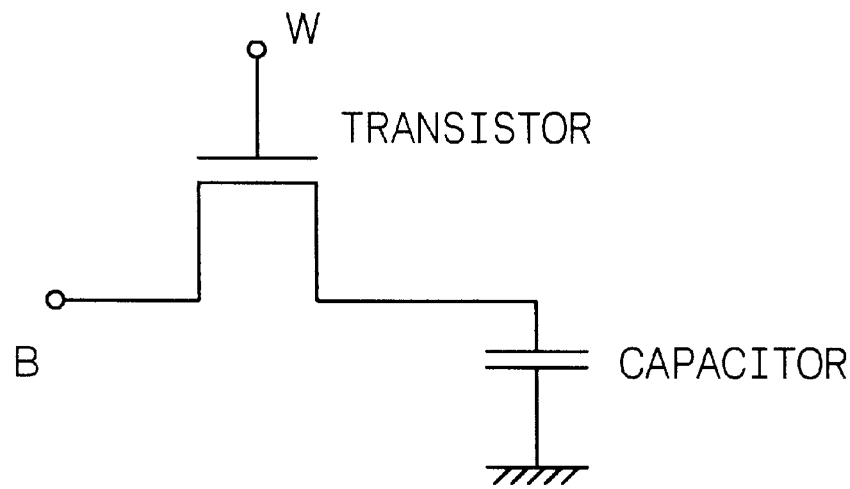

FIG. 248 schematically shows a conventional single-transistor memory cell.

Figure 249:
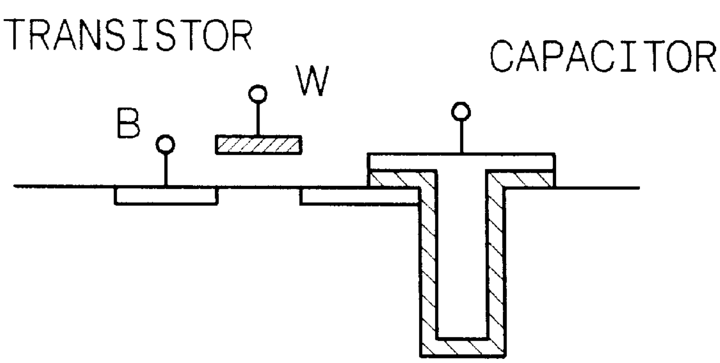

FIG. 249 schematically shows a conventional memory cell having a trench capacitor structure.

DESCRIPTION OF THE PREFERRED EMBODIMENTS

EXAMPLE 1

Figure 1A:
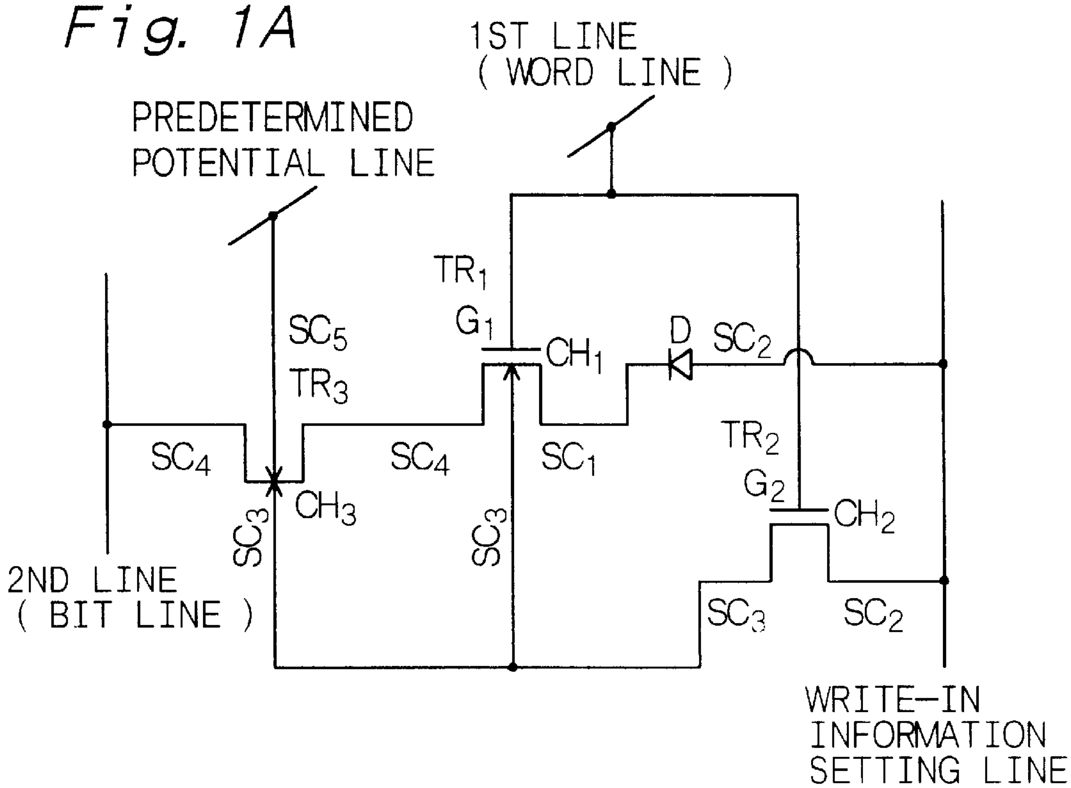
FIGS. 1A and 1B are a principle drawing and a schematic partial cross-sectional view of a semiconductor memory cell in Example 1, respectively.
Figure 1B:
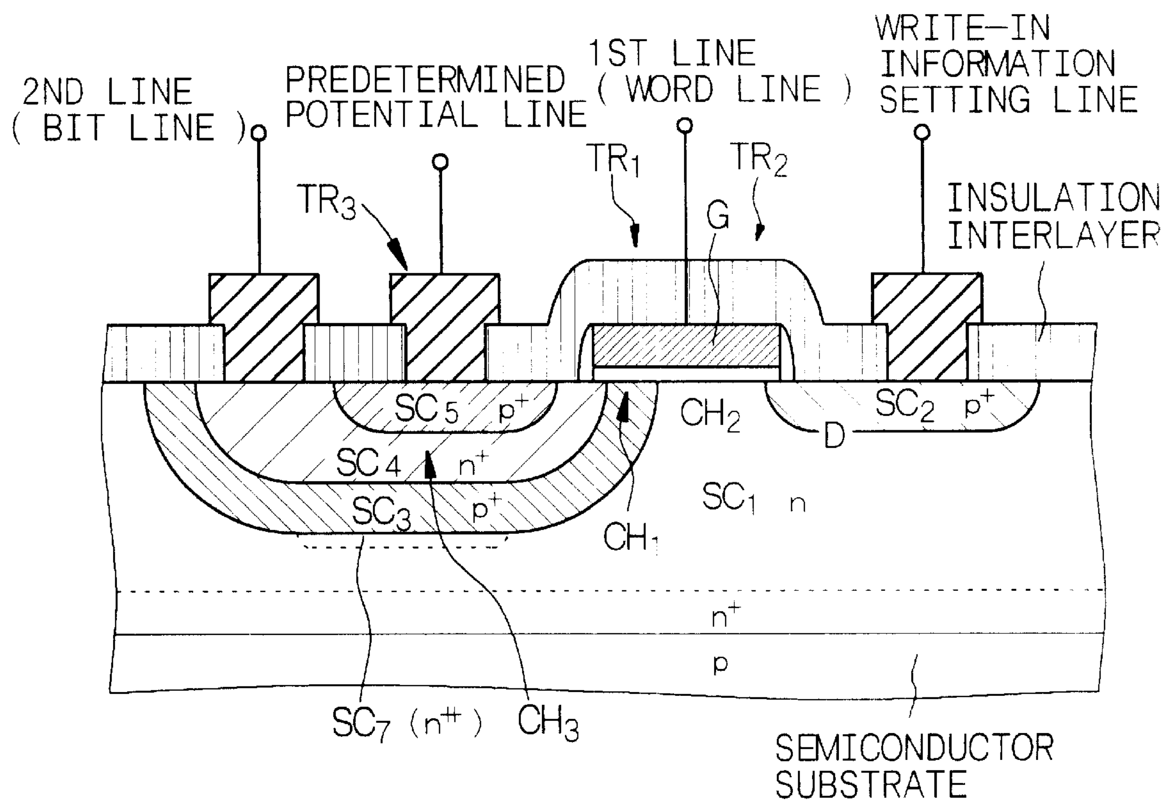

Example 1 is directed to the semiconductor memory cell according to the first aspect of the present invention and the method for manufacturing a semiconductor memory cell according to the first aspect of the present invention. For example, as FIG. 1A shows its principle drawing and as FIG. 1B shows its schematic partial cross-sectional view, the semiconductor memory cell of Example 1 comprises a first transistor of a first conductivity type (e.g., n-type) for read-out $TR_1$, a second transistor of a second conductivity type (e.g., p-type) for write-in $TR_2$, a junction-field-effect transistor of a first conductivity type (e.g., n-type) for current control $TR_3$ and a diode D. In Example 1, the first transistor $TR_1$ and the second transistor $TR_2$ are merged into one unit. That is, the semiconductor memory cell of Example 1 approximately occupies an area which one transistor occupies.

The semiconductor memory cell of Example 1 has;

(1) a first semi-conductive region $SC_1$ of the first conductivity type (for example, n-type), (2) a second semi-conductive region $SC_2$ of the second conductivity type (for example, $p^+$-type) opposite to the first conductivity type, or a second conductive region $SC_2$ formed of a silicide, a metal or a metal compound, said second region $SC_2$ being formed in a surface region of the first region $SC_1$ and forming a rectifier junction together with the first region $SC_1$, (3) a third semi-conductive region $SC_3$ of the second conductivity type (for example, $p^+$-type), formed in a surface region of the first region $SC_1$ and spaced from the second region $SC_2$, (4) a fourth semi-conductive region $SC_4$ of the first conductivity type (for example, $n^+$-type), formed in a surface region of the third region $SC_3$, (5) a fifth semi-conductive region $SC_5$ of the second conductivity type (for example, $p^+$-type), or a fifth conductive region $SC_5$ formed of a silicide, a metal or a metal compound, said fifth region $SC_5$ being formed in a surface region of the fourth region $SC_4$ and forming a rectifier junction together with the fourth region $SC_4$, and (6) a gate portion G shared by the first transistor $TR_1$ and the second transistor $TR_2$, and formed on a barrier layer so as to bridge the first region $SC_1$ and the fourth region $SC_4$ and so as to bridge the second region $SC_2$ and the third region $SC_3$.

Concerning the first transistor $TR_1$;

(A-1) one source/drain region is constituted of the surface region of the fourth region $SC_4$, (A-2) the other source/drain region is constituted of the surface region of the first region $SC_1$ sandwiched by (or interposed between) the second region $SC_2$ and the third region $SC_3$, and (A-3) a channel forming region $CH_1$ is constituted of the surface region of the third region $SC_3$ sandwiched by (or interposed between) the surface region of the first region $SC_1$ and the surface region of the fourth region $SC_4$.

Concerning the second transistor $TR_2$;

(B-1) one source/drain region is constituted of the second region $SC_2$, (B-2) the other source/drain region is constituted of the surface region of the third region $SC_3$ constituting the channel forming region $CH_1$ of the first transistor $TR_1$, and (B-3) a channel forming region $CH_2$ is constituted of the surface region of the first region $SC_1$ constituting the other source/drain region of the first transistor $TR_1$.

Further, concerning the junction-field-effect transistor $TR_3$;

(C-1) gate regions are constituted of the fifth region $SC_5$ and a portion of the third region $SC_3$ facing the fifth region $SC_5$, (C-2) a channel region $CH_3$ is constituted of part of the fourth region $SC_4$ sandwiched by (or interposed between) the fifth region $SC_5$ and said portion of the third region $SC_3$, (C-3) one source/drain region is constituted of a portion of the fourth region $SC_4$ extending from one end of the channel region $CH_3$ of the junction-field-effect transistor $TR_3$ and constituting one source/drain region of the first transistor $TR_1$, and (C-4) the other source/drain region is constituted of a portion of the fourth region $SC_4$ extending from the other end of the channel region $CH_3$ of the junction-field-effect transistor $TR_3$.

The junction-field-effect transistor $TR_3$ in the semiconductor memory cell of Example 1 can be formed by (X) optimizing the distance (thickness of the channel region $CH_3$) between the facing gate regions (the fifth region $SC_5$ and the portion of the third region $SC_3$ facing the fifth region $SC_5$) of the junction-field-effect transistor $TR_{3B}$ and (Y) optimizing impurity concentrations of the facing gate regions (the fifth region $SC_5$ and the portion of the third region $SC_3$ facing the fifth region $SC_5$) and the channel region $CH_3$ (specifically, the fourth region $SC_4$) of the junction-field-effect transistor $TR_3$.

In Example 1, the semiconductor memory cell (specifically, the first region $SC_1$) is formed in a well of the first conductivity type (for example, n-type) in a p-type semiconductor substrate.

In the semiconductor memory cell of Example 1, the gate portion G is connected to a first memory-cell-selecting line (for example, a word line); a diode D is formed between the first region $SC_1$ and the second region $SC_2$; the first region $SC_1$ is connected to a write-in information setting line through the diode D; the second region $SC_2$ is connected to the write-in information setting line; the portion of the fourth region $SC_4$ constituting the other source/drain region of the junction-field-effect transistor $TR_3$ is connected to a second memory-cell-selecting line (for example, a bit line); and the fifth region $SC_5$ is connected to a predetermined potential line.

When a region $SC_7$ containing a high concentration of an impurity having the first conductivity type (for example, $n^{++}$-type) is formed between the first region $SC_1$ and the third region $SC_3$ in the semiconductor memory cell of Example 1, a potential or an electric charge stored in the channel forming region $CH_1$ of the first transistor $TR_1$ can be increased.

Figure 2A:
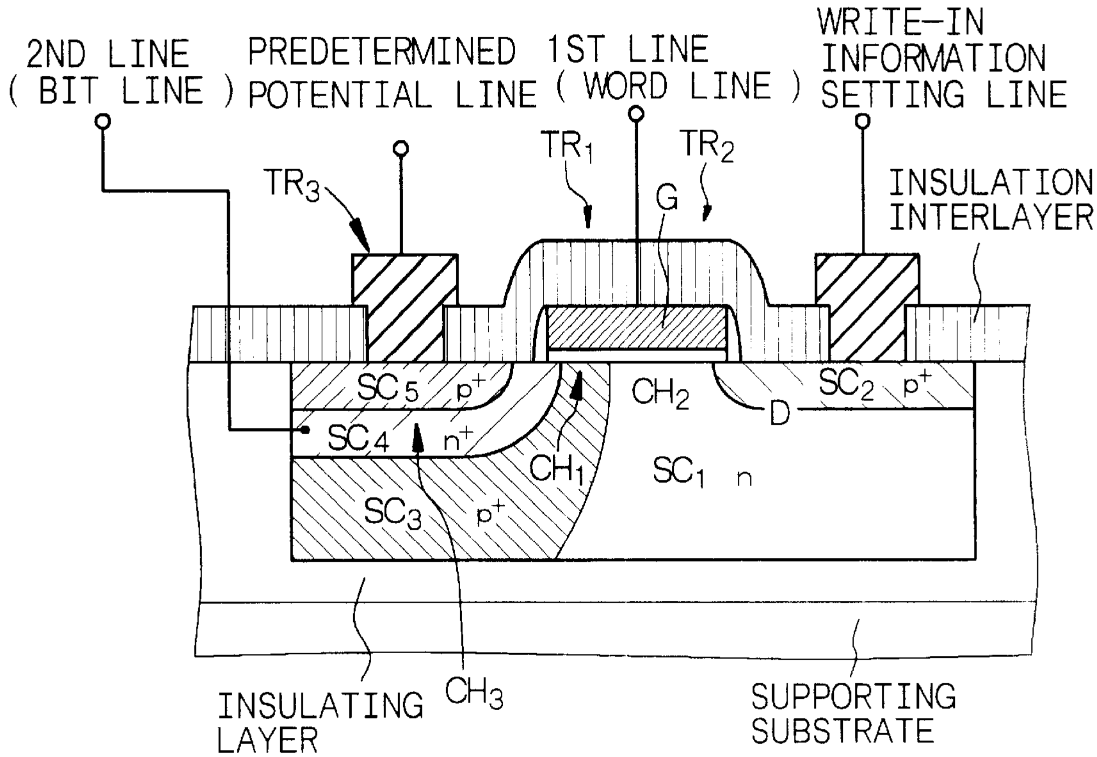
FIGS. 2A and 2B are schematic partial cross-sectional views of modifications of the semiconductor memory cell in Example 1.
Figure 2B:
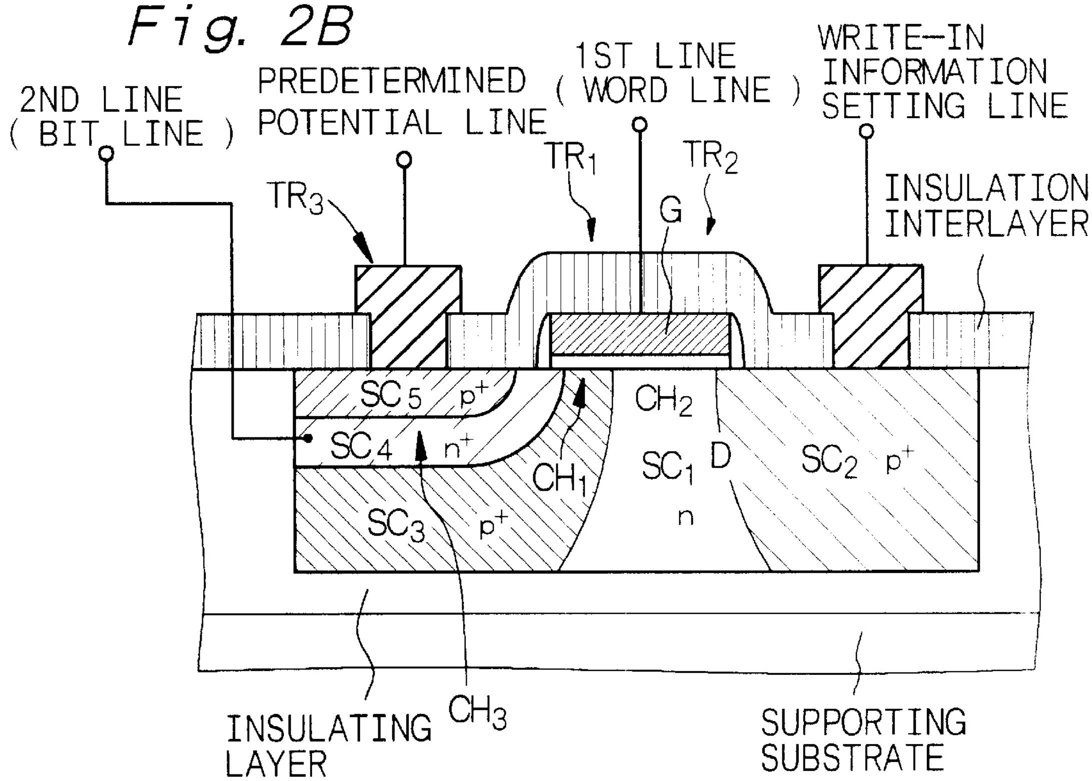

FIGS. 2A and 2B show schematic partial cross-sectional views of modifications of the semiconductor memory cell in Example 1. As shown in FIG. 2A or FIG. 2B, the semiconductor memory cell having the same configuration as the semiconductor memory cell shown in FIG. 1B is formed in a semi-conductive layer surrounded with an insulating layer formed on a supporting substrate. The semiconductor memory cell shown in FIG. 2A has the same configuration as the semiconductor memory cell shown in FIG. 2B, except the depth of the second region $SC_2$.

Figure 3A:
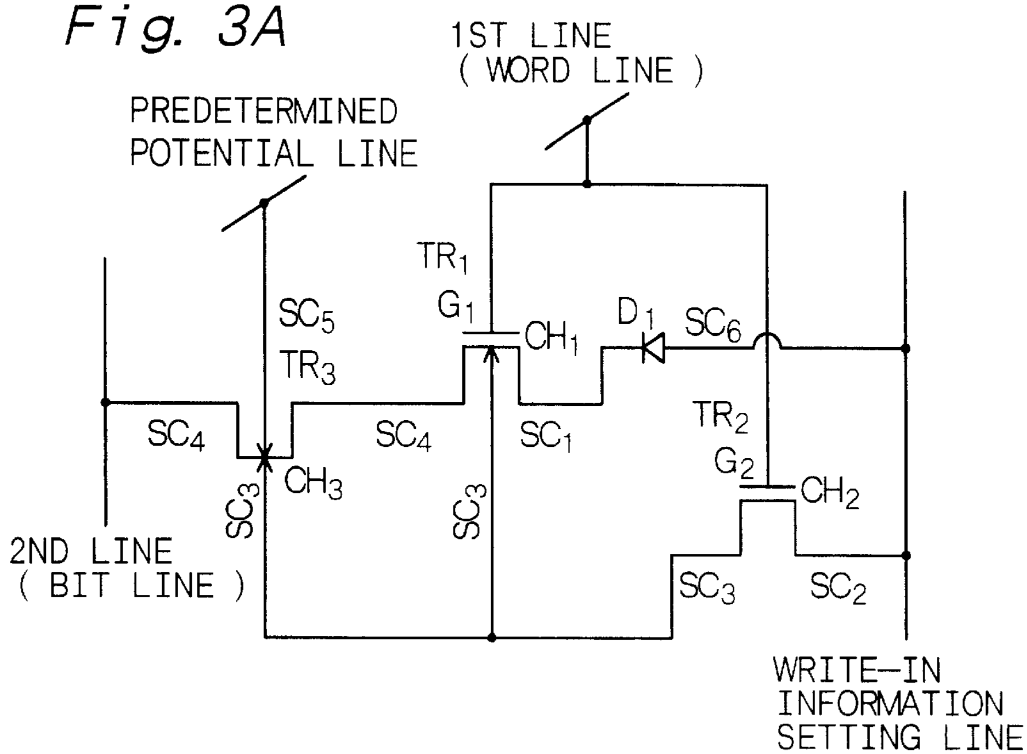
FIGS. 3A and 3B are a principle drawing and a schematic partial cross-sectional view of a modification of the semiconductor memory cell in Example 1, respectively.
Figure 3B:
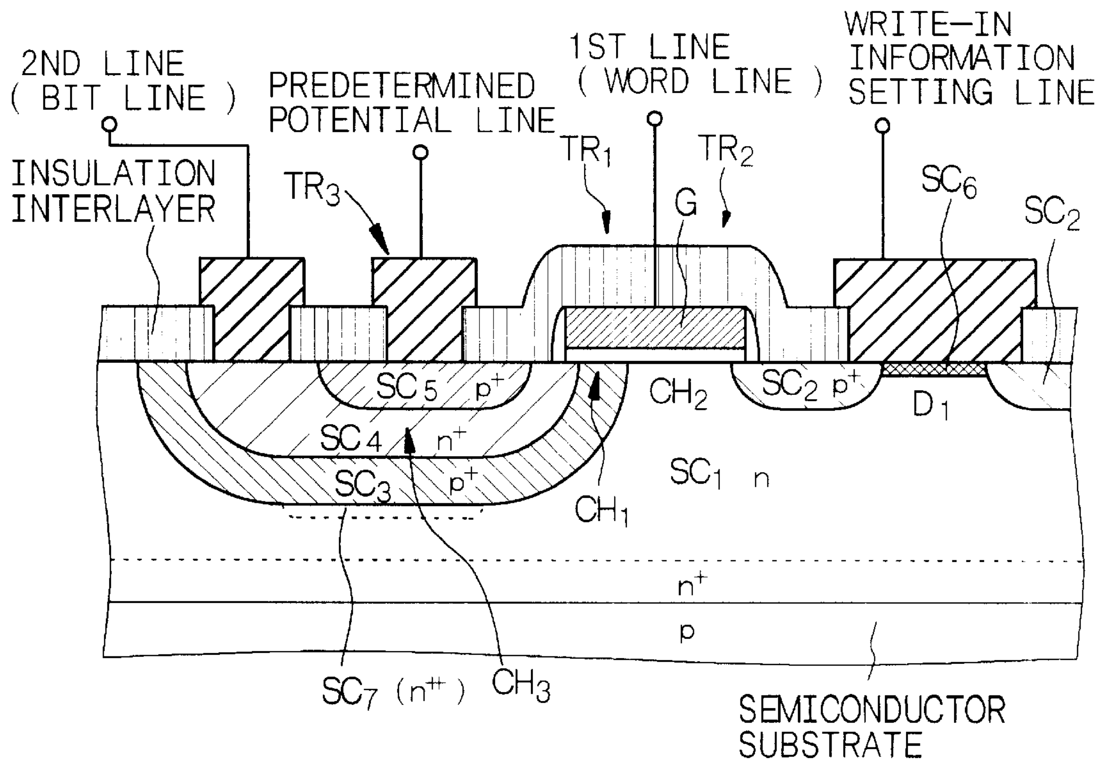

FIGS. 3A and 3B show a principle drawing and a schematic partial cross-sectional view of a modification of the semiconductor memory cell in Example 1, respectively. The semiconductor memory cell shown in FIG. 3B has a configuration in which a sixth region $SC_6$ is formed in a surface region of the first region $SC_1$ and forms a rectifier junction together with the first region $SC_1$. The sixth region $SC_6$ is constituted of, for example, a silicide. A diode $D_1$ of Schottky junction type is constituted of the sixth region $SC_6$ and the first region $SC_1$, and one end of the diode $D_1$ is connected to the write-in information setting line. In this configuration, the second region $SC_2$ is preferably constituted of semiconductor.

Figure 4A:
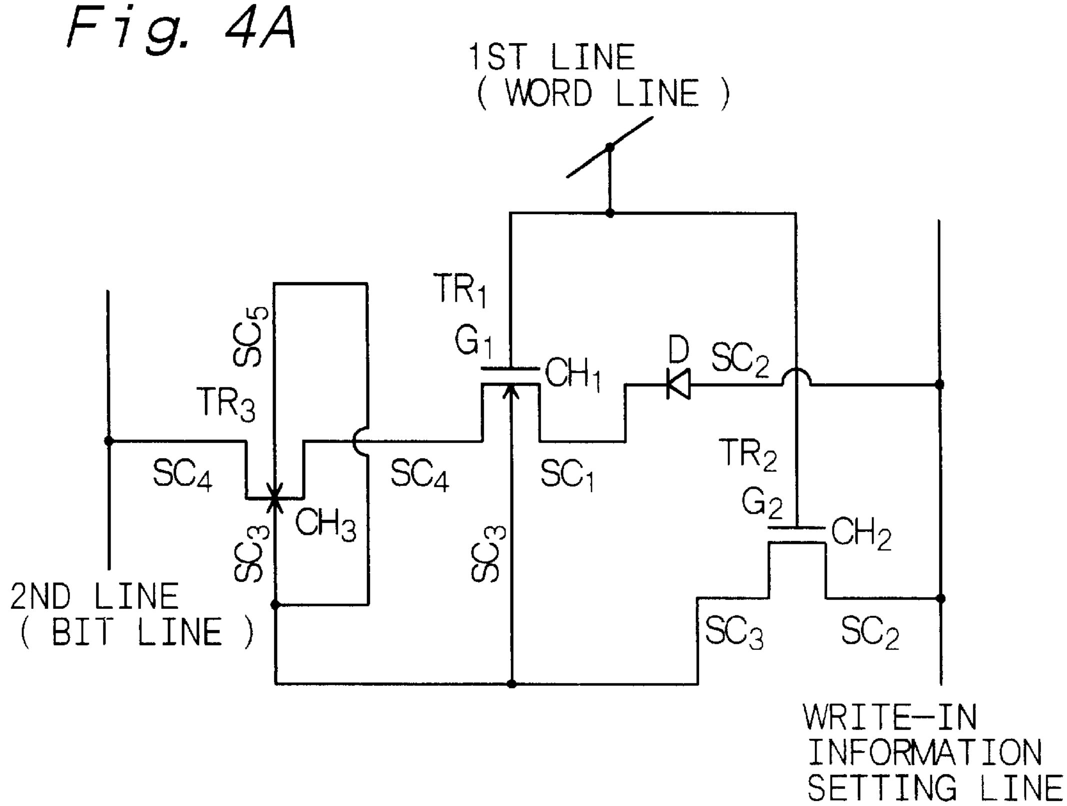
FIGS. 4A and 4B are other principle drawings of modifications of the semiconductor memory cell in Example 1.
Figure 4B:
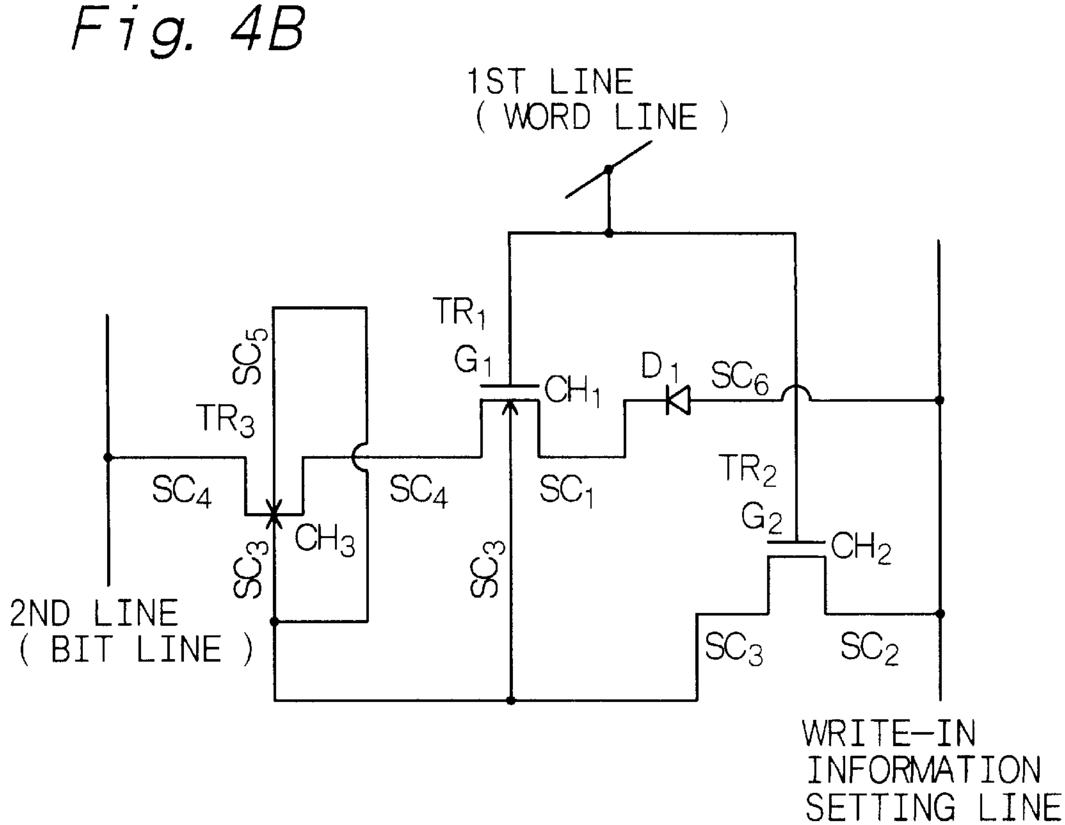
Figure 5A:
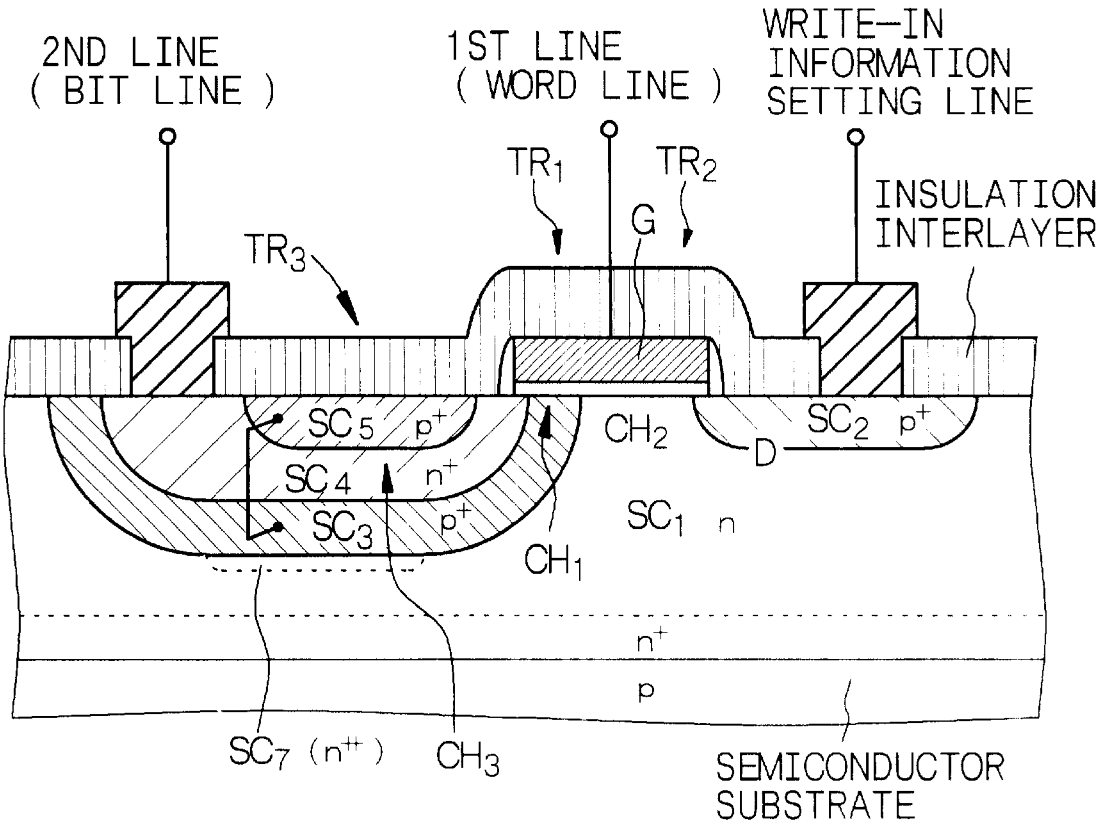
FIGS. 5A and 5B are a schematic partial cross-sectional view and a schematic arrangement of each regions of a modification of the semiconductor memory cell in Example 1, respectively.
Figure 5B:
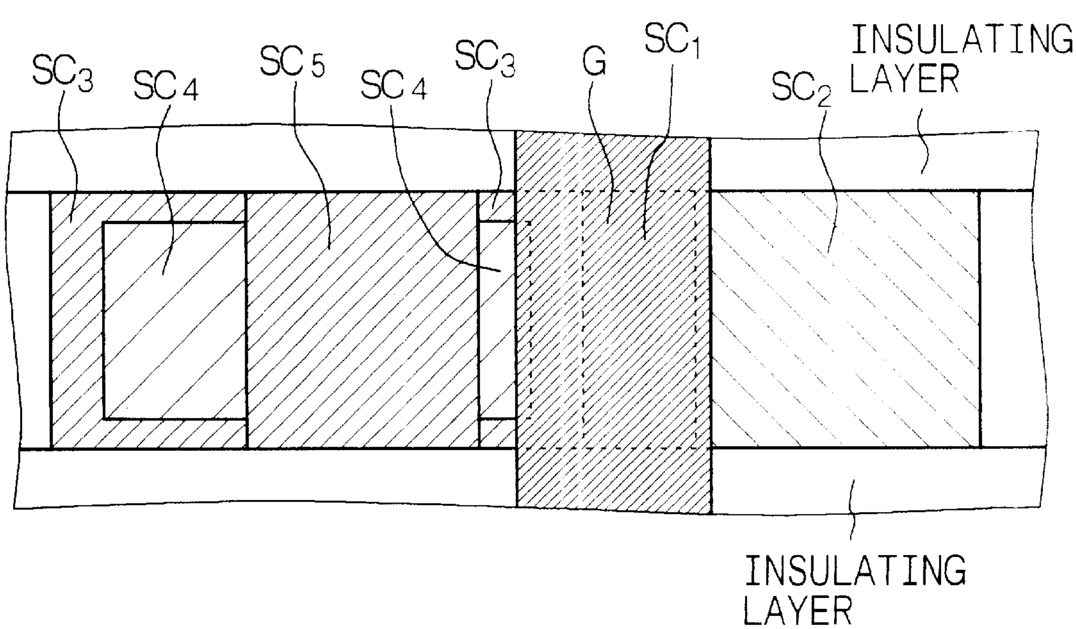
Figure 6A:
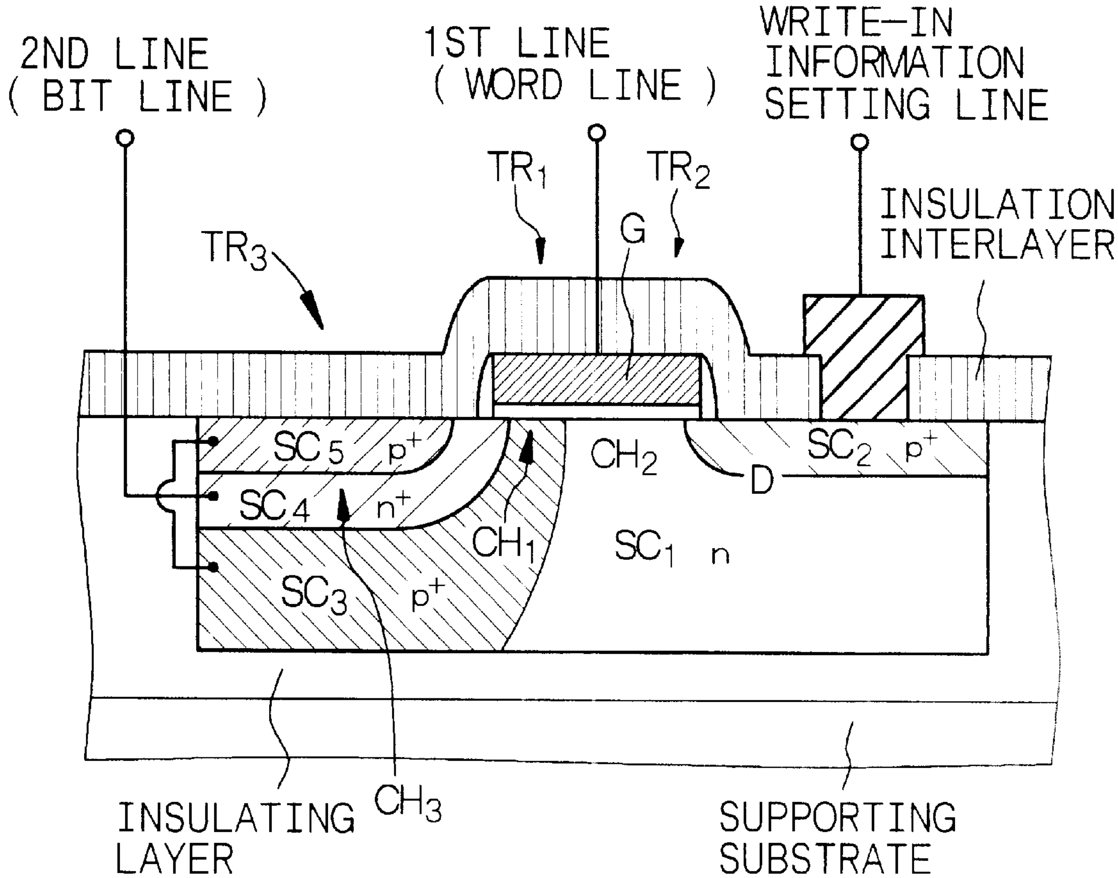
FIGS. 6A and 6B are a schematic partial cross-sectional view and a schematic arrangement of each regions of a modification of the semiconductor memory cell in Example 1, respectively.
Figure 6B:
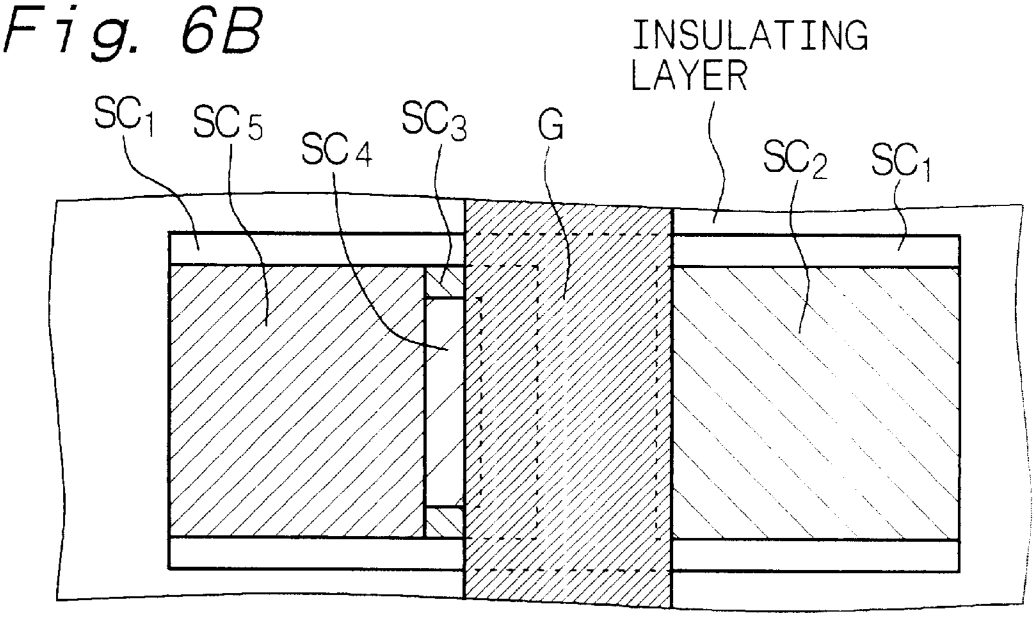
Figure 7A:
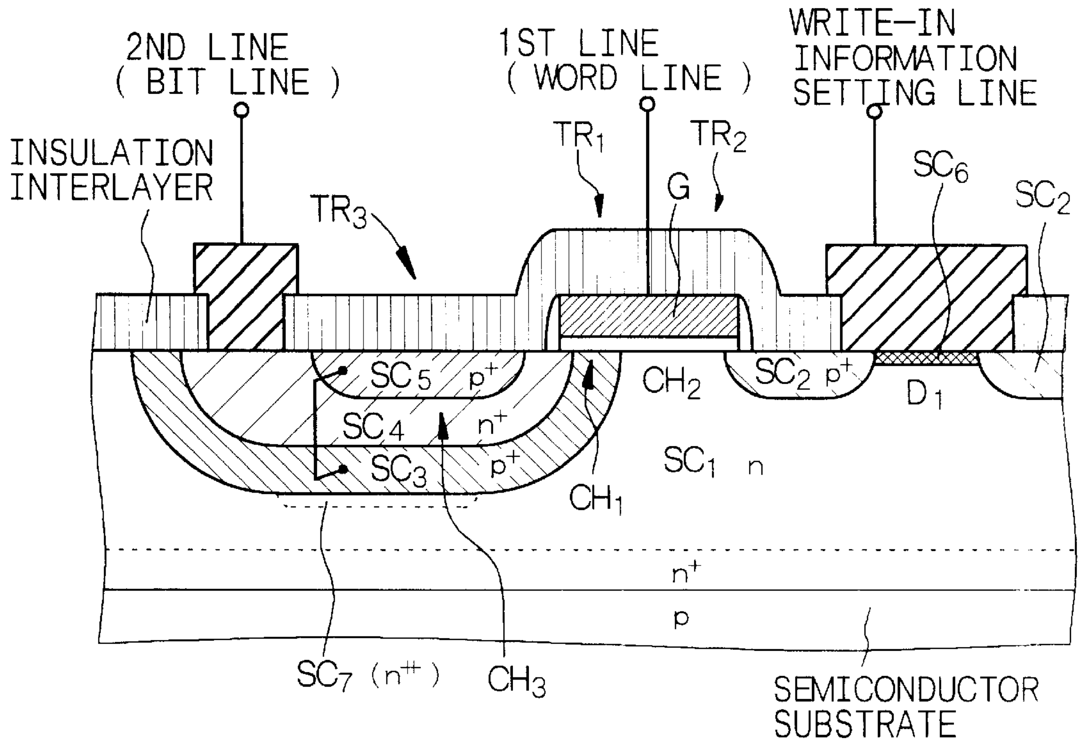
FIGS. 7A and 7B are a schematic partial cross-sectional view and a schematic arrangement of each regions of a modification of the semiconductor memory cell in Example 1, respectively.
Figure 7B:
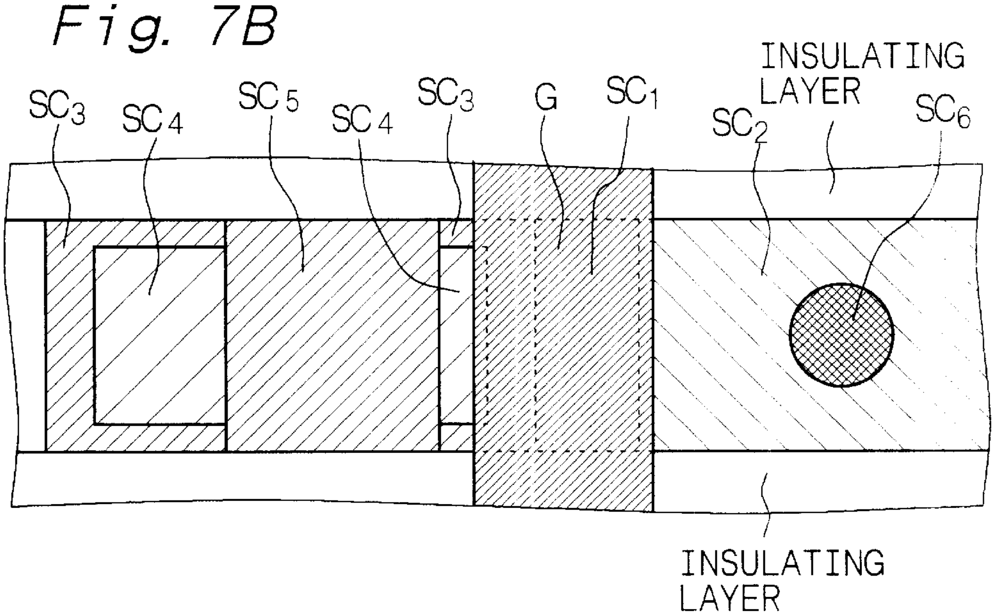

FIGS. 5A, 5B, 6A, 6B, 7A and 7B show schematic partial views of modifications of the semiconductor memory cell in Example 1. Each of FIGS. 5A, 6A and 7A shows a schematic partial cross-sectional view and each of FIGS. 5B, 6B and 7B shows a schematic layout of the gate portion and each regions. FIG. 4A shows a principle drawing of each of the semiconductor memory cells shown in FIGS. 5A, 5B, 6A and 6B. On the other hand, FIG. 4B shows a principle drawing of the semiconductor memory cell shown in FIGS. 7A and 7B. The semiconductor memory cells shown in FIG. 5A and 5B is a modification of the semiconductor memory cell shown in FIG. 1B. The semiconductor memory cell shown in FIG. 6A and 6B is a modification of the semiconductor memory cell shown in FIG. 2A. The semiconductor memory cell shown in FIG. 7A and 7B is a modification of the semiconductor memory cell shown in FIG. 3B.

In each of the above semiconductor memory cells, the fifth region $SC_5$ is connected to the third region $SC_3$ in place of being connected to the predetermined potential line. More specifically, the fifth region $SC_5$ and the third region $SC_3$ can be connected to each other, e.g., by providing a structure in which part of the third region $SC_3$ is extended up to the vicinity of the surface of the semiconductor substrate so that the fifth region $SC_5$ and the extending portion of the third region $SC_3$ come in contact with each other outside the fourth region $SC_4$. The wiring configuration can be simplified by structuring the semiconductor memory cell as explained above. The semiconductor memory cell shown in FIGS. 7A and 7B has a configuration in which a sixth region $SC_6$ is formed in a surface region of the first region $SC_1$ and forms a rectifier junction together with the first region $SC_1$. The sixth region $SC_6$ is constituted of, for example, a silicide. A diode $D_1$ of Schottky junction type is constituted of the sixth region $SC_6$ and the first region $SC_1$, and one end of the diode $D_1$ is connected to the write-in information setting line. In this configuration, the second region $SC_2$ is preferably constituted of semiconductor. The planar shape of the sixth region $SC_6$ is not limited to a circular shape, and may be an arbitrary shape such as a rectangular shape.

The method for manufacturing the semiconductor memory cell of Example 1 shown in FIG. 1B will be explained with reference to FIGS. 22A, 22B, 23A and 23B showing schematic partial cross-sectional views of the semiconductor substrate and so on, hereinafter.

[Step-100]

First, an isolation region (not shown), an n-type well, the first region $SC_1$ of n-type and a gate oxide layer 11 corresponding to the barrier layer are formed in a p-type silicon semiconductor substrate 10. Then, the gate portion G which is constituted of polysilicon doped with an impurity or has a polyside structure is formed, whereby the structure shown in FIG. 22A can be obtained.

[Step-110]

Figure 22A:
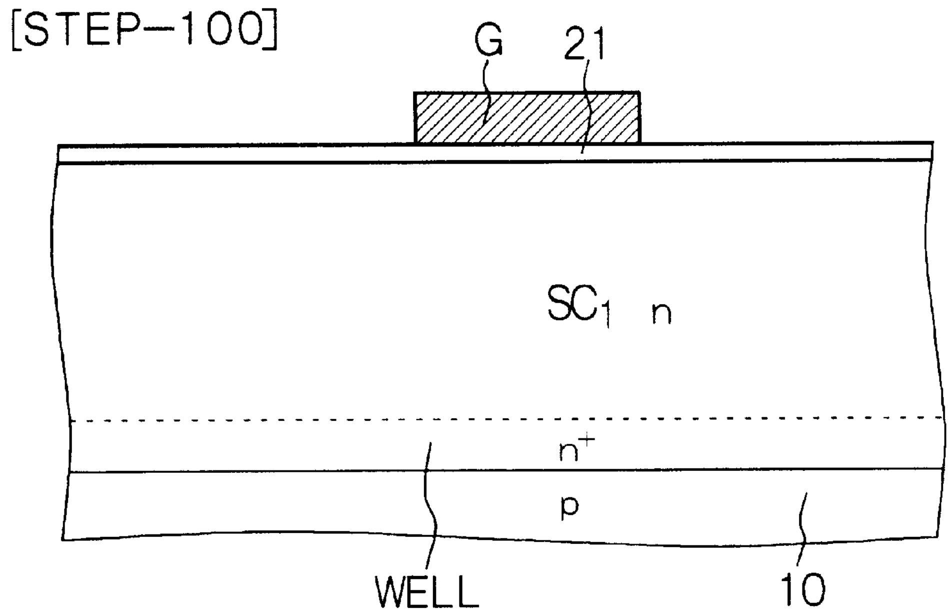
FIGS. 22A and 22B are schematic partial cross-sectional views of a semiconductor substrate, etc., for the explanation of a manufacturing method of the semiconductor memory cell in Example 1.
Figure 22B:
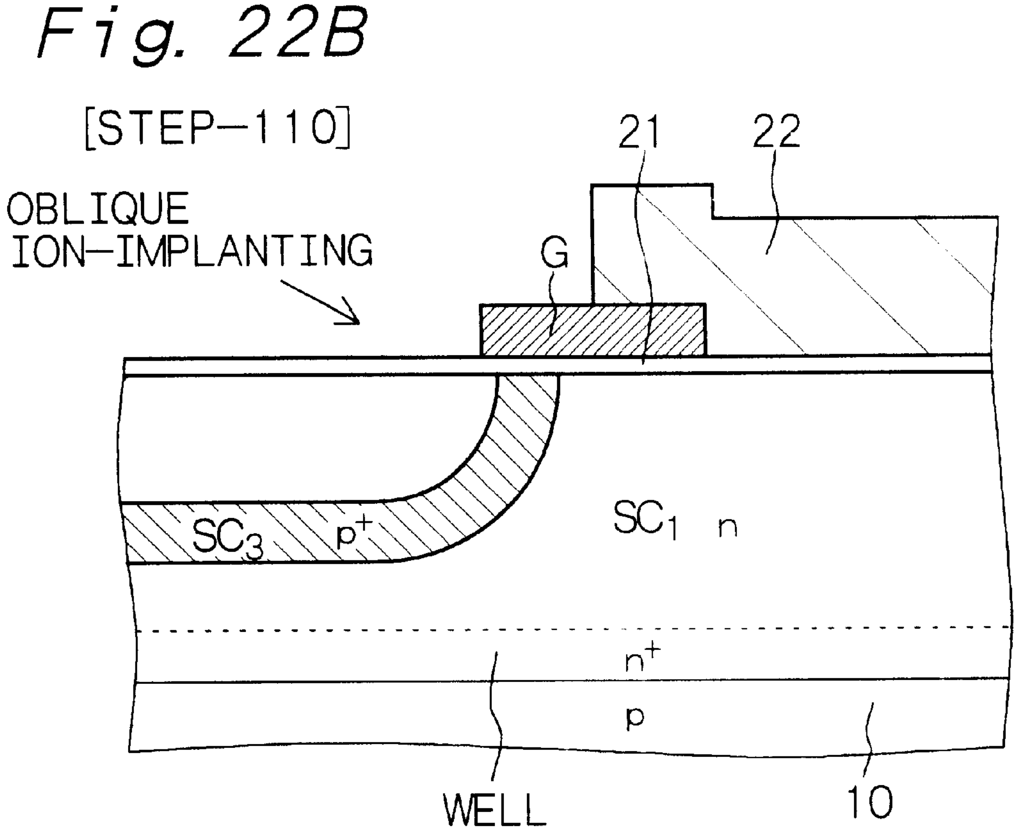

Then, an ion implantation mask 22 is formed from a resist material, and an impurity of the second conductivity type (for example, p-type) is ion-implanted to form the third semi-conductive region $SC_3$ in the surface region of the first region $SC_1$ (see FIG. 22B). The third region $SC_3$ can be formed under and beyond the edge of the gate portion G by using an oblique ion implantation technique.

[Step-120]

Figure 23A:
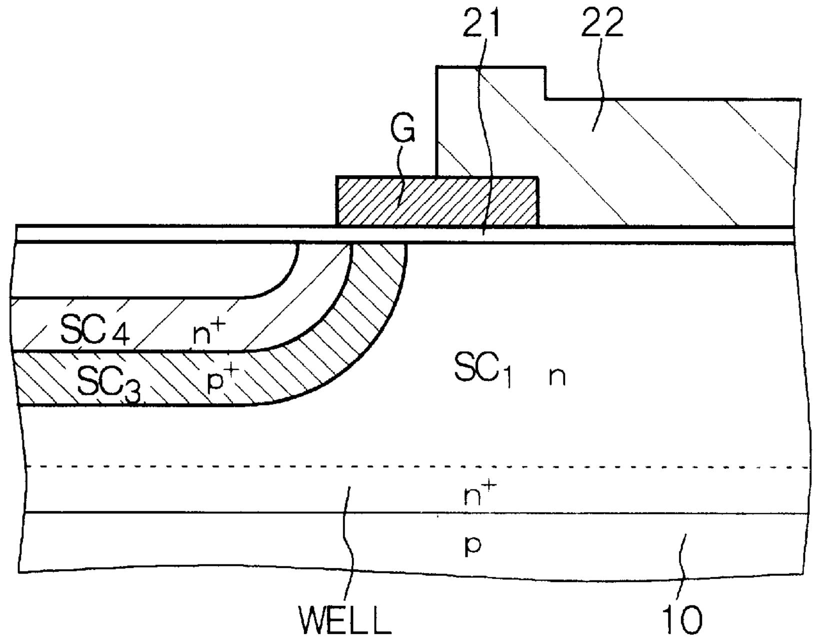
FIGS. 23A and 23B, subsequent to FIG. 22B, are schematic partial cross-sectional views of a semiconductor substrate, etc., for the explanation of a manufacturing method of the semiconductor memory cell in Example 1.
Figure 23B:
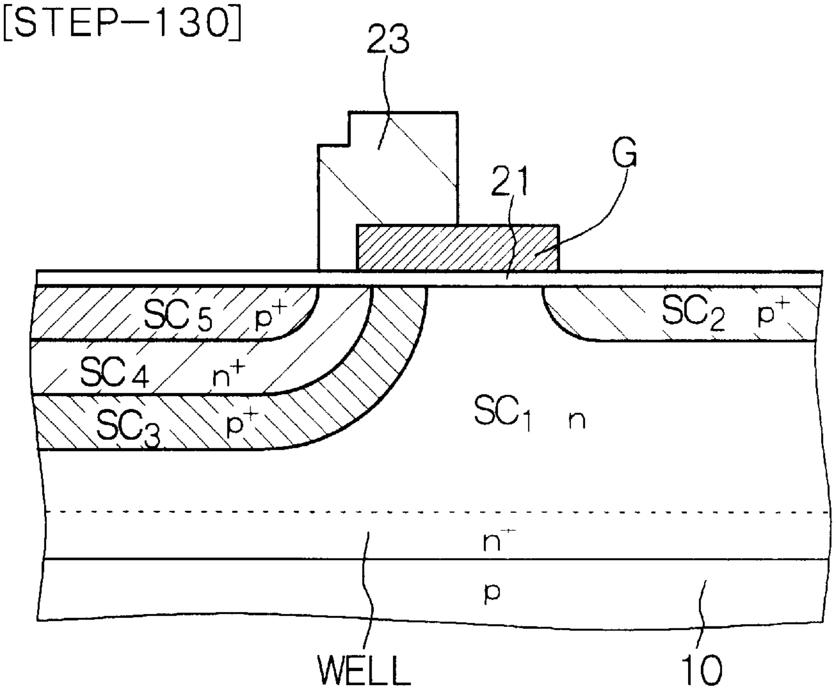

Then, an impurity of the first conductivity type (for example, n-type) is ion-implanted to form the fourth region $SC_4$ in the surface portion of the third region $SC_3$ so as to form a rectifier junction together with the third region $SC_3$ (see FIG. 23A).

[Step-130]

The ion implantation mask 22 is then removed, another ion implantation mask 23 is formed from a resist material, and an impurity of the second conductivity type (for example, p-type) is ion-implanted to form the second region $SC_2$ of the second conductivity type in the surface region of the first region $SC_1$ as well as being spaced from the third region $SC_3$. In this process, the fifth region $SC_5$ of the second conductivity type (for example, p-type) is also formed in the surface region of the fourth region $SC_4$ (see FIG. 23B).

[Step-140]

Then, the semiconductor memory cell will be completed according to a conventional fabrication process of MOS transistors. It is not always necessary to form the second region $SC_2$ by the ion implantation. A barrier layer or glue layer constituted of titanium silicide or TiN, being usually formed in the general process for fabricating the write-in information setting line, may be formed also on the surface of the first region $SC_1$. Thus, the second region $SC_2$ is formed in common with part of the write-in information setting line (more specifically, part of the barrier layer or glue layer) in the surface region of the first region $SC_1$. Provided that a variety of conductive regions are constituted of a silicide, a metal or a metal compound, and that the conductive region is to be connected to a wiring, the conductive region, in any semiconductor memory cell described hereinafter, may be formed of a material in common with that constituting the wiring (for example, titanium silicide, TiN, etc., used for the barrier layer or glue layer), as required. A configuration in which the conductive region is formed in common with part of the wiring is thus obtained. A configuration in which the conductive region and part of the wiring is fabricated in common includes the one in which the conductive region is constituted of a compound obtained by reacting between a material constituting a wiring and silicon originated from the silicon semiconductor substrate.

In the semiconductor memory cell of Example 1, the distance (thickness of the channel region $CH_3$) between the facing gate regions (the fifth region $SC_5$ and the portion of the third region $SC_3$ facing the fifth region $SC_5$) of the junction-field-effect transistor $TR_3$ is optimized, and impurity concentrations of the facing gate regions (the fifth region $SC_5$ and the portion of the third region $SC_3$ facing the fifth region $SC_5$) and the channel region $CH_3$ (specifically, the fourth region $SC_4$) of the junction-field-effect transistor $TR_3$ are optimized on the basis of an ion-implantation condition. These optimization need to be carried out by computer simulation or experiments.

The manufacturing processes of the semiconductor memory cell of Example 1 are not limited to those described in the above. An arbitrary order of Step-110, Step-120 and Step-130 is allowable. The gate portion or a device isolation region can be formed after Step-130.

The semiconductor memory cells shown in FIGS. 2A, 2B, 6A and 6B, or FIGS. 10A, 10B , 13, 14, 17B and 20B explained later, can be formed in a so-called bonded substrate produced by forming a convex portion in a semiconductor substrate (a starting substrate), depositing an insulator (insulating layer) on an entire surface, attaching the insulator (insulating layer) and a supporting substrate to each other, and grinding and polishing the semiconductor substrate (the starting substrate) from its back surface. In another method, for example, a silicon semiconductor substrate is ion-implanted with oxygen and then, heat-treated to obtain an insulator (insulating layer) according to an SIMOX method, and the semiconductor memory cell can be formed in a silicon layer remaining thereon. In still another method, for example, an amorphous silicon layer or a polysilicon layer is deposited on an insulator (insulating layer) by a CVD method, then, a silicon layer is formed by any one of known single-crystallization methods such as a zone melting crystallization method using laser beam or electron beam and a lateral solid phase epitaxy method in which a crystal is grown through an opening formed in an insulator (insulating layer), and the semiconductor memory cell can be formed in the above silicon layer. Further, the semiconductor memory cell can be obtained by depositing, for example, a polysilicon layer or an amorphous silicon layer on an insulator (insulating layer) deposited on a supporting substrate, and manufacturing the semiconductor memory cell in the above polysilicon layer or amorphous layer. The above semiconductor memory cell has a so-called TFT structure.

The method of forming the sixth region $SC_6$ such as a titanium silicide layer, that is, the method of forming the titanium silicide layer in the surface region of the first region $SC_1$ where the sixth region $SC_6$ is to be formed will be explained, hereinafter. That is, for example, an insulation interlayer is deposited on an entire surface, and a portion of the insulation interlayer where the titanium silicide layer is to be formed is removed. Then, a titanium layer is deposited, by a sputtering method, on the insulation interlayer including an exposed surface of the first region $SC_1$. Then, a first annealing treatment is carried out, and the titanium layer and the silicon semiconductor substrate (the first region $SC_1$) are allowed to react to form a titanium silicide layer on the surface of the silicon semiconductor substrate. Then, unreacted titanium layer on the insulation interlayer is removed, e.g., with $NH_4OH:H_2O_2:H_2O$, and a second annealing treatment is carried out, whereby a stable titanium silicide layer can be obtained. The material for forming the diode $D_1$ is not limited to titanium silicide, and it may be selected from materials such as cobalt silicide and tungsten silicide. Alternatively, when the write-in information setting line is formed, a barrier layer or a glue layer constituted of titanium silicide or TiN is generally formed. At the same time, the barrier layer or the glue layer is formed on the first region $SC_1$, whereby the sixth region $SC_6$ having a common region with part of the write-in information setting line (more specifically, part of the barrier layer or the glue layer) is formed in the surface of the first region $SC_1$.

EXAMPLE 2

Figure 8A:
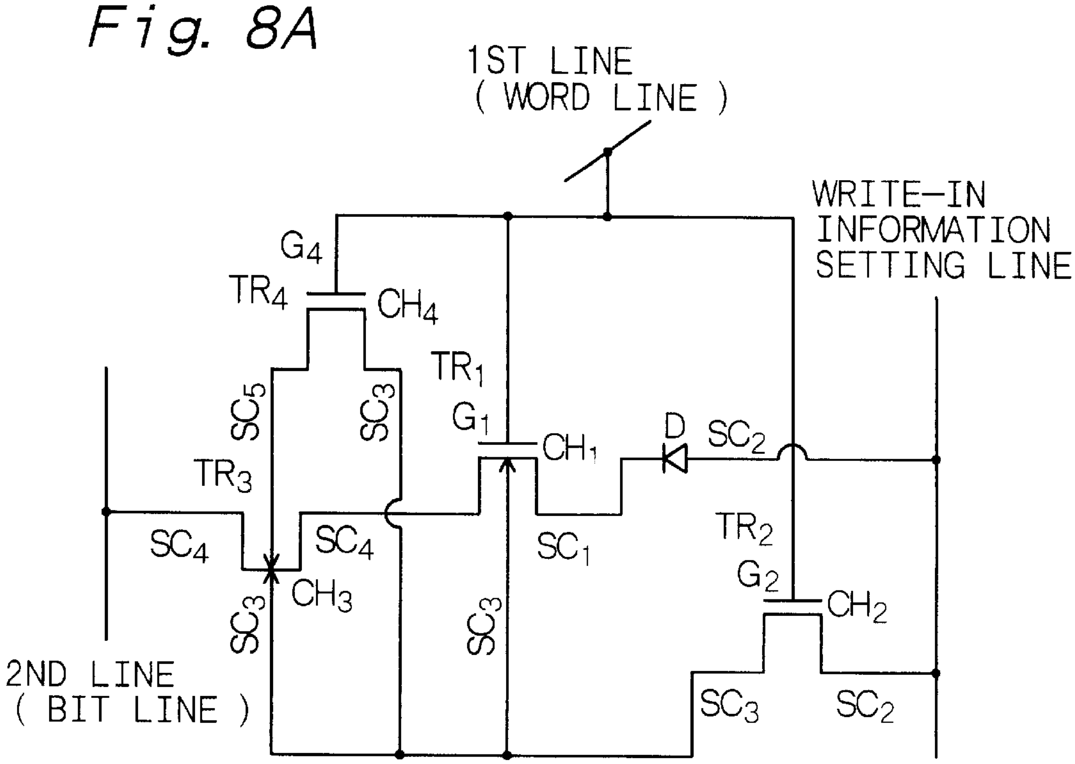
FIGS. 8A and 8B are principle drawings of the semiconductor memory cells in Example 2.
Figure 9A:
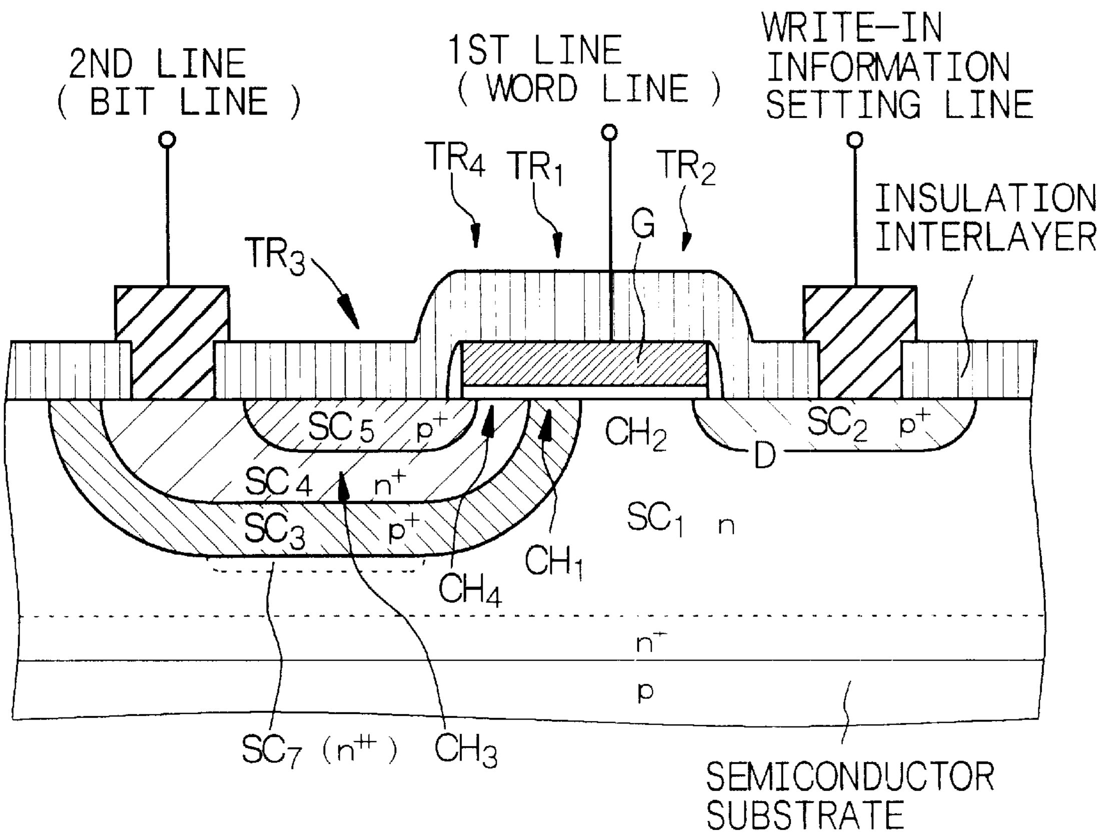
FIGS. 9A and 9B are a schematic partial cross-sectional view and a schematic arrangement of each regions of a semiconductor memory cell in Example 2, respectively.
Figure 9B:
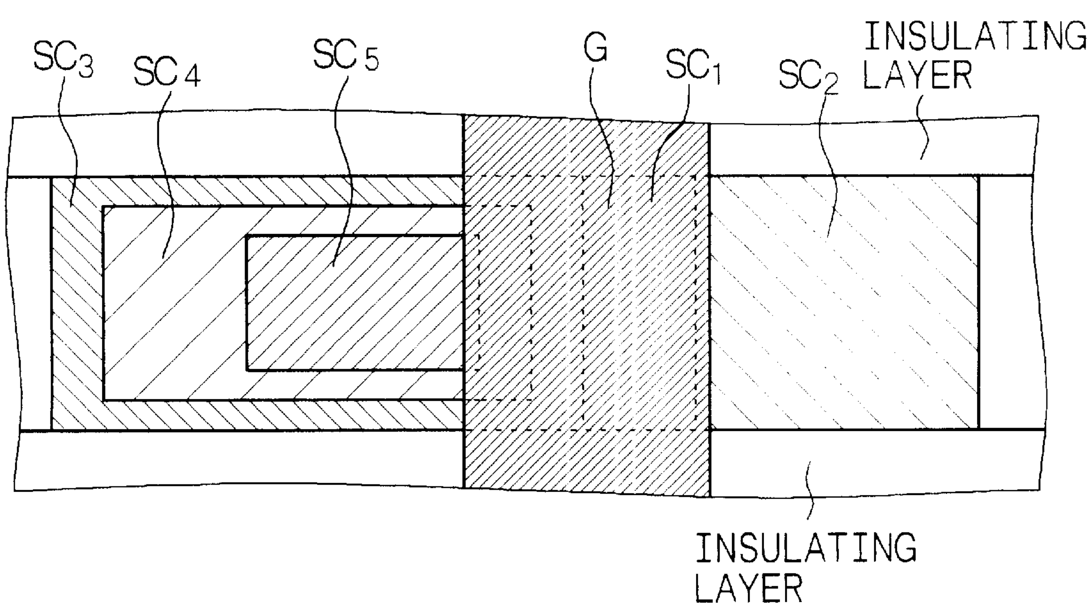

Example 2 is directed to the semiconductor memory cell according to the second aspect of the present invention and the method for manufacturing a semiconductor memory cell according to the first aspect of the present invention. For example, as FIG. 8A shows its principle drawing, as FIG. 9A shows its schematic partial cross-sectional view and as FIG. 9B shows its schematic layout of a gate portion and each regions, the semiconductor memory cell of Example 2 comprises a first transistor of a first conductivity type (e.g., n-type) for read-out $TR_1$, a second transistor of a second conductivity type (e.g., p-type) for write-in $TR_2$, a junction-field-effect transistor of the first conductivity type (e.g., n-type) for current control $TR_3$, a third transistor of the second conductivity type (e.g., p-type) for write-in $TR_4$, and a diode D. In Example 2, the first transistor $TR_1$, the second transistor $TR_2$ and the third transistor $TR_4$ are merged into one unit. That is, the semiconductor memory cell of Example 2 approximately occupies an area which one transistor occupies.

The semiconductor memory cell of Example 2 has;

(1) a first semi-conductive region $SC_1$ of the first conductivity type (for example, n-type), (2) a second semi-conductive region $SC_2$ of the second conductivity type (for example, $p^+$-type) opposite to the first conductivity type, or a second conductive region $SC_2$ formed of a silicide, a metal or a metal compound, said second region $SC_2$ being formed in a surface region of the first region $SC_1$ and forming a rectifier junction together with the first region $SC_1$, (3) a third semi-conductive region $SC_3$ of the second conductivity type (for example, $p^+$-type) formed in a surface region of the first region $SC_1$ and spaced from the second region $SC_2$, (4) a fourth semi-conductive region $SC_4$ of the first conductivity type (for example, $n^+$-type), formed in a surface region of the third region $SC_3$, (5) a fifth semi-conductive region $SC_5$ of the second conductivity type (for example, $p^+$-type), or a fifth conductive region $SC_5$ formed of a silicide, a metal or a metal compound, said fifth region $SC_5$ being formed in a surface region of the fourth region $SC_4$ and forming a rectifier junction together with the fourth region $SC_4$, and (6) a gate portion G shared by the first transistor $TR_1$, the second transistor $TR_2$ and the third transistor $TR_{4B}$ and formed on a barrier layer so as to bridge the first region $SC_1$ and the fourth region $SC_4$, so as to bridge the second region $SC_2$ and the third region $SC_3$ and so as to bridge the third region $SC_3$ and the fifth region $SC_5$.

Concerning the first transistor $TR_1$;

(A-1) one source/drain region is constituted of the surface region of the fourth region $SC_4$, (A-2) the other source/drain region is constituted of the surface region of the first region $SC_1$ sandwiched by (or interposed between) the second region $SC_2$ and the third region $SC_3$, and (A-3) a channel forming region $CH_1$ is constituted of the surface region of the third region $SC_3$ sandwiched by (or interposed between) the surface region of the first region $SC_1$ and the surface region of the fourth region $SC_4$.

Concerning the second transistor $TR_2$;

(B-1) one source/drain region is constituted of the second region $SC_2$, (B-2) the other source/drain region is constituted of the surface region of the third region $SC_3$ constituting the channel forming region $CH_1$ of the first transistor $TR_1$, and (B-3) a channel forming region $CH_2$ is constituted of the surface region of the first region $SC_1$ constituting the other source/drain region of the first transistor $TR_1$.

Further, concerning the junction-field-effect transistor $TR_3$;

(C-1) gate regions are constituted of the fifth region $SC_5$ and a portion of the third region $SC_3$ facing the fifth region $SC_5$, (C-2) a channel region $CH_3$ is constituted of part of the fourth region $SC_4$ sandwiched by (or interposed between) the fifth region $SC_5$ and said portion of the third region $SC_3$, (C-3) one source/drain region is constituted of a portion of the fourth region $SC_4$ extending from one end of the channel region $CH_3$ of the junction-field-effect transistor $TR_3$ and constituting one source/drain region of the first transistor $TR_1$, and (C-4) the other source/drain region is constituted of a portion of the fourth region $SC_4$ extending from the other end of the channel region $CH_3$ of the junction-field-effect transistor $TR_3$.

Concerning the third transistor $TR_4$;

(D-1) one source/drain region is constituted of the surface region of the third region $SC_3$ constituting the channel forming region $CH_1$ of the first transistor $TR_1$, (D-2) the other source/drain region $TR_4$ is constituted of the fifth region $SC_5$, and (D-3) a channel forming region $CH_4$ is constituted of the surface region of the fourth region $SC_4$ functioning as one source/drain region of the first transistor $TR_1$.

The junction-field-effect transistor $TR_3$ in the semiconductor memory cell of Example 2 can be formed by (X) optimizing the distance (thickness of the channel region $CH_3$) between the facing gate regions (the fifth region $SC_5$ and the portion of the third region $SC_3$ facing the fifth region $SC_5$) of the junction-field-effect transistor $TR_3$, and (Y) optimizing impurity concentrations of the facing gate regions (the fifth region $SC_5$ and the portion of the third region $SC_3$ facing the fifth region $SC_5$) and the channel region $CH_3$ (specifically, the fourth region $SC_4$) of the junction-field-effect transistor $TR_3$.

In the semiconductor memory cell of Example 2, the gate portion G is connected to a first memory-cell-selecting line (for example, a word line); the diode D is formed between the first region $SC_1$ and the second region $SC_2$; the first region $SC_1$ is connected to a write-in information setting line through the diode D; the second region $SC_2$ is connected to the write-in information setting line; and the portion of the fourth region $SC_4$ constituting the other source/drain region of the junction-field-effect transistor $TR_3$ is connected to a second memory-cell-selecting line (for example, a bit line).

In Example 2, the semiconductor memory cell (specifically, the first region $SC_1$) is formed in a well of the first conductivity type (for example, n-type) in a p-type semiconductor substrate.

When a region $SC_7$ containing a high concentration of an impurity having the first conductivity type (for example, $n^{++}$-type) is formed between the first region $SC_1$ and the third region $SC_3$ in the semiconductor memory cell of Example 2, a potential or an electric charge stored in the channel forming region $CH_1$ of the first transistor $TR_1$ can be increased.

In the semiconductor memory cell of Example 2, the potential in the third region $SC_3$ and the potential in the fifth region $SC_5$ are approximately equal to each other when the third transistor $TR_4$ is brought into an on-state, and the operation of the junction-field-effect transistor $TR_3$ is reliably controlled by the operation of the third transistor $TR_4$.

Figure 10A:
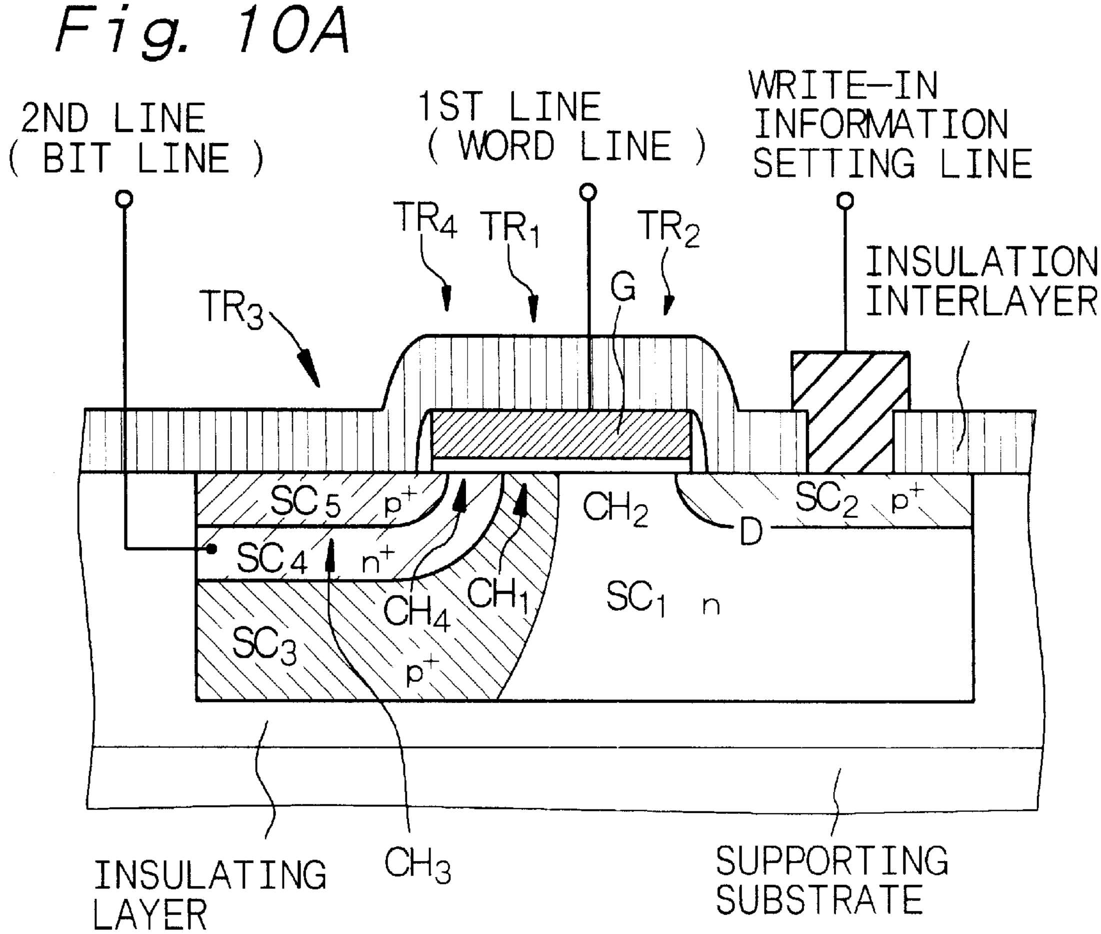
FIGS. 10A and 10B are a schematic partial cross-sectional view and a schematic arrangement of each regions of a modification of the semiconductor memory cell in Example 2, respectively.
Figure 10B:
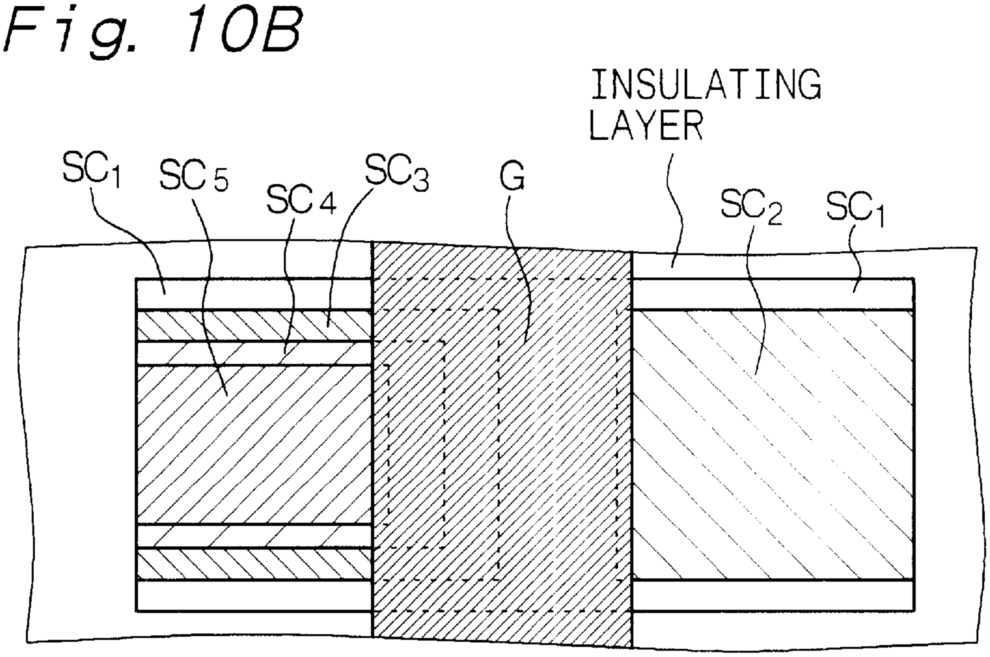

FIGS. 10A and 10B show schematic views of a modification of the semiconductor memory cell in Example 2. FIG. 10A shows a schematic partial cross-sectional view, and FIG. 10B shows a schematic layout of the gate portion and each regions. The semiconductor memory cell shown in FIGS. 10A and 10B having the same configuration as the semiconductor memory cell shown in FIGS. 9A and 9B is formed in a semi-conductive layer surrounded with an insulating layer formed on a supporting substrate.

Figure 8B:
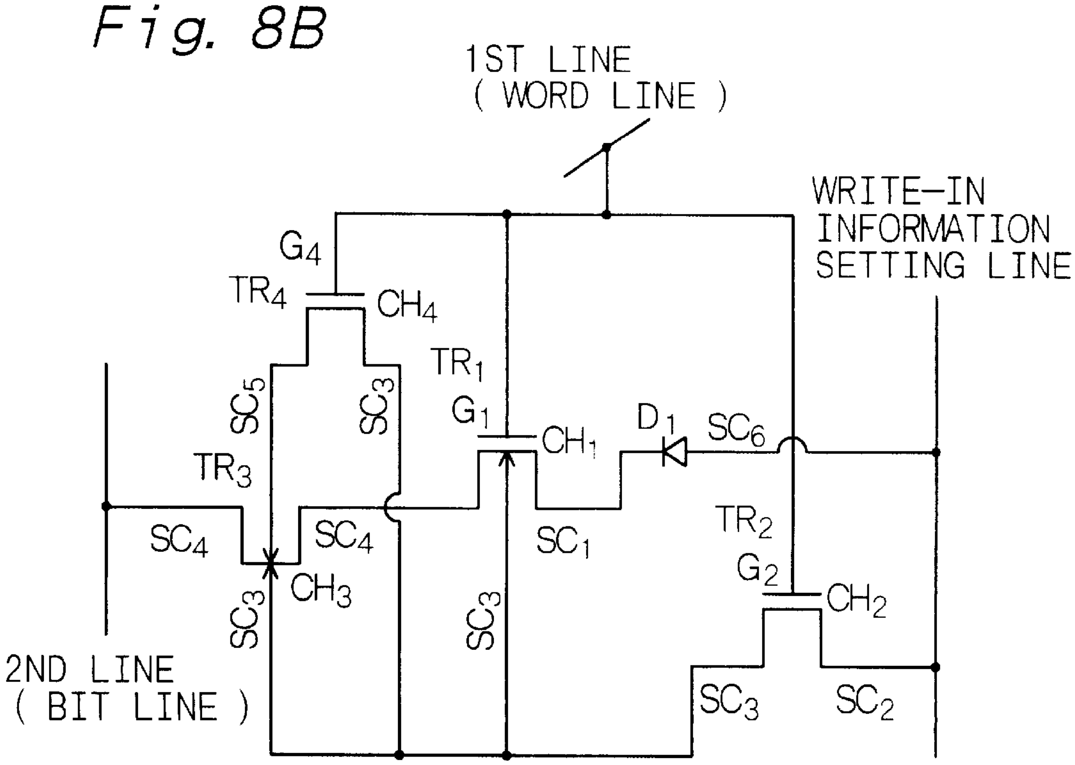
Figure 11A:
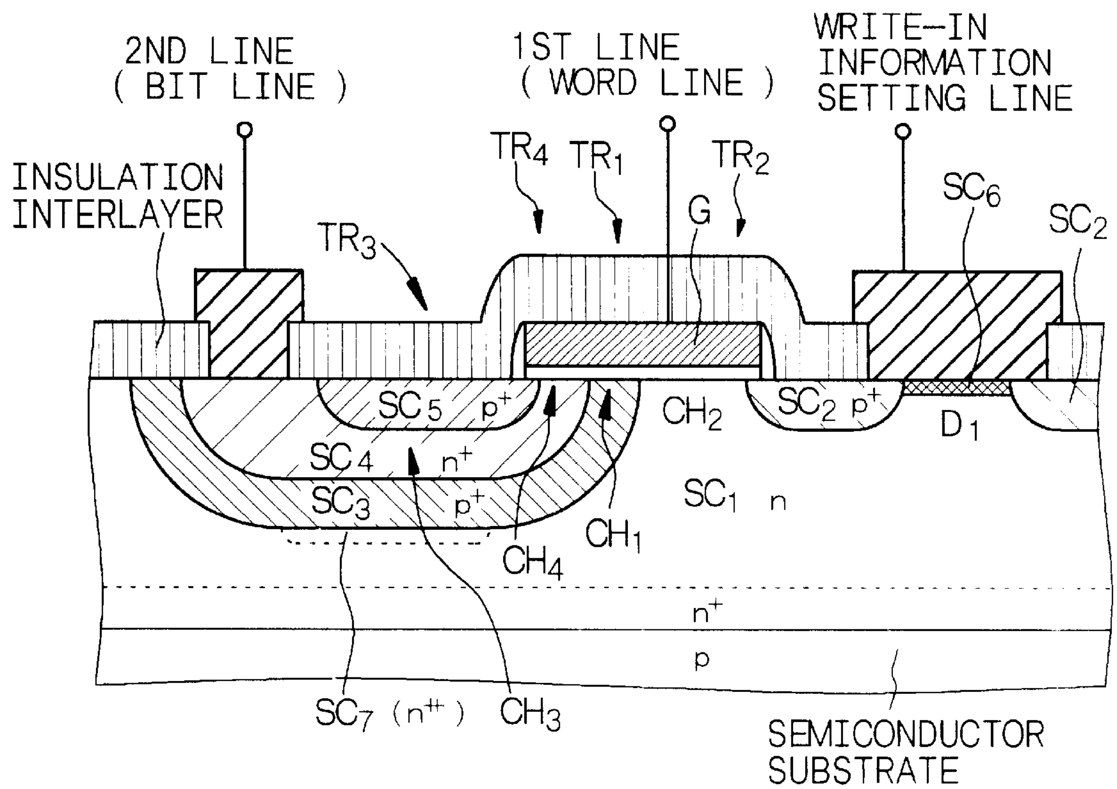
FIGS. 11A and 11B are a schematic partial cross-sectional view and a schematic arrangement of each regions of a modification of the semiconductor memory cell in Example 2 respectively.
Figure 11B:
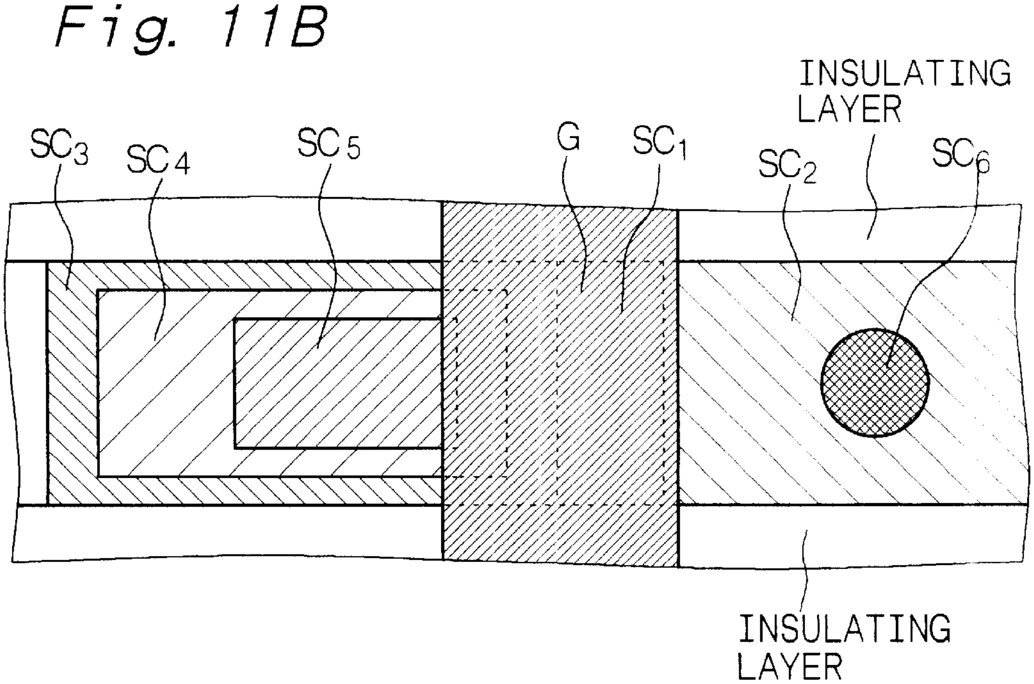

FIGS. 11A and 11B show schematic views of another modification of the semiconductor memory cell in Example 2. FIG. 11A shows a schematic partial cross-sectional view, and FIG. 11B shows a schematic layout of the gate portion and each regions. FIG. 8B shows its principle drawing. The semiconductor memory cell shown in FIGS. 11A and 11B has a configuration in which a sixth region $SC_6$ is formed in a surface region of the first region $SC_1$ and forms a rectifier junction together with the first region $SC_1$. The sixth region $SC_6$ is constituted of, for example, a silicide. A diode $D_1$ of Schottky junction type is constituted of the sixth region $SC_6$ and the first region $SC_1$, and one end of the diode $D_1$ is connected to the write-in information setting line. In this configuration, the second region $SC_2$ is preferably constituted of semiconductor. The sixth region $SC_6$ shown in FIGS. 11A and 11B can be applied to the semiconductor memory cell shown in FIGS. 10A and 10B.

The semiconductor memory cell of Example 2 can be produced by the steps of carrying out the steps similar to Step-100 and Step-110 in the manufacturing process of the semiconductor memory cell of Example 1 (with an exception of adopting oblique ion implantation to form the channel forming region $CH_1$); forming the fourth region $SC_4$ by obliquely ion-implanting to the surface region of the third region $SC_3$ in a process similar to Step-120; and then carrying out the steps similar to Step-130 and Step-140. Alternatively, the semiconductor memory cell of Example 2 can be produced by the steps of carrying the steps similar to Step-100 to Step-120 to obtain the fourth region $SC_4$; forming the gate portion so as to cover that part of the fourth region $SC_4$ which being placed adjacent to the surface region of the third region $SC_3$; and carrying out the steps similar to Step-130 and Step-140. In each of the ion implantation processes, the third region $SC_3$, fourth region $SC_4$ and fifth region $SC_5$ are formed so as to optimize a distance between the facing gate regions of the junction-field-effect transistor $TR_3$, and so as to optimize impurity concentrations of the facing gate regions and the channel region $CH_3$ of the junction-field-effect transistor $TR_3$. An arbitrary order of these ion implantation processes is allowable.

EXAMPLE 3

Figure 12A:
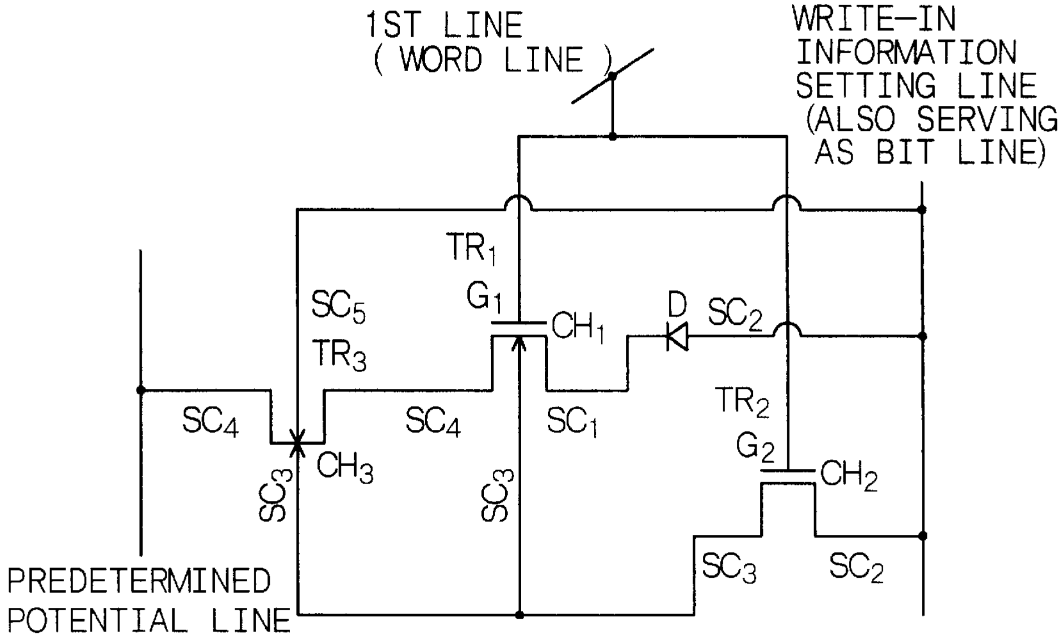
FIGS. 12A and 12B are a principle drawing and a schematic partial cross-sectional view of a semiconductor memory cell in Example 3, respectively.
Figure 12B:
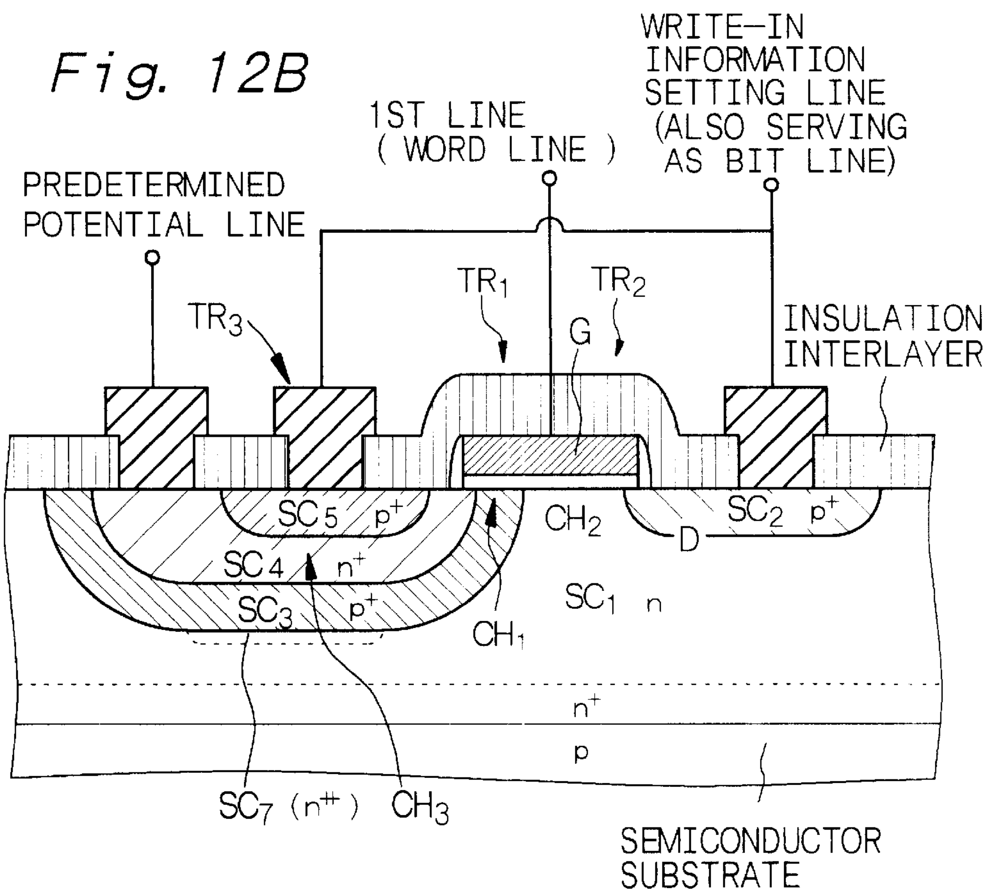

Example 3 is directed to the semiconductor memory cell according to the third aspect of the present invention and the method for manufacturing a semiconductor memory cell according to the first aspect of the present invention. For example, as FIG. 12A shows its principle drawing and as FIG. 12B shows its schematic partial cross-sectional view, the semiconductor memory cell of Example 3 comprises a first transistor of a first conductivity type (e.g., n-type) for read-out $TR_1$, a second transistor of a second conductivity type (e.g., p-type) for write-in $TR_2$, a junction-field-effect transistor of a first conductivity type (e.g., n-type) for current control $TR_3$ and a diode D. In Example 3, the first transistor $TR_1$ and the second transistor $TR_2$ are merged into one unit. That is, the semiconductor memory cell of Example 3 approximately occupies an area which one transistor occupies. In Example 3, the semiconductor memory cell (specifically, the first region $SC_1$) is formed in a well of the first conductivity type (for example, n-type) in a p-type semiconductor substrate.

The configuration of the first region $SC_1$ to the fifth region $SC_5$ in the semiconductor memory cell of Example 3 is the same as that of the semiconductor memory cell of Example 1. Detailed explanations of configuration of the semiconductor memory cell of Example 3 are therefore omitted. Further, the semiconductor memory cell of Example 3 has the same configuration as the semiconductor memory cell of Example 1 in the points that the gate portion G is connected to a first memory-cell-selecting line (for example, a word line) and the diode D is formed between the first region $SC_1$ and the second region $SC_2$, while the semiconductor memory cell of Example 3 differs from the semiconductor memory cell of Example 1 in the following points.

That is, the first region $SC_1$ is connected to the write-in information setting line (also serving as the bit line) through the diode D, the second region $SC_2$ and the fifth region $SC_5$ are connected to the write-in information setting line (also serving as the bit line), and the portion of the fourth region $SC_4$ constituting the other source/drain region of the junction-field-effect transistor $TR_3$ is connected to the predetermined potential line.

Figure 13:
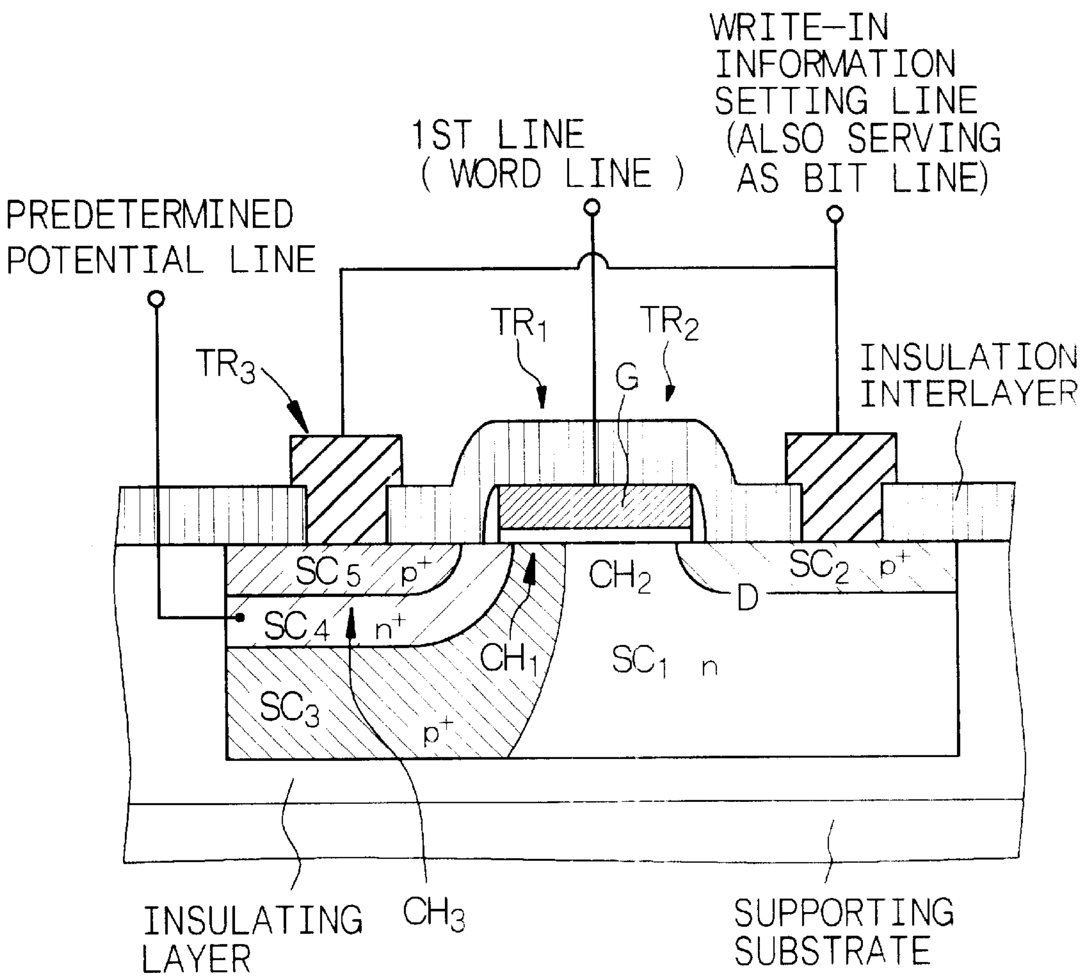
FIG. 13 is a schematic partial cross-sectional view of the semiconductor memory cell in Example 3.
Figure 14:
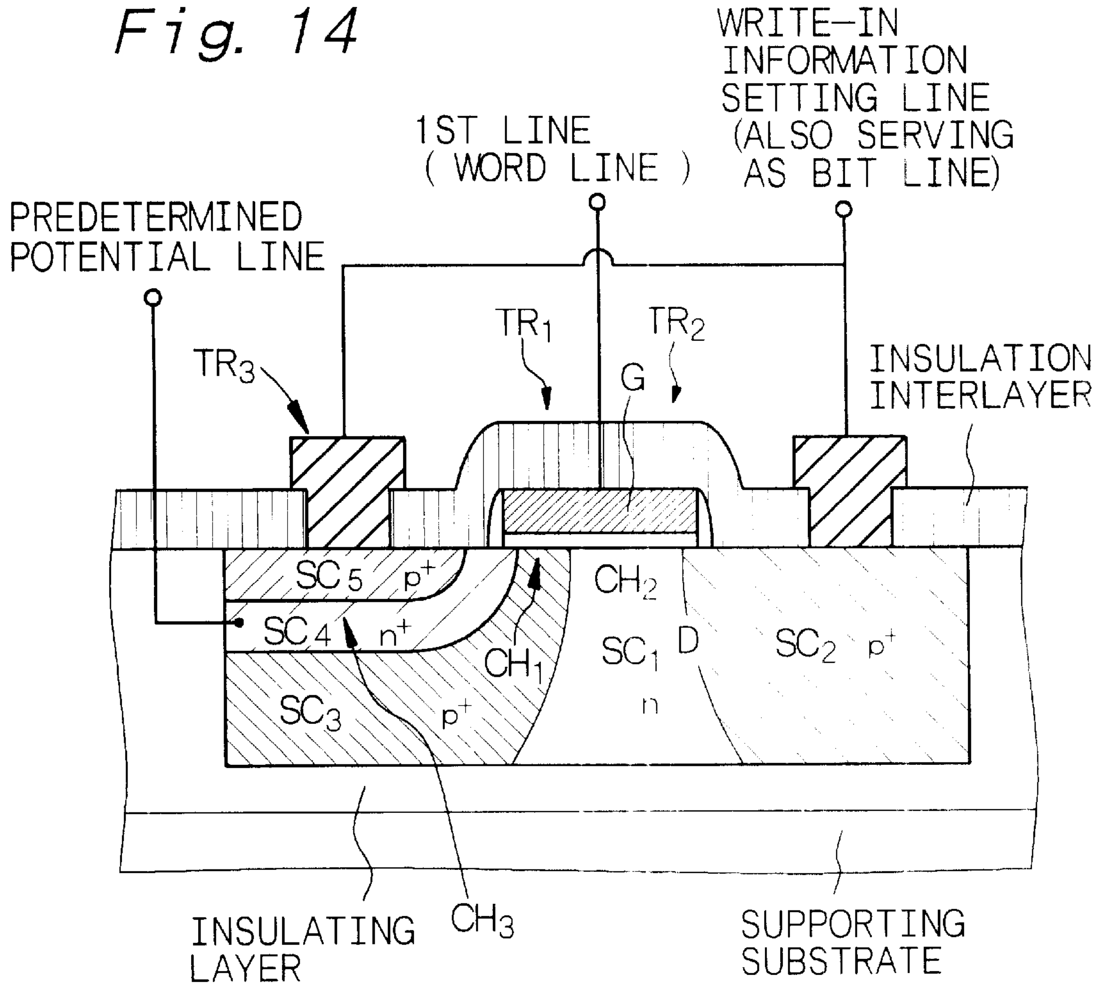
FIG. 14 is a schematic partial cross-sectional view of the semiconductor memory cell in Example 3.

FIGS. 13 and 14 show schematic partial cross-sectional views of modifications of the semiconductor memory cell in Example 3. The semiconductor memory cell shown in FIG. 13 or FIG. 14 having the same configuration as the semiconductor memory cell shown in FIG. 12B is formed in a semi-conductive layer surrounded with an insulating layer formed on a supporting substrate. The semiconductor memory cell shown in FIG. 13 has the same configuration as the semiconductor memory cell shown in FIG. 14, except the depth of the second region $SC_2$.

Figure 15A:
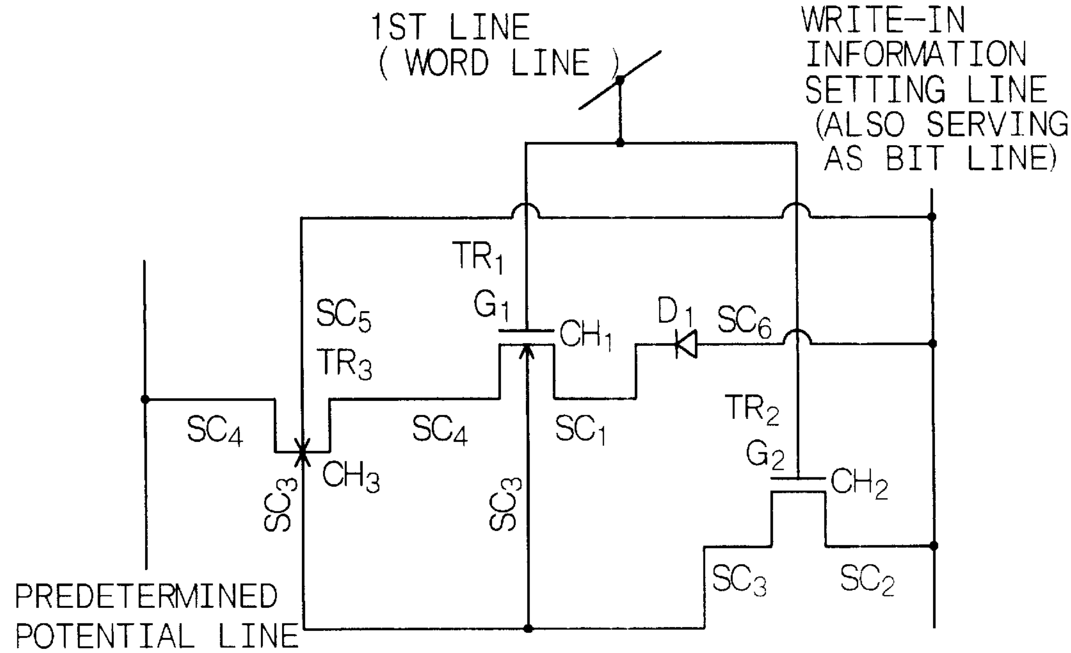
FIGS. 15A and 15B are a principle drawing of a modification of the semiconductor memory cell and a schematic partial cross-sectional view of a modification of the semiconductor memory cell in Example 3, respectively.
Figure 15B:
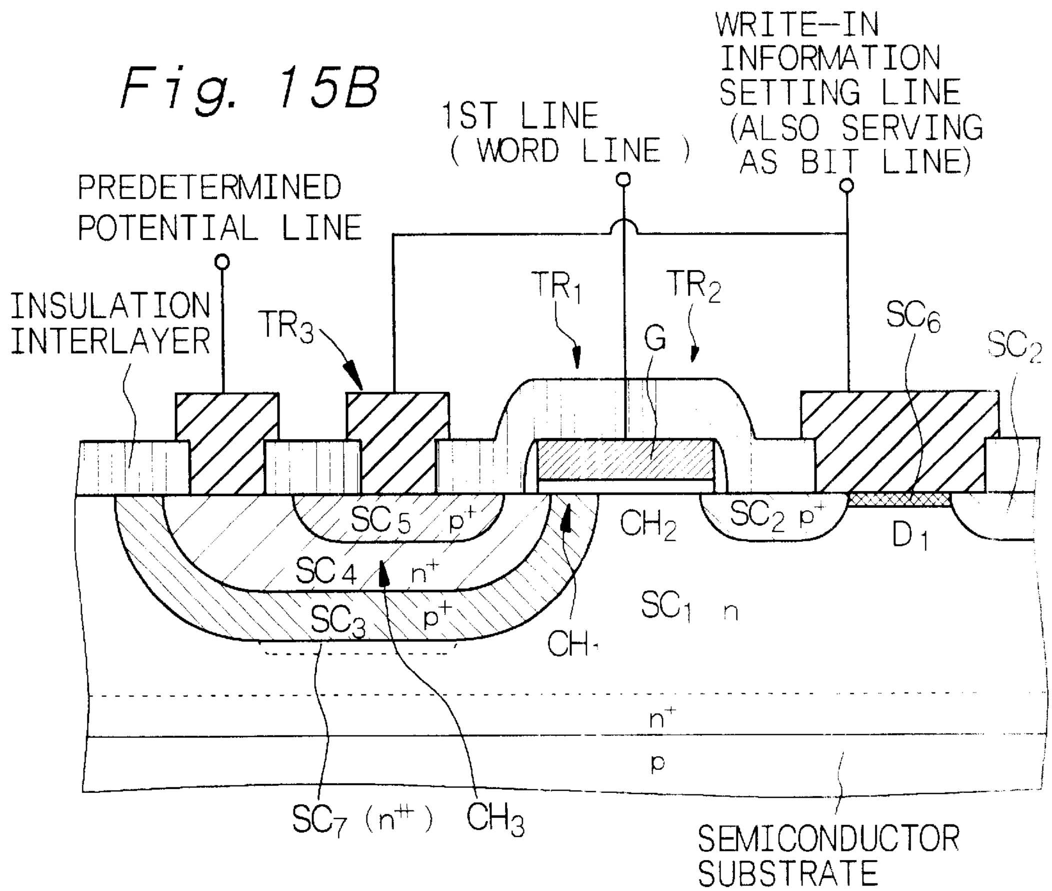

FIGS. 15B shows a schematic partial cross-sectional view of another modification of the semiconductor memory cell in Example 3, and FIG. 15A shows its principle drawing. The semiconductor memory cell shown in FIG. 15B has a configuration in which a sixth region $SC_6$ is formed in a surface region of the first region $SC_1$ and forms a rectifier junction together with the first region $SC_1$. The sixth region $SC_6$ is constituted of, for example, a silicide. In this configuration, the second region $SC_2$ is preferably constituted of semiconductor. A diode $D_1$ of Schottky junction type is constituted of the sixth region $SC_6$ and the first region $SC_1$, and one end of the diode $D_1$ is connected to the write-in information setting line. The sixth region $SC_6$ shown in FIG. 15B can be applied to the semiconductor memory cell shown in FIG. 13.

Figure 16A:
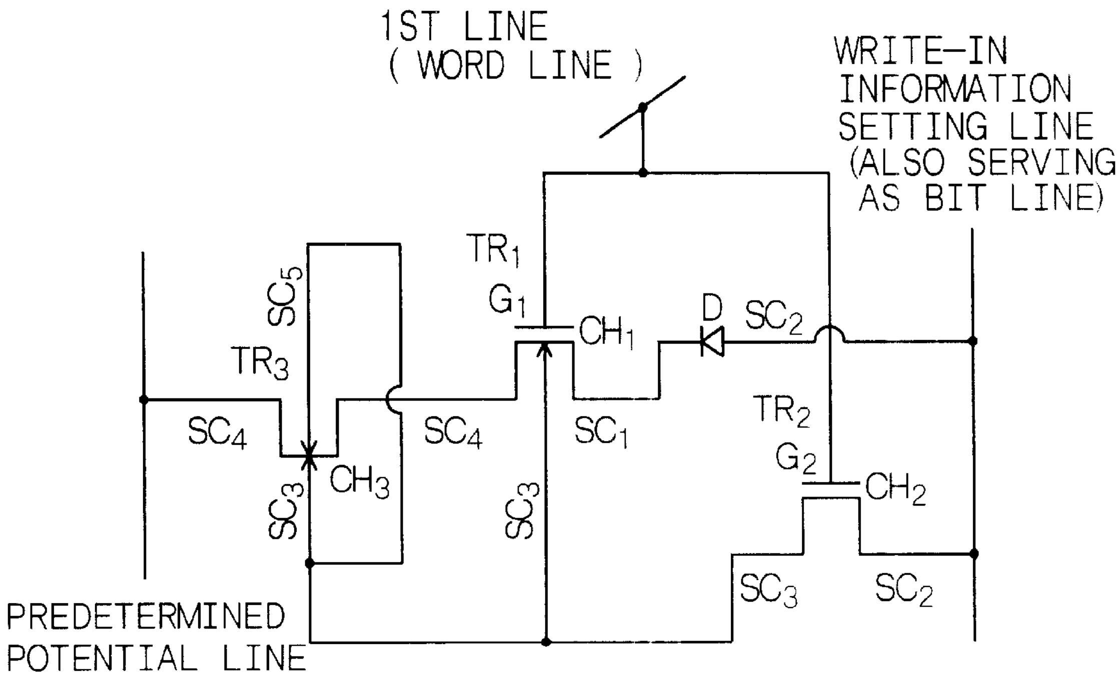
FIGS. 16A and 16B are other principle drawings of modifications of the semiconductor memory cell in Example 3.
Figure 16B:
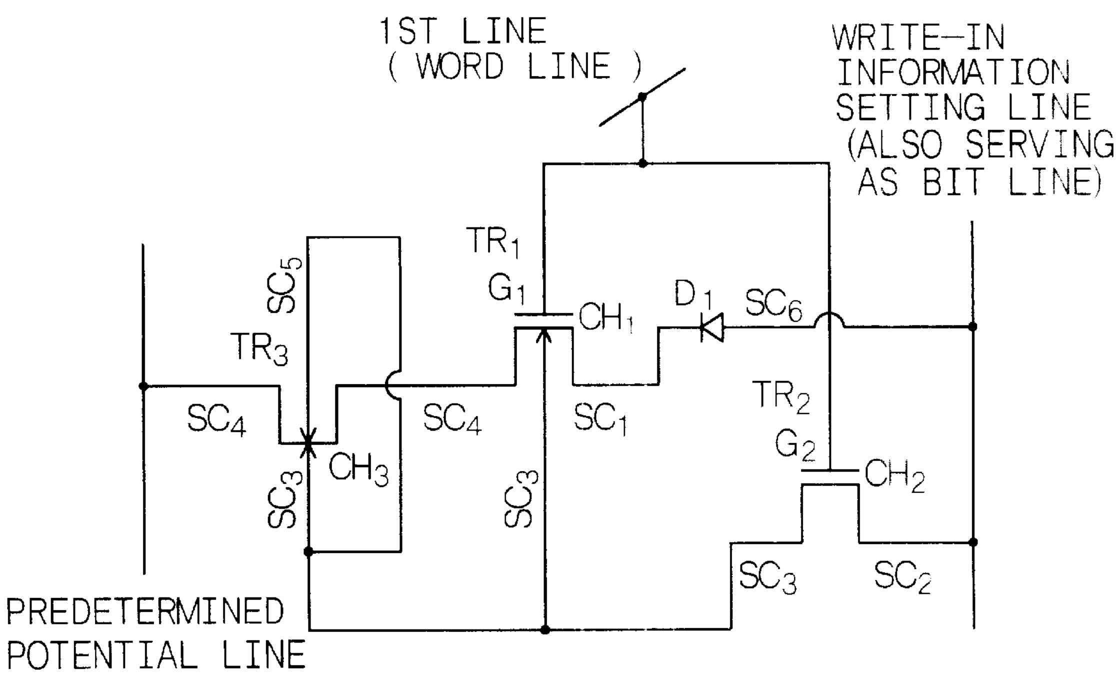
Figure 17A:
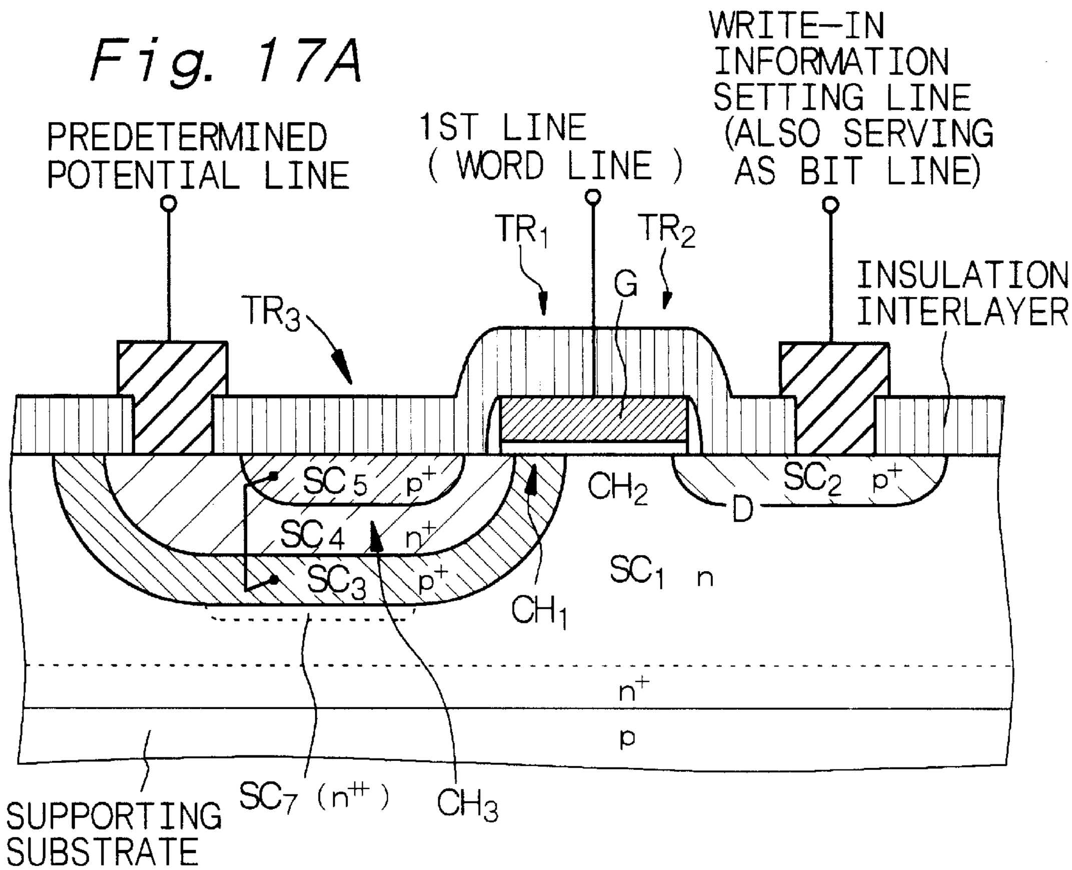
FIGS. 17A and 17B are schematic partial cross-sectional views of modifications of the semiconductor memory cell in Example 3.
Figure 17B:
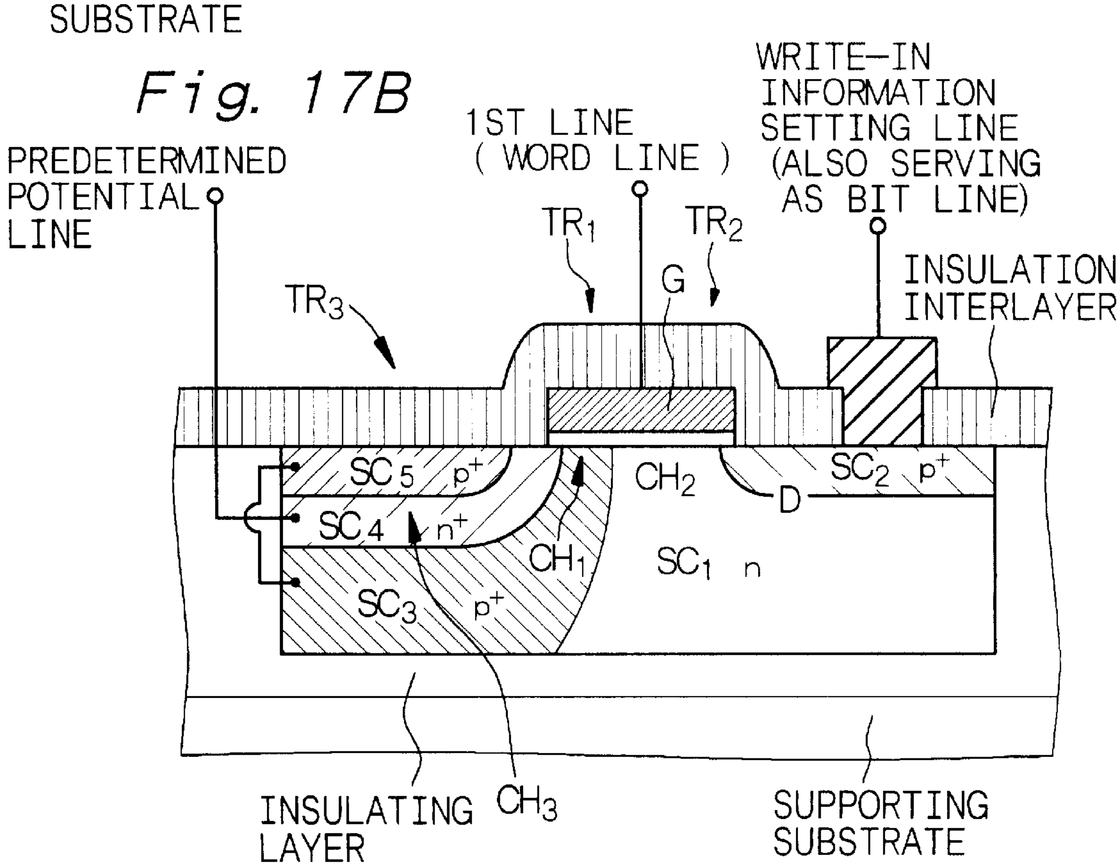
Figure 18:
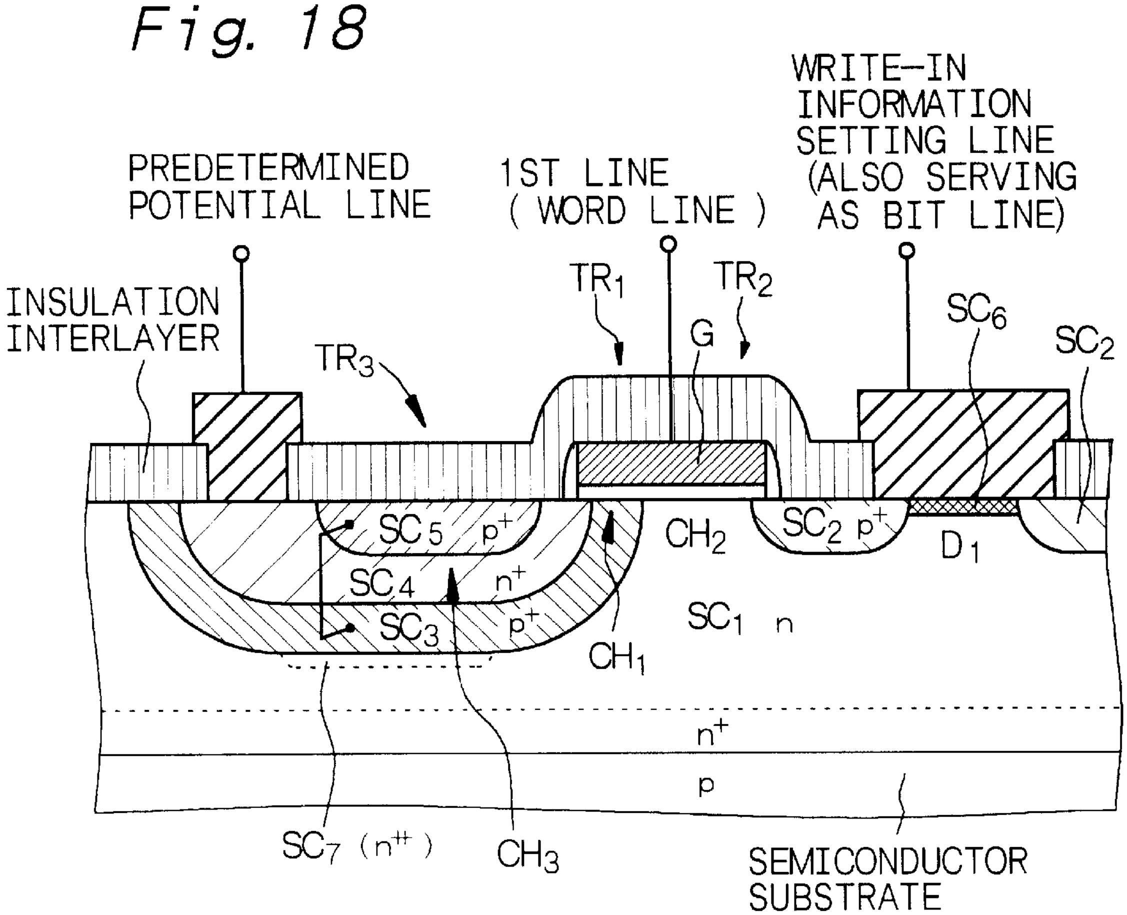
FIG. 18 is a schematic partial cross-sectional view of a modification of the semiconductor memory cell 9B are principle drawings of the semiconductor memory cells in Example 4.

FIGS. 17A, 17B and 18 show schematic partial cross-sectional views of other modifications of the semiconductor memory cell in Example 3. FIG. 16A shows a principle drawing of the semiconductor memory cell shown in each of FIGS. 17A and 17B, while FIG. 16B shows a principle drawing of the semiconductor memory cell shown in FIG. 18. The semiconductor memory cell shown in FIG. 17A is a modification of the semiconductor memory cell shown in FIG. 12B, the semiconductor memory cell shown in FIG. 17B is a modification of the semiconductor memory cell shown in FIG. 13, and the semiconductor memory cell shown in FIG. 18 is a modification of the semiconductor memory cell shown in FIG. 15B.

Each of the above semiconductor memory cells shown in FIGS. 17A, 17B and 18 has a configuration in which the fifth region $SC_5$ is connected to the third region $SC_3$ in place of being connected to the write-in information setting line. More specifically, the fifth region $SC_5$ and the third region $SC_1$ can be connected to each other, e.g., by providing a structure in which part of the third region $SC_3$ is extended up to the vicinity of the surface of the semiconductor substrate so that the fifth region $SC_5$ and the extending portion of the third region $SC_3$ come in contact with each other outside the fourth region $SC_4$. The wiring configuration can be simplified by structuring the semiconductor memory cell as explained above. The semiconductor memory cell shown in FIG. 18 has a configuration in which a sixth region $SC_6$ is formed in a surface region of the first region $SC_1$ and forms a rectifier junction together with the first region $SC_1$. The sixth region $SC_6$ is constituted of, for example, a silicide. In this configuration, the second region $SC_2$ is preferably constituted of semiconductor. A diode $D_1$ of Schottky junction type is constituted of the sixth region $SC_6$ and the first region $SC_1$, and one end of the diode $D_1$ is connected to the write-in information setting line.

When a region $SC_7$ containing a high concentration of an impurity having the first conductivity type (for example, $n^{++}$-type) is formed between the first region $SC_1$ and the third region $SC_3$ in the semiconductor memory cell of Example 3, a potential or an electric charge stored in the channel forming region $CH_1$ of the first transistor $TR_1$ can be increased.

The method of manufacturing the semiconductor memory cell in Example 3 can substantially be the same as the method of manufacturing the semiconductor memory cell of Example 1. Detailed explanations thereof are therefore omitted.

EXAMPLE 4

Figure 19A:
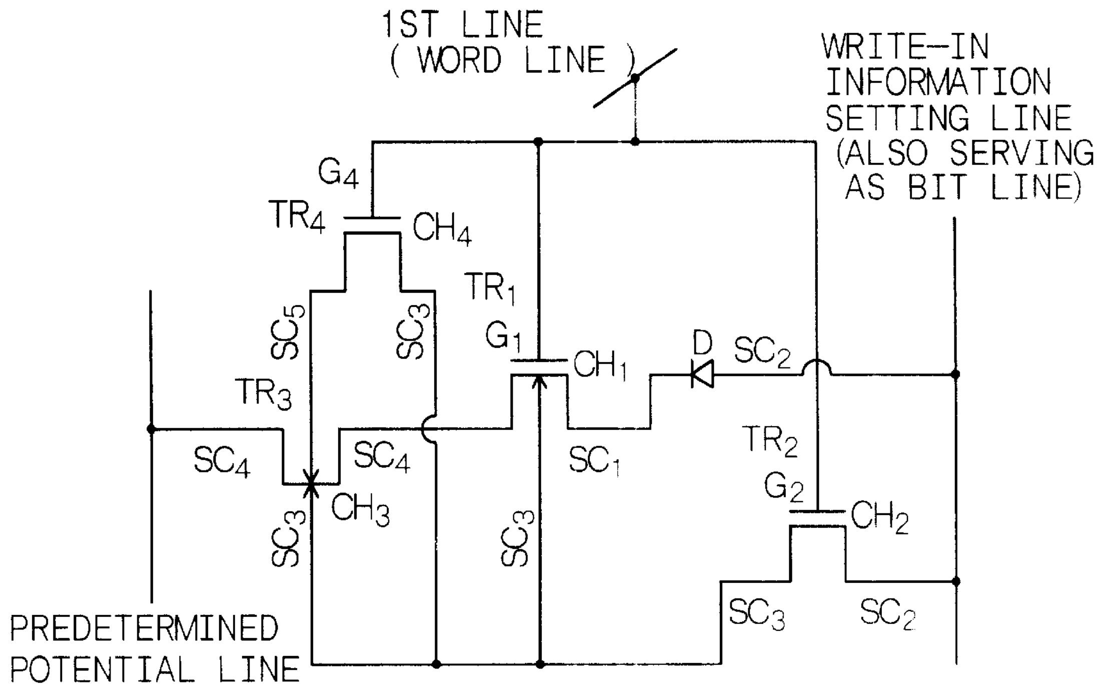
FIGS. 19A and 19B are principle drawings of the semiconductor memory cells in Example 4.
Figure 20A:
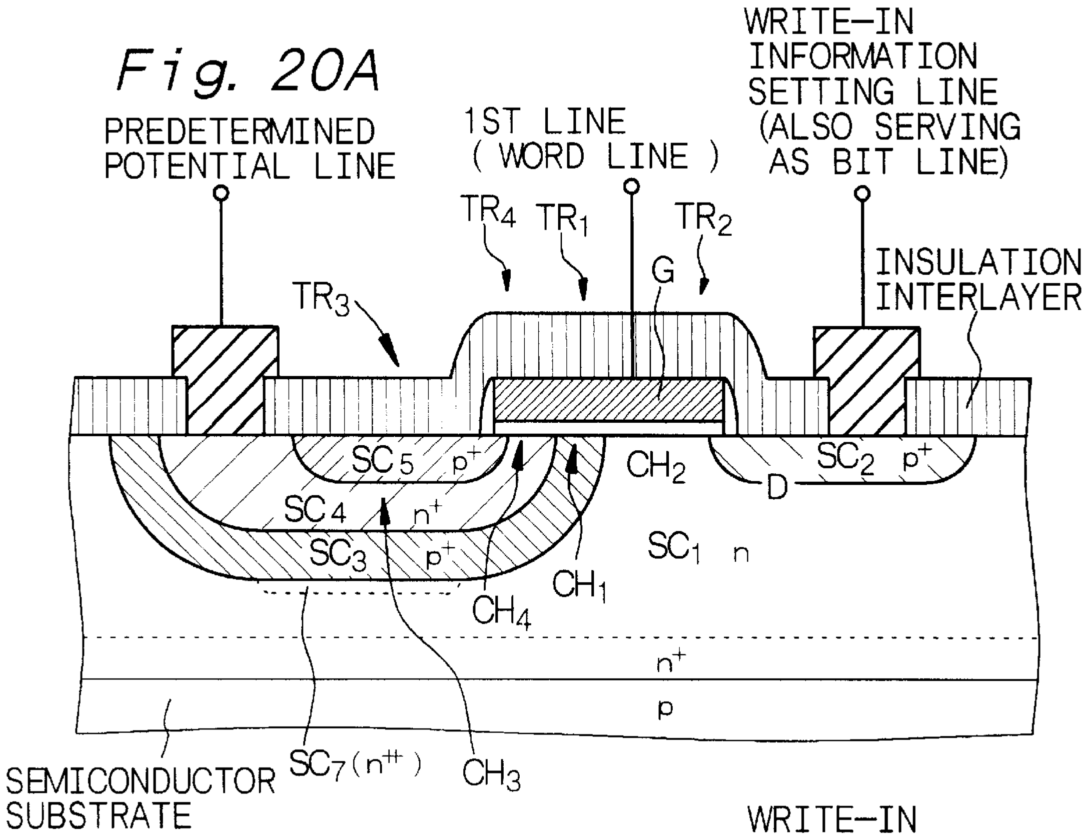
FIGS. 20A and 20B are schematic partial cross-sectional views of modifications of a semiconductor memory cell in Example 4.

Example 4 is directed to the semiconductor memory cell according to the fourth aspect of the present invention and the method for manufacturing a semiconductor memory cell according to the first aspect of the present invention. For example, as FIG. 19A shows its principle drawing, and as FIG. 20A shows its schematic partial cross-sectional view, the semiconductor memory cell of Example 4 comprises a first transistor of a first conductivity type (e.g., n-type) for read-out $TR_1$, a second transistor of a second conductivity type (e.g., p-type) for write-in $TR_2$, a junction-field-effect transistor of the first conductivity type (e.g., n-type) for current control $TR_3$, a third transistor of the second conductivity type (e.g., p-type) for write-in $TR_4$, and a diode D. In Example 4, the first transistor $TR_1$, the second transistor $TR_2$ and the third transistor $TR_4$ are merged into one unit. That is, the semiconductor memory cell of Example 4 occupies an area which two transistors occupy. In Example 4, as shown in FIG. 20A, the semiconductor memory cell (specifically, the first region $SC_1$) is formed in a well of the first conductivity type (for example, n-type) in a p-type semiconductor substrate, The configurations of the first region $SC_1$ to the fifth region $SC_5$ in the semiconductor memory cell of Example 4 are the same as those of the semiconductor memory cell of Example 2. Detailed explanations of configuration of the semiconductor memory cell of Example 4 are therefore omitted. Further, the semiconductor memory cell of Example 4 has the same configuration as the semiconductor memory cell of Example 2 in the points that the gate portion G is connected to a first memory-cell-selecting line (for example, a word line) and the diode D is formed between the first region $SC_1$ and the second region $SC_2$, while the semiconductor memory cell of Example 4 differs from the semiconductor memory cell of Example 2 in the following points.

That is, the first region $SC_1$ is connected to the write-in information setting line (also serving as the bit line) through the diode D, the second region $SC_2$ is connected to the write-in information setting line (also serving as the bit line), and the portion of the fourth region $SC_4$ constituting the other source/drain region of the junction-field-effect transistor $TR_3$ is connected to the predetermined potential line.

Figure 19B:
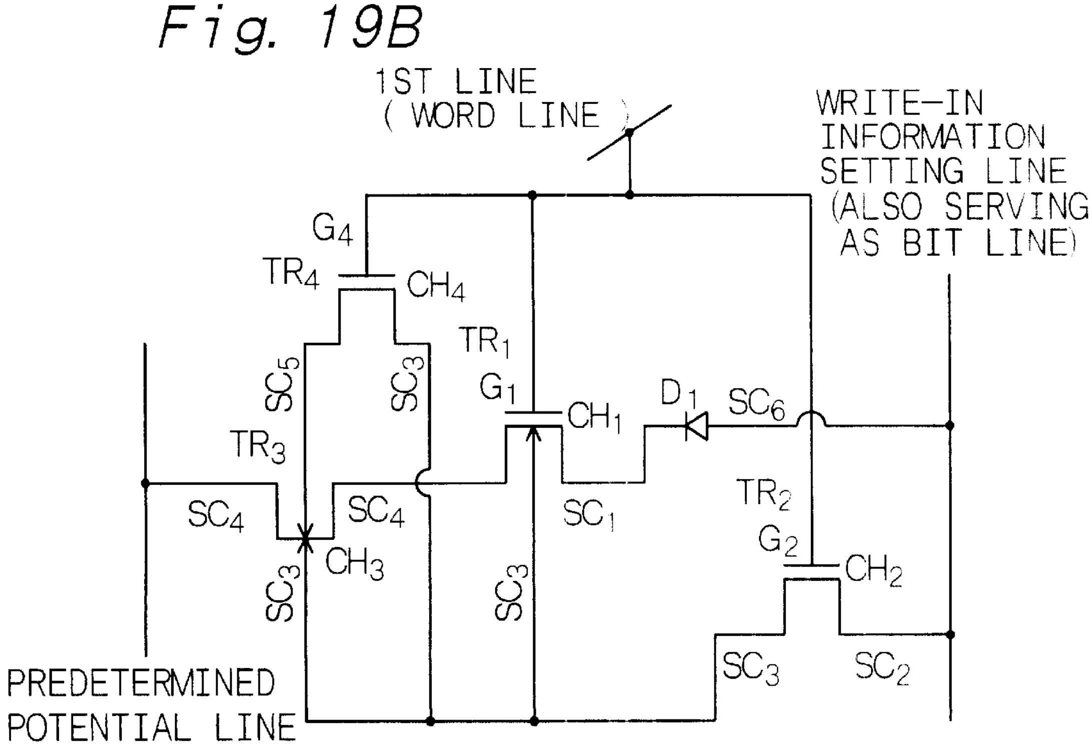
Figure 20B:
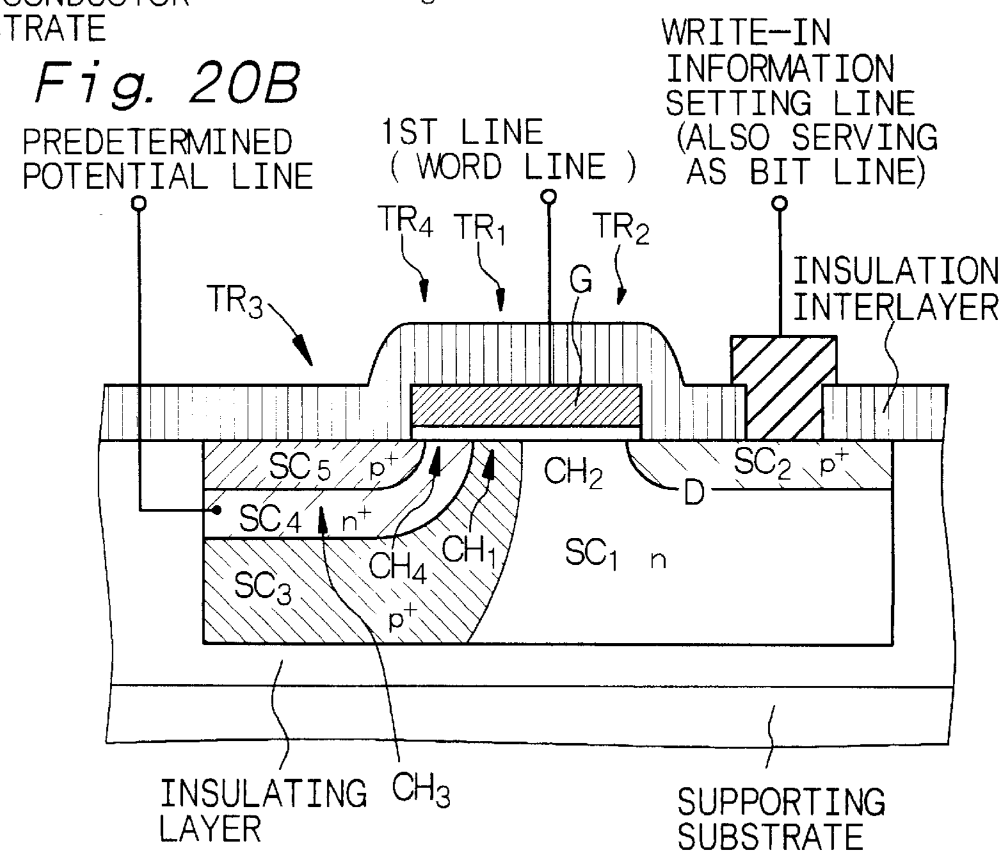
Figure 21:
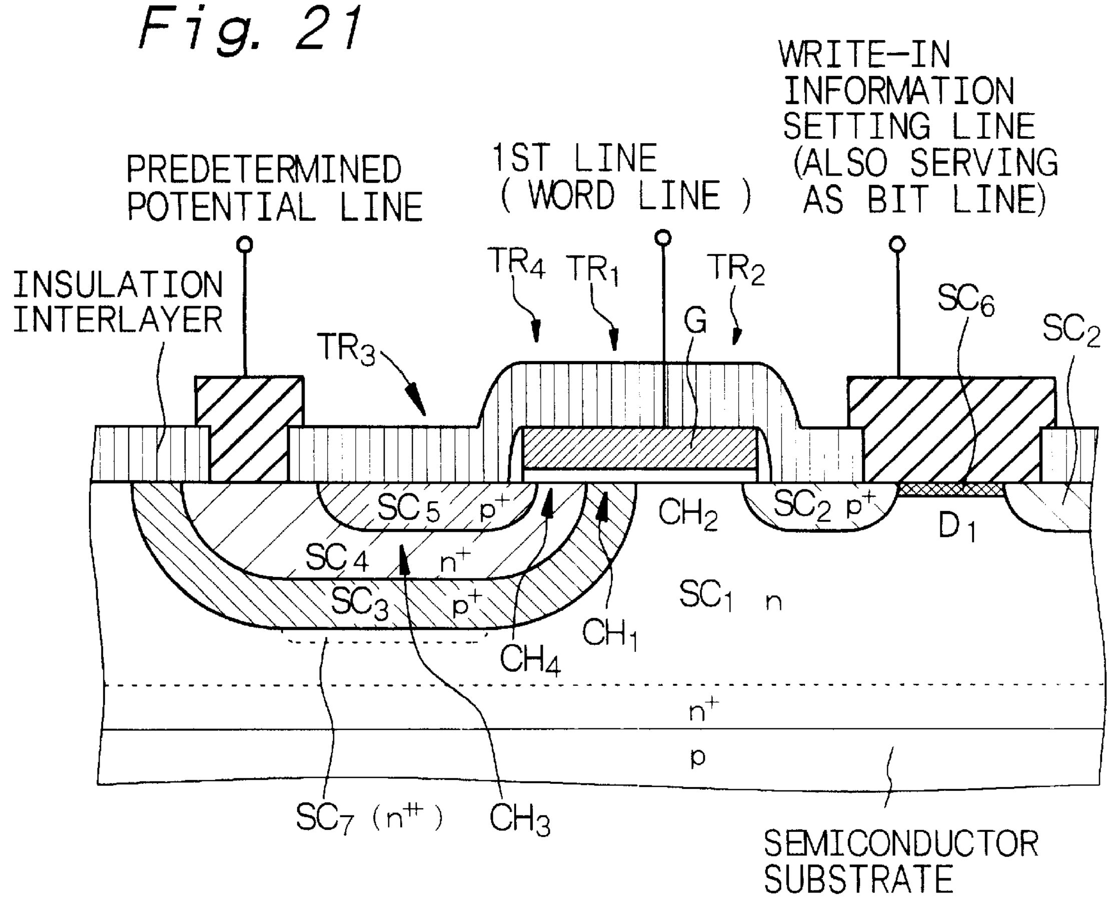
FIG. 21 is a schematic partial cross-sectional view of a modification of the semiconductor memory cell in Example 4.

FIGS. 20B and 21 show schematic partial cross-sectional views of modifications of the semiconductor memory cell in Example 4. As shown in FIG. 20B, the semiconductor memory cell having the same configuration as the semiconductor memory cell shown in FIG. 19B is formed in a semi-conductive layer surrounded with an insulating layer formed on a supporting substrate. FIG. 19B shows a principle drawing of the semiconductor memory cell shown in FIG. 21. The semiconductor memory cell shown in FIG. 21 has a configuration in which a sixth region $SC_6$ is formed in a surface region of the first region $SC_1$ and forms a rectifier junction together with the first region $SC_1$. The sixth region $SC_6$ is constituted of, for example, a silicide. In this configuration, the second region $SC_2$ is preferably constituted of semiconductor. A diode $D_1$ of Schottky junction type is constituted of the sixth region $SC_6$ and the first region $SC_1$, and one end of the diode $D_1$ is connected to the write-in information setting line. The sixth region $SC_6$ shown in FIG. 21 can be applied to the semiconductor memory cell shown in FIG. 20B.

When a region $SC_7$ containing a high concentration of an impurity having the first conductivity type (for example, $n^{++}$-type) is formed between the first region $SC_1$ and the third region $SC_3$ in the semiconductor memory cell of Example 4, a potential or an electric charge stored in the channel forming region $CH_1$ of the first transistor $TR_1$ can be increased.

The method of manufacturing the semiconductor memory cell in Example 4 can substantially be the same as the method of manufacturing the semiconductor memory cell of Example 2. Detailed explanations thereof are therefore omitted.

EXAMPLE 5

Figure 24A:
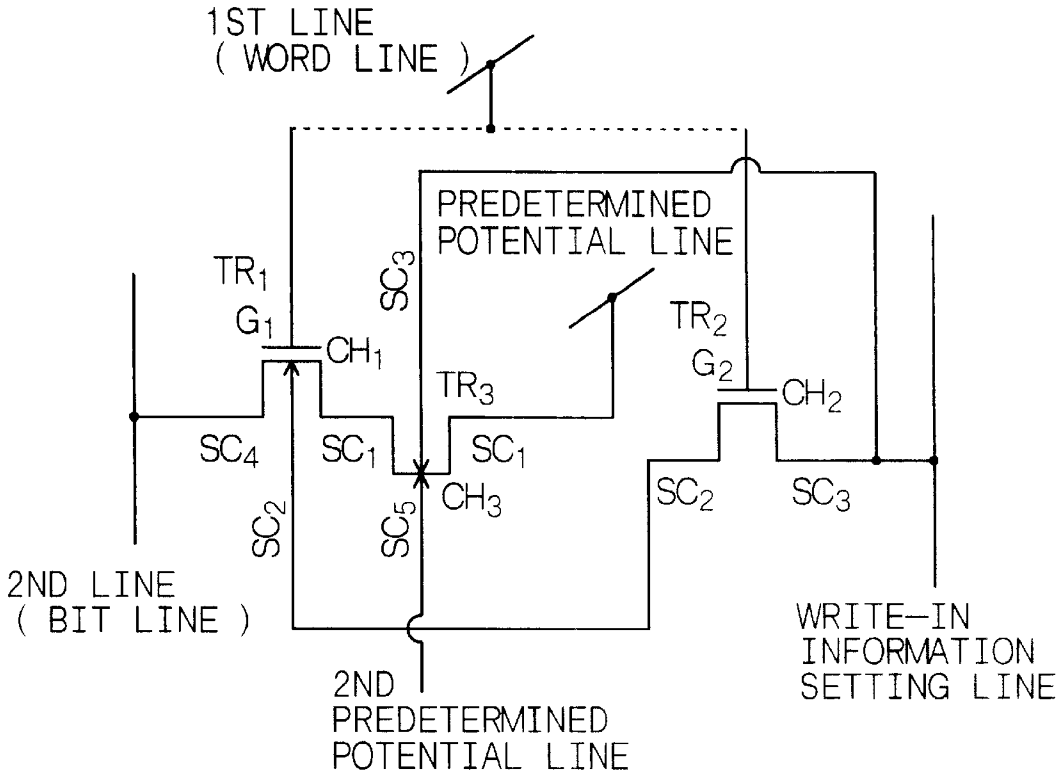
FIGS. 24A and 24B are principle drawings of the semiconductor memory cells in Example 5.
Figure 25A:
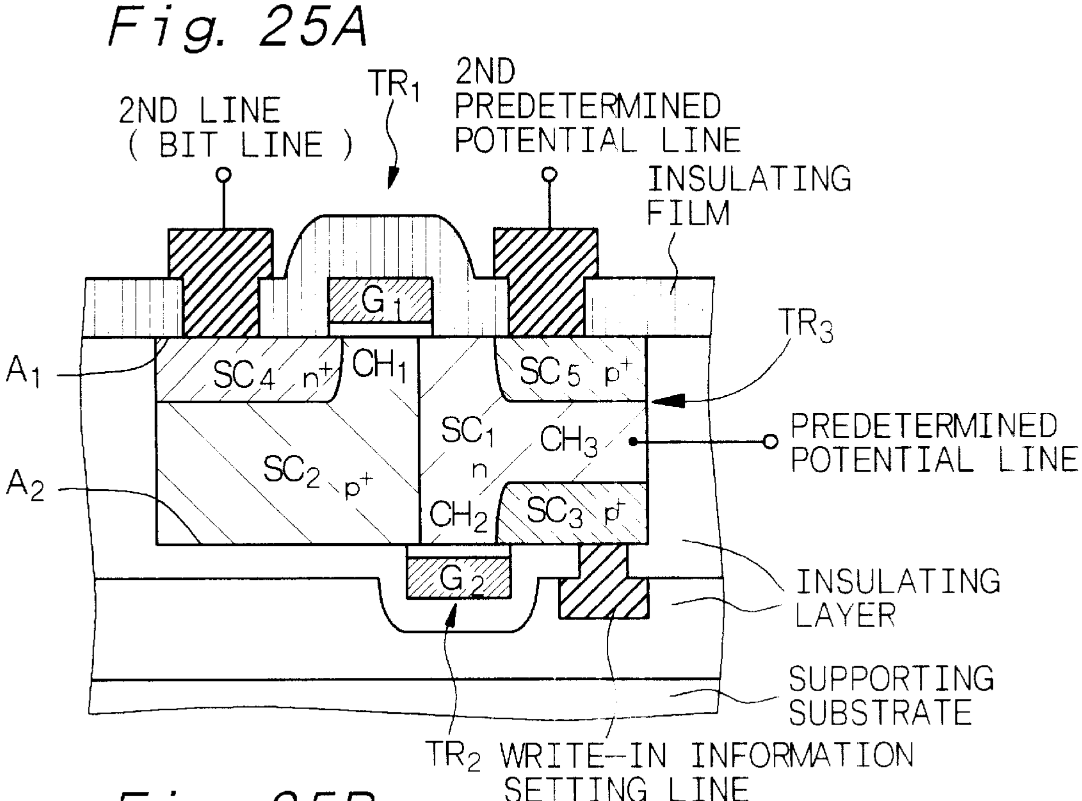
FIGS. 25A and 25B are schematic partial cross-sectional views of the semiconductor memory cells in Example 5.

Example 5 is directed to the semiconductor memory cell according to the fifth aspect of the present invention and the method for manufacturing a semiconductor memory cell according to the second aspect of the present invention. For example, as FIG. 24A shows its principle drawing and as FIG. 25A shows its schematic partial cross-sectional view, the semiconductor memory cell of Example 5 comprises a first transistor of a first conductivity type (e.g., n-type) for read-out $TR_1$, a second transistor of a second conductivity type (e.g., p-type) for write-in $TR_2$, and a junction-field-effect transistor of a first conductivity type (e.g., n-type) for current control $TR_3$. The semiconductor memory cell of Example 5 is provided with a semi-conductive layer having a first main surface $A_1$ and a second main surface $A_2$ opposed to the first main surface $A_1$. In Example 5 shown in FIG. 25A, a gate portion $G_1$ of the first transistor $TR_1$ is formed on the first main surface $A_1$, and a gate portion $G_2$ of the second transistor $TR_2$ is formed on the second main surface $A_2$. The gate portion $G_1$ and the gate portion $G_2$ are slightly off-aligned along a vertical direction. Further, the semiconductor memory cell is formed in the semi-conductive layer surrounded with an insulating layer formed on a supporting substrate and has a so-called SOI structure. In the semiconductor memory cell of Example 5 shown in FIG. 25A, the supporting substrate, the insulating layer, the gate portion $G_2$ of the second transistor $TR_2$ and the gate portion $G_1$ of the first transistor $TR_1$ are arranged in this order from the bottom.

The semiconductor memory cell of Example 5 has;

(1) a first semi-conductive region $SC_1$ of the first conductivity type (for example, n-type), formed through the semi-conductive layer from the first main surface $A_1$ to the second main surface $A_2$, (2) a second semi-conductive region $SC_2$ of the second conductivity type (for example, p-type) opposite to the first conductivity type, formed through the semi-conductive layer from the first main surface $A_1$ to the second main surface $A_2$ and being in contact with the first region $SC_1$, (3) a third semi-conductive region $SC_3$ of the second conductivity type (for example, $p^+$-type), or a third conductive region $SC_3$ formed of a silicide, a metal or a metal compound, said third region $SC_3$ being formed in a surface region, including the second main surface $A_2$, of the first region $SC_1$, being spaced from the second region $SC_2$ and forming a rectifier junction together with the first region $SC_1$, (4) a fourth semi-conductive region $SC_4$ of the first conductivity type (for example, $n^+$-type), or a fourth conductive region $SC_4$ formed of a silicide, a metal or a metal compound, said fourth region $SC_4$ being formed in a surface region, including the first main surface $A_1$, of the second region $SC_2$, being spaced from the first region $SC_1$, and forming a rectifier junction together with the second region $SC_2$, (5) a fifth semi-conductive region $SC_5$ of the second conductivity type (for example, $p^+$-type), or a fifth conductive region $SC_5$ formed of a silicide, a metal or a metal compound, said fifth region $SC_5$ being formed in a surface region, including the first main surface $A_1$, of the first region $SC_1$, being spaced from the second region $SC_2$ and forming a rectifier junction together with the first region $SC_1$, (6) a gate portion $G_1$ of the first transistor $TR_1$ formed on a barrier layer formed on the first main surface $A_1$ so as to bridge the first region $SC_1$ and the fourth region $SC_4$, and (7) a gate portion $G_2$ of the second transistor $TR_2$ formed on a barrier layer formed on the second main surface $A_2$ so as to bridge the second region $SC_2$ and the third region $SC_3$.

Concerning the first transistor $TR_1$;

(A-1) one source/drain region is constituted of a surface region, including the first main surface $A_1$, of the first region $SC_1$, (A-2) the other source/drain region is constituted of the fourth region $SC_4$, and (A-3) a channel forming region $CH_1$ is constituted of a surface region, including the first main surface $A_1$, of the second region $SC_2$ which surface region is sandwiched by interposed between) the surface region, including the first main surface $A_1$, of the first region $SC_1$ and the fourth region $SC_4$.

Concerning the second transistor $TR_2$;

(B-1) one source/drain region is constituted of the third region $SC_3$, (B-2) the other source/drain region is constituted of a surface region, including the second main surface $A_2$, of the second region $SC_2$, and (B-3) a channel forming region $CH_2$ is constituted of a surface region, including the second main surface $A_2$, of the first region $SC_1$ which surface region is sandwiched by (or interposed between) the third region $SC_3$ and the surface region, including the second main surface $A_2$, of the second region $SC_2$.

Further, concerning the junction-field-effect transistor $TR_3$;

(C-1) gate regions are constituted of the fifth region $SC_5$ and the third region $SC_3$ facing the fifth region $SC_5$, (C-2) a channel region $CH_3$ is constituted of a portion of the first region $SC_1$ sandwiched by (or interposed between) the fifth region $SC_5$ and the third region $SC_3$, (C-3) one source/drain region is constituted of a portion of the first region $SC_1$ extending from one end of the channel region $CH_3$ of the junction-field-effect transistor $TR_3$ and constituting one source/drain region of the first transistor $TR_1$ and the channel forming region $CH_2$ of the second transistor $TR_2$, and (C-4) the other source/drain region is constituted of a portion of the first region $SC_1$ extending from the other end of the channel region $CH_1$ of the junction-field-effect transistor $TR_3$.

The junction-field-effect transistor $TR_3$ in the semiconductor memory cell of Example 5 can be formed by (X) optimizing the distance (thickness of the channel region $CH_3$) between the facing gate regions (the fifth region $SC_5$ and the third region $SC_3$) of the junction-field-effect transistor $TR_3$, and (Y) optimizing impurity concentrations of the facing gate regions (the fifth region $SC_5$ and the third region $SC_3$) and the channel region $CH_3$ (specifically, the first region $SC_1$) of the junction-field-effect transistor $TR_3$.

In the semiconductor memory cell of Example 5, the gate portion $G_1$ of the first transistor $TR_1$ and the gate portion $G_2$ of the second transistor $TR_2$ are connected to a first memory-cell-selecting line (for example, a word line); the third region $SC_3$ is connected to a write-in information setting line; the fourth region $SC_4$ is connected to a second memory-cell-selecting line (for example, a bit line); the other source/drain region of the junction-field-effect transistor $TR_3$ is connected to a predetermined potential line; and the fifth region $SC_5$ is connected to a second predetermined potential line.

Figure 25B:
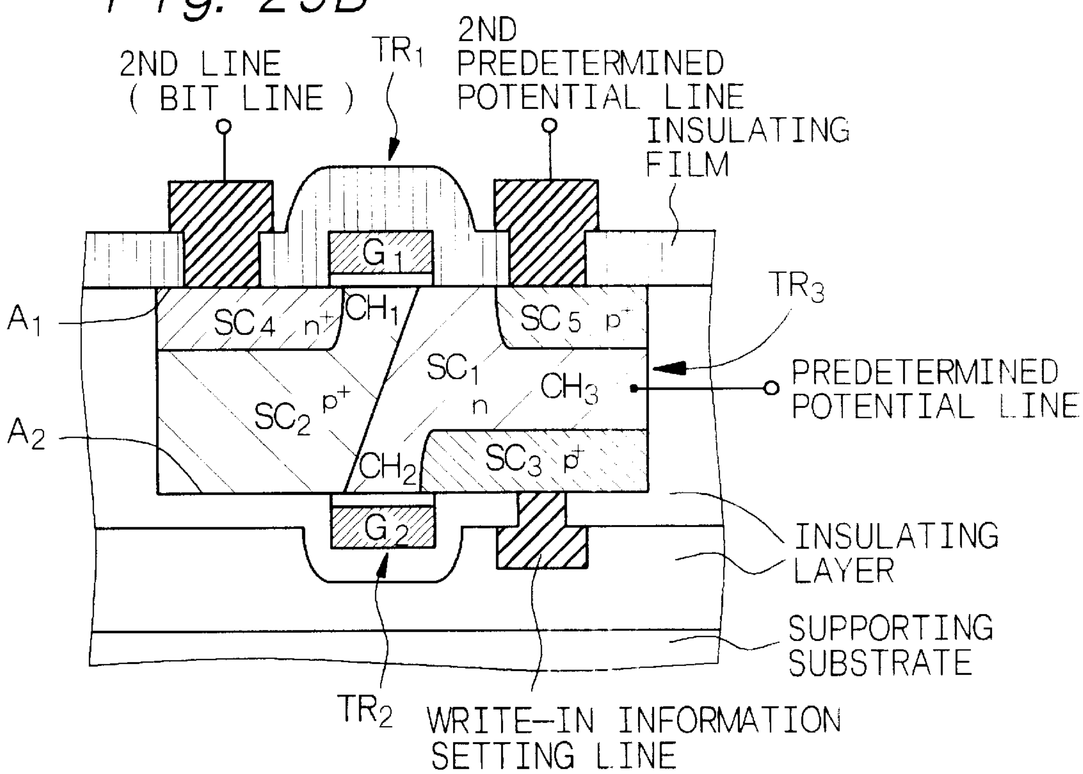
Figure 26A:
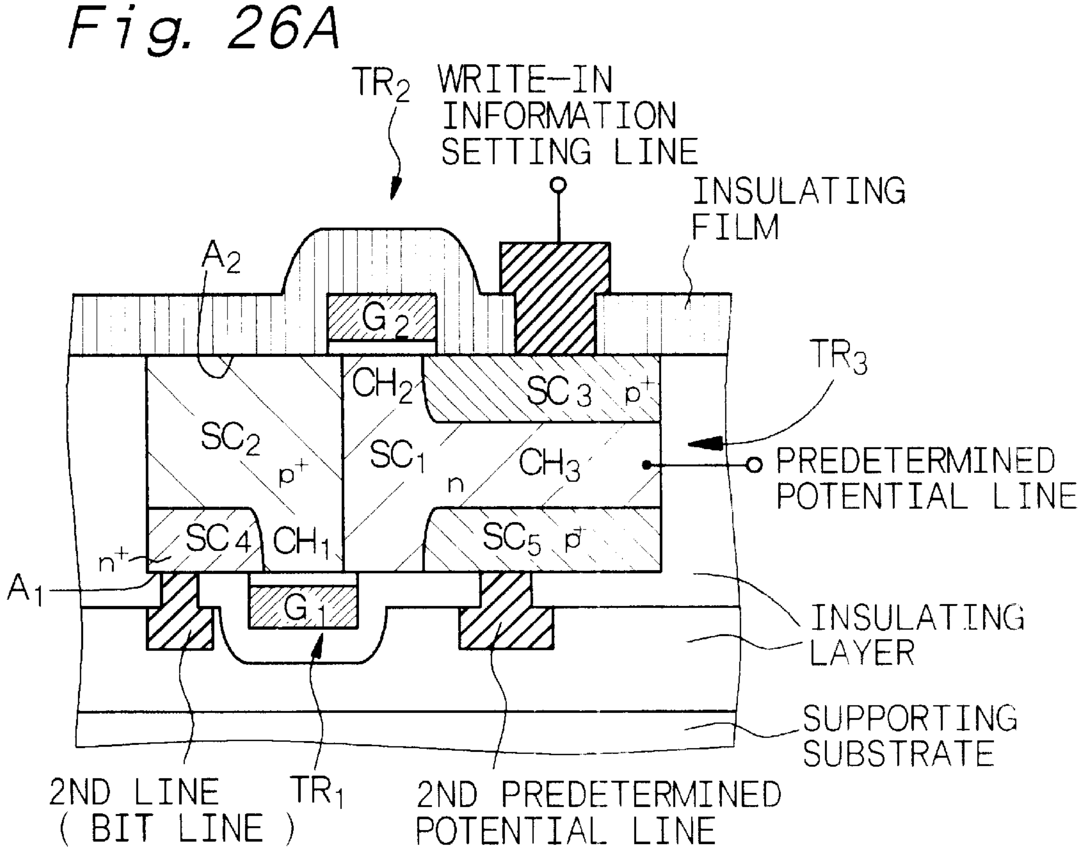
FIGS. 26A and 26B are schematic partial cross-sectional views of modifications of the semiconductor memory cell in Example 5.
Figure 26B:
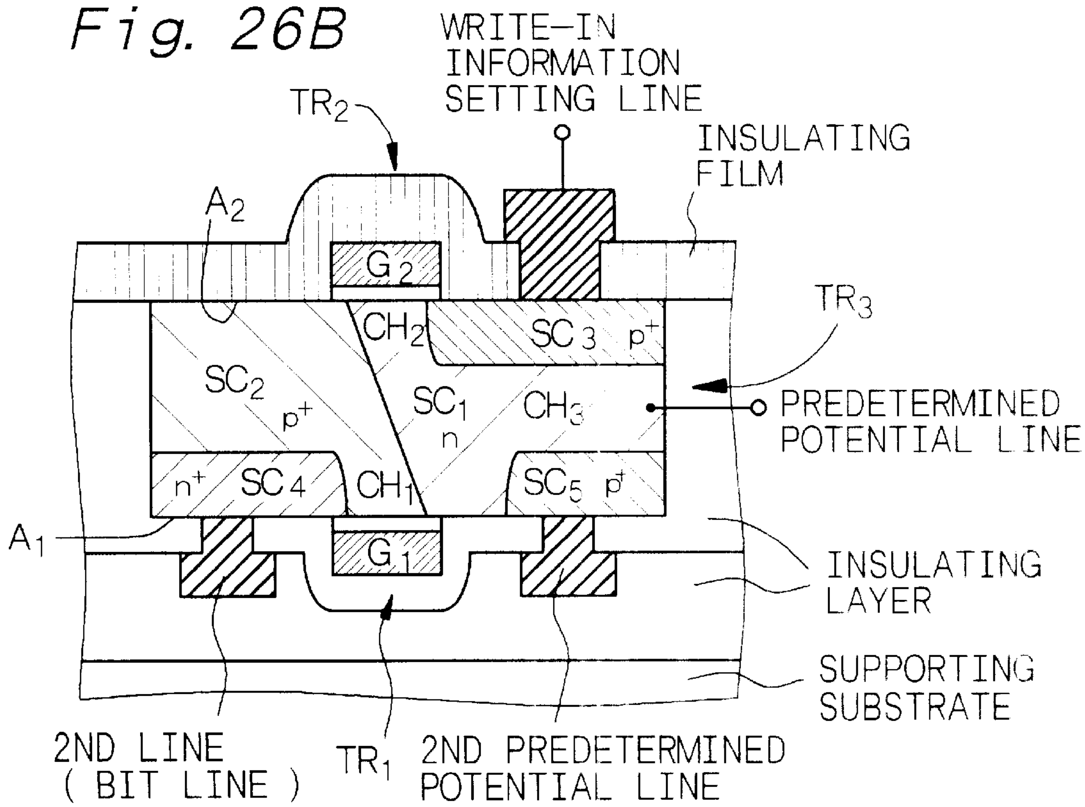
Figure 27A:
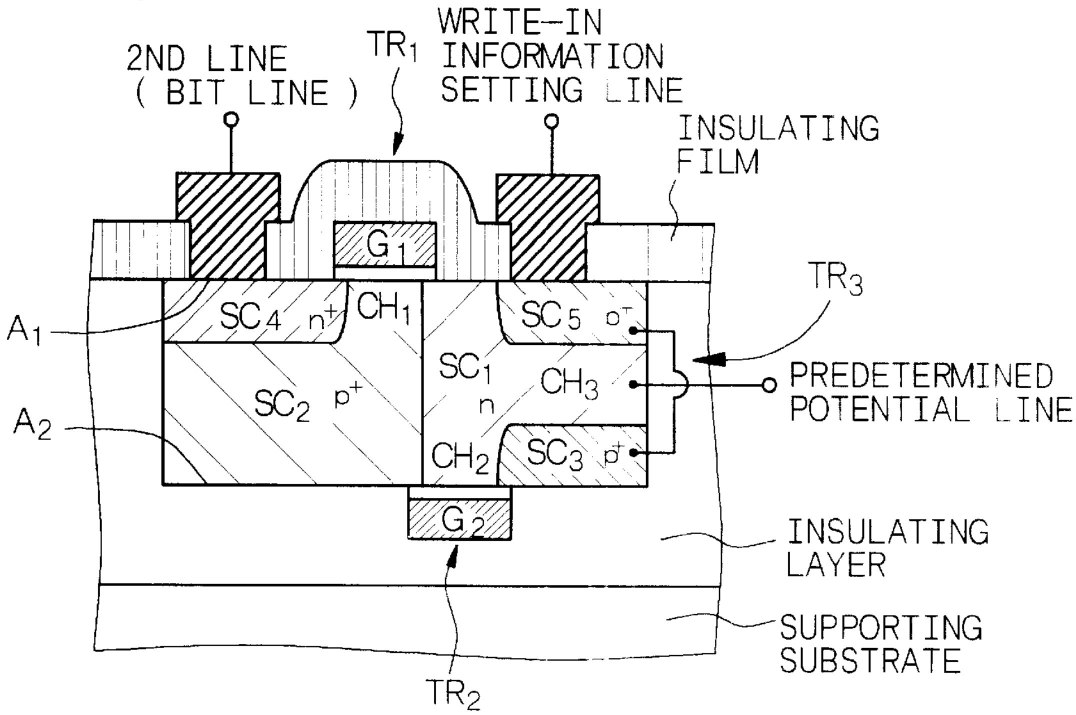
FIGS. 27A and 27B are schematic partial cross-sectional views of modifications of the semiconductor memory cell in Example 5.
Figure 27B:
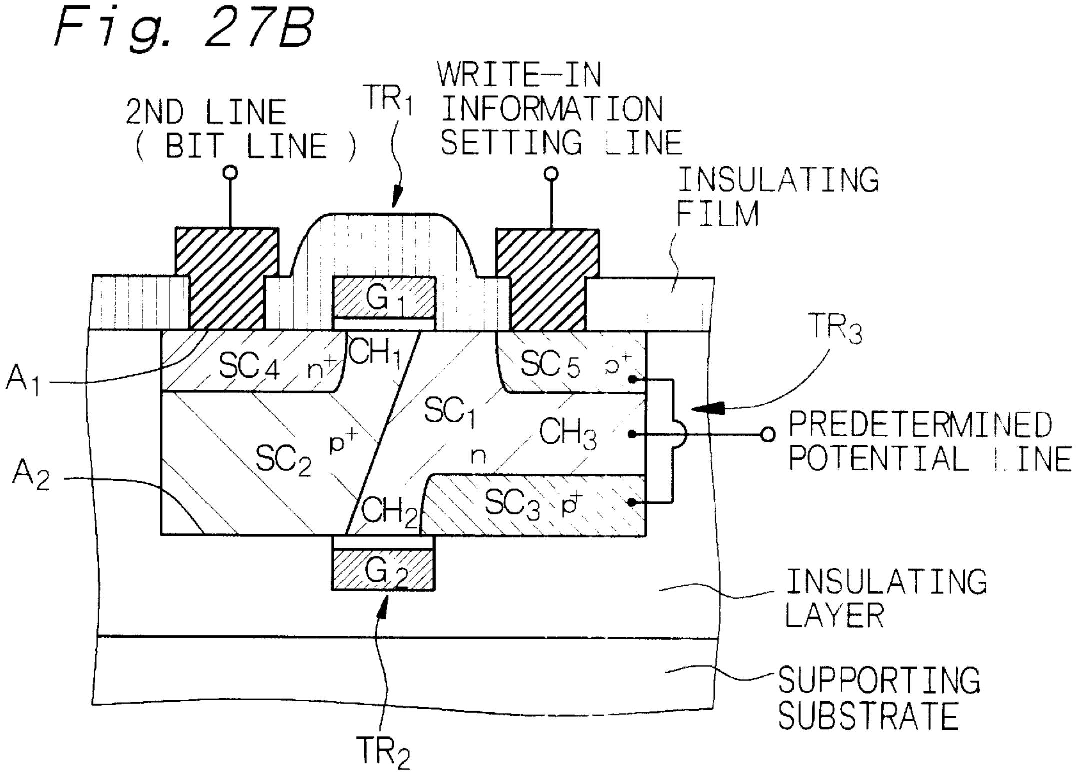
Figure 28A:
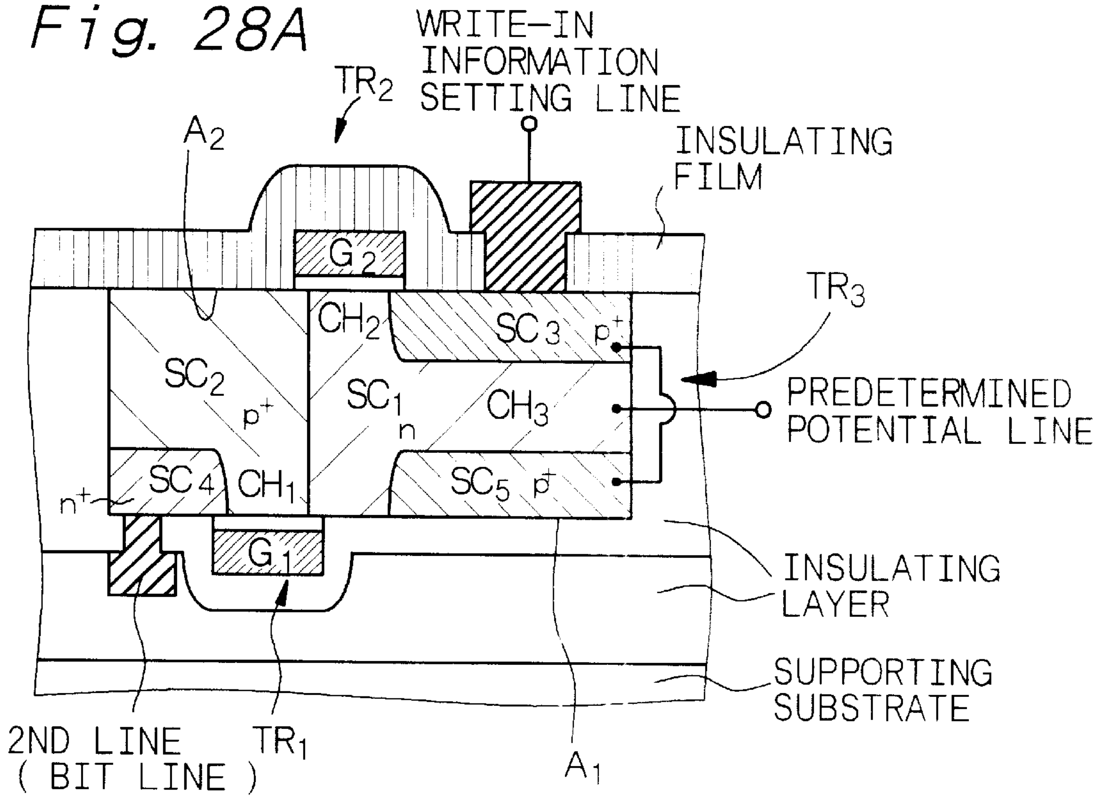
FIGS. 28A and 28B are schematic partial cross-sectional views of modifications of the semiconductor memory cell in Example 5.
Figure 28B:
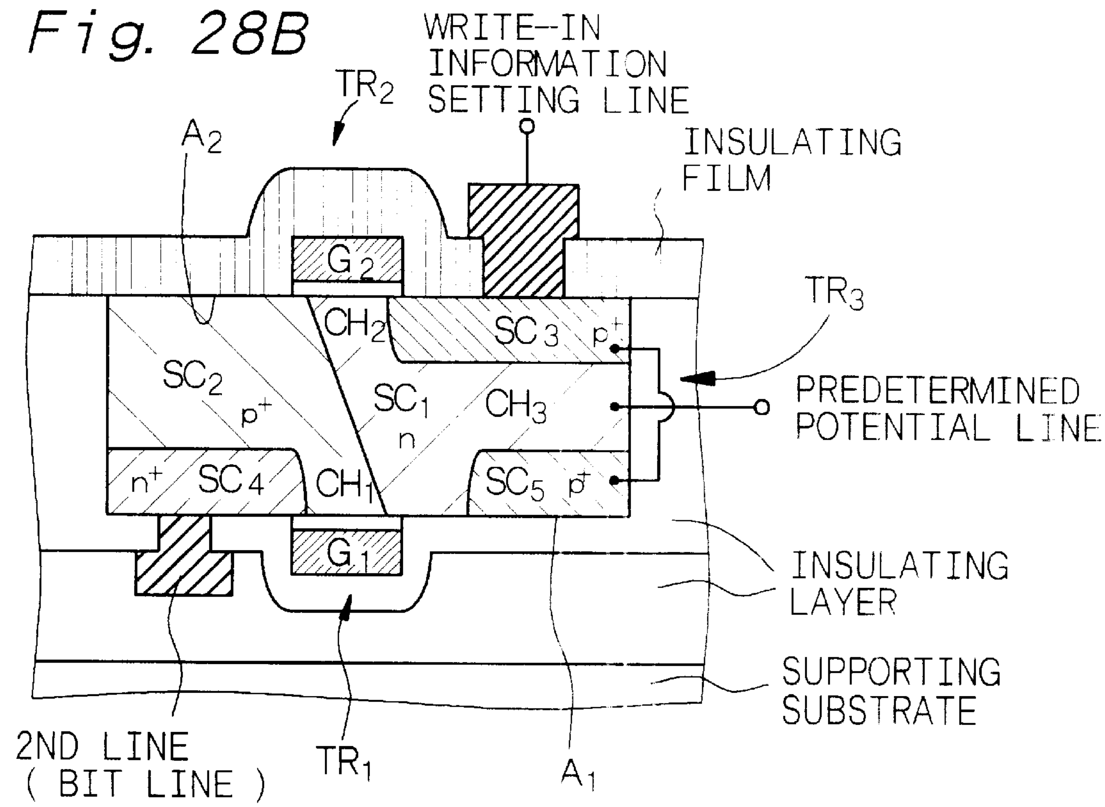
Figure 29A:
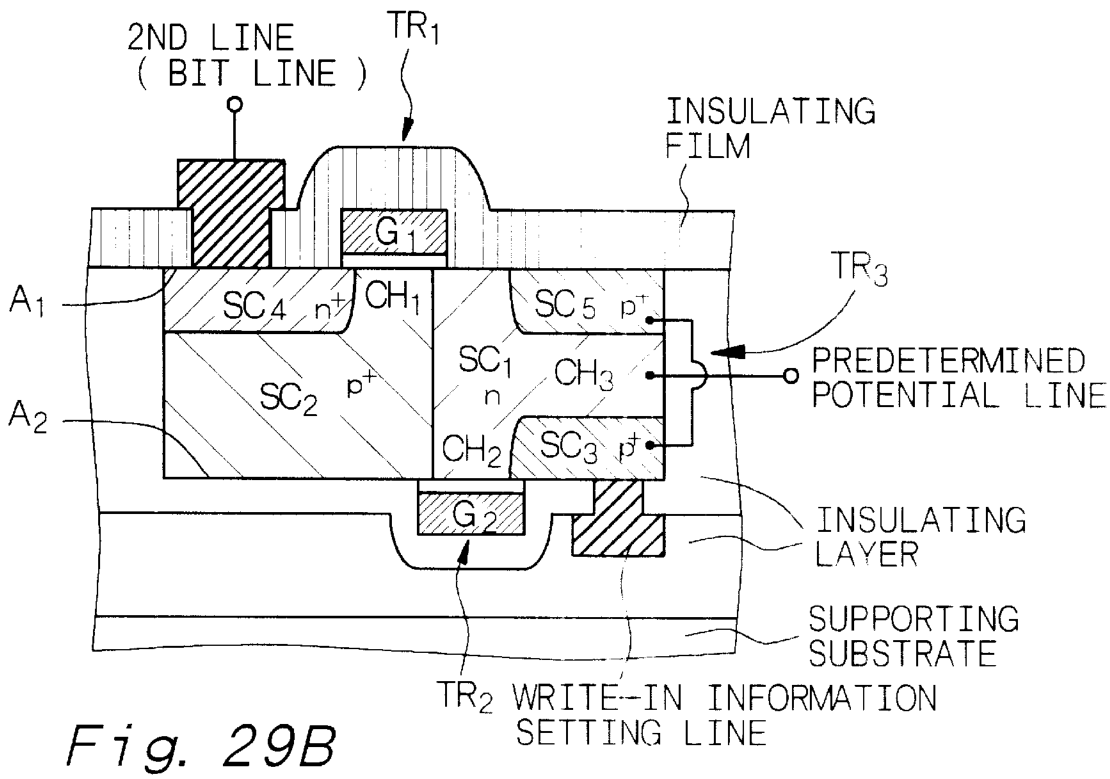
FIGS. 29A and 29B are schematic partial cross-sectional views of modifications of the semiconductor memory cell in Example 5.
Figure 29B:
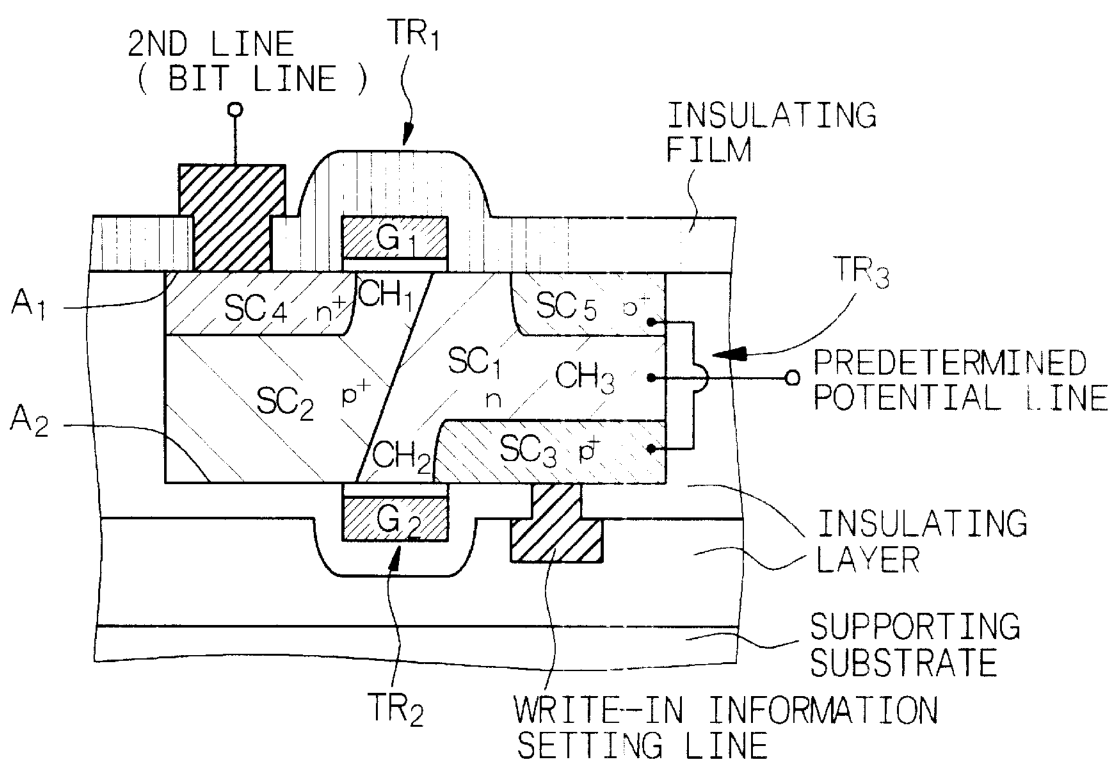
Figure 30A:
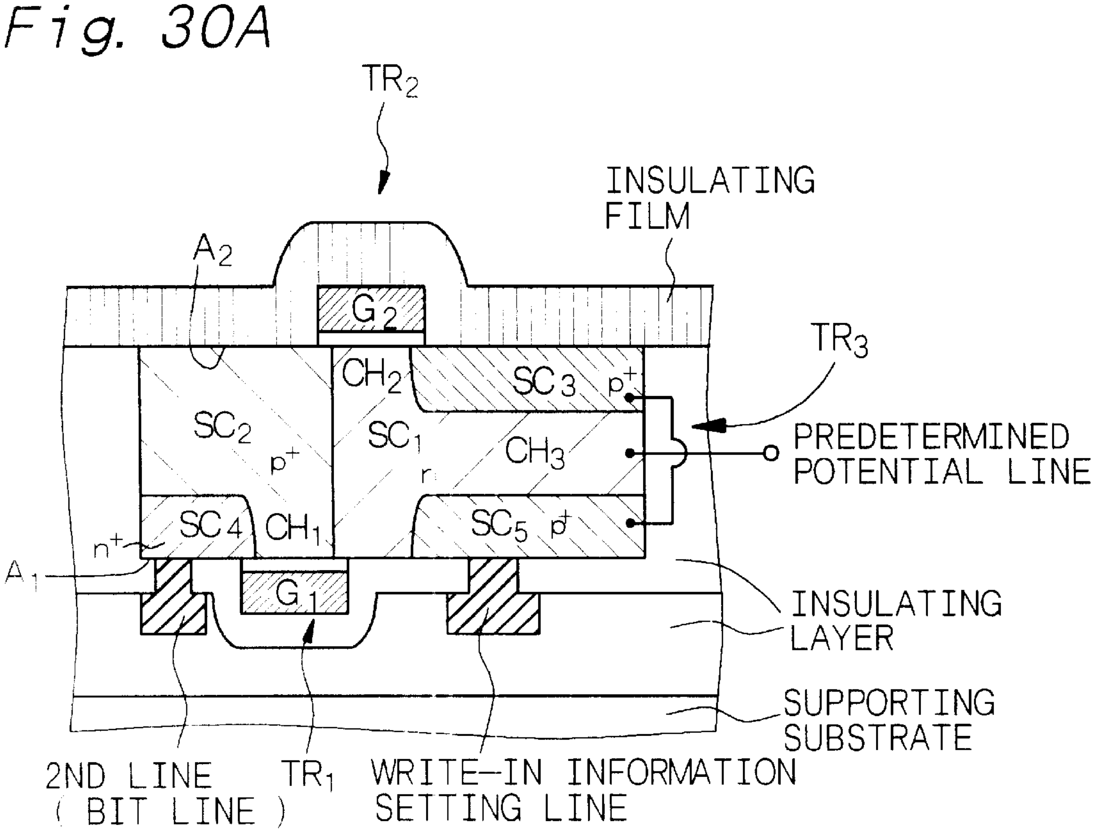
FIGS. 30A and 30B are schematic partial cross-sectional views of modifications of the semiconductor memory cell in Example 5.
Figure 30B:
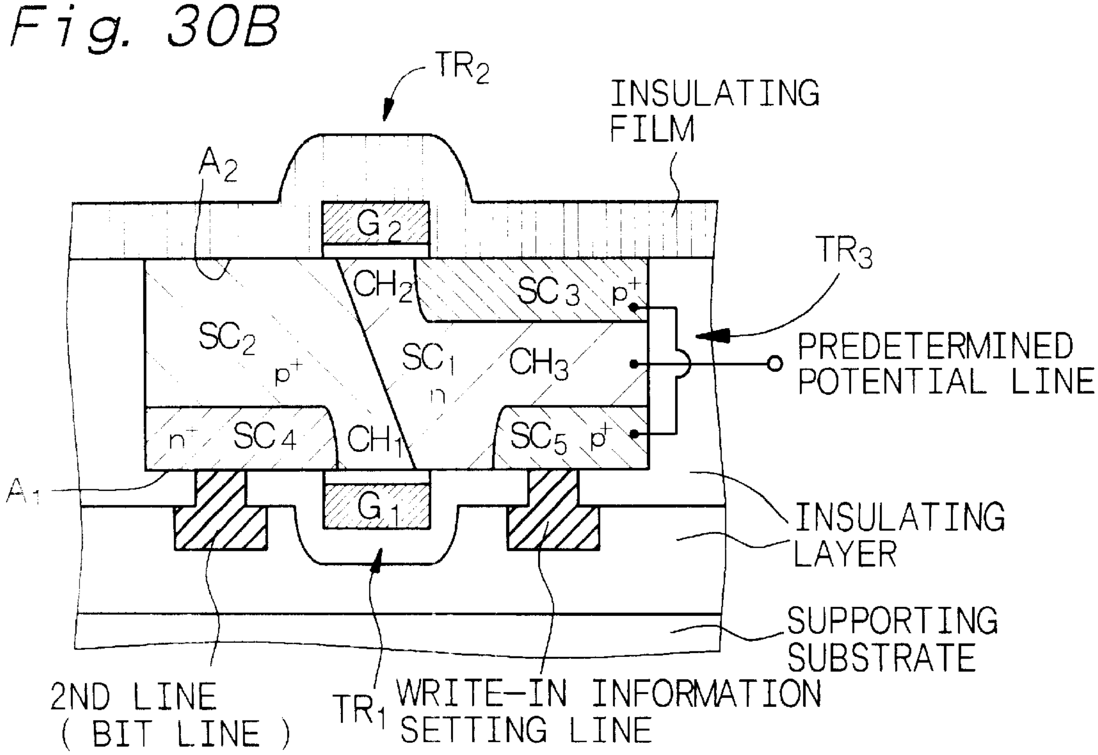

FIGS. 25B, 26A and 26B show schematic partial cross-sectional views of modifications of the semiconductor memory cell shown in FIG. 25A. The semiconductor memory cell shown in FIG. 25B differs from the semiconductor memory cell shown in FIG. 25A in that the gate portion $G_1$ and the gate portion $G_2$ are almost aligned along a vertical direction or are positioned in a nearly aligned manner along a vertical direction. That is, when viewed from above (as a plane view), the gate portion $G_2$ and the gate portion $G_1$ are approximately overlapped. The semiconductor memory cell can be decreased in size with such a configuration. In the semiconductor memory cells shown in FIGS. 26A and 26B, the supporting substrate, the insulating layer, the gate portion $G_1$ of the first transistor $TR_1$ and the gate portion $G_2$ of the second transistor $TR_2$ are arranged in this order from the bottom. The order of each regions and the gate portions in the semiconductor memory cell shown in FIGS. 26A and 26B along a perpendicular direction is inverse to the order of each regions and the gate portions in the semiconductor memory cell shown in FIGS. 25A and 25B, respectively. The semiconductor memory cell shown in FIG. 26B differs from the semiconductor memory cell shown in FIG. 26A in that the gate portion $G_1$ and the gate portion $G_2$ are almost aligned along a vertical direction.

Figure 24B:
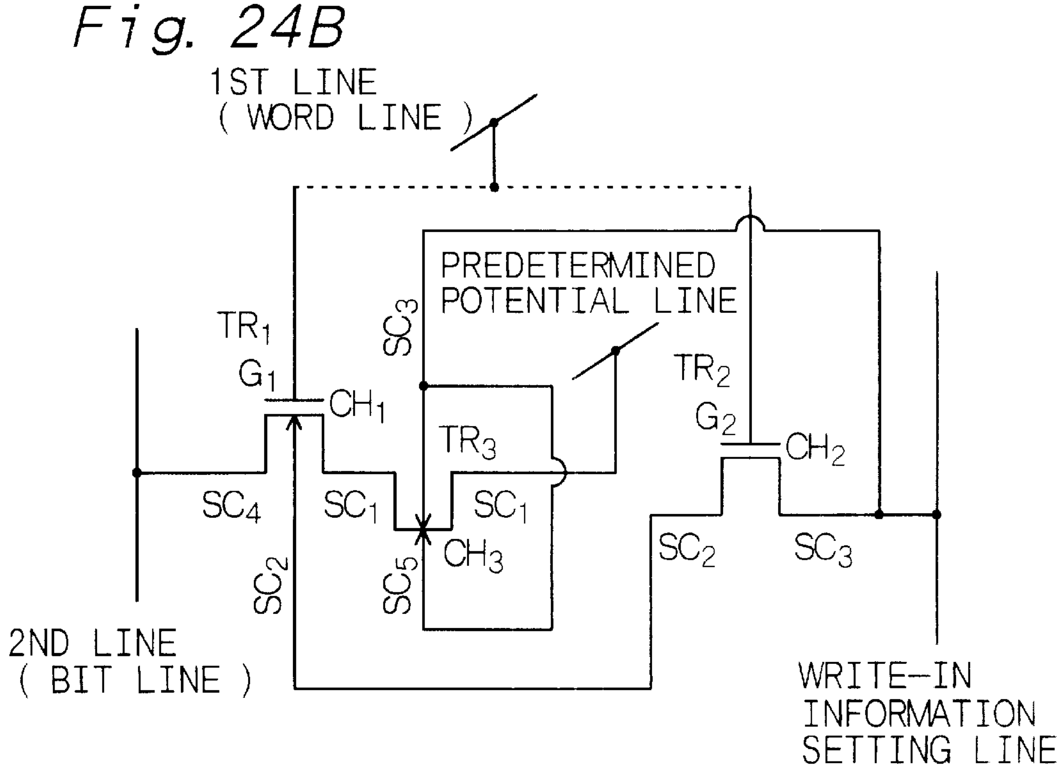

FIGS. 27A, 27B, 28A, 28B, 29A, 29B, 30A and 30B show schematic partial cross-sectional views of other modifications of the semiconductor memory cell in Example 5. FIG. 24B shows a principle drawing of these semiconductor memory cells. The semiconductor memory cells shown in FIGS. 27A, 27B, 29A and 29B are modifications of the semiconductor memory cells shown in FIGS. 25A and 25B. On the other hand, the semiconductor memory cells shown in FIGS. 28A, 28B, 30A and 30B are modifications of the semiconductor memory cells shown in FIGS. 26A and 26B.

Each of the above semiconductor memory cells has a configuration in which the fifth region $SC_5$ is connected to the write-in information setting line in place of being connected to the second predetermined potential line. The phrase of "being connected to the write-in information setting line" is equivalent to the phrase of "being connected to the third region $SC_3$". More specifically, the fifth region $SC_5$ and the third region $SC_3$ can be connected to each other, e.g., by providing a structure in which part of the third region $SC_3$ is extended up to the main surface $A_1$ of the semi-conductive layer so that the fifth region $SC_5$ and the extending portion of the third region $SC_3$ come in contact with each other outside the first region $SC_1$.

The wiring configuration can be simplified by structuring the semiconductor memory cell as explained above.

Figure 31A:
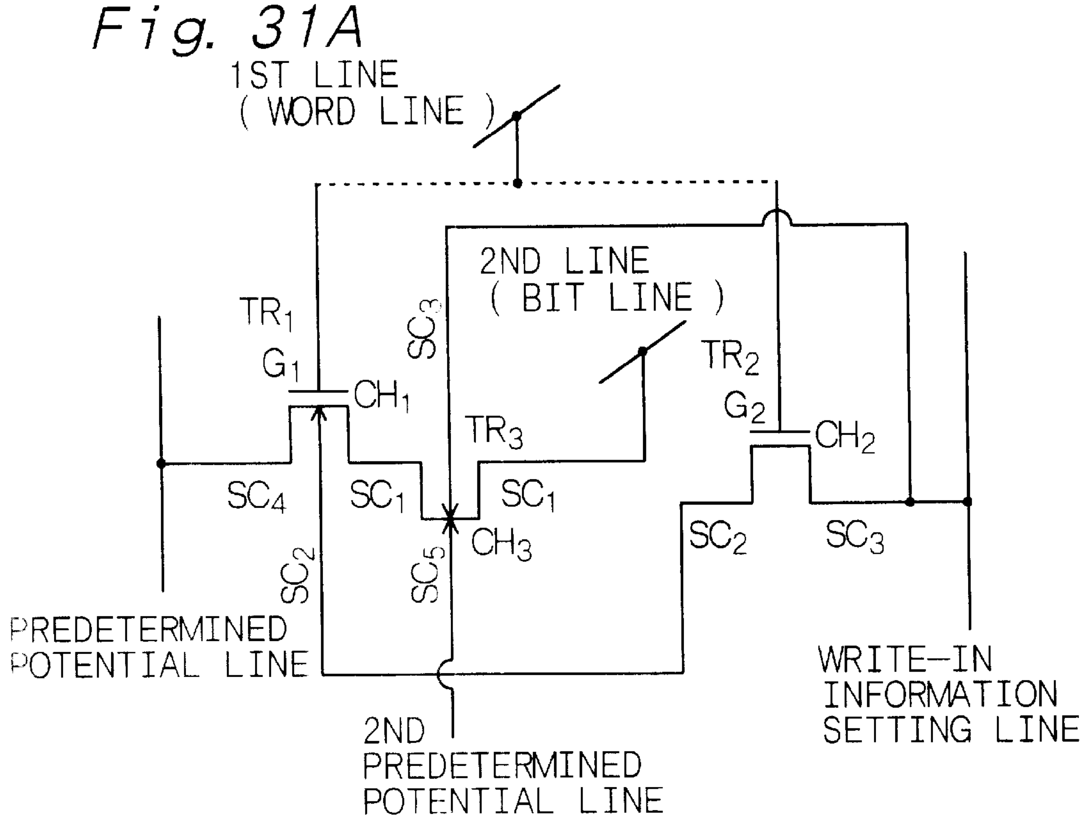
FIGS. 31A and 31B are principle drawings of modifications of the semiconductor memory cell in Example 5.
Figure 31B:
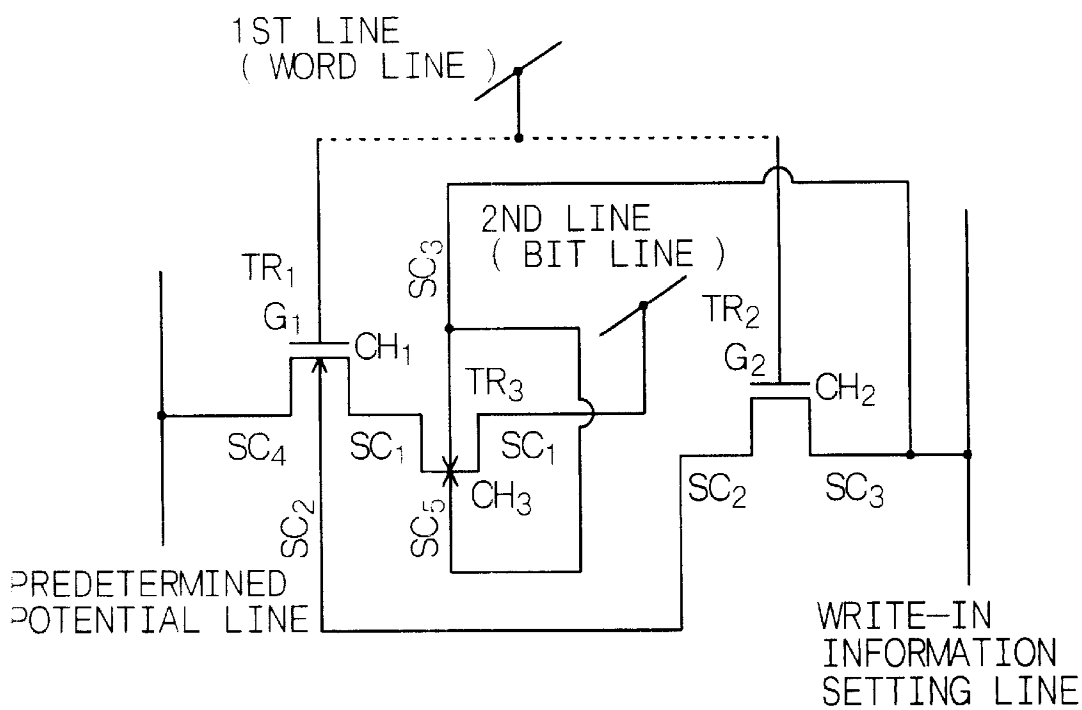
Figure 32A:
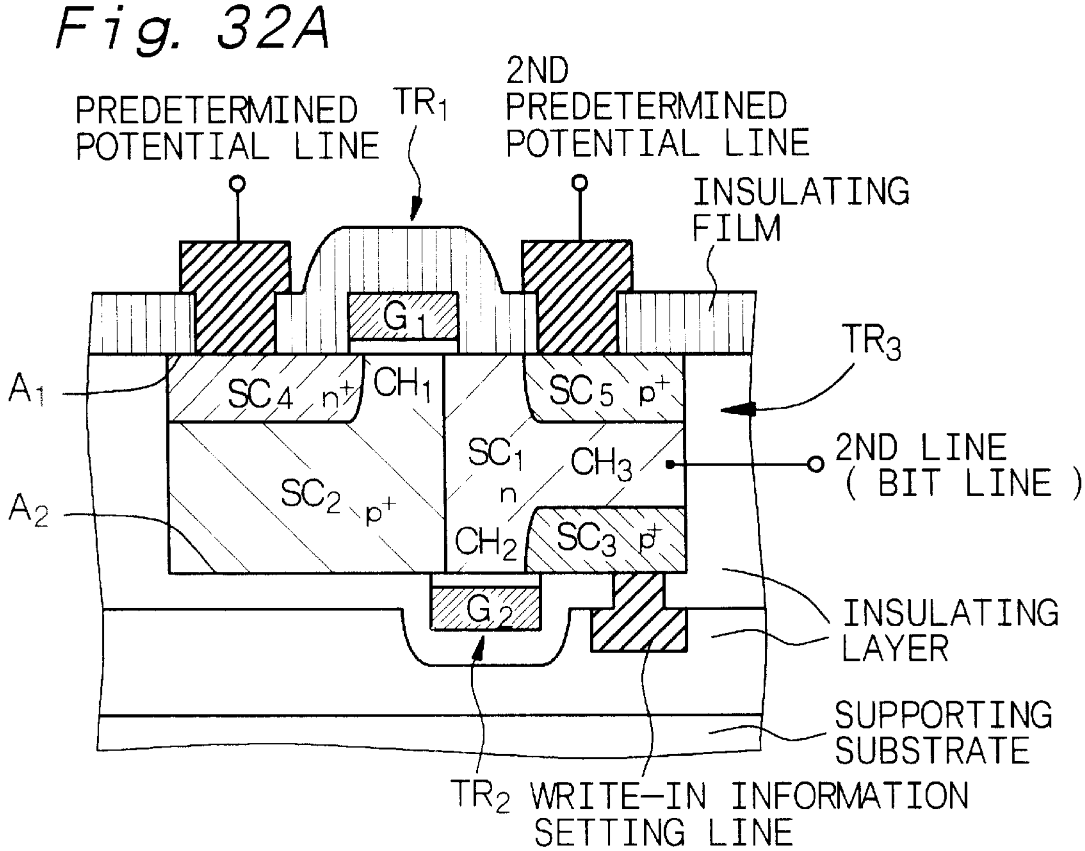
FIGS. 32A and 32B are schematic partial cross-sectional views of modifications of the semiconductor memory cell in Example 5.
Figure 32B:
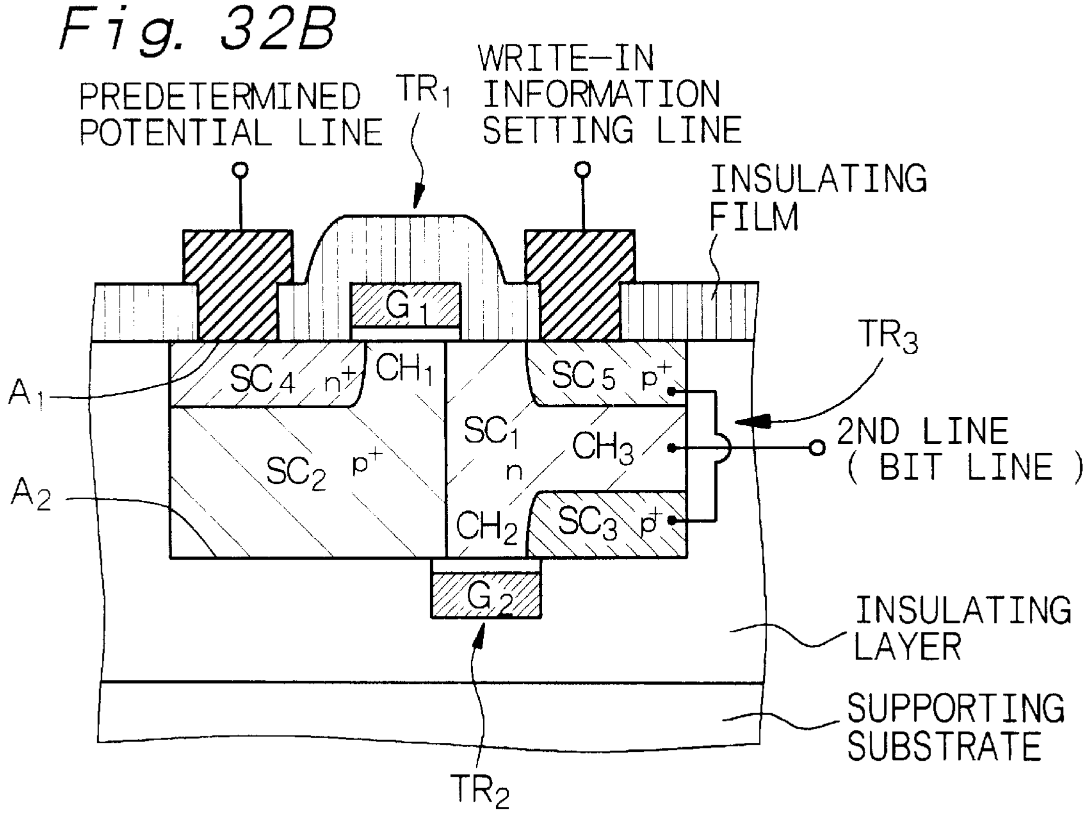

As FIG. 31A shows a principle drawing and as FIG. 32A shows a schematic partial cross-sectional view, a modification of the semiconductor memory cell in Example 5 has a configuration in which the fourth region $SC_4$ is connected to the predetermined potential line in place of being connected to the second memory-cell-selecting line and the other source/drain region of the junction-field-effect transistor $TR_3$ is connected to the second memory-cell-selecting line in place of being connected to the predetermined potential line. In this configuration, as FIG. 31B shows a principle drawing and as FIG. 32B shows a schematic partial cross-sectional view, the semiconductor memory cell may have a configuration in which the fifth region $SC_5$ is connected to the write-in information setting line (equivalent to be connected to the third region $SC_3$) in place of being connected to the second predetermined potential line. The configurations of the semiconductor memory cells shown in FIG. 32A and 32B can be applied to the semiconductor memory cells shown in FIGS. 25A to 30B.

The method for manufacturing the semiconductor memory cell of Example 5 shown in FIG. 25B will be explained with reference to FIGS. 71A to 75B showing schematic partial cross-sectional views of the semiconductor substrate and so on, hereinafter.

[Step-500]

Figure 71A:
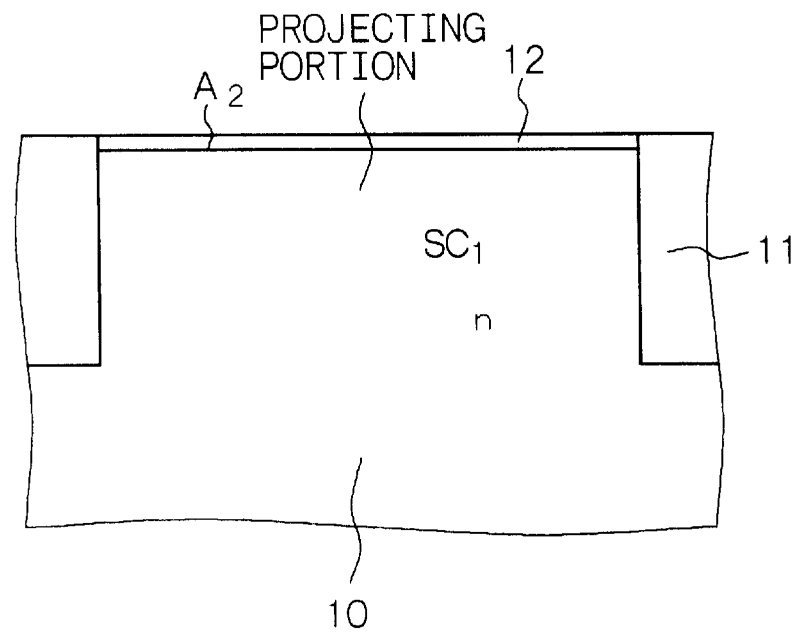
FIGS. 71A and 71B are schematic partial cross-sectional views of a supporting substrate, etc., for the explanation of a manufacturing method of the semiconductor memory cell in Example 5.

A silicon semiconductor substrate 10 is etched to form projected portions in which the semiconductor memory cells are to being fabricated, and then, the complementary concave portions are buried with an insulating layer 11 so that only the top surfaces of projected portions of the silicon semiconductor substrate 10 are exposed. The insulating layer 11 corresponds to a device isolating region. The first semi-conductive region $SC_1$ of the first conductivity type (for example, n-type) is then formed in the projected portion of the silicon semiconductor substrate 10. The order of the processes for forming the first region $SC_1$ and for forming the projected portions in the silicon semiconductor substrate 10 can be inverted. A silicon oxide film 12 having a thickness of approx. 10 nm (corresponding to the barrier layer) is formed on the surface of projected portion of the semiconductor substrate 10, on the basis of a known method for forming a silicon oxide film. Such state is shown in FIG. 71A as a partial schematic cross-sectional view. The top surface of projected portion of the silicon semiconductor substrate 10 corresponds to the second main surface $A_2$. The projected portion of the silicon semiconductor substrate 10 may have a height of 0.3 to 0.4 $\mu$m.

[Step-510]

Figure 71B:
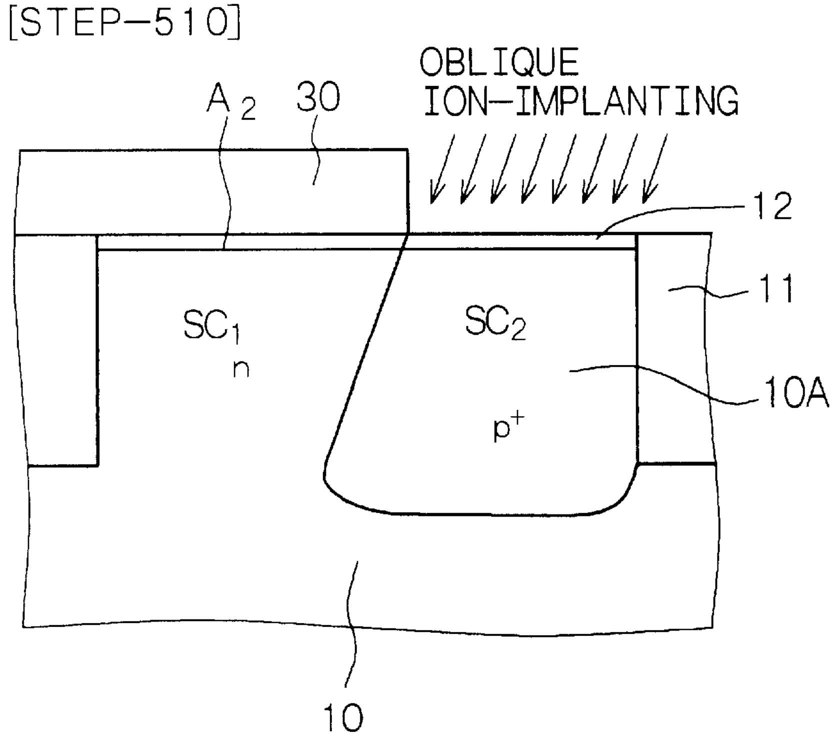
Figure 72A:
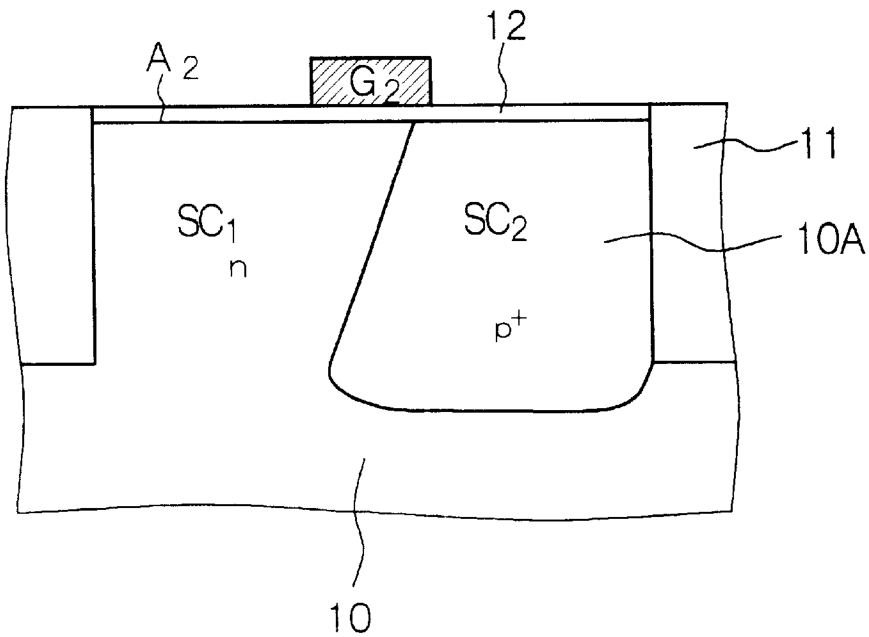
FIGS. 72A and 72B, subsequent to FIG. 71B, are schematic partial cross-sectional views of a supporting substrate, etc., for the explanation of a manufacturing method of the semiconductor memory cell in Example 5.

Then, using a resist 30 as a mask, the second semi-conductive region $SC_2$ of the second conductivity type (for example, $p^+$-type) is formed by an oblique ion implantation technique. Thus, formed is the first semi-conductive region $SC_1$ of the first conductivity type (for example, n-type) through the semi-conductive layer 10A (corresponding to the projected portion of the silicon semiconductor substrate 10) from the first main surface (described later) to the second main surface $A_2$, and, formed is the second semi-conductive region $SC_2$ of the second conductivity type (for example, $p^+$-type) through the semi-conductive layer 10A from the first main surface to the second main surface $A_2$ as well as being in contact with the first region $SC_1$ as shown in FIG. 71B. The gate portion $G_2$ for the second transistor, which is constituted of doped polysilicon or has a polyside structure, is then formed on the basis of a known method. Such state is shown in FIG. 72A as a partial schematic cross-sectional view.

[Step-520]

Figure 72B:
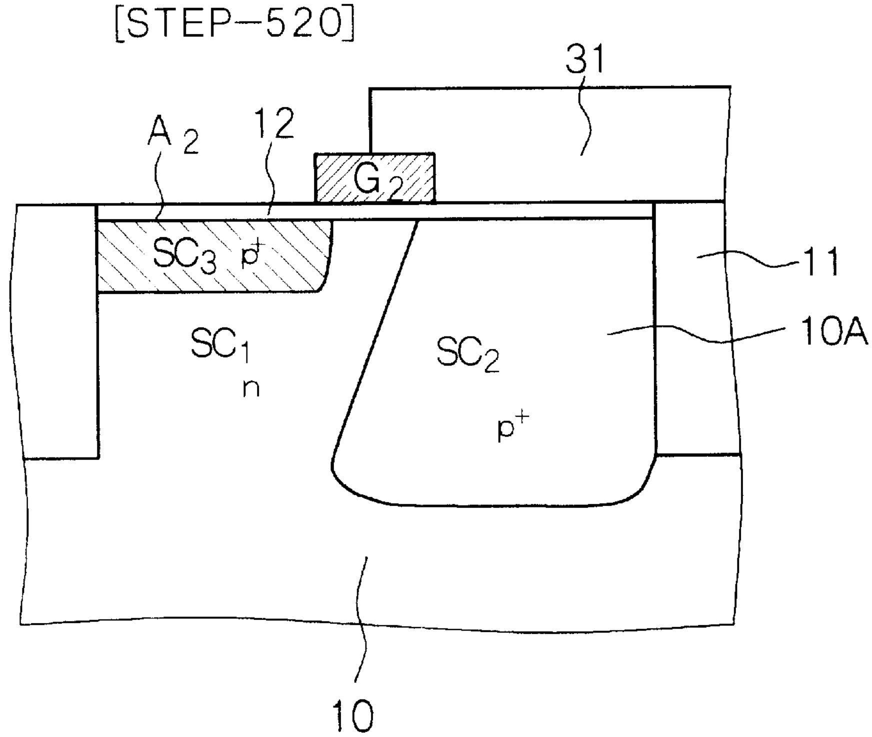

Then, using a resist 31 as a mask, normal ion implantation and oblique ion implantation are performed successively to form the third region $SC_3$ in the surface region, including the second main surface $A_2$, of the first region $SC_1$ so as to be spaced from the second region $SC_2$ and so as to form a rectifier junction together with the first region $SC_1$. Such state is shown in FIG. 72B as a partial schematic cross-sectional view. After that, an insulating interlayer 13A is formed on the entire surface, an opening is formed in the insulating interlayer 13A above the third region $SC_3$, a metal layer for a wiring is formed on the insulating interlayer 13A including the inside of the opening and is then patterned to form the write-in information setting line connected to the third region $SC_3$, It is not always necessary to form the third region $SC_3$ by the ion implantation. A barrier layer or glue layer constituted of titanium silicide or TiN, being usually formed in the general process for fabricating the write-in information setting line, may be formed also on the surface of the first region $SC_1$ exposed at the bottom of the opening. Thus, the third region $SC_3$ can be formed in common with part of the write-in information setting line (more specifically, part of the barrier layer or glue layer) in the surface region of the first region $SC_1$.

[Step-530]

Figure 73A:
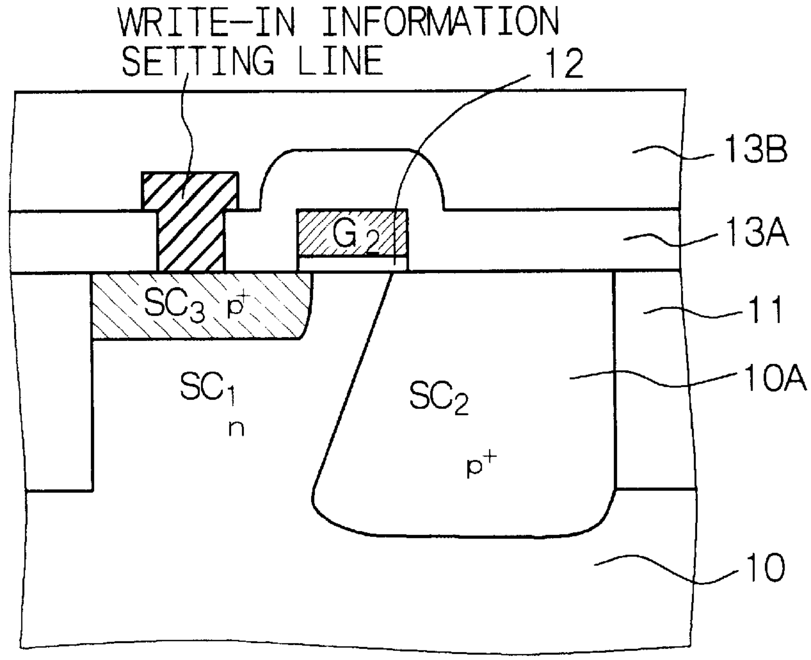
FIGS. 73A and 73B, subsequent to FIG. 72B, are schematic partial cross-sectional views of a supporting substrate, etc., for the explanation of a manufacturing method of the semiconductor memory cell in Example 5.
Figure 73B:
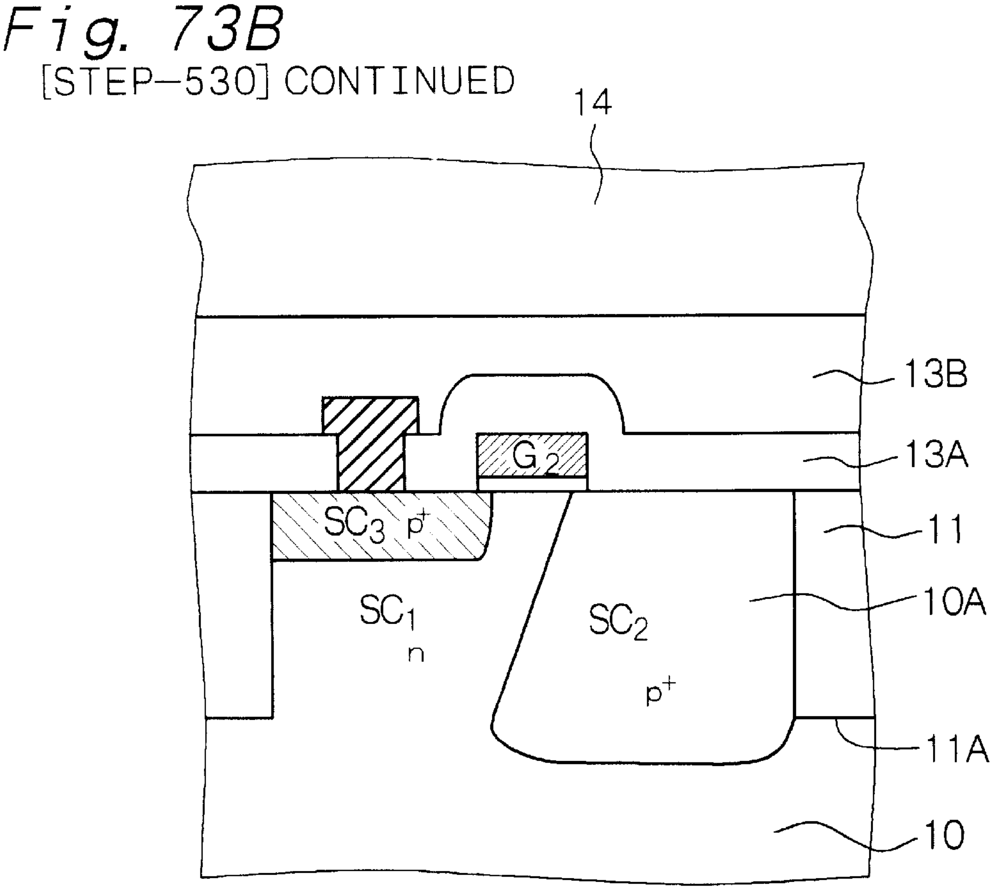

Then, as shown in FIG. 73A, an insulating layer 13B constituted of, for example, $SiO_2$ is formed on the entire surface by a CVD method, and the surface of the insulating layer 13B is then polished to be flattened. The surface of the insulating layer 13B and a supporting substrate 14 are bonded (see FIG. 73B), and the silicon semiconductor substrate 10 is polished from the back surface to expose the bottom 11A of the insulating layer 11 (see FIG. 74A). The semi-conductive layer 10A corresponding to the projected portion of the silicon semiconductor substrate 10 is left within the insulating layer 11. The surface of the semi-conductive layer 10A corresponds to the first main surface $A_1$.

[Step-540]

Figure 74A:
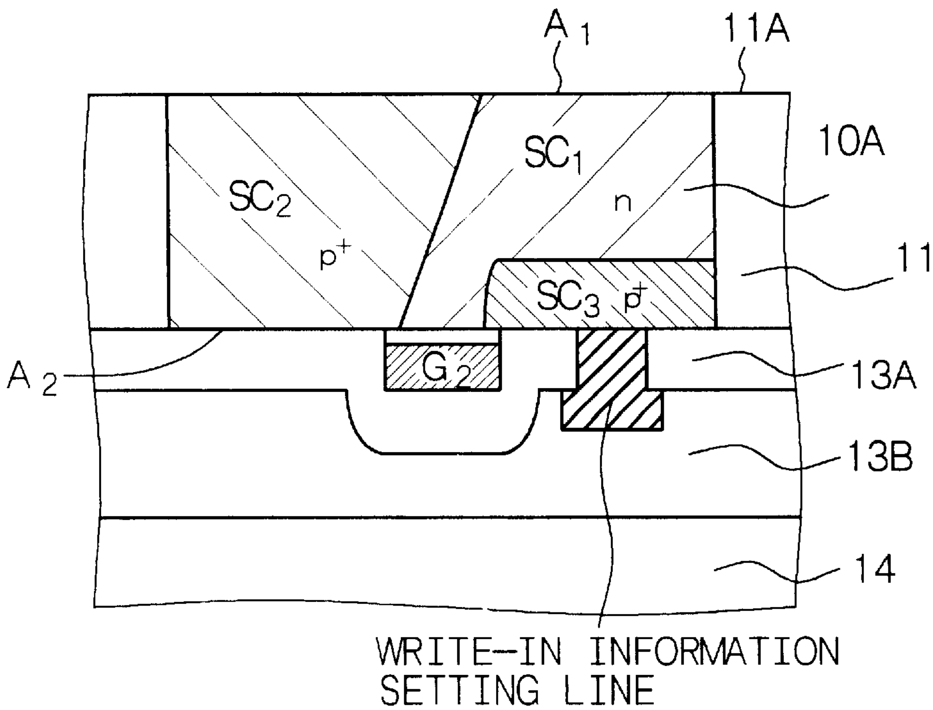
FIGS. 74A and 74B, subsequent to FIG. 73B, are schematic partial cross-sectional views of a supporting substrate, etc., for the explanation of a manufacturing method of the semiconductor memory cell in Example 5.
Figure 74B:
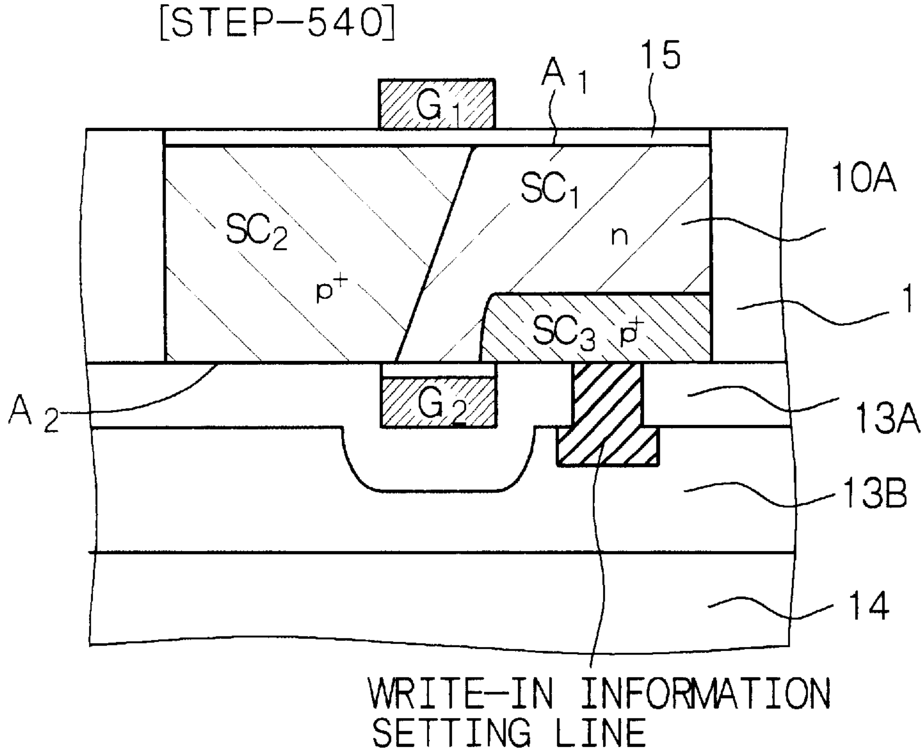

After that, a silicon oxide film 15 (corresponding to the barrier layer) having a thickness of approx. 10 nm is formed on the surface of the semi-conductive layer 10A on the basis of a known method for forming a silicon oxide film, and the gate portion $G_1$ of the first transistor, which is constituted of doped polysilicon or has a policed structure, is then formed (see FIG. 74B). The gate portion $G_1$ for the first transistor and the gate portion $G_2$ for the second transistor are placed on the both sides of the semi-conductive layer 10A with their locations being almost aligned along a vertical direction.

[Step-550]

Figure 75A:
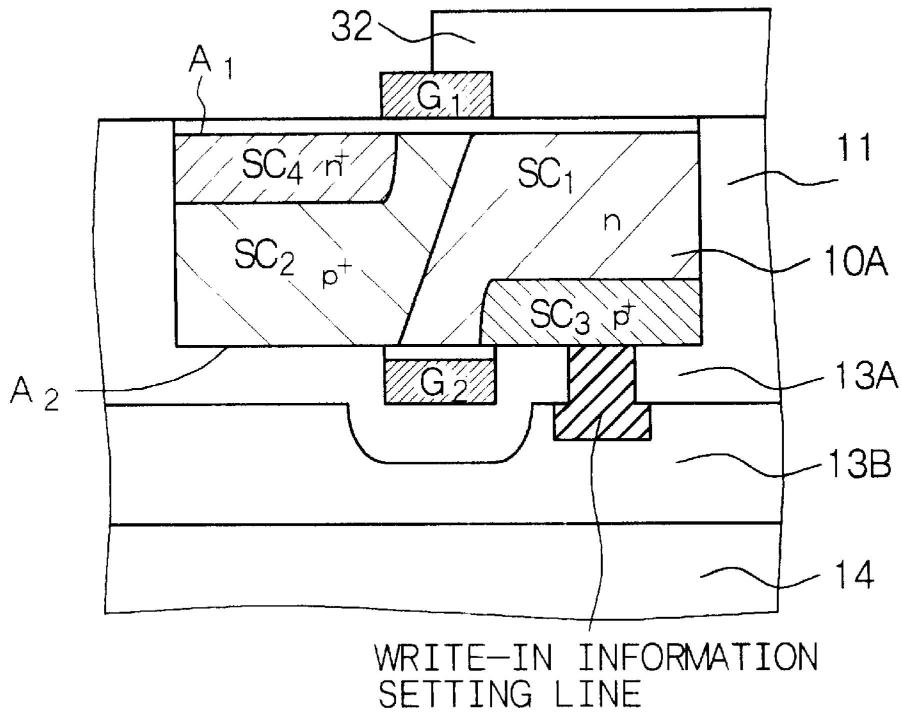
FIGS. 75A and 75B, subsequent to FIG. 74B, are schematic partial cross-sectional views of a supporting substrate, etc., for the explanation of a manufacturing method of the semiconductor memory cell in Example 5.

Using a resist 32 as a mask, normal ion implantation and oblique ion implantation are successively conducted to form the fourth region $SC_4$ (see FIG. 75A).

[Step-560]]

Figure 75B:
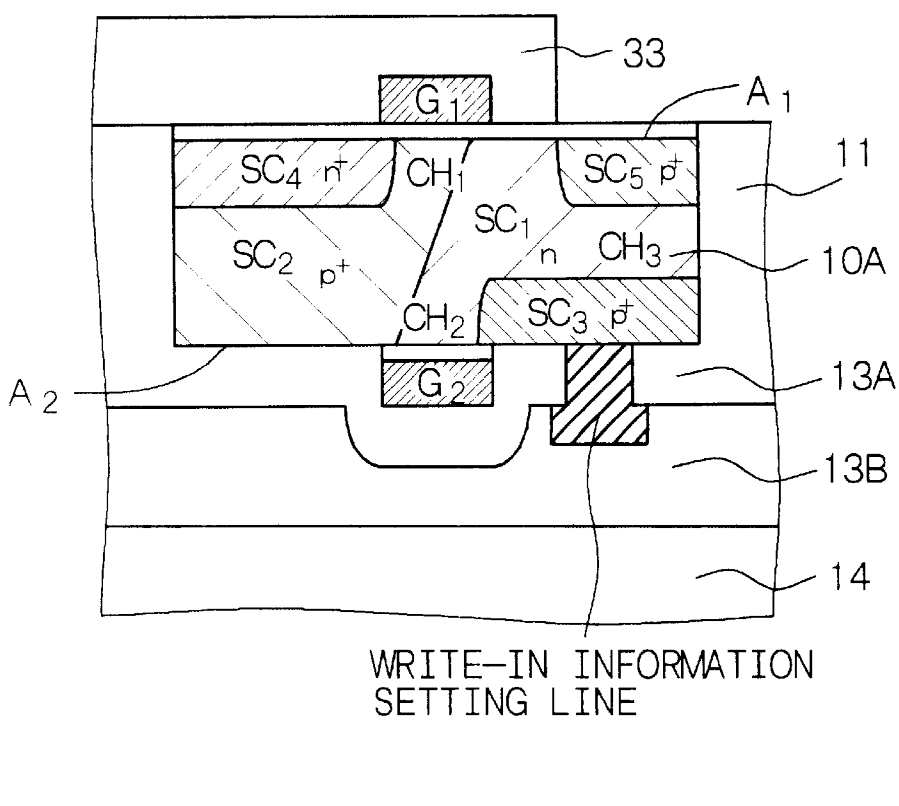

Using a resist 33 as a mask, normal ion implantation is further performed to form the fifth region $SC_5$ (see FIG. 75B).

[Step-570]

After that, an insulating layer is formed on the entire surface, and then, openings are formed in the insulating layer above the fourth region $SC_4$ and fifth region $SC_5$ as well as above the first region $SC_1$ extending on the first main surface $A_1$. A metal layer is then formed on the insulating layer including the insides of the openings, and is then patterned into the second memory-cell-selecting line, the predetermined potential line and the second predetermined potential line. Thus, the semiconductor memory cell of Example 5 shown in FIG. 25B is completed. It is not always necessary to form the fourth region $SC_4$ and the fifth region $SC_5$ by the ion implantation. When the second memory-cell-selecting line or the second predetermined potential line is formed, a barrier layer or a glue layer constituted of titanium silicide or TiN is generally formed. At the same time, the barrier layer or the glue layer is formed on the surface of the first region $SC_1$ and the surface of the second region $SC_2$, whereby the fourth region $SC_4$ and the fifth region $SC_5$ are formed in the surface region of the first region $SC_1$ and in the surface region of the second region $SC_2$, the fourth region $SC_4$ and part of the second memory-cell-selecting line (more specifically, part of the barrier layer or the glue layer) are fabricated in common, and the fifth region $SC_5$ part of the second predetermined potential line (more specifically, part of the barrier layer or the glue layer) are fabricated in common.

The manufacturing processes for the semiconductor memory cell of Example 5 are not limited to those mentioned above. It is allowable, for example, to form the second region $SC_2$ in Step-540, rather than in Step-510. That is, in Step-540, after the silicon oxide film 15 having a thickness of, for example, approx. 10 nm is formed on the surface of the semi-conductive layer 10A, the second region $SC_2$ may be formed. The order of forming individual regions by the ion implantation is arbitrary in essence with some dependence on the processes.

In the semiconductor memory cell of Example 5, the distance (thickness of the channel region $CH_3$) between the facing gate regions (the fifth region $SC_5$ and the third region $SC_3$) of the junction-field-effect transistor $TR_3$ is optimized, and impurity concentrations of the facing gate regions (the fifth region $SC_5$ and the third region $SC_3$) and the channel region $CH_3$ (specifically, the first region $SC_1$) of the junction-field-effect transistor $TR_3$ is optimized on the basis of an ion-implantation condition. These optimization need to be carried out by computer simulation or experiments.

EXAMPLE 6

Figure 33A:
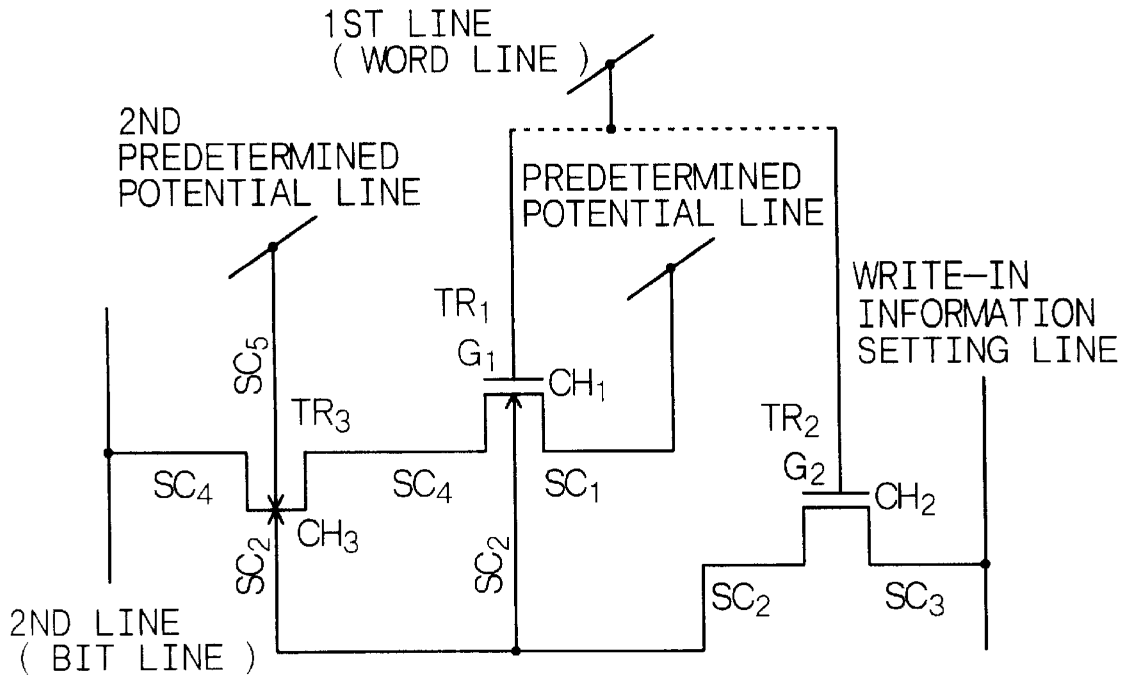
FIGS. 33A and 33B are principle drawings of the semiconductor memory cells in Example 6.
Figure 34A:
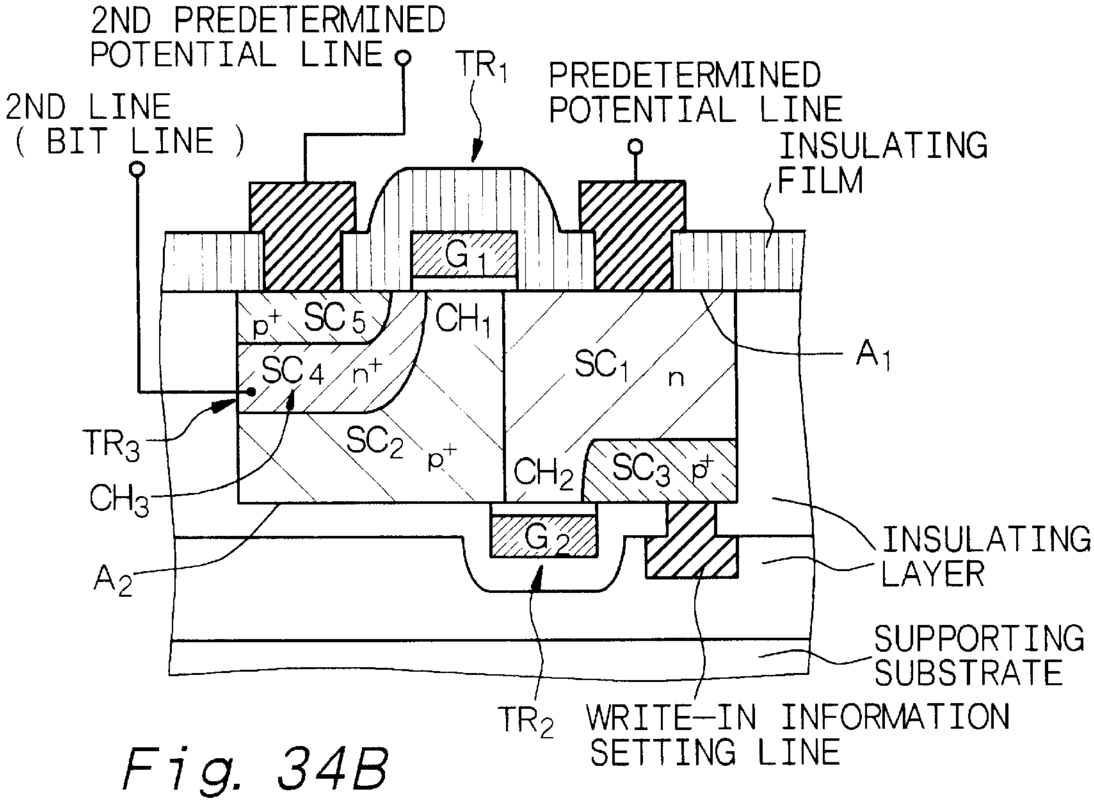
FIGS. 34A and 34B are schematic partial cross-sectional views of the semiconductor memory cells in Example 6.
Figure 37A:
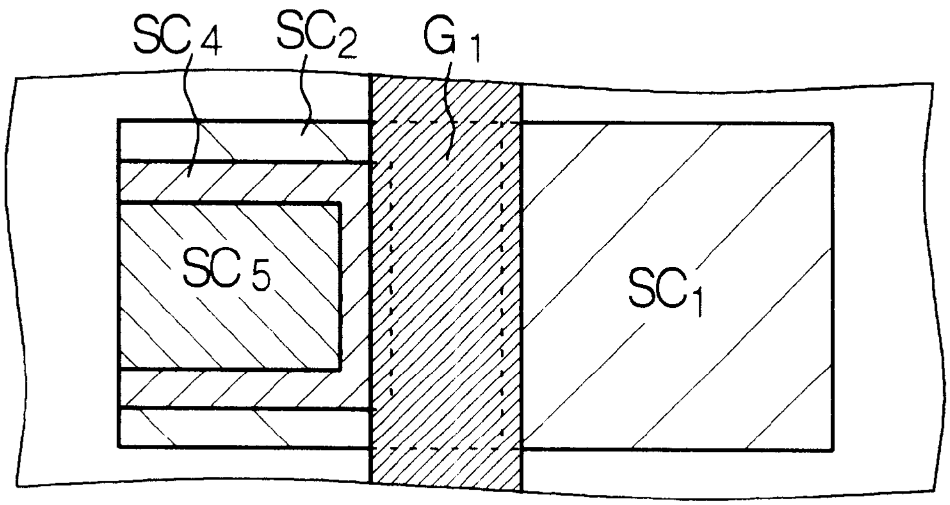
FIGS. 37A and 37B show schematic arrangements of gate portions and each regions of the semiconductor memory cells in Example 6 and its modification, respectively.

Example 6 is directed to the semiconductor memory cell according to the sixth aspect of the present invention and the method for manufacturing a semiconductor memory cell according to the third aspect of the present invention. For example, as FIG. 33A shows its principle drawing, as FIG. 34A shows its schematic partial cross-sectional view and as FIG. 37A shows a schematic layout of a gate portion and each regions, the semiconductor memory cell of Example 6 comprises a first transistor of a first conductivity type (e.g., n-type) for read-out $TR_1$, a second transistor of a second conductivity type (e.g., p-type) for write-in $TR_2$, and a junction-field-effect transistor of a first conductivity type (e.g., n-type) for current control $TR_3$. The semiconductor memory cell of Example 6 is provided with a semi-conductive layer having a first main surface $A_1$ and a second main surface $A_2$ opposed to the first main surface $A_1$. In Example 6, as shown in FIG. 34A, a gate portion $G_1$ of the first transistor $TR_1$ is formed on the first main surface $A_1$, and a gate portion $G_2$ of the second transistor $TR_2$ is formed on the second main surface $A_2$. The gate portion $G_1$ and the gate portion $G_2$ are slightly off-aligned along a vertical direction. Further, the semiconductor memory cell is formed in the semi-conductive layer surrounded with an insulating layer formed on a supporting substrate and has a so-called SOI structure. In the semiconductor memory cell of Example 6 shown in FIG. 34A, the supporting substrate, the insulating layer, the gate portion $G_2$ of the second transistor $TR_2$ and the gate portion $G_1$ of the first transistor $TR_1$ are arranged in this order from the bottom. The gate portion $G_2$ and the third region $SC_3$ are omitted in FIG. 37A.

The semiconductor memory cell of Example 6 has;

(1) a first semi-conductive region $SC_1$ of the first conductivity type (for example, n-type), formed through the semi-conductive layer from the first main surface $A_1$ to the second main surface $A_2$, (2) a second semi-conductive region $SC_2$ of the second conductivity type (for example, $p^+$-type) opposite to the first conductivity type, formed through the semi-conductive layer from the first main surface $A_1$ to the second main surface $A_2$ and being in contact with the first region $SC_1$, (3) a third semi-conductive region $SC_3$ of the second conductivity type (for example, $p^+$-type), or a third conductive region $SC_3$ formed of a silicide, a metal or a metal compound, said third region $SC_3$ being formed in a surface region, including the second main surface $A_2$, of the first region $SC_1$, being spaced from the second region $SC_2$ and forming a rectifier junction together with the first region $SC_1$, (4) a fourth semi-conductive region $SC_4$ of the first conductivity type (for example, $n^+$-type), or a fourth conductive region $SC_4$ formed of a silicide, a metal or a metal compound, said fourth region $SC_4$ being formed in a surface region, including the first main surface $A_1$, of the second region $SC_2$, being spaced from the first region $SC_1$ and forming a rectifier junction together with the second region $SC_2$, (5) a fifth semi-conductive region $SC_5$ of the second conductivity type (for example, $p^+$-type), or a fifth conductive region $SC_5$ formed of a silicide, a metal or a metal compound, said fifth region $SC_5$ being formed in a surface region of the fourth region $SC_4$ and forming a rectifier junction together with the fourth region $SC_4$, (6) a gate portion $G_1$ of the first transistor $TR_1$ formed on a barrier layer formed on the first main surface $A_1$ so as to bridge the first region $SC_1$ and the fourth region $SC_4$, and (7) a gate portion $G_2$ of the second transistor $TR_2$ formed on a barrier layer formed on the second main surface $A_2$ so as to bridge the second region $SC_2$ and the third region $SC_3$.

Concerning the first transistor $TR_1$;

(A-1) one source/drain region is constituted of a surface region, including the first main surface $A_1$, of the first region $SC_1$, (A-2) the other source/drain region is constituted of the fourth region $SC_4$, and (A-3) a channel forming region $CH_1$ is constituted of a surface region, including the first main surface $A_1$, of the second region $SC_2$ which surface region is sandwiched by (or interposed between) the surface region, including the first main surface $A_1$, of the first region $SC_1$ and the fourth region $SC_4$.

Concerning the second transistor $TR_2$;

(B-1) one source/drain region is constituted of the third region $SC_3$ (B-2) the other source/drain region is constituted of a surface region, including the second main surface $A_2$, of the second region $SC_2$, and (B-3) a channel forming region $CH_2$ is constituted of a surface region, including the second main surface $A_2$, of the first region $SC_1$ which surface region is sandwiched by (or interposed between) the third region $SC_3$ and the surface region, including the second main surface $A_2$, of the second region $SC_2$.

Further, concerning the junction-field-effect transistor $TR_3$;

(C-1) gate regions are constituted of the fifth region $SC_5$ and a portion of the second region $SC_2$ facing the fifth region $SC_5$, (C-2) a channel region $CH_3$ is constituted of a portion of the fourth region $SC_4$ sandwiched by (or interposed between) the fifth region $SC_5$ and said portion of the second region $SC_2$, (C-3) one source/drain region is constituted of a portion of the fourth region $SC_4$ extending from one end of the channel region $CH_3$ of the junction-field-effect transistor $TR_3$ and constituting the other source/drain region of the first transistor $TR_1$, and (C-4) the other source/drain region is constituted of a portion of the fourth region $SC_4$ extending from the other end of the channel region $CH_3$ of the junction-field-effect transistor $TR_3$.

The junction-field-effect transistor $TR_3$ in the semiconductor memory cell of Example 6 can be formed by (X) optimizing the distance (thickness of the channel region $CH_3$) between the facing gate regions (the fifth region $SC_5$ and the portion of the second region $SC_2$ facing the fifth region $SC_5$) of the junction-field-effect transistor $TR_3$, and (Y) optimizing impurity concentrations of the facing gate regions (the fifth region $SC_5$ and the portion of the second region $SC_2$ facing the fifth region $SC_5$) and the channel region $CH_3$ (specifically, the fourth region $SC_4$) of the junction-field-effect transistor $TR_3$.

In the semiconductor memory cell of Example 6, the gate portion $G_1$ of the first transistor $TR_1$ and the gate portion $G_2$ of the second transistor $TR_2$ are connected to a first memory-cell-selecting line (for example, a word line); the third region $SC_3$ is connected to a write-in information setting line; the first region $SC_1$ is connected to a predetermined potential line; the other source/drain region of the junction-field-effect transistor $TR_3$ is connected to a second memory-cell-selecting line (for example, a bit line); and the fifth region $SC_5$ is connected to a second predetermined potential line.

Figure 34B:
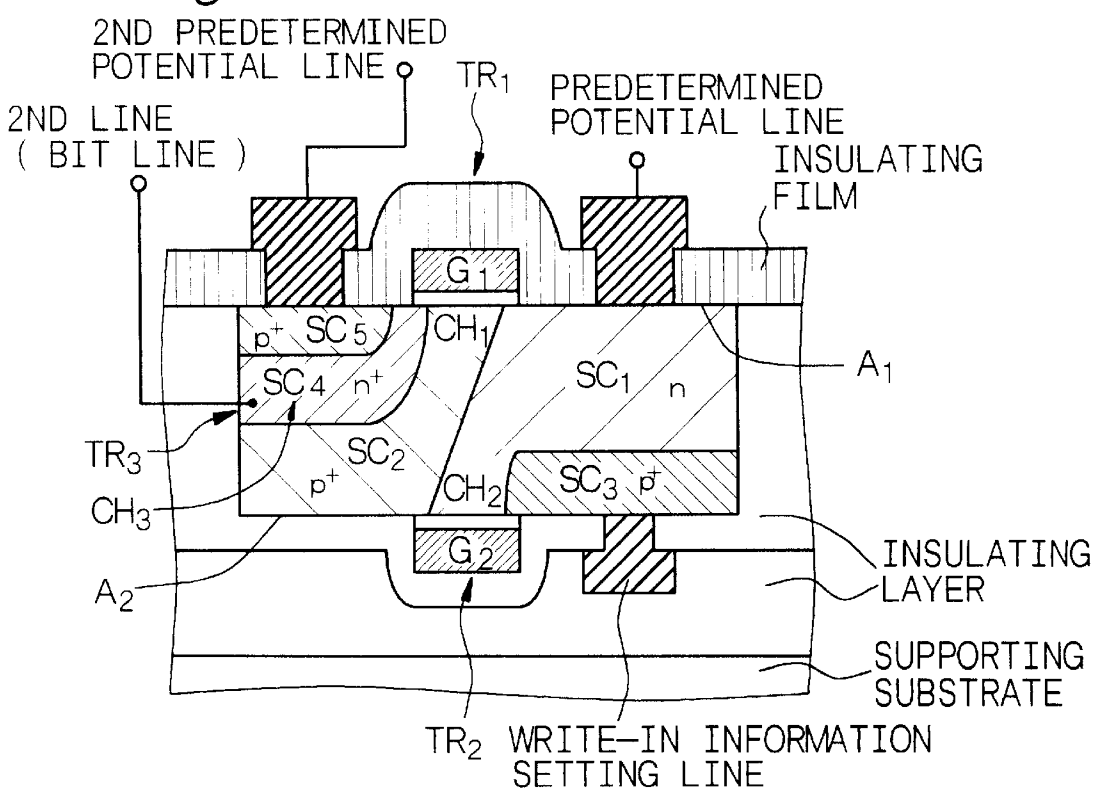
Figure 35A:
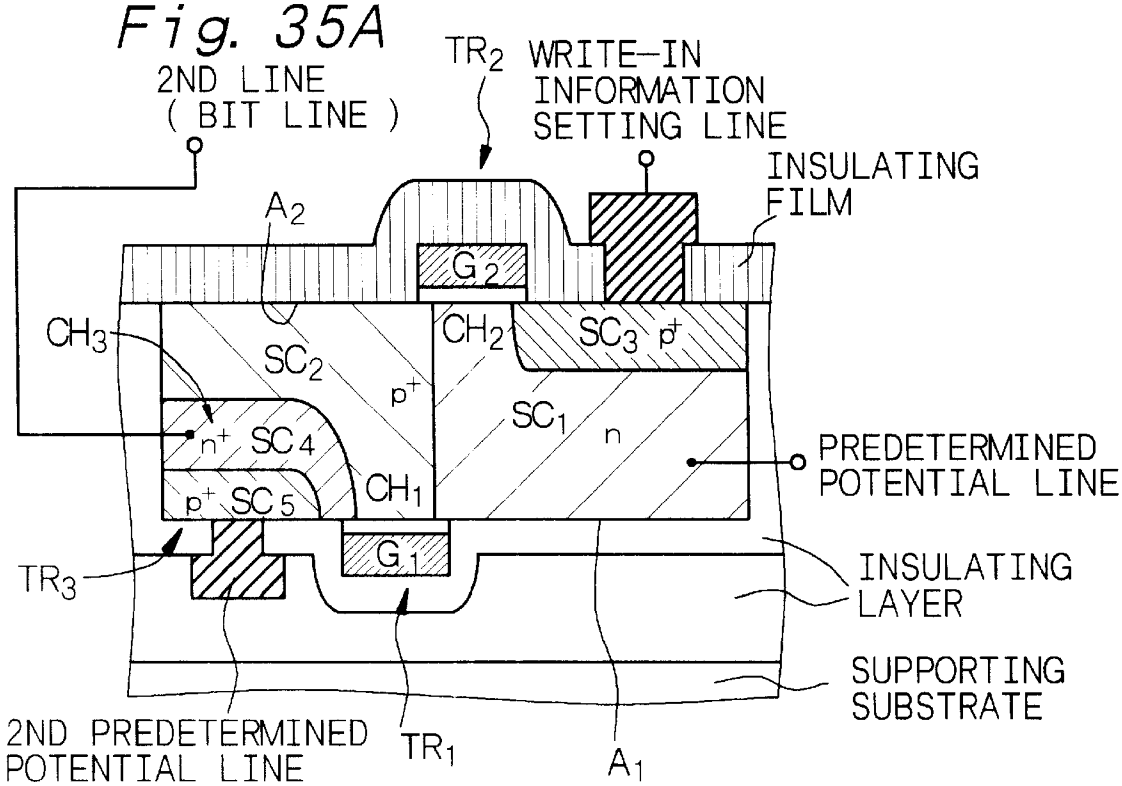
FIGS. 35A and 35B are schematic partial cross-sectional views of modifications of the semiconductor memory cell in Example 6.
Figure 35B:
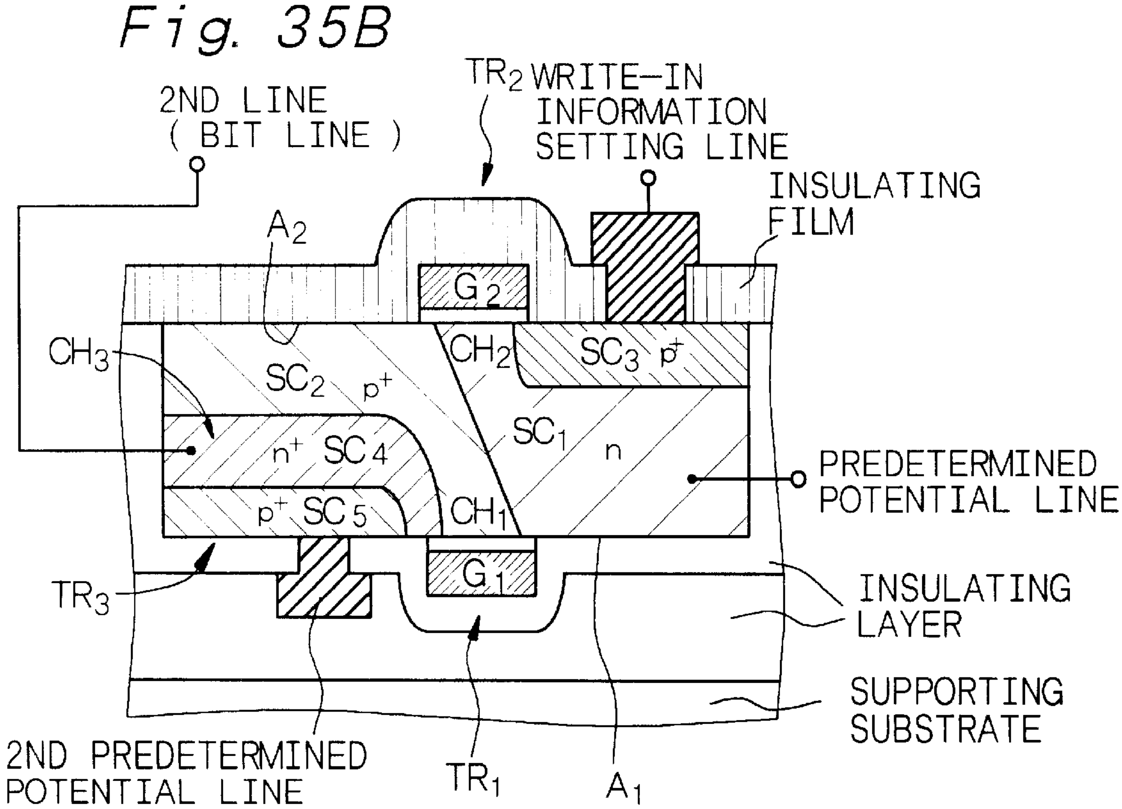

FIGS. 34B, 35A and 35B show schematic partial cross-sectional views of modifications of the semiconductor memory cell in Example 6. The semiconductor memory cell shown in FIG. 34B differs from the semiconductor memory cell shown in FIG. 34A in that the gate portion $G_1$ and the gate portion $G_2$ are almost aligned along a vertical direction. That is, when viewed from above (as a plane view), the gate portion $G_2$ and the gate portion $G_1$ are approximately overlapped. The semiconductor memory cell can be decreased in size with such a configuration. In the semiconductor memory cells shown in FIGS. 35A and 35B, the supporting substrate, the insulating layer, the gate portion $G_1$ of the first transistor $TR_1$ and the gate portion $G_2$ of the second transistor $TR_2$ are arranged in this order from the bottom. The order of each regions and the gate portions in the semiconductor memory cells shown in FIGS. 35A and 35B along a perpendicular direction is inverse to the order of each regions and the gate portions in the semiconductor memory cells shown in FIGS. 34A and 34B, respectively. The semiconductor memory cell shown in FIG. 35B differs from the semiconductor memory cell shown in FIG. 35A in that the gate portion $G_1$ and the gate portion $G_2$ are almost aligned along a vertical direction.

Figure 33B:
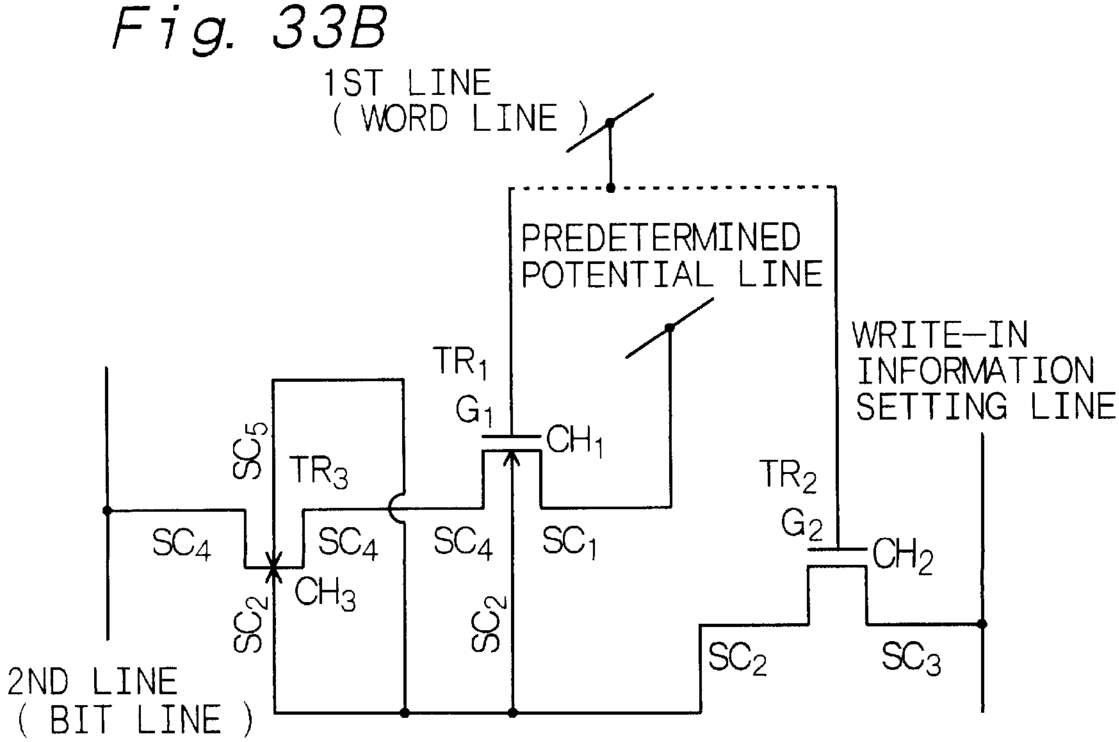
Figure 36A:
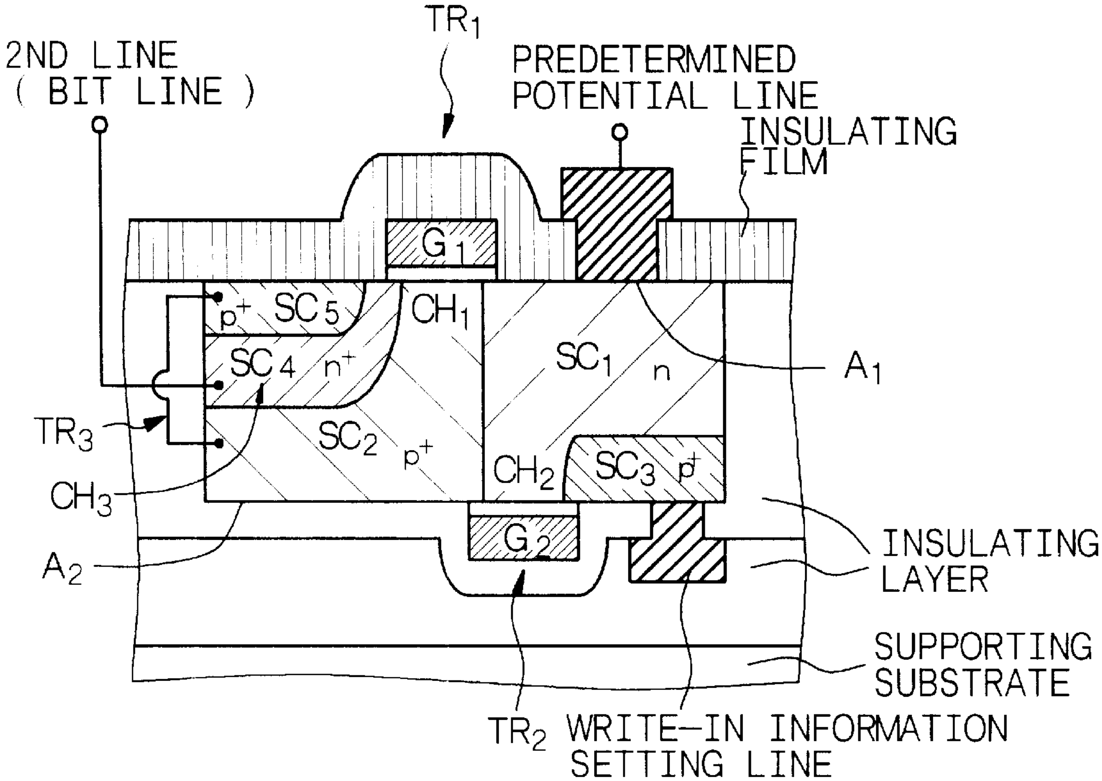
FIGS. 36A and 36B are schematic partial cross-sectional views of modifications of the semiconductor memory cell in Example 6.
Figure 36B:
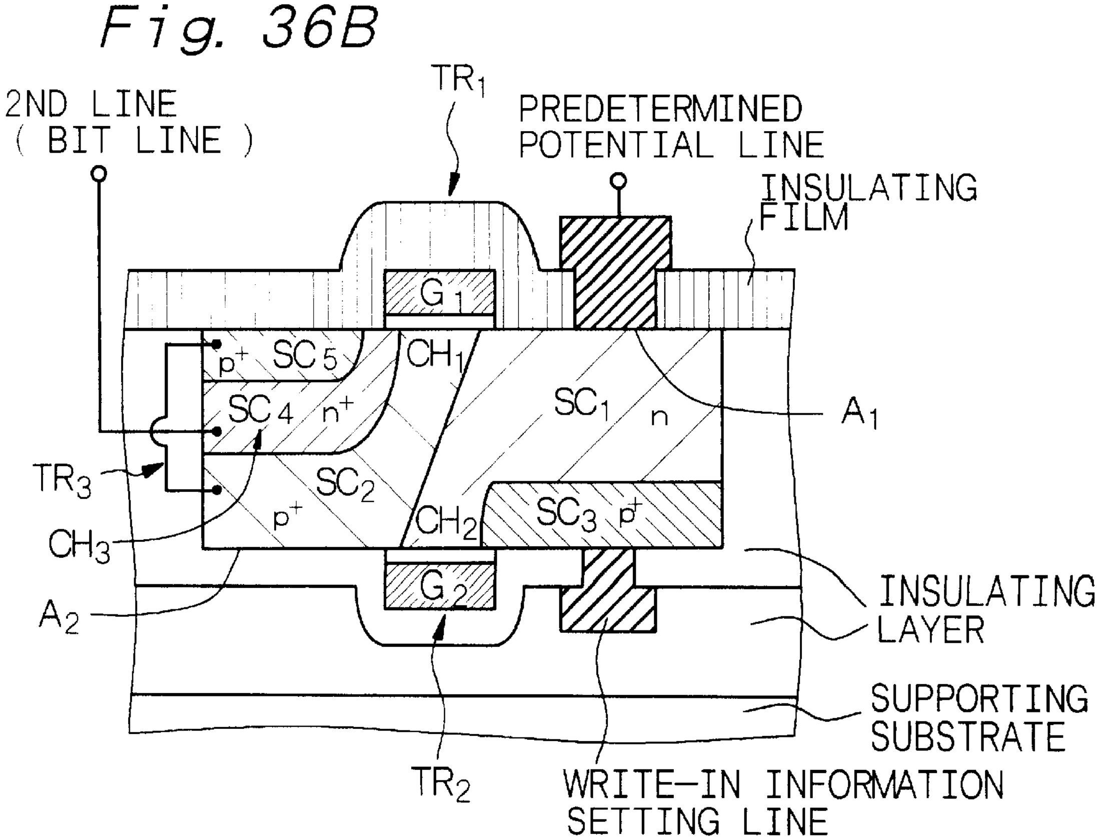
Figure 37B:
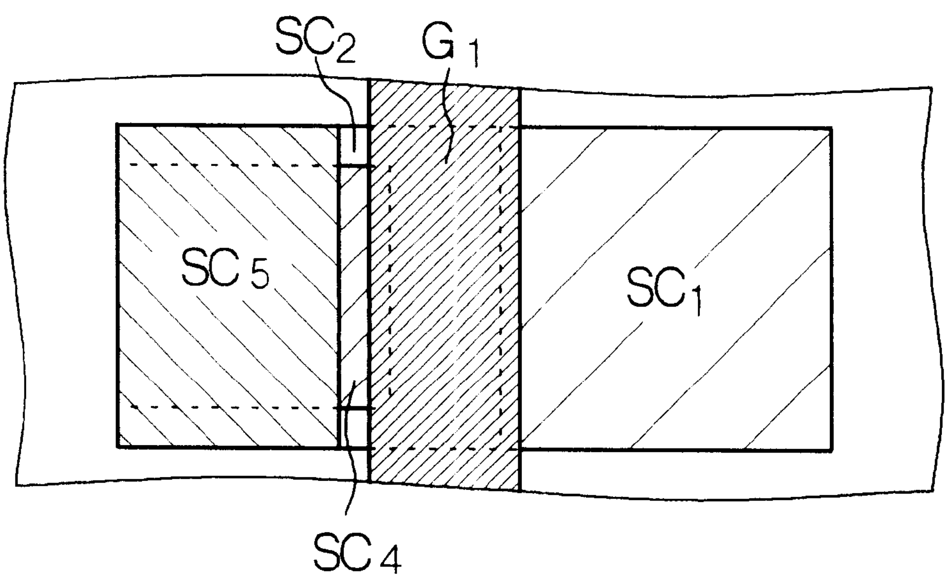
Figure 38A:
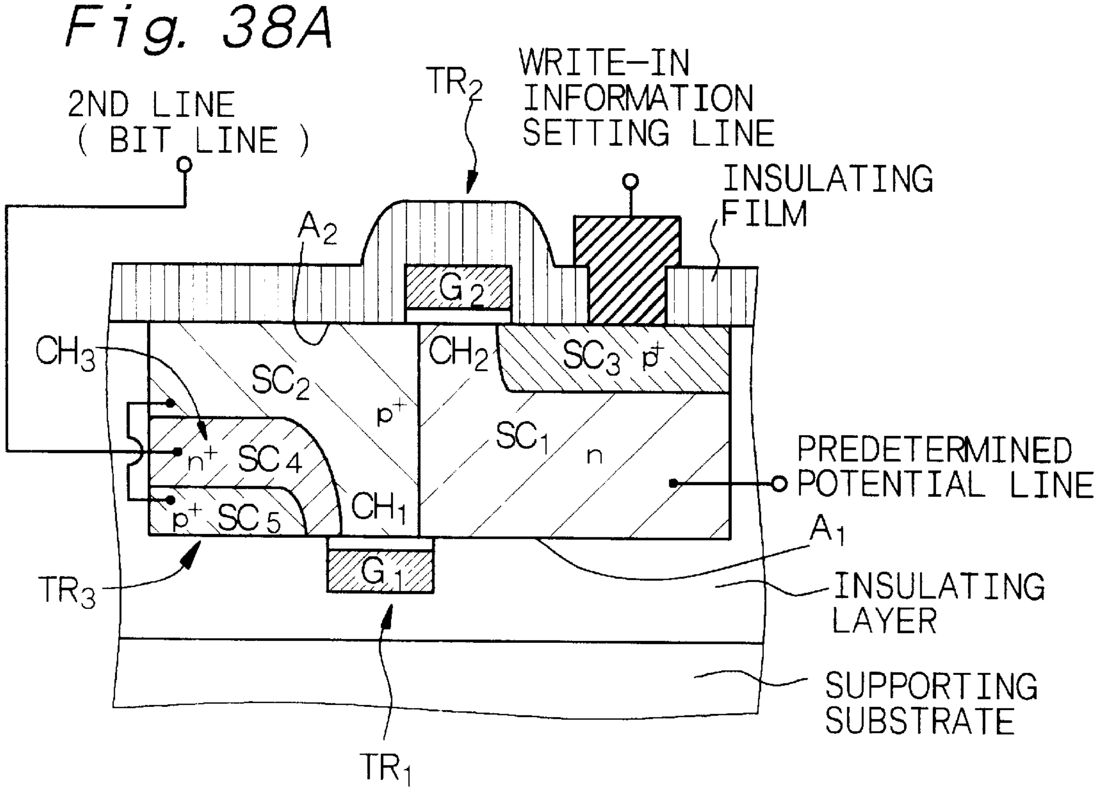
FIGS. 38A and 38B are schematic partial cross-sectional views of modifications of the semiconductor memory cell in Example 6.
Figure 38B:
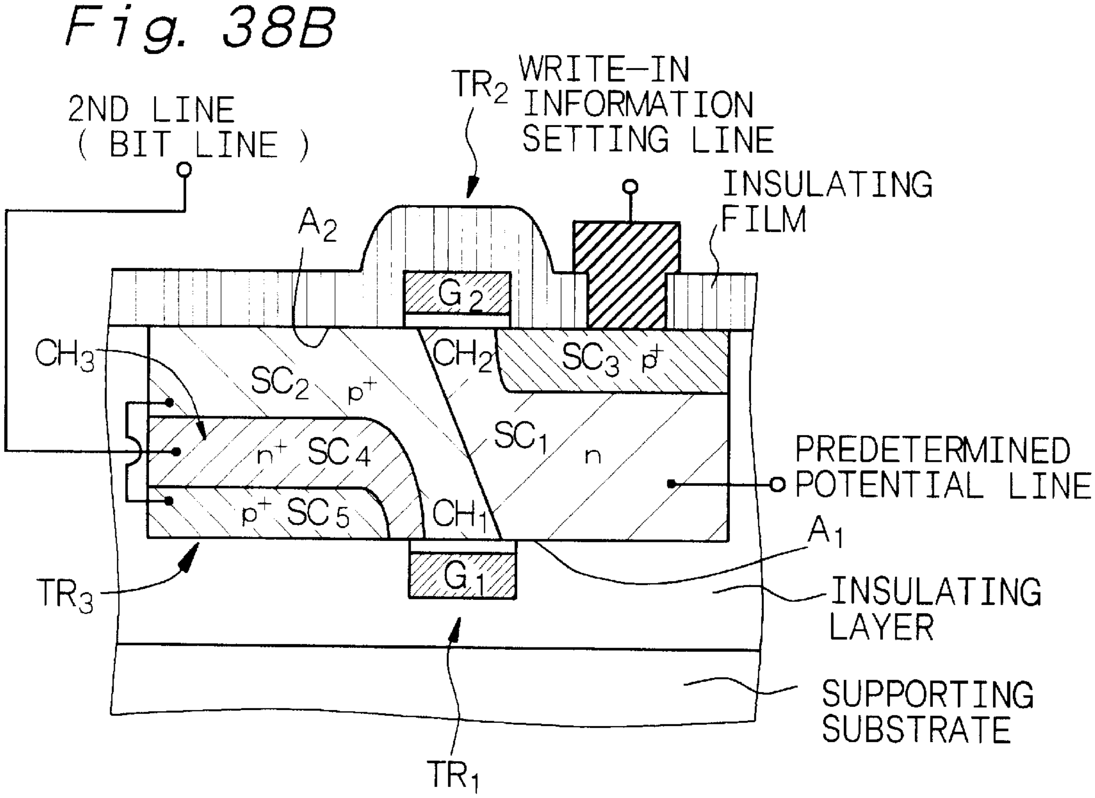

FIGS. 36A, 36B, 38A and 38B show schematic partial cross-sectional views of other modifications of the semiconductor memory cell in Example 6. FIG. 37B shows a schematic layout of the gate portion and each regions in the semiconductor memory cell shown in FIG. 36A. The gate portion $G_2$ and the region $SC_3$ are omitted in FIG. 37B. FIG. 33B shows a principle drawing of these semiconductor memory cells. Each of these semiconductor memory cells has a configuration in which the fifth region $SC_5$ is connected to the second region $SC_2$ in place of being connected to the second predetermined potential line. More specifically, the fifth region $SC_5$ and the second region $SC_2$ can be connected to each other, e.g., by providing a structure in which part of the second region $SC_2$ is extended up to the main surface $A_1$ of the semi-conductive layer so that the fifth region $SC_5$ and the extending portion of the second region $SC_2$ come in contact with each other outside the fourth region $SC_4$. The wiring configuration can be simplified by structuring the semiconductor memory cell as explained above. The semiconductor memory cells shown in FIGS. 36A and 36B are modifications of the semiconductor memory cells shown in FIGS. 34A and 34B, respectively. The semiconductor memory cells shown in FIGS. 38A and 38B are modifications of the semiconductor memory cells shown in FIGS. 35A and 35B, respectively.

Figure 39A:
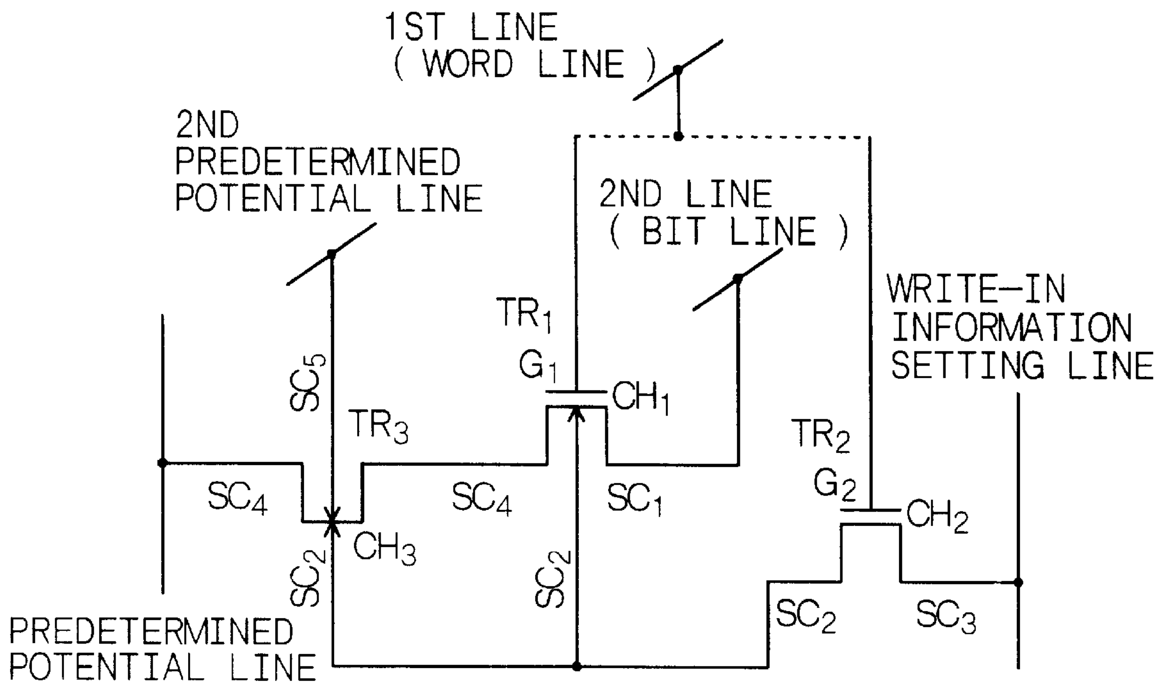
FIGS. 39A and 39B are principle drawings of modifications of the semiconductor memory cell in Example 6.
Figure 39B:
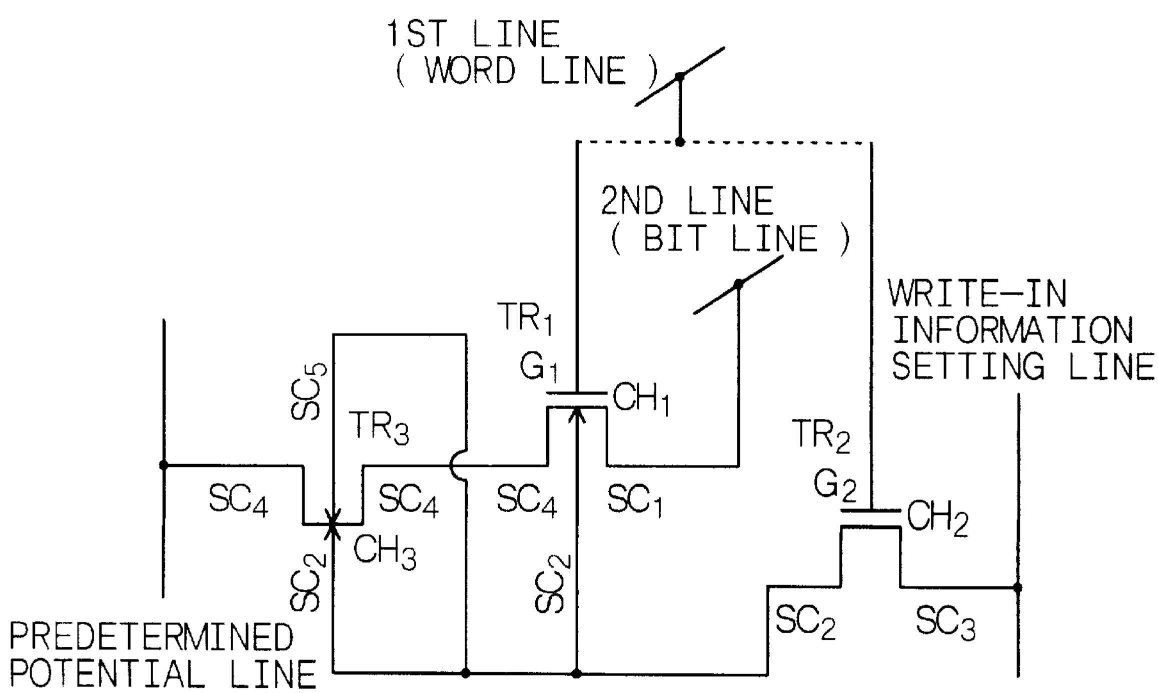
Figure 40A:
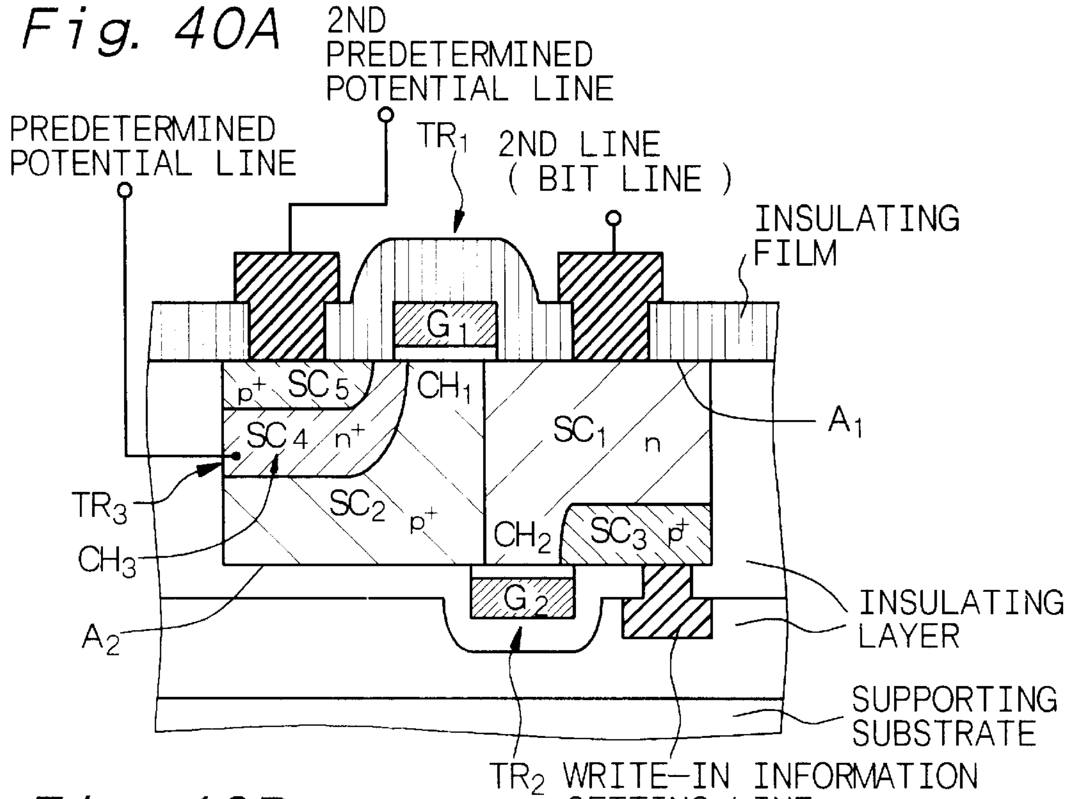
FIGS. 40A and 40B are schematic partial cross-sectional views of modifications of the semiconductor memory cell in Example 6.
Figure 40B:
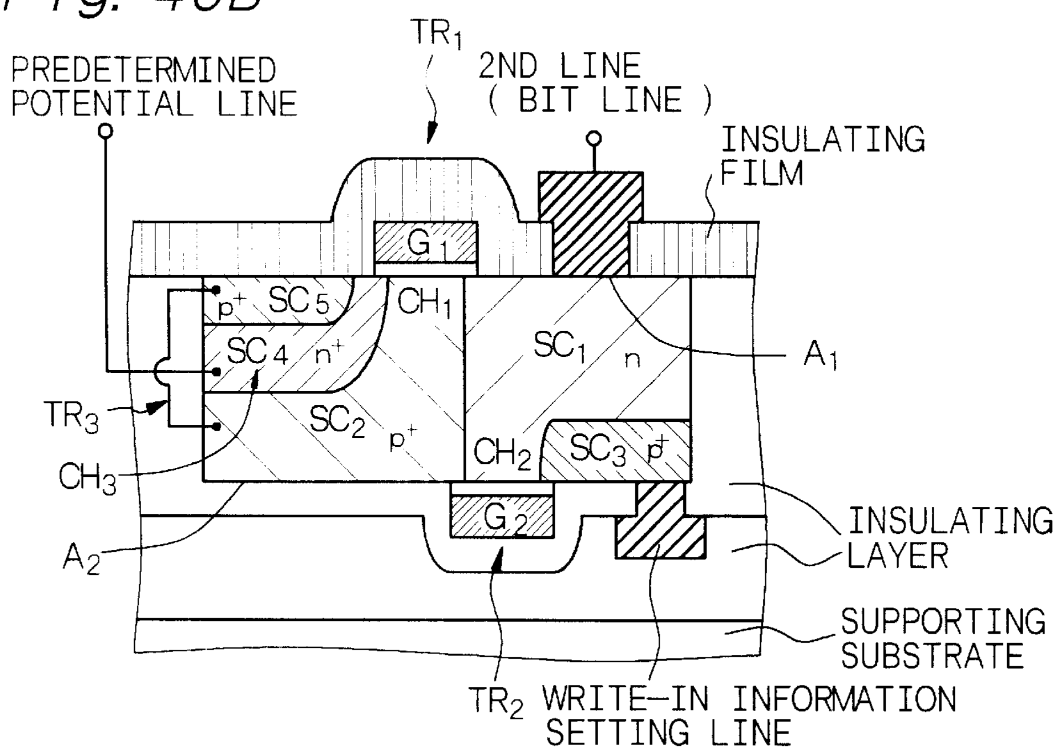

Alternatively, as FIG. 39A shows a principle drawing and as FIG. 40A shows a schematic partial cross-sectional view of another modification in Example 6, the other source/drain region of the junction-field-effect transistor $TR_3$ may be connected to the predetermined potential line in place of being connected to the second memory-cell-selecting line, and the first region $SC_1$ may be connected to the second memory-cell-selecting line in place of being connected to the predetermined potential line. In this case, as FIG. 39B shows a principle drawing and as FIG. 40B shows a schematic partial cross-sectional view, the fifth region $SC_5$ may be connected to the second region $SC_2$ in place of being connected to the second predetermined potential line. The configurations of the semiconductor memory cells shown in FIGS. 40A and 40B can be applied to the configurations of the semiconductor memory cells shown in FIGS. 34A to 38B.

The method of manufacturing the semiconductor memory cell in Example 6 can substantially be the same as the method of manufacturing the semiconductor memory cell of Example 5, except the formation of the region $SC_5$. Detailed explanations thereof are therefore omitted.

EXAMPLE 7

Figure 41:
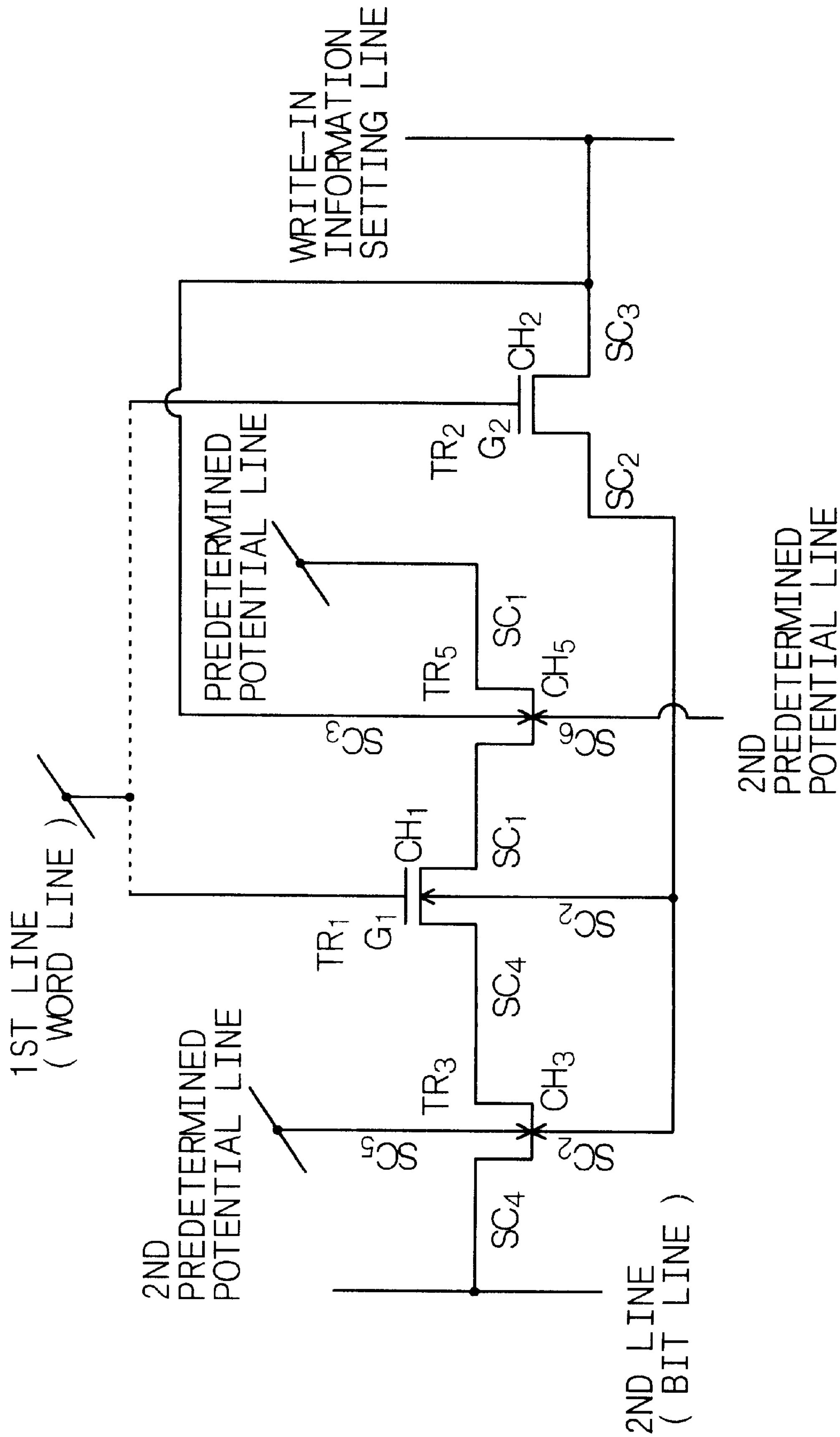
FIG. 41 is a principle drawing of the semiconductor memory cell in Example 7.
Figure 42A:
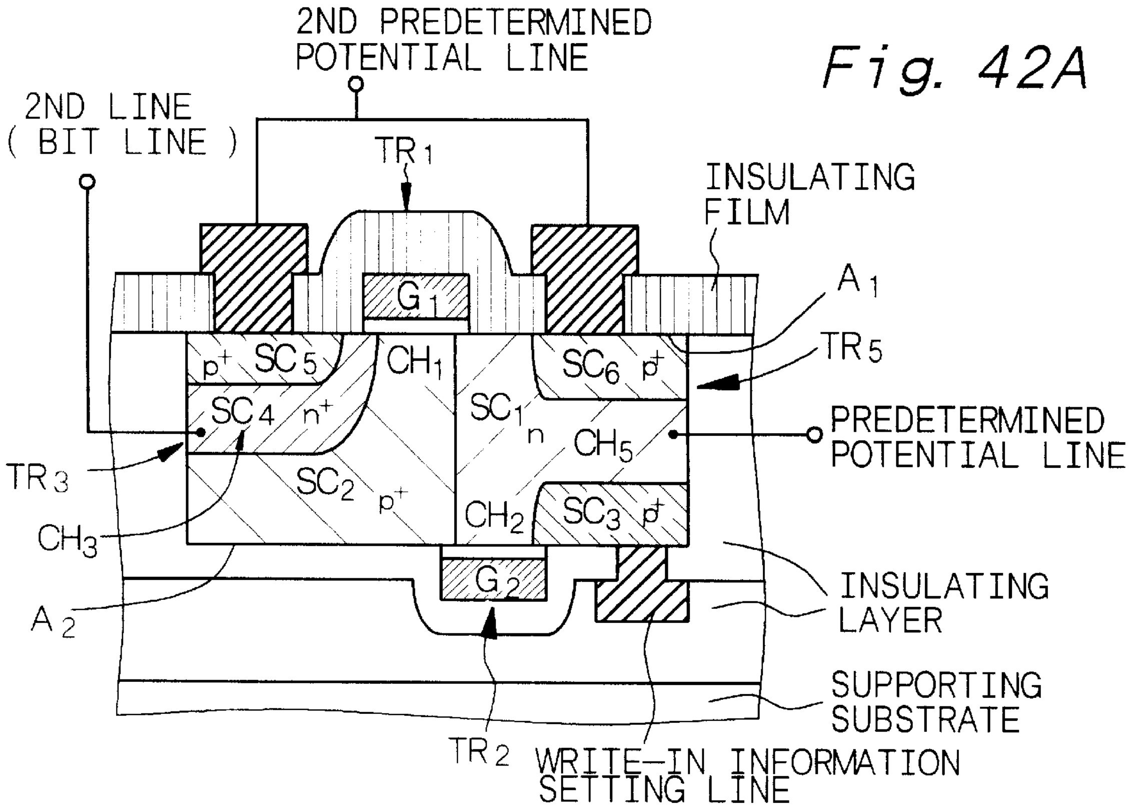
FIGS. 42A and 42B are schematic partial cross-sectional views of a semiconductor memory cell in Example 7.

Example 7 is directed to the semiconductor memory cell according to the seventh aspect of the present invention and the method for manufacturing a semiconductor memory cell according to the third aspect of the present invention. For example, as FIG. 41 shows a principle drawing and as FIG. 42A shows a schematic partial cross-sectional view, the semiconductor memory cell of Example 7 comprises a first transistor of a first conductivity type (e.g., n-type) for read-out $TR_1$, a second transistor of a second conductivity type (e.g., p-type) for write-in $TR_2$, a first junction-field-effect transistor of a first conductivity type (e.g., n-type) for current control $TR_3$ and a second junction-field-effect transistor of the first conductivity type (e.g., n-type) for current control $TR_5$. That is, the semiconductor memory cell of Example 7 has a configuration in which a semi-conductive or conductive region $SC_6$ and the second junction-field-effect transistor of the first conductivity type $TR_5$ are added into the semiconductor memory cell in Example 6.

In the semiconductor memory cell of Example 7 shown in FIG. 42A, the gate portion $G_1$ of the first transistor $TR_1$ and the gate portion $G_2$ of the second transistor $TR_2$ are slightly off-aligned along a vertical direction. The semiconductor memory cell is formed in the semi-conductive layer surrounded with an insulating layer formed on a supporting substrate and has a so-called SOI structure. In the semiconductor memory cell of Example 7 shown in FIG. 42A, the supporting substrate, the insulating layer, the gate portion $G_2$ of the second transistor $TR_2$ and the gate portion $G_1$ of the first transistor $TR_1$ are arranged in this order from the bottom.

The semiconductor memory cell of Example 7 has the same configuration of the first region $SC_1$, the second region $SC_2$, the third region $SC_3$, the fourth region $SC_4$ and the fifth region $SC_5$ as the semiconductor memory cell of Example 6.

Further, the semiconductor memory cell of Example 7 has the same configurations of the first transistor $TR_1$, the second transistor $TR_2$ and the first junction-field-effect transistor $TR_3$ as the semiconductor memory cell of Example 6.

In the semiconductor memory cell of Example 7, a sixth semi-conductive or conductive region $SC_6$ is formed in a surface region, including the first main surface $A_1$, of the first region $SC_1$, is spaced from the second region $SC_2$ and forms a rectifier junction together with the first region $SC_1$.

Concerning the second junction-field-effect transistor $TR_5$;

(D-1) gate regions are constituted of the sixth region $SC_6$ and the third region $SC_3$, (D-2) a channel region $CH_5$ is constituted of a portion of the first region $SC_1$ sandwiched (or interposed between) by the sixth region $SC_6$ and the third region $SC_3$, (D-3) one source/drain region is constituted of a portion of the first region $SC_1$ extending from one end of the channel region $CH_5$ of the second junction-field-effect transistor $TR_5$ and constituting one source/drain region of the first transistor $TR_1$ and the channel forming region $CH_2$ of the second transistor $TR_2$, and (D-4) the other source/drain region is constituted of a portion of the first region $SC_1$ extending from the other end of the channel region $CH_5$ of the second junction-field-effect transistor $TR_5$.

The junction-field-effect transistors $TR_3$ and $TR_5$ in the semiconductor memory cell of Example 7 can be formed by (X) optimizing the distance (thickness of the channel regions $CH_3$ and $CH_5$) between the facing gate regions (the fifth region $SC_5$ and the portion of the second region $SC_2$ facing the fifth region $SC_5$, and, the sixth region $SC_6$ and the third region $SC_3$) of the junction-field-effect transistors $TR_3$ and $TR_5$, and (Y) optimizing impurity concentrations of the facing gate regions (the fifth region $SC_5$ and the portion of the second region $SC_2$ facing the fifth region $SC_5$, and, the sixth region $SC_6$ and the third region $SC_3$) and the channel regions $CH_3$ and $CH_5$ (specifically, the fourth region $SC_4$ and the first region $SC_1$) of the junction-field-effect transistors $TR_3$ and $TR_5$.

In the semiconductor memory cell of Example 7, the gate portion $G_1$ of the first transistor $TR_1$ and the gate portion $G_2$ of the second transistor $TR_2$ are connected to a first memory-cell-selecting line (for example, a word line); the third region $SC_3$ is connected to a write-in information setting line; the other source/drain region of the second junction-field-effect transistor $TR_5$ is connected to a predetermined potential line; the other source/drain region of the first junction-field-effect transistor $TR_3$ is connected to a second memory-cell-selecting line (for example, a bit line); and the fifth region $SC_5$ and the sixth region $SC_6$ are connected to a second predetermined potential line.

Figure 42B:
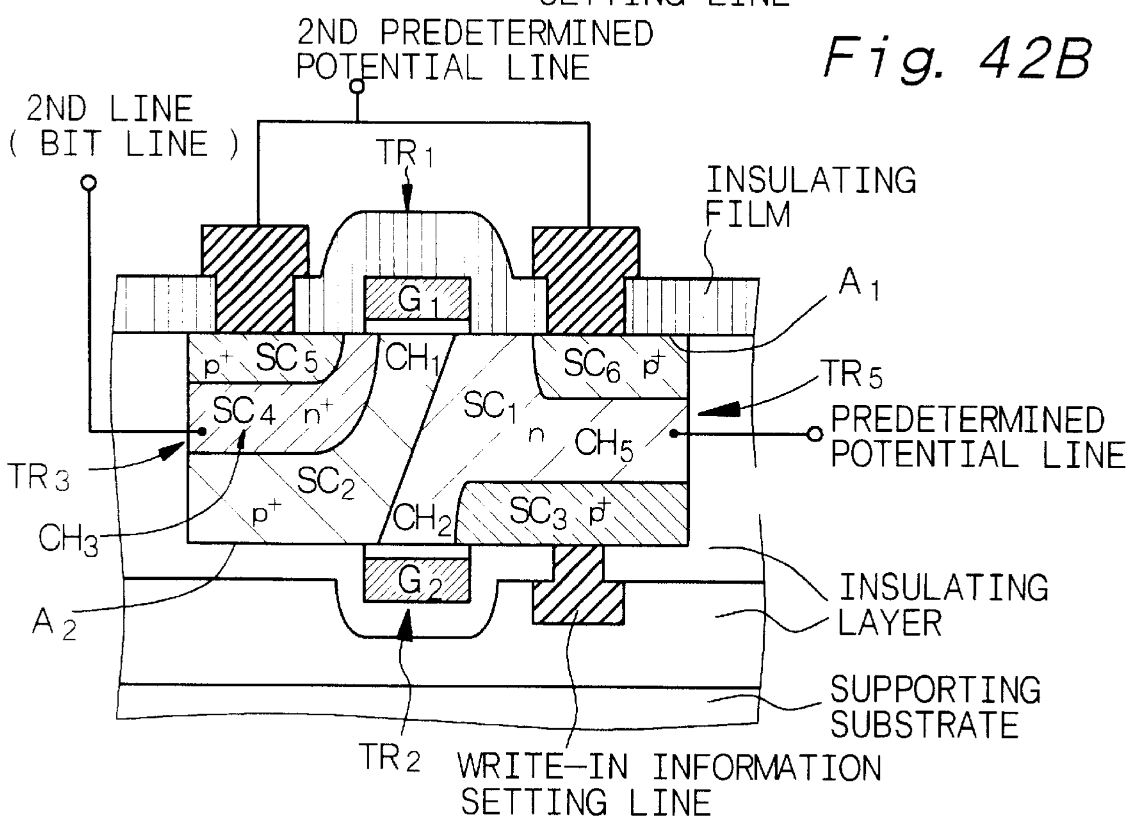
Figure 43A:
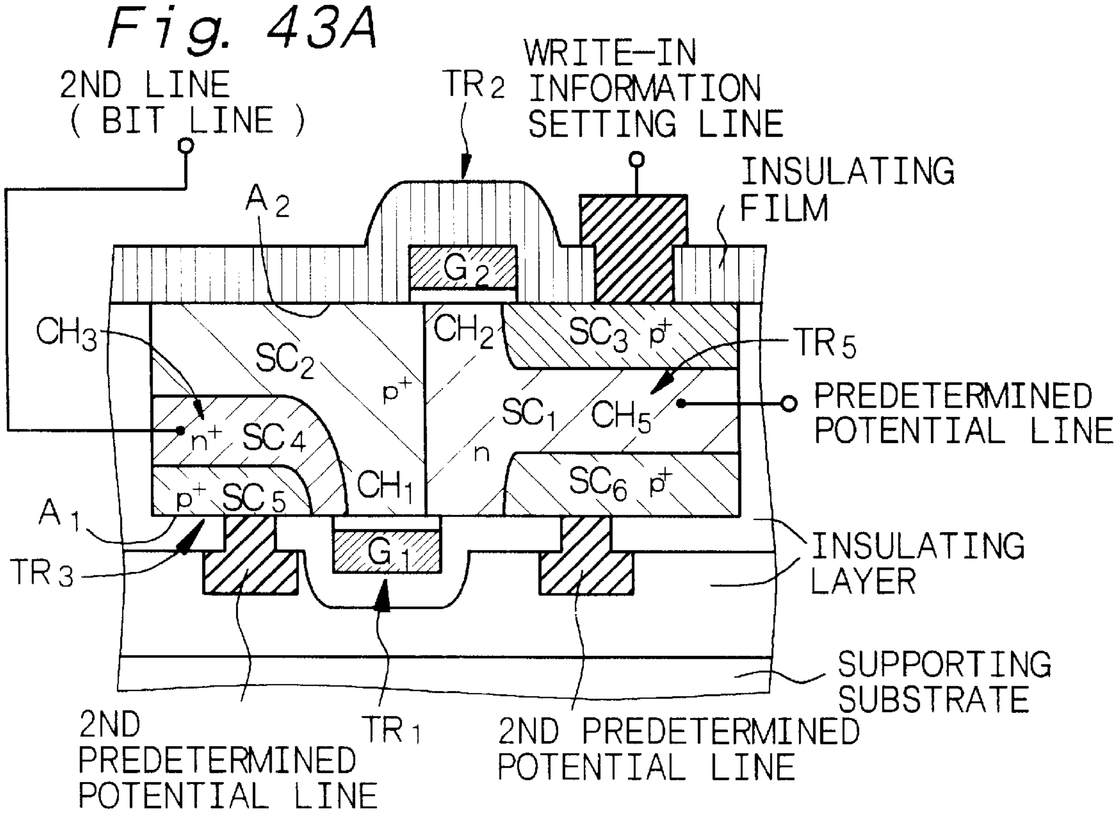
FIGS. 43A and 43B are schematic partial cross-sectional views of modifications of the semiconductor memory cell in Example 7.
Figure 43B:
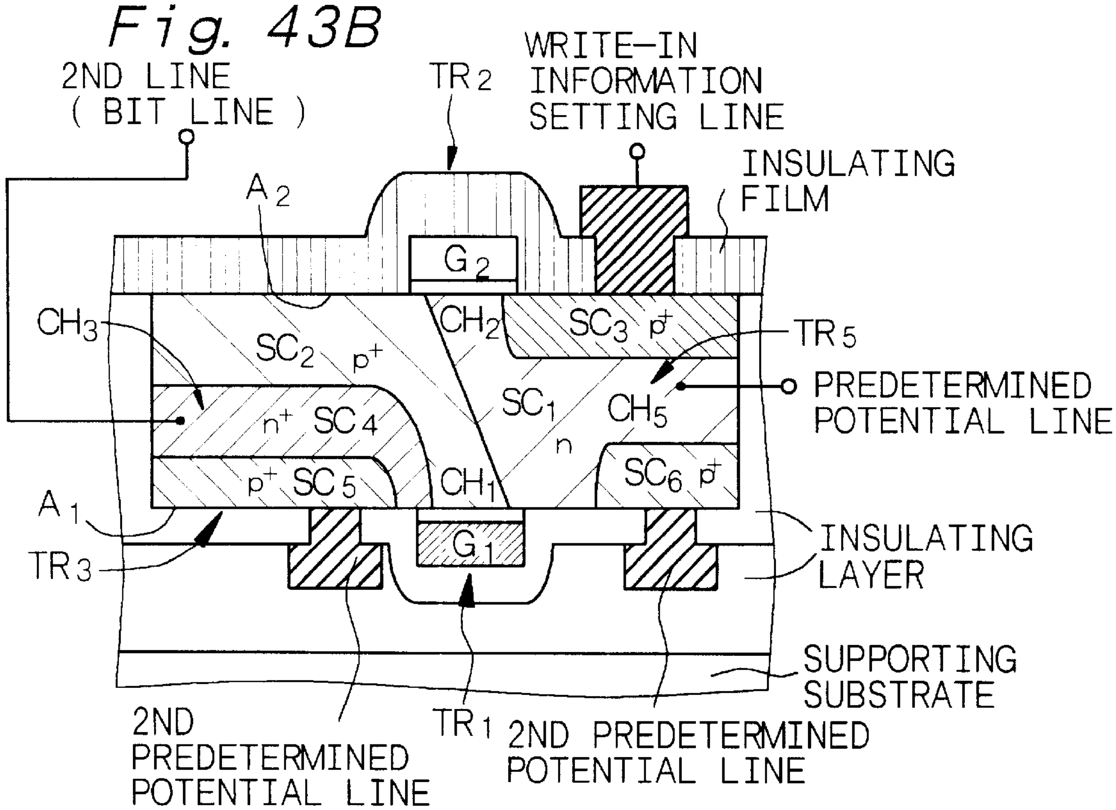

FIGS. 42B, 43A and 43B show schematic partial cross-sectional views of modifications of the semiconductor memory cell in Example 7. The semiconductor memory cell shown in FIG. 42B differs from the semiconductor memory cell shown in FIG. 42A in that the gate portion $G_1$ and the gate portion $G_2$ are almost aligned along a vertical direction. That is, when viewed from above (as a plane view), the gate portion $G_2$ and the gate portion $G_1$ are approximately overlapped. The semiconductor memory cell can be decreased in size with such a configuration. In the semiconductor memory cells shown in FIGS. 43A and 43B, the supporting substrate, the insulating layer, the gate portion $G_1$ of the first transistor $TR_1$ and the gate portion $G_2$ of the second transistor $TR_2$ are arranged in this order from the bottom. The order of each regions and the gate portions in the semiconductor memory cells shown in FIGS. 43A and 43B along a perpendicular direction is inverse to the order of each regions and the gate portions in the semiconductor memory cells shown in FIGS. 42A and 42B, respectively. The semiconductor memory cell shown in FIG. 43B differs from the semiconductor memory cell shown in FIG. 43A in that the gate portion $G_1$ and the gate portion $G_2$ are almost aligned along a vertical direction.

Figure 44:
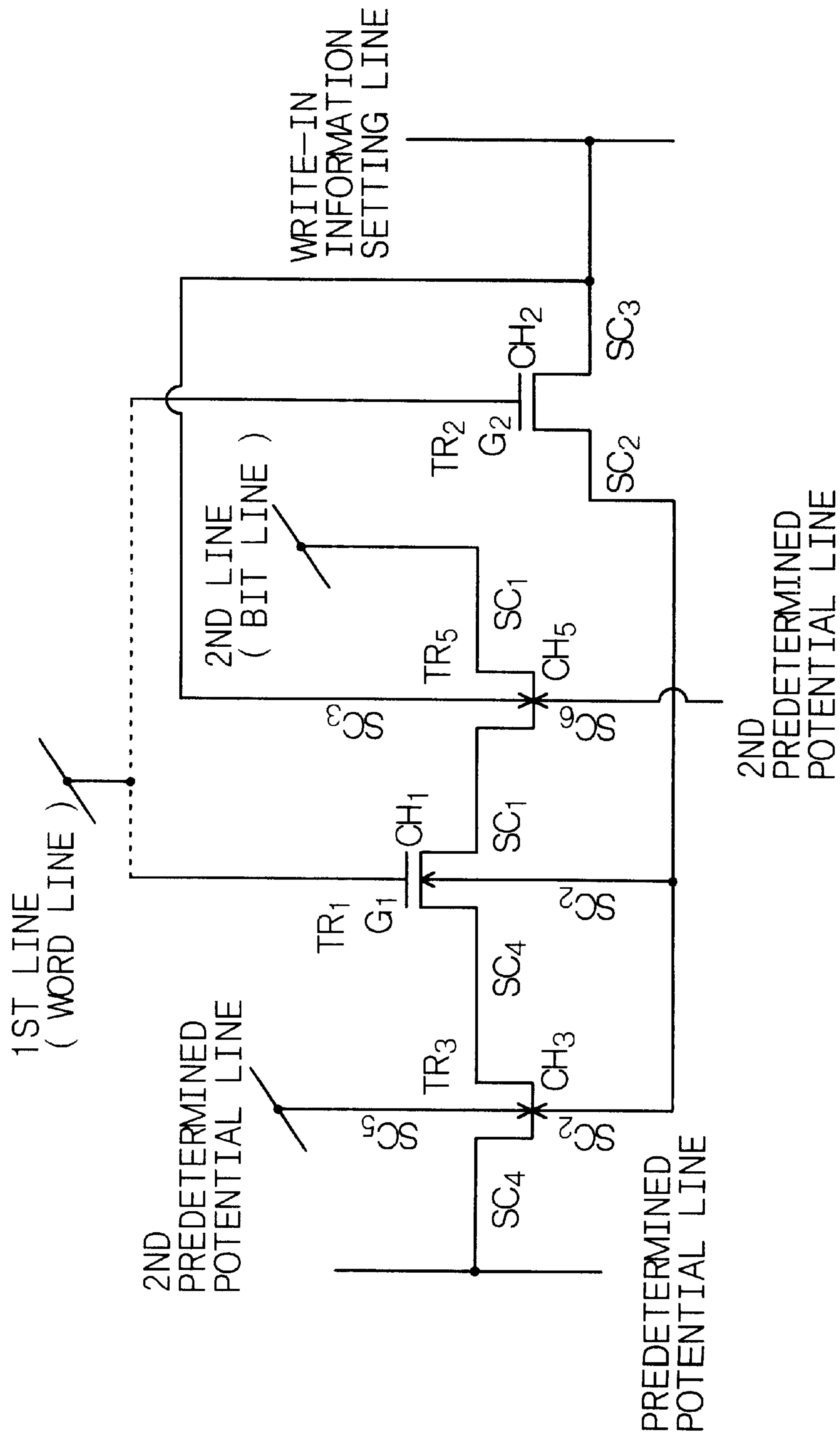
FIG. 44 is a principle drawing of a modification of the semiconductor memory cell in Example 7.
Figure 45:
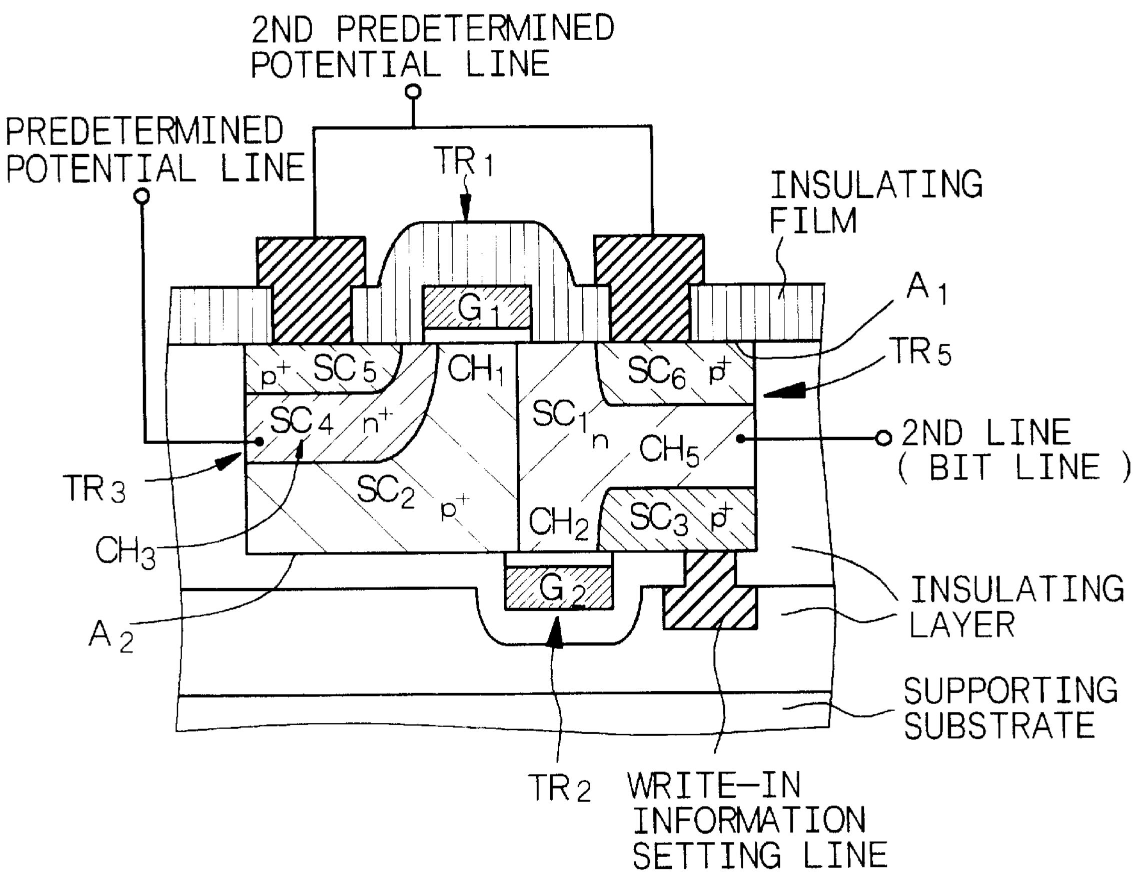
FIG. 45 is a schematic partial cross-sectional view of a modification of the semiconductor memory cell in Example 7.

Alternatively, as FIG. 44 shows a principle drawing and as FIG. 45 shows a schematic partial cross-sectional view, the semiconductor memory cell of Example 7 may have a configuration in which the other source/drain region of the first junction-field-effective transistor $TR_3$ is connected to the predetermined potential line in place of being connected to the second memory-cell-selecting line, and the other source/drain region of the second junction-field-effective transistor $TR_5$ is connected to the second memory-cell-selecting line in place of being connected to the predetermined potential line. The configuration of the semiconductor memory cell shown in FIG. 45 can be applied to the configurations of the semiconductor memory cells shown in FIGS. 42A to 43B.

Figure 46:
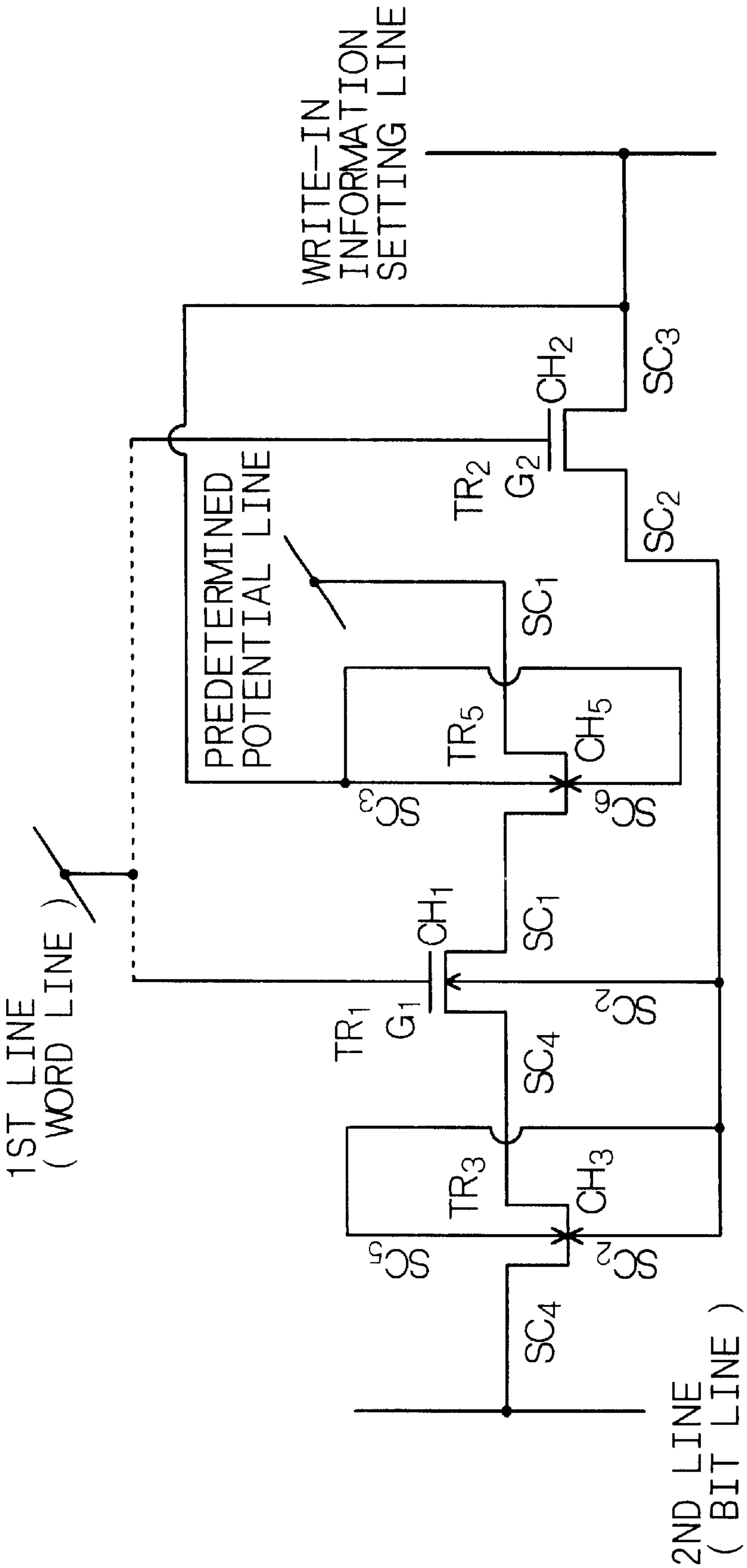
FIG. 46 is a principle drawing of a modification of the semiconductor memory cell in Example 7.
Figure 47A:
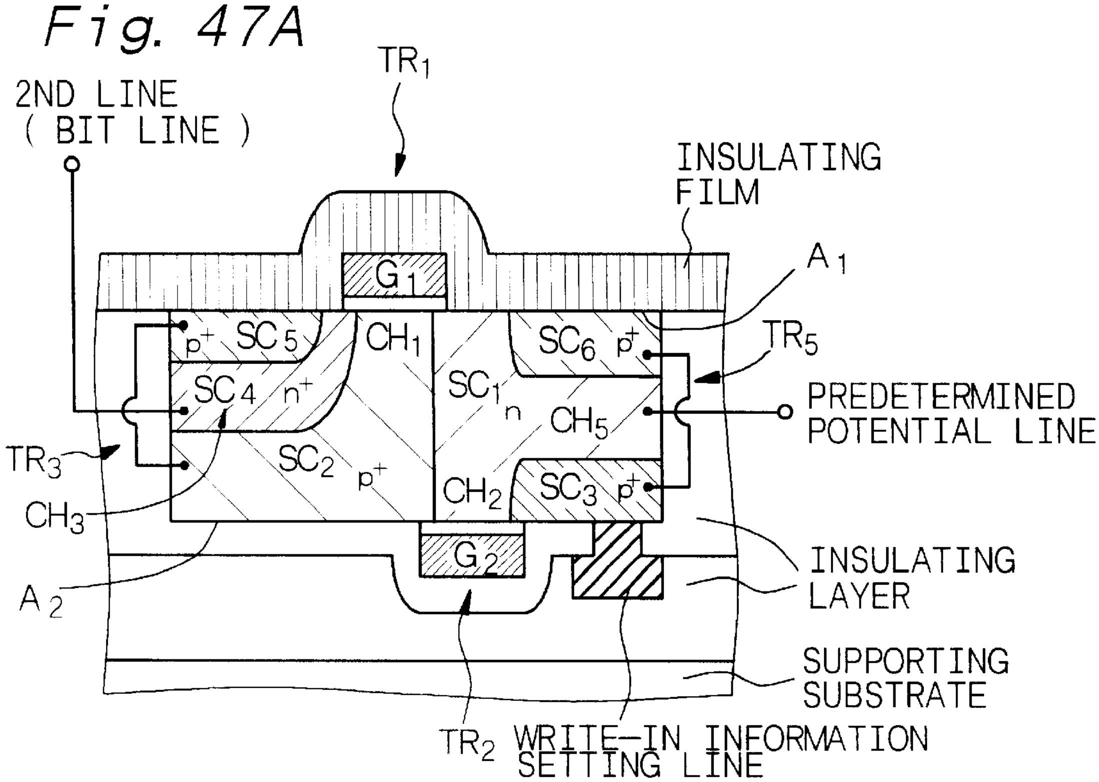
FIGS. 47A and 47B are schematic partial cross-sectional views of modifications of the semiconductor memory cell in Example 7.
Figure 47B:
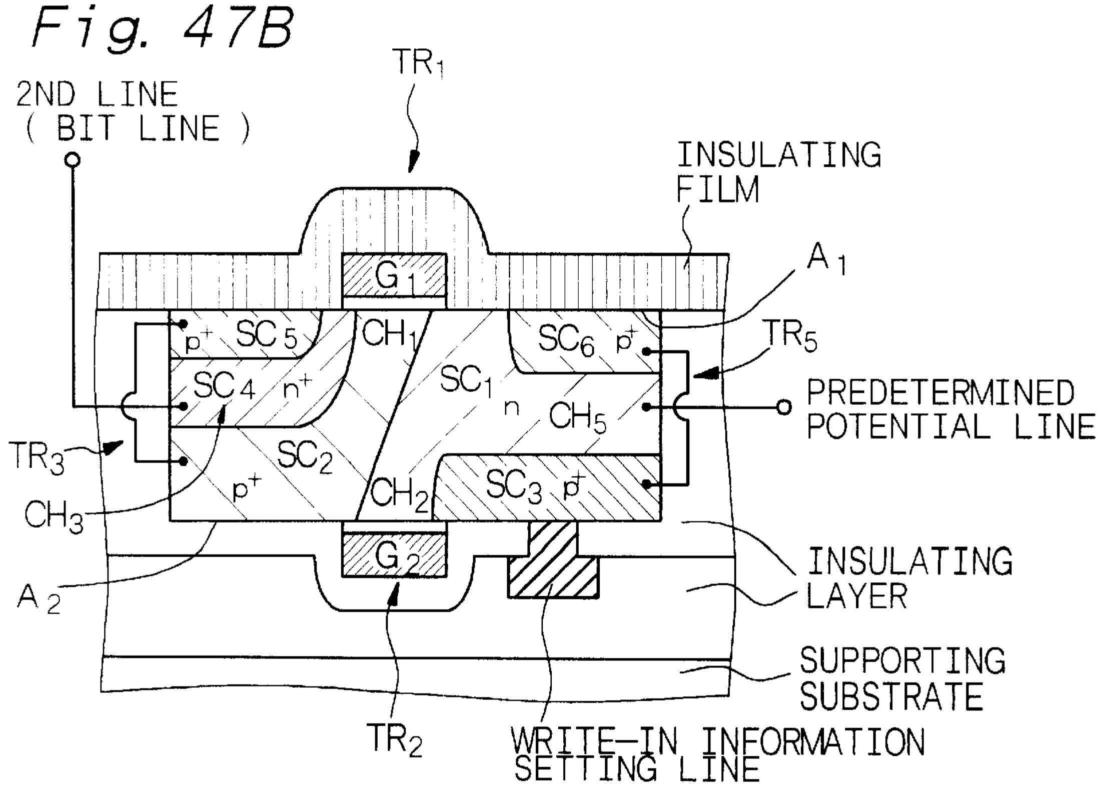
Figure 48A:
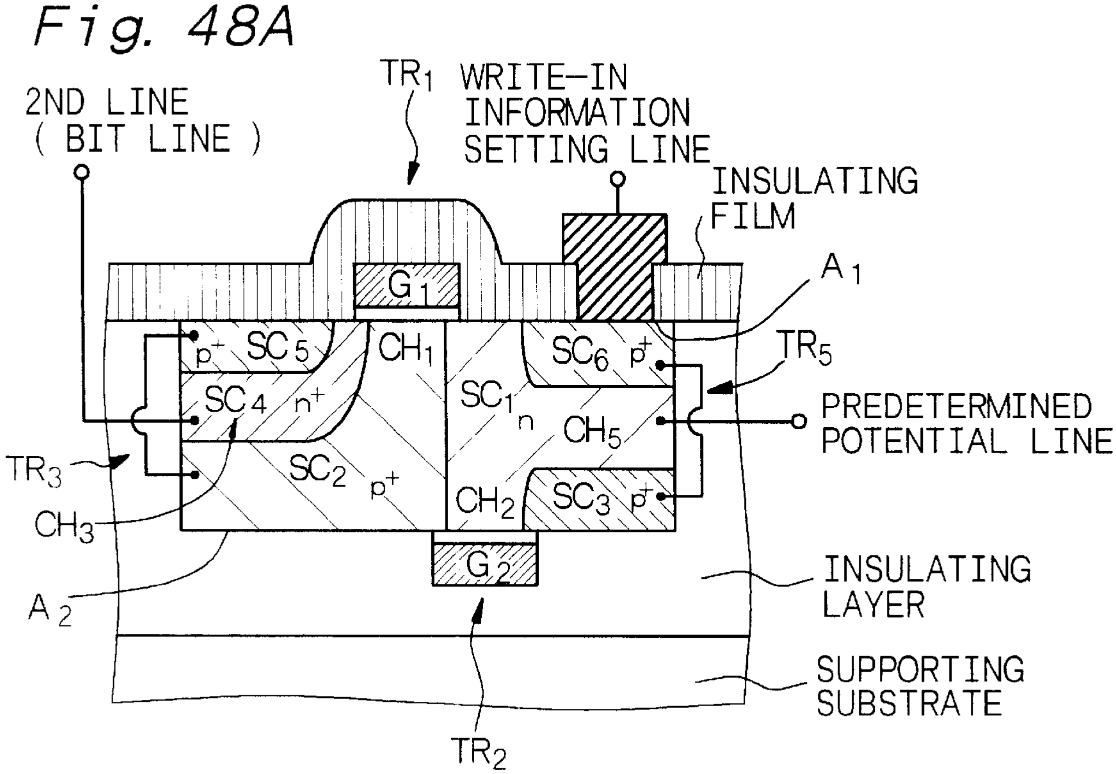
FIGS. 48A and 48B are schematic partial cross-sectional views of modifications of the semiconductor memory cell in Example 7.
Figure 48B:
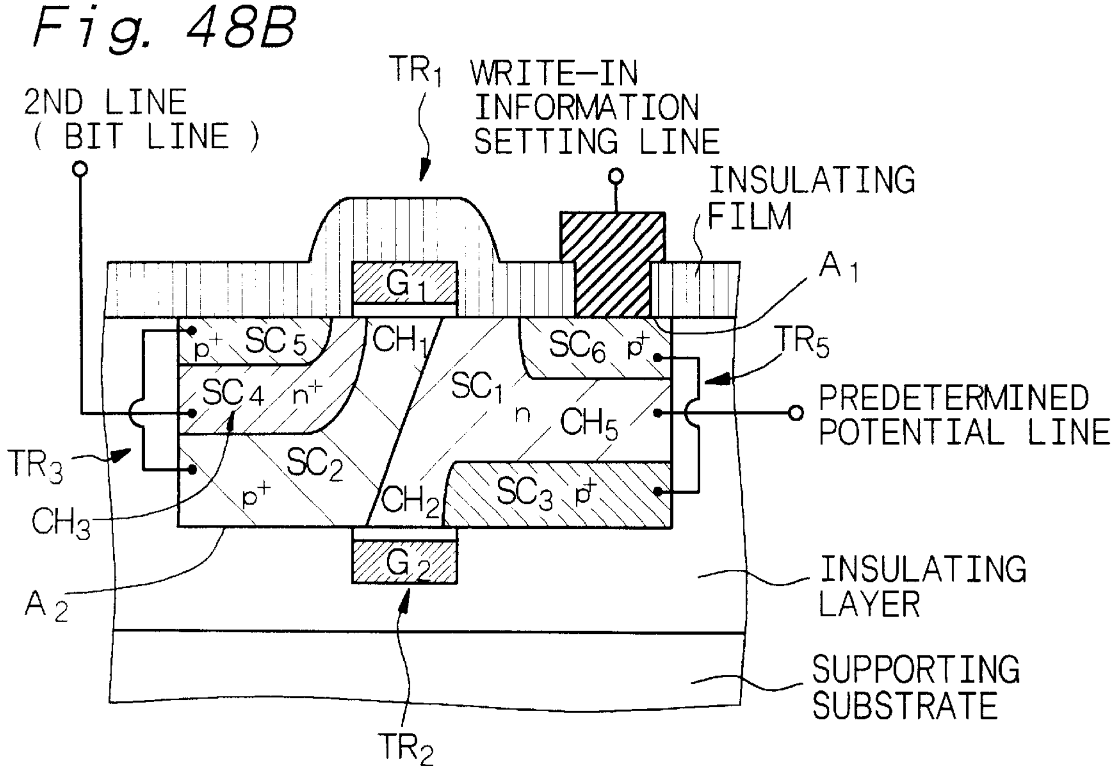
Figure 49A:
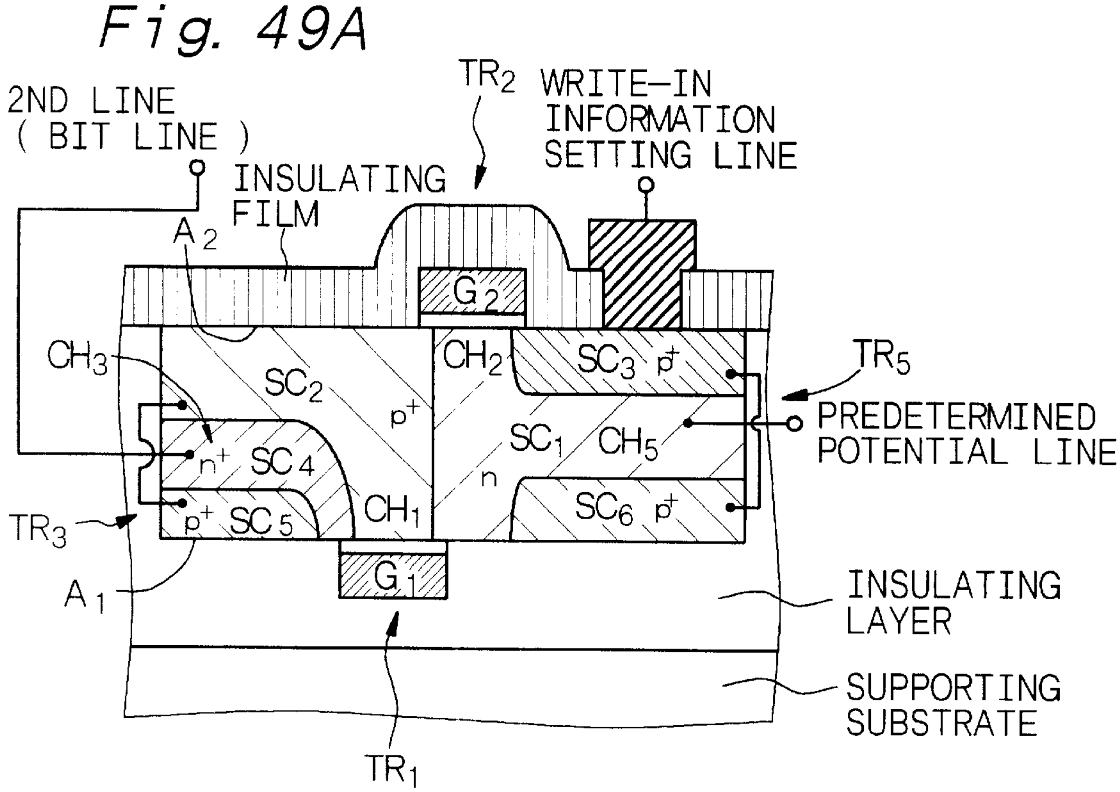
FIGS. 49A and 49B are schematic partial cross-sectional views of modifications of the semiconductor memory cell in Example 7.
Figure 49B:
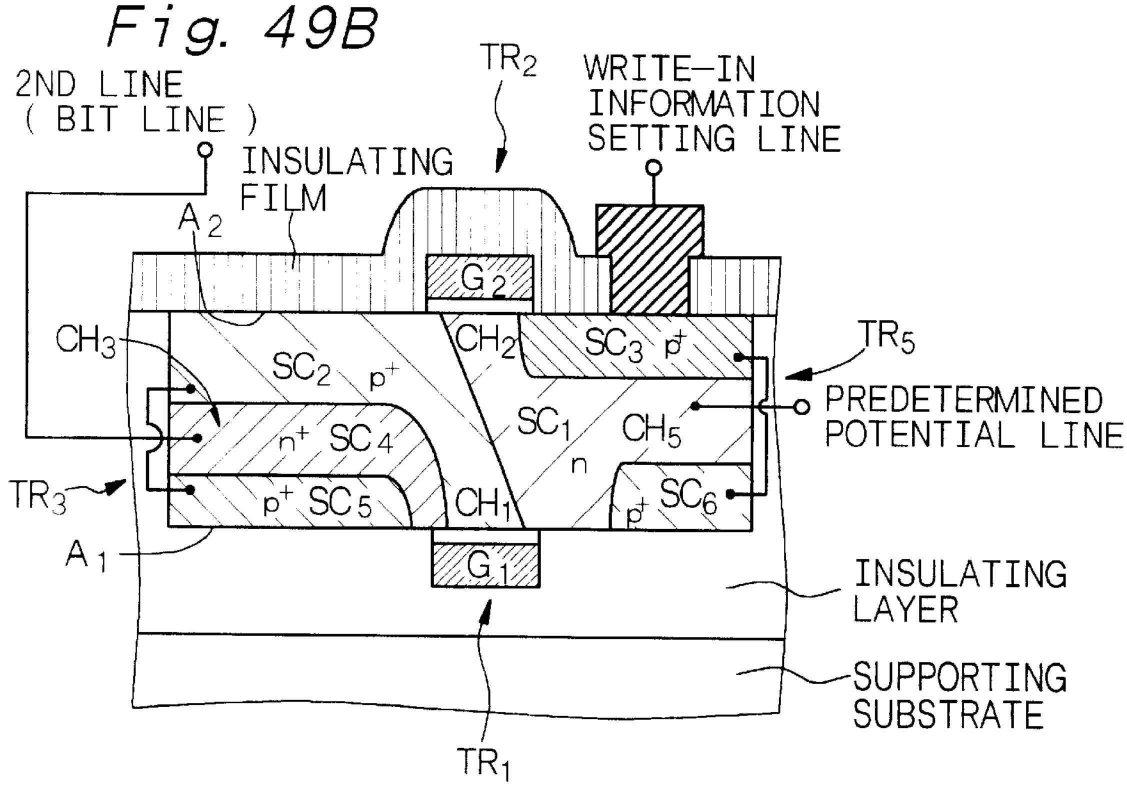
Figure 50A:
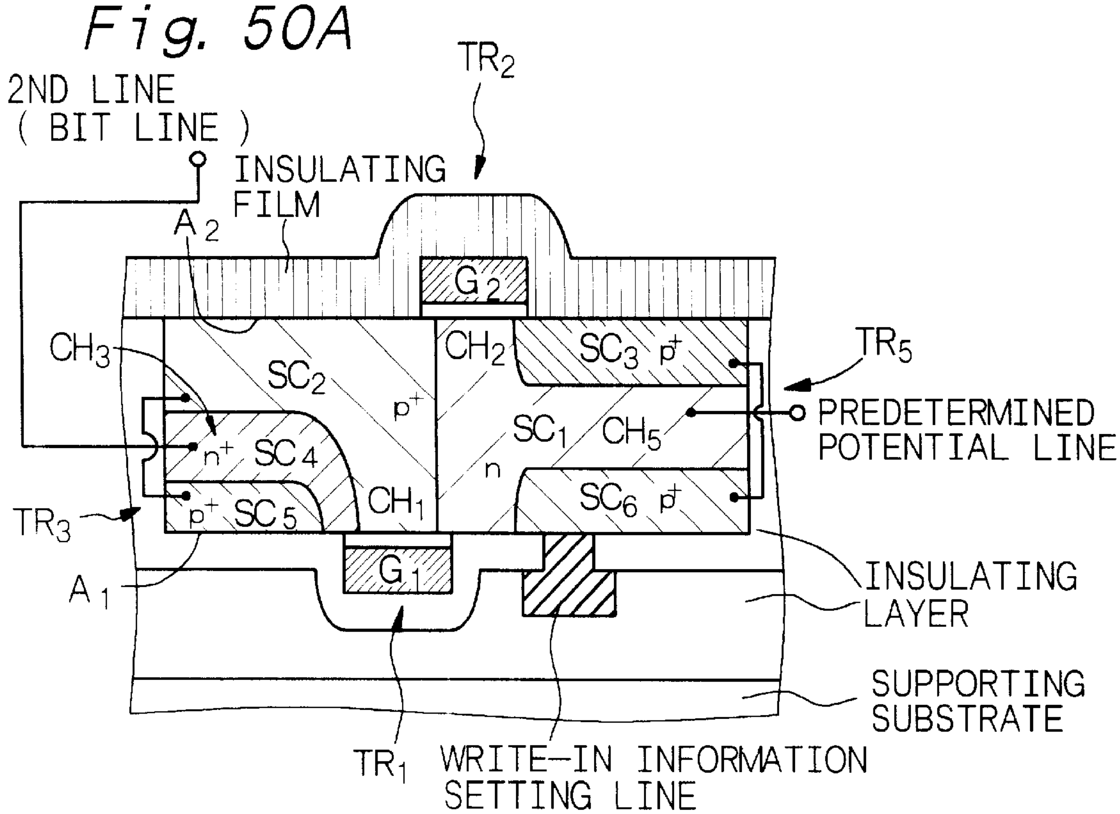
FIGS. 50A and 50B are schematic partial cross-sectional views of modifications of the semiconductor memory cell in Example 7.
Figure 50B:
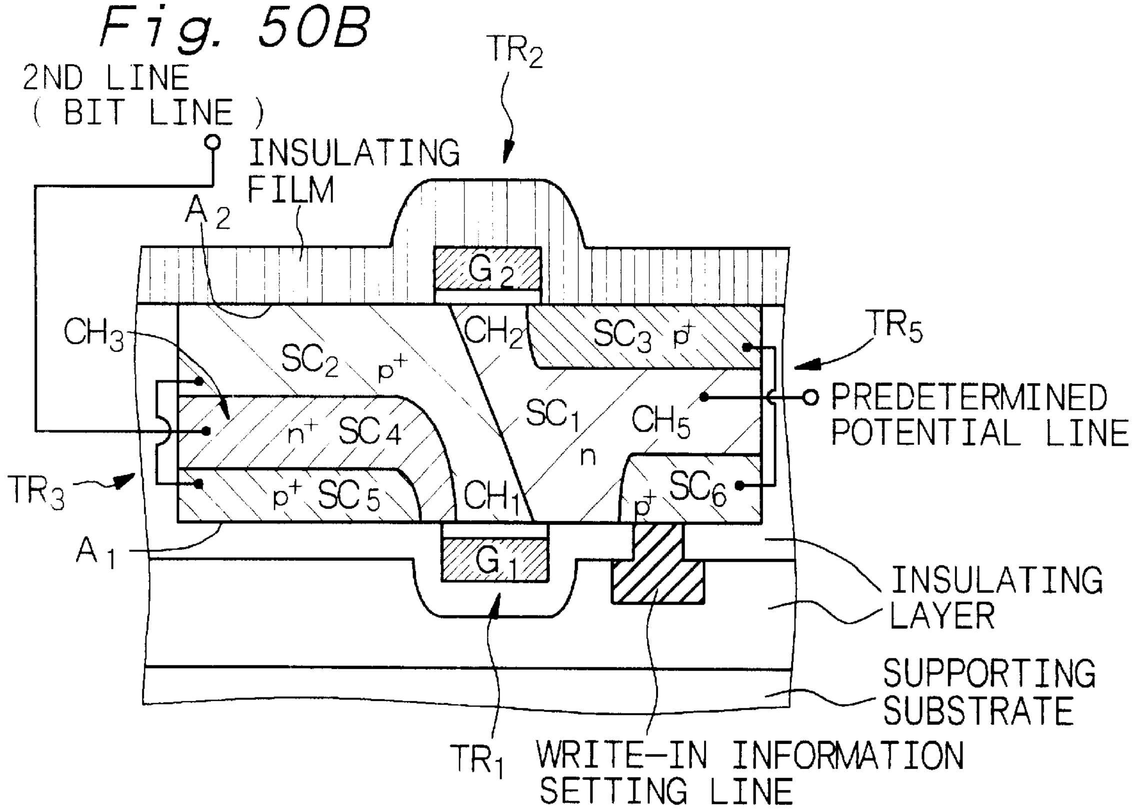

FIGS. 47A, 47B, 48A, 48B, 49A, 49B, 50A and 50B show schematic partial cross-sectional views of modifications of the semiconductor memory cell in Example 7. FIG. 46 shows a principle drawing of these semiconductor memory cells. Each of these semiconductor memory cells has a configuration in which the fifth region $SC_5$ is connected to the second region $SC_2$ in place of being connected to the second predetermined potential line and the sixth region $SC_6$ is connected to the write-in information setting line in place of being connected to the second predetermined potential line. The phrase of "being connected to the write-in information setting line" is equivalent to the phrase of "being connected to the third region $SC_3$". The fifth region $SC_5$ and the second region $SC_2$ can be connected to each other, e.g., by providing the same structure as that explained in Example 6. Further, the connection of the sixth region $SC_6$ and the write-in information setting line (the connection of the sixth region $SC_6$ and the third region $SC_3$) can be obtained, e.g., by the same manner as that explained in Example 5, that is, the manner for the connection of the fifth region $SC_5$ and the third region $SC_3$. The configurations of the semiconductor memory cells shown in FIGS. 47A, 47B, 48A and 48B are substantially the same as those of the semiconductor memory cells shown in FIGS. 42A and 42B. The configurations of the semiconductor memory cells shown in FIGS. 49A, 49B, 50A and 50B are substantially the same as those of the semiconductor memory cells shown in FIGS. 43A and 43B. Detailed explanations of the configurations of these semiconductor memory cells in Example 7 are therefore omitted. In some cases, the fifth region $SC_5$ may be connected to the second region $SC_2$ in place of being connected to the second predetermined potential line. Alternatively, the sixth region $SC_6$ may be connected to the write-in information setting line in place of being connected to the second predetermined potential line.

Figure 51:
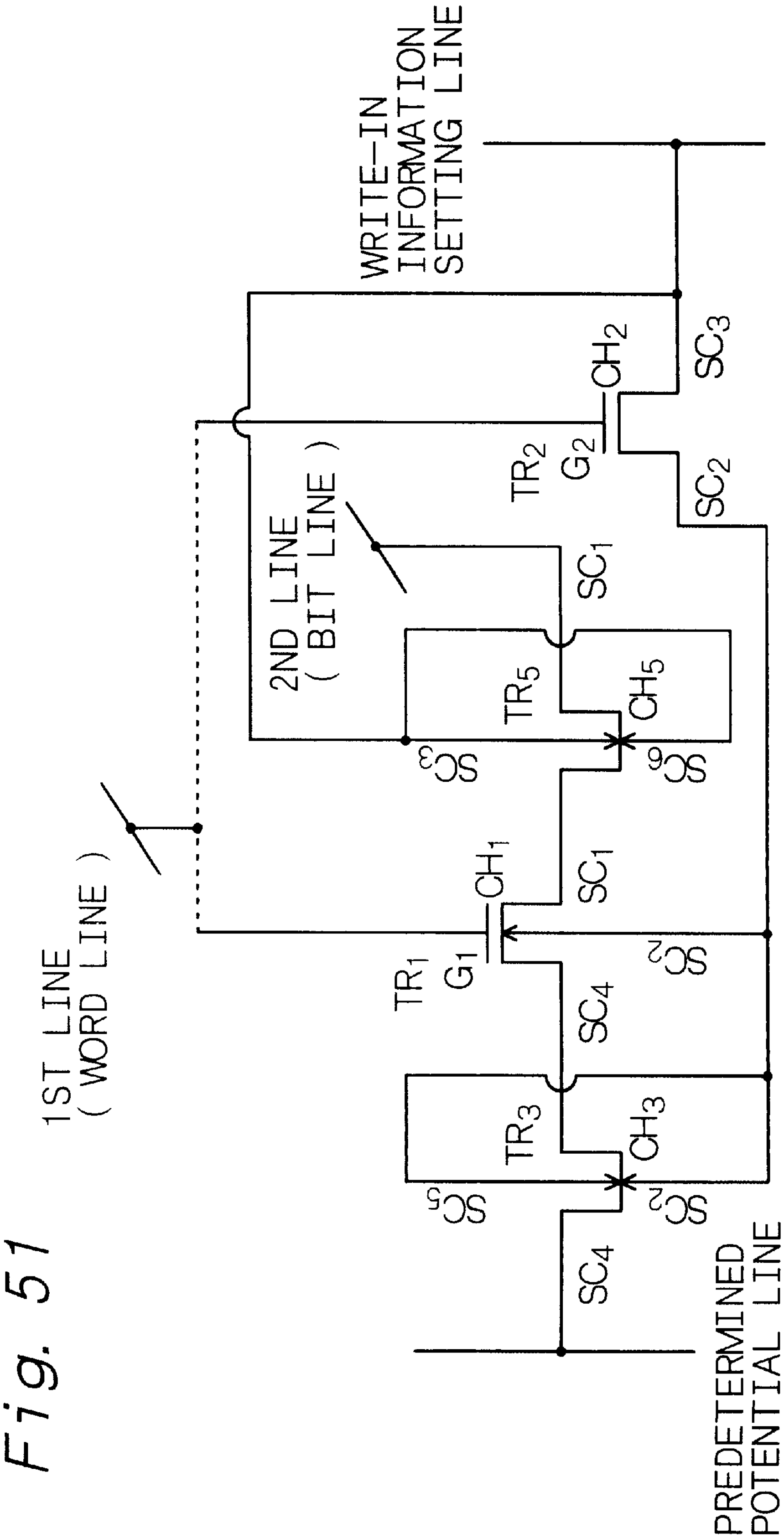
FIG. 51 is a principle drawing of a modification of the semiconductor memory cell in Example 7.
Figure 52:
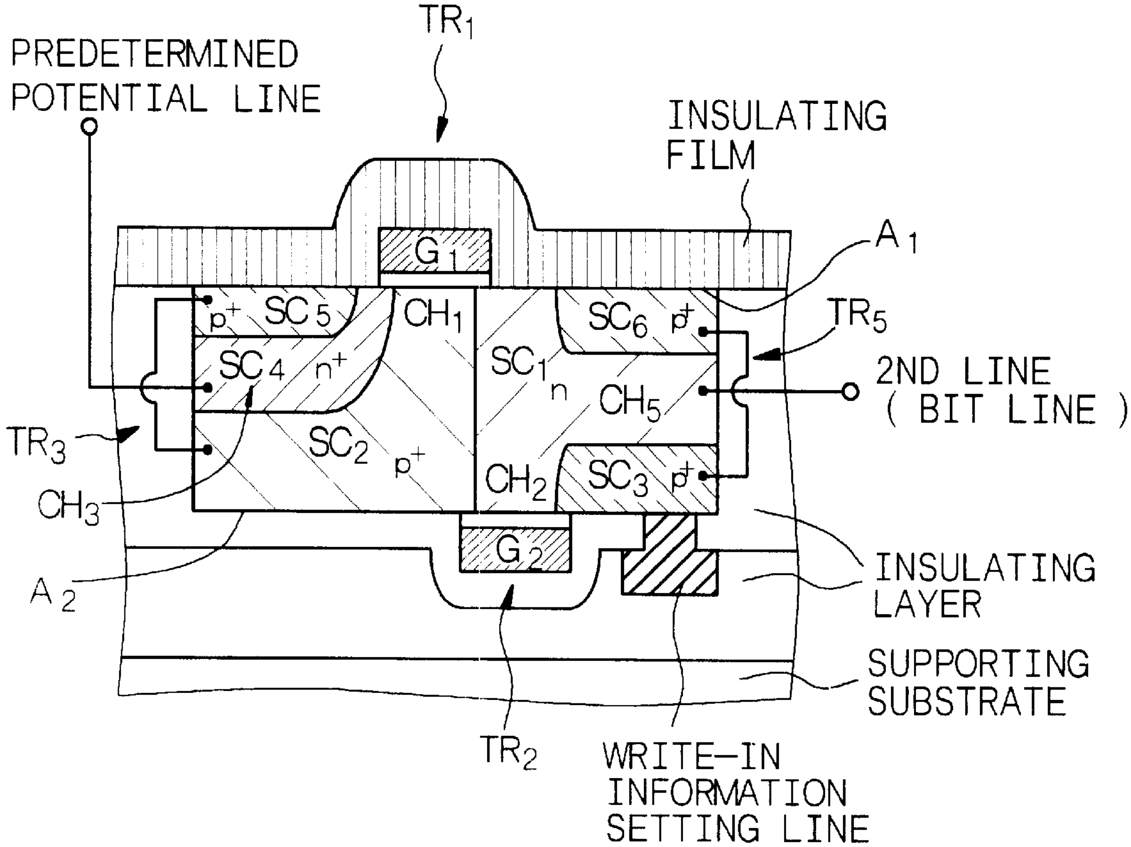
FIG. 52 is a schematic partial cross-sectional view of a modification of the semiconductor memory cell in Example 7.

FIG. 52 shows a schematic partial cross-sectional view of another modification in Example 7 and FIG. 51 shows its principle drawing. In this semiconductor memory cell, the other source/drain region of the first junction-field-effect transistor $TR_3$ is connected to the predetermined potential line in place of being connected to the second memory-cell-selecting line, and the other source/drain region of the second junction-field-effect transistor $TR_5$ is connected to the second memory-cell-selecting line in place of being connected to the predetermined potential line. The semiconductor memory cell shown in FIG. 52 substantially has the same configuration as the semiconductor memory cell shown FIG. 47A. Detailed explanations of its configuration are therefore omitted. The configuration of the semiconductor memory cell shown in FIG. 52 can be applied to the configurations of the semiconductor memory cells shown in FIGS. 47A to 50B.

The method of manufacturing the semiconductor memory cell in Example 7 can substantially be the same as the method of manufacturing the semiconductor memory cell of Example 5, except the formation of the region $SC_5$ and the region $SC_6$. Detailed explanations thereof are therefore omitted.

EXAMPLE 8

Figure 53:
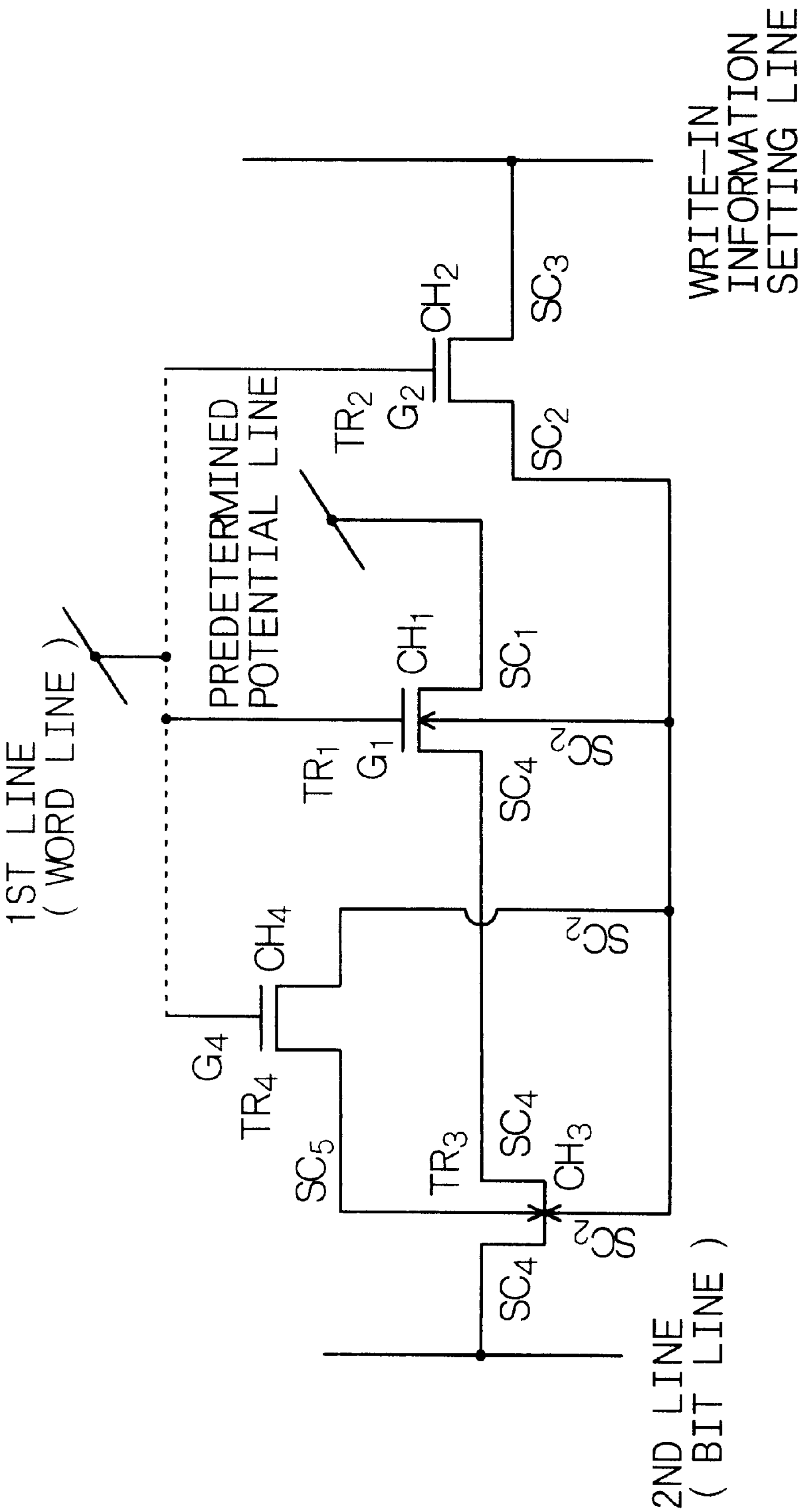
FIG. 53 is a principle drawing of the semiconductor memory cell in Example 8.
Figure 54A:
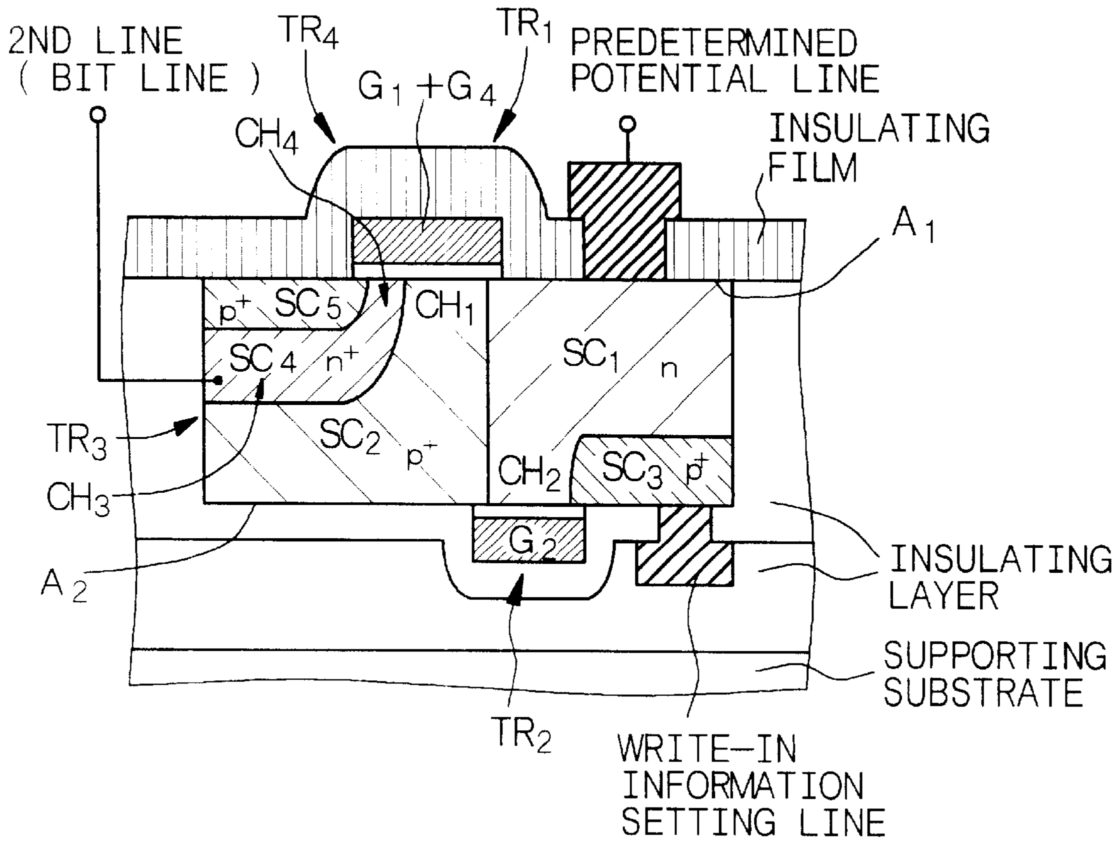
FIGS. 54A and 54B are a schematic partial cross-sectional view and a schematic arrangement of a gate portion and each regions of a semiconductor memory cell in Example 8, respectively.
Figure 54B:
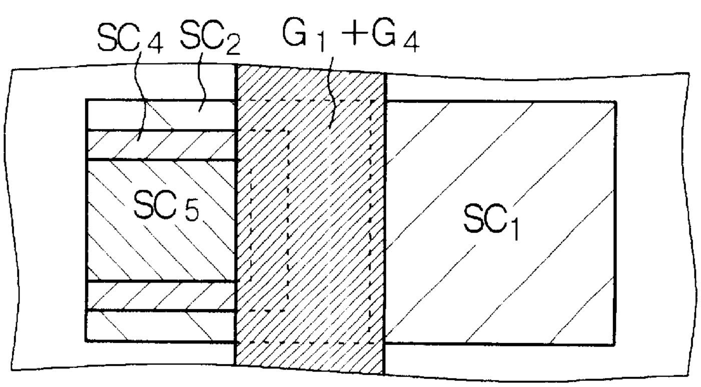

Example 8 is directed to the semiconductor memory cell according to the eighth aspect of the present invention and the method for manufacturing a semiconductor memory cell according to the third aspect of the present invention. For example, as FIG. 53 shows its principle drawing, as FIG. 54A shows its schematic partial cross-sectional view and as FIG. 54B shows a schematic of a gate portion and regions, the semiconductor memory cell of Example 8 comprises a first transistor of a first conductivity type (e.g., n-type) for read-out $TR_1$, a second transistor of a second conductivity type (e.g., p-type) for write-in $TR_2$, a junction-field-effect transistor of a first conductivity type (e.g., n-type) for current control $TR_3$ and a third transistor of the second conductivity type (e.g., p-type) for write-in $TR_4$. That is, the semiconductor memory cell of Example 8 has a configuration in which the third transistor of the second conductivity type for write-in $TR_4$ is added into the semiconductor memory cell similar to the semiconductor memory cell of Example 6 according to the sixth aspect of the present invention. The gate portion $G_2$ and the third region $SC_3$ are omitted in FIG. 54B.

In the semiconductor memory cell shown in FIG. 54A, a common gate portion with the first transistor $TR_1$ and the third transistor $TR_4$ (to be referred to as "common gate portion $G_1$+$G_4$", hereinafter) and the gate portion $G_2$ are slightly off-aligned along a vertical direction. The semiconductor memory cell is formed in a semi-conductive layer surrounded with an insulating layer formed on a supporting substrate and has a so-called SOI structure. In the semiconductor memory cell of Example 8 shown in FIG. 54A, the supporting substrate, the insulating layer, the gate portion $G_2$ and the common gate portion ($G_1$+$G_4$) are arranged in this order from the bottom.

The semiconductor memory cell of Example 8 has the same configuration of the first region $SC_1$, the second region $SC_2$, the third region $SC_3$, the fourth region $SC_4$ and the fifth region $SC_5$ as the semiconductor memory cell of Example 6.

Further, the semiconductor memory cell of Example 8 has the same configurations of the first transistor $TR_1$, the second transistor $TR_2$ and the junction-field-effect transistor $TR_3$ as the semiconductor memory cell of Example 6. The semiconductor memory cell of Example 8 differs from the semiconductor memory cell of Example 6 in that the gate portion $(G_1+G_4)$ shared by the first transistor $TR_1$ and the third transistor $TR_4$ is formed on a barrier layer formed on the first main surface $A_1$ so as to bridge the first region $SC_2$ and the fourth region $SC_4$ and so as to bridge the second region $SC_2$ and the fifth region $SC_5$. That is, the semiconductor memory cell of Example 8 has a configuration in which the common gate portion $(G_1+G_4)$ extends to the end portion of the region $SC_4$ and the fifth region $SC_5$ is formed by a self-aligned manner.

Concerning the third transistor $TR_4$;

(D-1) one source/drain region is constituted of the channel forming region $CH_1$ of the first transistor $TR_1$, (D-2) the other source/drain region is constituted of the fifth region $SC_5$, and (D-3) a channel forming region $CH_4$ is constituted of the other source/drain region of the first transistor $TR_1$.

The junction-field-effect transistor $TR_3$ in the semiconductor memory cell of Example 8 can be formed by (X) optimizing the distance (thickness of the channel region $CH_3$) between the facing gate regions (the fifth region $SC_5$ and the portion of the second region $SC_2$ facing the fifth region $SC_5$) of the junction-field-effect transistor $TR_3$, and (Y) optimizing impurity concentrations of the facing gate regions (the fifth region $SC_5$ and the portion of the second region $SC_2$ facing the fifth region $SC_5$) and the channel region $CH_3$ (specifically, the region $SC_4$) of the junction-field-effect transistor $TR_3$.

In the semiconductor memory cell of Example 8, the common gate portion $(G_1+G_4)$ shared by the first transistor $TR_1$ and the third transistor $TR_4$ and the gate portion $G_2$ of the second transistor $TR_2$ are connected to a first memory-cell-selecting line (for example, a word line); the third region $SC_3$ is connected to a write-in information setting line; the first region $SC_1$ is connected to a predetermined potential line; and the other source/drain region of the junction-field-effect transistor $TR_3$ is connected to a second memory-cell-selecting line (for example, a bit line).

Figure 55:
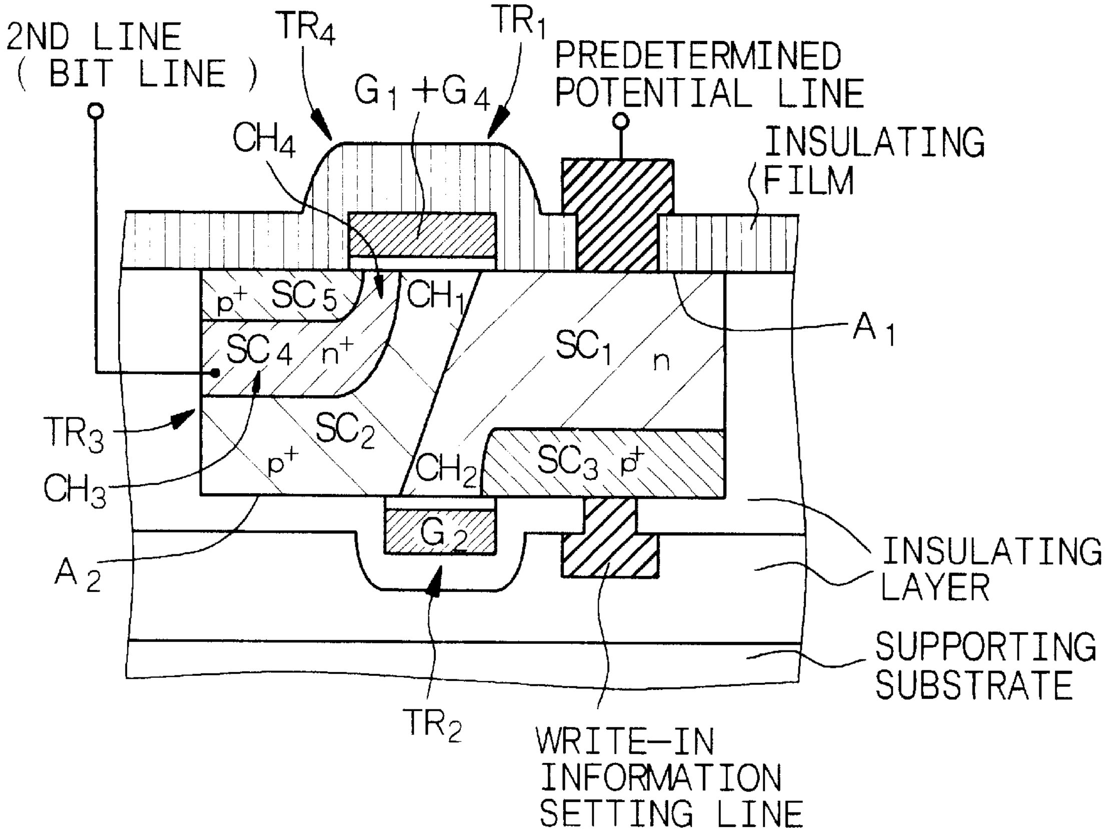
FIG. 55 is a schematic partial cross-sectional view of a modification of the semiconductor memory cell in Example 8.
Figure 56A:
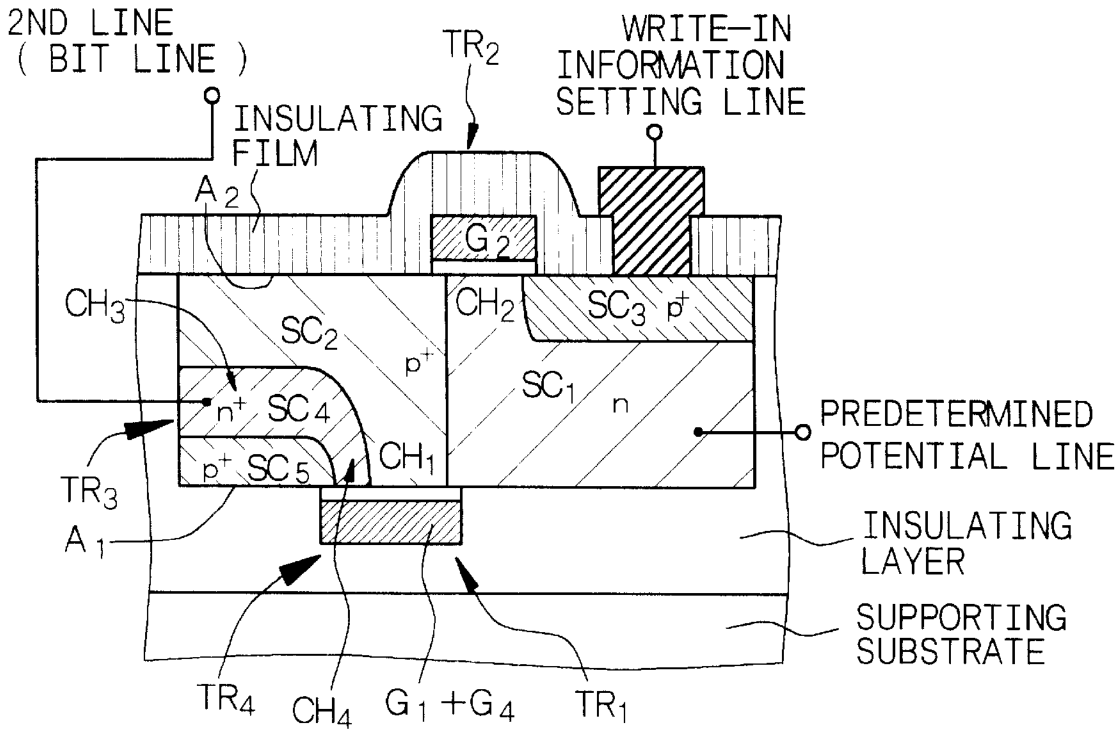
FIGS. 56A and 56B are schematic partial cross-sectional views of modifications of the semiconductor memory cell in Example 8.
Figure 56B:
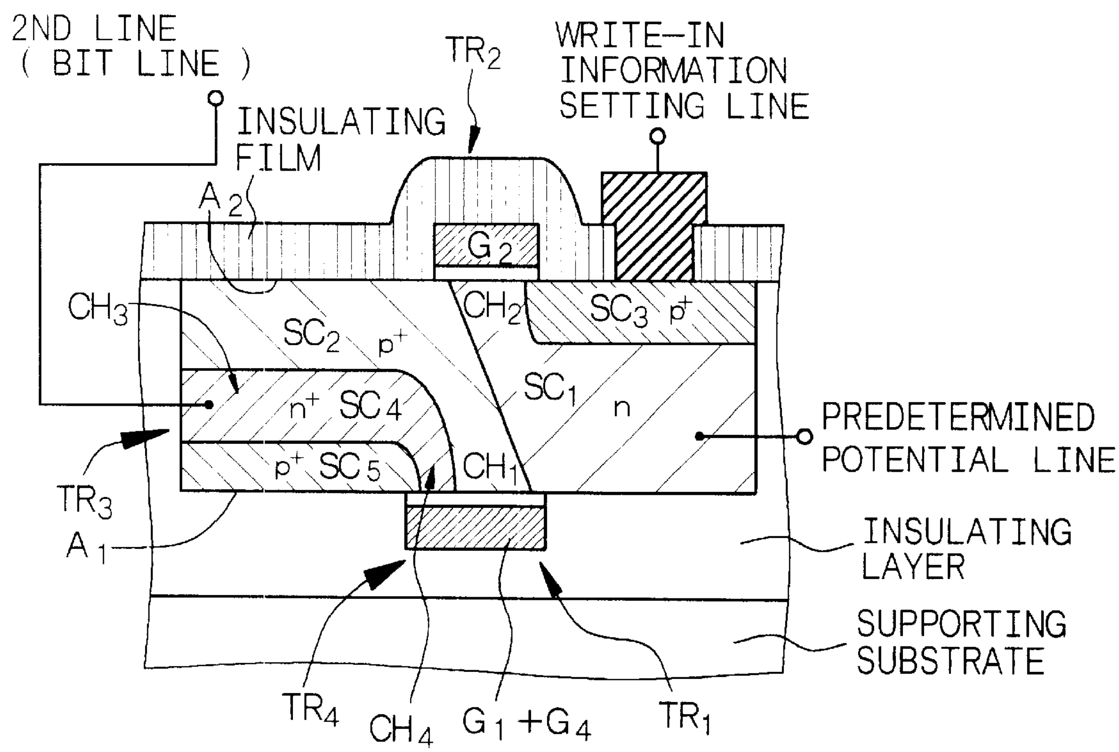

FIGS. 55, 56A and 56B show schematic partial cross-sectional views of modifications of the semiconductor memory cell in Example 8. The semiconductor memory cell shown in FIG. 55 differs from the semiconductor memory cell shown in FIG. 54A in that the common gate portion $(G_1+G_4)$ and the gate portion $G_2$ are almost aligned along a vertical direction. That is, when viewed from above (as a plane view), the common gate portion $(G_1+G_4)$ and the gate portion $G_2$ are approximately overlapped. The semiconductor memory cell can be decreased in size with such a configuration. In the semiconductor memory cells shown in FIGS. 56A and 56B, the supporting substrate, the insulating layer, the common gate portion $(G_1+G_4)$ and the gate portion $G_2$ are arranged in this order from the bottom. The order of each regions and the gate portions in the semiconductor memory cells shown in FIGS. 56A and 56B along a perpendicular direction is inverse to the order of each regions and the gate portions in the semiconductor memory cells shown in FIGS. 54A and 55, respectively. The semiconductor memory cell shown in FIG. 56B differs from the semiconductor memory cell shown in FIG. 56A in that the common gate portion $(G_1+G_4)$ and the gate portion $G_2$ are almost aligned along a vertical direction.

Figure 57:
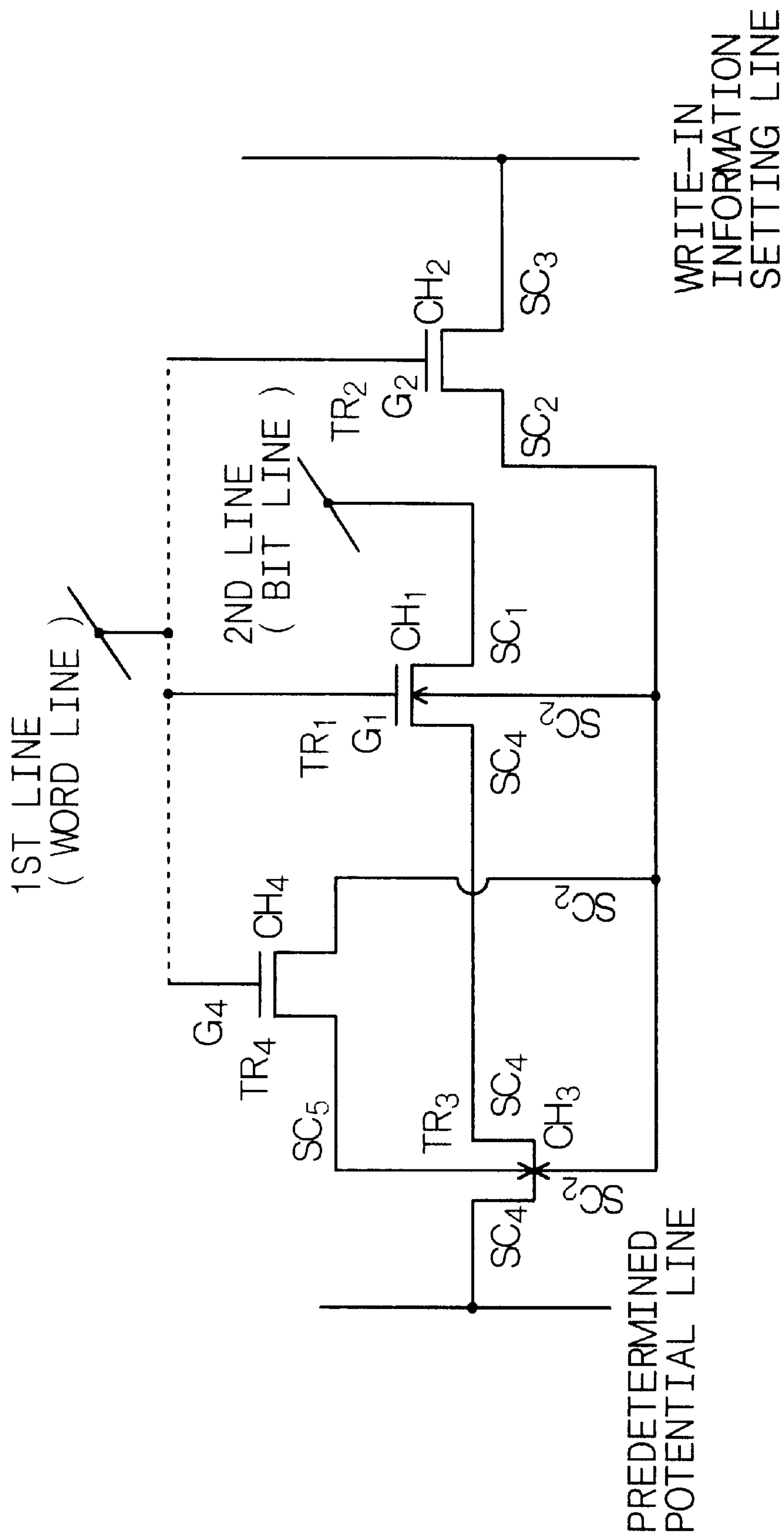
FIG. 57 is a principle drawing of a modification of the semiconductor memory cell in Example 8.
Figure 58:
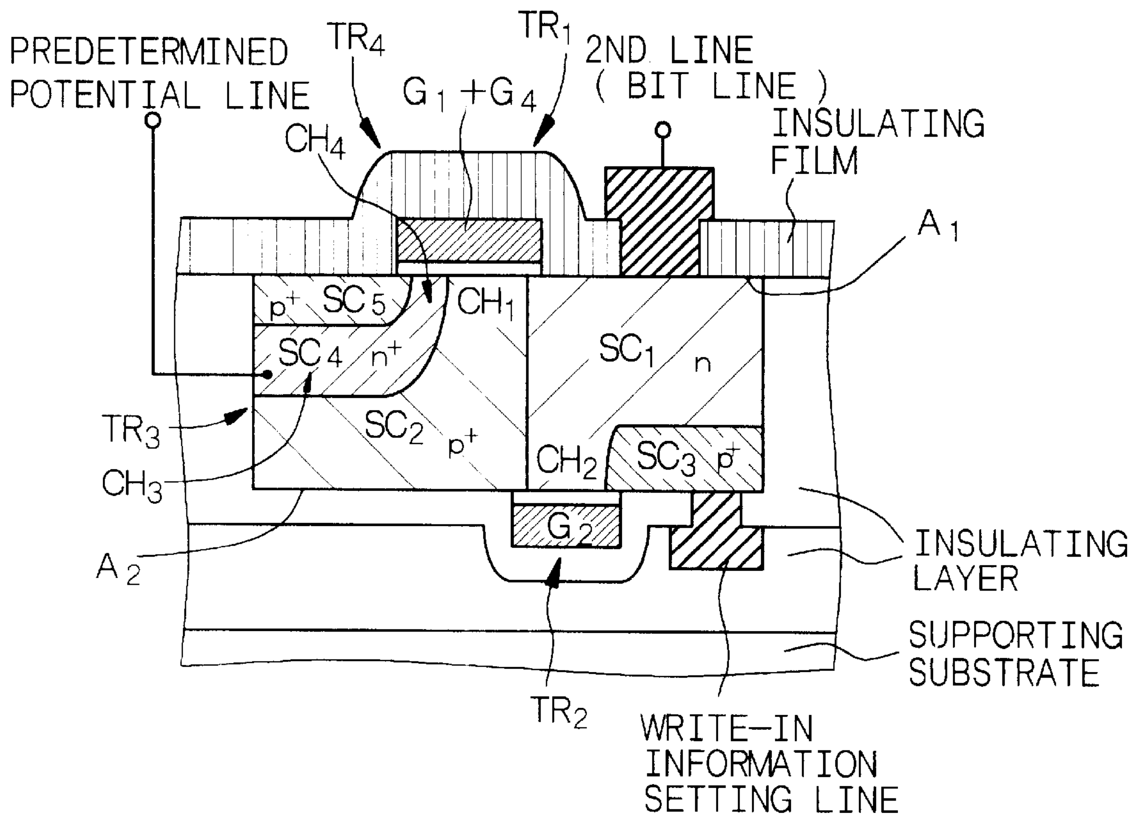
FIG. 58 is a schematic partial cross-sectional view of a modification of the semiconductor memory cell in Example 8.

As FIG. 57 shows a principle drawing and as FIG. 58 shows a schematic partial cross-sectional view, the semiconductor memory cell in Example 8 may have a configuration in which the other source/drain region of the junction-field-effect transistor $TR_3$ is connected to the predetermined potential line in place of being connected to the second memory-cell-selecting line and the first region $SC_1$ is connected to the second memory-cell-selecting line in place of being connected to the predetermined potential line. The configuration of the semiconductor memory cells shown in FIG. 58 can be applied to the semiconductor memory cells shown in FIGS. 54A to 56B.

The method of manufacturing the semiconductor memory cell in Example 8 can substantially be the same as the method of manufacturing the semiconductor memory cell of Example 5, except the formation of the common gate portion $(G_1+G_4)$ and the formation of the fifth region $SC_5$. Detailed explanations thereof are therefore omitted.

EXAMPLE 9

Figure 59:
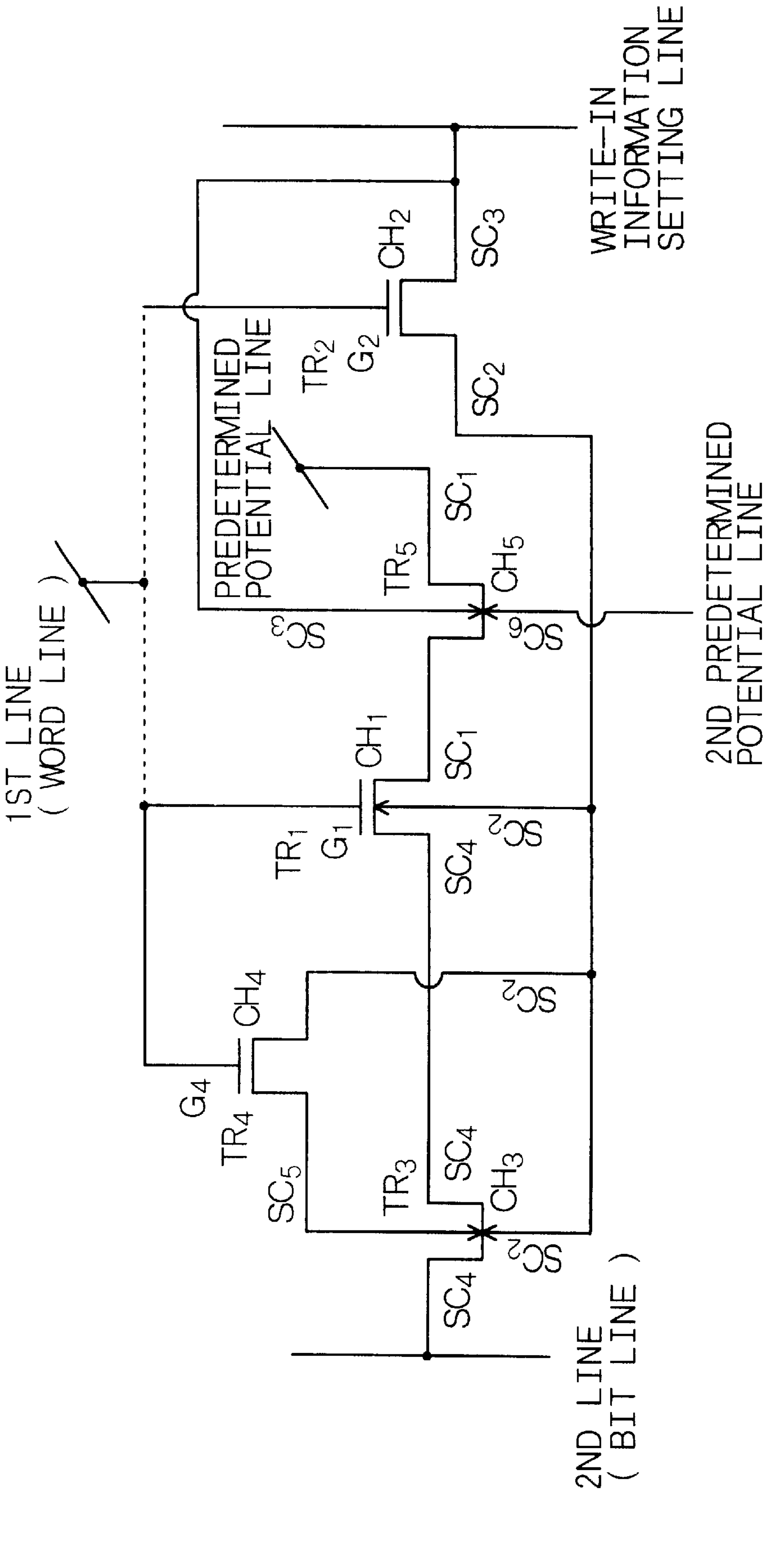
FIG. 59 is a principle drawing of the semiconductor memory cell in Example 9.
Figure 60A:
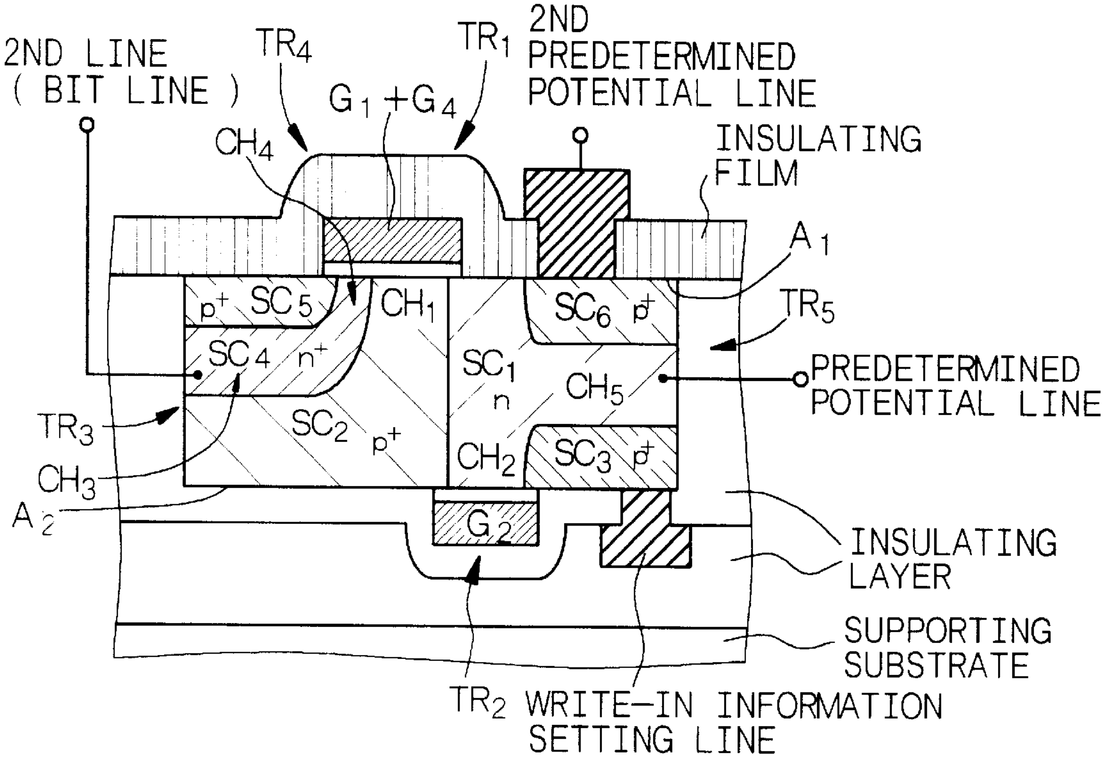
FIGS. 60A and 60B are schematic partial cross-sectional views of the semiconductor memory cells in Example 9.

Example 9 is directed to the semiconductor memory cell according to the ninth aspect of the present invention and the method for manufacturing a semiconductor memory cell according to the third aspect of the present invention. For example, as FIG. 59 shows its principle drawing and as FIG. 60A shows its schematic partial cross-sectional view, the semiconductor memory cell of Example 9 comprises a first transistor of a first conductivity type (e.g., n-type) for read-out $TR_1$, a second transistor of a second conductivity type (e.g., p-type) for write-in $TR_2$, a first junction-field-effect transistor of a first conductivity type (e.g., n-type) for current control $TR_3$, a second junction-field-effect transistor of a first conductivity type (e.g., n-type) for current control $TR_5$ and a third transistor of the second conductivity type (e.g., p-type) for write-in $TR_4$. The semiconductor memory cell of Example 9 has a configuration in which the configuration of the semiconductor memory cell according to the seventh aspect of the present invention is combined with the configuration of the semiconductor memory cell according to the eighth aspect of the present invention. That is, the semiconductor memory cell of Example 9 has a configuration in which a sixth semi-conductive or conductive region $SC_6$ is formed and the second junction-field-effect transistor of a first conductivity type for current control $TR_5$ and the third transistor of the second conductivity type for write-in $TR_4$ are added into the semiconductor memory cell according to the sixth aspect of the present invention.

In the semiconductor memory cell of Example 9 shown in FIG. 60A, the common gate portion $(G_1+G_4)$ and the gate portion $G_2$ are slightly off-aligned along a vertical direction. Further, the semiconductor memory cell is formed in a semi-conductive layer surrounded with an insulating layer formed on a supporting substrate and has a so-called SOI structure. In the semiconductor memory cell of Example 9 shown in FIG. 60A, the supporting substrate, the insulating layer, the gate portion $G_2$ and the common gate portion $(G_1+G_4)$ are arranged in this order from the bottom.

The semiconductor memory cell of Example 9 has the same configuration of the first region $SC_1$, the second region $SC_2$, the third region $SC_3$, the fourth region $SC_4$, the fifth region $SC_5$ and the sixth region $SC_6$ as the semiconductor memory cell of Example 7.

Further, the semiconductor memory cell of Example 9 has the same configurations of the first transistor $TR_1$, the second transistor $TR_2$, the first junction-field-effect transistor $TR_3$ and the second junction-field-effect transistor $TR_5$ as the semiconductor memory cell of Example 7. The semiconductor memory cell of Example 9 differs from the semiconductor memory cell of Example 7 in that the common gate portion ($G_1$+$G_4$) shared by the first transistor $TR_1$ and the third transistor $TR_4$ is formed on a barrier layer formed on the first main surface $A_1$ so as to bridge the first region $SC_1$ and the fourth region $SC_4$ and so as to bridge the second region $SC_2$ and the fifth region $SC_5$ and in that the fifth region $SC_5$ is not connected to the second predetermined potential line.

Concerning the third transistor $TR_4$, as well as the semiconductor memory cell of Example 8;

(E-1) one source/drain region is constituted of the channel forming region $CH_1$ of the first transistor $TR_1$, (E-2) the other source/drain region is constituted of the fifth region $SC_5$, and (E-3) a channel forming region $CH_4$ is constituted of the other source/drain region of the first transistor $TR_1$.

The junction-field-effect transistors $TR_3$ and $TR_5$ in the semiconductor memory cell of Example 9 can be formed by (X) optimizing the distance (thickness of the channel regions $CH_3$ and $CH_5$) between the facing gate regions (the fifth region $SC_5$ and the portion of the second region $SC_2$ facing the fifth region $SC_5$, and, the sixth region $SC_6$ and the third region $SC_3$) of the junction-field-effect transistors $TR_3$ and $TR_1$, and (Y) optimizing impurity concentrations of the facing gate regions (the fifth region $SC_5$ and the portion of the second region $SC_2$ facing the fifth region $SC_5$, and, the sixth region $SC_6$ and the third region $SC_3$) and the channel regions $CH_3$ and $CH_5$ (specifically, the fourth region $SC_4$ and the first region $SC_1$) of the junction-field-effect transistors $TR_3$ and $TR_5$.

In the semiconductor memory cell of Example 9, the common gate portion ($G_1$+$G_4$) shared by the first transistor $TR_1$ and the third transistor $TR_4$ and the gate portion $G_2$ of the second transistor $TR_2$ are connected to a first memory-cell-selecting line (for example, a word line); the third region $SC_3$ is connected to a write-in information setting line; the other source/drain region of the second junction-field-effect transistor $TR_5$ is connected to a predetermined potential line; the other source/drain region of the first junction-field-effect transistor $TR_3$ is connected to a second memory-cell-selecting line (for example, a bit line); and the sixth region $SC_6$ is connected to a second predetermined potential line.

Figure 60B:
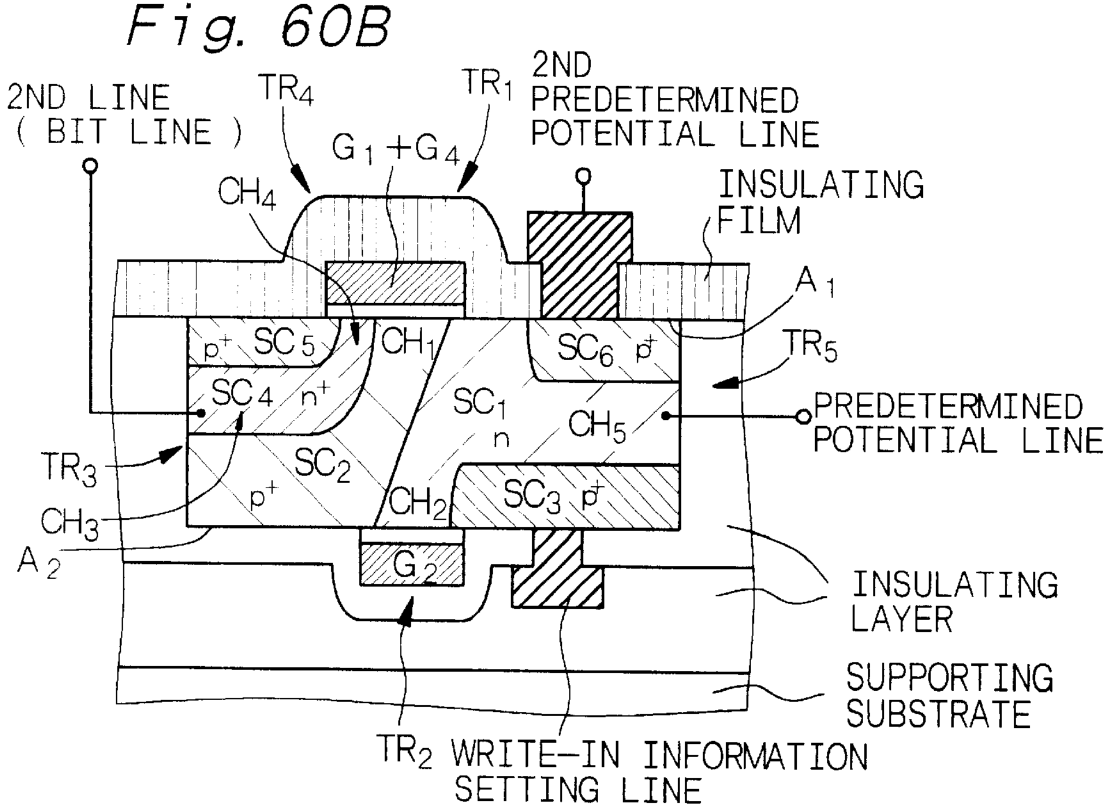
Figure 61A:
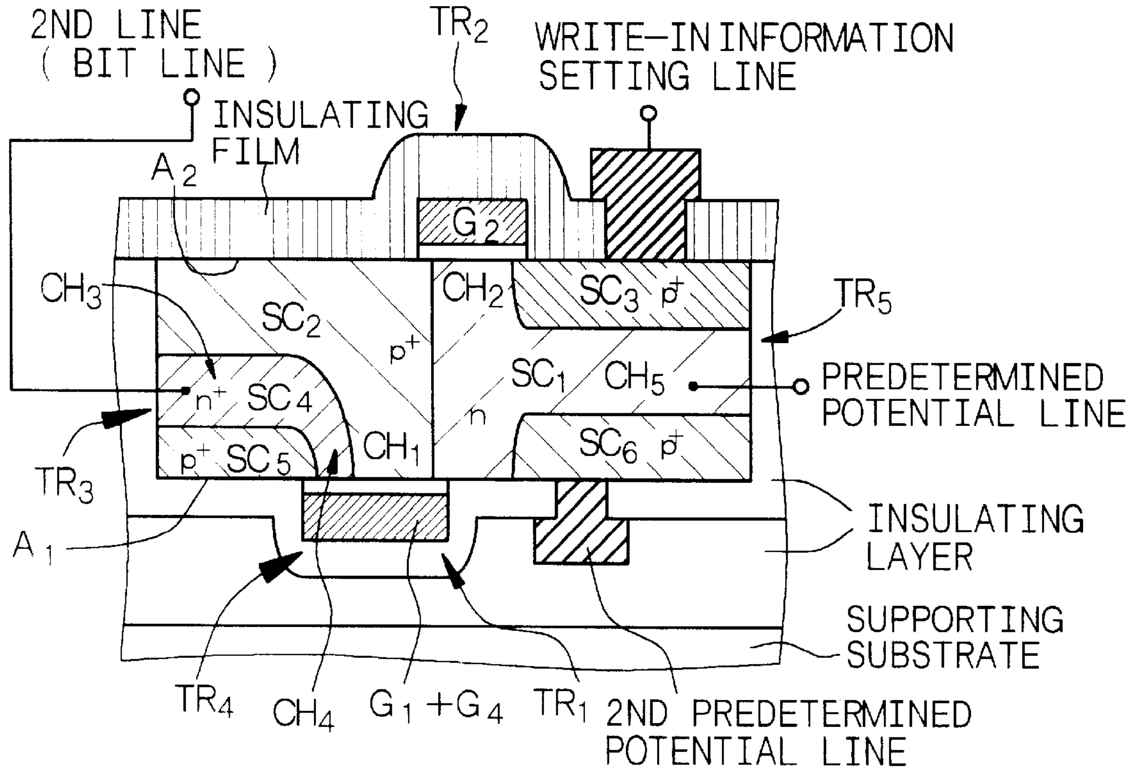
FIGS. 61A and 61B are schematic partial cross-sectional views of modifications of the semiconductor memory cell in Example 9.
Figure 61B:
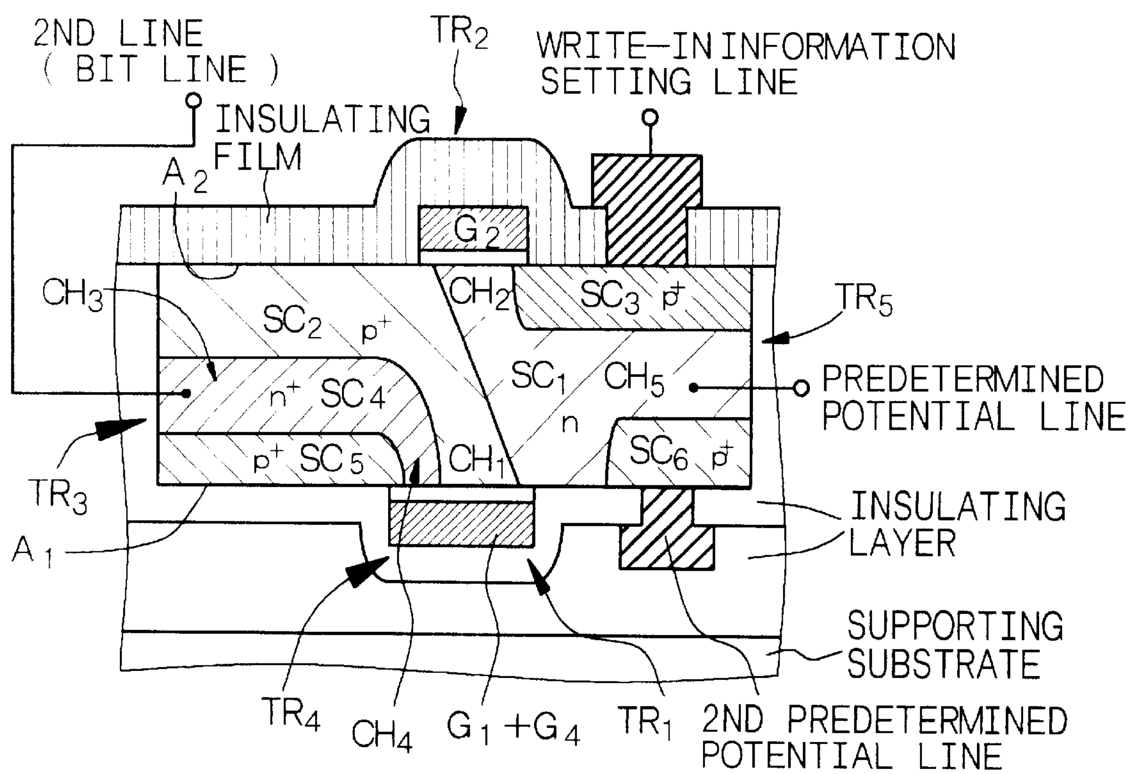

FIGS. 60B, 61A and 61B show schematic partial cross-sectional views of modifications of the semiconductor memory cell in Example 9. The semiconductor memory cell shown in FIG. 60B differs from the semiconductor memory cell shown in FIG. 60A in that the common gate portion ($G_1$+$G_4$) and the gate portion $G_2$ are almost aligned along a vertical direction. That is, when viewed from above (as a plane view), the common gate portion ($G_1$+$G_4$) and the gate portion $G_2$ are approximately overlapped. The semiconductor memory cell can be decreased in size with such a configuration. In the semiconductor memory cells shown in FIGS. 61A and 61B, the supporting substrate, the insulating layer, the common gate portion ($G_1$+$G_4$) and the gate portion $G_2$ are arranged in this order from the bottom. The order of each regions and the gate portions in the semiconductor memory cells shown in FIGS. 61A and 61B along a perpendicular direction is inverse to the order of each regions and the gate portions in the semiconductor memory cells shown in FIGS. 60A and 60B, respectively. The semiconductor memory cell shown in FIG. 61B differs from the semiconductor memory cell shown in FIG. 61A in that the common gate portion ($G_1$+$G_4$) and the gate portion $G_2$ are almost aligned along a vertical direction.

Figure 62:
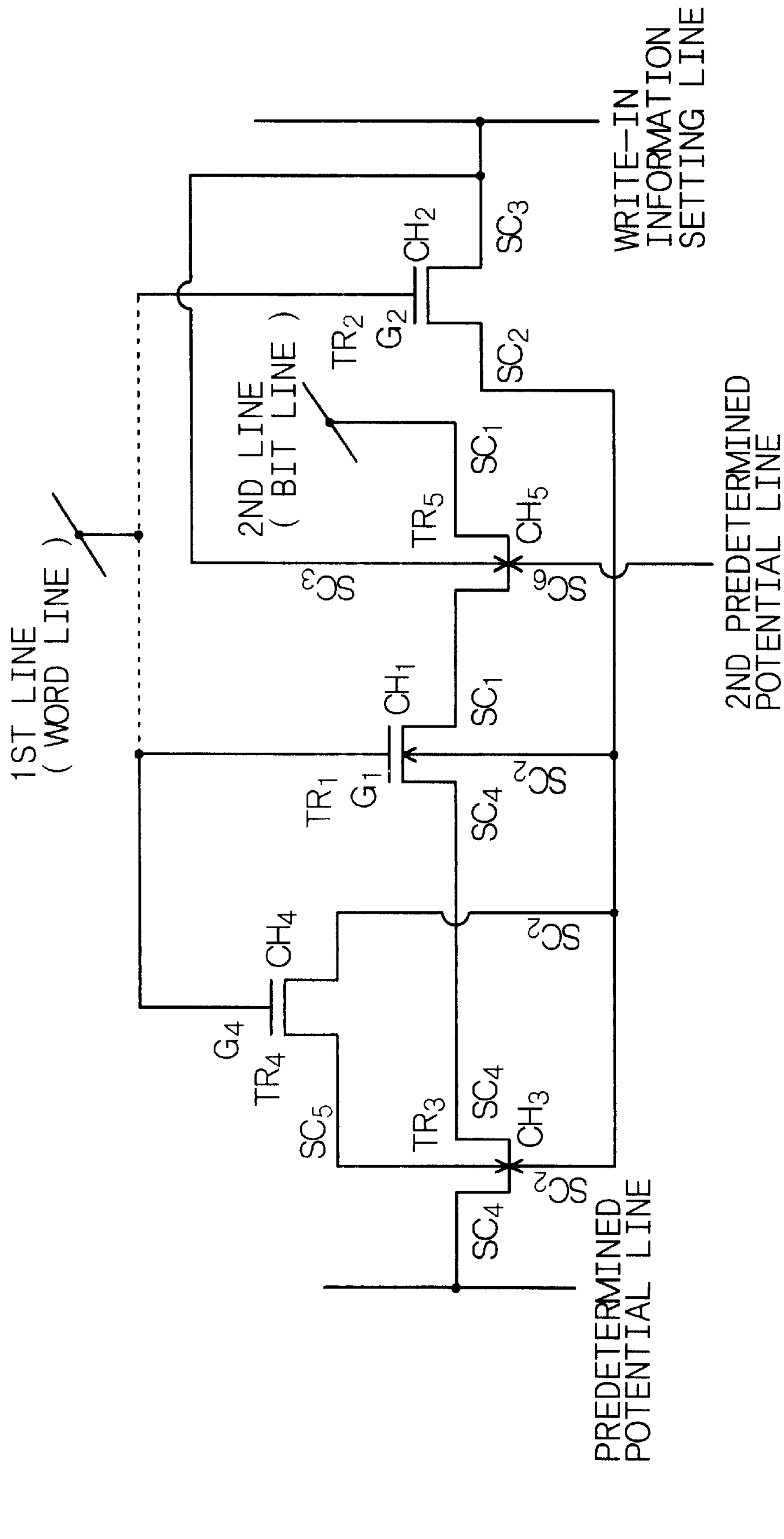
FIG. 62 is a principle drawing of a modification of the semiconductor memory cell in Example 9.
Figure 63:
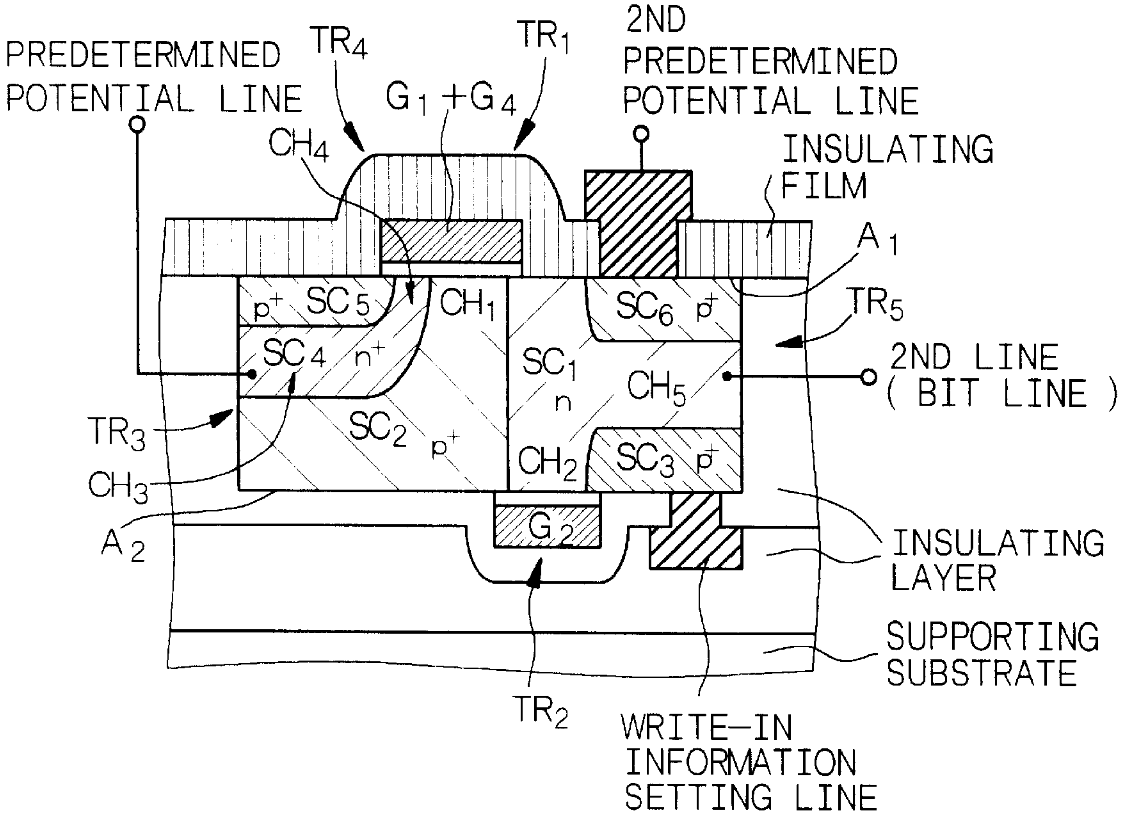
FIG. 63 is a schematic partial cross-sectional view of a modification of the semiconductor memory cell in Example 9.

As FIG. 62 shows a principle drawing and as FIG. 63 shows a schematic partial cross-sectional view, the semiconductor memory cell of Example 9 may have a configuration in which the other source/drain region of the first junction-field-effect transistor $TR_3$ is connected to the predetermined potential line in place of being connected to the second memory-cell-selecting line, and the other source/drain region of the second junction-field-effect transistor $TR_5$ is connected to the second memory-cell-selecting line (for example, a bit line) in place of being connected to the predetermined potential line. The configuration of the semiconductor memory cells shown in FIG. 63 can be applied to the semiconductor memory cells shown in FIGS. 60A to 61B.

Figure 64:
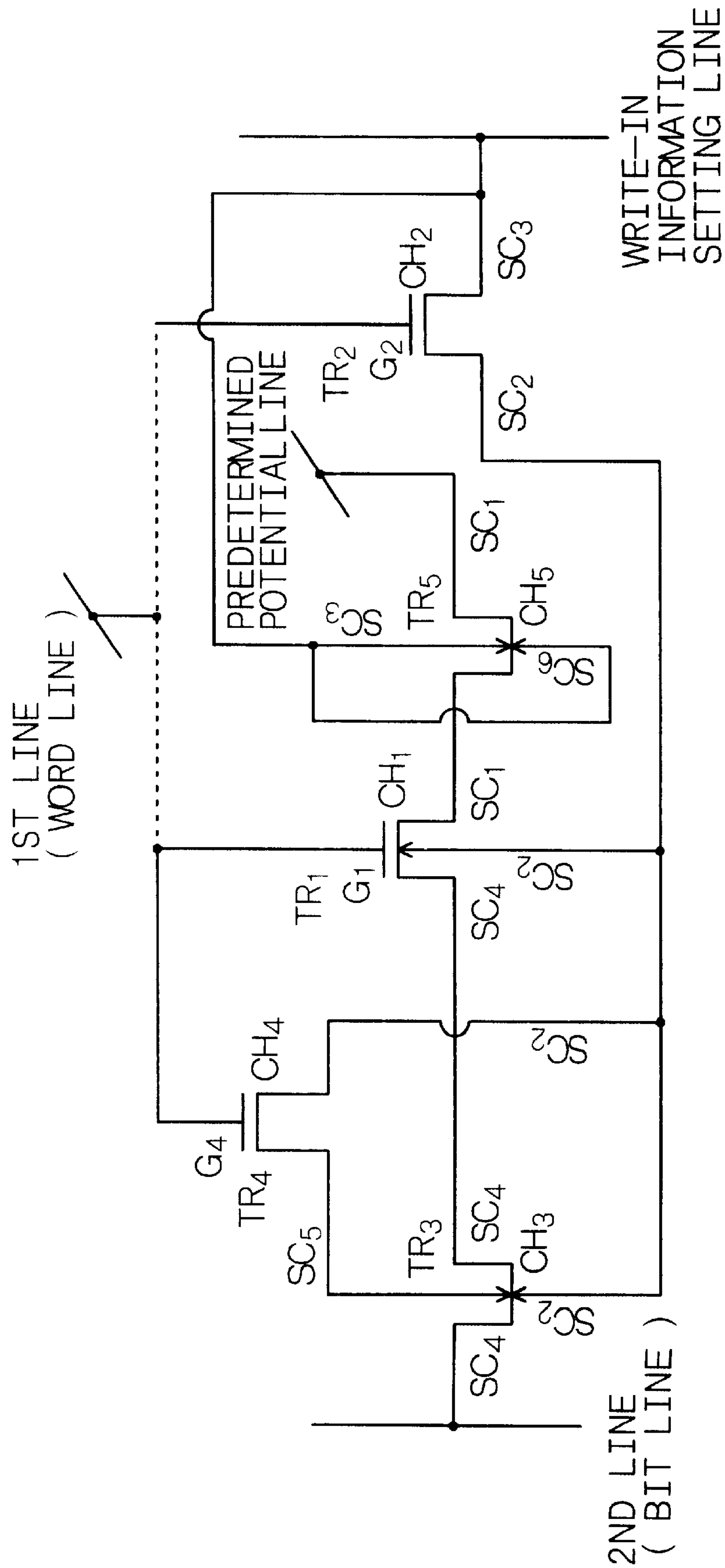
FIG. 64 is a principle drawing of a modification of the semiconductor memory cell in Example 9.
Figure 65A:
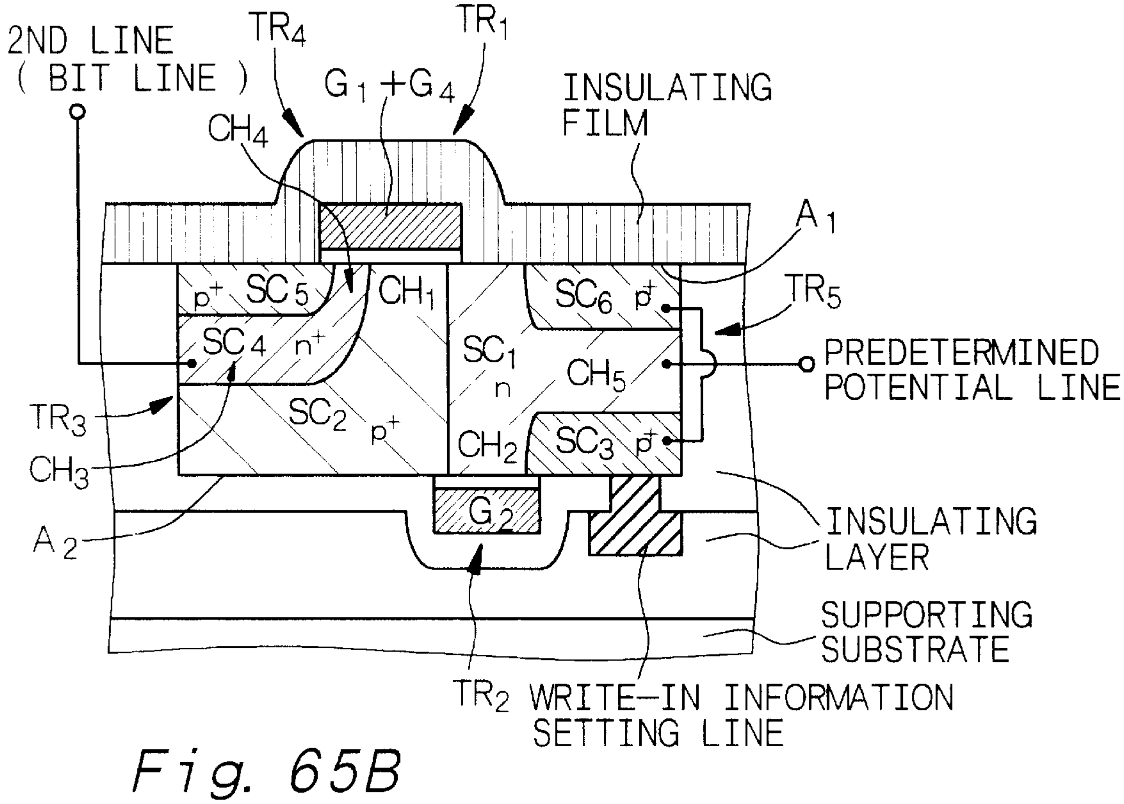
FIGS. 65A and 65B are schematic partial cross-sectional views of modifications of the semiconductor memory cell in Example 9.
Figure 65B:
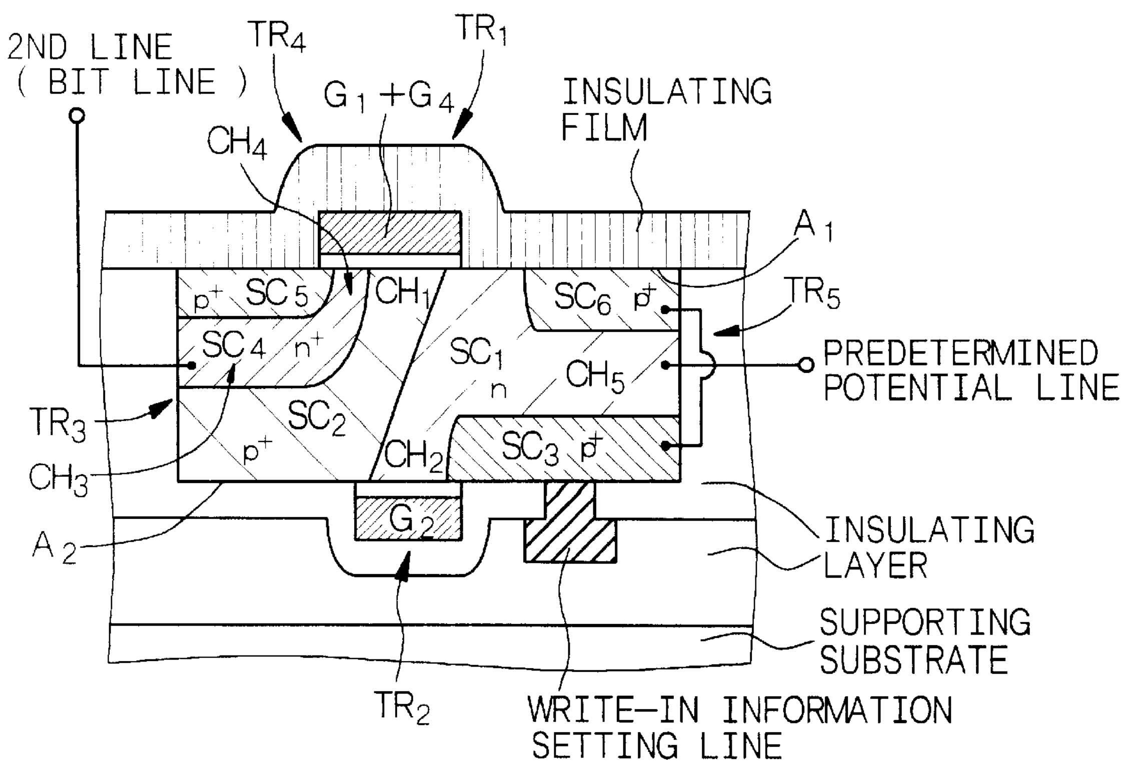
Figure 66A:
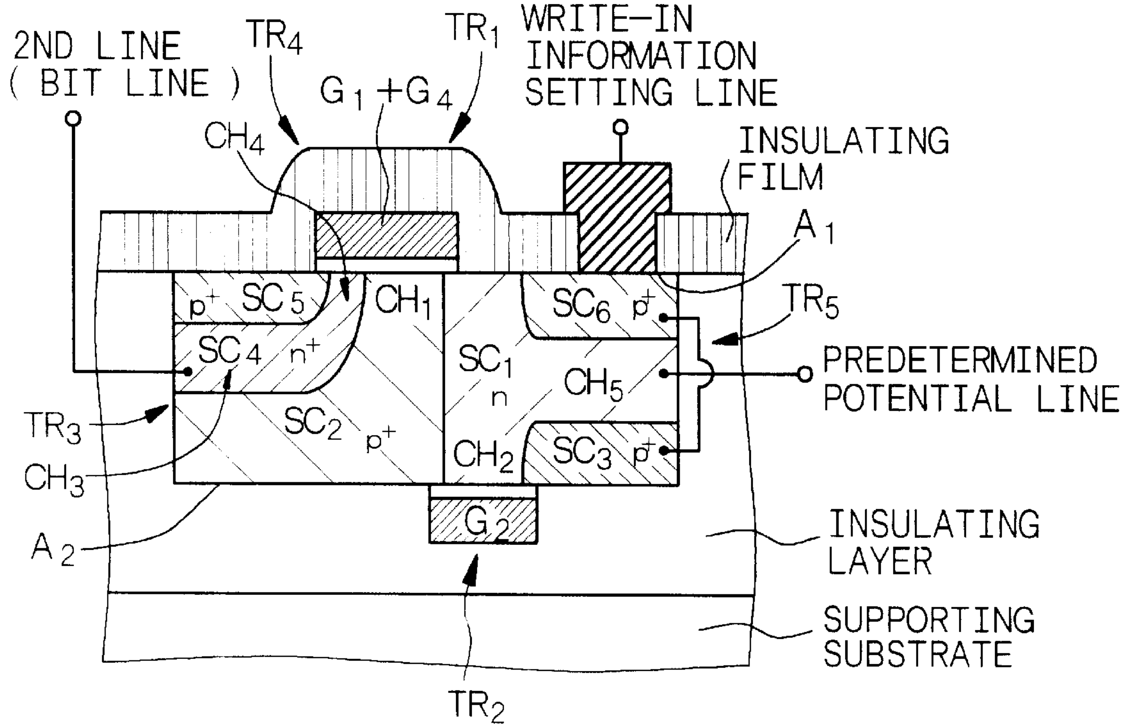
FIGS. 66A and 66B are schematic partial cross-sectional views of modifications of the semiconductor memory cell in Example 9.
Figure 66B:
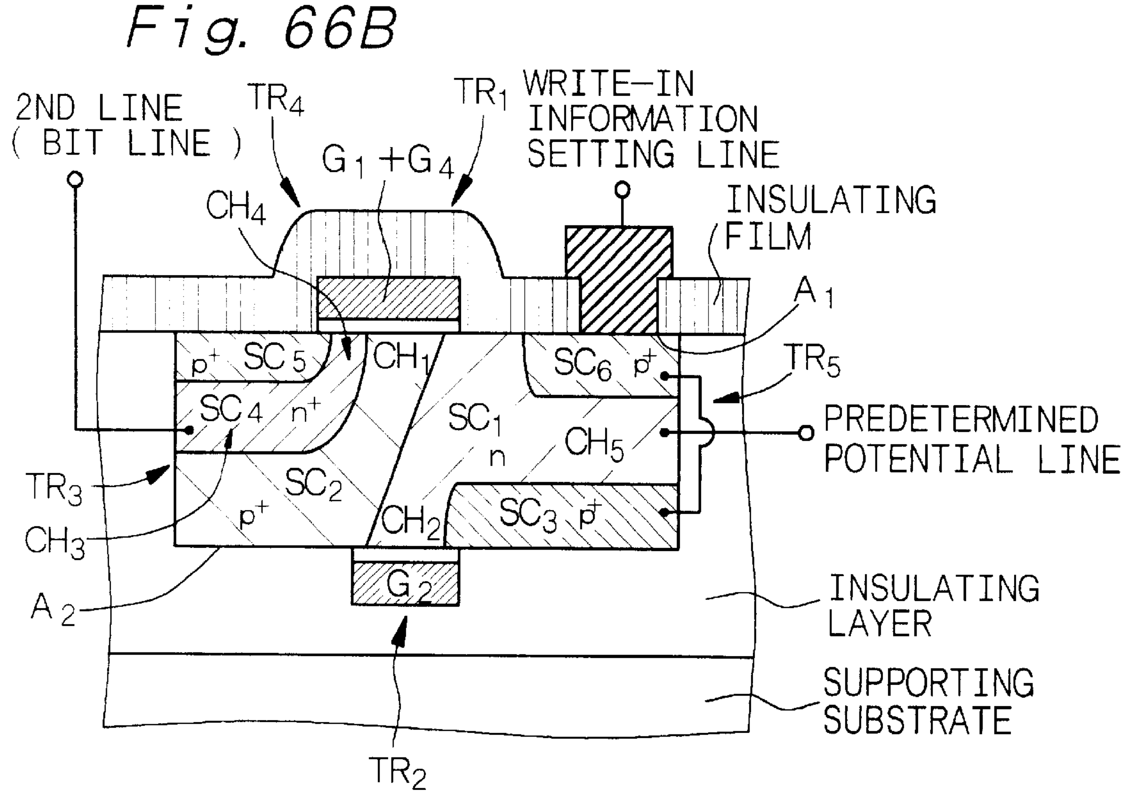
Figure 67A:
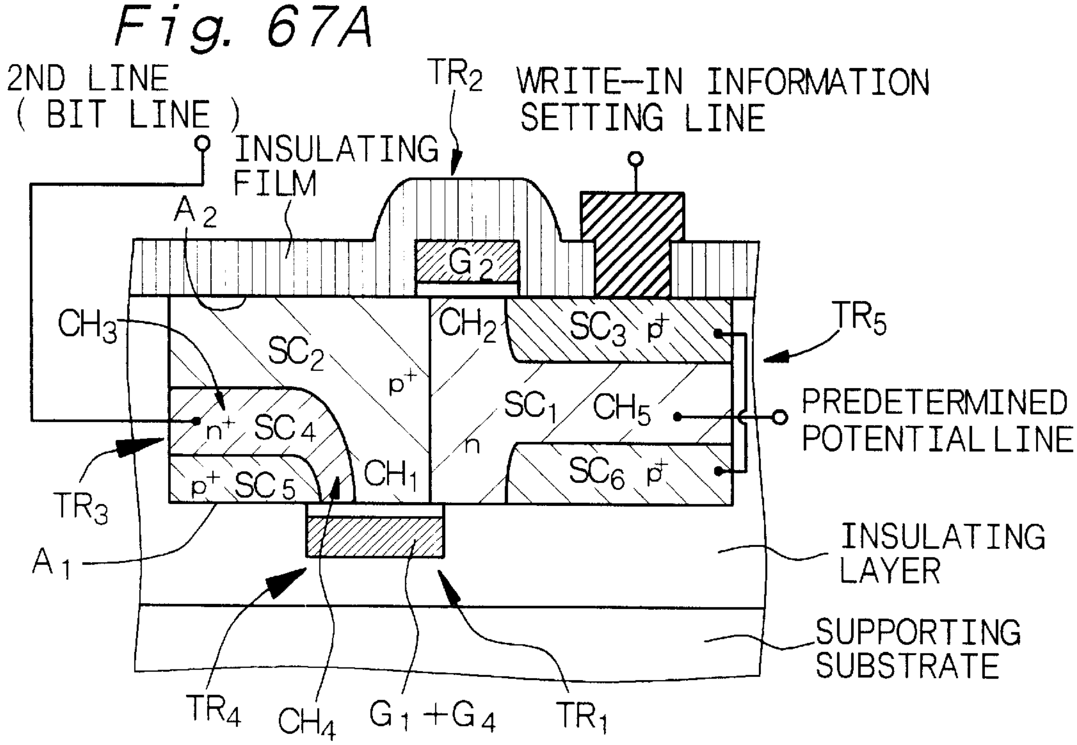
FIGS. 67A and 67B are schematic partial cross-sectional views of modifications of the semiconductor memory cell in Example 9.
Figure 67B:
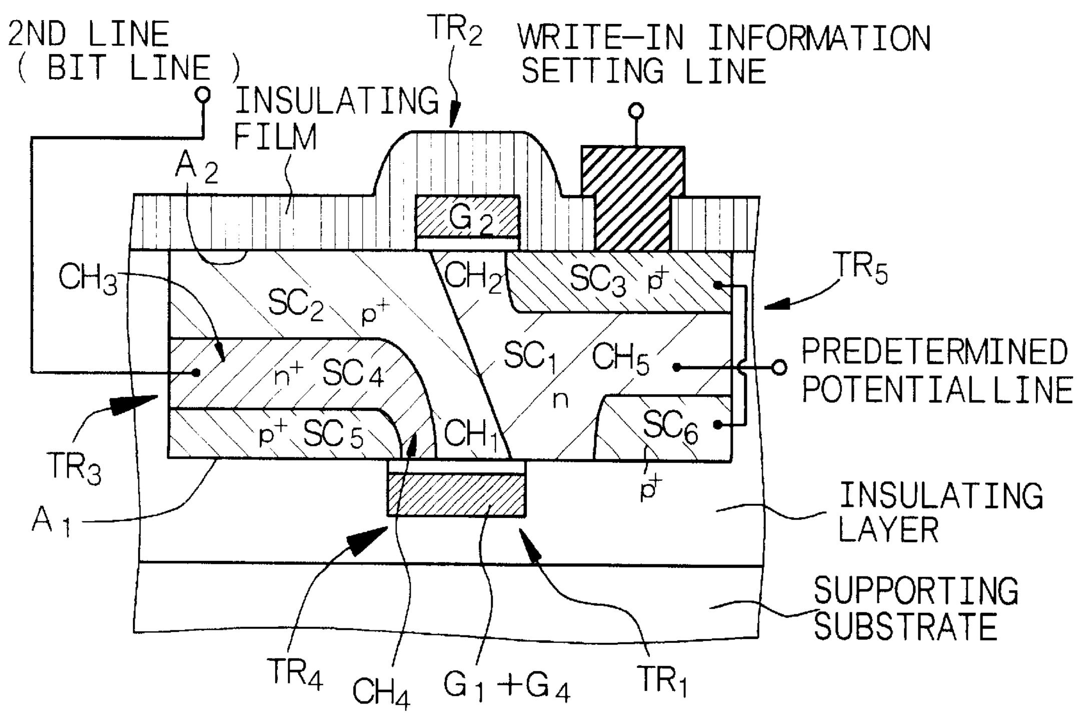
Figure 68A:
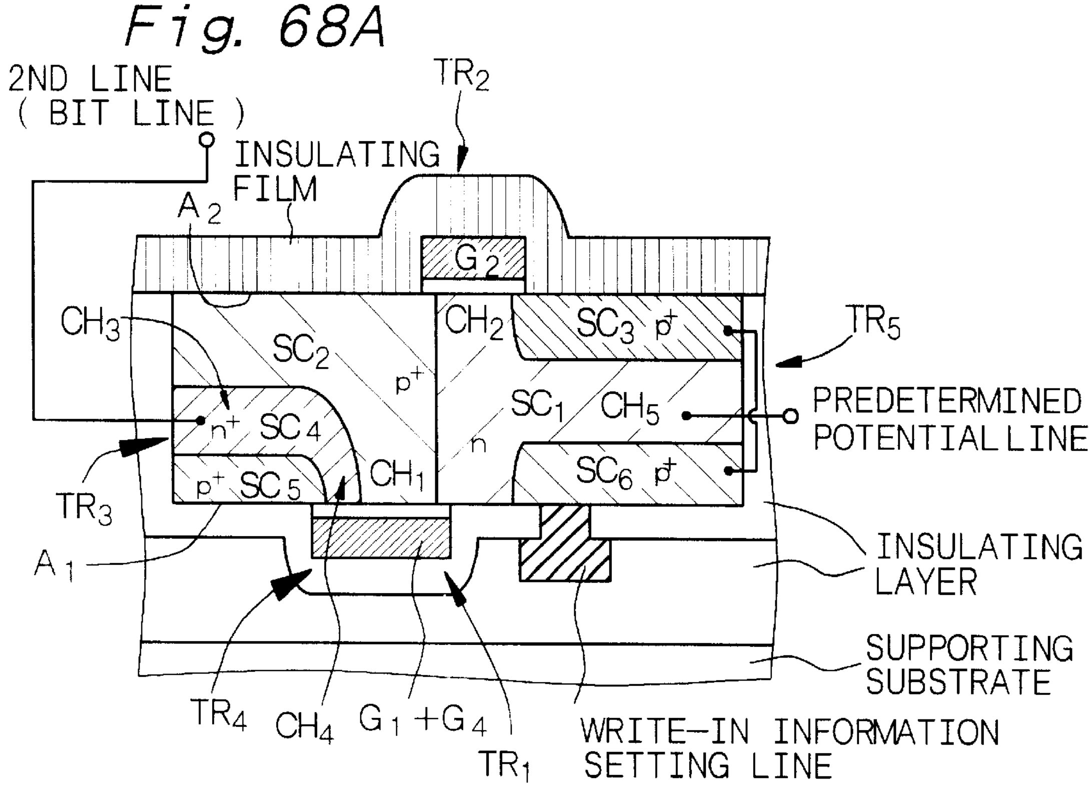
FIGS. 68A and 68B are schematic partial cross-sectional views of modifications of the semiconductor memory cell in Example 9.
Figure 68B:
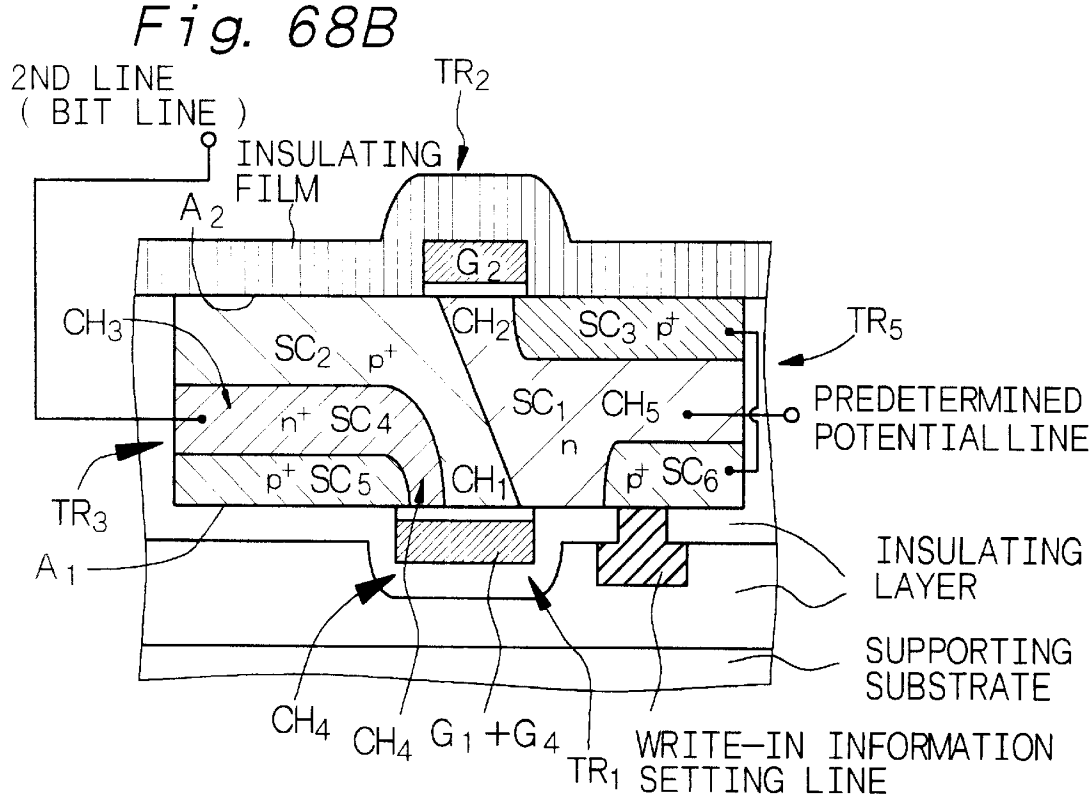

FIGS. 65A, 65B, 66A, 66B, 67A, 67B, 68A and 68B show schematic partial cross-sectional views of modifications of the semiconductor memory cell in Example 9. FIG. 64 shows a principle drawing of these semiconductor memory cells. Each of the semiconductor memory cells shown in FIGS. 65A to 68B differs from the semiconductor memory cell shown in FIG. 60A in that the sixth region $SC_6$ is connected to the write-in information setting line in place of being connected to the second predetermined potential line. The phrase of "being connected to the write-in information setting line" is equivalent to the phrase of "being connected to the third region $SC_3$,". Each of the semiconductor memory cells shown in FIGS. 65A, 65B, 66A and 66B has substantially the same configuration as the semiconductor memory cell shown in FIGS. 60A or 60B. Each of the semiconductor memory cells shown in FIGS. 67A, 67B, 68A and 68B has substantially the same configuration as the semiconductor memory cell shown in FIGS. 61A or 61B. Detailed explanations thereof are therefore omitted.

Figure 69:
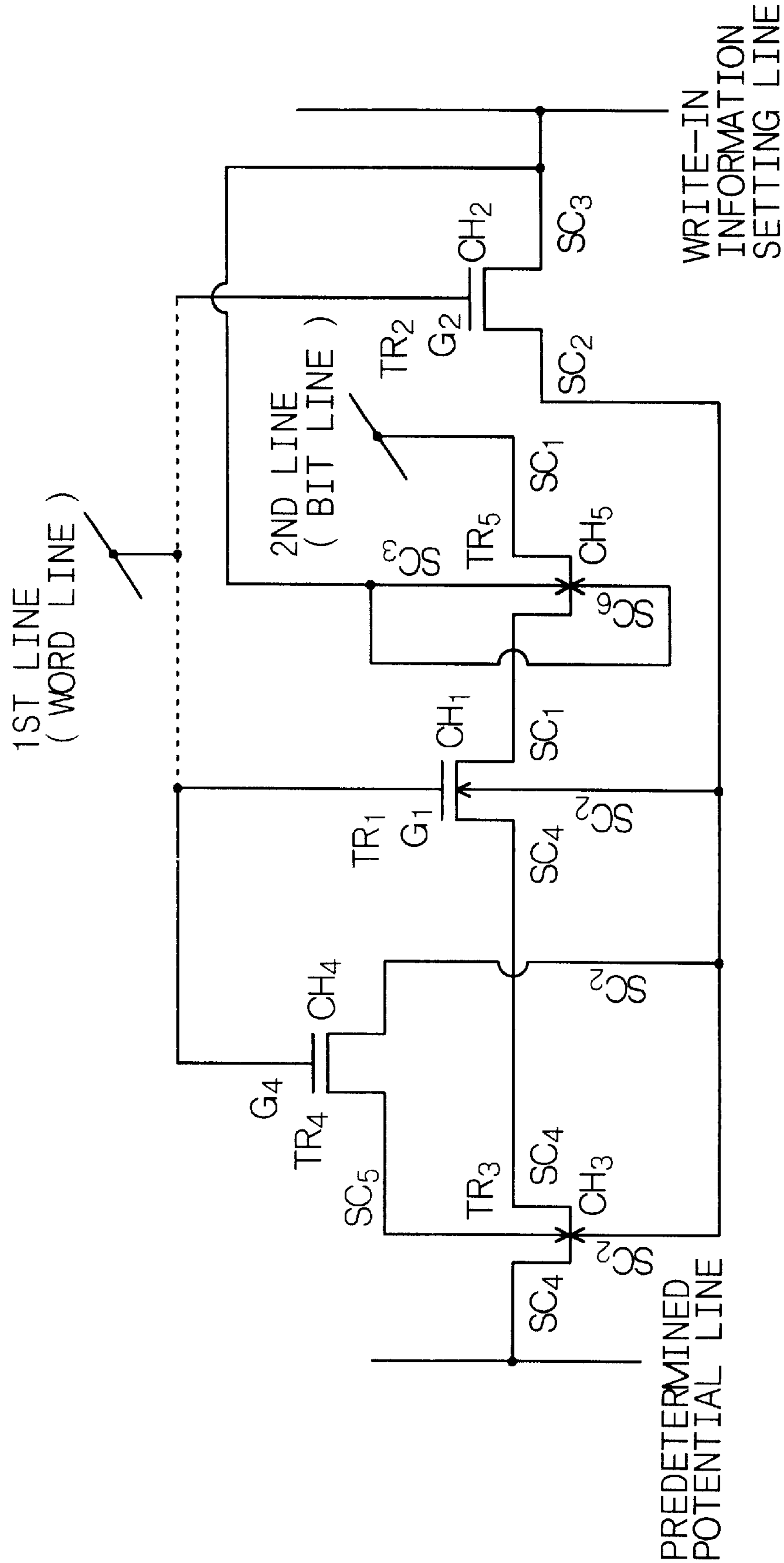
FIG. 69 is a principle drawing of a modification of the semiconductor memory cell in Example 9.
Figure 70:
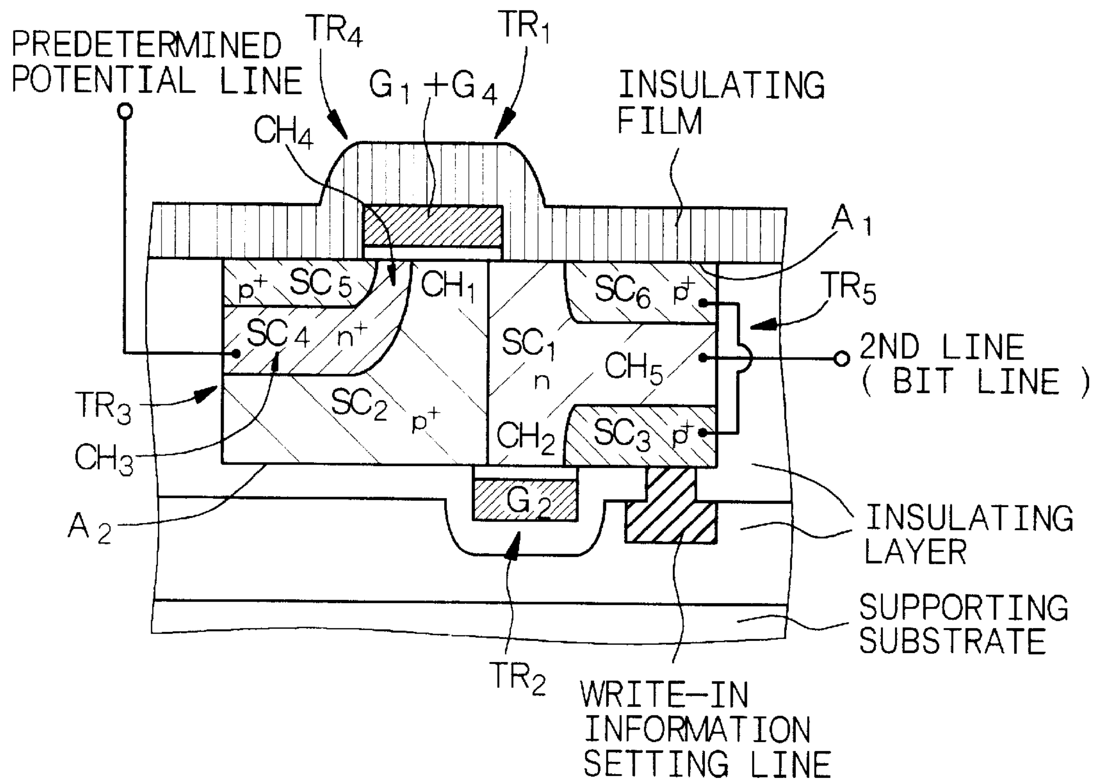
FIG. 70 is a schematic partial cross-sectional view of a modification of the semiconductor memory cell in Example 9.

Alternatively, as FIG. 69 shows a principle drawing and as FIG. 70 shows a schematic partial cross-sectional view, the semiconductor memory cell may have a configuration in that the other source/drain region of the first junction-field-effect transistor $TR_3$ is connected to the predetermined potential line in place of being connected to the second memory-cell-selecting line, and the other source/drain region of the second junction-field-effect transistor $TR_5$ is connected to the second memory-cell-selecting line (for example, the bit line) in place of being connected to the predetermined potential line. The configuration of the semiconductor memory cells shown in FIG. 70 can be applied to the semiconductor memory cells shown in FIGS. 65A to 68B.

The method of manufacturing the semiconductor memory cell in Example 9 can substantially be the same as the method of manufacturing the semiconductor memory cell of Example 5, except the formation of the common gate portion ($G_1$+$G_4$), the region $SC_6$ and the region $SC_6$. Detailed explanations thereof are therefore omitted.

EXAMPLE 10

Figure 76A:
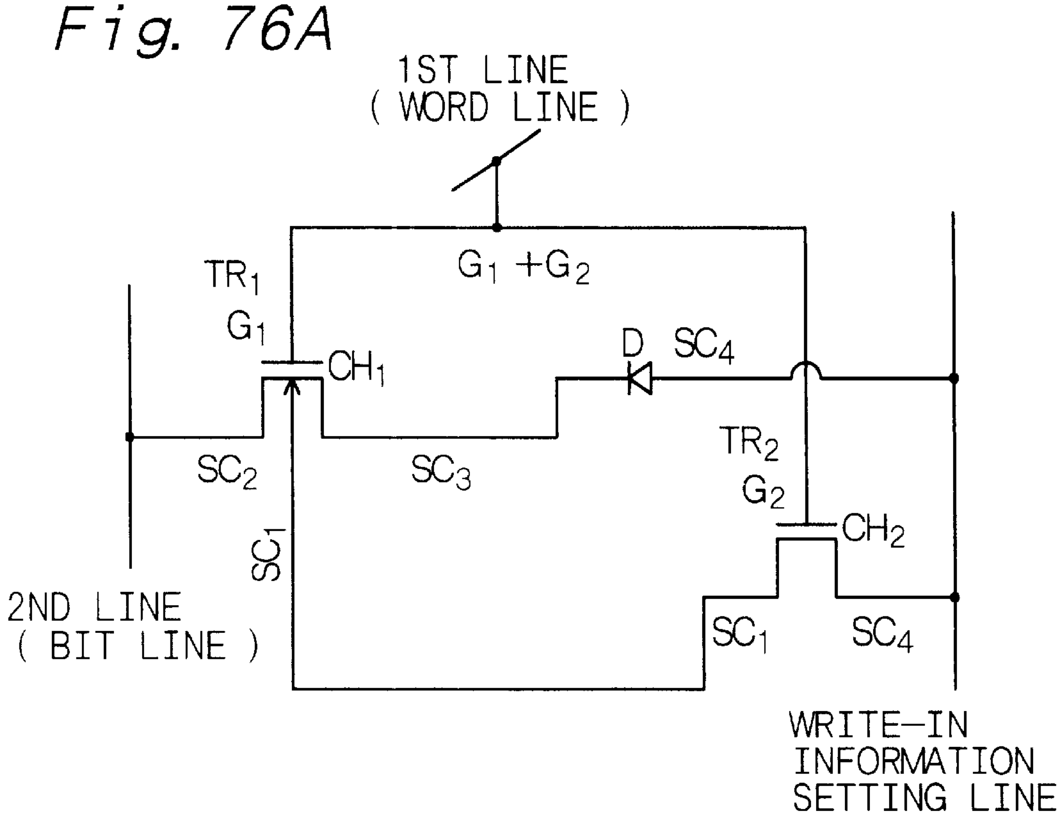
FIGS. 76A and 76B are principle drawings of the semiconductor memory cells according to the tenth and the eleventh aspects of the present invention.
Figure 78A:
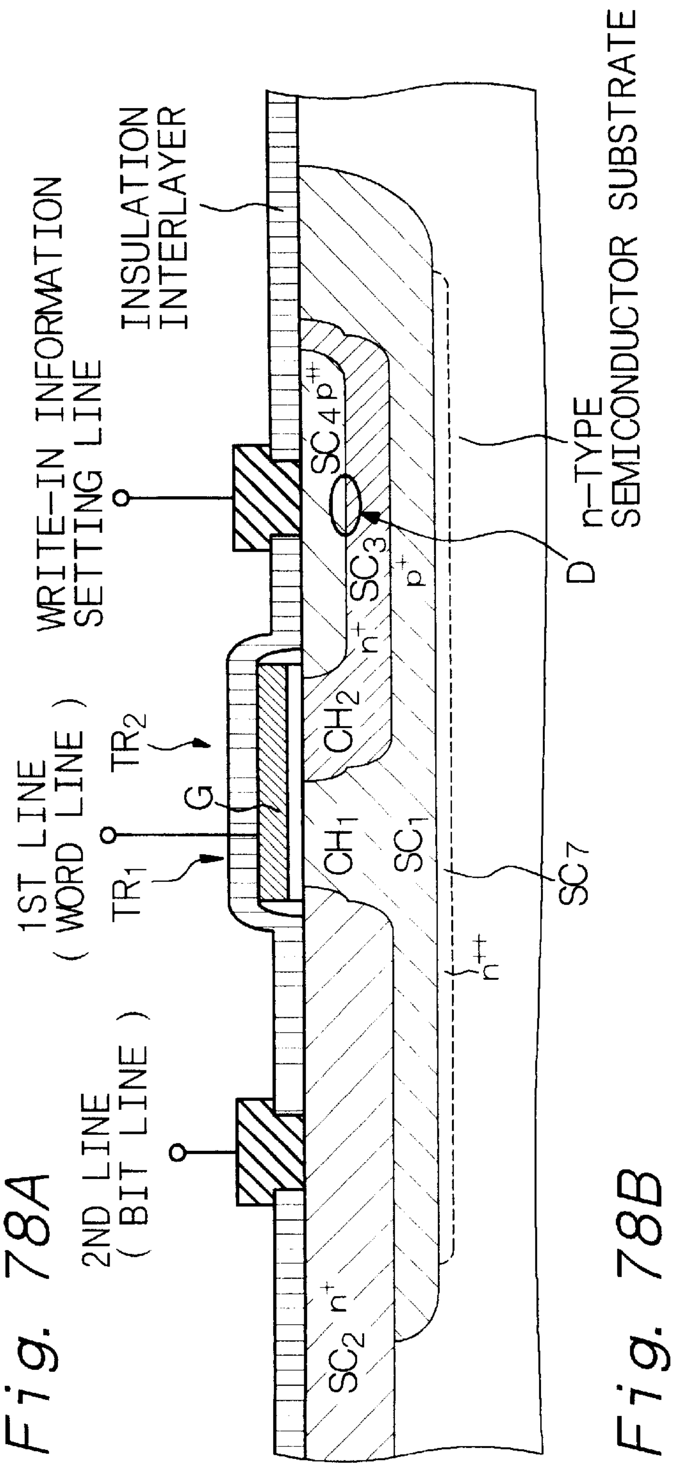
FIGS. 78A and 78B are a schematic partial cross-sectional view and a schematic arrangement of each regions and a gate portion of a semiconductor memory cell in Example 10, respectively.
Figure 78B:
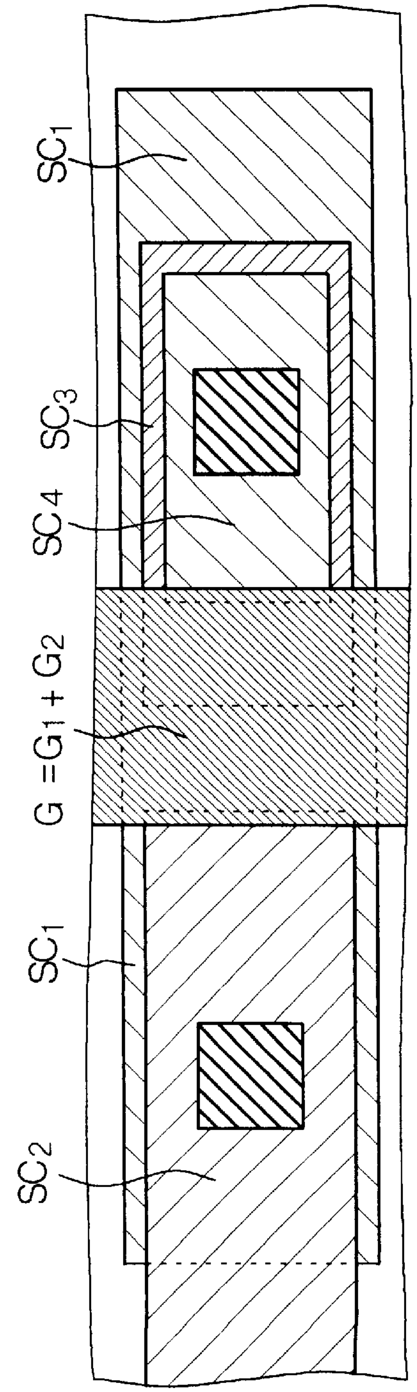

Example 10 is directed to the semiconductor memory cell according to the tenth and twelfth aspects of the present invention. For example, as FIG. 76A shows its principle drawing and FIGS. 78A and 78B show the configurations, the semiconductor memory cell of Example 10 comprises a first transistor of a first conductivity type (e.g., n-type) for read-out $TR_1$, a second transistor of a second conductivity type (e.g., p-type) for write-in $TR_2$ and a diode D. FIG. 78A shows a schematic partial cross-sectional view and FIG. 78B shows a schematic layout of the gate portion and each regions.

Concerning the first transistor $TR_1$;

(A-1) one source/drain region is connected to a second memory-cell-selecting line (for example, a bit line), and (A-2) the other source/drain region constitutes one end of the diode D.

Concerning the second transistor $TR_2$;

(B-1) one source/drain region is connected to a write-in information setting line and constitutes other end of the diode D, and (B-2) the other source/drain region functions (or serves) as a channel forming region $CH_1$ of the first transistor $TR_1$.

A gate portion $G_1$ and $G_2$ shared by the first transistor $TR_1$ and the second transistor $TR_2$ is connected to a first memory-cell-selecting line (for example, a word line).

Or, the semiconductor memory cell of Example 10 has;

(1) a first semi-conductive region $SC_1$ of the second conductivity type (for example, p-type), (2) a second semi-conductive or conductive region $SC_2$ forming a rectifier junction together with the first region $SC_1$, (more specifically in Example 10, a second semi-conductive region $SC_2$ of the first conductivity type (for example, n-type) opposite to the second conductivity type, or a second conductive region $SC_2$ formed of a silicide, a metal or a metal compound, said second region $SC_2$ being formed in a surface region $SC_1$ and forming a rectifier junction together with the first region $SC_1$), (3) a third semi-conductive region $SC_3$ of the first conductivity type (for example, $n^+$-type), in contact with the first region $SC_1$ (more specifically, formed in a surface region of the first region $SC_1$) and spaced from the second region $SC_2$, (4) a fourth semi-conductive region $SC_4$ of the second conductivity type (for example, $p^{++}$-type), or a fourth conductive region $SC_4$ formed of a silicide, a metal or a metal compound, said fourth region $SC_4$ being formed in a surface region of the third region $SC_3$ and forming a rectifier junction together with the third region $SC_3$, and (5) a gate portion $G_1$ and $G_2$ shared by the first transistor $TR_1$ and the second transistor $TR_2$, and formed on a barrier layer so as to bridge the second region $SC_2$ and the third region $SC_3$ and so as to bridge the first region $SC_1$ and the fourth region $SC_4$.

Concerning the first transistor $TR_1$;

(A-1) one source/drain region is constituted of the second region $SC_2$, (A-2) the other source/drain region is constituted of the third region $SC_3$, and (A-3) a channel forming region $CH_1$ is constituted of a surface region of the first region $SC_1$ sandwiched by (or interposed between) the second region $SC_2$ and the third region $SC_3$.

Concerning the second transistor $TR_2$;

(B-1) one source/drain region is constituted of the fourth region $SC_4$, (B-2) the other source/drain region is constituted of the first region $SC_1$, and (B-3) a channel forming region $CH_2$ is constituted of a surface region of the third region $SC_3$ sandwiched by (or interposed between) the first region $SC_1$ and the fourth region $SC_4$.

The diode D is constituted of the third region $SC_3$ and the fourth region $SC_4$. In the semiconductor memory cell of Example 10, the gate portion $G_1$ of the first transistor $TR_1$ and $G_2$ of the second transistor $TR_2$ are connected to a first memory-cell-selecting line (for example, a word line); the second region $SC_2$ is connected to a second memory-cell-selecting line (for example, a bit line); and the fourth region $SC_4$ is connected to a write-in information setting line. The combination of gate portion $G_1$ of the first transistor $TR_1$ and $G_2$ of the second transistor $TR_2$ is referred to as "the gate portion G", hereinafter, in some cases.

When a pn junction is formed of the third region $SC_3$ and the fourth region $SC_4$ in the semiconductor memory cell of Example 10, and if the potential setting in the third region $SC_3$ or the designing of impurity concentration relationships between the third region $SC_3$ and the first region $SC_1$ is improper, "latch-up" may take place when the information is read out. For avoiding the above problem, the voltage which is applied to the write-in information setting line is required to be a low degree of voltage (0.4 volt or lower) at which no large forward current flows in the junction portion (that is, the diode D) of the third region $SC_3$ and the fourth region $SC_4$ and in the junction portion of the third region $SC_3$ and the first region $SC_1$. When the fourth region $SC_4$ is constituted of a silicide, a metal or a metal compound, a Schottky junction in which majority carrier mainly constitutes a forward current is formed between the third region $SC_3$ and the fourth region $SC_4$, whereby the risk of latch-up can be avoided, and the limitation on the voltage applied to the write-in information setting line is no longer necessary.

The semiconductor memory cell of Example 10 is formed in a well having the second conductivity type (for example, p-type) formed in a semiconductor substrate.

The method for manufacturing the semiconductor memory cell of Example 10 will be explained with reference to FIGS. 79A, 79B, 80A and 80B.

[Step-1000]

Figure 79A:
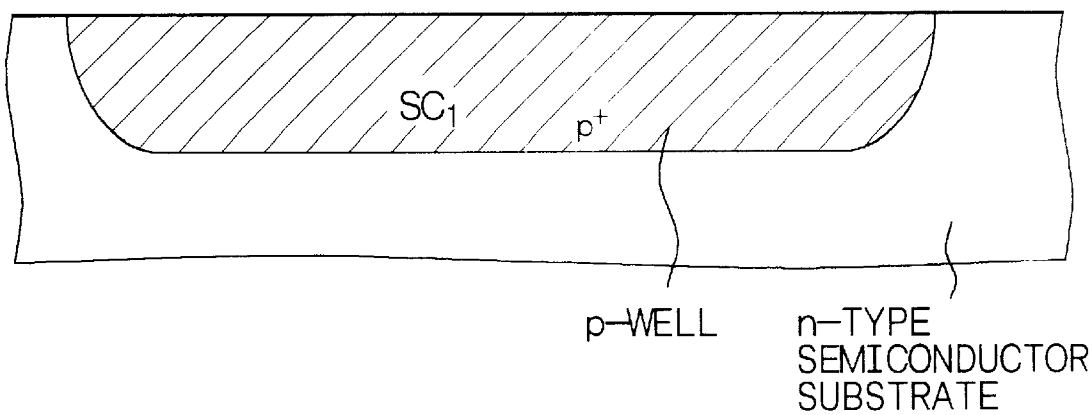
FIGS. 79A and 79B are schematic partial cross-sectional views of a semiconductor substrate, etc., for the explanation of a manufacturing method of the semiconductor memory cell in Example 10.

The first region $SC_1$ of the second conductivity type (for example, p-type) is formed in a silicon semiconductor substrate of the first conductivity type (for example, n-type) by ion implantation (see FIG. 79A). The first region $SC_1$ of the second conductivity type corresponds to a p-type well.

[Step-1010]

Figure 79B:
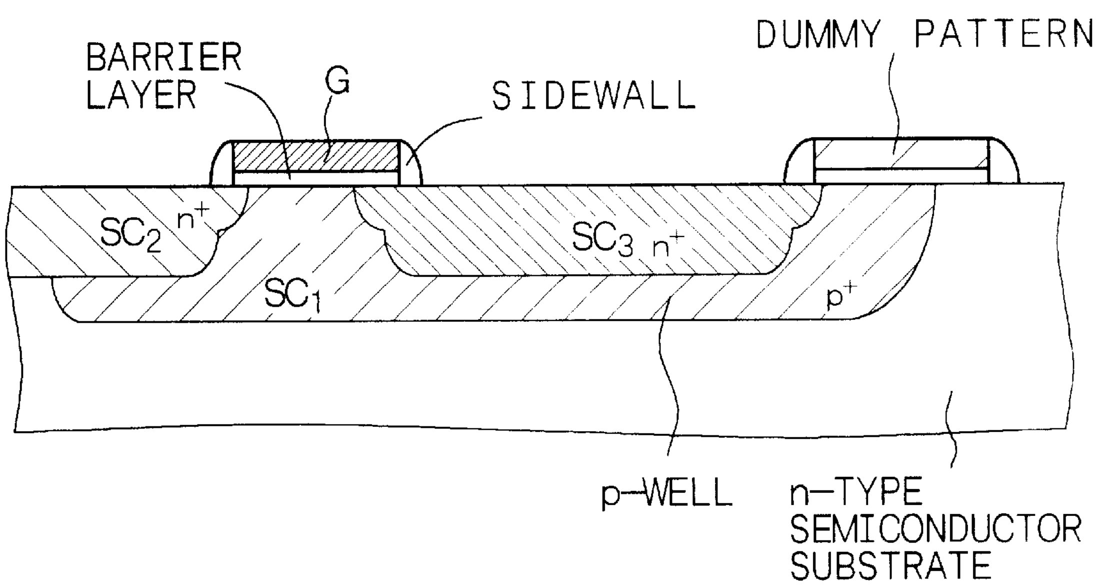

A gate oxide of approx. 10 nm thick corresponding to the barrier layer is formed on the surface of the silicon semiconductor substrate by, for example, a thermal oxidation method. An impurity-doped polysilicon layer is then deposited on the entire surface by a CVD method, and on which a resist pattern is formed. The polysilicon layer is then patterned using the resist pattern as a mask to obtain the gate portion G and a dummy pattern. An n-type impurity is then ion-implanted to the surface region of the first region $SC_1$ containing a $p^+$-type impurity to form a layer containing the n-type impurity. A layer of, for example, SiN is deposited on the entire surface and then etched anisotropically to form sidewalls on the both lateral planes of the gate portion G and the dummy pattern. A thin oxide film is formed on the entire surface and an n-type impurity is ion-implanted at a high dosage. Thus formed, as shown in FIG. 79B, are the second region $SC_2$ (second semi-conductive region $SC_2$ of $n^+$-type) in the surface region of the first semi-conductive region $SC_1$ so as to form a rectifier junction together with the first region $SC_1$, and the third semi-conductive region $SC_3$ of the first conductivity type (for example, $n^+$-type) in the surface region of the first region $SC_1$ so as to be spaced from the second region $SC_2$.

[Step-1020]

Figure 80A:
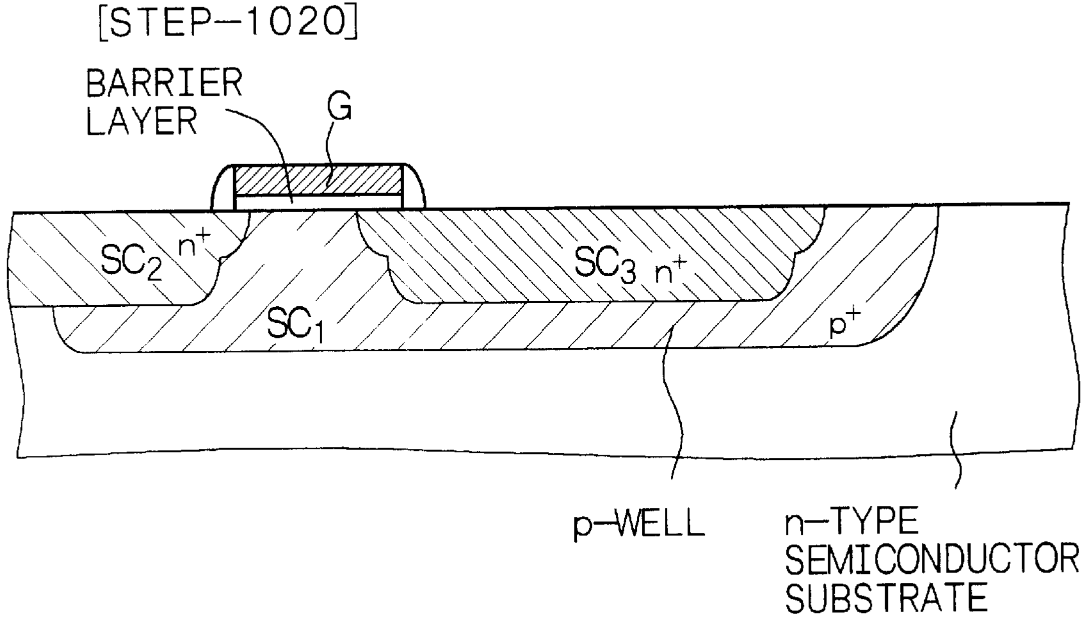
FIGS. 80A and 80B, subsequent to FIG. 79B, are schematic partial cross-sectional views of a semiconductor substrate, etc., for the explanation of a manufacturing method of the semiconductor memory cell in Example 10.

A resist pattern is formed, then using the resist pattern as a mask, the dummy pattern, sidewalls attached thereto and the thin oxide film are removed to obtain a state shown in FIG. 80A.

[Step-1030]

Figure 80B:
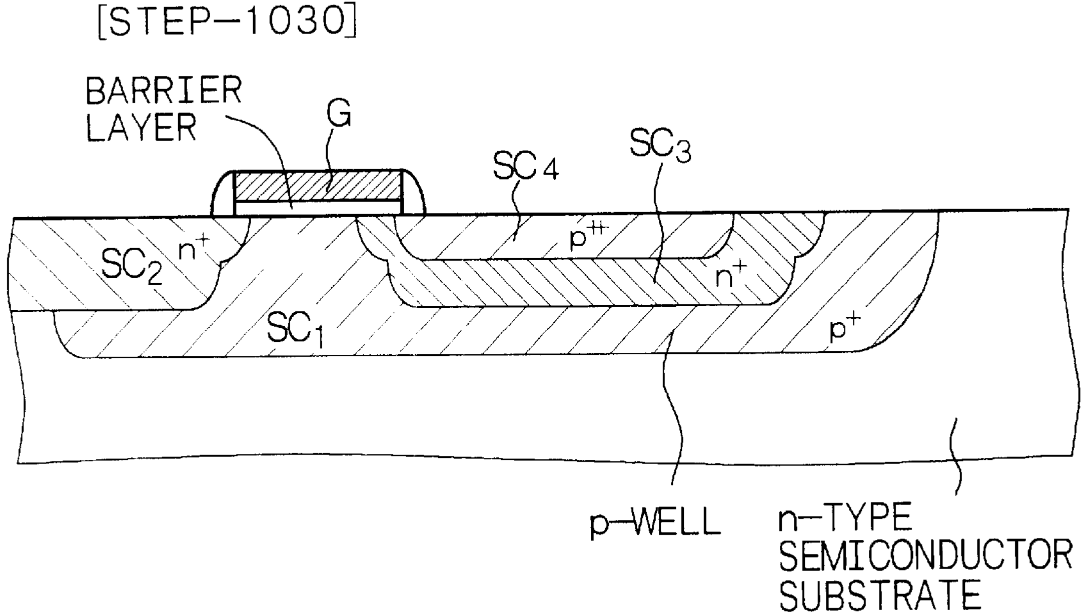

A resist pattern is formed, and a p-type impurity is ion-implanted using the resist pattern as a mask, which is followed by resist removal. Thus, as shown in FIG. 80B, the fourth region $SC_4$ (fourth semi-conductive region $SC_4$ of the second conductivity type, for example, of $p^{++}$-type) is formed in the surface region of the third region $SC_3$ so as to form a rectifier junction together with the third region $SC_3$. In the above-described ion implantations, it is necessary to optimize the conditions for introducing the impurities through computer-assisted simulation or experiments so that the individual regions will have an optimum impurity concentrations. The order of these ion implantations can arbitrarily be selected in essence.

[Step-1040]

An insulation interlayer is deposited on the entire surface, an opening is formed in the insulation interlayer, a metal layer is deposited on the entire surface including the inside of the opening and is then patterned to form various wirings. Thus obtained is the semiconductor memory cell of Example 10 as shown in FIGS. 78A and 78B. A region $SC_7$ containing a high concentration of an impurity having the first conductivity type (for example, $n^{++}$-type) is preferably formed under the first region $SC_1$, for increasing a potential or an electric charge stored in the channel forming region $CH_1$ of the first transistor $TR_1$.

Figure 81A:
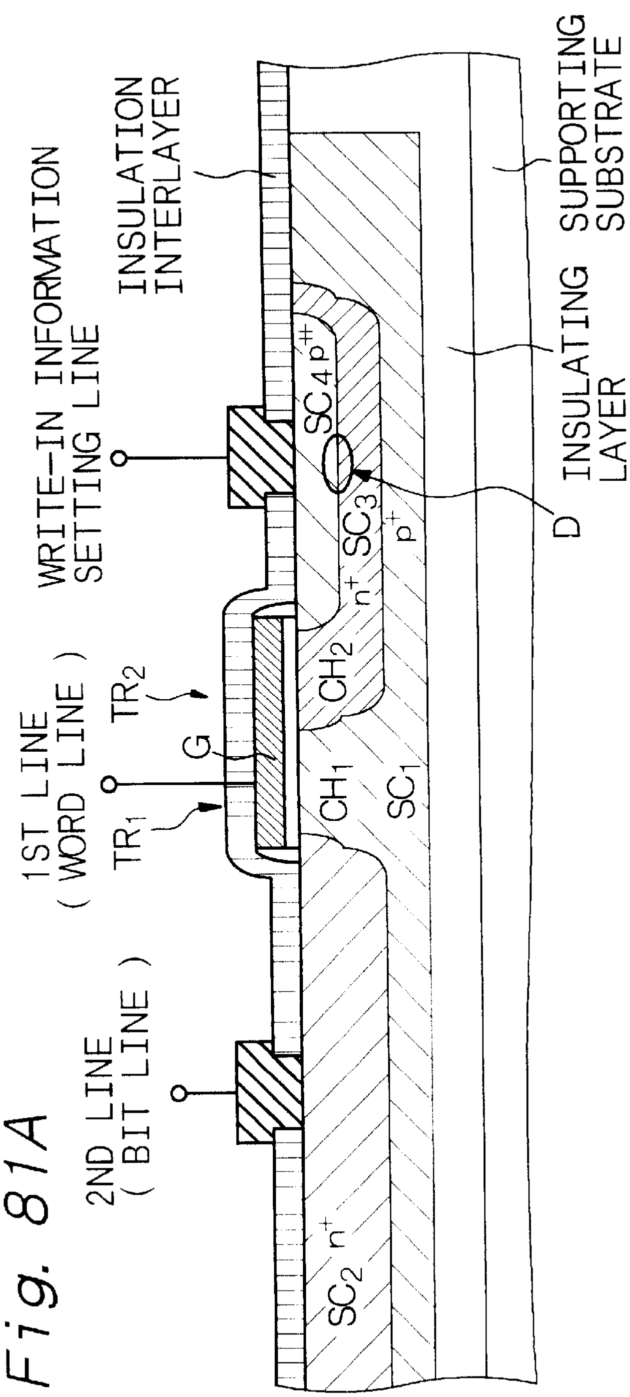
FIGS. 81A and 81B are a schematic partial cross-sectional view and a schematic arrangement of each regions and a gate portion of a modification of the semiconductor memory cell in Example 10, respectively.
Figure 81B:
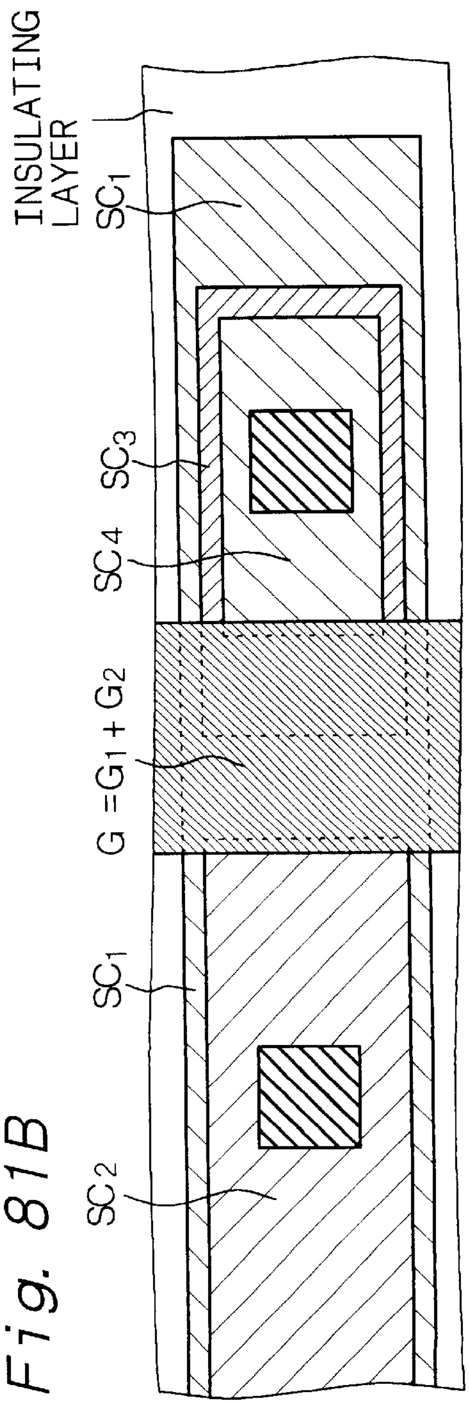

FIG. 81A and 81B show a modification of the semiconductor memory cell in Example 10. The semiconductor memory cell shown in FIGS. 81A and 81B is formed on an insulator such as, for example, $SiO_2$ and has a so-called SOI structure. The above semiconductor memory cell can be formed in a so-called bonded substrate produced by forming a convex portion in a semiconductor substrate (a starting substrate), depositing an insulator (insulating layer) on an entire surface, attaching the insulator (insulating layer) and a supporting substrate to each other, and grinding and polishing the semiconductor substrate (the starting substrate) from its back surface. In another method, for example, a silicon semiconductor substrate is ion-implanted with oxygen and then, heat-treated to obtain an insulator (insulating layer) according to an SIMOX method, and the semiconductor memory cell can be formed in a silicon layer remaining thereon.

Figure 82A:
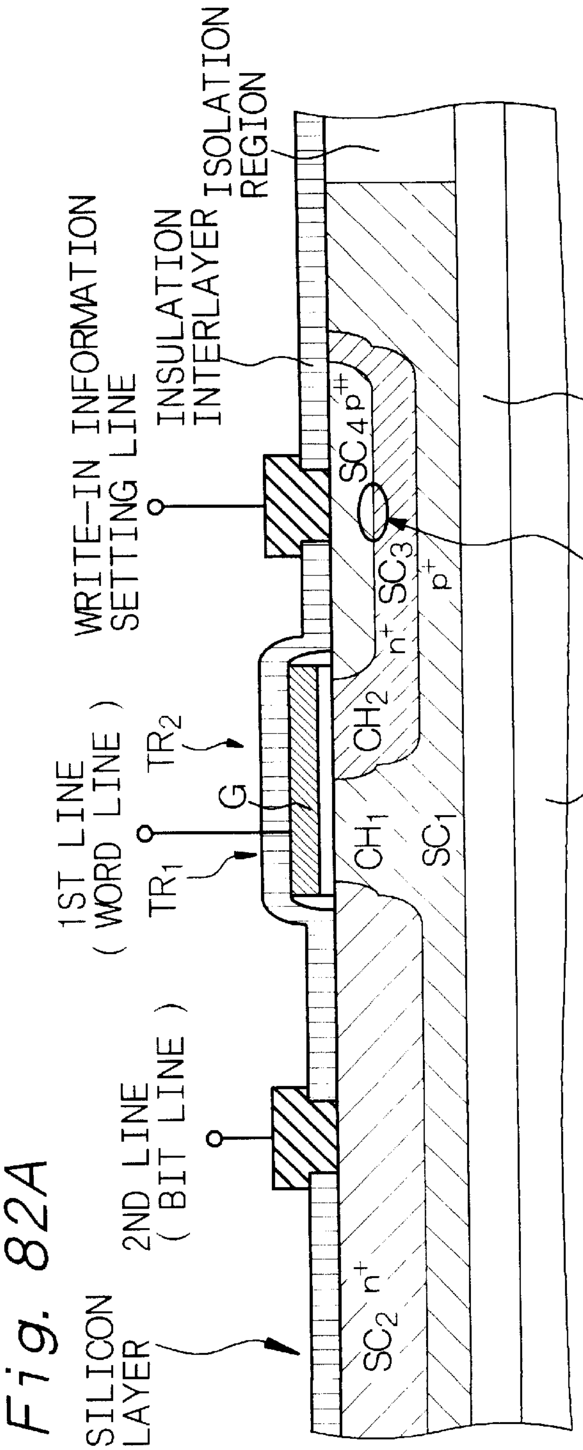
FIGS. 82A and 82B are a schematic partial cross-sectional view and a schematic arrangement of each regions and a gate portion of a modification of the semiconductor memory cell in Example 10, respectively.
Figure 82B:
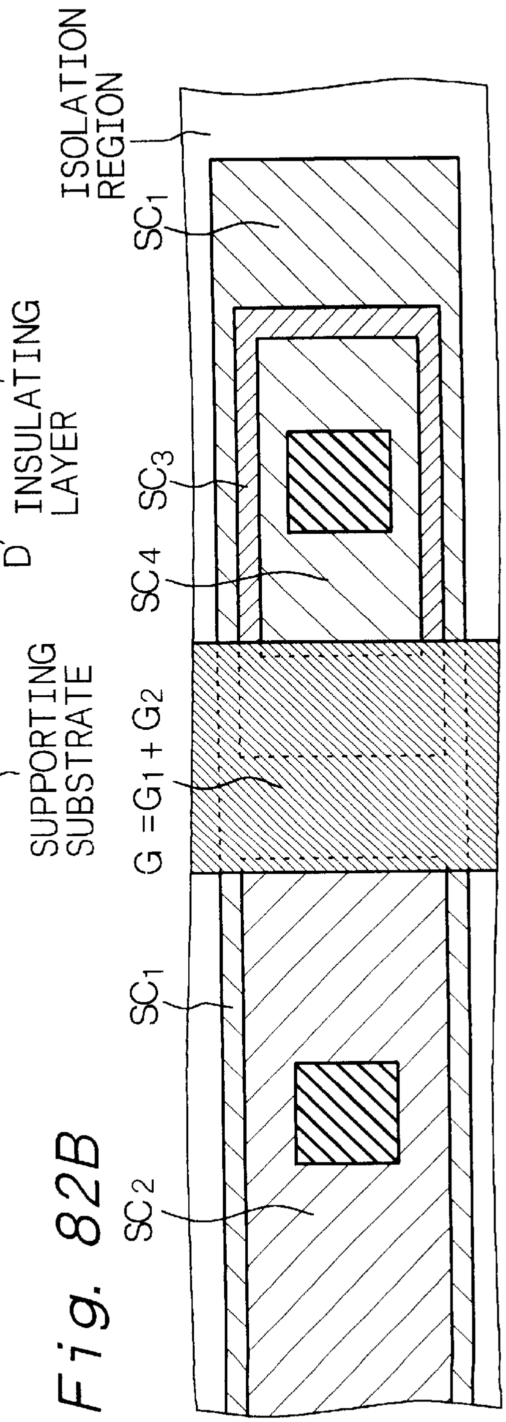

Alternatively, the semiconductor memory cell has a so-called TFT structure as shown in FIG. 82A and 82B. The above semiconductor memory cell can be formed by the following method. That is, for example, an amorphous silicon layer or a polysilicon layer is deposited on an insulator (insulating layer) by a CVD method, then, a silicon layer is formed by any one of known single-crystallization methods such as a zone melting crystallization method using laser beam or electron beam and a lateral solid phase epitaxy method in which a crystal is grown through an opening formed in an insulator (insulating layer), and the semiconductor memory cell can be formed in the above silicon layer. Or, an amorphous silicon layer or a polysilicon layer is deposited on an insulator (insulating layer), and then, the semiconductor memory cell can be formed in the above amorphous or polysilicon layer.

Figure 83A:
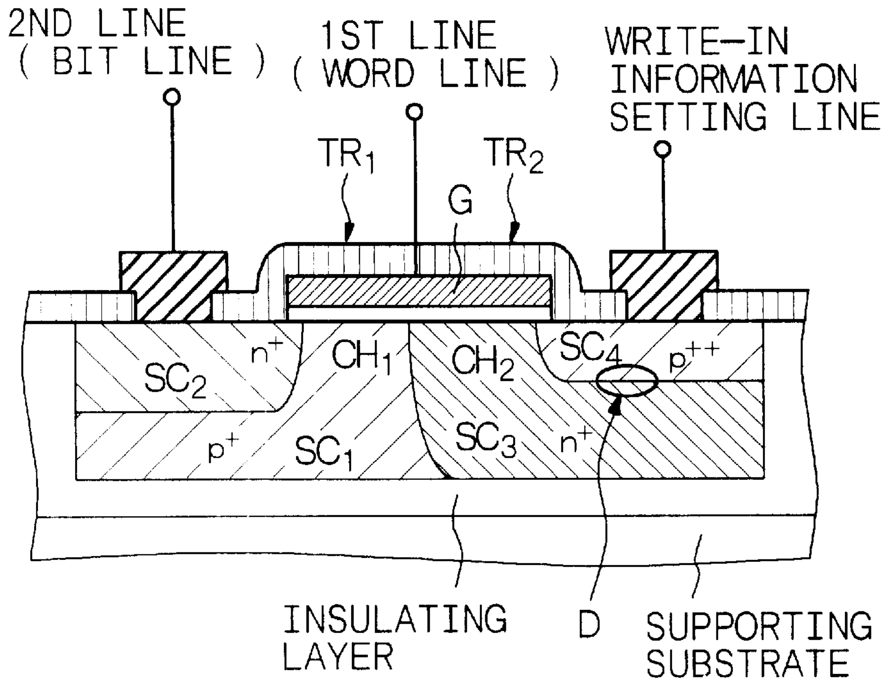
FIGS. 83A and 83B are schematic partial cross-sectional views of modifications of the semiconductor memory cell in Example 10.
Figure 83B:
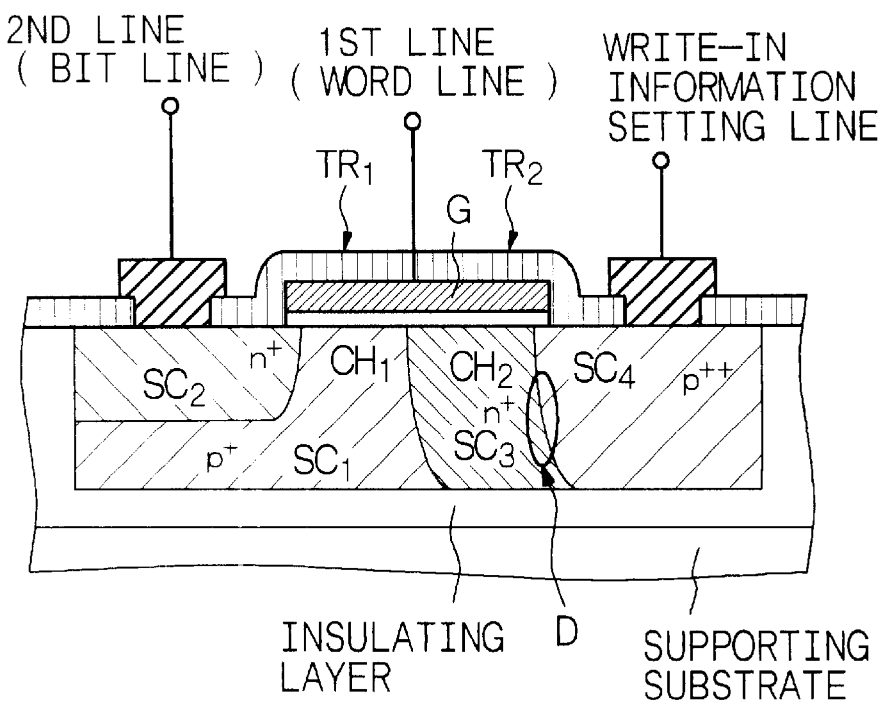
Figure 84A:
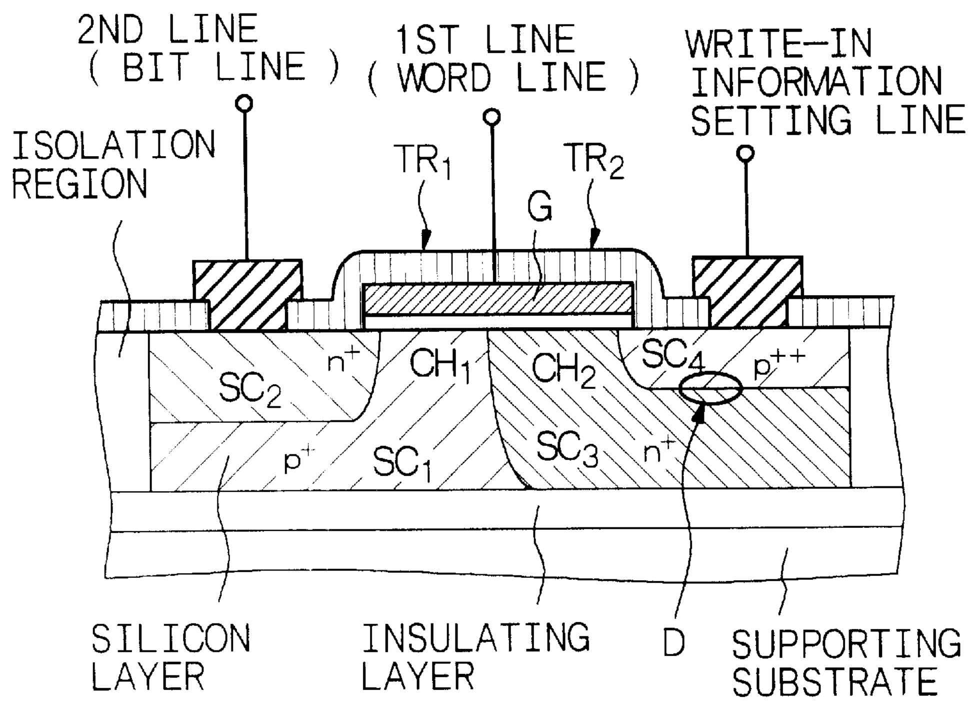
FIGS. 84A and 84B are schematic partial cross-sectional views of modifications of the semiconductor memory cell in Example 10.
Figure 84B:
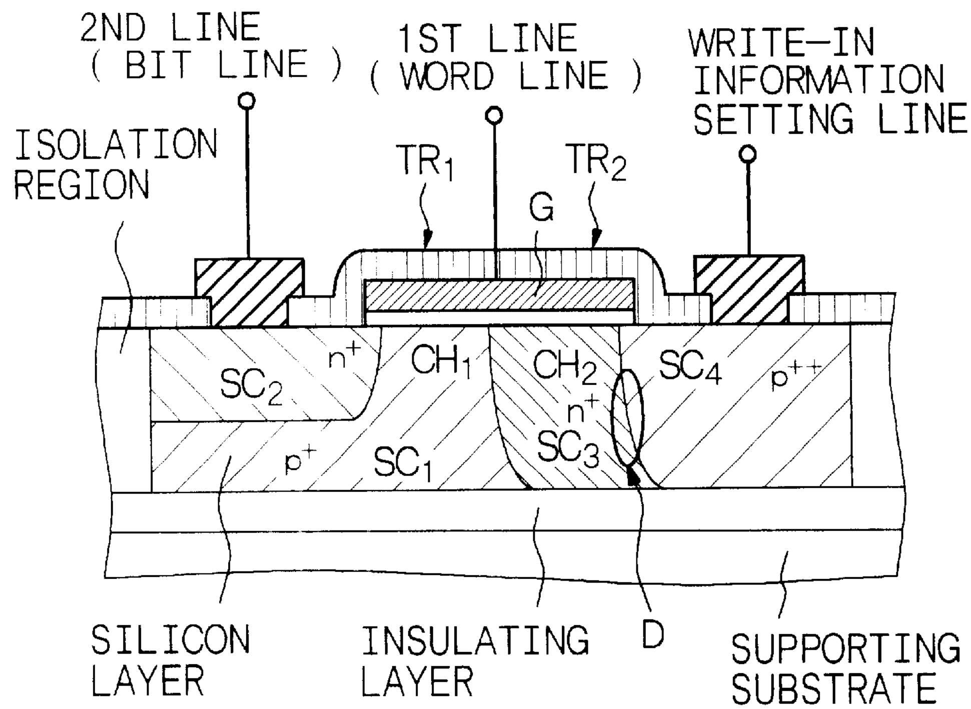

FIGS. 83A, 83B, 84A and 84B show other modifications of the semiconductor memory cell in Example 10. Each of the semiconductor memory cells shown in FIGS. 83A and 83B is formed on an insulator such as, for example, $SiO_2$ and has a so-called SOI structure. In the configuration shown in FIG. 83B, the fourth region $SC_4$ extends towards the insulating layer more deeper than that in the semiconductor memory cell shown in FIG. 83A. This enables draw-out of an electrode to be connected to the write-in information setting line, from the side portion of the fourth region $SC_4$. Each of the semiconductor memory cells shown in FIGS. 84A and 84B has a so-called TFT structure.

EXAMPLE 11

Figure 76B:
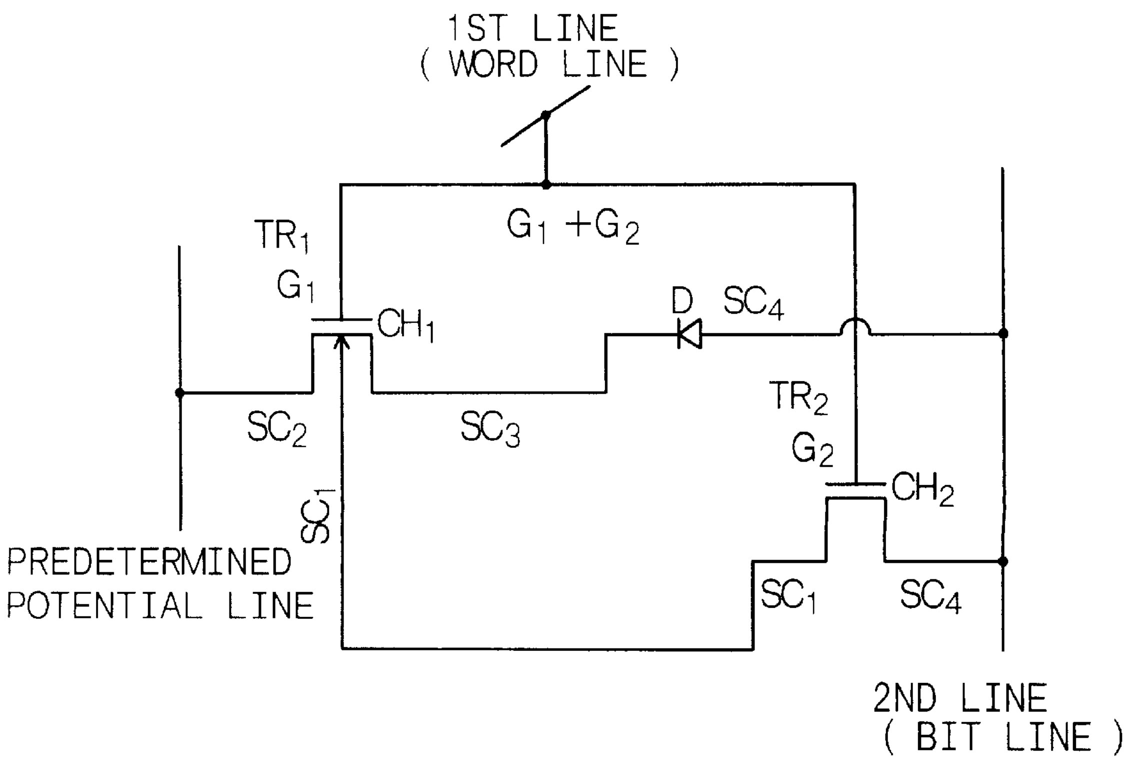
Figure 85A:
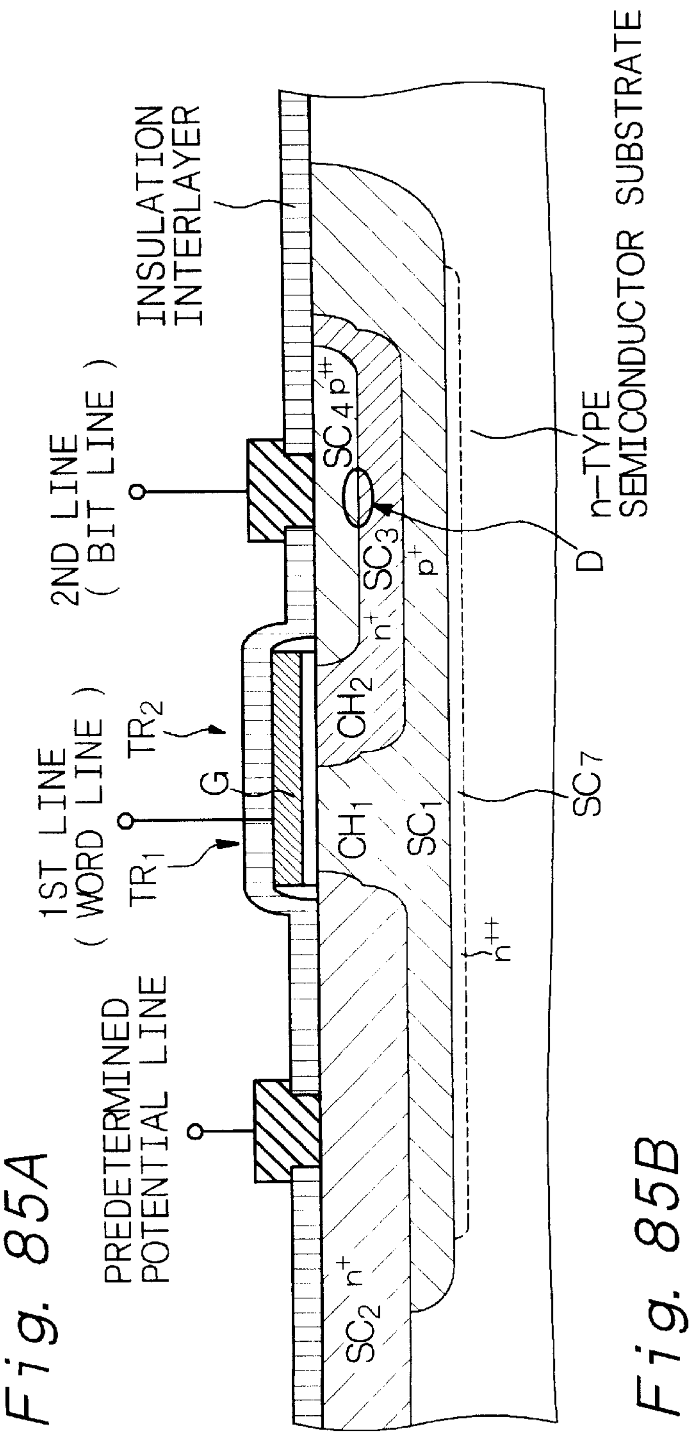
FIGS. 85A and 85B are a schematic partial cross-sectional view and a schematic arrangement of each regions and a gate portion of a semiconductor memory cell in Example 11, respectively.
Figure 85B:
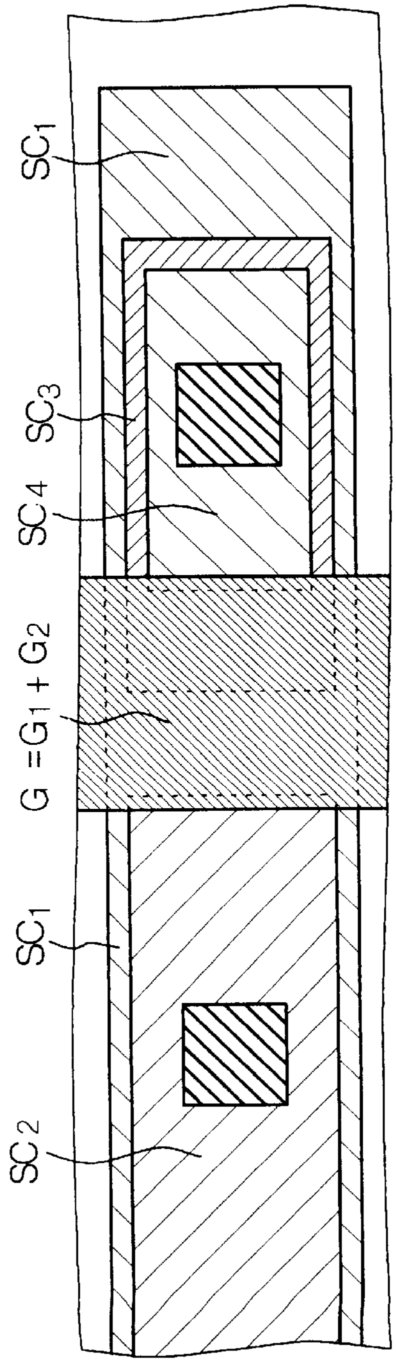

Example 11 is directed to the semiconductor memory cell according to the eleventh aspect of the present invention and is directed to a modification of the semiconductor memory cell according to twelfth aspect of the present invention. For example, as FIG. 76B shows its principle drawing and FIGS. 85A and 85B show the configurations, the semiconductor memory cell of Example 11 has a configuration in which one source/drain region of the first transistor $TR_1$ is connected to a predetermined potential line, and one source/drain region of the second transistor $TR_2$ is connected to a second memory-cell-selecting line (for example, the bit line). The second region $SC_2$ is connected to a predetermined potential line in place of being connected to the second memory-cell-selecting line (for example, the bit line), and the fourth region $SC_4$ is connected to the second memory-cell-selecting line (for example, the bit line) in place of being connected to the write-in information setting line. In Example 11, the second memory-cell-selecting line (for example, the bit line) also serves as the write-in information setting line of the semiconductor memory cell in Example 10. FIG. 85A shows a schematic partial cross-sectional view and FIG. 85B shows a schematic layout of the gate portion and each regions. The semiconductor memory cell in Example 11 has the same configuration as the semiconductor memory cell of Example 10, except the above described points. Detailed explanations thereof are therefore omitted.

Figure 86A:
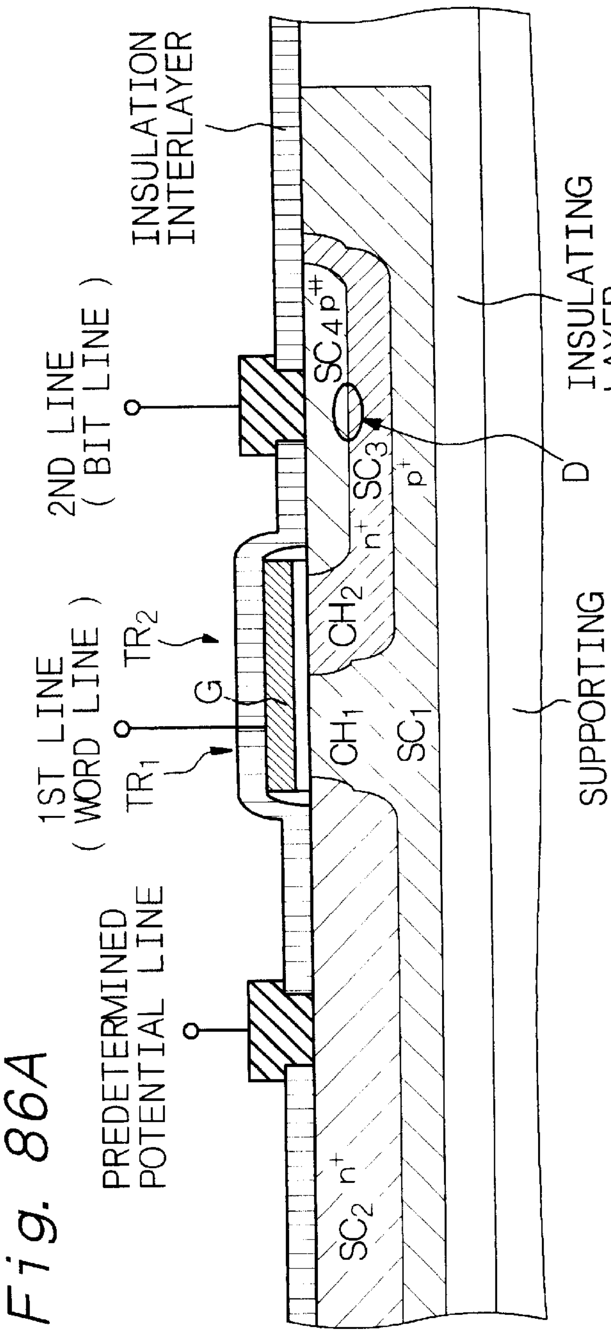
FIGS. 86A and 86B are a schematic partial cross-sectional view and a schematic arrangement of each regions and a gate portion of a modification of the semiconductor memory cell in Example 11, respectively.
Figure 86B:
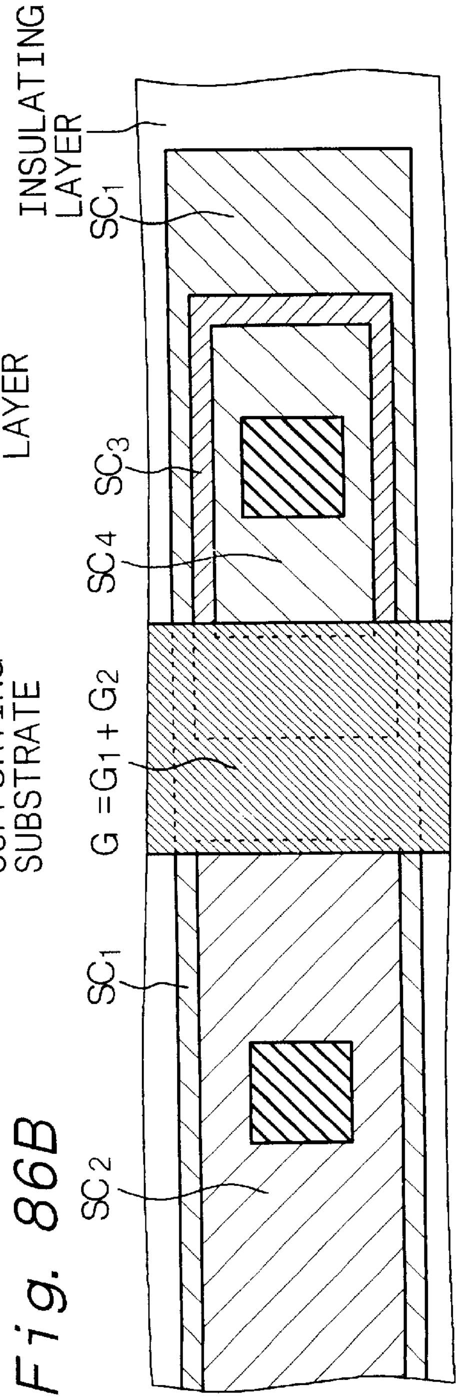
Figure 87A:
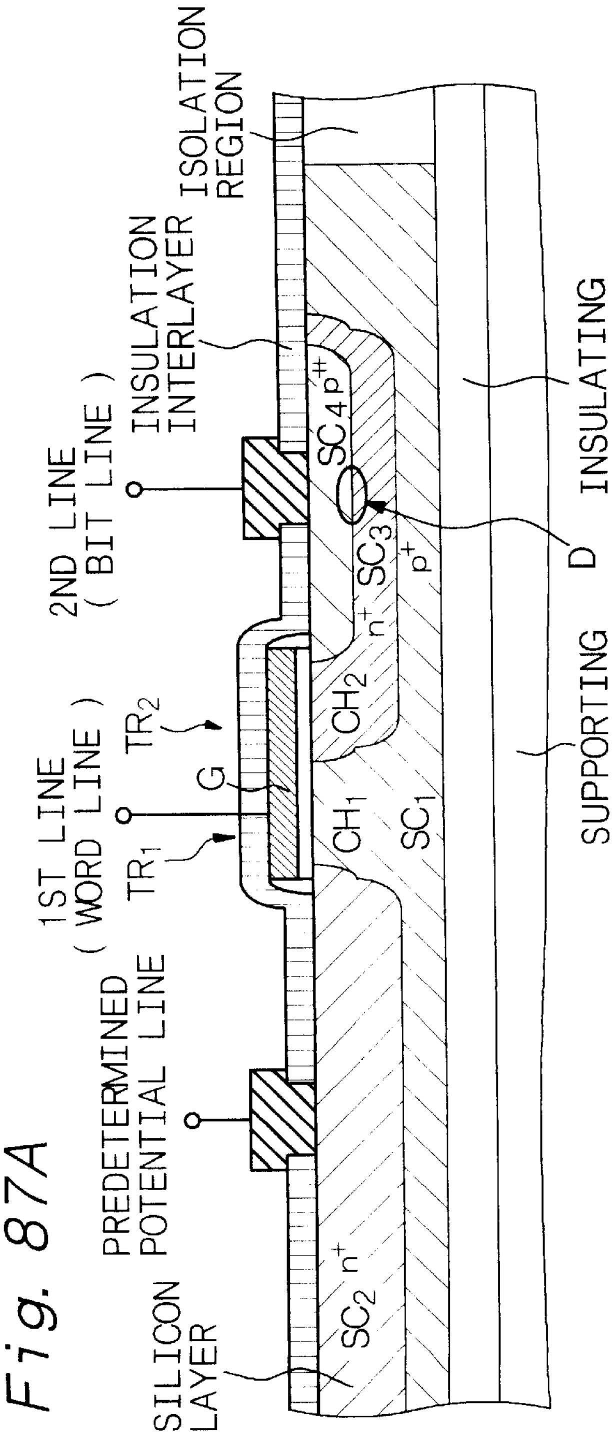
FIGS. 87A and 87B are a schematic partial cross-sectional view and a schematic arrangement of each regions and a gate portion of a modification of the semiconductor memory cell in Example 11, respectively.
Figure 87B:
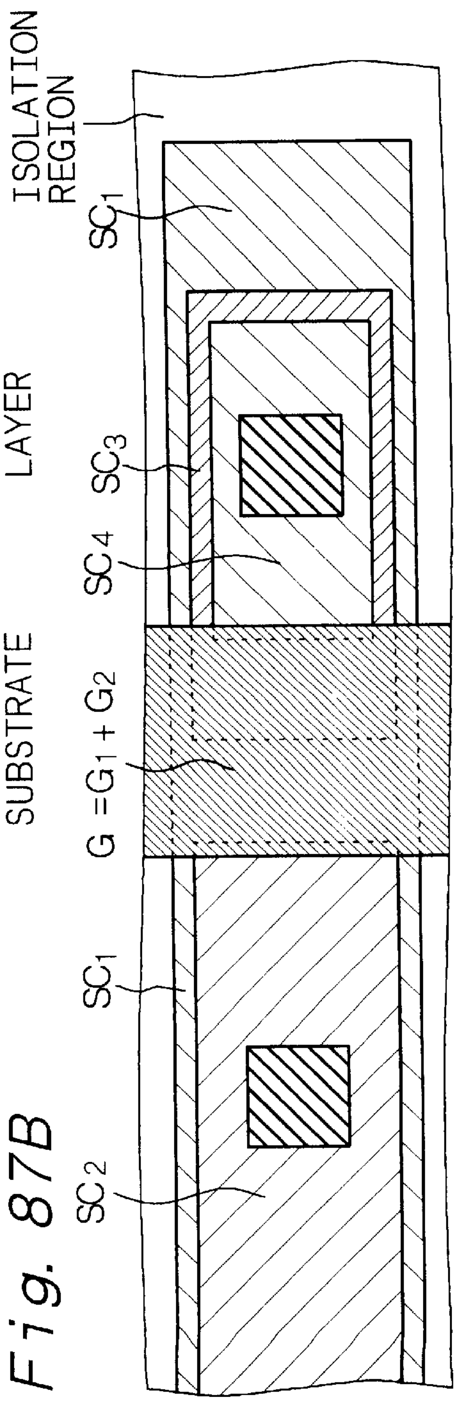

FIGS. 86A, 86B, 87A and 87B show modifications of the semiconductor memory cell in Example 11. The semiconductor memory cell shown in FIGS. 86A and 86B is formed on an insulator such as, for example, $SiO_2$ and has a so-called SOI structure. On the other hand, the semiconductor memory cell shown in FIGS. 87A and 87B has a so-called TFT structure.

Figure 88A:
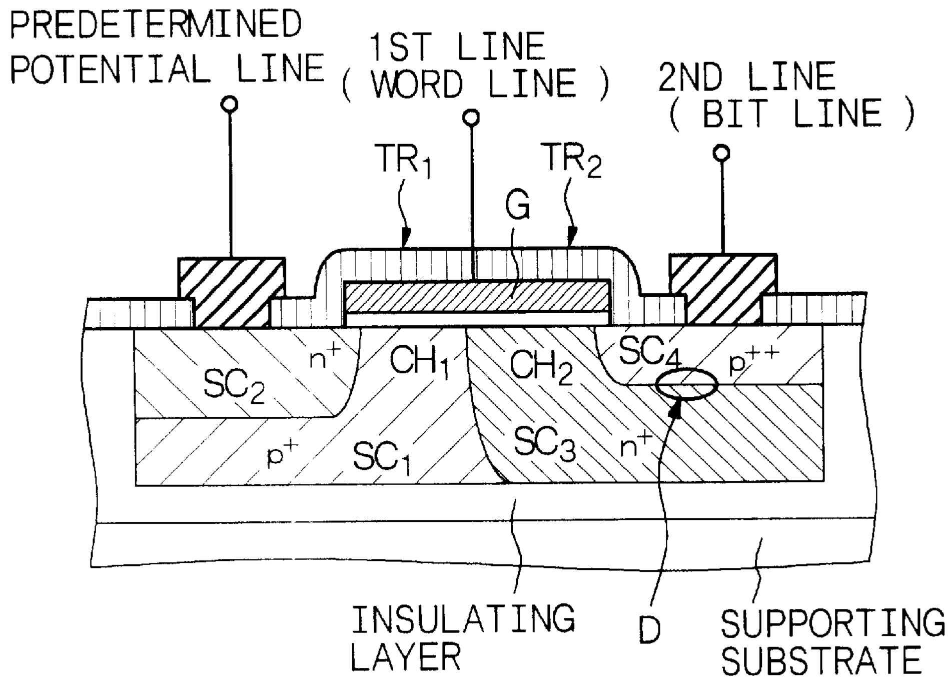
FIGS. 88A and 88B are schematic partial cross-sectional views of modifications of the semiconductor memory cell in Example 11.
Figure 88B:
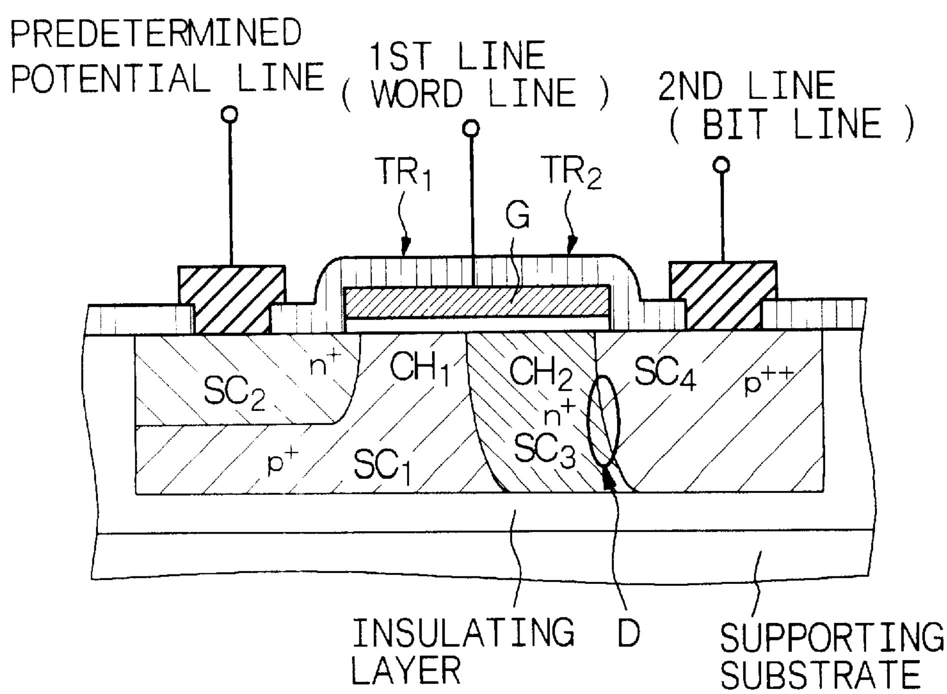
Figure 89A:
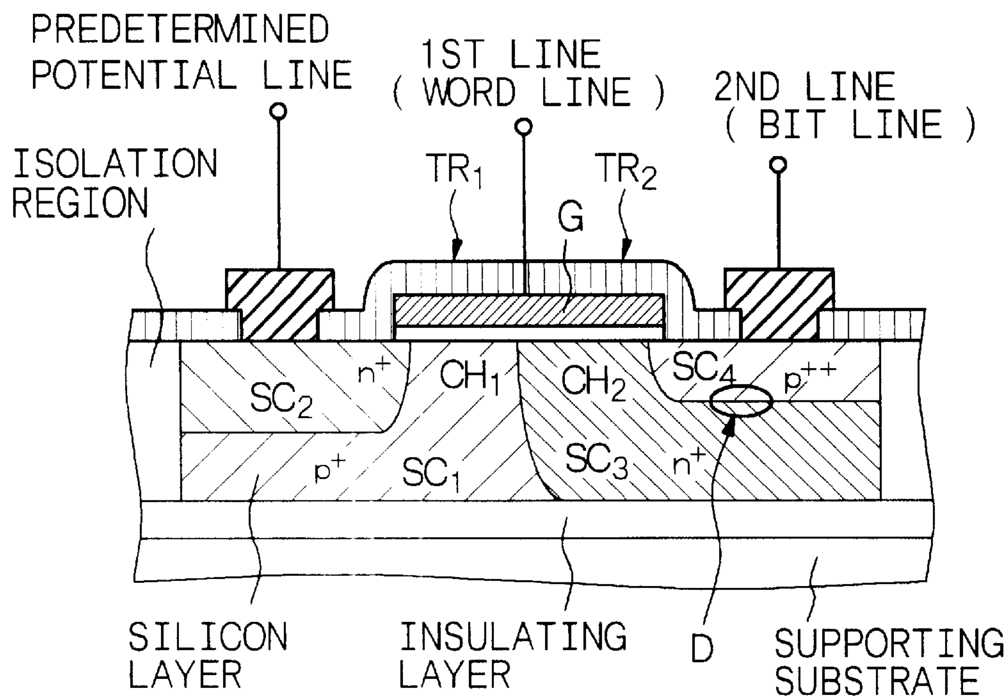
FIGS. 89A and 89B are schematic partial cross-sectional views of modifications of the semiconductor memory cell in Example 11.
Figure 89B:
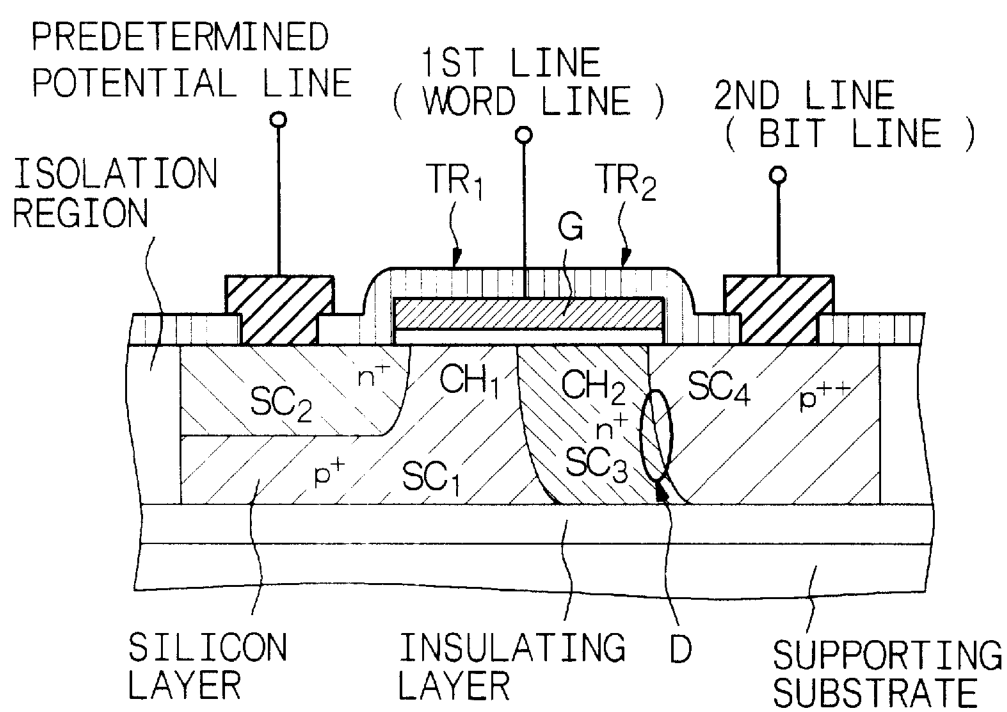

Further, FIGS. 88A, 88B, 89A and 89B show other modifications of the semiconductor memory cell in Example 11. Each of the semiconductor memory cells shown in FIGS. 88A and 88B is formed on an insulator such as, for example, $SiO_2$ and has a so-called SOI structure. In the configuration shown in FIG. 83B, the fourth region $SC_4$ extends towards the insulating layer more deeper than that in the semiconductor memory cell shown in FIG. 83A. This enables draw-out of an electrode to be connected to the write-in information setting line, from the side portion of the fourth region $SC_4$. On the other hand, each of the semiconductor memory cells shown in FIGS. 89A and 89B has a so-called TFT structure.

EXAMPLE 12

Figure 77A:
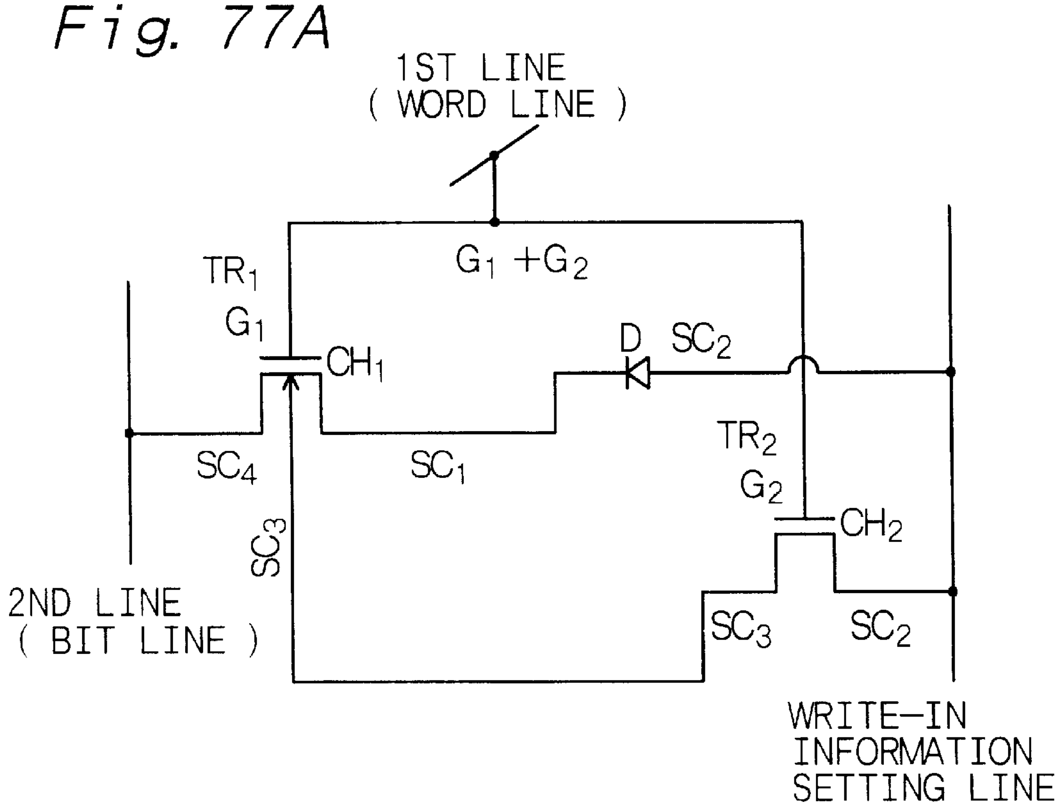
FIGS. 77A and 77B are principle drawings of the semiconductor memory cells according to the tenth and the eleventh aspects of the present invention.
Figure 90A:
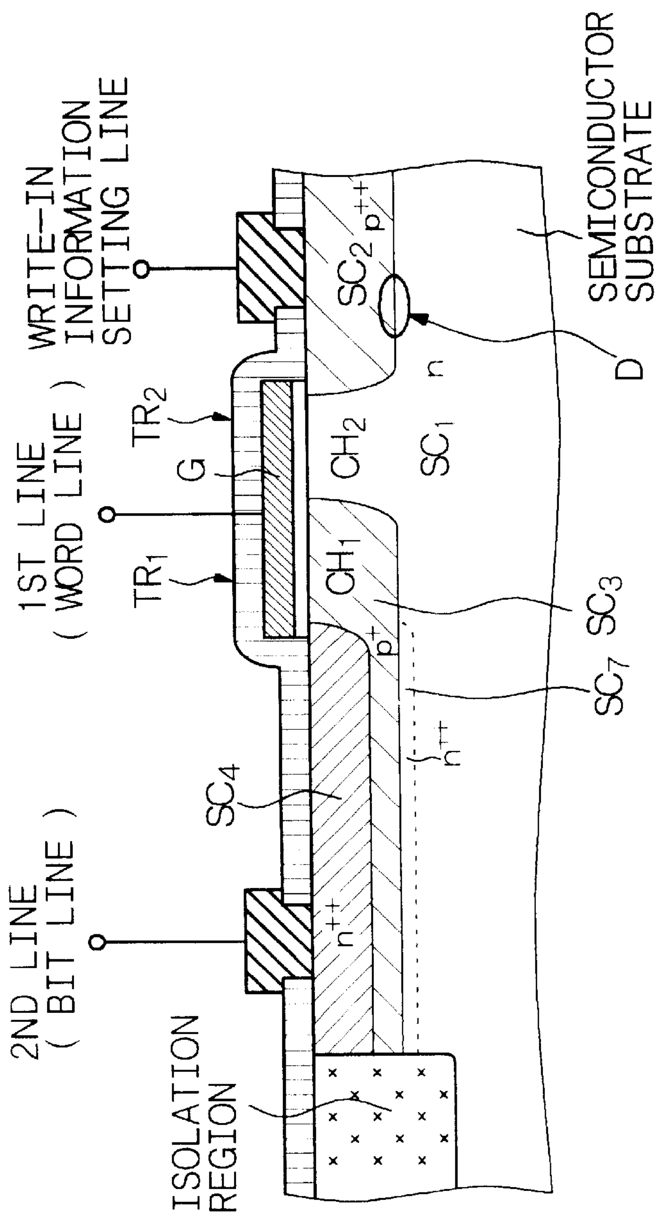
FIGS. 90A and 90B are a schematic partial cross-sectional view and a schematic arrangement of each regions of a semiconductor memory cell in Example 12, respectively.
Figure 90B:
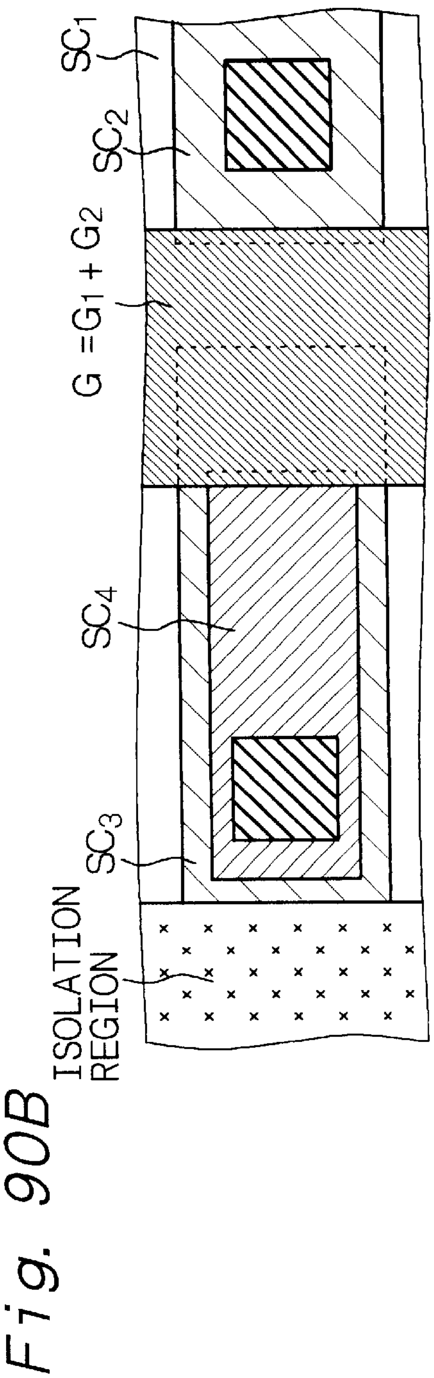

Example 12 is directed to the semiconductor memory cell according to the tenth and thirteenth aspects of the present invention. For example, as FIG. 77A shows its principle drawing and FIGS. 90A and 90B show the configurations, the semiconductor memory cell of Example 12 comprises a first transistor of a first conductivity type (e.g., n-type) for read-out $TR_1$, a second transistor of a second conductivity type (e.g., p-type) for write-in $TR_2$ and a diode D. FIG. 90A shows a schematic partial cross-sectional view and FIG. 90B shows a schematic layout of the gate portion and each regions.

Concerning the first transistor $TR_1$;

(A-1) one source/drain region is connected to a second memory-cell-selecting line (for example, a bit line), and (A-2) the other source/drain region constitutes one end of the diode D.

Concerning the second transistor $TR_2$;

(B-1) one source/drain region is connected to a write-in information setting line and constitutes other end of the diode D, and (B-2) the other source/drain region functions (or serves) as a channel forming region $CH_1$ of the first transistor $TR_1$.

A gate portion $G_1$ and $G_2$ shared by the first transistor $TR_1$ and the second transistor $TR_2$ is connected to a first memory-cell-selecting line (for example, a word line).

Or, the semiconductor memory cell of Example 12 has;

(1) a first semi-conductive region $SC_1$ of the first conductivity type (for example, n-type), (2) a second semi-conductive or conductive region $SC_2$ forming a rectifier junction together with the first region $SC_1$, (more specifically, in Example 12, a second semi-conductive region $SC_2$ of the first conductivity type (for example, $n^+$-type) opposite to the second conductivity type, or a second conductive region $SC_2$ formed of a silicide, a metal or a metal compound, said second region $SC_2$ being formed in a surface region $SC_1$ and forming a rectifier junction together with the first region $SC_1$), (3) a third semi-conductive region $SC_3$ of the second conductivity type (for example, $p^+$-type), in contact with the first region $SC_1$ (more specifically, formed in a surface region of the first region $SC_1$) and spaced from the second region $SC_2$, (4) a fourth semi-conductive region $SC_4$ of the first conductivity type (for example, $n^+$-type), or a fourth conductive region $SC_4$ formed of a silicide, a metal or a metal compound, said fourth region $SC_4$ being formed in a surface region of the third region $SC_3$ and forming a rectifier junction together with the third region $SC_3$, and (5) a gate portion $G_1$ and $G_2$ shared by the first transistor $TR_1$ and the second transistor $TR_2$, and formed on a barrier layer so as to bridge the second region $SC_2$ and the third region $SC_3$ and so as to bridge the first region $SC_1$ and the fourth region $SC_4$.

Concerning the first transistor $TR_1$;

(A-1) one source/drain region is constituted of the fourth region $SC_4$, (A-2) the other source/drain region is constituted of the first region $SC_1$, and (A-3) a channel forming region $CH_1$ is constituted of a surface region of the third region $SC_3$ sandwiched by (or interposed between) the first region $SC_1$ and the fourth region $SC_4$.

Concerning the second transistor $TR_2$;

(B-1) one source/drain region is constituted of the second region $SC_2$, (B-2) the other source/drain region is constituted of the third region $SC_3$, and (B-3) a channel forming region $CH_2$ is constituted of a surface region of the first region $SC_1$ sandwiched by (or interposed between) the second region $SC_2$ and the third region $SC_3$.

In the semiconductor memory cell of Example 12, the diode D is constituted of the first region $SC_1$ and the second region $SC_2$; the gate portion $G_1$ of the first transistor $TR_1$ and the gate portion $G_2$ of the second transistor $TR_2$ are connected to a first memory-cell-selecting line (for example, a word line); the fourth region $SC_4$ is connected to a second memory-cell-selecting line (for example, a bit line); and the second region $SC_2$ is connected to a write-in information setting line.

When a pn junction is formed of the second region $SC_2$ and the first region $SC_1$ in the semiconductor memory cell of Example 12, and if the potential setting in the second region $SC_2$ or the designing of impurity concentration relationships between the second region $SC_2$ and the first region $SC_1$ is improper, “latch-up” may take place when the information is read out. For avoiding the above problem, the voltage which is applied to the write-in information setting line is required to be a low degree of voltage (0.4 volt or lower) at which no large forward current flows in the junction portion (that is, the diode D) of the second region $SC_2$ and the first region $SC_1$. When the second region $SC_2$ is constituted of a silicide, a metal or a metal compound, a Schottky junction in which majority carrier mainly constitutes a forward current is formed between the second region $SC_2$ and the first region $SC_1$, whereby the risk of latch-up can be avoided, and the limitation on the voltage applied to the write-in information setting line is no longer necessary.

The semiconductor memory cell of Example 12 is formed in a well having the first conductivity type (for example, n-type) formed in a semiconductor substrate.

The method for manufacturing the semiconductor memory cell of Example 12 will be explained with reference to FIGS. 91A, 91B, 92A, 92B, 93A and 93B.

[Step-1200]

Figure 91A:
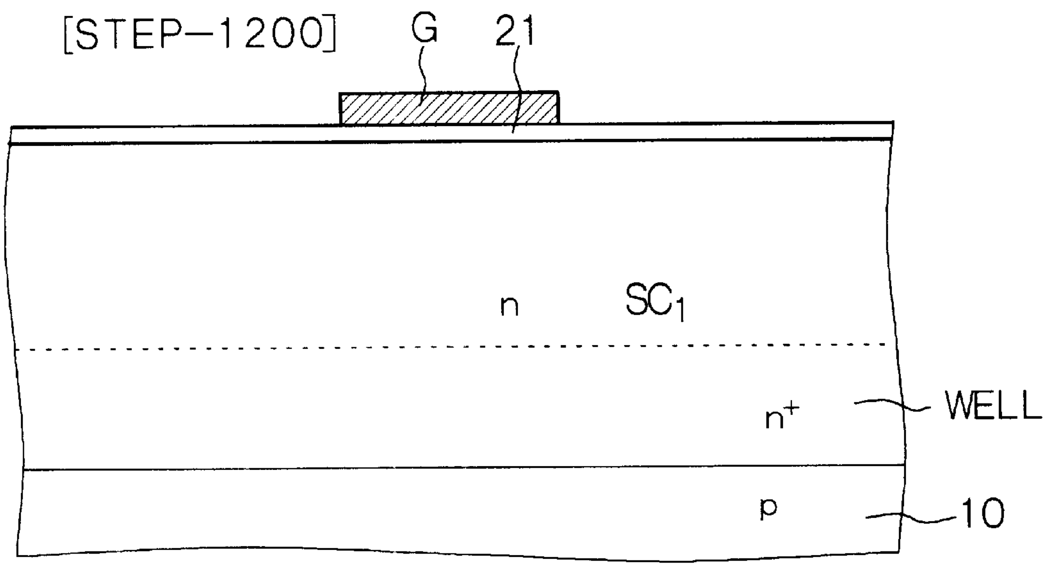
FIGS. 91A and 91B are schematic partial cross-sectional views of a semiconductor substrate, etc., for the explanation of a manufacturing method of the semiconductor memory cell in Example 12.

According to known methods, in a p-type silicon semiconductor substrate 10, formed are an isolation region (not shown), an n-type well, the first semi-conductive region $SC_1$ of n-type and a gate oxide film 21 corresponding to the barrier layer. The gate portion $G_1$ which is constituted of impurity-doped polysilicon or has a polyside structure, is then formed. Thus, a structure shown in FIG. 91A is obtained.

[Step-1210]

Figure 91B:
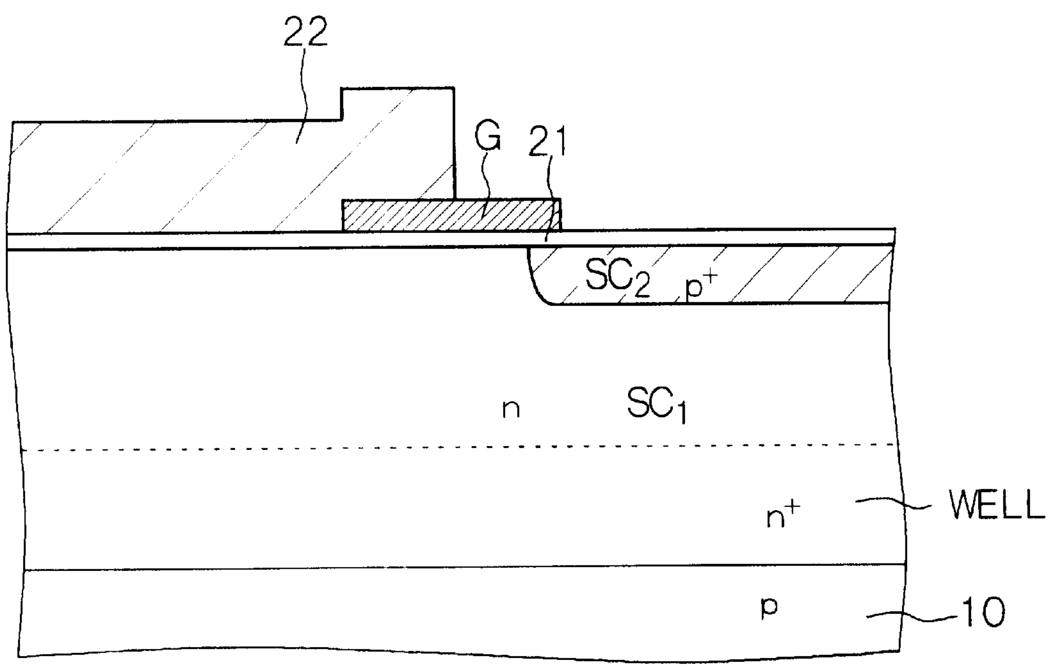

Next, an ion implantation mask 22 is formed from a resist material, and an impurity of the second conductivity type (for example, p-type) is then ion-implanted to form the second semi-conductive region $SC_2$ in the surface region of the first region $SC_1$ (see FIG. 91B). The second region $SC_2$ forms a rectifier junction together with the first region $SC_1$.

[Step-1220]

The ion implantation mask 22 is then removed, another ion implantation mask 23 is formed from a resist material, and an impurity ion of the second conductivity type (for example, p-type) is obliquely ion-implanted to form the third semi-conductive region $SC_3$ of the second conductivity type in the surface region of the first region $SC_1$. The third region $SC_3$ is spaced from the second region $SC_2$, using such oblique ion implantation technique will allow the third region $SC_3$ to be formed under and beyond the edge of the gate portion G (see FIG. 92A).

[Step-1230]

Figure 92A:
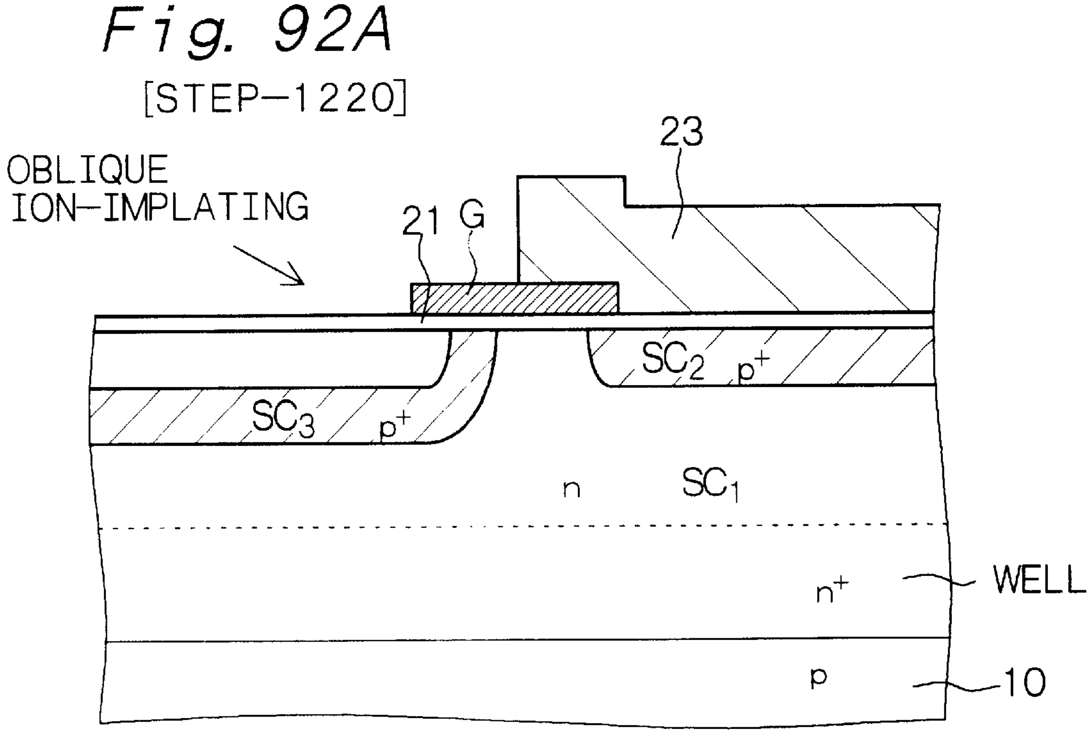
FIGS. 92A and 92B, subsequent to FIG. 91B, are schematic partial cross-sectional views of a semiconductor substrate, etc., for the explanation of a manufacturing method of the semiconductor memory cell in Example 12.
Figure 92B:
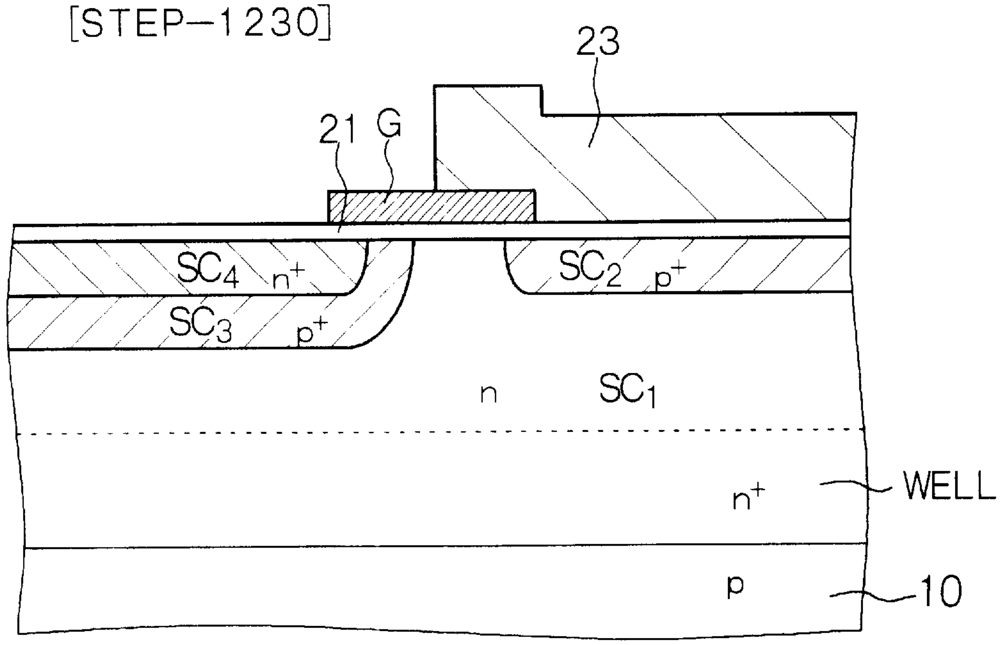
Figure 93A:
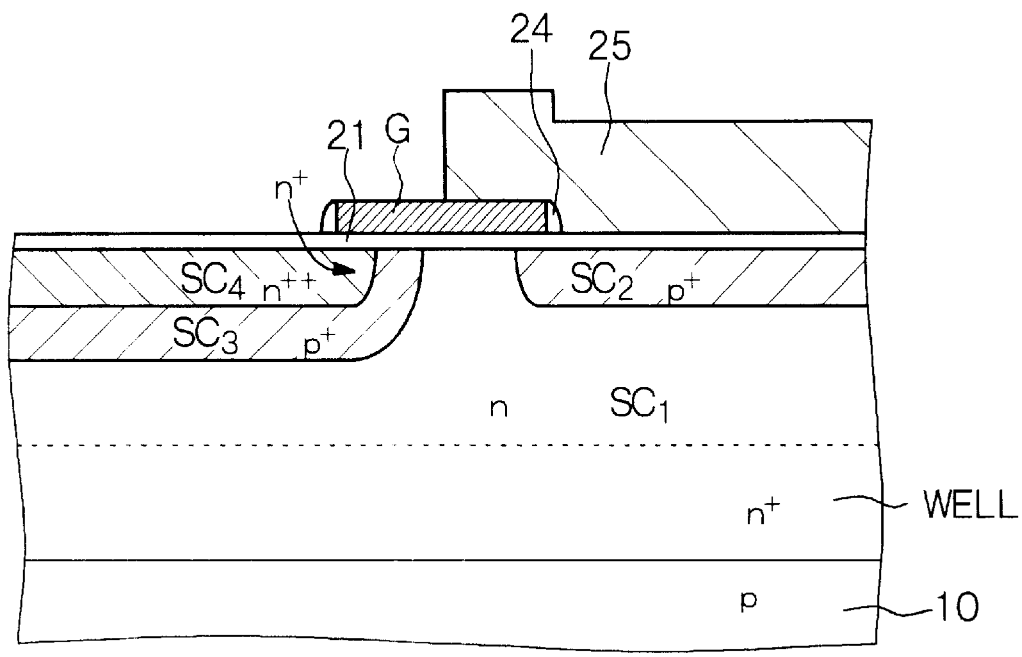
FIGS. 93A and 93B, subsequent to FIG. 92B, are schematic partial cross-sectional views of a semiconductor substrate, etc., for the explanation of a manufacturing method of the semiconductor memory cell in Example 12.
Figure 93B:
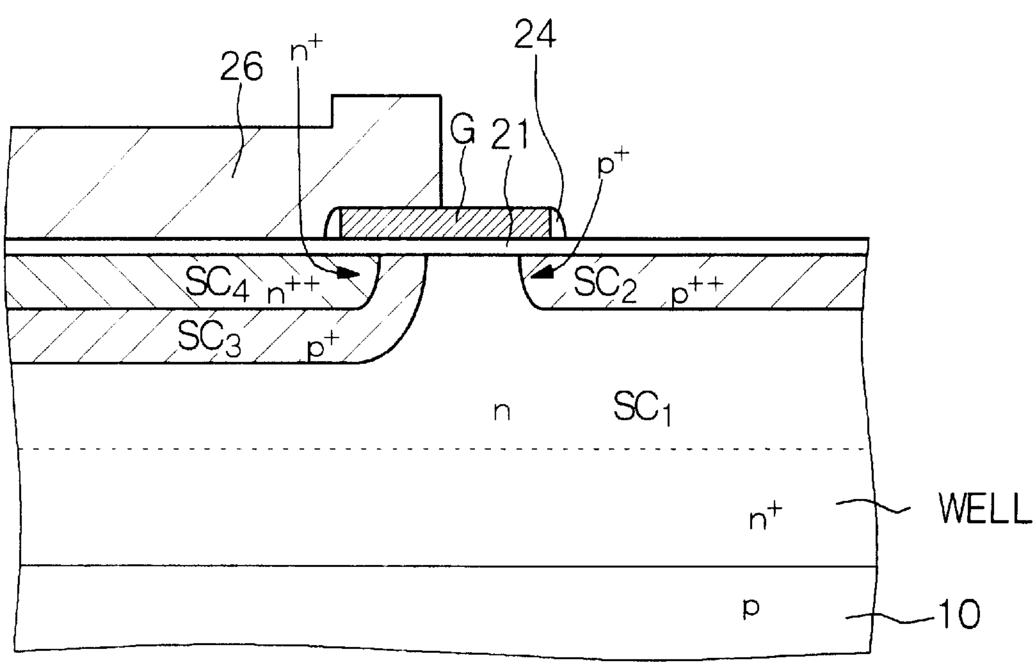

Then, an impurity of the first conductivity type (for example, n-type) is ion-implanted to form the fourth semiconductive region $SC_4$ in the surface region of the third region $SC_3$ (see FIG. 92B). The fourth region $SC_4$ forms a rectifier junction together with the third region $SC_3$.

[Step-1240]

After the ion implantation mask 23 is removed, an $SiO_2$ layer is deposited on the entire surface by a CVD method and then is etched back to form sidewalls 24 on the both lateral planes of the gate portion G.

[Step-1250]

An ion implantation mask 25 is then formed from a resist material, and an impurity of the first conductivity type (n-type, for example) is ion-implanted to increase an impurity concentration of the fourth region $SC_4$ up to an order of approx. $10^{19}$ to $10^{20}$ $cm^{-3}$, which successfully lowers a resistivity of the fourth region $SC_4$ (see FIG. 93A).

[Step-1260]

The ion implantation mask 25 is removed, another ion implantation mask 26 is formed, and an impurity of the second conductivity type (for example, p-type) is ion-implanted to increase an impurity concentration of a portion of the second region $SC_2$ up to an order of approx. $10^{19}$ to $10^{20}$ $cm^{-3}$ which successfully lowers a resistivity of this portion (see FIG. 93B).

[Step-1270]

Afterward, the semiconductor memory cell will be completed according to a conventional fabrication process of MOS transistors.

The manufacturing processes of the semiconductor memory cell of Example 12 are not limited to those described in the above. [Step-1210], for example, may be omissible. An arbitrary order of [Step-1220], [Step-1230] and [Step-1250] is allowable. The gate portion or device isolation region can be formed after [Step-1260]. A region $SC_7$ containing a high concentration of an impurity having the first conductivity type (for example, $n^{++}$-type) is preferably formed under the first region $SC_1$, for increasing a potential or an electric charge stored in the channel forming region $CH_1$ of the first transistor $TR_1$.

Figure 94A:
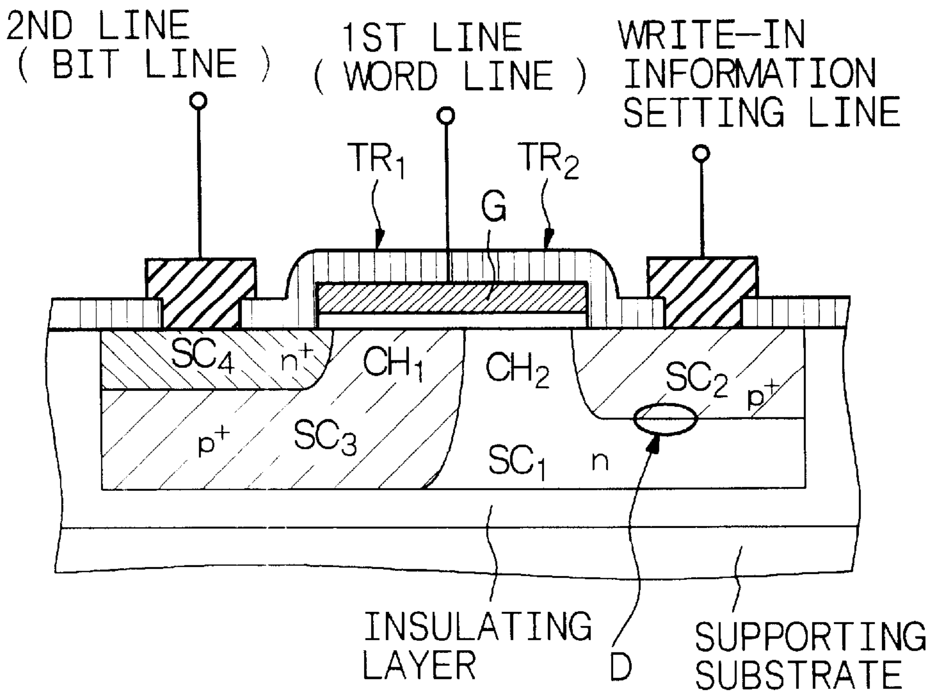
FIGS. 94A and 94B are schematic partial cross-sectional views of modifications of the semiconductor memory cell in Example 12.
Figure 94B:
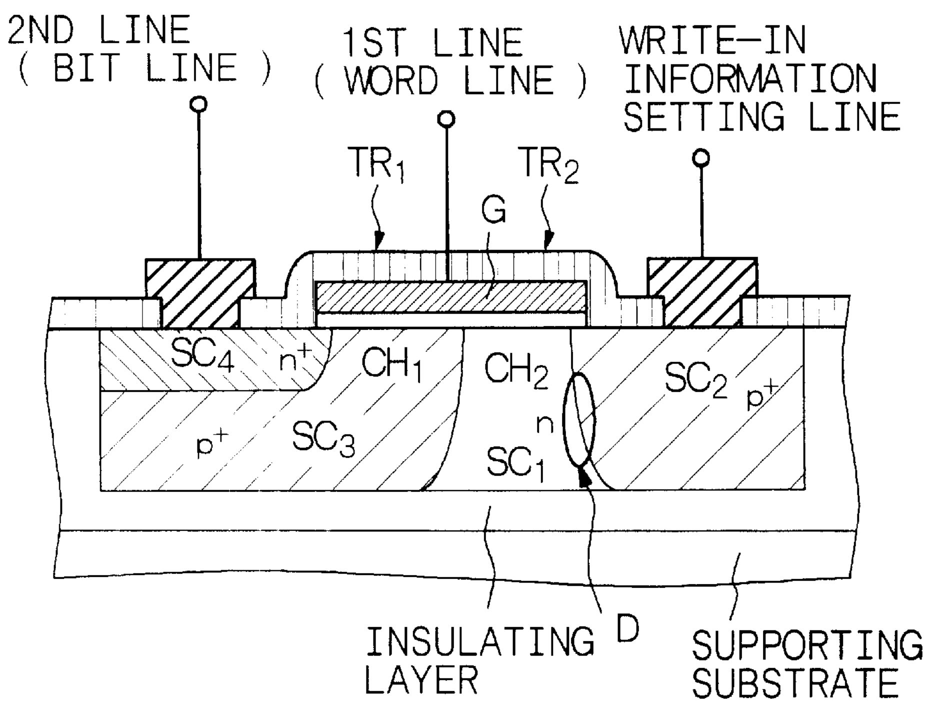
Figure 95A:
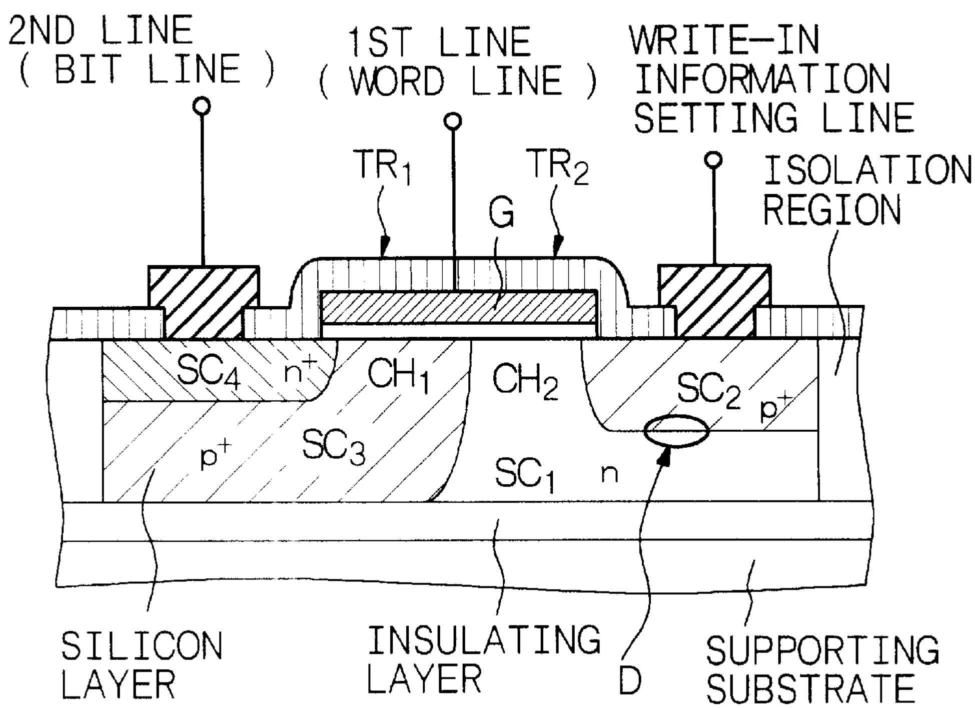
FIGS. 95A and 95B are schematic partial cross-sectional views of modifications of the semiconductor memory cell in Example 12.
Figure 95B:
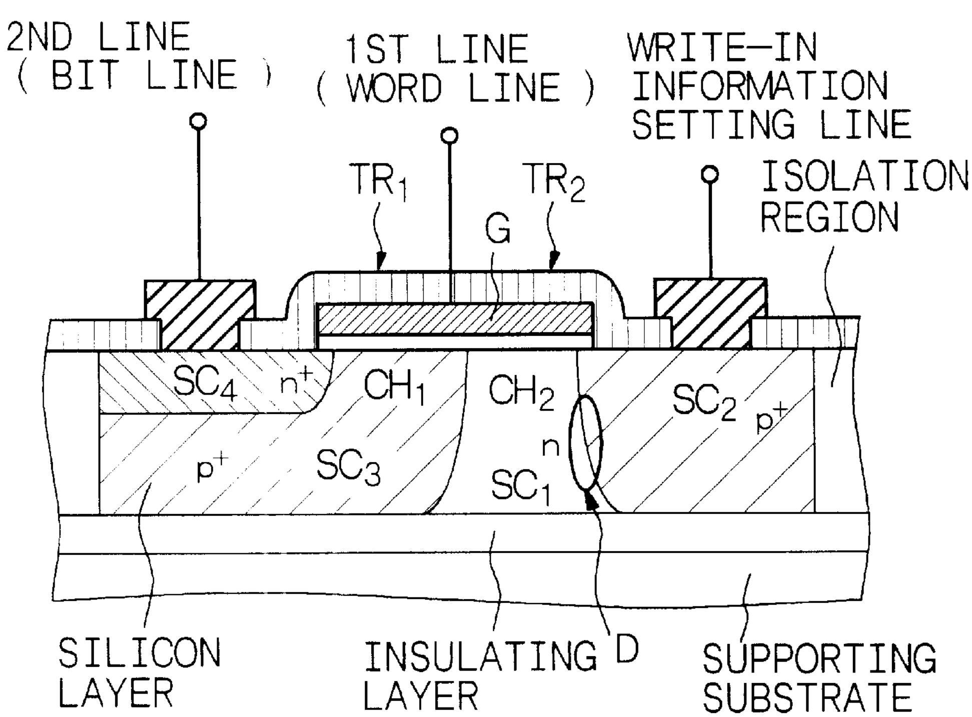

FIG. 94A, 94B, 95A and 95B show modifications of the semiconductor memory cell in Example 12. Each of the semiconductor memory cells shown in FIGS. 94A and 94B is formed on an insulator such as, for example, $SiO_2$ and has a so-called SOI structure. In the configuration shown in FIG. 94B, the second region $SC_2$ extends towards the insulating layer more deeper than that in the semiconductor memory cell shown in FIG. 94A. This enables draw-out of an electrode to be connected to the write-in information setting line, from the side portion of the second region $SC_2$. On the other hand, each of the semiconductor memory cells shown in FIGS. 95A and 95B has a so-called TFT structure.

EXAMPLE 13

Figure 77B:
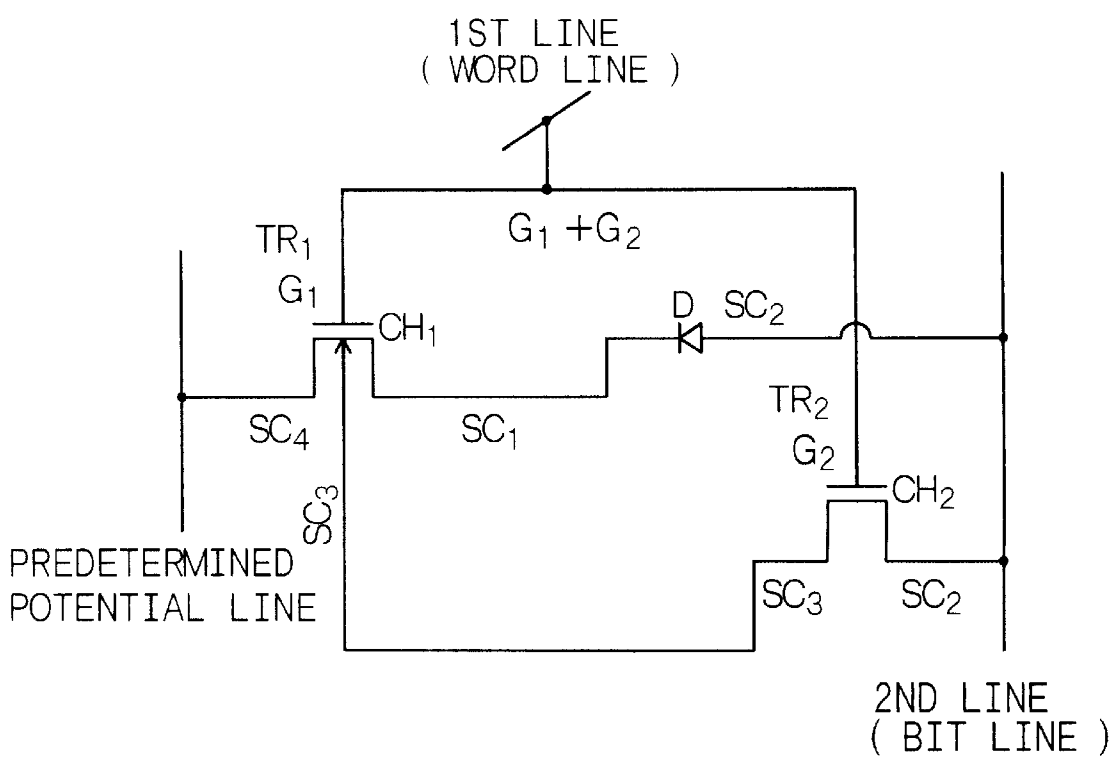
Figure 96A:
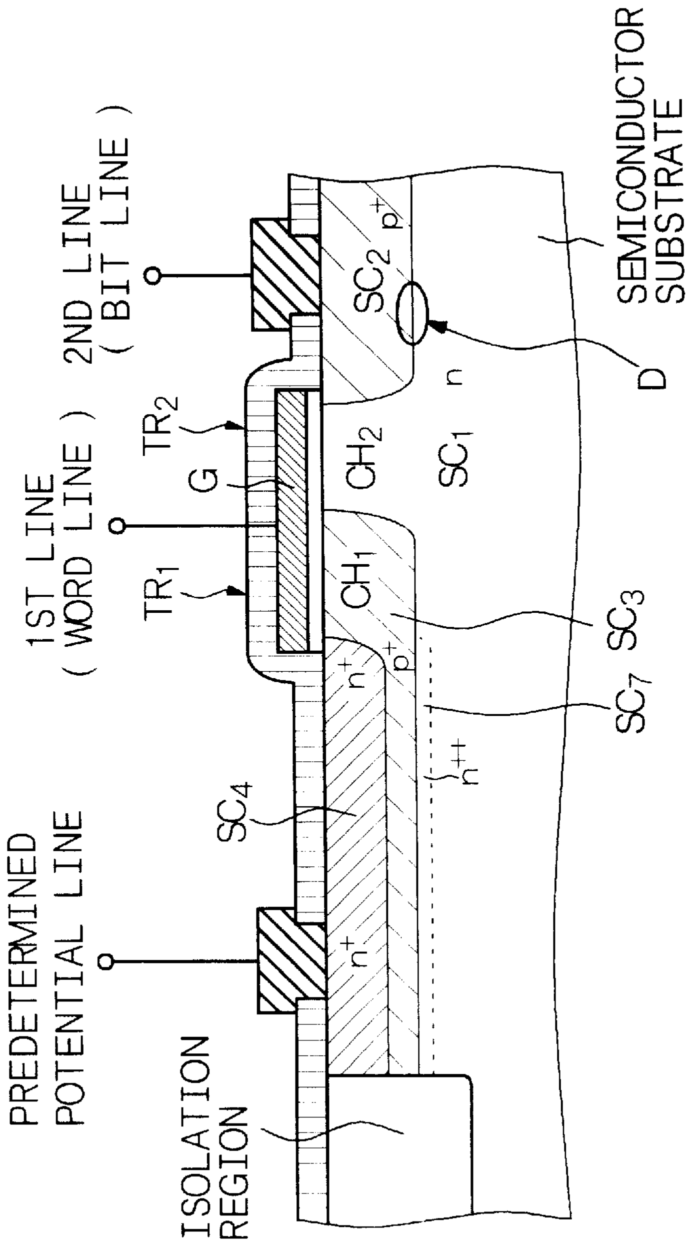
FIGS. 96A and 96B are a schematic partial cross-sectional view and a schematic arrangement of each regions and a gate portion of a semiconductor memory cell in Example 13, respectively.
Figure 96B:
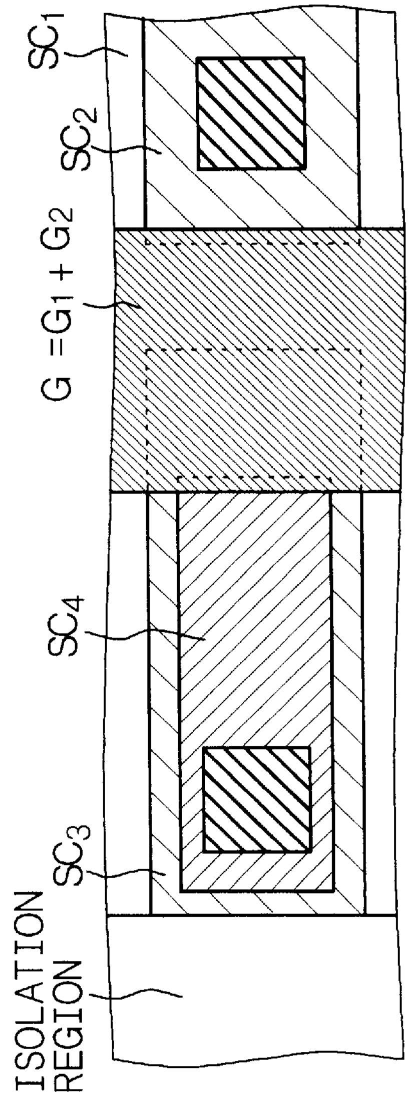

Example 13 is directed to the semiconductor memory cell according to the eleventh aspect of the present invention and is directed to a modification of the semiconductor memory cell according to thirteenth aspect of the present invention. For example, as FIG. 77B shows its principle drawing and FIGS. 96A and 96B show the configurations, the semiconductor memory cell of Example 13 has a configuration in which one source/drain region of the first transistor $TR_1$ is connected to a predetermined potential line, and one source/drain region of the second transistor $TR_2$ is connected to a second memory-cell-selecting line (for example, the bit line). The fourth region $SC_4$ is connected to a predetermined potential line in place of being connected to the second memory-cell-selecting line (for example, the bit line), and the second region $SC_2$ is connected to the second memory-cell-selecting line (for example, the bit line) in place of being connected to the write-in information setting line. In Example 13, the second memory-cell-selecting line (for example, the bit line) also serves as the write-in information setting line of the semiconductor memory cell in Example 12. FIG. 96A shows a schematic partial cross-sectional view and FIG. 96B shows a schematic layout of the gate portion and each regions. The semiconductor memory cell in Example 13 has the same configuration as the semiconductor memory cell of Example 12, except the above described points. Detailed explanations thereof are therefore omitted.

Figure 97A:
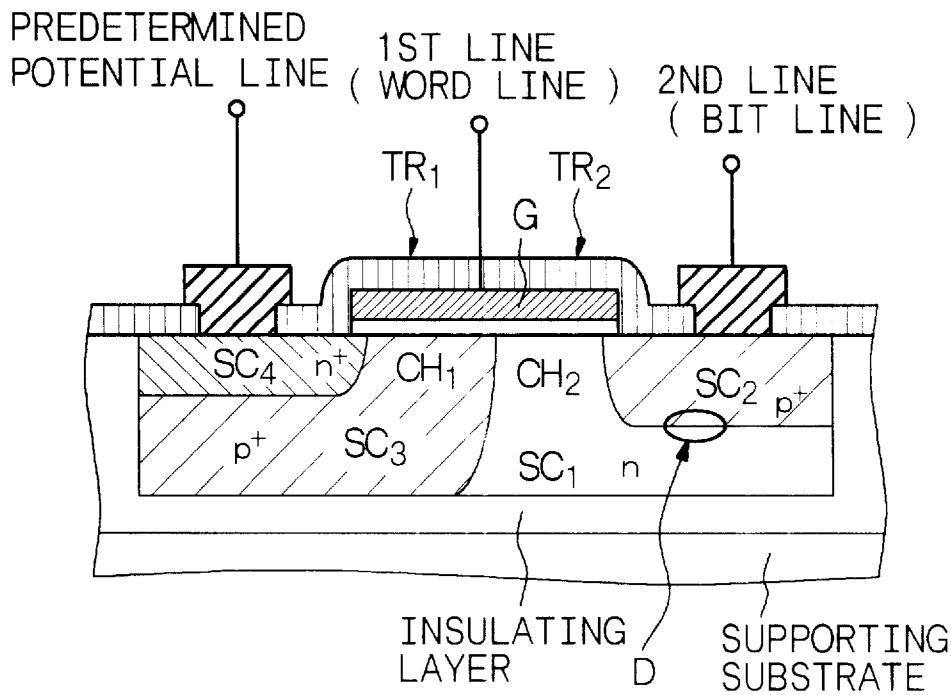
FIGS. 97A and 97B are schematic partial cross-sectional views of modifications of the semiconductor memory cell in Example 13.
Figure 97B:
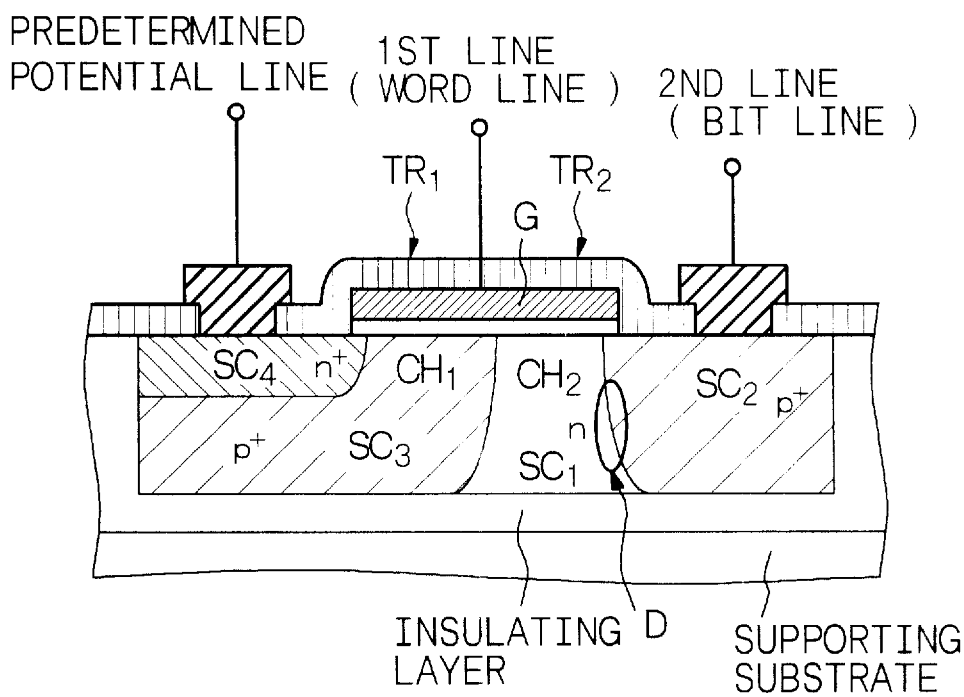
Figure 98A:
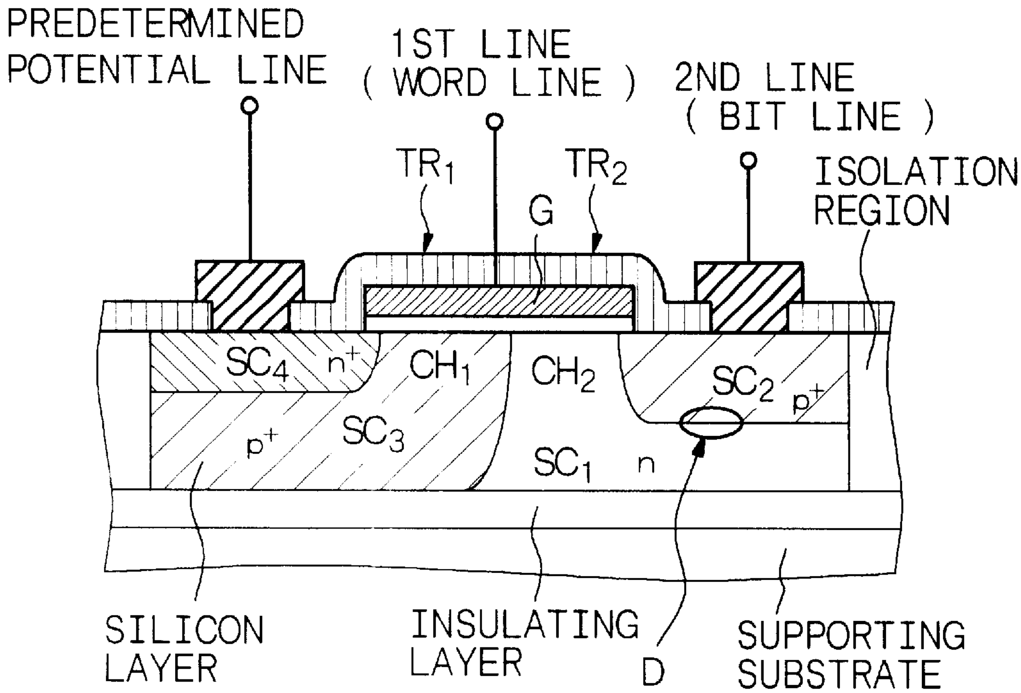
FIGS. 98A and 98B are schematic partial cross-sectional views of modifications of the semiconductor memory cell in Example 13.
Figure 98B:
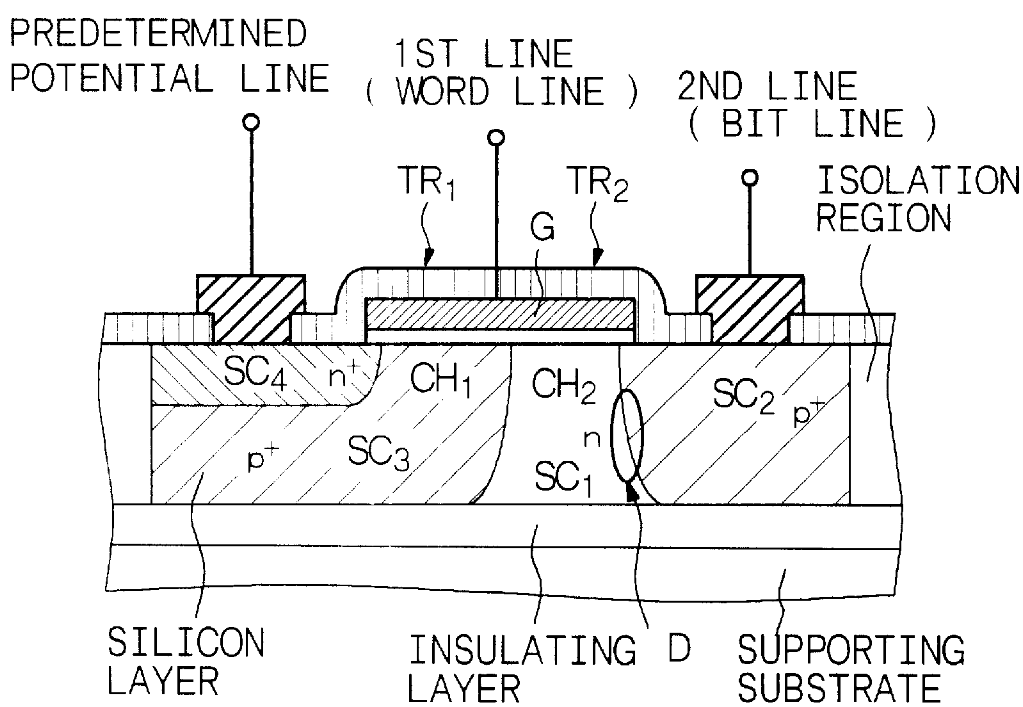

FIG. 97A, 97B, 98A and 98B show modifications of the semiconductor memory cell in Example 13. Each of the semiconductor memory cells shown in FIGS. 97A and 97B is formed on an insulator such as, for example, $SiO_2$ and has a so-called SOI structure. On the other hand, each of the semiconductor memory cells shown in FIGS. 98A and 98B has a so-called TFT structure.

EXAMPLE 14

Figure 101A:
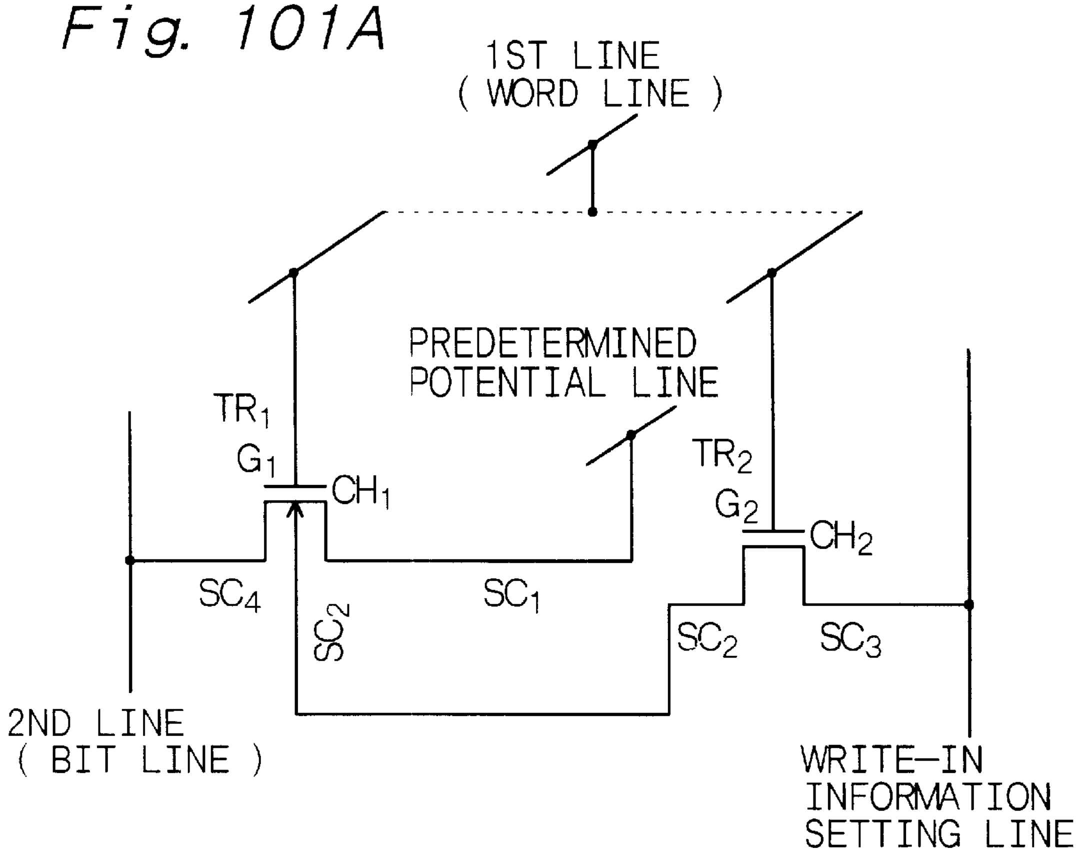
FIGS. 101A and 101B are principle drawings of the semiconductor memory cells according to the fourteenth and the fifteenth aspects of the present invention.
Figure 103A:
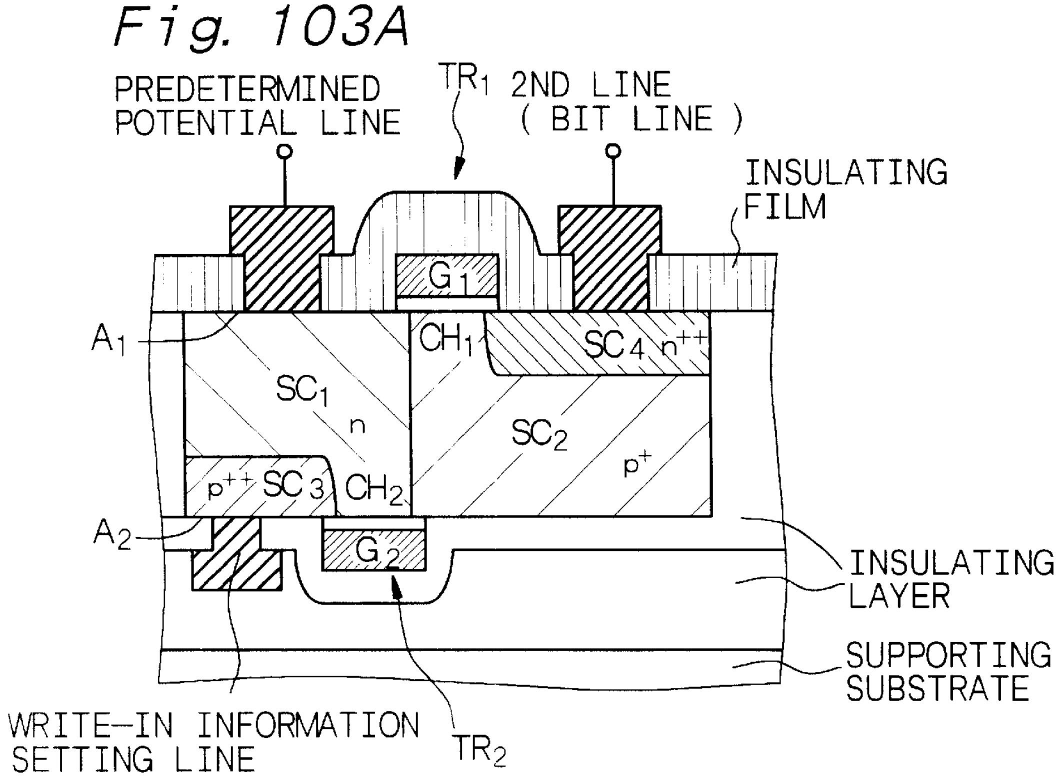
FIGS. 103A and 103B are schematic partial cross-sectional views of a semiconductor memory cells in Example 14.

Example 14 is directed to the semiconductor memory cell according to the fourteenth aspect of the present invention. For example, as FIG. 101A shows its principle drawing and as FIG. 103A shows its schematic partial cross-sectional view, the semiconductor memory cell of Example 14 comprises a first transistor of a first conductivity type (e.g., n-type) for read-out $TR_1$ and a second transistor of a second conductivity type (e.g., p-type) for write-in $TR_2$. The semiconductor memory cell of Example 14 shown in FIG. 103A is provided with a semi-conductive layer having a first main surface $A_1$ and a second main surface $A_2$ opposed to the first main surface $A_1$. In Example 14 shown in FIG. 103A, a gate portion $G_1$ of the first transistor $TR_1$ is formed on the first main surface $A_1$, and a gate portion $G_1$ of the second transistor $TR_2$ is formed on the second main surface $A_2$. The gate portion $G_1$ and the gate portion $G_2$ are slightly off-aligned along a vertical direction. Further, the semiconductor memory cell is formed in the semi-conductive layer surrounded with an insulating layer formed on a supporting substrate and has a so-called SOI structure. In the semiconductor memory cell of Example 14 shown in FIG. 103A, the supporting substrate, the insulating layer, the gate portion $G_2$ of the second transistor $TR_2$ and the gate portion $G_1$ of the first transistor $TR_1$ are arranged in this order from the bottom.

The semiconductor memory cell of Example 14 has;

(1) a first semi-conductive region $SC_1$ of the first conductivity type (for example, n-type), formed through the semi-conductive layer from the first main surface $A_1$ to the second main surface $A_2$, (2) a second semi-conductive region $SC_2$ of the second conductivity type (for example, $p^+$-type) opposite to the first conductivity type, formed through the semi-conductive layer from the first main surface $A_1$ to the second main surface $A_2$ and being in contact with the first region $SC_1$, (3) a third semi-conductive region $SC_3$ of the second conductivity type (for example, $p^{++}$-type), or a third conductive region $SC_3$ formed of a silicide, a metal or a metal compound, said third region $SC_3$ being formed in a surface region, including the second main surface $A_2$, of the first region $SC_1$, spaced from the second region $SC_2$ and forming a rectifier junction together with the first region $SC_1$, (4) a fourth semi-conductive region $SC_4$ of the first conductivity type (for example, $n^{++}$-type), or a fourth conductive region $SC_4$ formed of a silicide, a metal or a metal compound, said fourth region $SC_4$ being formed in a surface region, including the first main surface $A_1$, of the second region $SC_2$, spaced from the first region $SC_1$ and forming a rectifier junction together with the second region $SC_2$, (5) a gate portion $G_1$ of the first transistor $TR_1$ formed on a barrier layer formed on the first main surface $A_1$ so as to bridge the first region $SC_1$ and the fourth region $SC_4$, and (6) a gate portion $G_2$ of the second transistor $TR_2$ formed on a barrier layer formed on the second main surface $A_2$ so as to bridge the second region $SC_2$ and the third region $SC_3$.

Concerning the first transistor $TR_1$;

(A-1) one source/drain region is constituted of the fourth region $SC_4$, (A-2) the other source/drain region is constituted of a surface region, including the first main surface $A_1$, of the first region $SC_1$, and (A-3) a channel forming region $CH_1$ is constituted of a surface region, including the first main surface $A_1$, of the second region $SC_2$ which surface region is sandwiched by (or interposed between) the surface region, including the first main surface $A_1$, of the first region $SC_1$ and the fourth region $SC_4$.

Concerning the second transistor $TR_2$;

(B-1) one source/drain region is constituted of the third region $SC_3$, (B-2) the other source/drain region is constituted of a surface region, including the second main surface $A_2$, of the second region $SC_2$, and (B-3) a channel forming region $CH_2$ is constituted of a surface region, including the second main surface $A_2$, of the first region $SC_1$ which surface region is sandwiched by (or interposed between) the third region $SC_3$ and the surface region, including the second main surface $A_2$, of the second region $SC_2$.

In the semiconductor memory cell of Example 14, the gate portion $G_1$ of the first transistor $TR_1$ and the gate portion $G_2$ of the second transistor $TR_2$ are connected to a first memory-cell-selecting line (for example, a word line); the third region $SC_3$ is connected to a write-in information setting line; the fourth region $SC_4$ is connected to a second memory-cell-selecting line (for example, a bit line); and the other source/drain region of the first transistor $TR_1$ is connected to a predetermined potential line.

Figure 103B:
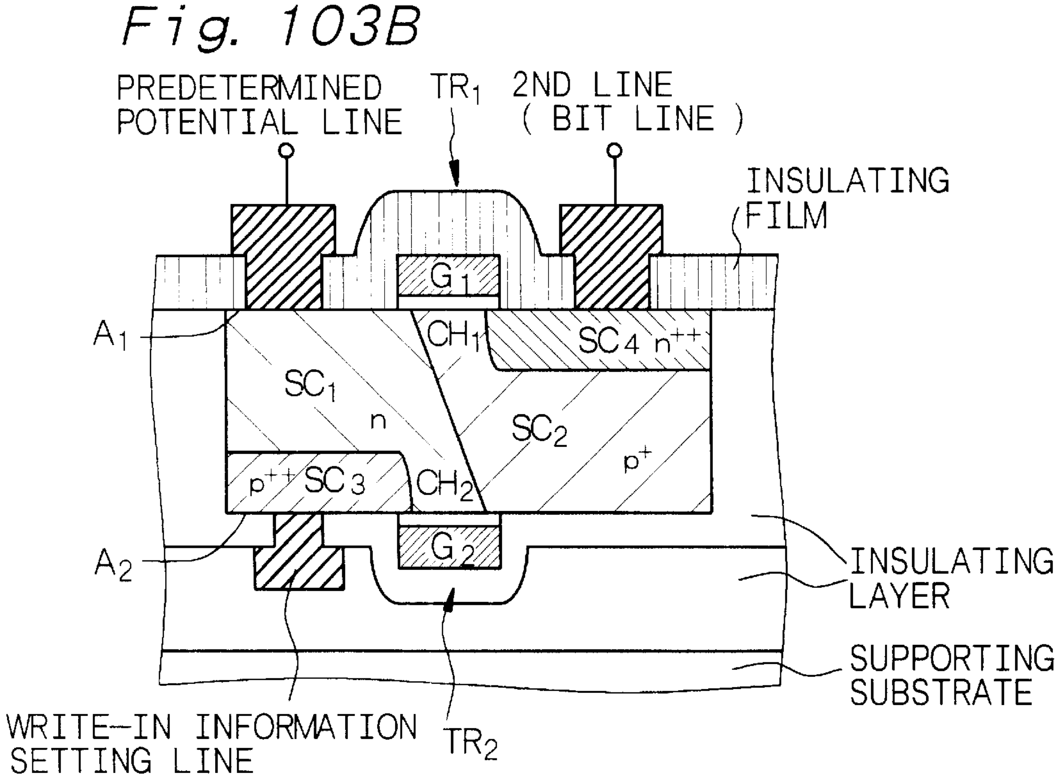
Figure 104A:
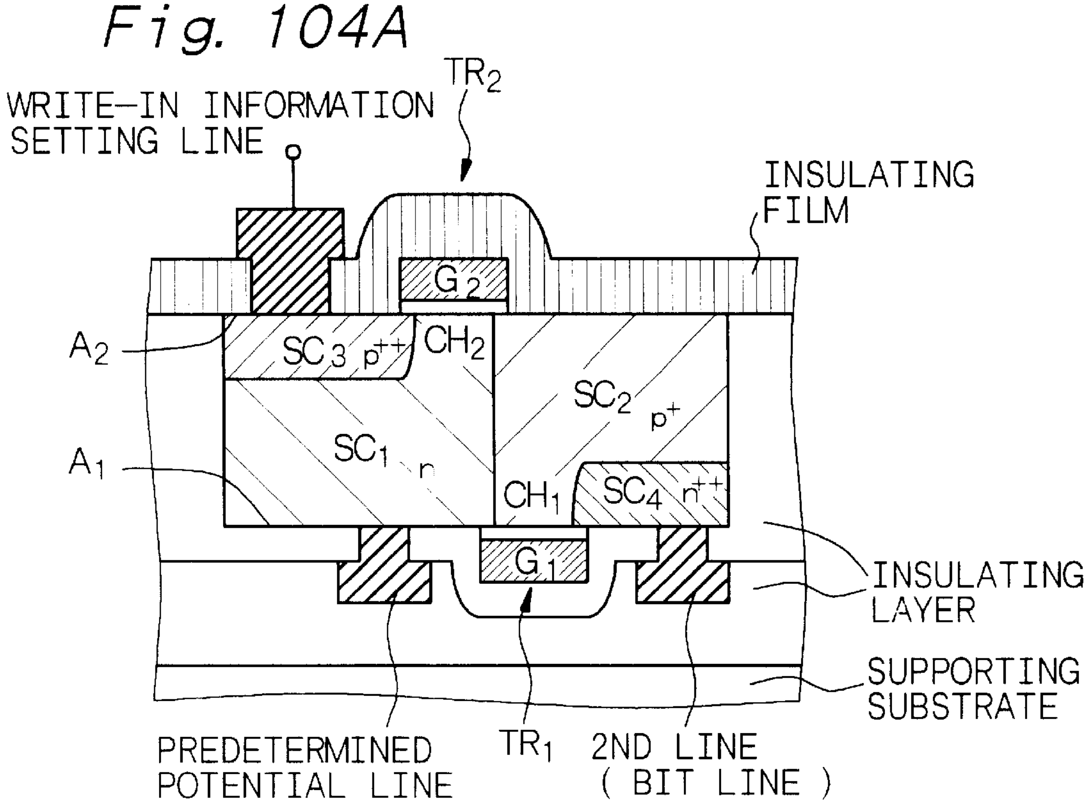
FIGS. 104A and 104B are schematic partial cross-sectional views of modifications of the semiconductor memory cell in Example 14.
Figure 104B:
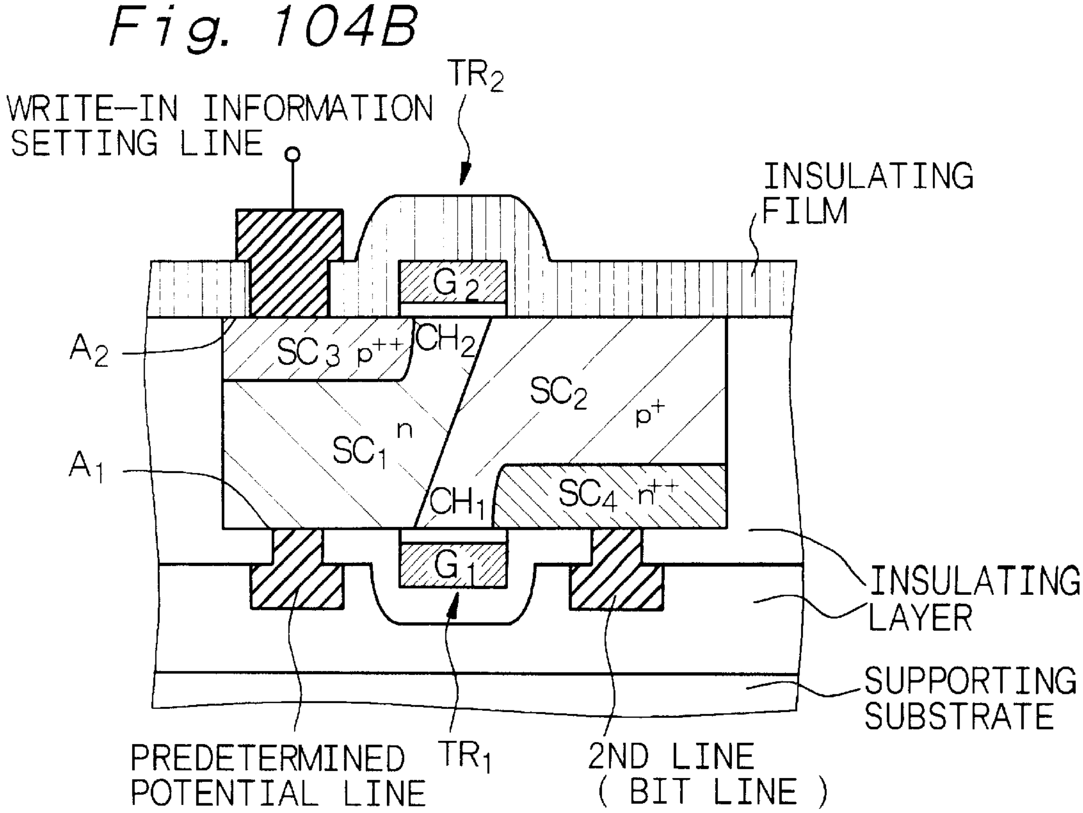

FIGS. 103B, 104A and 104B show schematic partial cross-sectional views of modifications of the semiconductor memory cell in Example 14. The semiconductor memory cell shown in FIG. 103B differs from the semiconductor memory cell shown in FIG. 103A in that the gate portion $G_1$ of the first transistor $TR_1$ and the gate portion $G_2$ of the second transistor $TR_2$ are almost aligned along a vertical direction. That is, when viewed from above (as a plane view), the gate portion $G_1$ and the gate portion $G_2$ are approximately overlapped. The semiconductor memory cell can be decreased in size with such a configuration. In each of the semiconductor memory cells shown in FIG. 104A and 104B, the supporting substrate, the insulating layer, the gate portion $G_1$ of the first transistor $TR_1$ and the gate portion $G_2$ of the second transistor $TR_2$ are arranged in this order from the bottom. The order of each regions and the gate portions in the semiconductor memory cells shown in FIGS. 104A and 104B along a perpendicular direction is inverse to the order of each regions and the gate portions in the semiconductor memory cells shown in FIGS. 103A and 103B, respectively. The semiconductor memory cell shown in FIG. 104B differs from the semiconductor memory cell shown in FIG. 104A in that the gate portion $G_1$ of the first transistor $TR_1$ and the gate portion $G_2$ of the second transistor $TR_2$ are almost aligned along a vertical direction.

The method for manufacturing the semiconductor memory cell of Example 14 shown in FIG. 103B will be explained with reference to FIGS. 105A, 105B, 106A, 106B, 107A, 107B, 108A, 108B and 109, all of which schematically show partial cross-sectional views of the supporting substrate, etc.

[Step-1400]

Figure 105A:
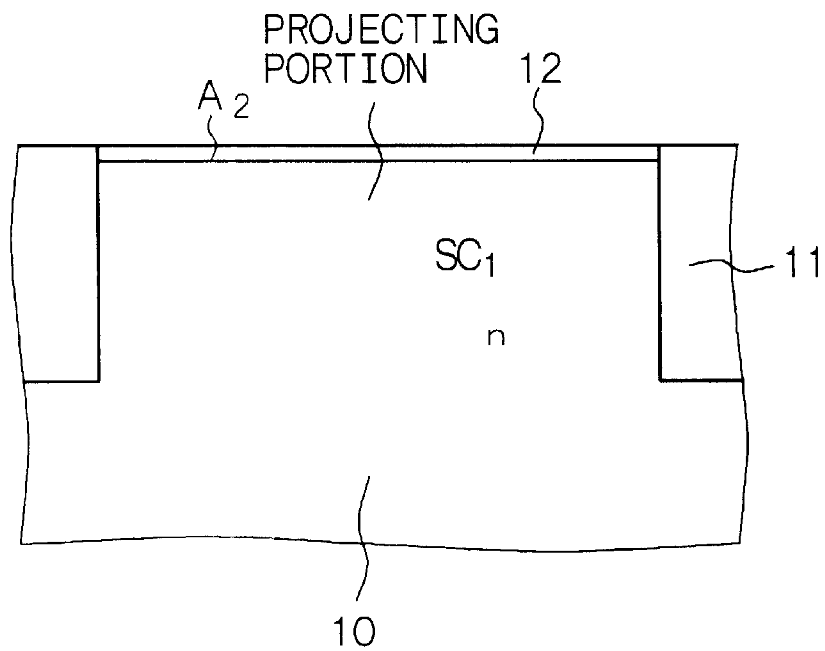
FIGS. 105A and 105B are schematic partial cross-sectional views of a supporting substrate, etc., for the explanation of a manufacturing method of the semiconductor memory cell in Example 14.

A silicon semiconductor substrate 10 is etched to form projected portions in which the semiconductor memory cells are to being fabricated, and then, the complementary concave portions are buried with an insulating layer 11 so that only the top surfaces of projected portions of the silicon semiconductor substrate 10 are exposed. The insulating layer 11 corresponds to a device isolating region. The first semi-conductive region $SC_1$ of the first conductivity type (for example, n-type) is then formed in the projected portion of the silicon semiconductor substrate 10. The order of the processes for forming the first region $SC_1$ and for forming the projected portions in the silicon semiconductor substrate 10 can be inverted on the surface of projected portion of the semiconductor substrate 10, formed is a silicon oxide film 12 having a thickness of approx. 10 nm (corresponding to the second barrier layer), on the basis of a known method for forming a silicon oxide film. Such state is shown in FIG. 105A as a partial schematic cross-sectional view. The top surface of projected portion of the silicon semiconductor substrate 10 corresponds to the second main surface $A_2$. The projected portion of the silicon semiconductor substrate 10 may have a height of 0.3 to 0.4 μm.

[Step-1410]

Figure 105B:
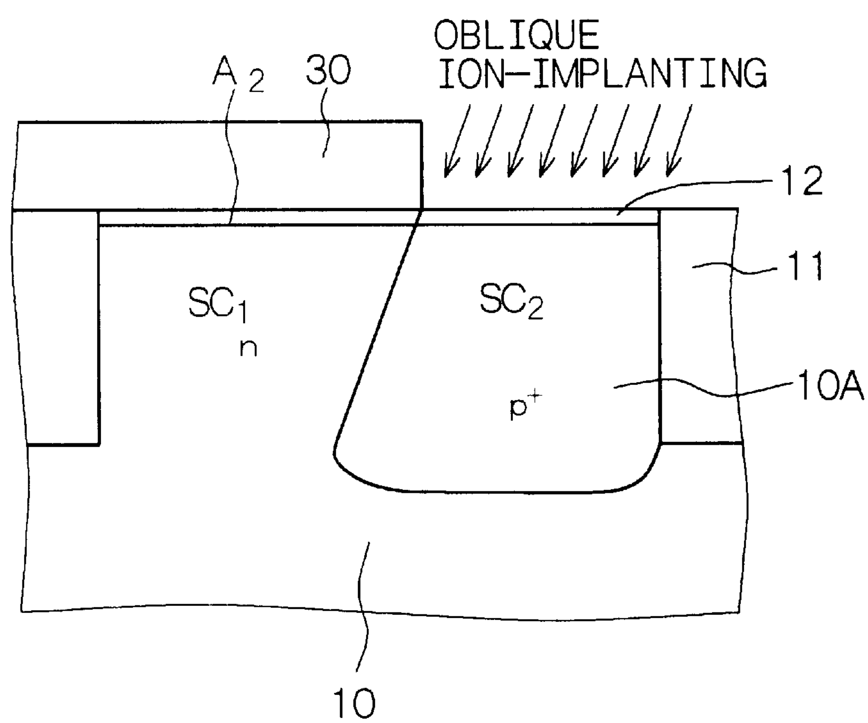
Figure 106A:
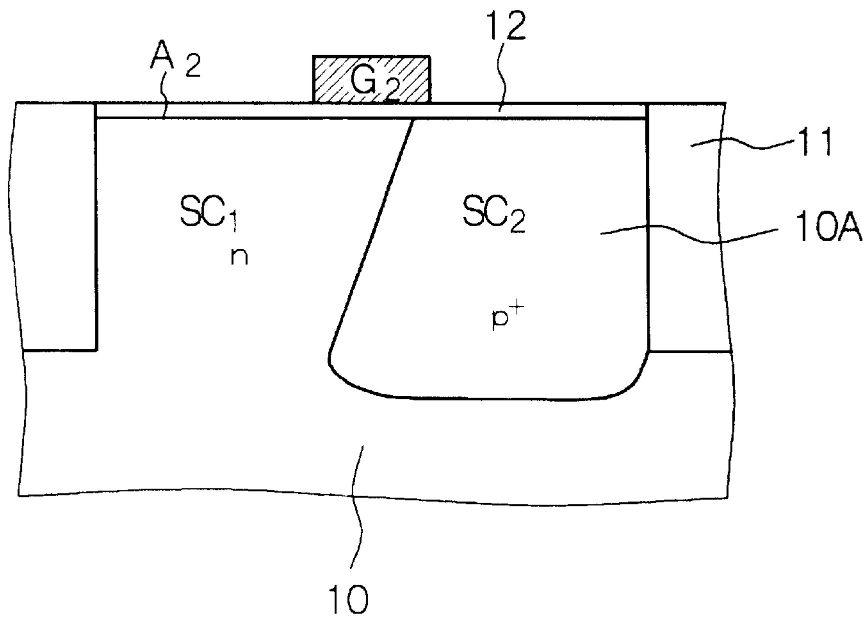
FIGS. 106A and 106B, subsequent to FIG. 105B, are schematic partial cross-sectional views of a supporting substrate, etc., for the explanation of a manufacturing method of the semiconductor memory cell in Example 14.

Then, using a resist 30 as a mask, the second semi-conductive region $SC_2$ of the second conductivity type (for example, $p^+$-type) is formed by an oblique ion implantation technique. Thus, formed is the first semi-conductive region $SC_1$ of the first conductivity type (for example, n-type) through the semi-conductive layer 10A (corresponding to the projected portion of the silicon semiconductor substrate 10) from the first main surface (described later) to the second main surface $A_2$, and, formed is the second semi-conductive region $SC_2$ of the second conductivity type (for example, $p^+$-type) through the semi-conductive layer 10A from the first main surface to the second main surface $A_2$ as well as being in contact with the first region $SC_1$ as shown in FIG. 105B. The gate portion $G_2$ for the second transistor, which is constituted of doped polysilicon or has a polyside structure, is then formed on the basis of a known method. Such state is shown in FIG. 106A as a partial schematic cross-sectional view.

[Step-1420]

Figure 106B:
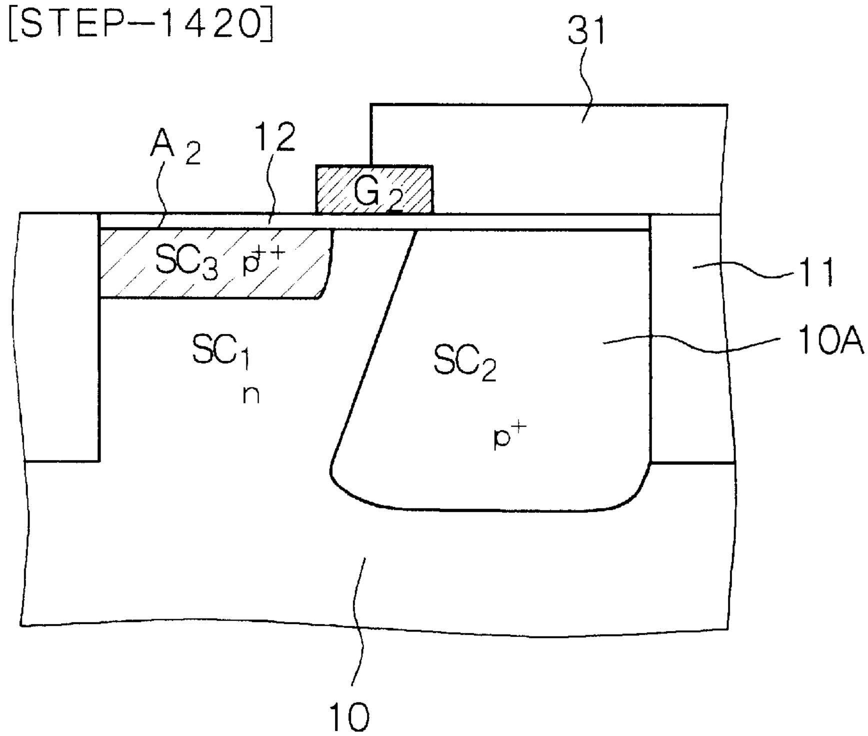

Then, using a resist 31 as a mask, normal ion implantation and oblique ion implantation are performed successively to form the third region $SC_3$ (the third semi-conductive region $SC_3$ of $p^{++}$-type) in the surface region, including the second main surface $A_2$, of the first region $SC_1$ so as to be spaced from the second region $SC_2$ and so as to form a rectifier junction together with the first region $SC_1$. Such state is shown in FIG. 106B as a partial schematic cross-sectional view. After that, an insulating interlayer 13A is formed on the entire surface, an opening is formed in the insulating interlayer 13A above the third region $SC_3$, a metal layer for a wiring is formed on the insulating interlayer 13A including the inside of the opening and is then patterned to form the write-in information setting line connected to the third region $SC_3$. It is not always necessary to form the third region $SC_3$ by the ion implantation. A barrier layer or glue layer constituted of titanium silicide or TiN, being usually formed in the general process for fabricating the write-in information setting line, may be formed also on the surface of the first region $SC_1$ exposed at the bottom of the opening. Thus, the third region $SC_3$ can be formed in common with part of the write-in information setting line (more specifically, part of the barrier layer or glue layer) in the surface region of the first region

[Step-1430]

Figure 107A:
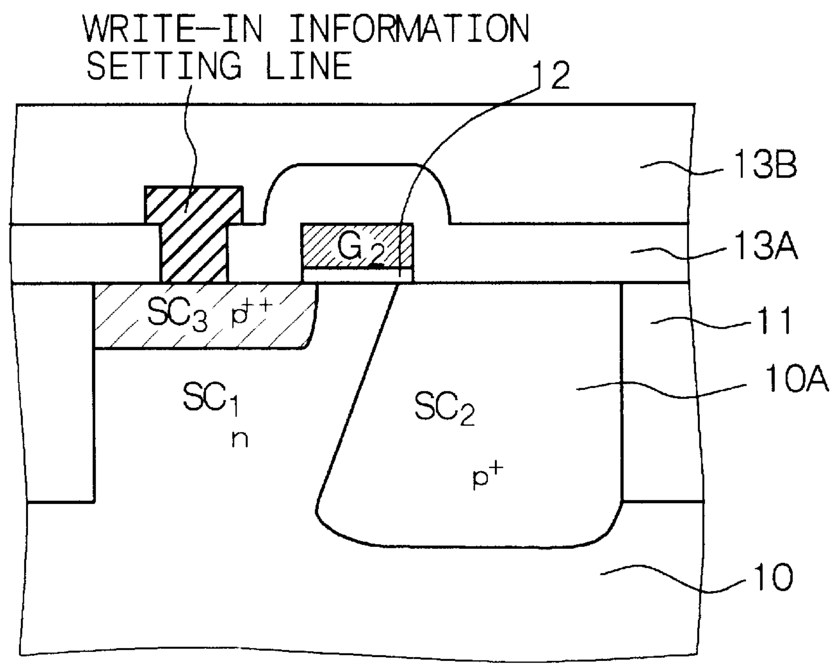
FIGS. 107A and 107B, subsequent to FIG. 106B, are schematic partial cross-sectional views of a supporting substrate, etc., for the explanation of a manufacturing method of the semiconductor memory cell in Example 14.
Figure 107B:
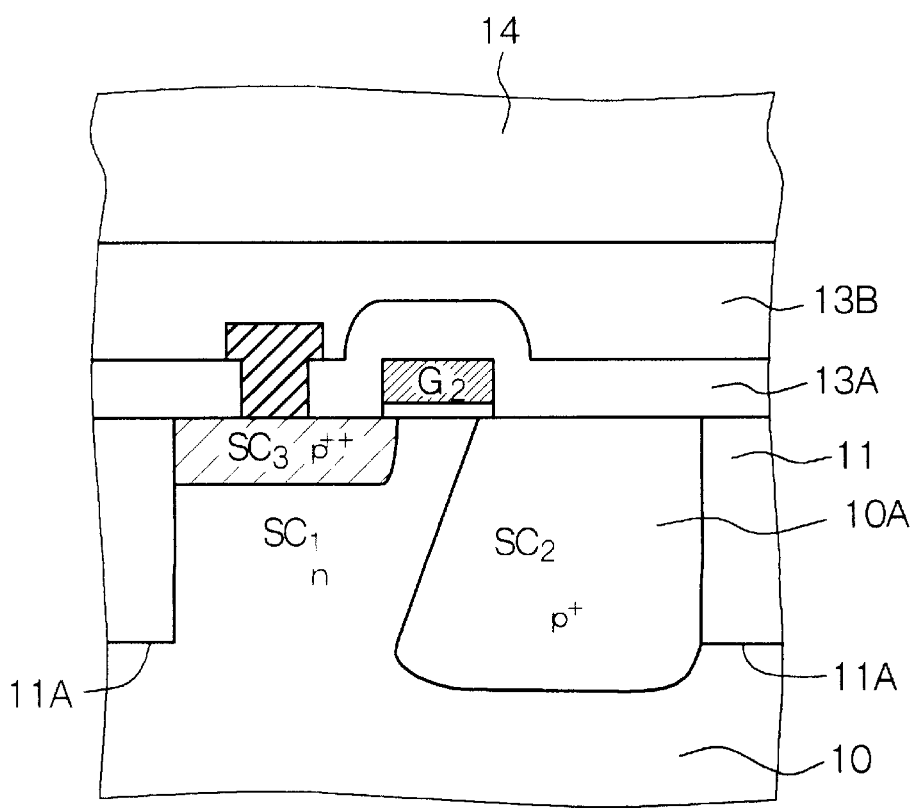

Then, as shown in FIG. 107A, an insulating layer 13B constituted of, for example, $SiO_2$ is formed on the entire surface by a CVD method, and the surface of the insulating layer 13B is then polished to be flattened. The surface of the insulating layer 13B and a supporting substrate 14 are bonded (see FIG. 107B), and the silicon semiconductor substrate 10 is polished from the back surface to expose the bottom 11A of the insulating layer 11 (see FIG. 108A). The semi-conductive layer 10A corresponding to the projected portion of the silicon semiconductor substrate 10 is left within the insulating layer 11. The surface of the semi-conductive layer 10A corresponds to the first main surface $A_1$.

[Step-1440]

Figure 108A:
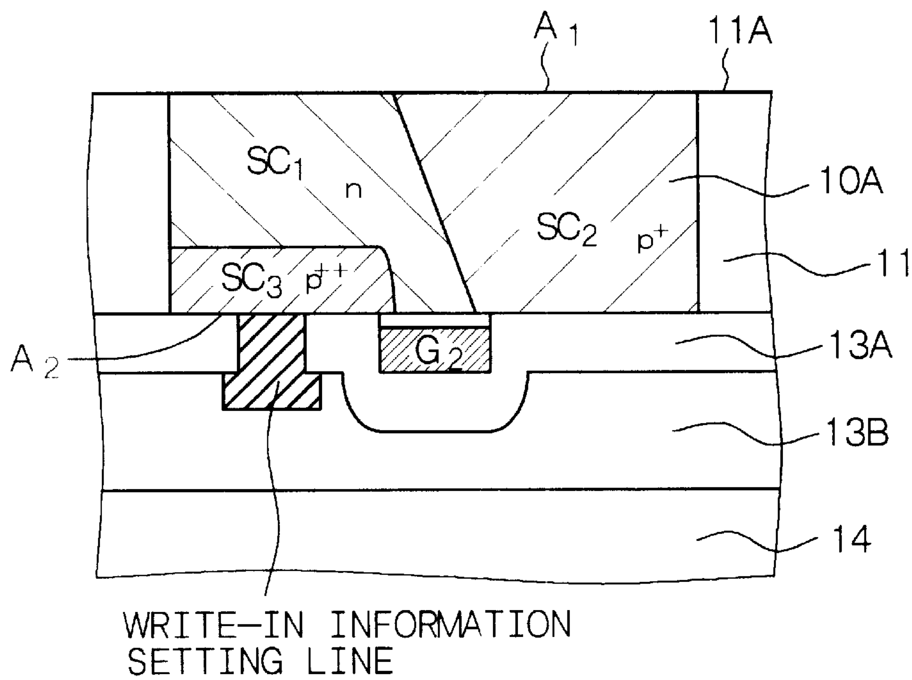
FIGS. 108A and 108B, subsequent to FIG. 107B, are schematic partial cross-sectional views of a supporting substrate, etc., for the explanation of a manufacturing method of the semiconductor memory cell in Example 14.
Figure 108B:
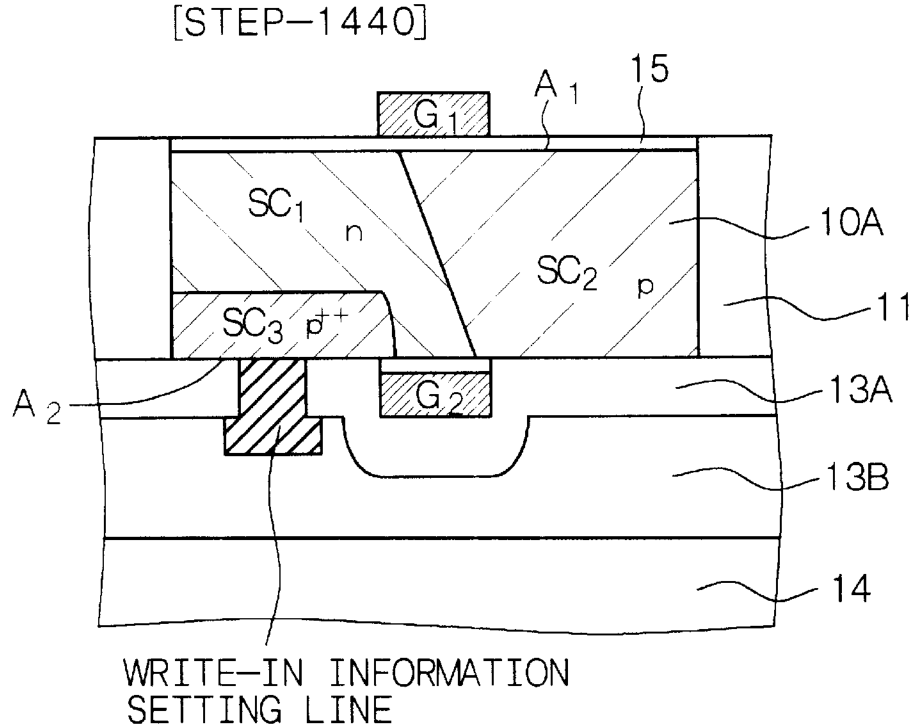

After that, a silicon oxide film 15 (corresponding to the first barrier layer) having a thickness of approx. 10 nm is formed on the surface of the semi-conductive layer 10A on the basis of a known method for forming a silicon oxide film, and the gate portion $G_1$ of the first transistor, which is constituted of doped polysilicon or has a polyside structure, is then formed (see FIG. 108B). The gate portion $G_1$ for the first transistor and the gate portion $G_2$ for the second transistor are placed on the both sides of the semi-conductive layer 10A with their locations being almost aligned along a vertical direction.

[Step-1450]

Figure 109:
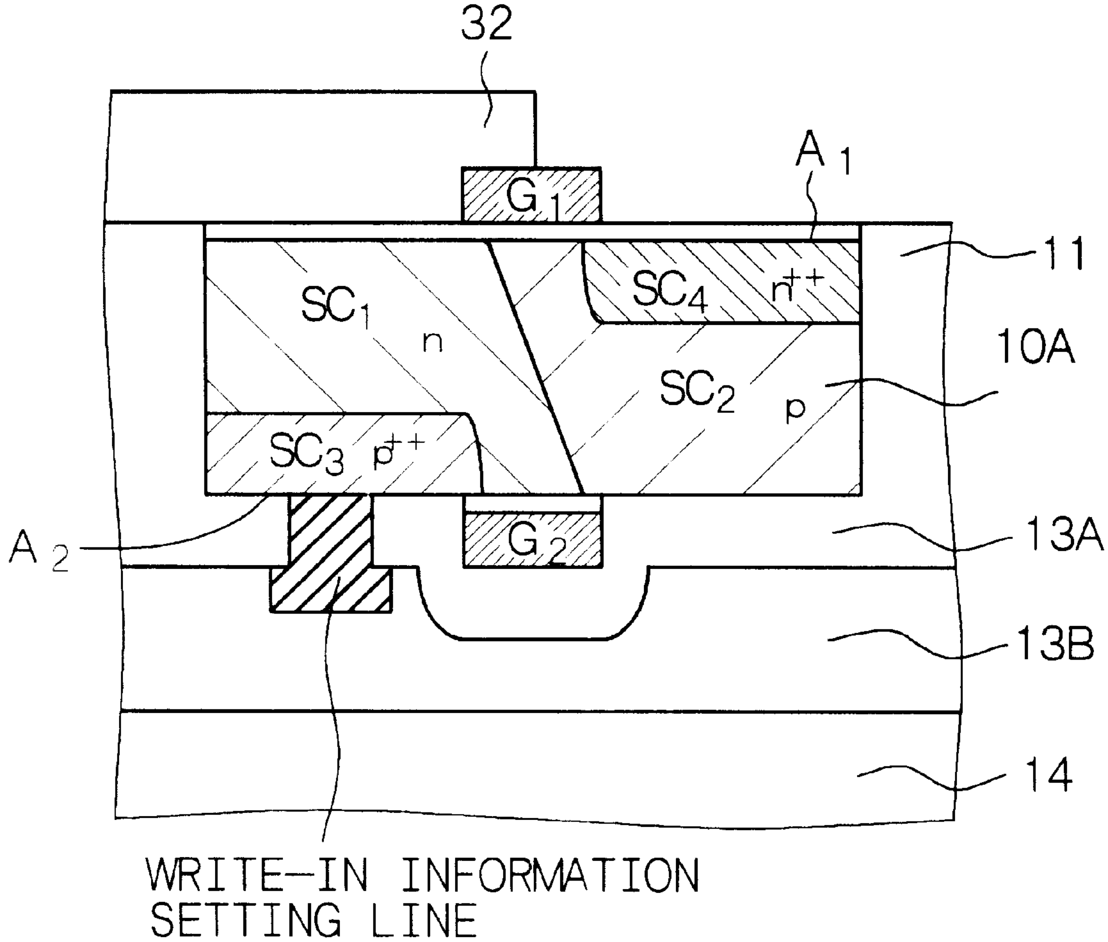
FIG. 109, subsequent to FIG. 108B, is a schematic partial cross-sectional view of a supporting substrate, etc., for the explanation of a manufacturing method of the semiconductor memory cell in Example 14.

Using a resist 32 as a mask, normal ion implantation and oblique ion implantation are successively conducted to form the fourth region $SC_4$ (the fourth semi-conductive region $SC_4$ of $n^{++}$-type) (see FIG. 109).

[Step-1460]

After that, an insulating layer is formed on the entire surface, and then, openings are formed in the insulating layer above the fourth region $SC_4$ and the first region $SC_1$ extending on the first main surface $A_1$. A metal layer is then formed on the insulating layer including the insides of the openings, and is then patterned into the second memory-cell-selecting line and the predetermined potential line. Thus, the semiconductor memory cell of Example 14 shown in FIG. 103B is completed. It is not always necessary to form the fourth region $SC_4$ by the ion implantation. When the second memory-cell-selecting line is formed, a barrier layer or a glue layer constituted of titanium silicide or TiN is generally formed. At the same time, the barrier layer or the glue layer is formed on the surface of the second region $SC_2$, whereby the fourth region $SC_4$ is formed in the surface region of the second region $SC_2$ and the fourth region $SC_4$ and part of the second memory-cell-selecting line (more specifically, part of the barrier layer or the glue layer) are fabricated in common.

The manufacturing processes for the semiconductor memory cell of Example 14 are not limited to those mentioned above. It is allowable, for example, to form the second region $SC_2$ in Step-1440, rather than in Step-1410. That is, in Step-1440, after the silicon oxide film 15 having a thickness of, for example, approx. 10 nm is formed on the surface of the semi-conductive layer 10A, the second region $SC_2$ may be formed. The order of forming individual regions by the ion implantation is arbitrary in essence with some dependence on the processes. In the above-described ion implantations, it is necessary to optimize the conditions for introducing the impurities through computer-assisted simulation or experiments so that the individual regions will have an optimum impurity concentrations.

EXAMPLE 15

Figure 101B:
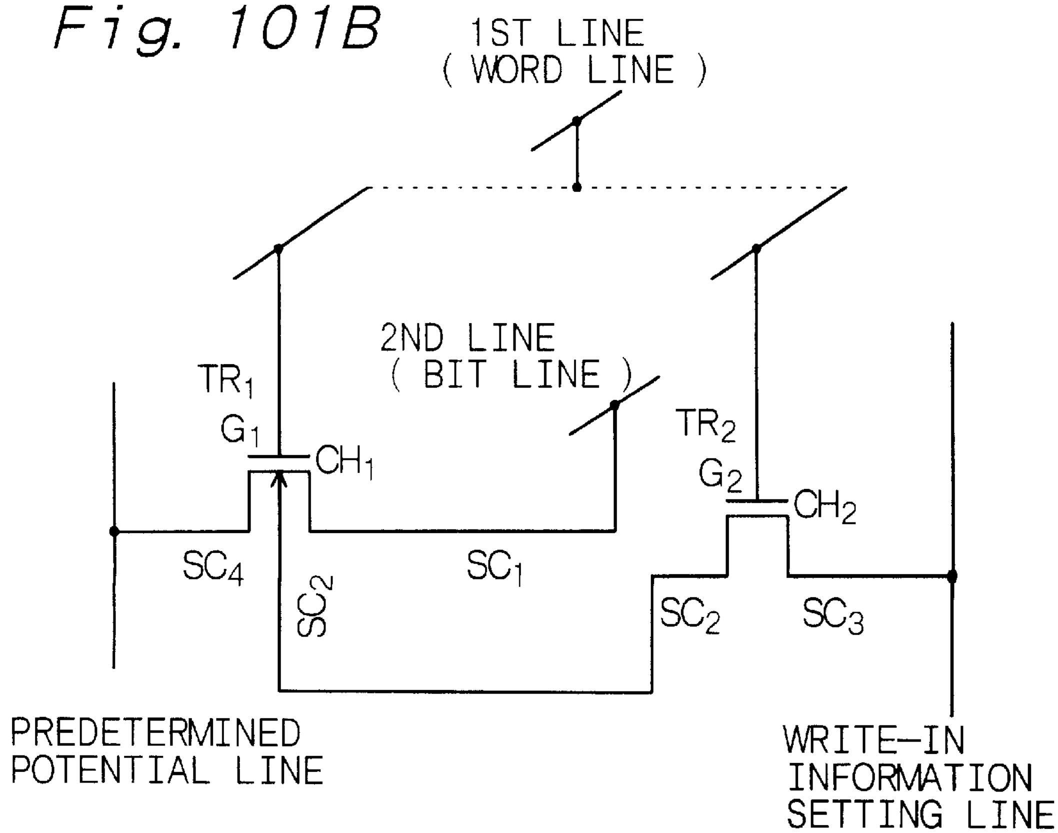

Example 15 is directed to the semiconductor memory cell according to the fifteenth aspect of the present invention. For example, as FIG. 101B shows its principle drawing and as FIGS. 110A, 110B, 111A and 111B show the schematic partial cross-sectional views, the semiconductor memory cell of Example 15 has the same configuration of each regions as the semiconductor memory cell in Example 14. The semiconductor memory cell of Example 15 differs from the semiconductor memory cell of Example 14 in that the fourth region $SC_4$ is connected to the predetermined potential line in place of being connected to the second memory-cell-selecting line, and the other source/drain region of the first transistor $TR_1$ is connected to the second memory-cell-selecting line (for example, the bit line) in place of being connected to the predetermined potential line.

Figure 110A:
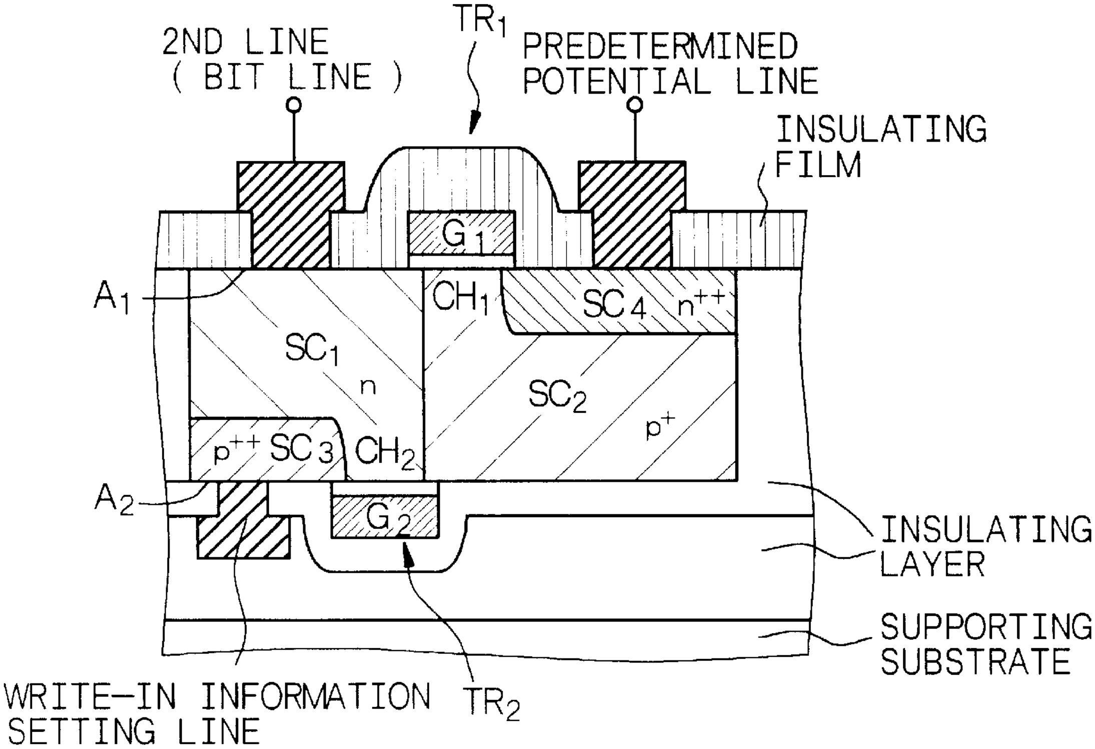
FIGS. 110A and 110B are schematic partial cross-sectional views of the semiconductor memory cells in Example 15.

The semiconductor memory cell of Example 15 shown in FIG. 110A is provided with a semi-conductive layer having a first main surface $A_1$ and a second main surface $A_2$ opposed to the first main surface $A_1$. In Example 15 shown in FIG. 110A, a gate portion $G_1$ of the first transistor $TR_1$ is formed on the first main surface $A_1$, and a gate portion $G_2$ of the second transistor $TR_2$ is formed on the second main surface $A_2$. The gate portion $G_1$ and the gate portion $G_2$ are slightly off-aligned along a vertical direction. Further, the semiconductor memory cell is formed in the semi-conductive layer surrounded with an insulating layer formed on a supporting substrate and has a so-called SOI structure.

Figure 110B:
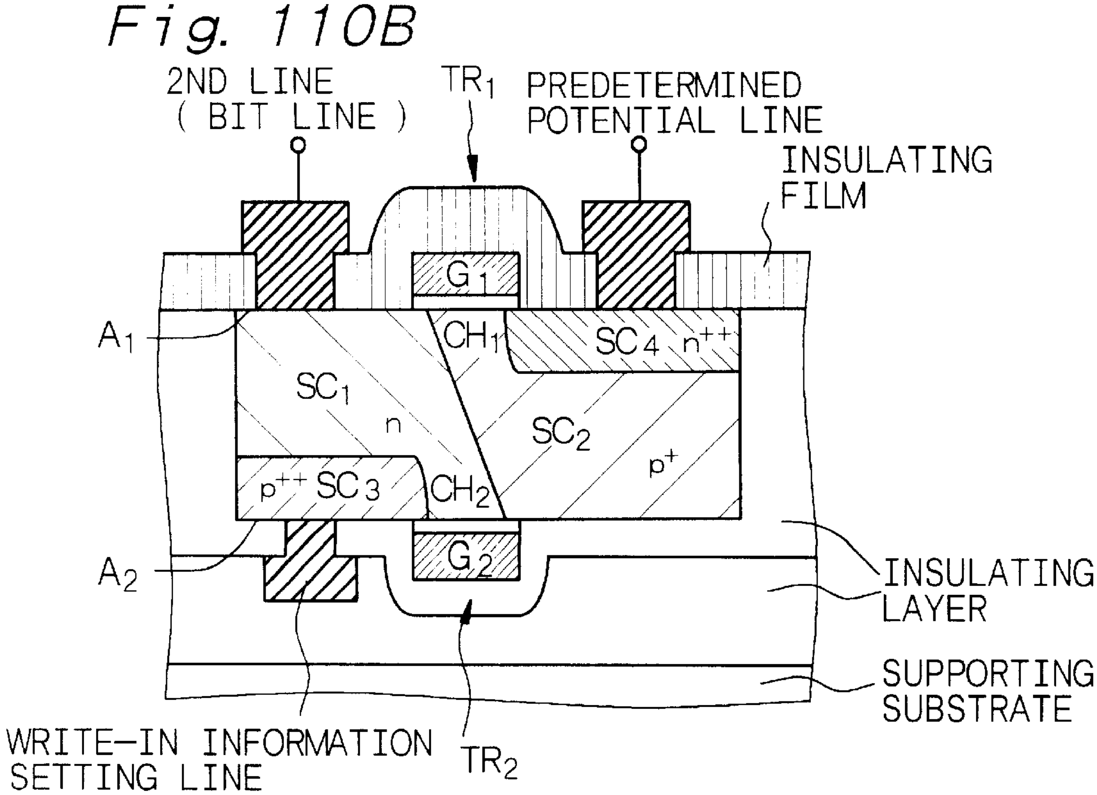

In each of the semiconductor memory cells of Example 15 shown in FIGS. 110A and 110B, the supporting substrate, the insulating layer, the gate portion $G_2$ of the second transistor $TR_2$ and the gate portion $G_1$ of the first transistor $TR_1$ are arranged in this order from the bottom.

The semiconductor memory cell shown in FIG. 110B differs from the semiconductor memory cell shown in FIG. 110A in that the gate portion $G_1$ of the first transistor $TR_1$ and the gate portion $G_2$ of the second transistor $TR_2$ are almost aligned along a vertical direction. That is, when viewed from above (as a plane view), the gate portion $G_1$ and the gate portion $G_2$ are approximately overlapped. The semiconductor memory cell can be decreased in size with such a configuration.

Figure 111A:
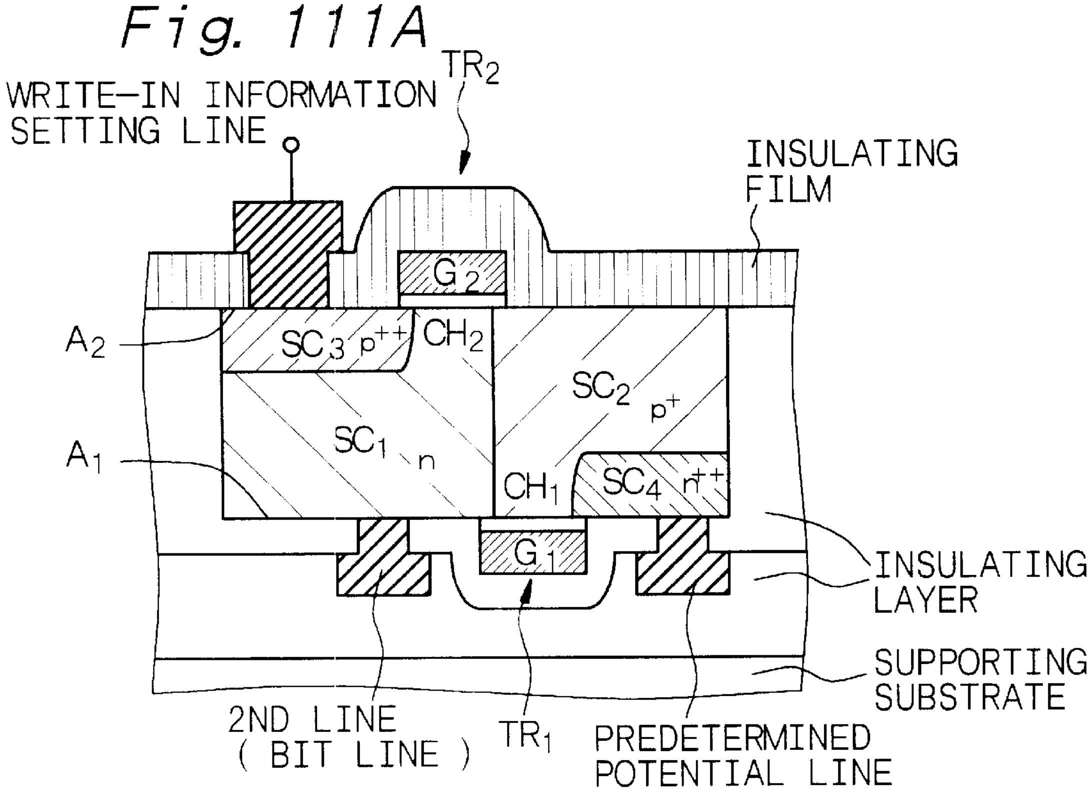
FIGS. 111A and 111B are schematic partial cross-sectional views of modifications of the semiconductor memory cell in Example 15.
Figure 111B:
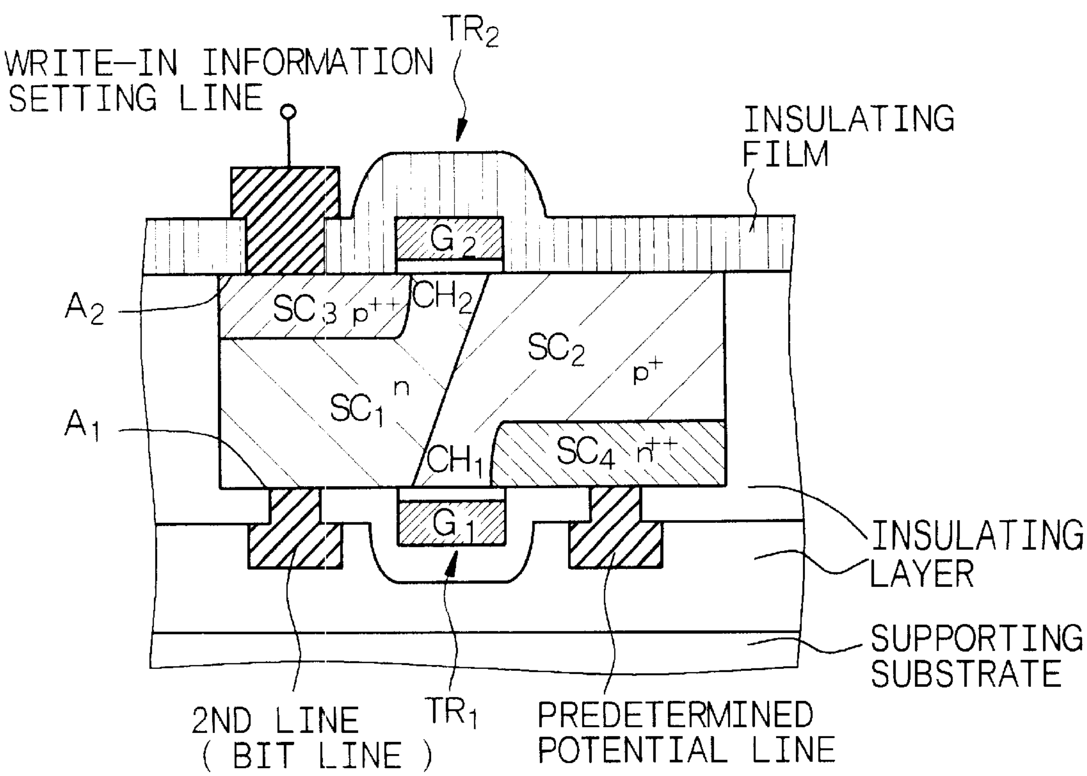

In each of the semiconductor memory cells shown in FIG. 111A and 111B, the supporting substrate, the insulating layer, the gate portion $G_1$ of the first transistor $TR_1$ and the gate portion $G_2$ of the second transistor $TR_2$ are arranged in this order from the bottom. The order of each regions and the gate portions in the semiconductor memory cells shown in FIGS. 111A and 111B along a perpendicular direction is inverse to the order of each regions and the gate portions in the semiconductor memory cells shown in FIGS. 110A and 110B, respectively. The semiconductor memory cell shown in FIG. 111B differs from the semiconductor memory cell shown in FIG. 111A in that the gate portion $G_1$ of the first transistor $TR_1$ and the gate portion $G_2$ of the second transistor $TR_2$ are almost aligned along a vertical direction.

EXAMPLE 16

Figure 102A:
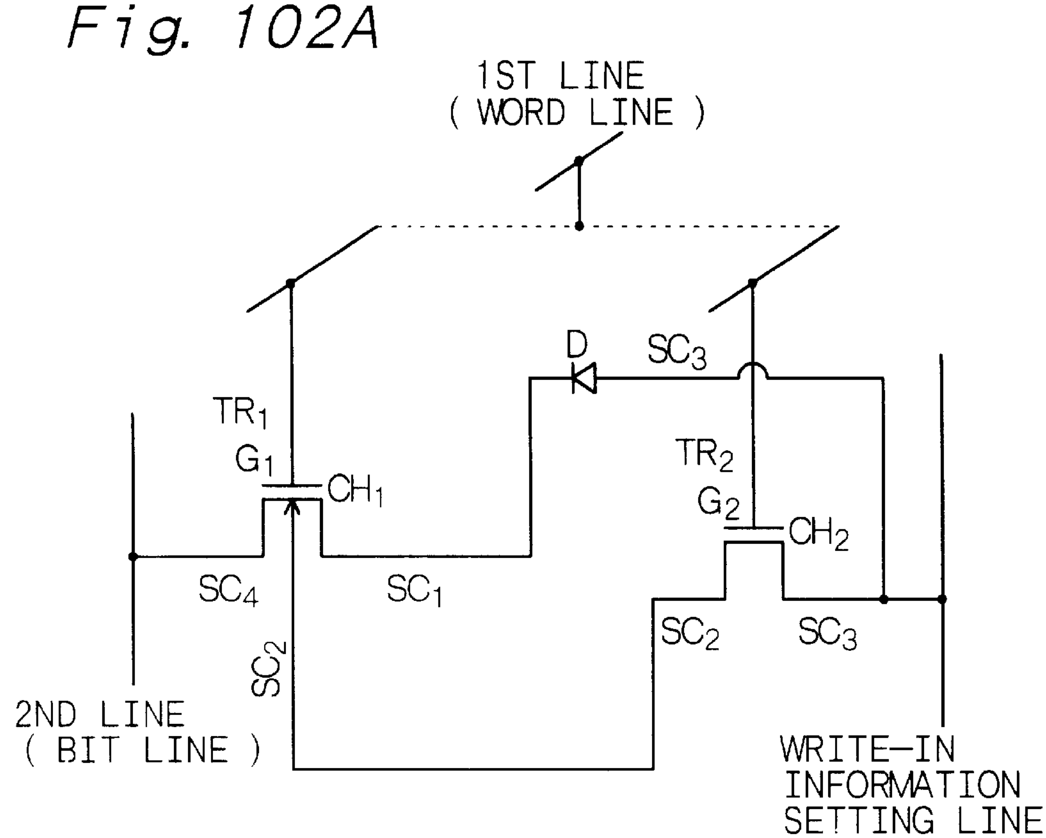
FIGS. 102A and 102B are principle drawings of the semiconductor memory cells according to the sixteenth and the seventeenth aspects of the present invention.
Figure 112A:
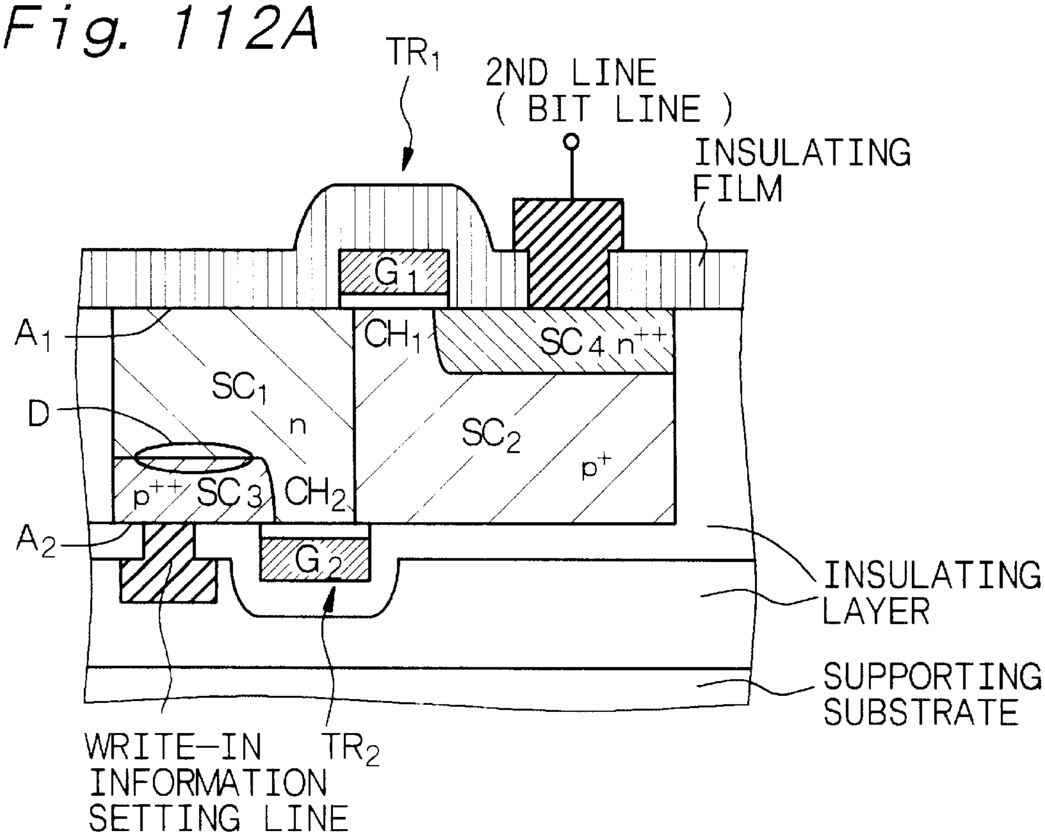
FIGS. 112A and 112B are schematic partial cross-sectional views of the semiconductor memory cells in Example 16.

Example 16 is directed to the semiconductor memory cell according to the sixteenth aspect of the present invention. For example, as FIG. 102A shows its principle drawing and as FIG. 112A shows its schematic partial cross-sectional view, the semiconductor memory cell of Example 16 comprises a first transistor of a first conductivity type (e.g., n-type) for read-out $TR_1$, a second transistor of a second conductivity type (e.g., p-type) for write-in $TR_2$ and a diode D. The semiconductor memory cell of Example 16 shown in FIG. 112A is provided with a semi-conductive layer having a first main surface $A_1$ and a second main surface $A_2$ opposed to the first main surface $A_1$. In Example 16 shown in FIG. 112A, a gate portion $G_1$ of the first transistor $TR_1$ is formed on the first main surface A, and a gate portion $G_2$ of the second transistor $TR_2$ is formed on the second main surface $A_2$. The gate portion $G_1$ and the gate portion $G_2$ are slightly off-aligned along a vertical direction. Further, the semiconductor memory cell is formed in the semi-conductive layer surrounded with an insulating layer formed on a supporting substrate and has a so-called SOI structure. In the semiconductor memory cell of Example 16 shown in FIG. 112A, the supporting substrate, the insulating layer, the gate portion $G_2$ of the second transistor $TR_2$ and the gate portion $G_1$ of the first transistor $TR_1$ are arranged in this order from the bottom.

The semiconductor memory cell of Example 16 has;

(1) a first semi-conductive region $SC_1$ of the first conductivity type (for example, n-type), formed through the semi-conductive layer from the first main surface $A_1$ to the second main surface $A_2$, (2) a second semi-conductive region of the second conductivity type (for example, $p^+$-type) opposite to the first conductivity type, formed through the semi-conductive layer from the first main surface $A_1$ to the second main surface $A_2$ and being in contact with the first region $SC_1$, (3) a third semi-conductive region $SC_3$ of the second conductivity type (for example, $p^{++}$-type), or a third conductive region $SC_3$ formed of a silicide, a metal or a metal compound, said third region $SC_3$ being formed in a surface region, including the second main surface $A_2$, of the first region $SC_1$, spaced from the second region $SC_2$ and forming a rectifier junction together with the first region $SC_1$, (4) a fourth semi-conductive region $SC_4$ of the first conductivity type (for example, $n^{++}$-type), or a fourth conductive region $SC_4$ formed of a silicide, a metal or a metal compound, said fourth region $SC_4$ being formed in a surface region, including the first main surface $A_1$, of the second region $SC_2$, spaced from the first region $SC_1$ and forming a rectifier junction together with the second region $SC_2$, (5) a gate portion $G_1$ of the first transistor $TR_1$ formed on a barrier layer formed on the first main surface $A_1$ so as to bridge the first region $SC_1$ and the fourth region $SC_4$, and (6) a gate portion $G_2$ of the second transistor $TR_2$ formed on a barrier layer formed on the second main surface $A_2$ so as to bridge the second region $SC_2$ and the third region $SC_3$.

Concerning the first transistor $TR_1$;

(A-1) one source/drain region is constituted of the fourth region $SC_4$, (A-2) the other source/drain region is constituted of a surface region, including the first main surface $A_1$, of the first region $SC_1$, and (A-3) a channel forming region $CH_1$ is constituted of a surface region, including the first main surface $A_1$, of the second region $SC_2$ which surface region is sandwiched by (or interposed between) the surface region, including the first main surface $A_1$, of the first region $SC_1$ and the fourth region $SC_4$.

Concerning the second transistor $TR_2$;

(B-1) one source/drain region is constituted of the third region $SC_3$, (B-2) the other source/drain region is constituted of a surface region, including the second main surface $A_2$, of the second region $SC_2$, and (B-3) a channel forming region $CH_2$ is constituted of a surface region, including the second main surface $A_2$, of the first region $SC_1$ which surface region is sandwiched by (or interposed between) the third region $SC_3$ and the surface region, including the second main surface $A_2$, of the second region $SC_2$.

The diode D is constituted of the first region $SC_1$ and the third region $SC_3$. Since the diode D is provided, the semiconductor memory cell of Example 16 differs from the semiconductor memory cell of Example 14 in that the predetermined potential line is not required, whereby the wiring configuration of the semiconductor memory cell can be simplified. When a pn junction is formed of the third region $SC_3$ and the first region $SC_1$ in the semiconductor memory cell of Example 16, and if the potential setting in the third region $SC_3$ or the designing of impurity concentration relationships between the third region $SC_3$ and the first region $SC_1$ is improper, "latch-up" may take place when the information is read out. For avoiding the above problem, the voltage which is applied to the write-in information setting line is required to be a low degree of voltage (0.4 volt or lower) at which no large forward current flows in the diode D. When the third region $SC_3$ is constituted of a silicide, a metal or a metal compound, a Schottky junction in which majority carrier mainly constitutes a forward current is formed between the third region $SC_3$ and the first region $SC_1$, whereby the risk of latch-up can be avoided, and the limitation on the voltage applied to the write-in information setting line is no longer necessary.

In the semiconductor memory cell of Example 16, the gate portion $G_1$ of the first transistor $TR_1$ and the gate portion $G_2$ of the second transistor $TR_2$ are connected to a first memory-cell-selecting line (for example, a word line); the third region $SC_3$ is connected to the write-in information setting line; and the fourth region $SC_4$ is connected to a second memory-cell-selecting line (for example, a bit line).

Figure 112B:
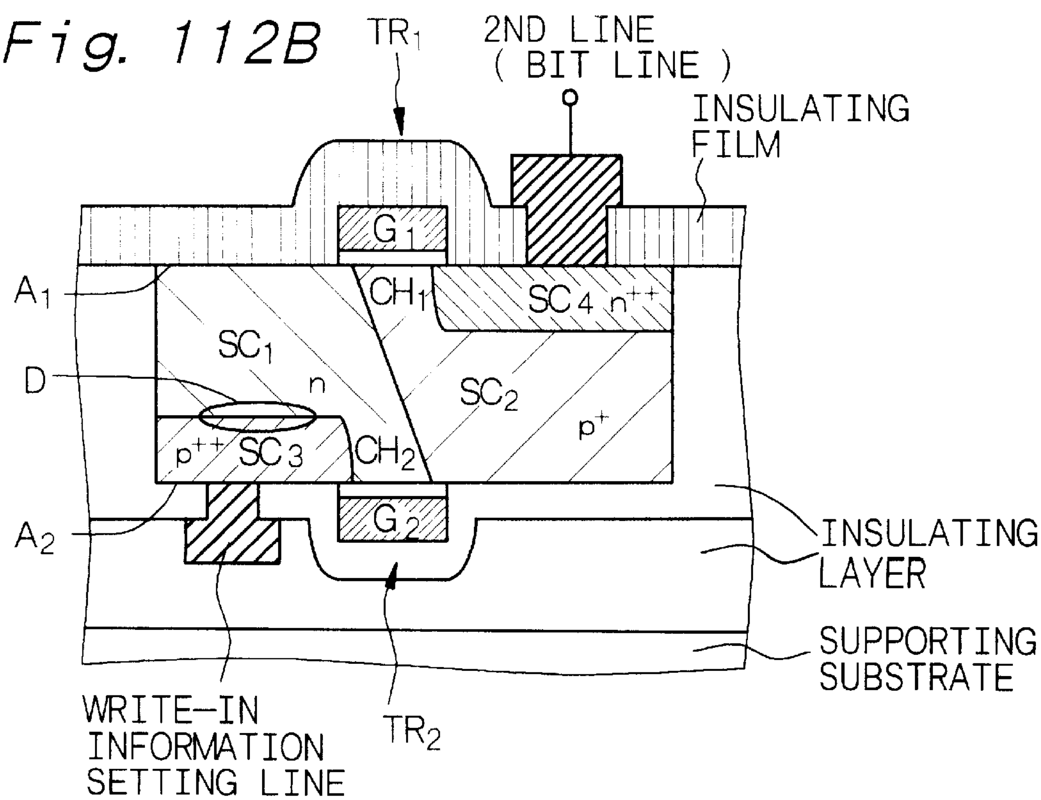
Figure 113A:
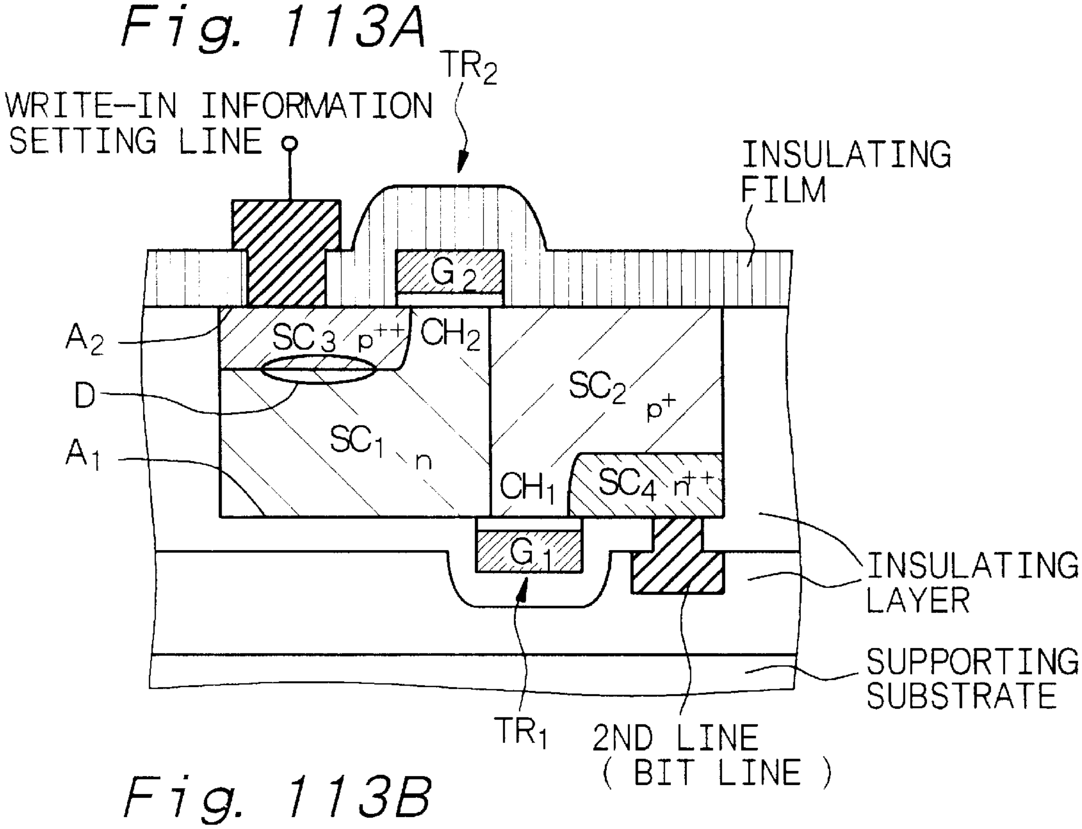
FIGS. 113A and 113B are schematic partial cross-sectional views of modifications of the semiconductor memory cell in Example 16.
Figure 113B:
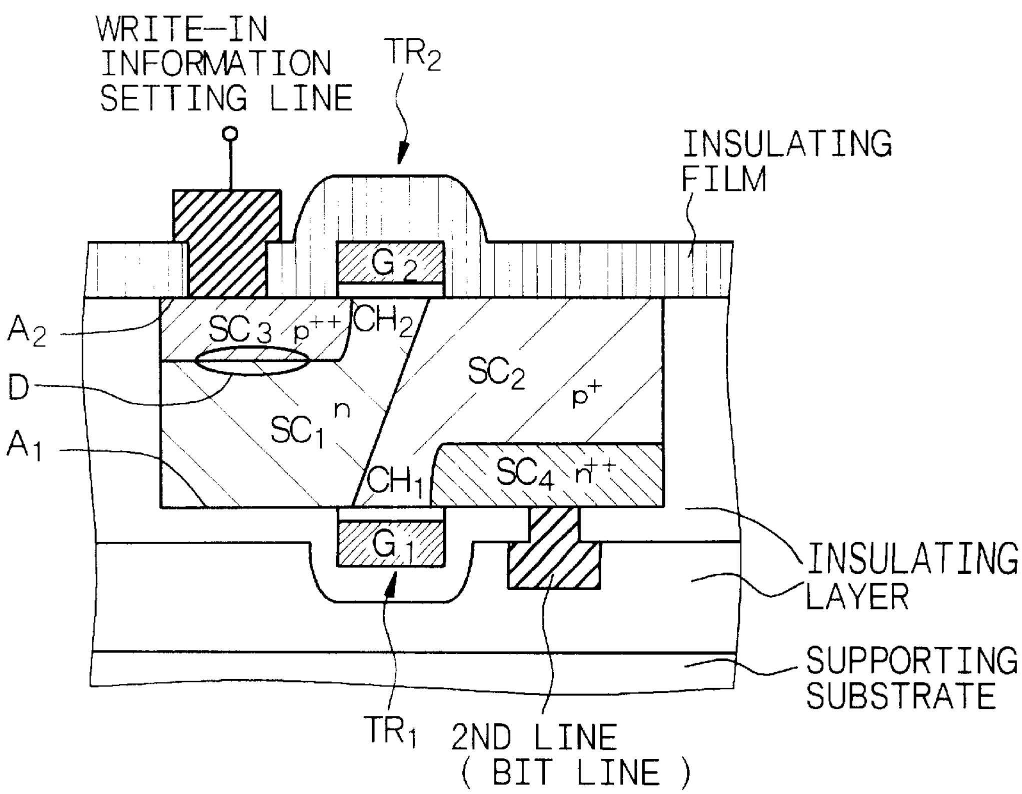

FIG. 112B, 113A and 113B show schematic partial cross-sectional views of modifications of the semiconductor memory cell in Example 16. The semiconductor memory cells shown in FIG. 112B differs from the semiconductor memory cell shown in FIG. 112A in that the gate portion $G_1$ of the first transistor $TR_1$ and the gate portion $G_2$ of the second transistor $TR_2$ are almost aligned along a vertical direction. The semiconductor memory cell can be decreased in size with such a configuration. In each of the semiconductor memory cells shown in FIGS. 113A and 113B, the supporting substrate, the insulating layer, the gate portion $G_1$ of the first transistor $TR_1$ and the gate portion $G_2$ of the second transistor $TR_2$ are arranged in this order from the bottom. The order of each regions and the gate portions in the semiconductor memory cells shown in FIGS. 113A and 113B along a perpendicular direction is inverse to the order of each regions and the gate portions in the semiconductor memory cells shown in FIGS. 112A and 112B, respectively. The semiconductor memory cell shown in FIG. 113B differs from the semiconductor memory cell shown in FIG. 113A in that the gate portion $G_1$ of the first transistor $TR_1$ and the gate portion $G_2$ of the second transistor $TR_2$ are almost aligned along a vertical direction.

EXAMPLE 17

Figure 102B:
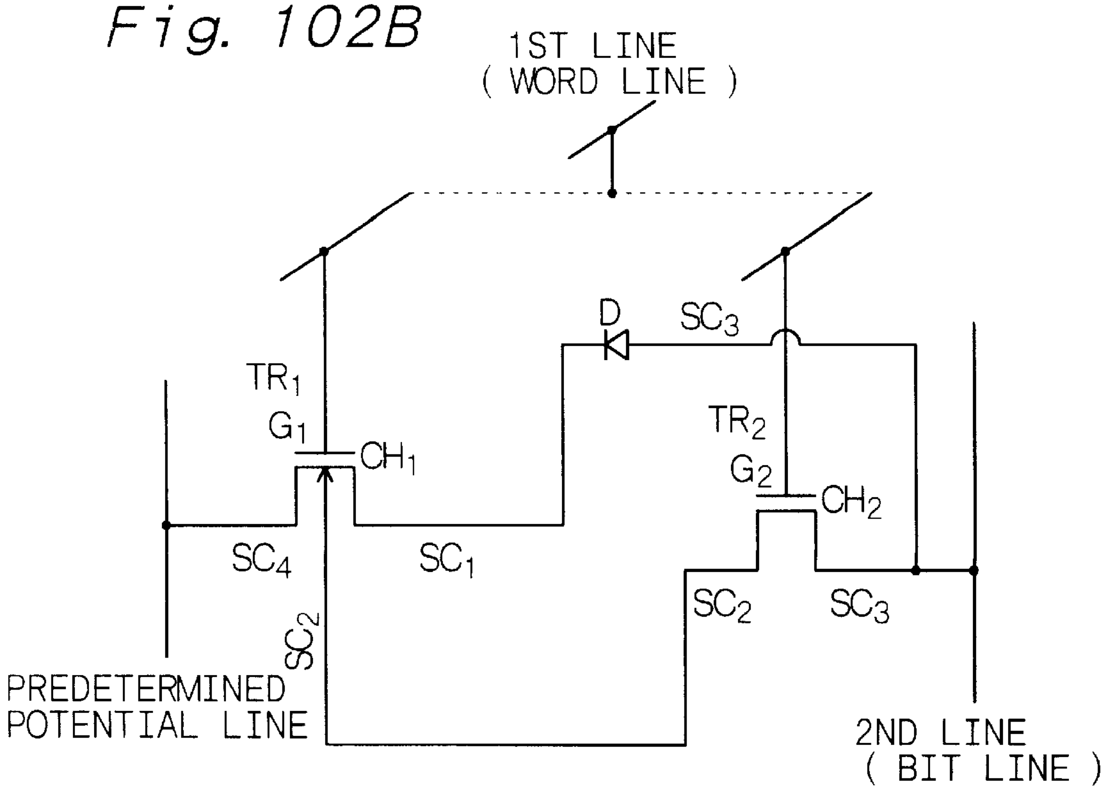

Example 17 is directed to the semiconductor memory cell according to the seventeenth aspect of the present invention. For example, as FIG. 102B shows a principle drawing and as FIGS. 114A, 114B, 115A and 115B show schematic partial cross-sectional views, each of the semiconductor memory cells of Example 17 has the same configuration of each regions as the semiconductor memory cell of Example 16. The semiconductor memory cell of Example 17 differs from the semiconductor memory cell of Example 16 in that the third region $SC_3$ is connected to the second memory-cell-selecting line (for example, a bit line) in place of being connected to the write-in information setting line, and the fourth region $SC_4$ is connected to the predetermined potential line in place of being connected to the second memory-cell-selecting line.

Figure 114A:
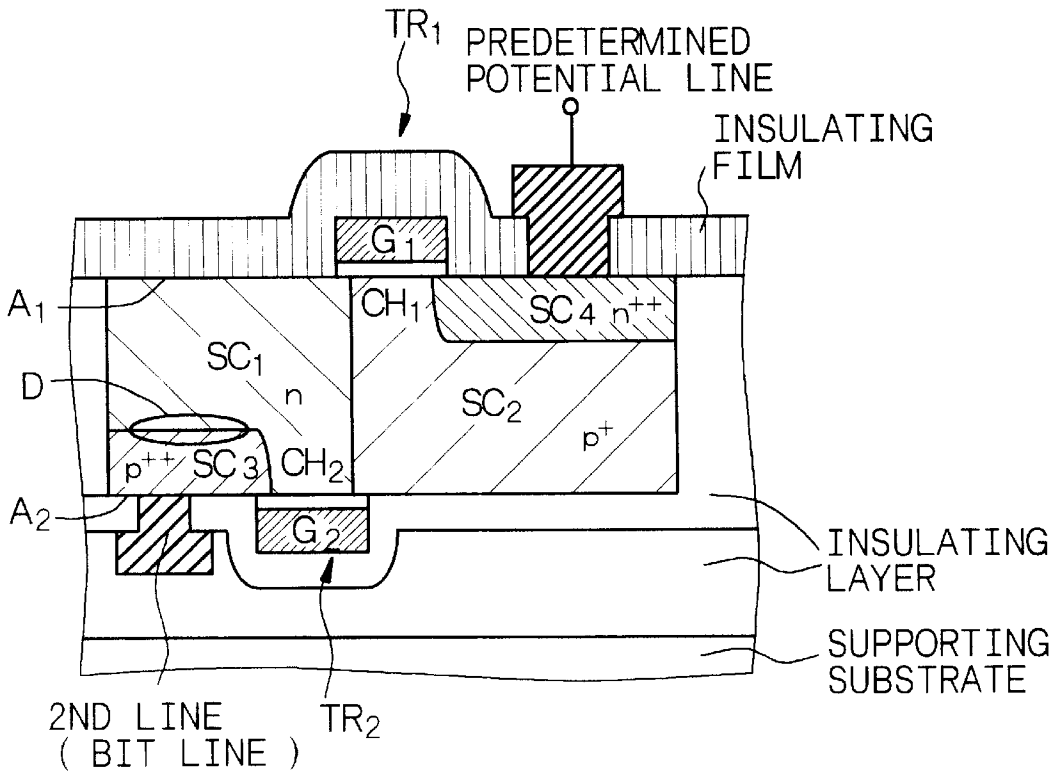
FIGS. 114A and 114B are schematic partial cross-sectional views of the semiconductor memory cells in Example 17.
Figure 114B:
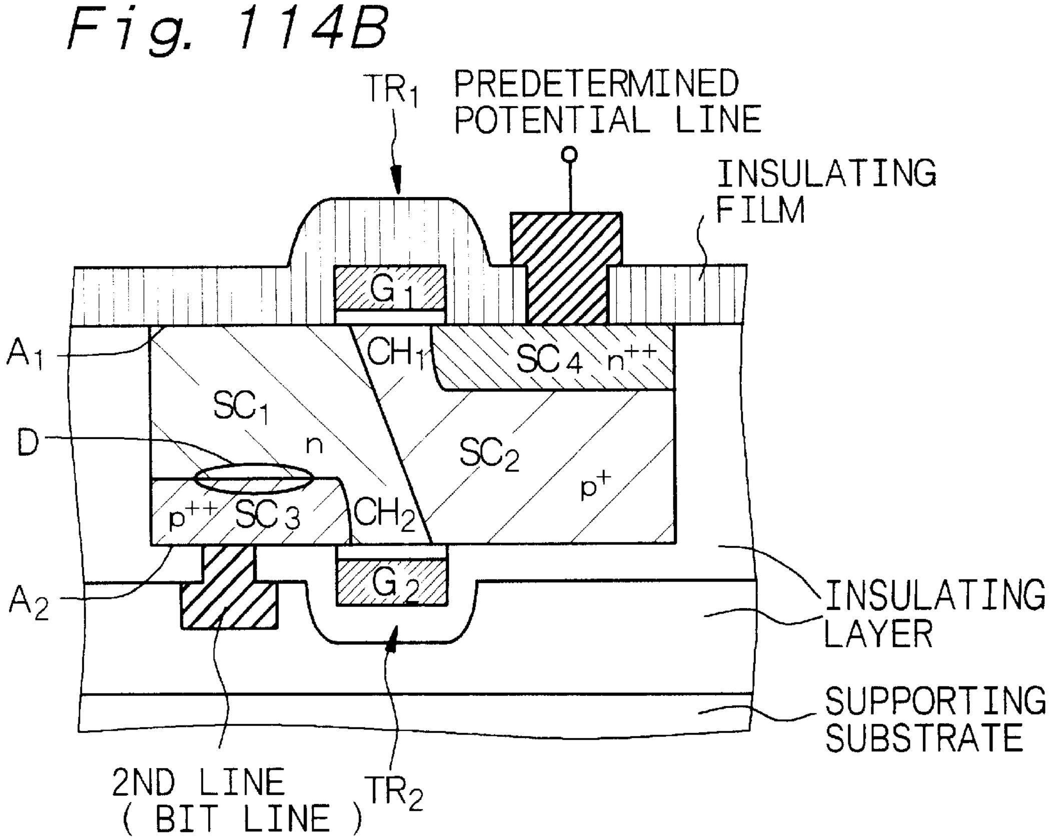

The semiconductor memory cell of Example 17 shown in FIG. 114A is provided with a semi-conductive layer having a first main surface $A_1$ and a second main surface $A_2$ opposed to the first main surface $A_1$. In Example 17 shown in FIG. 114A, a gate portion $G_1$ of the first transistor $TR_1$ is formed on the first main surface $A_1$, and a gate portion $G_2$ of the second transistor $TR_2$ is formed on the second main surface $A_2$. The gate portion $G_1$ and the gate portion $G_2$ are slightly off-aligned along a vertical direction. Further, the semiconductor memory cell is formed in the semi-conductive layer surrounded with an insulating layer formed on a supporting substrate and has a so-called SOI structure.

In the semiconductor memory cell of Example 17 shown in FIG. 114A, the supporting substrate, the insulating layer, the gate portion $G_2$ of the second transistor $TR_2$ and the gate portion $G_1$ of the first transistor $TR_1$ are arranged in this order from the bottom. On the other hand, the semiconductor memory cell shown in FIG. 114B differs from the semiconductor memory cell shown in FIG. 114A in that the gate portion $G_1$ of the first transistor $TR_1$ and the gate portion $G_2$ of the second transistor $TR_2$ are almost aligned along a vertical direction. The semiconductor memory cell can be decreased in size with such a configuration. In each of the semiconductor memory cells shown in FIGS. 115A and 115B, the supporting substrate, the insulating layer, the gate portion $G_1$ of the first transistor $TR_1$ and the gate portion $G_2$ of the second transistor $TR_2$ are arranged in this order from the bottom. The order of each regions and the gate portions in the semiconductor memory cells shown in FIGS. 115A and 115B along a perpendicular direction is inverse to the order of each regions and the gate portions in the semiconductor memory cells shown in FIGS. 114A and 114B, respectively. The semiconductor memory cell shown in FIG. 115B differs from the semiconductor memory cell shown in FIG. 115A in that the gate portion $G_1$ of the first transistor $TR_1$ and the gate portion $G_2$ of the second transistor $TR_2$ are almost aligned along a vertical direction.

The method of manufacturing the semiconductor memory cells in Examples 15, 16 and 17 can substantially be the same as the method of manufacturing the semiconductor memory cell of Example 14. Detailed explanations thereof are therefore omitted.

EXAMPLE 18

Figure 122:
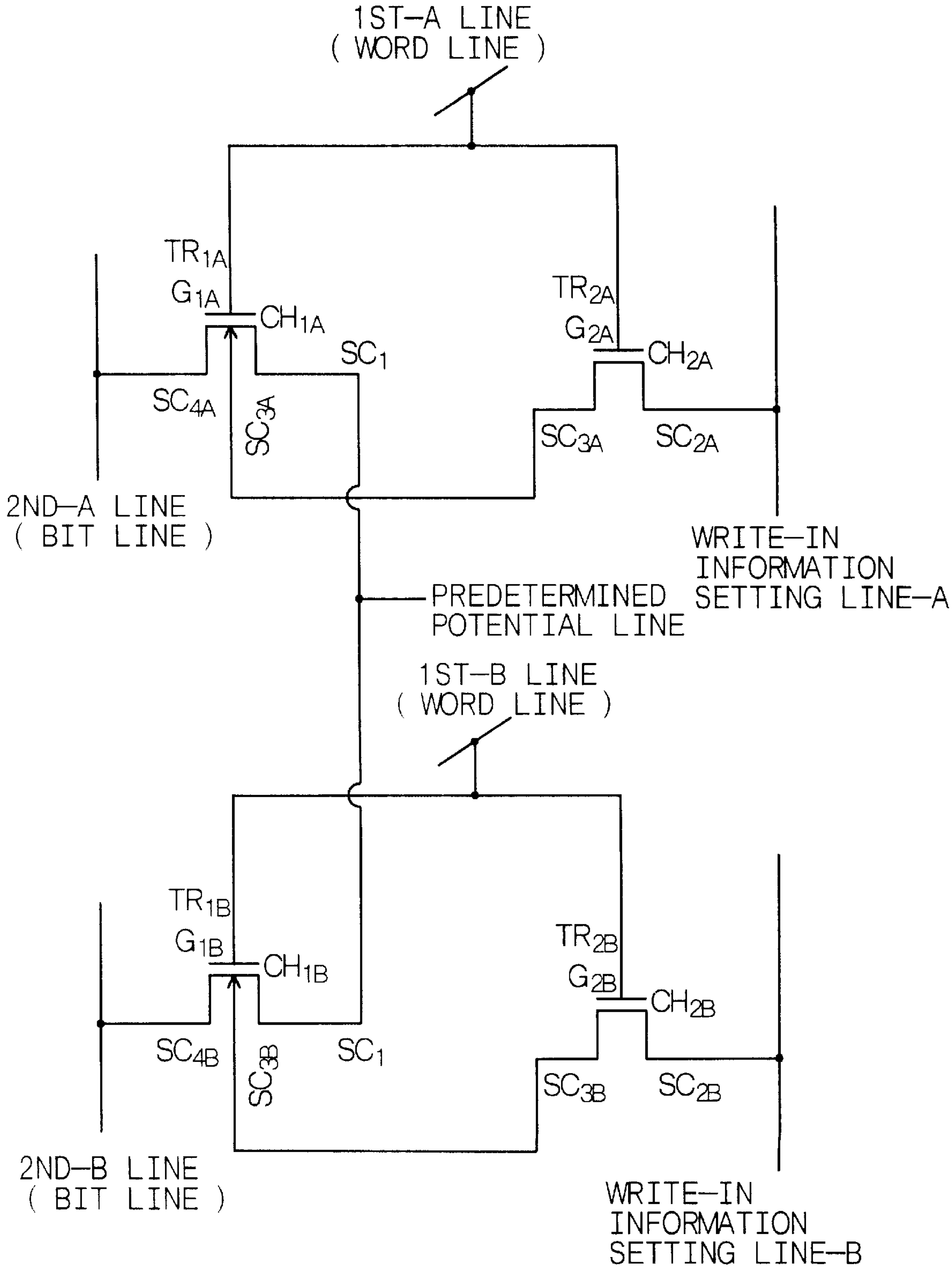
Figure 123:
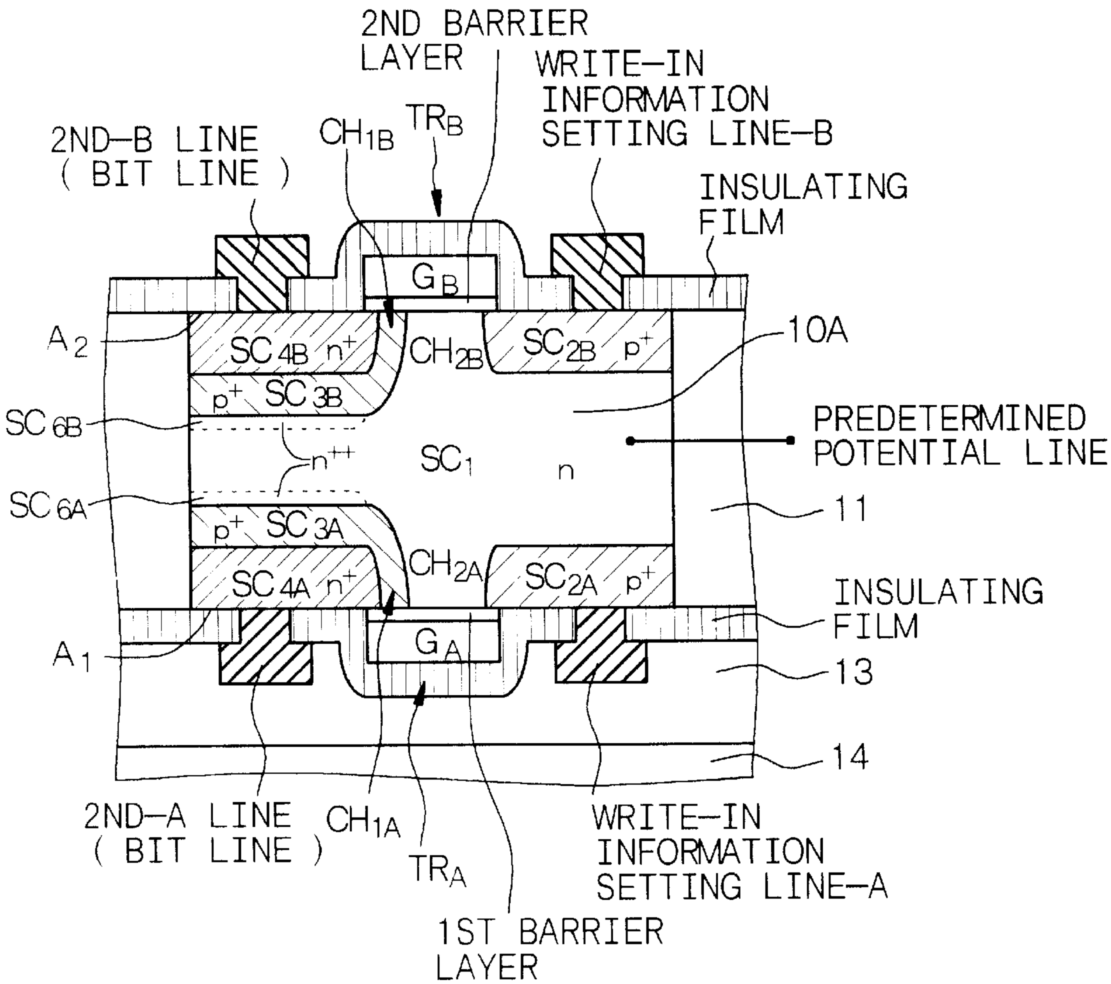

Example 18 is directed to the semiconductor memory cell according to the eighteenth aspect of the present invention. For example, as FIG. 122 shows its principle drawing and as FIG. 123 shows its schematic partial cross-sectional view, the semiconductor memory cell of Example 18 is provided with a semi-conductive layer 10A having a first main surface $A_1$ and a second main surface $A_2$ opposed to the first main surface $A_1$, and comprises a first semiconductor memory device $TR_A$ and a second semiconductor memory device $TR_B$. The first semiconductor memory device $TR_A$ comprises a first transistor of a first conductivity type (e.g., n-type) for read-out $TR_{1A}$ and a first transistor of a second conductivity type (e.g., p-type) for write-in $TR_{2A}$. The second semiconductor memory device $TR_B$ comprises a second transistor of the first conductivity type (e.g., n-type) for read-out $TR_{1B}$, and a second transistor of the second conductivity type (e.g., p-type) for write-in $TR_{2B}$. The semiconductor memory cell is formed in the semi-conductive layer 10A surrounded with an insulating layer 11 formed on a supporting substrate 14 and has a so-called SOI structure. In the semiconductor memory cell shown in FIG. 123, the supporting substrate 14, the insulating layer 13, the first semiconductor memory device $TR_A$ and the second semiconductor memory device $TR_B$ are arranged in this order from the bottom.

The semiconductor memory cell of Example 18 has;

(1) a first semi-conductive region $SC_1$ of the first conductivity type (for example, n-type), formed through the semi-conductive layer 10A from the first main surface $A_1$ to the second main surface $A_2$, (2-1) a second-A semi-conductive region $SC_{2A}$ of the second conductivity type (for example, $p^+$-type) opposite to the first conductivity type, or a second-A conductive region $SC_{2A}$ formed of a silicide, a metal or a metal compound, said second-A region $SC_{2A}$ being formed in a surface region, including the first main surface $A_1$, of the first region $SC_1$ and forming a rectifier junction together with the first region $SC_1$, (2-2) a second-B semi-conductive region $SC_{2B}$ of the second conductivity type (for example, $p^+$-type), or a second-B conductive region $SC_{2B}$ formed of a silicide, a metal or a metal compound, said second-B region $SC_{2B}$ being formed in a surface region, including the second main surface $A_2$, of the first region $SC_1$ and forming a rectifier junction together with the first region $SC_1$, (3-1) a third-A semi-conductive region $SC_{3A}$ of the second conductivity type (for example, $p^+$-type), formed in a surface region, including the first main surface $A_1$, of the first region $SC_1$ and spaced from the second-A region $SC_{2A}$, (3-2) a third-B semi-conductive region $SC_{3B}$ of the second conductivity type (for example, $p^+$-type), formed in a surface region, including the second main surface $A_2$, of the first region $SC_1$ and spaced from the second-B region $SC_{2B}$, (4-1) a fourth-A semi-conductive region $SC_{4A}$ of the first conductivity type (for example, $n^+$-type), or a fourth-A conductive region $SC_{4A}$ formed of a silicide, a metal or a metal compound, said fourth-A region $SC_{4A}$ being formed in a surface region, including the first main surface $A_1$, of the third-A region $SC_{3A}$ and forming a rectifier junction together with the third-A region $SC_{3A}$, (4-2) a fourth-B semi-conductive region $SC_{4B}$ of the first conductivity type (for example, $n^+$-type), or a fourth-B conductive region $SC_{4B}$ formed of a silicide, a metal or a metal compound, said fourth-B region $SC_{4B}$ being formed in a surface region, including the second main surface $A_2$, of the third-B region $SC_{3B}$ and forming a rectifier junction together with the third-B region $SC_{3B}$, (5-1) a gate portion $G_A$ (=$G_{1A}$+$G_{2A}$ wherein "$G_{1A}$" means a gate portion of the first transistor for read-out $TR_{1A}$ and "$G_{2A}$" means a gate portion of the first transistor for write-in $TR_{2A}$) of the first semiconductor memory device $TR_A$ formed on a first barrier layer formed on the first main surface $A_1$ so as to bridge the first region $SC_1$ and the fourth-A region $SC_{4A}$ and so as to bridge the second-A region $SC_{2A}$ and the third-A region $SC_{3A}$, and (5-2) a gate portion $G_B$ (=$G_{1B}$+$G_{2B}$ wherein "$G_{1B}$" means a gate portion of the second transistor for read-out $TR_{2A}$ and "$G_{2B}$" means a gate portion of the second transistor for write-in $TR_{2B}$) of the second semiconductor memory device $TR_B$ formed on a second barrier layer formed on the second main surface $A_2$ so as to bridge the first region $SC_1$ and the fourth-B region $SC_{4B}$ and so as to bridge the second-B region $SC_{2B}$ and the third-B region $SC_{3B}$.

In the semiconductor memory cell of Example 18 shown in FIG. 123, the gate portion $G_A$ of the first semiconductor memory device $TR_A$ and the gate portion $G_B$ of the second semiconductor memory device $TR_B$ are almost aligned along a vertical direction.

Concerning the first transistor for read-out $TR_{1A}$ in the first semiconductor memory device $TR_A$;

(A-1) one source/drain region is constituted of the fourth-A region $SC_{4A}$, (A-2) the other source/drain region is constituted of a surface region, including the first main surface $A_1$, of the first region $SC_1$, and (A-3) a channel forming region $CH_{1A}$ is constituted of a surface region, including the first main surface $A_1$, of the third-A region $SC_{3A}$ which surface region is: sandwiched by (or interposed between) the surface region, including the first main surface $A_1$, of the first region $SC_1$ and the fourth-A region $SC_{4A}$.

Concerning the second transistor for read-out $TR_{1B}$ in the second semiconductor memory device $TR_B$;

(a-1) one source/drain region is constituted of the fourth-B region $SC_{4B}$, (a-2) the other source/drain region is constituted of a surface region, including the second main surface $A_2$, of the first region $SC_1$, and (a-3) a channel forming region $CH_{1B}$ is constituted of a surface region, including the second main surface $A_2$, of the third-B region $SC_{3B}$ which surface region is sandwiched by (or interposed between) the surface region, including the second main surface $A_2$, of the first region $SC_1$ and the fourth-B region $SC_{4B}$.

Concerning the first transistor for write-in $TR_{2A}$ in the first semiconductor memory device $TR_A$;

(B-1) one source/drain region is constituted of the second-A region $SC_{2A}$, (B-2) the other source/drain region is constituted of a surface region, including the first main surface $A_1$, of the third-A region $SC_{3A}$, and (B-3) a channel forming region $CH_{2A}$ is constituted of a surface region, including the first main surface $A_1$, of the first region $SC_1$ which surface region is sandwiched by (or interposed between) the surface region, including the first main surface $A_1$, of the third-A region $SC_{3A}$ and the second-A region $SC_{2A}$.

Concerning the second transistor for write-in $TR_{2B}$ in the second semiconductor memory device $TR_B$;

(b-1) one source/drain region is constituted of the second-B region $SC_{2B}$, (b-2) the other source/drain region is constituted of a surface region, including the second main surface $A_2$, of the third-B region $SC_{3B}$, and (b-3) a channel forming region $CH_{2B}$ is constituted of a surface region, including the second main surface $A_2$, of the first region $SC_1$ which surface region is sandwiched by (or interposed between) the surface region, including the second main surface $A_2$, of the third-B region $SC_{3B}$ and the second-B region $SC_{2B}$.

In the semiconductor memory cell of Example 18, the gate portion $G_A$ (=$G_{1A}$+$G_{2A}$) of the first semiconductor memory device $TR_A$ is connected to a first-A memory-cell-selecting line (for example, a word line), and the gate portion $G_B$ (=$G_{1B}$+$G_{2B}$) of the second semiconductor memory device $TR_B$ is connected to a first-B memory-cell-selecting line (for example, the word line). The second-A region $SC_{2A}$ is connected to a write-in information setting line-A, and the second-B region $SC_{2B}$ is connected to a write-in information setting line-B. The fourth-A region $SC_{4A}$ is connected to a second-A memory-cell-selecting line (for example, a bit line), the fourth-B region $SC_{4B}$ is connected to a second-B memory-cell-selecting line (for example, the bit line), and the first region $SC_1$ is connected to a predetermined potential line. The first region $SC_1$ and the predetermined potential line can be connected to each other, e.g., by providing a structure in which part of the first region $SC_1$ is extended along a direction perpendicular to the sheet of FIG. 123 and a contact portion to the predetermined potential line is formed in that part of the first region $SC_1$.

Figure 124:
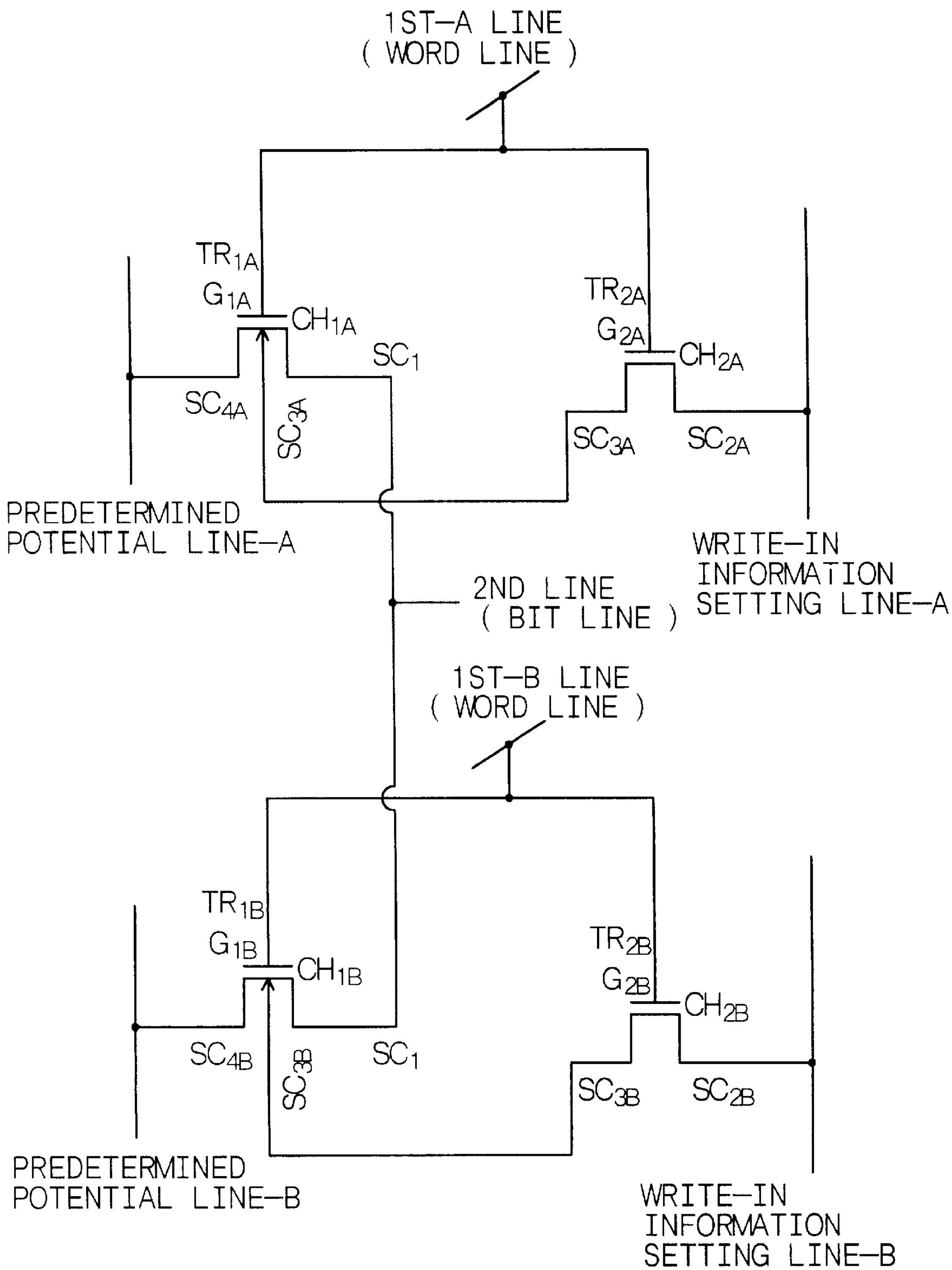
Figure 125:
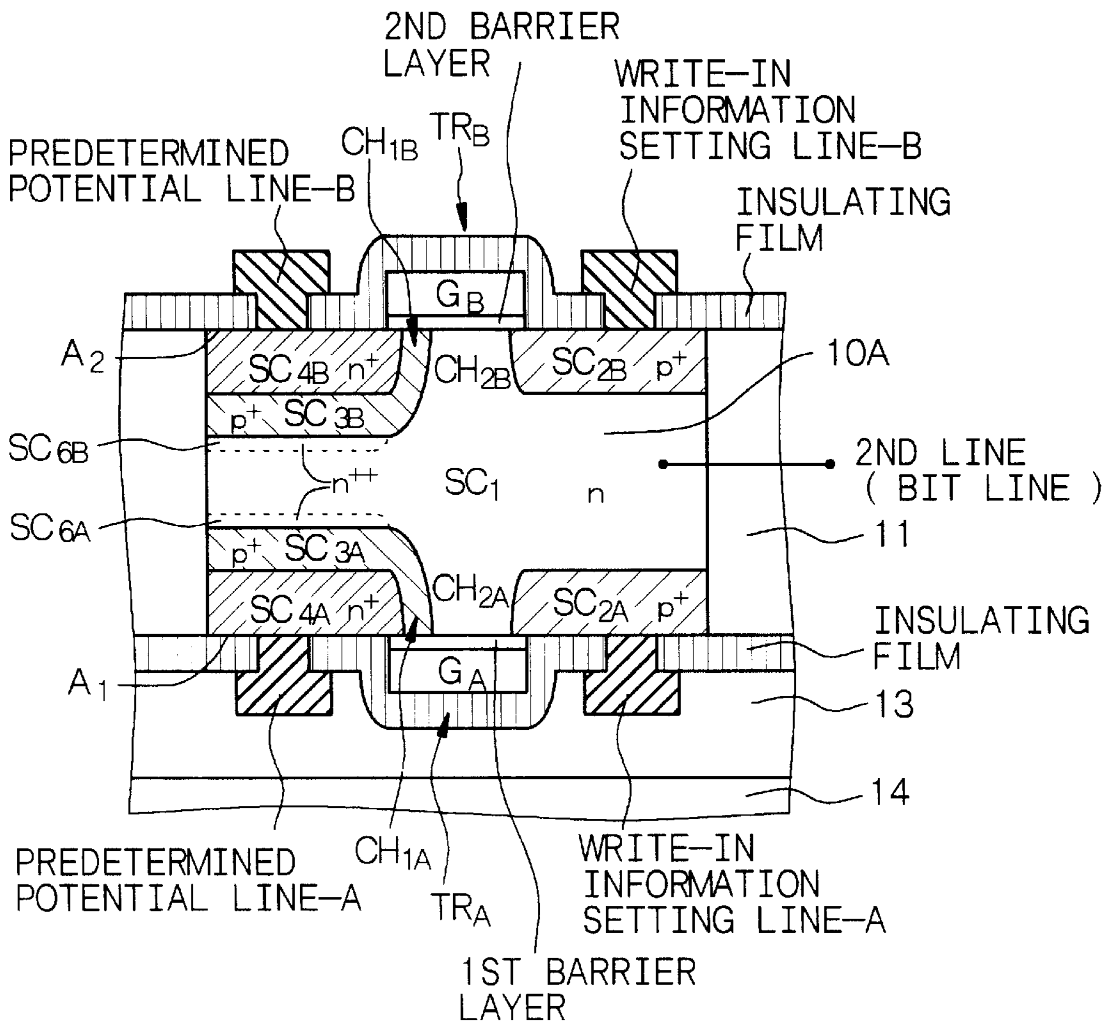

As FIG. 124 shows a principle drawing and as FIG. 125 shows a schematic partial cross-sectional view, a modification of the semiconductor memory cell in Example 18 may have a configuration in which the fourth-A region $SC_{4A}$ is connected to a predetermined potential line-A in place of being connected to the second-A memory-cell-selecting line, the fourth-B region $SC_{4B}$ is connected to a predetermined potential line-B in place of being connected to the second-B memory-cell-selecting line, and the first region $SC_1$ is connected to a second memory-cell-selecting line in place of being connected to the predetermined potential line.

The method for manufacturing the semiconductor memory cell of Example 18 shown in FIG. 123 will be explained with reference to FIGS. 126A, 126B, 127A, 127B, 128, 129, 130, 131, 132, 133 and 134, all of which schematically show partial cross-sectional views of the supporting substrate, etc.

[Step-1800]

A n-type silicon semiconductor substrate 10 is etched to form projected portions in which the semiconductor memory cells are to being fabricated, and then, the complementary concave portions are buried with an insulating layer 11 so that only the top surfaces of projected portions of the silicon semiconductor substrate 10 are exposed. The insulating layer 11 corresponds to a device isolating region. Thus, the first semi-conductive region $SC_1$ of the first conductivity type (for example, n-type) is formed in the projected portion of the silicon semiconductor substrate 10. A silicon oxide film 12 having a thickness of approx. 10 nm (corresponding to the first barrier layer), is formed on the surface of projected portion of the semiconductor substrate 10, on the basis of a known method for forming a silicon oxide film. Then, an impurity-containing polysilicon is deposited on the entire surface and is patterned to form the gate portion $G_A$ for the first semiconductor memory device $TR_A$. The extended portion of the gate portion $G_A$ functions also as the first memory-cell-selecting line (for example, a word line). Such state is shown in FIG. 126A as a partial schematic cross-sectional view. The top surface of projected portion of the silicon semiconductor substrate 10 corresponds to the first main surface $A_1$. The projected portion of the silicon semiconductor substrate 10 may have a height of 0.3 to 0.4 $\mu$m.

[Step-1810]

Then, using a resist 30Aas a mask, the second semi-conductive region $SC_{2A}$ of the second conductivity type (for example, $p^+$-type) is formed by ion implantation. Thus, the first semi-conductive region $SC_1$ of the first conductivity type (for example, n-type) is formed through the semi-conductive layer 10A (corresponding to the projected portion of the silicon semiconductor substrate 10) from the first main surface $A_1$ to the second main surface (described later), and, the second-A semi-conductive region $SC_{2A}$ of the second conductivity type (for example, $p^+$-type) is formed in the surface region, including the first main surface $A_1$, of the first region $SC_1$ (see FIG. 126B). The second-A region $SC_{2A}$ forms a rectifier junction together with the first region $SC_1$.

After the resist 30A is removed, using another resist mask 31A as a mask, oblique ion implantation is performed to form the third-A semi-conductive region $SC_{3A}$ of the second conductivity type (for example, $p^+$-type) opposite to the first conductivity type (for example, n-type), in the surface region, including the first main surface $A_1$, of the first region $SC_1$ (see FIG. 127A). The third-A region $SC_{3A}$ is spaced from the second-A region $SC_{2A}$ and forms a rectifier junction together with the first region $SC_1$. When the third-A region $SC_{3A}$ is formed, it is preferable to perform ion implantation twice with their ion incident angles being differed from each other. Setting the ion incident angle in the first ion implantation in particular at, for example, 60° allows precise control of the impurity concentration of the third-A region $SC_{3A}$ below the gate portion $G_A$.

Afterward, the fourth-A region $SC_{4A}$ of the first conductivity type (for example, $n^+$-type) is formed by ion implantation. The fourth-A semi-conductive region $SC_{4A}$ is thus formed in the surface region, including the first main surface $A_1$, of the third-A region $SC_{3A}$ so as to form a rectifier junction together with the third-A region $SC_{3A}$ (see FIG. 127B).

It is also allowable to deposit, for example, a layer of SiN on the entire surface by a CVD method, to etch the layer of SiN anisotropically for forming sidewalls on the both lateral planes of the gate portion $G_A$, again to perform ion implantation of a p-type impurity at a high dosage to the second-A region $SC_{2A}$, and to perform ion implantation of an n-type impurity at a high dosage to the fourth-A region $SC_{4A}$,

[Step-1820]

Next, after the resist 31A is removed, an insulating layer constituted of, for example, $SiO_2$ is deposited on the entire surface by a CVD method, and openings are formed in the insulating layer above the second-A region $SC_{2A}$ and fourth-A region $SC_{4A}$. A metal layer is deposited on the entire surface including the insides of the openings, and is patterned to form the write-in information setting line-A connected to the second-A region $SC_{2A}$ and the second-A memory-cell-selecting line (for example, a bit line) connected to the fourth-A region $SC_{4A}$ (see FIG. 128). It is not always necessary to form the second-A region $SC_{2A}$ and fourth-A region $SC_{4A}$ by the ion implantation. A barrier layer or glue layer constituted of titanium silicide or TiN, being usually formed in the general process for fabricating the write-in information setting line-A or the second-A memory-cell-selecting line, may be formed also on the surface of the first region $SC_1$ exposed at the bottom of the openings. Thus, the second-A region $SC_{2A}$ in common with part of the write-in information setting line-A (more specifically, part of the barrier layer or glue layer) and the fourth-A region $SC_{4A}$ in common with part of the second-A memory-cell-selecting line (more specifically, part of the barrier layer or glue layer) are formed in the surface region of the first region $SC_1$.

[Step-1830]

Next, as shown in FIG. 129, an insulating layer 13 constituted of, for example, $SiO_2$ is deposited on the entire surface by a CVD method, and the surface of which is then polished to be flattened. The surface of the insulating layer 13 and a supporting substrate 14 made of a silicon semiconductor substrate are bonded, and the silicon semiconductor substrate 10 is then polished from the back surface to expose the bottom 11A of the insulating layer 11 (see FIG. 130). Thus, a semi-conductive layer 10A corresponding to the projected portion of the silicon semiconductor substrate 10 is left within the insulating layer 11. The surface of the semi-conductive layer 10A corresponds to the second main surface $A_2$.

[Step-1840]

After that, a silicon oxide film 15 (corresponds to the second barrier layer) having a thickness of approx. 10 nm is formed on the second main surface $A_2$ of the semi-conductive layer 10A, on the basis of a known method for forming a silicon oxide film. An impurity-containing polysilicon layer is then deposited on the entire surface, and is patterned to form the gate portion $G_B$ for the second semiconductor memory device $TR_B$. The extended portion of the gate portion $G_B$ functions also as the first-B memory-cell-selecting line (for example, a word line). Such state is shown in FIG. 131 as a partial schematic cross-sectional view.

[Step-1850]

Using a resist 30B as a mask, ion implantation is performed to form the second-B semi-conductive region $SC_{2B}$ of the second conductivity type (for example, $p^+$-type) in the surface region, including the second main surface $A_2$, of the first region $SC_1$ (see FIG. 132). The second-B region $SC_{2B}$ forms a rectifier junction together with the first region $SC_1$.

After the resist 30B is removed, using another resist mask 31B as a mask, oblique ion implantation is performed to form the third-B semi-conductive region $SC_{3B}$ of the second conductivity type (for example, $p^+$-type) opposite to the first conductivity type, in the surface region, including the second main surface $A_2$, of the first region $SC_1$ (see FIG. 133). The third-B semi-conductive region $SC_{3B}$ is spaced from the second-B region $SC_{2B}$. When the third-B region $SC_{3B}$ is formed, it is preferable to perform ion implantation twice with their ion incident angles being differed from each other. Setting the ion incident angle in the first ion implantation in particular at, for example, 60° allows precise control of the impurity concentration of the third-B region $SC_{3B}$ below the gate portion $G_B$.

Then, the fourth-B semi-conductive region $SC_{4B}$ of the first conductivity type (for example, $n^+$-type) is formed by ion implantation. Thus, the fourth-B semi-conductive region $SC_{4B}$ of the first conductivity type (for example, $n^+$-type) forming a rectifier junction together with the third-B region $SC_{3B}$ is formed in the surface region, including the second main surface $A_2$, of the third-B region $SC_{3B}$ (see FIG. 134).

It is also allowable to deposit, for example, a layer of SiN on the entire surface by a CVD method, to etch the layer of SiN anisotropically for forming sidewalls on the both lateral planes of the gate portion $G_B$, again to perform ion implantation of a p-type impurity at a high dosage to the second-B region $SC_{2B}$, and to perform ion implantation of an n-type impurity at a high dosage to the fourth-B region $SC_{4B}$.

[Step-1860]

Next, after the resist 31B is removed, an insulating layer constituted of, for example, $SiO_2$ is deposited on the entire surface by a CVD method, and openings are formed in the insulating layer above the second-B region $SC_{2B}$ and fourth-B region $SC_{4B}$, A metal layer is deposited on the entire surface including the insides of the openings, and is patterned to form the write-in information setting line-B connected to the second-B region $SC_{2B}$ and the second-B memory-cell-selecting line (for example, a bit line) connected to the fourth-B region $SC_{4B}$ (see FIG. 123). It is not always necessary to form the second-B region $SC_{2B}$ and fourth-B region $SC_{4B}$ by the ion implantation. A barrier layer or glue layer constituted of titanium silicide or TiN, being usually formed in the general process for fabricating the write-in information setting line-B or the second-B memory-cell-selecting line, may be formed also on the surface of the first region $SC_1$ exposed at the bottom of the openings. Thus, the second-B region $SC_{2B}$ in common with part of the write-in information setting line-B (more specifically, part of the barrier layer or glue layer) and the fourth-B region $SC_{4B}$ in common with part of the second-B memory-cell-selecting line (more specifically, part of the barrier layer or glue layer) are formed in the surface region of the first region $SC_1$.

The manufacturing processes for the semiconductor memory cell of Example 18 are not limited to those mentioned above. The order of forming individual regions by ion implantation is arbitrary in essence even with some dependence on the processes. In the above-described ion implantations, it is necessary to optimize the conditions for introducing the impurities through computer-assisted simulation or experiments so that the individual regions will have an optimum impurity concentrations.

When a region $SC_{6A}$ containing a high concentration of an impurity having the first conductivity type is formed between the first region $SC_1$ and the third-A region $SC_{3A}$ or a region $SC_{6B}$ containing a high concentration of an impurity having the first conductivity type is formed between the first region $SC_1$ and the third-B region $SC_{3B}$, a potential or an electric charge stored in the channel forming region $CH_{1A}$ or $CH_{1B}$ in the first or second transistor for read-out $TR_{1A}$ or $TR_{1B}$ can be increased.

EXAMPLE 9

Example 19 is directed to the semiconductor memory cell according to the nineteenth aspect of the present invention. For example, as FIG. 135 shows its principle drawing and as FIG. 136 shows its schematic partial cross-sectional view, the semiconductor memory cell of Example 19 is provided with a semi-conductive layer 10A having a first main surface $A_1$ and a second main surface $A_2$ opposed to the first main surface A, and comprises a first semiconductor memory device $TR_A$ and a second semiconductor memory device $TR_B$. The first semiconductor memory device $TR_A$ comprises a first transistor of a first conductivity type (e.g., n-type) for read-out $TR_{1A}$, a first transistor of a second conductivity type (e.g., p-type) for write-in $TR_{2A}$ and a first diode $D_A$. The second semiconductor memory device $TR_B$ comprises a second transistor of the first conductivity type (e.g., n-type) for read-out $TR_{1B}$, a second transistor of the second conductivity type (e.g., p-type) for write-in $TR_{2B}$ and a second diode $D_B$. The semiconductor memory cell is formed in the semi-conductive layer 10A surrounded with an insulating layer 11 formed on a supporting substrate 14 and has a so-called SOI structure. In the semiconductor memory cell shown in FIG. 136, the supporting substrate 14, the insulating layer 13, the first semiconductor memory device $TR_A$ and the second semiconductor memory device $TR_B$ are arranged in this order from the bottom.

The semiconductor memory cell of Example 19 has;

(1) a first semi-conductive region $SC_1$ of the first conductivity type (for example, n-type), formed through the semi-conductive layer 10A from the first main surface $A_1$ to second main surface $A_2$, (2-1) a second-A semi-conductive region $SC_{2A}$ of the second conductivity type (for example, $p^+$-type) opposite to the first conductivity type, or a second-A conductive region $SC_{2A}$ formed of a silicide, a metal or a metal compound, said second-A region $SC_{2A}$ being formed in a surface region, including the first main surface $A_1$, of the first region $SC_1$ and forming a rectifier junction together with the first region $SC_1$, (2-2) a second-B semi-conductive region $SC_2$, of the second conductivity type (for example, $p^{++}$-type), or a second-B conductive region $SC_{2B}$ formed of a silicide, a metal or a metal compound, said second-B region $SC_{2B}$ being formed in a surface region, including the second main surface $A_2$, of the first region $SC_1$ and forming a rectifier junction together with the first region $SC_1$, (3-1) a third-A semi-conductive region $SC_{3A}$ of the second conductivity type (for example, $p^+$-type), formed in a surface region, including the first main surface $A_1$, of the first region $SC_1$ and spaced from the second-A region $SC_{2A}$, (3-2) a third-B semi-conductive region $SC_{3B}$ of the second conductivity type (for example, $p^+$-type), formed in a surface region, including the second main surface $A_2$, of the first region $SC_1$ and spaced from the second-B region $SC_{2B}$, (4-1) a fourth-A semi-conductive region $SC_{4A}$ of the first conductivity type (for example, $n^+$-type), or a fourth-A conductive region $SC_{4A}$ formed of a silicide, a metal or a metal compound, said fourth-A region $SC_{4A}$ being formed in a surface region, including the first main surface $A_1$, of the third-A region $SC_{3A}$ and forming a rectifier junction together with the third-A region $SC_{3A}$, (4-2) a fourth-B semi-conductive region $SC_{4B}$ of the first conductivity type (for example, $n^+$-type), or a fourth-B conductive region $SC_{4B}$ formed of a silicide, a metal or a metal compound, said fourth-B region $SC_{4B}$ being formed in a surface region, including the second main surface $A_2$, of the third-B region $SC_{3B}$ and forming a rectifier junction together with the third-B region $SC_{3B}$, (5-1) a gate portion $G_A$ (=$G_{1A}$+$G_{2A}$ wherein "$G_{1A}$" means a gate portion of the first transistor for read-out $TR_{1A}$ and "$G_{2A}$" means a gate portion of the first transistor for write-in $TR_{2A}$) of the first semiconductor memory device $TR_A$ formed on a first barrier layer formed on the first main surface $A_1$ so as to bridge the first region $SC_1$ and the fourth-A region $SC_{4A}$ and so as to bridge the second-A region $SC_{2A}$ and the third-A region $SC_{3A}$, and (5-2) a gate portion $G_B$ (=$G_{1B}$+$G_{2B}$ wherein "$G_{1B}$" means a gate portion of the second transistor for read-out $TR_{1B}$ and "$G_{2B}$" means a gate portion of the second transistor for write-in $TR_{2B}$) of the second semiconductor memory device $TR_B$ formed on a second barrier layer formed on the second main surface $A_2$ so as to bridge the first region $SC_1$ and the fourth-B region $SC_{4B}$ and so as to bridge the second-B region $SC_{2B}$ and the third-B region $SC_{3B}$.

In the semiconductor memory cell of Example 19 shown in FIG. 136, the gate portion $G_A$ of the first semiconductor memory device $TR_A$ and the gate portion $G_B$ of the second semiconductor memory device $TR_B$ are almost aligned along a vertical direction.

Concerning the first transistor for read-out $TR_{1A}$ in the first semiconductor memory device $TR_A$;

(A-1) one source/drain region is constituted of the fourth-A region $SC_{4A}$, (A-2) the other source/drain region is constituted of a surface region, including the first main surface $A_1$, of the first region $SC_1$, and (A-3) a channel forming region $CH_{1A}$ is constituted of a surface region, including the first main surface $A_1$, of the third-A region $SC_{3A}$ which surface region is sandwiched by (or interposed between) the surface region, including the first main surface $A_1$, of the first region $SC_1$ and the fourth-A region $SC_{4A}$.

Concerning the second transistor for read-out $TR_{1B}$ in the second semiconductor memory device $TR_B$;

(a-1) one source/drain region is constituted of the fourth-B region $SC_{4B}$, (a-2) the other source/drain region is constituted of a surface region, including the second main surface $A_2$, of the first region $SC_1$, and (a-3) a channel forming region $CH_{1B}$ is constituted of a surface region, including the second main surface $A_2$, of the third-B region $SC_{3B}$ which surface region is sandwiched by (or interposed between) the surface region, including the second main surface $A_2$, of the first region $SC_1$ and the fourth-B region $SC_{4B}$.

Concerning the first transistor for write-in $TR_{2A}$ in the first semiconductor memory device $TR_A$;

(B-1) one source/drain region is constituted of the second-A region $SC_{2A}$, (B-2) the other source/drain region is constituted of a surface region, including the first main surface $A_1$, of the third-A region $SC_{3A}$, and (B-3) a channel forming region $CH_{2A}$ is constituted of a surface region, including the first main surface $A_1$, of the first region $SC_1$ which surface region is sandwiched by (or interposed between) the surface region, including the first main surface $A_1$, of the third-A region $SC_{3A}$ and the second-A region $SC_{2A}$.

Concerning the second transistor for write-in $TR_{2B}$ in the second semiconductor memory device $TR_B$;

(b-1) one source/drain region is constituted of the second-B region $SC_{2B}$, (b-2) the other source/drain region is constituted of a surface region, including the second main surface $A_2$, of the third-B region $SC_{3B}$, and (b-3) a channel forming region $CH_{2B}$ is constituted of a surface region, including the second main surface $A_2$, of the first region $SC_1$ which surface region is sandwiched by (or interposed between) the surface region, including the second main surface $A_2$, of the third-B region $SC_{3B}$ and the second-B region $SC_{2B}$.

The first diode $D_A$ is constituted of the first region $SC_1$ and the second-A region $SC_{2A}$ and the second diode $D_B$ is constituted of the first region $SC_1$ and the second-B region $SC_{2B}$.

In the semiconductor memory cell of Example 19, the gate portion $G_A$ ($=G_{1A}+G_{2A}$) of the first semiconductor memory device $TR_A$ is connected to a first-A memory-cell-selecting line (for example, a word line), and the gate portion $G_1$ ($=G_{1B}+G_{2B}$) of the second semiconductor memory device $TR_B$ is connected to a first-B memory-cell-selecting line (for example, the word line). Further, the second-A region $SC_{2A}$ is connected to a write-in information setting line-A, the second-B region $SC_{2B}$ is connected to a write-in information setting line-B, the fourth-A region $SC_{4A}$ is connected to a second-A memory-cell-selecting line (for example, a bit line), and the fourth-B region $SC_{4B}$ is connected to a second-B memory-cell-selecting line (for example, the bit line). Since the diode $D_A$ and the diode $D_B$ are provided, the semiconductor memory cell of Example 19 differs from the semiconductor memory cell of Example 18 in that the first region $SC_1$ is not required to be connected to a predetermined potential line.

As FIG. 137 shows a principle drawing and as FIG. 138 shows a schematic partial cross-sectional view, the semiconductor memory cell may have a configuration in which the write-in information setting line-A is in common with the write-in information setting line-B, whereby the wiring configuration of the semiconductor memory cell can be simplified.

It is also possible to make the write-in information setting line-A and line-B being in common by the steps of, for example, forming the second-A region $SC_{2A}$ together with its extended portion; forming a conductive region containing a $p^{++}$-type impurity so as to be extended from the extended portion of the second-A region $SC_{2A}$ to the second main surface $A_2$ before or after the formation of the second-B region $SC_{2B}$; and forming the second-B region $SC_{2B}$ together with its extended portion so that this extended portion reaches the above conductive region containing a $p^{++}$-type impurity. The same constitution can be applied to the case for forming the second memory-cell-selecting lines in common, in the semiconductor memory cell according to any one of the eighteenth to twenty-first aspects of the present invention.

As FIG. 139 shows a principle drawing and as FIG. 140 shows a schematic partial cross-sectional view, a modification of the semiconductor memory cell in Example 19 has a configuration in which the second-A region $SC_{2A}$ is connected to the second-A memory-cell-selecting line (for example, the bit line) in place of being connected to the write-in information setting line-A, the second-B region $SC_{2B}$ is connected to the second-B memory-cell-selecting line (for example, the bit line) in place of being connected to the write-in information setting line-B, the fourth-A region $SC_{4A}$ is connected to a predetermined potential line-A in place of being connected to the second-A memory-cell-selecting line, and the fourth-B region $SC_{4B}$ is connected to a predetermined potential line-B in place of being connected to the second-B memory-cell-selecting line. In this modification, the second-A memory-cell-selecting line and the second-B memory-cell-selecting line also serve as the write-in information setting line-A and the write-in information setting line-B.

As FIG. 141 shows a principle drawing and as FIG. 142 shows a schematic partial cross-sectional view, another modification of the semiconductor memory cell in Example 19 has a configuration in which the second-A memory-cell-selecting line is in common with the second-B memory-cell-selecting line.

The method of manufacturing the semiconductor memory cell in Examples 19 can substantially be the same as the method of manufacturing the semiconductor memory cell of Example 18. Detailed explanations thereof are therefore omitted.

EXAMPLE 20

Example 20 is directed to another modification of the semiconductor memory cell according to the nineteenth aspect of the present invention and the semiconductor memory cell according to the twentieth aspect of the present invention. As FIG. 143 shows its principle drawing and as FIG. 144 shows its schematic partial cross-sectional view, the semiconductor memory cell of Example 20 further has a fifth-A conductive region $SC_{5A}$ formed in a surface region, including the first main surface $A_1$, of the first region $SC_1$ and a fifth-B conductive region $SC_{5B}$ formed in a surface region, including the second main surface $A_2$, of the first region $SC_1$. The first diode comprises a Schottky diode $D_{SA}$ constituted of the first region $SC_1$ and the fifth-A region $SC_{5A}$ in place of being constituted of the first region $SC_1$ and the second-A region $SC_{2A}$, and the second diode comprises a Schottky diode $D_{SB}$ constituted of the first region $SC_1$ and the fifth-B region $SC_{5B}$ in place of being constituted of the first region $SC_1$ and the second-B region $SC_{2B}$.

As FIG. 145 shows a principle drawing and as FIG. 146 shows a schematic partial cross-sectional view, a modification of the semiconductor memory cell in Example 20 may have a configuration in which the write-in information setting line-A is in common with the write-in information setting line-B. The fifth-A region $SC_{5A}$ or the fifth-B region $SC_{5B}$ may be constituted of a silicide layer or a metal layer such as Mo or Al layer.

Alternatively, as FIG. 147 shows a principle drawing and as FIG. 148 shows a schematic partial cross-sectional view, another modification of the semiconductor memory cell in Example 20 may have a configuration in which the second-A region $SC_{2A}$ is connected to the second-A memory-cell-selecting line in place of being connected to the write-in information setting line-A, the second-B region $SC_{2B}$ is connected to the second-B memory-cell-selecting line in place of being connected to the write-in information setting line-B, the fourth-A region $SC_{4A}$ is connected to a predetermined potential line-A in place of being connected to the second-A memory-cell-selecting line, and the fourth-B region $SC_{4B}$ is connected to a predetermined potential line-B in place of being connected to the second-B memory-cell-selecting line.

As FIG. 149 shows a principle drawing and as FIG. 150 shows a schematic partial cross-sectional view, the above modification may have a configuration in which the second-A memory-cell-selecting line is in common with the second-B memory-cell-selecting line. In these modification, the second-A memory-cell-selecting line and the second-B memory-cell-selecting line also serve as the write-in information setting line-A and the write-in information setting line-B, respectively.

As FIG. 151 shows a principle drawing and as FIG. 152 shows a schematic partial cross-sectional view, another modification of the semiconductor memory cell in Example 20 may have a configuration in which the write-in information setting line-A is in common with the write-in information setting line-B; the semiconductor memory cell further has a fifth conductive region $SC_5$ formed through the semi-conductive layer 10A from the first main surface $A_1$ to second main surface $A_2$ and being in contact with the first region $SC_1$; the first diode comprises a Schottky diode $D_S$ constituted of the first region $SC_1$ and the fifth region $SC_5$ in place of being constituted of the first region $SC_1$ and the second-A region $SC_{2A}$; and the second diode comprises a Schottky diode $D_S$ constituted of the first region $SC_1$ and the fifth region $SC_5$ in place of being constituted of the first region $SC_1$ and the second-B region $SC_{2B}$.

As FIG. 153 shows a principle drawing and as FIG. 154 shows a schematic partial cross-sectional view, the above modification of the semiconductor memory cell in Example 20 may have a configuration in which the second-A region $SC_{2A}$ and the second-B region $SC_{2B}$ are connected to a second memory-cell-selecting line (for example, the bit line) in place of being connected to the common write-in information setting line; the fourth-A region $SC_{4A}$ is connected to a predetermined potential line-A in place of being connected to the second-A memory-cell-selecting line; and the fourth-B region $SC_{4B}$ is connected to a predetermined potential line-B in place of being connected to the second-B memory-cell-selecting line. In this modification, the second memory-cell-selecting line also serves as the common write-in information setting line.

The method of manufacturing the semiconductor memory cell in Example 20 can substantially be the same as the method of manufacturing the semiconductor memory cell of Example 18, except the formation of the fifth-A region $SC_{5A}$, the fifth-B region $SC_{5B}$ or the fifth region $SC_5$. Detailed explanations thereof are therefore omitted. The fifth region $SC_5$ can be formed in, for example, [Step-1800] of Example 18 by the steps of etching the n-type silicon semiconductor substrate 10 for leaving the projected portion as a semi-conductive layer 10A in which the semiconductor memory cell is to be fabricated; and depositing a silicide layer or a metal layer consisting of Mo, Al and so forth on part of the projected portion of the silicon semiconductor substrate 10 by oblique sputtering.

In the semiconductor memory cell of Example 20, when the diode $D_A$ or $D_B$ is formed of a pn junction constituted of the first region $SC_1$ and the second-A region $SC_{2A}$ or of the first region $SC_1$ and the second-B region $SC_{2B}$, and if the potential setting in the first region $SC_1$ or the second-A region $SC_{2A}$ is improper, or if the designing of impurity concentration relationship of the first region $SC_1$ and the second-A region $SC_{2A}$ or the designing of impurity concentration relationship of the first region $SC_1$ and the second-B region $SC_{2B}$ is improper, "latch-up" may take place when the information is read out or write-in. For avoiding the above problem, the voltage which is applied to, for example, the write-in information setting line is required to be a low degree of voltage (0.4 volt or lower) at which no large forward current flows in the diode $D_A$ (the junction portion of the second-A region $SC_{2A}$ and the first region $SC_1$) or in the diode $D_B$ (the junction portion of the second-B region $SC_2$, and the first region $SC_1$). When the fifth-A region $SC_{5A}$ or the fifth-B region $SC_{5B}$ is constituted of a silicide, a metal or a metal compound, a Schottky junction in which majority carrier mainly constitutes a forward current is formed between the fifth-A region $SC_{5A}$ and the first region $SC_1$ or between the fifth-B region $SC_{5B}$ and the first region $SC_1$, whereby the risk of latch-up can be avoided, and the limitation on the voltage applied to the write-in information setting line or the second-A or second-B memory-cell-selecting line is substantially removed.

EXAMPLE 21

Example 21 is directed to the semiconductor memory cell according to the twenty-first aspect of the present invention. As FIG. 155 shows its principle drawing and as FIG. 156 shows its schematic partial cross-sectional view, the semiconductor memory cell of Example 21 is provided with a semi-conductive layer 10A having a first main surface $A_1$ and a second main surface $A_2$ opposed to the first main surface $A_1$, and comprises a first semiconductor memory device $TR_A$ and a second semiconductor memory device $TR_B$. The first semiconductor memory device $TR_A$ comprises a first transistor of a first conductivity type (e.g., n-type) for read-out $TR_{1A}$, a first transistor of a second conductivity type (e.g., p-type) for write-in $TR_{2A}$ and a first diode D. The second semiconductor memory device $TR_B$ comprises a second transistor of the first conductivity type (e.g., n-type) for read-out $TR_{1B}$, a second transistor of the second conductivity type (e.g., p-type) for write-in $TR_{2B}$ and a second diode D. The semiconductor memory cell is formed in the semi-conductive layer 10A surrounded with an insulating layer 11 formed on a supporting substrate 14 and has a so-called SOI structure. In the semiconductor memory cell of Example 21 shown in FIG. 156, the supporting substrate 14, the insulating layer 13, the first semiconductor memory device $TR_A$ and the second semiconductor memory device $TR_B$ are arranged in this order from the bottom.

The semiconductor memory cell of Example 21 has;

(1) a first semi-conductive region $SC_1$ of the first conductivity type (for example, n-type), formed through the semi-conductive layer 10A from the first main surface $A_1$ to second main surface $A_2$, (2) a second semi-conductive region $SC_2$ of the second conductivity type (for example, p-type) opposite to the first conductivity type, formed through the semi-conductive layer 10A from the first main surface $A_1$ to second main surface $A_2$ and being in contact with the first region $SC_1$, (3-1) a third-A semi-conductive region $SC_{3A}$ of the second conductivity type (for example, p-type), formed in a surface region, including the first main surface $A_1$, of the first region $SC_1$ and spaced from the second region $SC_2$, (3-2) a third-B semi-conductive region $SC_{3B}$ of the second conductivity type (for example, p-type), formed in a surface region, including the second main surface $A_2$, of the first region $SC_1$ and spaced from the second region $SC_2$, (4-1) a fourth-A semi-conductive region $SC_{4A}$ of the first conductivity type (for example, $n^+$-type), or a fourth-A conductive region $SC_{4A}$ formed of a silicide, a metal or a metal compound, said fourth-A region $SC_{4A}$ being formed in a surface region, including the first main surface $A_1$, of the third-A region $SC_{3A}$ and forming a rectifier junction together with the third-A region $SC_{3A}$, (4-2) a fourth-B semi-conductive region $SC_{4B}$ of the first conductivity type (for example, $n^+$-type), or a fourth-B conductive region $SC_{4B}$ formed of a silicide, a metal or a metal compound, said fourth-B region $SC_{4B}$ being formed in a surface region, including the second main surface $A_2$, of the third-B region $SC_{3B}$ and forming a rectifier junction together with the third-B region $SC_{3B}$, (5-1) a gate portion $G_A$ ($=G_{1A}+G_{2A}$ wherein "$G_{1A}$" means a gate portion of the first transistor for read-out $TR_{1A}$ and "$G_{2A}$" means a gate portion of the first transistor for write-in $TR_{2A}$) of the first semiconductor memory device $TR_A$ formed on a first barrier layer formed on the first main surface $A_1$ so as to bridge the first region $SC_1$ and the fourth-A region $SC_{4A}$ and so as to bridge the second region $SC_2$ and the third-A region $SC_{3A}$, and (5-2) a gate portion $G_1$ ($=G_{1B}+G_{2B}$ wherein "$G_{1B}$" means a gate portion of the second transistor for read-out $TR_{1B}$ and "$G_{2B}$" means a gate portion of the second transistor for write-in $TR_{2B}$) of the second semiconductor memory device $TR_B$ formed on a second barrier layer formed on the second main surface $A_2$ so as to bridge the first region $SC_1$ and the fourth-B region $SC_{4B}$ and so as to bridge the second region $SC_2$ and the third-B region $SC_{3B}$.

In the semiconductor memory cell of Example 21 shown in FIG. 156, the gate portion $G_A$ of the first semiconductor memory device $TR_A$ and the gate portion $G_B$ of the second semiconductor memory device $TR_B$, are almost aligned along a vertical direction.

Concerning the first transistor for read-out $TR_{1A}$ in the first semiconductor memory device $TR_A$;

(A-1) one source/drain region is constituted of the fourth-A region $SC_{4A}$, (A-2) the other source/drain region is constituted of a surface region, including the first main surface $A_1$, of the first region $SC_1$, and (A-3) a channel forming region $CH_{1A}$ is constituted of a surface region, including the first main surface $A_1$, of the third-A region $SC_{3A}$ which surface region is sandwiched by (or interposed between) the surface region, including the first main surface $A_1$, of the first region $SC_1$ and the fourth-A region $SC_{4A}$, Concerning the second transistor for read-out $TR_{1B}$ in the second semiconductor memory device $TR_B$;

(a-1) one source/drain region is constituted of the fourth-B region $SC_{4B}$, (a-2) the other source/drain region is constituted of a surface region, including the second main surface $A_2$, of the first region $SC_1$, and (a-3) a channel forming region $CH_{1B}$ is constituted of a surface region, including the second main surface $A_2$, of the third-B region $SC_{3B}$ which surface region is sandwiched by (or interposed between) the surface region, including the second main surface $A_2$, of the first region $SC_1$ and the fourth-B region $SC_{4B}$.

Concerning the first transistor for write-in $TR_{2A}$ in the first semiconductor memory device $TR_A$;

(B-1) one source/drain region is constituted of a surface region, including the first main surface $A_1$, of the second region $SC_2$, (B-2) the other source/drain region is constituted of a surface region, including the first main surface $A_1$, of the third-A region $SC_{3A}$, and (B-3) a channel forming region $CH_{2A}$ is constituted of a surface region, including the first main surface $A_1$, of the first region $SC_1$ which surface region is sandwiched by (or interposed between) the surface region, including the first main surface $A_1$, of the second region $SC_2$ and the surface region, including the first main surface $A_1$, of the third-A region $SC_{3A}$. Concerning the second transistor for write-in $TR_{2B}$ in the second semiconductor memory device $TR_B$;

(b-1) one source/drain region is constituted of a surface region, including the second main surface $A_2$, of the second region $SC_2$, (b-2) the other source/drain region is constituted of a surface region, including the second main surface $A_2$, of the third-B region $SC_{3B}$, and (b-3) a channel forming region $CH_{2B}$ is constituted of a surface region, including the second main surface $A_2$, of the first region $SC_1$ which surface region is sandwiched by (or interposed between) the surface region, including the second main surface $A_2$, of the second region $SC_2$ and the surface region, including the second main surface $A_2$, of the third-B region $SC_{3B}$.

The first diode D is in common with the second diode D, and each of the first diode D and the second diode D is constituted of the first region $SC_1$ and the second region $SC_2$. The gate portion $G_A$ ($=G_{1A}+G_{2A}$) of the first semiconductor memory device $TR_A$ is connected to a first-A memory-cell-selecting line, the gate portion $G_B$ (=$G_{1B}$+$G_{2B}$) of the second semiconductor memory device $TR_B$ is connected to a first-B memory-cell-selecting line. The second region $SC_2$ is connected to a write-in information setting line, the fourth-A region $SC_{4A}$ is connected to a second-A memory-cell-selecting line, and the fourth-B region $SC_{4B}$ is connected to a second-B memory-cell-selecting line.

As FIG. 157 shows a principle drawing and as FIG. 158 shows a schematic partial cross-sectional view, a modification of the semiconductor memory cell in Example 21 may have a configuration in which the write-in information setting line-A is in common with the write-in information setting line-B. In this modification, a second memory-cell-selecting line serves as the common write-in information setting line (the write-in information setting line-A and the write-in information setting line-B).

The semiconductor memory cell of Example 21 can be fabricated by the method similar to the method for manufacturing the semiconductor memory cell of Example 18, except the following points. That is, in place of forming the second-A region $SC_{2A}$ and second-B region $SC_{2B}$, the second region $SC_2$ is formed in [Step-1800] by ion-implanting a p-type impurity to the n-type silicon semiconductor substrate 10; and the silicon semiconductor substrate 10 is then etched to leave a projected portion in which the semiconductor memory cell is to be fabricated, and whereby the first region $SC_1$ containing the n-type impurity and the second region $SC_2$ containing the p-type impurity are formed. Alternatively, it is also allowable to etch the silicon semiconductor substrate 10 for leaving a projected portion in which the semiconductor memory cell is to be fabricated, and then, to ion-implant a p-type impurity to the projected portion for forming the second region $SC_2$. Excluding the above, the method for manufacturing the semiconductor memory cell of Example 21 is substantially the same as that of Example 18. Detailed explanations thereof are therefore omitted.

EXAMPLE 22

Example 22 is directed to the semiconductor memory cell according to the twenty-second aspect of the present invention. As FIG. 160 shows its principle drawing and as FIG. 161 shows its schematic partial cross-sectional view, the semiconductor memory cell of Example 22 comprises a first semiconductor memory device $TR_A$ and a second semiconductor memory device $TR_B$ opposite to each other, and each of the semiconductor memory devices comprises a transistor for read-out, a transistor for write-in and a junction-field-effect transistor for current control. That is, the semiconductor memory cell of Example 22 is provided with a semi-conductive layer 10A having a first main surface $A_1$ and a second main surface opposed to the first main surface $A_1$, and comprises a first semiconductor memory device $TR_A$ and a second semiconductor memory device $TR_B$. The first semiconductor memory device $TR_A$ comprises a first transistor of a first conductivity type (e.g., n-type) for read-out $TR_{1A}$, a first transistor of a second conductivity type (e.g., p-type) for write-in $TR_{2A}$ and a first junction-field-effect transistor of the first conductivity type (e.g., n-type) for current control $TR_{3A}$. The second semiconductor memory device $TR_B$ comprises a second transistor of the first conductivity type (e.g., n-type) for read-out $TR_{1B}$, a second transistor of the second conductivity type (e.g., p-type) for write-in $TR_{2B}$ and a second junction-field-effect transistor of the first conductivity type (e.g., n-type) for current control $TR_{3B}$. The semiconductor memory cell is formed in the semi-conductive layer 10A surrounded with an insulating layer 11 formed on a supporting substrate 14 and has a so-called SOI structure. In the semiconductor memory cell shown in FIG. 161, the supporting substrate 14, the insulating layer 13, the first semiconductor memory device $TR_A$ and the second semiconductor memory device $TR_B$ are arranged in this order from the bottom.

The semiconductor memory cell of Example 22 has;

(1) a first semi-conductive region $SC_1$ of the first conductivity type (for example, n-type), formed through the semi-conductive layer 10A from the first main surface $A_1$ to second main surface $A_2$, (2-1) a second-A semi-conductive region $SC_{2A}$ of the second conductivity type (for example, $p^+$-type) opposite to the first conductivity type, or a second-A conductive region $SC_{2A}$ formed of a silicide, a metal or a metal compound, said second-A region $SC_{2A}$ being formed in a surface region, including the first main surface $A_1$, of the first region $SC_1$ and forming a rectifier junction together with the first region $SC_1$, (2-2) a second-B semi-conductive region $SC_{2B}$ of the second conductivity type (for example, $p^+$-type), or a second-B conductive region $SC_{2B}$ formed of a silicide, a metal or a metal compound, said second-B region $SC_{2B}$ being formed in a surface region, including the second main surface $A_2$, of the first region $SC_1$ and forming a rectifier junction together with the first region $SC_1$, (3-1) a third-A semi-conductive region $SC_{3A}$ of the second conductivity type (for example, $p^+$-type), formed in a surface region, including the first main surface $A_1$, of the first region $SC_1$ and spaced from the second-A region $SC_{2A}$, (3-2) a third-B semi-conductive region $SC_{3B}$ of the second conductivity type (for example, $p^+$-type), formed in a surface region, including the second main surface $A_2$, of the first region $SC_1$ and spaced from the second-B region $SC_{2B}$, (4-1) a fourth-A semi-conductive region $SC_{4A}$ of the first conductivity type (for example, $n^+$-type), or a fourth-A conductive region $SC_{4A}$ formed of a silicide, a metal or a metal compound, said fourth-A region $SC_{4A}$ being formed in a surface region, including the first main surface $A_1$, of the third-A region $SC_{3A}$ and forming a rectifier junction together with the third-A region $SC_{3A}$, (4-2) a fourth-B semi-conductive region $SC_{4B}$ of the first conductivity type (for example, $n^+$-type), or a fourth-B conductive region $SC_{4B}$ formed of a silicide, a metal or a metal compound, said fourth-B region $SC_{4B}$ being formed in a surface region, including the second main surface $A_2$, of the third-B region $SC_{3B}$ and forming a rectifier junction together with the third-B region $SC_{3B}$, (5-1) a gate portion $G_A$ ($G_{1A}$ and $G_{2A}$ wherein "$G_{1A}$" means a gate portion of the first transistor for read-out $TR_{1A}$ and "$G_{2A}$" means a gate portion of the first transistor for write-in $TR_{2A}$) of the first semiconductor memory device $TR_A$ formed on a first barrier layer formed on the first main surface $A_1$ so as to bridge the first region $SC_1$ and the fourth-A region $SC_{4A}$ and so as to bridge the second-A region $SC_{2A}$ and the third-A region $SC_{3A}$, and (5-2) a gate portion $G_B$ ($G_{1B}$ and $G_{2B}$ wherein "$G_{1B}$" means a gate portion of the second transistor for read-out $TR_{2A}$ and "$G_{2B}$" means a gate portion of the second transistor for write-in $TR_{2B}$) of the second semiconductor memory device formed on a second barrier layer formed on the second main surface $A_2$ so as to bridge the first region $SC_1$ and the fourth-B region $SC_{4B}$ and so as to bridge the second-B region $SC_{2B}$ and the third-B region $SC_{3B}$.

In the semiconductor memory cell of Example 22 shown in FIG. 161, the gate portion $G_A$ of the first semiconductor memory device $TR_A$ and the gate portion $G_B$ of the second semiconductor memory device $TR_B$ are almost aligned along a vertical direction.

Concerning the first transistor for read-out $TR_{1A}$ in the first semiconductor memory device $TR_A$;

(A-1) one source/drain region is constituted of the fourth-A region $SC_{4A}$, (A-2) the other source/drain region is constituted of a surface region, including the first main surface $A_1$, of the first region $SC_1$, and (A-3) a channel forming region $CH_{1A}$ is constituted of a surface region, including the first main surface $A_1$, of the third-A region $SC_{3A}$ which surface region is sandwiched by (or interposed between) the surface region, including the first main surface $A_1$, of the first region $SC_1$ and the fourth-A region $SC_{4A}$, Concerning the second transistor for read-out $TR_{1B}$ in the second semiconductor memory device $TR_B$;

(a-1) one source/drain region is constituted of the fourth-B region $SC_{4B}$, (a-2) the other source/drain region is constituted of a surface region, including the second main surface $A_2$, of the first region $SC_1$, and (a-3) a channel forming region $CH_{1B}$ is constituted of a surface region, including the second main surface $A_2$, of the third-B region $SC_{3B}$ which surface region is sandwiched-by (or interposed between) the surface region, including the second main surface $A_2$, of the first region $SC_1$ and the fourth-B region $SC_{4B}$.

Concerning the first transistor for write-in $TR_{2A}$ in the first semiconductor memory device $TR_A$;

(B-1) one source/drain region is constituted of the second-A region $SC_{2A}$, (B-2) the other source/drain region is constituted of a surface region, including the first main surface $A_1$, of the third-A region $SC_{3A}$, and (B-3) a channel forming region $CH_{2A}$ is constituted of a surface region, including the first main surface $A_1$, of the first region $SC_1$ which surface region is sandwiched by (or interposed between) the surface region, including the first main surface $A_1$, of the third-A region $SC_{3A}$ and the second-A region $SC_{2A}$.

Concerning the second transistor for write-in $TR_{2B}$ in the second semiconductor memory device $TR_B$;

(b-1) one source/drain region is constituted of the second-B region $SC_{2B}$, (b-2) the other source/drain region is constituted of a surface region, including the second main surface $A_2$, of the third-B region $SC_{3B}$, and (b-3) a channel forming region $CH_{2B}$ is constituted of a surface region, including the second main surface $A_2$, of the first region $SC_1$ which surface region is sandwiched by (or interposed between) the surface region, including the second main surface $A_2$, of the third-B region $SC_{3B}$ and the second-B region $SC_{2B}$.

Further, concerning the first junction-field-effect transistor $TR_{3A}$ in the first semiconductor memory device $TR_A$;

(C-1) gate regions are constituted of the second-A region $SC_{2A}$ and the third-A region $SC_{3A}$, and (C-2) a channel region $CH_{3A}$ is constituted of a portion of the first region $SC_1$ sandwiched by (or interposed between) the second-A region $SC_{2A}$ and the third-A region $SC_{3A}$.

Concerning the second junction-field-effect transistor $TR_{3B}$ in the second semiconductor memory device $TR_B$;

(c-1) gate regions are constituted of the second-B region $SC_{2B}$ and the third-B region $SC_{3B}$, and (c-2) a channel region $CH_{3B}$ is constituted of a portion of the first region $SC_1$ sandwiched by (or interposed between) the second-B region $SC_{2B}$ and the third-B region $SC_{3B}$, In the semiconductor memory cell of Example 22, the gate portion $G_A$ ($=G_{1A}+G_{2A}$) of the first semiconductor memory device $TR_A$ is connected to a first-A memory-cell-selecting line (for example, a word line); the gate portion $G_B$ ($=G_{1B}+G_{2B}$) of the second semiconductor memory device $TR_B$ is connected to a first-B memory-cell-selecting line (for example, the word line); the second-A region $SC_{2A}$ is connected to a write-in information setting line-A; the second-B region $SC_{2B}$ is connected to a write-in information setting line-B; the fourth-A region $SC_{4A}$ is connected to a second-A memory-cell-selecting line (for example, a bit line); the fourth-B region $SC_{4B}$ is connected to a second-B memory-cell-selecting line (for example, the bit line); and the first region $SC_1$ is connected to a predetermined potential line.

The first region $SC_1$ and the predetermined potential line can be connected to each other, e.g., by providing a structure in which part of the first region $SC_1$ is extended along a direction perpendicular to the sheet of FIG. 161 and a contact portion to the predetermined potential line is formed in that part of the first region $SC_1$. The first region $SC_1$ and the predetermined potential line in the semiconductor memory cells in following Examples can be connected to each other in the above manner.

The junction-field-effect transistors $TR_{3A}$ and $TR_{3B}$ in the semiconductor memory cell of Example 22 can be formed by (X) optimizing the distance (thickness of the channel regions $CH_{3A}$ and $CH_{3B}$) between the facing gate regions (the second-A region $SC_{2A}$ and the third-A region $SC_{3A}$, and the second-B region $SC_{2B}$ and the third-B region $SC_{3B}$) of the junction-field-effect transistors $TR_{3A}$ and $TR_{3B}$, and (Y) optimizing impurity concentrations of the facing gate regions (the second-A region $SC_{2A}$ and the third-A region $SC_{3A}$, and the second-B region $SC_{2B}$, and the third-B region $SC_{3B}$) and the channel regions $CH_{3A}$ and $CH_{3B}$ (specifically, the first $SC_1$) of the junction-field-effect transistors $TR_{3A}$ and $TR_{3B}$.

When a region $SC_{7A}$ containing a high concentration of an impurity having the first conductivity type is formed between the first region $SC_1$ and the third-A region $SC_{3A}$ or a region $SC_{7B}$ containing a high concentration of an impurity having the first conductivity type is formed between the first region $SC_1$ and the third-B region $SC_{3B}$, a potential or an electric charge stored in the channel forming region $CH_{1A}$ or $CH_{1B}$ in the first or second transistor for read-out $TR_{1A}$ or $TR_{1B}$ can be increased.

As FIG. 162 shows a principle drawing and as FIG. 163 shows a schematic partial cross-sectional view, a modification of the semiconductor memory cell in Example 22 may have a configuration in which the fourth-A region $SC_{4A}$ is connected to a predetermined potential line-A in place of being connected to the second-A memory-cell-selecting line (for example, the bit line), the fourth-B region $SC_{4B}$ is connected to a predetermined potential line-B in place of being connected to the second-B memory-cell-selecting line (for example, the bit line), and the first region $SC_1$ is connected to a second memory-cell-selecting line (for example, the bit line) in place of being connected to the predetermined potential line.

The method for manufacturing the semiconductor memory cell of Example 22 shown in FIG. 161B will be explained with reference to FIGS. 238A, 238B, 239A, 239B, 240, 241, 242, 243, 244, 245 and 246, all of which schematically show partial cross-sectional views of the supporting substrate, etc.

[Step-2200]

A n-type silicon semiconductor substrate 10 is etched to form projected portions in which the semiconductor memory cells are to being fabricated, and then, the complementary concave portions are buried with an insulating layer 11 so that only the top surfaces of projected portions of the silicon semiconductor substrate 10 are exposed. The insulating layer 11 corresponds to a device isolating region. Thus, the first semi-conductive region $SC_1$ of the first conductivity type (for example, n-type) is formed in the projected portion of the silicon semiconductor substrate 10. A silicon oxide film 12 having a thickness of approx. 10 nm (corresponding to the first barrier layer), is formed on the surface of projected portion of the semiconductor substrate 10, on the basis of a known method for forming a silicon oxide film. Then, an impurity-containing polysilicon is deposited on the entire surface and is patterned to form the gate portion $G_A$ for the first semiconductor memory device $TR_A$. The extended portion of the gate portion $G_A$ functions also as the first memory-cell-selecting line (for example, a word line). Such state is shown in FIG. 238A as a partial schematic cross-sectional view. The top surface of projected portion of the silicon semiconductor substrate 10 corresponds to the first main surface $A_1$. The projected portion of the silicon semiconductor substrate 10 may have a height of 0.3 to 0.4 $\mu$m.

[Step-2210]

Then, using a resist 30A as a mask, the second semi-conductive region $SC_{2A}$ of the second conductivity type (for example, $p^+$-type) is formed by ion implantation. Thus, the first semi-conductive region $SC_1$ of the first conductivity type (for example, n-type) is formed through the semi-conductive layer 10A (corresponding to the projected portion of the silicon semiconductor substrate 10) from the first main surface $A_1$ to the second main surface (described later), and, the second-A semi-conductive region $SC_{2A}$ of the second conductivity type (for example, $p^+$-type) is formed in the surface region, including the first main surface $A_1$, of the first region $SC_1$ (see FIG. 238B). The second-A region $SC_{2A}$ forms a rectifier junction together with the first region $SC_1$.

After the resist 30A is removed, using another resist mask 31A as a mask, oblique ion implantation is performed to form the third-A semi-conductive region $SC_{3A}$ of the second conductivity type (for example, $p^+$-type) opposite to the first conductivity type (for example, n-type), in the surface region, including the first main surf ace $A_1$, of the first region $SC_1$ (see FIG. 239A). The third-A region $SC_{3A}$ is spaced from the second-A region $SC_{2A}$ and forms a rectifier junction together with the first region $SC_1$. When the third-A region $SC_{3A}$ is formed, it is preferable to perform ion implantation twice with their ion incident angles being differed from each other. Setting the ion incident angle in the first ion implantation in particular at, for example, 60° allows precise control of the impurity concentration of the third-A region $SC_{3A}$ below the gate portion $G_A$.

Afterward, the fourth-A region $SC_{4A}$ of the first conductivity type (for example, $n^+$-type) is formed by ion implantation. The fourth-A semi-conductive region $SC_{4A}$ is thus formed in the surface region, including the first main surface $A_1$, of the third-A region $SC_{3A}$ so as to form a rectifier junction together with the third-A region $SC_{3A}$ (see FIG. 239B). In addition, formed is the channel forming region $CH_{1A}$ of the first transistor for read-out $TR_{1A}$, which is constituted of the surface region, including the first main surface $A_1$, of the third-A region $SC_{3A}$ sandwiched by (or interposed between) the surface region, including the first main surface $A_1$, of the first region $SC_1$ and the fourth-A region $SC_{4A}$. Also formed is the channel forming region $CH_{2A}$ of the first transistor for write-in $TR_{2A}$, which is constituted of the surface region, including the first main surface $A_1$, of the first region $SC_1$ sandwiched by (or interposed between) the surface region, including the first main surface $A_1$, of the third-A region $SC_{3A}$ and the second-A region $SC_{2A}$. Further, formed is the channel forming region $CH_{3A}$ of the first junction-field-effect transistor for current control $TR_{3A}$, which is constituted of a portion of the first region $SC_1$ sandwiched by (or interposed between) the second-A region $SC_{2A}$ and the third-A region $SC_{3A}$.

It is also allowable to deposit, for example, a layer of SiN on the entire surface by a CVD method, to etch the layer of SiN anisotropically for forming sidewalls on the both lateral planes of the gate portion $G_A$, again to perform ion implantation of a p-type impurity at a high dosage to the second-A region $SC_{2A}$, and to perform ion implantation of an n-type impurity at a high dosage to the fourth-A region $SC_{4A}$.

[Step-2220]

Next, after the resist 31A is removed, an insulating layer constituted of, for example, $SiO_2$ is deposited on the entire surface by a CVD method, and openings are formed in the insulating layer above the second-A region $SC_{2A}$ and fourth-A region $SC_{4A}$. A metal layer is deposited on the entire surface including the insides of the openings, and is patterned to form the write-in information setting line-A connected to the second-A region $SC_{2A}$ and the second-A memory-cell-selecting line (for example, a bit line) connected to the fourth-A region $SC_{4A}$ (see FIG. 240). It is not always necessary to form the second-A region $SC_{2A}$ and fourth-A region $SC_{4A}$ by the ion implantation. A barrier layer or glue layer constituted of titanium silicide or TiN, being usually formed in the general process for fabricating the write-in information setting line-A or the second-A memory-cell-selecting line, may be formed also on the surface of the first region $SC_1$ exposed at the bottom of the openings. Thus, the second-A region $SC_{2A}$ in common with part of the write-in information setting line-A (more specifically, part of the barrier layer or glue layer) and the fourth-A region $SC_{4A}$ in common with part of the second-A memory-cell-selecting line (more specifically, part of the barrier layer or glue layer) are formed in the surface region of the first region $SC_1$.

[Step-2230]

Next, as shown in FIG. 241, an insulating layer 13 constituted of, for example, $SiO_2$ is deposited on the entire surface by a CVD method, and the surface of which is then polished to be flattened. The surface of the insulating layer 13 and a supporting substrate 14 made of a silicon semiconductor substrate are bonded, and the silicon semiconductor substrate 10 is then polished from the back surface to expose the bottom 11A of the insulating layer 11 (see FIG. 242). Thus, a semi-conductive layer 10A corresponding to the projected portion of the silicon semiconductor substrate 10 is left within the insulating layer 11. The surface of the semi-conductive layer 10A corresponds to the second main surface $A_2$,

[Step-2240]

After that, a silicon oxide film 15 (corresponds to the second barrier layer) having a thickness of approx. 10 nm is formed on the second main surface $A_2$ of the semi-conductive layer 10A, on the basis of a known method for forming a silicon oxide film. An impurity-containing poly-silicon layer is then deposited on the entire surface, and is patterned to form the gate portion $G_B$ for the second semiconductor memory device $TR_B$. The extended portion of the gate portion $G_B$ functions also as the first-B memory-cell-selecting line (for example, a word line). Such state is shown in FIG. 243 as a partial schematic cross-sectional view.

[Step-2250]

Using a resist 30B as a mask, ion implantation is performed to form the second-B semi-conductive region $SC_{2B}$ of the second conductivity type (for example, $p^+$-type) in the surface region, including the second main surface $A_2$, of the first region $SC_1$ (see FIG. 244). The second-B region $SC_{2B}$ forms a rectifier junction together with the first region $SC_1$.

After the resist 30B is removed, using another resist mask 31B as a mask, oblique ion implantation is performed to form the third-B semi-conductive region $SC_{3B}$ of the second conductivity type (for example, $p^+$-type) opposite to the first conductivity type, in the surface region, including the second main surface $A_2$, of the first region $SC_1$ (see FIG. 245). The third-B semi-conductive region $SC_{3B}$ is spaced from the second-B region $SC_{2B}$. When the third-B region $SC_{3B}$ is formed, it is preferable to perform ion implantation twice with their ion incident angles being differed from each other. Setting the ion incident angle in the first ion implantation in particular at, for example, 60° allows precise control of the impurity concentration of the third-B region $SC_{3B}$ below the gate portion $G_B$.

Then, the fourth-B semi-conductive region $SC_{4B}$ of the first conductivity type (for example, $n^+$-type) is formed by ion implantation. Thus, the fourth-B semi-conductive region $SC_{4B}$ of the first conductivity type (for example, $n^+$-type) forming a rectifier junction together with the third-B region $SC_{3B}$ is formed in the surface region, including the second main surface $A_2$, of the third-B region $SC_{3B}$, (see FIG. 246). In addition, formed is the channel forming region $CH_{1B}$ of the second transistor for read-out $TR_{1B}$, which is constituted of the surface region, including the second main surface $A_2$, of the third-B region $SC_{3B}$ sandwiched by (or interposed between) the surface region, including the second main surface $A_2$, of the first region $SC_1$ and the fourth-B region $SC_{4B}$. Also formed is the channel forming region $CH_{2B}$ of the second transistor for write-in $TR_{2B}$, which is constituted of the surface region, including the second main surface $A_2$, of the first region $SC_1$ sandwiched by (or interposed between) the surface region, including the second main surface $A_2$, of the third-B region $SC_{3B}$ and the second-B region $SC_{2B}$. Further, formed is the channel forming region $CH_{3B}$ of the second junction-field-effect transistor for current control $TR_{3B}$, which is constituted of part of the first region $SC_1$ sandwiched by (or interposed between) the second-B region $SC_{2B}$ and the third-B region $SC_{3B}$.

It is also allowable to deposit, for example, a layer of SiN on the entire surface by a CVD method, to etch the layer of SiN anisotropically for forming sidewalls on the both lateral planes of the gate portion $G_B$, again to perform ion implantation of a p-type impurity at a high dosage to the second-B region $SC_{2B}$, and to perform ion implantation of an n-type impurity at a high dosage to the fourth-B region $SC_{4B}$.

[Step-2260]

Next, after the resist 31B is removed, an insulating layer constituted of, for example, $SiO_2$ is deposited on the entire surface by a CVD method, and openings are formed in the insulating layer above the second-B region $SC_{2B}$ and fourth-B region $SC_{4B}$. A metal layer is deposited on the entire surface including the insides of the openings, and is patterned to form the write-in information setting line-B connected to the second-B region $SC_{2B}$ and the second-B memory-cell-selecting line (for example, a bit line) connected to the fourth-B region $SC_{4B}$ (see FIG. 161). It is not always necessary to form the second-B region $SC_{2B}$ and fourth-B region $SC_{4B}$ by the ion implantation. A barrier layer or glue layer constituted of titanium silicide or TiN, being usually formed in the general process for fabricating the write-in information setting line-B or the second-B memory-cell-selecting line, may be formed also on the surface of the first region $SC_1$ exposed at the bottom of the openings. Thus, the second-B region $SC_{2B}$ in common with part of the write-in information setting line-B (more specifically, part of the barrier layer or glue layer) and the fourth-B region $SC_{4B}$ in common with part of the second-B memory-cell-selecting line (more specifically, part of the barrier layer or glue layer) are formed in the surface region of the first region $SC_1$.

The manufacturing processes for the semiconductor memory cell of Example 22 are not limited to those mentioned above. The order of forming individual regions by ion implantation is arbitrary in essence even with some dependence on the processes. In the above-described ion implantations, it is necessary to optimize the conditions for introducing the impurities through computer-assisted simulation or experiments so that the individual regions will have an optimum impurity concentrations.

EXAMPLE 23

Example 23 is directed to the semiconductor memory cell according to the twenty-third aspect of the present invention. As FIG. 164 shows its principle drawing and as FIG. 165 shows its schematic partial cross-sectional view, the semiconductor memory cell of Example 23 comprises a first semiconductor memory device $TR_A$ and a second semiconductor memory device $TR_B$ opposite to each other, and each of the semiconductor memory devices $TR_A$ and $TR_B$ comprises a transistor for read-out, a transistor for write-in and a junction-field-effect transistor for current control. The semiconductor memory cell of Example 23 differs from the semiconductor memory cell of Example 22 in that the regions constituting the junction-field-effect transistor are different and in that a fifth-A region $SC_{5A}$ and a fifth-B region $SC_{5B}$ are formed.

That is, the semiconductor memory cell of Example 23 is provided with a semi-conductive layer 10A having a first main surface $A_1$ and a second main surface $A_2$ opposed to the first main surface $A_1$, and comprises a first semiconductor memory device $TR_A$ and a second semiconductor memory device $TR_B$. The first semiconductor memory device $TR_A$ comprises a first transistor of a first conductivity type (e.g., n-type) for read-out $TR_{1A}$, a first transistor of a second conductivity type (e.g., p-type) for write-in $TR_{2A}$ and a first junction-field-effect transistor of the first conductivity type (e.g., n-type) for current control $TR_{4A}$. The second semiconductor memory device $TR_B$ comprises a second transistor of the first conductivity type (e.g., n-type) for read-out $TR_{1B}$, a second transistor of the second conductivity type (e.g., p-type) for write-in $TR_{2B}$ and a second junction-field-effect transistor of the first conductivity type (e.g., n-type) for current control $TR_{4B}$. The semiconductor memory cell is formed in the semi-conductive layer 10A surrounded with an insulating layer 11 formed on a supporting substrate 14 and has a so-called SOI structure. In the semiconductor memory cell shown in FIG. 165, the supporting substrate 14, the insulating layer 13, the first semiconductor memory device $TR_A$ and the second semiconductor memory device $TR_B$ are arranged in this order from the bottom.

The semiconductor memory cell of Example 23 has;

(1) a first semi-conductive region $SC_1$ of the first conductivity type (for example, n-type), formed through the semi-conductive layer 10A from the first main surface $A_1$ to second main surface $A_2$, (2-1) a second-A semi-conductive region $SC_{2A}$ of the second conductivity type (for example, $p^+$-type) opposite to the first conductivity type, or a second-A conductive region $SC_{2A}$ formed of a silicide, a metal or a metal compound, said second-A region $SC_{2A}$ being formed in a surface region, including the first main surface $A_1$, of the first region $SC_1$ and forming a rectifier junction together with the first region $SC_1$, (2-2) a second-B semi-conductive region $SC_{2B}$ of the second conductivity type (for example, $p^+$-type), or a second-B conductive region $SC_{2B}$ formed of a silicide, a metal or a metal compound, said second-B region $SC_{2B}$ being formed in a surface region, including the second main surface $A_2$, of the first region $SC_1$ and forming a rectifier junction together with the first region $SC_1$, (3-1) a third-A semi-conductive region $SC_{3A}$ of the second conductivity type (for example, $p^+$-type), formed in a surface region, including the first main surface $A_1$, of the first region $SC_1$ and spaced from the second-A region $SC_{2A}$, (3-2) a third-B semi-conductive region $SC_{3B}$ of the second conductivity type (for example, $p^+$-type), formed in a surface region, including the second main surface $A_2$, of the first region $SC_1$ and spaced from the second-B region $SC_{2B}$, (4-1) a fourth-A semi-conductive region $SC_{4A}$ of the first conductivity type (for example, $n^+$-type), formed in a surface region, including the first main surface $A_1$, of the third-A region $SC_{3A}$, (4-2) a fourth-B semi-conductive region $SC_{4B}$ of the first conductivity type (for example, $n^+$-type), formed in a surface region, including the second main surface $A_2$, of the third-B region $SC_{3B}$, (5-1) a fifth-A semi-conductive region $SC_{5A}$ of the second conductivity type (for example, $p^+$-type), or a fifth-A conductive region $SC_{5A}$ formed of a silicide, a metal or a metal compound, said fifth-A region $SC_{5A}$ being formed in a surface region, including the first main surface $A_1$, of the fourth-A region $SC_{4A}$ and forming a rectifier junction together with the fourth-A region $SC_{4A}$, (5-2) a fifth-B semi-conductive region $SC_{5B}$ of the second conductivity type (for example, $p^+$-type), or a fifth-B conductive region $SC_{5B}$ formed of a silicide, a metal or a metal compound, said fifth-B region $SC_{5B}$ being formed in a surface region, including the second main surface $A_2$, of the fourth-B region $SC_{4B}$ and forming a rectifier junction together with the fourth-B region $SC_{4B}$, (6-1) a gate portion $G_A$ ($G_{1A}$ and $G_{2A}$ wherein "$G_{1A}$" means a gate portion of the first transistor for read-out $TR_{1A}$ and "$G_{2A}$" means a gate portion of the first transistor for write-in $TR_{2A}$) of the first semiconductor memory device $TR_A$ formed on a first barrier layer formed on the first main surface $A_1$ so as to bridge the first region $SC_1$ and the fourth-A region $SC_{4A}$ and so as to bridge the second-A region $SC_{2A}$ and the third-A region $SC_{3A}$, and (6-2) a gate portion $G_B$ ($G_{1B}$ and $G_{2B}$ wherein "$G_{1B}$" means a gate portion of the second transistor for read-out $TR_{2A}$ and "$G_{2B}$" means a gate portion of the second transistor for write-in $TR_{2B}$) of the second semiconductor memory device formed on a second barrier layer formed on the second main surface $A_2$ so as to bridge the first region $SC_1$ and the fourth-B region $SC_{4B}$ and so as to bridge the second-B region $SC_{2B}$ and the third-B region $SC_{3B}$.

In the semiconductor memory cell of Example 23 shown in FIG. 165, the gate portion $G_A$ of the first semiconductor memory device $TR_A$ and the gate portion $G_B$ of the second semiconductor memory device $TR_B$ are almost aligned along a vertical direction.

Concerning the first transistor for read-out $TR_{1A}$ in the first semiconductor memory device $TR_A$;

(A-1) one source/drain region is constituted of the fourth-A region $SC_{4A}$, (A-2) the other source/drain region is constituted of a surface region, including the first main surface $A_1$, of the first region $SC_1$, and (A-3) a channel forming region $CH_{1A}$ is constituted of a surface region, including the first main surface $A_1$, of the third-A region $SC_{3A}$ which surface region is sandwiched by (or interposed between) the surface region, including the first main surface $A_1$, of the first region $SC_1$ and the fourth-A region $SC_{4A}$.

Concerning the second transistor for read-out $TR_{1B}$ in the second semiconductor memory device $TR_B$;

(a-1) one source/drain region is constituted of the fourth-B region $SC_{4B}$, (a-2) the other source/drain region is constituted of a surface region, including the second main surface $A_2$, of the first region $SC_1$, and (a-3) a channel forming region $CH_{1B}$ is constituted of a surface region, including the second main surface $A_2$, of the third-B region $SC_{3B}$ which surface region is sandwiched by (or interposed between) the surface region, including the second main surface $A_2$, of the first region $SC_1$ and the fourth-B region $SC_{4B}$.

Concerning the first transistor for write-in $TR_{2A}$ in the first semiconductor memory device $TR_A$;

(B-1) one source/drain region is constituted of the second-A region $SC_{2A}$, (B-2) the other source/drain region is constituted of a surface region, including the first main surface $A_1$, of the third-A region $SC_{3A}$, and (B-3) a channel forming region $CH_{2A}$ is constituted of a surface region, including the first main surface $A_1$, of the first region $SC_1$ which surface region is sandwiched by (or interposed between) the surface region, including the first main surface $A_1$, of the third-A region $SC_{3A}$ and the second-A region $SC_{2A}$.

Concerning the second transistor for write-in $TR_{2B}$ in the second semiconductor memory device $TR_B$;

(b-1) one source/drain region is constituted of the second-B region $SC_{2B}$, (b-2) the other source/drain region is constituted of a surface region, including the second main surface $A_2$, of the third-B region $SC_{3B}$, and (b-3) a channel forming region $CH_{2B}$ is constituted of a surface region, including the second main surface $A_2$, of the first region $SC_1$ which surface region is sandwiched by (or interposed between) the surface region, including the second main surface $A_2$, of the third-B region $SC_{3B}$ and the second-B region $SC_{2B}$, Further, concerning the first junction-field-effect transistor $TR_{4A}$ in the first semiconductor memory device $TR_A$;

(C-1) gate regions are constituted of the fifth-A region $SC_{5A}$ and a portion of third-A region $SC_{3A}$ facing the fifth-A region $SC_{5A}$, (C-2) a channel region $CH_{4A}$ is constituted of a portion of the fourth-A region $SC_{4A}$ sandwiched by (or interposed between) the fifth-A region $SC_{5A}$ and said portion of the third-A region $SC_{3A}$, and (C-3) source/drain regions are constituted of portions of the fourth-A region $SC_{4A}$, one of the portions of the fourth-A region $SC_{4A}$ extending from one end of the channel region $CH_{4A}$ of the first junction-field-effect transistor $TR_{4A}$ and the other of the portions of the fourth-A region $SC_{4A}$ extending from the other end of the channel region $CH_{4A}$ of the first junction-field-effect transistor $TR_{4A}$.

Concerning the second junction-field-effect transistor $TR_{4B}$ in the second semiconductor memory device $TR_B$;

(c-1) gate regions are constituted of the fifth-B region $SC_{5B}$ and a portion of third-B region $SC_{3B}$ facing the fifth-B region $SC_{5B}$, (c-2) a channel region $CH_{4B}$ is constituted of a portion of the fourth-B region $SC_{4B}$ sandwiched by (or interposed between) the fifth-B region $SC_{5B}$ and said portion of the third-B region $SC_{3B}$, and (c-3) source/drain regions are constituted of portions of the fourth-B region $SC_{4B}$, one of the portions of the fourth-B region $SC_{4B}$ extending from one end of the channel region $CH_{4B}$ of the second junction-field-effect transistor $TR_{4B}$ and the other of the portions of the fourth-B region $SC_{4B}$ extending from the other end of the channel region $CH_{4B}$ of the second junction-field-effect transistor $TR_{4B}$.

In the semiconductor memory cell of Example 23, the gate portion $G_A$ ($G_{1A}$ and $G_{2A}$) of the first semiconductor memory device $TR_A$ is connected to a first-A memory-cell-selecting line (for example, a word line); the gate portion $G_B$ ($G_{1B}$ and $G_{2B}$) of the second semiconductor memory device $TR_B$ is connected to a first-B memory-cell-selecting line (for example, the word line); the second-A region $SC_{2A}$ is connected to a write-in information setting line-A; the second-B region $SC_{2B}$ is connected to a write-in information setting line-B; the fourth-A region $SC_{4A}$ is connected to a second-A memory-cell-selecting line (for example, a bit line); the fourth-B region $SC_{4B}$ is connected to a second-B memory-cell-selecting line (for example, the bit line); the first region $SC_1$ is connected to a predetermined potential line; the fifth-A region $SC_{5A}$ is connected to the write-in information setting line-A; and the fifth-B region $SC_{5B}$ is connected to the write-in information setting line-B.

The first region $SC_1$ and the predetermined potential line can be connected to each other, e.g., by providing a structure in which part of the first region $SC_1$ is extended along a direction perpendicular to the sheet of FIG. 165 and a contact portion to the predetermined potential line is formed in that part of the first region $SC_1$.

The junction-field-effect transistors $TR_{4A}$ and $TR_{4B}$ in the semiconductor memory cell of Example 23 can be formed by (X) optimizing the distance (thickness of the channel regions $CH_{4A}$ and $CH_{4B}$) between the facing gate regions (the fifth-A region $SC_{5A}$ and the portion of third-A region $SC_{3A}$ facing the fifth-A region $SC_{5A}$, and, the fifth-B region $SC_{5B}$ and the portion of the third-B region $SC_{3B}$ facing the fifth-B region $SC_{5B}$) of the junction-field-effect transistors $TR_{4A}$ and $TR_{4B}$, and (Y) optimizing impurity concentrations of the facing gate regions (the fifth-A region $SC_{5A}$ and the portion of third-A region $SC_{3A}$ facing the fifth-A region $SC_{5A}$, and, the fifth-B region $SC_{5B}$ and the portion of the third-B region $SC_{3B}$ facing the fifth-B region $SC_{5B}$) and the channel regions $CH_{4A}$ and $CH_{4B}$ (specifically, the fourth-A region $SC_{4A}$ and the fourth-B region $SC_{4B}$) of the junction-field-effect transistors $TR_{4A}$ and $TR_{4B}$.

When a region $SC_{7A}$ containing a high concentration of an impurity having the first conductivity type is formed between the first region $SC_1$ and the third-A region $SC_{3A}$ or a region $SC_{7B}$ containing a high concentration of an impurity having the first conductivity type is formed between the first region $SC_1$ and the third-B region $SC_{3B}$, a potential or an electric charge stored in the channel forming region $CH_{1A}$ or $CH_{1B}$ in the first or second transistor for read-out $TR_{1A}$ or $TR_{1B}$ can be increased.

As FIG. 166 shows a principle drawing and as FIG. 167 shows a schematic partial cross-sectional view, a modification of the semiconductor memory cell in Example 23 may have a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; and the first region $SC_1$ is connected to a second memory-cell-selecting line (for example, the bit line) in place of being connected to the predetermined potential line.

As FIG. 168 shows a principle drawing and as FIG. 169 shows a schematic partial cross-sectional view, another modification of the semiconductor memory cell of Example 23 may have the following configuration. That is, the first semiconductor memory device $TR_A$ further has a third junction-field-effect transistor of the first conductivity type (e.g., n-type) for current control $TR_{5A}$, and the second semiconductor memory device $TR_B$ further has a fourth junction-field-effect transistor of the first conductivity type (e.g., n-type) for current control $TR_{5B}$, wherein;

(I-1) gate regions of the third junction-field-effect transistor $TR_{5A}$ are constituted of the second-A region $SC_{2A}$ and the third-A region $SC_{3A}$, (I-2) a channel region $CH_{5A}$ of the third junction-field-effect transistor $TR_{5A}$ is constituted of a portion of the first region $SC_1$ sandwiched by (or interposed between) the second-A region $SC_{2A}$ and the third-A region $SC_{3A}$, (i-1) gate regions of the fourth junction-field-effect transistor $TR_{5B}$ are constituted of the second-B region $SC_{2B}$ and the third-B region $SC_{3B}$, and (i-2) a channel region $CH_{5B}$ of the fourth junction-field-effect transistor $TR_{5B}$is constituted of a portion of the first region $SC_1$ sandwiched by (or interposed between) the second-B region $SC_{2B}$ and the third-B region $SC_{3B}$.

The third and fourth junction-field-effect transistors $TR_{5A}$ and $TR_{5B}$ can be formed by (X) optimizing the distance (thickness of the channel regions $CH_{5A}$ and $CH_{5B}$) between the facing gate regions (the second-A region $SC_{2A}$ and the third-A region $SC_{3A}$, and, the second-B region $SC_{2B}$ and the third-B region $SC_{3B}$) of the third and fourth junction-field-effect transistors $TR_{5A}$ and $TR_{5B}$, and (Y) optimizing impurity concentrations of the facing gate regions (the second-A region $SC_{2A}$ and the third-A region $SC_{3A}$, and, the second-B region $SC_{2B}$ and the third-B region $SC_{3B}$) and the channel regions $CH_{5A}$ and $CH_{5B}$ (specifically, the first region $SC_1$) of the third and fourth junction-field-effect transistors $TR_{5A}$ and $TR_{5B}$.

As FIG. 170 shows a principle drawing and as FIG. 171 shows a schematic partial cross-sectional view, the above modification of the semiconductor memory cell in Example 23 may have a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; and the first region $SC_1$ is connected to a second memory-cell-selecting line (for example, the bit line) in place of being connected to the predetermined potential line.

FIGS. 172 and 173 show a principle drawing and a schematic partial cross-sectional view of another modification of the semiconductor memory cell in Example 23, according to the twenty-fourth aspect of the present invention. FIG. 174A shows the schematic layout of a gate portion and each regions of the above modification, and FIG. 174B shows the schematic partial cross-sectional view of the above modification cut along arrows B—B in FIG. 174A. The above modification has a configuration in which the fifth-A region $SC_{5A}$ is connected to the third-A region $SC_{3A}$ in place of being connected to the write-in information setting line-A, and the fifth-B region $SC_{5B}$ is connected to the third-B region $SC_{3B}$ in place of being connected to the write-in information setting line-B. The fifth-A region $SC_{5A}$ and the third-A region $SC_{3A}$ can be connected to each other, e.g., by providing a structure in which part of the third-A region $SC_{3A}$ is extended up to the vicinity of the first main surface $A_1$ so that the fifth-A region $SC_{5A}$ and the extending portion of the third-A region $SC_{3A}$ come in contact with each other outside the fourth-A region $SC_{4A}$. The fifth-B region $SC_{5B}$ and the third-B region $SC_{3B}$ can be connected to each other, e.g., by providing a structure in which part of the third-B region $SC_{3B}$ is extended up to the vicinity of the second main surface $A_2$ so that the fifth-B region $SC_{5B}$ and the extending portion of the third-B region $SC_{3B}$ come in contact with each other outside the fourth-B region $SC_{4B}$, The wiring configuration can be simplified by structuring the semiconductor memory cell as explained above.

As FIG. 175 shows a principle drawing and as FIG. 176 shows a schematic partial cross-sectional view, a modification of the semiconductor memory cell according to the twenty-fourth aspect of the present invention may have a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; and the first region $SC_1$ is connected to a second memory-cell-selecting line (for example, the bit line) in place of being connected to the predetermined potential line.

As FIG. 177 shows a principle drawing and as FIG. 178 shows a schematic partial cross-sectional view, another modification of the semiconductor memory cell according to the twenty-fourth aspect of the present invention may have a configuration in which the first semiconductor memory device $TR_A$ further has a third junction-field-effect transistor of the first conductivity type (e.g., n-type) for current control $TR_{5A}$, and the second semiconductor memory device $TR_B$ further has a fourth junction-field-effect transistor of the first conductivity type (e.g., n-type) for current control $TR_{5B}$, wherein;

(I-1) gate regions of the third junction-field-effect transistor $TR_{5A}$ are constituted of the second-A region $SC_{2A}$ and the third-A region $SC_{3A}$, (I-2) a channel region $CH_{5A}$ of the third junction-field-effect transistor $TR_{5A}$ is constituted of a portion of the first region $SC_1$ sandwiched by (or interposed between) the second-A region $SC_{2A}$ and the third-A region $SC_{3A}$, (i-1) gate regions of the fourth junction-field-effect transistor $TR_{5B}$ are constituted of the second-B region $SC_{2B}$ and the third-B region $SC_{3B}$, and (i-2) a channel region $CH_{5B}$ of the fourth junction-field-effect transistor $TR_{5B}$ is constituted of a portion of the first region $SC_1$ sandwiched by (or interposed between) the second-B region $SC_{2B}$ and the third-B region $SC_{3B}$.

The third and fourth junction-field-effect transistors $TR_{5A}$ and $TR_{5B}$ can be formed by (X) optimizing the distance (thickness of the channel regions $CH_{5A}$ and $CH_{5B}$) between the facing gate regions (the second-A region $SC_{2A}$ and the third-A region $SC_{3A}$, and, the second-B region $SC_{2B}$ and the third-B region $SC_{3B}$) of the third and fourth junction-field-effect transistors $TR_{5A}$ and $TR_{5B}$, and (Y) optimizing impurity concentrations of the facing gate regions (the second-A region $SC_{2A}$ and the third-A region $SC_{3A}$, and, the second-B region $SC_{2B}$ and the third-B region $SC_{3B}$) and the channel regions $CH_{5A}$ and $CH_{5B}$ (specifically, the first region $SC_1$) of the third and fourth junction-field-effect transistors $TR_{5A}$ and $TR_{5B}$.

As FIG. 179 shows a principle drawing and as FIG. 180 shows a schematic partial cross-sectional view, the above modification of the semiconductor memory cell according to the twenty-fourth aspect of the present invention may have a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; and the first region $SC_1$ is connected to a second memory-cell-selecting line (for example, the bit line) in place of being connected to the predetermined potential line.

The method of manufacturing the semiconductor memory cell in Example 23 can substantially be the same as the method of manufacturing the semiconductor memory cell of Example 22, except the formation of the fifth-A region $SC_{5A}$ and the fifth-B region $SC_{5B}$. Detailed explanations thereof are therefore omitted.

EXAMPLE 24

Example 24 is directed to the semiconductor memory cell according to the twenty-fifth aspect of the present invention. As FIG. 181 shows its principle drawing and as FIG. 182 shows its schematic partial cross-sectional view, the semiconductor memory cell of Example 24 comprises a first semiconductor memory device $TR_A$ and a second semiconductor memory device $TR_B$ opposite to each other, and each of the semiconductor memory devices $TR_A$ and $TR_B$ comprises four transistors, a transistor for read-out, a transistor for write-in, a junction-field-effect transistor for current control and an additional transistor for write-in. The semiconductor memory cell of Example 24 differs from the semiconductor memory cell of Example 23 in that the semiconductor memory cell of Example 24 has the additional transistor for write-in. FIG. 183 shows a schematic layout of a gate portion and each regions.

The semiconductor memory cell of Example 24 is provided with a semi-conductive layer 10A having a first main surface $A_1$ and a second main surface opposed to the first main surface $A_1$, and comprises a first semiconductor memory device $TR_A$ and a second semiconductor memory device $TR_B$. The first semiconductor memory device $TR_A$ comprises a first transistor of a first conductivity type (e.g., n-type) for read-out $TR_{1A}$, a first transistor of a second conductivity (e.g., p-type) type for write-in $TR_{2A}$, a first junction-field-effect transistor of the first conductivity type (e.g., n-type) for current control $TR_{4A}$ and a third transistor of the second conductivity type (e.g., p-type) for write-in $TR_{6A}$. The second semiconductor memory device $TR_B$ comprises a second transistor of the first conductivity type (e.g., n-type) for read-out $TR_{1B}$, a second transistor of the second conductivity type (e.g., p-type) for write-in $TR_{2B}$, a second junction-field-effect transistor of the first conductivity type (e.g., n-type) for current control $TR_{4B}$ and a fourth transistor of the second conductivity type (e.g., p-type) for write-in $TR_{6B}$. The semiconductor memory cell is formed in the semi-conductive layer 10A surrounded with an insulating layer 11 formed on a supporting substrate 14 and has a so-called SOI structure. In the semiconductor memory cell shown in FIG. 182, the supporting substrate 14, the insulating layer 13, the first semiconductor memory device $TR_A$ and the second semiconductor memory device $TR_B$ are arranged in this order from the bottom.

The semiconductor memory cell of Example 24 has;

(1) a first semi-conductive region $SC_1$ of the first conductivity type (for example, n-type), formed through the semi-conductive layer 10A from the first main surface $A_1$ to second main surface $A_2$, (2-1) a second-A semi-conductive region $SC_{2A}$ of the second conductivity type (for example, $p^+$-type) opposite to the first conductivity type, or a second-A conductive region $SC_{2A}$ formed of a silicide, a metal or a metal compound, said second-A region $SC_{2A}$ being formed in a surface region, including the first main surface $A_1$, of the first region $SC_1$ and forming a rectifier junction together with the first region $SC_1$, (2-2) a second-B semi-conductive region $SC_{2B}$ of the second conductivity type (for example, $p^+$-type), or a second-B conductive region $SC_{2B}$ formed of a silicide, a metal or a metal compound, said second-B region $SC_{2B}$ being formed in a surface region, including the second main surface $A_2$, of the first region $SC_1$ and forming a rectifier junction together with the first region $SC_1$, (3-1) a third-A semi-conductive region $SC_{3A}$ of the second conductivity type (for example, $p^+$-type), formed in a surface region, including the first main surface $A_1$, of the first region $SC_1$ and spaced from the second-A region $SC_{2A}$, (3-2) a third-B semi-conductive region $SC_{3B}$ of the second conductivity type (for example, $p^+$-type), formed in a surface region, including the second main surface $A_2$, of the first region $SC_1$ and spaced from the second-B region $SC_{2B}$, (4-1) a fourth-A semi-conductive region $SC_{4S}$ of the first conductivity type (for example, $n^+$-type), formed in a surface region, including the first main surface $A_1$, of the third-A region $SC_{3A}$, (4-2) a fourth-B semi-conductive region $SC_{4B}$ of the first conductivity type (for example, $n^+$-type), formed in a surface region, including the second main surface $A_2$, of the third-B region $SC_{3B}$, (5-1) a fifth-A semi-conductive region $SC_{5A}$ of the second conductivity type (for example, $p^+$-type), or a fifth-A conductive region $SC_{5A}$ formed of a silicide, a metal or a metal compound, said fifth-A region $SC_{5A}$ being formed in a surface region, including the first main surface $A_1$, of the fourth-A region $SC_{4A}$ and forming a rectifier junction together with the fourth-A region $SC_{4A}$, (5-2) a fifth-B semi-conductive region $SC_{5B}$ of the second conductivity type (for example, $p^+$-type), or a fifth-B conductive region $SC_{5B}$ formed of a silicide, a metal or a metal compound, said fifth-B region $SC_{5B}$ being formed in a surface region, including the second main surface $A_2$, of the fourth-B region $SC_{4B}$ and forming a rectifier junction together with the fourth-B region $SC_{4B}$, (6-1) a gate portion $G_A$ ($G_{1A}$, $G_{2A}$ and $G_{6A}$ wherein "$G_{1A}$" means a gate portion of the first transistor for read-out $TR_{1A}$, "$G_{2A}$" means a gate portion of the first transistor for write-in $TR_{2A}$ and "$G_{6A}$" means a gate portion of the third transistor for write-in $TR_{6A}$) of the first semiconductor memory device $TR_A$ formed on a first barrier layer formed on the first main surface $A_1$ so as to bridge the first region $SC_1$ and the fourth-A region $SC_{4A}$, so as to bridge the second-A region $SC_{2A}$ and the third-A region $SC_{3A}$ and so as to bridge the third-A region $SC_{3A}$ and the fifth-A region $SC_{5A}$, and (6-2) a gate portion $G_1$ ($G_{1B}$, $G_{2A}$ and $G_{6B}$ wherein "$G_{1B}$" means a gate portion of the second transistor for read-out $TR_{1B}$, "$G_{2B}$" means a gate portion of the second transistor for write-in $TR_{2B}$ and "$G_{6B}$" means a gate portion of the fourth transistor for write-in $TR_{6B}$) of the second semiconductor memory device $TR_B$ formed on a second barrier layer formed on the second main surface $A_2$ so as to bridge the first region $SC_1$ and the fourth-B region $SC_{4B}$, so as to bridge the second-B region $SC_{2B}$ and the third-B region $SC_{3B}$ and so as to bridge the third-B region $SC_{3B}$ and the fifth-B region $SC_{5B}$.

In the semiconductor memory cell of Example 24 shown in FIG. 182, the gate portion $G_A$ of the first semiconductor memory device $TR_A$ and the gate portion $G_B$ of the second semiconductor memory device $TR_B$ are almost aligned along a vertical direction.

Concerning the first transistor for read-out $TR_{1A}$ in the first semiconductor memory device $TR_A$;

(A-1) one source/drain region is constituted of the fourth-A region $SC_{4A}$, (A-2) the other source/drain region is constituted of a surface region, including the first main surface $A_1$, of the first region $SC_1$, and (A-3) a channel forming region $CH_{1A}$ is constituted of a surface region, including the first main surface $A_1$, of the third-A region $SC_{3A}$ which surface region is sandwiched by (or interposed between) the surface region, including the first main surface $A_1$, of the first region $SC_1$ and the fourth-A region $SC_{4A}$.

Concerning the second transistor for read-out $TR_{1B}$ in the second semiconductor memory device $TR_B$;

(a-1) one source/drain region is constituted of the fourth-B region $SC_{4B}$, (a-2) the other source/drain region is constituted of a surface region, including the second main surface $A_2$, of the first region $SC_1$, and (a-3) a channel forming region $CH_{1B}$ is constituted of a surface region, including the second main surface $A_2$, of the third-B region $SC_{3B}$ which surface region is sandwiched by (or interposed between) the surface region, including the second main surface $A_2$, of the first region $SC_1$ and the fourth-B region $SC_{4B}$.

Concerning the first transistor for write-in $TR_{2A}$ in the first semiconductor memory device $TR_A$;

(B-1) one source/drain region is constituted of the second-A region $SC_{2A}$, (B-2) the other source/drain region is constituted of a surface region, including the first main surface $A_1$, of the third-A region $SC_{3A}$, and (B-3) a channel forming region $CH_{2A}$ is constituted of a surface region, including the first main surface $A_1$, of the first region $SC_1$ which surface region is sandwiched by (or interposed between) the surface region, including the first main surface $A_1$, of the third-A region $SC_{3A}$ and the second-A region $SC_{2A}$.

Concerning the second transistor for write-in $TR_{2B}$ in the second semiconductor memory device $TR_B$;

(b-1) one source/drain region is constituted of the second-B region $SC_{2B}$, (b-2) the other source/drain region is constituted of a surface region, including the second main surface $A_2$, of the third-B region $SC_{3B}$, and (b-3) a channel forming region $CH_{2B}$ is constituted of a surface region, including the second main surface $A_2$, of the first region $SC_1$ which surface region is sandwiched by (or interposed between) the surface region, including the second main surface $A_2$, of the third-B region $SC_{3B}$ and the second-B region $SC_{2B}$.

Further, concerning the first junction-field-effect transistor $TR_{4A}$ in the first semiconductor memory device $TR_A$;

(C-1) gate regions are constituted of the fifth-A region $SC_{5A}$ and a portion of third-A region $SC_{3A}$ facing the fifth-A region $SC_{5A}$, (C-2) a channel region $CH_{4A}$ is constituted of a portion of the fourth-A region $SC_{4A}$ sandwiched by (or interposed between) the fifth-A region $SC_{5A}$ and said portion of the third-A region $SC_{3A}$, and (C-3) source/drain regions are constituted of portions of the fourth-A region $SC_{4A}$, one of the portions of the fourth-A region $SC_{4A}$ extending from one end of the channel region $CH_{4A}$ of the first junction-field-effect transistor $TR_{4A}$ and the other of the portions of the fourth-A region $SC_{4A}$ extending from the other end of the channel region $CH_{4A}$ of the first junction-field-effect transistor $TR_{4A}$.

Concerning the second junction-field-effect transistor $TR_{4B}$ in the second semiconductor memory device $TR_B$;

(c-1) gate regions are constituted of the fifth-B region $SC_{5B}$ and a portion of third-B region $SC_{3B}$ facing the fifth-B region $SC_{5B}$, (c-2) a channel region $CH_{4B}$ is constituted of a portion of the fourth-B region $SC_{4B}$ sandwiched by (or interposed between) the fifth-B region $SC_{5B}$ and said portion of the third-B region $SC_{3B}$, and (c-3) source/drain regions are constituted of portions of the fourth-B region $SC_{4B}$, one of the portions of the fourth-B region $SC_{4B}$ extending from one end of the channel region $CH_{4B}$ of the second junction-field-effect transistor $TR_{4B}$ and the other of the portions of the fourth-B region $SC_{4B}$ extending from the other end of the channel region $CH_{4B}$ of the second junction-field-effect transistor $TR_{4B}$.

Concerning the third transistor for write-in $TR_{6A}$ in the first semiconductor memory device $TR_A$;

(D-1) one source/drain region is constituted of the surface region of the third-A region $SC_{3A}$ functioning as the channel forming region $CH_{1A}$ of the first transistor for read-out $TR_{1A}$, (D-2) the other source/drain region is constituted of the fifth-A region $SC_{5A}$, and (D-3) a channel forming region $CH_{6A}$ is constituted of the surface region of the fourth-A region $SC_{4A}$ functioning as one source/drain region of the first transistor for read-out $TR_{1A}$.

Concerning the fourth transistor for write-in $TR_{6B}$ in the second semiconductor memory device $TR_B$;

(d-1) one source/drain region is constituted of the surface region of the third-B region $SC_{3B}$ functioning as to the channel forming region $CH_{1B}$ of the second transistor for read-out $TR_{1B}$, (d-2) the other source/drain region is constituted of the fifth-B region $SC_{5B}$, and (d-3) a channel forming region $CH_{6B}$ is constituted of the surface region of the fourth-B region $SC_{4B}$ functioning as one source/drain region of the second transistor for read-out $TR_{1B}$.

In the semiconductor memory cell of Example 24, the gate portion $G_A$ ($G_{1A}$, $G_{2A}$ and $G_{6A}$) of the first semiconductor memory device $TR_A$ is connected to a first-A memory-cell-selecting line (for example, a word line); the gate portion $G_B$ ($G_{1B}$, $G_{2B}$ and $G_{6B}$) of the second semiconductor memory device is connected to a first-B memory-cell-selecting line (for example, the word line); the second-A region $SC_{2A}$ is connected to a write-in information setting line-A; the second-B region $SC_{2B}$ is connected to a write-in information setting line-B; the fourth-A region $SC_{4A}$ is connected to a second-A memory-cell-selecting line (for example, a bit line); the fourth-B region $SC_{4B}$ is connected to a second-B memory-cell-selecting line (for example, the bit line); and the first region $SC_1$ is connected to a predetermined potential line.

The first region $SC_1$ and the predetermined potential line can be connected to each other, e.g., by providing a structure in which part of the first region $SC_1$ is extended along a direction perpendicular to the sheet of FIG. 182 and a contact portion to the predetermined potential line is formed in that part of the first region $SC_1$.

The junction-field-effect transistors $TR_{4A}$ and $TR_{4B}$ in the semiconductor memory cell of Example 24 can be formed by (X) optimizing the distance (thickness of the channel regions $CH_{4A}$ and $CH_{4B}$) between the facing gate regions (the fifth-A region $SC_{5A}$ and the portion of third-A region $SC_{3A}$ facing the fifth-A region $SC_{5A}$, and, the fifth-B region $SC_{5B}$ and the portion of the third-B region $SC_{3B}$ facing the fifth-B region $SC_{5B}$) of the junction-field-effect transistors $TR_{4A}$ and $TR_{4B}$, and (Y) optimizing impurity concentrations of the facing gate regions (the fifth-A region $SC_{5A}$ and the portion of third-A region $SC_{3A}$ facing the fifth-A region $SC_{5A}$, and, the fifth-B region $SC_{5B}$ and the portion of the third-B region $SC_{3B}$ facing the fifth-B region $SC_{5B}$) and the channel regions $CH_{4A}$ and $CH_{4B}$ (specifically, the fourth-A regions $SC_{4A}$ and the fourth-B region $SC_{4B}$) of the junction-field-effect transistors $TR_{4A}$ and $TR_{4B}$.

When a region $SC_{7A}$ containing a high concentration of an impurity having the first conductivity type is formed between the first region $SC_1$ and the third-A region $SC_{3A}$ or a region $SC_{7B}$ containing a high concentration of an impurity having the first conductivity type is formed between the first region $SC_1$ and the third-B region $SC_{3B}$ a potential or an electric charge stored in the channel forming region $CH_{1A}$ or $CH_{1B}$ in the first or second transistor for read-out $TR_{1A}$ or $TR_{1B}$ can be increased.

As FIG. 184 shows a principle drawing and as FIG. 185 shows a schematic partial cross-sectional view, a modification of the semiconductor memory cell in Example 24 may have a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; and the first region $SC_1$ is connected to a second memory-cell-selecting line (for example, the bit line) in place of being connected to the predetermined potential line.

As FIG. 186 shows a principle drawing and as FIG. 187 shows a schematic partial cross-sectional view, another modification of the semiconductor memory cell in Example 24 may have a configuration in which the first semiconductor memory device $TR_A$ further has a third junction-field-effect transistor of the first conductivity type (e.g., n-type) for current control $TR_{5A}$, and the second semiconductor memory device $TR_B$ further has a fourth junction-field-effect transistor of the first conductivity type for current control $TR_{5B}$, wherein;

(I-1) gate regions of the third junction-field-effect transistor $TR_{5A}$ are constituted of the second-A region $SC_{2A}$ and the third-A region $SC_{3A}$, (I-2) a channel region $CH_{5A}$ of the third junction-field-effect transistor $TR_{5A}$ is constituted of a portion of the first region $SC_1$ sandwiched by (or interposed between) the second-A region $SC_{2A}$ and the third-A region $SC_{3A}$, (i-1) gate regions of the fourth junction-field-effect transistor $TR_{5B}$ are constituted of the second-B region $SC_{2B}$ and the third-B region $SC_{3B}$, and (i-2) a channel region $CH_{5B}$ of the fourth junction-field-effect transistor $TR_{5B}$ is constituted of a portion of the first region $SC_1$ sandwiched by (or interposed between) the second-B region $SC_{2B}$ and the third-B region $SC_{3B}$.

The third and fourth junction-field-effect transistors $TR_{5A}$ and $TR_{5B}$ can be formed by (X) optimizing the distance (thickness of the channel regions $CH_{5A}$ and $CH_{5B}$) between the facing gate regions (the second-A region $SC_{2A}$ and the third-A region $SC_{3A}$, and, the second-B region $SC_{2B}$ and the third-B region $SC_{3B}$) of the third and fourth junction-field-effect transistors $TR_{5A}$ and $TR_{5B}$, and (Y) optimizing impurity concentrations of the facing gate regions (the second-A region $SC_{2A}$ and the third-A region $SC_{3A}$, and, the second-B region $SC_{2B}$ and the third-B region $SC_{3B}$) and the channel regions $CH_{5A}$ and $CH_{5B}$ (specifically, the first region $SC_1$) of the third and fourth junction-field-effect transistors $TR_{5A}$ and $TR_{5B}$.

As FIG. 188 shows a principle drawing and as FIG. 189 shows a schematic partial cross-sectional view, the above modification of the semiconductor memory cell in Example 24 may have a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; and the first region $SC_1$ is connected to a second memory-cell-selecting line (for example, the bit line) in place of being connected to the predetermined potential line.

The method of manufacturing the semiconductor memory cell in Example 24 can substantially be the same as the method of manufacturing the semiconductor memory cell of Example 22, except the formation of the fifth-A region $SC_{5A}$ and the fifth-B region $SC_{5B}$, and except the formation of the gate portions which extend above the fifth-A region $SC_{5A}$ and fifth-B region $SC_{5B}$, respectively. Detailed explanations thereof are therefore omitted.

EXAMPLE 25

Example 25 is directed to the semiconductor memory cell according to the twenty-sixth aspect of the present invention. As FIG. 190 shows its principle drawing and as FIG. 191 shows its schematic partial cross-sectional view, the semiconductor memory cell of Example 25 comprises a first semiconductor memory device $TR_A$ and a second semiconductor memory device $TR_B$ opposite to each other, and each of the semiconductor memory devices $TR_A$ and $TR_B$ comprises three transistors, a transistor for read-out, a transistor for write-in and a junction-field-effect transistor for current control, and a diode. The semiconductor memory cell of Example 25 has a configuration similar to that of Example 23.

That is, the semiconductor memory cell of Example 25 is provided with a semi-conductive layer 10A having a first main surface $A_1$ and a second main surface opposed to the first main surface $A_1$, and comprises a first semiconductor memory device $TR_A$ and a second semiconductor memory device $TR_B$. The first semiconductor memory device $TR_A$ comprises a first transistor of a first conductivity type (e.g., n-type) for read-out $TR_{1A}$, a first transistor of a second conductivity type (e.g., p-type) for write-in $TR_{2A}$, a first junction-field-effect transistor of the first conductivity type (e.g., n-type) for current control $TR_{4A}$ and a first diode $D_A$ having a pn junction. The second semiconductor memory device $TR_B$ comprises a second transistor of the first conductivity type (e.g., n-type) for read-out $TR_{1B}$, a second transistor of the second conductivity type (e.g., p-type) for write-in $TR_{2B}$, a second junction-field-effect transistor of the first conductivity type (e.g., n-type) for current control $TR_{4B}$ and a second diode $D_B$ having a pn junction. The semiconductor memory cell is formed in the semi-conductive layer 10A surrounded with an insulating layer 11 formed on a supporting substrate 14 and has a so-called SOI structure. In the semiconductor memory cell of Example 25 shown in FIG. 191, the supporting substrate 14, the insulating layer 13, the first semiconductor memory device $TR_A$ and the second semiconductor memory device $TR_B$ are arranged in this order from the bottom.

The semiconductor memory cell of Example 25 has;

(1) a first semi-conductive region $SC_1$ of the first conductivity type (for example, n-type), formed through the semi-conductive layer 10A from the first main surface $A_1$ to second main surface $A_2$, (2-1) a second-A semi-conductive region $SC_{2A}$ of the second conductivity type (for example, $p^+$-type) opposite to the first conductivity type, or a second-A conductive region $SC_{2A}$ formed of a silicide, a metal or a metal compound, said second-A region $SC_{2A}$ being formed in a surface region, including the first main surface $A_1$, of the first region $SC_1$ and forming a rectifier junction together with the first region $SC_1$, (2-2) a second-B semi-conductive region $SC_{2B}$ of the second conductivity type (for example, $p^+$-type), or a second-B conductive region $SC_{2B}$ formed of a silicide, a metal or a metal compound, said second-B region $SC_{2B}$ being formed in a surface region, including the second main surface $A_2$, of the first region $SC_1$ and forming a rectifier junction together with the first region $SC_1$, (3-1) a third-A semi-conductive region $SC_{3A}$ of the second conductivity type, formed in a surface region, including the first main surface $A_1$, of the first region $SC_1$ and spaced from the second-A region $SC_{2A}$, (3-2) a third-B semi-conductive region $SC_{3B}$ of the second conductivity type, formed in a surface region, including the second main surface $A_2$, of the first region $SC_1$ and spaced from the second-B region $SC_{2B}$, (4-1) a fourth-A semi-conductive region $SC_{4A}$ of the first conductivity type (for example, $n^+$-type), formed in a surface region, including the first main surface $A_1$, of the third-A region $SC_{3A}$, (4-2) a fourth-B semi-conductive region $SC_{4B}$ of the first conductivity type (for example, $n^+$-type), formed in a surface region, including the second main surface $A_2$, of the third-B region $SC_{3B}$, (5-1) a fifth-A semi-conductive region $SC_{5A}$ of the second conductivity type (for example, $p^+$-type), or a fifth-A conductive region $SC_{5A}$ formed of a silicide, a metal or a metal compound, said fifth-A region $SC_{5A}$ being formed in a surface region, including the first main surface $A_1$, of the fourth-A region $SC_{4A}$ and forming a rectifier junction together with the fourth-A region $SC_{4A}$, (5-2) a fifth-B semi-conductive region $SC_{5B}$ of the second conductivity type (for example, $p^+$-type), or a fifth-B conductive region $SC_{5B}$ formed of a silicide, a metal or a metal compound, said fifth-B region $SC_{5B}$ being formed in a surface region, including the second main surface $A_2$, of the fourth-B region $SC_{4B}$ and forming a rectifier junction together with the fourth-B region $SC_{4B}$, (6-1) a gate portion $G_A$ ($G_{1A}$ and $G_{2A}$ wherein "$G_{1A}$" means a gate portion of the first transistor for read-out $TR_{1A}$ and "$G_{2A}$" means a gate portion of the first transistor for write-in $TR_{2A}$) of the first semiconductor memory device $TR_A$ formed on a first barrier layer formed on the first main surface $A_1$ so as to bridge the first region $SC_1$ and the fourth-A region $SC_{4A}$ and so as to bridge the second-A region $SC_{2A}$ and the third-A region $SC_{3A}$, and (6-2) a gate portion $G_B$ ($G_{1B}$ and $G_{2B}$ wherein "$G_{1B}$" means a gate portion of the second transistor for read-out $TR_{2A}$ and "$G_{2B}$" means a gate portion of the second transistor for write-in $TR_{2B}$) of the second semiconductor memory device $TR_B$ formed on a second barrier layer formed on the second main surface $A_2$ so as to bridge the first region $SC_1$ and the fourth-B region $SC_{4B}$ and so as to bridge the second-B region $SC_{2B}$ and the third-B region $SC_{3B}$.

In the semiconductor memory cell of Example 25 shown in FIG. 191, the gate portion $G_A$ of the first semiconductor memory device $TR_A$ and the gate portion $G_B$ of the second semiconductor memory device $TR_B$ are almost aligned along a vertical direction.

Concerning the first transistor for read-out $TR_{1A}$ in the first semiconductor memory device $TR_A$;

(A-1) one source/drain region is constituted of the fourth-A region $SC_{4A}$, (A-2) the other source/drain region is constituted of a surface region, including the first main surface $A_1$, of the first region $SC_1$, and (A-3) a channel forming region $CH_{1A}$ is constituted of a surface region, including the first main surface $A_1$, of the third-A region $SC_{3A}$ which surface region is sandwiched by (or interposed between) the surface region, including the first main surface $A_1$, of the first region $SC_1$ and the fourth-A region $SC_{4A}$.

Concerning the second transistor for read-out $TR_{1B}$ in the second semiconductor memory device $TR_B$;

(a-1) one source/drain region is constituted of the fourth-B region $SC_{4B}$, (a-2) the other source/drain region is constituted of a surface region, including the second main surface $A_2$, of the first region $SC_1$, and (a-3) a channel forming region $CH_{1B}$ is constituted of a surface region, including the second main surface $A_2$, of the third-B region $SC_{3B}$ which surface region is sandwiched by (or interposed between) the surface region, including the second main surface $A_2$, of the first region $SC_1$ and the fourth-B region $SC_{4B}$.

Concerning the first transistor for write-in $TR_{2A}$ in the first semiconductor memory device $TR_A$;

(B-1) one source/drain region is constituted of the second-A region $SC_{2A}$, (B-2) the other source/drain region is constituted of a surface region, including the first main surface $A_1$, of the third-A region $SC_{3A}$, and (B-3) a channel forming region $CH_{2A}$ is constituted of a surface region, including the first main surface $A_1$, of the first region $SC_1$ which surface region is sandwiched by (or interposed between) the surface region, including the first main surface $A_1$, of the third-A region $SC_{3A}$ and the second-A region $SC_{2A}$.

Concerning the second transistor for write-in $TR_{2B}$ in the second semiconductor memory device $TR_B$;

(b-1) one source/drain region is constituted of the second-B region $SC_{2B}$, (b-2) the other source/drain region is constituted of a surface region, including the second main surface $A_2$, of the third-B region $SC_{3B}$, and (b-3) a channel forming region $CH_{2B}$ is constituted of a surface region, including the second main surface $A_2$, of the first region $SC_1$ which surface region is sandwiched by (or interposed between) the surface region, including the second main surface $A_2$, of the third-B region $SC_{3B}$ and the second-B region $SC_{2B}$.

Further, concerning the first junction-field-effect transistor $TR_{4A}$ in the first semiconductor memory device $TR_A$;

(C-1) gate regions are constituted of the fifth-A region $SC_{5A}$ and a portion of third-A region $SC_{3A}$ facing the fifth-A region $SC_{5A}$, (C-2) a channel region $CH_{4A}$ is constituted of a portion of the fourth-A region $SC_{4A}$ sandwiched by (or interposed between) the fifth-A region $SC_{5A}$ and said portion of the third-A region $SC_{3A}$, and (C-3) source/drain regions are constituted of portions of the fourth-A region $SC_{4A}$, one of the portions of the fourth-A region $SC_{4A}$ extending from one end of the channel region $CH_{4A}$ of the first junction-field-effect transistor $TR_{4A}$ and the other of the portions of the fourth-A region $SC_{4A}$ extending from the other end of the channel region $CH_{4A}$ of the first junction-field-effect transistor $TR_{4A}$.

Concerning the second junction-field-effect transistor $TR_{4B}$ in the second semiconductor memory device $TR_B$;

(c-1) gate regions are constituted of the fifth-B region $SC_{5B}$ and a portion of third-B region $SC_{3B}$ facing the fifth-B region $SC_{5B}$, (c-2) a channel region $CH_{4B}$ is constituted of a portion of the fourth-B region $SC_{4B}$ sandwiched by (or interposed between) the fifth-B region $SC_{5B}$ and said portion of the third-B region $SC_{3B}$, and (c-3) source/drain regions are constituted of portions of the fourth-B region $SC_{4B}$, one of the portions of the fourth-B region $SC_{4B}$ extending from one end of the channel region $CH_{4B}$ of the second junction-field-effect transistor $TR_{4B}$ and the other of the portions of the fourth-B region $SC_{4B}$ extending from the other end of the channel region $CH_{4B}$ of the second junction-field-effect transistor $TR_{4B}$.

Further, in the semiconductor memory cell of Example 25;

(D) the first diode $D_A$ is constituted of the second-A region $SC_{2A}$ and the first region $SC_1$, (d) the second diode $D_B$ is constituted of the second-B region $SC_{2B}$ and the first region $SC_1$, (E) the gate portion of the first semiconductor memory device $TR_A$ is connected to a first-A memory-cell-selecting line (for example, a word line), (e) the gate portion of the second semiconductor memory device $TR_B$ is connected to a first-B memory-cell-selecting line (for example, the word line), (F) the second-A region $SC_{2A}$ is connected to a write-in information setting line-A, (f) the second-B region $SC_{2B}$ is connected to a write-in information setting line-B, (G) the fourth-A region $SC_{4A}$ is connected to a second-A memory-cell-selecting line (for example, a bit line), (g) the fourth-B region $SC_{4B}$ is connected to a second-B memory-cell-selecting line (for example, the bit line), (H) the fifth-A region $SC_{5A}$ is connected to the write-in information setting line-A, and (h) the fifth-B region $SC_{5B}$ is connected to the write-in information setting line-B.

The junction-field-effect transistors $TR_{4A}$ and $TR_{4B}$ in the semiconductor memory cell of Example 25 can be formed by (X) optimizing the distance (thickness of the channel regions $CH_{4A}$ and $CH_{4B}$) between the facing gate regions (the fifth-A region $SC_{5A}$ and the portion of third-A region $SC_{3A}$ facing the fifth-A region $SC_{5A}$, and, the fifth-B region $SC_{5B}$ and the portion of the third-B region $SC_{3B}$ facing the fifth-B region $SC_{5B}$) of the junction-field-effect transistors $TR_{4A}$ and $TR_{4B}$, and (Y) optimizing impurity concentrations of the facing gate regions (the fifth-A region $SC_{5A}$ and the portion of third-A region $SC_{3A}$ facing the fifth-A region $SC_{5A}$, and, the fifth-B region $SC_{5B}$ and the portion of the third-B region $SC_{3B}$ facing the fifth-B region $SC_{5B}$) and the channel regions $CH_{4A}$ and $CH_{4B}$ (specifically, the fourth-A regions $SC_{4A}$ and the fourth-B region $SC_{4B}$) of the junction-field-effect transistors $TR_{4A}$ and $TR_{4B}$.

Since the diode $D_A$ and the diode $D_B$ are provided in the semiconductor memory cell of Example 25, the semiconductor memory cell of Example 25 differs from the semiconductor memory cell of Example 23 in that the first region $SC_1$ is not required to be connected to a predetermined potential line, whereby the wiring configuration can be simplified.

The semiconductor memory cell of Example 25 may have a configuration in which the write-in information setting line-A is in common with the write-in information setting line-B, whereby the wiring configuration can be simplified. It is also possible to make the write-in information setting line-A and line-B being in common by the steps of, for example, forming the second-A region $SC_{2A}$ together with its extended portion; forming the conductive region containing a $p^{++}$-type impurity so as to be extended from the extended portion of the second-A region $SC_{2A}$ to the second main surface $A_2$, before or after the formation of the second-B region $SC_{2B}$; and forming the second-B region $SC_{2B}$ together with its extended portion so that this extended portion reaches the above conductive region containing a $p^{++}$-type impurity. It is further possible to connect the write-in information setting line-A and write-in information setting line-B, outside the semiconductor memory cell. It is still further possible to connect the write-in information setting line-A and line-B in a predetermined number of, or orderly located, adjacent semiconductor memory cells. The same configuration can be applied to the case for fabricating the second memory-cell-selecting lines in common, in the semiconductor memory cell according to any one of the twenty-second to thirtieth aspects of the present invention.

When a region $SC_{7A}$ containing a high concentration of an impurity having the first conductivity type is formed between the first region $SC_1$ and the third-A region $SC_{3A}$ or a region $SC_{7B}$ containing a high concentration of an impurity having the first conductivity type is formed between the first region $SC_1$ and the third-B region $SC_{3B}$, a potential or an electric charge stored in the channel forming region $CH_{1A}$ or $CH_{1B}$ in the first or second transistor for read-out $TR_{1A}$ or $TR_{1B}$ can be increased.

As FIG. 192 shows a principle drawing and as FIG. 193 shows a schematic partial cross-sectional view, a modification of the semiconductor memory cell in Example 25 may have a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; the second-A region $SC_{2A}$ is connected to the second-A memory-cell-selecting line (for example, the bit line) in place of being connected to the write-in information setting line-A; and the second-B region $SC_{2B}$ is connected to the second-B memory-cell-selecting line (for example, the bit line) in place of being connected to the write-in information setting line-B. In this configuration, the second-A memory-cell-selecting line also serves as the write-in information setting line-A, and the second-B memory-cell-selecting line also serves as the write-in information setting line-B. The second-A memory-cell-selecting line may be in common with the second-B memory-cell-selecting line.

As FIG. 194 shows a principle drawing and as FIG. 195 shows a schematic partial cross-sectional view, another modification of the semiconductor memory cell in Example 25 may have a configuration in which the semiconductor memory cell further has a sixth-A conductive region $SC_{6A}$ formed in a surface region, including the first main surface $A_1$, of the first region $SC_1$ and a sixth-B conductive region $SC_{6B}$ formed in a surface region, including the second main surface $A_2$, of the first region $SC_1$, wherein the first diode comprises a Schottky diode $D_{SA}$ constituted of the first region $SC_1$ and the sixth-A region $SC_{6A}$ in place of being constituted of the first region $SC_1$ and the second-A region $SC_{2A}$, and the second diode comprises a Schottky diode $D_{SB}$ constituted of the first region $SC_1$ and the sixth-B region $SC_{6B}$ in place of being constituted of the first region $SC_1$ and the second-B region $SC_{2B}$. The sixth-A region $SC_{6A}$ or the sixth-B region $SC_{6B}$ may be constituted of a silicide layer or a metal layer such as Mo or Al layer. The another modification may have a configuration in which the write-in information setting line-A is in common with the write-in information setting line-B.

As FIG. 196 shows a principle drawing and as FIG. 197 shows a schematic partial cross-sectional view, the above modification of the semiconductor memory cell in Example 25 may have a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; the second-A region $SC_{2A}$ is connected to the second-A memory-cell-selecting line (for example, the bit line) in place of being connected to the write-in information setting line-A; and the second-B region $SC_{2B}$ is connected to the second-B memory-cell-selecting line (for example, the bit line) in place of being connected to the write-in information setting line-B. In this configuration, the second-A memory-cell-selecting line also serves as the write-in information setting line-A, and the second-B memory-cell-selecting line also serves as the write-in information setting line-B. The second-A memory-cell-selecting line may be in common with the second-B memory-cell-selecting line.

As FIG. 198 shows a principle drawing and as FIG. 199 shows a schematic partial cross-sectional view, another modification of the semiconductor memory cell in Example 25 may have a configuration in which the write-in information setting line-A is in common with the write-in information setting line-B; the semiconductor memory cell has a sixth conductive region $SC_6$ formed through the semiconductive layer 10A from the first main surface $A_1$ to second main surface $A_2$ and being in contact with the first region $SC_1$; the first diode comprises a Schottky diode $D_S$ constituted of the first region $SC_1$ and the sixth region in place of being constituted of the first region $SC_1$ and the second-A region $SC_{2A}$; and the second diode comprises a Schottky diode $D_S$ constituted of the first region $SC_1$ and the sixth region in place of being constituted of the first region $SC_1$ and the second-B region $SC_{2B}$. The sixth region $SC_6$ may be constituted of a silicide layer or a metal layer such as Mo or Al layer.

As FIG. 200 shows a principle drawing and as FIG. 201 shows a schematic partial cross-sectional view, the above another modification of the semiconductor memory cell in Example 25 may have a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; and the second-A and second-B regions $SC_{2A}$ and $SC_{2B}$ are connected to a second memory-cell-selecting line (for example, the bit line) in place of being connected to the write-in information setting line-A and the write-in information setting line-B, respectively. In the above another modification of the semiconductor memory cell of Example 25, the second memory-cell-selecting line also serves as the write-in information setting line.

As FIG. 202 shows a principle drawing and as FIG. 202 shows a schematic partial cross-sectional view, another modification of the semiconductor memory cell in Example 25 (according to the twenty-seventh aspect of the present invention) has a configuration in which the fifth-A region $SC_{5A}$ is connected to the third-A region $SC_{3A}$ in place of being connected to the write-in information setting line-A, and the fifth-B region $SC_{5B}$ is connected to the third-B region $SC_{3B}$ in place of being connected to the write-in information setting line-B. The fifth-A region $SC_{5A}$ and the third-A region $SC_{3A}$ can be connected to each other, e.g., by providing a structure in which part of the third-A region $SC_{3A}$ is extended up to the vicinity of the first main surface $A_1$ so that the fifth-A region $SC_{5A}$ and the extending portion of the third-A region $SC_{3A}$ come in contact with each other outside the fourth-A region $SC_{4A}$. The fifth-B region $SC_{5B}$ and the third-B region $SC_{3B}$ can be connected to each other, e.g., by providing a structure in which part of the third-B region $SC_{3B}$ is extended up to the vicinity of the second main surface $A_2$ so that the fifth-B region $SC_{5B}$ and the extending portion of the third-B region $SC_{3B}$ come in contact with each other outside the fourth-B region $SC_{4B}$. The wiring configuration can be simplified by structuring the semiconductor memory cell as explained above. The write-in information setting line-A may be in common with the write-in information setting line-B.

As FIG. 204 shows a principle drawing and as FIG. 205 shows a schematic partial cross-sectional view, a modification of the semiconductor memory cell according to the twenty-seventh aspect of the present invention has a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; the second-A region $SC_{2A}$ is connected to the second-A memory-cell-selecting line (for example, the bit line) in place of being connected to the write-in information setting line-A; and the second-B region $SC_{2B}$ is connected to the second-B memory-cell-selecting line (for example, the bit line) in place of being connected to the write-in information setting line-B. In this configuration, the second-A memory-cell-selecting line serves as the write-in information setting line-A, and the second-B memory-cell-selecting line serves as the write-in information setting line-B. The second-A memory-cell-selecting line may be in common with the second-B memory-cell-selecting line.

As FIG. 206 shows a principle drawing and as FIG. 207 shows a schematic partial cross-sectional view, another modification of the semiconductor memory cell according to the twenty-seventh aspect of the present invention has a configuration in which the semiconductor memory cell further has a sixth-A conductive region $SC_{6A}$ formed in a surface region, including the first main surface $A_1$, of the first region $SC_1$ and a sixth-B conductive region $SC_{6B}$ formed in a surface region, including the second main surface $A_2$, of the first region $SC_1$; the first diode comprises a Schottky diode $D_{SA}$ constituted of the first region $SC_1$ and the sixth-A region $SC_{6A}$ in place of being constituted of the first region $SC_1$ and the second-A region $SC_{2A}$; and the second diode comprises a Schottky diode $D_{SB}$ constituted of the first region $SC_1$ and the sixth-B region $SC_{6B}$ in place of being constituted of the first region $SC_1$ and the second-B region $SC_{2B}$. The write-in information setting line-A may be in common with the write-in information setting line-B.

As FIG. 208 shows a principle drawing and as FIG. 209 shows a schematic partial cross-sectional view, the above modification of the semiconductor memory cell according to the twenty-seventh aspect of the present invention has a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; the second-A region $SC_{2A}$ is connected to the second-A memory-cell-selecting line (for example, the bit line) in place of being connected to the write-in information setting line-A; and the second-B region $SC_{2B}$ is connected to the second-B memory-cell-selecting line (for example, the bit line) in place of being connected to the write-in information setting line-B. In this configuration, the second-A memory-cell-selecting line serves as the write-in information setting line-A, and the second-B memory-cell-selecting line serves as the write-in information setting line-B. The second-A memory-cell-selecting line may be in common with the second-B memory-cell-selecting line.

As FIG. 210 shows a principle drawing and as FIG. 211 shows a schematic partial cross-sectional view, another modification of the semiconductor memory cell according to the twenty-seventh aspect of the present invention has a configuration in which the write-in information setting line-A is in common with the write-in information setting line-B; the semiconductor memory cell has a sixth conductive region $SC_6$, formed through the semi-conductive layer 10A from the first main surface $A_1$ to second main surface $A_2$ and being in contact with the first region $SC_1$; the first diode comprises a Schottky diode $D_S$ constituted of the first region $SC_1$ and the sixth region $SC_6$ in place of being constituted of the first region $SC_1$ and the second-A region $SC_{2A}$; and the second diode comprises a Schottky diode $D_S$ constituted of the first region $SC_1$ and the sixth region $SC_6$ in place of being constituted of the first region $SC_1$ and the second-B region $SC_{2B}$.

As FIG. 212 shows a principle drawing and as FIG. 213 shows a schematic partial cross-sectional view, the above another modification of the semiconductor memory cell according to the twenty-seventh aspect of the present invention may have a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; and the second-A and second-B regions $SC_{2A}$ and $SC_{2B}$ are connected to a second memory-cell-selecting line (for example, the bit line) in place of being connected to the write-in information setting line-A and the write-in information setting line-B. The second memory-cell-selecting line also serves as the write-in information setting line.

The method of manufacturing the semiconductor memory cell in Example 25 can substantially be the same as the method of manufacturing the semiconductor memory cell of Example 22, except the formation of the fifth-A region $SC_{5A}$ and the fifth-B region $SC_{5B}$, and except the position where the gate portions are to be formed. Detailed explanations thereof are therefore omitted.

For a case that the sixth region $SC_6$ is provided to form a diode, the sixth region $SC_6$ can be formed in, for example, [Step-2200] of Example 22 by the steps of etching the n-type silicon semiconductor substrate 10 for leaving the projected portion as a semi-conductive layer 10A in which the semiconductor memory cell is to be fabricated; and depositing a silicide layer or a metal layer consisting of Mo, Al and so forth on part of the projected portion of the silicon semiconductor substrate 10 by oblique sputtering.

The method of forming the sixth-A region $SC_{6A}$ and the sixth-B region $SC_{6B}$ in the surface region of the first region $SC_1$ with titanium silicide, that is, the method of forming the titanium silicide layer in the surface region of the first region $SC_1$ where the sixth-A region $SC_{6A}$ and the sixth-B region $SC_{6B}$ is to be formed will be explained, hereinafter. That is, for example, an insulation interlayer is deposited on an entire surface, and a portion of the insulation interlayer where the titanium silicide layer is to be formed is removed. Then, a titanium layer is deposited, by a sputtering method, on the insulation interlayer including an exposed surface of the semi-conductive layer 10A. Then, a first annealing treatment is carried out, and the titanium layer and the semi-conductive layer 10A are allowed to react to form a titanium silicide layer on the surface of the semi-conductive layer 10A. Then, unreacted titanium layer on the insulation interlayer is removed, e.g., with $NH_4OH:H_2O_2:H_2O$, and a second annealing treatment is carried out, whereby a stable titanium silicide layer can be obtained. The material for forming the diode $D_S$ is not limited to titanium silicide, and it may be selected from materials such as cobalt silicide and tungsten silicide.

EXAMPLE 26

Example 26 is directed to the semiconductor memory cell according to the twenty-eighth aspect of the present invention. As FIG. 214 shows its principle drawing and as FIG. 215 shows its schematic partial cross-sectional view, the semiconductor memory cell of Example 26 comprises a first semiconductor memory device $TR_A$ and a second semiconductor memory device $TR_B$ opposite to each other, and each of the semiconductor memory devices $TR_A$ and $TR_B$ comprises four transistors, a transistor for read-out, a transistor for write-in, a junction-field-effect transistor for current control and an additional transistor for write-in, and a diode. The semiconductor memory cell of Example 26 has a configuration similar to that of Example 25, except the formation of the additional transistor for write-in.

That is, the semiconductor memory cell of Example 26 is provided with a semi-conductive layer 10A having a first main surface $A_1$ and a second main surface opposed to the first main surface $A_1$, and comprises a first semiconductor memory device $TR_A$ and a second semiconductor memory device $TR_B$. The first semiconductor memory device $TR_A$ comprises a first transistor of a first conductivity type (e.g., n-type) for read-out $TR_{1A}$, a first transistor of a second conductivity type (e.g., p-type) for write-in $TR_{2A}$, a first junction-field-effect transistor of the first conductivity type (e.g., n-type) for current control $TR_{4A}$, a third transistor of the second conductivity type (e.g., p-type) for write-in $TR_{6A}$ and a first diode $D_A$ having a pn junction. The second semiconductor memory device $TR_B$ comprises a second transistor of the first conductivity type (e.g., n-type) for read-out $TR_{1B}$, a second transistor of the second conductivity type (e.g., p-type) for write-in $TR_{2B}$, a second junction-field-effect transistor of the first conductivity type (e.g., n-type) for current control $TR_{4B}$, a fourth transistor of the second conductivity type (e.g., p-type) for write-in $TR_{6B}$ and a second diode $D_B$ having a pn junction.

The semiconductor memory cell of Example 26 has;

(1) a first semi-conductive region $SC_1$ of the first conductivity type (for example, n-type), formed through the semi-conductive layer 10A from the first main surface $A_1$ to second main surface $A_2$, (2-1) a second-A semi-conductive region $SC_{2A}$ of the second conductivity type (for example, $p^+$-type) opposite to the first conductivity type, or a second-A conductive region $SC_{2A}$ formed of a silicide, a metal or a metal compound, said second-A region $SC_{2A}$ being formed in a surface region, including the first main surface $A_1$, of the first region $SC_1$ and forming a rectifier junction together with the first region $SC_1$, (2-2) a second-B semi-conductive region $SC_{2B}$ of the second conductivity type (for example, $p^+$-type), or a second-B conductive region $SC_{2B}$ formed of a silicide, a metal or a metal compound, said second-B region $SC_{2B}$ being formed in a surface region, including the second main surface $A_2$, of the first region $SC_1$ and forming a rectifier junction together with the first region $SC_1$, (3-1) a third-A semi-conductive region $SC_{3A}$ of the second conductivity type (for example, $p^+$-type), formed in a surface region, including the first main surface $A_1$, of the first region $SC_1$ and spaced from the second-A region $SC_{2A}$, (3-2) a third-B semi-conductive region $SC_{3B}$ of the second conductivity type (for example, $p^+$-type), formed in a surface region, including the second main surface $A_2$, of the first region $SC_1$ and spaced from the second-B region $SC_{2B}$, (4-1) a fourth-A semi-conductive region $SC_{4A}$ of the first conductivity type (for example, $n^+$-type), formed in a surface region, including the first main surface $A_1$, of the third-A region $SC_{3A}$, (4-2) a fourth-B semi-conductive region $SC_{4B}$ of the first conductivity type (for example, $n^+$-type), formed in a surface region, including the second main surface $A_2$, of the third-B region $SC_{3B}$, (5-1) a fifth-A semi-conductive region $SC_{5A}$ of the second conductivity type (for example, $p^+$-type), or a fifth-A conductive region $SC_{1A}$ formed of a silicide, a metal or a metal compound, said fifth-A region $SC_{5A}$ being formed in a surface region, including the first main surface $A_1$, of the fourth-A region $SC_{4A}$ and forming a rectifier junction together with the fourth-A region $SC_{4A}$, (5-2) a fifth-B semi-conductive region $SC_{5B}$ of the second conductivity type (for example, $p^+$-type), or a fifth-B conductive region $SC_{5B}$ formed of a silicide, a metal or a metal compound, said fifth-B region $SC_{5B}$ being formed in a surface region, including the second main surface $A_2$, of the fourth-B region $SC_{4B}$ and forming a rectifier junction together with the fourth-B region $SC_{4B}$, (6-1) a gate portion $G_A$ ($G_{1A}$, $G_{2A}$ and $G_{6A}$ wherein "$G_{1A}$" means a gate portion of the first transistor for read-out $TR_{1A}$, "$G_{2A}$" means a gate portion of the first transistor for write-in $TR_{2A}$ and "$G_{6A}$" means a gate portion of the third transistor for write-in $TR_{6A}$) of the first semiconductor memory device $TR_A$ formed on a first barrier layer formed on the first main surface $A_1$ so as to bridge the first region $SC_1$ and the fourth-A region $SC_{4A}$, so as to bridge the second-A region $SC_{2A}$ and the third-A region $SC_{3A}$ and so as to bridge the third-A region $SC_{3A}$ and the fifth-A region $SC_{5A}$, and (6-2) a gate portion $G_B$ ($G_{1B}$, $G_{2B}$ and $G_{6B}$ wherein "$G_{1B}$" means a gate portion of the second transistor for read-out $TR_{1B}$, "$G_{2B}$" means a gate portion of the second transistor for write-in $TR_{2B}$ and "$G_{6B}$" means a gate portion of the fourth transistor for write-in $TR_{6B}$) of the second semiconductor memory device $TR_{1B}$ formed on a second barrier layer formed on the second main surface $A_2$ so as to bridge the first region $SC_1$ and the fourth-B region $SC_{4B}$, so as to bridge the second-B region $SC_{2B}$ and the third-B region $SC_{3B}$ and so as to bridge the third-B region $SC_{3B}$ and the fifth-B region $SC_{5B}$.

In the semiconductor memory cell of Example 26 shown in FIG. 215, the gate portion $G_A$ of the first semiconductor memory device $TR_A$ and the gate portion $G_B$ of the second semiconductor memory device $TR_B$ are almost aligned along a vertical direction.

Concerning the first transistor for read-out $TR_{1A}$ in the first semiconductor memory device $TR_A$;

(A-1) one source/drain region is constituted of the fourth-A region $SC_{4A}$, (A-2) the other source/drain region is constituted of a surface region, including the first main surface $A_1$, of the first region $SC_1$, and (A-3) a channel forming region $CH_{1A}$ is constituted of a surface region, including the first main surface $A_1$, of the third-A region $SC_{3A}$ which surface region is sandwiched by (or interposed between) the surface region, including the first main surface $A_1$, of the first region $SC_1$ and the fourth-A region $SC_{4A}$, Concerning the second transistor for read-out $TR_{1B}$ in the second semiconductor memory device $TR_B$;

(a-1) one source/drain region is constituted of the fourth-B region $SC_{4B}$, (a-2) the other source/drain region is constituted of a surface region, including the second main surface $A_2$, of the first region $SC_1$, and (a-3) a channel forming region $CH_{1B}$ is constituted of a surface region, including the second main surface $A_2$, of the third-B region $SC_{3B}$ which surface region is sandwiched by (or interposed between) the surface region, including the second main surface $A_2$, of the first region $SC_1$ and the fourth-B region $SC_{4B}$.

Concerning the first transistor for write-in $TR_{2A}$ in the first semiconductor memory device $TR_A$;

(B-1) one source/drain region is constituted of the second-A region $SC_{2A}$, (B-2) the other source/drain region is constituted of a surface region, including the first main surface $A_1$, of the third-A region $SC_{3A}$, and (B-3) a channel forming region $CH_{2A}$ is constituted of a surface region, including the first main surface $A_1$, of the first region $SC_1$ which surface region is sandwiched by (or interposed between) the surface region, including the first main surface $A_1$, of the third-A region $SC_{3A}$ and the second-A region $SC_{2A}$.

Concerning the second transistor for write-in $TR_{2B}$ in the second semiconductor memory device $TR_B$;

(b-1) one source/drain region is constituted of the second-B region $SC_{2B}$, (b-2) the other source/drain region is constituted of a surface region, including the second main surface $A_2$, of the third-B region $SC_{3B}$, and (b-3) a channel forming region $CH_{2B}$ is constituted of a surface region, including the second main surface $A_2$, of the first region $SC_1$ which surface region is sandwiched by (or interposed between) the surface region, including the second main surface $A_2$, of the third-B region $SC_{3B}$ and the second-B region $SC_{2B}$.

Further, concerning the first junction-field-effect transistor $TR_{4A}$ in the first semiconductor memory device $TR_A$;

(C-1) gate regions are constituted of the fifth-A region $SC_{5A}$ and a portion of third-A region $SC_{3A}$ facing the fifth-A region $SC_{5A}$, (C-2) a channel region $CH_{4A}$ is constituted of a portion of the fourth-A region $SC_{4A}$ sandwiched by (or interposed between) the fifth-A region $SC_{5A}$ and said portion of the third-A region $SC_{3A}$, and (C-3) source/drain regions are constituted of portions of the fourth-A region $SC_{4A}$, one of the portions of the fourth-A region $SC_{4A}$ extending from one end of the channel region $CH_{4A}$ of the first junction-field-effect transistor $TR_{4A}$ and the other of the portions of the fourth-A region $SC_{4A}$ extending from the other end of the channel region $CH_{4A}$ of the first junction-field-effect transistor $TR_{4A}$.

Concerning the second junction-field-effect transistor $TR_{4B}$ in the second semiconductor memory device $TR_B$;

(c-1) gate regions are constituted of the fifth-B region $SC_{5B}$ and a portion of third-B region $SC_{3B}$ facing the fifth-B region $SC_{5B}$, (c-2) a channel region $CH_{4B}$ is constituted of a portion of the fourth-B region $SC_{4B}$ sandwiched by (or interposed between) the fifth-B region $SC_{5B}$ and said portion of the third-B region $SC_{3B}$, and (c-3) source/drain regions are constituted of portions of the fourth-B region $SC_{4B}$, one of the portions of the fourth-B region $SC_{4B}$ extending from one end of the channel region $CH_{4B}$ of the second junction-field-effect transistor $TR_{4B}$ and the other of the portions of the fourth-B region $SC_{4B}$ extending from the other end of the channel region $CH_{4B}$ of the second junction-field-effect transistor $TR_{4B}$.

Concerning the third transistor $TR_{6A}$ in the first semiconductor memory device $TR_A$;

(D-1) one source/drain region is constituted of the surface region of the third-A region $SC_{3A}$ functioning as the channel forming region $CH_{1A}$ of the first transistor for read-out $TR_{1A}$, (D-2) the other source/drain region is constituted of the fifth-A region $SC_{5A}$, and (D-3) a channel forming region $CH_{6A}$ is constituted of the surface region of the fourth-A region $SC_{4A}$ functioning as one source/drain region of the first transistor for read-out $TR_{1A}$.

Concerning the fourth transistor $TR_{6B}$ in the second semiconductor memory device $TR_B$;

(d-1) one source/drain region is constituted of the surface region of the third-B region $SC_{3B}$ functioning as the channel forming region $CH_{1B}$ of the second transistor for read-out $TR_{1B}$, (d-2) the other source/drain region is constituted of the fifth-B region $SC_{5B}$, and (d-3) a channel forming region $CH_{6B}$ is constituted of the surface region of the fourth-B region $SC_{4B}$ functioning as one source/drain region of the second transistor for read-out $TR_{1B}$.

In the semiconductor memory cell of Example 26;

(E) the first diode $D_A$ having a pn junction is constituted of the second-A region $SC_{2A}$ and the first region $SC_1$, (e) the second diode $D_B$ having a pn junction is constituted of the second-B region $SC_{2B}$ and the first region $SC_1$, (F) the gate portion $G_A$ ($G_{1A}$, $G_{2A}$ and $G_{6A}$) of the first semiconductor memory device $TR_A$ is connected to a first-A memory-cell-selecting line (for example, a word line), (f) the gate portion $G_B$ ($G_{1B}$, $G_{2B}$ and $G_{6B}$) of the second semiconductor memory device $TR_B$ is connected to a first-B memory-cell-selecting line (for example, the word line), (G) the second-A region $SC_{2A}$ is connected to a write-in information setting line-A, (g) the second-B region $SC_{2B}$ is connected to a write-in information setting line-B, (H) the fourth-A region $SC_{4A}$ is connected to a second-A memory-cell-selecting line (for example, a bit line), and (h) the fourth-B region $SC_{4B}$ is connected to a second-B memory-cell-selecting line (for example, the bit line).

The write-in information setting line-A may be in common with the write-in information setting line-B.

The junction-field-effect transistors $TR_{4A}$ and $TR_{4B}$ in the semiconductor memory cell of Example 26 can be formed by (X) optimizing the distance (thickness of the channel regions $CH_{4A}$ and $CH_{4B}$) between the facing gate regions (the fifth-A region $SC_{5A}$ and the portion of third-A region $SC_{3A}$ facing the fifth-A region $SC_{5A}$, and, the fifth-B region $SC_{5B}$ and the portion of the third-B region $SC_{3B}$ facing the fifth-B region $SC_{5B}$) of the junction-field-effect transistors $TR_{4A}$ and $TR_{4B}$, and (Y) optimizing impurity concentrations of the facing gate regions (the fifth-A region $SC_{5A}$ and the portion of third-A region $SC_{3A}$ facing the fifth-A region $SC_{5A}$, and, the fifth-B region $SC_{5B}$ and the portion of the third-B region $SC_{3B}$ facing the fifth-B region $SC_{5B}$) and the channel regions $CH_{4A}$ and $CH_{4B}$ (specifically, the fourth-A region $SC_{4A}$ and the fourth-B region $SC_{4B}$) of the junction-field-effect transistors $TR_{4A}$ and $TR_{4B}$.

When a region $SC_{7A}$ containing a high concentration of an impurity having the first conductivity type is formed between the first region $SC_1$ and the third-A region $SC_{3A}$ or a region $SC_{7B}$ containing a high concentration of an impurity having the first conductivity type is formed between the first region $SC_1$ and the third-B region $SC_{3B}$, a potential or an electric charge stored in the channel forming region $CH_{1A}$ or $CH_{1B}$ in the first or second transistor for read-out $TR_{1A}$ or $TR_{1B}$ can be increased.

As FIG. 216 shows a principle drawing and as FIG. 217 shows a schematic partial cross-sectional view, a modification of the semiconductor memory cell in Example 26 may have a configuration in which the fourth-A region $SC_4$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; the second-A region $SC_{2A}$ is connected to the second-A memory-cell-selecting line (for example, the bit line) in place of being connected to the write-in information setting line-A; and the second-B region $SC_{2B}$ is connected to the second-B memory-cell-selecting line (for example, the bit line) in place of being connected to the write-in information setting line-B. In this configuration, the second-A memory-cell-selecting line also serves as the write-in information setting line-A, and the second-B memory-cell-selecting line also serves as the write-in information setting line-B. The second-A memory-cell-selecting line may be in common with the second-B memory-cell-selecting line.

As FIG. 218 shows a principle drawing and as FIG. 219 shows a schematic partial cross-sectional view, another modification of the semiconductor memory cell in Example 26 may have a configuration in which the semiconductor memory cell further has a sixth-A conductive region $SC_{6A}$ formed in a surface region, including the first main surface $A_1$, of the first region $SC_1$ and a sixth-B conductive region $SC_{6B}$ formed in a surface region, including the second main surface $A_2$, of the first region $SC_1$, wherein the first diode comprises a Schottky diode $D_{SA}$ constituted of the first region $SC_1$ and the sixth-A region $SC_{6A}$ in place of being constituted of the first region $SC_1$ and the second-A region $SC_{2A}$, and the second diode comprises a Schottky diode $D_{SB}$ constituted of the first region $SC_1$ and the sixth-B region $SC_{6B}$ in place of being constituted of the first region $SC_1$ and the second-B region $SC_{2B}$. The write-in information setting line-A may be in common with the write-in information setting line-B.

As FIG. 220 shows a principle drawing and as FIG. 221 shows a schematic partial cross-sectional view, the above another modification of the semiconductor memory cell in Example 26 may have a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; the second-A region $SC_{2A}$ is connected to the second-A memory-cell-selecting line (for example, the bit line) in place of being connected to the write-in information setting line-A; and the second-B region $SC_{2B}$ is connected to the second-B memory-cell-selecting line (for example, the bit line) in place of being connected to the write-in information setting line-B. In this configuration, the second-A memory-cell-selecting line also serves as the write-in information setting line-A, and the second-B memory-cell-selecting line also serves as the write-in information setting line-B. The second-A memory-cell-selecting line may be in common with the second-B memory-cell-selecting line.

As FIG. 222 shows a principle drawing and as FIG. 223 shows a schematic partial cross-sectional view, another modification of the semiconductor memory cell in Example 26 may have a configuration in which the write-in information setting line-A is in common with the write-in information setting line-B; the semiconductor memory cell has a sixth conductive region $SC_6$, formed through the semi-conductive layer 10A from the first main surface $A_1$ to second main surface $A_2$ and being in contact with the first region $SC_1$; the first diode comprises a Schottky diode $D_S$ constituted of the first region $SC_1$ and the sixth region $SC_6$ in place of being constituted of the first region $SC_1$ and the second-A region $SC_{2A}$; and the second diode comprises a Schottky diode $D_S$ constituted of the first region $SC_1$ and the sixth region $SC_6$ in place of being constituted of the first region $SC_1$ and the second-B region $SC_{2B}$.

As FIG. 224 shows a principle drawing and as FIG. 225 shows a schematic partial cross-sectional view, the above another modification of the semiconductor memory cell in Example 26 may have a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; the second-A and second-B regions $SC_{2A}$ and $SC_{2B}$ are connected to a second memory-cell-selecting line (for example, the bit line) in place of being connected to the write-in information setting line-A and the write-in information setting line-B. In this configuration, the second memory-cell-selecting line also serves as the write-in information setting line.

The method of manufacturing the semiconductor memory cell in Example 26 can substantially be the same as the method of manufacturing the semiconductor memory cell of Example 22, except the formation of the fifth-A region $SC_{5A}$ and the fifth-B region $SC_{5B}$, and except the formation of the gate portions which extend above the fifth-A region $SC_{5A}$ and fifth-B region $SC_{5B}$, respectively. Detailed explanations thereof are therefore omitted.

EXAMPLE 27

Example 27 is directed to the semiconductor memory cell according to the twenty-ninth aspect of the present invention. As FIG. 226 shows its principle drawing and as FIG. 227 shows its schematic partial cross-sectional view, the semiconductor memory cell of Example 27 comprises a first semiconductor memory device $TR_A$ and a second semiconductor memory device $TR_B$ opposite to each other, and each of the semiconductor memory devices $TR_A$ and $TR_B$ comprises three transistors, a transistor for read-out, a transistor for write-in and a junction-field-effect transistor for current control, and a diode. The semiconductor memory cell of Example 27 has a configuration similar to that of Example 25, except the configuration of the second region $SC_2$.

That is, the semiconductor memory cell of Example 27 is provided with a semi-conductive layer 10A having a first main surface $A_1$ and a second main surface opposed to the first main surface $A_1$, and comprises a first semiconductor memory device $TR_A$ and a second semiconductor memory device $TR_B$. The first semiconductor memory device $TR_A$ comprises a first transistor of a first conductivity type (e.g., n-type) for read-out $TR_{1A}$, a first transistor of a second conductivity type (e.g., p-type) for write-in $TR_{2A}$, a first junction-field-effect transistor of the first conductivity type (e.g., n-type) for current control $TR_{4A}$, and a first diode having a pn junction. The second semiconductor memory device $TR_B$ comprises a second transistor of the first conductivity type (e.g., n-type) for read-out $TR_{1B}$, a second transistor of the second conductivity type (e.g., p-type) for write-in $TR_{2B}$, a second junction-field-effect transistor of the first conductivity type (e.g., n-type) for current control $TR_4$ and a second diode having a pn junction.

The semiconductor memory cell of Example 27 has;

(1) a first semi-conductive region $SC_1$ of the first conductivity type (for example, n-type), formed through the semi-conductive layer 10A from the first main surface $A_1$ to second main surface $A_2$, (2) a second semi-conductive region $SC_2$ of the second conductivity type (for example, $p^+$-type) opposite to the first conductivity type, formed through the semi-conductive layer 10A from the first main surface $A_1$ to second main surface $A_2$ and being in contact with the first region $SC_1$, (3-1) a third-A semi-conductive region $SC_{3A}$ of the second conductivity type (for example, $p^+$-type), formed in a surface region, including the first main surface $A_1$, of the first region $SC_1$ and spaced from the second region $SC_2$, (3-2) a third-B semi-conductive region $SC_{3B}$ of the second conductivity type (for example, $p^+$-type), formed in a surface region, including the second main surface $A_2$, of the first region $SC_1$ and spaced from the second region $SC_2$, (4-1) a fourth-A semi-conductive region $SC_{4A}$ of the first conductivity type (for example, $n^+$-type), formed in a surface region, including the first main surface $A_1$, of the third-A region $SC_{3A}$, (4-2) a fourth-B semi-conductive region $SC_{4B}$ of the first conductivity type (for example, $n^+$-type), formed in a surface region, including the second main surface $A_2$, of the third-B region $SC_{3B}$, (5-1) a fifth-A semi-conductive region $SC_{5A}$ of the second conductivity type (for example, $p^+$-type), or a fifth-A conductive region $SC_{5A}$ formed of a silicide, a metal or a metal compound, said fifth-A region $SC_{5A}$ being formed in a surface region, including the first main surface $A_1$, of the fourth-A region $SC_{4A}$ and forming a rectifier junction together with the fourth-A region $SC_{4A}$, (5-2) a fifth-B semi-conductive region $SC_{5B}$ of the second conductivity type (for example, $p^+$-type), or a fifth-B conductive region $SC_{5B}$ formed of a silicide, a metal or a metal compound, said fifth-B region $SC_{5B}$ being formed in a surface region, including the second main surface $A_2$, of the fourth-B region $SC_{4B}$ and forming a rectifier junction together with the fourth-B region $SC_{4B}$, (6-1) a gate portion $G_A$ ($G_{1A}$ and $G_{2A}$ wherein "$G_{1A}$" means a gate portion of the first transistor for read-out $TR_{1A}$ and "$G_{2A}$" means a gate portion of the first transistor for write-in $TR_{2A}$) of the first semiconductor memory device $TR_A$ formed on a first barrier layer formed on the first main surface $A_1$ so as to bridge the first region $SC_1$ and the fourth-A region $SC_{4A}$ and so as to bridge the second region $SC_2$ and the third-A region $SC_{3A}$, and (6-2) a gate portion $G_B$ ($G_{1B}$ and $G_{2B}$ wherein "$G_{1B}$" means a gate portion of the second transistor for read-out $TR_{2A}$ and "$G_{2B}$" means a gate portion of the second transistor for write-in $TR_{2B}$) of the second semiconductor memory device $TR_B$ formed on a second barrier layer formed on the second main surface $A_2$ so as to bridge the first region $SC_1$ and the fourth-B region $SC_{4B}$ and so as to bridge the second region $SC_2$ and the third-B region $SC_{3B}$.

In the semiconductor memory cell of Example 27 shown in FIG. 227, the gate portion $G_A$ of the first semiconductor memory device $TR_A$ and the gate portion $G_B$ of the second semiconductor memory device $TR_B$ are almost aligned along a vertical direction.

Concerning the first transistor for read-out $TR_{1A}$ in the first semiconductor memory device $TR_A$;

(A-1) one source/drain region is constituted of the fourth-A region $SC_{4A}$, (A-2) the other source/drain region is constituted of a surface region, including the first main surface $A_1$, of the first region $SC_1$, and (A-3) a channel forming region $CH_{1A}$ is constituted of a surface region, including the first main surface $A_1$, of the third-A region $SC_{3A}$ which surface region is sandwiched by (or interposed between) the surface region, including the first main surface $A_1$, of the first region $SC_1$ and the fourth-A region $SC_{4A}$.

Concerning the second transistor for read-out $TR_{1B}$ in the second semiconductor memory device $TR_B$;

(a-1) one source/drain region is constituted of the fourth-B region $SC_{4B}$, (a-2) the other source/drain region is constituted of a surface region, including the second main surface $A_2$, of the first region $SC_1$, and (a-3) a channel forming region $CH_{1B}$ is constituted of a surface region, including the second main surface $A_2$, of the third-B region $SC_{3B}$ which surface region is sandwiched by (or interposed between) the surface region, including the second main surface $A_2$, of the first region $SC_1$ and the fourth-B region $SC_{4B}$.

Concerning the first transistor for write-in $TR_{2A}$ in the first semiconductor memory device $TR_A$;

(B-1) one source/drain region is constituted of a surface region, including the first main surface $A_1$, of the second region $SC_2$, (B-2) the other source/drain region is constituted of a surface region, including the first main surface $A_1$, of the third-A region $SC_{3A}$, and (B-3) a channel forming region $CH_{2A}$ is constituted of a surface region, including the first main surface $A_1$, of the first region $SC_1$ which surface region is sandwiched by (or interposed between) the surface region, including the first main surface $A_1$, of the third-A region $SC_{3A}$ and the surface region, including the first main surface $A_1$, of the second region $SC_2$.

Concerning the second transistor for write-in $TR_{2B}$ in the second semiconductor memory device $TR_B$;

(b-1) one source/drain region is constituted of a surface region, including the second main surface $A_2$, of the second region $SC_2$, (b-2) the other source/drain region is constituted of a surface region, including the second main surface $A_2$, of the third-B region $SC_{3B}$, and (b-3) a channel forming region $SC_{2B}$ is constituted of a surface region, including the second main surface $A_2$, of the first region $SC_1$ which surface region is sandwiched by (or interposed between) the surface region, including the second main surface $A_2$, of the third-B region $SC_{3B}$ and the surface region, including the second main surface $A_2$, of the second region $SC_2$.

Further, concerning the first junction-field-effect transistor $TR_{4A}$ in the first semiconductor memory device $TR_A$;

(C-1) gate regions are constituted of the fifth-A region $SC_{5A}$ and a portion of third-A region $SC_{3A}$ facing the fifth-A region $SC_{5A}$, (C-2) a channel region $CH_{4A}$ is constituted of a portion of the fourth-A region $SC_{4A}$ sandwiched by (or interposed between) the fifth-A region $SC_{5A}$ and said portion of the third-A region $SC_{3A}$, and (C-3) source/drain regions are constituted of portions of the fourth-A region $SC_{4A}$, one of the portions of the fourth-A region $SC_{4A}$ extending from one end of the channel region $CH_{4A}$ of the first junction-field-effect transistor $TR_{4A}$ and the other of the portions of the fourth-A region $SC_{4A}$ extending from the other end of the channel region $CH_{4A}$ of the first junction-field-effect transistor $TR_{4A}$.

Concerning the second junction-field-effect transistor $TR_{4B}$ in the second semiconductor memory device $TR_B$;

(c-1) gate regions are constituted of the fifth-B region $SC_{5B}$ and a portion of third-B region $SC_{3B}$ facing the fifth-B region $SC_{5B}$, (c-2) a channel region $SC_{4B}$ is constituted of a portion of the fourth-B region $SC_{4B}$ sandwiched by (or interposed between) the fifth-B region $SC_{5B}$ and said portion of the third-B region $SC_{3B}$, and (c-3) source/drain regions are constituted of portions of the fourth-B region $SC_{4B}$, one of the portions of the fourth-B region $SC_{4B}$ extending from one end of the channel region $CH_{4B}$ of the second junction-field-effect transistor $TR_{4B}$ and the other of the portions of the fourth-B region $SC_{4B}$ extending from the other end of the channel region $CH_{4B}$ of the second junction-field-effect transistor $TR_{4B}$.

In the semiconductor memory cell of Example 27;

(D) the first diode and the second diode D, each having a pn junction, are constituted of the second region $SC_2$ and the first region $SC_1$, (E) the gate portion $G_A$ ($G_{1A}$ and $G_{2A}$) of the first semiconductor memory device $TR_A$ is connected to a first-A memory-cell-selecting line (for example, a word line), (e) the gate portion $G_B$ ($G_{1B}$ and $G_{2B}$) of the second semiconductor memory device $TR_B$ is connected to a first-B memory-cell-selecting line (for example, the word line), (F) the second region $SC_2$ is connected to a write-in information setting line, (G) the fourth-A region $SC_{4A}$ is connected to a second-A memory-cell-selecting line (for example, a bit line), (g) the fourth-B region $SC_{4B}$ is connected to a second-B memory-cell-selecting line (for example, the bit line), and (H) the fifth-A region $SC_{5A}$ and the fifth-B region $SC_{5B}$ are connected to the write-in information setting line.

In the semiconductor memory cell of Example 27, the fifth-B region $SC_{5B}$ is connected to the write-in information setting line through the second region $SC_2$.

The junction-field-effect transistors $TR_{4A}$ and $TR_{4B}$ in the semiconductor memory cell of Example 27 can be formed by (X) optimizing the distance (thickness of the channel regions $CH_{4A}$ and $CH_{4B}$) between the facing gate regions (the fifth-A region $SC_{5A}$ and the portion of third-A region $SC_{3A}$ facing the fifth-A region $SC_{5A}$, and, the fifth-B region $SC_{5B}$ and the portion of the third-B region $SC_{3B}$ facing the fifth-B region $SC_{5B}$) of the junction-field-effect transistors $TR_{4A}$ and $TR_{4B}$, and (Y) optimizing impurity concentrations of the facing gate regions (the fifth-A region $SC_{5A}$ and the portion of third-A region $SC_{3A}$ facing the fifth-A region $SC_{5A}$, and, the fifth-B region $SC_{5B}$ and the portion of the third-B region $SC_{3B}$ facing the fifth-B region $SC_{5B}$) and the channel regions $CH_{4A}$ and $CH_{4B}$ (specifically, the fourth-A region $SC_{4A}$ and the fourth-B region $SC_{4B}$) of the junction-field-effect transistors $TR_{4A}$ and $TR_{4B}$.

As FIG. 228 shows a principle drawing and as FIG. 229 shows a schematic partial cross-sectional view, a modification of the semiconductor memory cell in Example 27 may have a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; and the second region $SC_2$ is connected to a second memory-cell-selecting line (for example, the bit line) in place of being connected to the write-in information setting line. In this configuration, the second memory-cell-selecting line also serves as the write-in information setting line.

As FIG. 230 shows a principle drawing and as FIG. 231 shows a schematic partial cross-sectional view, another modification of the semiconductor memory cell in Example 27 may have a configuration in which the fifth-A region $SC_{5A}$ is connected to the third-A region $SC_{3A}$ in place of being connected to the write-in information setting line, and the fifth-B region $SC_{5B}$ is connected to the third-B region $SC_{3B}$ in place of being connected to the write-in information setting line.

As FIG. 232 shows a principle drawing and as FIG. 233 shows a schematic partial cross-sectional view, the above another modification of the semiconductor memory cell in Example 27 may have a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B, in place of being connected to the second-B memory-cell-selecting line; and the second region $SC_2$ is connected to the second memory-cell-selecting line (for example, the bit line) in place of being connected to the write-in information setting line. In this configuration, the second memory-cell-selecting line also serves as the write-in information setting line.

The semiconductor memory cell of Example 27 can be fabricated by the method similar to the method for manufacturing the semiconductor memory cell of Example 22, except the following points. That is, in place of forming the second-A region $SC_{2A}$ and second-B region $SC_{2B}$, the second region $SC_2$ is formed in [Step-2200] by ion-implanting a p-type impurity to the n-type silicon semiconductor substrate 10; and the silicon semiconductor substrate 10 is then etched to leave a projected portion in which the semiconductor memory cell is to be fabricated, and whereby the first region $SC_1$ containing the n-type impurity and the second region $SC_2$ containing the p-type impurity are formed. Alternatively, it is also allowable to etch the silicon semiconductor substrate 10 for leaving a projected portion in which the semiconductor memory cell is to be fabricated, and then, to ion-implant a p-type impurity to the projected portion for forming the second region $SC_2$. Excluding the above, the method for manufacturing the semiconductor memory cell of Example 27 is substantially the same as that of Example 22. Detailed explanations thereof are therefore omitted.

EXAMPLE 28

Example 28 is directed to the semiconductor memory cell according to the thirtieth aspect of the present invention. As FIG. 234 shows its principle drawing and as FIG. 235 shows its schematic partial cross-sectional view, the semiconductor memory cell of Example 28 comprises a first semiconductor memory device $TR_A$ and a second semiconductor memory device $TR_B$ opposite to each other, and each of the semiconductor memory devices $TR_A$ and $TR_B$ comprises four transistors, a transistor for read-out, a transistor for write-in, a junction-field-effect transistor for current control and an additional transistor for write-in, and a diode. The semiconductor memory cell of Example 28 has a configuration similar to that of Example 26, except the configuration of the second region.

That is, the semiconductor memory cell of Example 28 is provided with a semi-conductive layer 10A having a first main surface $A_1$ and a second main surface opposed to the first main surface $A_1$, and comprises a first semiconductor memory device $TR_A$ and a second semiconductor memory device $TR_B$. The first semiconductor memory device $TR_A$ comprises a first transistor of a first conductivity type (e.g., n-type) for read-out $TR_{1A}$, a first transistor of a second conductivity type (e.g., p-type) for write-in $TR_{2A}$, a first junction-field-effect transistor of the first conductivity type (e.g., n-type) for current control $TR_{4A}$, a third transistor of the second conductivity type (e.g., p-type) for write-in $TR_{6A}$ and a first diode having a pn junction. The second semiconductor memory device $TR_B$ comprises a second transistor of the first conductivity type (e.g., n-type) for read-out $TR_{1B}$, a second transistor of the second conductivity type (e.g., p-type) for write-in $TR_{2B}$, a second junction-field-effect transistor of the first conductivity type (e.g., n-type) for current control $TR_{4B}$, a fourth transistor of the second conductivity type (e.g., p-type) for write-in $TR_{6B}$ and a second diode having a pn junction.

The semiconductor memory cell of Example 28 has;

(1) a first semi-conductive region $SC_1$ of the first conductivity type (for example, n-type), formed through the semi-conductive layer 10A from the first main surface $A_1$ to second main surface $A_2$, (2) a second semi-conductive region $SC_2$ of the second conductivity type (for example, $p^+$-type) opposite to the first conductivity type, formed through the semiconductive layer 10A from the first main surface $A_1$ to second main surface $A_2$ and being in contact with the first region $SC_1$, (3-1) a third-A semi-conductive region $SC_{3A}$ of the second conductivity type (for example, $p^+$-type), formed in a surface region, including the first main surface $A_1$, of the first region $SC_1$ and spaced from the second region $SC_2$, (3-2) a third-B semi-conductive region $SC_{3B}$ of the second conductivity type (for example, $p^+$-type), formed in a surface region, including the second main surface $A_2$, of the first region $SC_1$ and spaced from the second region $SC_2$, (4-1) a fourth-A semi-conductive region $SC_{4A}$ of the first conductivity type (for example, $n^+$-type), formed in a surface region, including the first main surface $A_1$, of the third-A region $SC_{3A}$, (4-2) a fourth-B semi-conductive region $SC_4$ of the first conductivity type (for example, $n^+$-type), formed in a surface region, including the second main surface $A_2$, of the third-B region $SC_{3B}$, (5-1) a fifth-A semi-conductive region $SC_{5A}$ of the second conductivity type (for example, $p^+$-type), or a fifth-A conductive region $SC_{5A}$ formed of a silicide, a metal or a metal compound, said fifth-A region $SC_{5A}$being formed in a surface region, including the first main surface $A_1$, of the fourth-A region $SC_{4A}$ and forming a rectifier junction together with the fourth-A region $SC_{4A}$, (5-2) a fifth-B semi-conductive region $SC_{5B}$ of the second conductivity type (for example, $p^+$-type), or a fifth-B conductive region $SC_{5B}$ formed of a silicide, a metal or a metal compound, said fifth-B region $SC_{5B}$ being formed in a surface region, including the second main surface $A_2$, of the fourth-B region $SC_{4B}$ and forming a rectifier junction together with the fourth-B region $SC_{4B}$, (6-1) a gate portion $G_A$ ($G_{1A}$, $G_{2A}$ and $G_{6A}$ wherein "$G_{1A}$" means a gate portion of the first transistor for read-out $TR_{1A}$, "$G_{2A}$" means a gate portion of the first transistor for write-in $TR_{2A}$ and "$G_{6A}$" means a gate portion of the third transistor for write-in $TR_{6A}$) of the first semiconductor memory device $TR_A$ formed on a first barrier layer formed on the first main surface $A_1$ so as to bridge the first region $SC_1$ and the fourth-A region $SC_{4A}$, so as to bridge the second region $SC_2$ and the third-A region $SC_{3A}$ and so as to bridge the third-A region $SC_{3A}$ and the fifth-A region $SC_{5A}$, and (6-2) a gate portion $G_B$ ($G_{1B,\ G2B}$ and $G_{6B}$ wherein "$G_{1B}$" means a gate portion of the second transistor for read-out $TR_{1B}$, "$G_{2B}$ " means a gate portion of the second transistor for write-in $TR_{2B}$ and "$G_{6B}$" means a gate portion of the fourth transistor for write-in $TR_{6B}$) of the second semiconductor memory device $TR_B$ formed on a second barrier layer formed on the second main surface $A_2$ so as to bridge the first region $SC_1$ and the fourth-B region $SC_{4B}$, so as to bridge the second region $SC_2$ and the third-B region $SC_{3B}$ and so as to bridge the third-B region $SC_{3B}$ and the fifth-B region $SC_{5B}$.

In the semiconductor memory cell of Example 28 shown in FIG. 235, the gate portion $G_A$ of the first semiconductor memory device $TR_A$ and the gate portion $G_B$ of the second semiconductor memory device $TR_B$ are almost aligned along a vertical direction.

Concerning the first transistor for read-out $TR_{1A}$ in the first semiconductor memory device $TR_A$;

(A-1) one source/drain region is constituted of the fourth-A region $SC_{4A}$, (A-2) the other source/drain region is constituted of a surface region, including the first main surface $A_1$, of the first region $SC_1$, and (A-3) a channel forming region $CH_{1A}$ is constituted of a surface region, including the first main surface $A_1$, of the third-A region $SC_{3A}$ which surface region is sandwiched by (or interposed between) the surface region, including the first main surface $A_1$, of the first region $SC_1$ and the fourth-A region $SC_{4A}$.

Concerning the second transistor for read-out $TR_{1B}$ in the second semiconductor memory device $TR_B$;

(a-1) one source/drain region is constituted of the fourth-B region $SC_{4B}$, (a-2) the other source/drain region is constituted of a surface region, including the second main surface $A_2$, of the first region $SC_1$, and (a-3) a channel forming region $CH_{1B}$ is constituted of a surface region, including the second main surface $A_2$, of the third-B region $SC_{3B}$ which surface region is sandwiched by (or interposed between) the surface region, including the second main surface $A_2$, of the first region $SC_1$ and the fourth-B region $SC_{4B}$.

Concerning the first transistor for write-in $TR_{2A}$ in the first semiconductor memory device $TR_A$;

(B-1) one source/drain region is constituted of a surface region, including the first main surface $A_1$, of the second region $SC_2$, (B-2) the other source/drain region is constituted of a surface region, including the first main surface $A_1$, of the third-A region $SC_{3A}$, and (B-3) a channel forming region $CH_{2A}$ is constituted of a surface region, including the first main surface $A_1$, of the first region $SC_1$ which surface region is sandwiched by (or interposed between) the surface region, including the first main surface $A_1$, of the third-A region $SC_{3A}$ and the surface region, including the first main surface $A_1$, of the second region $SC_2$.

Concerning the second transistor for write-in $TR_{2B}$ in the second semiconductor memory device $TR_B$;

(b-1) one source/drain region is constituted of a surface region, including the second main surface $A_2$, of the second region $SC_2$, (b-2) the other source/drain region is constituted of a surface region, including the second main surface $A_2$, of the third-B region $SC_{3B}$, and (b-3) a channel forming region $CH_{2B}$ is constituted of a surface region, including the second main surface $A_2$, of the first region $SC_1$ which surface region is sandwiched by (or interposed between) the surface region, including the second main surface $A_2$, of the third-B region $SC_{3B}$ and the surface region, including the second main surface $A_2$, of the second region $SC_2$.

Further, concerning the first junction-field-effect transistor $TR_{4A}$ in the first semiconductor memory device $TR_A$;

(C-1) gate regions are constituted of the fifth-A region $SC_{5A}$ and a portion of third-A region $SC_{3A}$ facing the fifth-A region $SC_{5A}$, (C-2) a channel region $CH_{4A}$ is constituted of a portion of the fourth-A region $SC_{4A}$ sandwiched by (or interposed between) the fifth-A region $SC_{5A}$ and said portion of the third-A region $SC_{3A}$, and (C-3) source/drain regions are constituted of portions of the fourth-A region $SC_{4A}$, one of the portions of the fourth-A region $SC_{4A}$ extending from one end of the channel region $CH_{4A}$ of the first junction-field-effect transistor $TR_{4A}$ and the other of the portions of the fourth-A region $SC_{4A}$ extending from the other end of the channel region $CH_{4A}$ of the first junction-field-effect transistor $TR_{4A}$.

Concerning the second junction-field-effect transistor $TR_{4B}$ in the second semiconductor memory device $TR_B$;

(c-1) gate regions are constituted of the fifth-B region $SC_{5B}$ and a portion of third-B region $SC_{3B}$ facing the fifth-B region $SC_{5B}$, (c-2) a channel region $CH_{4B}$ is constituted of a portion of the fourth-B region $SC_{4B}$ sandwiched by (or interposed between) the fifth-B region $SC_{5B}$ and said portion of the third-B region $SC_{3B}$, and (c-3) source/drain regions are constituted of portions of the fourth-B region $SC_{4B}$, one of the portions of the fourth-B region $SC_{4B}$ extending from one end of the channel region $CH_{4B}$ of the second junction-field-effect transistor $TR_{4B}$ and the other of the portions of the fourth-B region $SC_{4B}$ extending from the other end of the channel region $CH_{4B}$ of the second junction-field-effect transistor $TR_{4B}$.

Concerning the third transistor for write-in $TR_{6A}$ in the first semiconductor memory device $TR_A$;

(D-1) one source/drain region is constituted of the surface region of the third-A region $SC_{3A}$ functioning as the channel forming region $CH_{1A}$ of the first transistor for read-out $TR_{1A}$, (D-2) the other source/drain region is constituted of the fifth-A region $SC_{5A}$, and (D-3) a channel forming region $CH_{6A}$ is constituted of the surface region of the fourth-A region $SC_{4A}$ functioning as one source/drain region of the first transistor for read-out $TR_{1A}$.

Concerning the fourth transistor for write-in $TR_{6B}$ in the second semiconductor memory device $TR_B$;

(d-1) one source/drain region is constituted of the surface region of the third-B region $SC_{3B}$ functioning as the channel forming region $CH_{1B}$ of the second transistor for read-out $TR_{1B}$, (d-2) the other source/drain region is constituted of the fifth-B region $SC_{5B}$, and (d-3) a channel forming region $CH_{6B}$ is constituted of the surface region of the fourth-B region $SC_{4B}$ functioning as one source/drain region of the second transistor for read-out $TR_{1B}$.

In the semiconductor memory cell of Example 28;

(E) the first diode and the second diode D, each having a pn junction, are constituted of the second region $SC_2$ and the first region $SC_1$, (F) the gate portion $G_A$ ($G_A$, $G_{2A}$ and $G_{6A}$) of the first semiconductor memory device $TR_A$ is connected to a first-A memory-cell-selecting line (for example, a word line), (f) the gate portion $G_B$ ($G_{1B}$, $G_{2B}$ and $G_{6B}$) of the second semiconductor memory device $TR_B$ is connected to a first-B memory-cell-selecting line (for example, the word line), (G) the second region $SC_2$ is connected to a write-in information setting line, (H) the fourth-A region $SC_{4A}$ is connected to a second-A memory-cell-selecting line (for example, a bit line), and (h) the fourth-B region $SC_{4B}$ is connected to a second-B memory-cell-selecting line (for example, the bit line).

The junction-field-effect transistors $TR_{4A}$ and $TR_{4B}$ in the semiconductor memory cell of Example 28 can be formed by (X) optimizing the distance (thickness of the channel regions $CH_{4A}$ and $CH_{4B}$) between the facing gate regions (the fifth-A region $SC_{5A}$ and the portion of third-A region $SC_{3A}$ facing the fifth-A region $SC_{5A}$, and, the fifth-B region $SC_{5B}$ and the portion of the third-B region $SC_{3B}$ facing the fifth-B region $SC_{5B}$) of the junction-field-effect transistors $TR_{4A}$ and $TR_{4B}$, and (Y) optimizing impurity concentrations of the facing gate regions (the fifth-A region $SC_{5A}$ and the portion of third-A region $SC_{3A}$ facing the fifth-A region $SC_{5A}$, and, the fifth-B region $SC_{5B}$ and the portion of the third-B region $SC_{3B}$ facing the fifth-B region $SC_{5B}$) and the channel regions $CH_{4A}$ and $CH_{4B}$ (specifically, the fourth-A regions $SC_{4A}$ and the fourth-B region $SC_{4B}$) of the junction-field-effect transistors $TR_{4A}$ and $TR_{4B}$.

As FIG. 236 shows a principle drawing and as FIG. 237 shows a schematic partial cross-sectional view, a modification of the semiconductor memory cell in Example 28 may have a configuration in which the fourth-A region $SC_{4A}$ is connected to a predetermined potential line-A in place of being connected to the second-A memory-cell-selecting line; the fourth-B region $SC_{4B}$ is connected to a predetermined potential line-B in place of being connected to the second-B memory-cell-selecting line; and the second region $SC_2$ is connected to a second memory-cell-selecting line (for example, the bit line), in place of being connected to the write-in information setting line. In this configuration, the second memory-cell-selecting line also serves as the write-in information setting line.

The method of manufacturing the semiconductor memory cell in Example 28 can substantially be the same as the method of manufacturing the semiconductor memory cell of Example 22 or Example 27, except the formation of the gate portions which extend above the fifth-A region $SC_{5A}$ and fifth-B region $SC_{5B}$, respectively. Detailed explanations thereof are therefore omitted.

The operation of the semiconductor memory cell of Example 1 will be explained below. It should be noted that the principles of operation of the semiconductor memory cells of Examples 1 to 28 are substantially same. Since the second memory-cell-selecting line (for example, the bit line) also serves as the write-in information setting line in Example 11 or 13, the term "the write-in information setting line" in the following paragraphs is literally convertible to "the second memory-cell-selecting line (for example, a bit line)".

In write-in operation, potentials at portions of the semiconductor memory cell are set as shown in the following Table 1.

Table 1

First memory-cell-selecting line: $V_W$

Write-in information setting line when writing "0": $V_0$ when writing "1": $V_1$ In read-out operation, potentials at portions of the semiconductor memory cell are set as shown in the following Table 2. Further, in read-out operation, a potential of the second memory-cell-selecting line to which the fourth region $SC_4$ in Example 1 or 2 is connected, a potential of the second memory-cell-selecting line in each of Examples 5 to 28, or a potential of the write-in information setting line (also serving as the bit line) to which the first region $SC_1$ in Example 3 or 4 is connected, is set as shown in the following Table 2. The second memory-cell-selecting line and the write-in information setting line may generally be referred to as "second memory-cell-selecting line", hereinafter. The predetermined potential including 0 Volt is applied to a wiring to which the fourth region $SC_4$ in Example 3 or 4 is connected, to a wiring to which the first region $SC_1$ or the fourth region $SC_4$ in Examples 5 to 9 is connected, to the write-in information setting line in Examples 10 to 13 (the second region $SC_2$ in Example 11 and the fourth region $SC_4$ in Example 13), or to a wiring to which the first region $SC_1$ in Examples 14 to 28 is connected.

Table 2

First memory-cell-selecting line: $V_R$

Second memory-cell-selecting line: $V_2$

A threshold voltage of the first transistor $TR_1$ seen from the gate portion is given as shown in the following Table 3. Further, the relationship among potentials in the first transistor $TR_1$ is set as shown in Table 3. A potential of the channel forming region $CH_1$ of the first transistor $TR_1$ when information "0" is read out is different from that when information "1" is read out. As a result, the threshold voltage of the first transistor $TR_1$ seen from the gate portion changes, depending upon whether the stored information is "0" or "1". However, unlike a conventional DRAM, the semiconductor memory cell of the present invention does not require a capacitor with a large capacitance required by a conventional DRAM. When the junction-field-effect transistor $TR_3$ is provided, and when the ratio of an on-state current to an off-state current of the junction-field-effect transistor $TR_3$ is large, the information can be read out without any error even if $|V_R| \geqq |V_{TH-11}|$.

Table 3

When "0" is read out: $V_{TH-10}$

When "1" is read out: $V_{TH-11}$ $|V_{TH-11}|>|V_R|>|V_{TH-10}|$

[Operation to Write Information]

In operation to write "0" by setting the potential of the write-in information setting line at $V_0$ or write "1" by setting the potential of the write-in information setting line at $V_1$, the potential of the first memory-cell-selecting line is set at $V_W$ (<0). As a result, the potential of the gate portion $G_2$ of the second transistor $TR_2$ is set at $V_W$ (<0) as well, and the second transistor $TR_2$ is brought into an on-state. Therefore, the potential of the channel forming region $CH_1$ of the first transistor $TR_1$ is $V_0$ when information "0" is written in, or $V_1$ (where, $V_W-V_{TH2}$ in case of $|V_W|<|V_1+V_{TH2}|$) when information "1" is written in.

After the information has been written in, potentials of portions in the first transistor $TR_1$ and the second transistor $TR_2$ should be set at such values that these transistors do not conduct. For this purpose, typically, the potential of the first memory-cell-selecting line is set at 0 Volt and the potential of the write-in information setting line is set at $V_1$.

In operation to write information, the potential of the gate portion $G_1$ of the first transistor $TR_1$ is also set at $V_W$ (<0). As a result, the first transistor $TR_1$ is in an off-state. In this state, the potential of the channel forming region $CH_1$ of the first transistor $TR_1$ is $V_0$ when information "0" is written in, or, $V_1$ or $V_W-V_{TH2}$ when information "1" is written in. In spite of the fact that this state changes with the lapse of time due to leakage currents, this state is none the less maintained within an allowable range till operation to read out the information is carried out. Examples of the leakage currents are a current flowing between the channel forming region $CH_1$ of the first transistor $TR_1$ and, for example, a semiconductor substrate, or an off-state current of the second transistor $TR_2$. It should be noted that so-called refresh operation is carried out before the potential of the channel forming region $CH_1$ of the first transistor $TR_1$ changes with the lapse of time to cause an error in operation to read out the information.

[Operation to Read Out Information]

In operation to read out the information "0" or "1", the potential of the first memory-cell-selecting line is set at $V_R$ (>0). Therefore, the potential of the gate portion $G_2$ of the second transistor $TR_2$ is also set at $V_R$ (>0). As a result, the second transistor $TR_2$ is brought into an off-state.

The potential of the gate portion $G_1$ of the first transistor $TR_1$ is set at $V_R$ (>0) as well. The threshold voltage of the first transistor $TR_1$ seen from the gate portion is $V_{TH-10}$ or $V_{TH-11}$ for stored information of "0" or "1" respectively. The threshold voltage of the first transistor $TR_1$ depends upon the state of the potential of the channel forming region $CH_1$. The relationship among the potentials and the threshold voltages is as follows. $|V_{TH-11}|>V_R|>|V_{TH-10}|$ Therefore, when the stored information is "0", the first transistor $TR_1$ is brought into an on-state. When the stored information is "1", on the other hand, the first transistor $TR_1$ is brought into an off-state. However, when the ratio of an on-state current to an off-state current of the junction-field-effect transistor $TR_3$ is large, the information can be read out without any error even if $|V_R| \geqq |V_{TH-11}|$.

Further, when the junction-field-effect transistor $TR_3$ is provided, the first transistor $TR_1$ is controlled by the junction-field-effect transistor $TR_3$ on the basis of the bias conditions of the gate portions of the junction-field-effect transistor $TR_3$ which are constituted of, for example the third region $SC_3$ and the fifth region $SC_5$. That is, when the stored information is "0", the junction-field-effect transistor $TR_3$ is brought into an on-state. When the stored information is "1", on the other hand, the junction-field-effect transistor $TR_3$ is brought into an off-state.

In the above manner, the first transistor $TR_1$ can be brought into an on-state or an off-state with a high degree of reliability depending upon the stored information. Since the fourth region $SC_4$ is connected to the second memory-cell-selecting line (for example, the bit line) or the first region $SC_1$ is connected to the write-in information setting line also serving as the bit line in Examples 1 to 4, since the fourth region $SC_4$ or the first region $SC_1$ is connected to the second memory-cell-selecting line (for example, the bit line) in Examples 5 to 9, since the second region $SC_2$ is connected to the second memory-cell-selecting line (for example, the bit line) in Examples 10 to 13, or since the fourth region $SC_4$ is connected to the second memory-cell-selecting line (for example, the bit line) in Examples 14 to 28, a current flows or does not flow depending upon whether the stored information is "0" or "1". As a result, the stored information can be read out by the first transistor $TR_1$.

The operating states of the first transistor $TR_1$, the second transistor $TR_2$ and the junction-field-effect transistor $TR_3$ described above are summarized in Table 4. It should be noted that the values of potentials shown in Table 4 are no more than typical values, which can be any values as long as the conditions described above are satisfied.

TABLE 4 unit: volt

| Write-in operation | Write-in of "0" | | Write-in of "1" | |
|---|---|---|---|---|
| Potential of first line | $V_W$ | −3.0 | $V_W$ | −3.0 |
| Potential of write-in information setting line | $V_0$ | 0 | $V_1$ | −2.0 |
| Potential of gate portion | $V_W$ | −3.0 | $V_W$ | −3.0 |
| State of $TR_2$ | ON | | ON | |
| Potential of channel forming | $V_0$ | 0 | $V_1$ | −2.0 |

TABLE 4-continued

| unit: volt | | | | |
|---|---|---|---|---|
| region $CH_1$ | | | | |
| State of $TR_1$ | OFF | | OFF | |
| State of $TR_3$ | ON | | OFF | |
| Read-out operation | Read-out of "0" | | Read-out of "1" | |
| Potential of first line | $V_R$ | 1.0 | $V_R$ | 1.0 |
| Potential of gate portion | $V_R$ | 1.0 | $V_R$ | 1.0 |
| State of $TR_2$ | OFF | | OFF | |
| Potential of channel forming region $CH_1$ | $V_0$ | 0 | $V_1$ | −2.0 |
| Threshold voltage $TR_1$ seen from gate portion | $V_{TH1\_0}$ | 0.5 | $V_{TH1\_1}$ | 1.1 |
| State of $TR_1$ | ON | | OFF | |
| Potential of write-in information setting line | 1.0 | | 1.0 | |
| State of $TR_3$ | ON | | OFF | |

The semiconductor memory cell of the present invention has been explained with reference to preferred embodiments hereinabove, while the present invention shall not be limited to those embodiments. The structures of the semiconductor memory cells, and voltages, potentials, etc., in the semiconductor memory cells explained as embodiments are examples, and may be changed as required. For example, in the semiconductor memory cells explained as embodiments, the first transistor for read-out, the second transistor for read-out and the junction-field-effect transistor(s) may be p-type transistors, and the first transistor for write-in, the second transistor for write-in, the third transistor for write-in and the fourth transistor for write-in may be n-type transistors. The layout of elements in each transistor is an example, and may be changed as required. An impurity may be introduced into each region not only by an ion-implanting method but also by a diffusion method. Further, the present invention can be applied not only to a silicon semiconductor but also to a compound semiconductor, e.g., of a GaAs system. Moreover, the semiconductor memory cell of the present invention can be applied to a semiconductor memory cell having an MES FET structure.

The semiconductor memory cell in Example 10 or 11 can be manufactured by the method for manufacturing a semiconductor memory cell explained in Example 12. The semiconductor memory cell in Example 12 or 13 can be manufactured by the method for manufacturing a semiconductor memory cell explained in Example 10.

The semiconductor memory cells having a so-called SOI structure in Examples 5 to 9 and 14 to 28 is formed in a so-called bonded substrate produced by forming a convex portion in a semiconductor substrate (a starting substrate), depositing an insulator (insulating layer) on an entire surface, attaching the insulator (insulating layer) and a supporting substrate to each other, and grinding and polishing the semiconductor substrate (the starting substrate) from its back surface. Alternatively, in Examples 5 to 9 and 14 to 28, the semiconductor memory cells having a so-called TFT structure can be formed by forming a gate portion on an insulator (insulating layer), depositing an amorphous silicon layer or a polysilicon layer on the entire surface by, for example, a CVD method, then, forming a silicon layer by any one of known single-crystallization methods such as a zone melting crystallization method using laser beam or electron beam and a lateral solid phase epitaxy method in which a crystal is grown through an opening formed in an insulator (insulating layer), and manufacturing the semiconductor memory cell in the above silicon layer as the semi-conductive layer. Further, in Examples 5 to 9 and 14 to 28, the semiconductor memory cell can be obtained by forming a gate portion on a supporting substrate, depositing, for example, a polysilicon layer or an amorphous silicon layer on the entire surface, and manufacturing the semiconductor memory cell in the above polysilicon layer or amorphous layer as the semi-conductive layer.

Figure 116A:
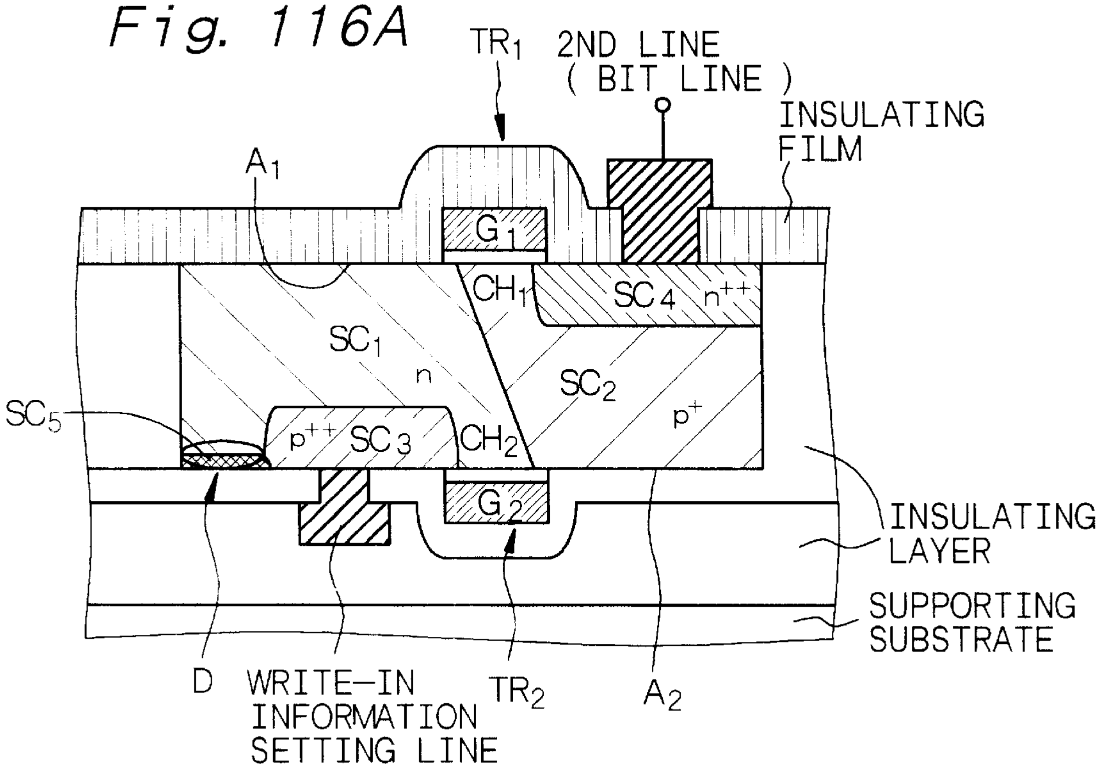
FIGS. 116A and 116B are schematic partial cross-sectional views of modifications of the semiconductor memory cell in Example 16 and Example 17.
Figure 116B:
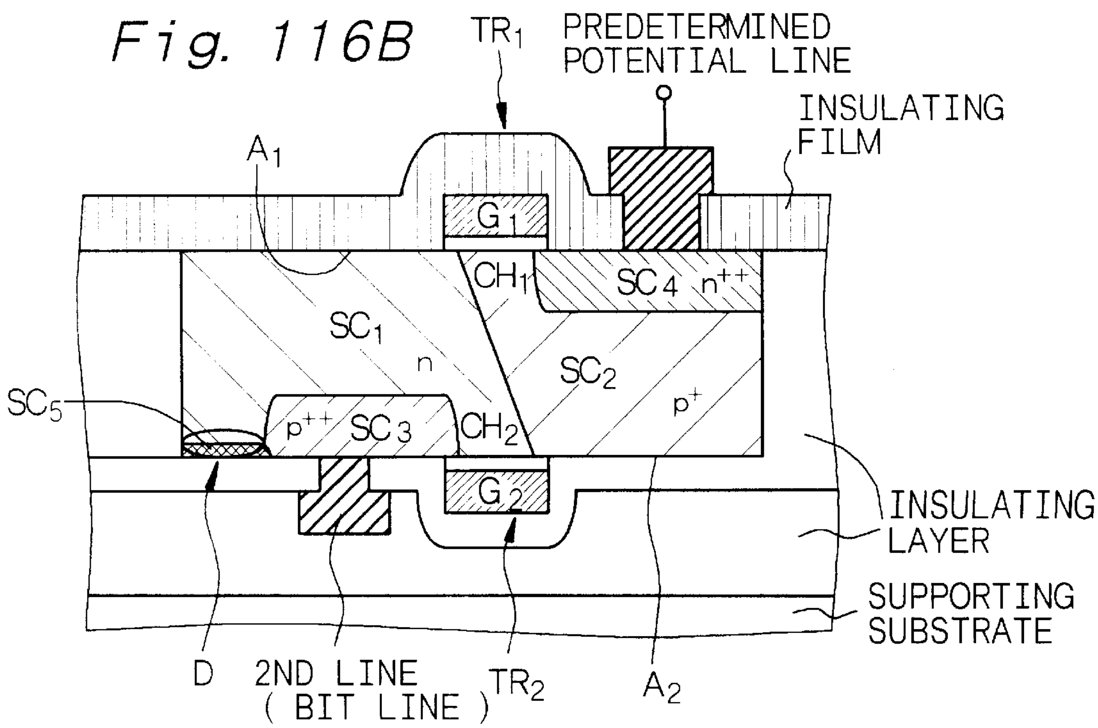

In the semiconductor memory cell in Example 16 or 17, the diode D may be formed of a Schottky junction. That is, as FIGS. 116A and 116B show schematic partial cross-sectional views, the semiconductor memory cell may have a configuration in which the diode D is constituted of the first region $SC_1$ and the fifth region $SC_5$ of a silicide layer or a metal layer such as an Mo or Al layer. The semiconductor memory cell shown in FIG. 116A is a modification of the semiconductor memory cell of Example 16 shown in FIG. 112B. The semiconductor memory cell shown in FIG. 116B is a modification of the semiconductor memory cell of Example 17 shown in FIG. 114B.

Figure 117A:
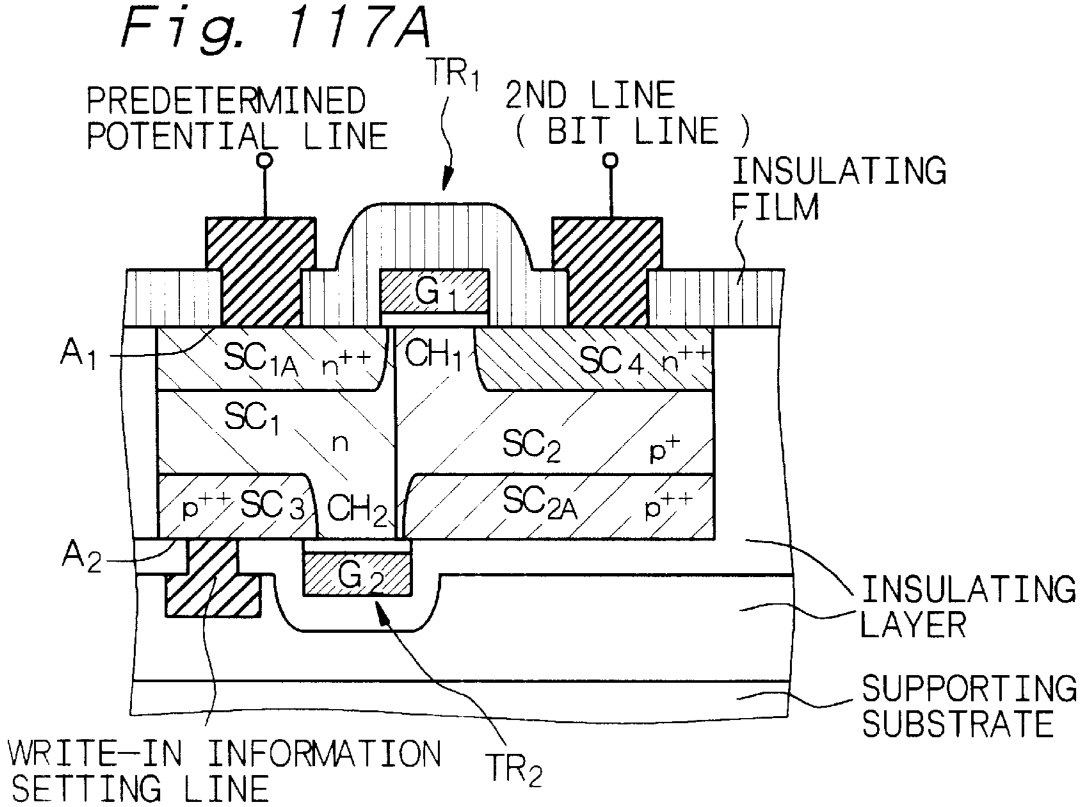
FIGS. 117A and 117B are schematic partial cross-sectional views of modifications of the semiconductor memory cell in Example 14.
Figure 117B:
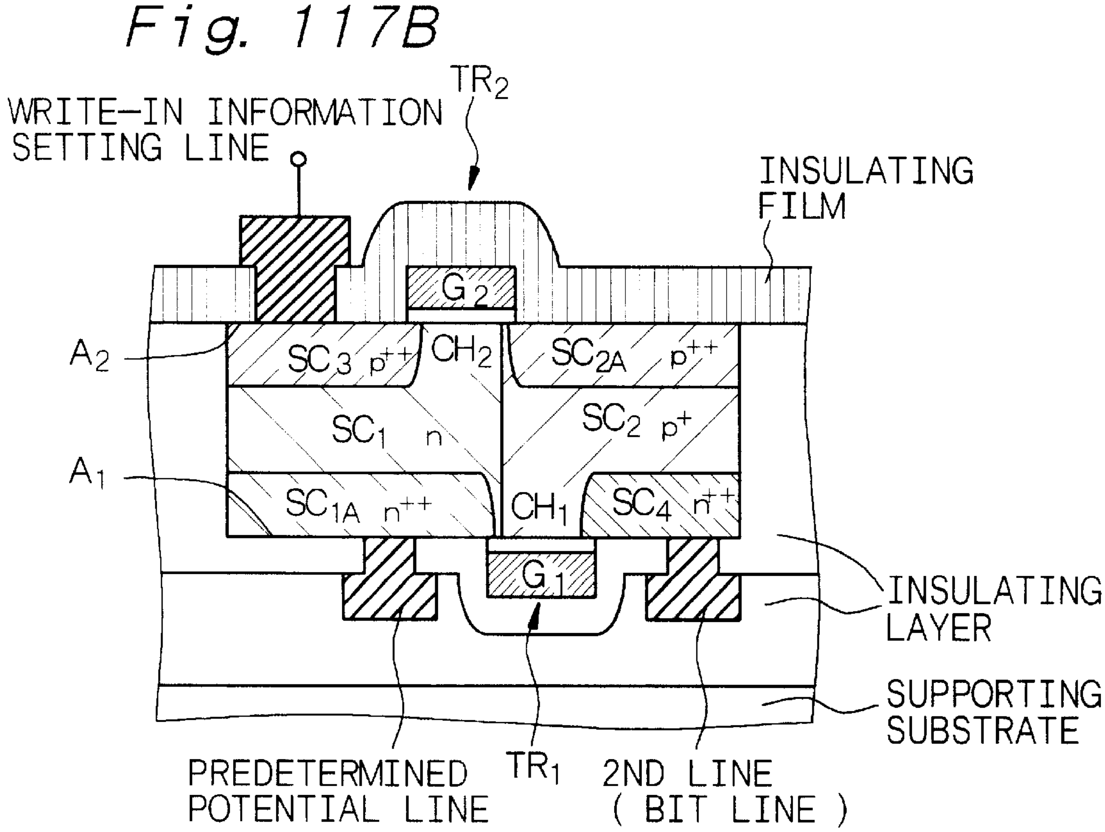

In the semiconductor memory cell explained in Example 14, a region $SC_{1A}$ containing an impurity of the first conductivity type (for example, $n^{++}$-type) at a high concentration can be substituted for the first region constituting the other source/drain region of the first transistor $TR_1$, and a region $SC_{2A}$ containing an impurity of the second conductivity type (for example, $p^{++}$-type) at a high concentration can be substituted for the surface region, including the second main surface, of the second region constituting the other source/drain region of the second transistor $TR_2$. Such modified examples concerning the semiconductor memory cells shown in FIGS. 103A and 104A are shown in FIGS. 117A and 117B, respectively.

Figure 118A:
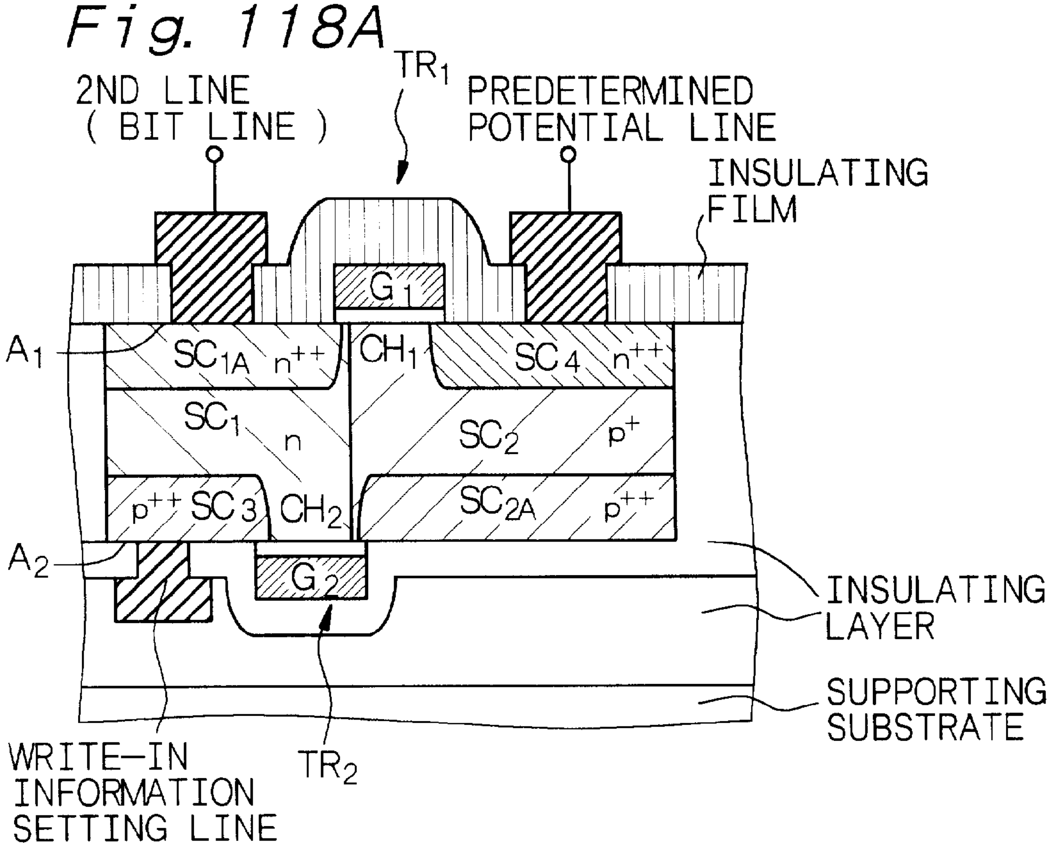
FIGS. 118A and 118B are schematic partial cross-sectional views of modifications of the semiconductor memory cell in Example 15.
Figure 118B:
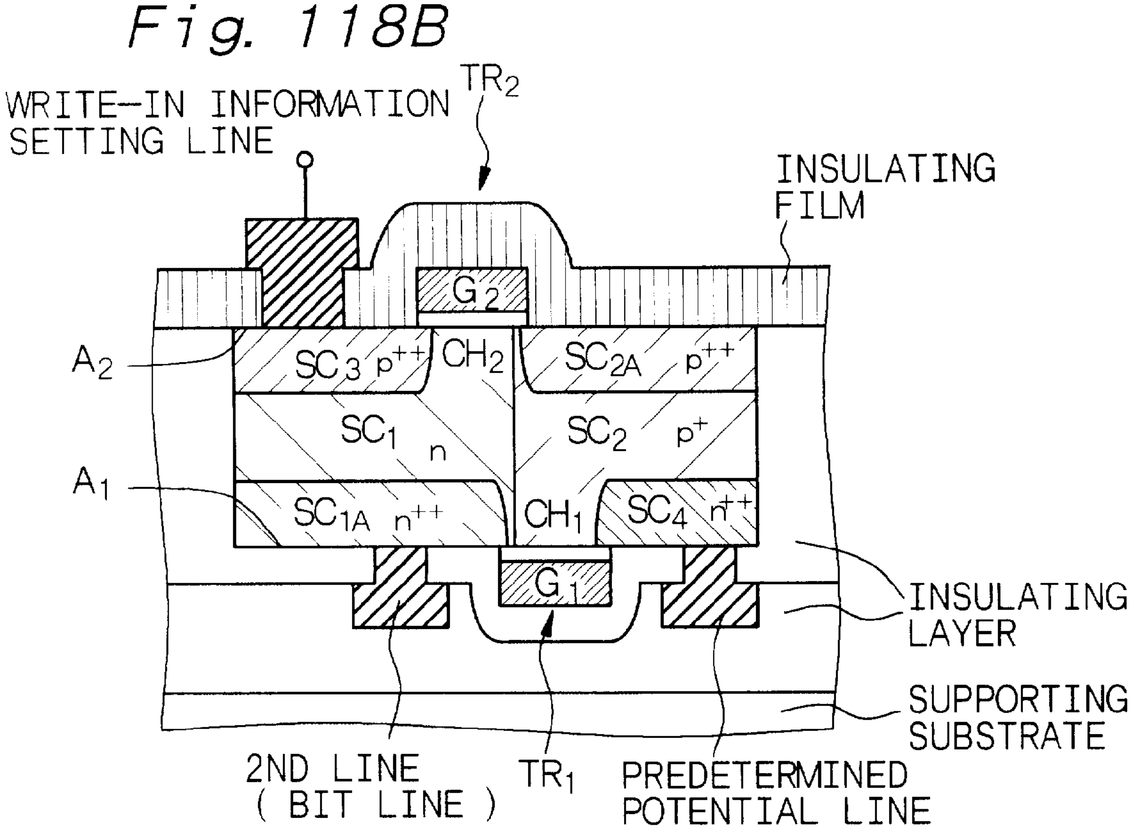

In the semiconductor memory cell explained in Example 15, a region $SC_{1A}$ containing an impurity of the first conductivity type (for example, $n^{++}$-type) at a high concentration can be substituted for the surface region, including the first main surface, of the first region constituting the other source/drain region of the first transistor $TR_1$, and a region $SC_{2A}$ containing an impurity of the second conductivity type ($p^{++}$-type, for example) at a high concentration can be substituted for the surface region, including the second main surface, of the second region constituting the other source/drain region of the second transistor $TR_2$. Such modified examples concerning the semiconductor memory cells shown in FIGS. 110A and 111A are shown in FIGS. 118A and 118B, respectively.

Figure 119A:
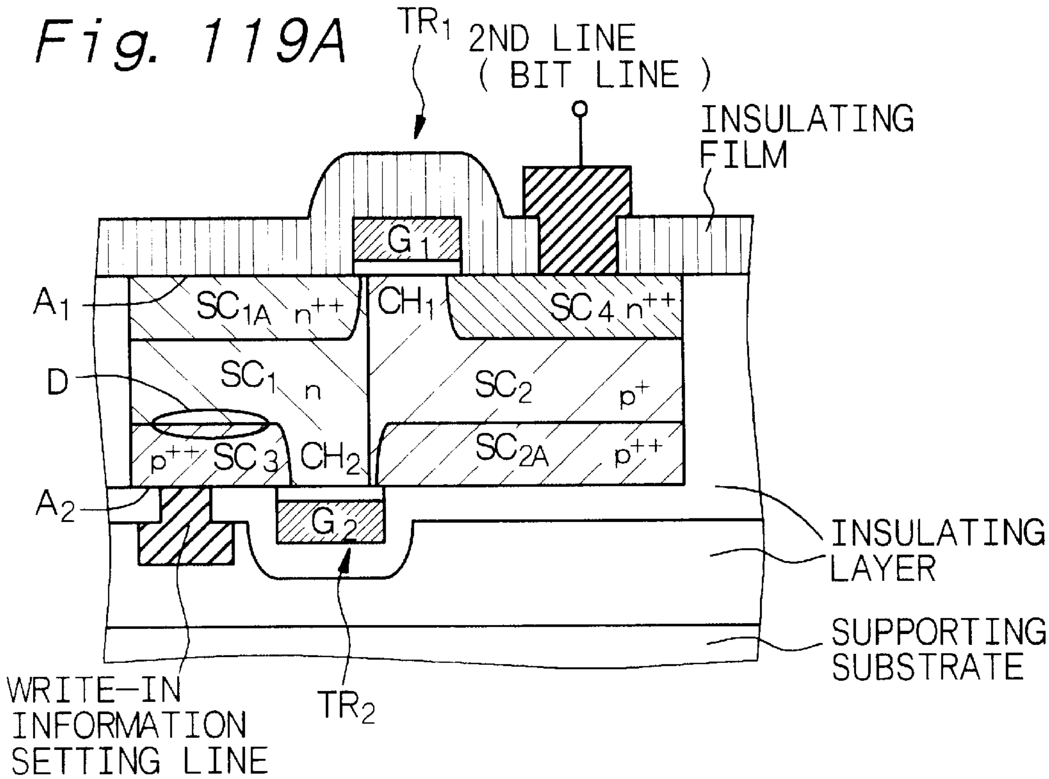
Figure 119B:
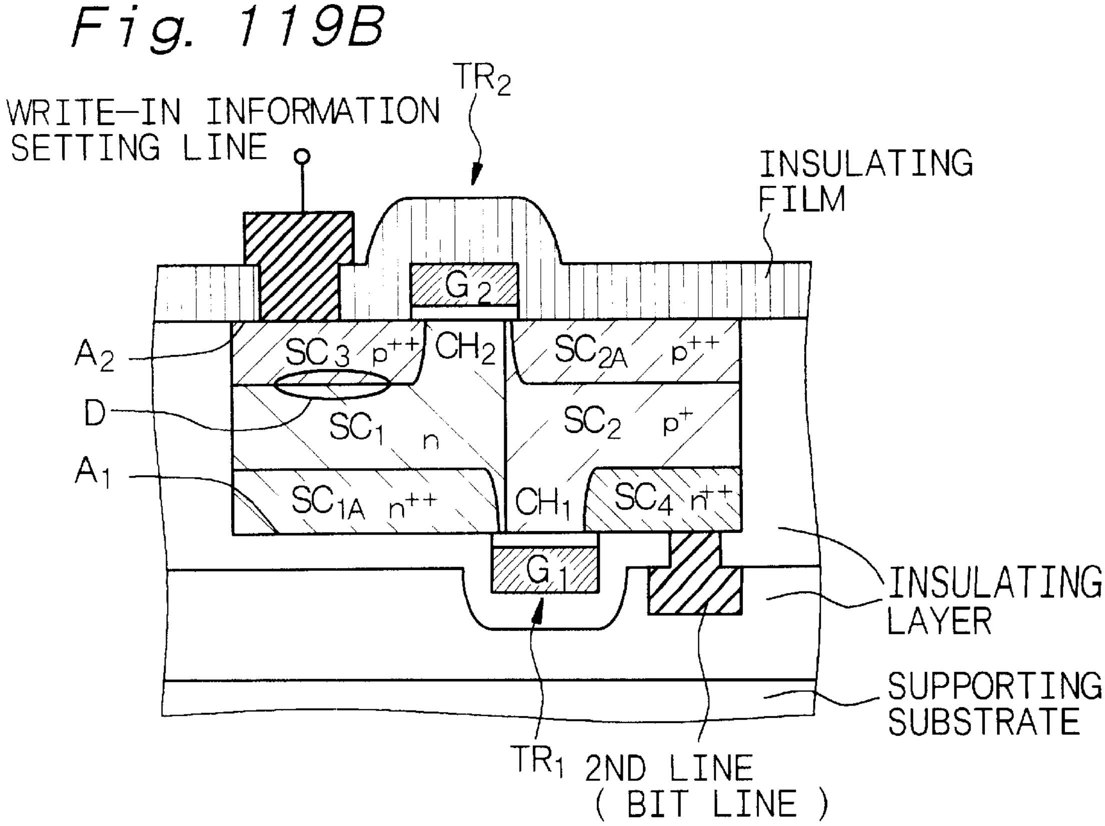

Further, with regard to the semiconductor memory cell explained in Example 16, a region $SC_{1A}$ containing an impurity of the first conductivity type (for example, $n^{++}$-type) at a high concentration can be substituted for the surface region, including the first main surface, of the first region constituting the other source/drain region of the first transistor $TR_1$, and a region $SC_{2A}$ containing an impurity of the second conductivity type (for example, $p^{++}$-type) at a high concentration can be substituted for the surface region, including the second main surface, of the second region constituting the other source/drain region of the second transistor $TR_2$. Such modified examples concerning the semiconductor memory cells shown in FIGS. 112A and 113A are shown in FIGS. 119A and 119B, respectively.

Figure 115A:
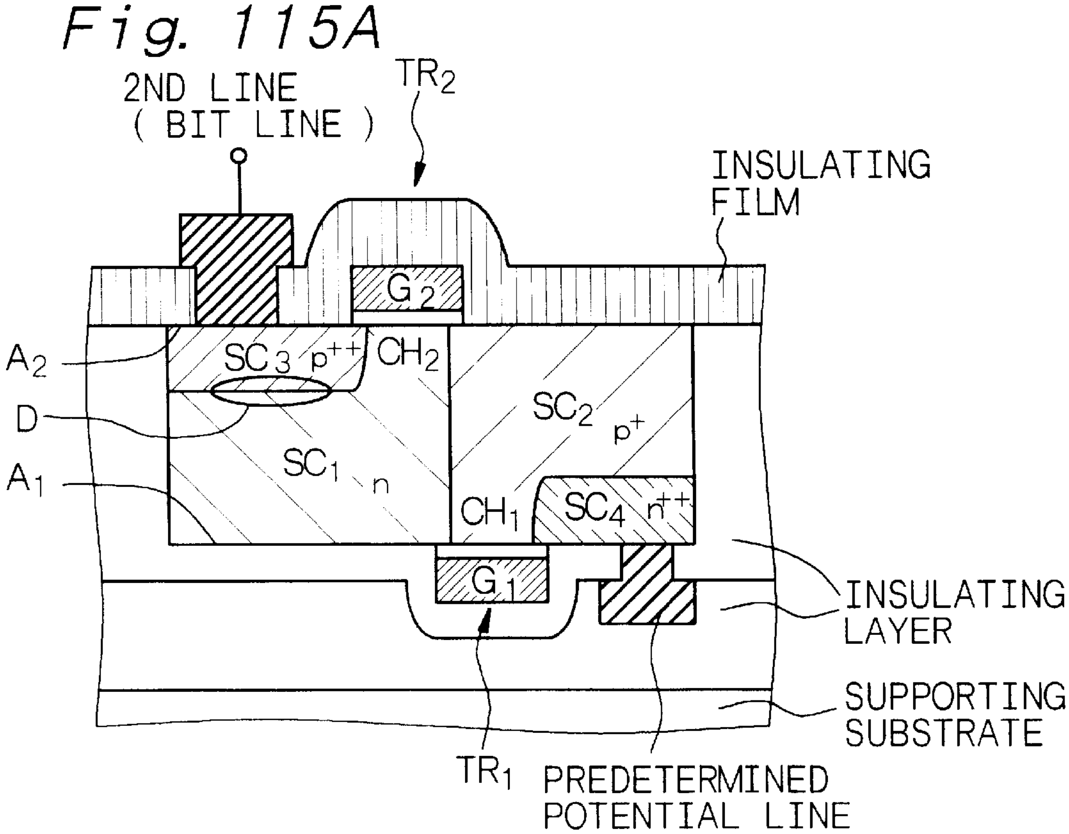
FIGS. 115A and 115B are schematic partial cross-sectional views of modifications of the semiconductor memory cell in Example 17.
Figure 115B:
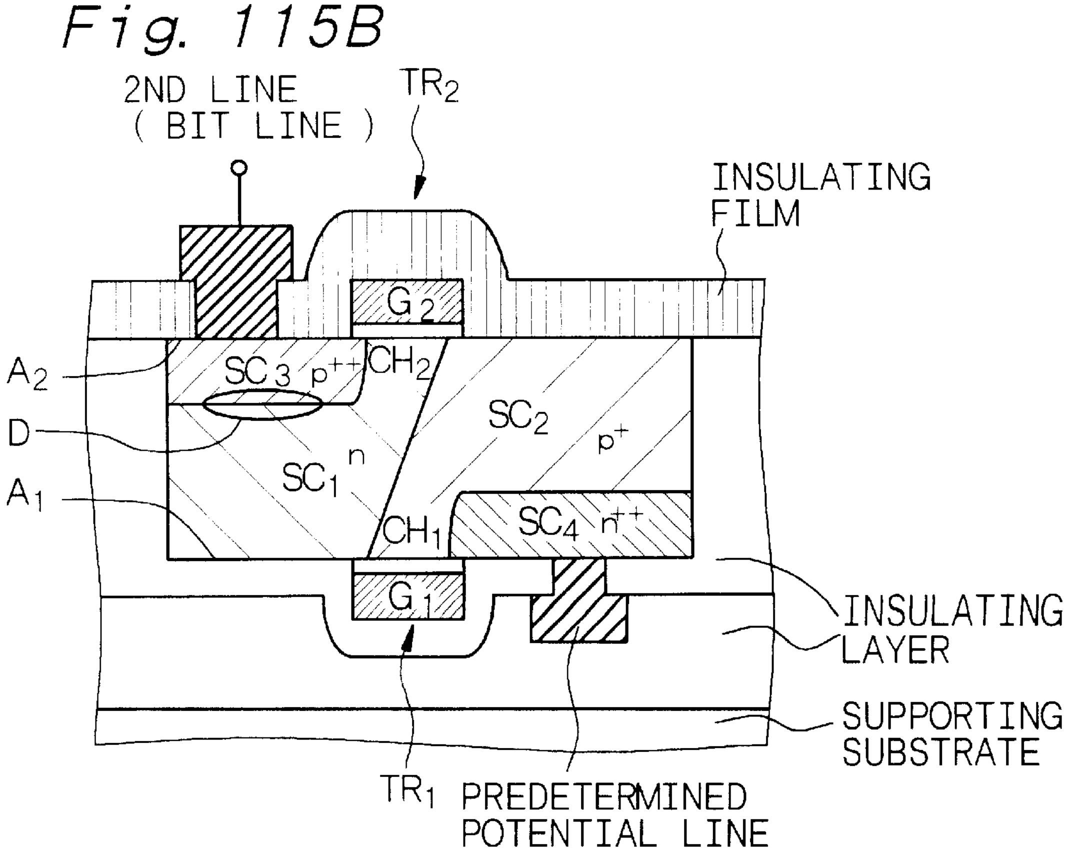
Figure 120A:
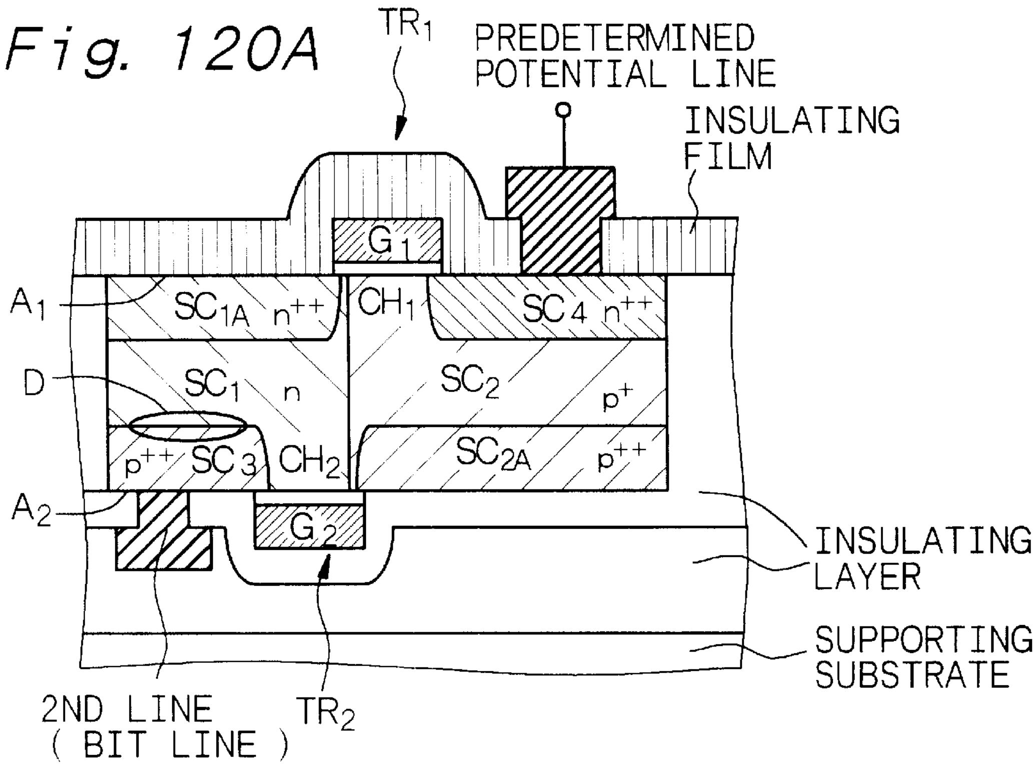
Figure 120B:
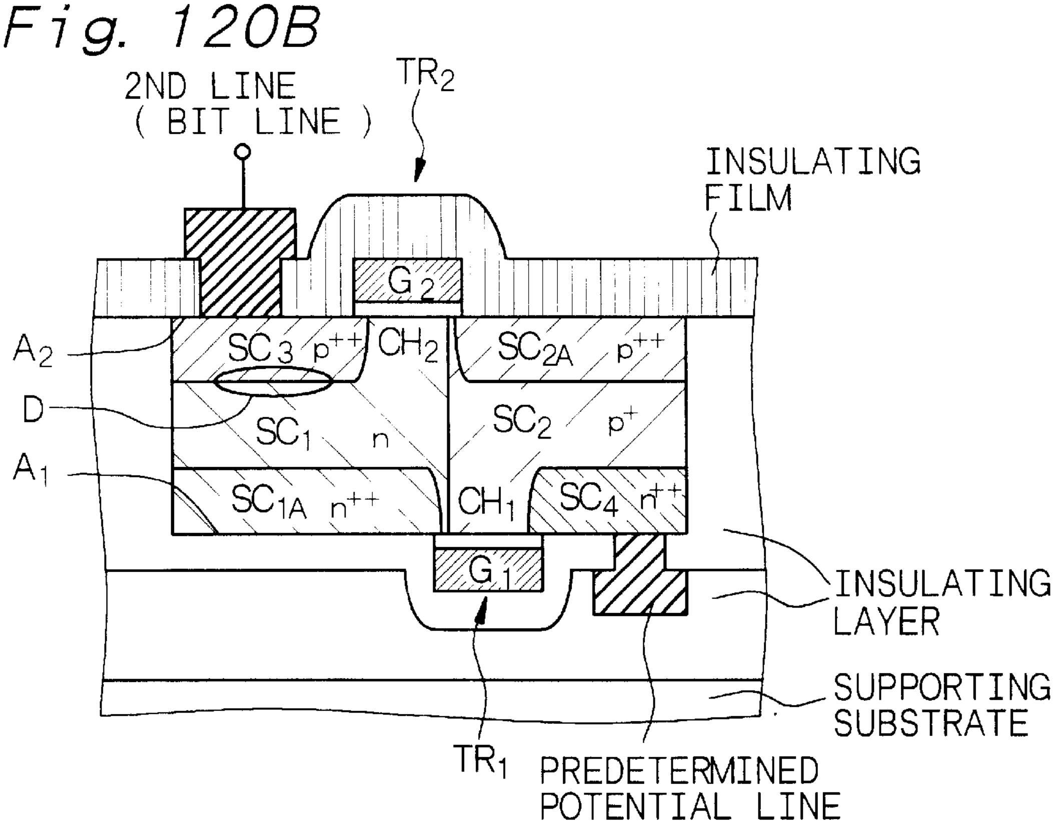

In the semiconductor memory cell explained in Example 17, a region $SC_{1A}$ containing an impurity of the first conductivity type (for example, $n^{++}$-type) at a high concentration can be substituted for the surface region, including the first main surface, of the first region constituting the other source/drain region of the first transistor $TR_1$, and a region $SC_{2A}$ containing an impurity of the second conductivity type (for example, $p^{++}$-type) at a high concentration can be substituted for the surface region, including the second main surface, of the second region constituting the other source/drain region of the second transistor $TR_2$. Such modified examples concerning the semiconductor memory cells shown in FIGS. 114A and 115A are shown in FIGS. 120A and 120B, respectively.

Figure 99:
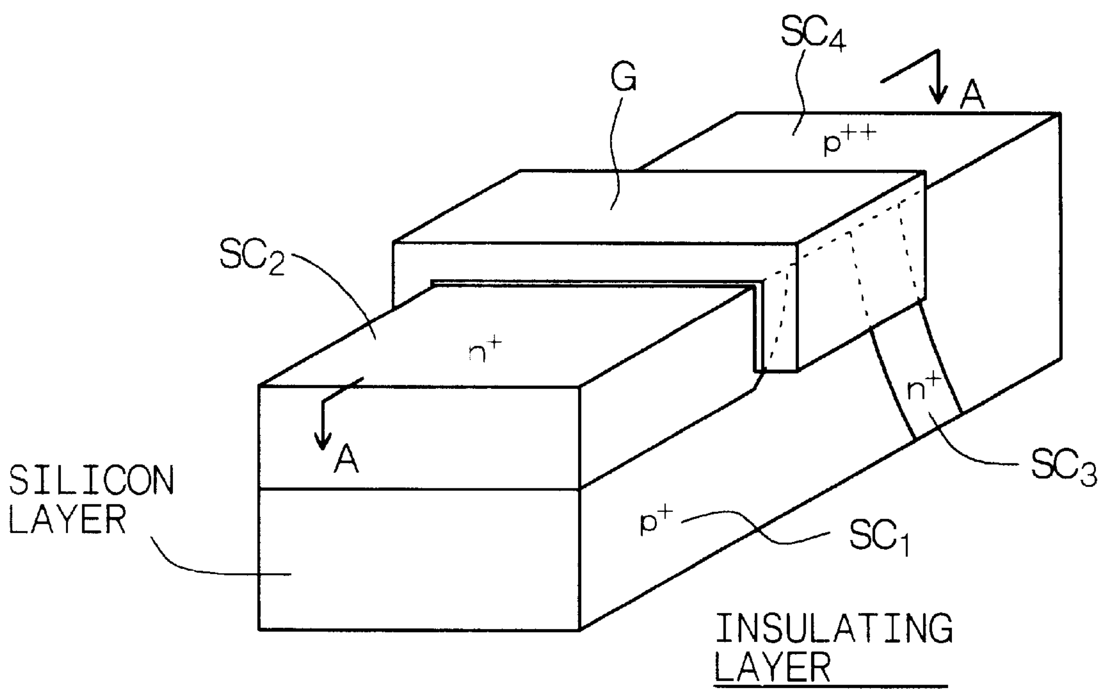
FIG. 99 shows a schematic perspective view of a modification of the semiconductor memory cell explained in Example 10.

The semiconductor memory cell according to any one of the tenth to thirteenth aspects of the present invention can be applied to a semiconductor memory cell having a gate portion which surrounds a channel forming region. FIG. 99 shows a schematic perspective view of an example of the above semiconductor memory cell which has the same configuration as the semiconductor memory cell of Example 10 shown in FIG. 83B except a gate portion which surrounds a channel forming region. In this type of semiconductor memory cell, the first region $SC_1$, second region $SC_2$, third region $SC_3$ and fourth region $SC_4$ are formed in a semi-conductive layer shaped nearly in a rectangular parallelepiped and projected from an insulating layer. The gate portion G not only covers the top surface of the semi-conductive layer shaped in a rectangular parallelepiped but also extends on the side plane thereof, thus providing a structure in which a U-shaped gate portion G surrounds the channel forming region. The arrangement of these regions obtained by cutting these regions with a plane including the line A—A indicated by arrows in FIG. 99 is the same as that shown in FIG. 83B. It should be noted that FIG. 99 shows only the individual regions and the gate portion, while any wiring being omitted.

Figure 100A:
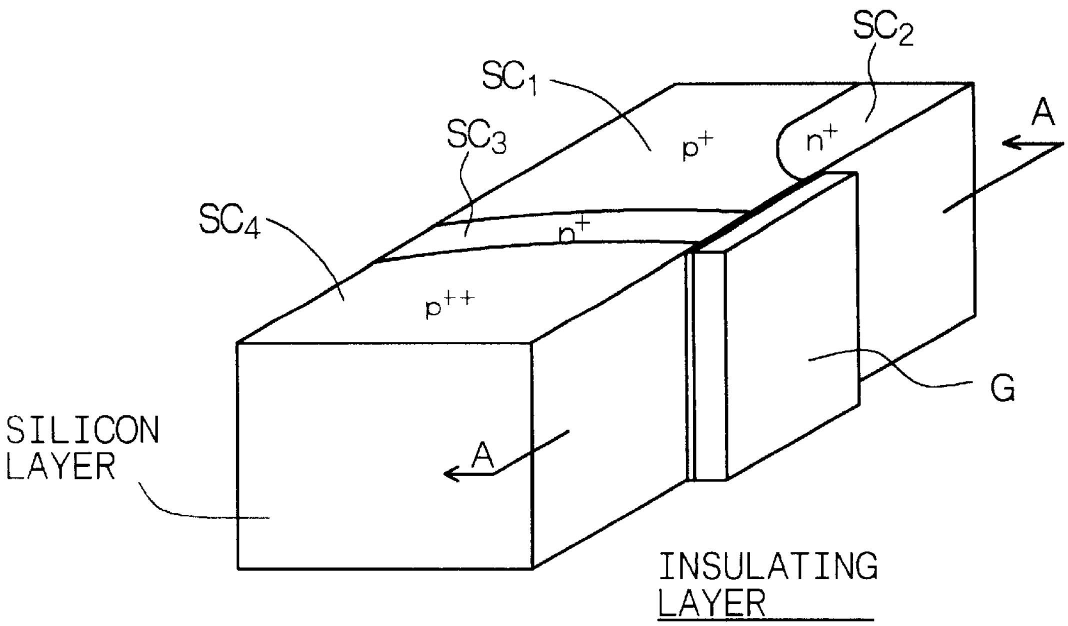
FIGS. 100A and 100B are schematic perspective views of modifications of the semiconductor memory cell explained in Example 10.
Figure 100B:
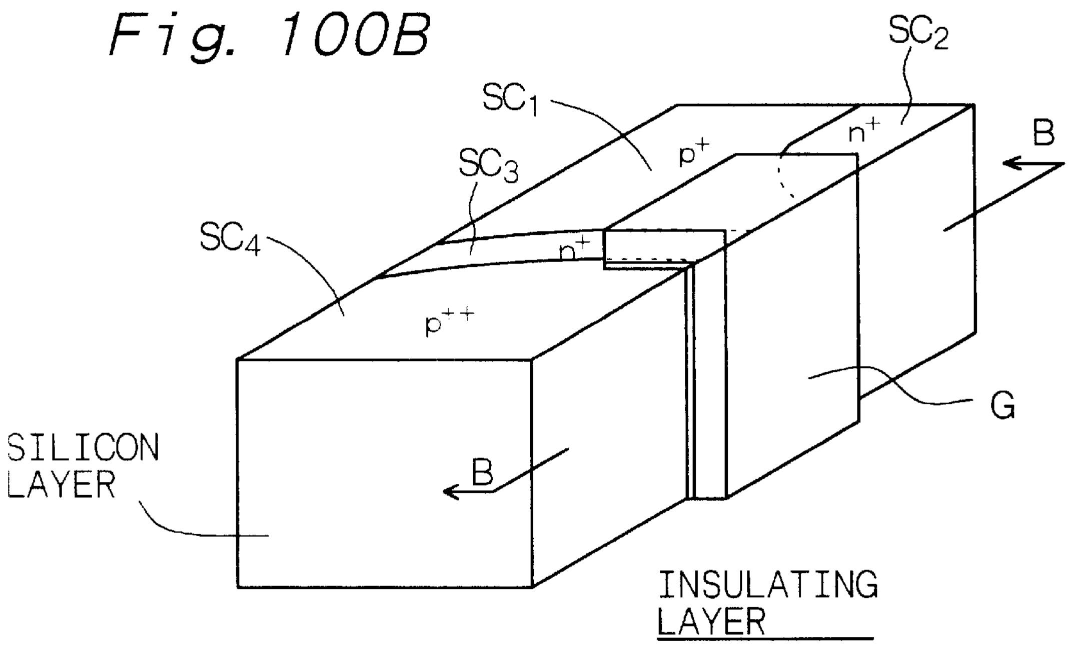

The semiconductor memory cell of the present invention can be applied to those of so-called side-gate-type. FIG. 100A shows a schematic perspective view of an example of the side-gate-type semiconductor memory cell which has the same configuration as the semiconductor memory cell of Example 10 shown in FIG. 83B except the position of a gate portion. In this type of semiconductor memory cell, the first region $SC_1$, second region $SC_2$, third region $SC_3$ and fourth region $SC_4$ are formed in a semi-conductive layer shaped nearly in a rectangular parallelepiped and projected from an insulating layer. The gate portion G is formed on part of the side plane of the semi-conductive layer shaped in a rectangular parallelepiped. Alternatively, as illustrated by a schematic perspective view of FIG. 100B, it is also permissible to form an L-shaped gate portion G extending from part of the side plane to part of the top surface of the semi-conductive layer shaped in a rectangular parallelepiped. The arrangements of these regions obtained by cutting these regions with a plane including the line A—A indicated by arrows in FIG. 100A and with a plane including the line B—B indicated by arrows in FIG. 100B are the same as that shown in FIG. 83B. It should be noted that FIGS. 100A and 100B show only the individual regions and the gate portions, while any wiring being omitted.

Figure 121A:
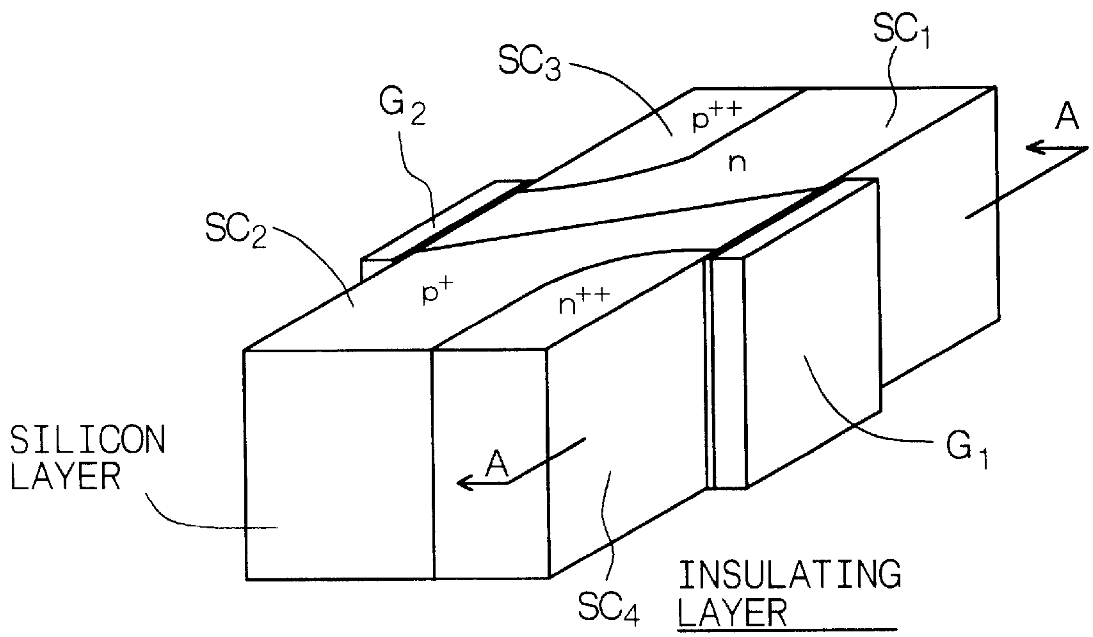
Figure 121B:
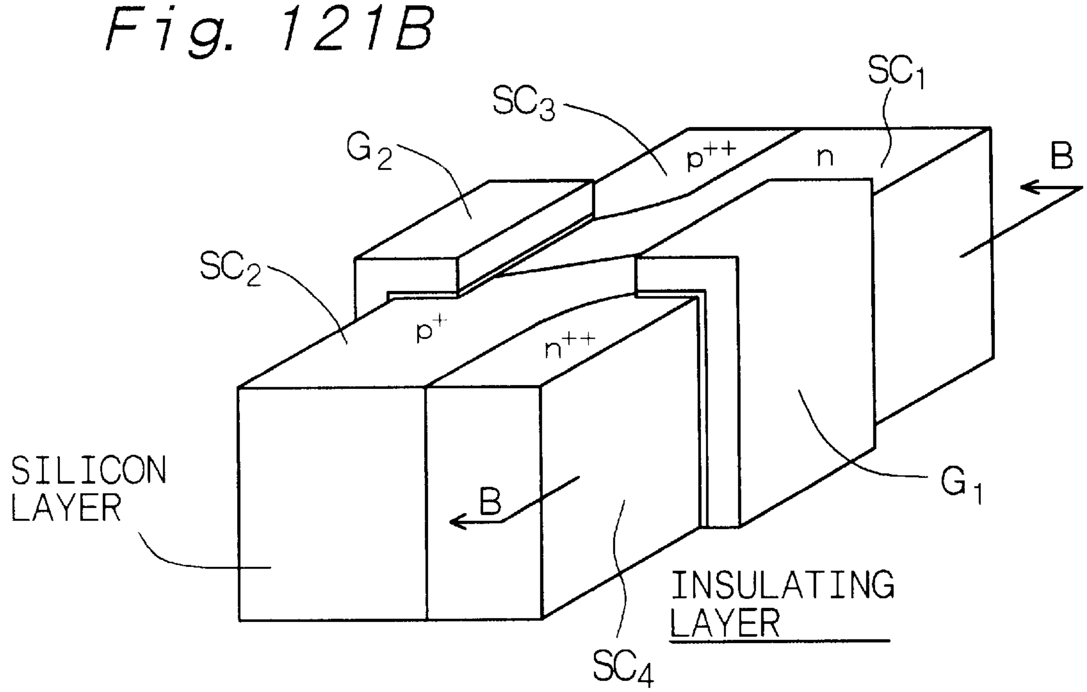

FIGS. 121A and 121B show schematic perspective views of examples of the side-gate-type semiconductor memory cell which have the same configuration as the semiconductor memory cell of Example 14 except the position of gate portions. In this type of semiconductor memory cell, as shown in FIG. 121A, the first region $SC_1$, second region $SC_2$, third region $SC_3$ and fourth region $SC_4$ are formed in a semi-conductive layer shaped nearly in a rectangular parallelepiped and projected from an insulating layer. Each of the gate portions $G_1$ and $G_2$ is formed on part of each side plane of the semi-conductive layer shaped in a rectangular parallelepiped. Alternatively, as illustrated by a schematic perspective view in FIG. 121B, it is also permissible to form L-shaped gate portions $G_1$ and $G_2$, each extending from part of the side plane to part of the top surface of the semi-conductive layer shaped in a rectangular parallelepiped. The arrangements of these regions obtained by cutting these regions with a plane including the line A—A indicated by arrows in FIG. 121A and with a plane including the line B—B indicated by arrows in FIG. 121B are the same as that shown in FIG. 103B. It should be noted that FIGS. 121A and 121B show only the individual regions and the gate portions, while any wiring being omitted.

Also the semiconductor memory cells according to any one of the eighteenth to twenty-first aspects of the present invention can be applied to those of side-gate-type. FIGS. 159A and 159B show schematic perspective views of examples of the side-gate-type semiconductor memory cell which have the same configuration as the semiconductor memory cell of Example 18 except the position of gate portions. In this type of semiconductor memory cell, as shown in FIG. 159A, the first region $SC_1$; second-A and second-B regions $SC_{2A}$, $SC_{2B}$; third-A and third-B regions $SC_{3A}$, $SC_{3B}$; and fourth-A and fourth-B regions $SC_{4A}$, $SC_{4A}$ are formed in a semi-conductive layer shaped nearly in a rectangular parallelepiped and projected from an insulating layer. Each of the gate portions $G_A$ and $G_B$ is formed on part of each side plane of the semi-conductive layer shaped in a rectangular parallelepiped. Alternatively, as illustrated by a schematic perspective view in FIG. 159B, it is also permissible to form L-shaped gate portions $G_A$ and $G_B$, each extending from part of each side plane to part of the top surface of the semi-conductive layer shaped in a rectangular parallelepiped. The arrangements of these regions obtained by cutting these regions with a plane including the line A—A indicated by arrows in FIG. 159A and with a plane including the line B—B indicated by arrows in FIG. 159B are the same as that shown in FIG. 123. It should be noted that FIGS. 159A and 159B show only the individual regions and the gate portions, while any wiring being omitted. These side-gate-type semiconductor memory cells shown in FIGS. 159A and 159B are also applicable to those explained in Examples 19 to 21.

Also the semiconductor memory cells according to any one of the twenty-second to thirtieth aspects of the present invention can be applied to those of side-gate-type. FIGS. 247A and 247B show schematic perspective views of examples of the side-gate-type semiconductor memory cell which have the same configuration as the semiconductor memory cell of Example 22 except the position of gate portions. In this type of semiconductor memory cell, as shown in FIG. 247A, the first region $SC_1$; second-A and second-B regions $SC_{2A}$, $SC_{2B}$; third-A and third-B regions $SC_{3A}$, $SC_{3B}$; and fourth-A and fourth-B regions $SC_{4A}$, $SC_{4A}$ are formed in a semi-conductive layer shaped nearly in a rectangular parallelepiped and projected from an insulating layer. Each of the gate portions $G_A$ and $G_B$ is formed on part of each side plane of the semi-conductive layer shaped in a rectangular parallelepiped. Alternatively, as illustrated by a schematic perspective view in FIG. 247B, it is also permissible to form L-shaped gate portions $G_A$ and $G_B$, each extending from part of each side plane to part of the top surface of the semi-conductive layer shaped in a rectangular parallelepiped. The arrangements of these regions obtained by cutting these regions with a plane including the line A—A indicated by arrows in FIG. 247A and with a plane including the line B—B indicated by arrows in FIG. 247B are the same as that shown in FIG. 161. It should be noted that FIGS. 247A and 247B show only the individual regions and the gate portions, while any wiring being omitted. These side-gate-type semiconductor memory cells shown in FIGS. 247A and 247B are also applicable to those explained in Examples 23 to 28.

The method of forming a Schottky junction or the method of forming conductive regions in surface regions of various regions shall not be limited to those explained in Examples. When, for example, the second memory-cell-selecting line is formed, for example, titanium silicide or TiN is used to form a barrier layer or a glue layer, while such a barrier or glue layer is also formed on the surface of, for example, the first region $SC_1$, whereby, for example, the sixth-A conductive region $SC_{6A}$ or the sixth-B conductive region $SC_{6B}$ in common with part of the second memory-cell-selecting line (more specifically, with part of the barrier layer or the glue layer) can be formed in the surface of the first region $SC_1$. Similarly, a conductive region can be formed in the surface region of each region.

In the semiconductor memory cell according to the present invention, the operation of the first transistor for read-out (or the first and second transistors for read-out) is defined by a potential or an electric charge (information) stored in the channel forming region thereof. Information as a current of a transistor, which is read out within a refresh time, is in no case dependent upon the capacitance (e.g., a capacitance of the gate portion+an added capacitance, etc.) even if it is additionally added. Therefore, the capacitance problem of a conventional semiconductor memory cell can be overcome, and even if an additional capacitor is added, a greatly large-capacitance capacitor like that in DRAM is no longer necessary.

And, the maximum area of the semiconductor memory cell is equal to, or smaller, than the area of conventional two transistors, or than the area of a conventional single transistor. In the semiconductor memory cell according to any one of the eighteenth to thirtieth aspects of the present invention, the maximum area of the semiconductor memory cell is equal to, or smaller than, the area of a conventional single transistor, and the two semiconductor memory devices are contained in such a limited area, which results in a larger integration density of the semiconductor memory cells.

Furthermore, since the junction-field-effect transistor is provided and is turned on and off in information read-out operation, a large margin is left for a current which flows between, for example, the second region and the third region or between, for example, the first region and the fourth region. As a result, the number of semiconductor memory cells to be connected to the bit line is scarcely limited, and the information holding time (retention time) of the semiconductor memory cell can be increased.

In the semiconductor memory cell according to the second, fourth or ninth aspect of the present invention, the area of the semiconductor memory cell can be further reduced, since the gate portion is extended so as to cover the edge of the surface of the fourth region and the fifth region is formed in a self-aligned manner.

In semiconductor memory cell according to the tenth or eleventh aspect of the present invention, the diode is constituted of the other source/drain region of the first transistor and one source/drain region of the second transistor; and in the semiconductor memory cell according to the twelfth or thirteenth aspect of the present invention, the diode is constituted of the third region and fourth region, or of the first region and the second region. Therefore, the diode per se occupies no area within the semiconductor memory cell, and since so-called read-out line is omissible, the semiconductor memory cell is realized within an area almost equivalent to that for a conventional single transistor.

In the semiconductor memory cell according to the sixteenth or seventeenth aspect of the present invention, the diode is constituted of the first region and third region, which allows the predetermined potential line to be omitted. It is also noted that the diode formed in any one of the nineteenth to twenty-first aspects and any one of the twenty-sixth to thirtieth aspects of the present invention can simplify the wiring configuration.

The process of each of the semiconductor memory cells according to the present invention is compatible with the MOS logic circuit formation process. Therefore, the area of one transistor is nearly sufficient for forming one semiconductor memory cell in some Examples, and a DRAM function can be integrated into an MOS logic circuit with a slight increase in the number of steps.

What is claimed is:

1. A semiconductor memory cell comprising a first transistor of a first conductivity type for read-out, a second transistor of a second conductivity type for write-in and a junction-field-effect transistor of the first conductivity type for current control, said semiconductor memory cell having;

(1) a first semi-conductive region of the first conductivity type, (2) a second semi-conductive or conductive region formed in a surface region of the first region, said second region forming a rectifier junction together with the first region, (3) a third semi-conductive region of the second conductivity type formed in a surface region of the first region and spaced from the second region, (4) a fourth semi-conductive region of the first conductivity type formed in a surface region of the third region, (5) a fifth semi-conductive or conductive region formed in a surface region of the fourth region, said fifth region forming a rectifier junction together with the fourth region, and (6) a gate portion shared by the first transistor and the second transistor, and formed on a barrier layer so as to bridge the first region and the fourth region and so as to bridge the second region and the third region, wherein;

(A-1) one source/drain region of the first transistor is constituted of the surface region of the fourth region, (A-2) the other source/drain region of the first transistor is constituted of the surface region of the first region sandwiched by the second region and the third region, (A-3) a channel forming region of the first transistor is constituted of the surface region of the third region sandwiched by the surface region of the first region and the surface region of the fourth region, (B-1) one source/drain region of the second transistor is constituted of the second region, (B-2) the other source/drain region of the second transistor is constituted of the surface region of the third region constituting the channel forming region of the first transistor, (B-3) a channel forming region of the second transistor is constituted of the surface region of the first region constituting the other source/drain region of the first transistor, (C-1) gate regions of the junction-field-effect transistor are constituted of the fifth region and a portion of the third region facing the fifth region, (C-2) a channel region of the junction-field-effect transistor is constituted of part of the fourth region sandwiched by the fifth region and said portion of the third region, (C-3) one source/drain region of the junction-field-effect transistor is constituted of a portion of the fourth region extending from one end of the channel region of the junction-field-effect transistor and constituting one source/drain region of the first transistor, (C-4) the other source/drain region of the junction-field-effect transistor is constituted of a portion of the fourth region extending from the other end of the channel region of the junction-field-effect transistor, (D) the gate portion is connected to a first memory-cell-selecting line, (E) a diode is formed between the first region and the second region, and the first region is connected to a write-in information setting line through the diode, (F) the second region is connected to the write-in information setting line, (G) the portion of the fourth region constituting the other source/drain region of the junction-field-effect transistor is connected to a second memory-cell-selecting line, and (H) the fifth region is connected to a predetermined potential line.

2. The semiconductor memory cell according to claim 1, wherein the semiconductor memory cell further has a sixth semi-conductive or conductive region formed in the surface region of the first region, said sixth region forming a rectifier junction together with the first region, and the diode is constituted of the sixth region and the first region, and one end of the diode is connected to the write-in information setting line.

3. The semiconductor memory cell according to claim 1, wherein the semiconductor memory cell further has a sixth semi-conductive or conductive region formed in the surface region of the first region, said sixth region forming a rectifier junction together with the first region, said rectifier junction between the sixth region and the first region being a majority carrier junction such as a Schottky junction or an ISO-type hetero junction, the diode is constituted of the sixth region and the first region, and the sixth region has a common region with part of the write-in information setting line.

4. The semiconductor memory cell according to claim 1, wherein the fifth region is connected to the third region, in place of being connected to the predetermined potential line.

5. The semiconductor memory cell according to claim 4, wherein the semiconductor memory cell further has a sixth semi-conductive or conductive region formed in the surface region of the first region, said sixth region forming a rectifier junction together with the first region, and the diode is constituted of the sixth region and the first region, and one end of the diode is connected to the write-in information setting line.

6. The semiconductor memory cell according to claim 4, wherein the semiconductor memory cell further has a sixth semi-conductive or conductive region formed in the surface region of the first region, said sixth region forming a rectifier junction together with the first region said rectifier junction between the sixth region and-the first region being a majority carrier junction such as a Schottky junction or an ISO-type hetero junction, the diode is constituted of the sixth region and the first region, and the sixth region has a common region with part of the write-in information setting line.

7. The semiconductor memory cell according to claim 1, wherein the semiconductor memory cell is formed in a well having the first conductivity type.

8. The semiconductor memory cell according to claim 1, wherein the semiconductor memory cell is formed on an insulator.

9. A semiconductor memory cell comprising a first transistor of a first conductivity type for read-out, a second transistor of a second conductivity type for write-in, a junction-field-effect transistor of the first conductivity type for current control and a third transistor of the second conductivity type for write-in, said semiconductor memory cell having;

(1) a first semi-conductive region of the first conductivity type, (2) a second semi-conductive or conductive region formed in a surface region of the first region, said second region forming a rectifier junction together with the first region, (3) a third semi-conductive region of the second conductivity type formed in a surface region of the first region and spaced from the second region, (4) a fourth semi-conductive region of the first conductivity type formed in a surface region of the third region, (5) a fifth semi-conductive or conductive region formed in a surface region of the fourth region, said fifth region forming a rectifier junction together with the fourth region, and (6) a gate portion shared by the first transistor, the second transistor and the third transistor, and formed on a barrier layer so as to bridge the first region and the fourth region, so as to bridge the second region and the third region and so as to bridge the third region and the fifth region, wherein;

(A-1) one source/drain region of the first transistor is constituted of the surface region of the fourth region, (A-2) the other source/drain region of the first transistor is constituted of the surface region of the first region sandwiched by the second region and the third region, (A-3) a channel forming region of the first transistor is constituted of the surface region of the third region sandwiched by the surface region of the first region and the surface region of the fourth region, (B-1) one source/drain region of the second transistor is constituted of the second region, (B-2) the other source/drain region of the second transistor is constituted of the surface region of the third region constituting the channel forming region of the first transistor, (B-3) a channel forming region of the second transistor is constituted of the surface region of the first region constituting the other source/drain region of the first transistor, (C-1) gate regions of the junction-field-effect transistor are constituted of the fifth region and a portion of the third region facing the fifth region, (C-2) a channel region of the junction-field-effect transistor is constituted of part of the fourth region sandwiched by the fifth region and said portion of the third region, (C-3) one source/drain region of the junction-field-effect transistor is constituted of a portion of the fourth region extending from one end of the channel region of the junction-field-effect transistor and constituting one source/drain region of the first transistor, (C-4) the other source/drain region of the junction-field-effect transistor is constituted of a portion of the fourth region extending from the other end of the channel region of the junction-field-effect transistor, (D-1) one source/drain region of the third transistor is constituted of the surface region of the third region constituting the channel forming region of the first transistor, (D-2) the other source/drain region of the third transistor is constituted of the fifth region, (D-3) a channel forming region of the third transistor is constituted of the surface region of the fourth region functioning as one source/drain region of the first transistor, (E) the gate portion is connected to a first memory-cell-selecting line, (F) a diode is formed between the first region and the second region, and the first region is connected to a write-in information setting line through the diode, (G) the second region is connected to the write-in information setting line, and (H) the portion of the fourth region constituting the other source/drain region of the junction-field-effect transistor is connected to a second memory-cell-selecting line.

10. The semiconductor memory cell according to claim 9, wherein the semiconductor memory cell further has a sixth semi-conductive or conductive region formed in the surface region of the first region, said sixth region forming a rectifier junction together with the first region, and the diode is constituted of the sixth region and the first region, and one end of the diode is connected to the write-in information setting line.

11. The semiconductor memory cell according to claim 9, wherein the semiconductor memory cell further has a sixth semi-conductive or conductive region formed in the surface region of the first region, said sixth region forming a rectifier junction together with the first region, said rectifier junction between the sixth region and the first region being a majority carrier junction such as a Schottky junction or an ISO-type hetero junction, the diode is constituted of the sixth region and the first region, and the sixth region has a common region with part of the write-in information setting line.

12. The semiconductor memory cell according to claim 9, wherein the semiconductor memory cell is formed in a well having the first conductivity type.

13. The semiconductor memory cell according to claim 9, wherein the semiconductor memory cell is formed on an insulator.

14. A semiconductor memory cell comprising a first transistor of a first conductivity type for read-out, a second transistor of a second conductivity type for write-in and a junction-field-effect transistor of the first conductivity type for current control, said semiconductor memory cell having;

(1) a first semi-conductive region of the first conductivity type, (2) a second semi-conductive or conductive region formed in a surface region of the first region, said second region forming a rectifier junction together with the first region, (3) a third semi-conductive region of the second conductivity type formed in a surface region of the first region and spaced from the second region, (4) a fourth semi-conductive region of the first conductivity type formed in a surface region of the third region, (5) a fifth semi-conductive or conductive region formed in a surface region of the fourth region, said fifth region forming a rectifier junction together with the fourth region, and (6) a gate portion shared by the first transistor and the second transistor, and formed on a barrier layer so as to bridge the first region and the fourth region and so as to bridge the second region and the third region, wherein;

(A-1) one source/drain region of the first transistor is constituted of the surface region of the fourth region, (A-2) the other source/drain region of the first transistor is constituted of the surface region of the first region sandwiched by the second region and the third region, (A-3) a channel forming region of the first transistor is constituted of the surface region of the third region sandwiched by the surface region of the first region and the surface region of the fourth region, (B-1) one source/drain region of the second transistor is constituted of the second region, (B-2) the other source/drain region of the second transistor is constituted of the surface region of the third region constituting the channel forming region of the first transistor, (B-3) a channel forming region of the second transistor is constituted of the surface region of the first region constituting the other source/drain region of the first transistor, (C-1) gate regions of the junction-field-effect transistor are constituted of the fifth region and a portion of the third region facing the fifth region, (C-2) a channel region of the junction-field-effect transistor is constituted of part of the fourth region sandwiched by the fifth region and said portion of the third region, (C-3) one source/drain region of the junction-field-effect transistor is constituted of a portion of the fourth region extending from one end of the channel region of the junction-field-effect transistor and constituting one source/drain region of the first transistor, (C-4) the other source/drain region of the junction-field-effect transistor is constituted of a portion of the fourth region extending from the other end of the channel region of the junction-field-effect transistor, (D) the gate portion is connected to a first memory-cell-selecting line, (E) a diode is formed between the first region and the second region, and the first region is connected to a write-in information setting line through the diode, (F) the second region and the fifth region are connected to the write-in information setting line, and (G) the portion of the fourth region constituting the other source/drain region of the junction-field-effect transistor is connected to a predetermined potential line.

15. The semiconductor memory cell according to claim 14, wherein the semiconductor memory cell further has a sixth semi-conductive or conductive region formed in the surface region of the first region, said sixth region forming a rectifier junction together with the first region, and the diode is constituted of the sixth region and the first region, and one end of the diode is connected to the write-in information setting line.

16. The semiconductor memory cell according to claim 14, wherein the semiconductor memory cell further has a sixth semi-conductive or conductive region formed in the surface region of the first region, said sixth region forming a rectifier junction together with the first region, said rectifier junction between the sixth region and the first region being a majority carrier junction such as a Schottky junction or an ISO-type hetero junction, the diode is constituted of the sixth region and the first region, and the sixth region has a common region with part of the write-in information setting line.

17. The semiconductor memory cell according to claim 14, wherein the fifth region is connected to the third region, in place of being connected to the write-in information setting line.

18. The semiconductor memory cell according to claim 17, wherein the semiconductor memory cell further has a sixth semi-conductive or conductive region formed in the surface region of the first region, said sixth region forming a rectifier junction together with the first region, and the diode is constituted of the sixth region and the first region, and one end of the diode is connected to the write-in information setting line.

19. The semiconductor memory cell according to claim 17, wherein the semiconductor memory cell further has a sixth semi-conductive or conductive region formed in the surface region of the first region, said sixth region forming a rectifier junction together with the first region, said rectifier junction between the sixth region and the first region being a majority carrier junction such as a Schottky junction or an ISO-type hetero junction, the diode is constituted of the sixth region and the first region, and the sixth region has a common region with part of the write-in information setting line.

20. The semiconductor memory cell according to claim 14, wherein the semiconductor memory cell is formed in a well having the first conductivity type.

21. The semiconductor memory cell according to claim 14, wherein the semiconductor memory cell is formed on an insulator.

22. A semiconductor memory cell comprising a first transistor of a first conductivity type for read-out, a second transistor of a second conductivity type for write-in, a junction-field-effect transistor of the first conductivity type for current control and a third transistor of the second conductivity type for write-in, said semiconductor memory cell having;

(1) a first semi-conductive region of the first conductivity type, (2) a second semi-conductive or conductive region formed in a surface region of the first region, said second region forming a rectifier junction together with the first region, (3) a third semi-conductive region of the second conductivity type formed in a surface region of the first region and spaced from the second region, (4) a fourth semi-conductive region of the first conductivity type formed in a surface region of the third region, (5) a fifth semi-conductive or conductive region formed in a surface region of the fourth region, said fifth region forming a rectifier junction together with the fourth region, and (6) a gate portion shared by the first transistor, the second transistor and the third transistor, and formed on a barrier layer so as to bridge the first region and the fourth region, so as to bridge the second region and the third region and so as to bridge the third region and the fifth region, wherein;

(A-1) one source/drain region of the first transistor is constituted of the surface region of the fourth region, (A-2) the other source/drain region of the first transistor is constituted of the surface region of the first region sandwiched by the second region and the third region, (A-3) a channel forming region of the first transistor is constituted of the surface region of the third region sandwiched by the surface region of the first region and the surface region of the fourth region, (B-1) one source/drain region of the second transistor is constituted of the second region, (B-2) the other source/drain region of the second transistor is constituted of the surface region of the third region constituting the channel forming region of the first transistor, (B-3) a channel forming region of the second transistor is constituted of the surface region of the first region constituting the other source/drain region of the first transistor, (C-1) gate regions of the junction-field-effect transistor are constituted of the fifth region and a portion of the third region facing the fifth region, (C-2) a channel region of the junction-field-effect transistor is constituted of part of the fourth region sandwiched by the fifth region and the portion of the third region, (C-3) one source/drain region of the junction-field-effect transistor is constituted of a portion of the fourth region extending from one end of the channel region of the junction-field-effect transistor and constituting one source/drain region of the first transistor, (C-4) the other source/drain region of the junction-field-effect transistor is constituted of a portion of the fourth region extending from the other end of the channel region of the junction-field-effect transistor, (D-1) one source/drain region of the third transistor is constituted of the surface region of the third region constituting the channel forming region of the first transistor, (D-2) the other source/drain region of the third transistor is constituted of the fifth region, (D-3) a channel forming region of the third transistor is constituted of the surface region of the fourth region functioning as one source/drain region of the first transistor, (E) the gate portion is connected to a first memory-cell-selecting line, (F) a diode is formed between the first region and the second region, and the first region is connected to a write-in information setting line through the diode, (G) the second region is connected to the write-in information setting line, and (H) the portion of the fourth region constituting the other source/drain region of the junction-field-effect transistor is connected to a predetermined potential line.

23. The semiconductor memory cell according to claim 22, wherein the semiconductor memory cell further has a sixth semi-conductive or conductive region formed in the surface region of the first region, said sixth region forming a rectifier junction together with the first region, and the diode is constituted of the sixth region and the first region, and one end of the diode is connected to the write-in information setting line.

24. The semiconductor memory cell according to claim 22, wherein the semiconductor memory cell further has a sixth semi-conductive or conductive region formed in the surface region of the first region, said sixth region forming a rectifier junction together with the first region, said rectifier junction between the sixth region and the first region being a majority carrier junction such as a Schottky junction or an ISO-type hetero junction, the diode is constituted of the sixth region and the first region, and the sixth region has a common region with part of the write-in information setting line.

25. The semiconductor memory cell according to claim 22, wherein the semiconductor memory cell is formed in a well having the first conductivity type.

26. The semiconductor memory cell according to claim 22, wherein the semiconductor memory cell is formed on an insulator.

27. A method for manufacturing a semiconductor memory cell comprising at least a first transistor of a first conductivity type for read-out, a second transistor of a second conductivity type for write-in and a junction-field-effect transistor of the first conductivity type for current control, said semiconductor memory cell having;

(1) a first semi-conductive region of the first conductivity type, (2) a second semi-conductive or conductive region formed in a surface region of the first region, said second region forming a rectifier junction together with the first region, (3) a third semi-conductive region of the second conductivity type formed in a surface region of the first region and spaced from the second region, (4) a fourth semi-conductive region of the first conductivity type formed in a surface region of the third region, (5) a fifth semi-conductive or conductive region formed in a surface region of the fourth region, said fifth region forming a rectifier junction together with the fourth region, and (6) a gate portion shared by the first transistor and the second transistor, and formed on a barrier layer at least so as to bridge the first region and the fourth region and so as to bridge the second region and the third region, the first transistor having;

(A-1) one source/drain region constituted of the surface region of the fourth region, (A-2) the other source/drain region constituted of the surface region of the first region sandwiched by the second region and the third region, and (A-3) a channel forming region constituted of the surface region of the third region sandwiched by the surface region of the first region and the surface region of the fourth region, the second transistor having;

(B-1) one source/drain region constituted of the second region, (B-2) the other source/drain region constituted of the surface region of the third region constituting the channel forming region of the first transistor, and (B-3) a channel forming region constituted of the surface region of the first region constituting the other source/drain region of the first transistor, and the junction-field-effect transistor having;

(C-1) gate regions constituted of the fifth region and a portion of the third region facing the fifth region, (C-2) a channel region constituted of part of the fourth region sandwiched by the fifth region and said portion of the third region, (C-3) one source/drain region constituted of a portion of the fourth region extending from one end of the channel region of the junction-field-effect transistor and constituting one source/drain region of the first transistor, (C-4) the other source/drain region constituted of a portion of the fourth region extending from the other end of the channel region of the junction-field-effect transistor, said method comprising the steps of;

forming the barrier layer at least on the surfaces of the first region and the third region, and then, forming the gate portion on the barrier layer, and forming the third region, the fourth region and the fifth region by ion implantation in an arbitrary order so as to optimize a distance between the facing gate regions of the junction-field-effect transistor and so as to optimize impurity concentrations of the facing gate regions and the channel region of the junction-field-effect transistor.

28. A semiconductor memory cell provided with a semi-conductive layer having a first main surface and a second main surface opposed to the first main surface, said semi-conductor memory cell comprising a first transistor of a first conductivity type for read-out, a second transistor of a second conductivity type for write-in and a junction-field-effect transistor of the first conductivity type for current control, and having;

(1) a first semi-conductive region of the first conductivity type, formed through the semi-conductive layer from the first main surface to the second main surface, (2) a second semi-conductive region of the second conductivity type, formed through the semi-conductive layer from the first main surface to the second main surface and being in contact with the first region, (3) a third semi-conductive or conductive region formed in a surface region, including the second main surface, of the first region and spaced from the second region, said third region forming a rectifier junction together with the first region, (4) a fourth semi-conductive or conductive region formed in a surface region, including the first main surface, of the second region and spaced from the first region, said fourth region forming a rectifier junction together with the second region, (5) a fifth semi-conductive or conductive region formed in a surface region, including the first main surface, of the first region and spaced from the second region, said fifth region forming a rectifier junction together with the first region, (6) a gate portion of the first transistor formed on a barrier layer formed on the first main surface so as to bridge the first region and the fourth region, and (7) a gate portion of the second transistor formed on a barrier layer formed on the second main surface so as to bridge the second region and the third region, wherein;

(A-1) one source/drain region of the first transistor is constituted of a surface region, including the first main surface, of the first region, (A-2) the other source/drain region of the first transistor is constituted of the fourth region, (A-3) a channel forming region of the first transistor is constituted of a surface region, including the first main surface, of the second region which surface region is sandwiched by the surface region, including the first main surface, of the first region and the fourth region, (B-1) one source/drain region of the second transistor is constituted of the third region, (B-2) the other source/drain region of the second transistor is constituted of a surface region, including the second main surface, of the second region, (B-3) a channel forming region of the second transistor is constituted of a surface region, including the second main surface, of the first region which surface region is sandwiched by the third region and the surface region, including the second main surface, of the second region, (C-1) gate regions of the junction-field-effect transistor are constituted of the fifth region and the third region facing the fifth region, (C-2) a channel region of the junction-field-effect transistor is constituted of a portion of the first region sandwiched by the fifth region and the third region, (C-3) one source/drain region of the junction-field-effect transistor is constituted of a portion of the first region extending from one end of the channel region of the junction-field-effect transistor and constituting one source/drain region of the first transistor and the channel forming region of the second transistor, (C-4) the other source/drain region of the junction-field-effect transistor is constituted of a portion of the first region extending from the other end of the channel region of the junction-field-effect transistor, (D) the gate portion of the first transistor and the gate portion of the second transistor are connected to a first memory-cell-selecting line, (E) the third region is connected to a write-in information setting line, (F) the fourth region is connected to a second memory-cell-selecting line, (G) the other source/drain region of the junction-field-effect transistor is connected to a predetermined potential line, and (H) the fifth region is connected to a second predetermined potential line.

29. The semiconductor memory cell according to claim 28, wherein the fifth region is connected to the write-in information setting line, in place of being connected to the second predetermined potential line.

30. The semiconductor memory cell according to claim 28, wherein the fourth region is connected to the predetermined potential line, in place of being connected to the second memory-cell-selecting line, and the other source/drain region of the junction-field-effect transistor is connected to the second memory-cell-selecting line, in place of being connected to the predetermined potential line.

31. The semiconductor memory cell according to claim 30, wherein the fifth region is connected to the write-in information setting line, in place of being connected to the second predetermined potential line.

32. A semiconductor memory cell provided with a semi-conductive layer having a first main surface and a second main surface opposed to the first main surface, said semi-conductor memory cell comprising a first transistor of a first conductivity type for read-out, a second transistor of a second conductivity type for write-in and a junction-field-effect transistor of the first conductivity type for current control, and having;

(1) a first semi-conductive region of the first conductivity type, formed through the semi-conductive layer from the first main surface to the second main surface, (2) a second semi-conductive region of the second conductivity type, formed through the semi-conductive layer from the first main surface to the second main surface and being in contact with the first region, (3) a third semi-conductive or conductive region formed in a surface region, including the second main surface, of the first region and spaced from the second region, said third region forming a rectifier junction together with the first region, (4) a fourth semi-conductive or conductive region formed in a surface region, including the first main surface, of the second region and spaced from the first region, said fourth region forming a rectifier junction together with the second region, (5) a fifth semi-conductive or conductive region formed in a surface region of the fourth region, said fifth region forming a rectifier junction together with the fourth region, (6) a gate portion of the first transistor formed on a barrier layer formed on the first main surface so as to bridge the first region and the fourth region, and (7) a gate portion of the second transistor formed on a barrier layer formed on the second main surface so as to bridge the second region and the third region, wherein;

(A-1) one source/drain region of the first transistor is constituted of a surface region, including the first main surface, of the first region, (A-2) the other source/drain region of the first transistor is constituted of the fourth region, (A-3) a channel forming region of the first transistor is constituted of a surface region, including the first main surface, of the second region which surface region is sandwiched by the surface region, including the first main surface, of the first region and the fourth region, (B-1) one source/drain region of the second transistor is constituted of the third region, (B-2) the other source/drain region of the second transistor is constituted of a surface region, including the second main surface, of the second region, (B-3) a channel forming region of the second transistor is constituted of a surface region, including the second main surface, of the first region which surface region is sandwiched by the third region and the surface region, including the second main surface, of the second region, (C-1) gate regions of the junction-field-effect transistor are constituted of the fifth region and a portion of the second region facing the fifth region, (C-2) a channel region of the junction-field-effect transistor is constituted of a portion of the fourth region sandwiched by the fifth region and said portion of the second region, (C-3) one source/drain region of the junction-field-effect transistor is constituted of a portion of the fourth region extending from one end of the channel region of the junction-field-effect transistor and constituting the other source/drain region of the first transistor, (C-4) the other source/drain region of the junction-field-effect transistor is constituted of a portion of the fourth region extending from the other end of the channel region of the junction-field-effect transistor, (D) the gate portion of the first transistor and the gate portion of the second transistor are connected to a first memory-cell-selecting line, (E) the third region is connected to a write-in information setting line, (F) the first region is connected to a predetermined potential line, (G) the other source/drain region of the junction-field-effect transistor is connected to a second memory-cell-selecting line, and (H) the fifth region is connected to a second predetermined potential line.

33. The semiconductor memory cell according to claim 32, wherein the fifth region is connected to the second region, in place of being connected to the second predetermined potential line.

34. The semiconductor memory cell according to claim 32, wherein the other source/drain region of the junction-field-effect transistor is connected to the predetermined potential line, in place of being connected to the second memory-cell-selecting line, and the first region is connected to the second memory-cell-selecting line, in place of being connected to the predetermined potential line.

35. The semiconductor memory cell according to claim 34, wherein the fifth region is connected to the second region, in place of being connected to the second predetermined potential line.

36. A semiconductor memory cell provided with a semi-conductive layer having a first main surface and a second main surface opposed to the first main surface, said semi-conductor memory cell comprising a first transistor of a first conductivity type for read-out, a second transistor of a second conductivity type for write-in, a first junction-field-effect transistor of the first conductivity type for current control and a second junction-field-effect transistor of the first conductivity type for current control, and having;

(1) a first semi-conductive region of the first conductivity type, formed through the semi-conductive layer from the first main surface to the second main surface, (2) a second semi-conductive region of the second conductivity type, formed through the semi-conductive layer from the first main surface to the second main surface and being in contact with the first region, (3) a third semi-conductive or conductive region formed in a surface region, including the second main surface, of the first region and spaced from the second region, said third region forming a rectifier junction together with the first region, (4) a fourth semi-conductive or conductive region formed in a surface region, including the first main surface, of the second region and spaced from the first region, said fourth region forming a rectifier junction together with the second region, (5) a fifth semi-conductive or conductive region formed in a surface region of the fourth region, said fifth region forming a rectifier junction together with the fourth region, (6) a sixth semi-conductive or conductive region formed in a surface region, including the first main surface, of the first region and spaced from the second region, said sixth region forming a rectifier junction together with the first region, (7) a gate portion of the first transistor formed on a barrier layer formed on the first main surface so as to bridge the first region and the fourth region, and (8) a gate portion of the second transistor formed on a barrier layer formed on the second main surface so as to bridge the second region and the third region, wherein;

(A-1) one source/drain region of the first transistor is constituted of a surface region, including the first main surface, of the first region, (A-2) the other source/drain region of the first transistor is constituted of the fourth region, (A-3) a channel forming region of the first transistor is constituted of a surface region, including the first main surface, of the second region which surface region is sandwiched by the surface region, including the first main surface, of the first region and the fourth region, (B-1) one source/drain region of the second transistor is constituted of the third region, (B-2) the other source/drain region of the second transistor is constituted of a surface region, including the second main surface, of the second region, (B-3) a channel forming region of the second transistor is constituted of a surface region, including the second main surface, of the first region which surface region is sandwiched by the third region and the surface region, including the second main surface, of the second region, (C-1) gate regions of the first junction-field-effect transistor are constituted of the fifth region and a portion of the second region facing the fifth region, (C-2) a channel region of the first junction-field-effect transistor is constituted of a portion of the fourth region sandwiched by the fifth region and said portion of the second region, (C-3) one source/drain region of the first junction-field-effect transistor is constituted of a portion of the fourth region extending from one end of the channel region of the first junction-field-effect transistor and constituting the other source/drain region of the first transistor, (C-4) the other source/drain region of the first junction-field-effect transistor is constituted of a portion of the fourth region extending from the other end of the channel region of the first junction-field-effect transistor, (D-1) gate regions of the second junction-field-effect transistor are constituted of the sixth region and the third region, (D-2) a channel region of the second junction-field-effect transistor is constituted of a portion of the first region sandwiched by the sixth region and the third region, (D-3) one source/drain region of the second junction-field-effect transistor is constituted of a portion of the first region extending from one end of the channel region of the second junction-field-effect transistor and constituting one source/drain region of the first transistor and the channel forming region of the second transistor, (D-4) the other source/drain region of the second junction-field-effect transistor is constituted of a portion of the first region extending from the other end of the channel region of the second junction-field-effect transistor, (E) the gate portion of the first transistor and the gate portion of the second transistor are connected to a first memory-cell-selecting line, (F) the third region is connected to a write-in information setting line, (G) the other source/drain region of the second junction-field-effect transistor is connected to a predetermined potential line, (H) the other source/drain region of the first junction-field-effect transistor is connected to a second memory-cell-selecting line, and (I) the fifth region and the sixth region are connected to a second predetermined potential line.

37. The semiconductor memory cell according to claim 36, wherein the other source/drain region of the first junction-field-effect transistor is connected to the predetermined potential line, in place of being connected to the second memory-cell-selecting line, and the other source/drain region of the second junction-field-effect transistor is connected to the second memory-cell-selecting line, in place of being connected to the predetermined potential line.

38. The semiconductor memory cell according to claim 36, wherein the fifth region is connected to the second region, in place of being connected to the second predetermined potential line, and the sixth region is connected to the write-in information setting line, in place of being connected to the second predetermined potential line.

39. The semiconductor memory cell according to claim 38, wherein the other source/drain region of the first junction-field-effect transistor is connected to the predetermined potential line, in place of being connected to the second memory-cell-selecting line, and the other source/drain region of the second junction-field-effect transistor is connected to the second memory-cell-selecting line, in place of being connected to the predetermined potential line.

40. A semiconductor memory cell provided with a semi-conductive layer having a first main surface and a second main surface opposed to the first main surface, said semi-conductor memory cell comprising a first transistor of a first conductivity type for read-out, a second transistor of a second conductivity type for write-in, a junction-field-effect transistor of the first conductivity type for current control and a third transistor of the second conductivity type for write-in, and having;

(1) a first semi-conductive region of the first conductivity type, formed through the semi-conductive layer from the first main surface to the second main surface, (2) a second semi-conductive region of the second conductivity type, formed through the semi-conductive layer from the first main surface to the second main surface and being in contact with the first region, (3) a third semi-conductive or conductive region formed in a surface region, including the second main surface, of the first region and spaced from the second region, said third region forming a rectifier junction together with the first region, (4) a fourth semi-conductive or conductive region formed in a surface region, including the first main surface, of the second region and spaced from the first region, said fourth region forming a rectifier junction together with the second region, (5) a fifth semi-conductive or conductive region formed in a surface region of the fourth region, said fifth region forming a rectifier junction together with the fourth region, (6) a gate portion shared by the first transistor and the third transistor, and formed on a barrier layer formed on the first main surface so as to bridge the first region and the fourth region and so as to bridge the second region and the fifth region, and (7) a gate portion of the second transistor formed on a barrier layer formed on the second main surface so as to bridge the second region and the third region, wherein;

(A-1) one source/drain region of the first transistor is constituted of a surface region, including the first main surface, of the first region, (A-2) the other source/drain region of the first transistor is constituted of the fourth region, (A-3) a channel forming region of the first transistor is constituted of a surface region, including the first main surface, of the second region which surface region is sandwiched by the surface region, including the first main surface, of the first region and the fourth region, (B-1) one source/drain region of the second transistor is constituted of the third region, (B-2) the other source/drain region of the second transistor is constituted of a surface region, including the second main surface, of the second region, (B-3) a channel forming region of the second transistor is constituted of a surface region, including the second main surface, of the first region which surface region is sandwiched by the third region and the surface region, including the second main surface, of the second region, (C-1) gate regions of the junction-field-effect transistor are constituted of the fifth region and a portion of the second region facing the fifth region, (C-2) a channel region of the junction-field-effect transistor is constituted of a portion of the fourth region sandwiched by the fifth region and said portion of the second region, (C-3) one source/drain region of the junction-field-effect transistor is constituted of a portion of the fourth region extending from one end of the channel region of the junction-field-effect transistor and constituting the other source/drain region of the first transistor, (C-4) the other source/drain region of the junction-field-effect transistor is constituted of a portion of the fourth region extending from the other end of the channel region of the junction-field-effect transistor, (D-1) one source/drain region of the third transistor is constituted of the channel forming region of the first transistor, (D-2) the other source/drain region of the third transistor is constituted of the fifth region, (D-3) a channel forming region of the third transistor is constituted of the other source/drain region of the first transistor, (E) the gate portion shared by the first transistor and the third transistor and the gate portion of the second transistor are connected to a first memory-cell-selecting line, (F) the third region is connected to a write-in information setting line, (G) the first region is connected to a predetermined potential line, and (H) the other source/drain region of the junction-field-effect transistor is connected to a second memory-cell-selecting line.

41. The semiconductor memory cell according to claim 40, wherein the other source/drain region of the junction-field-effect transistor is connected to the predetermined potential line, in place of being connected to the second memory-cell-selecting line, and the first region is connected to the second memory-cell-selecting line, in place of being connected to the predetermined potential line.

42. A semiconductor memory cell provided with a semi-conductive layer having a first main surface and a second main surface opposed to the first main surface, said semi-conductor memory cell comprising a first transistor of a first conductivity type for read-out, a second transistor of a second conductivity type for write-in, a first junction-field-effect transistor of the first conductivity type for current control, a second junction-field-effect transistor of the first conductivity type for current control and a third transistor of the second conductivity type for write-in, and having;

(1) a first semi-conductive region of the first conductivity type, formed through the semi-conductive layer from the first main surface to the second main surface, (2) a second semi-conductive region of the second conductivity type, formed through the semi-conductive layer from the first main surface to the second main surface and being in contact with the first region, (3) a third semi-conductive or conductive region formed in a surface region, including the second main surface, of the first region and spaced from the second region, said third region forming a rectifier junction together with the first region, (4) a fourth semi-conductive or conductive region formed in a surface region, including the first main surface, of the second region and spaced from the first region, said fourth region forming a rectifier junction together with the second region, (5) a fifth semi-conductive or conductive region formed in a surface region of the fourth region, said fifth region forming a rectifier junction together with the fourth region, (6) a sixth semi-conductive or conductive region formed in a surface region, including the first main surface, of the first region and spaced from the second region, said sixth region forming a rectifier junction together with the first region, (7) a gate portion shared by the first transistor and the third transistor, and formed on a barrier layer formed on the first main surface so as to bridge the first region and the fourth region and so as to bridge the second region and the fifth region, and (8) a gate portion of the second transistor formed on a barrier layer formed on the second main surface so as to bridge the second region and the third region, wherein;

(A-1) one source/drain region of the first transistor is constituted of a surface region, including the first main surface, of the first region, (A-2) the other source/drain region of the first transistor is constituted of the fourth region, (A-3) a channel forming region of the first transistor is constituted of a surface region, including the first main surface, of the second region which surface region is sandwiched by the surface region, including the first main surface, of the first region and the fourth region, (B-1) one source/drain region of the second transistor is constituted of the third region, (B-2) the other source/drain region of the second transistor is constituted of a surface region, including the second main surface, of the second region, (B-3) a channel forming region of the second transistor is constituted of a surface region, including the second main surface, of the first region which surface region is sandwiched by the third region and the surface region, including the second main surface, of the second region, (C-1) gate regions of the first junction-field-effect transistor are constituted of the fifth region and a portion of the second region facing the fifth region, (C-2) a channel region of the first junction-field-effect transistor is constituted of a portion of the fourth region sandwiched by the fifth region and said portion of the second region, (C-3) one source/drain region of the first junction-field-effect transistor is constituted of a portion of the fourth region extending from one end of the channel region of the first junction-field-effect transistor and constituting the other source/drain region of the first transistor, (C-4) the other source/drain region of the first junction-field-effect transistor is constituted of a portion of the fourth region extending from the other end of the channel region of the first junction-field-effect transistor, (D-1) gate regions of the second junction-field-effect transistor are constituted of the sixth region and the third region, (D-2) a channel region of the second junction-field-effect transistor is constituted of a portion of the first region sandwiched by the sixth region and the third region, (D-3) one source/drain region of the second junction-field-effect transistor is constituted of a portion of the first region extending from one end of the channel region of the second junction-field-effect transistor and constituting one source/drain region of the first transistor and the channel forming region of the second transistor, (D-4) the other source/drain region of the second junction-field-effect transistor is constituted of a portion of the first region extending from the other end of the channel region of the second junction-field-effect transistor, (E-1) one source/drain region of the third transistor is constituted of the channel forming region of the first transistor, (E-2) the other source/drain region of the third transistor is constituted of the fifth region, (E-3) a channel forming region of the third transistor is constituted of the other source/drain region of the first transistor, (F) the gate portion shared by the first transistor and the third transistor and the gate portion of the second transistor are connected to a first memory-cell-selecting line, (G) the third region is connected to a write-in information setting line, (H) the other source/drain region of the second junction-field-effect transistor is connected to a predetermined potential line, (I) the other source/drain region of the first junction-field-effect transistor is connected to a second memory-cell-selecting line, and (J) the sixth region is connected to a second predetermined potential line.

43. The semiconductor memory cell according to claim 42, wherein the other source/drain region of the first junction-field-effect transistor is connected to the predetermined potential line, in place of being connected to the second memory-cell-selecting line, and the other source/drain region of the second junction-field-effect transistor is connected to the second memory-cell-selecting line, in place of being connected to the predetermined potential line.

44. The semiconductor memory cell according to claim 43, wherein the sixth region is connected to the write-in information setting line, in place of being connected to the second predetermined potential line.

45. The semiconductor memory cell according to claim 44, wherein the other source/drain region of the first junction-field-effect transistor is connected to the predetermined potential line, in place of being connected to the second memory-cell-selecting line, and the other source/drain region of the second junction-field-effect transistor is connected to the second memory-cell-selecting line, in place of being connected to the predetermined potential line.

46. A method for manufacturing a semiconductor memory cell provided with a semi-conductive layer having a first main surface and a second main surface opposed to the first main surface, said semiconductor memory cell comprising a first transistor of a first conductivity type for read-out, a second transistor of a second conductivity type for write-in and a junction-field-effect transistor of the first conductivity type for current control, and having;

(1) a first semi-conductive region of the first conductivity type, formed through the semi-conductive layer from the first main surface to the second main surface, (2) a second semi-conductive region of the second conductivity type, formed through the semi-conductive layer from the first main surface to the second main surface and being in contact with the first region, (3) a third semi-conductive or conductive region formed in a surface region, including the second main surface, of the first region and spaced from the second region, said third region forming a rectifier junction together with the first region, (4) a fourth semi-conductive or conductive region formed in a surface region, including the first main surface, of the second region and spaced from the first region, said fourth region forming a rectifier junction together with the second region, (5) a fifth semi-conductive or conductive region formed in a surface region, including the first main surface, of the first region and spaced from the second region, said fifth region forming a rectifier junction together with the first region, (6) a gate portion of the first transistor formed on a barrier layer formed on the first main surface so as to bridge the first region and the fourth region, and (7) a gate portion of the second transistor formed on a barrier layer formed on the second main surface so as to bridge the second region and the third region, the first transistor having;

(A-1) one source/drain region constituted of a surface region, including the first main surface, of the first region, (A-2) the other source/drain region constituted of the fourth region, and (A-3) a channel forming region constituted of a surface region, including the first main surface, of the second region which surface region is sandwiched by the surface region, including the first main surface, of the first region and the fourth region, the second transistor having;

(B-1) one source/drain region constituted of the third region, (B-2) the other source/drain region constituted of a surface region, including the second main surface, of the second region, and (B-3) a channel forming region constituted of a surface region, including the second main surface, of the first region which surface region is sandwiched by the third region and the surface region, including the second main surface, of the second region, and the junction-field-effect transistor having;

(C-1) gate regions constituted of the fifth region and the third region facing the fifth region, (C-2) a channel region constituted of a portion of the first region sandwiched by the fifth region and the third region, (C-3) one source/drain region constituted of a portion of the first region extending from one end of the channel region of the junction-field-effect transistor and constituting one source/drain region of the first transistor and the channel forming region of the second transistor, and (C-4) the other source/drain region constituted of a portion of the first region extending from the other end of the channel region of the junction-field-effect transistor, said method comprising the steps of;

forming the barrier layer on the first main surface and then, forming the gate portion of the first transistor on the barrier layer, and forming the barrier layer on the second main surface and then, forming the gate portion of the second transistor on the barrier layer, and forming the first region, the third region and the fifth region by ion implantation in an arbitrary order so as to optimize a distance between the facing gate regions of the junction-field-effect transistor and so as to optimize impurity concentrations of the facing gate regions and the channel region of the junction-field-effect transistor.

47. A method for manufacturing a semiconductor memory cell provided with a semi-conductive layer having a first main surface and a second main surface opposed to the first main surface, said semiconductor memory cell comprising at least a first transistor of a first conductivity type for read-out, a second transistor of a second conductivity type for write-in and a junction-field-effect transistor of the first conductivity type for current control, and having at least;

(1) a first semi-conductive region of the first conductivity type, formed through the semi-conductive layer from the first main surface to the second main surface, (2) a second semi-conductive region of the second conductivity type, formed through the semi-conductive layer from the first main surface to the second main surface and being in contact with the first region, (3) a third semi-conductive or conductive region formed in a surface region, including the second main surface, of the first region and spaced from the second region, said third region forming a rectifier junction together with the first region, (4) a fourth semi-conductive or conductive region formed in a surface region, including the first main surface, of the second region and spaced from the first region, said fourth region forming a rectifier junction together with the second region, (5) a fifth semi-conductive or conductive region formed in a surface region of the fourth region, said fifth region forming a rectifier junction together with the fourth region, (6) a gate portion of the first transistor formed on a barrier layer formed on the first main surface so as to bridge the first region and the fourth region, and (7) a gate portion of the second transistor formed on a barrier layer formed on the second main surface so as to bridge the second region and the third region, the first transistor having;

(A-1) one source/drain region constituted of a surface region, including the first main surface, of the first region, (A-2) the other source/drain region constituted of the fourth region, and (A-3) a channel forming region constituted of a surface region, including the first main surface, of the second region which surface region is sandwiched by the surface region, including the first main surface, of the first region and the fourth region, the second transistor having;

(B-1) one source/drain region constituted of the third region, (B-2) the other source/drain region constituted of a surface region, including the second main surface, of the second region, and (B-3) a channel forming region constituted of a surface region, including the second main surface, of the first region which surface region is sandwiched by the third region and the surface region, including the second main surface, of the second region, and the junction-field-effect transistor having;

(C-1) gate regions constituted of the fifth region and a portion of the second region facing the fifth region, (C-2) a channel region constituted of a portion of the fourth region sandwiched by the fifth region and said portion of the second region, (C-3) one source/drain region constituted of a portion of the fourth region extending from one end of the channel region of the junction-field-effect transistor and constituting the other source/drain region of the first transistor, and (C-4) the other source/drain region constituted of a portion of the fourth region extending from the other end of the channel region of the junction-field-effect transistor, said method comprising the steps of;

forming the barrier layer on the first main surface and then, forming the gate portion of the first transistor on the barrier layer, and forming the barrier layer on the second main surface and then, forming the gate portion of the second transistor on the barrier layer, and forming the second region, the fourth region and the fifth region by ion implantation in an arbitrary order so as to optimize a distance between the facing gate regions of the junction-field-effect transistor and so as to optimize impurity concentrations of the facing gate regions and the channel region of the junction-field-effect transistor.

48. A semiconductor memory cell comprising a first transistor of a first conductivity type for read-out, a second transistor of a second conductivity type for write-in and a diode, wherein;

(A-1) one source/drain region of the first transistor is connected to a second memory-cell-selecting line, (A-2) the other source/drain region of the first transistor constitutes one end of the diode, (B-1) one source/drain region of the second transistor is connected to a write-in information setting line and constitutes other end of the diode, (B-2) the other source/drain region of the second transistor functions as a channel forming region of the first transistor, and (C) a gate portion shared by the first transistor and the second transistor is connected to a first memory-cell-selecting line.

49. A semiconductor memory cell comprising a first transistor of a first conductivity type for read-out, a second transistor of a second conductivity type for write-in and a diode, wherein;

(A-1) one source/drain region of the first transistor is connected to a predetermined potential line, (A-2) the other source/drain region of the first transistor constitutes one end of the diode, (B-1) one source/drain region of the second transistor is connected to a second memory-cell-selecting line and constitutes other end of the diode, (B-2) the other source/drain region of the second transistor functions as a channel forming region of the first transistor, and (C) a gate portion shared by the first transistor and the second transistor is connected to a first memory-cell-selecting line.

50. A semiconductor memory cell comprising a first transistor of a first conductivity type for read-out, a second transistor of a second conductivity type for write-in and a diode, said semiconductor memory cell having;

(1) a first semi-conductive region of the second conductivity type, (2) a second semi-conductive or conductive region forming a rectifier junction together with the first region, (3) a third semi-conductive region of the first conductivity type, in contact with the first region and spaced from the second region, (4) a fourth semi-conductive or conductive region formed in a surface region of the third region, said fourth region forming a rectifier junction together with the third region, and (5) a gate portion shared by the first transistor and the second transistor, and formed on a barrier layer so as to bridge the second region and the third region and so as to bridge the first region and the fourth region, wherein;

(A-1) one source/drain region of the first transistor is constituted of the second region, (A-2) the other source/drain region of the first transistor is constituted of the third region, (A-3) a channel forming region of the first transistor is constituted of a surface region of the first region sandwiched by the second region and the third region, (B-1) one source/drain region of the second transistor is constituted of the fourth region, (B-2) the other source/drain region of the second transistor is constituted of the first region, (B-3) a channel forming region of the second transistor is constituted of a surface region of the third region sandwiched by the first region and the fourth region, (C) the diode is constituted of the third region and the fourth region, (D) the gate portion is connected to a first memory-cell-selecting line, (E) the second region is connected to a second memory-cell-selecting line, and (F) the fourth region is connected to a write-in information setting line.

51. The semiconductor memory cell according to claim 50, wherein a region containing a high concentration of an impurity having the first conductivity type is formed under the first region.

52. The semiconductor memory cell according to claim 50, wherein the semiconductor memory cell is formed in a well having the second conductivity type.

53. The semiconductor memory cell according to claim 50, wherein the semiconductor memory cell is formed on an insulator.

54. The semiconductor memory cell according to claim 50, wherein the second region is connected to a predetermined potential line, in place of being connected to the second memory-cell-selecting line, and the fourth region is connected to the second memory-cell-selecting line, in place of being connected to the write-in information setting line.

55. The semiconductor memory cell according to claim 54, wherein a region containing a high concentration of an impurity having the first conductivity type is formed under the first region.

56. The semiconductor memory cell according to claim 54, wherein the semiconductor memory cell is formed in a well having the second conductivity type.

57. The semiconductor memory cell according to claim 54, wherein the semiconductor memory cell is formed on an insulator.

58. A semiconductor memory cell comprising a first transistor of a first conductivity type for read-out, a second transistor of a second conductivity type for write-in and a diode, said semiconductor memory cell having;

(1) a first semi-conductive region of the first conductivity type, (2) a second semi-conductive or conductive region forming a rectifier junction together with the first region, (3) a third semi-conductive region of the second conductivity type, in contact with the first region and spaced from the second region, (4) a fourth semi-conductive or conductive region formed in a surface region of the third region, said fourth region forming a rectifier junction together with the third region, and (5) a gate portion shared by the first transistor and the second transistor, and formed on a barrier layer so as to bridge the second region and the third region and so as to bridge the first region and the fourth region, wherein;

(A-1) one source,drain region of the first transistor is constituted of the fourth region, (A-2) the other source/drain region of the first transistor is constituted of the first region, (A-3) a channel forming region of the first transistor is constituted of a surface region of the third region sandwiched by the first region and the fourth region, (B-1) one source/drain region of the second transistor is constituted of the second region, (B-2) the other source/drain region of the second transistor is constituted of the third region, (B-3) a channel forming region of the second transistor is constituted of a surface region of the first region sandwiched by the second region and the third region, (C) the diode is constituted of the first region and the second region, (D) the gate portion is connected to a first memory-cell-selecting line, (E) the fourth region is connected to a second memory-cell-selecting line, and (F) the second region is connected to a write-in information setting line.

59. The semiconductor memory cell according to claim 58, wherein a region containing a high concentration of an impurity having the first conductivity type is formed under the third region.

60. The semiconductor memory cell according to claim 58, wherein the semiconductor memory cell is formed in a well having the first conductivity type.

61. The semiconductor memory cell according to claim 58, wherein the semiconductor memory cell is formed on an insulator.

62. The semiconductor memory cell according to claim 58, wherein the fourth region is connected to a predetermined potential line, in place of being connected to the second memory-cell-selecting line, and the second region is connected to the second memory-cell-selecting line, in place of being connected to the write-in information setting line.

63. The semiconductor memory cell according to claim 62, wherein a region containing a high concentration of an impurity having the first conductivity type is formed under the third region.

64. The semiconductor memory cell according to claim 62, wherein the semiconductor memory cell is formed in a well having the first conductivity type.

65. The semiconductor memory cell according to claim 62, wherein the semiconductor memory cell is formed on an insulator.

66. A semiconductor memory cell provided with a semi-conductive layer having a first main surface and a second main surface opposed to the first main surface, said semiconductor memory cell comprising a first transistor of a first conductivity type for read-out, and a second transistor of a second conductivity type for write-in, and having;

(1) a first semi-conductive region of the first conductivity type, formed through the semi-conductive layer from the first main surface to the second main surface, (2) a second semi-conductive region of the second conductivity type, formed through the semi-conductive layer from the first main surface to the second main surface and being in contact with the first region, (3) a third semi-conductive or conductive region formed in a surface region, including the second main surface, of the first region and spaced from the second region, said third region forming a rectifier junction together with the first region, (4) a fourth semi-conductive or conductive region formed in a surface region, including the first main surface, of the second region and spaced from the first region, said fourth region forming a rectifier junction together with the second region, (5) a gate portion of the first transistor formed on a barrier layer formed on the first main surface so as to bridge the first region and the fourth region, and (6) a gate portion of the second transistor formed on a barrier layer formed on the second main surface so as to bridge the second region and the third region, wherein;

(A-1) one source/drain region of the first transistor is constituted of the fourth region, (A-2) the other source/drain region of the first transistor is constituted of a surface region, including the first main surface, of the first region, (A-3) a channel forming region of the first transistor is constituted of a surface region, including the first main surface, of the second region which surface region is sandwiched by the surface region, including the first main surface, of the first region and the fourth region, (B-1) one source/drain region of the second transistor is constituted of the third region, (B-2) the other source/drain region of the second transistor is constituted of a surface region, including the second main surface, of the second region, (B-3) a channel forming region of the second transistor is constituted of a surface region, including the second main surface, of the first region which surface region is sandwiched by the third region and the surface region, including the second main surface, of the second region, (C) the gate portion of the first transistor and the gate portion of the second transistor are connected to a first memory-cell-selecting line, (D) the third region is connected to a write-in information setting line, (E) the fourth region is connected to a second memory-cell-selecting line, and (F) the other source/drain region of the first transistor is connected to a predetermined potential line.

67. The semiconductor memory cell according to claim 66, wherein the fourth region is connected to the predetermined potential line, in place of being connected to the second memory-cell-selecting line, and the other source/drain region of the first transistor is connected to the second memory-cell-selecting line, in place of being connected to the predetermined potential line.

68. A semiconductor memory cell provided with a semi-conductive layer having a first main surface and a second main surface opposed to the first main surface, said semiconductor memory cell comprising a first transistor of a first conductivity type for read-out, a second transistor of a second conductivity type for write-in and a diode, and having;

(1) a first semi-conductive region of the first conductivity type, formed through the semi-conductive layer from the first main surface to the second main surface, (2) a second semi-conductive region of the second conductivity type, formed through the semi-conductive layer from the first main surface to the second main surface and being in contact with the first region, (3) a third semi-conductive or conductive region formed in a surface region, including the second main surface, of the first region and spaced from the second region, said third region forming a rectifier junction together with the first region, (4) a fourth semi-conductive or conductive region formed in a surface region, including the first main surface, of the second region and spaced from the first region, said fourth region forming a rectifier junction together with the second region, (5) a gate portion of the first transistor formed on a barrier layer formed on the first main surface so as to bridge the first region and the fourth region, and (6) a gate portion of the second transistor formed on a barrier layer formed on the second main surface so as to bridge the second region and the third region, wherein;

(A-1) one source/drain region of the first transistor is constituted of the fourth region, (A-2) the other source/drain region of the first transistor is constituted of a surface region, including the first main surface, of the first region, (A-3) a channel forming region of the first transistor is constituted of a surface region, including the first main surface, of the second region which surface region is sandwiched by the surface region, including the first main surface, of the first region and the fourth region, (B-1) one source/drain region of the second transistor is constituted of the third region, (B-2) the other source/drain region of the second transistor is constituted of a surface region, including the second main surface, of the second region, (B-3) a channel forming region of the second transistor is constituted of a surface region, including the second main surface, of the first region which surface region is sandwiched by the third region and the surface region, including the second main surface, of the second region, (C) the diode is constituted of the first region and the third region, (D) the gate portion of the first transistor and the gate portion of the second transistor are connected to a first memory-cell-selecting line, (E) the third region is connected to a write-in information setting line, and (F) the fourth region is connected to a second memory-cell-selecting line.

69. The semiconductor memory cell according to claim 68, wherein the third region is connected to the second memory-cell-selecting line, in place of being connected to the write-in information setting line, and the fourth region is connected to a predetermined potential line, in place of being connected to second memory-cell-selecting line.

70. A semiconductor memory cell provided with a semi-conductive layer having a first main surface and a second main surface opposed to the first main surface, said semiconductor memory cell comprising a first semiconductor memory device and a second semiconductor memory device, said first semiconductor memory device comprising a first transistor of a first conductivity type for read-out and a first transistor of a second conductivity type for write-in, and said second semiconductor memory device comprising a second transistor of the first conductivity type for read-out and a second transistor of the second conductivity type for write-in, said semiconductor memory cell having;

(1) a first semi-conductive region of the first conductivity type, formed through the semi-conductive layer from the first main surface to the second main surface, (2-1) a second-A semi-conductive or conductive region formed in a surface region, including the first main surface, of the first region, said second-A region forming a rectifier junction together with the first region, (2-2) a second-B semi-conductive or conductive region formed in a surface region, including the second main surface, of the first region, said second-B region forming a rectifier junction together with the first region (3-1) a third-A semi-conductive region of the second conductivity type opposite to the first conductivity type, formed in a surface region, including the first main surface, of the first region and spaced from the second-A region, (3-2) a third-B semi-conductive region of the second conductivity type opposite to the first conductivity type, formed in a surface region, including the second main surface, of the first region and spaced from the second-B region, (4-1) a fourth-A semi-conductive or conductive region formed in a surface region, including the first main surface, of the third-A region, said fourth-A region forming a rectifier junction together with the third-A region, (4-2) a fourth-B semi-conductive or conductive region formed in a surface region, including the second main surface, of the third-B region, said fourth-B region forming a rectifier junction together with the third-B region, (5-1) a gate portion of the first semiconductor memory device formed on a first barrier layer formed on the first main surface so as to bridge the first region and the fourth-A region and so as to bridge the second-A region and the third-A region, and (5-2) a gate portion of the second semiconductor memory device formed on a second barrier layer formed on the second main surface so as to bridge the first region and the fourth-B region and so as to bridge the second-B region and the third-B region, wherein;

(A-1) one source/drain region of the first transistor for read-out is constituted of the fourth-A region, (A-2) the other source/drain region of the first transistor for read-out is constituted of a surface region, including the first main surface, of the first region, (A-3) a channel forming region of the first transistor for read-out is constituted of a surface region, including the first main surface, of the third-A region which surface region is sandwiched by the surface region, including the first main surface, of the first region and the fourth-A region, (a-1) one source/drain region of the second transistor for read-out is constituted of the fourth-B region, (a-2) the other source/drain region of the second transistor for read-out is constituted of a surface region, including the second main surface, of the first region, (a-3) a channel forming region of the second transistor for read-out is constituted of a surface region, including the second main surface, of the third-B region which surface region is sandwiched by the surface region, including the second main surface, of the first region and the fourth-B region, (B-1) one source/drain region of the first transistor for write-in is constituted of the second-A region, (B-2) the other source/drain region of the first transistor for write-in is constituted of a surface region, including the first main surface, of the third-A region, (B-3) a channel forming region of the first transistor for write-in is constituted of a surface region, including the first main surface, of the first region which surface region is sandwiched by the surface region, including the first main surface, of the third-A region and the second-A region, (b-1) one source/drain region of the second transistor for write-in is constituted of the second-B region, (b-2) the other source/drain region of the second transistor for write-in is constituted of a surface region, including the second main surface, of the third-B region, (b-3) a channel forming region of the second transistor for write-in is constituted of a surface region, including the second main surface, of the first region which surface region is sandwiched by the surface region, including the second main surface, of the third-B region and the second-B region, (C) the gate portion of the first semiconductor memory device is connected to a first-A memory-cell-selecting line, (c) the gate portion of the second semiconductor memory device is connected to a first-B memory-cell-selecting line, (D) the second-A region is connected to a write-in information setting line-A, (d) the second-B region is connected to a write-in information setting line-B, (E) the fourth-A region is connected to a second-A memory-cell-selecting line, (e) the fourth-B region is connected to a second-B memory-cell-selecting line, and (F) the first region is connected to a predetermined potential line.

71. The semiconductor memory cell according to claim 70, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, and the first region is connected to a second memory-cell-selecting line, in place of being connected to the predetermined potential line.

72. A semiconductor memory cell provided with a semiconductive layer having a first main surface and a second main surface opposed to the first main surface, said semiconductor memory cell comprising a first semiconductor memory device and a second semiconductor memory device, said first semiconductor memory device comprising a first transistor of a first conductivity type for read-out, a first transistor of a second conductivity type for write-in and a first diode, and said second semiconductor memory device comprising a second transistor of the first conductivity type for read-out, a second transistor of the second conductivity type for write-in and a second diode, said semiconductor memory cell having;

(1) a first semi-conductive region of the first conductivity type, formed through the semi-conductive layer from the first main surface to the second main surface, (2-1) a second-A semi-conductive or conductive region formed in a surface region, including the first main surface, of the first region, said second-A region forming a rectifier junction together with the first region, (2-2) a second-B semi-conductive or conductive region formed in a surface region, including the second main surface, of the first region, said second-B region forming a rectifier junction together with the first region, (3-1) a third-A semi-conductive region of the second conductivity type opposite to the first conductivity type, formed in a surface region, including the first main surface, of the first region and spaced from the second-A region, (3-2) a third-B semi-conductive region of the second conductivity type opposite to the first conductivity type, formed in a surface region, including the second main surface, of the first region and spaced from the second-B region, (4-1) a fourth-A semi-conductive or conductive region formed in a surface region, including the first main surface, of the third-A region, said fourth-A region forming a rectifier junction together with the third-A region, (4-2) a fourth-B semi-conductive or conductive region formed in a surface region, including the second main surface, of the third-B region, said fourth-B region forming a rectifier junction together with the third-B region, (5-1) a gate portion of the first semiconductor memory device formed on a first barrier layer formed on the first main surface so as to bridge the first region and the fourth-A region and so as to bridge the second-A region and the third-A region, and (5-2) a gate portion of the second semiconductor memory device formed on a second barrier layer formed on the second main surface so as to bridge the first region and the fourth-B region and so as to bridge the second-B region and the third-B region, wherein;

(A-1) one source/drain region of the first transistor for read-out is constituted of the fourth-A region, (A-2) the other source/drain region of the first transistor for read-out is constituted of a surface region, including the first main surface, of the first region, (A-3) a channel forming region of the first transistor for read-out is constituted of a surface region, including the first main surface, of the third-A region which surface region is sandwiched by the surface region, including the first main surface, of the first region and the fourth-A region, (a-1) one source/drain region of the second transistor for read-out is constituted of the fourth-B region, (a-2) the other source/drain region of the second transistor for read-out is constituted of a surface region, including the second main surface, of the first region, (a-3) a channel forming region of the second transistor for read-out is constituted of a surface region, including the second main surface, of the third-B region which surface region is sandwiched by the surface region, including the second main surface, of the first region and the fourth-B region, (B-1) one source/drain region of the first transistor for write-in is constituted of the second-A region, (B-2) the other source/drain region of the first transistor for write-in is constituted of a surface region, including the first main surface, of the third-A region, (B-3) a channel forming region of the first transistor for write-in is constituted of a surface region, including the first main surface, of the first region which surface region is sandwiched by the surface region, including the first main surface, of the third-A region and the second-A region, (b-1) one source/drain region of the second transistor for write-in is constituted of the second-B region, (b-2) the other source/drain region of the second transistor for write-in is constituted of a surface region, including the second main surface, of the third-B region, (b-3) a channel forming region of the second transistor for write-in is constituted of a surface region, including the second main surface, of the first region which surface region is sandwiched by the surface region, including the second main surface, of the third-B region and the second-B region, (C) the first diode is constituted of the first region and the second-A region, (c) the second diode is constituted of the first region and the second-B region, (D) the gate portion of the first semiconductor memory device is connected to a first-A memory-cell-selecting line, (d) the gate portion of the second semiconductor memory device is connected to a first-B memory-cell-selecting line, (E) the second-A region is connected to a write-in information setting line-A, (e) the second-B region is connected to a write-in information setting line-B, (F) the fourth-A region is connected to a second-A memory-cell-selecting line, and (f) the fourth-B region is connected to a second-B memory-cell-selecting line.

73. The semiconductor memory cell according to claim 72, wherein the write-in information setting line-A is in common with the write-in information setting line-B.

74. The semiconductor memory cell according to claim 72, wherein the second-A region is connected to the second-A memory-cell-selecting line, in place of being connected to the write-in information setting line-A, the second-B region is connected to the second-B memory-cell-selecting line, in place of being connected to the write-in information setting line-B, the fourth-A region is connected to a predetermined potential line-A, in place of being connected to the second-A memory-cell-selecting line, and the fourth-B region is connected to a predetermined potential line-B, in place of being connected to the second-B memory-cell-selecting line.

75. The semiconductor memory cell according to claim 74, wherein the second-A memory-cell-selecting line is in common with the second-B memory-cell-selecting line.

76. The semiconductor memory cell according to claim 72, wherein the semiconductor memory cell further has a fifth-A conductive region formed in a surface region, including the first main surface, of the first region and a fifth-B conductive region formed in a surface region, including the second main surface, of the first region, the first diode comprises a Schottky diode constituted of the first region and the fifth-A region in place of being constituted of the first region and the second-A region, and the second diode comprises a Schottky diode constituted of the first region and the fifth-B region in place of being constituted of the first region and the second-B region.

77. The semiconductor memory cell according to claim 76, wherein the write-in information setting line-A is in common with the write-in information setting line-B.

78. The semiconductor memory cell according to claim 76, wherein the second-A region is connected to the second-A memory-cell-selecting line, in place of being connected to the write-in information setting line-A, the second-B region is connected to the second-B memory-cell-selecting line, in place of being connected to the write-in information setting line-B, the fourth-A region is connected to a predetermined potential line-A, in place of being connected to the second-A memory-cell-selecting line, and the fourth-B region is connected to a predetermined potential line-B, in place of being connected to the second-B memory-cell-selecting line.

79. The semiconductor memory cell according to claim 78, wherein the second-A memory-cell-selecting line is in common with the second-B memory-cell-selecting line.

80. The semiconductor memory cell according to claim 72, wherein the write-in information setting line-A is in common with the write-in information setting line-B, the semiconductor memory cell further has a fifth conductive region formed through the semi-conductive layer from the first main surface to the second main surface and being in contact with the first region, the first diode comprises a Schottky diode constituted of the first region and the fifth region in place of being constituted of the first region and the second-A region, and the second diode comprises a Schottky diode constituted of the first region and the fifth region in place of being constituted of the first region and the second-B region.

81. The semiconductor memory cell according to claim 80, wherein the second-A region and the second-B region are connected to a second memory-cell-selecting line, in place of being connected to the common write-in information setting line, the fourth-A region is connected to a predetermined potential line-A, in place of being connected to the second-A memory-cell-selecting line, and the fourth-B region is connected to a predetermined potential line-B, in place of being connected to the second-B memory-cell-selecting line.

82. A semiconductor memory cell provided with a semi-conductive layer having a first main surface and a second main surface opposed to the first main surface, said semi-conductor memory cell comprising a first semiconductor memory device and a second semiconductor memory device, said first semiconductor memory device comprising a first transistor of a first conductivity type for read-out, a first transistor of a second conductivity type for write-in and a first diode, and said second semiconductor memory device comprising a second transistor of the first conductivity type for read-out, a second transistor of the second conductivity type for write-in and a second diode, said semiconductor memory cell having;

(1) a first semi-conductive region of the first conductivity type, formed through the semi-conductive layer from the first main surface to the second main surface, (2) a second semi-conductive region of the second conductivity type opposite to the first conductivity type, formed through the semi-conductive layer from the first main surface to the second main surface and being in contact with the first region, (3-1) a third-A semi-conductive region of the second conductivity type, formed in a surface region, including the first main surface, of the first region and spaced from the second region, (3-2) a third-B semi-conductive region of the second conductivity type, formed in a surface region, including the second main surface, of the first region and spaced from the second region, (4-1) a fourth-A semi-conductive or conductive region formed in a surface region, including the first main surface, of the third-A region, said fourth-A region forming a rectifier junction together with the third-A region, (4-2) a fourth-B semi-conductive or conductive region formed in a surface region, including the second main surface, of the third-B region, said fourth-B region forming a rectifier junction together with the third-B region, (5-1) a gate portion of the first semiconductor memory device formed on a first barrier layer formed on the first main surface so as to bridge the first region and the fourth-A region and so as to bridge the second region and the third-A region, and (5-2) a gate portion of the second semiconductor memory device formed on a second barrier layer formed on the second main surface so as to bridge the first region and the fourth-B region and so as to bridge the second region and the third-B region, wherein;

(A-1) one source/drain region of the first transistor for read-out is constituted of the fourth-A region, (A-2) the other source/drain region of the first transistor for read-out is constituted of a surface region, including the first main surface, of the first region, (A-3) a channel forming region of the first transistor for read-out is constituted of a surface region, including the first main surface, of the third-A region which surface region is sandwiched by the surface region, including the first main surface, of the first region and the fourth-A region, (a-1) one source/drain region of the second transistor for read-out is constituted of the fourth-B region, (a-2) the other source/drain region of the second transistor for read-out is constituted of a surface region, including the second main surface, of the first region, (a-3) a channel forming region of the second transistor for read-out is constituted of a surface region, including the second main surface, of the third-B region which surface region is sandwiched by the surface region, including the second main surface, of the first region and the fourth-B region, (B-1) one source/drain region of the first transistor for write-in is constituted of a surface region, including the first main surface, of the second region, (B-2) the other source/drain region of the first transistor for write-in is constituted of a surface region, including the first main surface, of the third-A region, (B-3) a channel forming region of the first transistor for write-in is constituted of a surface region, including the first main surface, of the first region which surface region is sandwiched by the surface region, including the first main surface, of the second region and the surface region, including the first main surface, of the third-A region, (b-1) one source/drain region of the second transistor for write-in is constituted of a surface region, including the second main surface, of the second region, (b-2) the other source/drain region of the second transistor for write-in is constituted of a surface region, including the second main surface, of the third-B region, (b-3) a channel forming region of the second transistor for write-in is constituted of a surface region, including the second main surface, of the first region which surface region is sandwiched by the surface region, including the second main surface, of the second region and the surface region, including the second main surface, of the third-B region, (C) the first diode is in common with the second diode, and each of the first diode and the second diode is constituted of the first region and the second region, (D) the gate portion of the first semiconductor memory device is connected to a first-A memory-cell-selecting line, (d) the gate portion of the second semiconductor memory device is connected to a first-B memory-cell-selecting line, (E) the second region is connected to a write-in information setting line, (F) the fourth-A region is connected to a second-A memory-cell-selecting line, and (f) the fourth-B region is connected to a second-B memory-cell-selecting line.

83. The semiconductor memory cell according to claim 82, wherein the second region is connected to a second memory-cell-selecting line, in place of being connected to the write-in information setting line, the fourth-A region is connected to a predetermined potential line-A, in place of being connected to the second-A memory-cell-selecting line, and the fourth-B region is connected to a predetermined potential line-B, in place of being connected to the second-B memory-cell-selecting line.

84. A semiconductor memory cell provided with a semi-conductive layer having a first main surface and a second main surface opposed to the first main surface, said semi-conductor memory cell comprising a first semiconductor memory device and a second semiconductor memory device, said first semiconductor memory device comprising a first transistor of a first conductivity type for read-out, a first transistor of a second conductivity type for write-in and a first junction-field-effect transistor of the first conductivity type for current control, and said second semiconductor memory device comprising a second transistor of the first conductivity type for read-out, a second transistor of the second conductivity type for write-in and a second junction-field-effect transistor of the first conductivity type for current control, said semiconductor memory cell having;

(1) a first semi-conductive region of the first conductivity type, formed through the semi-conductive layer from the first main surface to the second main surface, (2-1) a second-A semi-conductive or conductive region formed in a surface region, including the first main surface, of the first region, said second-A region forming a rectifier junction together with the first region, (2-2) a second-B semi-conductive or conductive region formed in a surface region, including the second main surface, of the first region, said second-B region forming a rectifier junction together with the first region, (3-1) a third-A semi-conductive region of the second conductivity type opposite to the first conductivity type, formed in a surface region, including the first main surface, of the first region and spaced from the second-A region, (3-2) a third-B semi-conductive region of the second conductivity type, formed in a surface region, including the second main surface, of the first region and spaced from the second-B region, (4-1) a fourth-A semi-conductive or conductive region formed in a surface region, including the first main surface, of the third-A region, said fourth-A region forming a rectifier junction together with the third-A region, (4-2) a fourth-B semi-conductive or conductive region formed in a surface region, including the second main surface, of the third-B region, said fourth-B region forming a rectifier junction together with the third-B region, (5-1) a gate portion of the first semiconductor memory device formed on a first barrier layer formed on the first main surface so as to bridge the first region and the fourth-A region and so as to bridge the second-A region and the third-A region, and (5-2) a gate portion of the second semiconductor memory device formed on a second barrier layer formed on the second main surface so as to bridge the first region and the fourth-B region and so as to bridge the second-B region and the third-B region, wherein;

(A-1) one source/drain region of the first transistor for read-out is constituted of the fourth-A region, (A-2) the other source/drain region of the first transistor for read-out is constituted of a surface region, including the first main surface, of the first region, (A-3) a channel forming region of the first transistor for read-out is constituted of a surface region, including the first main surface, of the third-A region which surface region is sandwiched by the surface region, including the first main surface, of the first region and the fourth-A region, (a-1) one source/drain region of the second transistor for read-out is constituted of the fourth-B region, (a-2) the other source/drain region of the second transistor for read-out is constituted of a surface region, including the second main surface, of the first region, (a-3) a channel forming region of the second transistor for read-out is constituted of a surface region, including the second main surface, of the third-B region which surface region is sandwiched by the surface region, including the second main surface, of the first region and the fourth-B region, (B-1) one source/drain region of the first transistor for write-in is constituted of the second-A region, (B-2) the other source/drain region of the first transistor for write-in is constituted of a surface region, including the first main surface, of the third-A region, (B-3) a channel forming region of the first transistor for write-in is constituted of a surface region, including the first main surface, of the first region which surface region is sandwiched by the surface region, including the first main surface, of the third-A region and the second-A region, (b-1) one source/drain region of the second transistor for write-in is constituted of the second-B region, (b-2) the other source/drain region of the second transistor for write-in is constituted of a surface region, including the second main surface, of the third-B region, (b-3) a channel forming region of the second transistor for write-in is constituted of a surface region, including the second main surface, of the first region which surface region is sandwiched by the surface region, including the second main surface, of the third-B region and the second-B region, (C-1) gate regions of the first junction-field-effect transistor are constituted of the second-A region and the third-A region, (C-2) a channel region of the first junction-field-effect transistor is constituted of a portion of the first region sandwiched by the second-A region and the third-A region, (c-1) gate regions of the second junction-field-effect transistor are constituted of the second-B region and the third-B region, (c-2) a channel region of the second junction-field-effect transistor is constituted of a portion of the first region sandwiched by the second-B region and the third-B region, (D) the gate portion of the first semiconductor memory device is connected to a first-A memory-cell-selecting line, (d) the gate portion of the second semiconductor memory device is connected to a first-B memory-cell-selecting line, (E) the second-A region is connected to a write-in information setting line-A, (e) the second-B region is connected to a write-in information setting line-B, (F) the fourth-A region is connected to a second-A memory-cell-selecting line, (f) the fourth-B region is connected to a second-B memory-cell-selecting line, and (G) the first region is connected to a predetermined potential line.

85. The semiconductor memory cell according to claim 84, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, and the first region is connected to a second memory-cell-selecting line, in place of being connected to the predetermined potential line.

86. A semiconductor memory cell provided with a semi-conductive layer having a first main surface and a second main surface opposed to the first main surface, said semi-conductor memory cell comprising a first semiconductor memory device and a second semiconductor memory device, said first semiconductor memory device comprising a first transistor of a first conductivity type for read-out, a first transistor of a second conductivity type for write-in and a first junction-field-effect transistor of the first conductivity type for current control, and said second semiconductor memory device comprising a second transistor of the first conductivity type for read-out, a second transistor of the second conductivity type for write-in and a second junction-field-effect transistor of the first conductivity type for current control, said semiconductor memory cell having;

(1) a first semi-conductive region of the first conductivity type, formed through the semi-conductive layer from the first main surface to the second main surface, (2-1) a second-A semi-conductive or conductive region formed in a surface region, including the first main surface, of the first region, said second-A region forming a rectifier junction together with the first region, (2-2) a second-B semi-conductive or conductive region formed in a surface region, including the second main surface, of the first region, said second-B region forming a rectifier junction together with the first region, (3-1) a third-A semi-conductive region of the second conductivity type opposite to the first conductivity type, formed in a surface region, including the first main surface, of the first region and spaced from the second-A region, (3-2) a third-B semi-conductive region of the second conductivity type, formed in a surface region, including the second main surface, of the first region and spaced from the second-B region, (4-1) a fourth-A semi-conductive region of the first conductivity type, formed in a surface region, including the first main surface, of the third-A region, (4-2) a fourth-B semi-conductive region of the first conductivity type, formed in a surface region, including the second main surface, of the third-B region, (5-1) a fifth-A semi-conductive or conductive region formed in a surface region, including the first main surface, of the fourth-A region, said fifth-A region forming a rectifier junction together with the fourth-A region, (5-2) a fifth-B semi-conductive or conductive region formed in a surface region, including the second main surface, of the fourth-B region, said fifth-B region forming a rectifier junction together with the fourth-B region, (6-1) a gate portion of the first semiconductor memory device formed on a first barrier layer formed on the first main surface so as to bridge the first region and the fourth-A region and so as to bridge the second-A region and the third-A region, and (6-2) a gate portion of the second semiconductor memory device formed on a second barrier layer formed on the second main surface so as to bridge the first region and the fourth-B region and so as to bridge the second-B region and the third-B region, wherein;

(A-1) one source/drain region of the first transistor for read-out is constituted of the fourth-A region, (A-2) the other source/drain region of the first transistor for read-out is constituted of a surface region, including the first main surface, of the first region, (A-3) a channel forming region of the first transistor for read-out is constituted of a surface region, including the first main surface, of the third-A region which surface region is sandwiched by the surface region, including the first main surface, of the first region and the fourth-A region, (a-1) one source/drain region of the second transistor for read-out is constituted of the fourth-B region, (a-2) the other source/drain region of the second transistor for read-out is constituted of a surface region, including the second main surface, of the first region, (a-3) a channel forming region of the second transistor for read-out is constituted of a surface region, including the second main surface, of the third-B region which surface region is sandwiched by the surface region, including the second main surface, of the first region and the fourth-B region, (B-1) one source/drain region of the first transistor for write-in is constituted of the second-A region, (B-2) the other source/drain region of the first transistor for write-in is constituted of a surface region, including the first main surface, of the third-A region, (B-3) a channel forming region of the first transistor for write-in is constituted of a surface region, including the first main surface, of the first region which surface region is sandwiched by the surface region, including the first main surface, of the third-A region and the second-A region, (b-1) one source/drain region of the second transistor for write-in is constituted of the second-B region, (b-2) the other source/drain region of the second transistor for write-in is constituted of a surface region, including the second main surface, of the third-B region, (b-3) a channel forming region of the second transistor for write-in is constituted of a surface region, including the second main surface, of the first region which surface region is sandwiched by the surface region, including the second main surface, of the third-B region and the second-B region, (C-1) gate regions of the first junction-field-effect transistor are constituted of the fifth-A region and a portion of third-A region facing the fifth-A region, (C-2) a channel region of the first junction-field-effect transistor is constituted of a portion of the fourth-A region sandwiched by the fifth-A region and said portion of the third-A region, (C-3) source/drain regions of the first junction-field-effect transistor are constituted of portions of the fourth-A region, one of the portions of the fourth-A region extending from one end of the channel region of the first junction-field-effect transistor and the other of the portions of the fourth-A region extending from the other end of the channel region of the first junction-field-effect transistor, (c-1) gate regions of the second junction-field-effect transistor are constituted of the fifth-B region and a portion of third-B region facing the fifth-B region, (c-2) a channel region of the second junction-field-effect transistor is constituted of a portion of the fourth-B region sandwiched by the fifth-B region and said portion of the third-B region, (c-3) source/drain regions of the second junction-field-effect transistor are constituted of portions of the fourth-B region, one of the portions of the fourth-B region extending from one end of the channel region of the second junction-field-effect transistor and the other of the portions of the fourth-B region extending from the other end of the channel region of the second junction-field-effect transistor, (D) the gate portion of the first semiconductor memory device is connected to a first-A memory-cell-selecting line, (d) the gate portion of the second semiconductor memory device is connected to a first-B memory-cell-selecting line, (E) the second-A region is connected to a write-in information setting line-A, (e) the second-B region is connected to a write-in information setting line-B, (F) the fourth-A region is connected to a second-A memory-cell-selecting line, (f) the fourth-B region is connected to a second-B memory-cell-selecting line, (G) the first region is connected to a predetermined potential line, (H) the fifth-A region is connected to the write-in information setting line-A, and (h) the fifth-B region is connected to the write-in information setting line-B.

87. The semiconductor memory cell according to claim 86, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, and the first region is connected to a second memory-cell-selecting line, in place of being connected to the predetermined potential line.

88. The semiconductor memory cell according to claim 86, wherein the first semiconductor memory device further has a third junction-field-effect transistor of the first conductivity type for current control, and the second semiconductor memory device further has a fourth junction-field-effect transistor of the first conductivity type for current control, wherein;

(I-1) gate regions of the third junction-field-effect transistor are constituted of the second-A region and the third-A region, (I-2) a channel region of the third junction-field-effect transistor is constituted of a portion of the first region sandwiched by the second-A region and the third-A region, (i-1) gate regions of the fourth junction-field-effect transistor are constituted of the second-B region and the third-B region, and (i-2) a channel region of the fourth junction-field-effect transistor is constituted of a portion of the first region sandwiched by the second-B region and the third-B region.

89. The semiconductor memory cell according to claim 88, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, and the first region is connected to a second memory-cell-selecting line, in place of being connected to the predetermined potential line.

90. The semiconductor memory cell according to claim 86, wherein the fifth-A region is connected to the third-A region, in place of being connected to the write-in information setting line-A, and the fifth-B region is connected to the third-B region, in place of being connected to the write-in information setting line-B.

91. The semiconductor memory cell according to claim 90, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, and the first region is connected to a second memory-cell-selecting line, in place of being connected to the predetermined potential line.

92. The semiconductor memory cell according to claim 90, wherein the first semiconductor memory device further has a third junction-field-effect transistor of the first conductivity type for current control, and the second semiconductor memory device further has a fourth junction-field-effect transistor of the first conductivity type for current control, wherein;

(I-1) gate regions of the third junction-field-effect transistor are constituted of the second-A region and the third-A region, (I-2) a channel region of the third junction-field-effect transistor is constituted of a portion of the first region sandwiched by the second-A region and the third-A region, (i-1) gate regions of the fourth junction-field-effect transistor are constituted of the second-B region and the third-B region, and (i-2) a channel region of the fourth junction-field-effect transistor is constituted of a portion of the first region sandwiched by the second-B region and the third-B region.

93. The semiconductor memory cell according to claim 92, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, and the first region is connected to a second memory-cell-selecting line, in place of being connected to the predetermined potential line.

94. A semiconductor memory cell provided with a semi-conductive layer having a first main surface and a second main surface opposed to the first main surface, said semiconductor memory cell comprising a first semiconductor memory device and a second semiconductor memory device, said first semiconductor memory device comprising a first transistor of a first conductivity type for read-out, a first transistor of a second conductivity type for write-in, a first junction-field-effect transistor of the first conductivity type for current control and a third transistor of the second conductivity type for write-in, and said second semiconductor memory device comprising a second transistor of the first conductivity type for read-out, a second transistor of the second conductivity type for write-in, a second junction-field-effect transistor of the first conductivity type for current control and a fourth transistor of the second conductivity type for write-in, said semiconductor memory cell having;

(1) a first semi-conductive region of the first conductivity type, formed through the semi-conductive layer from the first main surface to the second main surface, (2-1) a second-A semi-conductive or conductive region formed in a surface region, including the first main surface, of the first region, said second-A region forming a rectifier junction together with the first region, (2-2) a second-B semi-conductive or conductive region formed in a surface region, including the second main surface, of the first region, said second-B region forming a rectifier junction together with the first region, (3-1) a third-A semi-conductive region of the second conductivity type opposite to the first conductivity type, formed in a surface region, including the first main surface, of the first region and spaced from the second-A region, (3-2) a third-B semi-conductive region of the second conductivity type, formed in a surface region, including the second main surface, of the first region and spaced from the second-B region, (4-1) a fourth-A semi-conductive region of the first conductivity type, formed in a surface region, including the first main surface, of the third-A region, (4-2) a fourth-B semi-conductive region of the first conductivity type, formed in a surface region, including the second main surface, of the third-B region, (5-1) a fifth-A semi-conductive or conductive region formed in a surface region, including the first main surface, of the fourth-A region, said fifth-A region forming a rectifier junction together with the fourth-A region, (5-2) a fifth-B semi-conductive or conductive region formed in a surface region, including the second main surface, of the fourth-B region, said fifth-B region forming a rectifier junction together with the fourth-B region, (6-1) a gate portion of the first semiconductor memory device formed on a first barrier layer formed on the first main surface so as to bridge the first region and the fourth-A region, so as to bridge the second-A region and the third-A region and so as to bridge the third-A region and the fifth-A region, and (6-2) a gate portion of the second semiconductor memory device formed on a second barrier layer formed on the second main surface so as to bridge the first region and the fourth-B region, so as to bridge the second-B region and the third-B region and so as to bridge the third-B region and the fifth-b region, wherein;

(A-1) one source/drain region of the first transistor for read-out is constituted of the fourth-A region, (A-2) the other source/drain region of the first transistor for read-out is constituted of a surface region, including the first main surface, of the first region, (A-3) a channel forming region of the first transistor for read-out is constituted of a surface region, including the first main surface, of the third-A region which surface region is sandwiched by the surface region, including the first main surface, of the first region and the fourth-A region, (a-1) one source/drain region of the second transistor for read-out is constituted of the fourth-B region, (a-2) the other source/drain region of the second transistor for read-out is constituted of a surface region, including the second main surface, of the first region, (a-3) a channel forming region of the second transistor for read-out is constituted of a surface region, including the second main surface, of the third-B region which surface region is sandwiched by the surface region, including the second main surface, of the first region and the fourth-B region, (B-1) one source/drain region of the first transistor for write-in is constituted of the second-A region, (B-2) the other source/drain region of the first transistor for write-in is constituted of a surface region, including the first main surface, of the third-A region, (B-3) a channel forming region of the first transistor for write-in is constituted of a surface region, including the first main surface, of the first region which surface region is sandwiched by the surface region, including the first main surface, of the third-A region and the second-A region, (b-1) one source/drain region of the second transistor for write-in is constituted of the second-B region, (b-2) the other source/drain region of the second transistor for write-in is constituted of a surface region, including the second main surface, of the third-B region, (b-3) a channel forming region of the second transistor for write-in is constituted of a surface region, including the second main surface, of the first region which surface region is sandwiched by the surface region, including the second main surface, of the third-B region and the second-B region, (C-1) gate regions of the first junction-field-effect transistor are constituted of the fifth-A region and a portion of third-A region facing the fifth-A region, (C-2) a channel region of the first junction-field-effect transistor is constituted of a portion of the fourth-A region sandwiched by the fifth-A region and said portion of the third-A region, (C-3) source/drain regions of the first junction-field-effect transistor are constituted of portions of the fourth-A region, one of the portions of the fourth-A region extending from one end of the channel region of the first junction-field-effect transistor and the other of the portions of the fourth-A region extending from the other end of the channel region of the first junction-field-effect transistor, (c-1) gate regions of the second junction-field-effect transistor are constituted of the fifth-B region and a portion of third-B region facing the fifth-B region, (c-2) a channel region of the second junction-field-effect transistor is constituted of a portion of the fourth-B region sandwiched by the fifth-B region and said portion of the third-B region, (c-3) source/drain regions of the second junction-field-effect transistor are constituted of portions of the fourth-B region, one of the portions of the fourth-B region extending from one end of the channel region of the second junction-field-effect transistor and the other of the portions of the fourth-B region extending from the other end of the channel region of the second junction-field-effect transistor, (D-1) one source/drain region of the third transistor for write-in is constituted of the surface region of the third-A region functioning as the channel forming region of the first transistor for read-out, (D-2) the other source/drain region of the third transistor for write-in is constituted of the fifth-A region, (D-3) a channel forming region of the third transistor for write-in is constituted of the surface region of the fourth-A region functioning as one source/drain region of the first transistor for read-out, (d-1) one source/drain region of the fourth transistor for write-in is constituted of the surface region of the third-B region functioning as to the channel forming region of the second transistor for read-out, (d-2) the other source/drain region of the fourth transistor for write-in is constituted of the fifth-B region, (d-3) a channel forming region of the fourth transistor for write-in is constituted of the surface region of the fourth-B region functioning as one source/drain region of the second transistor for read-out, (E) the gate portion of the first semiconductor memory device is connected to a first-A memory-cell-selecting line, (e) the gate portion of the second semiconductor memory device is connected to a first-B memory-cell-selecting line, (F) the second-A region is connected to a write-in information setting line-A, (f) the second-B region is connected to a write-in information setting line-B, (G) the fourth-A region is connected to a second-A memory-cell-selecting line, (g) the fourth-B region is connected to a second-B memory-cell-selecting line, and (H) the first region is connected to a predetermined potential line.

95. The semiconductor memory cell according to claim 94, wherein the fourth-A region is connected to a predetermined potential line-A, in place of being connected to the second-A memory-cell-selecting line, the fourth-B region is connected to a predetermined potential line-B, in place of being connected to-the second-B memory-cell-selecting line, and the first region is connected to a second memory-cell-selecting line, in place of being connected to the predetermined potential line.

96. The semiconductor memory cell according to claim 94, wherein the first semiconductor memory device further has a third junction-field-effect transistor of the first conductivity type for current control, and the second semiconductor memory device further has a fourth junction-field-effect transistor of the first conductivity type for current control, wherein;

(I-1) gate regions of the third junction-field-effect transistor are constituted of the second-A region and the third-A region, (I-2) a channel region of the third junction-field-effect transistor is constituted of a portion of the first region sandwiched by the second-A region and the third-A region, (i-1) gate regions of the fourth junction-field-effect transistor are constituted of the second-B region and the third-B region, and (i-2) a channel region of the fourth junction-field-effect transistor is constituted of a portion of the first region sandwiched by the second-B region and the third-B region.

97. The semiconductor memory cell according to claim 96, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, and the first region is connected to a second memory-cell-selecting line, in place of being connected to the predetermined potential line.

98. A semiconductor memory cell provided with a semi-conductive layer having a first main surface and a second main surface opposed to the first main surface, said semiconductor memory cell comprising a first semiconductor memory device and a second semiconductor memory device, said first semiconductor memory device comprising a first transistor of a first conductivity type for read-out, a first transistor of a second conductivity type for write-in, a first junction-field-effect transistor of the first conductivity type for current control and a first diode, and said second semiconductor memory device comprising a second transistor of the first conductivity type for read-out, a second transistor of the second conductivity type for write-in, a second junction-field-effect transistor of the first conductivity type for current control and a second diode, said semiconductor memory cell having;

(1) a first semi-conductive region of the first conductivity type, formed through the semi-conductive layer from the first main surface to the second main surface, (2-1) a second-A semi-conductive or conductive region formed in a surface region, including the first main surface, of the first region, said second-A region forming a rectifier junction together with the first region, (2-2) a second-B semi-conductive or conductive region formed in a surface region, including the second main surface, of the first region, said second-B region forming a rectifier junction together with the first region, (3-1) a third-A semi-conductive region of the second conductivity type opposite to the first conductivity type, formed in a surface region, including the first main surface, of the first region and spaced from the second-A region, (3-2) a third-B semi-conductive region of the second conductivity type, formed in a surface region, including the second main surface, of the first region and spaced from the second-B region, (4-1) a fourth-A semi-conductive region of the first conductivity type, formed in a surface region, including the first main surface, of the third-A region, (4-2) a fourth-B semi-conductive region of the first conductivity type, formed in a surface region, including the second main surface, of the third-B region, (5-1) a fifth-A semi-conductive or conductive region formed in a surface region, including the first main surface, of the fourth-A region, said fifth-A region forming a rectifier junction together with the fourth-A region, (5-2) a fifth-B semi-conductive or conductive region formed in a surface region, including the second main surface, of the fourth-B region, said fifth-B region forming a rectifier junction together with the fourth-B region, (6-1) a gate portion of the first semiconductor memory device formed on a first barrier layer formed on the first main surface so as to bridge the first region and the fourth-A region and so as to bridge the second-A region and the third-A region, and (6-2) a gate portion of the second semiconductor memory device formed on a second barrier layer formed on the second main surface so as to bridge the first region and the fourth-B region and so as to bridge the second-B region and the third-B region, wherein;

(A-1) one source/drain region of the first transistor for read-out is constituted of the fourth-A region, (A-2) the other source/drain region of the first transistor for read-out is constituted of a surface region, including the first main surface, of the first region, (A-3) a channel forming region of the first transistor for read-out is constituted of a surface region, including the first main surface, of the third-A region which surface region is sandwiched by the surface region, including the first main surface, of the first region and the fourth-A region, (a-1) one source/drain region of the second transistor for read-out is constituted of the fourth-B region, (a-2) the other source/drain region of the second transistor for read-out is constituted of a surface region, including the second main surface, of the first region, (a-3) a channel forming region of the second transistor for read-out is constituted of a surface region, including the second main surface, of the third-B region which surface region is sandwiched by the surface region, including the second main surface, of the first region and the fourth-B region, (B-1) one source/drain region of the first transistor for write-in is constituted of the second-A region, (B-2) the other source/drain region of the first transistor for write-in is constituted of a surface region, including the first main surface, of the third-A region, (B-3) a channel forming region of the first transistor for write-in is constituted of a surface region, including the first main surface, of the first region which surface region is sandwiched by the surface region, including the first main surface, of the third-A region and the second-A region, (b-1) one source/drain region of the second transistor for write-in is constituted of the second-B region, (b-2) the other source/drain region of the second transistor for write-in is constituted of a surface region, including the second main surface, of the third-B region, (b-3) a channel forming region of the second transistor for write-in is constituted of a surface region, including the second main surface, of the first region which surface region is sandwiched by the surface region, including the second main surface, of the third-B region and the second-B region, (C-1) gate regions of the first junction-field-effect transistor are constituted of the fifth-A region and a portion of third-A region facing the fifth-A region, (C-2) a channel region of the first junction-field-effect transistor is constituted of a portion of the fourth-A region sandwiched by the fifth-A region and said portion of the third-A region, (C-3) source,drain regions of the first junction-field-effect transistor are constituted of portions of the fourth-A region, one of the portions of the fourth-A region extending from one end of the channel region of the first junction-field-effect transistor and the other of the portions of the fourth-A region extending from the other end of the channel region of the first junction-field-effect transistor, (c-1) gate regions of the second junction-field-effect transistor are constituted of the fifth-B region and a portion of third-B region facing the fifth-B region, (c-2) a channel region of the second junction-field-effect transistor is constituted of a portion of the fourth-B region sandwiched by the fifth-B region and said portion of the third-B region, (c-3) source/drain regions of the second junction-field-effect transistor are constituted of portions of the fourth-B region, one of the portions of the fourth-B region extending from one end of the channel region of the second junction-field-effect transistor and the other of the portions of the fourth-B region extending from the other end of the channel region of the second junction-field-effect transistor, (D) the first diode is constituted of the second-A region and the first region, (d) the second diode is constituted of the second-B region and the first region, (E) the gate portion of the first semiconductor memory device is connected to a first-A memory-cell-selecting line, (e) the gate portion of the second semiconductor memory device is connected to a first-B memory-cell-selecting line, (F) the second-A region is connected to a write-in information setting line-A, (f) the second-B region is connected to a write-in information setting line-B, (G) the fourth-A region is connected to a second-A memory-cell-selecting line, (g) the fourth-B region is connected to a second-B memory-cell-selecting line, (H) the fifth-A region is connected to the write-in information setting line-A, and (h) the fifth-B region is connected to the write-in information setting line-B.

99. The semiconductor memory cell according to claim 98, wherein the write-in information setting line-A is in common with the write-in information setting line-B.

100. The semiconductor memory cell according to claim 98, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, the second-A region is connected to the second-A memory-cell-selecting line, in place of being connected to the write-in information setting line-A, and the second-B region is connected to the second-B memory-cell-selecting line, in place of being connected to the write-in information setting line-B.

101. The semiconductor memory cell according to claim 100, wherein the second-A memory-cell-selecting line is in common with the second-B memory-cell-selecting line.

102. The semiconductor memory cell according to claim 98, wherein the semiconductor memory cell further has a sixth-A conductive region formed in a surface region, including the first main surface, of the first region and a sixth-B conductive region formed in a surface region, including the second main surface, of the first region, the first diode comprises a Schottky diode constituted of the first region and the sixth-A region, in place of being constituted of the first region and the second-A region, and the second diode comprises a Schottky diode constituted of the first region and the sixth-B region, in place of being constituted of the first region and the second-B region.

103. The semiconductor memory cell according to claim 102, wherein the second-A memory-cell-selecting line is in common with the second-B memory-cell-selecting line.

104. The semiconductor memory cell according to claim 102, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, the second-A region is connected to the second-A memory-cell-selecting line, in place of being connected to the write-in information setting line-A, and the second-B region is connected to the second-B memory-cell-selecting line, in place of being connected to the write-in information setting line-B.

105. The semiconductor memory cell according to claim 104, wherein the second-A memory-cell-selecting line is in common with the second-B memory-cell-selecting line.

106. The semiconductor memory cell according to claim 98, wherein the write-in information setting line-A is in common with the write-in information setting line-B, the semiconductor memory cell has a sixth conductive region, formed through the semi-conductive layer from the first main surface to the second main surface and being in contact with the first region, the first diode comprises a Schottky diode constituted of the first region and the sixth region, in place of being constituted of the first region and the second-A region, and the second diode comprises a Schottky diode constituted of the first region and the sixth region, in place of being constituted of the first region and the second-B.

107. The semiconductor memory cell according to claim 106, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, and the second-A and second-B regions are connected to a second memory-cell-selecting line, in place of being connected to the write-in information setting line-A and the write-in information setting line-B.

108. The semiconductor memory cell according to claim 98, wherein the fifth-A region is connected to the third-A region, in place of being connected to the write-in information setting line-A, and the fifth-B region is connected to the third-B region, in place of being connected to the write-in information setting line-B.

109. The semiconductor memory cell according to claim 108, wherein the write-in information setting line-A is in common with the write-in information setting line-B.

110. The semiconductor memory cell according to claim 108, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, the second-A region is connected to the second-A memory-cell-selecting line, in place of being connected to the write-in information setting line-A, and the second-B region is connected to the second-B memory-cell-selecting line, in place of being connected to the write-in information setting line-B.

111. The semiconductor memory cell according to claim 110, wherein the second-A memory-cell-selecting line is in common with the second-B memory-cell-selecting line.

112. The semiconductor memory cell according to claim 108, wherein the semiconductor memory cell further has a sixth-A conductive region formed in a surface region, including the first main surface, of the first region and a sixth-B conductive region formed in a surface region, including the second main surface, of the first region, the first diode comprises a Schottky diode constituted of the first region and the sixth-A region, in place of being constituted of the first region and the second-A region, and the second diode comprises a Schottky diode constituted of the first region and the sixth-B region, in place of being constituted of the first region and the second-B region.

113. The semiconductor memory cell according to claim 112, wherein the write-in information setting line-A is in common with the write-in information setting line-B.

114. The semiconductor memory cell according to claim 112, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, the second-A region is connected to the second-A memory-cell-selecting line, in place of being connected to the write-in information setting line-A, and the second-B region is connected to the second-B memory-cell-selecting line, in place of being connected to the write-in information setting line-B.

115. The semiconductor memory cell according to claim 114, wherein the second-A memory-cell-selecting line is in common with the second-B memory-cell-selecting line.

116. The semiconductor memory cell according to claim 108, wherein the write-in information setting line-A is in common with the write-in information setting line-B, the semiconductor memory cell has a sixth conductive region, formed through the semi-conductive layer from the first main surface to the second main surface and being in contact with the first region, the first diode comprises a Schottky diode constituted of the first region and the sixth region, in place of being constituted of the first region and the second-A region, and the second diode comprises a Schottky diode constituted of the first region and the sixth region, in place of being constituted of the first region and the second-B region.

117. The semiconductor memory cell according to claim 116, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, and the second-A and second-B regions are connected to a second memory-cell-selecting line, in place of being connected to the write-in information setting line-A and the write-in information setting line-B.

118. A semiconductor memory cell provided with a semi-conductive layer having a first main surface and a second main surface opposed to the first main surface, said semiconductor memory cell comprising a first semiconductor memory device and a second semiconductor memory device, said first semiconductor memory device comprising a first transistor of a first conductivity type for read-out, a first transistor of a second conductivity type for write-in, a first junction-field-effect transistor of the first conductivity type for current control, a third transistor of the second conductivity type for write-in and a first diode, and said second semiconductor memory device comprising a second transistor of the first conductivity type for read-out, a second transistor of the second conductivity type for write-in, a second junction-field-effect transistor of the first conductivity type for current control, a fourth transistor of the second conductivity type for write-in and a second diode, said semiconductor memory cell having;

(1) a first semi-conductive region of the first conductivity type, formed through the semi-conductive layer from the first main surface to the second main surface, (2-1) a second-A semi-conductive or conductive region formed in a surface region, including the first main surfaces of the first region, said second-A region forming a rectifier junction together with the first region, (2-2) a second-B semi-conductive or conductive region formed in a surface region, including the second main surface, of the first region, said second-B region forming a rectifier junction together with the first region, (3-1) a third-A semi-conductive region of the second conductivity type opposite to the first conductivity type, formed in a surface region, including the first main surface, of the first region and spaced from the second-A region, (3-2) a third-B semi-conductive region of the second conductivity type, formed in a surface region, including the second main surface, of the first region and spaced from the second-B region, (4-1) a fourth-A semi-conductive region of the first conductivity type, formed in a surface region, including the first main surface, of the third-A region, (4-2) a fourth-B semi-conductive region of the first conductivity type, formed in a surface region, including the second main surface, of the third-B region, (5-1) a fifth-A semi-conductive or conductive region formed in a surface region, including the first main surface, of the fourth-A region, said fifth-A region forming a rectifier junction together with the fourth-A region, (5-2) a fifth-B semi-conductive or conductive region formed in a surface region, including the second main surface, of the fourth-B region, said fifth-B region forming a rectifier junction together with the fourth-B region, (6-1) a gate portion of the first semiconductor memory device formed on a first barrier layer formed on the first main surface so as to bridge the first region and the fourth-A region, so as to bridge the second-A region and the third-A region and so as to bridge the third-A region and the fifth-A region, and (6-2) a gate portion of the second semiconductor memory device formed on a second barrier layer formed on the second main surface so as to bridge the first region and the fourth-B region, so as to bridge the second-B region and the third-B region and so as to bridge the third-B region and the fifth-b region, wherein;

(A-1) one source/drain region of the first transistor for read-out is constituted of the fourth-A region, (A-2) the other source/drain region of the first transistor for read-out is constituted of a surface region, including the first main surface, of the first region, (A-3) a channel forming region of the first transistor for read-out is constituted of a surface region, including the first main surface, of the third-A region which surface region is sandwiched by the surface region, including the first main surface, of the first region and the fourth-A region, (a-1) one source/drain region of the second transistor for read-out is constituted of the fourth-B region, (a-2) the other source/drain region of the second transistor for read-out is constituted of a surface region, including the second main surface, of the first region, (a-3) a channel forming region of the second transistor for read-out is constituted of a surface region, including the second main surface, of the third-B region which surface region is sandwiched by the surface region, including the second main surface, of the first region and the fourth-B region, (B-1) one source/drain region of the first transistor for write-in is constituted of the second-A region, (B-2) the other source/drain region of the first transistor for write-in is constituted of a surface region, including the first main surface, of the third-A region, (B-3) a channel forming region of the first transistor for write-in is constituted of a surface region, including the first main surface, of the first region which surface region is sandwiched by the surface region, including the first main surface, of the third-A region and the second-A region, (b-1) one source/drain region of the second transistor for write-in is constituted of the second-B region, (b-2) the other source/drain region of the second transistor for write-in is constituted of a surface region, including the second main surface, of the third-B region, (b-3) a channel forming region of the second transistor for write-in is constituted of a surface region, including the second main surface, of the first region which surface region is sandwiched by the surface region, including the second main surface, of the third-B region and the second-B region, (C-1) gate regions of the first junction-field-effect transistor are constituted of the fifth-A region and a portion of third-A region facing the fifth-A region, (C-2) a channel region of the first junction-field-effect transistor is constituted of a portion of the fourth-A region sandwiched by the fifth-A region and said portion of the third-A region, (C-3) source/drain regions of the first junction-field-effect transistor are constituted of portions of the fourth-A region, one of the portions of the fourth-A region extending from one end of the channel region of the first junction-field-effect transistor and the other of the portions of the fourth-A region extending from the other end of the channel region of the first junction-field-effect transistor, (c-1) gate regions of the second junction-field-effect transistor are constituted of the fifth-B region and a portion of third-B region facing the fifth-B region, (c-2) a channel region of the second junction-field-effect transistor is constituted of a portion of the fourth-B region sandwiched by the fifth-B region and said portion of the third-B region, (c-3) source/drain regions of the second junction-field-effect transistor are constituted of portions of the fourth-B region, one of the portions of the fourth-B region extending from one end of the channel region of the second junction-field-effect transistor and the other of the portions of the fourth-B region extending from the other end of the channel region of the second junction-field-effect transistor, (D-1) one source/drain region of the third transistor for write-in is constituted of the surface region of the third-A region functioning as the channel forming region of the first transistor for read-out, (D-2) the other source/drain region of the third transistor for write-in is constituted of the fifth-A region, (D-3) a channel forming region of the third transistor for write-in is constituted of the surface region of the fourth-A region functioning as one source/drain region of the first transistor for read-out, (d-1) one source/drain region of the fourth transistor for write-in is constituted of the surface region of the third-B region functioning as the channel forming region of the second transistor for read-out, (d-2) the other source/drain region of the fourth transistor for write-in is constituted of the fifth-B region, (d-3) a channel forming region of the fourth transistor for write-in is constituted of the surface region of the fourth-B region functioning as one source/drain region of the second transistor for read-out, (E) the first diode is constituted of the second-A region and the first region, (e) the second diode is constituted of the second-B region and the first region, (F) the gate portion of the first semiconductor memory device is connected to a first-A memory-cell-selecting line, (f) the gate portion of the second semiconductor memory device is connected to a first-B memory-cell-selecting line, (G) the second-A region is connected to a write-in information setting line-A, (g) the second-B region is connected to a write-in information setting line-B, (H) the fourth-A region is connected to a second-A memory-cell-selecting line, and (h) the fourth-B region is connected to a second-B memory-cell-selecting line.

119. The semiconductor memory cell according to claim 118, wherein the write-in information setting line-A is in common with the write-in information setting line-B.

120. The semiconductor memory cell according to claim 118, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, the second-A region is connected to the second-A memory-cell-selecting line, in place of being connected to the write-in information setting line-A, and the second-B region is connected to the second-B memory-cell-selecting line, in place of being connected to the write-in information setting line-B.

121. The semiconductor memory cell according to claim 120, wherein the second-A memory-cell-selecting line is in common with the second-B memory-cell-selecting line.

122. The semiconductor memory cell according to claim 118, wherein the semiconductor memory cell further has a sixth-A conductive region formed in a surface region, including the first main surface, of the first region and a sixth-B conductive region formed in a surface region, including the second main surface, of the first region, the first diode comprises a Schottky diode constituted of the first region and the sixth-A region, in place of being constituted of the first region and the second-A region, and the second diode comprises a Schottky diode constituted of the first region and the sixth-B region, in place of being constituted of the first region and the second-B region.

123. The semiconductor memory cell according to claim 118, wherein the write-in information setting line-A is in common with the write-in information setting line-B.

124. The semiconductor memory cell according to claim 122, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, the second-A region is connected to the second-A memory-cell-selecting line, in place of being connected to the write-in information setting line-A, and the second-B region is connected to the second-B memory-cell-selecting line, in place of being connected to the write-in information setting line-B.

125. The semiconductor memory cell according to claim 124, wherein the second-A memory-cell-selecting line is in common with the second-B memory-cell-selecting line.

126. The semiconductor memory cell according to claim 118, wherein the write-in information setting line-A is in common with the write-in information, setting line-B, the semiconductor memory cell has a sixth conductive region, formed through the semi-conductive layer from the first main surface to the second main surface and being in contact with the first region, the first diode comprises a Schottky diode constituted of the first region and the sixth region, in place of being constituted of the first region and the second-A region, and the second diode comprises a Schottky diode constituted of the first region and the sixth region, in place of being constituted of the first region and the second-B region.

127. The semiconductor memory cell according to claim 126, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, and the second-A and second-B regions are connected to a second memory-cell-selecting line, in place of being connected to the write-in information setting line-A and the write-in information setting line-B.

128. A semiconductor memory cell provided with a semi-conductive layer having a first main surface and a second main surface opposed to the first main surface, said semiconductor memory cell comprising a first semiconductor memory device and a second semiconductor memory device, said first semiconductor memory device comprising a first transistor of a first conductivity type for read-out, a first transistor of a second conductivity type for write-in, a first junction-field-effect transistor of the first conductivity type for current control and a first diode, and said second semiconductor memory device comprising a second transistor of the first conductivity type for read-out, a second transistor of the second conductivity type for write-in, a second junction-field-effect transistor of the first conductivity type for current control and a second diode, said semiconductor memory cell having;

(1) a first semi-conductive region of the first conductivity type, formed through the semi-conductive layer from the first main surface to the second main surface, (2) a second semi-conductive region of the second conductivity type opposite to the first conductivity type, formed through the semi-conductive layer from the first main surface to the second main surface and being in contact with the first region, (3-1) a third-A semi-conductive region of the second conductivity type, formed in a surface region, including the first main surface, of the first region and spaced from the second region, (3-2) a third-B semi-conductive region of the second conductivity type, formed in a surface region, including the second main surface, of the first region and spaced from the second region, (4-1) a fourth-A semi-conductive region of the first conductivity type, formed in a surface region, including the first main surface, of the third-A region, (4-2) a fourth-B semi-conductive region of the first conductivity type, formed in a surface region, including the second main surface, of the third-B region, (5-1) a fifth-A semi-conductive or conductive region formed in a surface region, including the first main surface, of the fourth-A region, said fifth-A region forming a rectifier junction together with the fourth-A region, (5-2) a fifth-B semi-conductive or conductive region formed in a surface region, including the second main surface, of the fourth-B region, said fifth-B region forming a rectifier junction together with the fourth-B region, (6-1) a gate portion of the first semiconductor memory device formed on a first barrier layer formed on the first main surface so as to bridge the first region and the fourth-A region and so as to bridge the second region and the third-A region, and (6-2) a gate portion of the second semiconductor memory device formed on a second barrier layer formed on the second main surface so as to bridge the first region and the fourth-B region and so as to bridge the second region and the third-B region, wherein;

(A-1) one source/drain region of the first transistor for read-out is constituted of the fourth-A region, (A-2) the other source/drain region of the first transistor for read-out is constituted of a surface region, including the first main surface, of the first region, (A-3) a channel forming region of the first transistor for read-out is constituted of a surface region, including the first main surface, of the third-A region which surface region is sandwiched by the surface region, including the first main surface, of the first region and the fourth-A region, (a-1) one source/drain region of the second transistor for read-out is constituted of the fourth-B region, (a-2) the other source/drain region of the second transistor for read-out is constituted of a surface region, including the second main surface, of the first region, (a-3) a channel forming region of the second transistor for read-out is constituted of a surface region, including the second main surface, of the third-B region which surface region is sandwiched by the surface region, including the second main surface, of the first region and the fourth-B region, (B-1) one source/drain region of the first transistor for write-in is constituted of a surface region, including the first main surface, of the second region, (B-2) the other source/drain region of the first transistor for write-in is constituted of a surface region, including the first main surface, of the third-A region, (B-3) a channel forming region of the first transistor for write-in is constituted of a surface region, including the first main surface, of the first region which surface region is sandwiched by the surface region, including the first main surface, of the third-A region and the surface region, including the first main surface, of the second region, (b-1) one source/drain region of the second transistor for write-in is constituted of a surface region, including the second main surface, of the second region, (b-2) the other source/drain region of the second transistor for write-in is constituted of a surface region, including the second main surface, of the third-B region, (b-3) a channel forming region of the second transistor for write-in is constituted of a surface region, including the second main surface, of the first region which surface region is sandwiched by the surface region, including the second main surface, of the third-B region and the surface region, including the second main surface, of the second region, (C-1) gate regions of the first junction-field-effect transistor are constituted of the fifth-A region and a portion of third-A region facing the fifth-A region, (C-2) a channel region of the first junction-field-effect transistor is constituted of a portion of the fourth-A region sandwiched by the fifth-A region and said portion of the third-A region, (C-3) source/drain regions of the first junction-field-effect transistor are constituted of portions of the fourth-A region, one of the portions of the fourth-A region extending from one end of the channel region of the first junction-field-effect transistor and the other of the portions of the fourth-A region extending from the other end of the channel region of the first junction-field-effect transistor, (c-1) gate regions of the second junction-field-effect transistor are constituted of the fifth-B region and a portion of third-B region facing the fifth-B region, (c-2) a channel region of the second junction-field-effect transistor is constituted of a portion of the fourth-B region sandwiched by the fifth-B region and said portion of the third-B region, (c-3) source/drain regions of the second junction-field-effect transistor are constituted of portions of the fourth-B region, one of the portions of the fourth-B region extending from one end of the channel region of the second junction-field-effect transistor and the other of the portions of the fourth-B region extending from the other end of the channel region of the second junction-field-effect transistor, (D) each of the first diode and the second diode is constituted of the second region and the first region, (E) the gate portion of the first semiconductor memory device is connected to a first-A memory-cell-selecting line, (e) the gate portion of the second semiconductor memory device is connected to a first-B memory-cell-selecting line, (F) the second region is connected to a write-in information setting line, (G) the fourth-A region is connected to a second-A memory-cell-selecting line, (g) the fourth-B region is connected to a second-B memory-cell-selecting line, and (H) the fifth-A region and the fifth-B region are connected to the write-in information setting line.

129. The semiconductor memory cell according to claim 128, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, and the second region is connected to a second memory-cell-selecting line, in place of being connected to the write-in information setting line.

130. The semiconductor memory cell according to claim 128, wherein the fifth-A region is connected to the third-A region, in place of being connected to the write-in information setting line, and the fifth-B region is connected to the third-B region, in place of being connected to the write-in information setting line.

131. The semiconductor memory cell according to claim 130, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, and the second region is connected to the second memory-cell-selecting line, in place of being connected to the write-in information setting line.

132. A semiconductor memory cell provided with a semi-conductive layer having a first main surface and a second main surface opposed to the first main surface, said semi-conductor memory cell comprising a first semiconductor memory device and a second semiconductor memory device, said first semiconductor memory device comprising a first transistor of a first conductivity type for read-out, a first transistor of a second conductivity type for write-in, a first junction-field-effect transistor of the first conductivity type for current control, a third transistor of the second conductivity type for write-in and a first diode, and said second semiconductor memory device comprising a second transistor of the first conductivity type for read-out, a second transistor of the second conductivity type for write-in, a second junction-field-effect transistor of the first conductivity type for current control, a fourth transistor of the second conductivity type for write-in and a second diode, said semiconductor memory cell having;

(1) a first semi-conductive region of the first conductivity type, formed through the semi-conductive layer from the first main surface to the second main surface, (2) a second semi-conductive region of the second conductivity type opposite to the first conductivity type, formed through the semi-conductive layer from the first main surface to the second main surface and being in contact with the first region, (3-1) a third-A semi-conductive region of the second conductivity type, formed in a surface region, including the first main surface, of the first region and spaced from the second region, (3-2) a third-B semi-conductive region of the second conductivity type, formed in a surface region, including the second main surface, of the first region and spaced from the second region, (4-1) a fourth-A semi-conductive region of the first conductivity type, formed in a surface region, including the first main surface, of the third-A region, (4-2) a fourth-B semi-conductive region of the first conductivity type, formed in a surface region, including the second main surface, of the third-B region, (5-1) a fifth-A semi-conductive or conductive region formed in a surface region, including the first main surface, of the fourth-A region, said fifth-A region forming a rectifier junction together with the fourth-A region, (5-2) a fifth-B semi-conductive or conductive region formed in a surface region, including the second main surface, of the fourth-B region, said fifth-B region forming a rectifier junction together with the fourth-B region, (6-1) a gate portion of the first semiconductor memory device formed on a first barrier layer formed on the first main surface so as to bridge the first region and the fourth-A region, so as to bridge the second region and the third-A region and so as to bridge the third-A region and the fifth-A region, and (6-2) a gate portion of the second semiconductor memory device formed on a second barrier layer formed on the second main surface so as to bridge the first region and the fourth-B region, so as to bridge the second region and the third-B region and so as to bridge the third-B region and the fifth-b region, wherein;

(A-1) one source/drain region of the first transistor for read-out is constituted of the fourth-A region, (A-2) the other source/drain region of the first transistor for read-out is constituted of a surface region, including the first main surface, of the first region, (A-3) a channel forming region of the first transistor for read-out is constituted of a surface region, including the first main surface, of the third-A region which surface region is sandwiched by the surface region, including the first main surface, of the first region and the fourth-A region, (a-1) one source/drain region of the second transistor for read-out is constituted of the fourth-B region, (a-2) the other source/drain region of the second transistor for read-out is constituted of a surface region, including the second main surface, of the first region, (a-3) a channel forming region of the second transistor for read-out is constituted of a surface region, including the second main surface, of the third-B region which surface region is sandwiched by the surface region, including the second main surface, of the first region and the fourth-B region, (B-1) one source/drain region of the first transistor for write-in is constituted of a surface region, including the first main surface, of the second region, (B-2) the other source/drain region of the first transistor for write-in is constituted of a surface region, including the first main surface, of the third-A region, (B-3) a channel forming region of the first transistor for write-in is constituted of a surface region, including the first main surface, of the first region which surface region is sandwiched by the surface region, including the first main surface, of the third-A region and the surface region, including the first main surface, of the second region, (b-1) one source/drain region of the second transistor for write-in is constituted of a surface region, including the second main surface, of the second region, (b-2) the other source/drain region of the second transistor for write-in is constituted of a surface region, including the second main surface, of the third-B region, (b-3) a channel forming region of the second transistor for write-in is constituted of a surface region, including the second main surface, of the first region which surface region is sandwiched by the surface region, including the second main surface, of the third-B region and the surface region, including the second main surface, of the second region, (C-1) gate regions of the first junction-field-effect transistor are constituted of the fifth-A region and a portion of third-A region facing the fifth-A region, (C-2) a channel region of the first junction-field-effect transistor is constituted of a portion of the fourth-A region sandwiched by the fifth-A region and said portion of the third-A region, (C-3) source/drain regions of the first junction-field-effect transistor are constituted of portions of the fourth-A region, one of the portions of the fourth-A region extending from one end of the channel region of the first junction-field-effect transistor and the other of the portions of the fourth-A region extending from the other end of the channel region of the first junction-field-effect transistor, (c-1) gate regions of the second junction-field-effect transistor are constituted of the fifth-B region and a portion of third-B region facing the fifth-B region, (c-2) a channel region of the second junction-field-effect transistor is constituted of a portion of the fourth-B region sandwiched by the fifth-B region and said portion of the third-B region, (c-3) source/drain regions of the second junction-field-effect transistor are constituted of portions of the fourth-B region, one of the portions of the fourth-B region extending from one end of the channel region of the second junction-field-effect transistor and the other of the portions of the fourth-B region extending from the other end of the channel region of the second junction-field-effect transistor, (D-1) one source/drain region of the third transistor for write-in is constituted of the surface region of the third-A region functioning as the channel forming region of the first transistor for read-out, (D-2) the other source/drain region of the third transistor for write-in is constituted of the fifth-A region, (D-3) a channel forming region of the third transistor for write-in is constituted of the surface region of the fourth-A region functioning as one source/drain region of the first transistor for read-out, (d-1) one source/drain region of the fourth transistor for write-in is constituted of the surface region of the third-B region functioning as the channel forming region of the second transistor for read-out, (d-2) the other source/drain region of the fourth transistor for write-in is constituted of the fifth-B region, (d-3) a channel forming region of the fourth transistor for write-in is constituted of the surface region of the fourth-B region functioning as one source/drain region of the second transistor for read-out, (E) each of the first diode and the second diode is constituted of the second region and the first region, (F) the gate portion of the first semiconductor memory device is connected to a first-A memory-cell-selecting line, (f) the gate portion of the second semiconductor memory device is connected to a first-B memory-cell-selecting line, (G) the second region is connected to a write-in information-setting line, (H) the fourth-A region is connected to a second-A memory-cell-selecting line, and (h) the fourth-B region is connected to a second-B memory-cell-selecting line.

133. The semiconductor memory cell according to claim 132, wherein the fourth-A region is connected to a predetermined potential line-A, in place of being connected to the second-A memory-cell-selecting line, the fourth-B region is connected to a predetermined potential line-B, in place of being connected to the second-B memory-cell-selecting line, and the second region is connected to a second memory-cell-selecting line, in place of being connected to the write-in information setting line.

* * * * *